US006947854B2

(12) United States Patent
Swarztrauber et al.

(10) Patent No.: US 6,947,854 B2
(45) Date of Patent: Sep. 20, 2005

(54) SYSTEM AND METHOD FOR ON-LINE MONITORING AND BILLING OF POWER CONSUMPTION

(75) Inventors: Sayre A. Swarztrauber, New York, NY (US); Doron Shafrir, Suffern, NY (US); Stanley C. Lo, Fresh Meadows, NY (US); Michael Newsome, Newport, VA (US); Eric Jacobson, Bayside, NY (US)

(73) Assignee: Quadlogic Controls Corporation, New York, NY (US)

(*) Notice: Subject to any disclaimer, the term of this patent is extended or adjusted under 35 U.S.C. 154(b) by 0 days.

(21) Appl. No.: 09/795,838

(22) Filed: Feb. 28, 2001

(65) Prior Publication Data

US 2003/0158677 A1 Aug. 21, 2003

Related U.S. Application Data

(60) Provisional application No. 60/185,832, filed on Feb. 29, 2000.

(51) Int. Cl.[7] .......... G06F 19/00

(52) U.S. Cl. .......... 702/62; 702/60; 702/80; 702/121; 702/188; 340/870.01; 340/870.11; 379/106.03; 379/106.04; 369/47.5; 369/47.52; 439/508; 439/517

(58) Field of Search .......... 702/57, 60–63, 702/80, 121, 122, 188, 189, FOR 103, 104, 106, 114, 111, 112, 155, 159, 170, 171; 340/870.01, 870.02, 870.03, 870.11, 10.51; 379/106.03, 106.04; 369/47.5, 47.52; 439/508, 517

(56) References Cited

U.S. PATENT DOCUMENTS

| | | | |
|---|---|---|---|
| 3,922,492 A | 11/1975 | Lumsden | |
| 3,973,240 A | 8/1976 | Fong | 340/151 |

(Continued)

FOREIGN PATENT DOCUMENTS

| | | | |
|---|---|---|---|
| GB | 2306852 | A | 5/1997 |
| GB | 2310779 | A | 9/1997 |
| JP | 4-160838 | A | 6/1992 |
| WO | WO 99/46746 | A1 | 9/1999 |
| WO | WO 99/57697 | A1 | 11/1999 |
| ZA | 9106610 | | 6/1992 |

OTHER PUBLICATIONS

Summers, Integrated Semiconductor Solutions for metering and telemetering, Conference Apr. 3–5, 1990, pp. 116–120.*

Mapps et al., A Non–Volatile Solid–State–Memory using the Magnetic Spin–Dependent–Tunneling Effect, Univeristy of Plymouth, UK, Jan. 2000, pp. 25–27.*

Supp. Partial European Search Report for EP 01 91 3201, mailed Apr. 25, 2003.

*Primary Examiner*—Marc S. Hoff
*Assistant Examiner*—Elias Desta
(74) *Attorney, Agent, or Firm*—Morgan, Lewis & Bockius LLP

(57) ABSTRACT

The present invention comprises systems and methods related to monitoring of energy usage on a power line. In a preferred embodiment, this system comprises (a) an electronic microprocessor-controlled digital electricity metering device coupled to the power line and comprising a non-volatile non-battery-powered data-storage device, wherein the metering device is capable of interval metering and of receiving a data request and transmitting data in response to the request over the power line; and (b) a data collector (preferably, a transponder) coupled to the metering device via the power line. The data collector is preferably capable of (i) receiving data from and transmitting data to the metering device over the power line, (ii) storing data received from the metering device over the power line, and (iii) receiving data from and transmitting data to a remotely located computer (preferably, a billing computer).

55 Claims, 176 Drawing Sheets

U.S. PATENT DOCUMENTS 4,004,097 A 1/1977 Spaulding .................... 179/2
4,240,030 A 12/1980 Bateman et al. ............ 324/110
4,727,315 A 2/1988 Jones ........................ 324/110
4,783,748 A * 11/1988 Swarztrauber et al. ...... 364/483
4,847,782 A * 7/1989 Brown, Jr. et al. ......... 364/492
4,908,769 A 3/1990 Vaughan et al. ....... 364/464.04
5,182,744 A 1/1993 Askew et al. ................ 370/16
5,586,112 A 12/1996 Tabata ....................... 370/225
5,699,276 A * 12/1997 Roos ......................... 364/514
5,764,739 A 6/1998 Patton et al.
5,838,660 A 11/1998 Croslin ...................... 370/216
5,897,607 A 4/1999 Jenney et al. ................ 702/62
5,986,574 A 11/1999 Colton
6,049,791 A 4/2000 Lerner ....................... 705/412
6,115,676 A 9/2000 Rector et al. ................ 702/62

* cited by examiner

A3-SUBSTATION INSTALLATION DIAGRAM MASTER TRANSPONDER ON UNUSED SWITCH CABINET

| | | |
|---|---|---|
| | FIG.9B-1 | FIG.9B-2 |
| FIG.9B-3 | FIG.9B-4 | FIG.9B-5 |
| FIG.9B-6 | FIG.9B-7 | FIG.9B-8 |
| FIG.9B-9 | FIG.9B-10 | FIG.9B-11 |

FIG. 9B

| | | |
|---|---|---|
| FIG.11A-1 | FIG.11A-2 | FIG.11A-3 |
| FIG.11A-4 | FIG.11A-5 | FIG.11A-6 |
| FIG.11A-7 | FIG.11A-8 | FIG.11A-9 |
| FIG.11A-10 | FIG.11A-11 | |

FIG.11A

| | | | |
|---|---|---|---|
| FIG.11C-1 | FIG.11C-2 | FIG.11C-3 | FIG.11C-4 |
| FIG.11C-5 | FIG.11C-6 | FIG.11C-7 | FIG.11C-8 |
| FIG.11C-9 | FIG.11C-10 | FIG.11C-11 | FIG.11C-12 |
| FIG.11C-13 | | | |

FIG.11C

| | | |
|---|---|---|
| FIG.12A-1 | FIG.12A-2 | FIG.12A-3 |
| FIG.12A-4 | FIG.12A-5 | FIG.12A-6 |
| FIG.12A-7 | FIG.12A-8 | FIG.12A-9 |

FIG.12A

| | | |
|---|---|---|
| FIG.12B-1 | FIG.12B-2 | FIG.12B-3 |
| FIG.12B-4 | FIG.12B-5 | FIG.12B-6 |
| FIG.12B-7 | FIG.12B-8 | FIG.12B-9 |

FIG.12B

| | | | | |
|---|---|---|---|---|
| FIG.15B-1 | FIG.15B-2 | FIG.15B-3 | FIG.15B-4 | FIG.15B-5 |
| FIG.15B-6 | FIG.15B-7 | FIG.15B-8 | FIG.15B-9 | FIG.15B-10 |
| FIG.15B-11 | FIG.15B-12 | FIG.15B-13 | FIG.15B-14 | FIG.15B-15 |
| FIG.15B-16 | FIG.15B-17 | | FIG.15B-18 | FIG.15B-19 |

FIG.15B

•H6 IS USED AS A PORT HDR & PICCHIP TESTER

| | | |
|---|---|---|
| FIG.17A-1 | FIG.17A-2 | FIG.17A-3 |
| FIG.17A-4 | FIG.17A-5 | FIG.17A-6 |
| FIG.17A-7 | FIG.17A-8 | FIG.17A-9 |
| FIG.17A-10 | FIG.17A-11 | FIG.17A-12 |

FIG.17A

| | | |
|---|---|---|
| FIG.17C-1 | FIG.17C-2 | FIG.17C-3 |
| FIG.17C-4 | | FIG.17C-5 |
| FIG.17C-6 | FIG.17C-7 | FIG.17C-8 |

FIG.17C

FIG.23 –THEFT DETECTION

SYSTEM AND METHOD FOR ON-LINE MONITORING AND BILLING OF POWER CONSUMPTION

CROSS-REFERENCE TO RELATED APPLICATIONS

This application claims the benefit of U.S. Provisional Application No. 60/185,832, filed Feb. 29, 2000.

FIELD OF THE INVENTION

The present invention relates to metering of and billing for electric power consumption, and has particular application to solid state electricity meters and powerline communication with such meters.

BACKGROUND

Submetering is the resale of electricity or allocation of costs within a multi-tenant property. Master metered apartments are units of a multi-tenant residential building without individual electric meters; the cost of electricity for each apartment is included in the rent for that apartment. Because tenants of such units typically consume up to 30% more electricity than tenants who pay a separate bill for energy consumed, there is a demand for submetering of such units.

Systems and methods for submetering are known. One such system is disclosed in U.S. Pat. No. 4,783,748, issued Nov. 8, 1988, to Swarztrauber et al. In that system, as disclosed in the patent and as developed through 1999, the submeter (known as a Transmeter®) measures electricity by connecting to the power wires to measure voltage and through current transformers to measure current. The initial Transmeters®, manufactured from 1982 through 1991, processed the voltage and current in digital form to derive the real energy. In a development effort that spanned the period from 1988 through 1992, additional parameters were added. The Transmeters manufactured from 1992 through 1999 calculate from the measured voltage and current additional parameters such as reactive and apparent energy, power factor, total harmonic distortion, peak demand, time-of-use, voltage and current. They also stored the information in CMOS ram backed up by battery to maintain an audit trail of key energy information either every day or every 15 minutes. This type of memory storage can suffer data loss through power and battery failure, data corruption due to "fast transients"—a type of interference commonly found on power lines.

The Transmeter® systems manufactured and sold through 1999 collect and deliver information from Transmeters® located in multi-tenant properties. The individual Transmeters® inject signals onto the power distribution lines (a technique known as power line communication, or "PLC") in the multi-tenant property to a more centrally located device, the Transponder. The Transponder is typically installed at the point of entry of electricity to that property. If the property has more than one electrical service, one Transponder is installed per service. The Transponders are interconnected via an RS-485 network. One of the Transponders connects by modem to a dedicated standard telephone line.

The billing computer is configured to dial any property on command of the operator. The data is processed by standard spreadsheet or database programs to generate bills in either paper or machine-readable format for use by the property management companies.

However, such systems have a number of deficiencies. One deficiency is cost: units that are too costly will not be utilized in areas where the profit margins are too small or there is a relatively high probability of theft. Another deficiency shared by many systems is that the meters communicate with a central billing office via telephone lines, thus requiring additional installation of wires in the building, or at least requiring that telephone lines be located near the power lines.

The submetering market has several requirements that often fail to be met by existing submetering systems. Such requirements include: (1) stringent metering standards found outside the United States such as those of Industry Canada and the International Electrotechnical Commission (a European standards organization with applicability to most of the world outside of North America). Not only must a submeter meet electrical standards, it must comply with strict mechanical standards as well.

(2) Communication with the submeter is required outside of densely populated urban areas, where electrical distribution transformers are not necessarily located near phone lines.

(3) There is an emerging need of electric utilities to provide on-line metering databases over the Internet. This need also includes providing this information to generation companies or Energy Service Companies (ESCOs) often located very distant from the customer. Such entities require delivery of information not available with standard electromechanical meters.

(4) Low-cost, high-volume manufacture.

SUMMARY

In one aspect, the present invention comprises a system for monitoring energy usage on a power line. Preferably, this system comprises (a) an electronic microprocessor-controlled digital electricity metering device connected to the power line and comprising a non-volatile non-battery-powered data-storage device, wherein the metering device is capable of interval metering and of receiving a data request and transmitting data in response to the request over the power line; and (b) a data collector (preferably, a transponder) connected to the metering device via the power line. The data collector is preferably capable of (i) receiving data from and transmitting data to the metering device over the power line, (ii) storing data received from the metering device over the power line, and (iii) receiving data from and transmitting data to a remotely located computer (preferably, a billing computer).

In another aspect, the present invention comprises a system for monitoring energy usage, comprising: (a) one or more power lines; and (b) an electronic microprocessor-controlled digital electricity metering device connected to the power lines and comprising at least one non-volatile non-battery-powered data-storage device. Preferably, the metering device is capable of interval metering and of metering multiple billing entities.

In another aspect, the present invention comprises a power line communication system for communication between a master device and a slave device, comprising: (a) a master device connected to a power line and capable of transmitting a request for data over the power line to a slave device and of receiving data transmitted by the slave device over the power line, wherein the master device is capable of transmitting a request for data over the power line to the slave device that is at a frequency low enough to ensure reliable reception by the slave device, and wherein the request for data comprises instructions to the slave device to transmit responsive data over the power line within specific transmission parameters; and (b) a slave device connected to the power line and capable of transmitting data over the power line in response to a request for data received over the power line from a master device, wherein the slave device is capable of transmitting data over the power line within the specific transmission parameters.

In a further aspect, the present invention comprises a method of monitoring energy usage, comprising the steps of: (a) measuring energy usage using a microprocessor-controlled digital electricity metering device; (b) storing data representing measured energy usage at regular intervals of time in a non-volatile, non-battery-operated data storage device; (c) receiving a request for the stored data over a power line from a remotely located computer (preferably, a billing computer); and (d) in response to that request, transmitting the stored data over the power line to the remotely located computer.

In another aspect, the present invention comprises a method of power line communication between a master device and a slave device, comprising the steps of: (a) transmitting a request for data over a power line from a master device to a slave device, wherein the request is at a frequency low enough to ensure reliable reception by the slave device (preferably, a transponder hunts between two or more channels to avoid narrow band noise and transmits the request at a data rate (baud rate) low enough to ensure reliable reception by the slave device), and wherein the request for data comprises instructions to the slave device to transmit responsive data over the power line within a first set of specific transmission parameters; and (b) transmitting responsive data over the power line from the slave device to the master device in response to the request for data received by the slave device over the power line from the master device, wherein the responsive data is transmitted over the power line within the first set of specific transmission parameters. This method, when the situation requires, further comprises the steps of: (c) after a predetermined period of time during which the master device has not received responsive data of acceptable quality from the slave device transmitted within the first set of specific transmission parameters, transmitting a subsequent request for data over the power line from the master device to the slave device, wherein the request is at a frequency low enough to ensure reliable reception by the slave device (again, preferably a transponder hunts between two or more channels to avoid narrow band noise and transmits the request at a data rate (baud rate) low enough to ensure reliable reception by the slave device), and wherein the request for data comprises instructions to the slave device to transmit responsive data over the power line within a second set of specific transmission parameters; and (d) transmitting responsive data over the power line from the slave device to the master device in response to the subsequent request for data received by the slave device over the power line from the master device, wherein the responsive data is transmitted over the power line within the second set of specific transmission parameters.

In still another aspect, the present invention comprises an application specific integrated circuit (ASIC) for monitoring energy usage, comprising: (a) a meter component; (b) a digital control logic component; (c) a real-time clock component; and (d) a power line communication component.

In a further aspect, the present invention comprises a device for monitoring energy usage, comprising: (a) an application specific integrated circuit (ASIC) chip connected to and capable of being controlled by a microprocessor; (b) a microprocessor connected to the ASIC chip and capable of controlling the operation of the ASIC chip; and (c) a flash memory device connected to the ASIC chip and to the microprocessor, wherein the flash memory device is capable of receiving energy usage data from the ASIC chip and capable of being controlled by the microprocessor.

Other aspects of the present invention will be apparent to those skilled in the art upon reviewing the following detailed description, attached drawings, and appended claims.

DETAILED DESCRIPTION OF PREFERRED EMBODIMENTS

Figure 1:
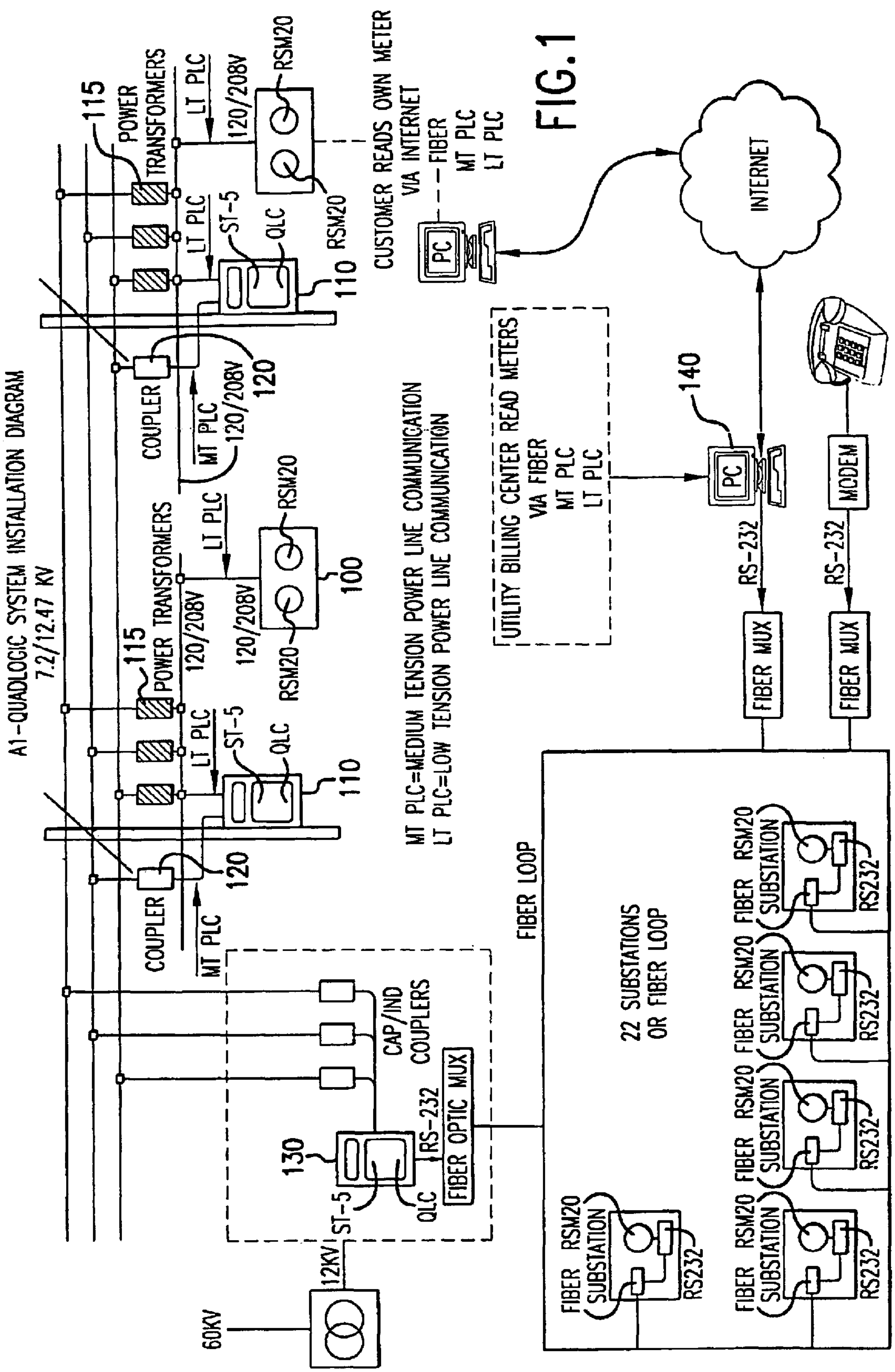
FIG. 1 is an overall installation diagram for a preferred embodiment of the present invention.
Figure 2:
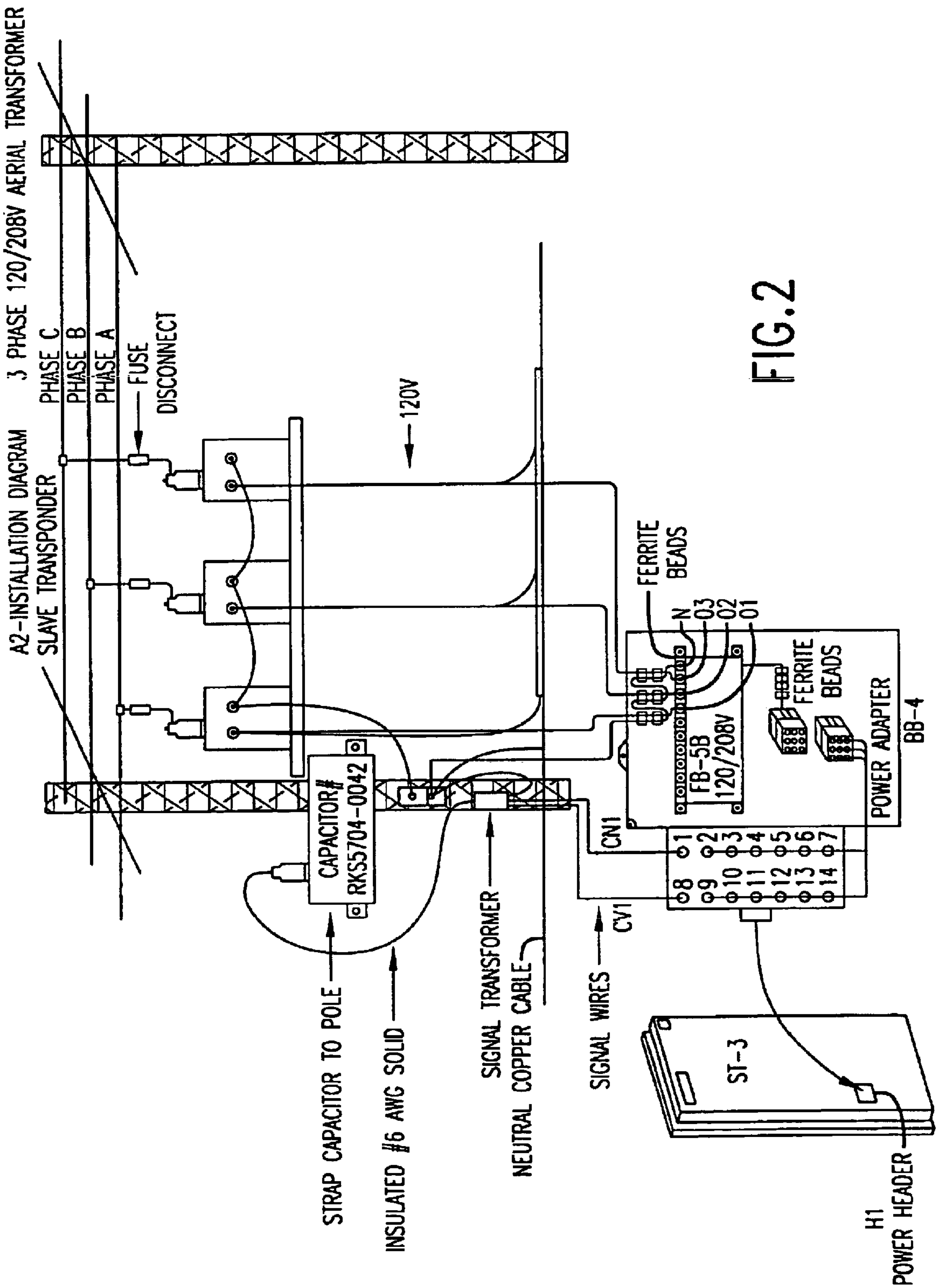
FIG. 2 is an installation diagram for a slave transponder.
Figure 3A:
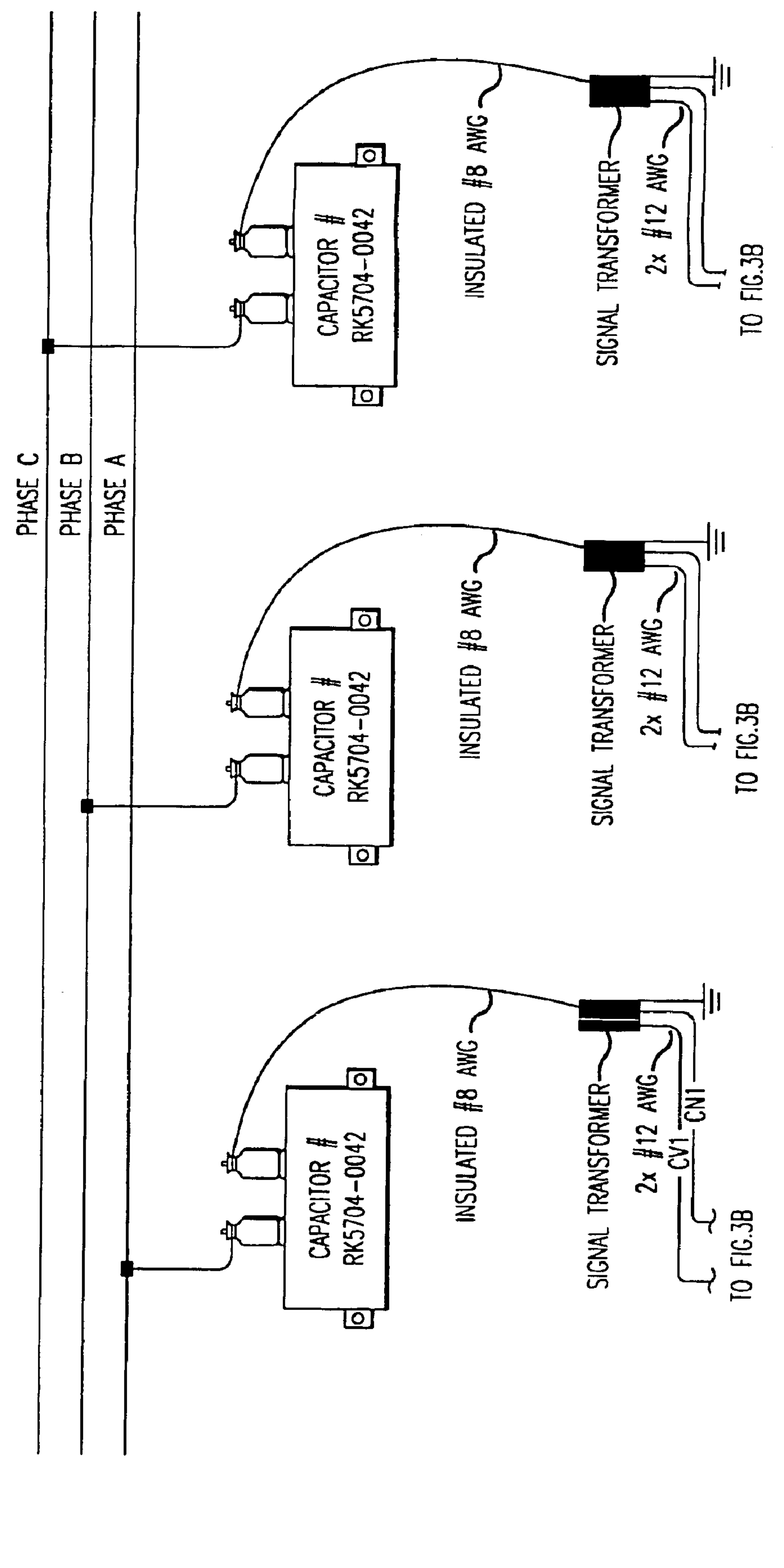
FIG. 3 is a substation installation diagram of a master transponder.
Figure 3B:
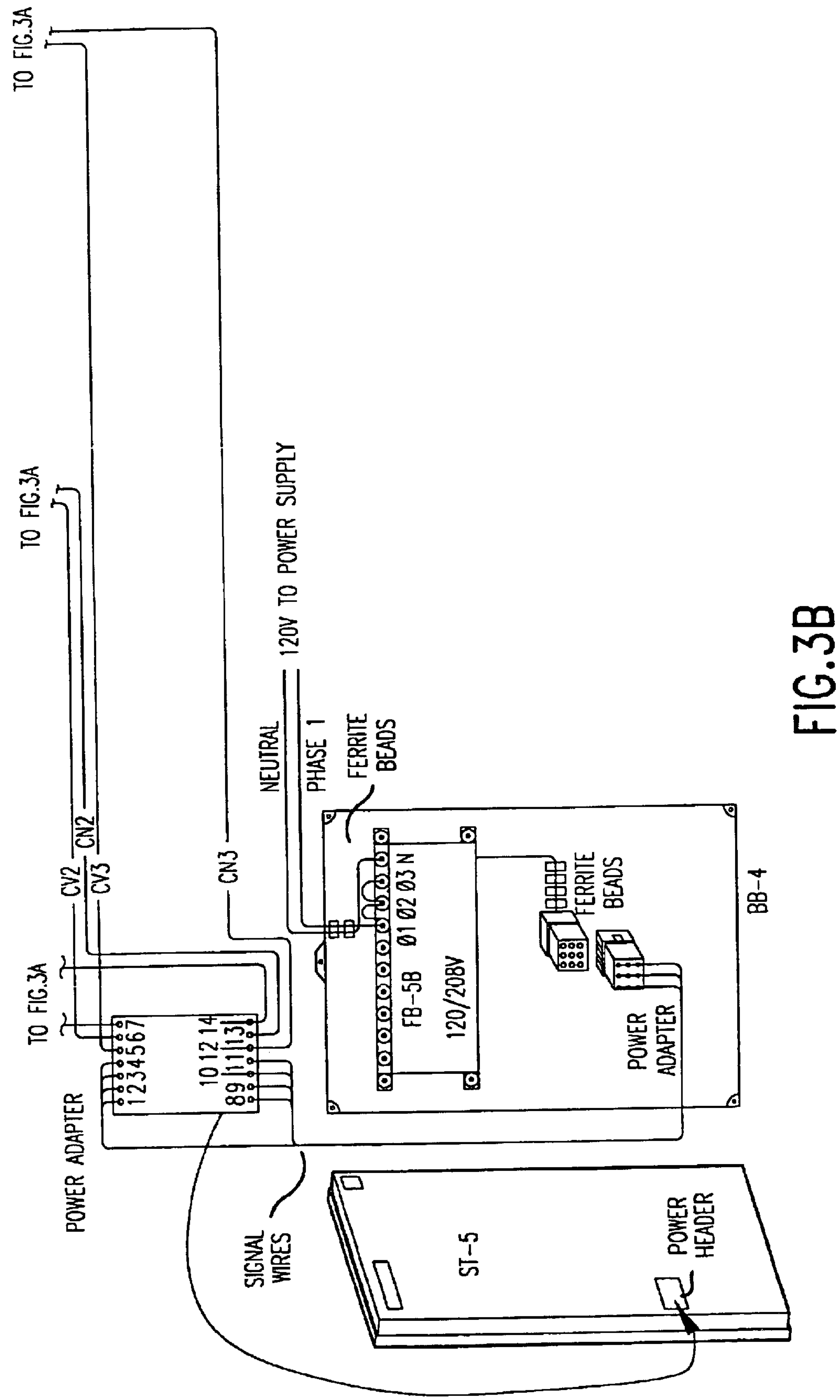
Figure 4:
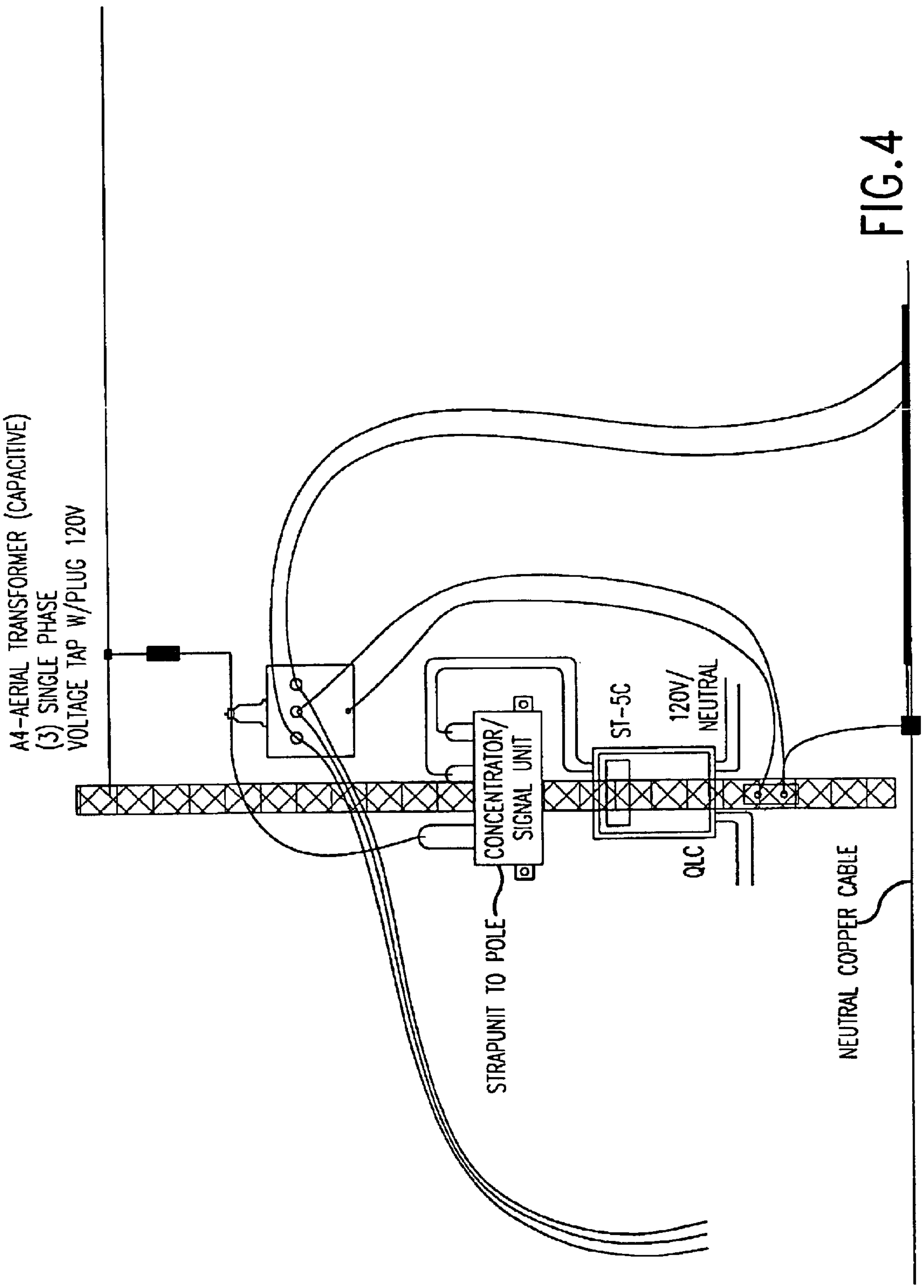
FIG. 4 is an aerial transformer and coupling diagram.
Figure 5:
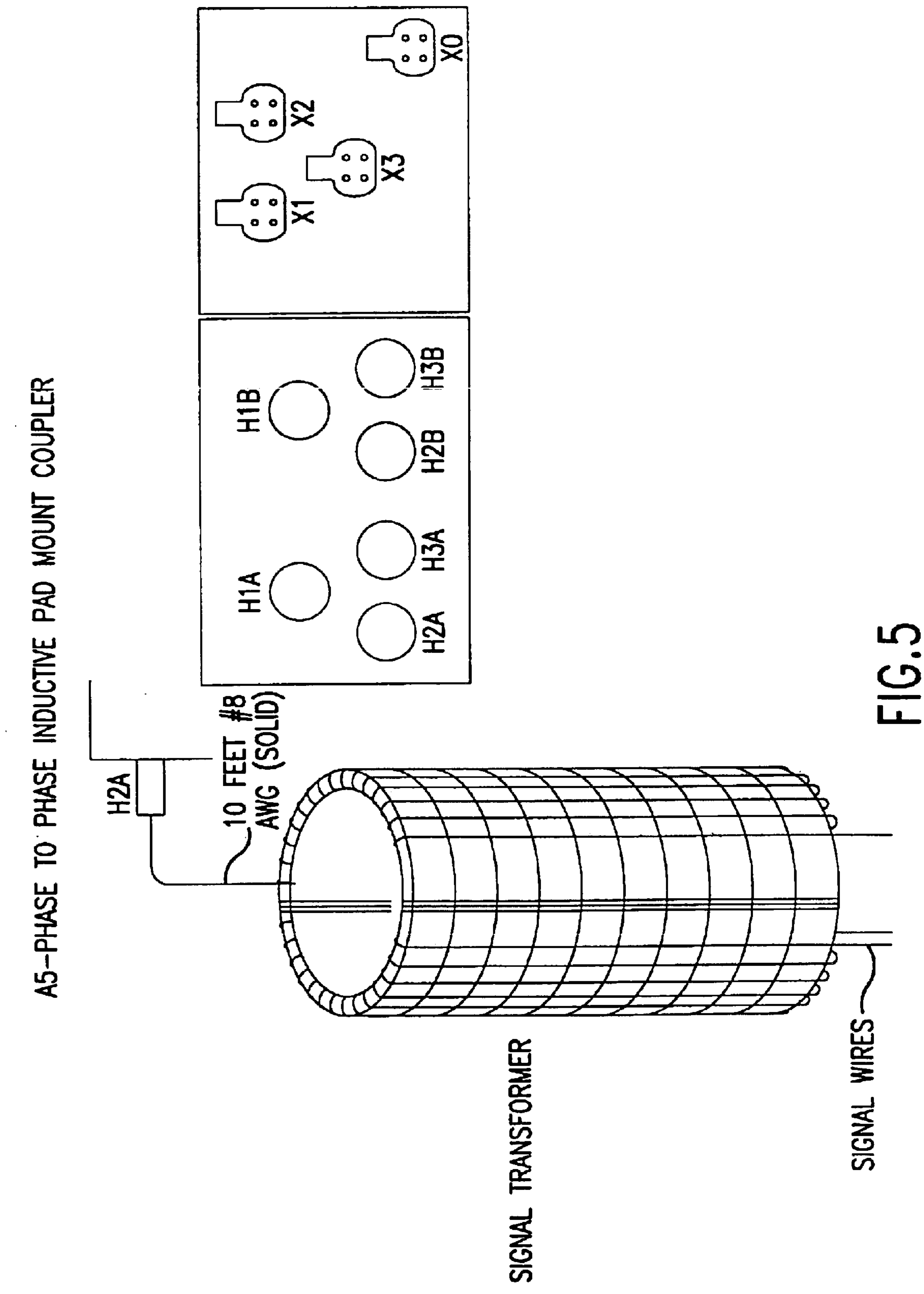
FIG. 5 is a phase-to-phase inductive pad mount coupler diagram.
Figure 6:
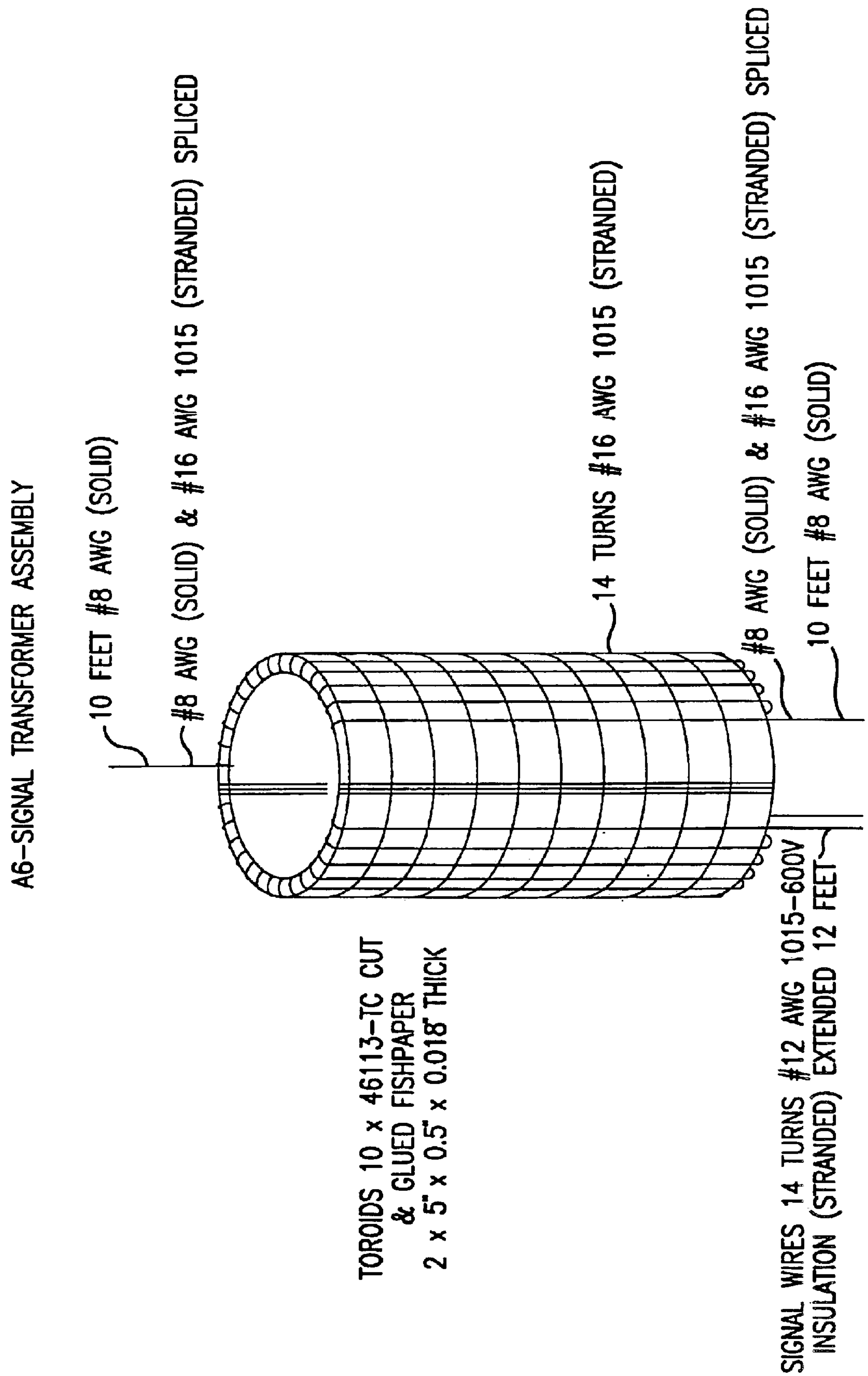
FIG. 6 is a signal transformer assembly diagram.
Figure 7:
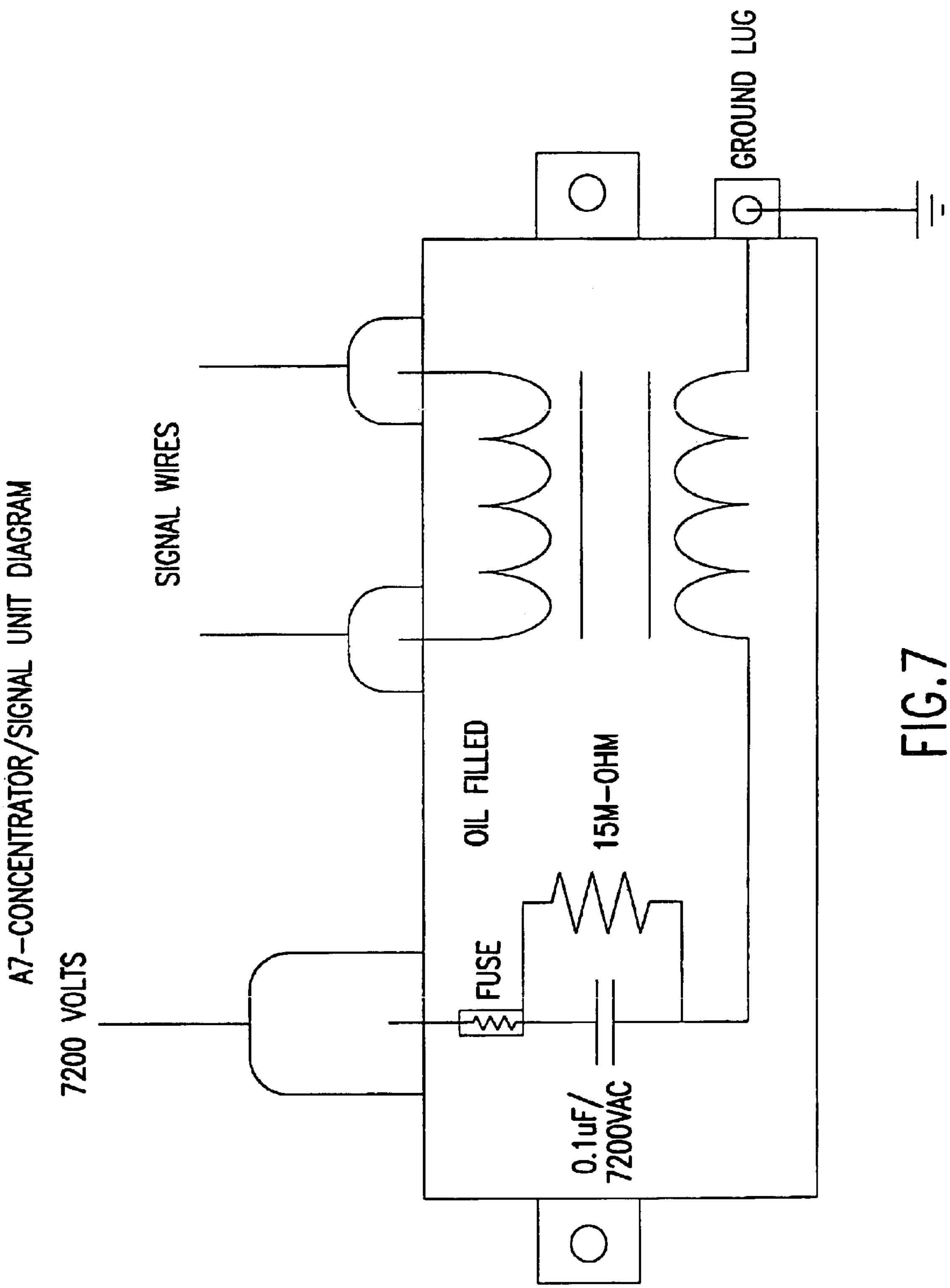
FIG. 7 is a concentrator/signal unit diagram.
Figure 8A:
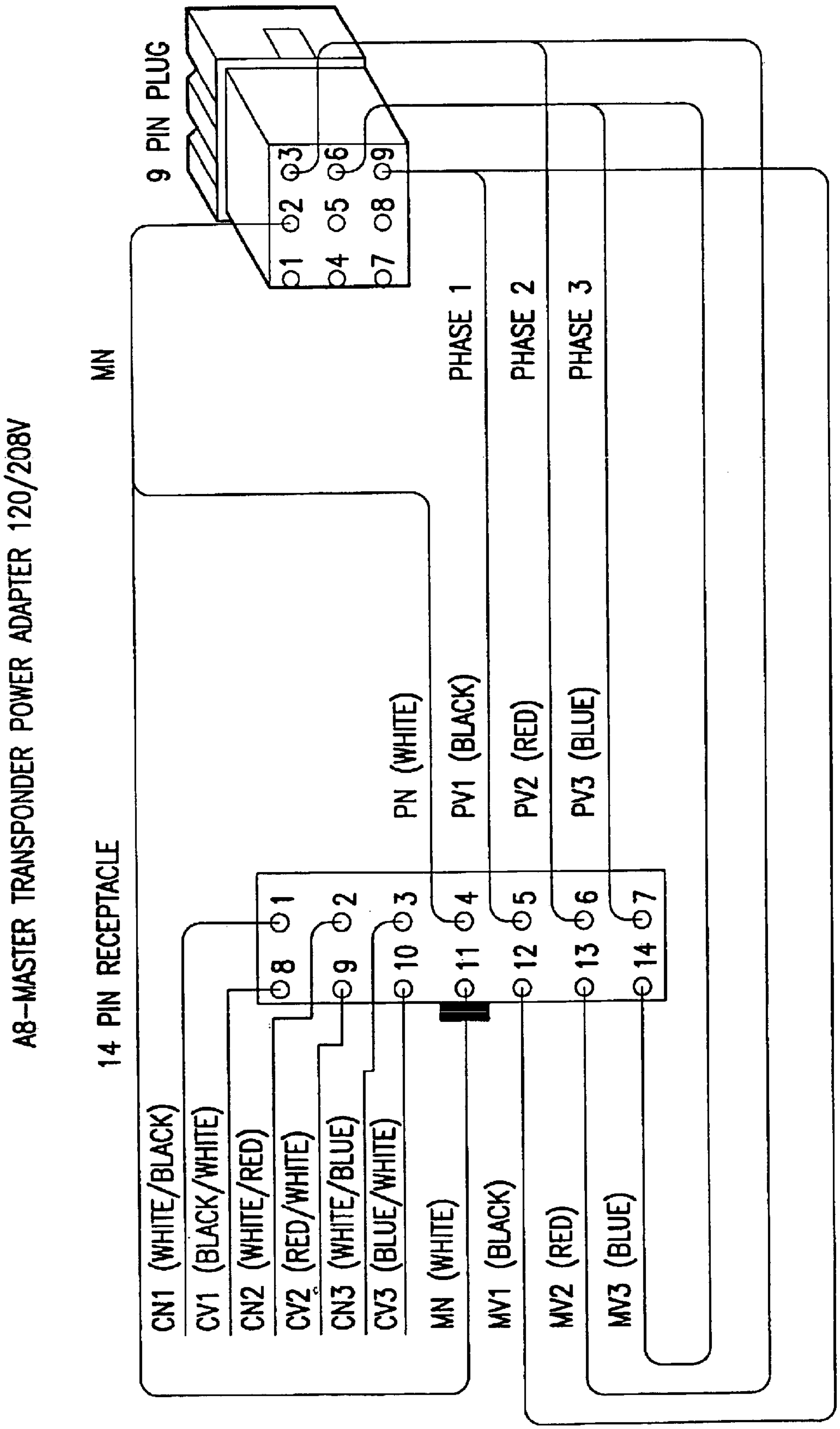
FIG. 8 is a master and slave transponder power adapter diagram.
Figure 8B:
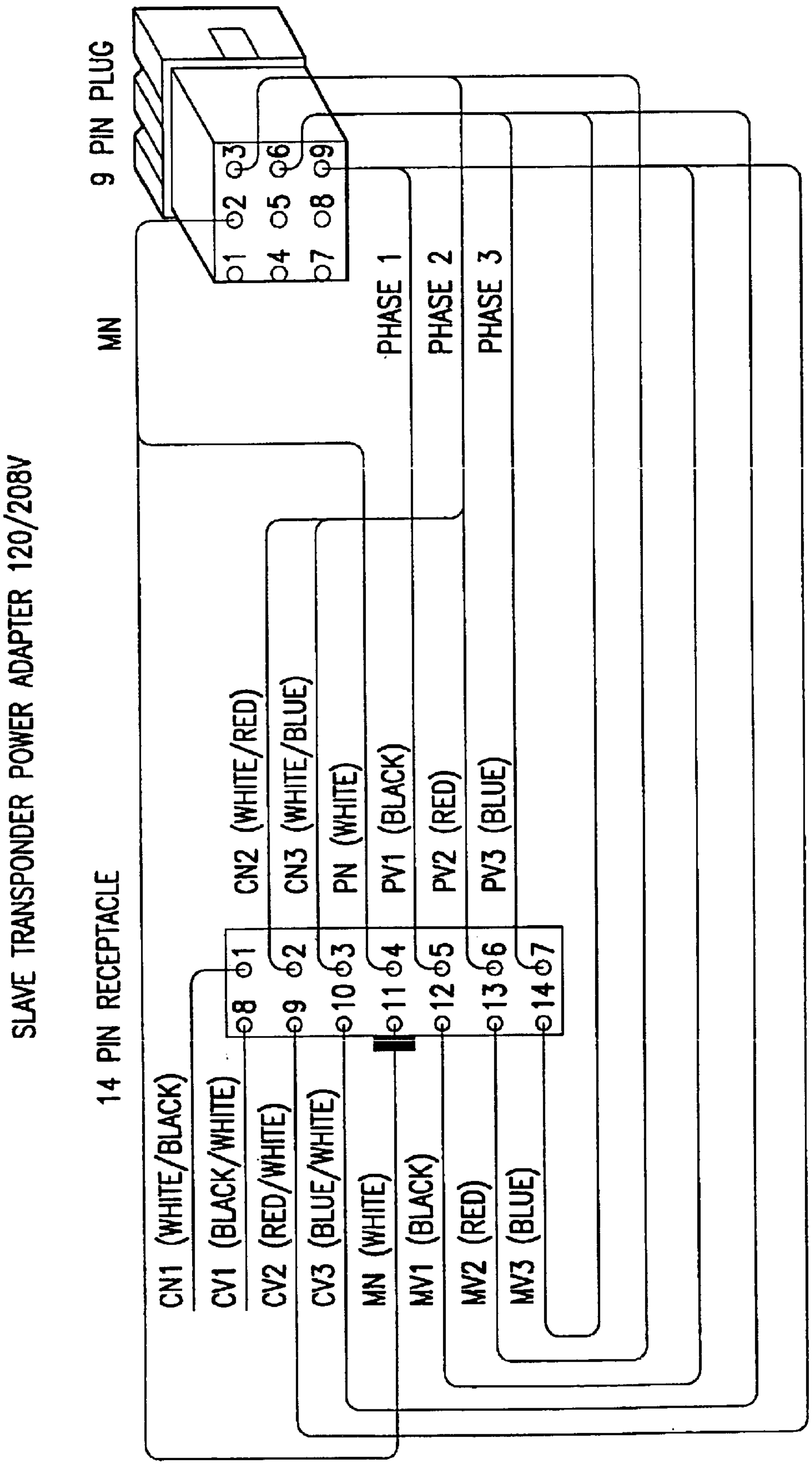
Figure 9A:
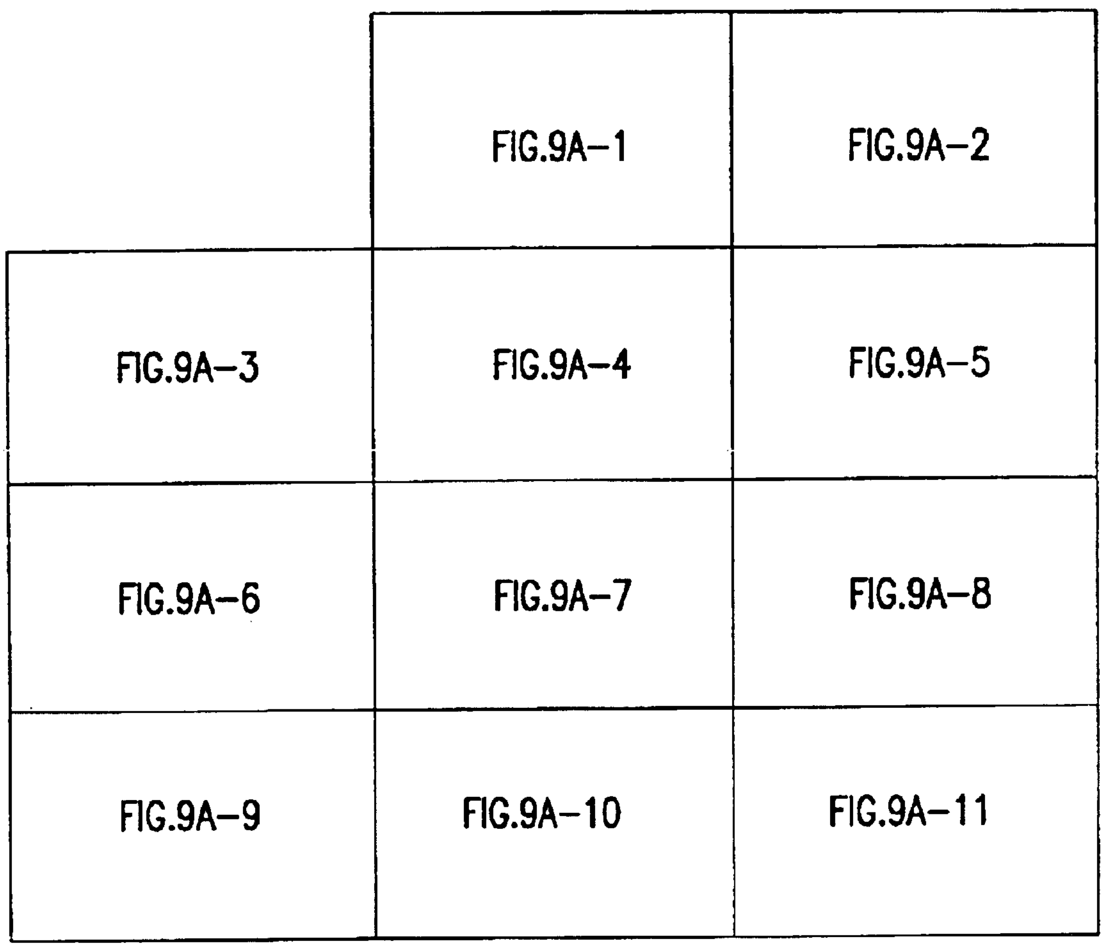
FIGS. 9A–B and 10 provide a Display Board schematic diagram.
Figures 1, 9A:
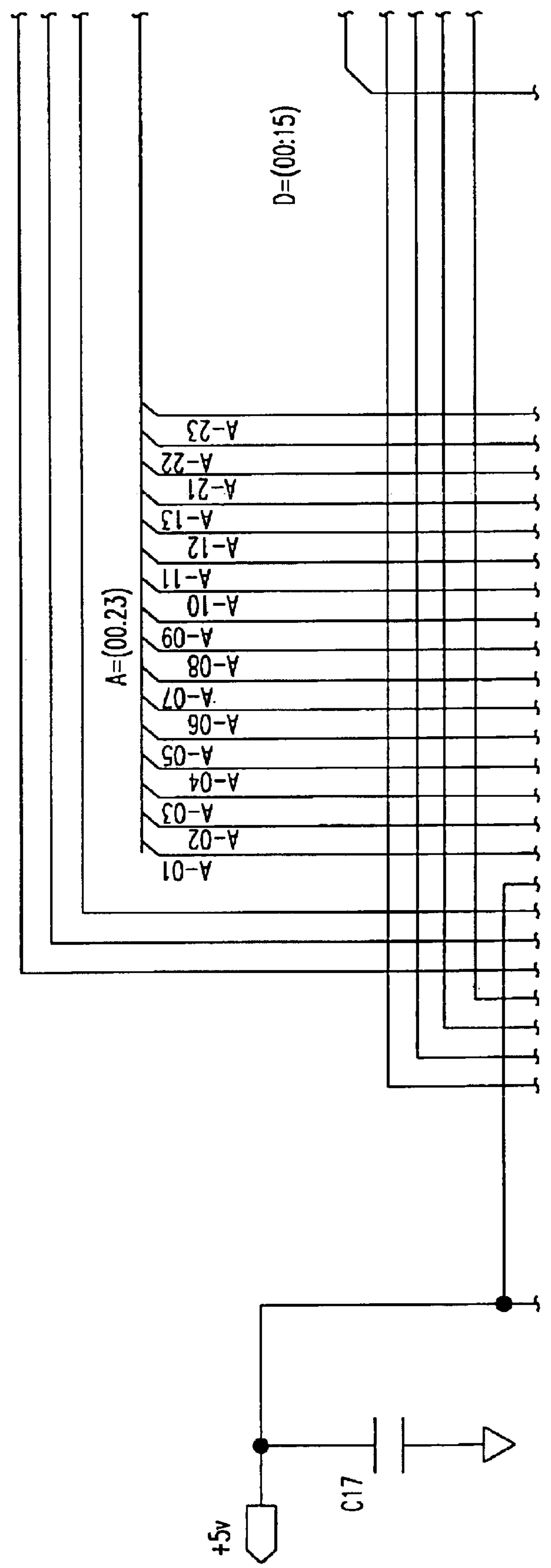
Figures 2, 9A:
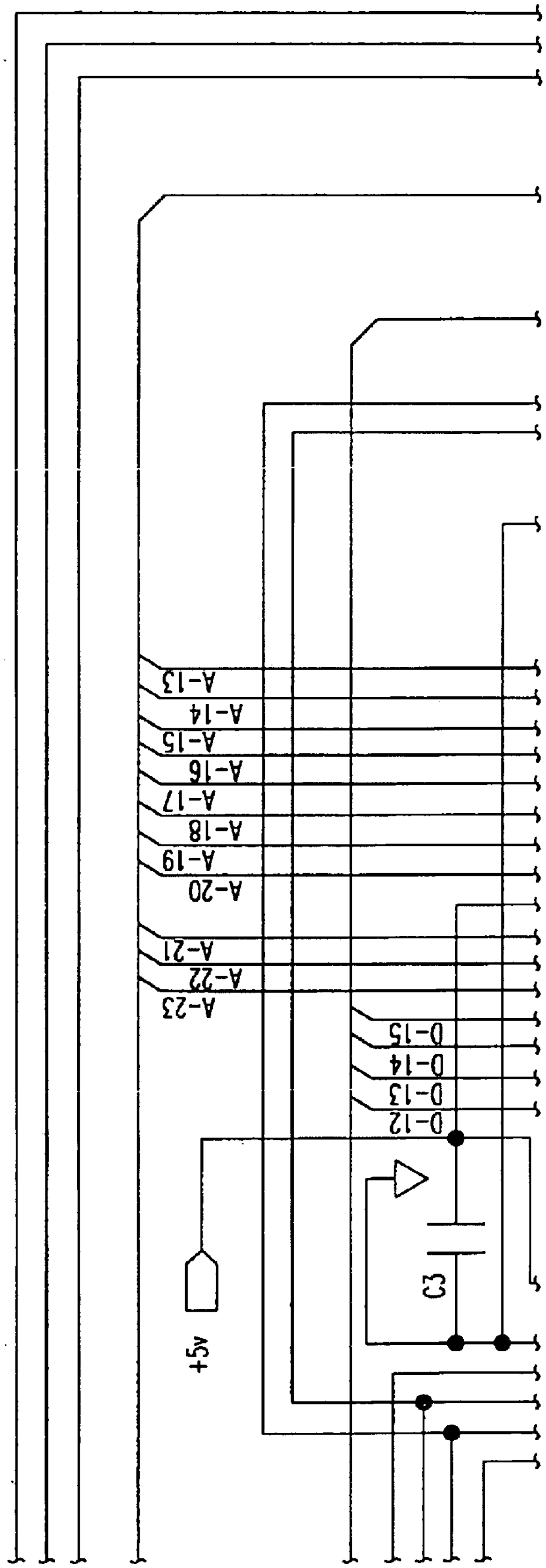
Figures 3, 9A:
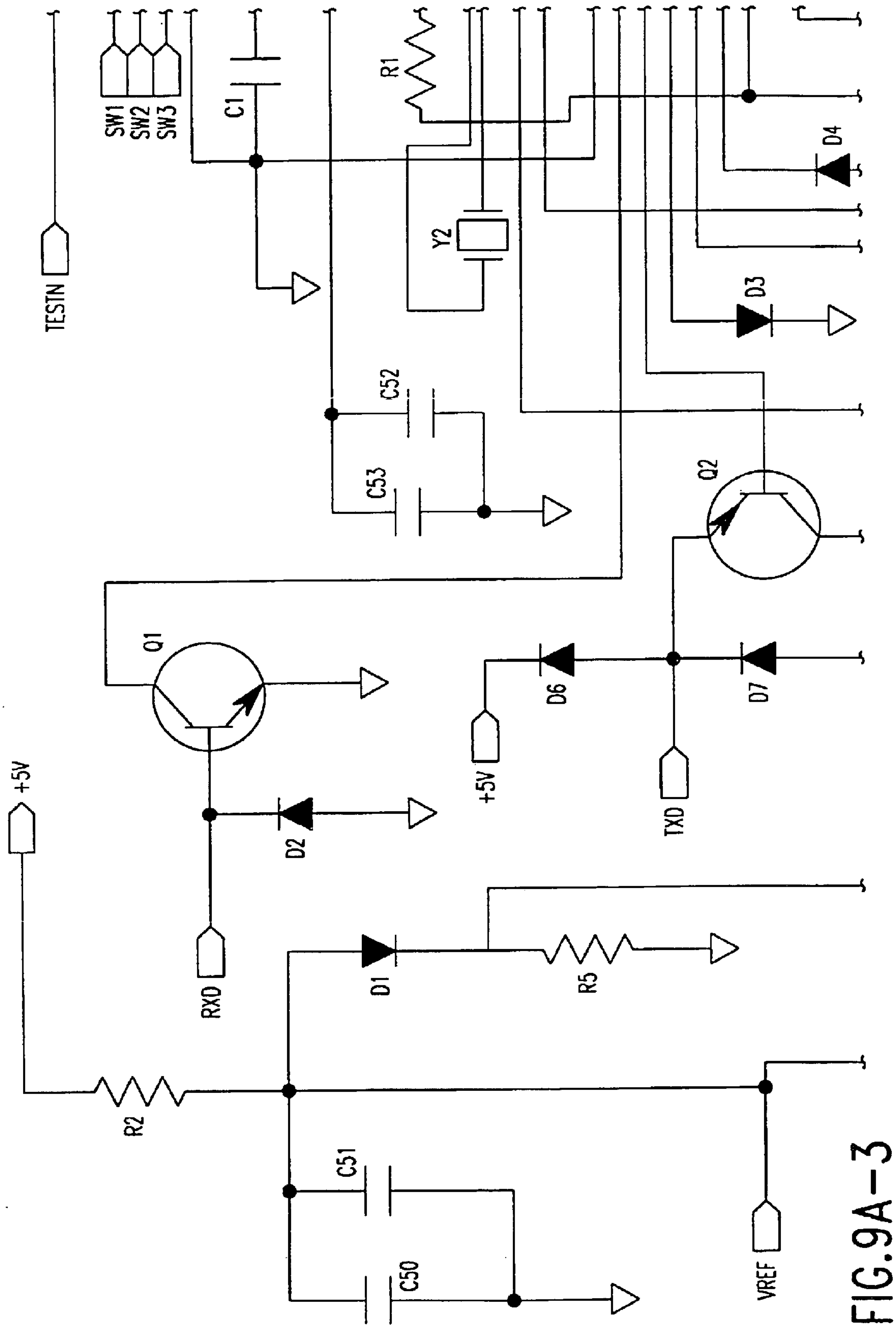
Figures 4, 9A:
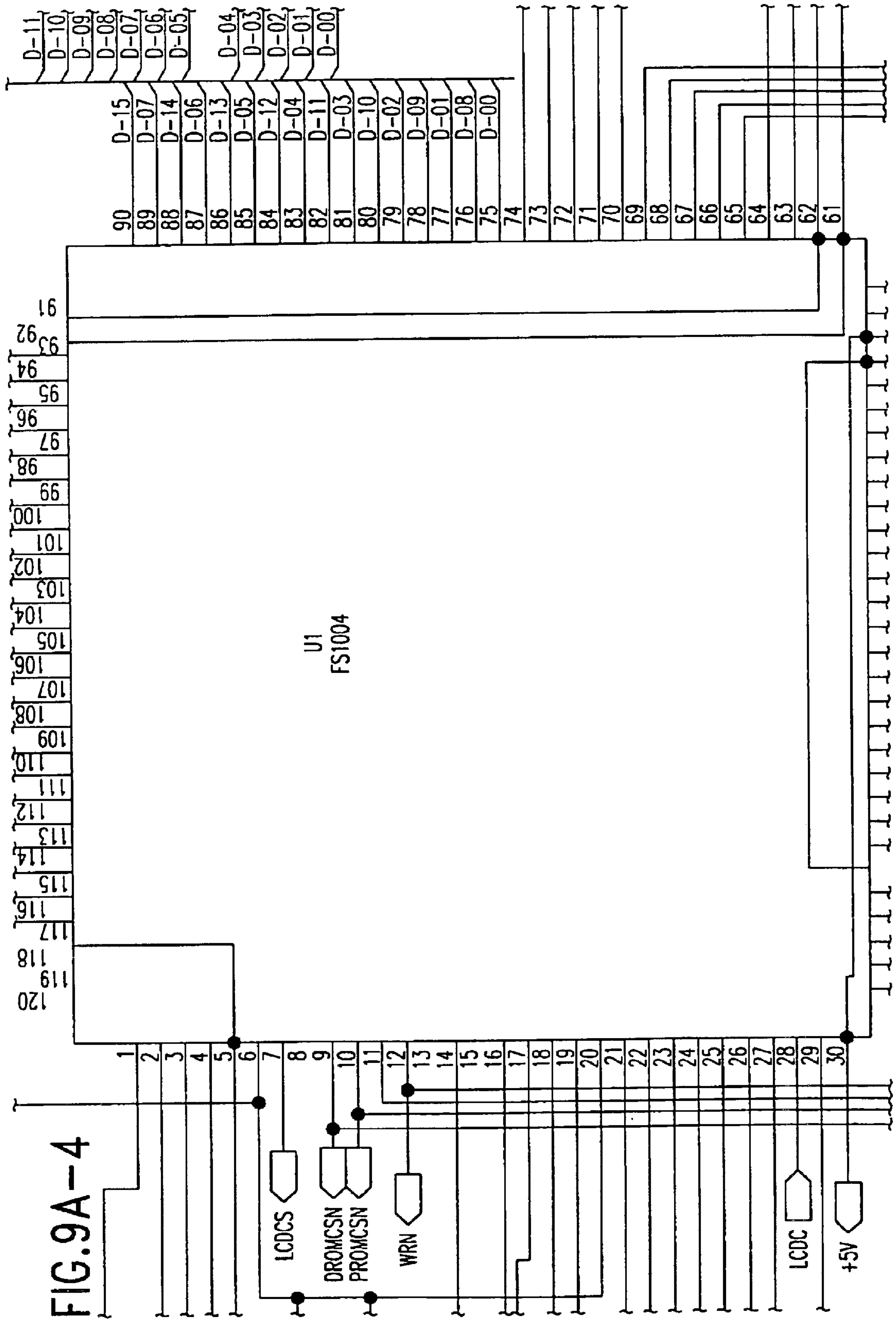
Figures 5, 9A:
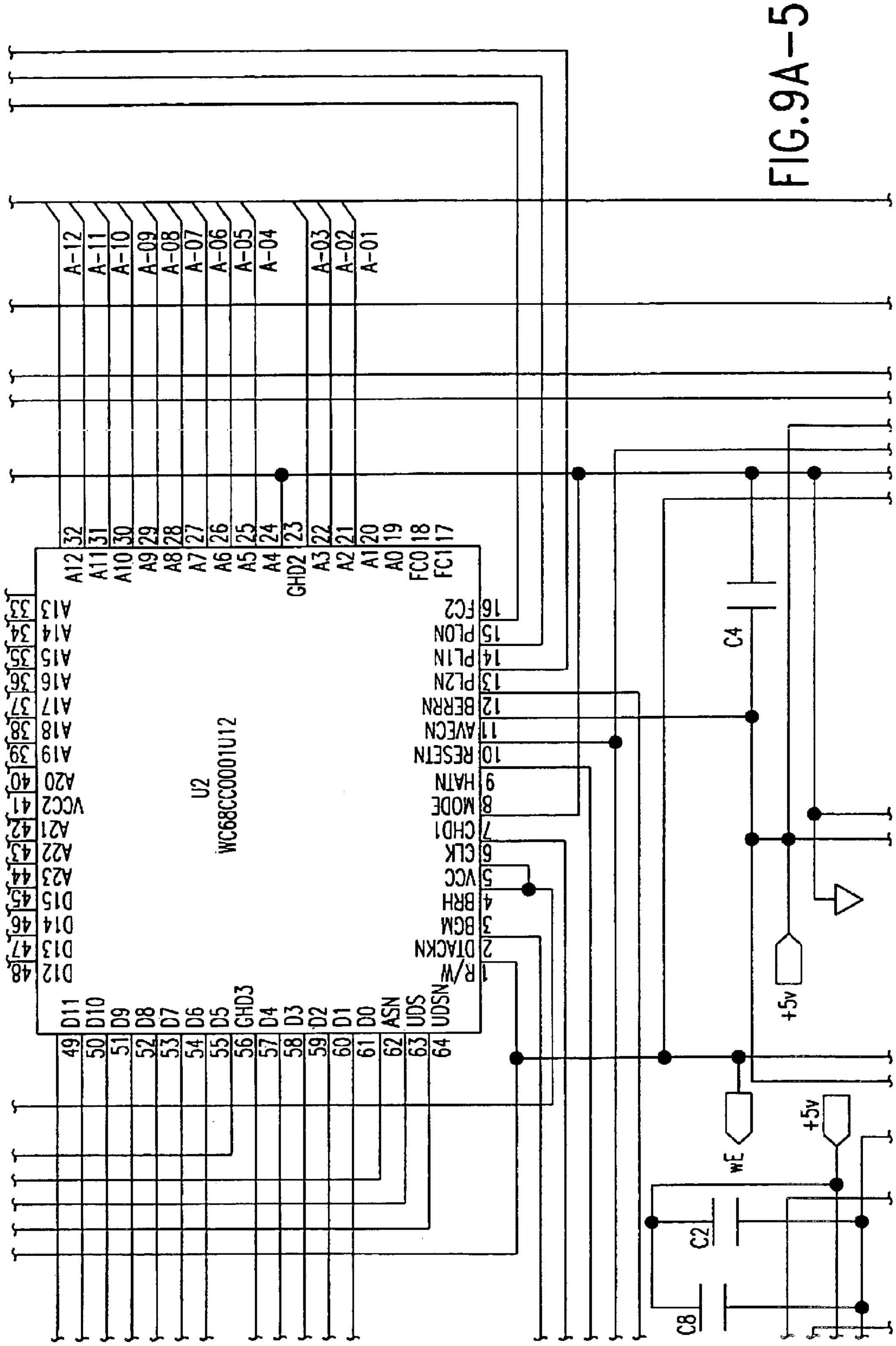
Figures 6, 9A:
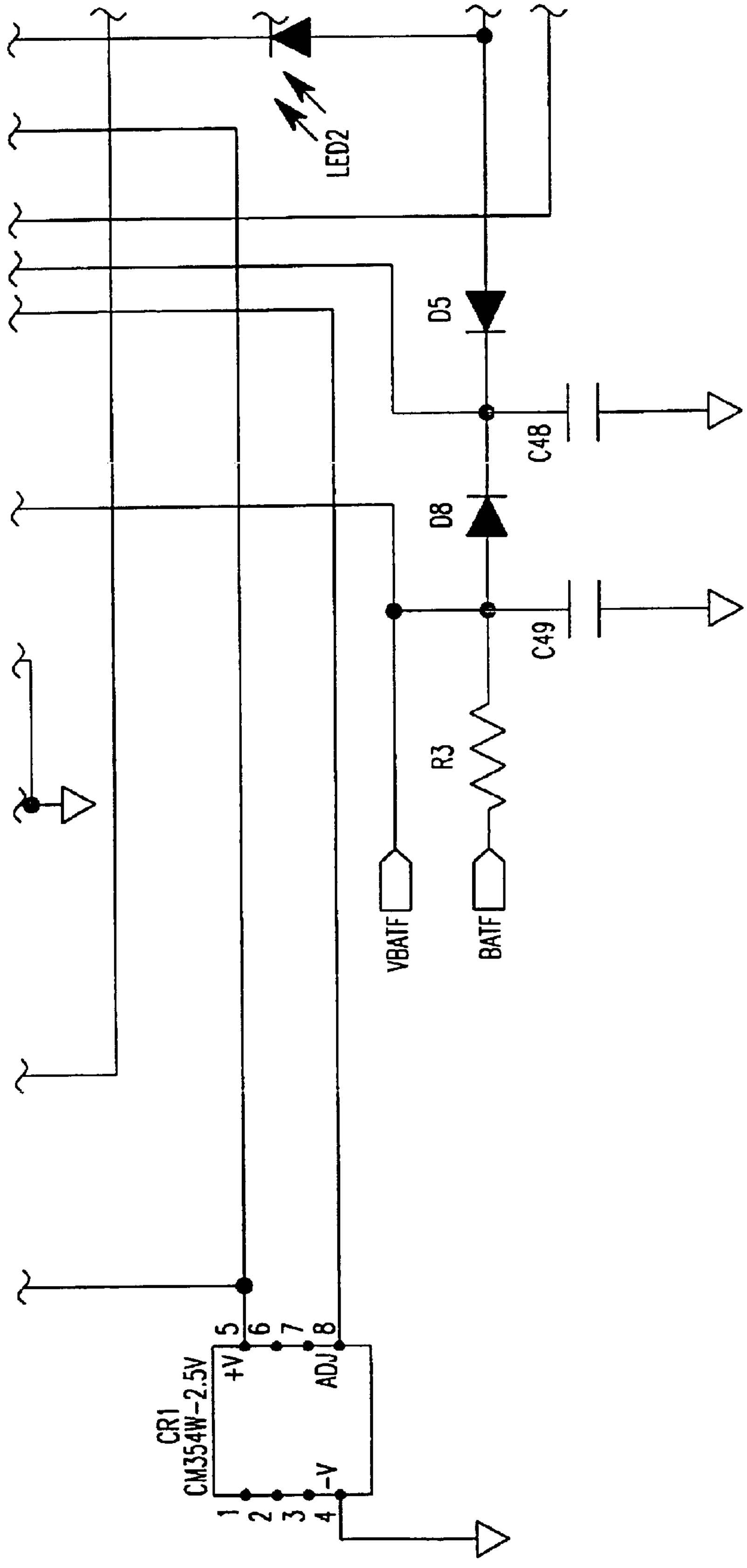
Figures 7, 9A:
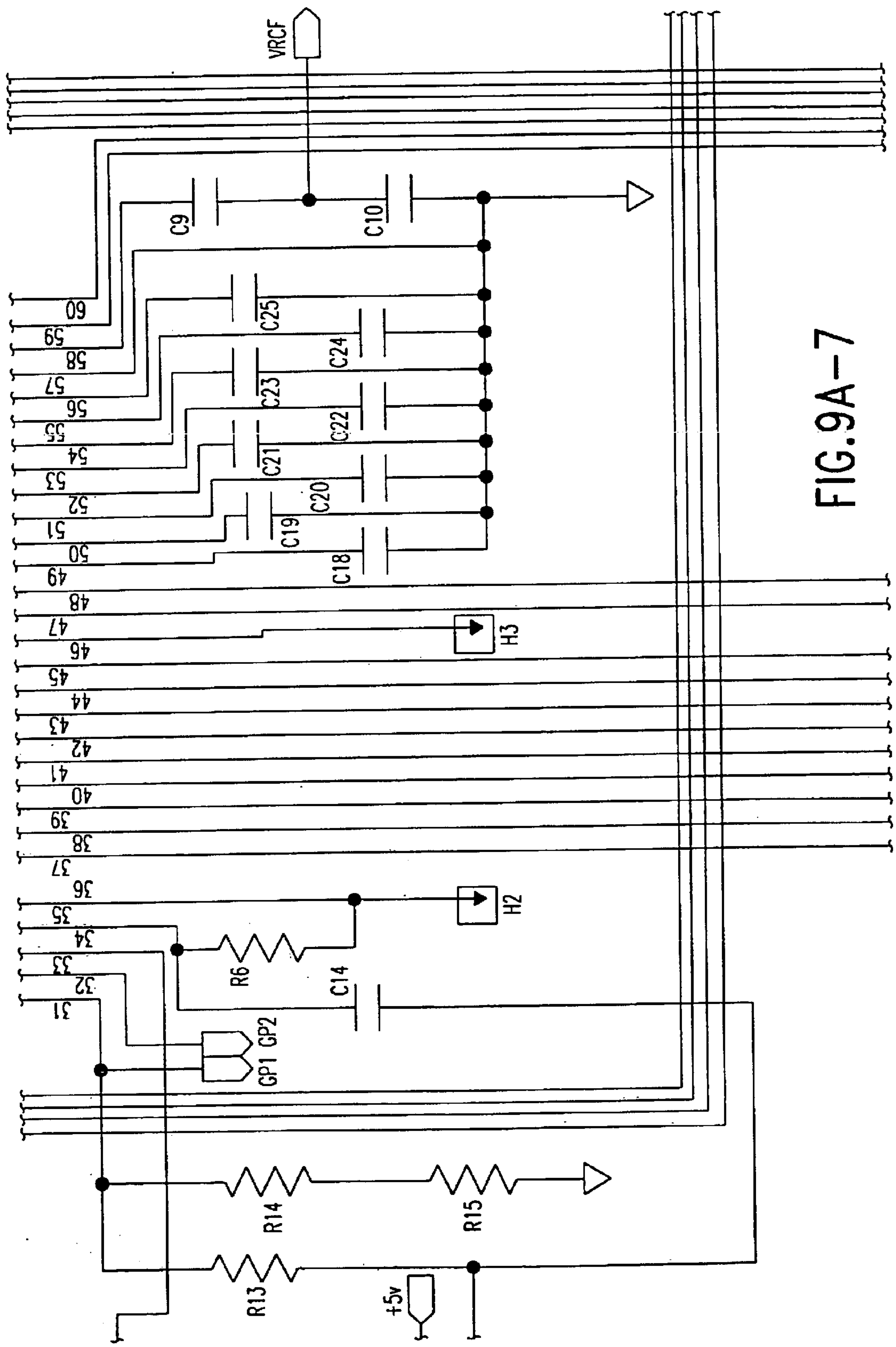
Figures 8, 9A:
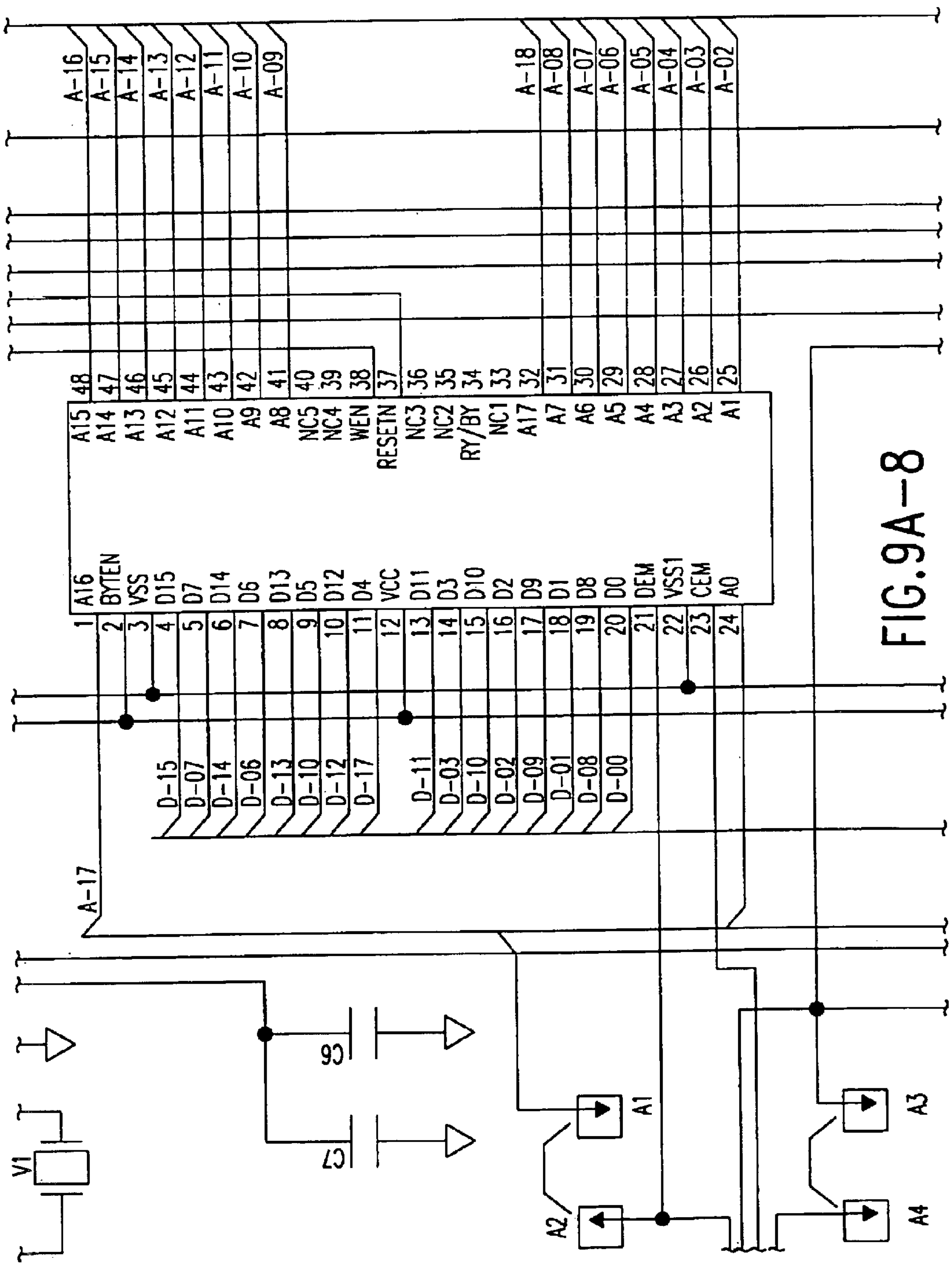
Figures 9, 9A:
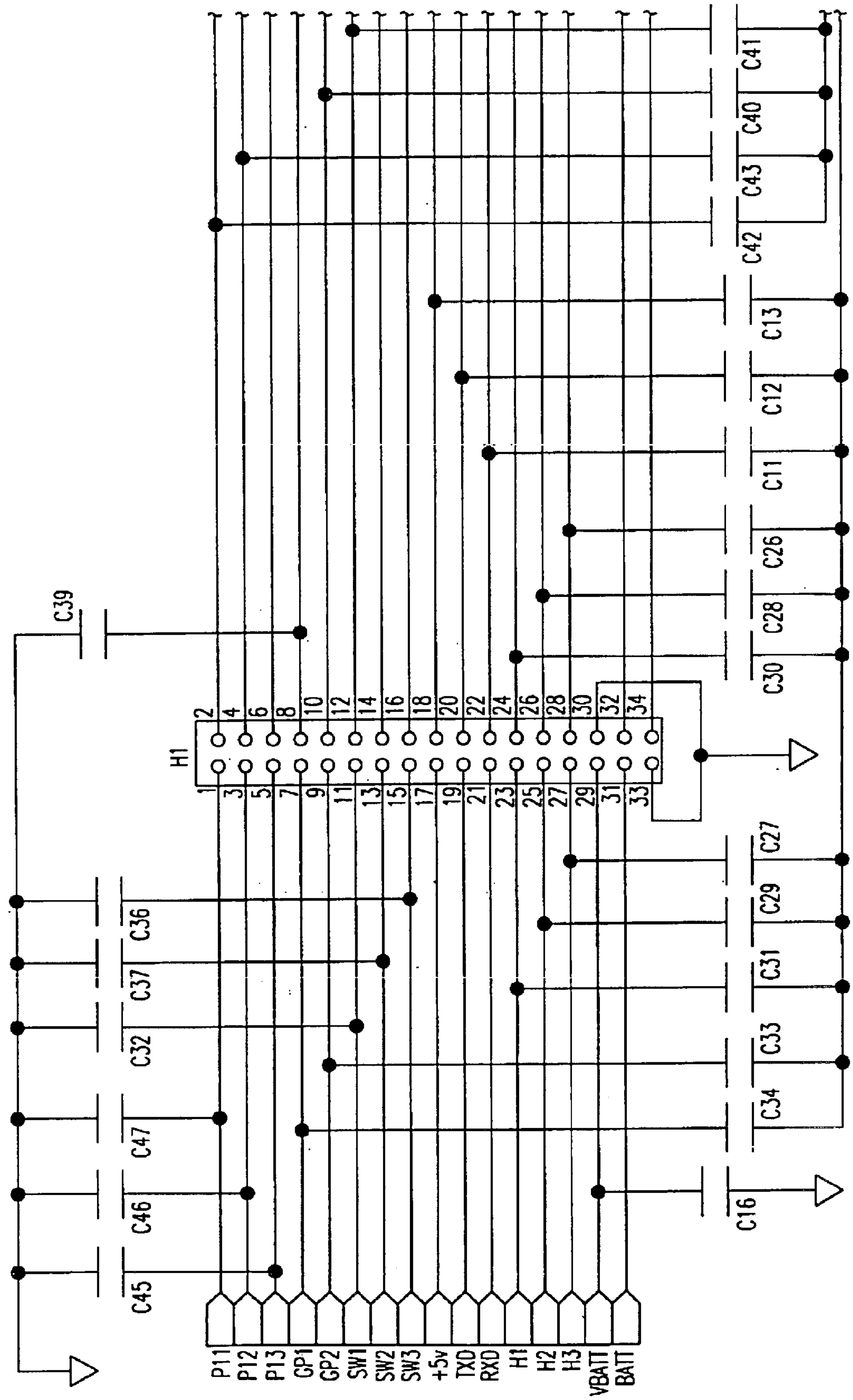

A full system drawing for a preferred embodiment of the present invention can be found in FIGS. 1–8. The system preferably reads meters using four communications media: low voltage (120 volt) power lines, medium voltage distribution lines (12,500 volt), a municipal fiber optic communications ring, and the Internet. FIG. 1 is an overall installation diagram for a preferred embodiment of the present invention. FIG. 2 is an installation diagram for a slave (low-level) transponder. FIG. 3 is a substation installation diagram of a master (high-level) transponder. FIG. 4 is an aerial transformer and coupling diagram. FIG. 5 is a phase-to-phase inductive pad mount coupler diagram. FIG. 6 is a signal transformer assembly diagram. FIG. 7 is a concentrator/signal unit diagram. FIG. 8 is a master and slave transponder power adapter diagram.

The system and method of a preferred embodiment of the present invention comprises the following components (see FIG. 1):

(1) Transmeters 100. These are the meters which monitor electricity, gas and water at the customer site.

(2) Low-level Transponders 110. Utility distribution systems have distribution transformers 115 to bring medium voltage distribution voltages (4×V through 33 kv) down to the low voltages (120–600 volt) connected to the customers. Low-level Transponders communicate with the Transmeters and with high-level Transponders 130 located at substations. Transponders of either type are referred to herein as "data collectors" or simply as "transponders." The context of usage will convey to those skilled in the art whether the transponder being discussed is a high- or low-level transponder, and whether the distinction is relevant. Referring to the embodiment illustrated in FIG. 1, high-level Transponder 130 requests data from a low-level Transponder 110, which then requests the same data from a Transmeter 100 connected to the same distribution transformer. A low-level Transponder 110 preferably communicates on the medium distribution voltage using a coupler 120, which can be either: (A) an inductive coupler: a device that replaces the cable feeding the distribution transformer with medium distribution voltage (the inductive coupler has two signal wires that connect to the low-level Transponder), or (B) a capacitive coupler: a circuit that includes a capacitor and a signal transformer. Two signal wires connect to the Transponder.

A low-level Transponder 110 may have an optional meter with 24 channels. These channels can be used to measure energy delivered on up to 24 phases of individual feeders leaving the distribution transformer. This data may be used to identify losses by comparing aggregate readings of all Transmeters 100 connected by phase and by feeder to the known reading at the low-level Transponder. These losses may be caused by theft of service. Identification of theft of service is a feature of a preferred embodiment of the present invention.

High-level Transponders

A high-level Transponder ("Transponder 5") 130 communicates with Low-level Transponders 110, requesting specified data from specified Transmeters. The data request is made first, and then high-level Transponder 130 polls the low-level Transponder at a later time to see whether the data is ready. The high-level Transponder may request data from several low-level Transponders in sequence and poll them later. Because higher data rates are possible on the medium voltage than the low voltage, the system may thus obtain greater reading efficiency. The Transponders connect to one of several network media to communicate with the billing computer: (A) fiber optic network; (B) hard wire RS-485 network; (C) TCP/IP LAN; or (D) telephone lines.

Billing Computer

A Billing Computer 140 connects one or many communications networks to read data from many Transponders. The Billing computer is programmed to respond to requests from the utility or requests made over the Internet, and to deliver the required information in a form that is portable to whatever billing software the utility uses, typically MV-90.

Billing Computers may be interconnected over the Internet to form a WAN. The user accessing the site does not need to know which Billing Computer is requesting the information, nor the route to the high-level Transponder or low-level Transponder en route to the source of the information, the Transmeter.

Internet Interface

In a preferred embodiment, an Internet interface at the Billing Center allows the utility or its customer to access an Oracle database.

Preferred Embodiments—Common Features

Preferred embodiments of the submeter comprise a combination of a Display Board, a Power Board and a case to complete the product.

Figures 9, 9A, 10:
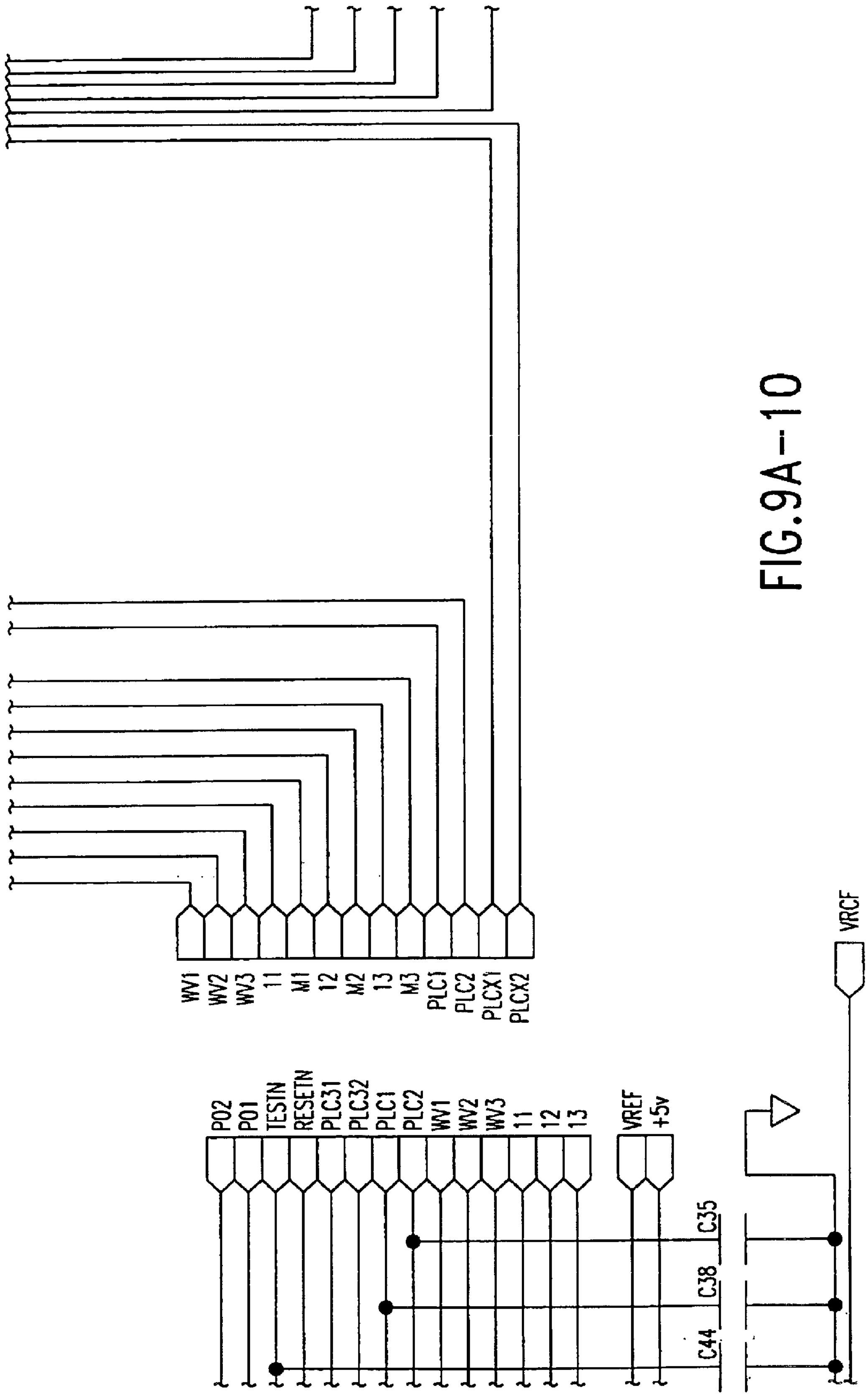
Figures 9, 9A, 10, 11:
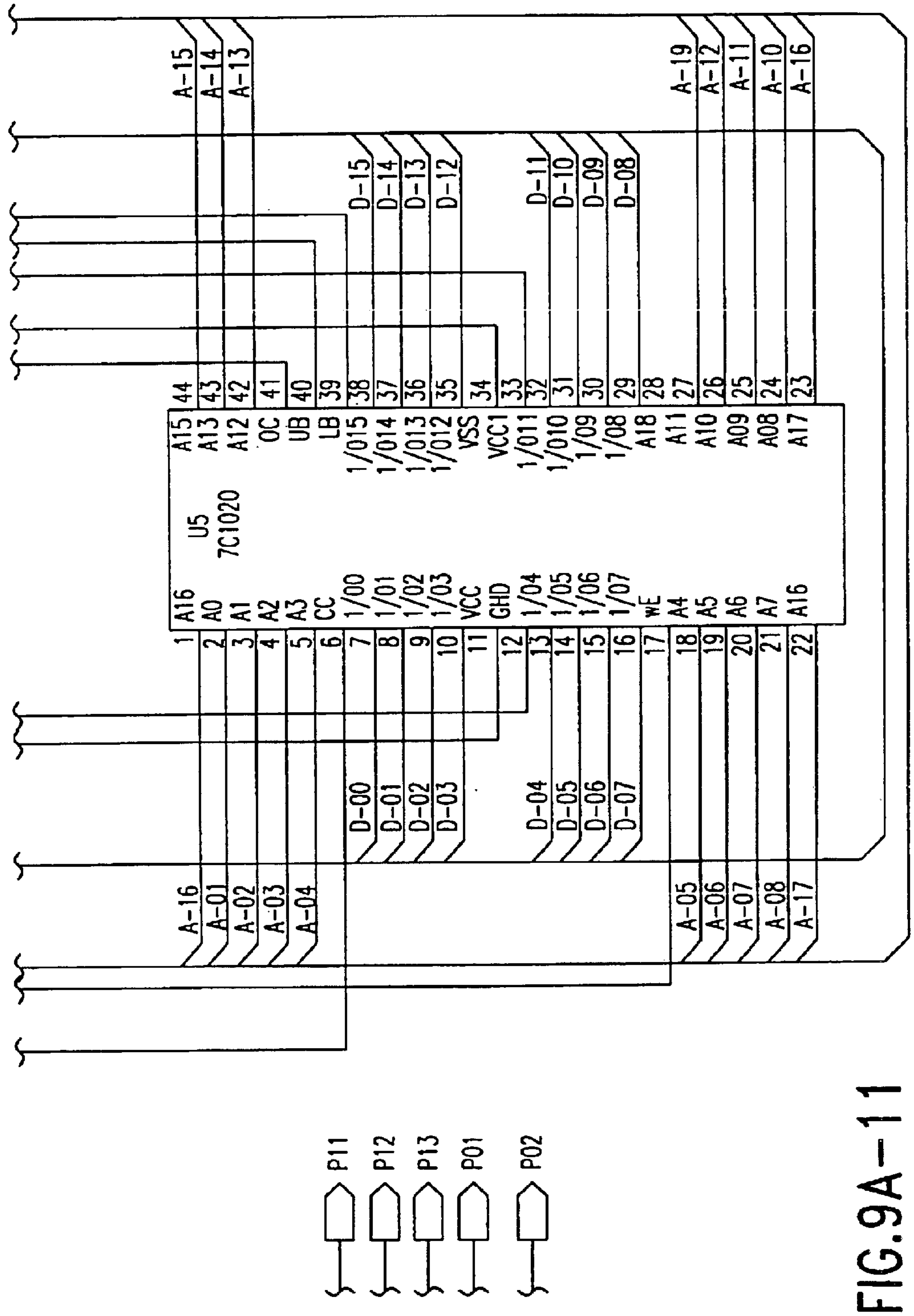
Figures 1, 9B:
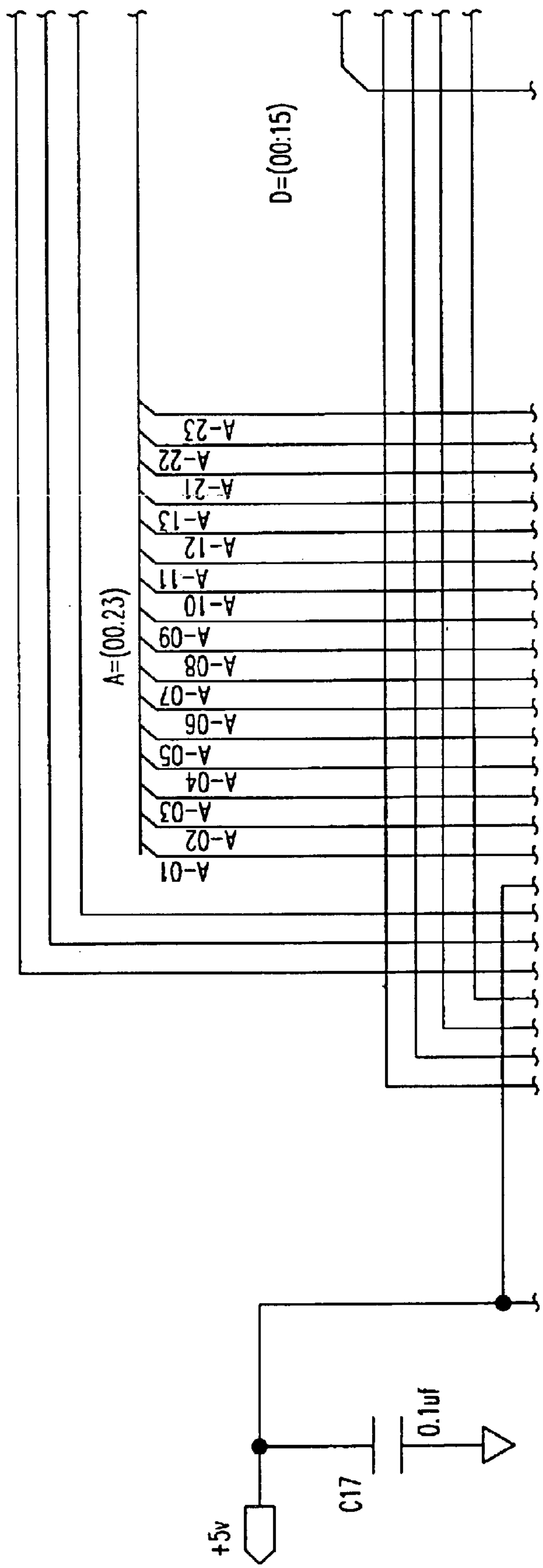
Figures 2, 9B:
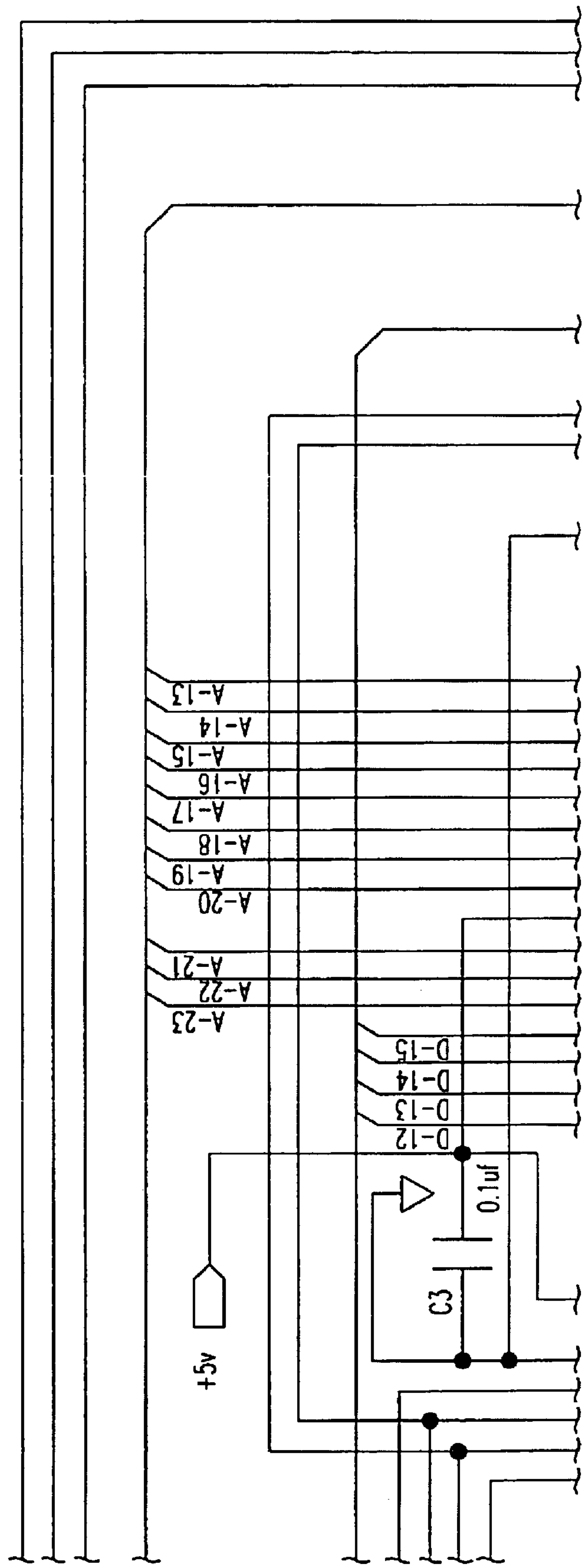
Figures 3, 9B:
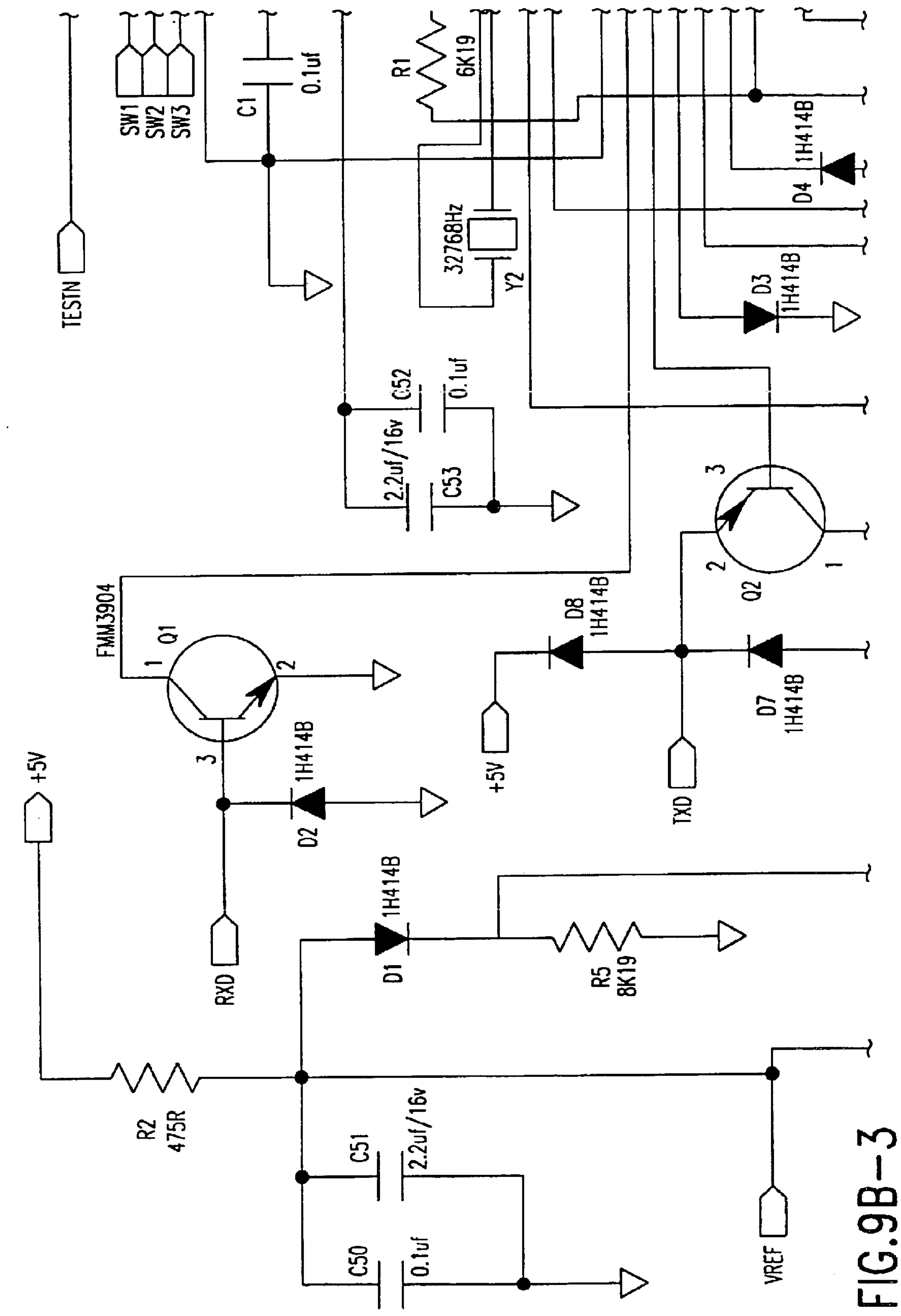
Figures 4, 9B:
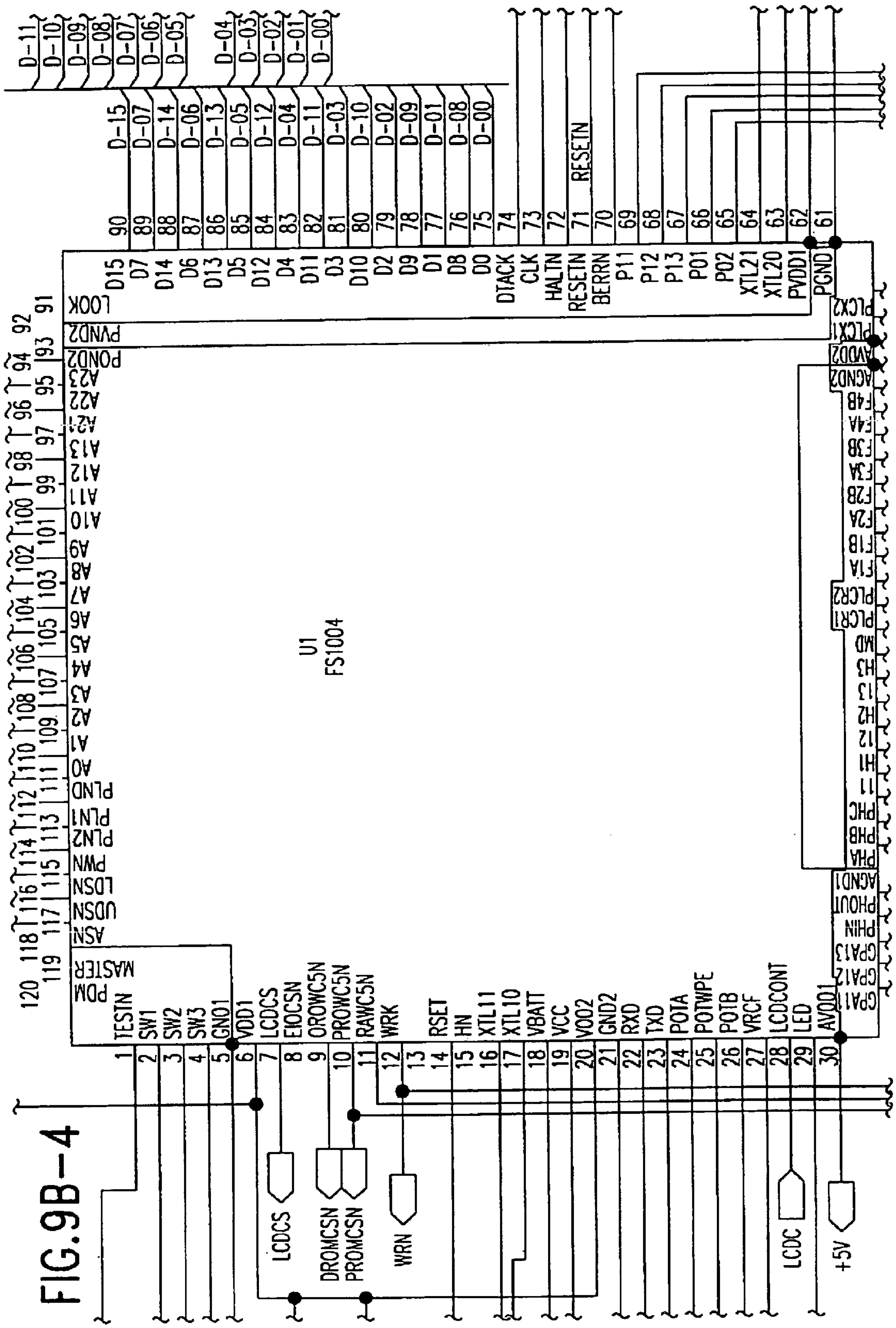
Figures 5, 9B:
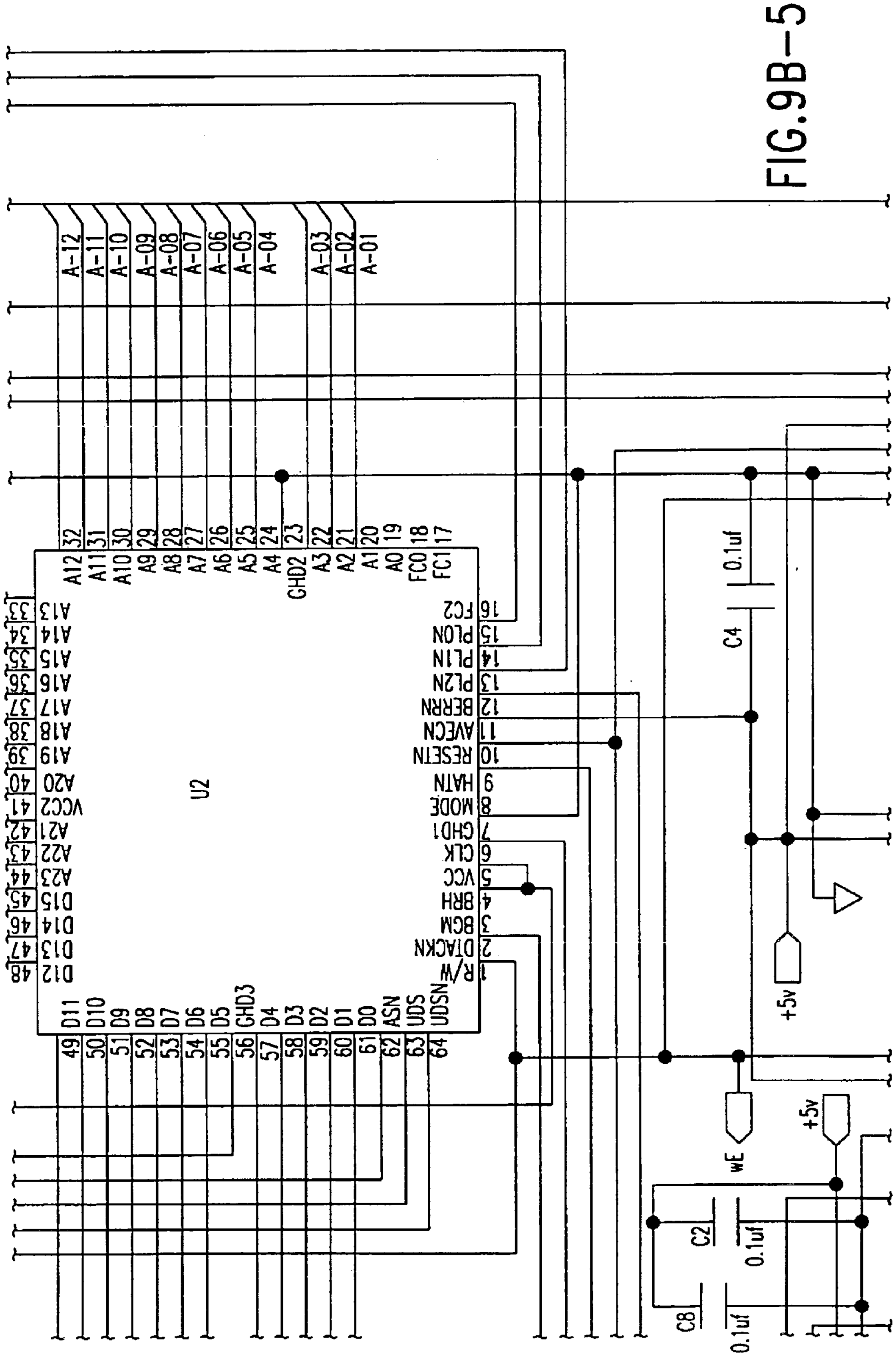
Figures 6, 9B:
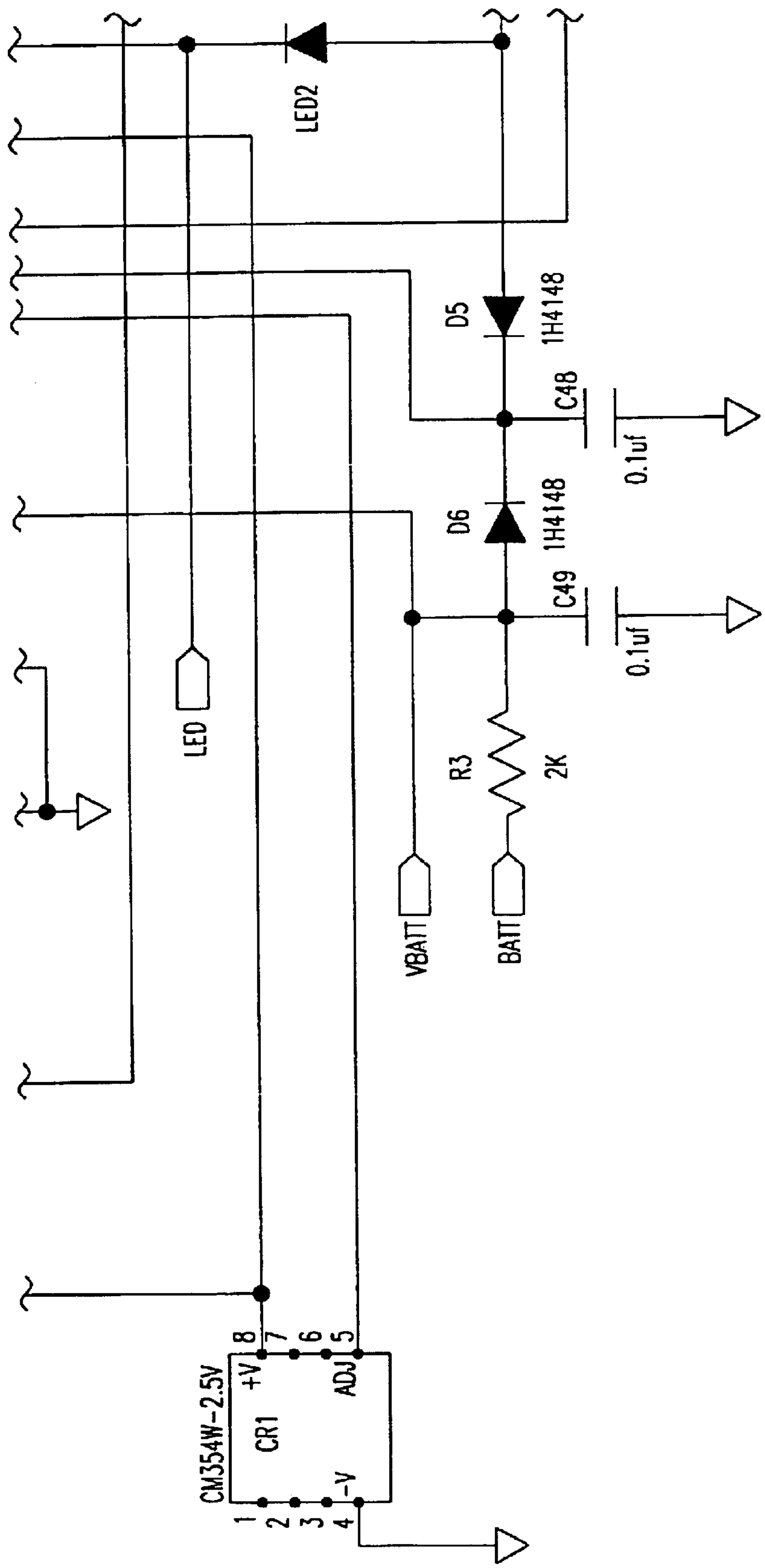
Figures 7, 9B:
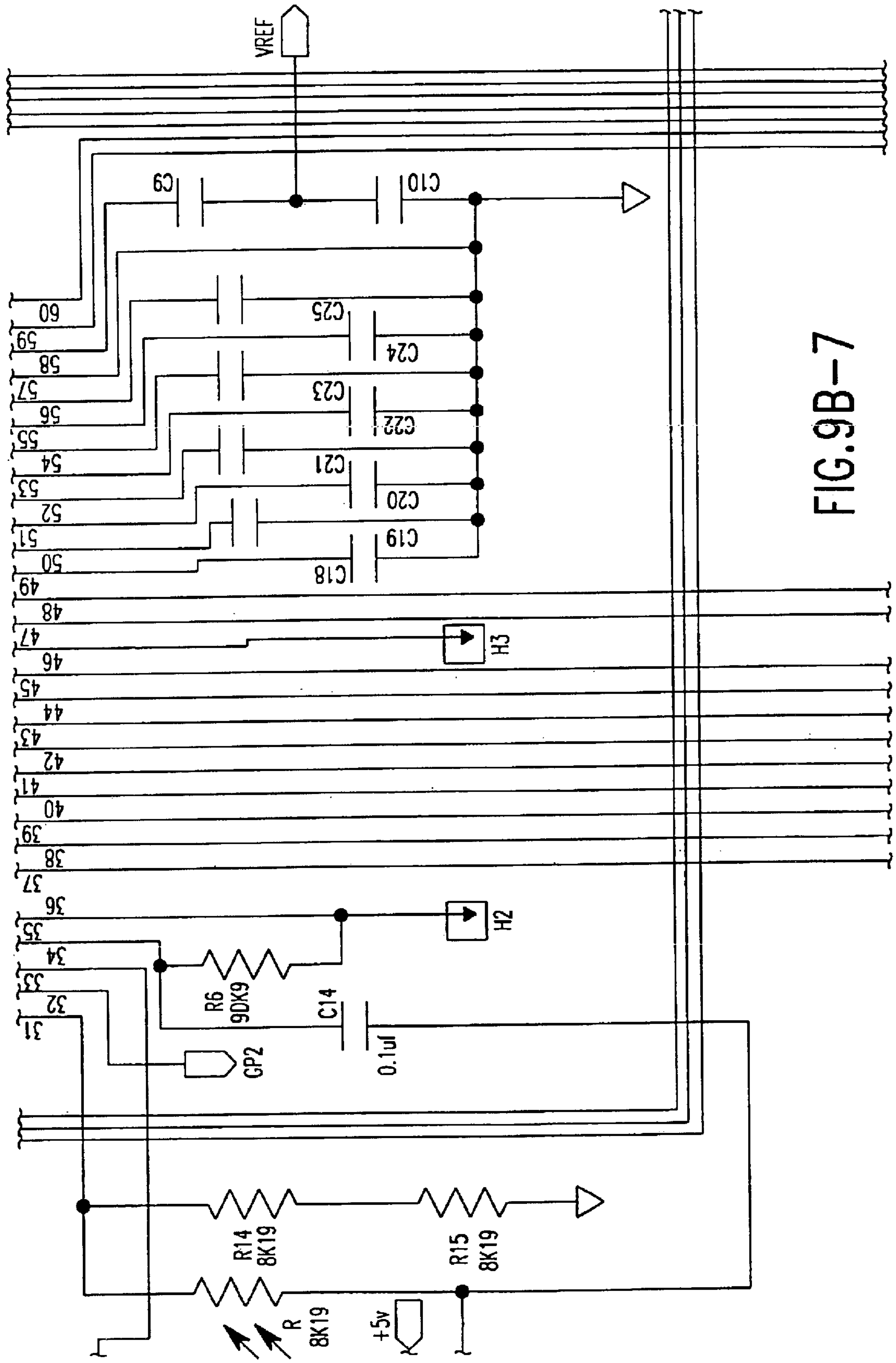
Figures 8, 9B:
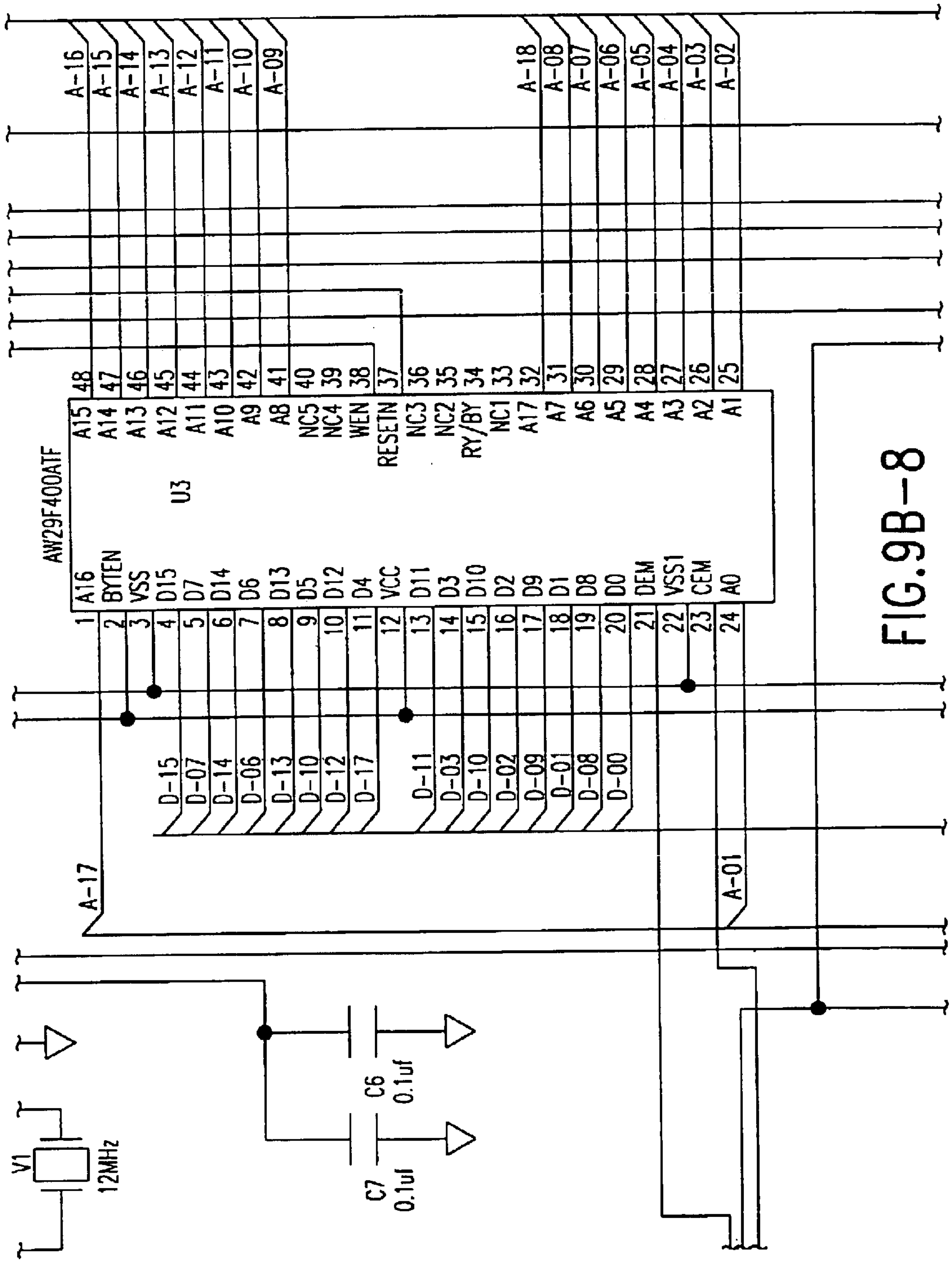
Figures 9, 9B:
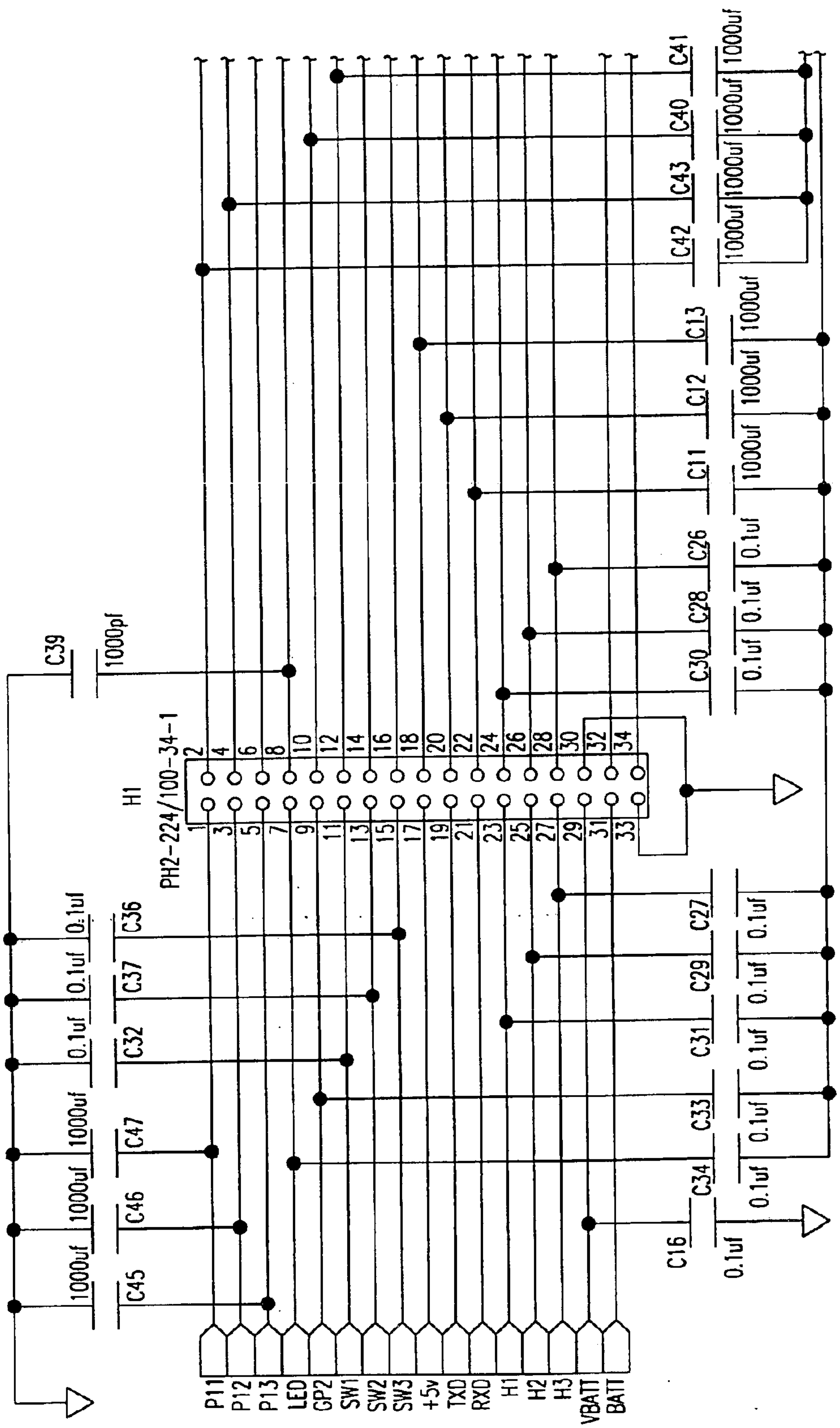
Figures 9, 9B, 10:
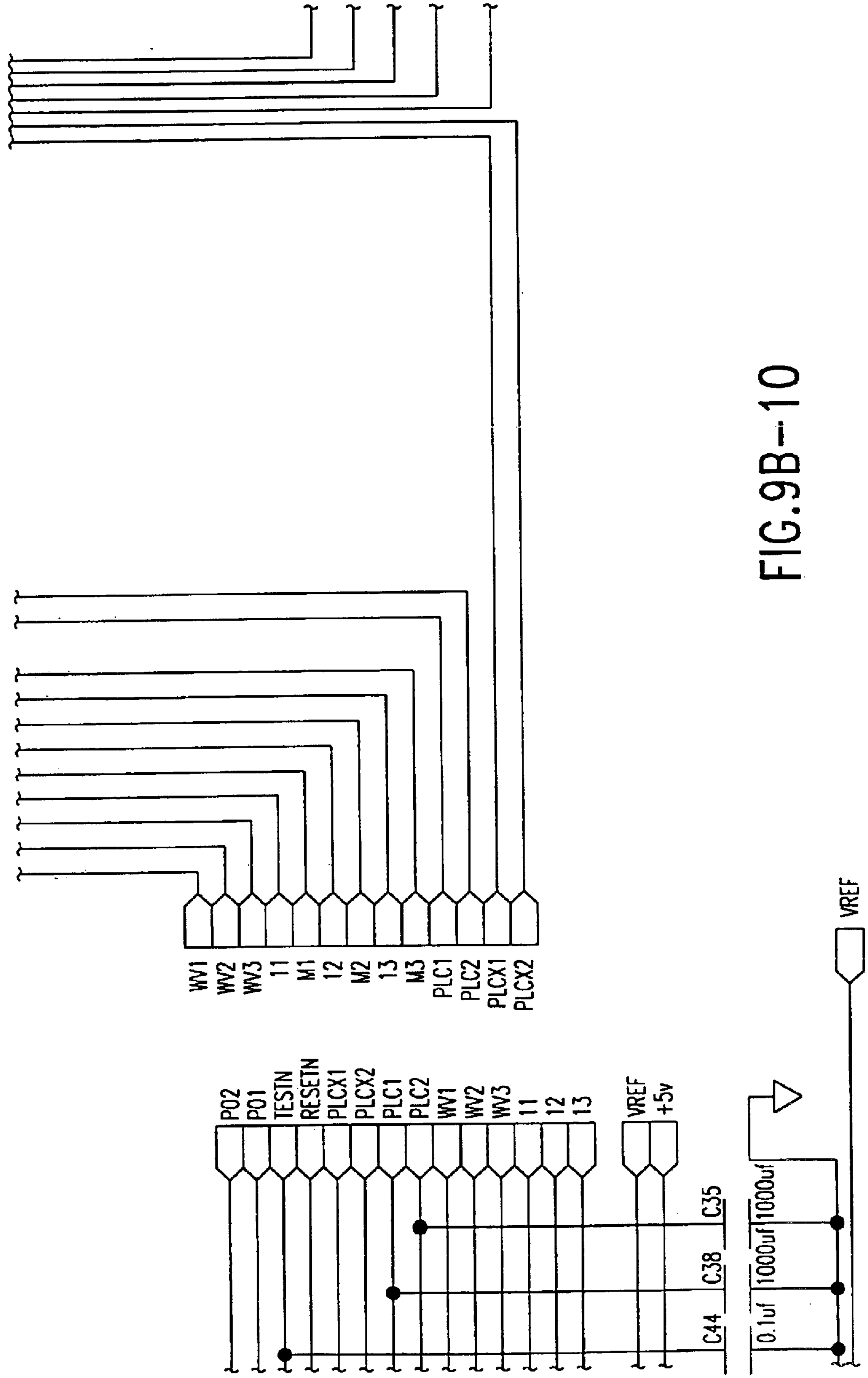
Figures 9, 9B, 10, 11:
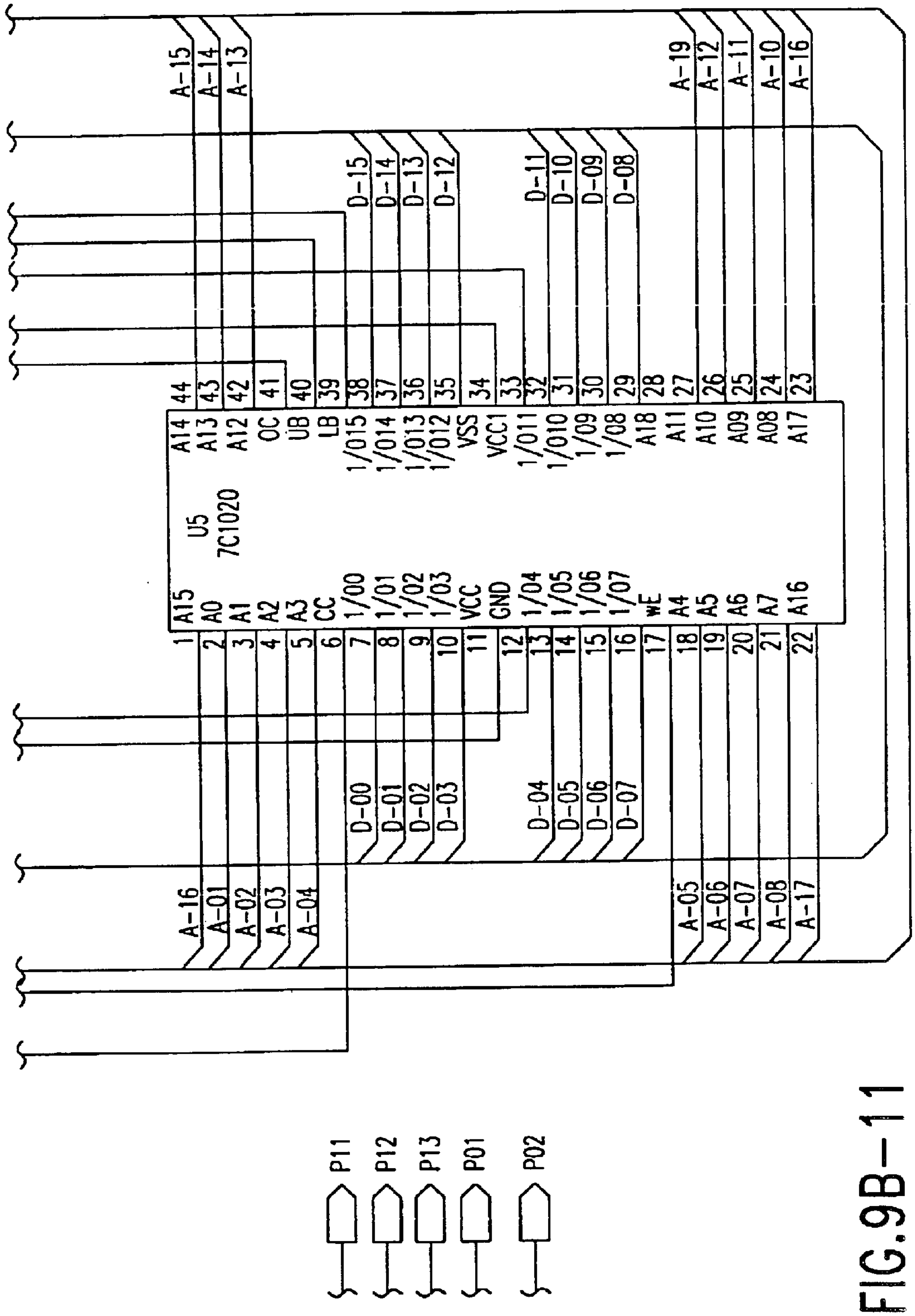
Figure 10:
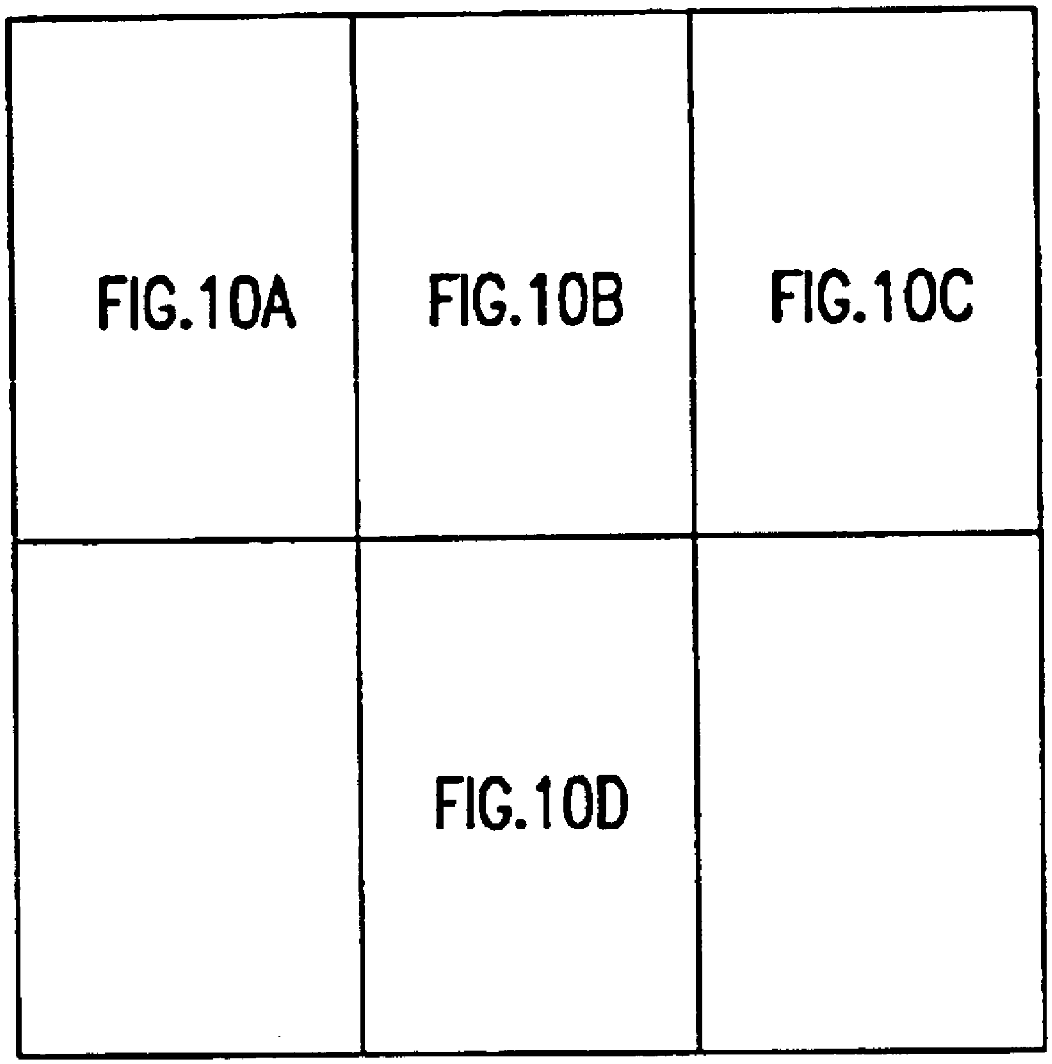
Figure 10A:
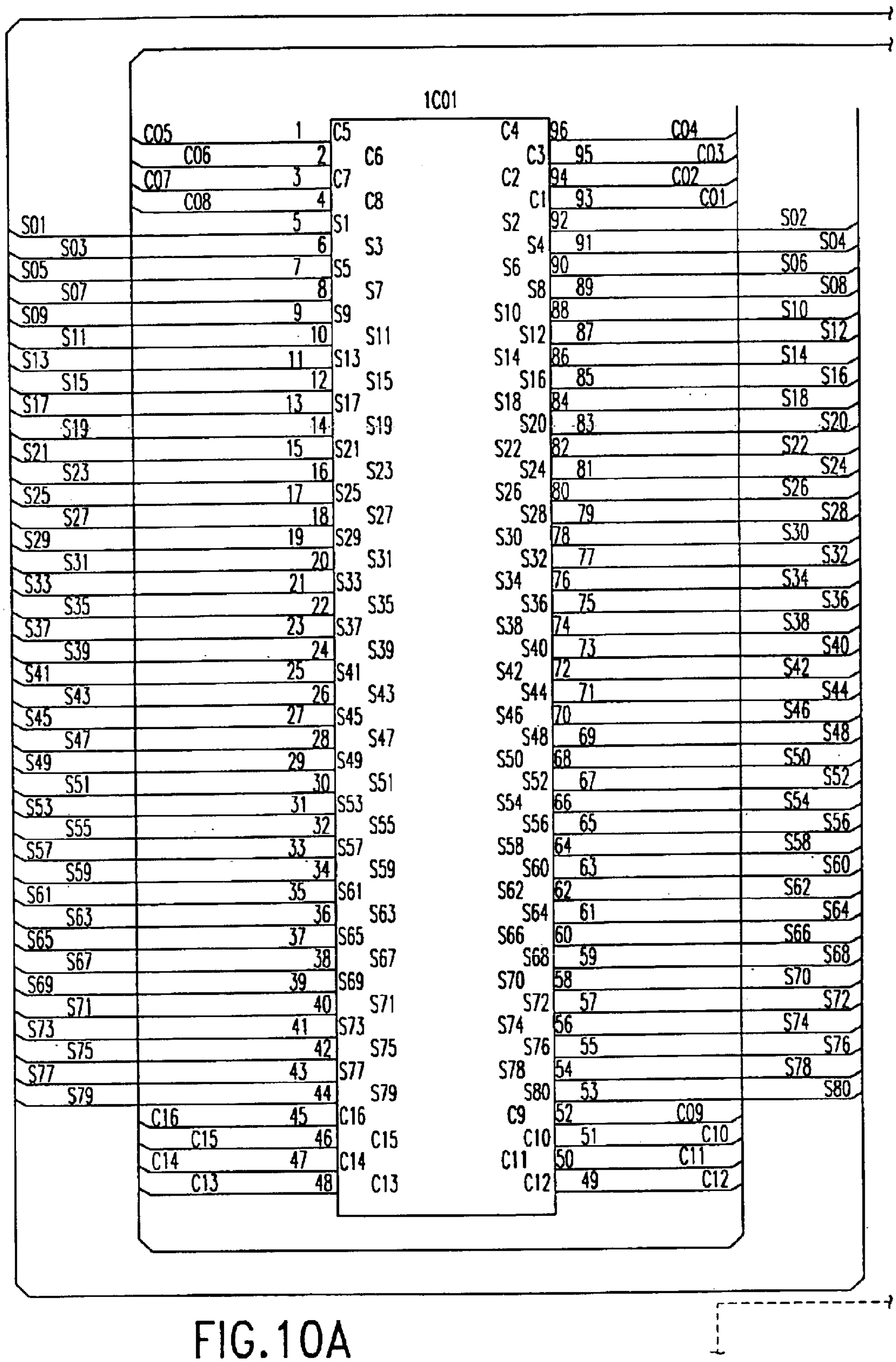
Figure 10B:
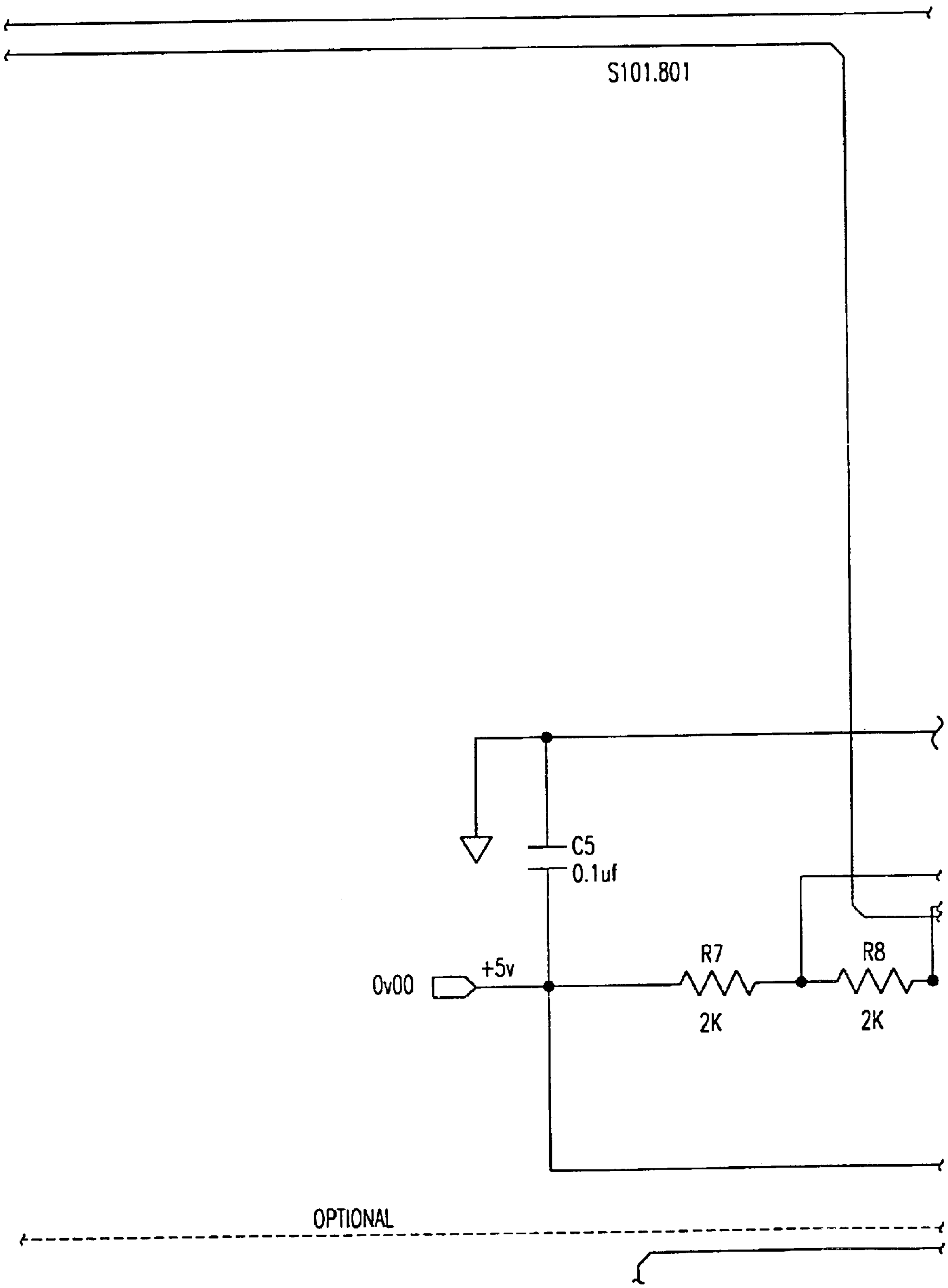
Figure 10C:
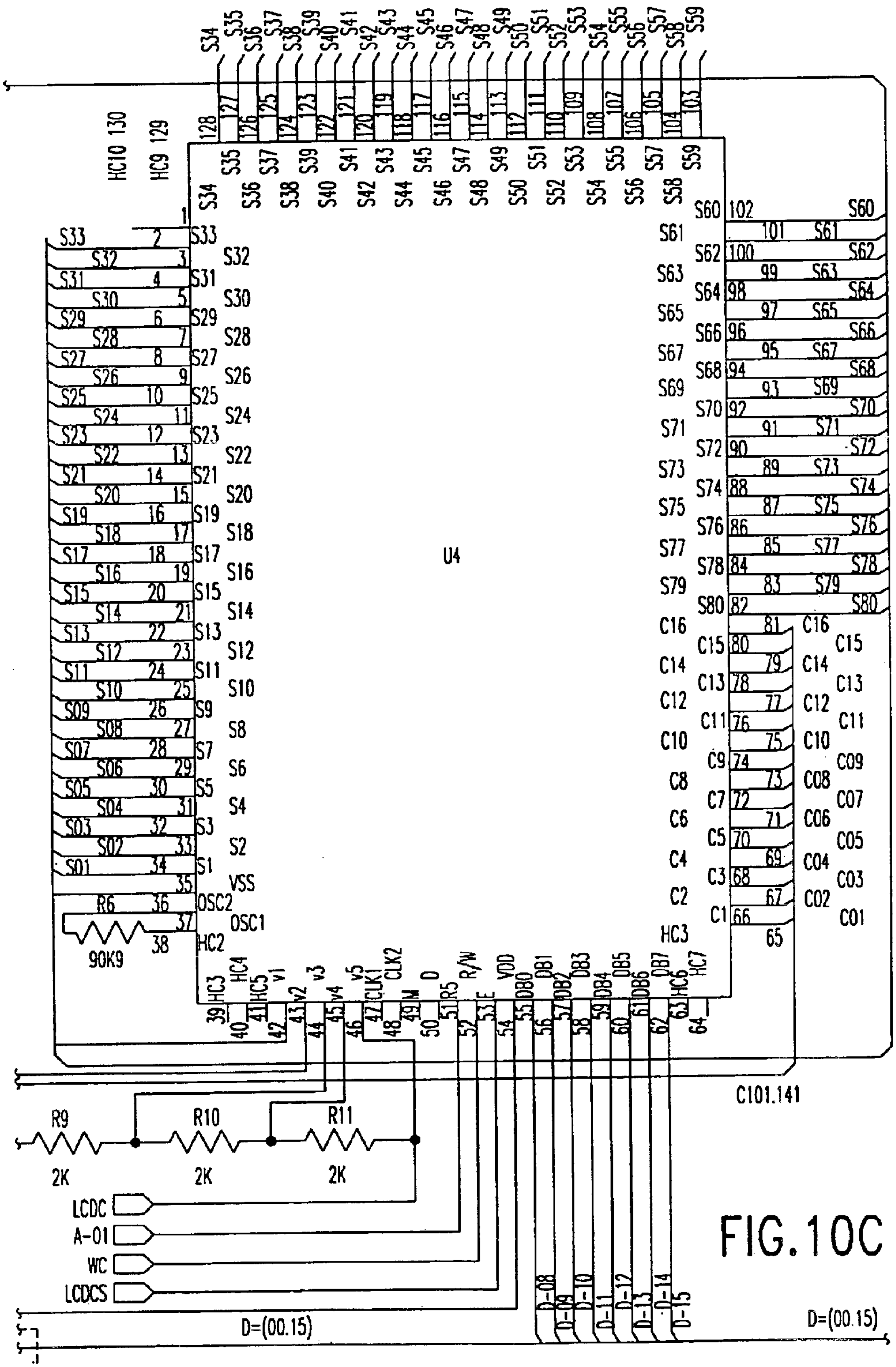
Figure 10D:
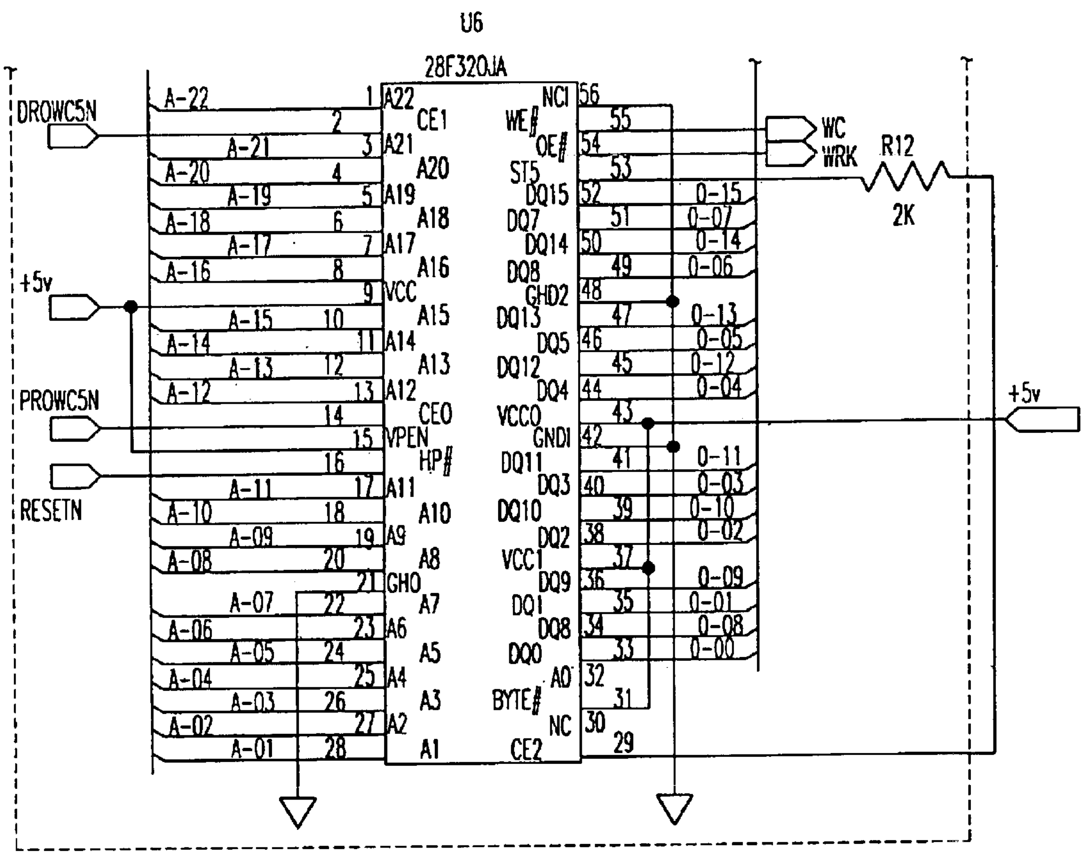

The Display Board is common to all embodiments. The Display Board schematic diagram can be found in FIGS. 9A–B and 10. The Display Board has an application-specific integrated circuit ("ASIC") U1, a Motorola 68000 microprocessor U2, an LCD driver U4 and display LCD1, a RAM memory (U3 and U6), flash memory U5 and a voltage reference CR1. The Display Board is preferably fabricated on a 5" to 2" 10 layer board with special care paid to ground planes. This affords improved protection against "fast transients," a type of interference found on power lines which often causes corruption of memory.

The Power Boards vary depending on the shape and connection requirements of the submeter. The power boards preferably contain power supply components, a battery for the real time clock, current and voltage interfaces, as well as optical, RS-232/485, modem, gas and water meter and other interfaces.

Flash memory U5 maintains an audit trail of all critical metering (electric, gas and water) and events (power outages, tamper attempts, etc.). This audit trail forms a second line of defense against "fast transient" induced memory loss. The critical data is preferably stored at least every 15 minutes. The flash memory is most useful for storing firmware or archiving data. It does not function like a RAM. Unlike RAM memories, it is not susceptible to corruption due to "fast transients." With the preferred archiving method, maximum data loss can be controlled by selecting a frequent archiving period, minimizing the commercial importance of a memory loss. The flash memory audit trail of energy usage has independent commercial value to ESCOs, generating companies, and electric utilities under deregulation: energy can be sold at varying prices during the day, even on a 15 or 5 minute basis. The electric meter monitors each phase of the incoming power: electricity measuring volts; amps; real, reactive, and apparent energy and power; power factor, total harmonic distortion; and frequency.

The algorithms in the 68000 microprocessor control the ASIC (described in detail below) and are disclosed by the S-record file 28130104.S and improved version 38230102.S in the attached Appendix.

The submeter also counts contact closure transitions emitted from water and gas meters. Preferred submeters have a liquid crystal display, an optical port, and an (optional) RS-232/485 port.

Preferred submeters feature a power-line modem to communicate over the low voltage (120 volt, 220 volt, 480 volt or 600 volt) lines to a Transponder or Low-level Transponder.

In a first preferred embodiment (the "10 series"), the system comprises a small apartment-style submeter that mounts next to a breaker panel within a wall and uses current transformers mounted on the apartment feeders to sense current.

In a second preferred embodiment (the "20 series"), the system comprises: (1) a plug-in replacement for socket-style round ANSI meters; (2) gas and water contact closure accumulators, which continue accumulating by battery even if the electric power is removed; and (3) full complex plane (amplitude and angle) calibration of internal 10, 100, or 200 amp current elements to achieve a high level of calibration.

Figures 1, 11A:
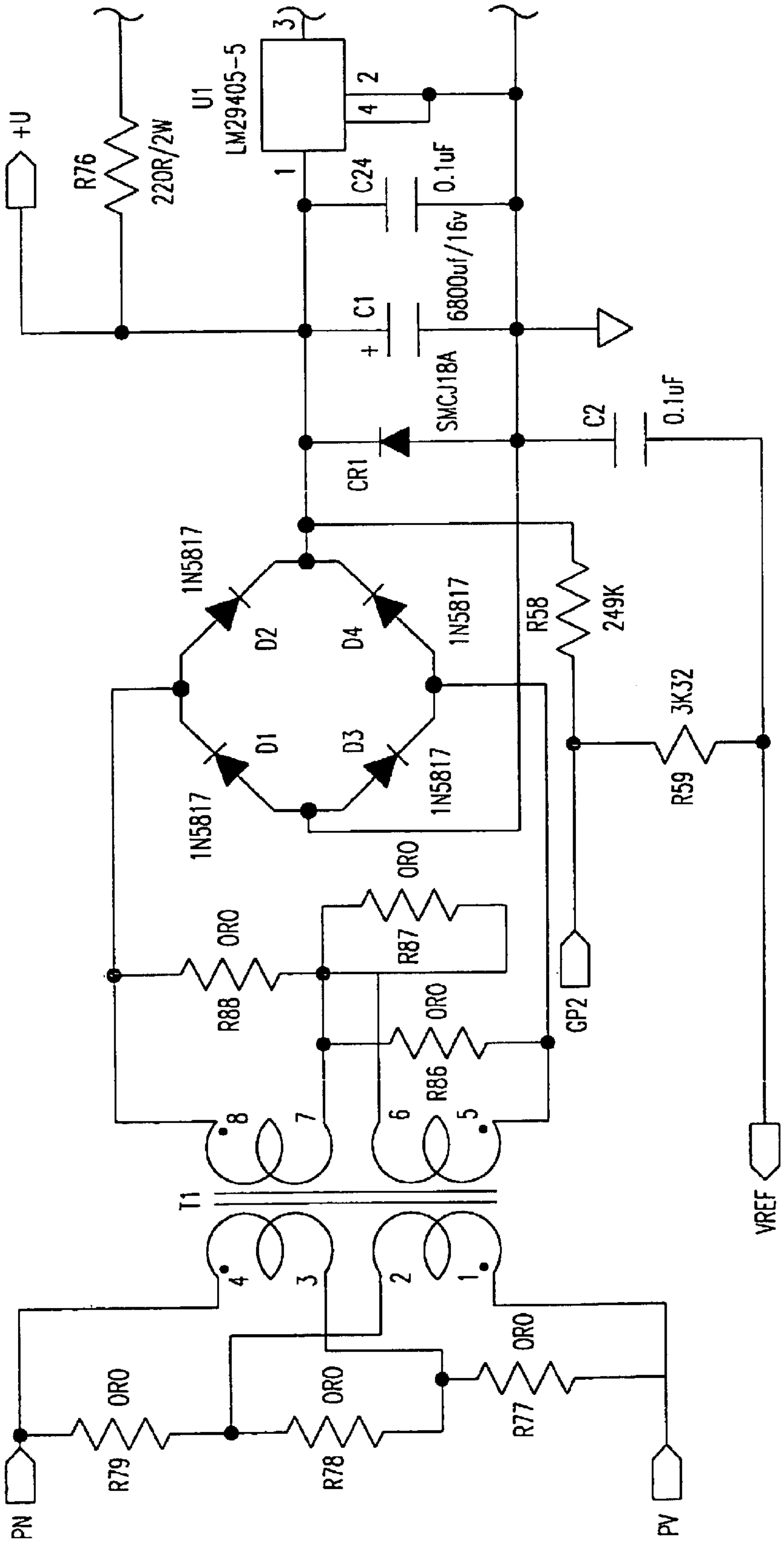
FIG. 11A provides a 10 series preferred embodiment power board schematic diagram.
Figures 2, 11A:
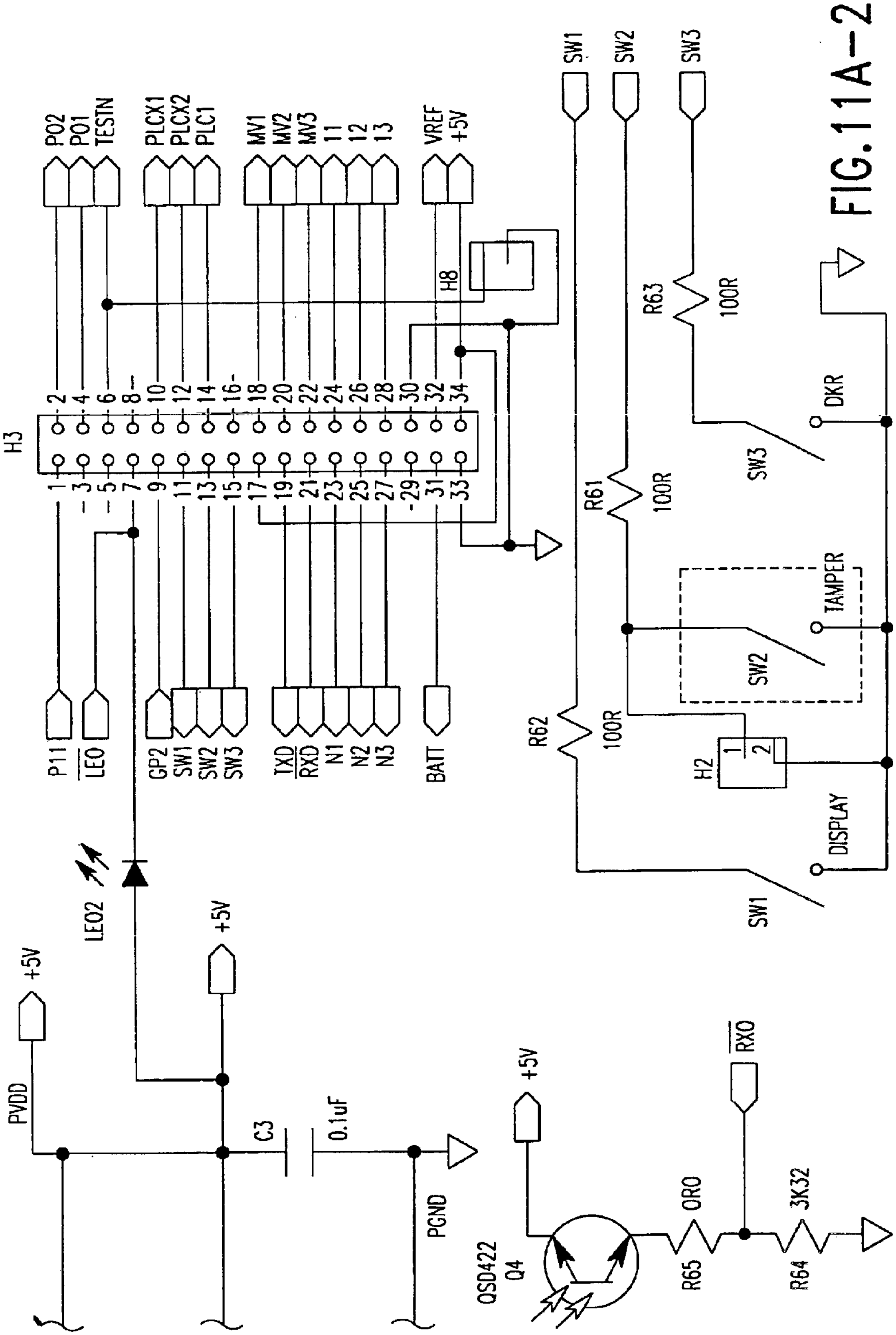
Figures 3, 11A:
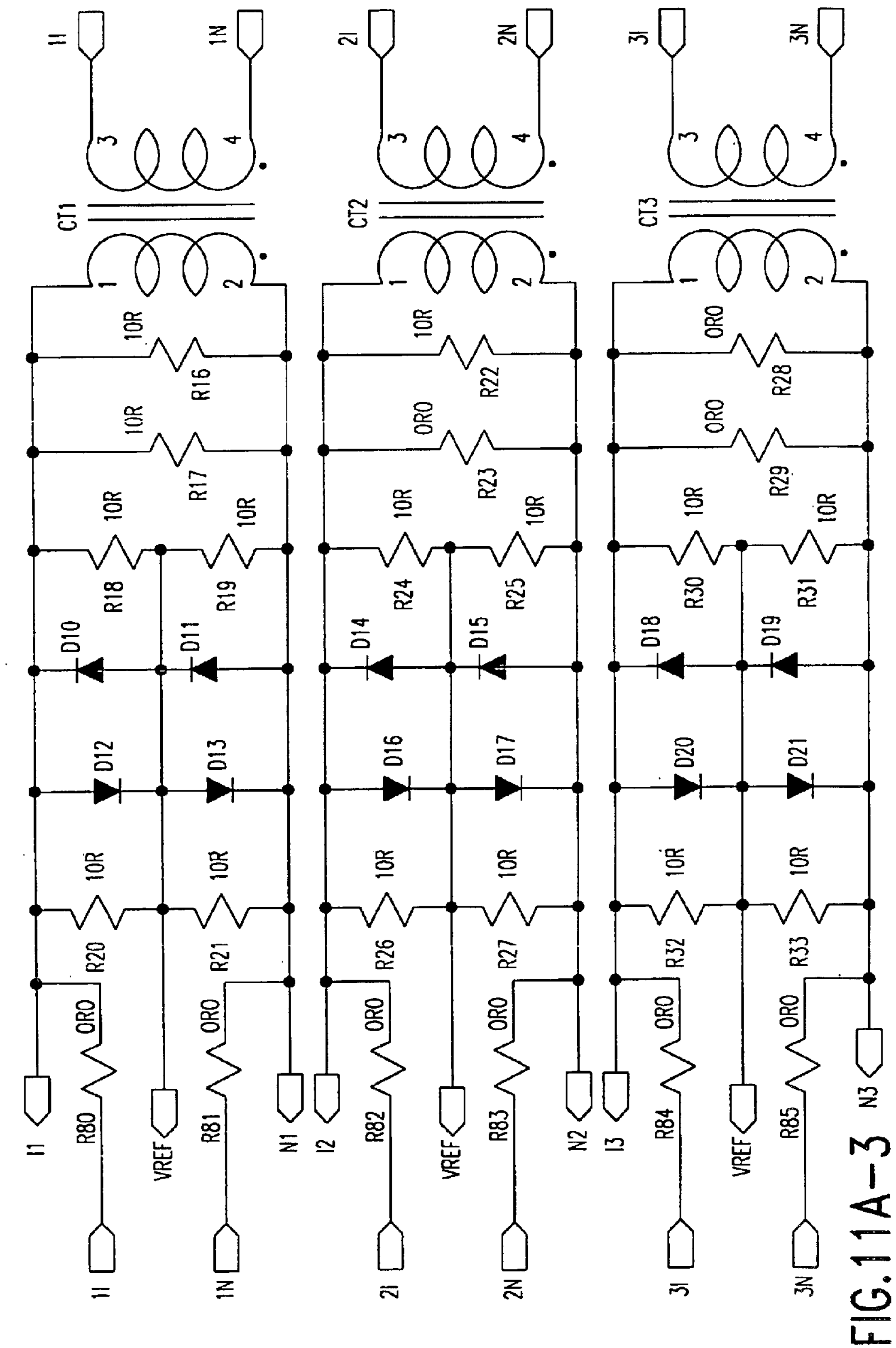
Figures 4, 11A:
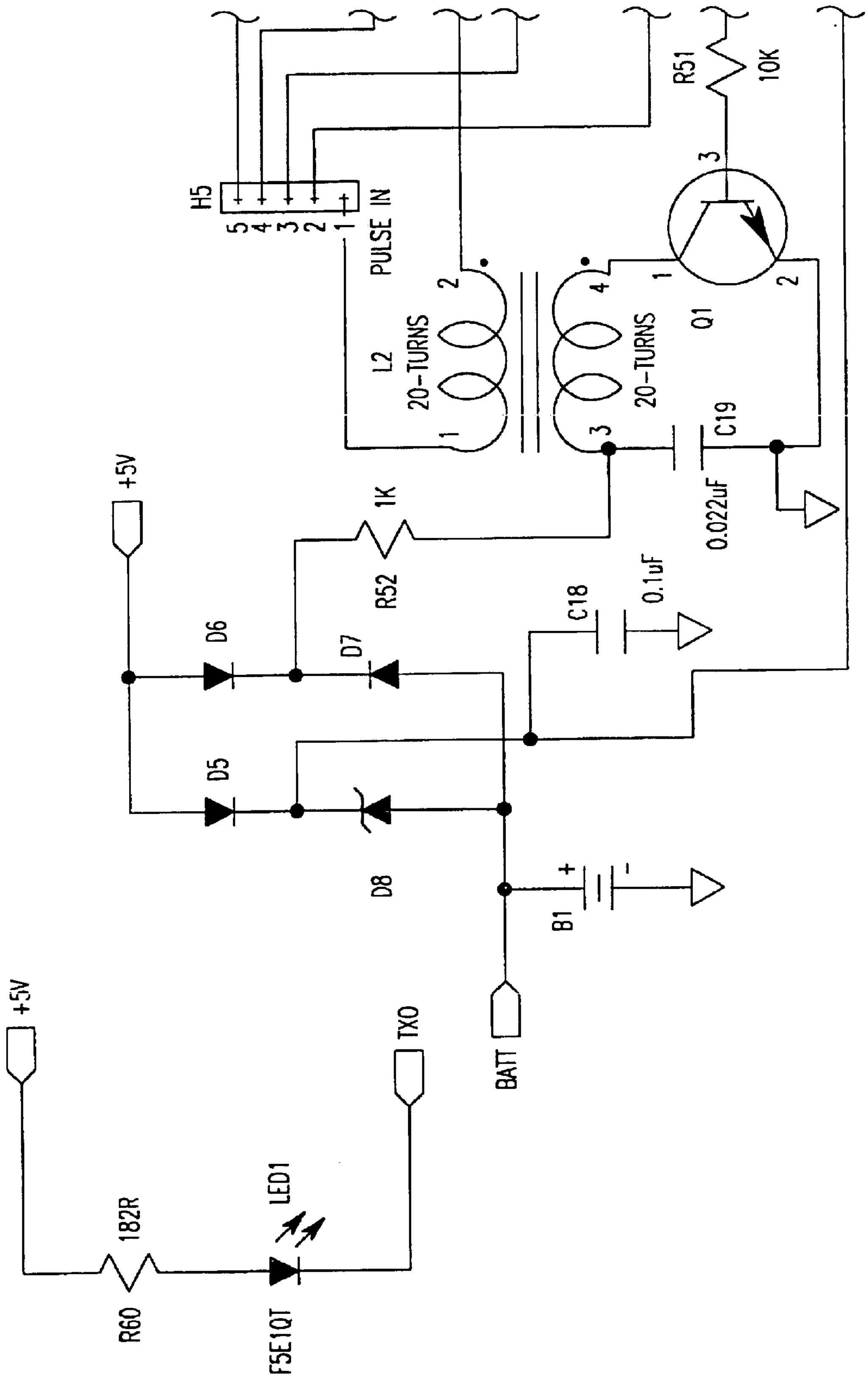
Figures 5, 11A:
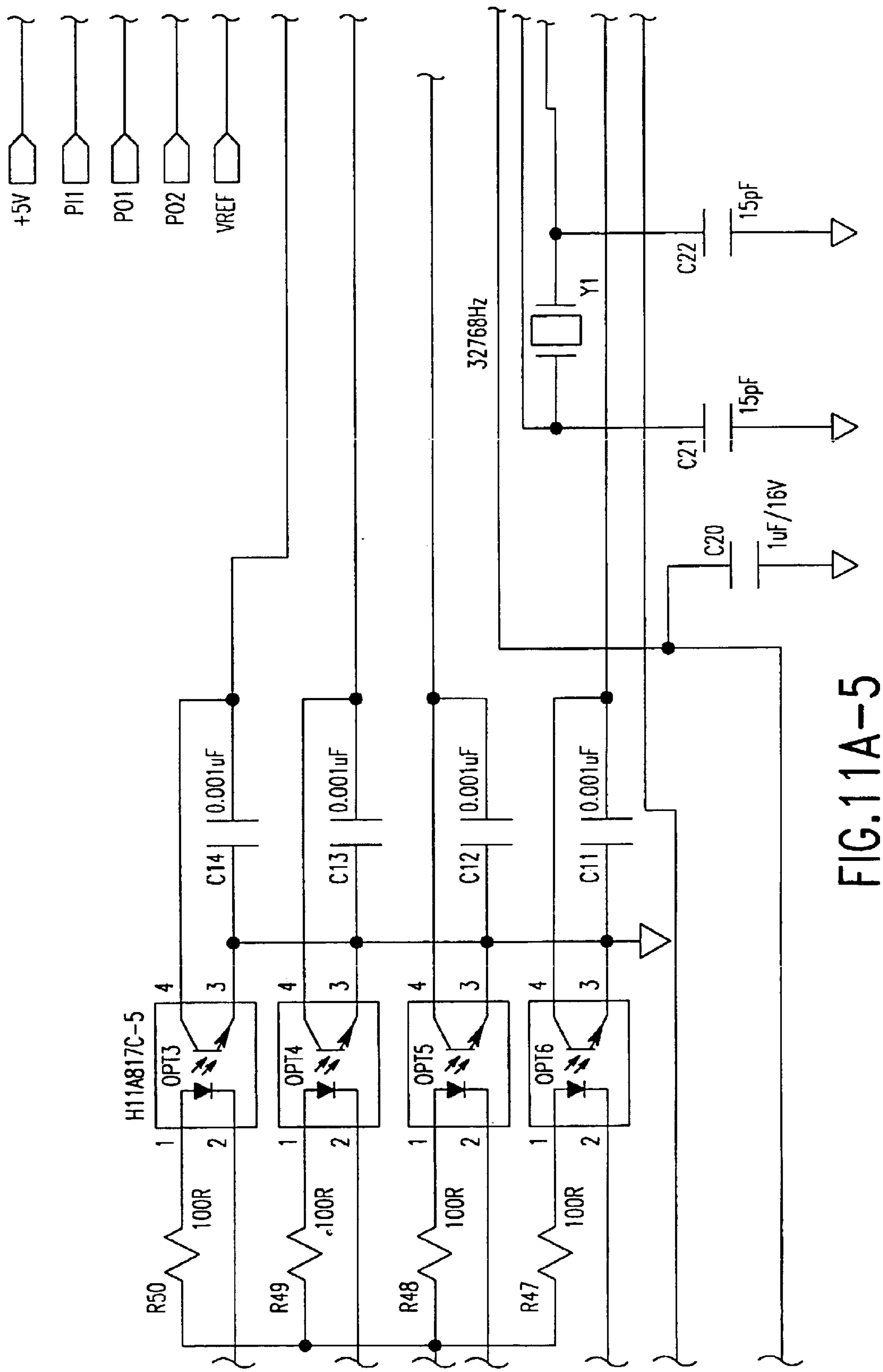
Figures 6, 11A:
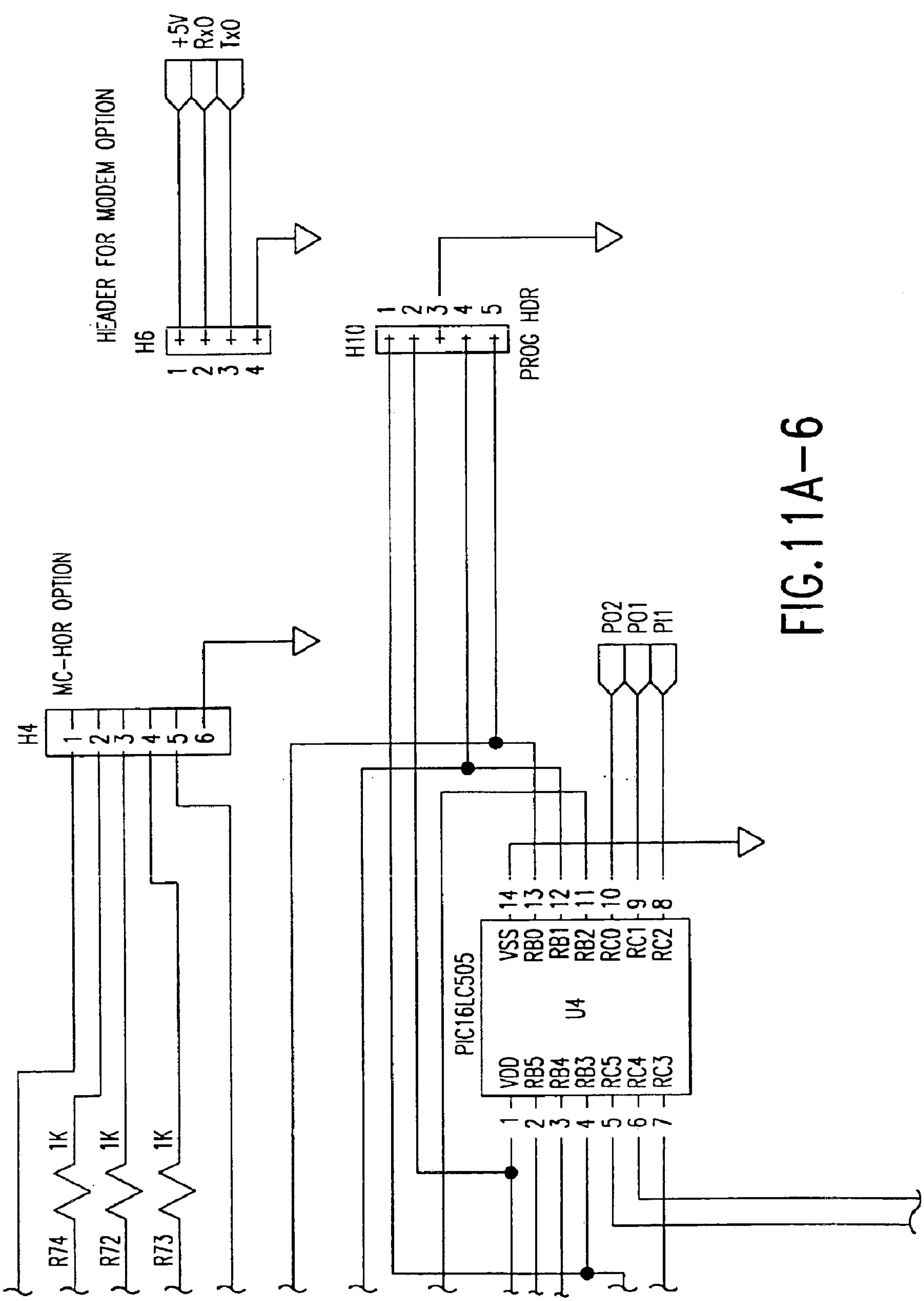
Figures 7, 11A:
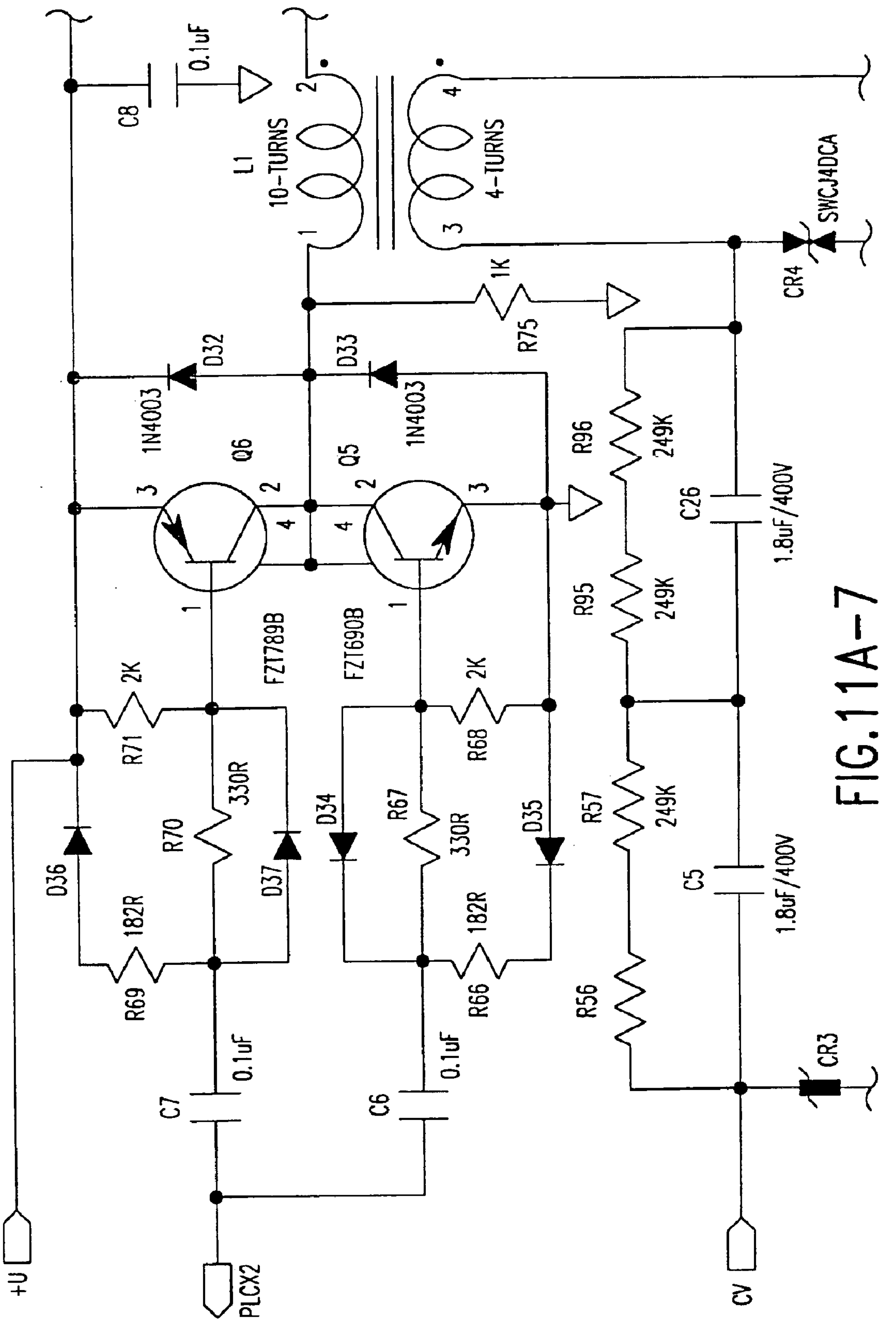
Figures 8, 11A:
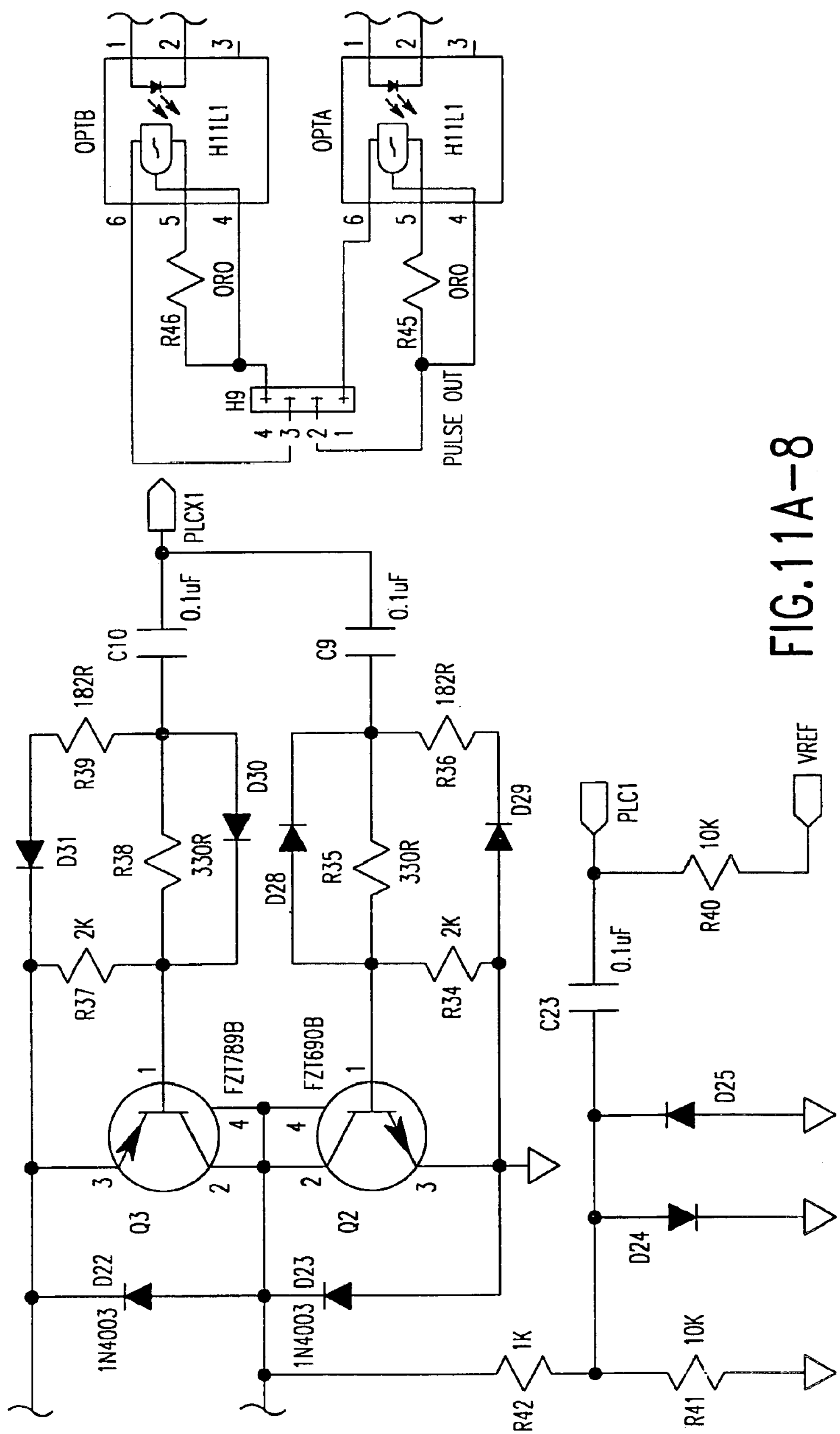
Figures 9, 11A:
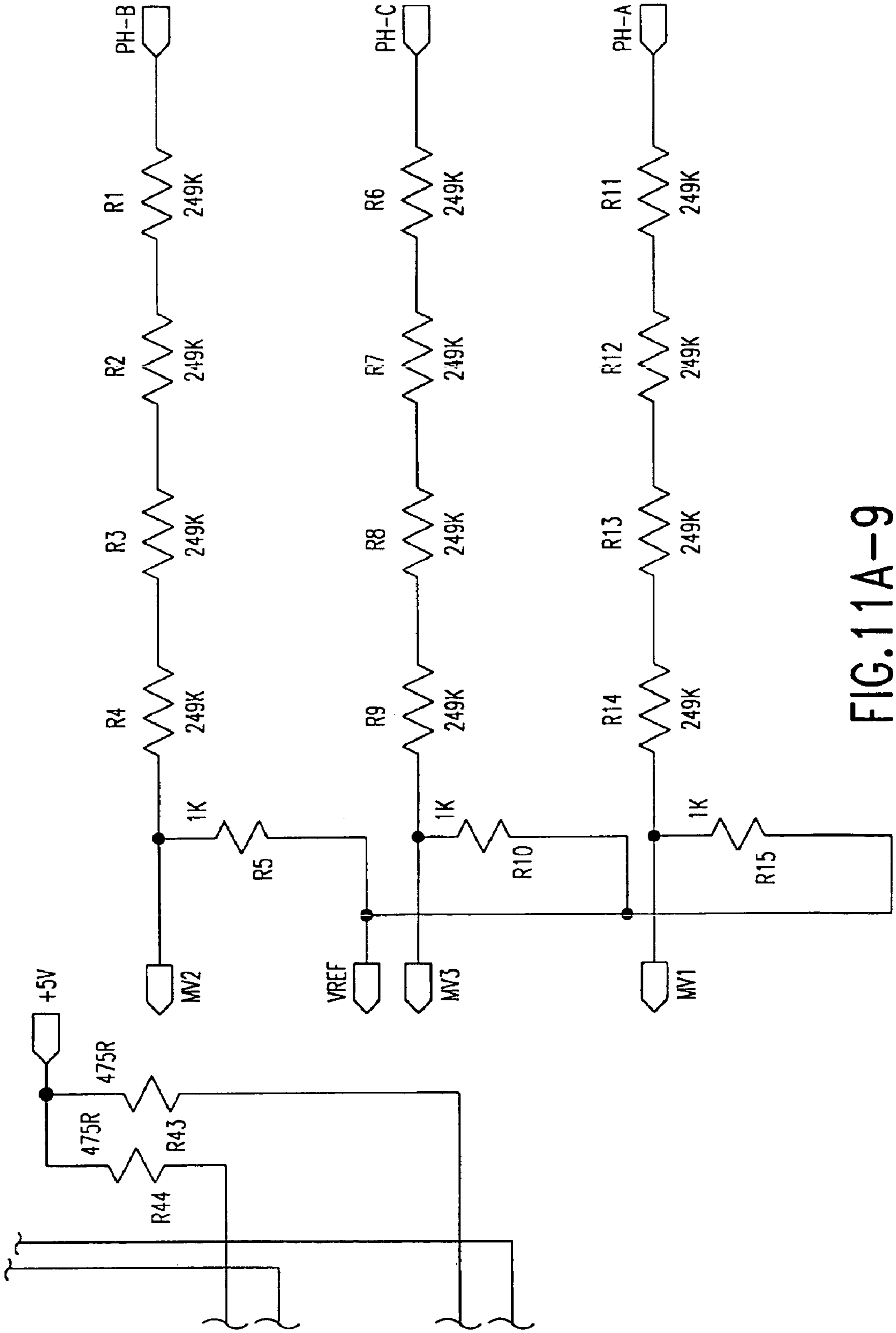
Figures 10, 11A:
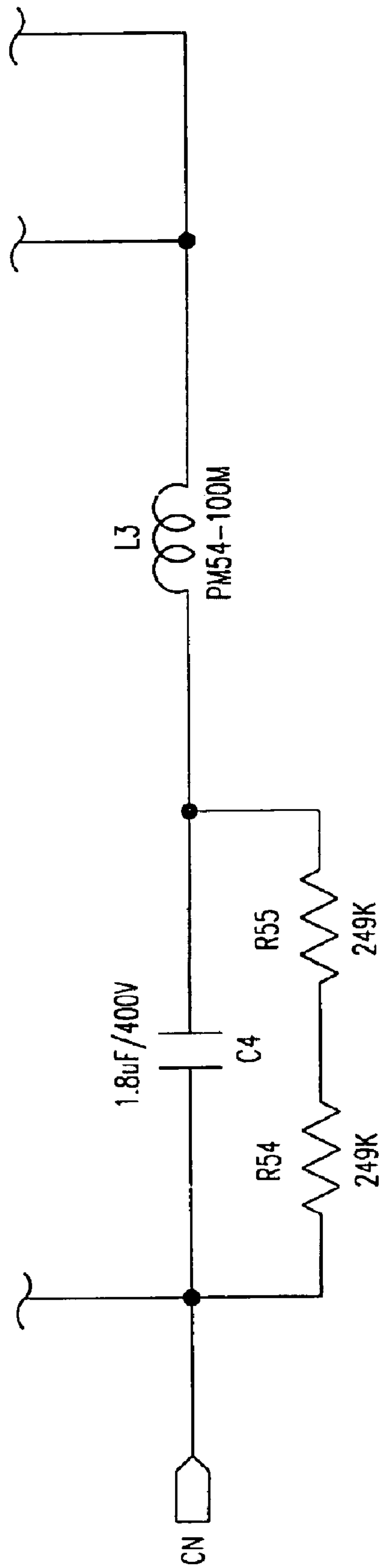
Figures 11, 11A:
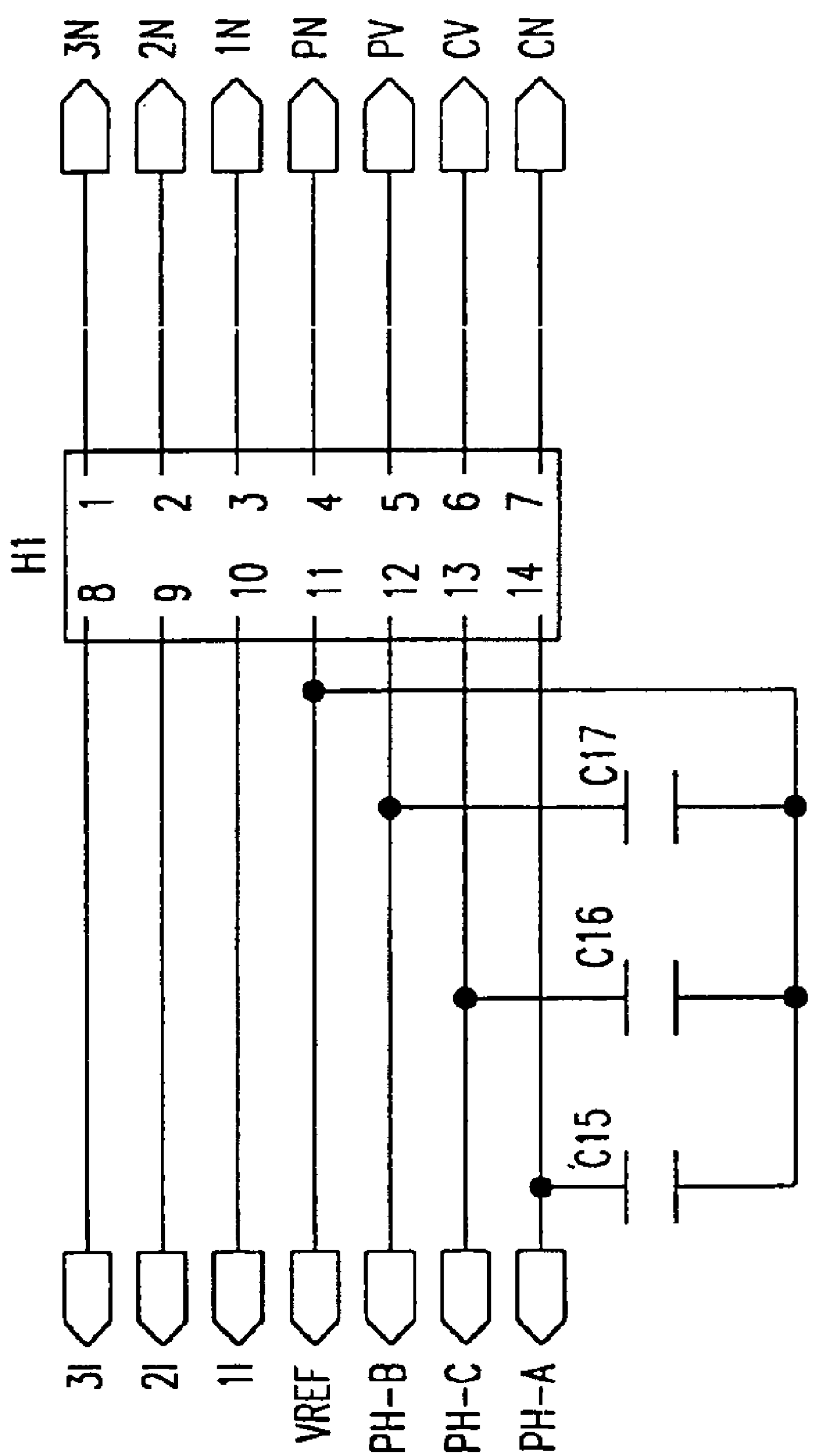
Figure 11B:
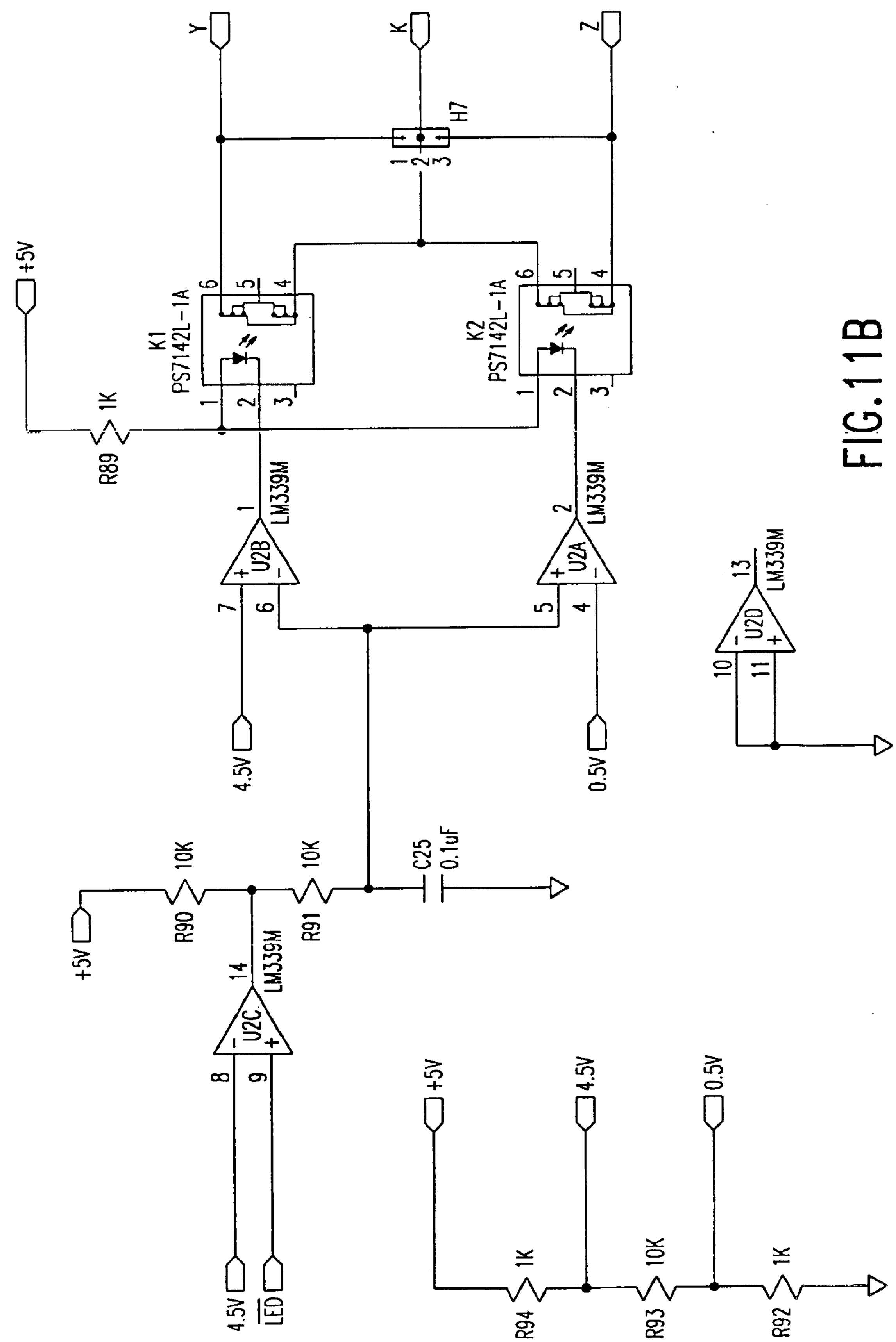
FIG. 11B provides a KYZ schematic diagram.
Figures 1, 11C:
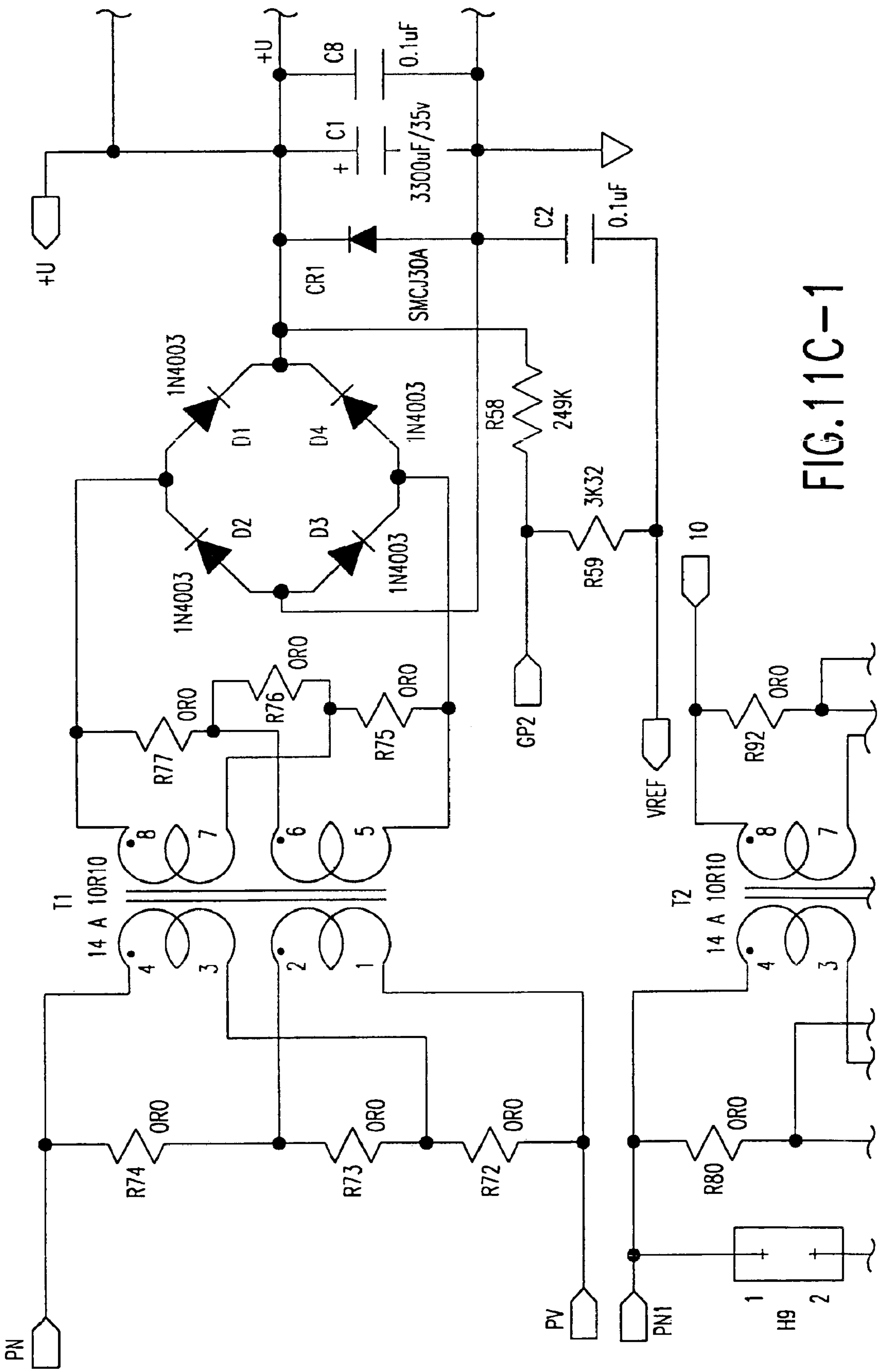
FIG. 11C is a 20 series preferred embodiment power board schematic diagram.
Figures 2, 11C:
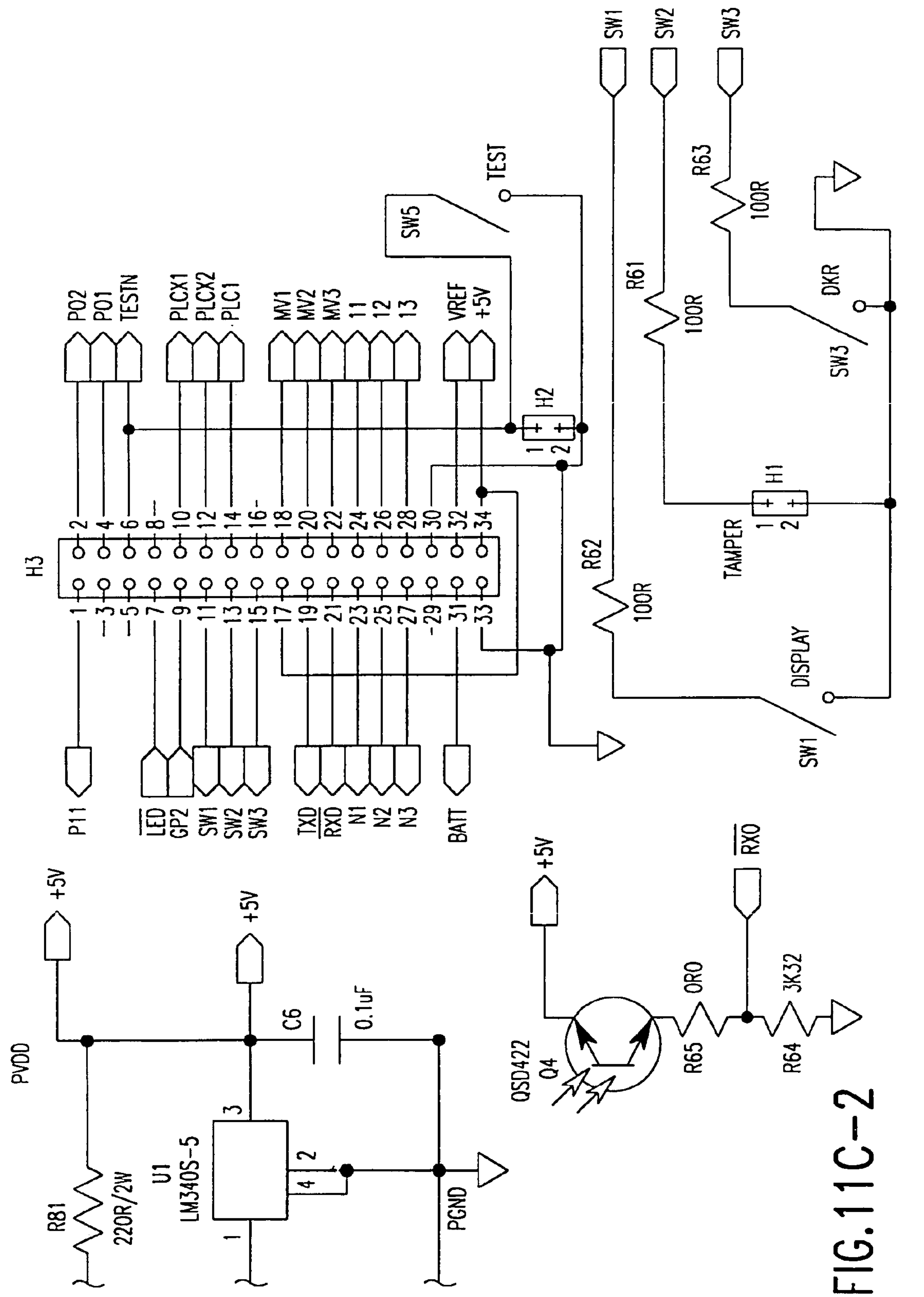
Figures 3, 11C:
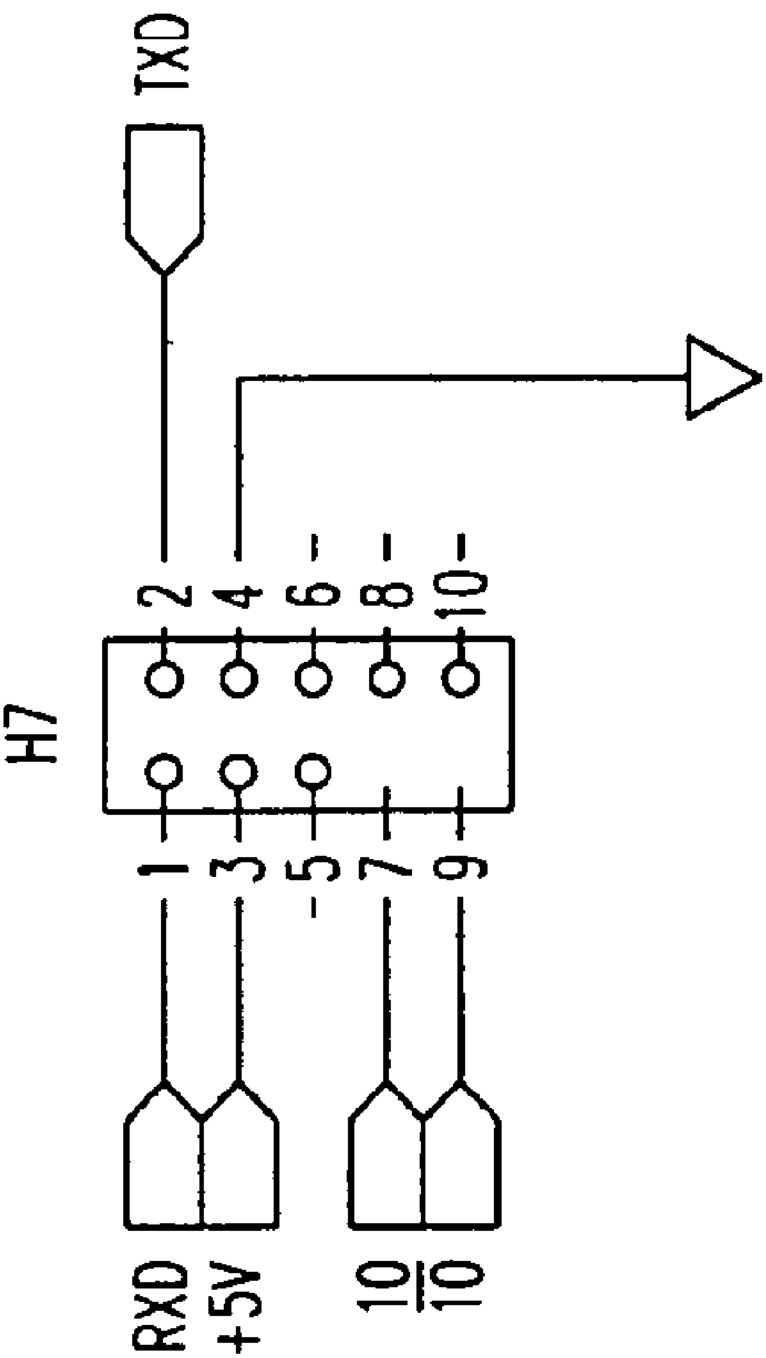
Figures 4, 11C:
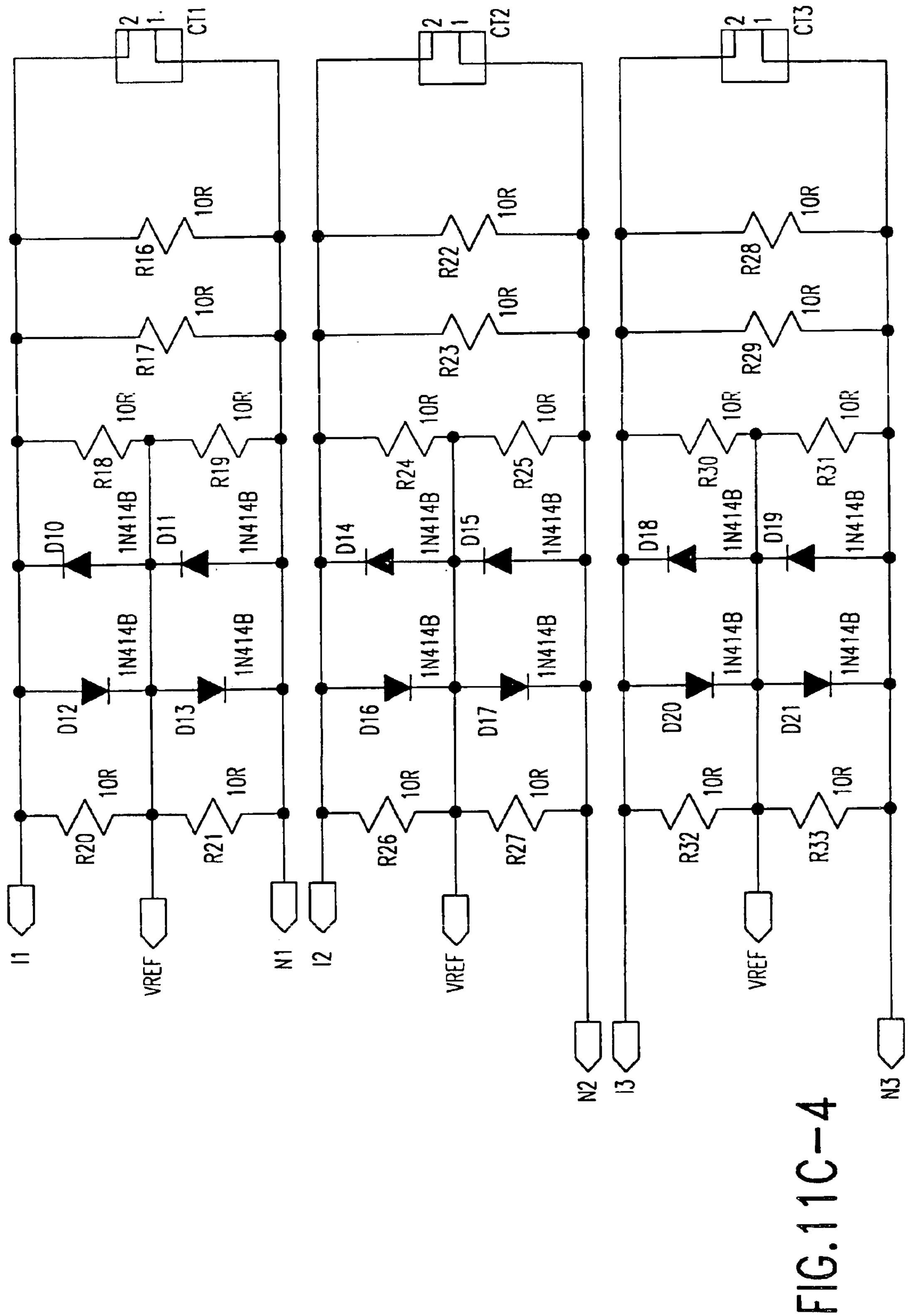
Figures 5, 11C:
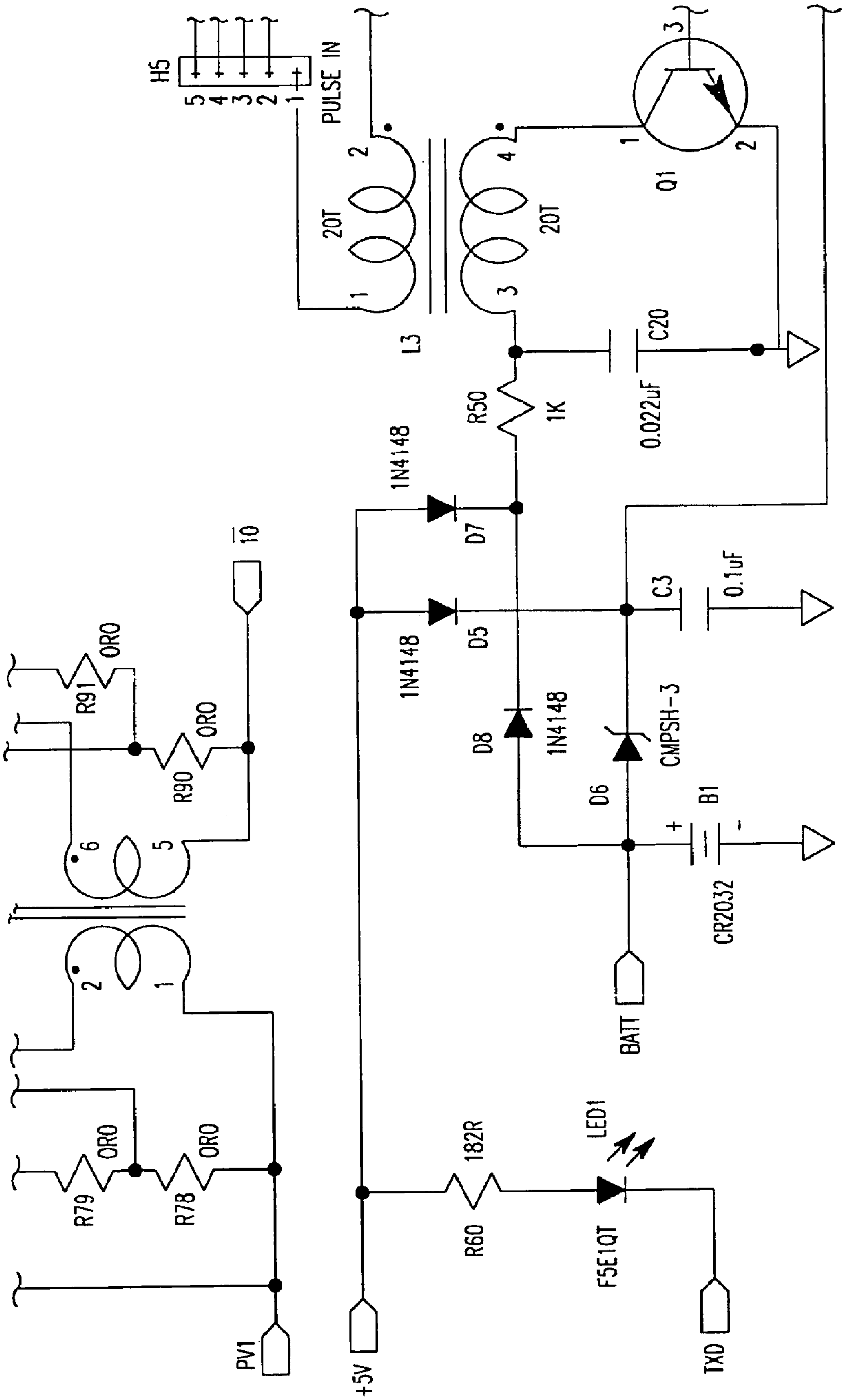
Figures 6, 11C:
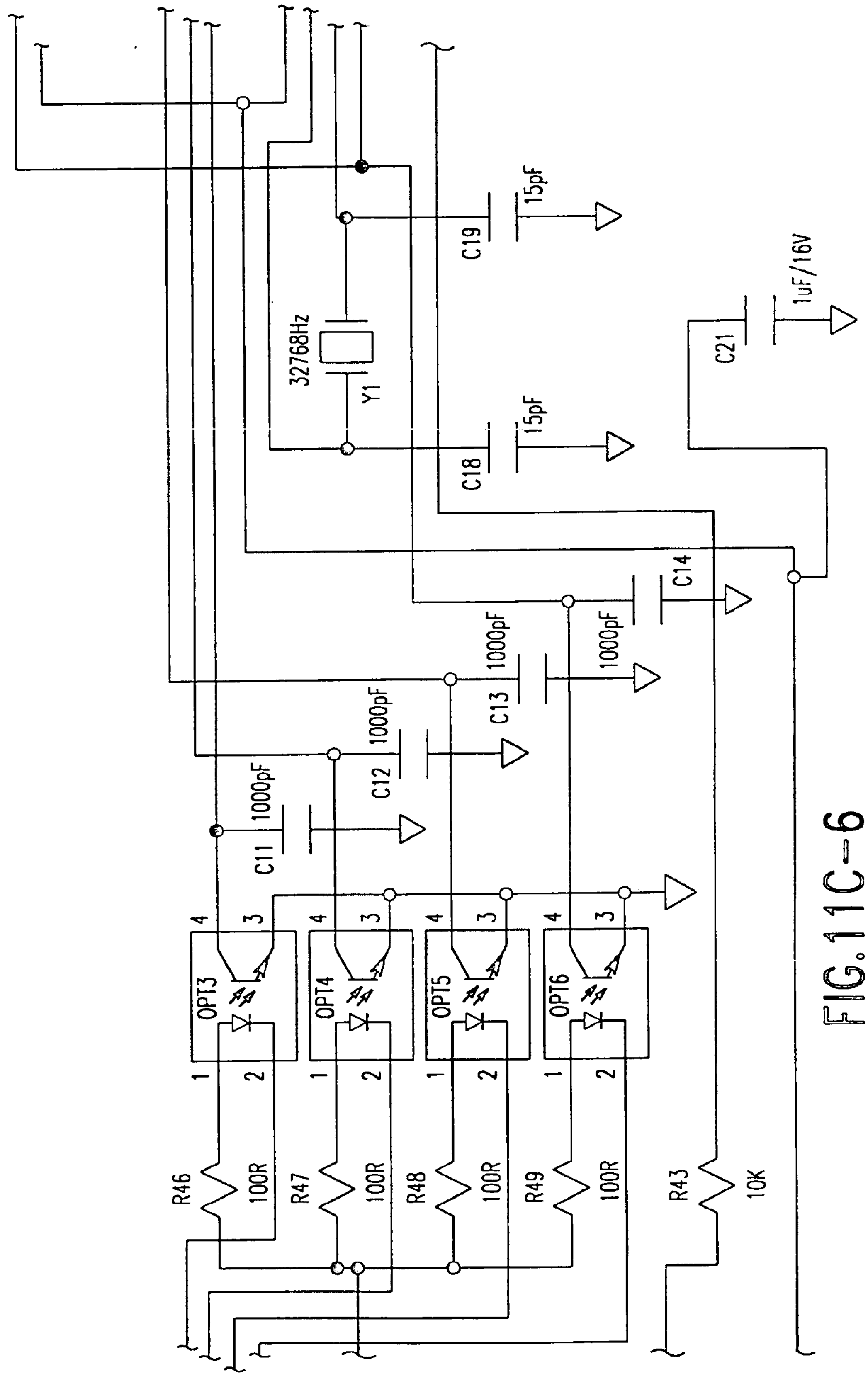
Figures 7, 11C:
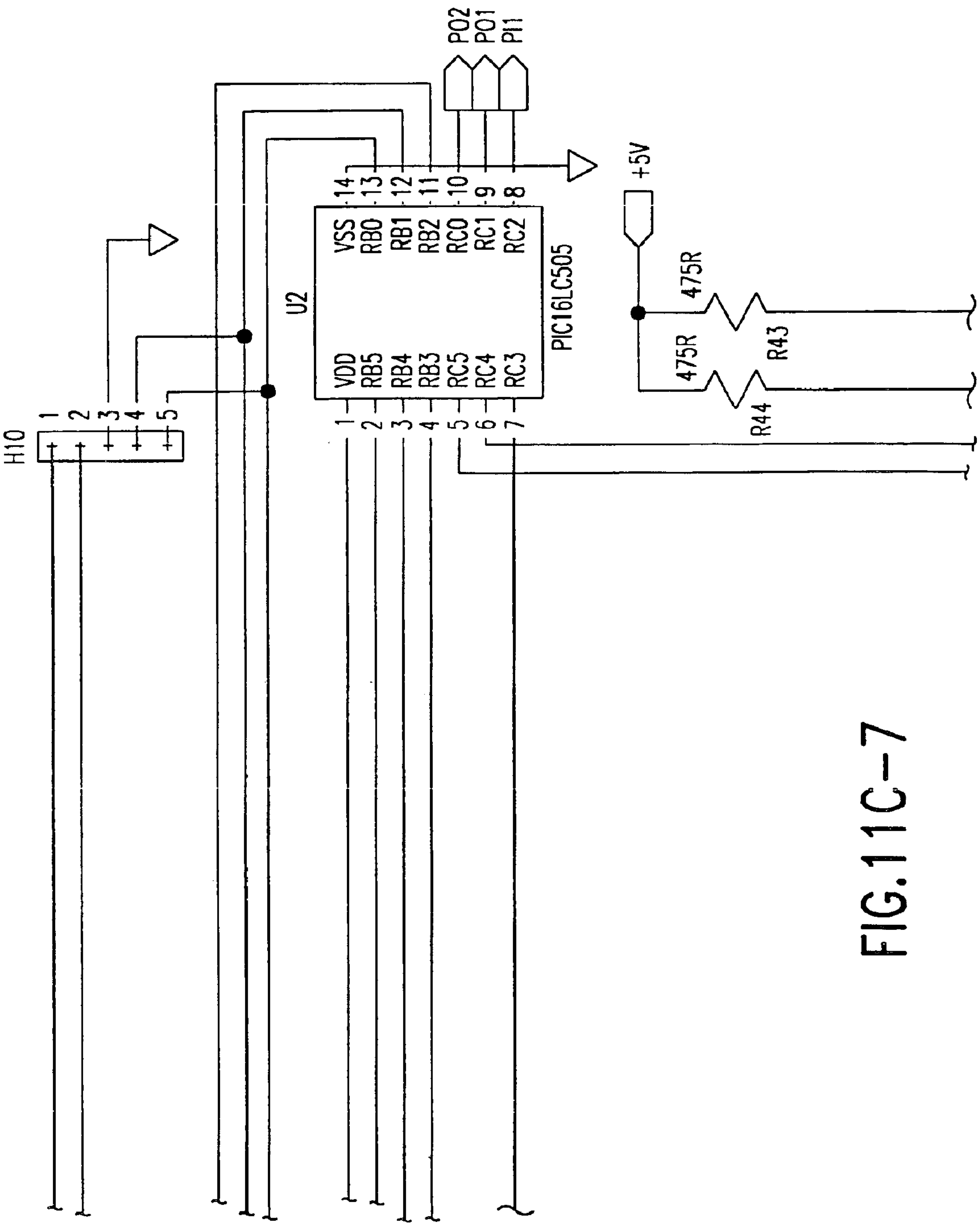
Figures 8, 11C:
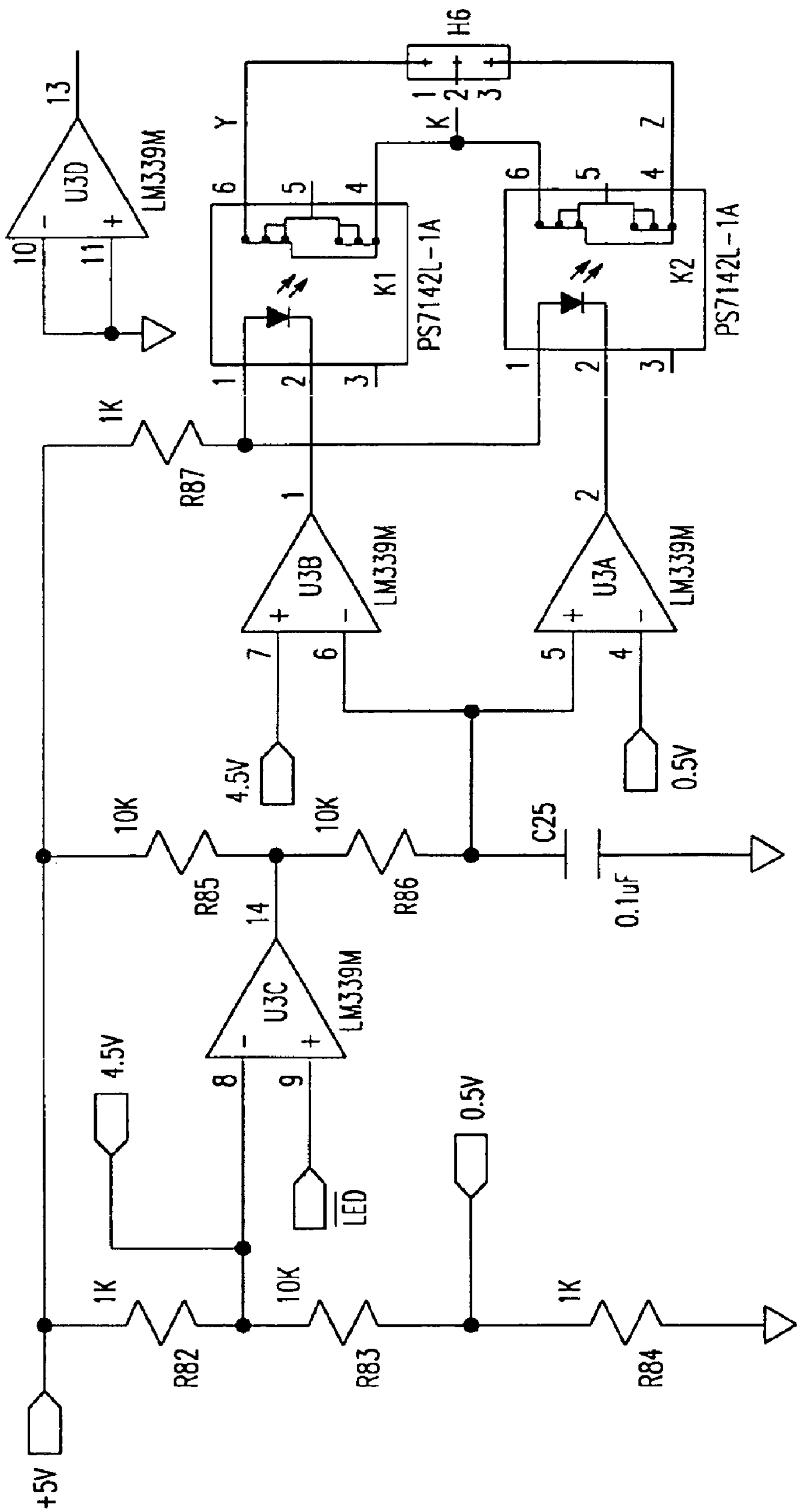
Figures 9, 11C:
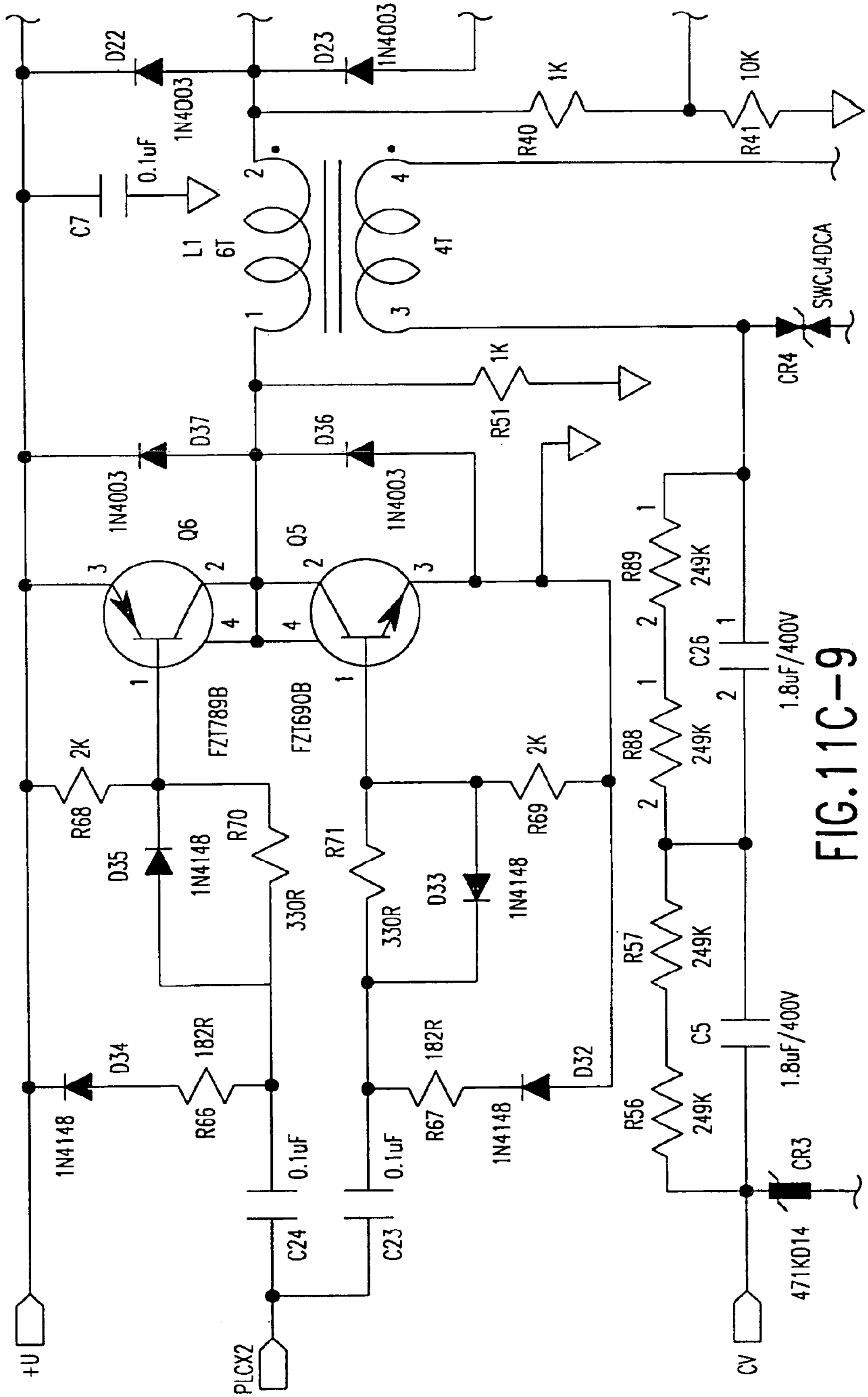
Figures 10, 11C:
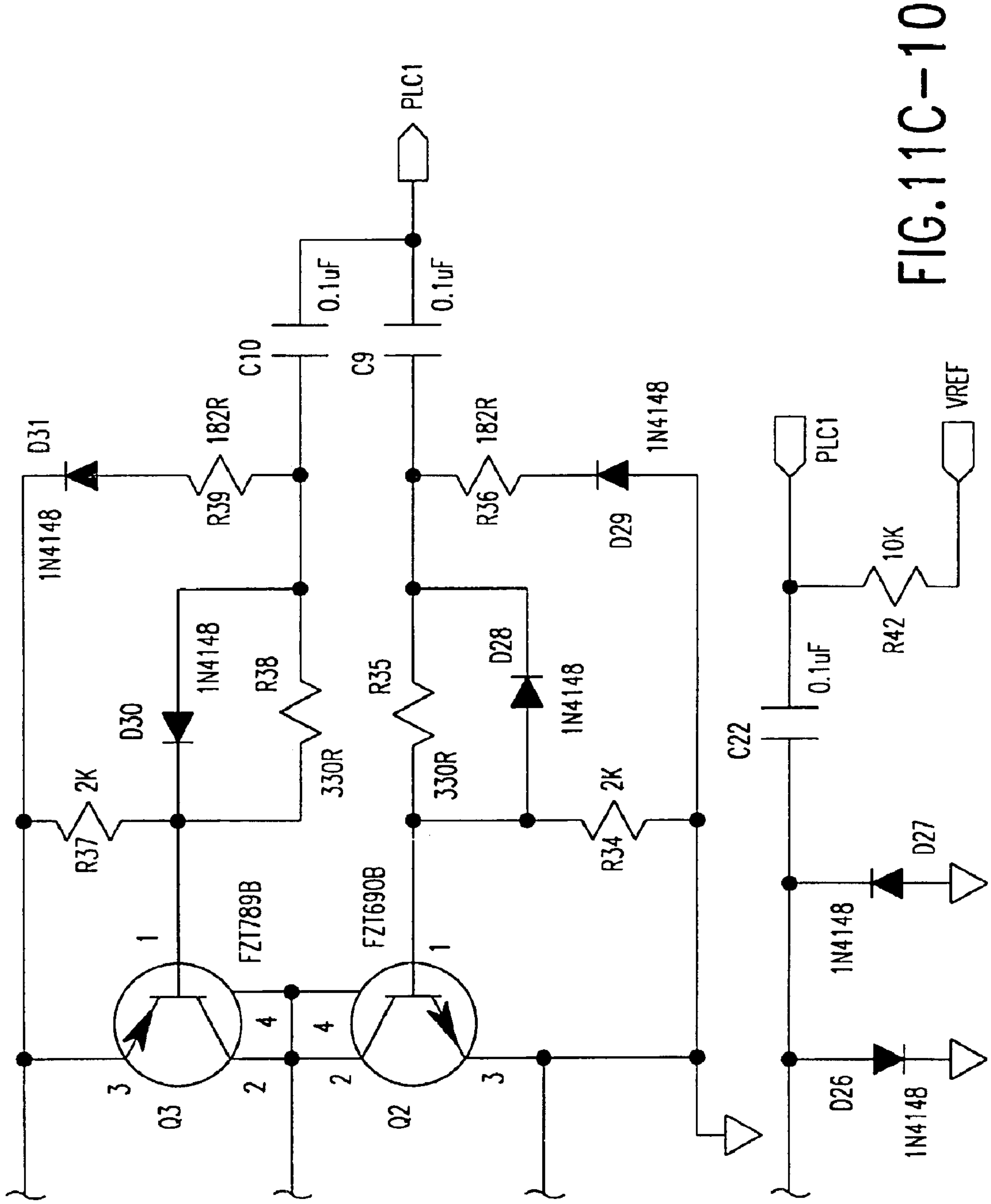
Figures 11, 11C:
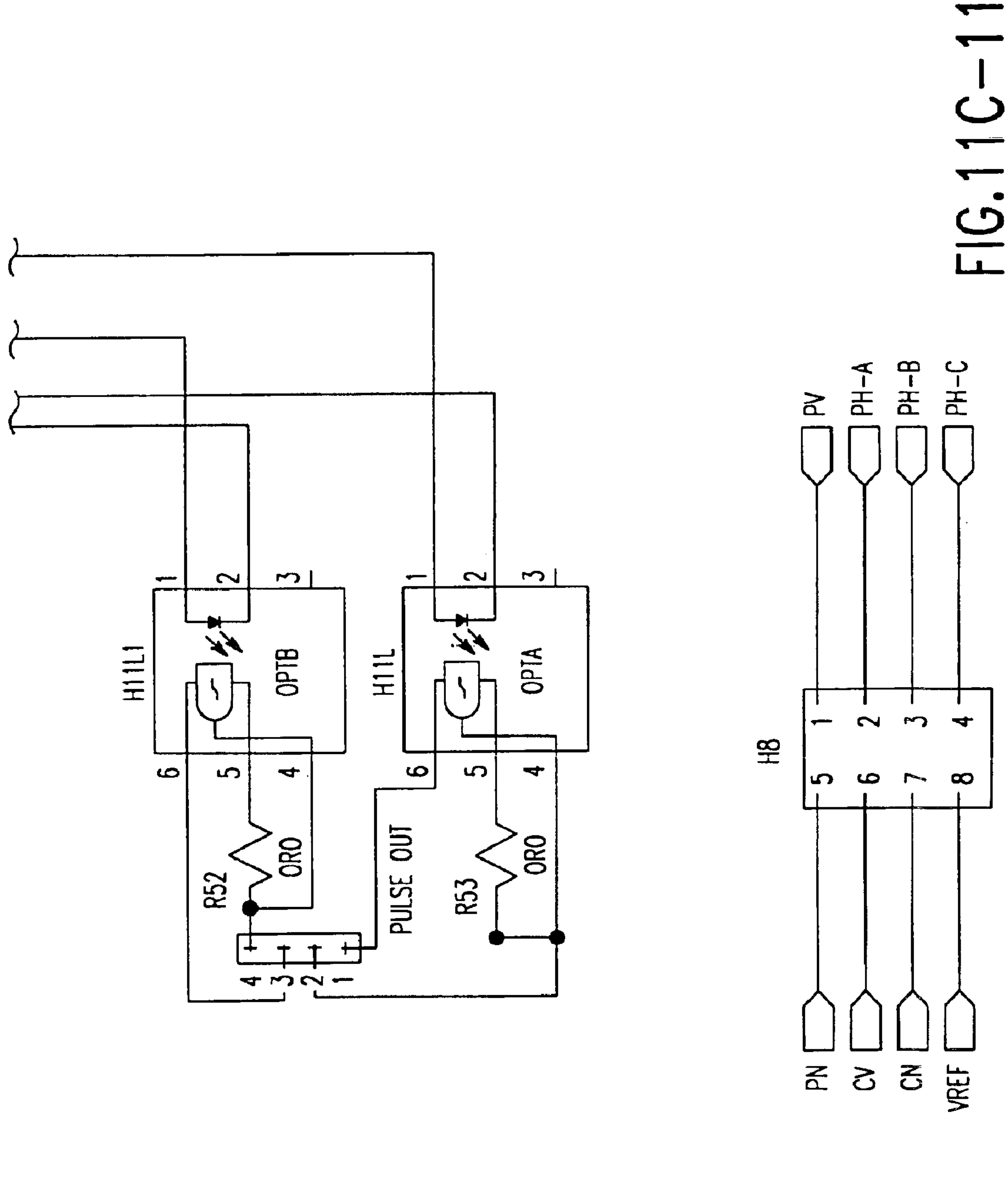
Figures 11, 11C, 12:
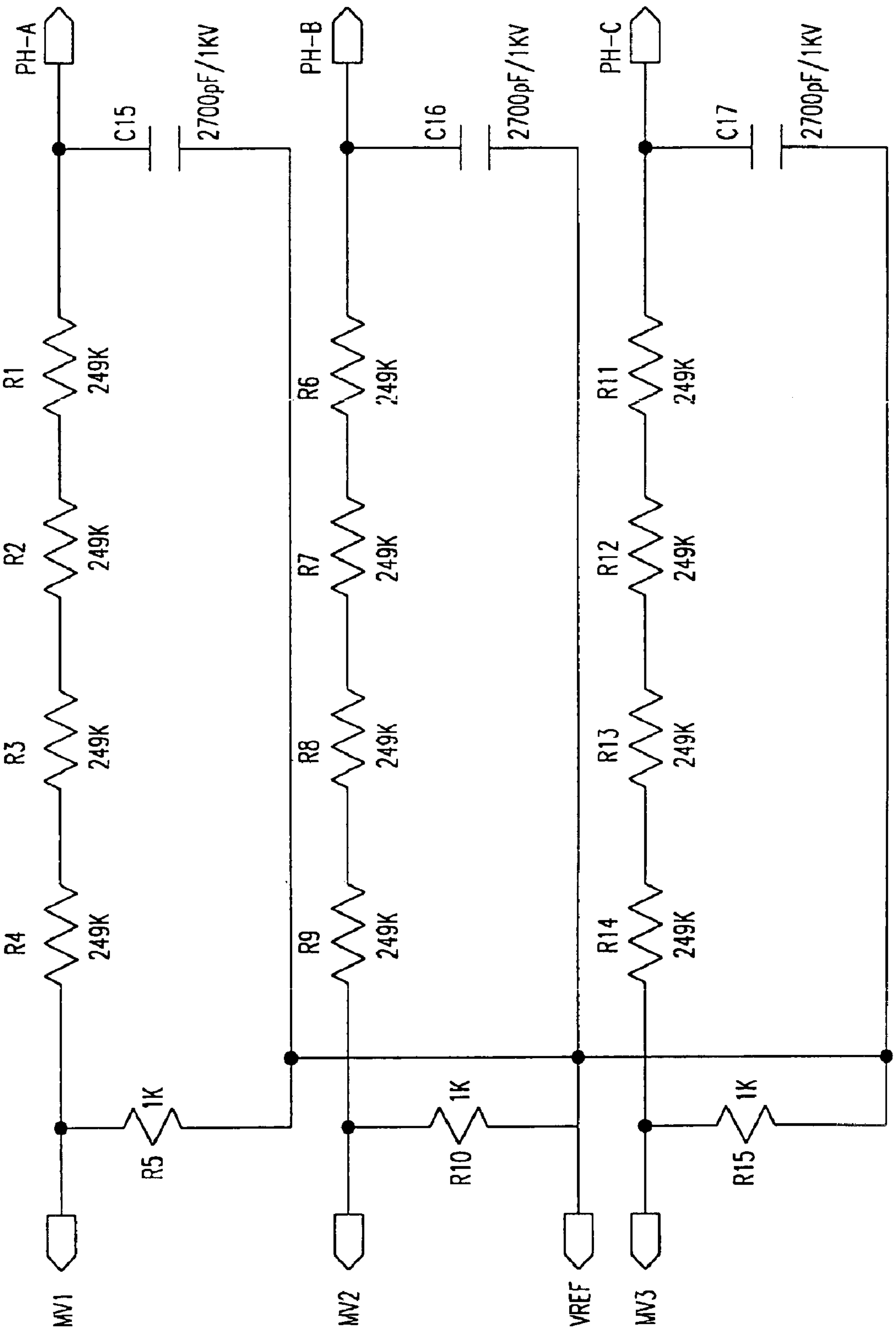
Figures 11, 11C, 12, 13:
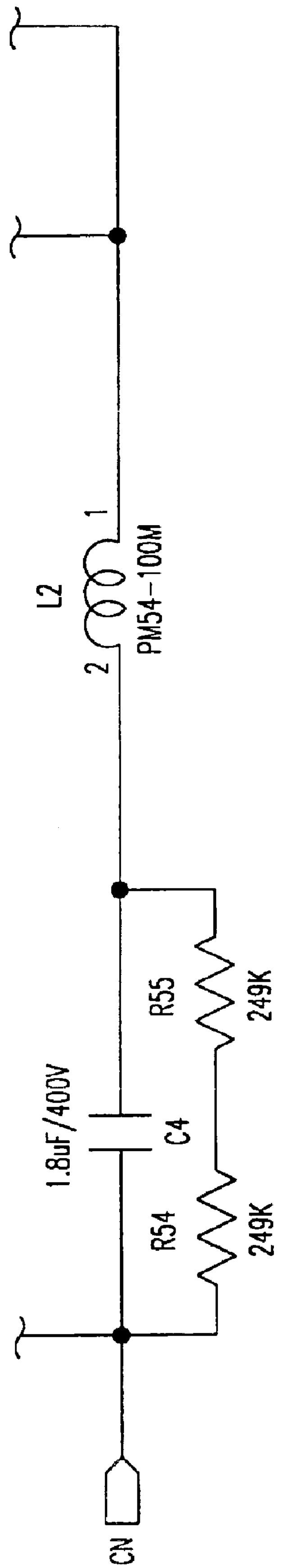
FIGS. 12A–C, 13, 14, and 15A provide a Transponder schematic diagram.
Figures 1, 12A:
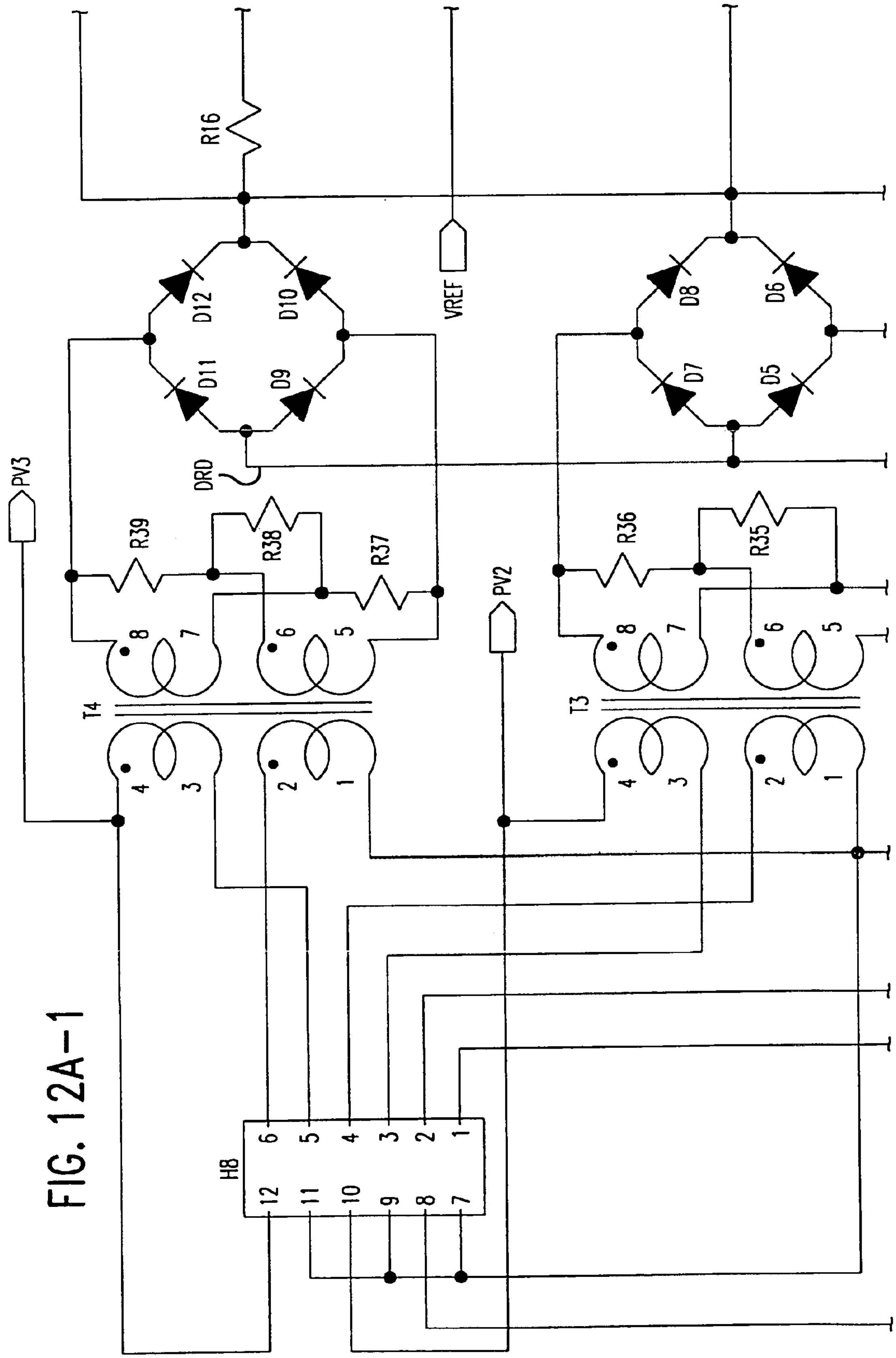
Figures 2, 12A:
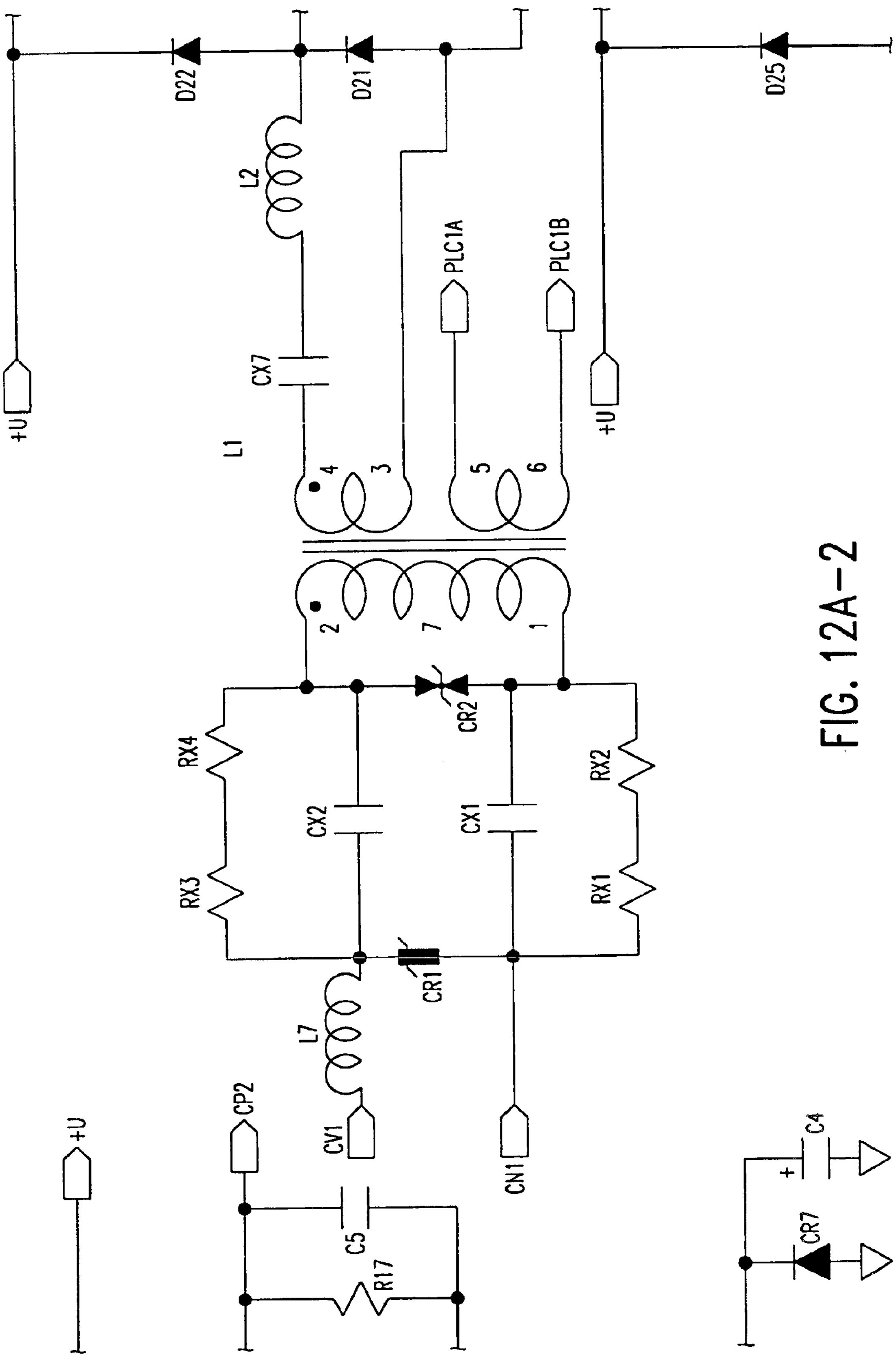
Figures 3, 12A:
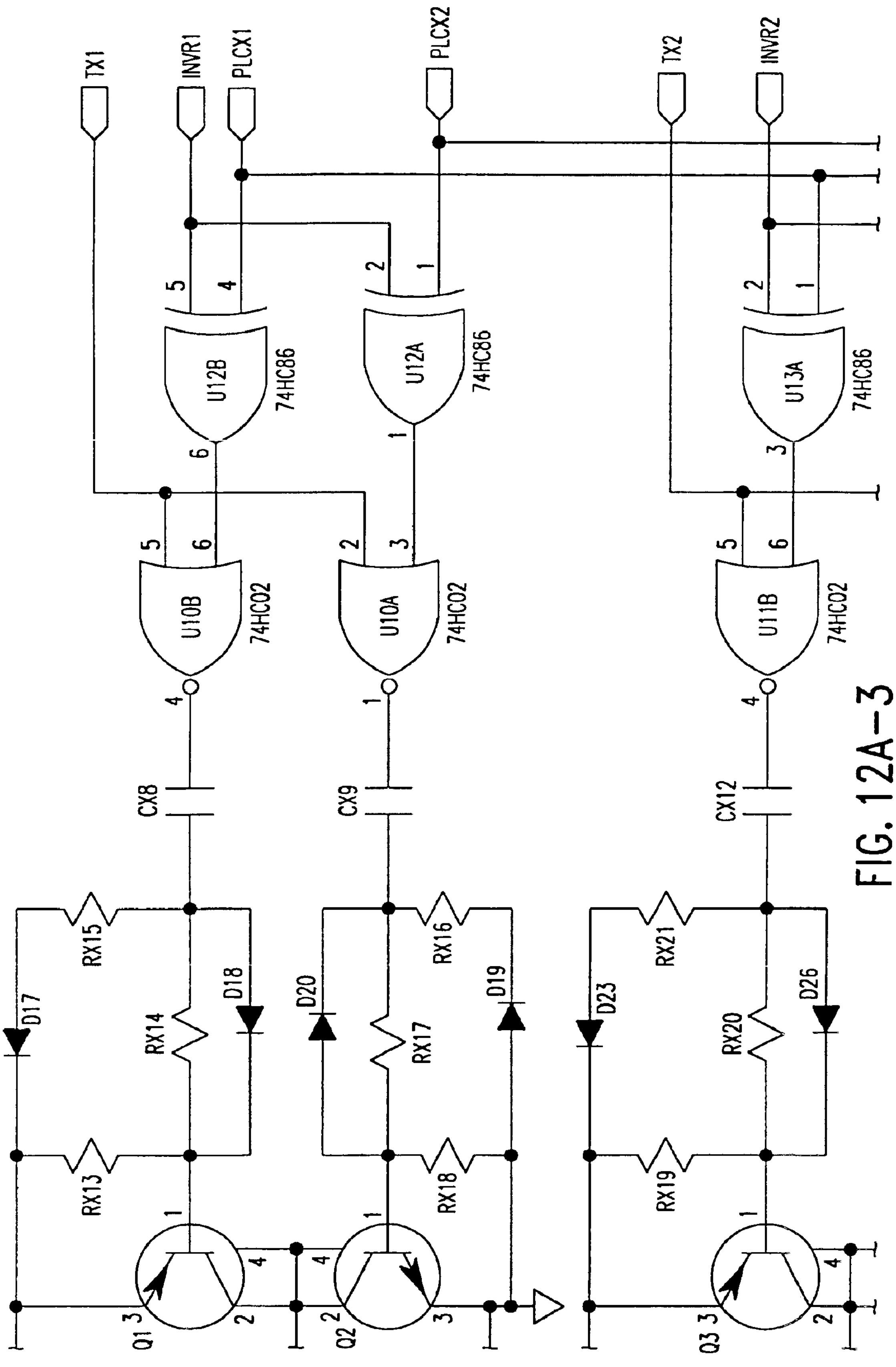
Figures 4, 12A:
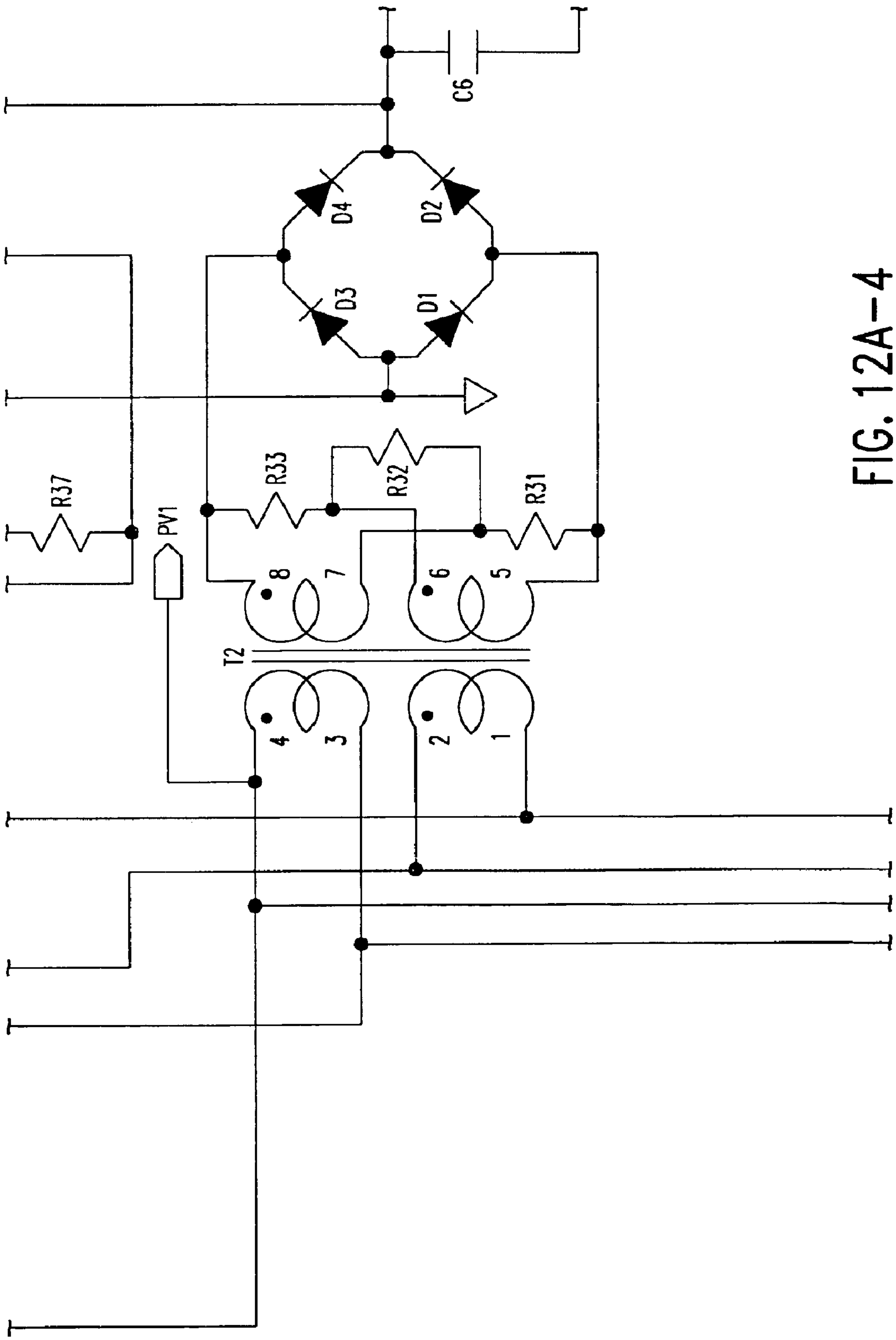
Figures 5, 12A:
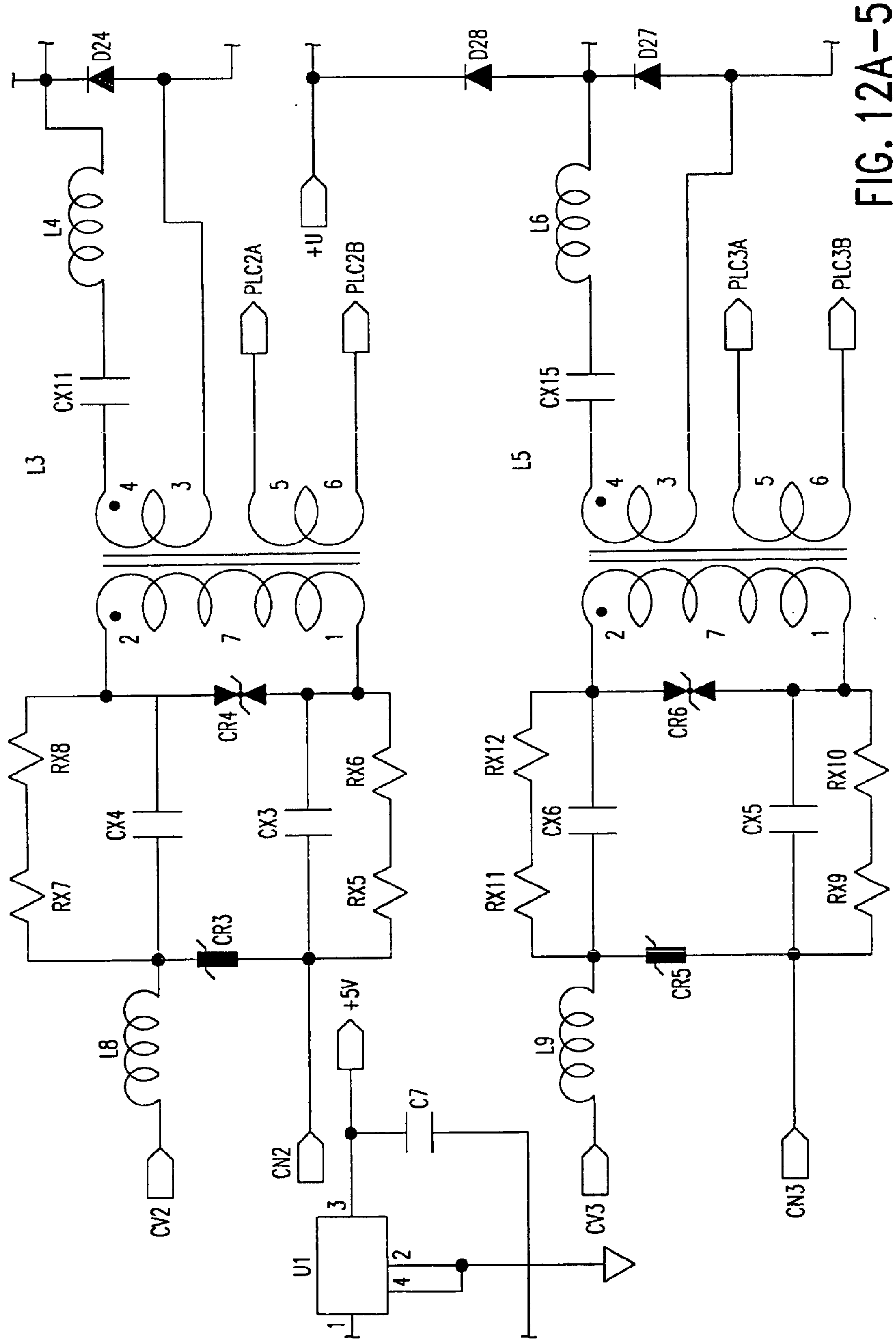
Figures 6, 12A:
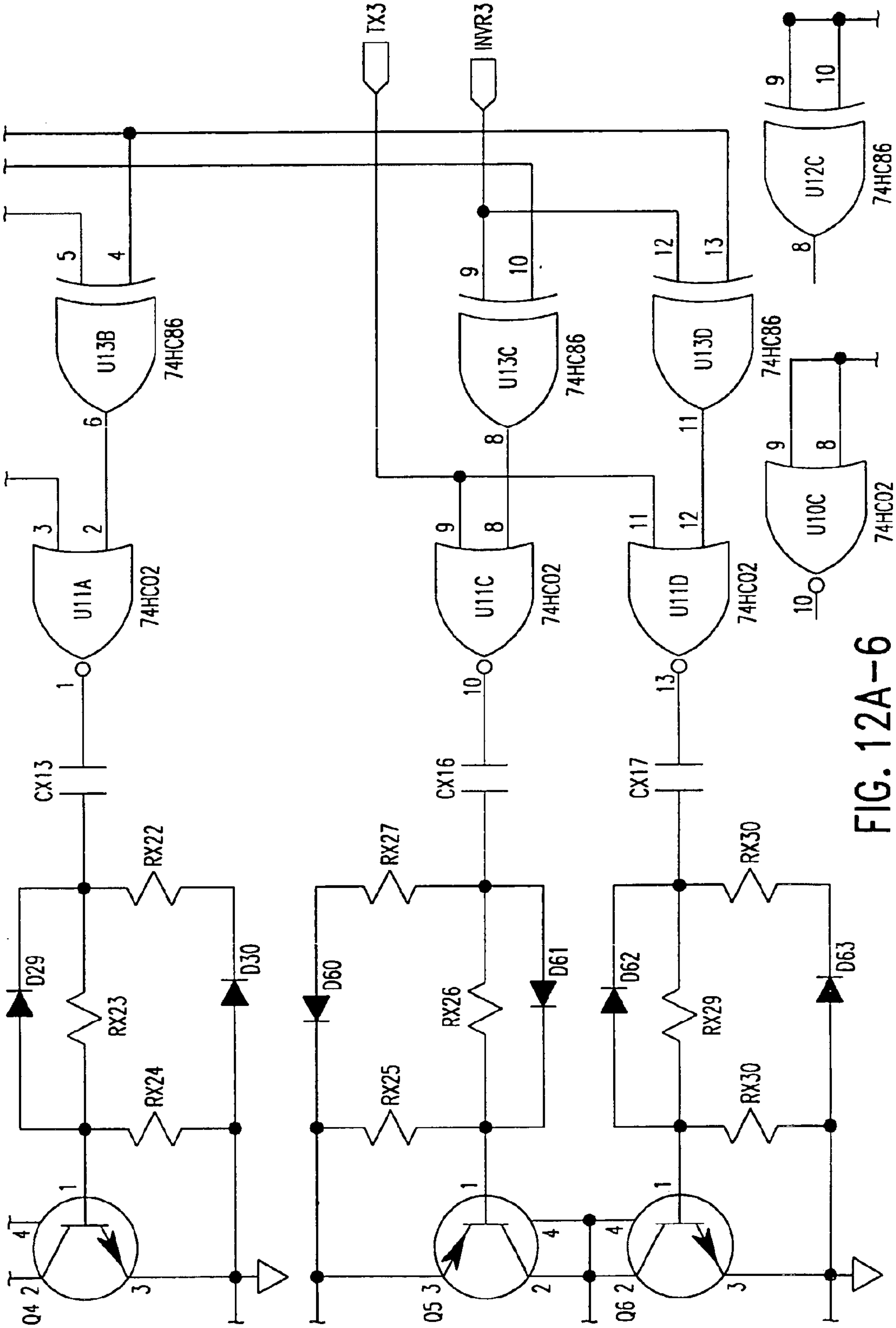
Figures 7, 12A:
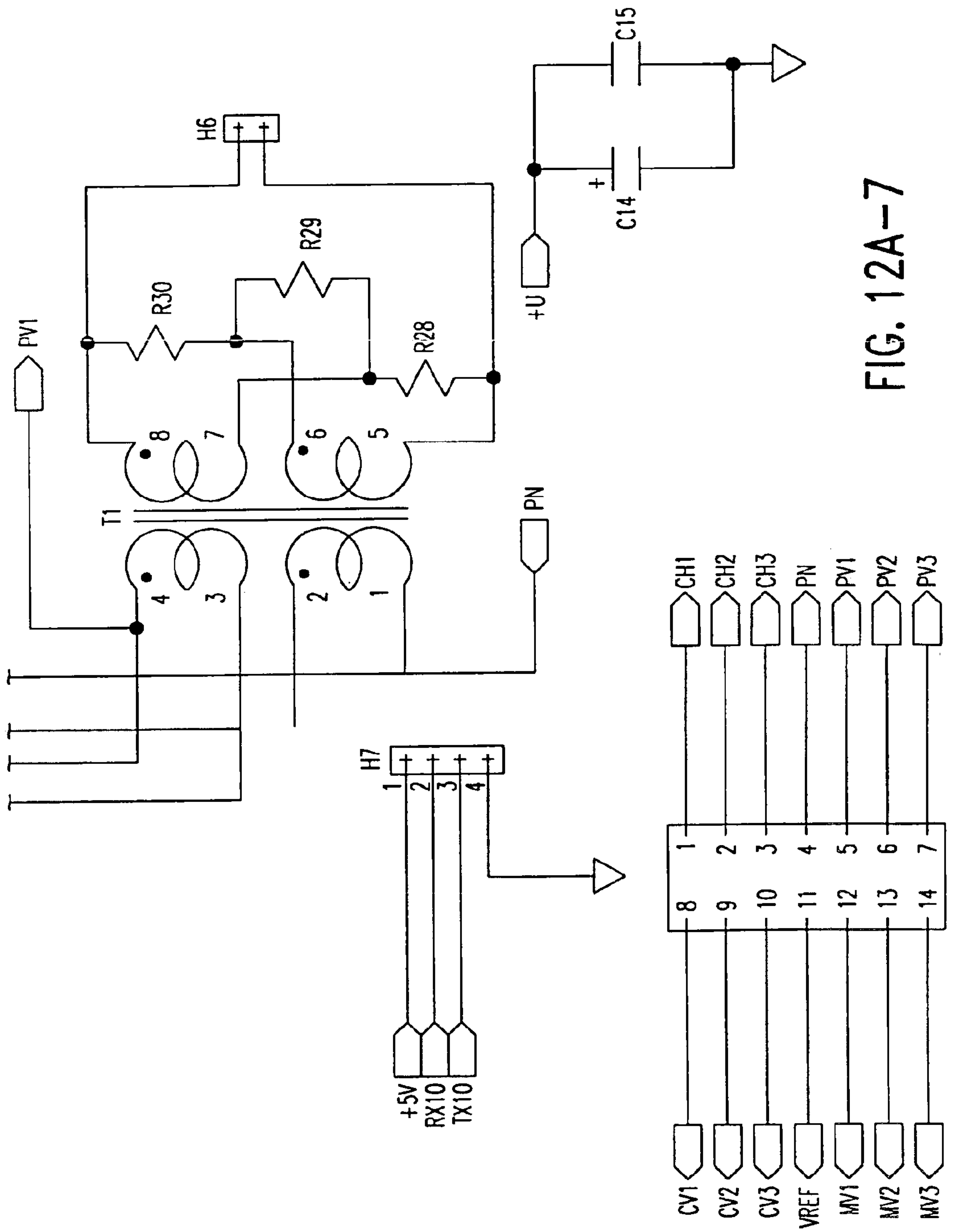
Figures 8, 12A:
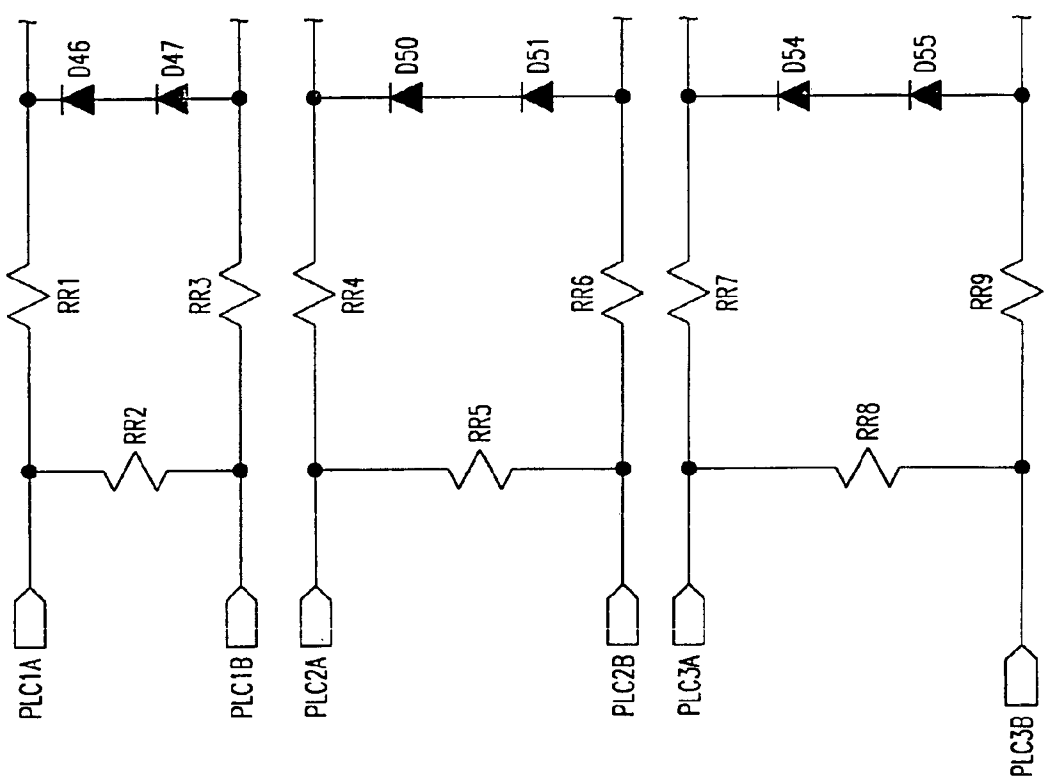
Figures 9, 12A:
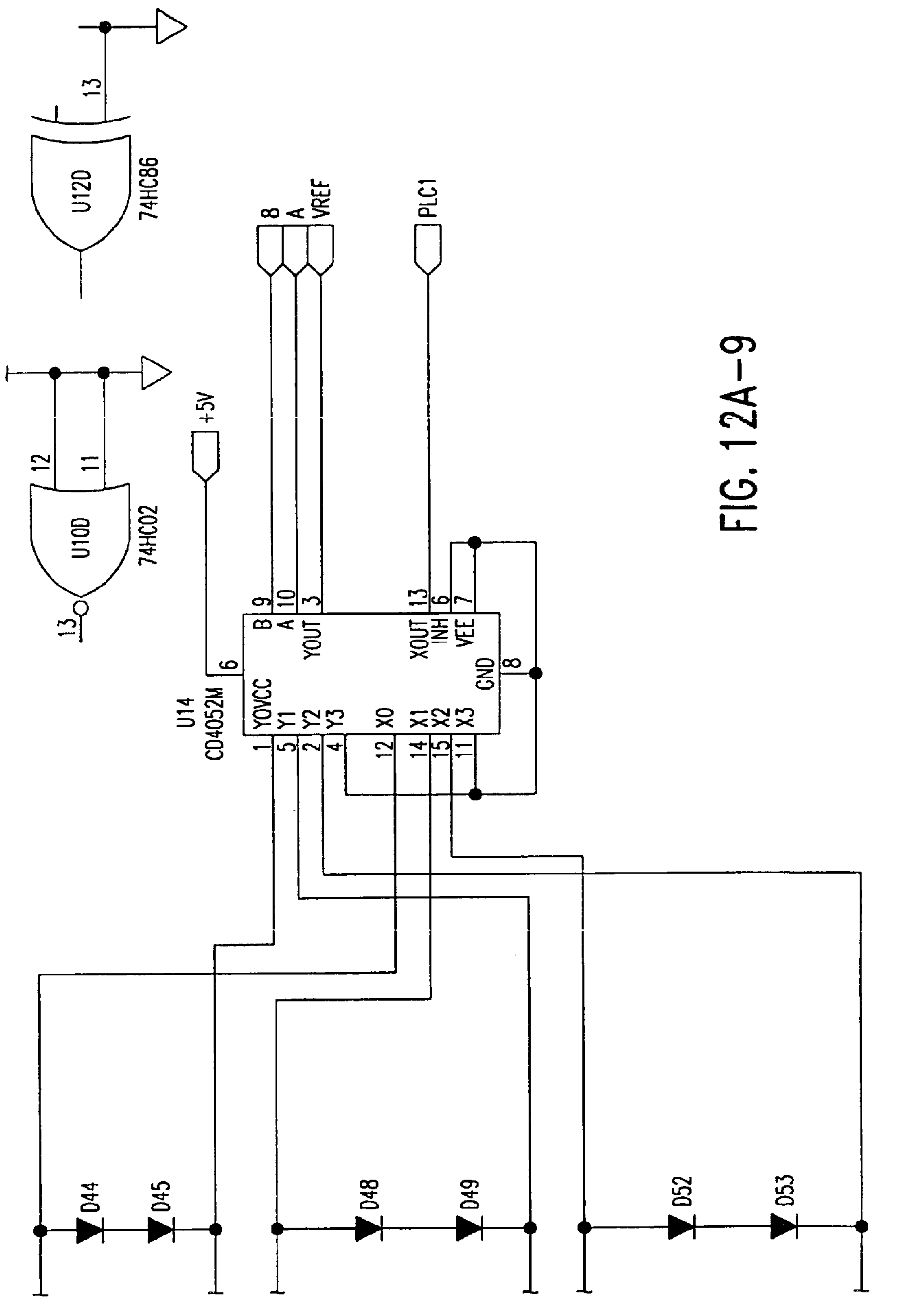
Figures 1, 12B:
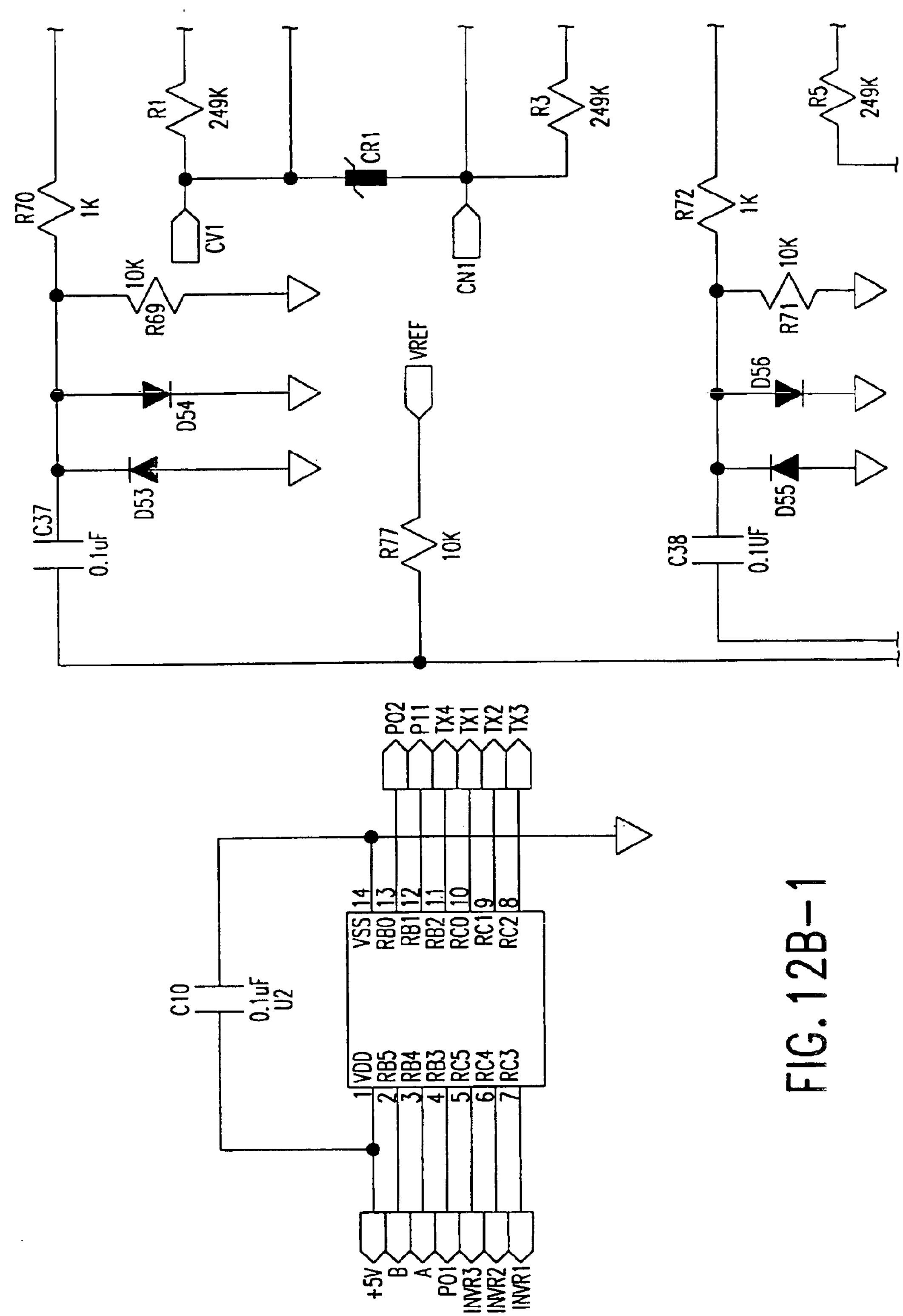
Figures 2, 12B:
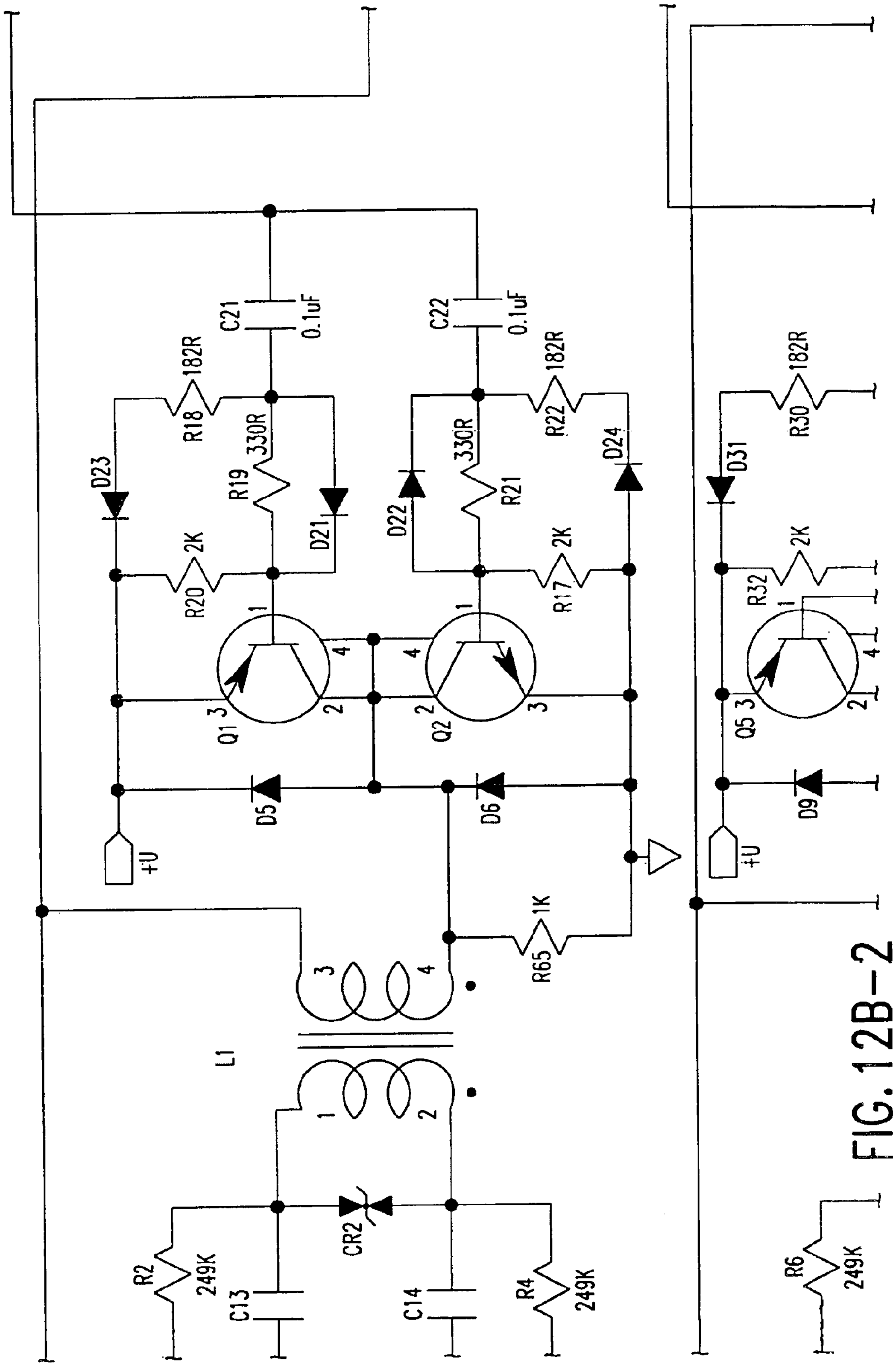
Figures 3, 12B:
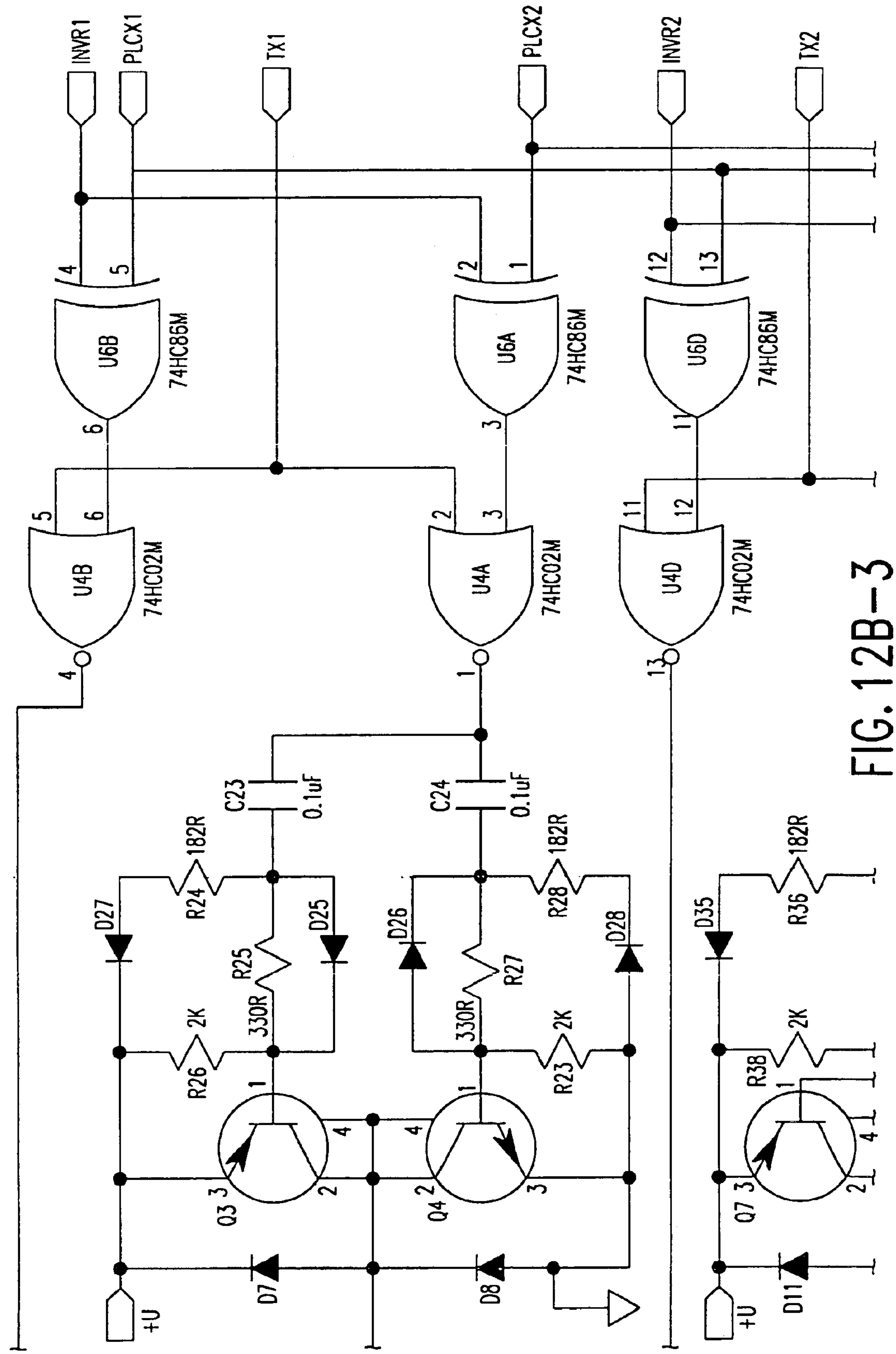
Figures 4, 12B:
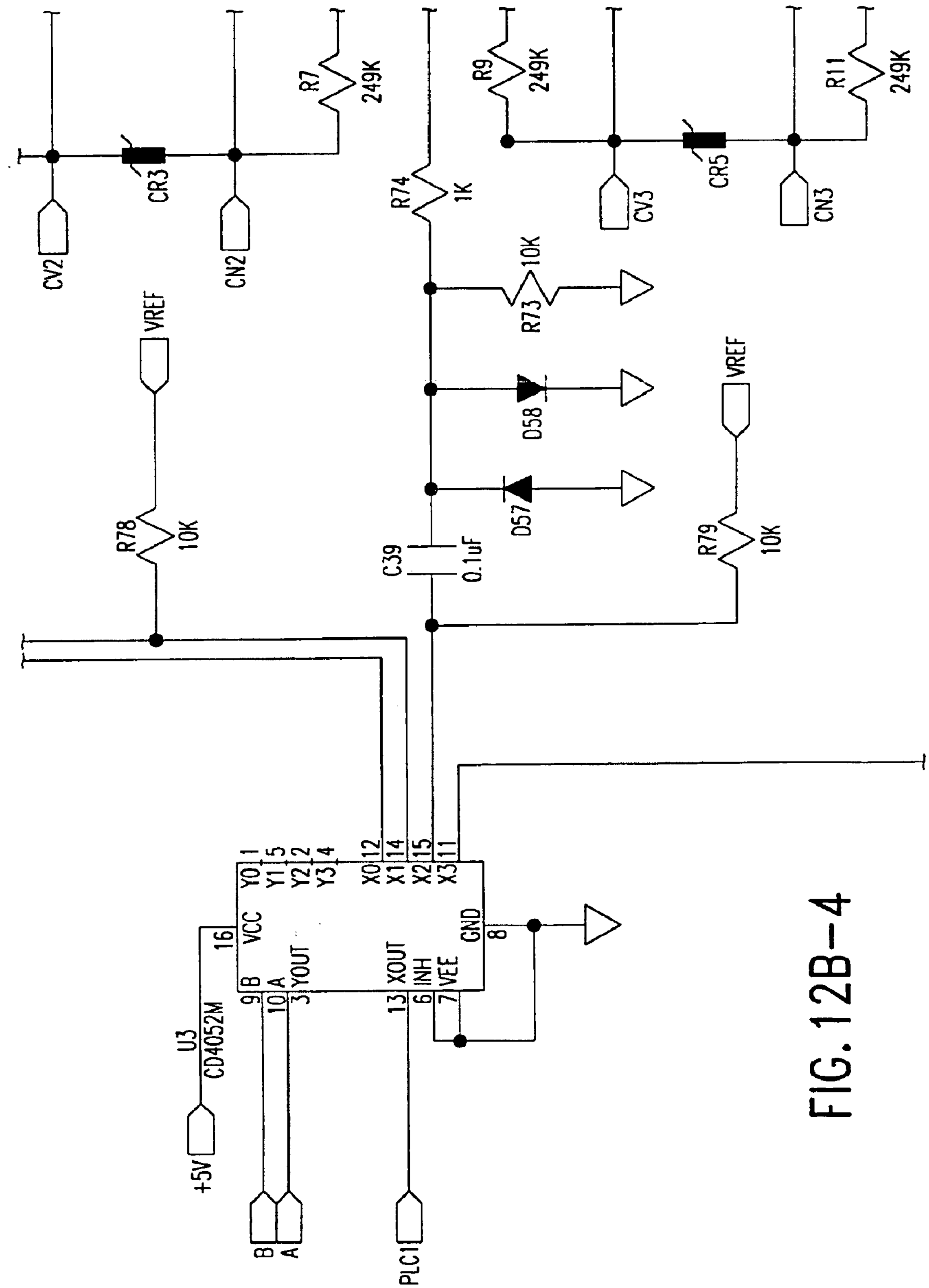
Figures 5, 12B:
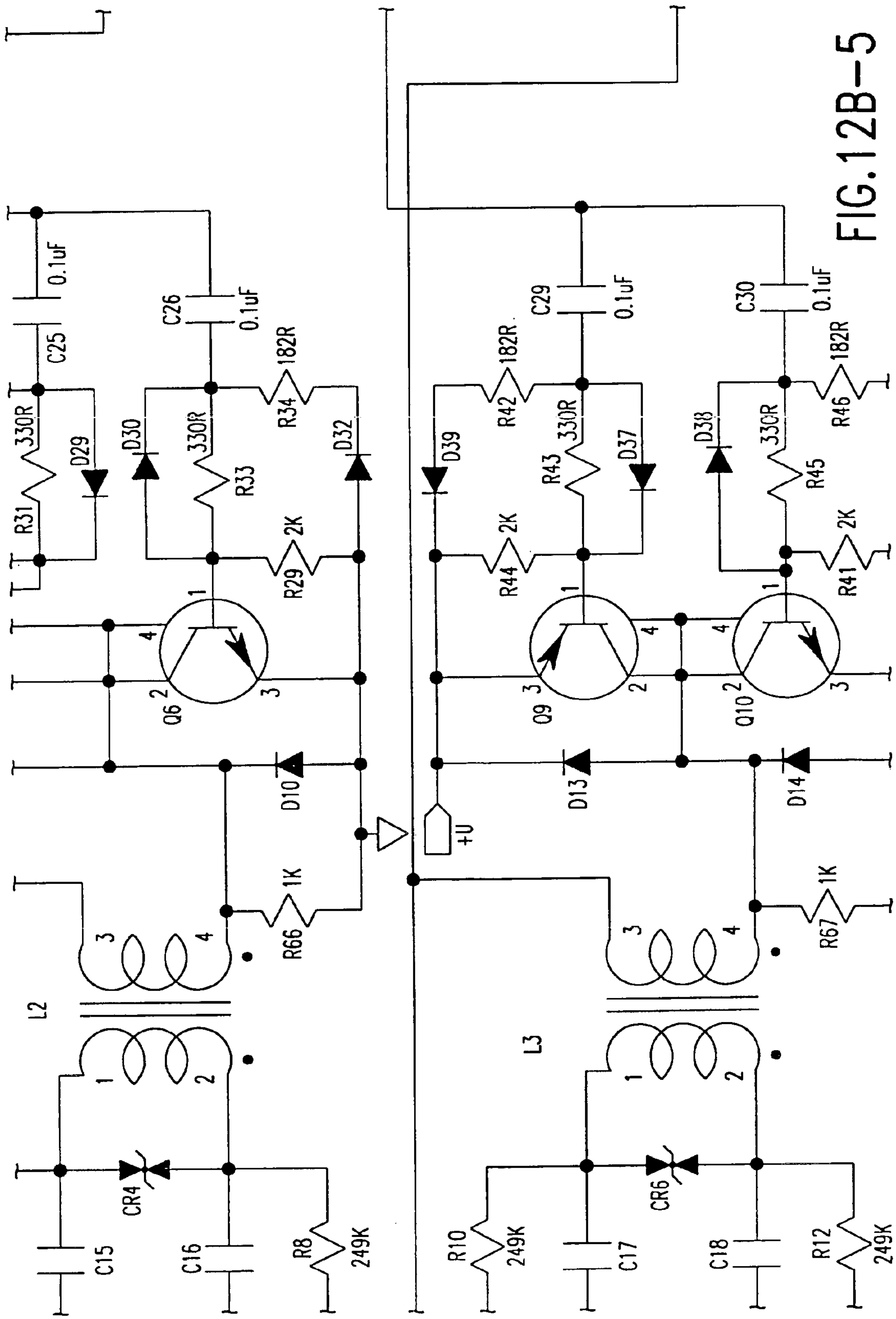
Figures 6, 12B:
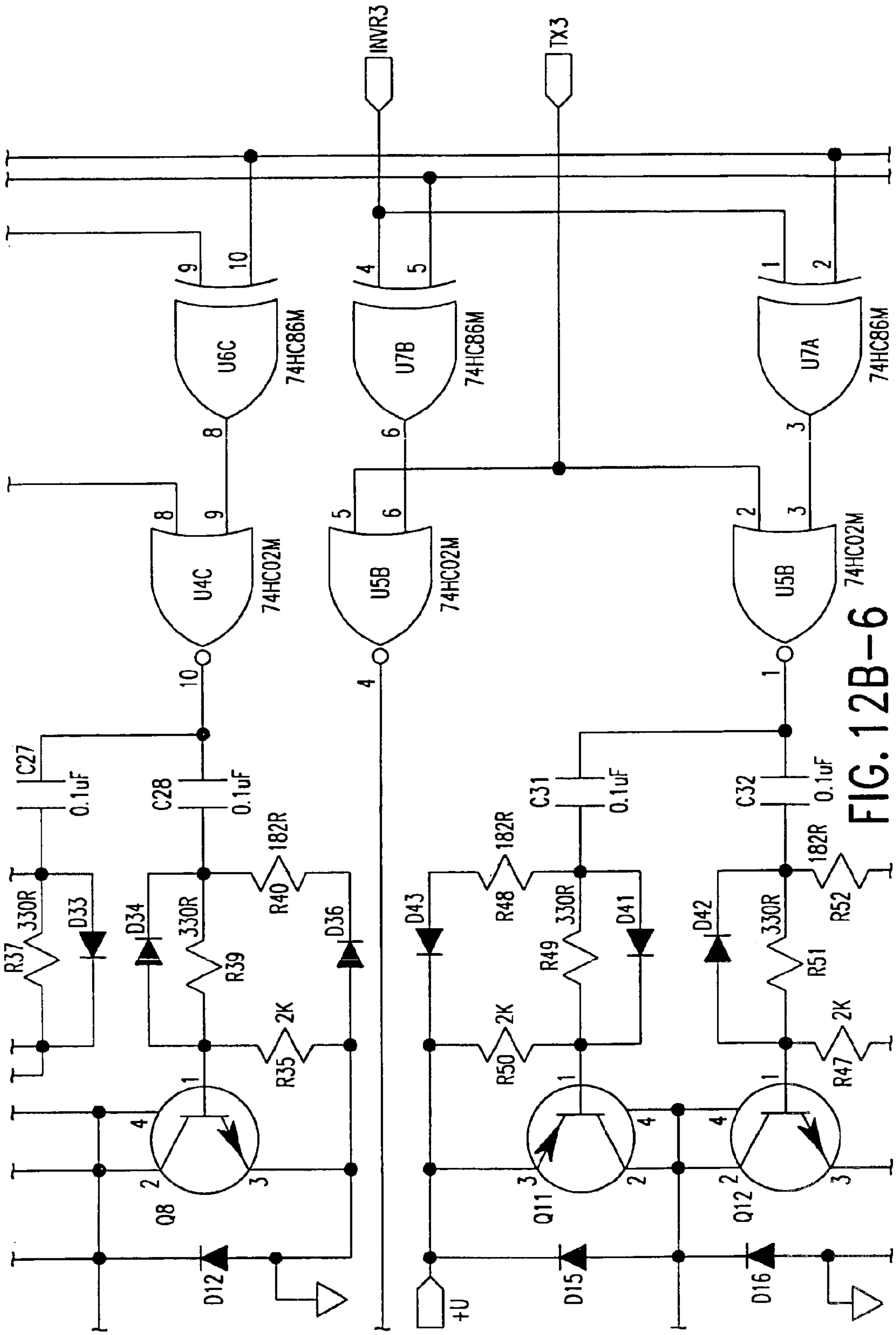
Figures 7, 12B:
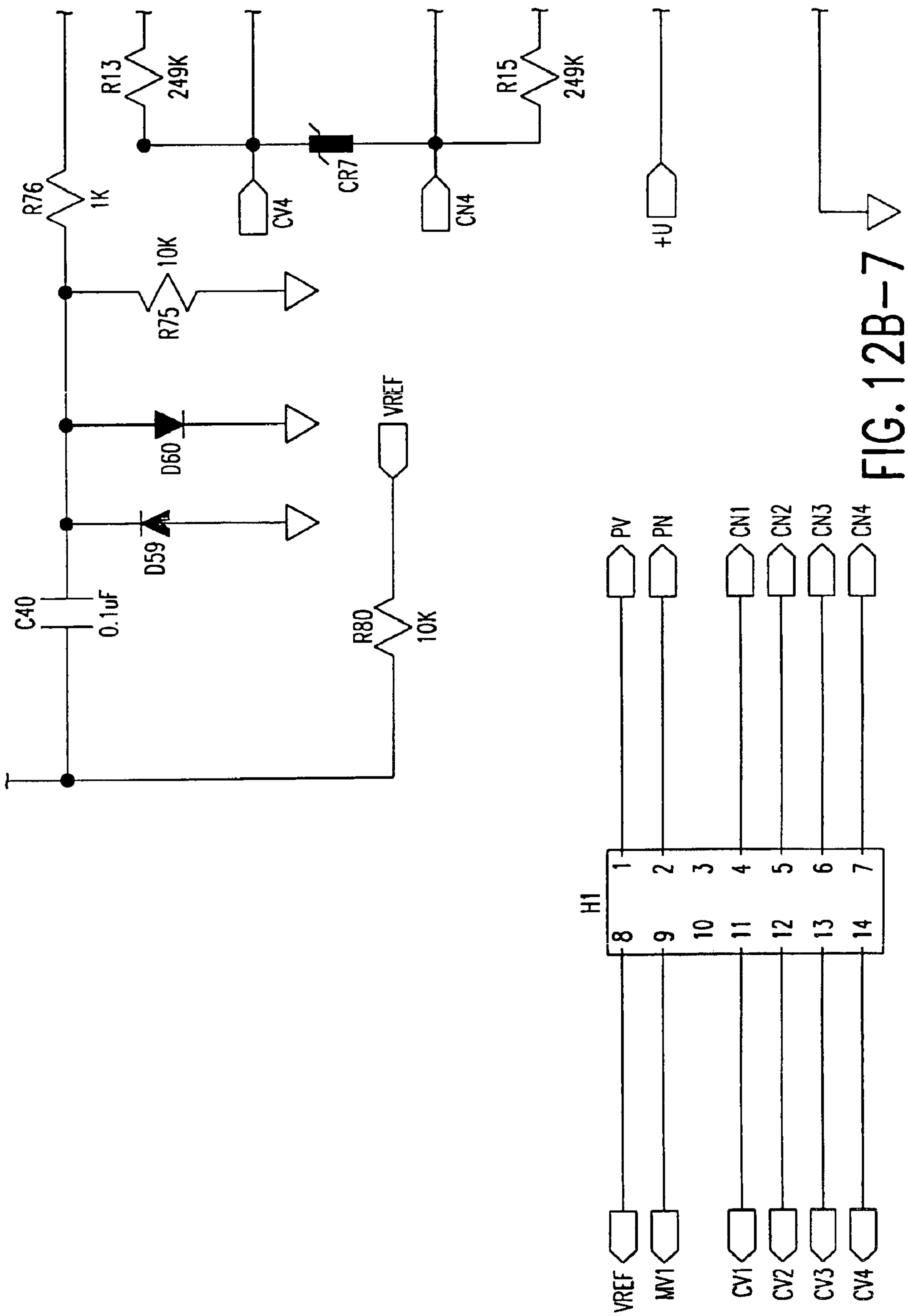
Figures 8, 12B:
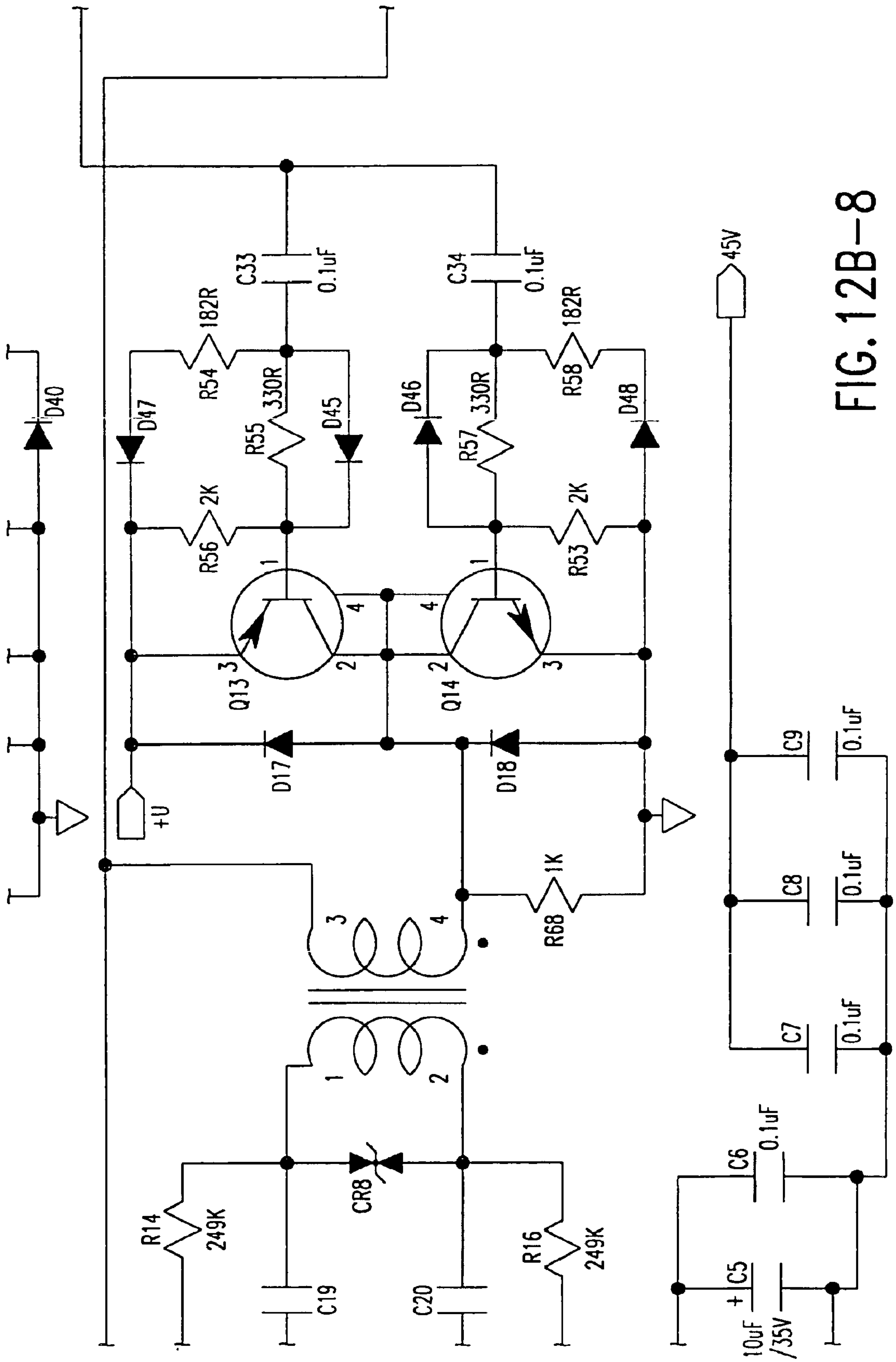
Figures 9, 12B:
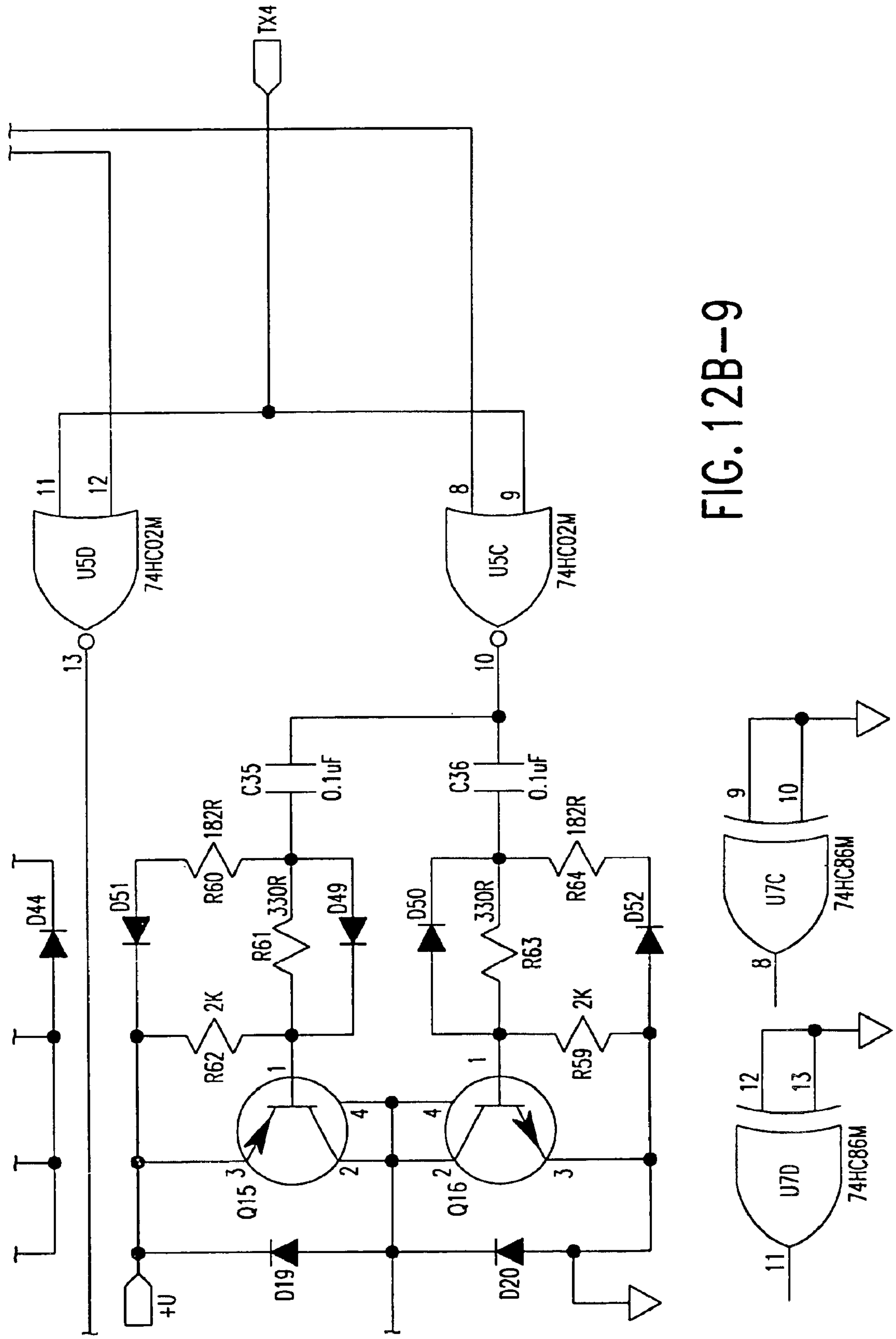
Figure 12C:
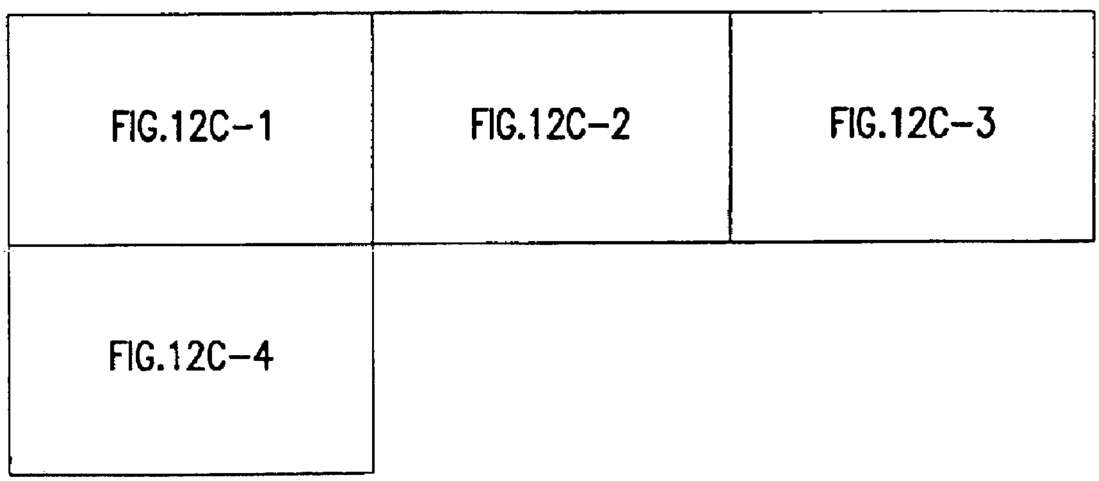
Figures 1, 12C:
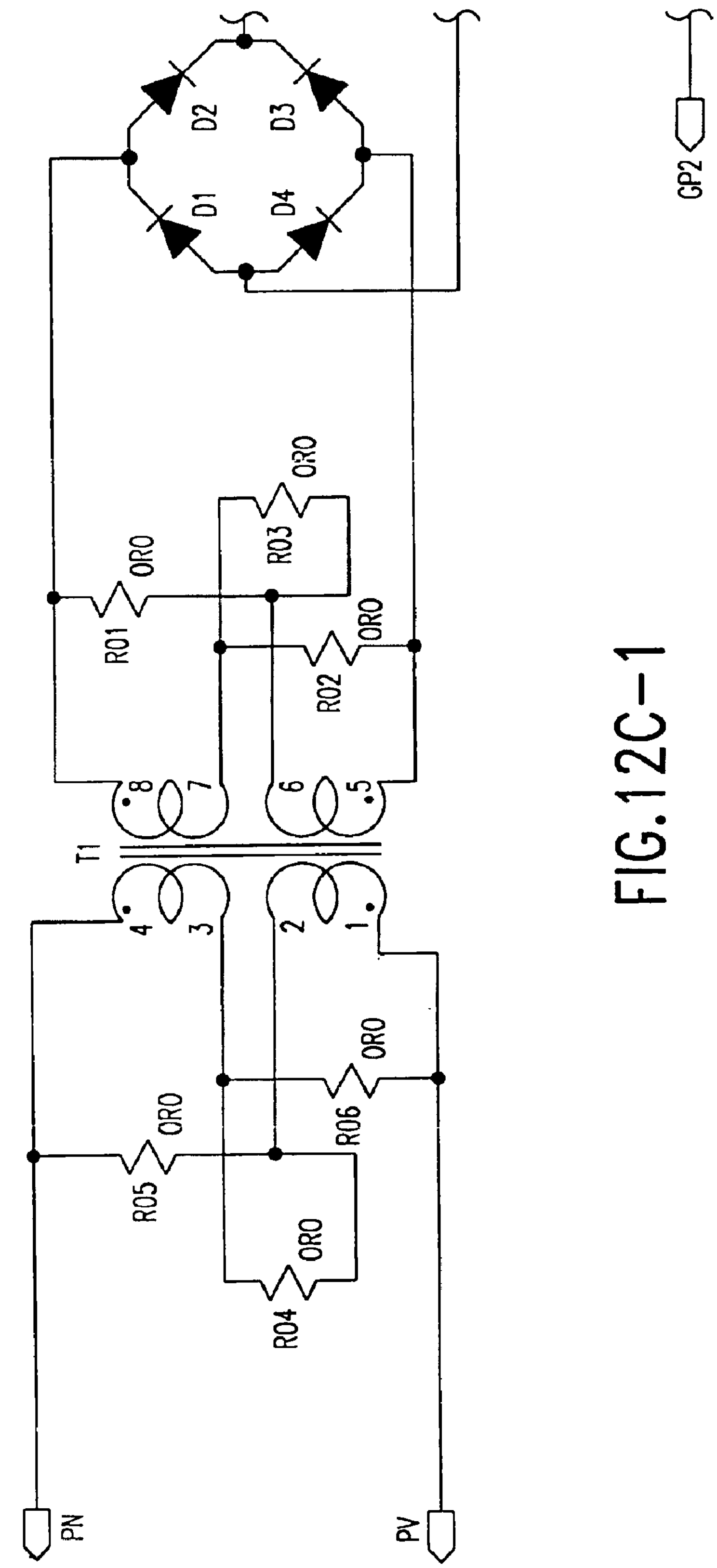
Figures 2, 12C:
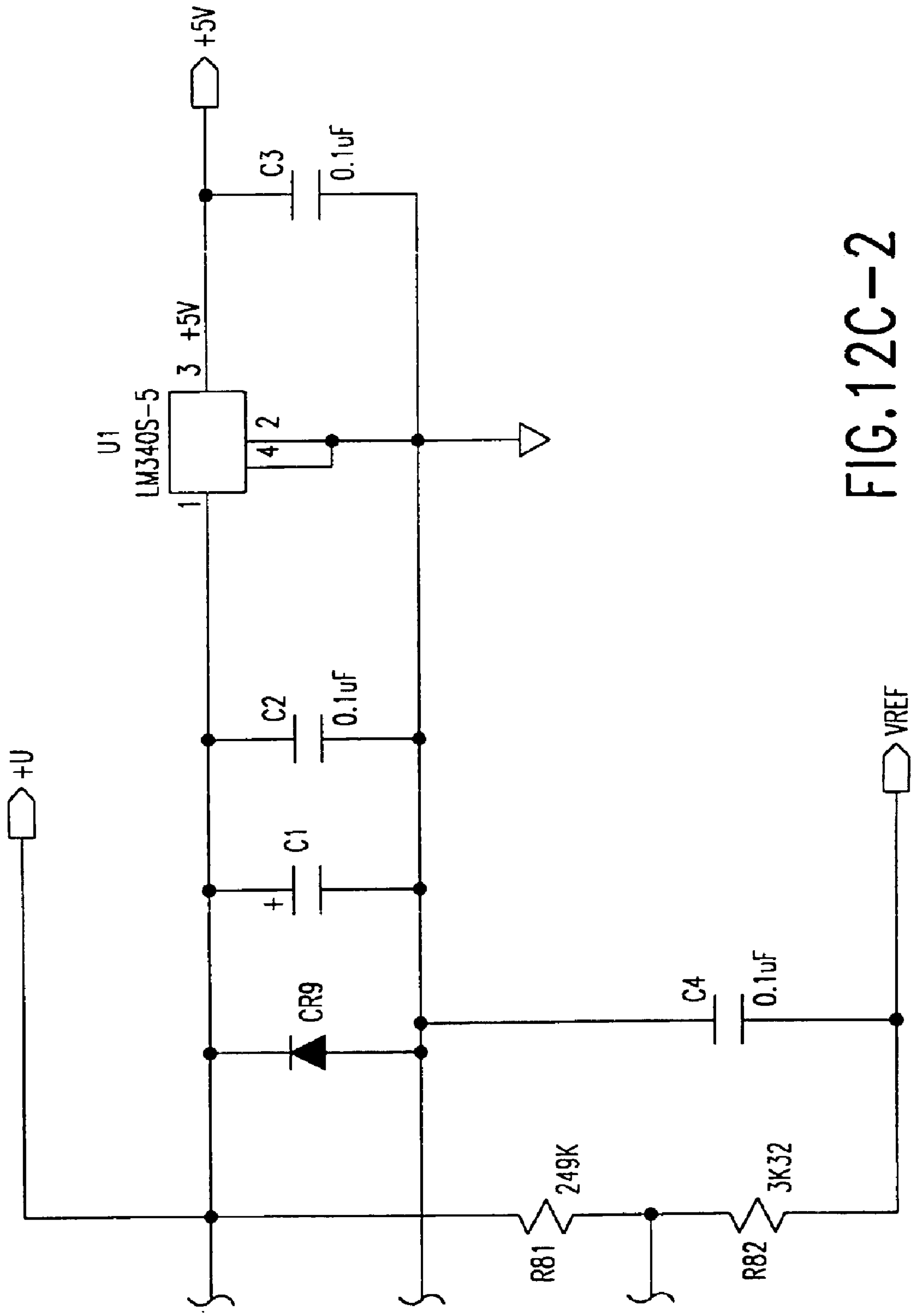
Figures 3, 12C:
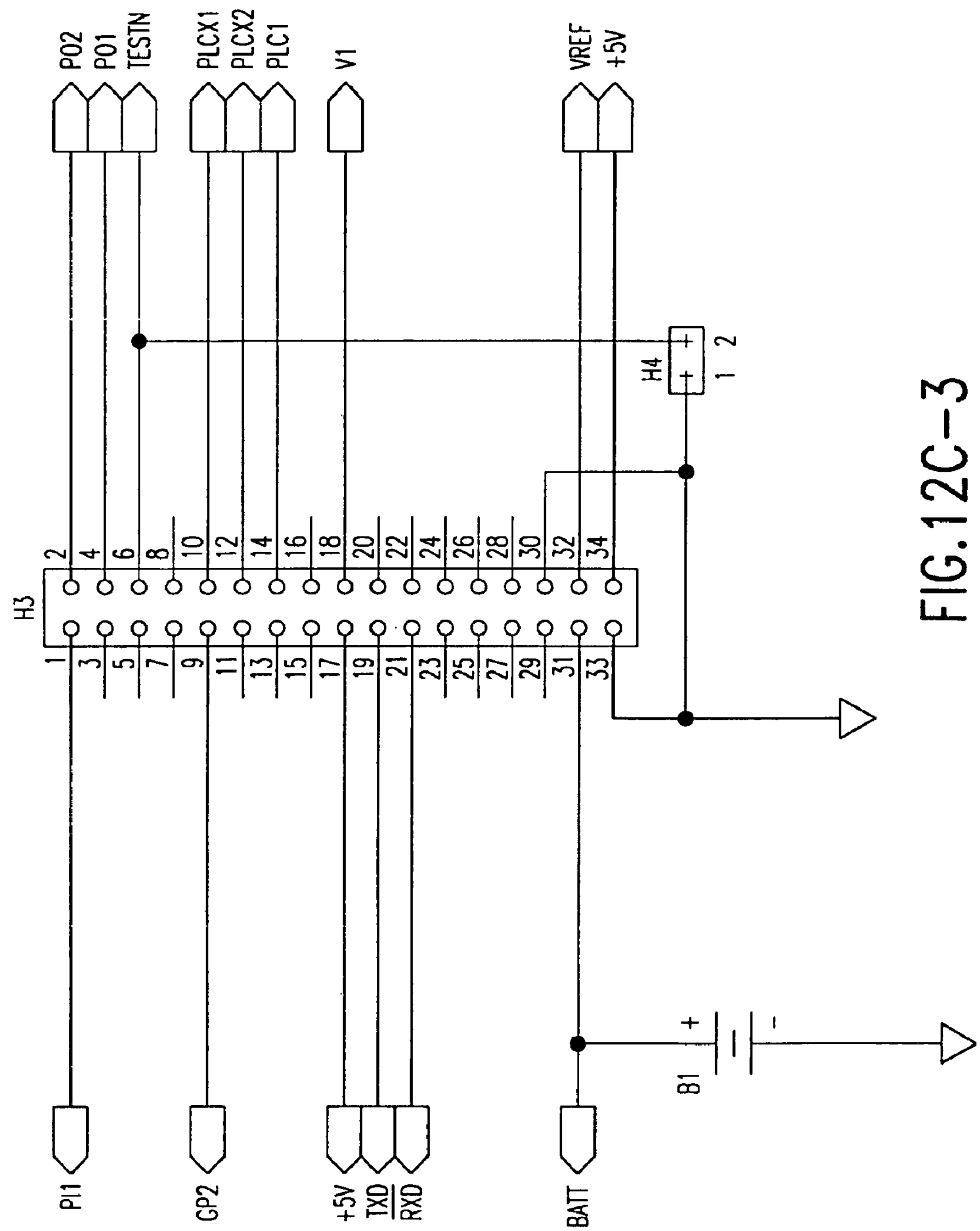
Figures 4, 12C:
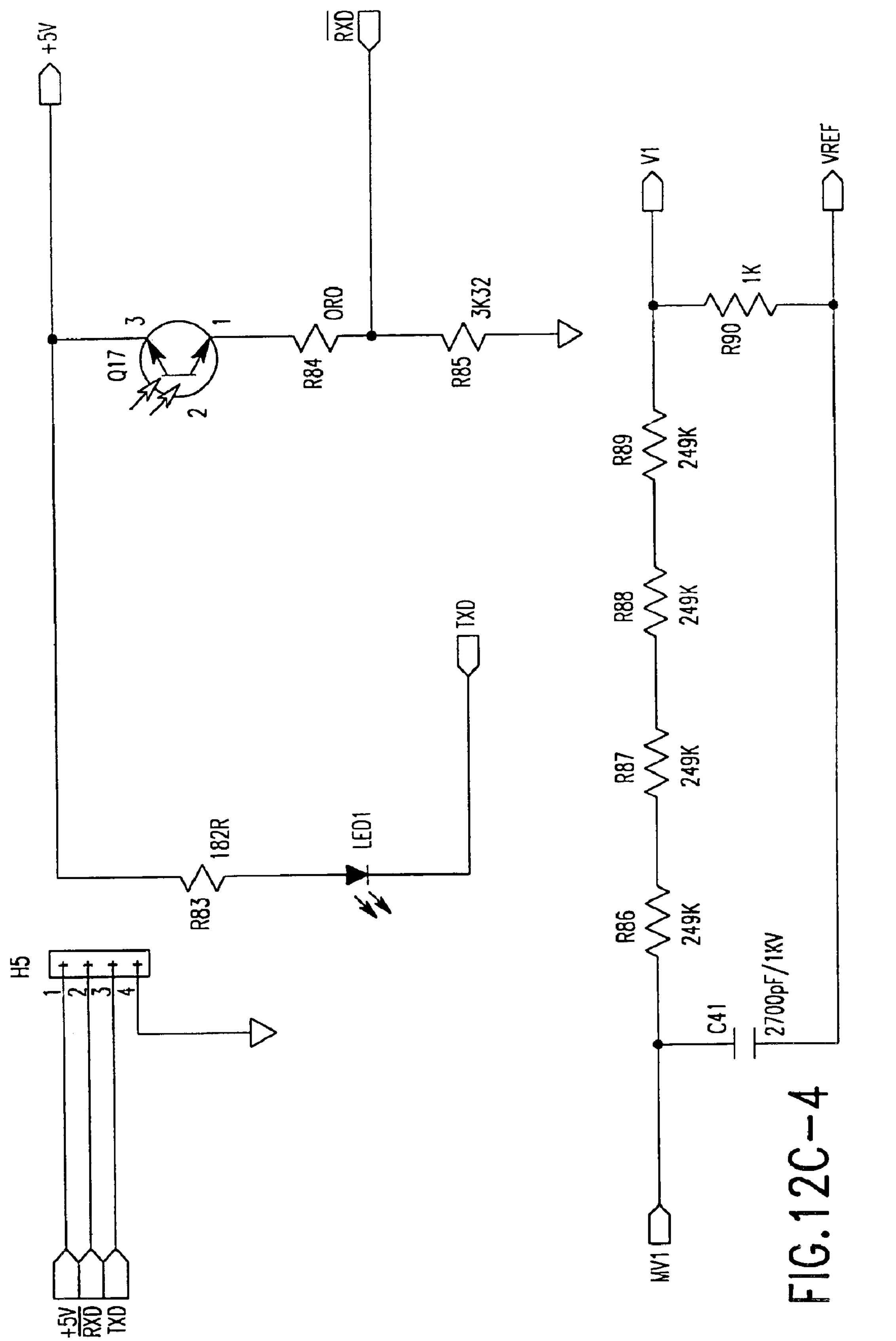
Figure 13:
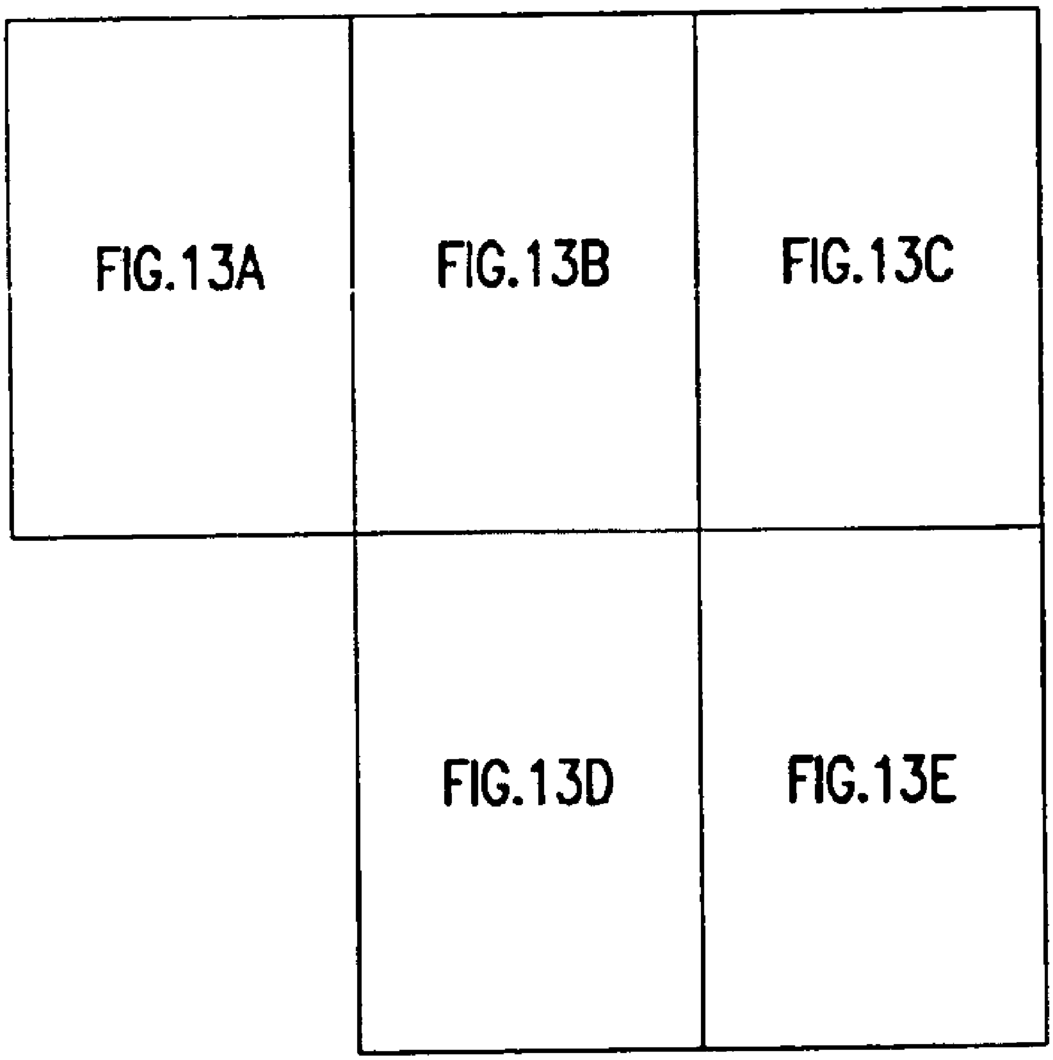
Figure 13A:
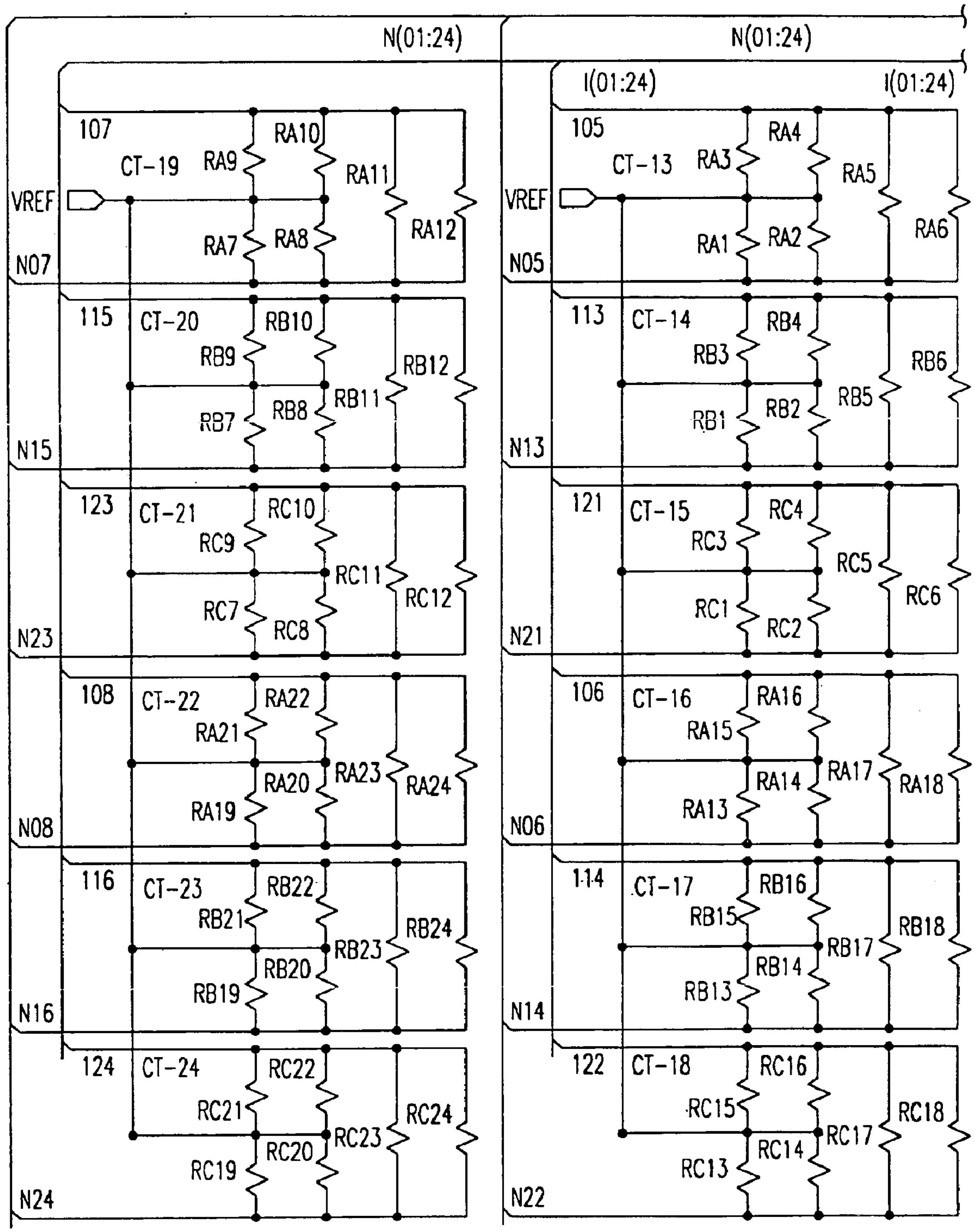
Figure 13B:
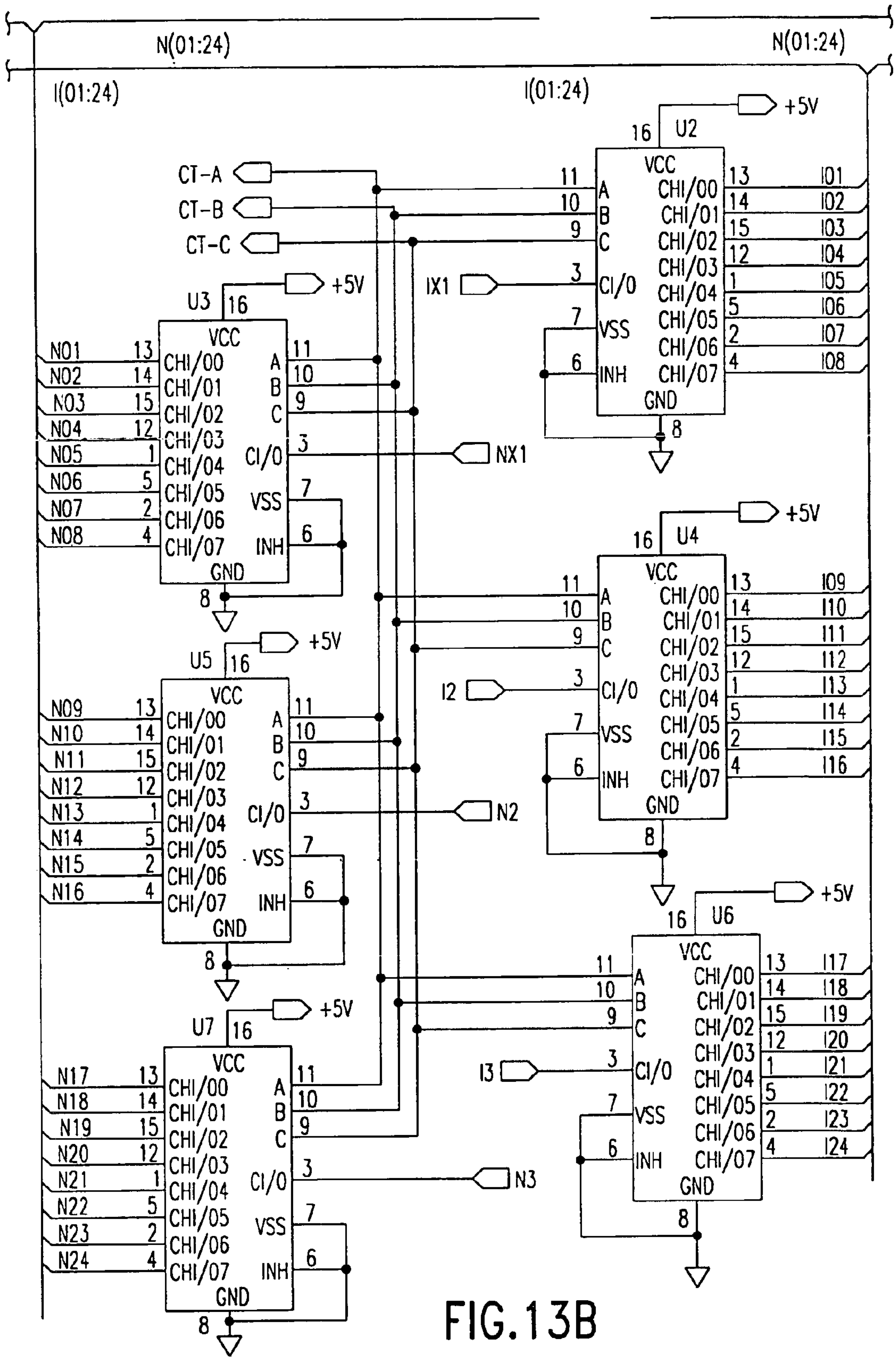
Figure 13C:
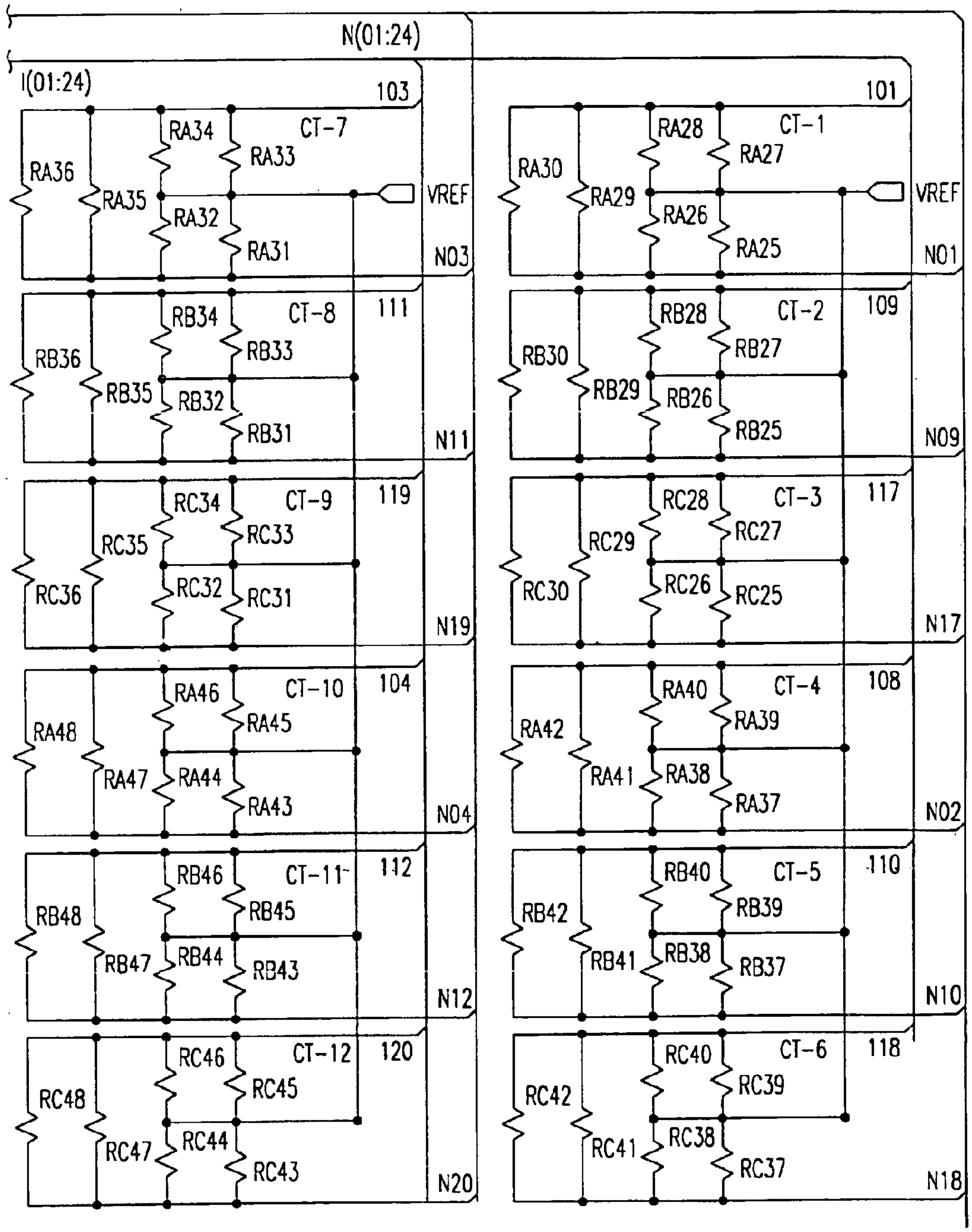
Figure 13D:
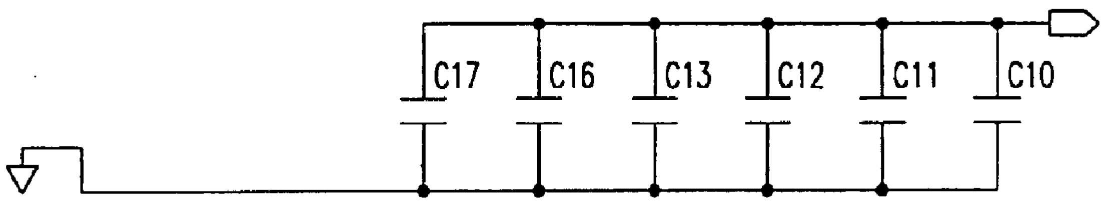
Figure 13E:
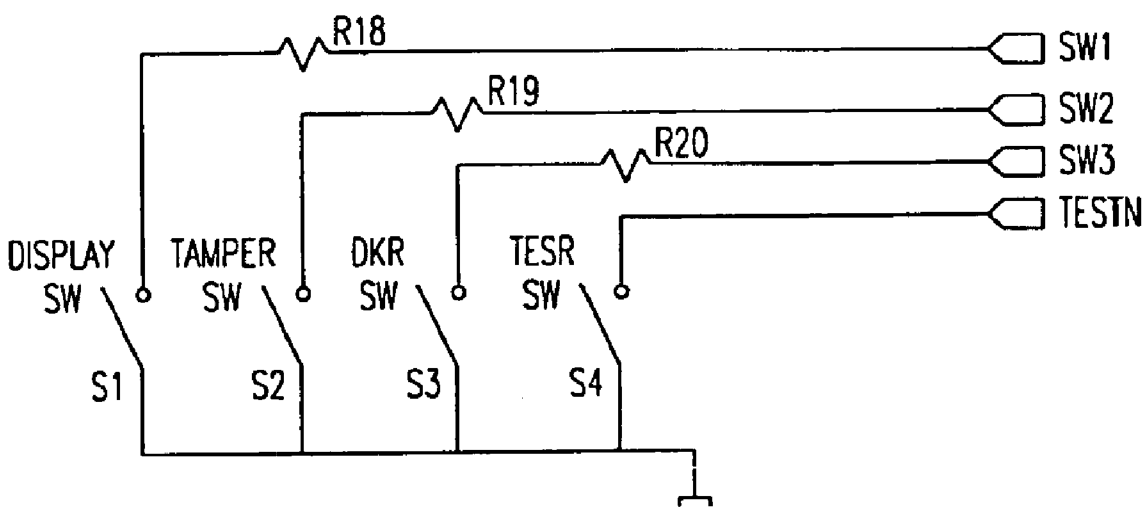
Figure 14:
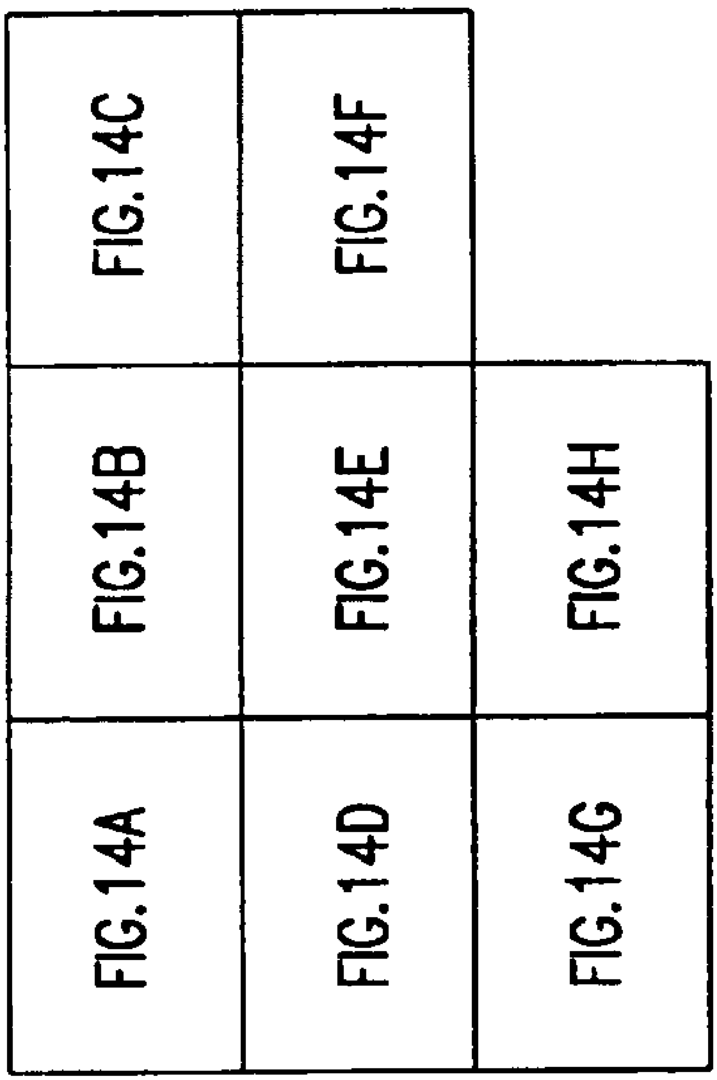
Figure 14A:
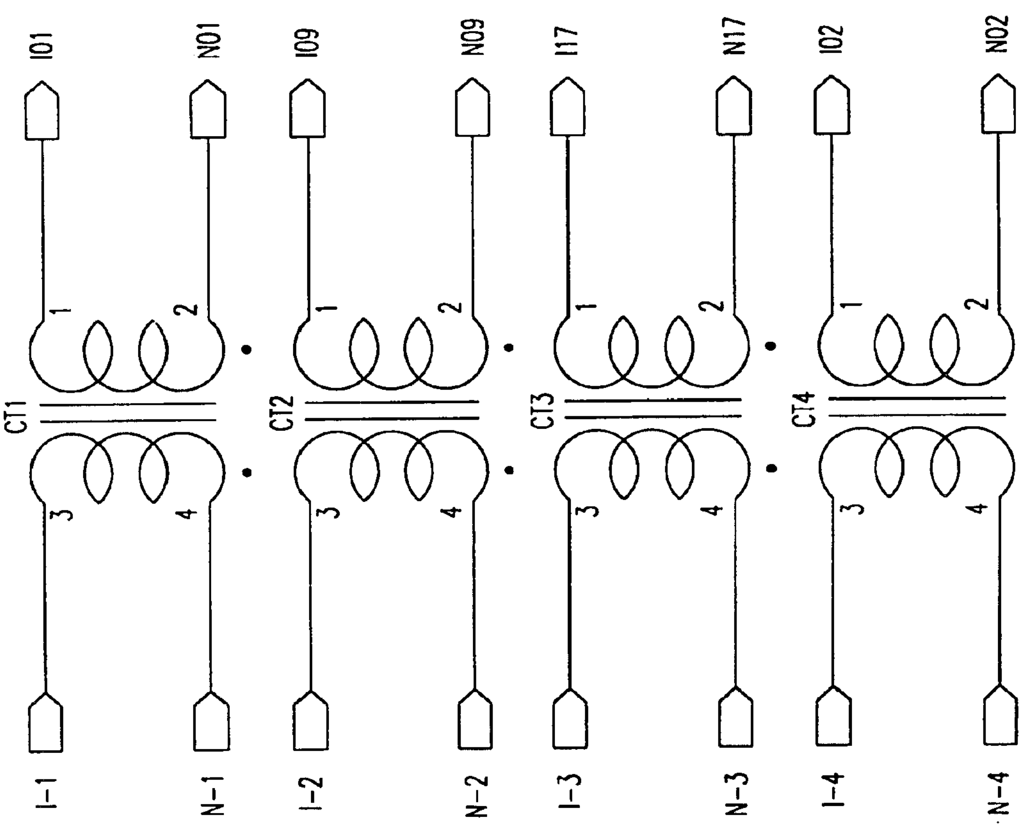
Figure 14B:
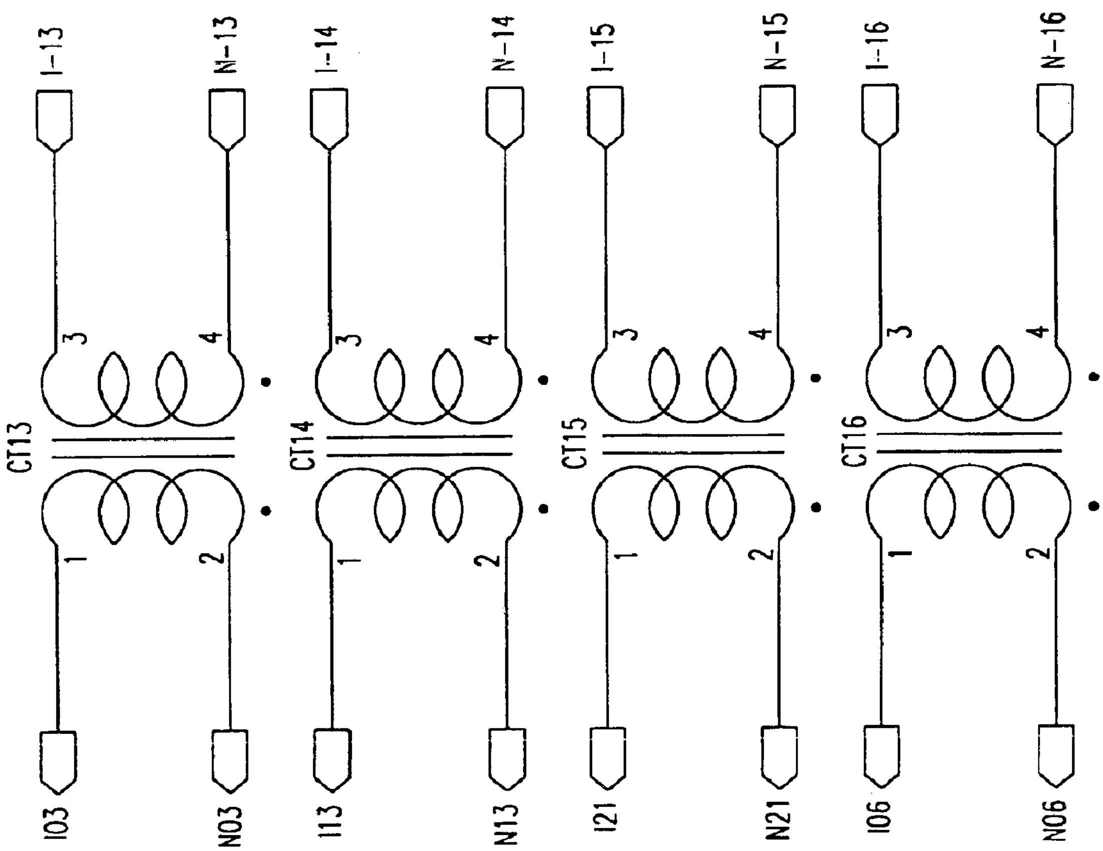
Figure 14C:
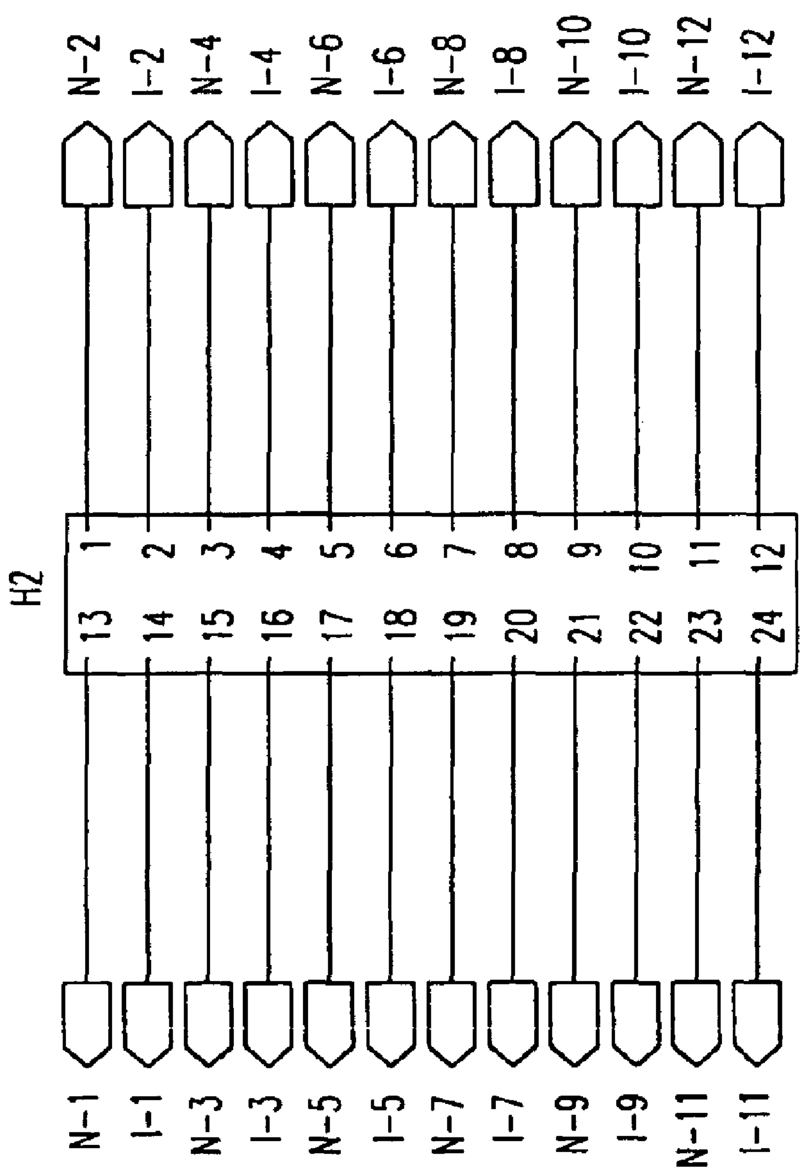
Figure 14D:
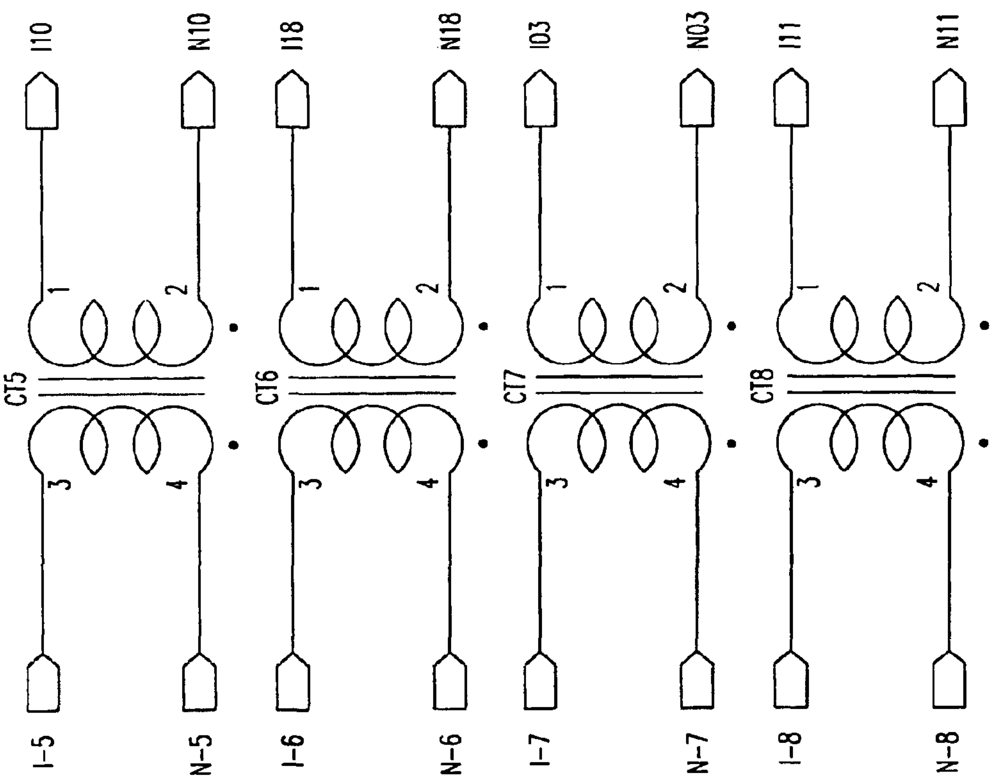
Figure 14E:
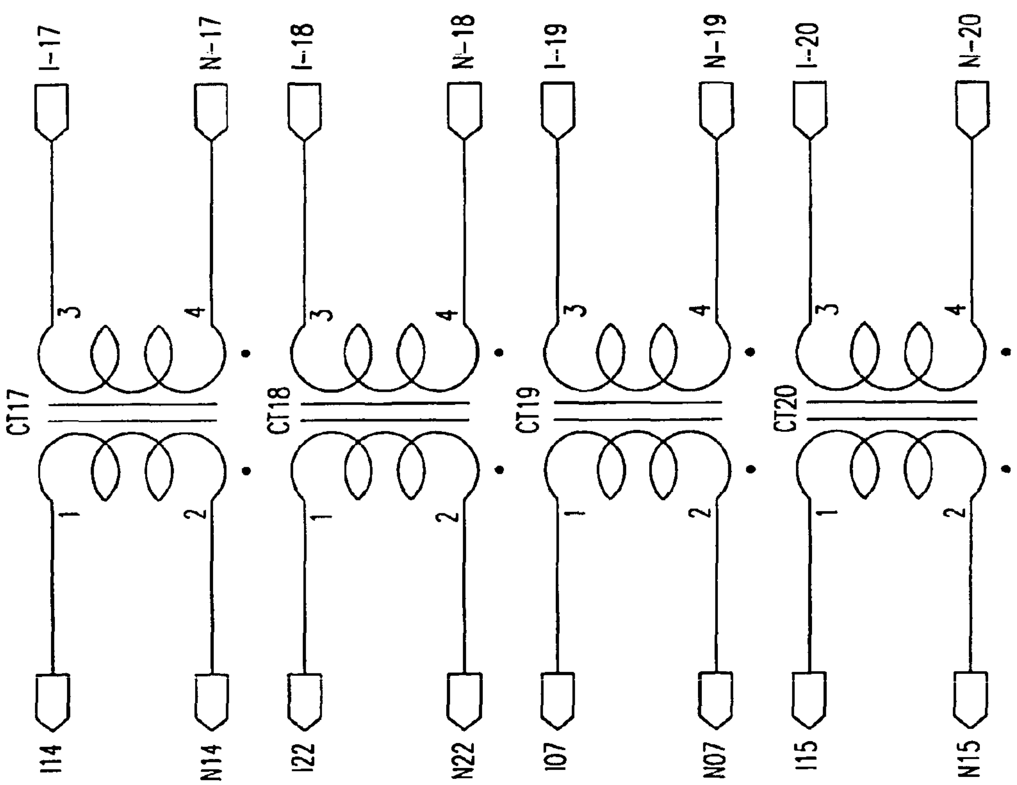
Figure 14F:
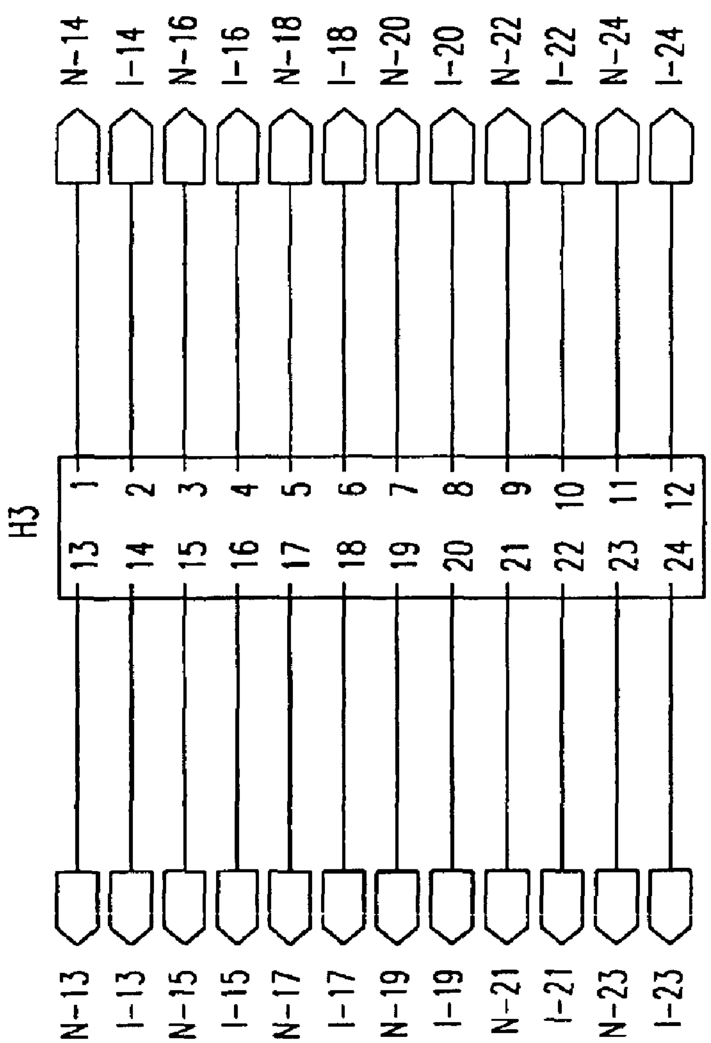
Figure 14G:
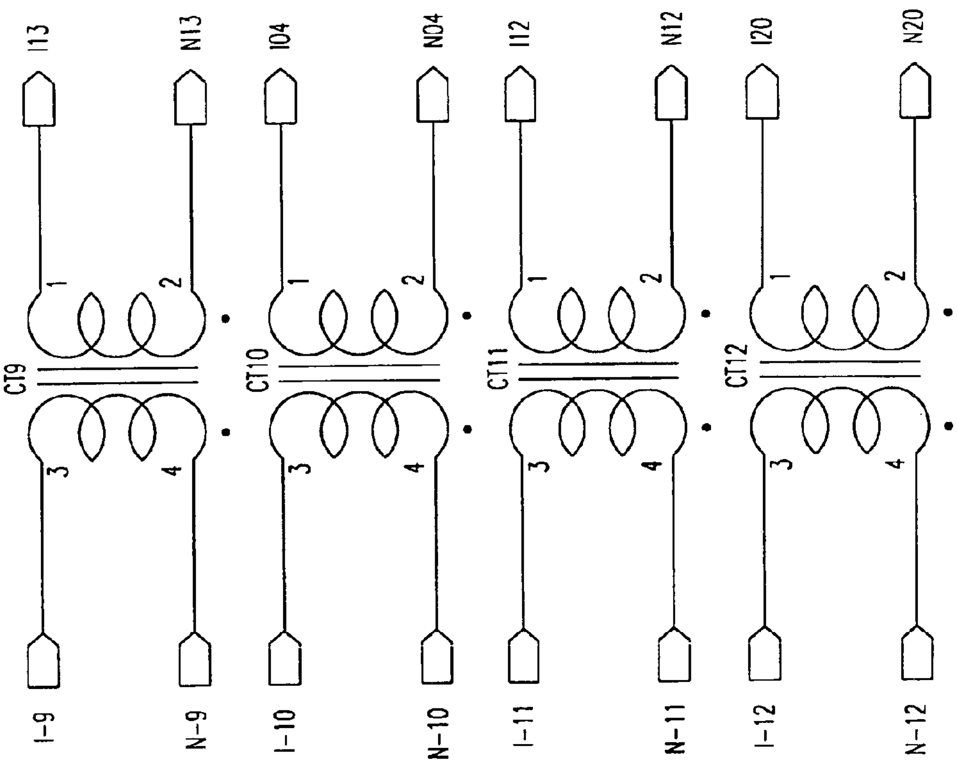
Figure 14H:
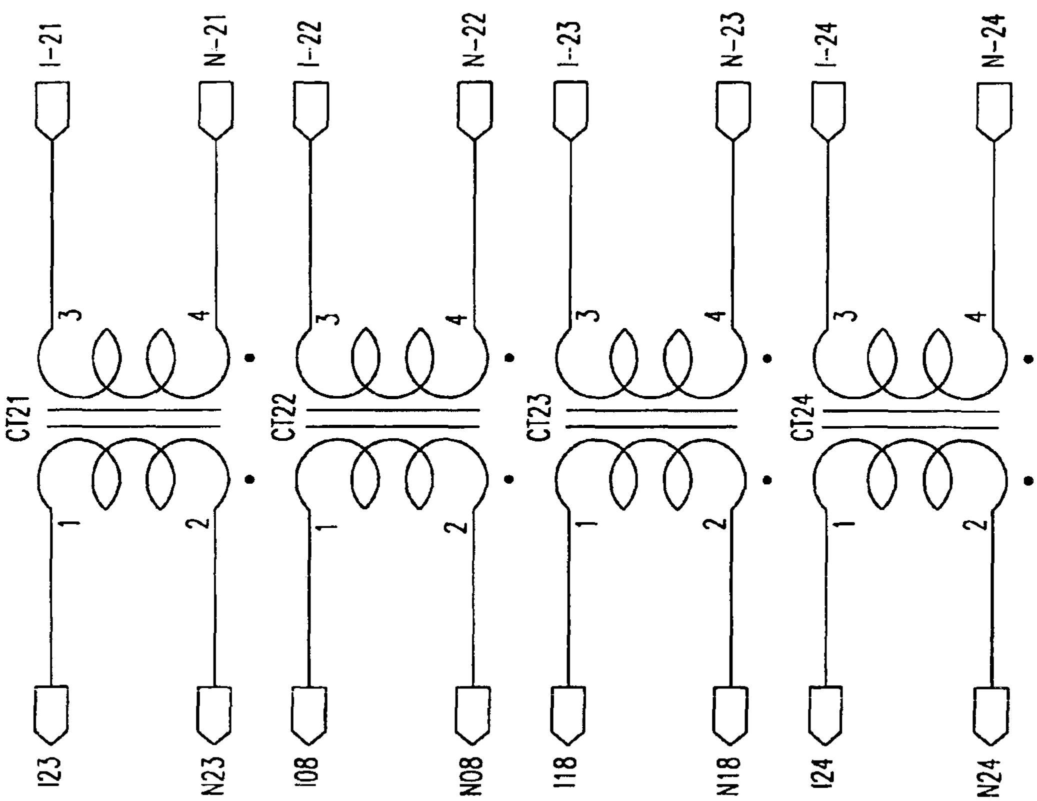

A 20 series schematic diagram can be found in FIG. 11C: CT1, CT2, and CT3 (in the upper right corner of the diagram) are inputs from the current transformer. They connect to resistor networks that convert the current source into a voltage level that is compatible with the ASIC (described below). PH-A, PH-B, and PH-C (in the bottom-central part of the diagram) are measurement voltage levels that enter a different resistor network and divide the voltage to a level that is readable by the ASIC. H3 (at the upper-central part of the diagram) is a header connection to the display board. H8 (near PH-A) is a header that connects high voltage phases. PLCX1, PLCX2, and PLC1 (near H3) are control signals that perform power line communication (PLC). U2 (in the right-central part of the diagram—near H7) is a microprocessor that is connected to a contact closure counting circuit. Contact closures are isolated by L3 and OPT1 through OPT6. Q4 and LED1 are the optical receiver and transmitter, respectively. The ferrite beads FB are intended to decouple high frequency noise. SW1, SW2, and SW3 are user access control switches. T1 is the transformer for the main power supply transformer for this unit. The input is 120/220 selectable by SW4. Power voltage is rectified and regulated. T2 provides an isolated power supply for an optional Modem Board attachment.

A third preferred embodiment (the "50 series") comprises an IEC bottom connect meter in which 100 amps at 200 volts 50 Hz pass through the meter to the customer and full complex plane (amplitude and angle) calibration of internal 10, 100, or 200 amp current elements to achieve high levels of calibration.

A fourth preferred embodiment (the "MC series") comprises a 24 channel meter that can be configured to 24 single phase loads, 12 apartment style loads, or 8 three phase commercial loads and provides economical per point cost.

The Transmeter MC series schematic diagram is of the PCB type TMX-5 and can be found in FIGS. 12A–C, 13, 14, and 15A. Note that the Low-level Transponder and the Transponder 5 also have PCB type TMX-5. Component placement determines whether the board is an MC series, Low-level Transponder, or Transponder 5. The circuits in FIGS. 12A–C, 13, 14, and 15A are discussed below.

Low-level Transponder: (1) receives instructions from Transponder to read a meter within its communication scope—typically one distribution transformer; and (2) can also be a meter to act as a check against loss due to theft. The Low-level Transponder schematic diagram is of PCB type TMX-5 and can be found in FIGS. 12A–C, 13, 14, and 15A.

Transponder: (1) reads Transmeters directly or via Low-level Transponders; and (2) communicates with fiber, phone or TCP/IP LAN. The Transponder schematic diagram is of PCB type TMX-5 and can be found in FIGS. 12A–C, 13, 14, and 15A.

TMX-5

The following are circuits in FIGS. 12A–C, 13, 14, and 15A.

H8 (see FIG. 12A) is a switch or adapter that selects between 120/220 VAC power supply voltage. Each phase is independently rectified and the rectified voltages are tied together. This requires only one of the power phases to be active for the system to receive power.

The transponder preferably has the ability to communicate on three power phases. There are three sets of PLC transmit and receive circuits (see FIG. 12A). A slave microprocessor U9 (see FIG. 15A, lower left) controls the transmit circuits by controlling the following: the PLC phase gating IC U11 (see FIG. 12A), level inverter IC U13 (see FIG. 12A), and analog inputs U14 (see FIG. 12A). J3 is the connector for serial communication to an external contact closure counter. Its power supply is current limited. The algorithms contained in the slave microprocessor are described by the HEX formatted file, PLCGATE.HEX in the attached Appendix.

There are 24 meter inputs (I0/N0 through I23/N23, shown in FIG. 13), each connecting to its own current-to-voltage resistor network. Metering is gated three phases at a time by analog multiplexers U2–U8 (see FIG. 13) into the ASIC by means of a slave microprocessor U8 (see FIG. 15A). Its master, the 68000, communicates with the slave to synchronize phase and timing. The algorithms contained in the slave microprocessor are described by the HEX formatted file, PHZGATE.HEX, in the attached Appendix.

SW1, SW2, and SW3 (see FIG. 13) are user access control switches.

H2 and H3 (see FIG. 14) are headers that connect to the current transformers CT1–CT24 (see FIG. 14) to current inputs.

MV-1, MV-2, and MV-3 (see FIG. 15A) are measurement voltage levels that enter a different resistor network and divide the voltage to a level that is readable by the ASIC.

H4, J1, and J2 (see FIG. 15A) are expansion headers that allow reading of more current channels.

H5 (see FIG. 15A) is a header connection to the display board.

J3 (see FIG. 15A) is a header that optionally connects with external pulse counters. The circuit involving Q8 provides a current-limited +5 V supply.

Q7 and LED1 (see FIG. 15A) are an optical receiver and transmitter, respectively.

"Big Helper" Automated Reading and Billing Software

This software runs on the Billing Computer and preferably comprises the following functionality:

(1) Read all Transponders to obtain required metering data from all Transmeters.

(2) Compare metering data with specified limits or historical data to identify suspicious readings or equipment failures at the earliest possible time.

(3) Compare Low-level Transponder energy readings with those of the corresponding Transmeters® to identify theft.

(4) Automatically select the best route to each Transponder, whether it be fiber, telephone, RS-485 or via the Internet to a satellite billing center running the Big Helper Software. This allows one billing center to use the Internet to connect to other centers in distant places without the use of long distance telephone service (5) Store data to an MV-90, Oracle® (or other equivalent) database for generation of bills.

(6) Seamlessly interconnect over the Internet to form a WAN of billing computers, each associated with a different set of Transponders.

Alternate Embodiments

Gas and Water Meter Interfaces

In the 20 series embodiment (see FIG. 11C), the gas and water meter interfaces continue to accumulate contact closures in the absence of electric power applied to the electricity meter. This is important for an electric company that wishes to sell meter reading services to water and gas utilities, yet guarantee data integrity even when electric power is out for an extended period of time.

A contact-closure counting microprocessor is powered by a diode OR of the +5 V supply and on-board battery, enabling contact-closure counting in the absence of power. The pulse microprocessor accumulates counts in its internal registers and sends the data to the main processor via serial transfer. To sense the state of the contact closure, the microprocessor energizes the primary of a pulse transformer. The contact closure points are in series with the secondary of the pulse transformer. If the contact is closed, the diode in an optical isolator is forward biased. This energizes its photo detector, which is a sample-and-hold capacitor. The microprocessor reads the level on the capacitor as low. If the contact is not closed, the optical isolator is idle. The capacitor recharges and is read high. The algorithms contained in the pulse microprocessor are described by the HEX formatted file, PULSE.HEX, in the attached Appendix.

Opto Adaptor

The Opto Adaptor (Optical Adaptor) converts RS232 into an optical signal that can be read by each meter. This board enables any meter to communicate with any computer through its serial port. An Opto Adaptor schematic diagram can be found in FIG. 16. U1 converts RS232 to TTL levels. Q1 and Q2 are gain transistors to drive the optical transmit LED1. Q5 is the optical receiver. Q3 provides gain and Q4 inhibits the receiver.

Modem Board

Figures 1, 17A:
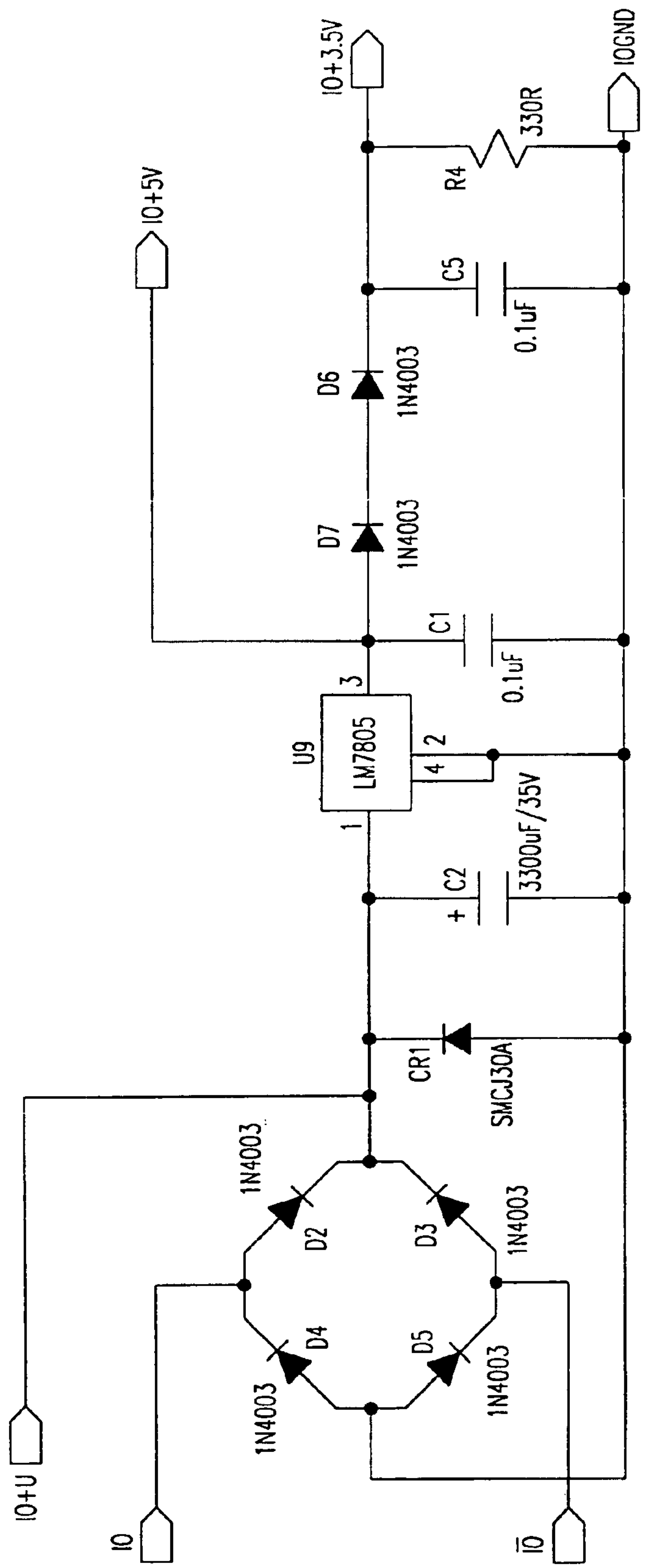
FIGS. 17A–B is a Modem Board schematic diagram.
Figures 2, 17A:
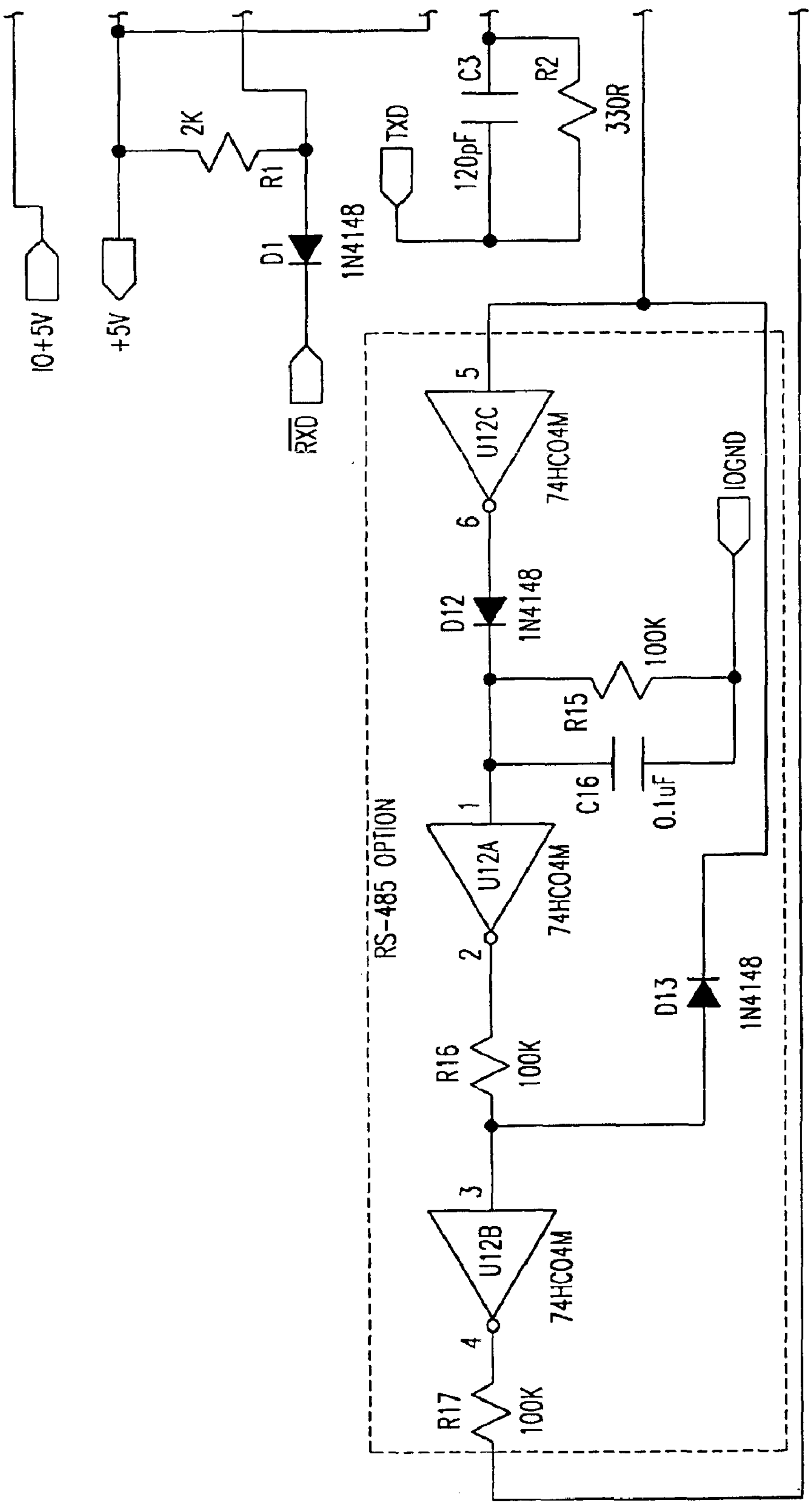
Figures 3, 17A:
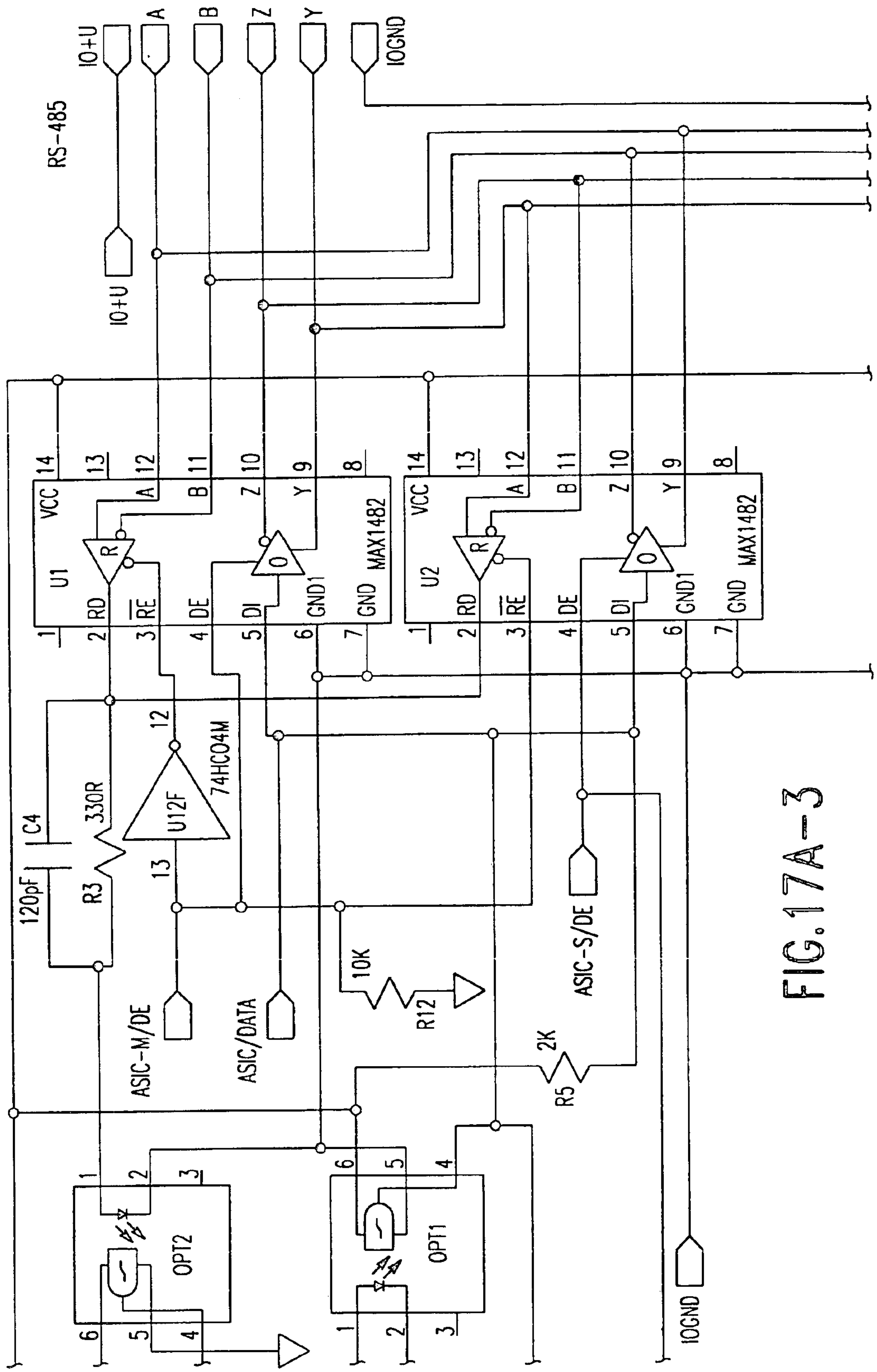
Figures 4, 17A:
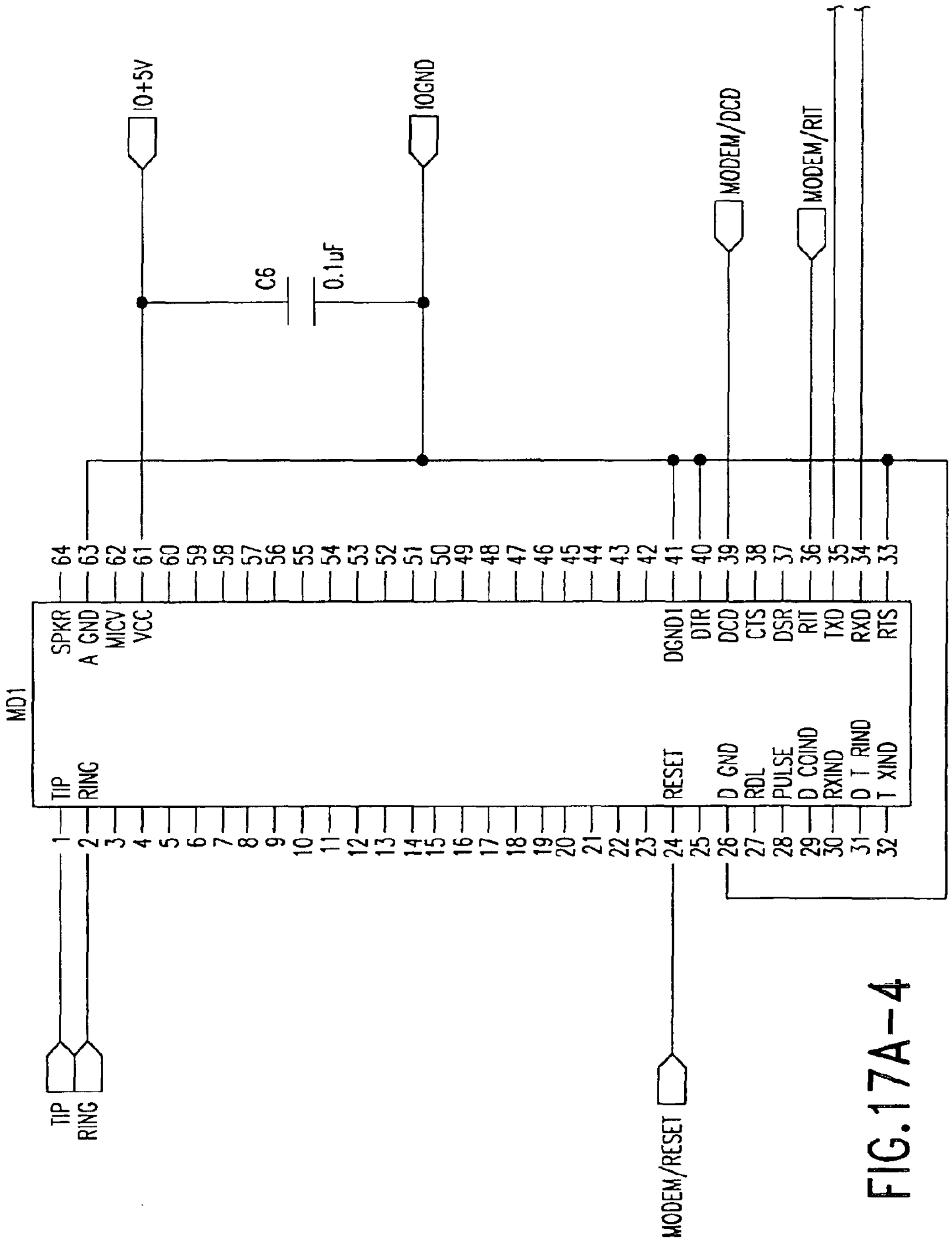
Figures 5, 17A:
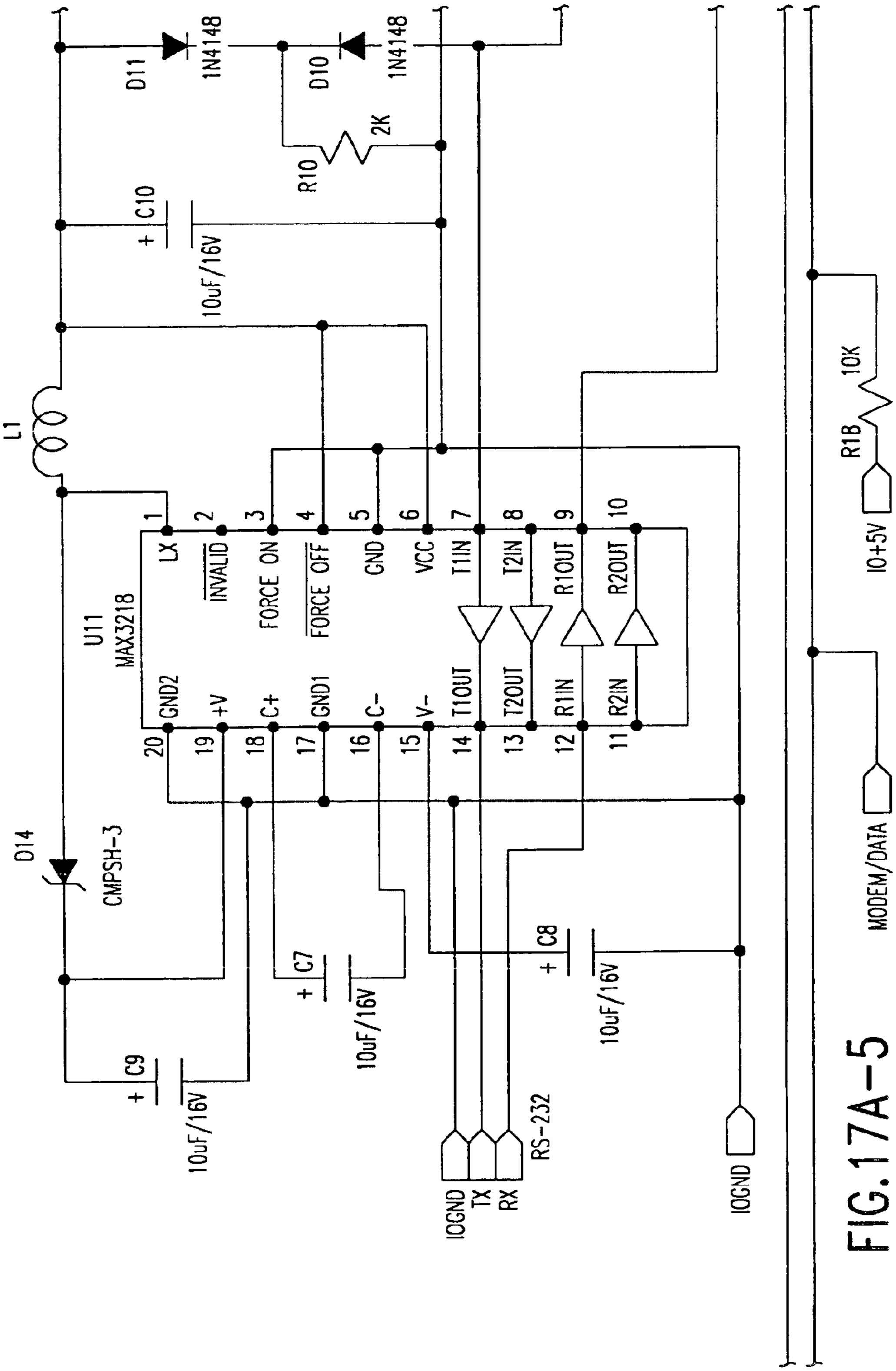
Figures 6, 17A:
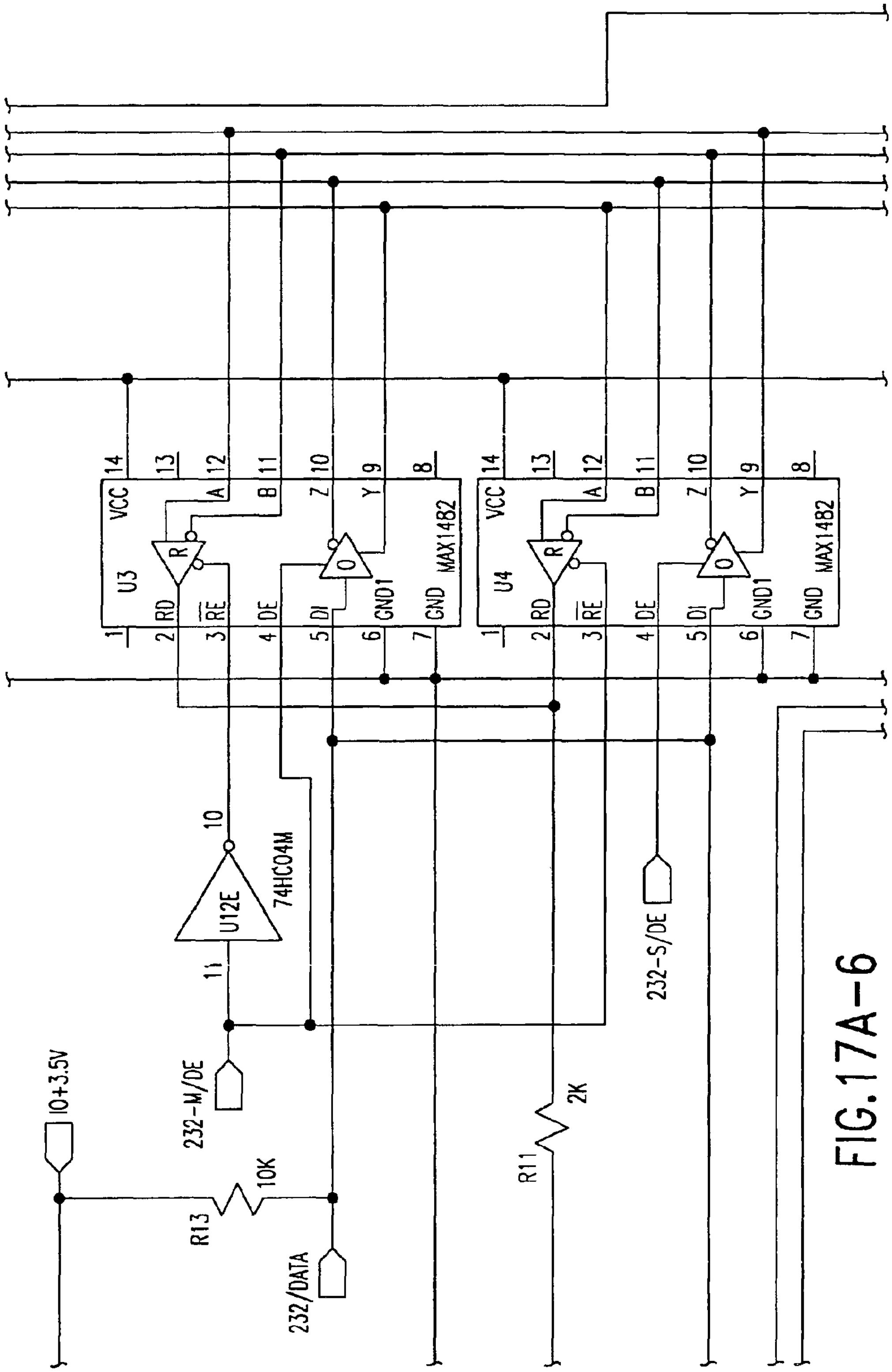
Figures 7, 17A:
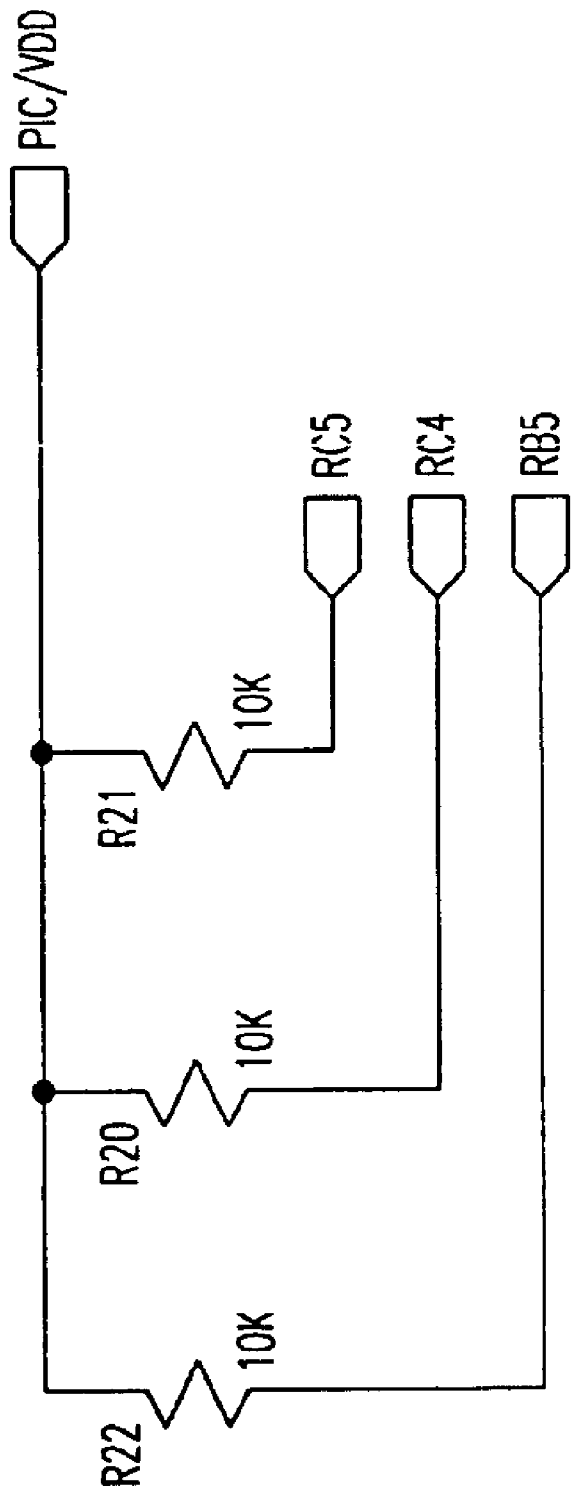
Figures 8, 17A:
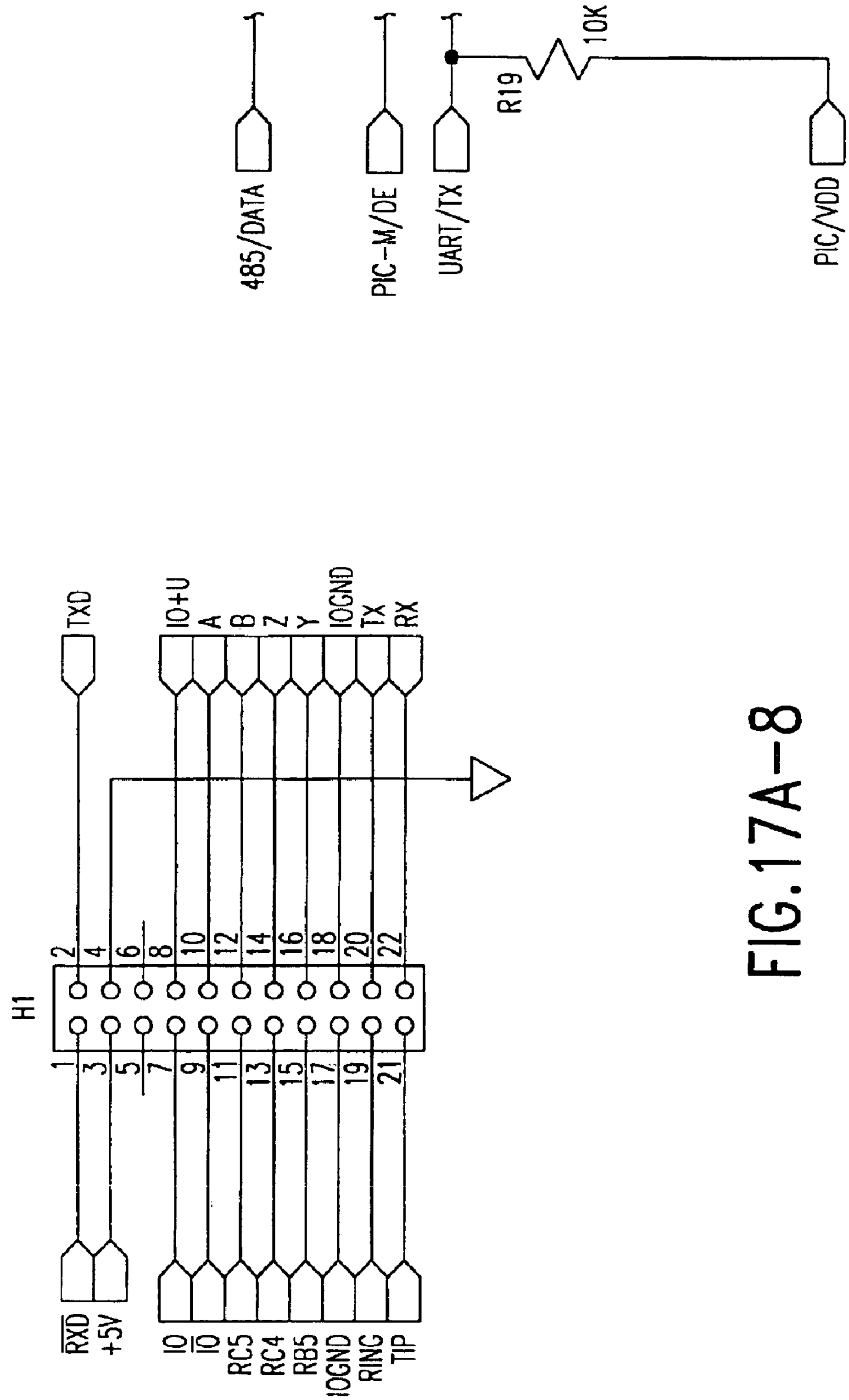
Figures 9, 17A:
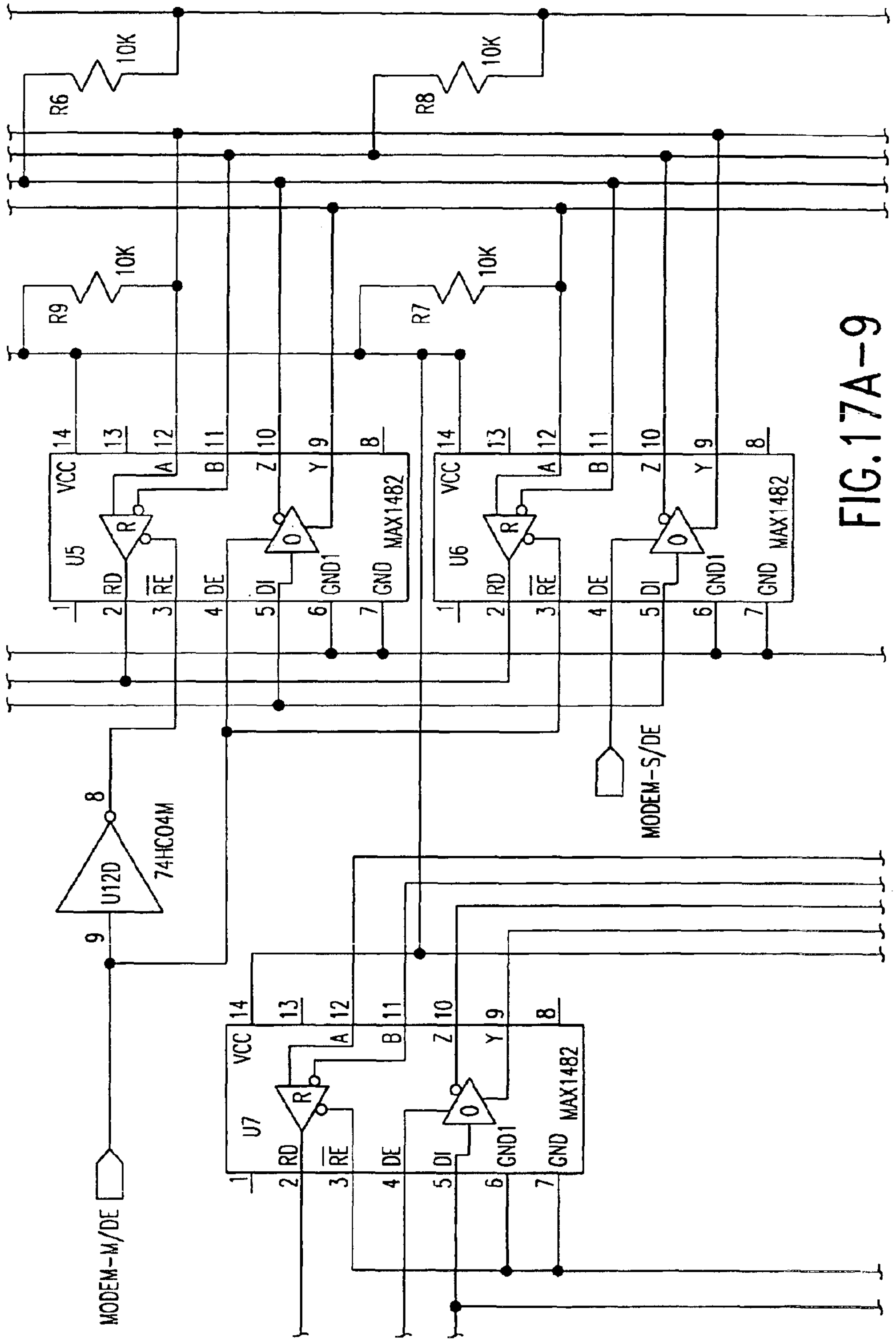
Figures 10, 17A:
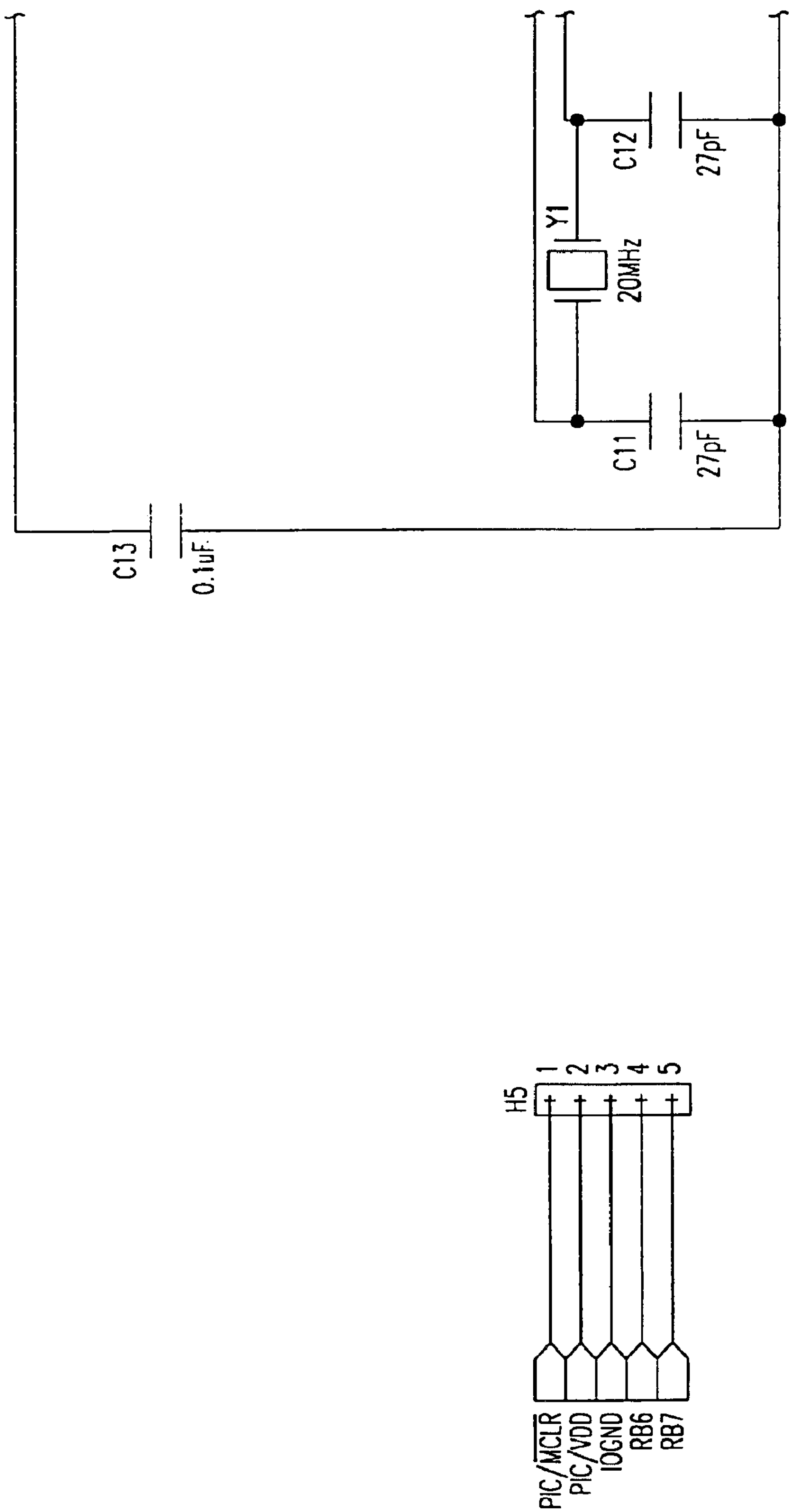
Figures 11, 17A:
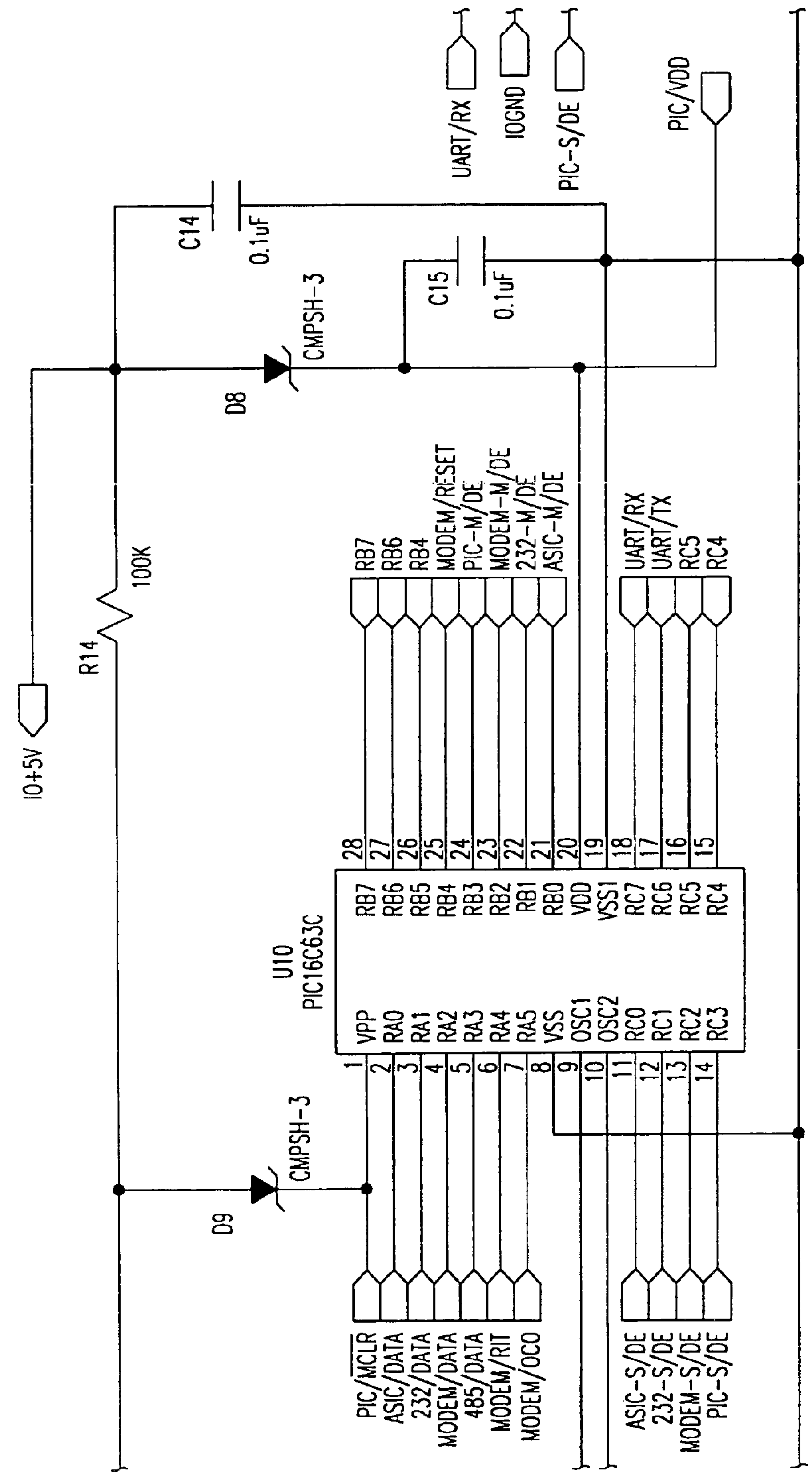
Figures 12, 17A:
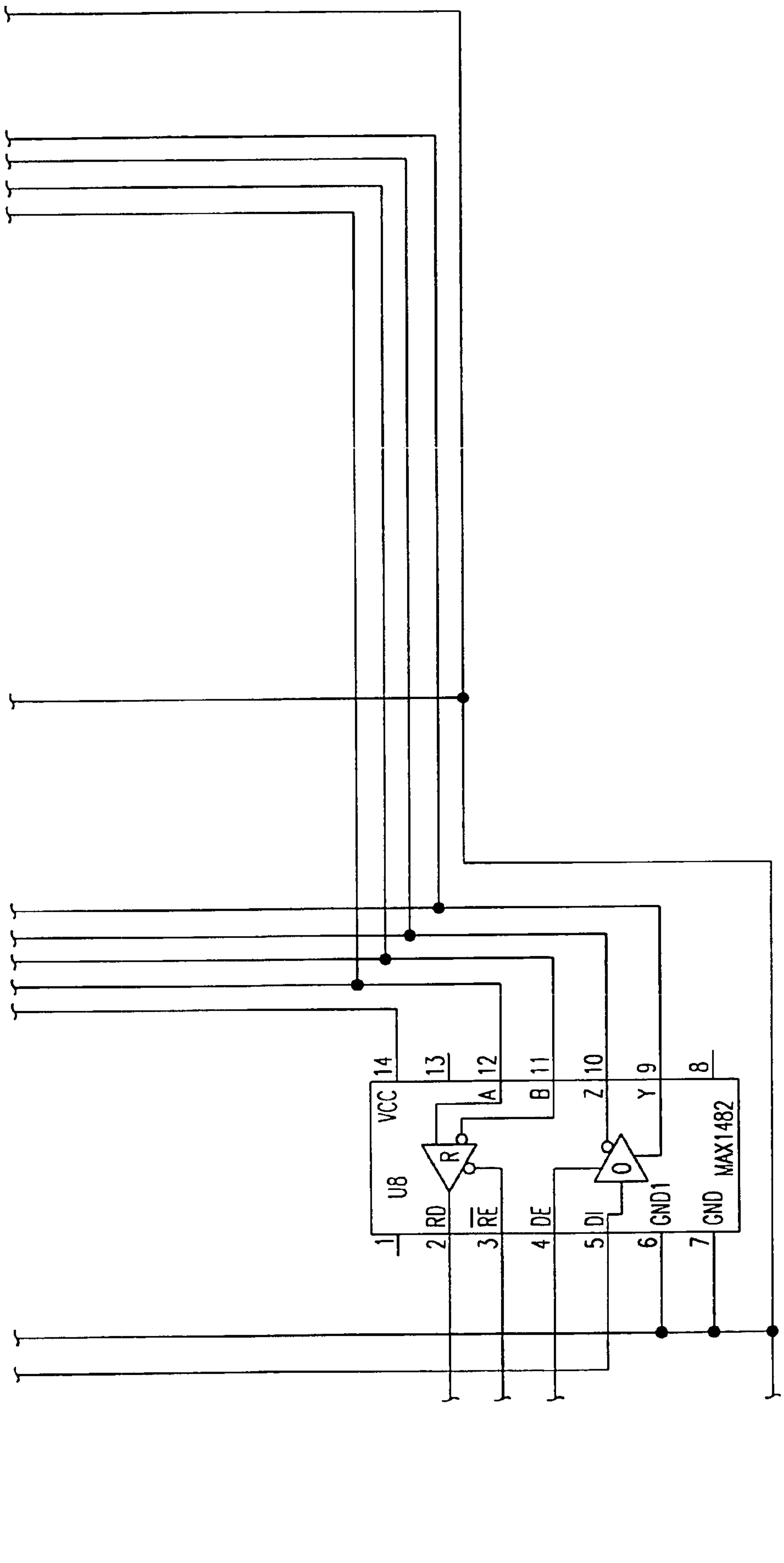
Figure 17B:
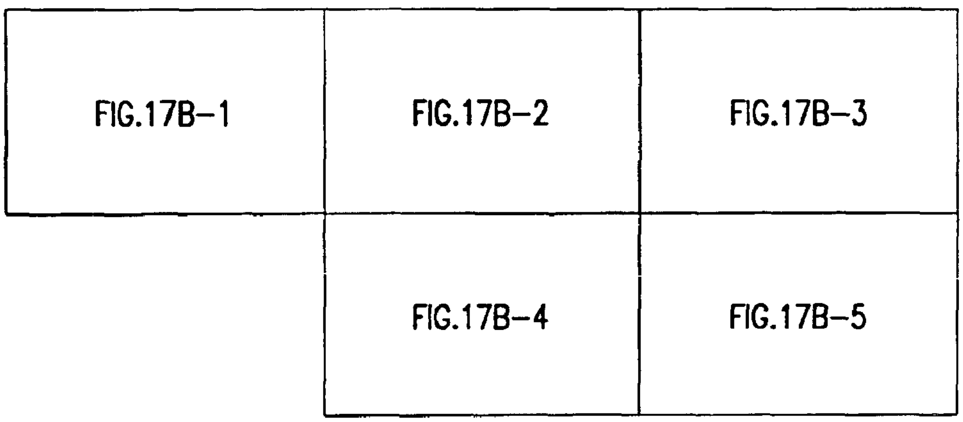
Figures 1, 17B:
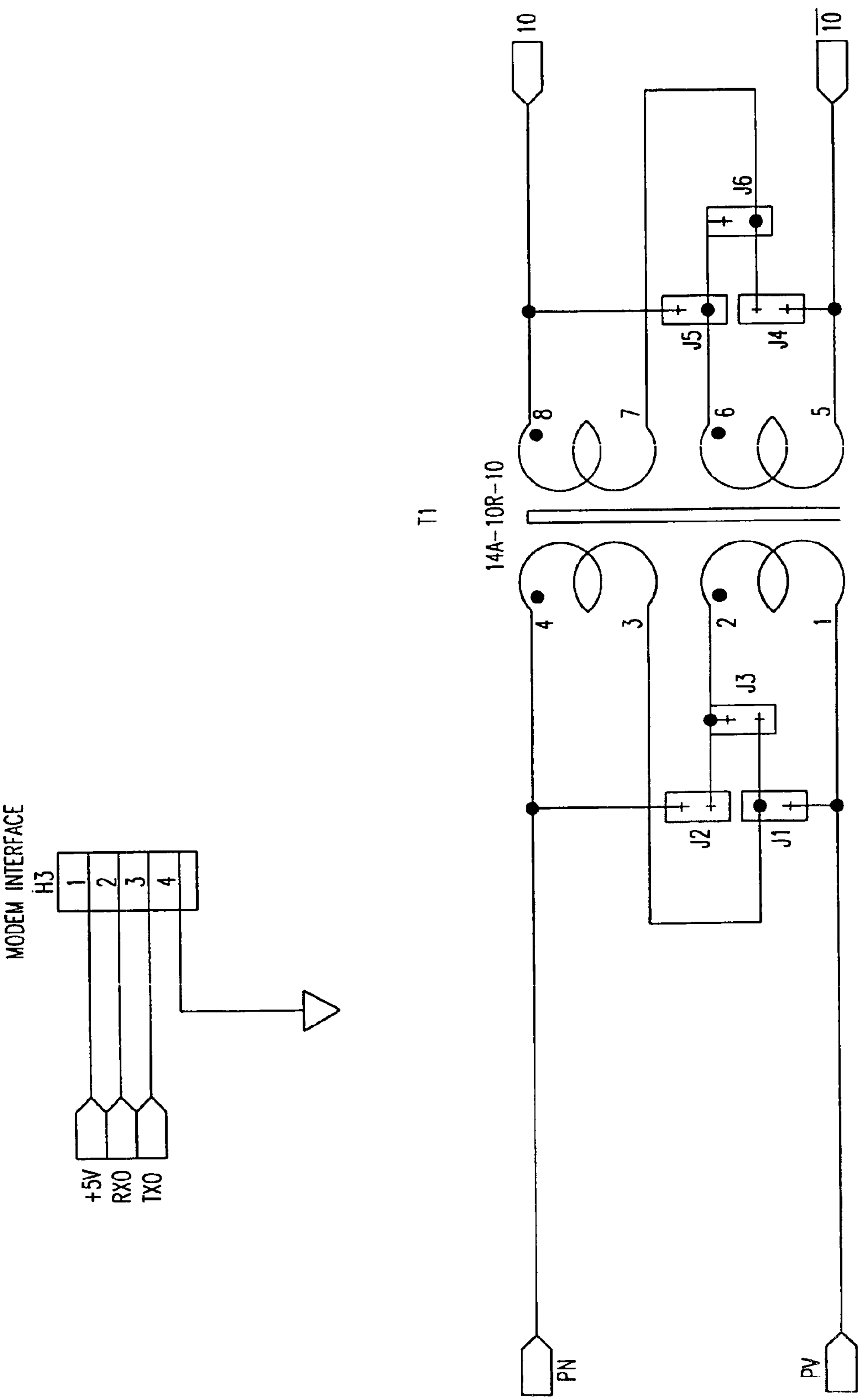
Figures 2, 17B:
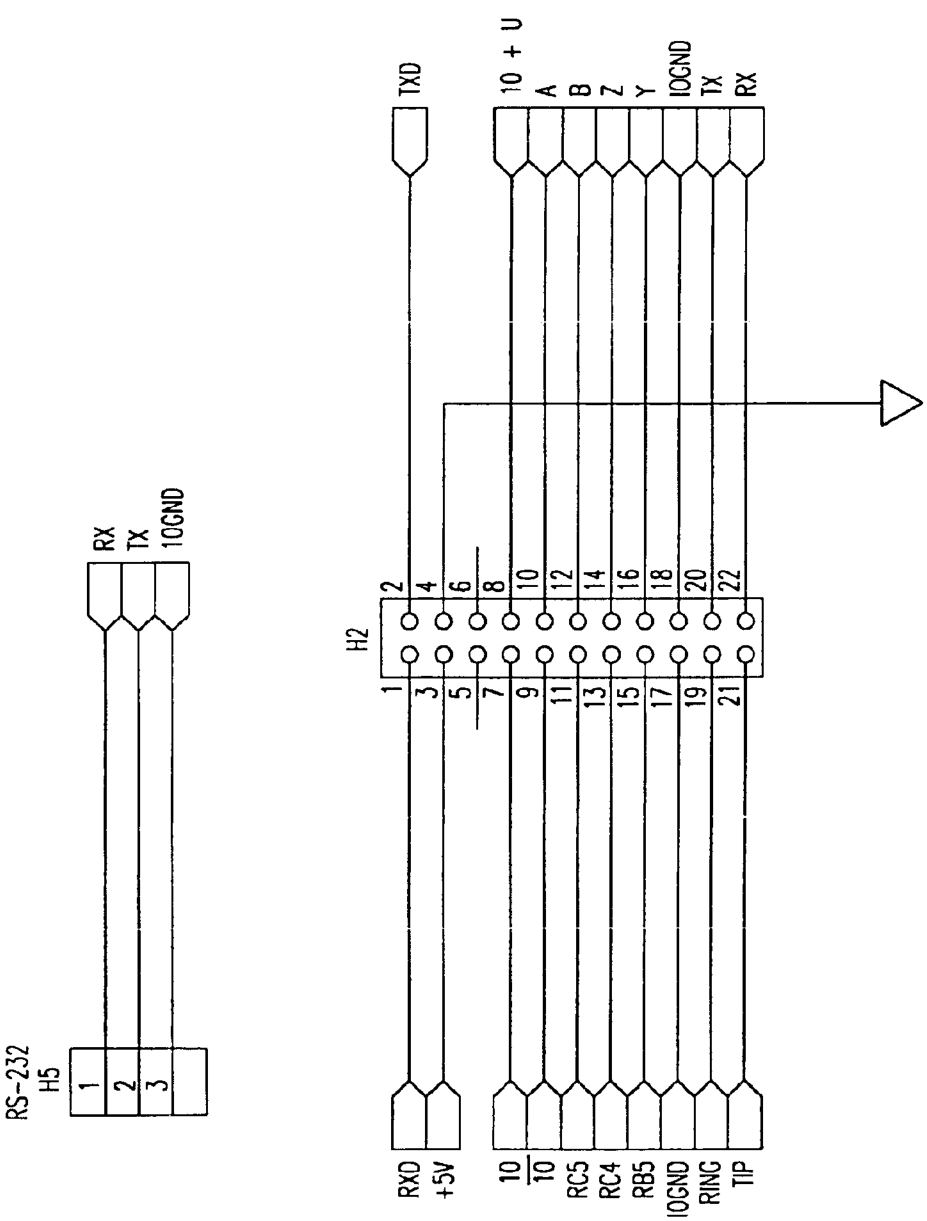
Figures 3, 17B:
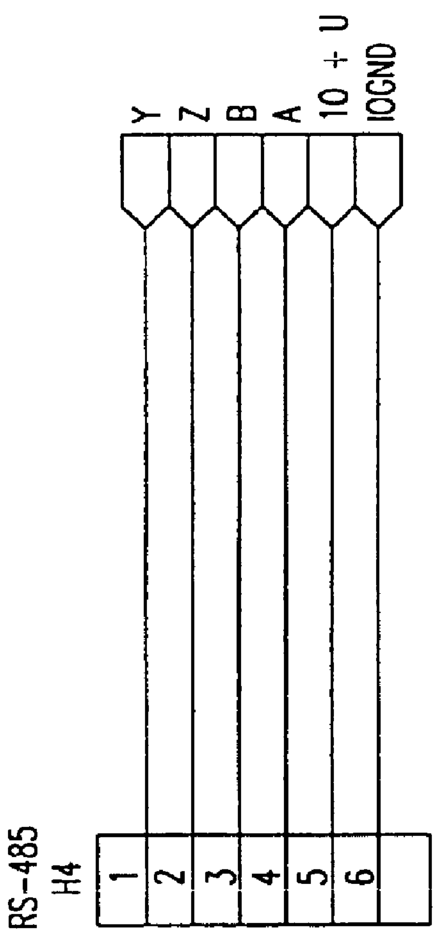
Figures 4, 17B:
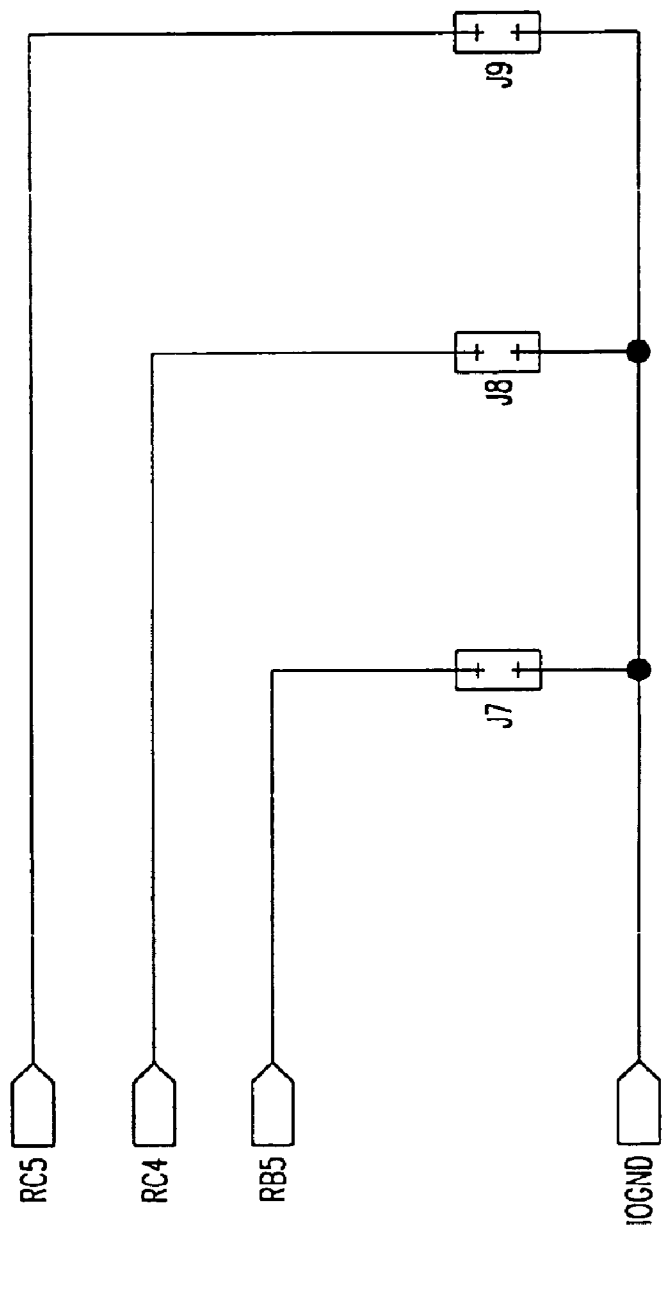
Figures 5, 17B:
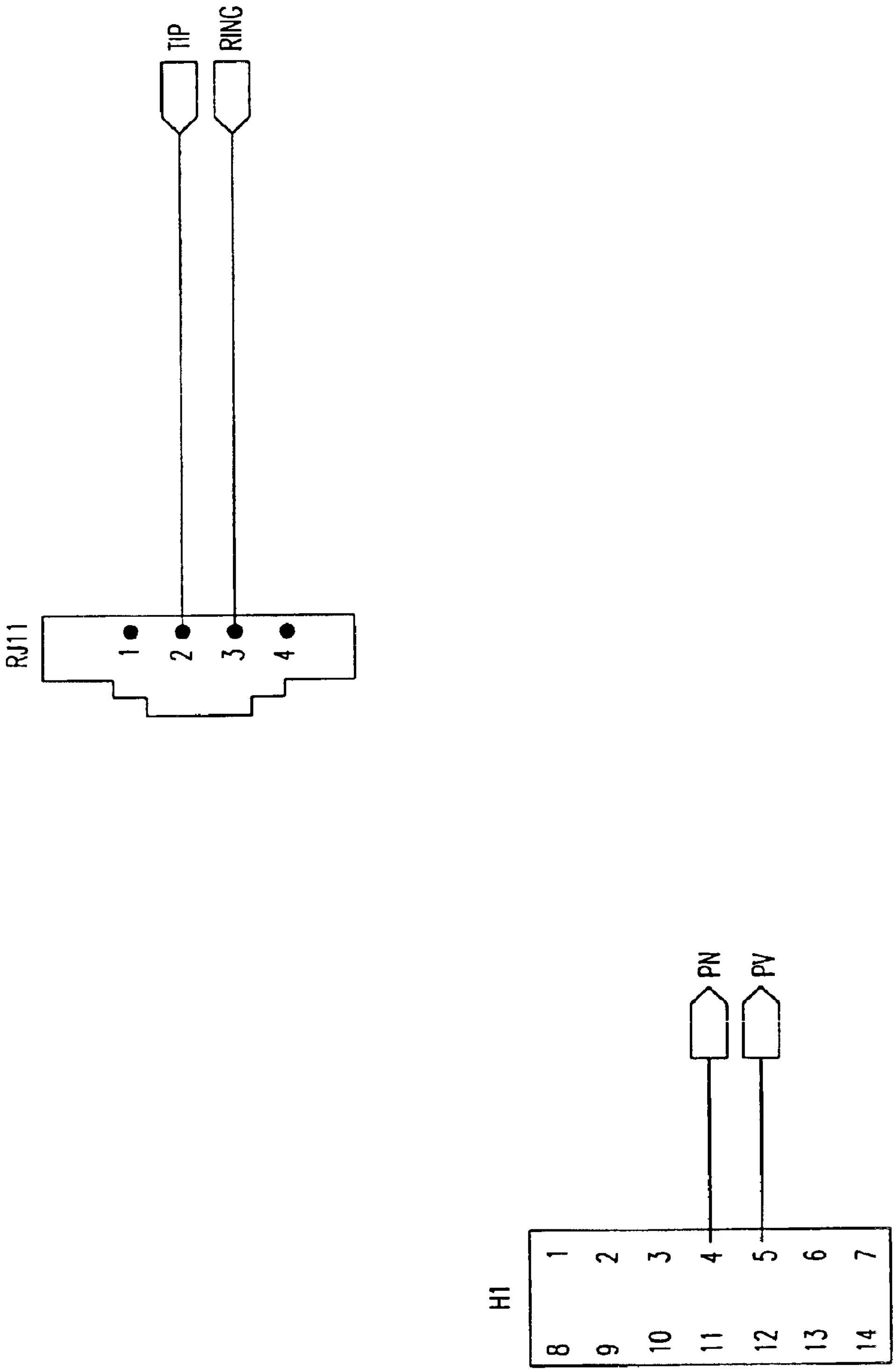

The Modem Board is so named because its on-board modem permits remote dial-in communication to other devices through different communication schemes. The Modem Board schematic diagram can be found in FIGS. 17A–B. Each Modem Board is attached to a Mother Board containing an ASIC. Each Modem Board consists of a modem MDI, external RS232 (via H4), external RS485 (via H1), and an on-board microprocessor U10. The modem, RS232, the Mother Board, microprocessor, and external RS485 all communicate across the R5485 bus by means of TTL/RS485 converters (U1–U8). U11 converts incoming RS232 to TTL levels. U12 rectifies signal levels for RS485 converter controls. The phone line is connected to RJ11. Power into the rectifier and regulator come from H2. H5 is the header that allows factory programming of U10.

To avoid bus conflicts, the on-board microprocessor arbitrates Master control and Slave control over these devices. The algorithms contained in the microprocessor are described by the HEX formatted file, MODEM.HEX, in the attached Appendix. The modem board's Auto Hunt feature seeks and adjusts to one of three appropriate baud rates 9600, 19200, and 38400.

Calibrator

The meter is calibrated automatically by a fully automatic calibrator. The calibrator: (1) can calibrate the meter at 20 points for both amplitude and phase; (2) calibrates each phase of the meter independently; (3) stores calibration constants in the non-volatile flash memory of the Transmeter, and (4) archives calibration records to the manufacturing database. The calibrator is described more fully below.

The ASIC

Meter Component

The ASIC of a preferred embodiment has an advanced electric meter with the following features:

(1) Automatic Autoranging Current and Voltage Amplifiers. The ASIC amplifiers sense the level of current and adjust to the level automatically in hardware. The ASIC voltage amplifiers are controlled by the external microprocessor.

(2) Automatic sample and hold timing logic. Allows for calibration of angle errors.

(3) Late voltage sampling logic and line frequency meter. Allows for generation of precise 90° phase shifted waveform for calculation of reactive power and energy.

(4) Offset DAC—allows for automatic firmware controlled amplifier offset correction.

(5) 12 BIT DAC with calibration points. A 12 BIT DAC with only 8 bits of accuracy is calibrated with digitally selected current sources to achieve 12-bit resolution and monotonicity.

(6) Auxiliary inputs to read battery voltage, power supply voltage, signal voltage from powerline modem and external analog quantities.

(7) Use of one of the analog inputs to compensate the temperature curve of the ADC to achieve better accuracy. Reads a fraction of the reference voltage generated with a voltage divider to maintain a constant scale factor over temperature.

(8) A digital potentiometer with 64 tap points used to digitally calibrate the voltage reference to within 0.1% from an initial accuracy of 5%.

(9) Read the voltage on a common silicon diode to obtain an analog of temperature. Storing N pairs of calibration position from (8) above and temperature diode voltages can fit a curve of degree N−1 to the temperature variation, precisely controlling the temperature variation of the reference voltage. The diode is also used to correct the temperature variation of the real time clock crystal.

Powerline Modem Component

The ASIC of a preferred embodiment has a powerline modem with the following features:

(1) An adjustable gain, adjustable frequency analog bandpass filter with minimal external components.

(2) A circuit to allow continuous calibration of the gain and center frequency of the bandpass filter under microprocessor control.

(3) A bandpass delta-sigma modulator to convert the analog data to a digital stream.

(4) A digitally implemented demodulator unit capable of adjusting gains and demodulating either fsk or bpsk data (5) A digitally implemented fsk and psk modulator.

(6) A digitally and software implemented data clock that uses the line frequency or a multiple thereof as a common synchronous data clock throughout the system network.

Digital Control and Memory

The ASIC of a preferred embodiment contains many circuits that control the external devices on the Display Board: (1) a Motorola 68000 bus generator, (2) memory control logic; (3) a real-time clock (RTC); (4) a watchdog timer; (5) 4 kBytes of CMOS battery backed RAM; (6) digital I/O; (7) tamper switch detection that continues to operate on battery, and (8) a bootstrap ROM for loading a secondary bootstrap program to internal RAM.

Firmware

Firmware controls many of the above-mentioned features of metering with advanced calibration algorithms, powerline communication protocols, liquid crystal displays, serial data interface. See 28130104.S in the attached Appendix.

The firmware provides an Advanced Data Integrity Method by providing a flash memory audit trail for added protection against data loss.

The firmware also provides a Data Log of Energy and Event Information, since the audit trail of energy information is commercially valuable under deregulation to ESCOs, utilities and end-users.

The firmware works with the Calibrator and (optionally) a Toaster (a test apparatus) to calibrate:

(1) The ADC. Realize 12 bits from an 8 bit limited CMOS process.

(2) The voltage reference. Obtain 0.1% accuracy from a 5% device.

(3) The internal current transformers (both amplitude and phase—a complex plane calibration), at 20 separate logarithmically-spaced points throughout the load curve.

(5) All components in the metering circuit, (6) The time clock's 32768 Hz crystal.

The firmware also provides Temperature Compensation Methods, since it: (1) uses a temperature diode to calibrate the voltage reference and time clock over temperature; and (2) uses a resistor divider on the voltage reference to calibrate the ADC over temperature.

The firmware also provides Self Calibration Methods, since it: (1) calibrates the bandpass filters periodically, and (2) adjusts the offsets in the meter circuits continually.

Also, the firmware provides Advanced Metering Parameters, since it:

(1) Uses a unique sample and control algorithm to provide all metering quantities. This method is fully determined by the program in the 68000, which controls the ASIC.

(2) Measures line frequency and create virtual 90 degree shifted voltage waveform for reactive power.

(3) Uses real, reactive and apparent power to calculate power factor, total harmonic distortion and phase angle.

The firmware can also automatically determine the proper range for: (1) Voltage; (2) Current; (3) Powerline signal; and (4) Demodulator parameters.

A more detailed description of the ASIC, its components, and its functionality are provided below.

Figure 15A:
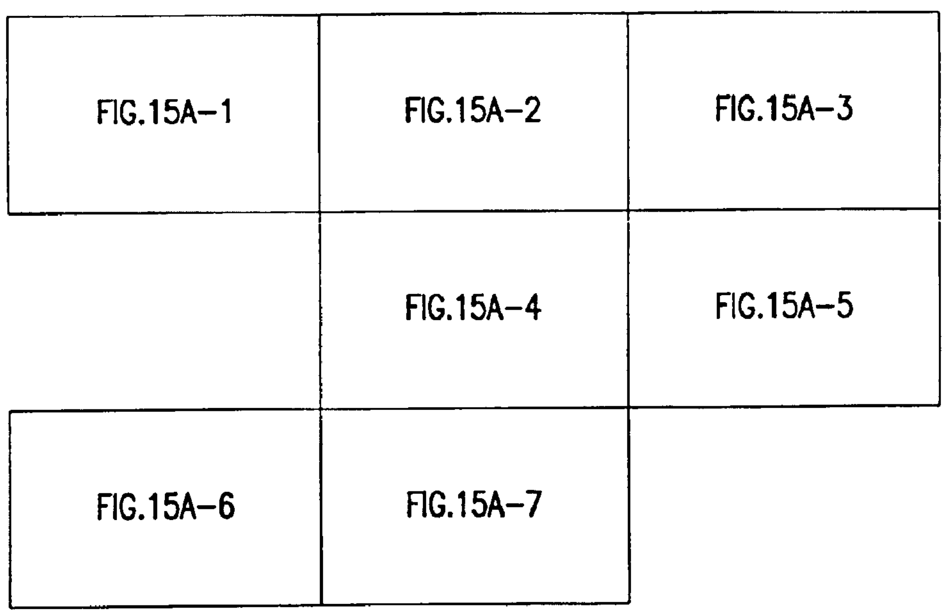
Figures 1, 15A:
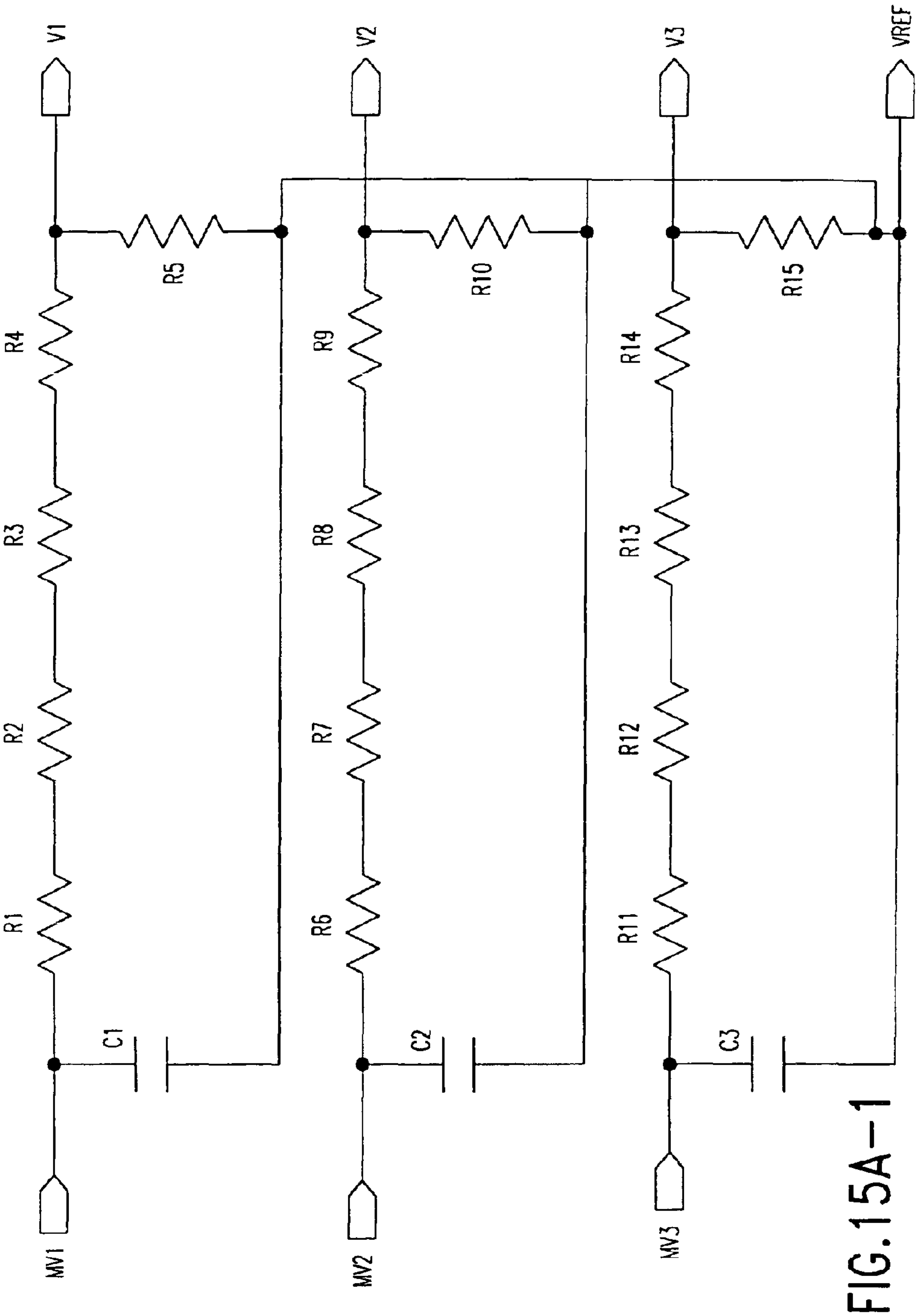
Figures 2, 15A:
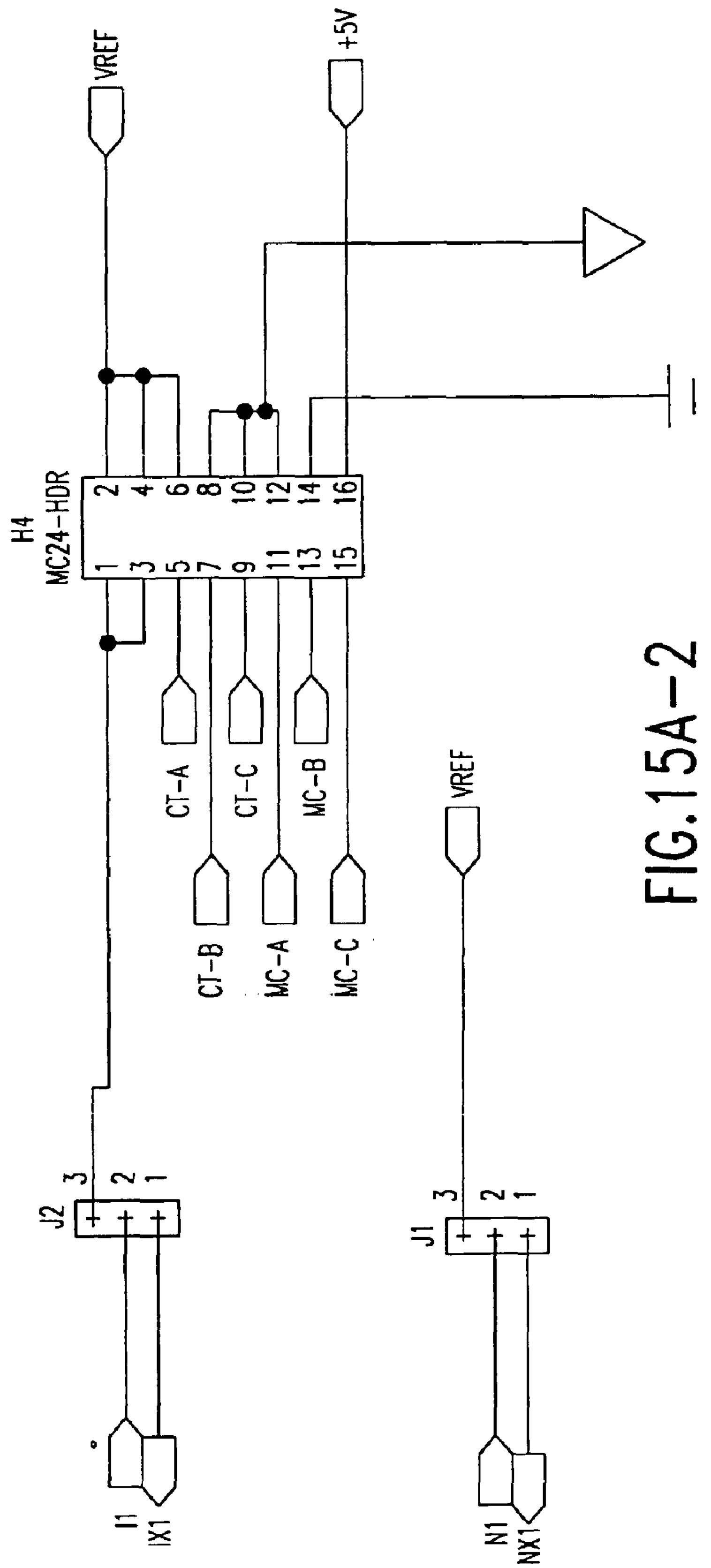
Figures 3, 15A:
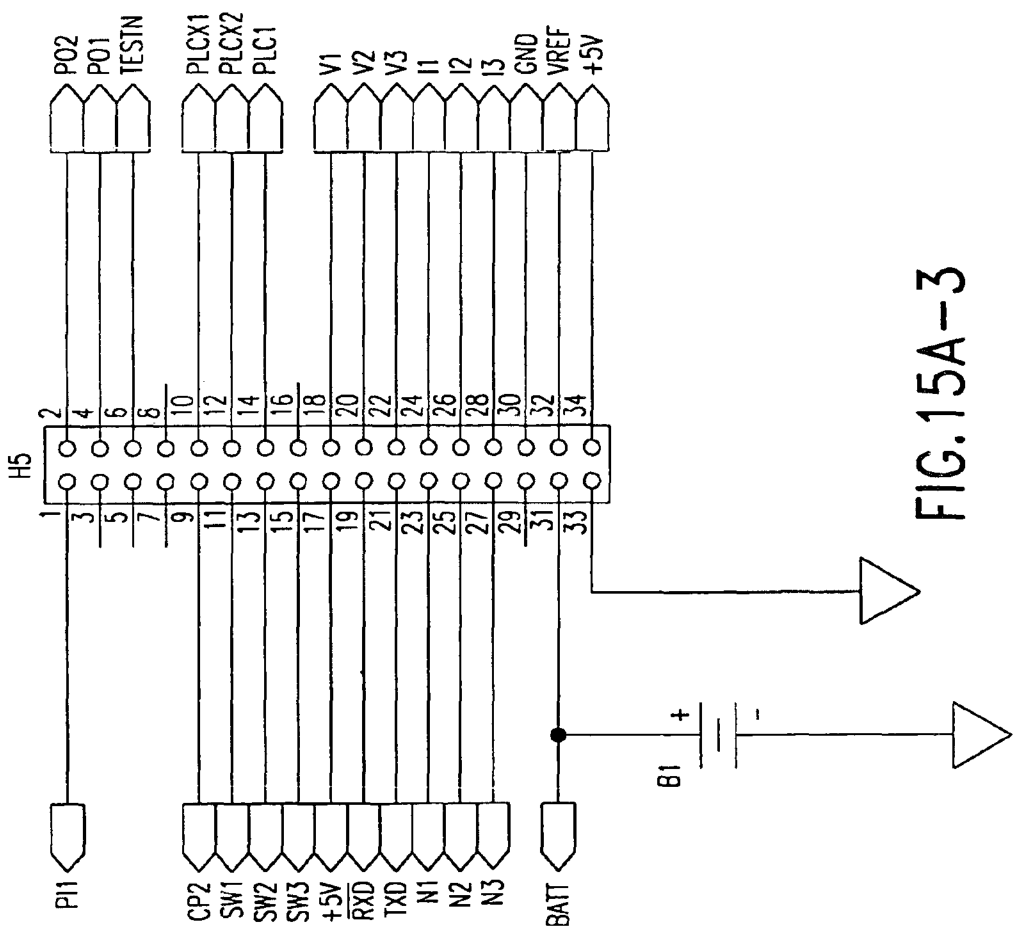
Figures 4, 15A:
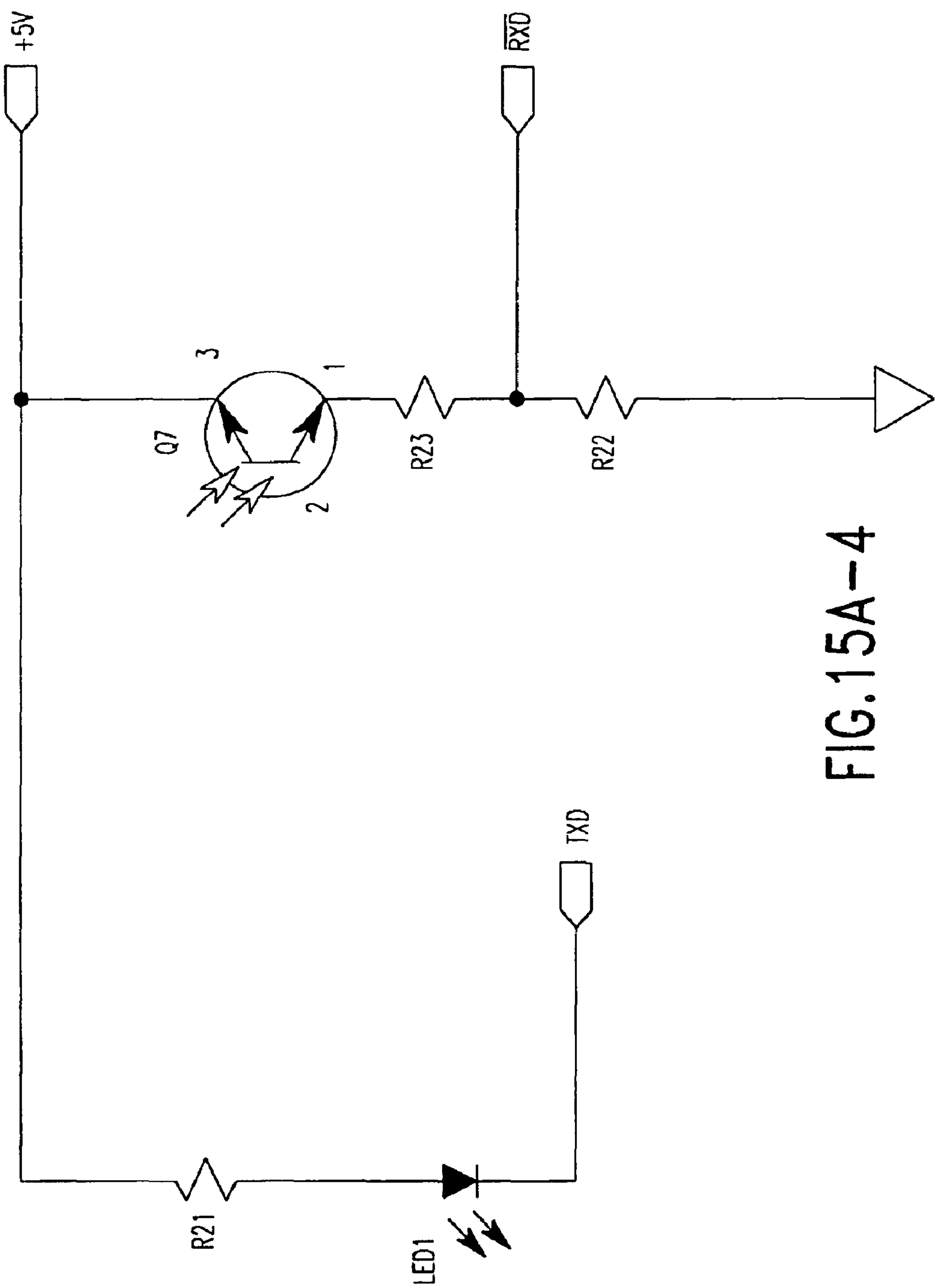
Figures 5, 15A:
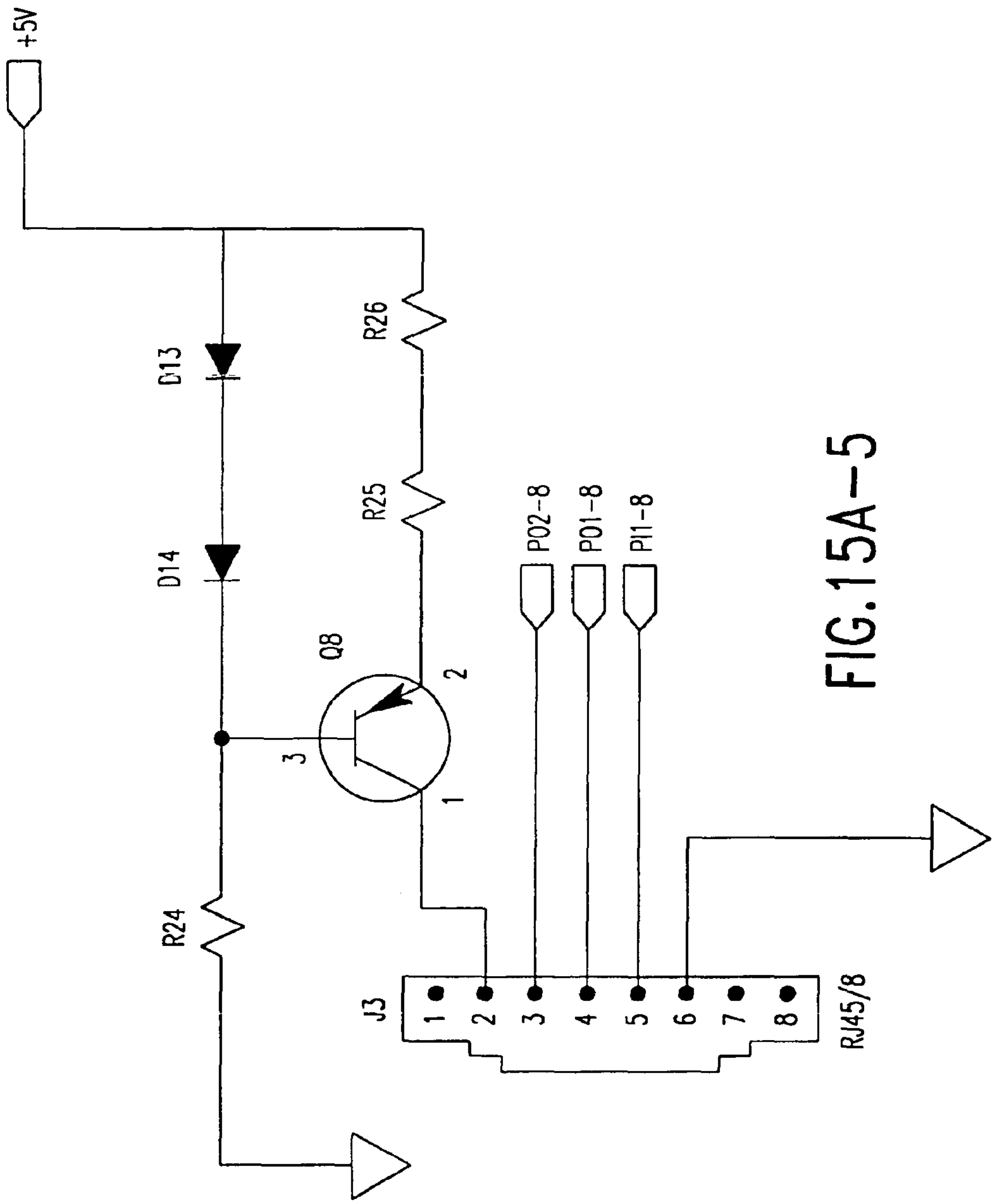
Figures 6, 15A:
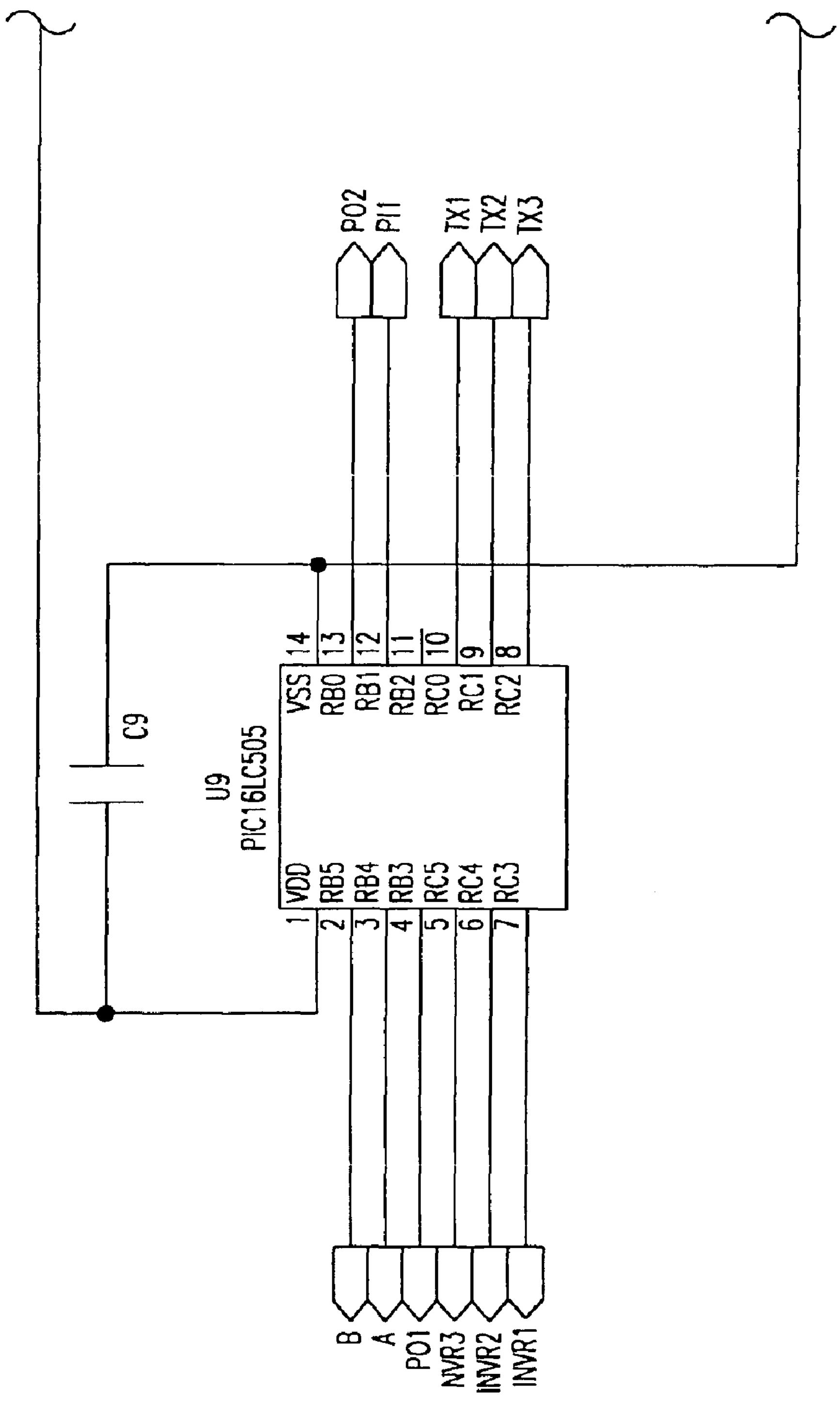
Figures 7, 15A:
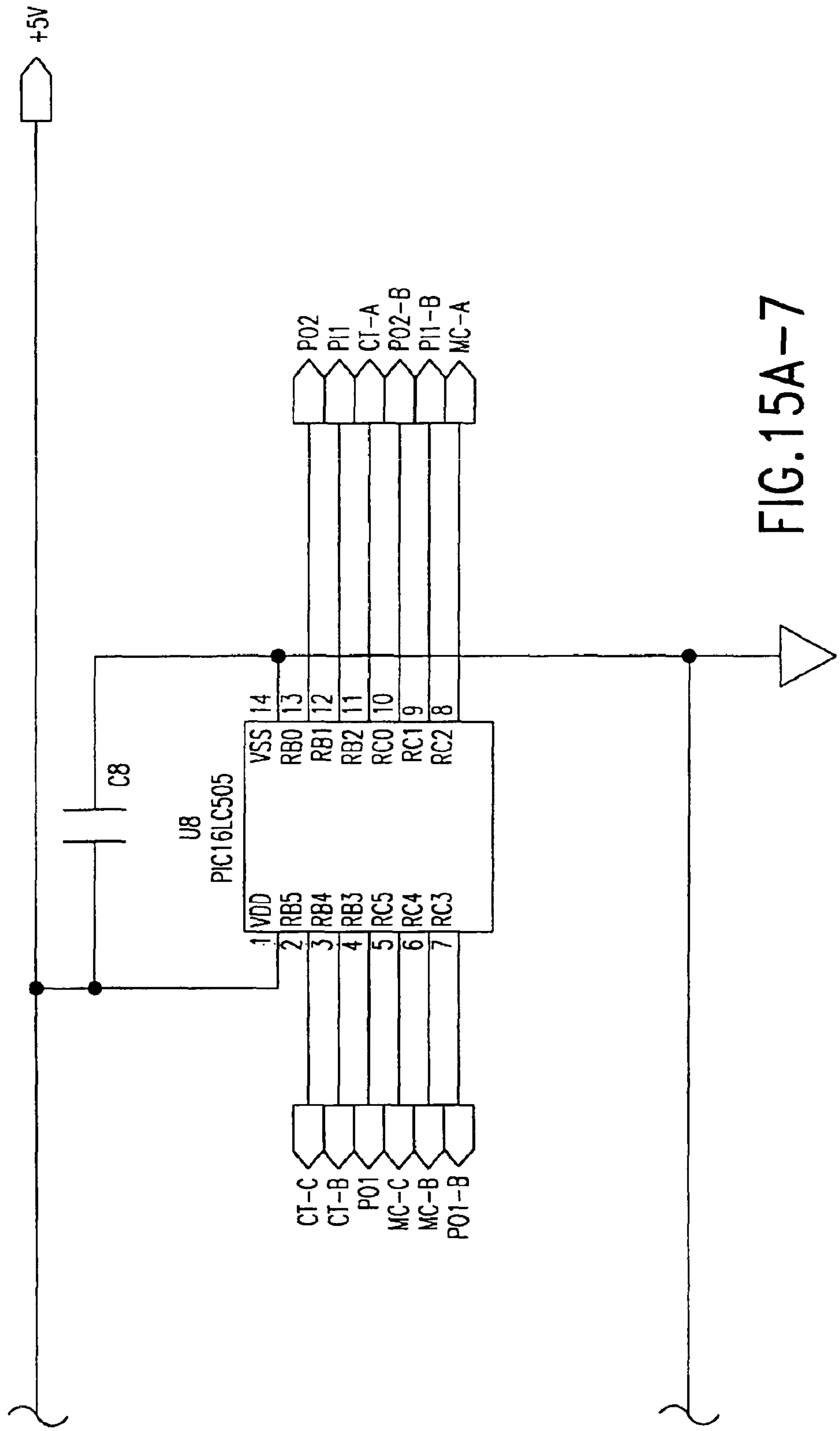
Figures 1, 15B:
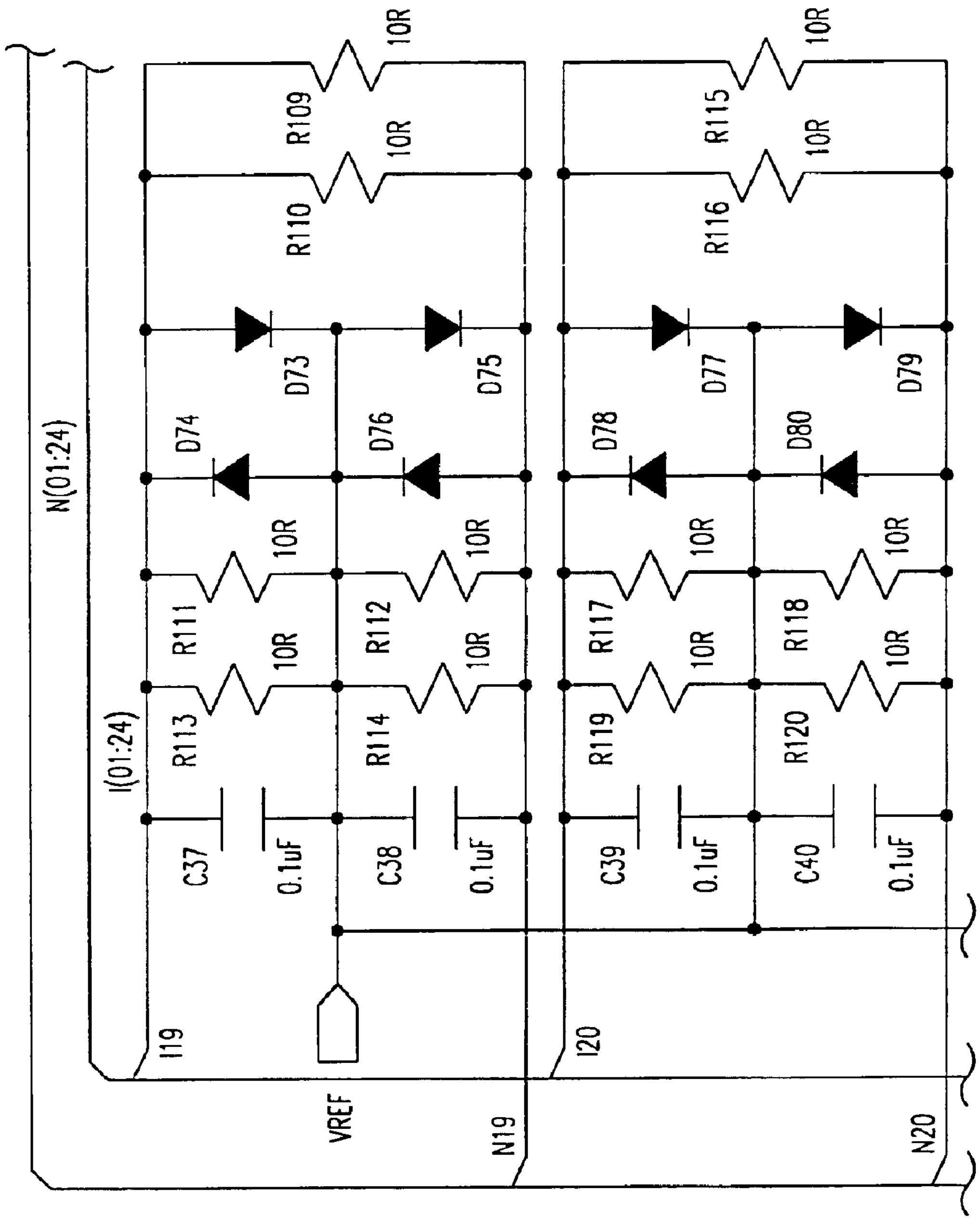
FIGS. 15B–C provide a Mini Closet Interface schematic diagram.
Figures 2, 15B:
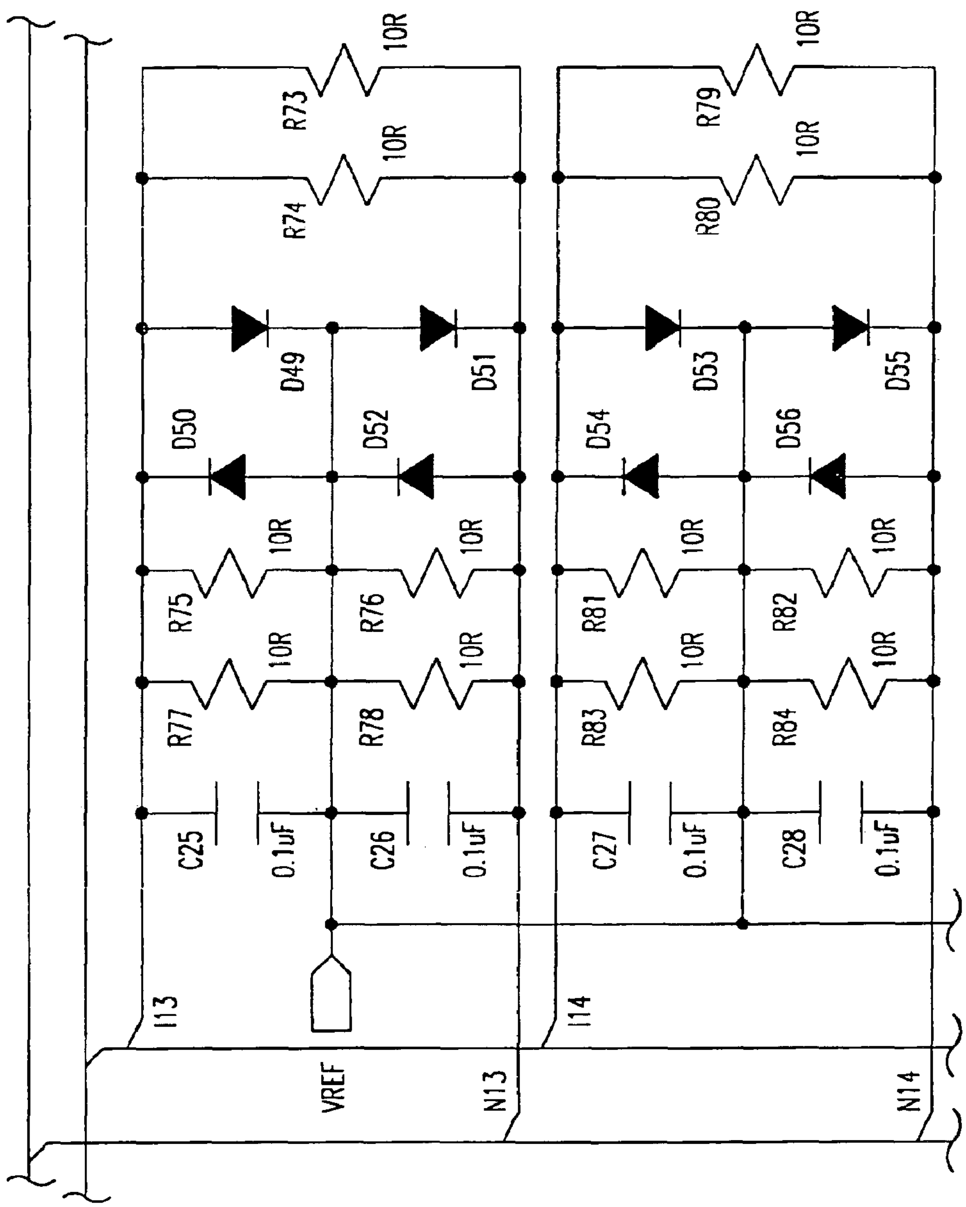
Figures 3, 15B:
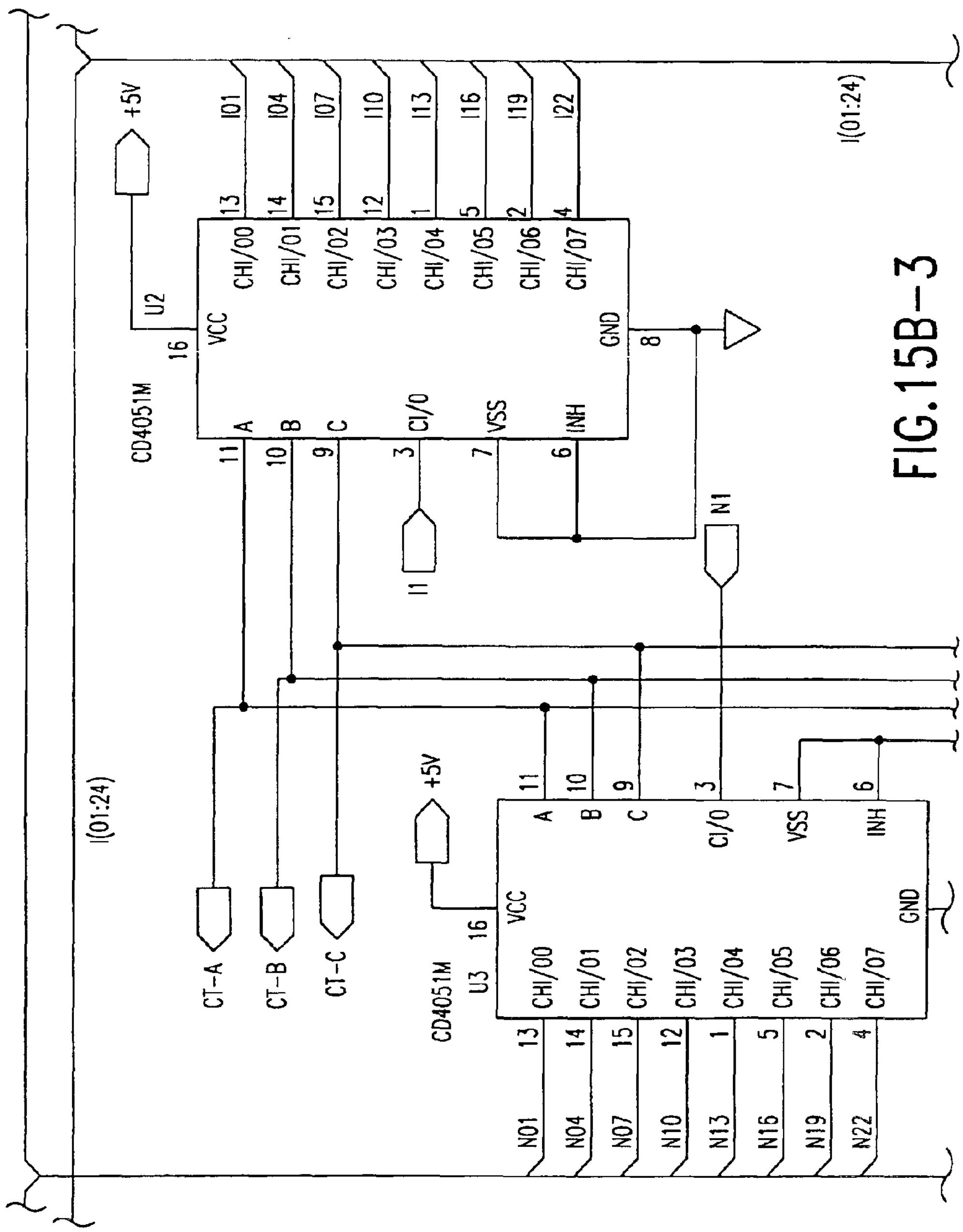
Figures 4, 15B:
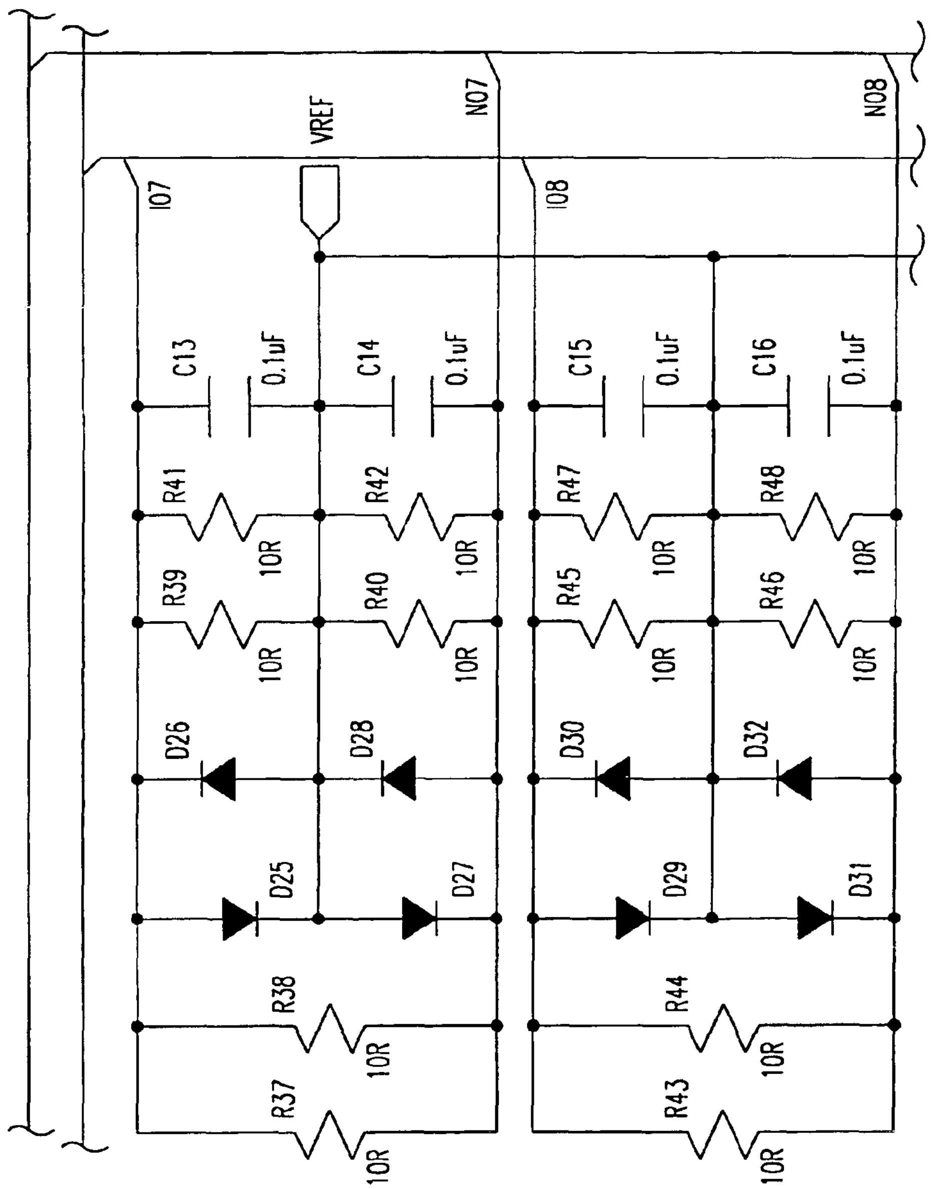
Figures 5, 15B:
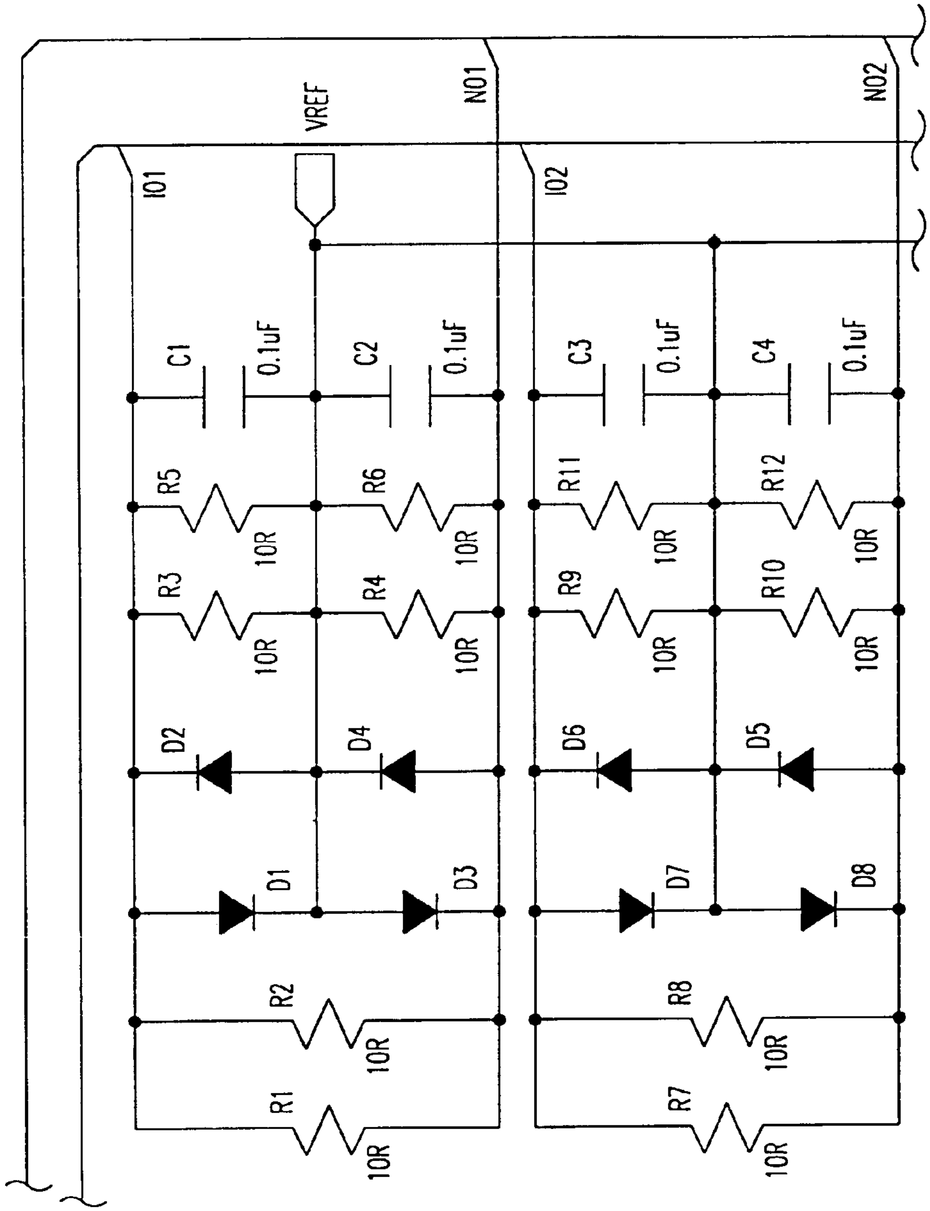
Figures 6, 15B:
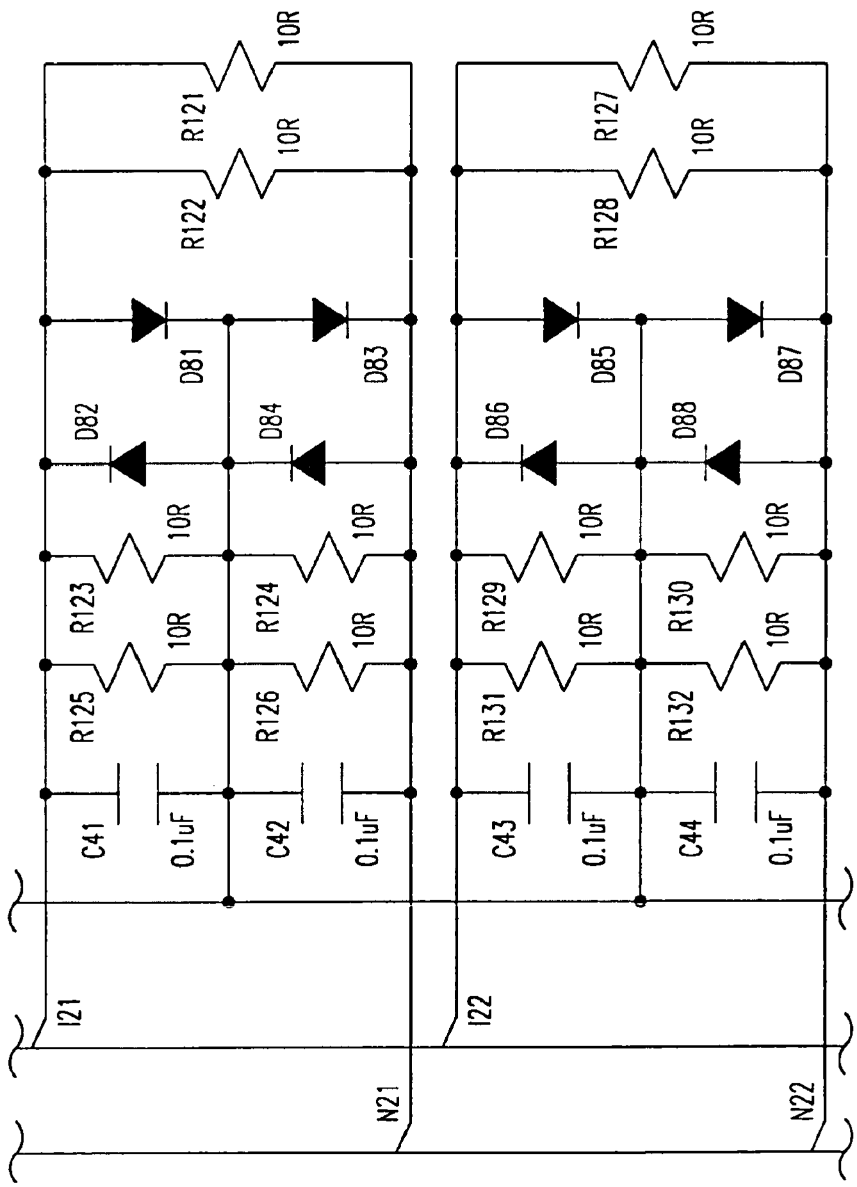
Figures 7, 15B:
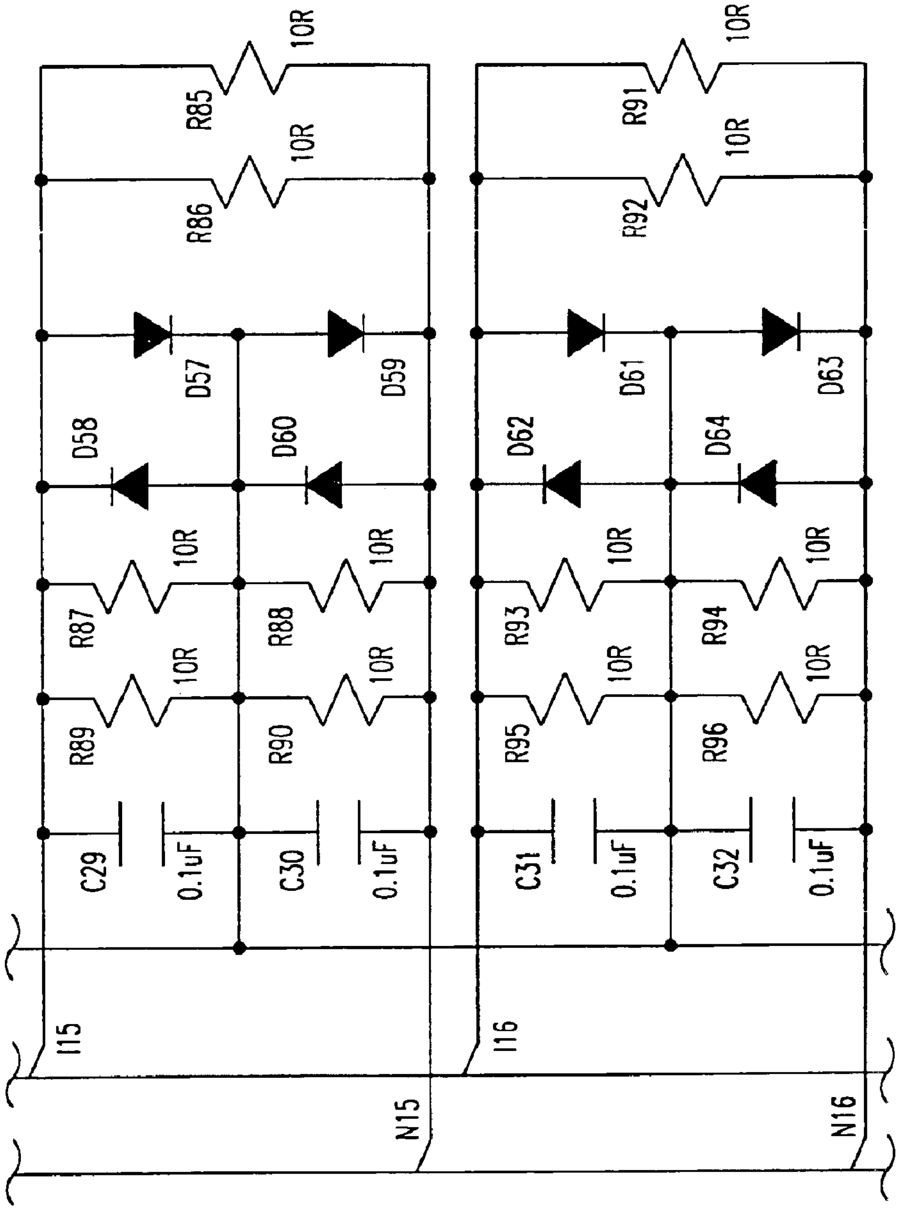
Figures 8, 15B:
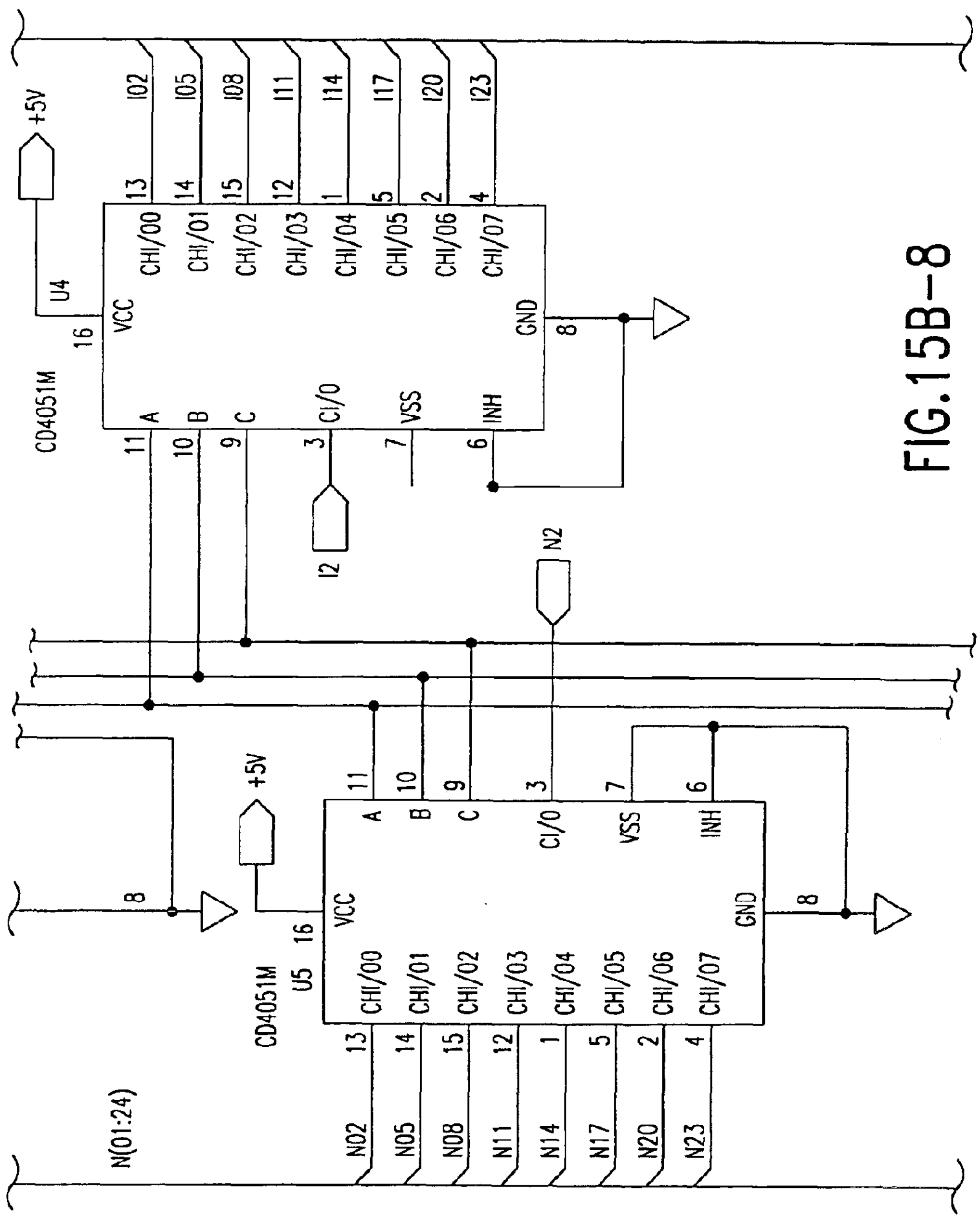
Figures 9, 15B:
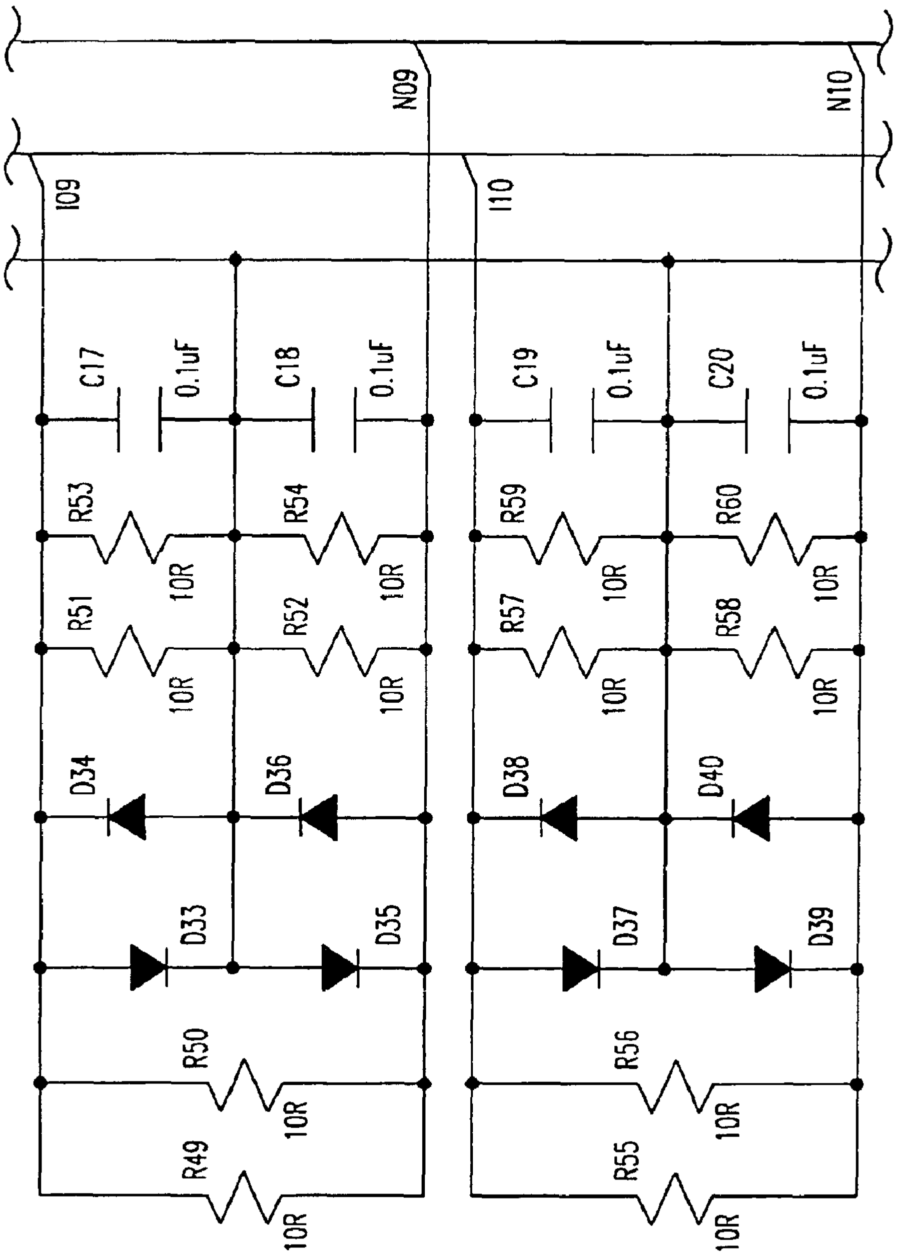
Figures 10, 15B:
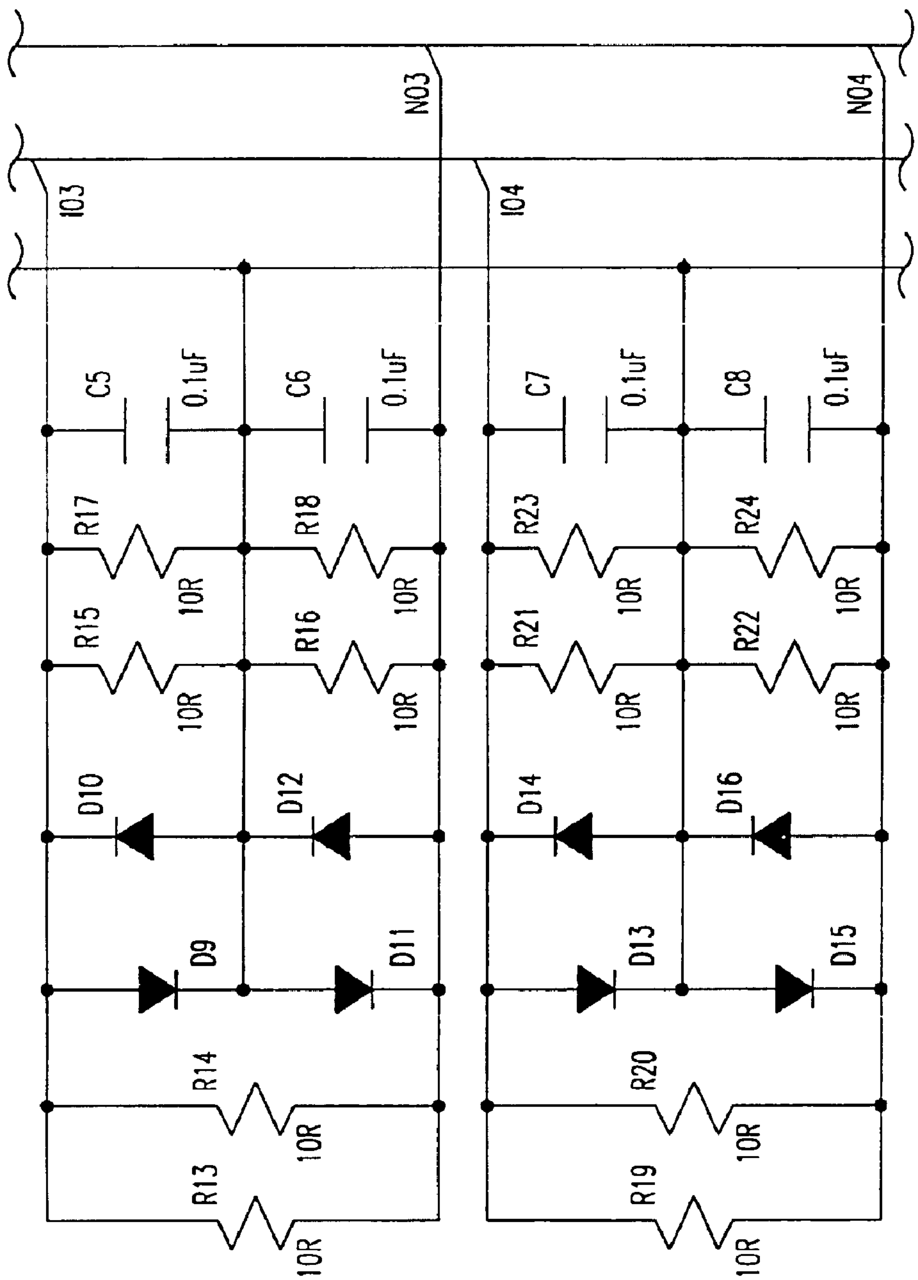
Figures 11, 15B:
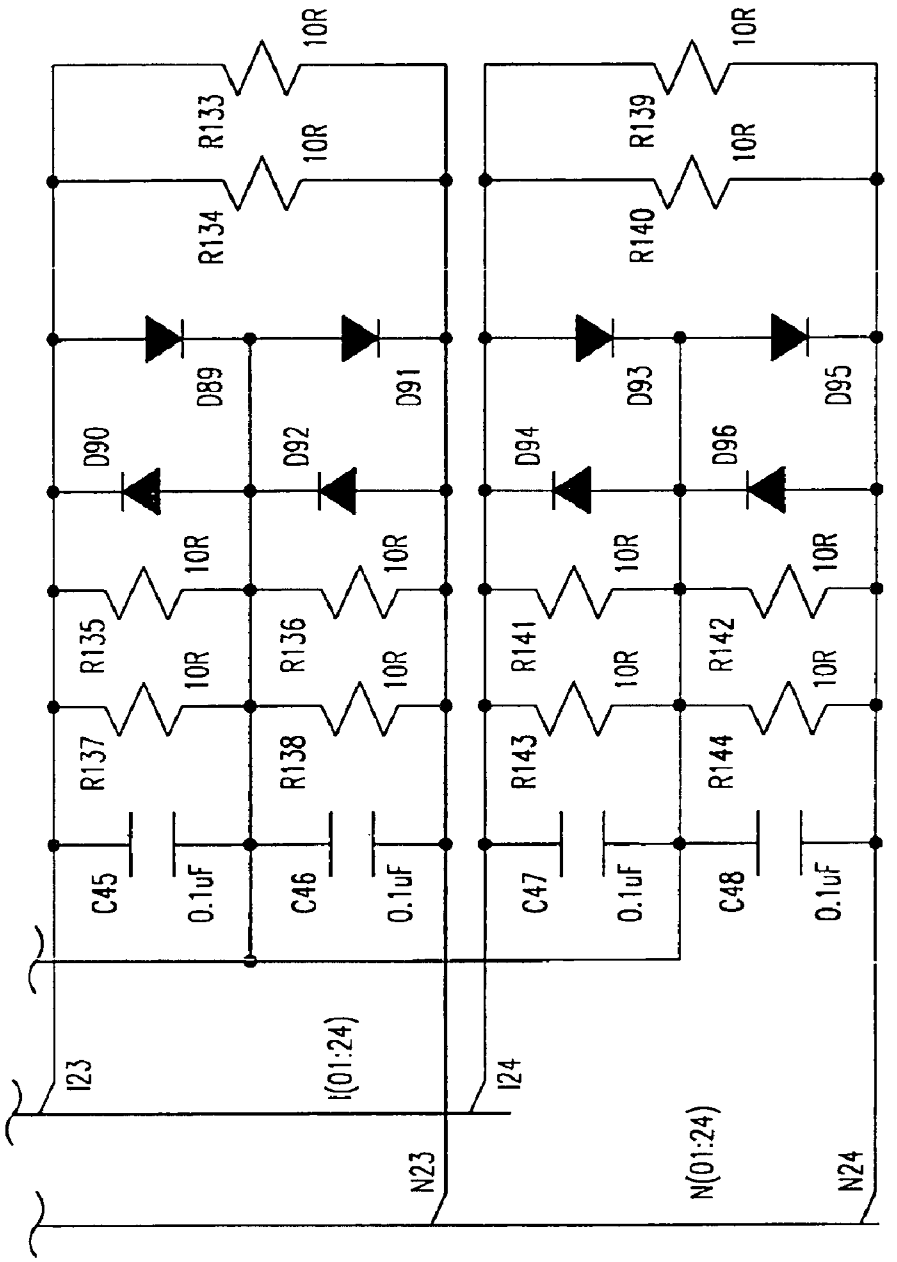
Figures 12, 15B:
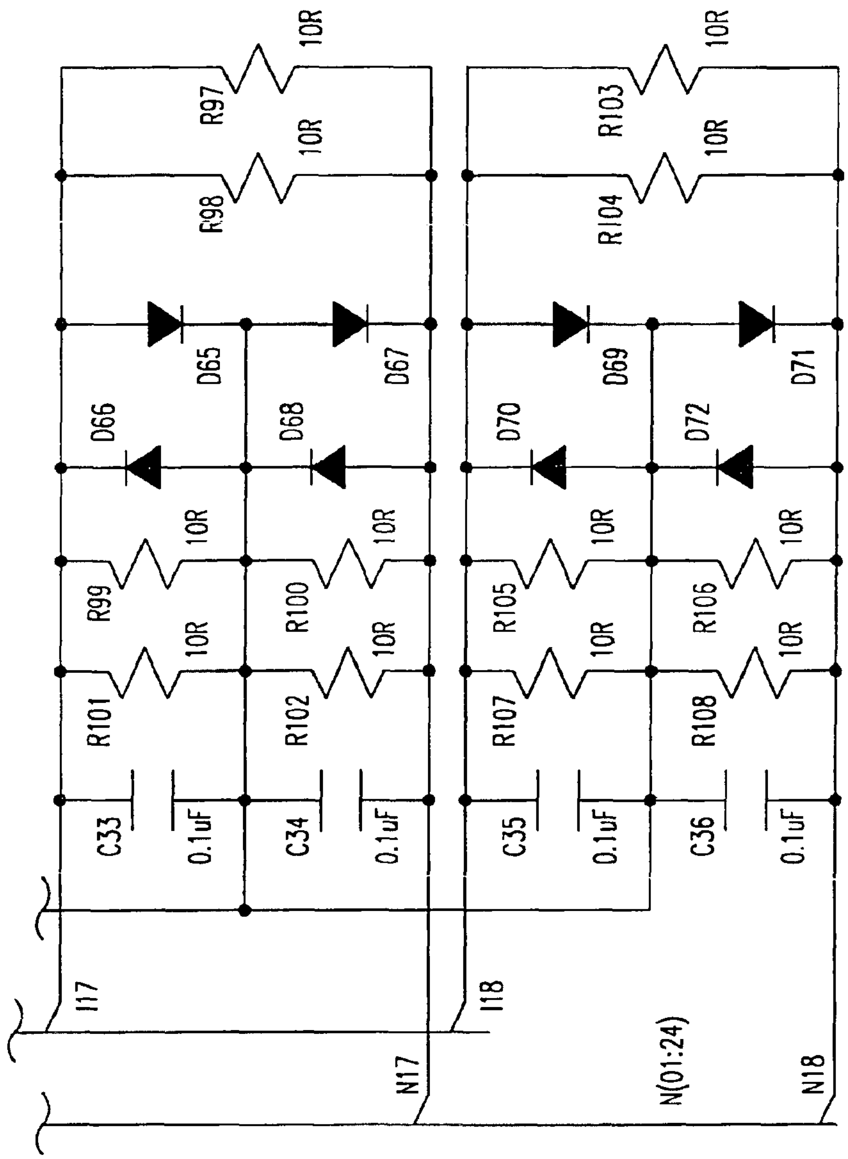
Figures 13, 15B:
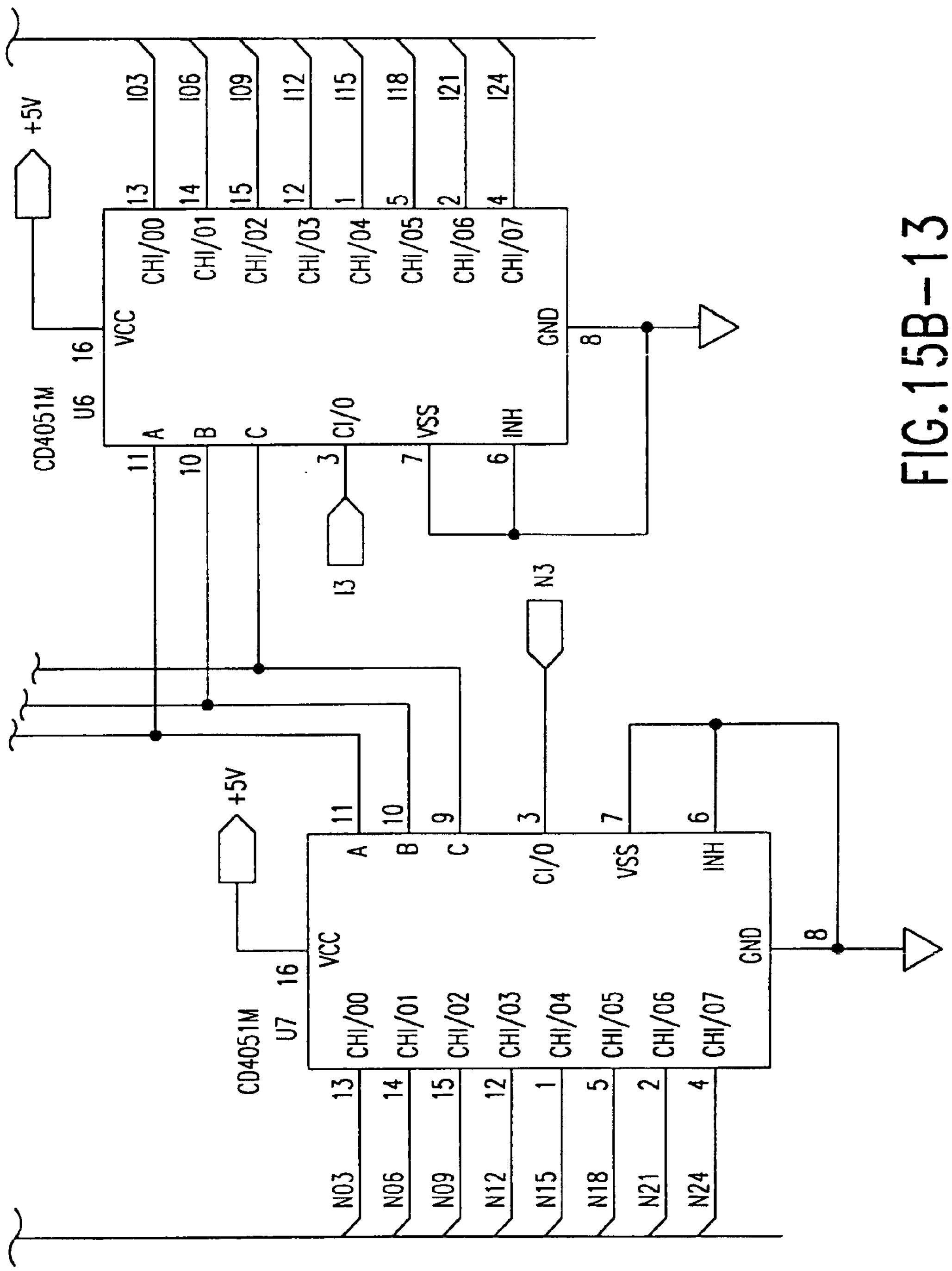
Figures 14, 15B:
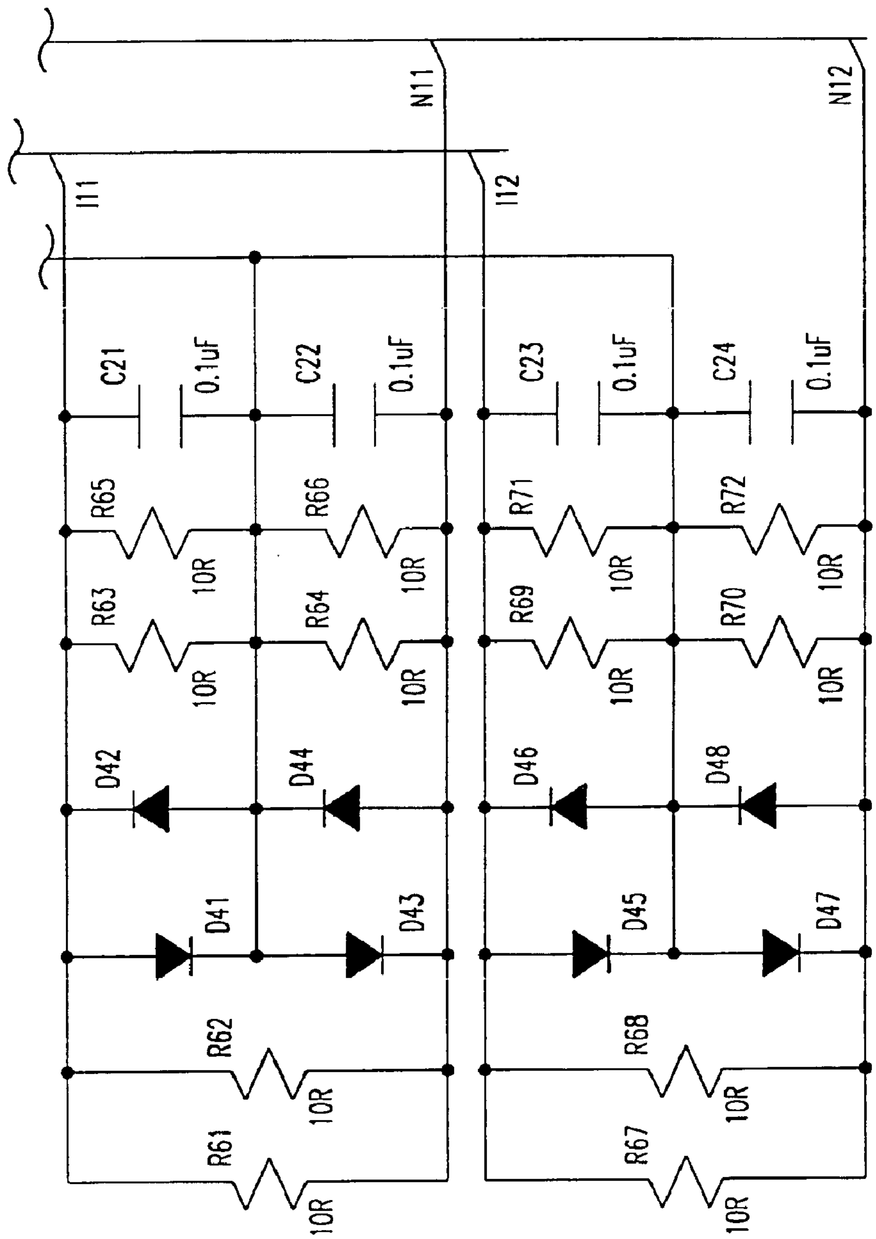
Figures 15, 15B:
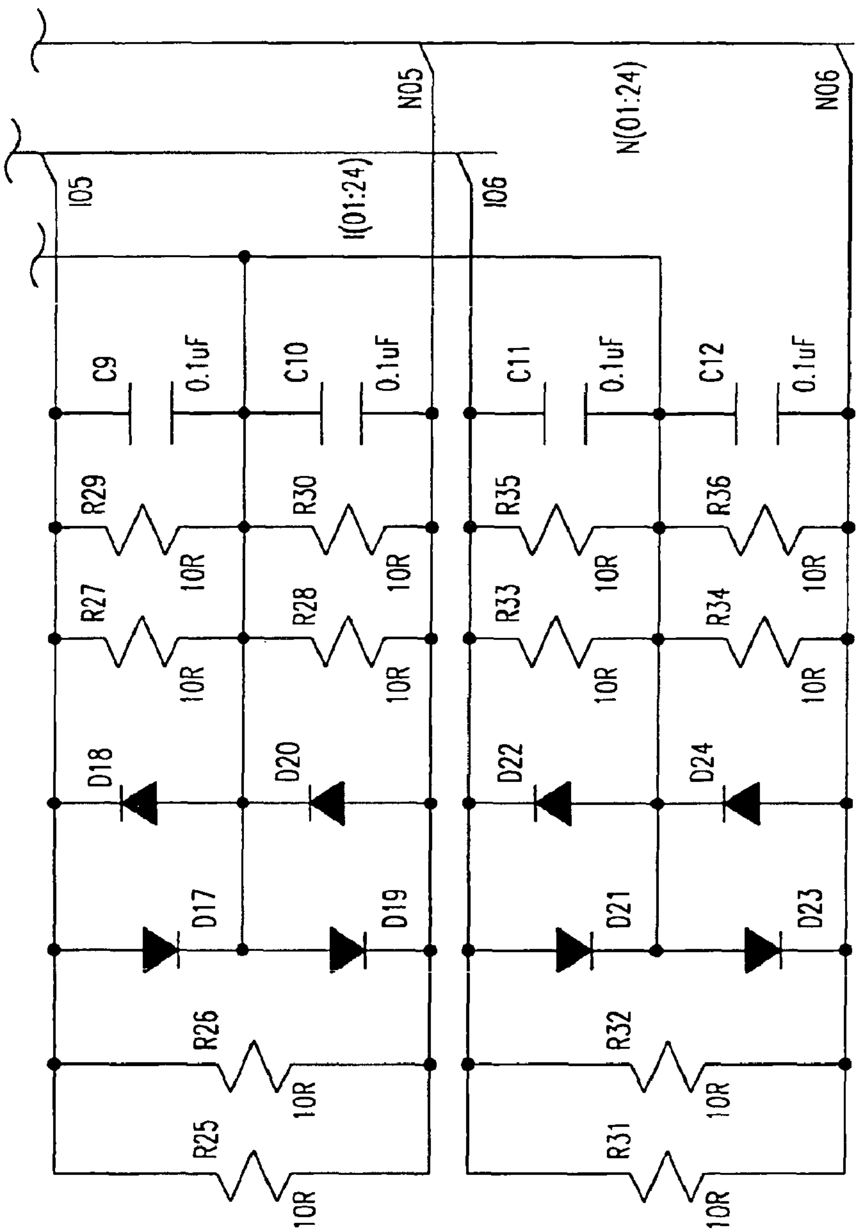
Figures 15, 15B, 16:
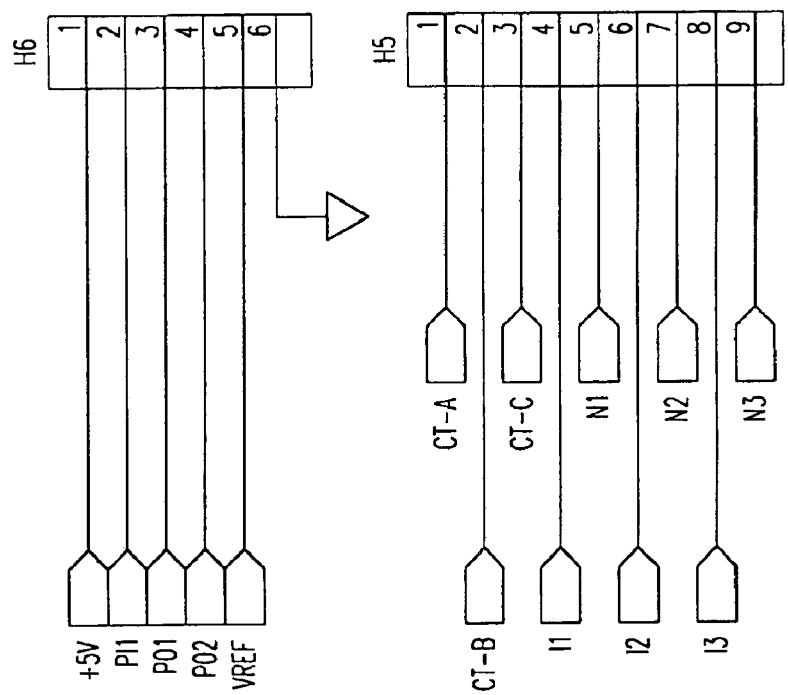
FIG. 16 is an Optical Adaptor schematic diagram.
Figures 15, 15B, 16, 17:
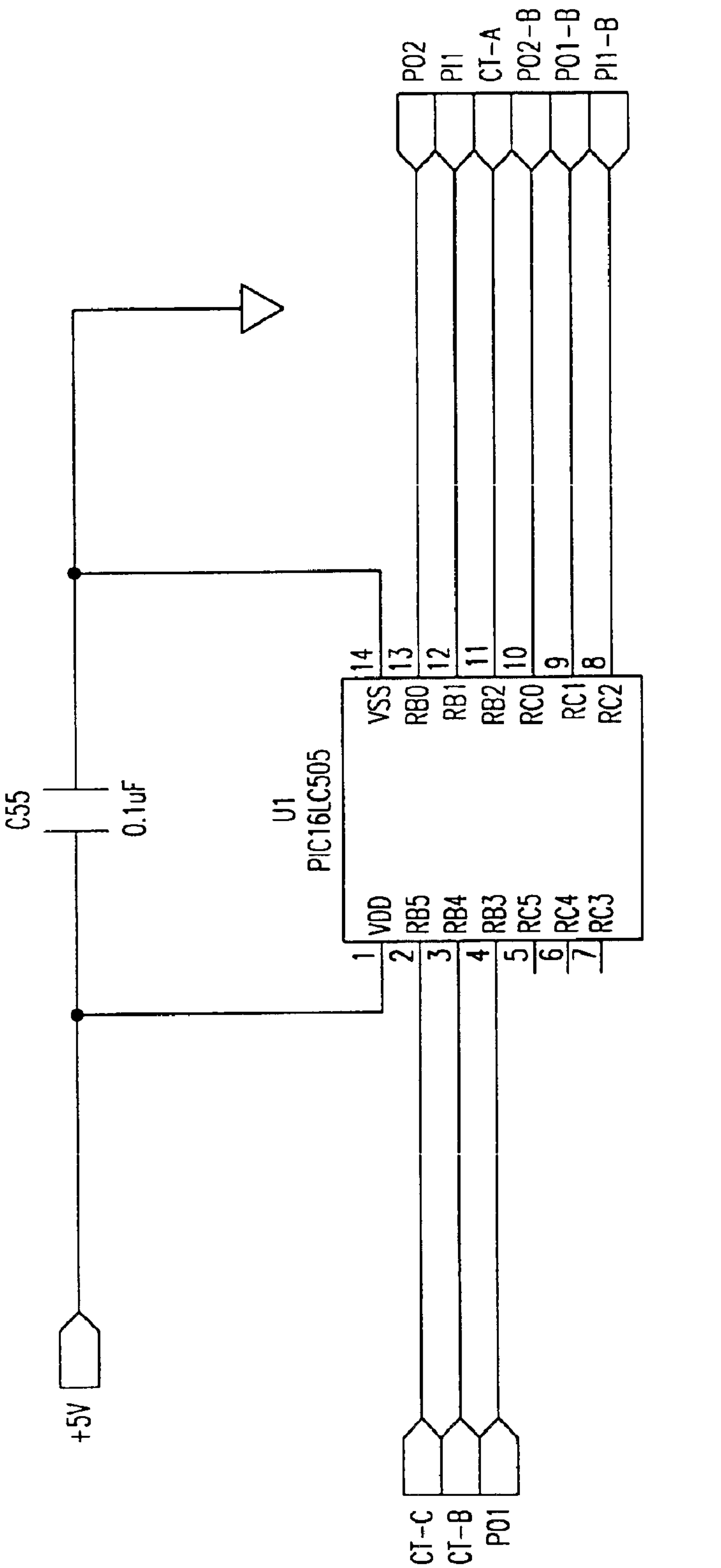
Figures 15, 15B, 16, 17, 18:
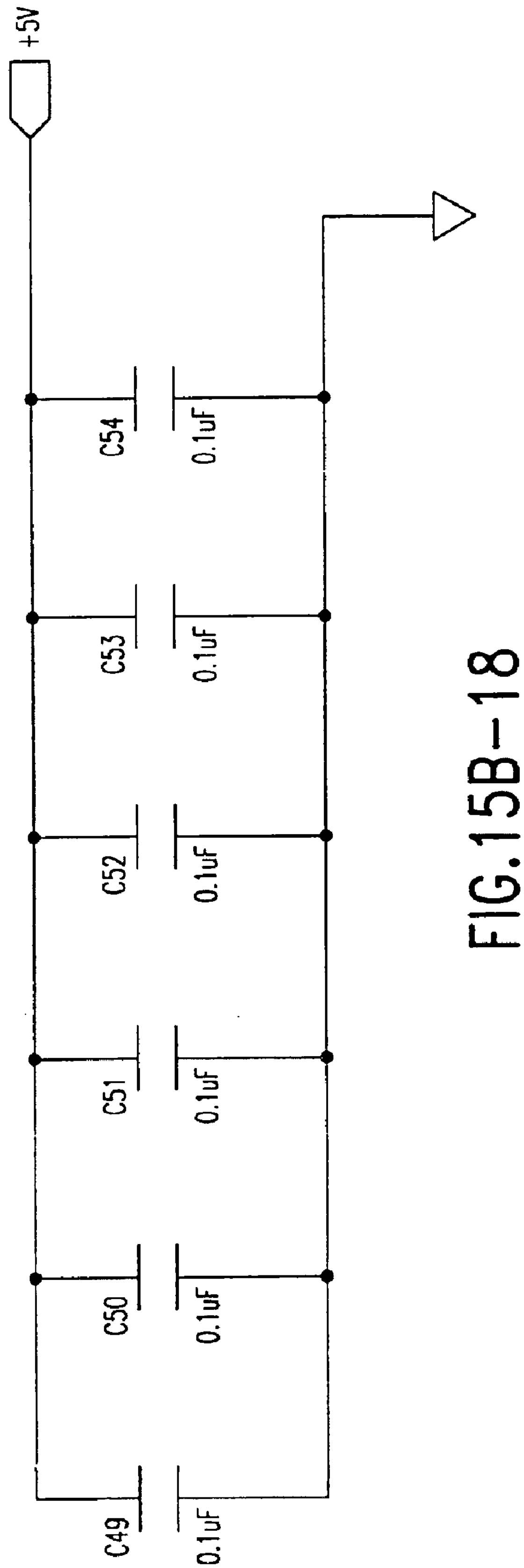
FIG. 18 depicts a configuration of a preferred submeter system.

Configuration of a preferred submeter system is depicted in FIG. 18. The following is a description of principal modules in the system.

A Power Supply 1801 supplies unregulated DC voltage +U for high power functions such as PLC. A regulated +5 VDC feeds each of the ICs and many other circuit blocks.

A Battery 1802 provides power for power-out operation of several functions in the ASIC including the Internal RAM A2, RTC A3, and 32768 Hz crystal 1809. It also powers the pulse reader when system power is unavailable.

Microprocessor U2 performs all the intelligent computations from the raw meter data and the ASIC states. The main program memory resides in the FLASH U5 but also run out of RAM and ASIC ROM in some cases.

FLASH U5 is nonvolatile memory, the site of primary memory storage and program memory.

RAM U3 is an IC that is external to the ASIC for microprocessor temporary storage of information.

Display Driver U4 sends the control signals to the LCD LCD1.

The ASIC U1 contains the bulk of the control hardware in the submeter system. The control blocks within the ASIC are discussed below.

32768 Crystal 1809 is used for time keeping.

20 M Crystal 1810 is the system clock for both the ASIC and the microprocessor.

$V_{REF}$ CR1 is a 2.5 VDC reference voltage. This design utilizes an IC with an external voltage adjustment such as LM336-2.5. The ASIC contains a 64 tap digital potentiometer that provides one of 64 voltage levels to the external control line. The ASIC control of $V_{REF}$ CR1 saves the cost of a moving part and provides digital code accuracy. Furthermore, because this code can be software-controlled, $V_{REF}$ can be calibrated meter by meter and can be calibrated to fit a parabolic profile with temperature. $V_{REF}$ is calibrated to 2.49 V, the voltage point of greatest temperature stability.

PLC Hardware 1815 is the power circuitry for the PLC transmit and receive.

Peripheral Interface 1818 is the connection point to external devices such as Pulse Relay, Relay Control, Minicloset interface, and transponder phase control circuits.

Hardware Test Points 1820 supply the ASIC with information that enables reading of +U, temperature, and ADC calibration. Various test points in the ASIC can be output as well.

Optical Reader 1825 is the hardware that translates the serial communication into optical transmission.

Voltage Divide 1830 is a 1000:1 voltage divide circuit that prepares measurement voltage for ASIC input.

Current Shunt 1835 is a resistor network used to convert current to voltage for ASIC input Detailed ASIC Description A preferred ASIC system U1 is depicted in FIG. 18. The following is an explanation of the different modules in the ASIC.

The Meter

Meter A1 reads the current and voltage channels from Voltage Divide 1830 and Current Shunt 1835. Internal amplifiers and correction factors improve the accuracy of the meter reading.

RAM (Internal) A2 is non-volatile RAM, backed up by the external battery 1802. This is the storage site for temporary RAM accumulators and other critical RAM variables.

Real Time Clock (RTC) A3 is the continuous time keeper for the system. The RTC is clocked by an accurate 32768 Hz crystal 1809 and is the standard for time clocking. Battery power from battery 1802 keeps the RTC operational even when system power is removed.

PLC Control A4 contains the control logic required to transmit and receive data that was sent through the PLC channels.

Digital Control Logic A5 provides the interface bits that control the enable lines for each part, the address and data busses, system reset, and access to internal state registers.

Unless Watchdog Timer ("WDT") A6 is refreshed, it will trigger a system reset.

Serial UART with FIFO A7 functions much like the PC 16550D from National Semiconductor.

Digital I/O A8 is used for communicating to peripheral devices through the Peripheral Interface 1818.

Analog I/O A9 is used to gather system information from Hardware Test Points 1820. This also outputs various analog points within the ASIC.

Sampling

The following is an example of the sampling times of voltage and current.

Ideally the voltage and the current samples are performed exactly at the same time. However there are timing issues in the current and the voltage measurement hardware. Because time discrepancies are usually not equal, a constant timing adjustment, which we shall call "delay," is applied to the current sampling channel. The term "delay" is used loosely here because the actual numerical delay can be a positive or negative number. In Table 1, the delay is 0.056°. This number is obtained through calibration.

For each measurement, four voltage samples ($V_1$ $V_{L1}$ $V_2$ $V_{L1}$) and one current sample (I) are taken. $V_1/V_{L1}$ is used for phase-to-neutral reading and the $V_2/V_{L2}$ pair allows phase-to-phase reading. The difference between the two types will become more evident in the meter diagram discussion.

$V_1$ and $V_{L1}$ comprise a voltage sample pair. The two samples are placed approximately 2° apart. $V_1$ is called the Voltage Sample and $V_{L1}$ is called the Late Voltage Sample.

Each measurement phase takes turns utilizing the metering channel to read their sample pairs. For example, in a three-phase meter, phase 1 is read, then phase 2 is read, then phase 3 is read, then phase 1 is read again. Eventually all the phases are read and the cycle repeats.

The process requires two voltage samples to be 90° apart. The strategy is to set the cycle period so that $V_1$ from one sample pair and $V_{L1}$ from another sample pair will be exactly 90° apart. Table 1 lists example sampling degrees for a three-phase (3Φ)) meter. Only phase 1 is shown.

TABLE 1

| Sample n | $V_1(n)$ | $V_{L1}(n)$ | I(n) |
|---|---|---|---|
| 1 | 0° | 2° | 0.056° |
| 2 | 44 | 46 | 44.056 |
| 3 | 88 | 90 | 88.056 |
| 4 | 132 | 134 | 132.056 |
| 5 | 176 | 178 | 176.056 |
| 6 | 220 | 222 | 220.056 |
| 7 | 264 | 266 | 264.056 |
| 8 | 308 | 310 | 308.056 |
| 9 | 352 | 354 | 352.056 |
| 10 | 36 | 38 | 36.056 |

Note the following:

(1) $V_1(1)$ and $V_{L1}(3)$ are 90° apart and therefore complete a measurement pair. $V_1(2)/V_{L1}(4)$, $V_1(3)/V_{L1}(5)$, and $V_1(4)/V_{L1}(6)$ make up future measurement pairs.

(2) Note that the current is offset from the voltage by 0.056 degrees. This is the delay required to synchronize the reading of the two channels.

Table 1 were extended, the sampling would sweep out the entire voltage waveform over a period of time. In a 3Φ meter every 4° would be sampled over 11 cycles. Table 2 shows the sequences of sampling degrees that would sweep the entire waveform:

TABLE 2

| $V_1(n)$ in degrees $\Phi_1$ of a 3Φ meter |
|---|
| 0, 44, 88, 132, 176, 220, 264, 308, 352, 36, 80, 124, 168, 212, 256, 300, 344, 28, 72, 116, 160, 204, 248, 292, 336, 20, 64, 108, 152, 196, 240, 284, 328, 12, 56, 100, 144, 188, 232, 276, 320, 4, 48, 92, 136, 180, 224, 268, 312, 356, 40, 84, 128, 172, 216, 260, 304, 348, 32, 76, 120, 164, 208, 252, 296, 340, 24, 68, 112, 156, 200, 244, 288, 332, 16, 60, 104, 148, 192, 236, 280, 324, 8, 52, 96, 140, 184, 228, 272, 316, 0 |

Even better, since the 2° separation between $V_1$ and $V_{L1}$ is not exact, all of the degrees between will eventually be swept out over a longer period of time.

The other two phases in a three-phase meter fall evenly between the gaps of the sample pairs, as shown below in Table 3, $V_1$ degrees of a 3Φ Meter:

TABLE 3

| Phase 1 | Phase 2 | Phase 3 |
|---|---|---|
| 0.00° | 14.67° | 29.33° |
| 44.00 | 58.67 | 73.33 |
| 88.00 | 102.67 | 117.33 |
| 132.00 | 146.67 | 161.33 |
| 176.00 | 190.67 | 205.33 |
| 220.00 | 234.67 | 249.33 |
| 264.00 | 278.67 | 293.33 |
| 308.00 | 322.67 | 337.33 |
| 352.00 | 6.67 | 21.33 |

Two-phase (2Φ) meters are sampled analogously to a 3Φ meter except the third phase samples are discarded. Table 4, $V_1$ degrees of a 2Φ Meter, shows the sampling of a Two-Phase Meter:

TABLE 4

| Phase 1 | Phase 2 |
|---|---|
| 0.00° | 14.67° |
| 44.00 | 58.67 |
| 88.00 | 102.67 |
| 132.00 | 146.67 |
| 176.00 | 190.67 |
| 220.00 | 234.67 |
| 264.00 | 278.67 |
| 308.00 | 322.67 |
| 352.00 | 6.67 |

Mini-closets are sampled so that all 24 phases are sampled in about 630 degrees or seven quarter cycles of the line as shown below in Table 5, Sample Pair Degrees of a Mini-Closet. This implies that each phase sweeps the entire sine wave in 67 line cycles.

TABLE 5

| Phase | V | $V_L$ |
|---|---|---|
| 1 | 0.00° | 2.00° |
| 2 | 26.17 | 28.17 |
| 3 | 52.33 | 54.33 |
| 4 | 78.50 | 80.50 |
| 5 | 104.67 | 106.67 |
| 6 | 130.83 | 132.83 |
| 7 | 157.00 | 159.00 |
| 8 | 183.17 | 185.17 |
| 9 | 209.33 | 211.33 |
| 10 | 235.50 | 237.50 |
| 11 | 261.67 | 263.67 |
| 12 | 287.83 | 289.83 |
| 13 | 314.00 | 316.00 |
| 14 | 340.17 | 342.17 |
| 15 | 6.33 | 8.33 |
| 16 | 32.50 | 34.50 |
| 17 | 58.67 | 60.67 |
| 18 | 84.83 | 86.83 |
| 19 | 111.00 | 113.00 |
| 20 | 137.17 | 139.17 |
| 21 | 163.33 | 165.33 |
| 22 | 189.50 | 191.50 |
| 23 | 215.67 | 217.67 |
| 24 | 241.83 | 243.83 |
| 1 | 268.00 | 270.00 |

Electrical quantities are computed from sampled voltage and current. The following are the mathematical formulas used:

Quantities calculated every sample:

Sample index: $n=n+1$

Real Energy: $WHr_n=K_U V_1(n)I(n)\ T_S+WHr_{n-1}$

Reactive Energy: $VARH_n=K_U V_{L1}(n+m)I(n)T_S+VARH_{n-1}$

Apparent Energy: $U_n=\sqrt{WHr_n^2+VARH_n^2}$

Volts-square hour: $V^2H=K_V^2 V_1(n)^2 T_S+V^2H_{n-1}$

Current-square hour: $I^2H_n=(K_U/K_V)^2 I_1(n)^2 T_S+I^2H_{n-1}$

Quantities calculated every frame of N samples:

Frame Index: $f=f+1$

RMS voltage: $VRMS_f=\sqrt{V^2H_n)/T_N}$

RMS current: $IRMS_f=\sqrt{I^2H)/T_N}$

Volt-Amp hour: $VAH_f=VRMS_f IRMS_f T_N+VAH_{f-1}$

Where:

$K_U$=KWH calibration constant for a particular range and metering phase.

$K_V$=Voltage calibration constant.

$V_1(n)$=Voltage sample point "n".

$V_{L1}(n+m)$=Late voltage sample that is 90° displaced on the waveform from $V_1(n)$.

$I(n)$=Current sample point.

N=Total number of samples taken in a frame.

$T_S$=Sample period.

$T_N$=Frame period.

Notes:

1. $V_{RMS}$ and $I_{RMS}$ are non-accumulation quantities but require a frame of samples for calculation. A frame size is approximately 1 second's worth of samples. The $V_{RMS}$ calculation uses $V^2H$ that has accumulated between samples 0 and N. Similarly, the $I_{RMS}$ calculation uses $I^2H$ that has accumulated between samples 0 and N. Therefore VAH is only updated once per frame.
2. VAH contains power of harmonic content, whereas WHr, U, and VARH, do not.

Calibration

When the meters are produced, they are capable of measuring voltage, current, KWH, and other parameters. These measurements can have an error of up to plus or minus 15 percent, due to manufacturing tolerances in the electronic components. While the value of this error is not predictable, the error will be extremely stable for a given meter. In other words, a meter which has just been built will not be particularly accurate, but the error will be very repeatable.

The calibrator used in a preferred embodiment measures the inherent error of the meter, then instructs the meter's onboard processor to correct the measured error. The meter stores these correction factors in its non-volatile memory, resulting in readings that are both accurate and stable.

The calibrator comprises a computer and auxiliary equipment The calibrator is preferably capable of supplying AC voltages between 0 and 600 volts, and AC currents between 0 and 210 amps. The phase angle theta (Θ) between the voltage and the current is adjustable from −90 to +90 degrees. The frequency of the AC power can be either 50 or 60 hertz.

The calibrator communicates with the meter using the meter's built-in optical communications port, and uses standard measurement devices to measure the actual correct value of the parameters being adjusted. For voltages, the calibrator uses a digital voltmeter (DVM) to obtain the actual values. For KWH, the calibrator uses a Radian KWH standard to measure the KWH to 0.05 percent accuracy.

There are several possible sources of errors in the meter's measurements: (1) voltage reference value and stability; (2) ADC linearity; (3) amplifier gain and delay; (4) sample rate; (5) system clock frequency; and (6) component tolerances for resistors and capacitors in measurement circuitry.

Calibration Algorithm

Voltage reference calibration: The output voltage of the voltage reference is adjusted by the calibrator to an initial value chosen to provide the most stable output voltage. This is accomplished by reading the actual value of the voltage reference using a DVM. The meter is then instructed to set the value of a digitally-controlled potentiometer (within the ASIC in the preferred embodiment) that adjusts the output voltage of the voltage reference. The calibrator then repeats this process until the voltage reference is set to the correct nominal output voltage (in a preferred embodiment, this is 2.490 Volts).

ADC linearity calibration: the meter uses an ADC inside the ASIC to read the voltage, current, and other analog values needed by the measurement algorithm of the meter. When the ASIC is manufactured, this ADC may be non-monotonic at high-order bit transitions. The ASIC provides for individual adjustment of the weight of the 5 high-order bits in the ADC, allowing calibration to guaranteed monotonicity. The calibrator uses a DVM to measure values just above and below these bit transitions, and adjusts the weight of each bit in order to get a monotonic response. These adjustments are performed by the meter's firmware, which writes correction values into registers in the ASIC. When the proper correction values have been found, the calibrator instructs the meter to store these values permanently in the non-volatile memory.

$V_{REF}$ and ADC temperature drift calibration: the voltage reference and the ADC are both affected by temperature changes experienced by the ASIC. This results in an error which varies with temperature. The calibrator measures the performance of the voltage reference and the ADC at 3 different temperatures (room temperature, 5° C., and 85° C.). The effect of temperature is then communicated to the meter's firmware. In operation, the meter reads its ambient temperature, then uses the temperature calibration information to correct for the effects of temperature on the ADC and voltage reference.

Voltage calibration: the meter must measure AC RMS voltage. The accuracy of the measurement is affected by the factors listed above (in "sources of error"). The meter has 4 different measurement ranges for voltage. In the present meter, these ranges are: (1) Range 3—0 to 75 volts; (2) Range 2—75 to 150 volts; (3) Range 1—150 to 300 volts; and (4) Range 0—300 to 600 volts.

The different ranges use different internal configurations of the ASIC, resulting in different gains in the signal presented to the ADC. Each of these gain settings may have a different error. For each voltage range, the calibrator supplies the meter with an AC voltage which is appropriate for that range. The calibrator then reads the voltage applied to the meter using a DVM, and also reads the voltage as measured by the meter. The difference in these readings is analyzed, and a correction factor is calculated and sent to the meter. For each range, this process is repeated until the meter and the DVM measurements agree. The value of the correction factor (the Voltage Calibration Constant) is then permanently stored in the non-volatile memory of the meter.

KWH calibration: the meter must measure energy in KWH. In order to do this accurately, the external quantities of voltage and current must be accurately measured so that KWH can be calculated. The KWH measurement depends on the value of the voltage and the current, and the timing relationship between the voltage and the current. The equation for KWH is Volts*Amps*Cos(Theta)*Hours, where Theta is the phase angle between the voltage and the current. The meter performs this measurement by sampling the voltage and the current simultaneously, then processing these instantaneous values.

Various errors can occur due to the reasons listed above. For this measurement, it is not only necessary to correct any errors in the values of the measured voltage and current, it is also necessary to correct for any error in the time relationship of these measurements. The meter has 20 ranges for current, from range 23 at 0.5 amps to range 4 at 100 amps. For each range, the internal configuration of the ASIC amplifiers is different, and the CT introduces current-dependent errors in both amplitude and delay. Therefore, the calibrator repeats the KWH calibration for each range.

Amplitude compensation: any error in the actual value measured for voltage and current is compensated for by using an "Amplitude" (A) calibration constant. This constant is a factor by which the readings are multiplied, to make the measured value correct.

Delay compensation: the time relationship between the voltage and the current signals may be incorrect due to amplifier characteristics in the ASIC, or due to the characteristics of the current transformers (CTs). In particular the CTs introduce a current-dependent phase shift which becomes greater and greater at low currents. This results in the current signal not being properly synchronized with the voltage signal. This error results in errors in the KWH measurement due to the change in theta caused by this time shift.

Any error in the time relationship between the voltage and the current measurement is compensated for by instructing the ASIC to sample the current either before or after the ASIC samples the voltage. This time-delay between the samples is adjusted to exactly cancel the time-delay caused by the measurement circuitry. This is referred to as the "Delay" (D) calibration constant.

KWH calibration algorithm: for each of the 20 current ranges, the calibrator sets up a specified voltage and current. This voltage and current are supplied to the meter being calibrated, and also to a KWH standard Radian RM-10, +/−0.05%). The calibrator cannot directly measure the quantities that it needs to communicate to the meter (amplitude and delay error). Instead, the calibrator measures the actual error in KWH registration. This error is caused by the combination of the amplitude error and the delay error. The calibrator does this measurement by supplying the specified current and voltage to the meter and to the standard, then measuring the accumulated KWH for a specified time interval. The difference between the standard and the meter measurements is the KWH error.

In order to separate the contributions of the amplitude error and the delay error to the total error, the calibrator performs the KWH test twice. In the first test, theta is set to 60 degrees, and the KWH error is measured and saved. Then, the test is repeated at 0 degrees.

Because the slope of the cosine is nearly flat around 0 degrees and quite steep at 60 degrees, the contribution of the delay (timing) error is very small at 0 degrees, and much larger at 60 degrees. The contribution of the amplitude (value) error is the same at either 0 or 60 degrees. Therefore, with these 2 measurements, the calibrator can solve for the 2 independent error sources (amplitude and delay).

After the calibrator does these measurements and makes these calculations, the calibrator instructs the meter to compensate for these errors.

This entire process is then repeated, until the measurements at both 0 and 60 degrees are within specification. The calibration constants are then stored in the meter's non-volatile memory.

Interval Metering

Interval metering stores independent records of metering data for future recall. Electrical parameters are continuously accumulated into battery-backed RAM and then periodically stored to non-volatile FLASH memory. For example, if the metering interval were set to 30 minutes, there would be 48 records of data in the day. Table 6 below, illustrating interval storage, is an example of data storage using Interval Metering. Interval Metering can be particularly useful in calculating billing demand.

TABLE 6

| Time at start of Interval | Consumption |
|---|---|
| Feb. 3, 2001 05:00 am | 0.122 kwh |
| Feb. 3, 2001 05:30 am | 0.128 kwh |
| Feb. 3, 2001 06:00 am | 0.115 kwh |
| Feb. 3, 2001 06:30 am | 0.858 kwh |
| Feb. 3, 2001 07:00 am | 0.778 kwh |
| Feb. 3, 2001 07:30 am | 0.353 kwh |
| Feb. 3, 2001 08:00 am | 0.247 kwh |
| Feb. 3, 2001 08:30 am | 0.137 kwh |

Interval Metering offers more frequent data records, which is useful in demand billing calculations and Theft Detection. But more important, Interval Metering in conj unction with FLASH memory provides protection from data corruption. In the past, switching a very high-current inductive load created an enormous transient on the line, destroying the RAM data. In other cases, RAM has also been found to corrupt in the presence of EMI sources such as toy transmitters.

Because RAM data is frequently dumped to FLASH memory, only a minimal amount of data in RAM is ever exposed to corruption. Reducing the storage intervals further increases data protection. FLASH is a far more reliable memory because, it requires a sequence of commands for any data modification and does not require a power source for data retention.

Figures 15, 15B, 16, 17, 18, 19:
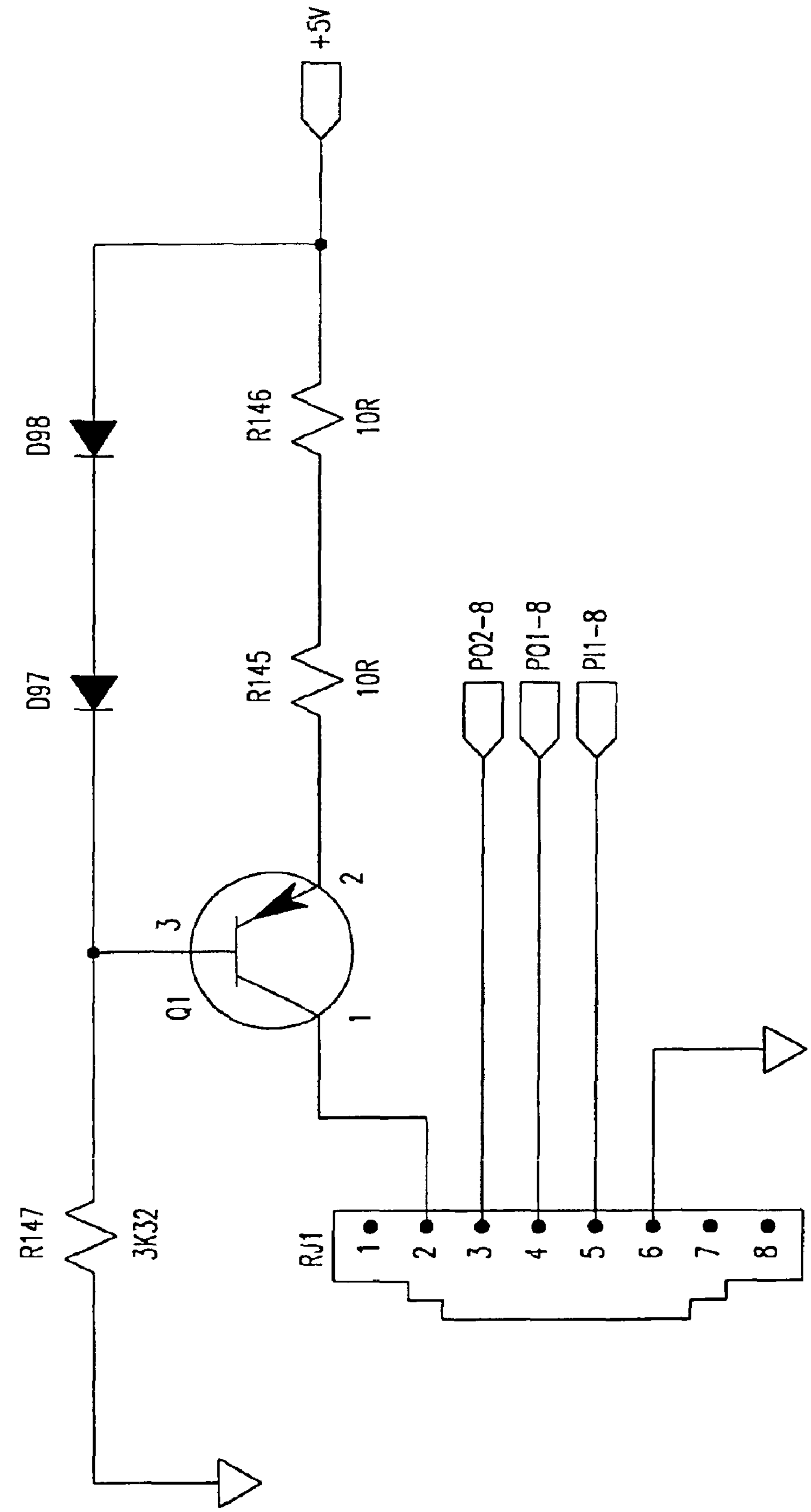
FIG. 19 shows how electrical parameters are accumulated in preferred software.

FIG. 19 shows how electrical parameters are accumulated in preferred software. There are two data accumulation registers per parameter and phase. The first register iAcc[0] becomes active. After a short period of time, this register is available to be dumped into RAM register curph. While waiting for this transfer, iAcc[0] ceases to accumulate and iAcc[1] is cleared and begins active accumulation. When iAcc[1] is ready for transfer, iAcc[1] becomes inactive and iAcc[0] is cleared and begins to accumulate. This enables seamless accumulation and periodic dumping to curph in RAM.

At the end of a metering interval, the electrical parameters are then stored to FLASH. After successful storage to FLASH, the RAM register is cleared and begins to accumulate for the next interval.

Meter Hardware

Figure 20:
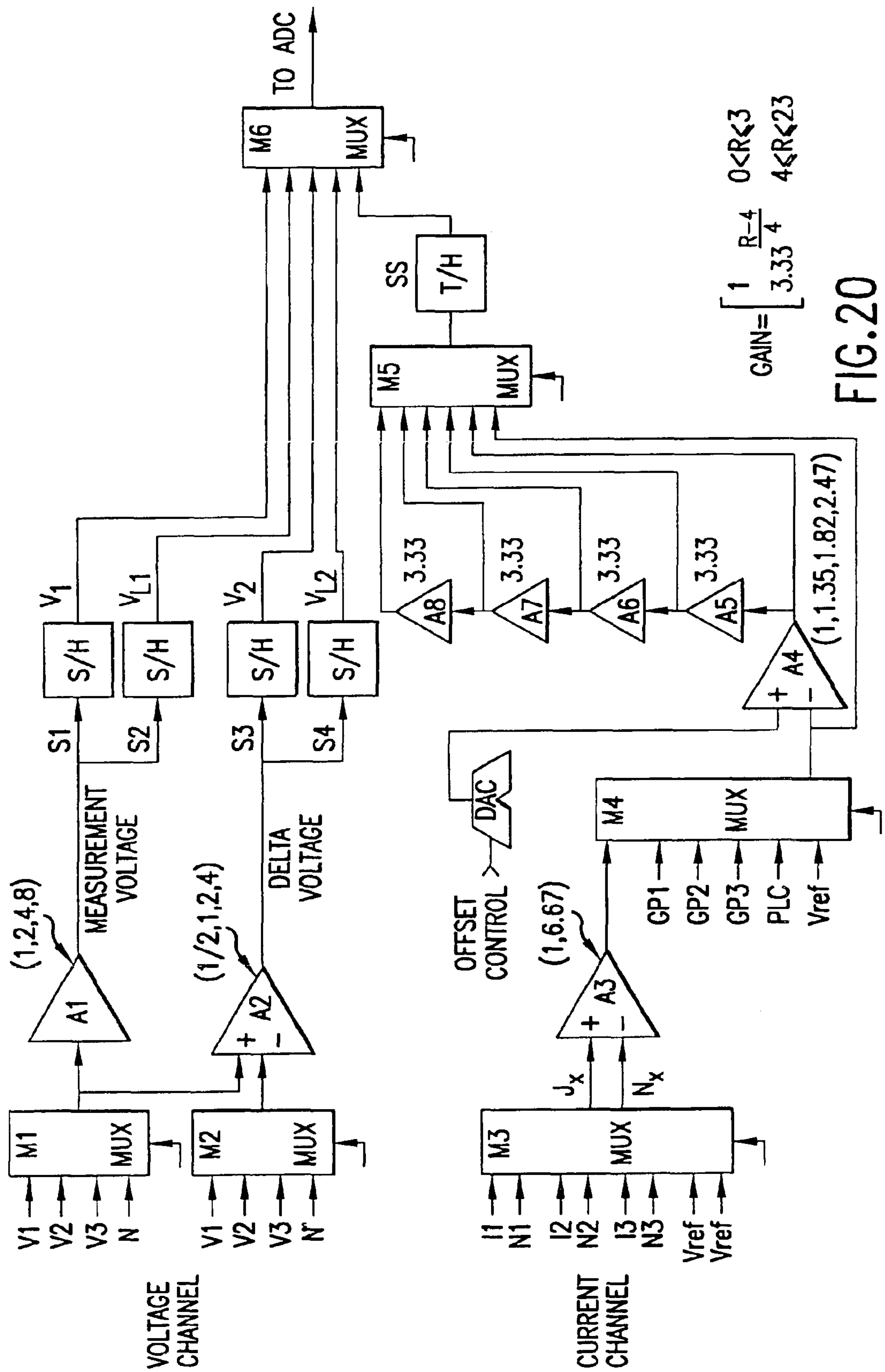
FIG. 20 depicts overall meter hardware of a preferred embodiment.

The overall Meter Hardware is depicted in FIG. 20. The upper portion shows the voltage channel and the lower portion the current channel. Both voltage and current are fed through their own gain stages and are selected through MUX M6 for the ADC.

Voltage channel—MUX M1 and MUX M2 independently select between V1, V2, V3, and N. The signal through the amplifier A1 is phase-to-neutral. The signal through the amplifier A2 is a differential (or delta) voltage between the two signals that were selected from MUX M1 and MUX M2, the delta voltage $V_2$. Each of these voltages pass through two sample and hold circuits, creating the late voltage $V_L$. From the four sample and holds emerge: $V_1$, $V_{L1}$, $V_2$, $V_{L2}$.

Amplifiers A1 and A2 have adjustable gains. Because A2 is intended for higher delta voltage, its gains are half of A1. The gain setting corresponds to a particular range of voltage amplitudes that will obtain optimal readable scale after amplification. There are four voltage ranges, 0 through 3.

$V_1$: Gain=$2^R$ $V_2$: Gain=$2^{R-1}$

Current channel—MUX M3 selects between 4 signal pairs: I1/N1, I2/N2, I3/N3, and $V_{REF}/V_{REF}$. The signal passes through amplifier A3, is selected by MUX M4 and passes through a series of amplifiers A4–A8. There are 23 current range settings selectable through MUX M5 and amplifier A4.

I: Gain=1.00 0£R£3

$3.33^{(R-4)/23}$ 4£R£23:

Offset control—Small offset voltage in amplifier A3 could saturate the current channel at higher ranges, making current unreadable. To null any offset, the output offset is dynamically monitored and adjusted in amplifier A4.

ADC Temperature Calibration—Because there is temperature variation with the ADC, the ADC is calibrated with temperature against the temperature sensing diode. The result is a best fit curve that can be applied to the final data in software.

Power Line Communication

A preferred implementation of Power Line Communication (PLC) is flexible enough to allow for faster data rates and successful data recovery.

Modulation schemes—Two modulation techniques are available: Frequency Shift Keying (FSK) and Phase Shift Keying (PSK).

Data Rates—The Baud Clock is synchronized to the line phase by means of a Phase-locked Loop (PLL). The PLL is jointly implemented in software and hardware. By knowing the zero phase crossings from the PLL, the actual data rate can be synchronized to fractions or multiples of the line frequency.

Figure 21:
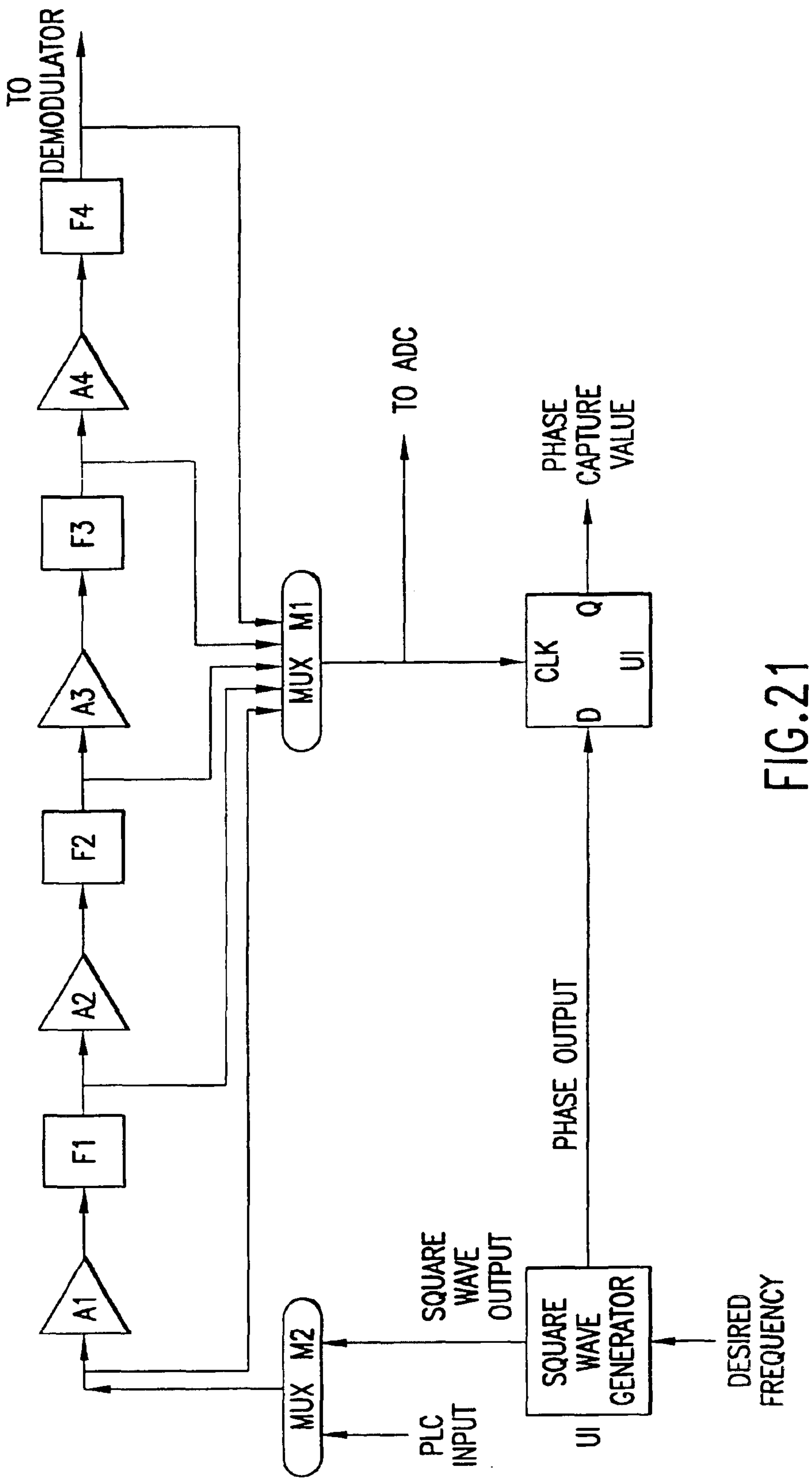
FIG. 21 depicts preferred PLC receive circuitry for an ASIC.

PLC Receiver—The PLC receive circuitry as found in the ASIC is shown in FIG. 21. In the normal mode, M2 channels the PLC input into the filter. The filter rejects out-of-band noise and couples the signal into the demodulator.

The PLC filter is designed as a continuous time domain filter. Its advantage over switched capacitor filters is to achieve higher Q and lower internal noise level in the operating frequency band. The high Q is essential because a bandpass effect is created from a lowpass, high Q design with attenuation. The attenuation compensates for high gain at the peak frequency of the LPF. The attenuation provides the low frequency rejection. A true bandpass filter can also be used as well. The filter is tunable to frequencies from 20 –90 kHz. The filter also compensates for variation due to components and temperature variation.

The overall filter is frequency-tuned with the Coarse Adjustment Register. The proper setting places the filter in the vicinity of the desired value. The entire filter is comprised of four filter stages, with the attenuation control spread over the four stages. These four stages need to be aligned to the desired frequency. Fine Adjust registers F1–F4 enable frequency tuning of each stage while Attenuation registers A1–A4 enable amplitude tuning or each stage. Together, these adjustments calibrate out any discrepancies between stages.

Figure 22:
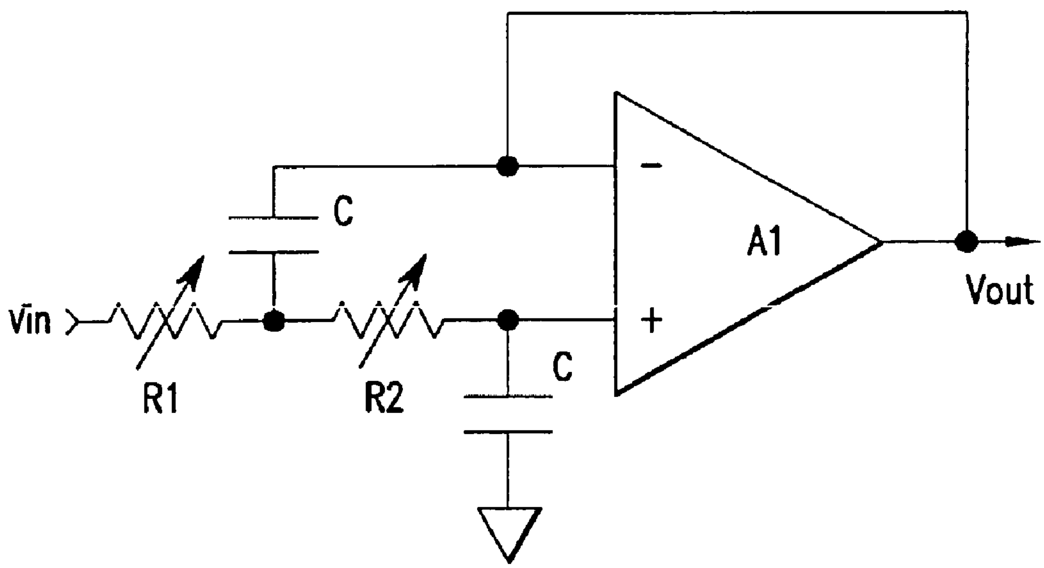
FIG. 22 is a diagram of a preferred two-pole lowpass filter used in an ASIC.

Each filter stage is preferably implemented as a two-pole lowpass filter with two external capacitors. A preferred filter is shown in FIG. 22.

Filter Alignment: Filter alignment is the process of tuning the corner frequencies of each of the four filter stages to the desired frequency by means of phase shift detection. The alignment process injects a test signal with a Square Wave Generator U2. U2 also outputs the phase of the square wave to be latched in by a Phase Shift Detector U1.

The microprocessor selects the desired frequency for U2 and routes the square wave through M2 to the input to filter. This square wave signal passes into all four stages of the filter. The microprocessor selects the filter stage output to pass through M1. The signal undergoes phase shift in the filter stages and its rising edge becomes the latch clock for U1, latching across the phase difference between the filtered signal and the test signal. For the two-pole lowpass stage, the phase at the corner frequency is 90°.

The ADC monitors the signal strength of the PLC signal to adjust attenuators A1–A4 for adequate clocking of the phase capture latch. The following is the filter alignment process:

(1) Place Fine Adjust of Stage 1 at the midpoint value.

(2) Set the Coarse Adjust Register to the highest frequency setting and lowest attenuation. Observe signal strength with the ADC. Decrease Coarse Adjust until there is valid signal strength. Adjust attenuators so that filter input does not saturate. Check phase difference. Continue adjusting Coarse Adjust and Attenuator 1 until there is a 90° difference.

(3) Tune Stage 1: (A) start with Fine Adjust I at the midpoint; (B) modify Attenuator 1 for valid signal strength; (C) check filter phase; (D) change Fine Adjust in the direction that leads the filter phase to 90° (a binary search algorithm is suggested); and (E) repeat (B) to (D) until filter phase is 90°.

(4) Tune Stages 2 thru 4. Note that the Phase Capture value is the phase difference between the square wave input and the output of the filter stage. Therefore Stage 2 seeks a 180° difference, Stage 3 seeks a 270' difference, and Stage 4 seeks a 0' difference.

Similarly, if the filters were designed with true bandpass filters with the same roll-ff, the phase difference across stages would be 180 degrees.

Digital Demodulator: The filtered signal enters the demodulator circuit The digital demodulator uses a digital phase lock loop to identify the binary data stream.

PLC Transmitter

A preferred embodiment uses ASIC control circuitry to control the PLC transmitter. There are two outputs that can be driven in parallel or opposite, depending on whether the design is for a bridge circuit or for a single-ended circuit.

A preferred transmitter circuit is found in the 10 series schematic drawing in FIG. 11A. Because the switching time differs between off and on, there is some overlapping period of time when both Q2 and Q3 are both active. This overlap short-circuits the power supply through Q2 and Q3 for a brief moment creating transition heat. The hardware can be designed so that neither Q2 nor Q3 will be active at the same time. This is illustrated in Table 7, which lists a Transistor Switching Sequence. The interval when both Q2 and Q3 are off is called Dead Space. Here are some benefits: (1) transition heat of the Q2 and Q3 is reduced or eliminated; and (2) output transmitter wave shape becomes more sinusoidal, and therefore reduces harmonic injection to the line. The dead zone makes the transition step more gradual at the edges. And since the load is inductive, current continues to flow through the bridge through the bridge clamping diodes (D22, D23, D32, and D33) during the dead period, creating rounder edges and therefore more a sinusoid effect.

TABLE 7

| Duration | Q2 | Q3 |
|---|---|---|
| 12 us | ON | off |
| 3 us (dead space) | off | off |
| 12 us | off | ON |
| 3 us (dead space) | off | off |
| 12 us | ON | off |
| 3 us (dead space) | off | off |
| 12 us | off | ON |
| 3 us (dead space) | off | off |

Dead Space can be implemented in ASIC hardware or in discrete circuitry. The ASIC can use a binary counter and specify certain count states as "off" states. Discrete circuitry can be designed so that the base drive has a delayed turn on but synchronized turn-off.

The overall design of the transmitter circuit is to drive a toroid coil using a transistor bridge circuit using transistors Q2, Q3, Q4, and Q5. The control signals are PLCX1 and PLCX2.

The base drive design for Q2 is explained below. Since the base drives of Q2, Q3, Q4, and Q5 are identical or complementary, it is sufficient to discuss only the base drive of Q2. Capacitor C9 provides AC coupling between the transistor base and the control signal.

This serves at least two functions:

(1) Transistor protection due to control signal failure. If PLCX1 was temporarily stuck in high impedance or at some intermediate voltage level (2.5 V for example), Q2 and Q3 would turn on. This short-circuits the power supply through these devices and quickly damages these devices. The AC coupling deactivates the circuit under any situation where PLCX1 or PLCX2 gets locked into any static state.

(2) The AC coupling also reduces transition heat. In the absence of Dead Space hardware, the AC coupling reduces transition heat by forcing a faster switch off time for Q2 and Q3. When PLCX1 transitions from high to low, the opposite side of C9 transitions below ground. This negative voltage is impressed upon the base of Q2 through D28. Charge is pulled out of the base of Q2 making the switch off far more rapid.

PLC Line Injection

PLC is injected into the line through series capacitors C4, C5, and C6 (see FIG. 11A). These capacitors block the generated PLC signal from high voltage. But unless C4/C5/C6 is very large, the impedance of the series capacitance weakens the signal substantially. Unfortunately, capacitors of large values, high AC voltage blocking, and board mount size are rare and expensive. Therefore, an inductor L3 is placed in series with the capacitor to cancel some of its impedance. For lower voltage applications (e.g., 120 V), only one capacitor is required for line blockage allowing for a smaller inductance to be used. For medium level voltages (e.g., 220 V, 347 V), C4 and C5 must be used. For the highest level of voltages (e.g., 480 V, 600 V), all three capacitors must be used. Therefore, by building the PLC injection circuit to match the line voltage requirement, signal strength can be maximized while costs are minimized.

C4, CS, C6, and L3 also act as an LC filter. For narrow band applications, a larger capacitance and smaller inductance is used. For broader band, smaller capacitance and larger inductance is used. Furthermore, another capacitor (not shown) can be placed at the CV/CN inputs. This offers yet another pole of filtering, if desired. This part can be mounted on the PCB or placed in the wiring harness.

Pulse Circuit

The Pulse Circuit controls external relays and counts contact closures. External relay control gives the utilities access to external events such as turning off power to the house or controlling other appliances. Contact closure reading enables other metering quantities such as gas and water to be monitored. The Pulse Circuit monitors these quantities in the absence of electric service. Normally, all services (such as gas, water and electricity) are active. Because of a battery-backed supply, gas and water are still accurately monitored in the absence of electric service. The circuit is shown in the central portion of FIG. 11A.

Contact Closure Read: The contact points are isolated from the main circuit through optical isolators and a pulse transformer. A remote microprocessor U4 polls the contact closures through a pulse transformer. Any contacts that are closed will activate the corresponding optical isolator (OPT3–OPT6) and shorts out the capacitors (C11–C14). The microprocessor reads the voltage on these capacitors to know which contacts were closed.

The pulse circuit is normally powered by +5 VDC (through D5). But when +5 VDC is not available, the battery supply (through DS) becomes the power supply of the pulse circuit. Because the minimum required voltage of the microprocessor is very close to the system battery voltage, care is preferably taken to maximize supply voltage. A schottky diode (D8) is used to minimize drop. A separate power feed (D6 and D7) is used to power the pulse charger, whose voltage is held by C19. This capacitor is charged through a current limiting resistor R52 to minimize voltage dips due to battery resistance. When the microprocessor activates Q1, C19 dumps charge into the pulse transformer, thereby providing the interrogating voltage.

Relay Control Output: The Pulse Circuit also outputs relay control through OPTA and OPTB. An optical triac, optical dry contact output, or +5 VDC output are optional output controllers.

Communication to Pulse Circuit: The microprocessor performs serial communication with the ASIC by means of the lines PO2, PO1, and P11. The main processor therefore has access to each of the accumulator registers and has control of the output relay channels.

Figures 1, 17C:
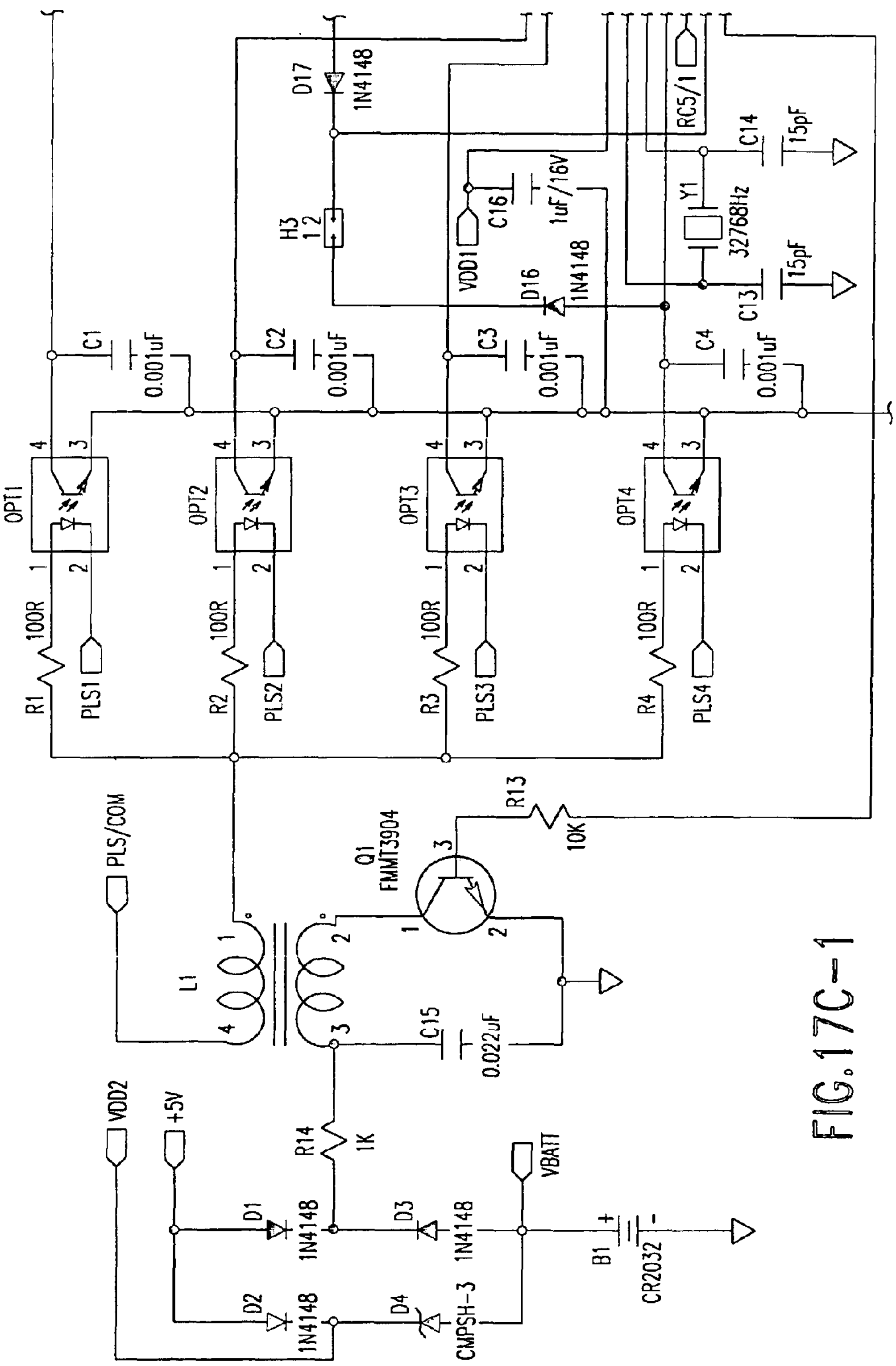
FIG. 17C shows a schematic of the pulse expansion circuit.
Figures 2, 17C:
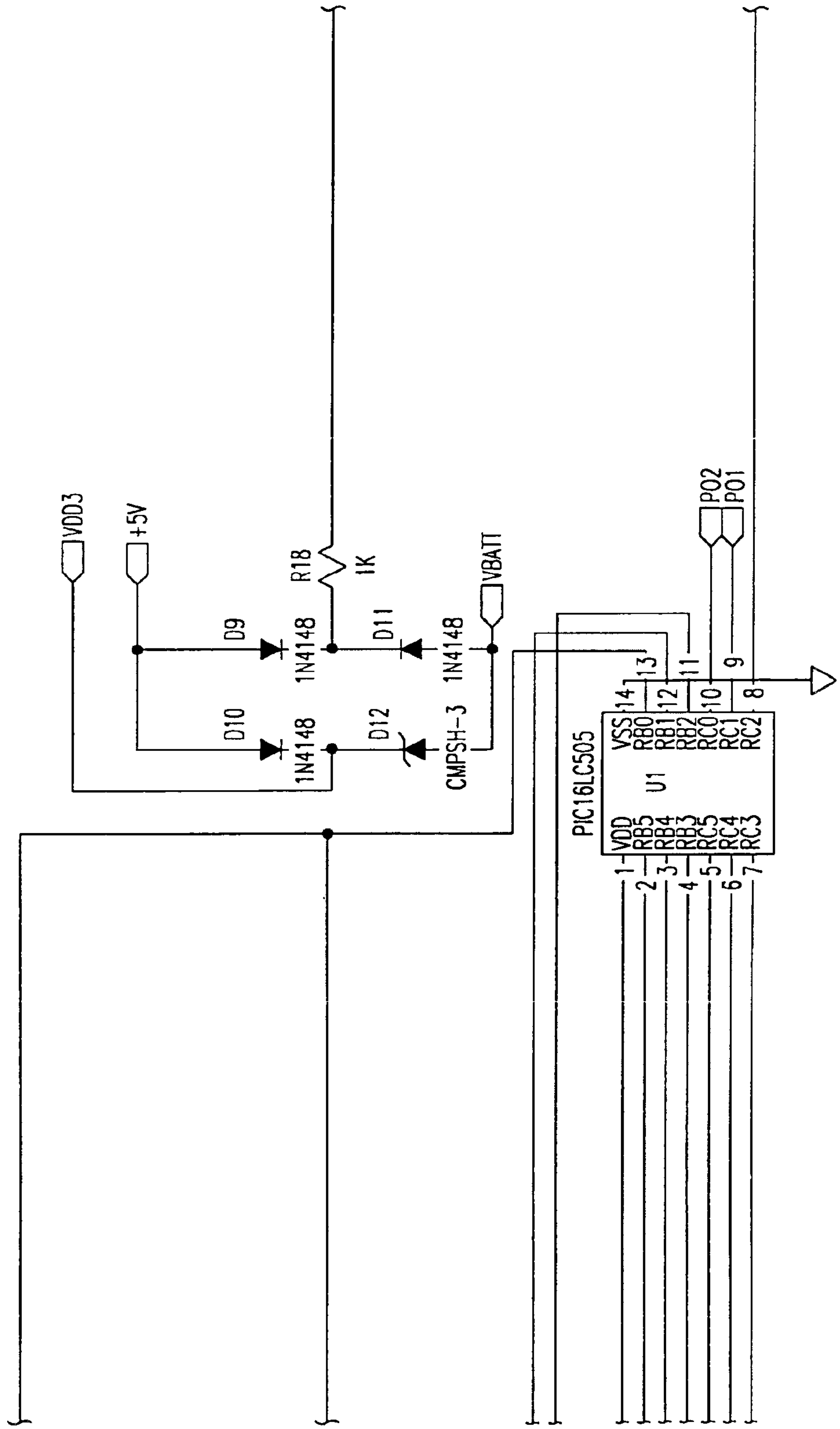
Figures 3, 17C:
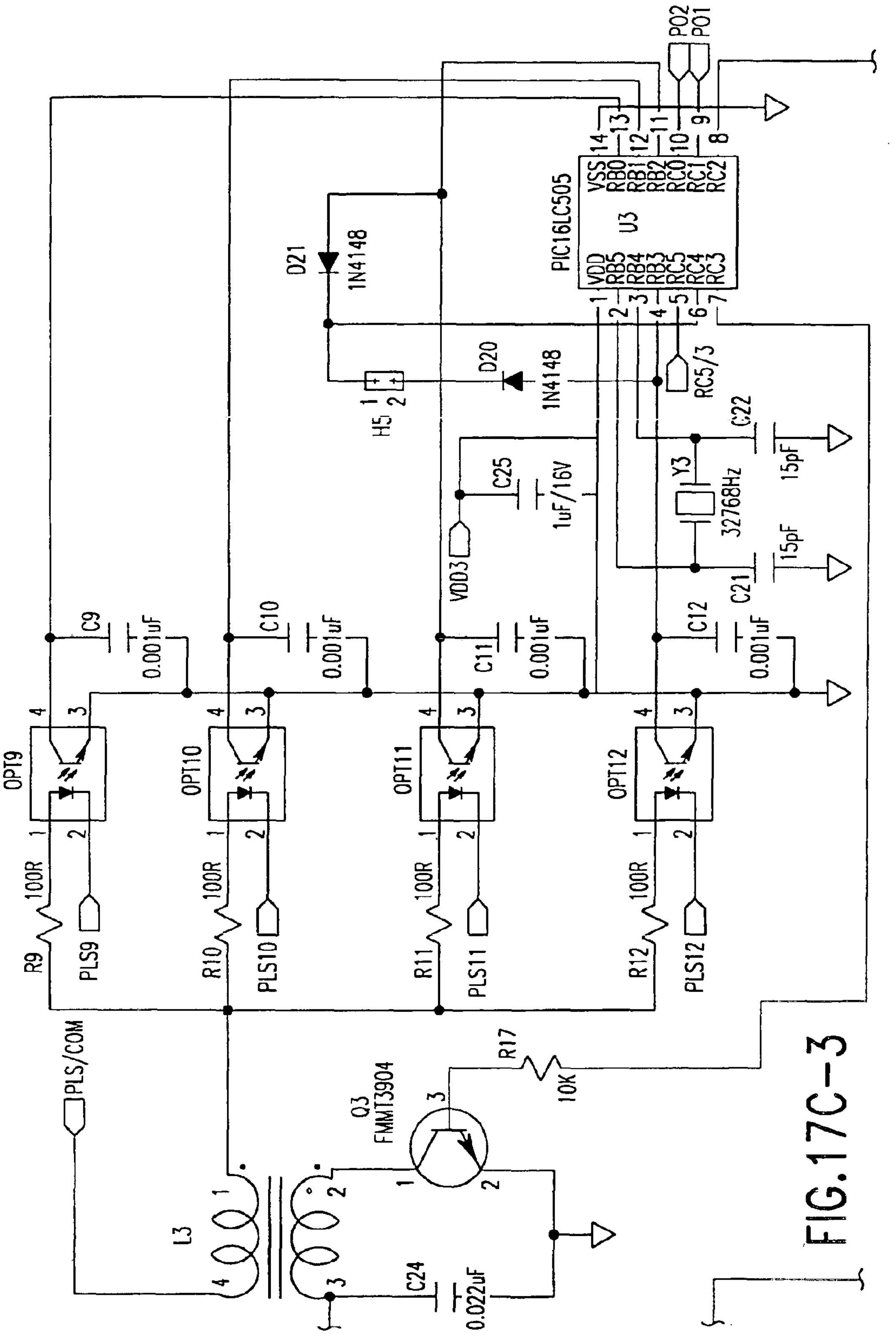
Figures 4, 17C:
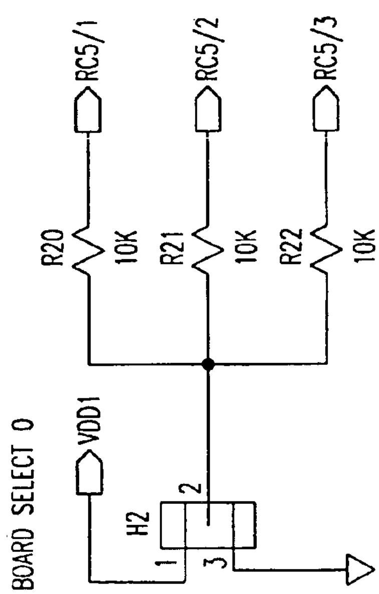
Figures 5, 17C:
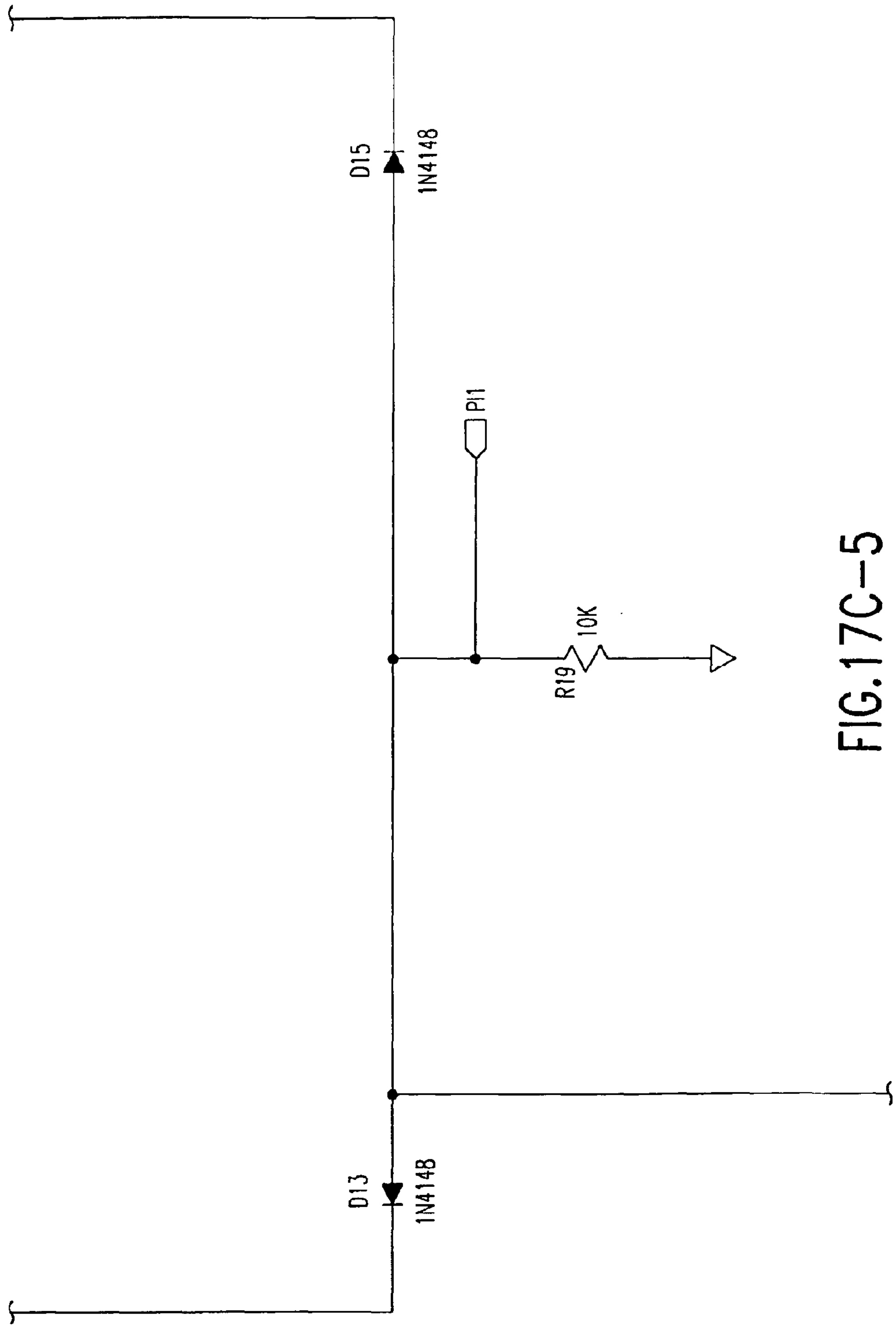
Figures 6, 17C:
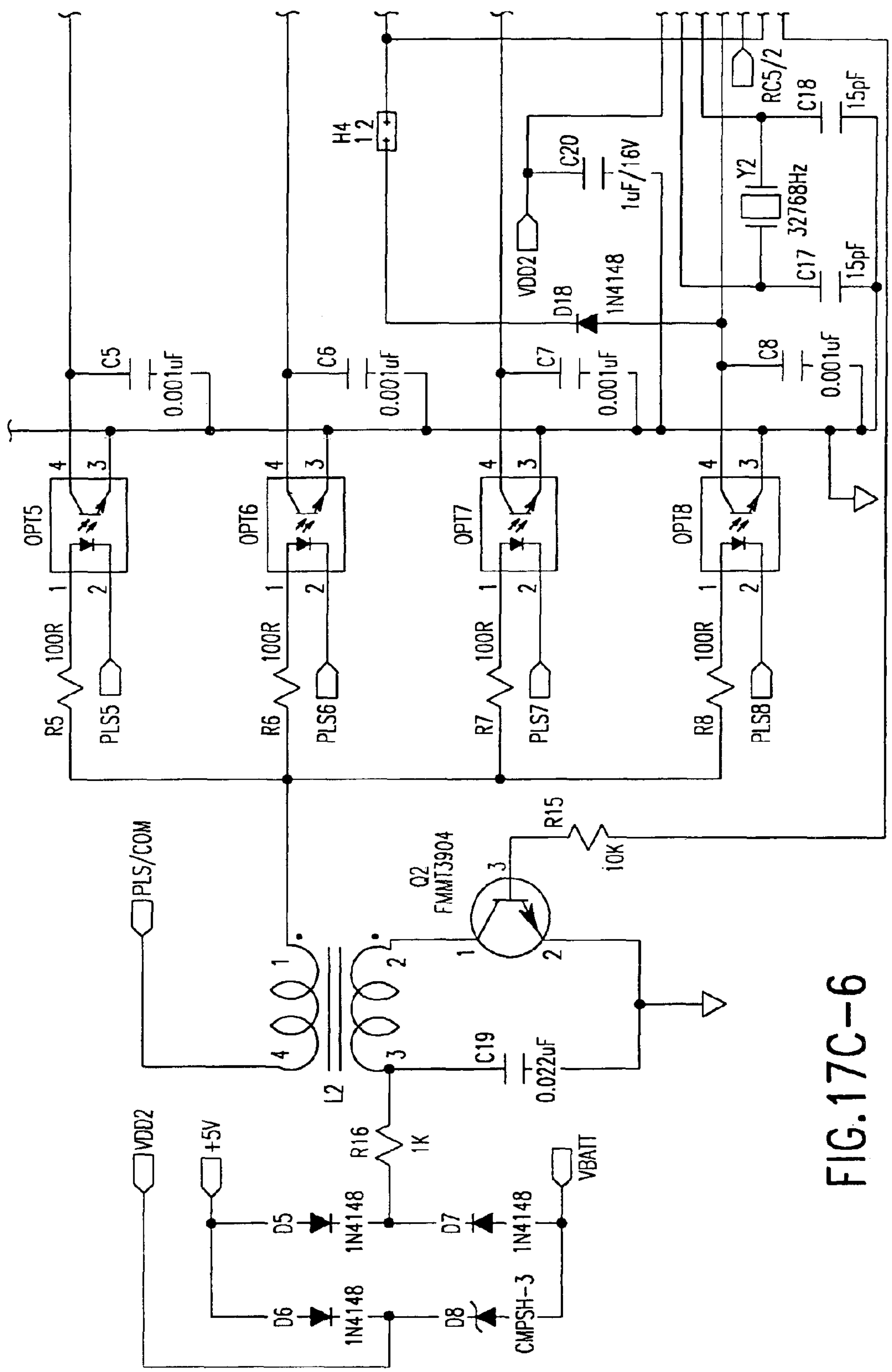
Figures 7, 17C:
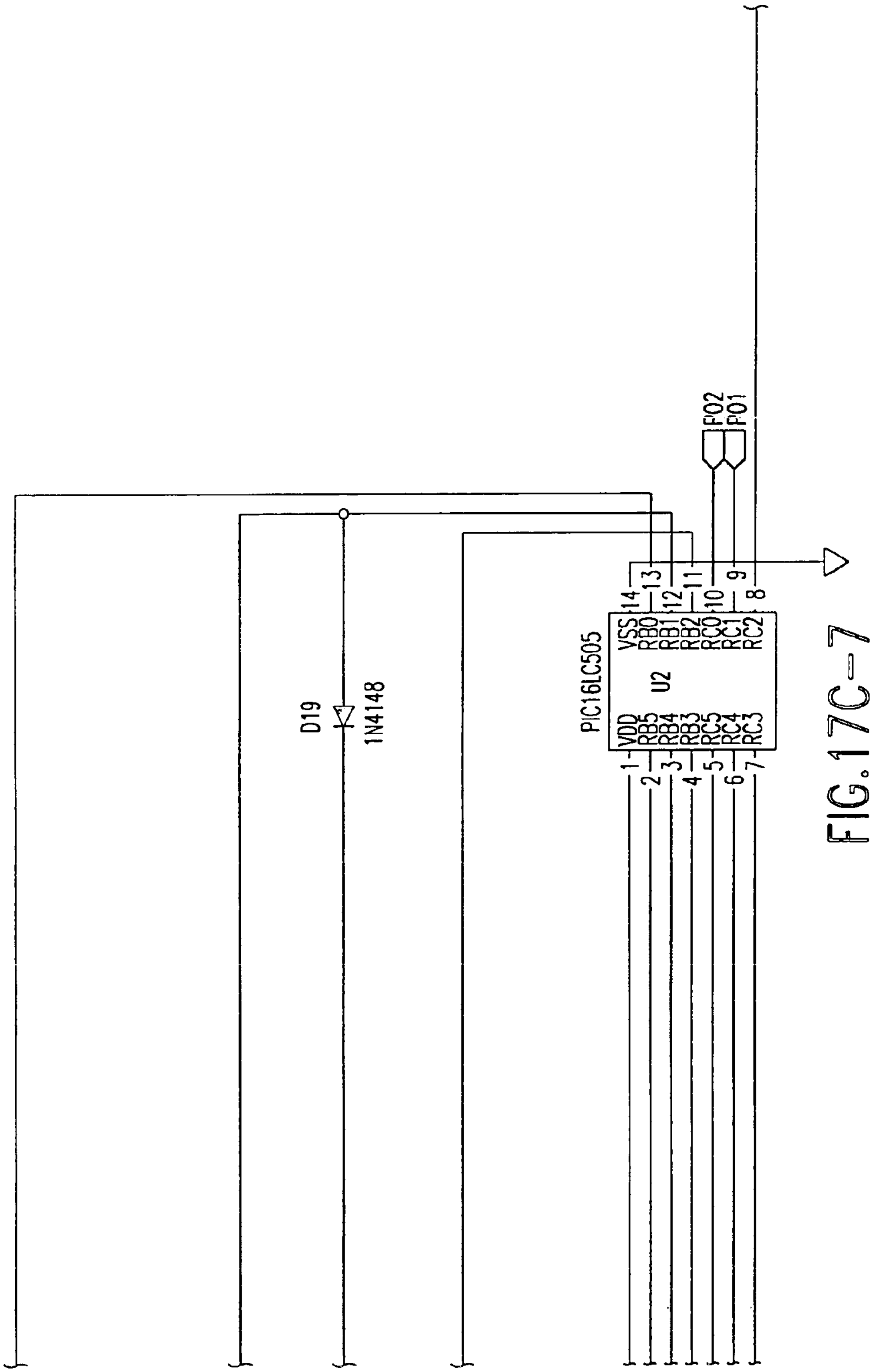
Figures 8, 17C:
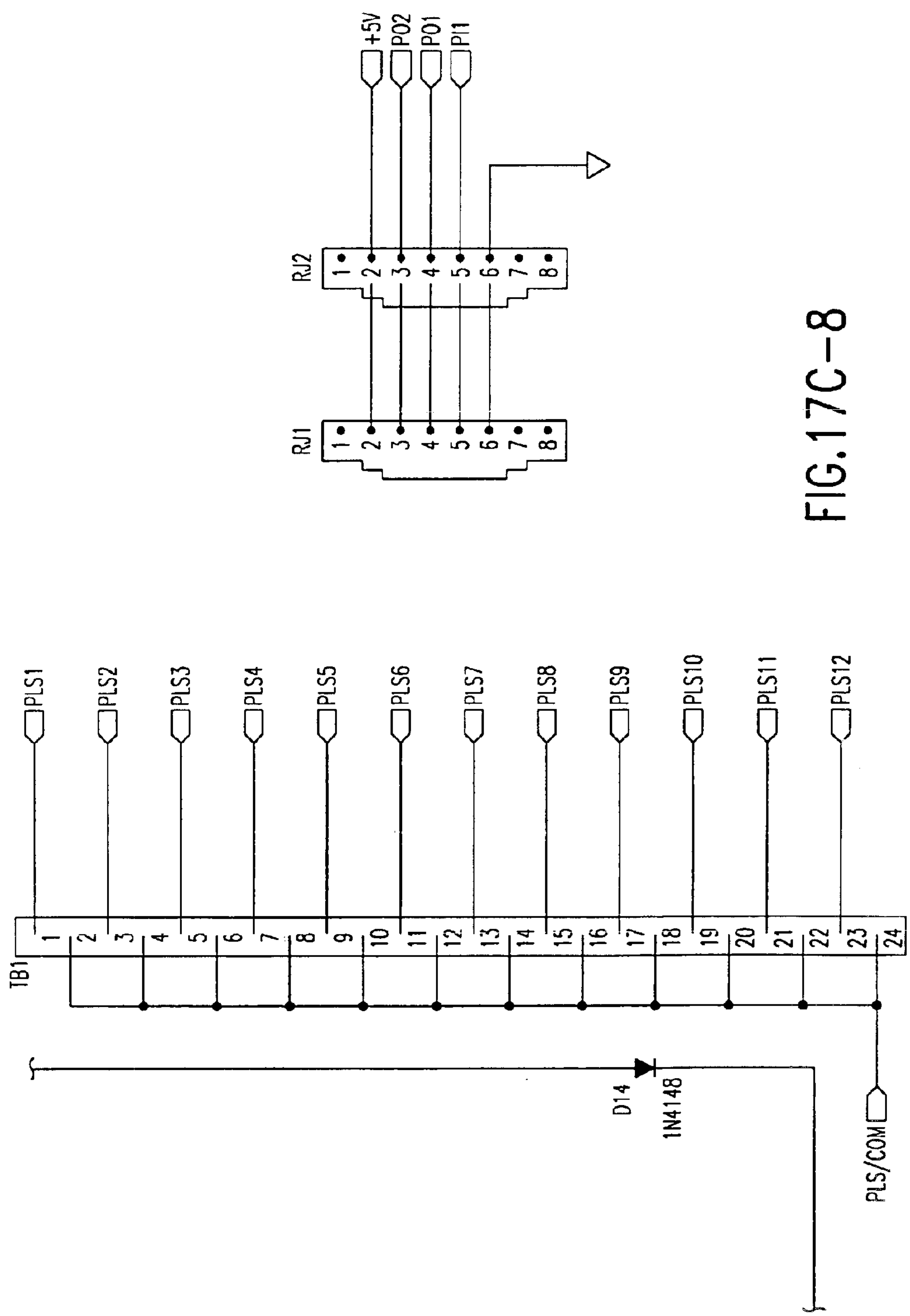
Figure 18:
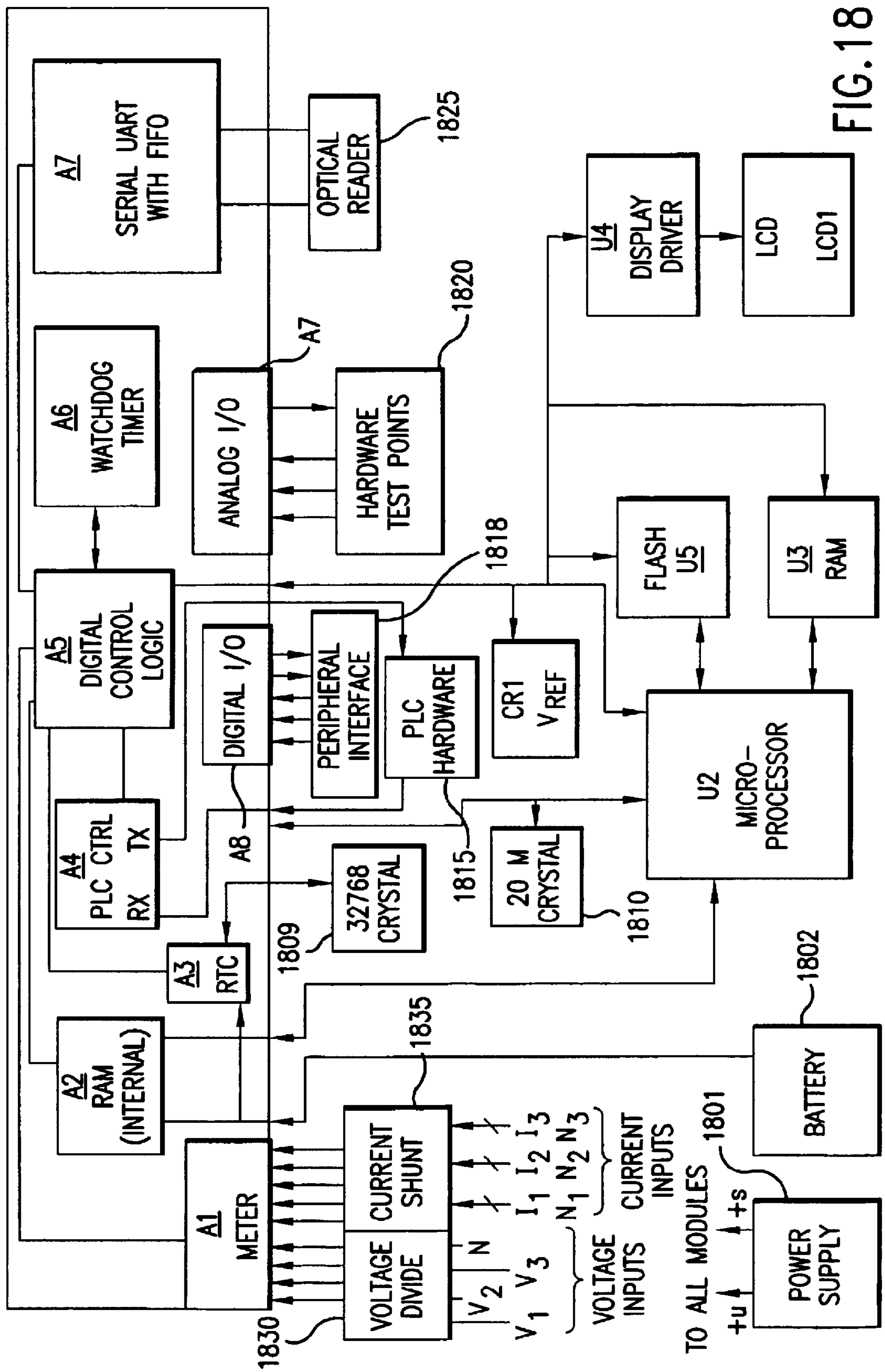
Figure 19:
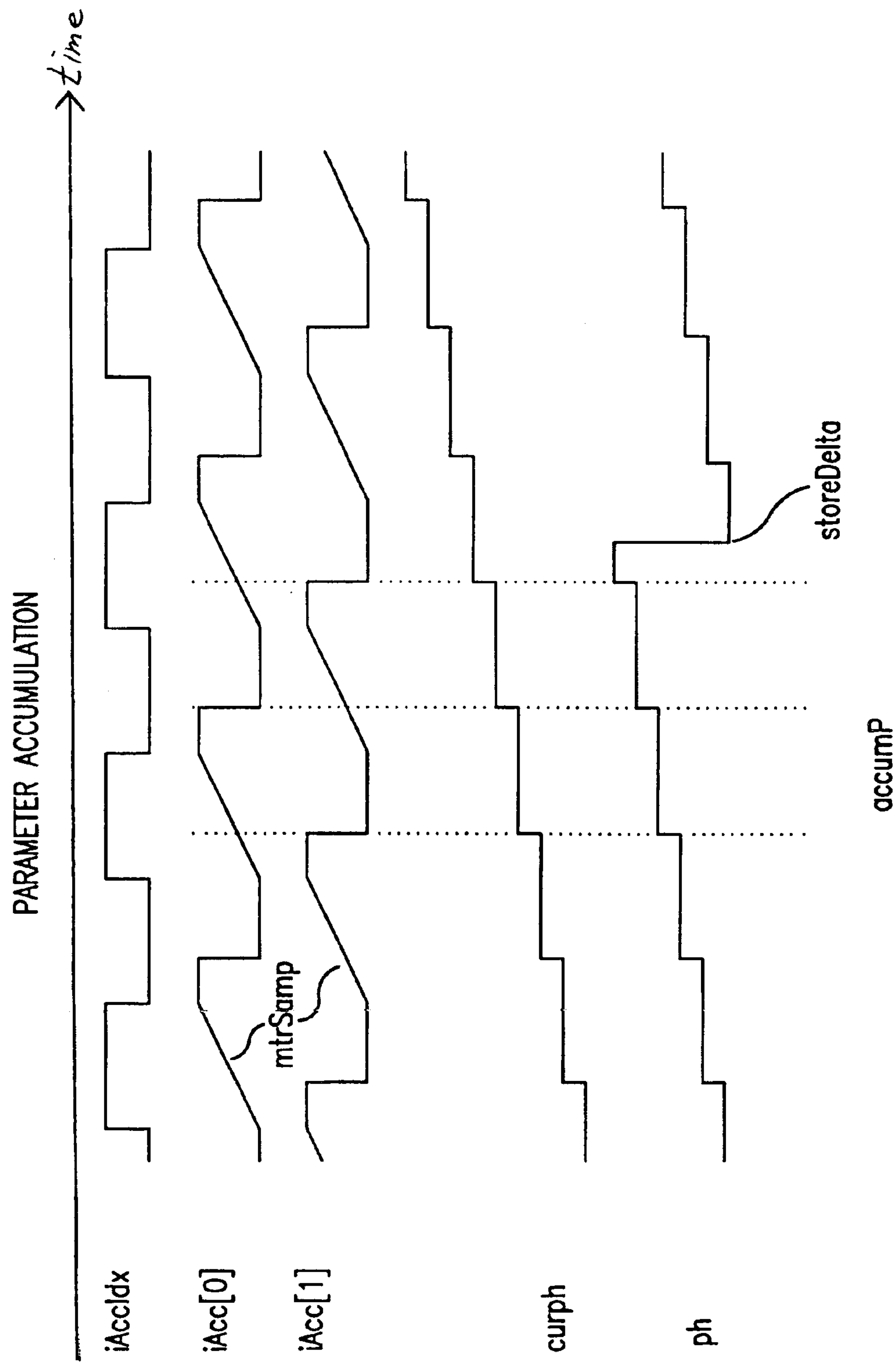

Expanded Pulse Readers: FIG. 17C shows a schematic of a preferred pulse expansion circuit. The input circuits are duplicated three times on the board for expanded metering capability. To distinguish one processor from the next, diodes D17, D19, and D21 serve to uniquely identify position. This allows all 12 inputs to be unique. In addition, four pulse boards can be serially chained to create 48 independent inputs. To distinguish the four boards, jumpers are placed in H2, H3, H4, and H5 for the processor to identify.

KYZ Circuit

The KYZ circuit provides an equivalent dry contact closure that can handle 120 VAC at the input. To prevent any momentary short circuits across the terminals Y and Z, circuitry enforces a dead period between transitions. FIG. 11B provides a KYZ schematic diagram.

The metering quantity is output through the LED signal and buffered through U2C. This waveform passes through an RC filter which slopes the edges of the square signal. This signal passes to comparators U2A and U2B. Only when the signal has traveled above 4.5 V will U2B trigger causing Y to contact K. Only when the signal has traveled below 0.5 V will U2A trigger causing Z to contact K. In the 0.5 V to 4.5 V zone, no contact is made, thereby enforcing the dead period and preventing momentary short circuits.

Mini-Closet (5A)

The Minicloset(MC) monitors a mass number of electrical metering points, saving cost and space. The price per metering point is much cheaper. Also in high-rise installations, often entire rooms are required in order to hold all the electrical meters. Because of the compact design of the MC, only a small closet is required for all the metering points. This frees up for building management extra rooms that would have otherwise been allocated for meter mounting.

Figure 15C:
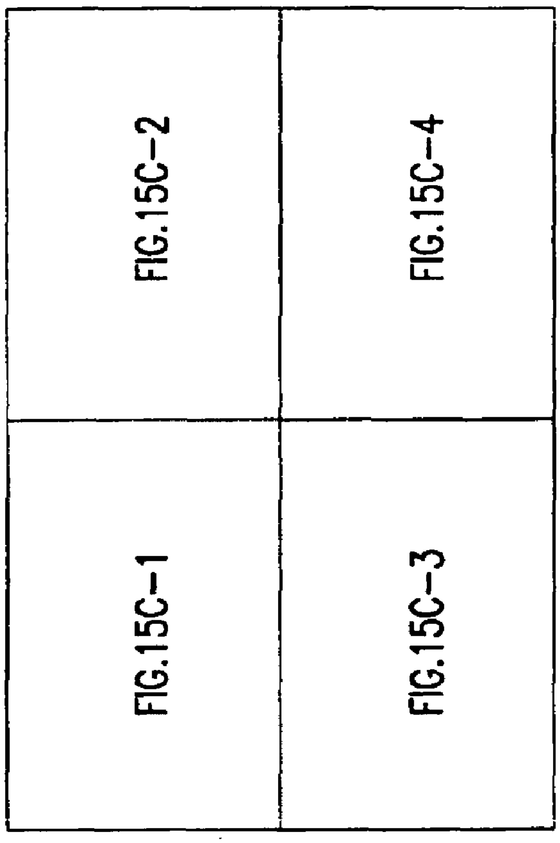
Figures 1, 15C:
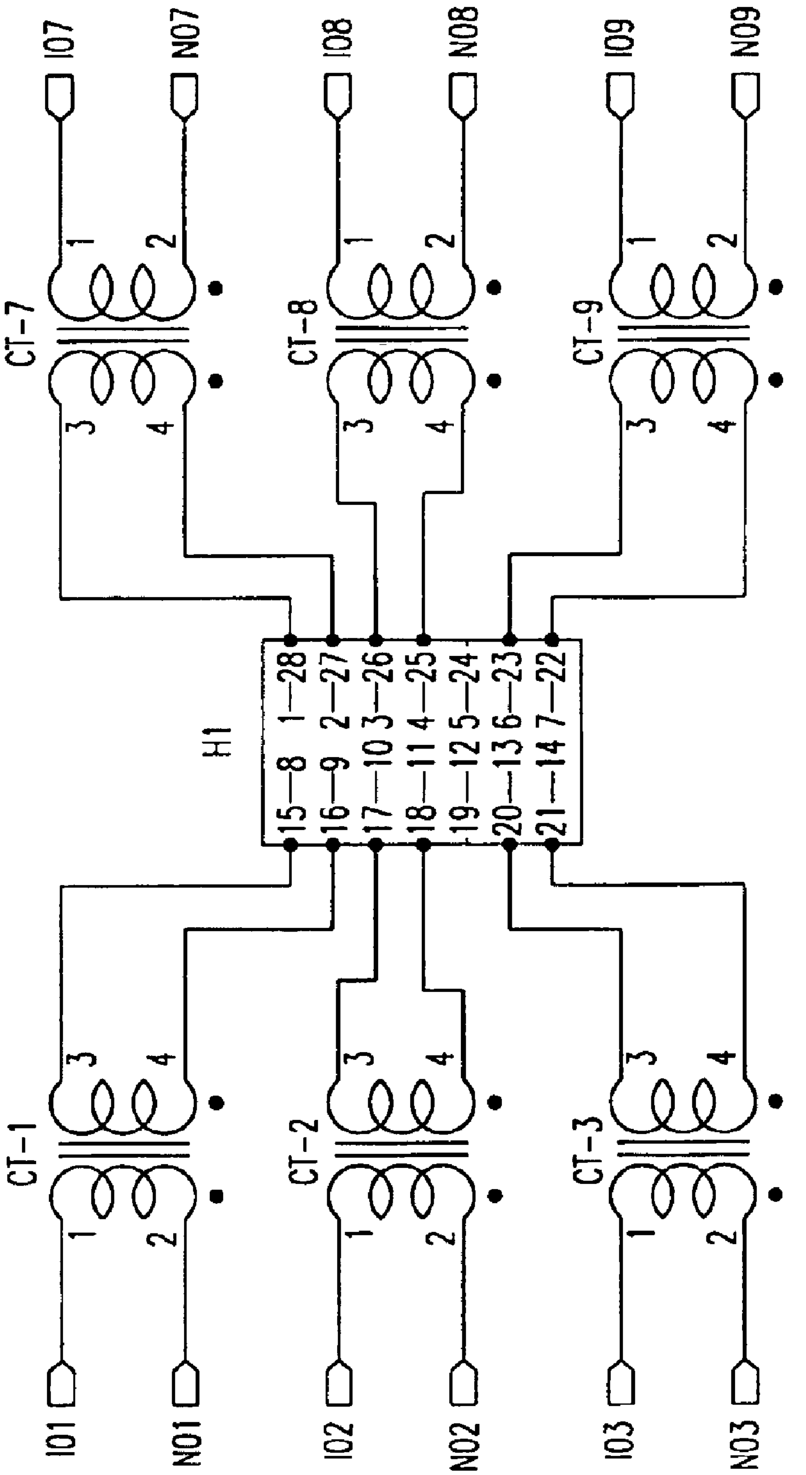
Figures 2, 15C:
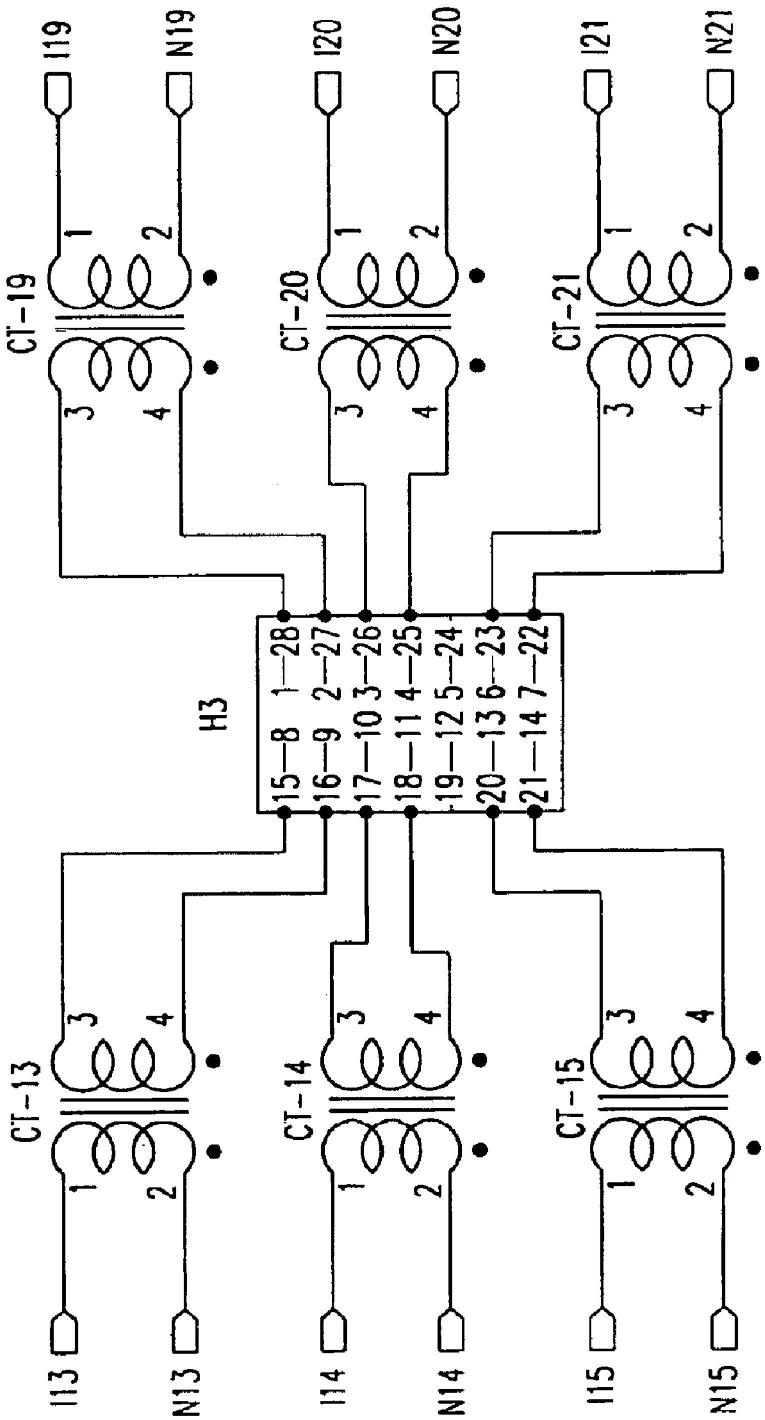
Figures 3, 15C:
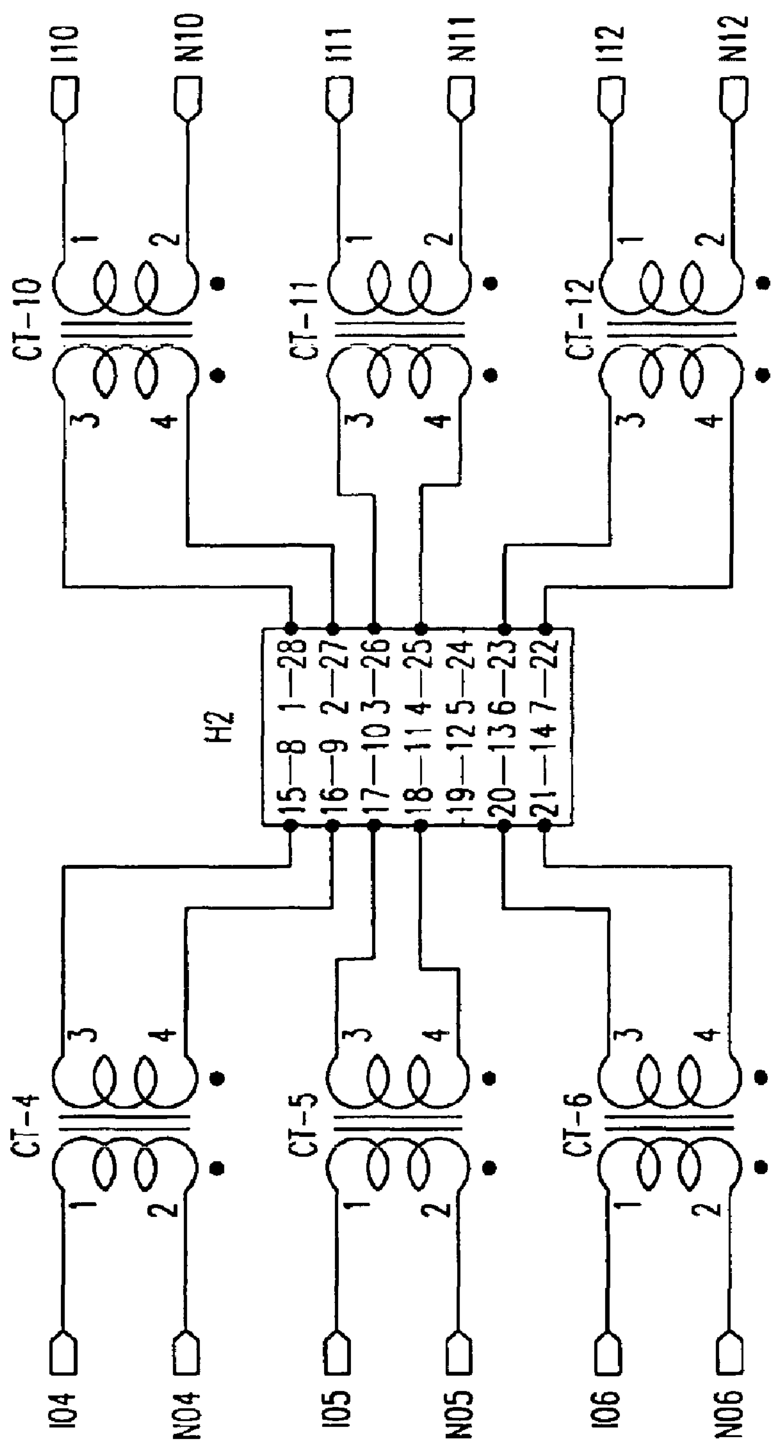
Figures 4, 15C:
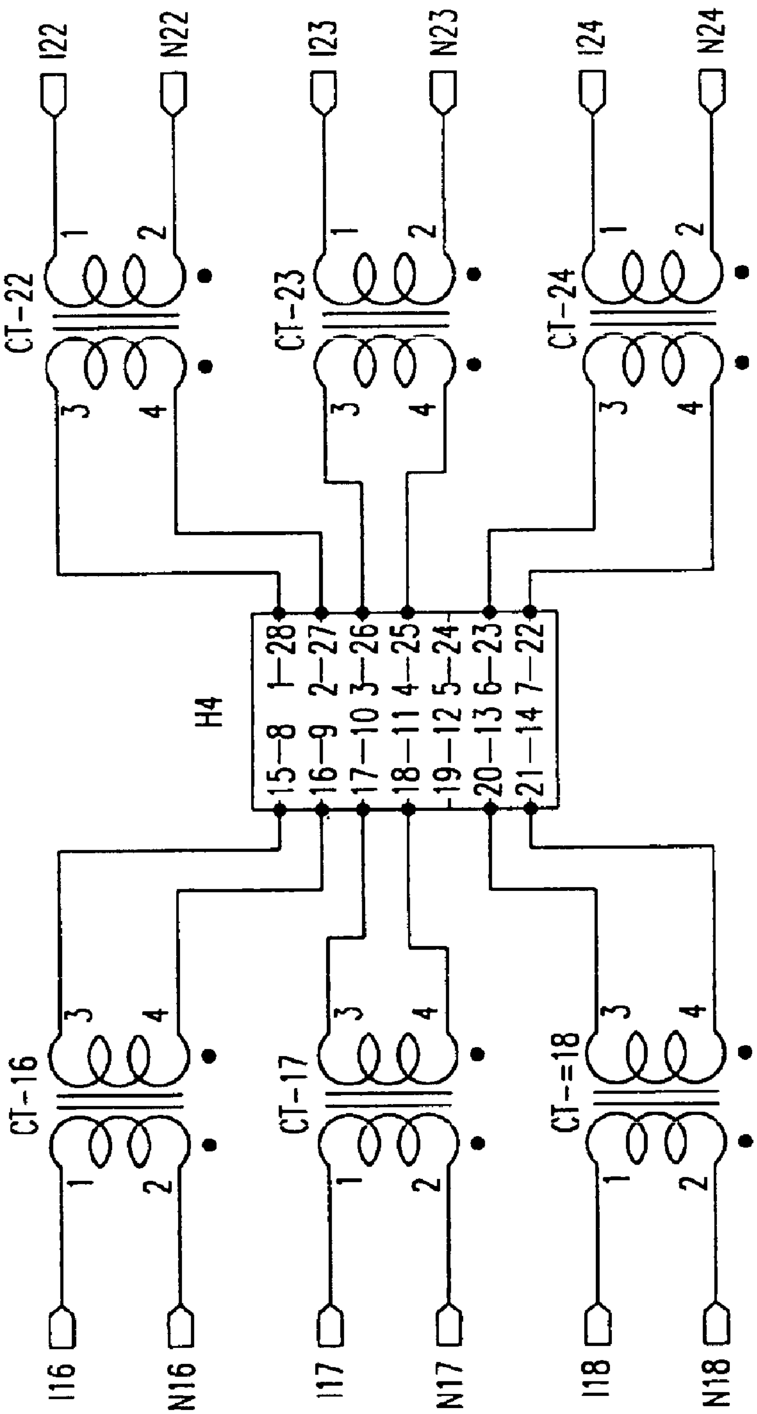
Figure 16:
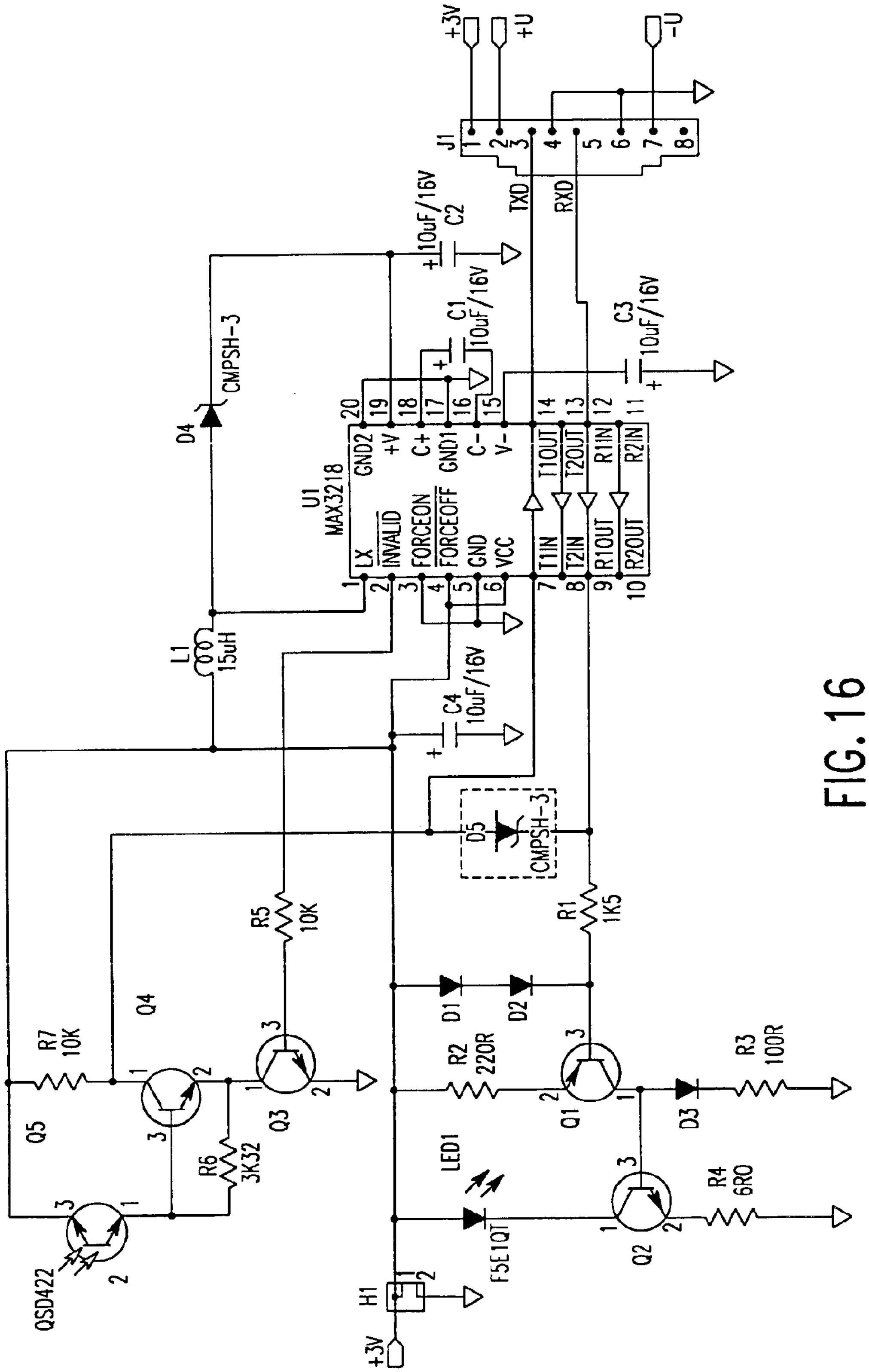

The 5A minicloset (MC) preferably monitors 24 metering points from one device. With internal 5A to 0.1 A current transformers, the MC receives current as high as SA. The MC also utilizes Internal Metering and stores its data in FLASH memory. The schematic diagram of the minicloset interface (MCI) board is shown in FIGS. 15B and 15C.

The main processor communicates to a remote microprocessor U1 and specifies which current channels to read. U1 controls the analog multiplexer (U2–U7) and gates in the desired CT outputs to the current sensing circuit.

The MC can also monitor higher current levels if external CTs are used to step down the current.

Scan Transponders

A Scan Transponder (ST) is used to communicate to each of the meters in a PLC system to collect data. The Transponder Power Board Circuit can be found in FIG. 11A. The transponder consists of four PLC communication channels: three channels to communicate along the three phases of the distribution transformer and a fourth phase to communicate along a medium tension line. The main processor communicates to the remote processor U1 through PO, $PO_2$, and P11 to control the gating of the transmitters and the receivers.

The Scan Transponder collects data from the meters by sequentially polling each meter on a scheduled basis and copying the data to its memory. The ST can be optionally equipped with a large-memory display board. The transponder can monitor electricity as well (i.e., function as an end user meter). The transponder has the ability to store additional data with an optional larger FLASH memory display board. The transponder can also periodically dump data to an even larger memory source such as a personal computer by means of a modem or a serial connection.

The ST requires that the serial numbers of each meter be cross referenced in its memory. This enables the ST to identify any meter in its cross reference table that is non-communicating. The ST also seeks optimal transfer by searching all phase, speed, and modulation combinations.

Optical Reader

An Optical Reader circuit is shown in FIG. 16. This circuit is designed for a battery source. The design uses a two stage constant current source to provide increased communication rate with transistor circuitry (Q1 and Q2).

Theft Detection

Reports indicate energy theft of 10% to 30% in some areas. A theft detection embodiment of the present invention is based on the hypothesis that theft is not evenly spread among end users. Instead, there are probably some customers who steal 50% of their energy, some who steal 100%, and many who do not steal at all. Each distribution transformer in a power distribution network can easily supply energy to hundreds of customers. Theft detection meters are preferably placed at strategic points to narrow the theft detection zone in the following ways: (I) based on the population of end users—to pinpoint known customers who are stealing; and (2) geographical area—to narrow the search area for illegal tapping.

Furthermore, in a 300 customer service area, a non-paying customer with average usage represents only a 0.3% variation in the total energy. Narrowing the theft detection zone increases the detection sensitivity. If 20 equal zones are monitored, the 0.3% variation suddenly registers as a 6% variation in one theft detection zone.

Figure 23:
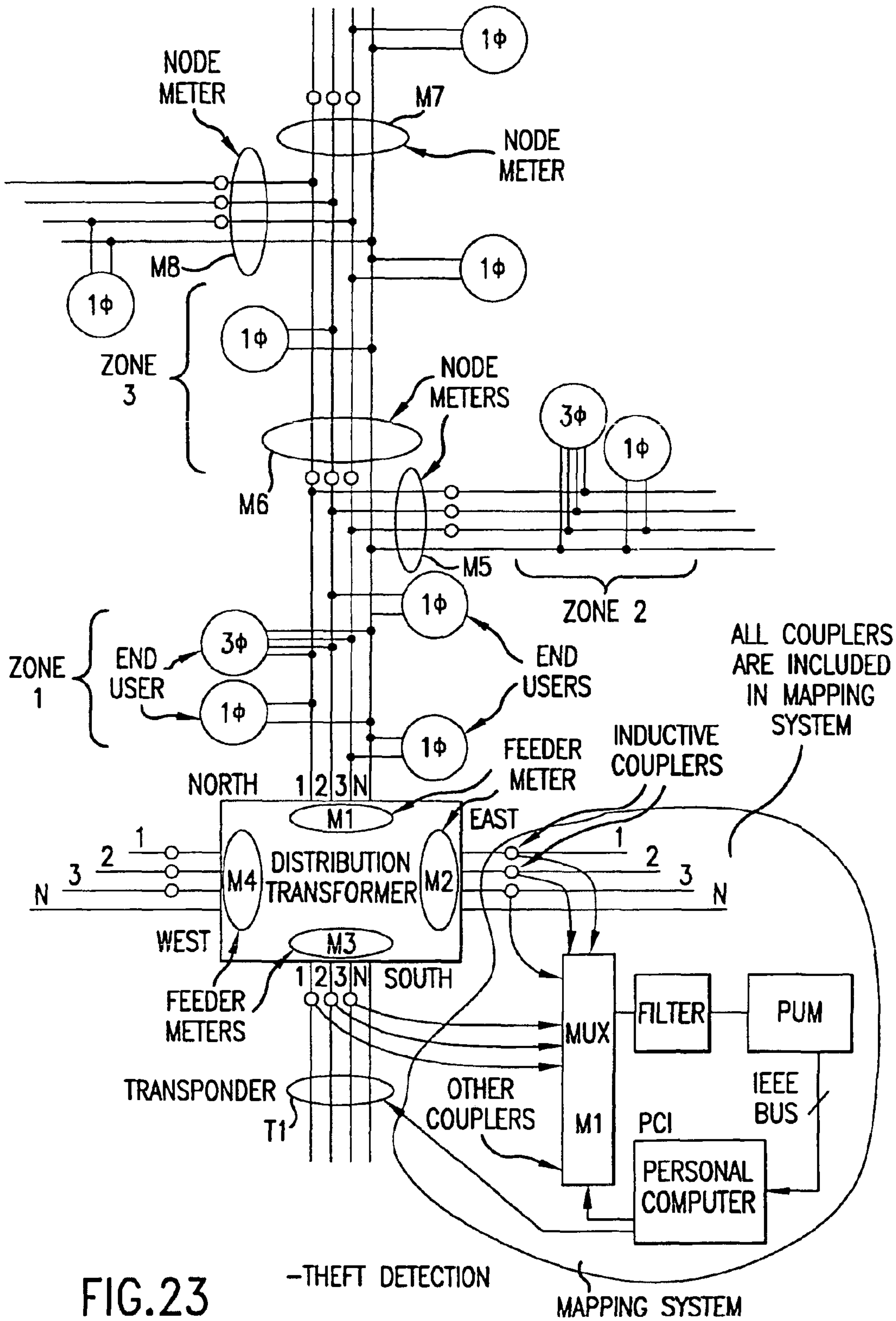
FIG. 23 depicts a preferred embodiment of the present invention used to address electricity theft.

The distribution transformer in FIG. 23 has twelve monitoring points coming from the four feeders and each of the three phases. The meters M1–M4 that monitor these points and are called Feeder Meters. By metering these 12 points, the theft detection zone reduces to 1⁄12 of the original metering points. In addition, Node Meters M5, M6, M7, and M8 further section the North branch into more detection zones. If all four feeders were sectioned into just three zones, there would be 36 different detection regions, sectioning 300 customers into 8 or 9 customer portions. For example, theft is determined in Zone I if energy theft is detected in M1 but not M5 and M6.

For the purpose of theft detection, a three phase (3ϕ) customer is treated as a customer with three 1ϕ services. This isolates the energy measurement cleanly between the phases. But for the sake of accurate demand billing, 3ϕ customers must be 3ϕ metered. If separate phases achieved equal peak demand but in non-coincident demand intervals, the customer who was billed as three 1ϕ could be overcharged for demand. Thus, a preferred 3ϕ meter is capable of being read either as three 1 meters or one 3ϕ meter, thereby satisfying both conditions. Likewise a minicloset can be considered as twenty-four 1ϕ meters and a 2ϕ meter can be considered as two 1ϕ as well. This enables the Theft Detection system to work with customers of 1ϕ, 2ϕ, and 3ϕ meters and of 24ϕ Mini-closets, including any combination of such customers.

A transponder T1, located at the distribution transformer, gathers meter data from all Feeder Meters $P_F$, Node Meters $P_N$, and the End User Meters.

This system accomplishes the following: (1) isolation of theft location to a very small circuit branch; and (2) isolation of theft instance in time.

Isolation of theft location comprises the following steps:

(1) Check node meters that are furthest out, ones that have no other node meters in their branch. Here, M7, M8, and M5. A node meter consumption that registers higher than the sum of its end user meters indicates theft.

(2) Check node branches that are closer to the generator. Here, M6. Consumption in M6 that registers higher than the sum of MS, M6, and any end users in this zone indicates theft.

(3) Keep checking node branches down until node branches are the feeder wires, themselves from the generator.

Isolation of theft instance in time: Using interval metering, theft detection can be applied to each metering interval to isolate the theft instance. The precision of time identification is determined by the metering interval.

Theft network mapping: theft detection requires a network map of all meters interconnections. However since an accurate electrical routing diagram from the distribution transformer is not always available, there is need for a mapping scheme. A Theft Detection Mapping System of a preferred embodiment performs the following tasks: (1) stores data identifying all Feeder, Node, and End User Meters; (2) associates End User Meters to Node branch and Feeder Meters; and (3) identifies the phase arrangement of multi-phase meters. For example, in a three-phase meter, phase 1 of the distribution transformer output might not be connected to phase 1 of the meter. This too needs to be recorded in the network map.

The network mapping system does not have to be included in the permanent installation. After mapping is done, the transponder remembers the position of all of the meters, and the mapping system can be recycled to map other distribution transformers. A personal computer (PC1) is preferably the master controller of the mapping process. Inductive couplers are place on feeder wires and node wires to identify return PLC signal strength. The outputs of these inductors are multiplexed (under control of PC1) through a sharp bandpass filter and into a DVM (such as HP34401A). PC1 reads the signal level from the DVM through the IEEE bus.

Meter identification: PC1 instructs the transponder to gather the serial numbers of all meters that exist on the network. The transponder sequentially requests an echo from the active meters on all three phases. When a meter receives the request from the transponder, it sends back its serial number to the transponder.

End user meter (phase) mapping: 1ϕ meter—The phase that the transponder reads with the greatest signal strength is metering phase of this meter. Alternatively, the phase can be determined in another way. The bit rate must be set equal to the line frequency. Because of phase lock, the bit transitions occur at the zero crossings of the line voltage. If the return signal from the meter has zero-crossings with the transponder metering phases, then the meter is said to be on transponder phase A (TϕA). If there is a +120° shift, it is said to be on transponder phase B (TϕB). And the remaining phase is transponder phase C (TϕC).

3ϕ meter—Because Phase 1 of the meter might not be connected to Phase 1 of its Node Meter, mapping is required to identify phase arrangement Like the 1ϕ meter, the transponder sends out a PLC signal with the bit rate equaling the line frequency. But this time it is the 3ϕ meter that compares the PLC bit-transitions to the zero crossings of each of their metering phases. From these comparisons, the meter determines which metering phases are connected to TϕA, TϕB, and TϕC. The Node Meter repeats the process to identify the phase mapping relationship. These relationships are transmitted back to the transponder to correlate the phases of the Node meters with its 3ϕ meter.

Feeder mapping: PC1 communicates to the transponder through its optical port to instruct a meter to send a 30-second message. The computer PC1 polls each of the couplers for signal strength. The coupler with the strongest signal indicates feeder position.

Node mapping: Starting at the farthest node meters, couplers are placed at these meters and checked for signal strength returning from the meter. If a signal is not present, couplers are moved down one node at a time and are again tested for return signal strength. The process repeats until all nodes are mapped.

In a further embodiment, mapping the locations of meters is used to locate line breakages. This embodiment comprises a method of determining the location of a break in a powerline electricity distribution network that has microprocessor-controlled end user electricity meters operative to communicate with a remotely located computer. The method comprises the steps of: (1) mapping the location of each end user meter; (2) periodically receiving data from each end user meter in response to a query to that meter; (3) when a plurality of meters in the same branch of the network fail to report during a given period, querying meters in neighboring branches to pinpoint the location of a break. Such queries, used in conjunction with the network map, will locate the break (at least to the resolution provided by the locations of the query-able meters) in a few seconds, thus reducing the time typically required to find a break by having line repair personnel visually inspect the lines until the break is spotted.

In a further embodiment, a personal computer (PC) is connected to a Scan Transponder and issues commands to the ST to continuously sequentially poll each meter for an echo. When multiple meters fail to echo, the ST correlates the serial numbers of these meters on an electrical distribution map (obtained by the Theft Detection mapping scheme, for example). If the non-communicating meters lie on the same distribution path, the PC hypothesizes that there is power line breakage at the point on the map where the meters fail to communicate.

Virtual Meter

Figure 24:
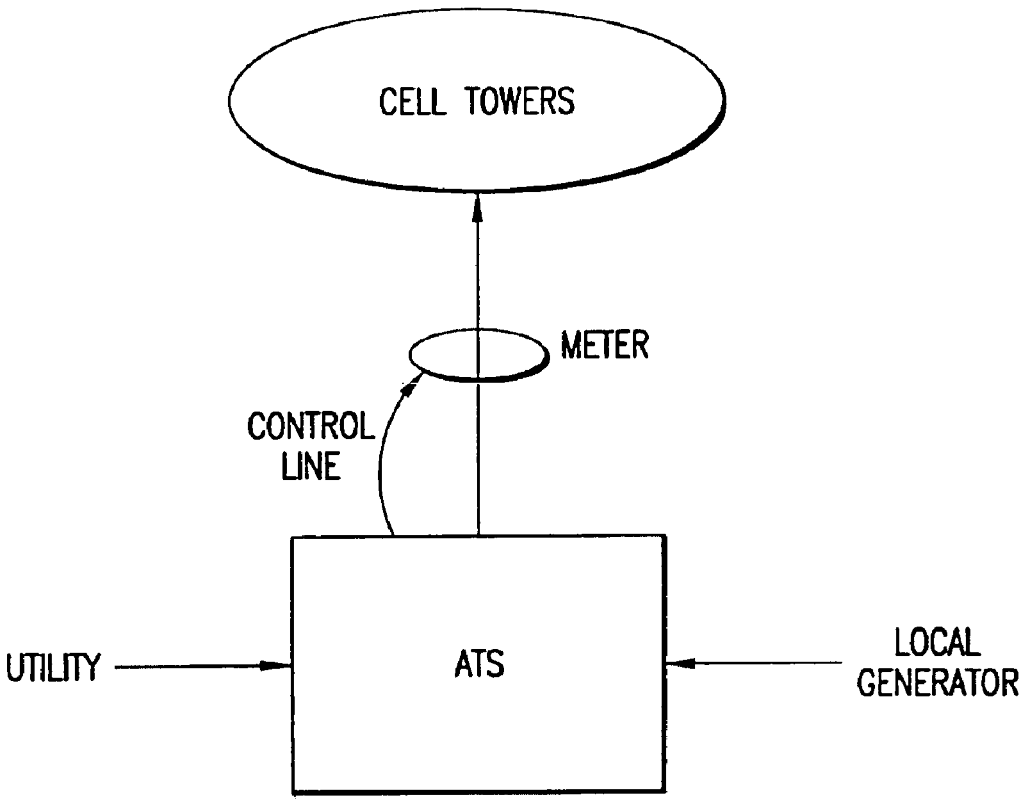
FIG. 24 depicts a system configuration for preferred embodiment of a virtual meter.

In a preferred embodiment (an example using an Automatic Transfer Switch (ATS) is depicted in FIG. 24), a single meter can monitor consumption from two or more sources—for example, a utility and a local generator—and store the data into separate corresponding sets of data registers. In the example illustrated in FIG. 24, a logical control signal line from the ATS is connected to the meter. When power comes from the utility, the meter stores metering data into a first set of data registers. When utility power is interrupted and the ATS delivers power from the local generator, the control line from the ATS triggers the meter to store metering data into a second set of data registers. When utility service is restored, the ATS switches the power source back to the utility and releases the control line; metering data is once again stored in the first set of data registers. Those skilled in the art will recognize that this embodiment can be applied to more general situations wherein there are multiple power sources and the meter receives a signal indicating when to switch metering data storage to another set of data registers.

Credit and Prepay Meters

Credit and Prepay meters of a preferred embodiment address the problems with present credit and prepay systems. No operator is needed to enter the house since all transactions are performed by PLC. Fraud-prone swipe cards are not needed since a remote utility operator handles the energy purchase and deposits the amount to the meter by PLC.

Prepay Meters: In a prepay embodiment of a preferred system, energy is purchased by an end user customer from a system operator (typically, a utility operator) in advance. The operator deposits the purchased energy to the customer's meter by PLC. When the customer has reached his prepaid limit, the meter cuts power to the household. The LCD display preferably alternates (i.e., displays each for a pre-defined period, then displays another) between the following displays, for example: (1) "Deposit $50 Jan. 23, 2001"; (2) "Remaining $23.45" (present amount remaining); and (3) "Estimated Cutoff 11:43 Feb. 28, 2001" (based on present consumption).

Credit Meters: In a credit embodiment of a preferred system, energy is purchased on credit. When the customer fails to pay his bill, an operator can terminate power by instructing the meter through PLC. The LCD display alternates between displaying the following quantities, for example: (1) "Last Bill: $62.53 Dec. 15, 2000"; (2) "Consumption: 45623.453 kWhr" (consumption on last bill); (3) "Projected Bill: $59.35 Jan. 23, 2001" (Jan. 23, 2001 is end of present billing cycle); and (4) "Cost per kWhr $0.15."

In a preferred embodiment, an operator also, when desired, remotely programs meters to cut off power when certain parameters are met or exceeded. For example, a customer with inferior credit may have his power temporarily discontinued when he uses 10 amps, when he uses 5 amps, or when his allotted consumption level is exceeded. The hardware and methodology for such remote programming are disclosed above.

Printing Meter

In a further embodiment, submeters are equipped with printers. In this embodiment, the utility still polls the meters for data through PLC and therefore has control over billing information. The utility calculates the bill and data is downloaded to the meter for local printing. Since the local printer is under utility control, the utility can initiate the printing of other messages through PLC as well. Such other messages may include billing receipts, rate changes, and usage profiles.

This is a useful feature in situations where it is inconvenient for a meter reader to enter the house to read the meter (for example, in countries or cultures where a male meter reader is not permitted to read the meter if the husband is not at home), or where local mail service is not reliable for sending invoices.

Disabling Customers Using GFI

This embodiment allows a utility to inexpensively disconnect a customer by taking advantage of an existing Ground Fault Interrupt (GFI) capable of interrupting power to the customer. For example, in Europe most residential customers are equipped with a whole-home GFI. The GFI is a protective circuit that shuts down power during anomalous current flow. In a preferred embodiment, when the utility wants to remove service to a customer, the utility sends a PLC signal to the meter. The meter then activates the GFI with onboard circuitry. The utility may want to deactivate customers for demand-side management applications or when customers fail to pay their bills.

Figure 25:
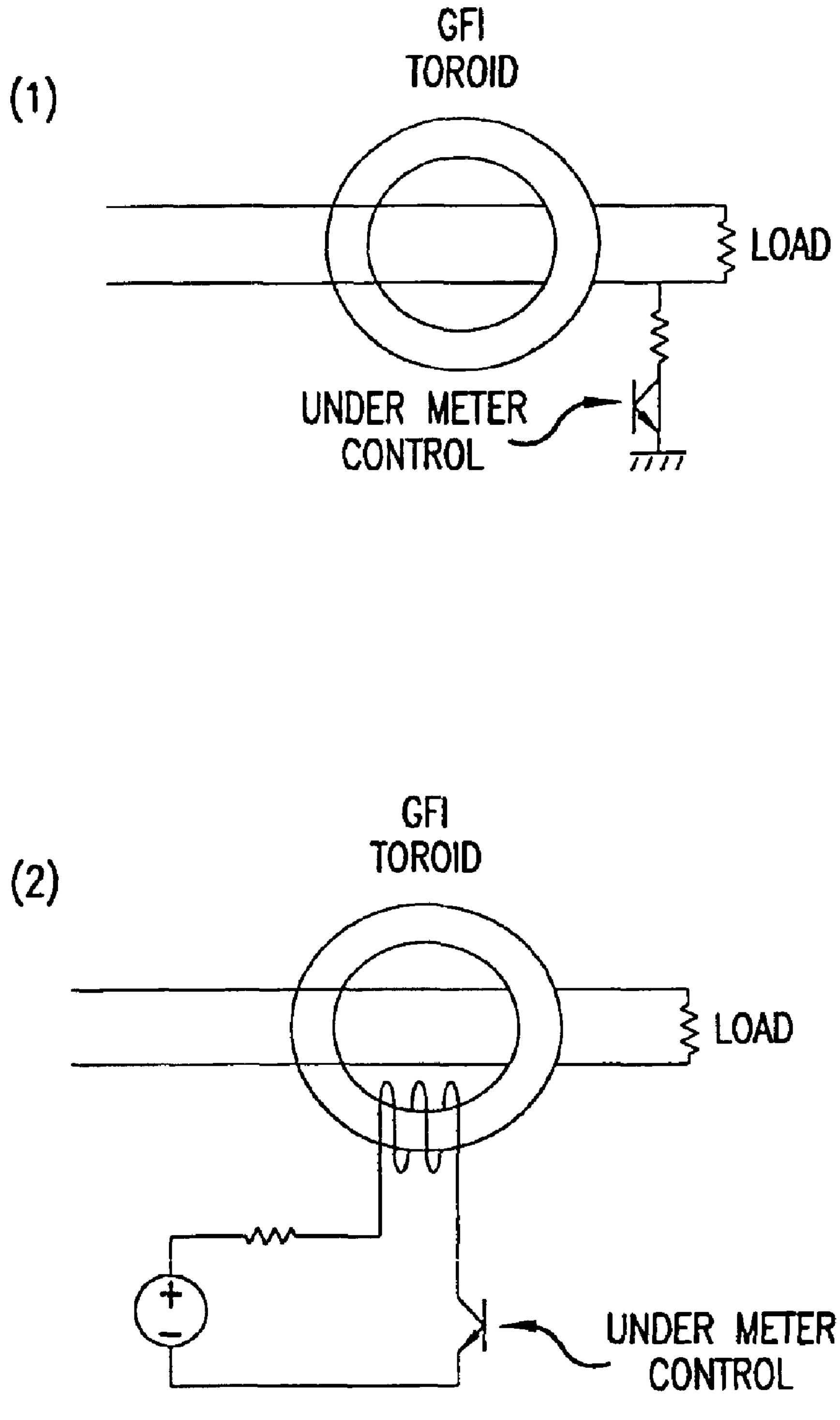
FIG. 25 depicts two preferred configurations for power interruption using GFI.

The meter preferably trips the GFI (see FIG. 25) either by (1) initiating a small leakage to earth ground, or (2) coupling a small amount of current into the GFI toroid.

APPENDIX

The following files are contained in this Appendix (in order):

Transponder S-record file

Minicloset S-record file

Transmeter 3-phase S-record file (38230102.S)

ROM Boot S-record file

RAM Boot S-record file

Modem Hex file

Transponder Hex file

Pulse Hex file

Minicloset Hex file

Transponder S-Record File

```
S0030000FC
S315000000000E00674000235980001A1DC0001A1E6BB
S315000000100001A1F00001A1FA0001A2040001A2184A
S315000000200001A2220001A1D20001A2360001A236DF
S315000000300001A2360001A2360001A2360001A23656
S315000000400001A2360001A2360001A2360001A23646
S315000000500001A2360001A2360001A2360001A23636
S315000000600001A20E0001A22C0001A22C00008CC8E7
S315000000700012A720001A22C0001D46C0001A22CFE
S315000000800001A2180001A2180001A2180001A2187E
S315000000900001A2180001A2180001A2180001A2186E
S315000000A00001A2180001A2180001A2180001A2185E
S315000000B00001A2180001A2180001A2180001A2184E
S315000000C00001A2400001A2400001A2400001A2409E
S315000000D00001A2400001A2400001A2400001A2408E
S315000000E00001A2360001A2360001A2360001A236A6
S315000000F00001A2360001A2360001A2360001A23696
S315000001000001A22C0001A22C0001A22C0001A22CAD
S315000001100001A22C0001A22C0001A22C0001A22C9D
S315000001200001A22C0001A22C0001A22C0001A22C8D
S315000001300001A22C0001A22C0001A22C0001A22C7D
S315000001400001A22C0001A22C0001A22C0001A22C6D
S315000001500001A22C0001A22C0001A22C0001A22C5D
S315000001600001A22C0001A22C0001A22C0001A22C4D
S315000001700001A22C0001A22C0001A22C0001A22C3D
S315000001800001A22C0001A22C0001A22C0001A22C2D
S315000001900001A22C0001A22C0001A22C0001A22C1D
S315000001A00001A22C0001A22C0001A22C0001A22C0D
S315000001B00001A22C0001A22C0001A22C0001A22CFD
S315000001C00001A22C0001A22C0001A22C0001A22CED
S315000001D00001A22C0001A22C0001A22C0001A22CDD
S315000001E00001A22C0001A22C0001A22C0001A22CCD
S315000001F00001A22C0001A22C0001A22C0001A22CBD
S315000002000001A22C0001A22C0001A22C0001A22CAC
S315000002100001A22C0001A22C0001A22C0001A22C9C
S315000002200001A22C0001A22C0001A22C0001A22C8C
S315000002300001A22C0001A22C0001A22C0001A22C7C
S315000002400001A22C0001A22C0001A22C0001A22C6C
S315000002500001A22C0001A22C0001A22C0001A22C5C
S315000002600001A22C0001A22C0001A22C0001A22C4C
S315000002700001A22C0001A22C0001A22C0001A22C3C
S315000002800001A22C0001A22C0001A22C0001A22C2C
S315000002900001A22C0001A22C0001A22C0001A22C1C
S315000002A00001A22C0001A22C0001A22C0001A22C0C
S315000002B00001A22C0001A22C0001A22C0001A22CFC
S315000002C00001A22C0001A22C0001A22C0001A22CEC
S315000002D00001A22C0001A22C0001A22C0001A22CDC
S315000002E00001A22C0001A22C0001A22C0001A22CCC
S315000002F00001A22C0001A22C0001A22C0001A22CBC
S315000003000001A22C0001A22C0001A22C0001A22CAB
S315000003100001A22C0001A22C0001A22C0001A22C9B
S315000003200001A22C0001A22C0001A22C0001A22C8B
S315000003300001A22C0001A22C0001A22C0001A22C7B
S315000003400001A22C0001A22C0001A22C0001A22C6B
S315000003500001A22C0001A22C0001A22C0001A22C5B
S315000003600001A22C0001A22C0001A22C0001A22C4B
S315000003700001A22C0001A22C0001A22C0001A22C3B
S315000003800001A22C0001A22C0001A22C0001A22C2B
S315000003900001A22C0001A22C0001A22C0001A22C1B
S315000003A00001A22C0001A22C0001A22C0001A22C0B
S315000003B00001A22C0001A22C0001A22C0001A22CFB
S315000003C00001A22C0001A22C0001A22C0001A22CEB
S315000003D00001A22C0001A22C0001A22C0001A22CDB
S315000003E00001A22C0001A22C0001A22C0001A22CCB
S315000003F00001A22C0001A22C0001A22C0001A22CBB
S3150000040000034C4000023598000235980016E7ECC
S315000004100001FEC000142D600014S3E0001C11A52
S315000004200001DE260001DAEC00004A1A00004E0642
S315000004300004EFC000214AA00000AB2000019F8DF
S3150000044000004248000008F3E0000E99A0000F9785B
S315000004500001134C4000140760001445A00015B6E7D
S3150000046000017C260001A9660001AEB20001C7D8D2
S315000004700001DAA800020306000206GE000206D09A
S31500000480000207320002192400000B7AA000010A4D7
S315000004900001F80000353800016EB200017CD2DA
S315000004A000017D4600017E000001C80E0001DA94BD
S315000004B000008CAC0000976C0001271A0001DAD806
S315000004C00001DE2600016E0A00017BE600001EC266
S315000004D0000097A20001199A00013BF2000148D6DC
S315000004E00017140000175840001D66C00002054A3
S315000004F00000E9C200011C24000134D80001407646
S3150000050000016B4800016F2C0001BDD20001DA3AF0
S3150000051000004EFC00011B4C00013EA600016D6A66
S3150000052000018B1E0001B8CE0002135E00021C649F
S31500000530000BB5A000175B60000296200004F7426
S3150000054000015B5A000202F200001A6A000097C618
S31500000550000141FA000147720001C822000200E2D0
S31500000560000220140001 5BC00001C836000232748C
S315000005700002026600002138E000223340002237C6E
S315000005800002286000022828000227800002 27B8FF
S3150000059000227F00002333C0002349000002029E63
S315000005A00002135E000223B4000224080002 2BAAF4
S315000005B000022B4600022AE000022A1400022A7AD0
S315000005C000023358000234AC3E1985F33E16096129
S315000005D000003E16096100003E16096100003E1645
S315000005E009610000BE1609610000BDDE46C80000B4
S315000005F0BDB3AF410000BD700F0100003D35DCD337
S3150000060000003D06B68900003CD9CCAC00003C9108
S315000006107D750000BC5C70840000BC2349DD0000D1
S31500000620BC03FFED0000BBB05A0300003B85998771
S3150000063000003B45ECED00003B1FFFE900003AD50A
S31500000640C2710000BAA1F0650000BA6FEBE10000CF
S31500000650BA41F0600000BA018D1E00003EF94F94C9
S31500000660 3F794F943E794F943EF94F943DF94F941C
S31500000670 3E794F943D794F943DF94F948000800028
S3150000068080008000800080008000800080000800064
S3150000069080008000800080008000800080000800054
S315000006A080008000800080008000808080808044
S315000006B080008000800080008000800080000800034
S315000006C08000BB80000000000000000000000000069
S315000006D000180018001800 18001A0018001800 1852
S315000006E00018001A00150015000000000000001A8E
S315000006F00018001800150015001500 18BDA00A0006
S31500000700BDA00A00BDA00A00BDA00A003DA00A00C7
S315000007103D8834163D6FC2463D36E6DBBCC1FC9BC8
S31500000720BCEAB454BC914EF5BC5DB2FA3BEB22ADCB
S3150000073 03BC81D843BB021A53B865CF5BB0EB1A062
S31500000740BAF29063BAD57E1EBAA2DD493A2CBC270E
S315000007503A13022C3A0163B539C56951000101000B
S315000007600051143280000000000000000000000006C
S31500000770000000000000000000000000000000000073
S31500000780426 96C6C696E6700000000000000000000A2
S31500000790000000000000000000000000000000000053
S315000007A0000000000000FFFF0000FFFF0000FFFF49
S315000007B0000000000000000000000000000000000033
S315000007C0000000000000000000000000000000000023
S315000007D0000000000000000000000000000000000013
S315000007E0000000000000000000000000000000000003
S315000007F00000000000000000000000000000000000F3
S3150000080000000000000000000000000000000000000E2
S3150000081000000000000000000000000000000000000D2
S3150000082000000000000000000000000000000000000C2
S3150000083000000000000000000000000000000000000B2
S3150000084000000000000000000000000000000000000A2
S31500000850000000000000000000000000000000000000092
S315000008600000000000000000000002FA2E3FF3F543C
S3150000087 07AE1BF0000003F000000000000004B9836
S3150000088 0968042200000428C0000358F2A6337860E
S31500000890 37BD3D80000042652EE00002DC8E00027E
S315000008A0DC970002DCA40002DCB10002DCC200021C
```

S315000008B0DCCF00000000000048E7013E33C000A086
S315000008C00000598F4EB900015B6E2A7C00C053842C
S315000008D0247C00C053882C7C00C0983A4A3900C05A
S315000008E05247670A34B900C05292600001880C155D
S315000008F00003632E4A3900C05252672670003012 38
S3150000090 02E8048573F3C00013F3C002E4EB9000068
S31500000910 71EA4A406700015E48790002C2D8600069
S3150000092 0014C287C00C05245267C00C052444A1522
S3150000093067284A1466144A1366104A14661C4A133A
S315000009406 6184A3900C05250661042153F3C0014E2
S315000009504EB9000073666000011C4A3900C0524659
S315000009606 6244A14670A203900C05288B096671672
S315000009704A13670001007000301222 3900C0528409
S31500000980B280660000F07E04700010074A3308004B
S3150000099067564240100759404 8C0E588068000C0A7
S315000009A0987820402F1070001007E588068000C058
S315000009B0528420402F104EB9000258444A406628FF
S315000009C00C0700076518207900C0985C082800020B
S315000009D00003670A0839000600804017670A103CC2
S315000009E000FDD0071A80600852070C0700096398BB
S315000009F04A3900C0524E672448790002C2E92F39AD
S31500000A0000C052AC4EB9000258444A40660E1ABCA9
S31500000A10000613FC000100C04D426006423900C0CA
S31500000A204D424A15634E4240101506400014 3F00E1
S31500000A304EB9000073664A3900C0524F66362F160B
S31500000A4048790002 9ED848790002C2F24EB90002E7
S31500000A5043564FEF000C2F3900C000FA3F3C0043CD
S31500000A604EB900000E1E48790002C3084EB90002B6
S31500000A704356588F4A3900C05251660C4A15631CBA
S31500000A804A3900C0525067143F122F164B790002A7
S31500000A90C30B4EB9000243564FEF000A4240588F2F
S31500000AA033C000A000024CDF7C804E754E714E7143
S31500000AB04E712F0733C000A00004598F3F3C002E13
S31500000AC043EF00024EB90000738E4A97670E205717
S31500000AD02E28001033C700C05388601B203900C084
S31500000AE0983A223C000003E84EB9000270903 3C0E9
S31500000AF000C053885B8F33C000A000062E1F4E75C5
S31500000B004E714E714E7148E7033E33C000A0000897
S31500000B104FEFFFF23E2F002E2C2F00302A6F0034AD
S31500000B2030070C40004A67080C40006A67026012F2
S31500000B30203C0001518022064EB900027B582F400E
S31500000B400000A0C47004A670A0C47006A67042F46EA
S31500000B50000A48574EB900000FEE204F2F28000A12
S31500000B604EB90000145C1E80287C0002438C3007BE
S31500000B700C40004367200C400054671A0C40004D9F
S31500000B80675A0C40006367540C400074674E0C4073
S31500000B90005367786074 4240102F00023F004240C5
S31500000BA0102F00053F004240102F00083F004879F3
S31500000BB00002C34F2F0D4E944FEF000E0C2D002058
S31500000BC00003673E0C2D0020000666081B7C0030E3
S31500000BD0000660381B7C00300009603042 40102F50
S31500000BE000033F004240102F00063F0048790002F4
S31500000BF0C35E2F0D4E944FEF000C0C2D002000030A
S31500000C00660A1B7C003000036002421547EF0005B0
S31500000C1045EF00062C7C00E0000830070C4000433E
S31500000C20673E0C40006367380C40004A67400C4042
S31500000C300044673A0C40004D670000D80C40006D38
S31500000C40670000DE0C40006A670000D60C40005AC0
S31500000C50670001320C40005367000174600001A474
S31500000C6048790002C3682F0D4EB9000258122F0DA5
S31500000C704EB90002664 82E0010164A00670E0C0098
S31500000C80000167260C000002673E6064204F3F2883
S31500000C90000842 40102F00073F004240102F000A74
S31500000CA03F0048790002C36A603A204F3F28000897
S31500000CB04240102F00083F004240102F00093F001D
S31500000CC048790002C376601C4240102F00053F00A1
S31500000CD04240102F00083F00204F3F28000C487963
S31500000CE00002C382487570004E944FEF000E6002FA
S31500000CF042163007 48C0D08D52802840600C0C1434
S31500000D0000020660418BC0030528C4A1466F060005D
S31500000D1000F248790002C38E2F0D4EB90002581218
S31500000D2010164A0067100C000002670A0C0000014A
S31500000D306728600000CE4240102F00053F00424069
S31500000D40102F00083F0048790002C3902F0D4EB9BE
S31500000D50000266484875080060224240102F0006CF
S31500000D603F004240102F00073F0048790002C39819
S31500000D702F0D4EB900026648487508004E944FEF95
S31500000D800000C607E4240102F0001534048C0E588A9
S31500000D90068000027C9E20402F102F064EB90000D0
S31500000DA0145C4A40670848790002C3AA600648797D
S31500000DB00002C3AE48790002C3A02F0D4EB900024F
S31500000DC066484875080 04E944FEF0010603442 4064
S31500000DD0102F00033F004240102F00063F00424004
S31500000DE0102F00093F004240102F000C3F00204FFB
S31500000DF03F28001048790002C3AF2F0D4E944FEFE5
S31500000E0000124FEF000E33C000A0000A4CDF7CC07A
S31500000E10205F4FEF000A4ED04E714E714E7133C0B7
S31500000E2000A0000C4FEFFFD80CAFEE6B2800002E91
S31500000E3063082F7CEE6B2800002E4857204F2F2882
S31500000E400032204F3F2800346100FCBC48574EB9A1
S31500000E5000024356588F4FEF002833C000A0000E03
S31500000E60205F5C8F4ED04E714E714E712F0D33C088
S31500000E7000A00010518F2A6F0010202D000A723C2E
S31500000E804EB9000270901B4000022F01202D000A6F
S31500000E904EB9000274A42F0043EF00084EB90002B9
S31500000EA04F901B6F00030003487800182 04F2F282F
S31500000EB0000843EF00084EB900024F901B6F000375
S31500000EC00004202E0004508F33C000A000122A5FB8
S31500000ED0205F588F4ED04E714E714E7148E7070411
S31500000EE033C000A00014598F2A6F00183E2F001C33
S31500000EF0300702800000FFFF80FC000748405200D8
S31500000F001B40000152473007028000 00FFFF80FCB3
S31500000F1000B7E248064007C63B40000860 04526D31
S31500000F2000083F2D0008700030072F4000024EB920
S31500000F3000019FBA2217B28062E4303CFFFFD06DF9
S31500000F4000083F004EB900019FBA9E403F2D0008A1
S31500000F504EB900019FEE3A003007EA481B400006F2
S31500000F6060045 22D00060C2D000D0006642A4A4529
S31500000F7066044246600E0C2D0002000654C0440072
S31500000F8048803C004240102D00063F004EB900014B
S31500000F90A01ED046BE4062CA4A4566044206601498
S31500000FA04240102D000653400C4000025CC0440035
S31500000FB048803C004240102D000653403F00100779
S31500000FC01F4000054EB90001A01ED006912F000358
S31500000FD01B6F00030005588F33C000A000164CDFBE
S31500000FE020E0205F5C8F4ED04E714E714E7148E707
S31500000FF0010433C000A000182A6F000C2F2D000A30
S3150000100004EB90000145C1A80670806AD00000E1089
S31500001010000A2F0D6100FE562E003F072F0D6100BE
S31500001020FEBC4A15670804AD00000E10000A33C066
S315000010300 0A0001A4CDF2080205F588F4ED04E71E2
S315000010404E714E7133C000A0001C518F3F3C000111
S31500001050 43EF00024EB9000073C641D72F280004A3
S3150000106 02F3900028746 48790002C3DE4EB90002D6
S31500001070 43564FEF000C3F3C000143EF00024EB9D0
S3150000108000 0073C641D72F103F3C00634EB90C00E5
S3150000109 00E1E4240508F33C000A0001E4E754E718A
S315000010A04E714E7133C000A0002033C000A0002254
S315000010B04E754E714E714E7133C000A00024202F24
S315000010C00004226F000C206F0008600210D951C87E
S315000010D0FFFC0480000100006 4F233C000A000267B
S315000010E0205F4FEF000C4ED04E714E714E7133C0E3
S315000010F000A00028202F0004226F000C206F00089B
S31500001100600210D951C8FFFC04800001000064F29F
S31500001110 33C000A0002A205F4FEF000C4ED04E7166
S315000011204E714E7133C000A0002C202F0004226F98
S3150000113 0000C206F0008600230D951C8FFFC048003
S3150000114 00001000064F233C000A0002E205F4FEFC4
S3150000115 0000C4ED04E714E714E7133C000A000305F
S3150000116 0202F0004226F000C206F0008600230D987
S31500001170 51C8FFFC04800001000064F233C000A0E7
S3150000118 00032205F4FEF000C4ED04E714E714E7103

S315000119033C000A00034202F0004226F000C206F03
S31500011A00008600220D951C8FFFC0480000100003D
S31500011B064F233C000A00036205F4FEF000C4ED023
S31500011C04E714E714E7133C000A00038202F0004BE
S31500011D0226F000C206F0008600220D951C8FFFC66
S31500011E004800001000064F233C000A0003A205FD2
S31500011F04FEF000C4ED04E714E714E7133C000A0B1
S3150001200003C202F0004226F000C206F00081239CA
S31500012100080000842390080000860022 0D951C8C9
S315000001220FFFC04800001000064F213C10080000886
S315000123033C000A0003E205F4FEF000C4ED04E7131
S31500012404E714E7133C000A00040202F0004226F63
S3150001250000C206F0008600420D920D951C8FFFA7D
S315000126004800001000064F033C000A00042205F4B
S31500012704FEF000C4ED04E714E714E7133C000A030
S315000012800044202F0004226F000C206F0008123942
S315000012900080000842390080000860042 0D920D967
S31500012A051C8FFFA04800001000064F013C10080F9
S31500012B0000833C000A00046205F4FEF000C4ED060
S31500012C04E714E714E7133C000A00048202F0008A9
S31500012D0206F00046002421851C8FFFC0480000120
S31500012E0000064F233C000A0004A205F508F4ED049
S31500012F04E714E714E7133C000A0004C202F000875
S3150001300206F00046002421851C8FFFC04800001EF
S315000131 0000064F233C000A0004E205F508F4ED014
S31500013204E714E714E7133C000A00050202F000840
S3150001330206F00046002425851C8FFFC048000017F
S3150001340000064F233C000A00052205F508F4ED0E0
S31500013504E714E714E7133C000A00054202F00080C
S3150001360206F00046002425851C8FFFC048000014F
S3150001370000064F233C000A00056205F508F4ED0AC
S31500013804E714E714E7133C000A00058202F0008D8
S3150001390206F00046002429851C8FFFC04800001DF
S31500013A0000064F233C000A0005A205F508F4ED078
S31500013B04E714E714E7133C000A0005C202F0008A4
S31500013C0206F00046002429851C8FFFC04800001AF
S31500013D0000064F233C000A0005E205F508F4ED044
S31500013E04E714E714E7133C000A00060202F000870
S31500013F0206F00046004429842985 1C8FFFA0480A6
S31500014000001000064F033C000A00062205F508F2E
S31500014104ED04E714E714E7133C000A00064202F25
S31500014200008206F00041239008000084239008 04D
S315000143000086004429842985 1C8FFFA04800001EF
S3150001440000064F013C10080000833C000A00066ED
S3150001450205F508F4ED04E714E714E7133C000A03A
S315000146000684241227900C00584600C4A4157C099
S3150001470440048803200588920 11B0AF000465EC62
S31500014803 00133C000A0006A205F588F4ED04E71E5
S31500014904E714E712F0633C000A0006C7C40083997
S31500014A0000300C00012660472006004220653 8125
S31500014B0206F00082081200633C000A0006E2C1F7C
S31500014C0205F5C8F4ED04E714E714E712F0D33C022
S31500014D000A000702A6F00082F3900027CCC4879E2
S31500014E00002C3FB2F0D4EB90002438C2F390002B8
S31500014F07D7A48790002C404486D00204EB9000286
S3150001500438C4FEF001833C000A000722A5F205FA3
S31500015105C8F4ED04E714E714E7133C000A0007478
S3150001520226F000460220839000300C00012670C15
S315000153053914A916C12703F2280600C52910C912B
S315000154000000 0406D024291307C00B8D1F900C025
S31500015500106201153 80D080D1C03010720BE26892
S315000156002400007 0C40000464BC20115380E5884B
S3150001570068000028742 20404A9067AA33C000A036
S315000158000762 05F588F4ED04E714E714E7148E7EF
S3150001590010433C000A00078518F2A6F00142E2F4B
S31500015A000184A87664648790002C40D2F0D4EB9C9
S31500015B00002438C48790002C413486D00204EB9DE
S31500015C00002438C4FEF0010486D00052F3900C014
S31500015D000FA3F3C00544EB900000B06486D00254A
S31500015E02F3900C000FA3F3C0044605A303CFFFFF0
S31500015F0D0473F0043EF00024EB9000073C641D703
S315000016002F2800042007538 0E58806800002874 2C1
S31500016102 0402F1048790002C4192F0D4EB9000240
S31500016204 38C4FEF0010303CFFFFD0473F0043EFA5
S3150001630 00024EB9000073C6486D002041EF000459
S31500016402F103F3C00634EB900000B06508F33C08D
S315000165000A0007A4CDF2080205F4FEF000A4ED0BA
S31500016604E714E714E7148E7033E33C000A0007CB8
S31500016704FEFFF7847EF008445EF00802C7C000297
S315000168043564A3900C05244670000D642472A7C76
S315000169000 0340F6600000BC4A3900C05247670E9E
S31500016A0300748C0223900C05290B280670A4A39D2
S31500016B000C05247660000983F072F0B2255205165
S31500016C04E902C006700008848780040486F000460
S31500016D04EB9000012C63F07486F00022255206926
S31500016E000044E904293606024932F0A225520698D
S31500016F000084E902012B093664C4857204F3F2862
S3150001700008A3F0748790002C5204E964878004077
S3150001710486F00504EB9000012C63F072F12486F9F
S315000172000522255206 9000C4E90486F004C4879B3
S31500017300002C5324E96486F007448790002C53ED5
S31500017404E964FEF001C52932013B0866D9A588D1B
S315000175052 47BBFC000341866500FF3E60000282E3
S31500017604A3900C052456 75642472A7C000340F674
S315000177060403F072F0B225520514E902C00672EBC
S31500017804878004 0486F00044EB9000012C63F0773
S3150001790486F0002225520 6900044E9048573F06C4
S31500017A03F0748790002C54A4E964FEF000C588D08
S31500017B05247BBFC0003418665B8600002242A7CC0
S31500017C000C0058C287C00C098004A3900C05249E8
S31500017D0670C288D23CD00C098046000016C4A393F
S31500017E000C05246670001964A3900C0524766005B
S31500017F000C02A54600000AC301548C0E588068059
S3150001800000340F62840B9FC0003418664000092BC
S315000181 0B9FC000340F6650000883F152F0B2254E3
S315000182020514E902E006778302D000248C0268049
S31500018 30B0876C6C3F15486F0002254206 9000483
S31500018404E9024932F0A2254206900084E902012AD
S315000185 0B093664C4857204F3F28008A3F15487979
S31500018600002C55C4E9648780040486F00504EB95D
S315000187000012C63F152F12486F005222542069ED
S3150001880000C4E90486F004C48790002C56E4E968B
S3150001890486F007448790002C57A4E964FEF001CD7
S31500018A0588DBBF900C098046500FF4E60000132F8
S31500018B04A3900C05248670001282014B08D6708D5
S31500018C0288D23CD00C098040CB900C005CC00C0FB
S31500018D09804640000A02A7900C098043B7900C0EF
S31500018E0529600023AB900C05292301548C0E588B7
S31500018F00680000340F62840B9FC00034186646C6C
S3150001900B9FC000340F665643F152F0B22542051A5
S31500019104E902E00674E302D000248C02680B087BC
S31500019206C3A3F15486F00022542069 00044E901D
S31500019302 4932F0A2254206900084E902012B09357
S315000194066125 8B900C0980433FC012C00C0001080
S315000195060000 08E48790002C586604A4879000218
S3150001960C5BE604248790002C5F6603A4879000271
S3150001970C61260324879 0002C636602A4A3900C06B
S3150001980524A672C2F14203900C098049094E480A2
S31500019903F003F3C002D4EB9000071EA4A40670CFB
S31500019A048790002C64A4E96588F6034614A6030C4
S31500019B04A3900C0524B672833FC000100C0000CB6
S31500019C060064EB90001A17E2F39000283884EB908
S31500019D0000037100C40FFFF67E8427900C0000C9A
S31500019E042404FEF008833C000A0007E4CDF7CC031
S31500019F04E754E714E714E7133C000A00080598FE6
S3150001A003F3C002D43EF00024EB90000738E4A970B
S3150001A1067347010D09723C000C09800205730 2834
S3150001A20000202400 3FF72003200E589E489E5897D
S3150001A30D2B900C0980023C100C0980433FC012C21
S3150001A4000C00010601423FC0002884200C0980009
S3150001A5023FC0002884200C09804588F33C000A0BF
S3150001A6000824E754E714E714E7148E7003E33C08E

S31500001A7000A000844FEFFFC02A7C00C00000287C35
S31500001A8000C00012267C00C00008247C000340F63B
S31500001A902C7C00C0000E0814000566002E030141D
S31500001AA0E848024000070C4000056200040OD040F0
S31500001AB0303B00064EFB0002000C0060007600CCB6
S31500001AC0010601C848780040486F00044EB900007E
S31500001AD012C648790002C66F48790002C666486F8A
S31500001AE000084EB90002438C48790002C68748793F
S31500001AF00002C67E486F00344EB90002438C4FEF99
S31500001B00001848574EB9000049160254FF8F08ECDA
S31500001B1000040001600003960C5600806300038EEB
S31500001B200254FF8F08EC000500016000008248782F
S31500001B300040486F00044EB9000012C66002589576
S31500001B402015908AE4803F002F0B2C5522562051F9
S31500001B504E9023C000C0001467E42015908AE480EC
S31500001B603F00486F00022455225220690004 4E901F
S31500001B7048574EB9000049160254FF8F00540030F2
S31500001B806000032A0C56008065000322203900C03D
S31500001B909804B0B900C09800661A0254FF8F00542A
S31500001BA000502F0B2455225220690008 4E904256B1
S31500001BB0600002FA0254FF8F08EC000600010C5682
S31500001BC00040650000BC303900C0001002800000F3
S31500001BD0FFFF80FC000648404A40660000A420390A
S31500001BE000C09804B0B900C098006300009420794 2
S31500001BF000C00004301048C0E588D08A2A80B08A28
S31500001C0065200C800003418664189 08AE4803F00BA
S31500001C102F0B2055225020514E9023C000C0001497
S31500001C2066182A8A200A908AE4803F002F0B2252E7
S31500001C3020514E9023C000C00014207900C000043B
S31500001C4031028000248C02680B0B900C000146C04D9
S31500001C504A806C0242932F0B205522502069000 8BF
S31500001C604E9058B900C00004203900C00004B0B935
S31500001C7000C09804650A23F900C0980000C000045B
S31500001C800C56000363540814000667 4E4256427908
S31500001C9000C0001008940006301 4E0480240000717
S31500001CA00C4000036426081400036712539 34A93FA
S31500001CB06C1A203900C000145380268 0600E52939F
S31500001CC02013B0B900C000146D0242932F0B2855A3
S31500001CD0225420690008 4E9060280C56004065008A
S31500001CE001CC4256527900C00010303900C00010B5
S31500001CF053400C40012C630A610002864EB9000075
S31500001D0049F448780040486F00044EB9000012C6F6
S31500001D102015908AE4803F002F13486F0006265551
S31500001D2022532069000C4E9048574EB900004916C0
S31500001D304A7900C0000C670001743F3900C0000AF0
S31500001D402015908AE4803F0048790002C6974EB974
S31500001D50000243S6486F000848790002C6A24EB9F1
S31500001D60000243S6486F003048790002C6AE4EB9AD
S31500001D70000243S64FEF0018600001320C56000374
S31500001D8063320814000767 2C4256427900C00010DF
S31500001D9008940007 0254F8FF3014E8480240000790
S31500001DA00C40000466000106 0254FF8F00540050E8
S31500001DB0600000FA0C56008065 0000F242563014AE
S31500001DC0E048024000070C400004641630 14E04866
S31500001DD00240000752400240000 7E1480254F8FF63
S31500001DE081543014E048024000070C400002671698
S31500001DF00C40000167100C400004675A0C400003B9
S31500001E00677E600000A8081400035 7C0440048809D
S31500001E1002400001720BE368089400038154487 87D
S31500001E200040486F00044EB9000012C608140003B3
S31500001E3067084879 0002C6C3600648790002C6CB27
S31500001E4048790002C6BA486F00084EB90002438CB2
S31500001E504FEF000C604E0894000358950C95000354
S31500001E6041866 5022A8A2015908AE4803F002F0B5E
S31500001E702855225420514E9023C000C0001467DA22
S31500001E8048780040486F00044EB9000012C62015 7D
S31500001E90908AE4803F00486F000224552252206950
S31500001EA000044E9048574EB9000049164FEF0040C7
S31500001EB033C000A000864CDF7C004E754E714E711B
S31500001EC04E712F0D33C000A000882A7C00C000127E
S31500001ED0227C00C0000E3015E848024000070C4086
S31500001EE00004640652516000008830390080400EBC
S31500001EF00800000C660608D5000560322 07900C08F
S31500001F00985C0828000700046606089500 05601E10
S31500001F1030390080400E0800000E57C0440048804B
S31500001F2002400001720DE3680255DFFF8155081576
S31500001F300005670E081500046608425108D500071B
S31500001F40601608150005660E0815000467084251 5C
S31500001F5008D50006600252513015720DE268024043
S31500001F6000010240000172 0CE368089500048155E7
S31500001F7033C000A0008A2A5F4E754E714E714E71B5
S31500001F8033C000A0008C4FEFFFBE3EB900027D7E3D
S31500001F9033D700C00012427900C0000E42B900C01B
S31500001FA00008427900C0001023F900C098000 0C064
S31500001FB00004 23FC000340F600C000004EB90000F8
S31500001FC04884487 80040486F00064EB9000012C6A3
S31500001FD0486F00024EB9000049164FEF004233C069
S31500001FE000A0008E4E754E714E714E7133C000A02A
S31500001FF000904FEFFFC04EB900004884487800407B
S3150000200000486F00044EB9000012C648790002C6DCCB
S315000020104879 0002C6D3486F00084EB90002438CC7
S3150000202048790002C6F248790002C6E9486F0034D2
S31500002030 4EB90002438C4FEF001848574EB90000C6
S31500002040 49164FEF004033C000A000924E754E7106
S315000020504E714E7148E7003C33C000A00094287CC6
S31500002060 00C09800267C00027D8030390080400E3A
S31500002070 0800000E66482A7C00C00018247C00C0B8
S3150000208098042014B08B6714288B24BC00027D882A
S31500002090 33FC012C00C00010425560 2E0C55000A7E
S315000020A0642852550C55000A6620248023C000C0BF
S315000020B00043F3C000B4EB900007366600C201410
S315000020C0B08B66064EB9000019F833C000A0009622
S315000020D04CDF3C004E754E714E714E7133C000A000
S315000020E00098424033C000A0009A4E754E714E7162
S315000020F04E7148E70F3E33C000A0009C518F4A390D
S31500002100 00C0524E6600060A4A3900C0524F671692
S31500002110 3F3900C052B24EB90001A89A4EB900002C
S31500002120 4A1A600005EC4A3900C0525167086 1003E
S31500002130 05F6600005DC267C000243564A3900C0DD
S3150000214052526700026648790002C8D74E93588FCC
S31500002150 4247287C00028846247C00C047AC2C7C81
S3150000216000C048B0300748C0E5882A7408003F0719
S315000021704879 0002C9344E935C8F42460C470003EF
S3150000218006C1048790002C93B4E93588F7C01600061
S31500002190 009C0C4700036D0E0C47001B6E08487927
S315000021A00002C94460260C47001C661448790002E8
S315000021B0C94D4E93588F4EB900021A963C00606C7A
S315000021C00C47001F661648790002C9564E93588F71
S315000021D02F0D4EB9000051263C0060500C47001EE2
S315000021E0661C48790002C95F4E93588F4EB90000AD
S315000021F0813A4A4057C0440048803C00602E0C4754
S31500002200001D661C48790002C9684E93588F4EB966
S31500002210 000080D44A4057C0440048803C00600C0F
S3150000222048790002C9714E93588F4246320752418F
S3150000223048C1E5892034180032 0748C1E58990B4C1
S31500002240 18002F002F0D4A4667063F3C00596004D0
S3150000225003F3C004E48790002C97A4E934FEF000E7C
S3150000226 04A46670001580C4700036C202F390002CC
S31500002270 89002F3900000040048790002C9894E936D
S315000022804FEF000C2F3900027B7C604A0C47001E82
S31500002290661E2F39003C046848780470487 90002AD
S315000022A0C99A4E934FEF000C2F39003C046060260C
S315000022B00C47001D662E207900C005802F102F398F
S315000022C0003A0020487 90002C9AB4E934FEF000C4C
S315000022D02F39003A00243F3C00434EB900000E1E41
S315000022E0600000DA0C47001F6626205230280002E4
S315000022F0024003FF72003200588191CD2008E4802D
S31500002300D280E58920012F0048790002C9BC603ED1
S3150000231000C6DFFFF0012671270003 02D0012E58869
S31500002320 2F0048790002C9C760242056302 80002D1
S31500002330024003FF72003200588191CD2008E480EC
S31500002340D280E58920012F0048790002C9D24E9338

S315000023502F2D000C48790002C9DD4E932F2D000861
S315000023603F3C00434EB900000E1E2F2D0004487955
S315000023700002C9E44E934FEF001842453805300578
S3150000238048C0E588068000C0140420402A50200D6D
S315000023906716 2F4D0004204F2F2800044EB9000069
S315000023A0519AB0476602524452450C4500406DCEE4
S315000023B03F0448790002C9EA4E935C8F52470C47A6
S315000023C000206D00FDA0600003484A3900C0524459
S315000023D06700033E4A3900C0525367047A0F6032E1
S315000023E04A3900C0524767047A0360264A3900C05A
S315000023F0524867047A04601A4A3900C05249670491
S315000024007A05600E4A3900C0524A67047A066002AD
S315000024107A072A7C00C052844A3900C05245662891
S315000024204A3900C0524667083C3900C0528E60786F
S315000024304A3900C0524C66084A3900C0524D6704FA
S315000024407C0160647C206060287C00C05288300576
S315000024500C40000367200C40000467260C40000F68
S3150000246067 2C0C400006671A0C40000567200C40DC
S3150000247000076726603220149095E6802C005246AD
S3150000248060262014909 5E4802C005246601A201491
S315000024909095E2802C005246600E3C3900C0528A6C
S315000024A09C7900C0528652464A3900C0524D660A8F
S315000024B04A3900C0524C670000AC42472B7C00C035
S315000024C052A86000009630050C40000367200C40BF
S315000024D0000467300C40000F67380C400006674662
S315000024E00C40000567520C400007675E606A2F0CBF
S315000024F0201572003207E789D0812F004EB90002FD
S3150000250036DE6054205570003007E588D1C020942F
S31500002510 60462F14225570003007D080D3C04EB9C4
S315000025200001 80C46032205570003007E588D1C0B4
S315000025302 0B900C052A46020205570003007D0801A
S315000025400D1C030B900C052A6600E205570003007C9
S315000025500D1C010B900C052A75247BE466500FF68F9
S315000025600600001AE4247287C00C0523C247C00C07B
S3150000257052506000019 60C94000001006C0606940F
S3150000258000000010030050C400003672A0C400004DF
S315000025906 7640C40000F670000940C40000667005B
S315000025A000D20C400005670000FE0C4000076700E3
S315000025B00126600001542015720032 07E789D08198
S315000025C02F0048790002C9EF4E932055700030075E
S315000025D0E788D1C02F2800042F104A1267084879CF
S315000025E00002C9F8600648790002C9FC4E934FEF15
S315000025F0001460000114201572003207E589D081AD
S315000026002F0048790002CA004E93508F2055700063
S315000026103007E588D1C02F104A126708487900 02B2
S3150000262 0CA09607C48790002CA0C607420157200E1
S315000026303207E589D0812F0048790002CA0F4E93F0
S315000026405 08F205570003007D080D1C0558F3E90F6
S31500002650 43EF00024EB90001806E204F2F104A1240
S3150000266067084879000 2CA18603648790002CA1B12
S315000026706 02E7003C00766162015720032 07E589C2
S315000026 80D0812F0048790002CA1E4E93508F2055E4
S315000026907000 3007E588D1C02F1048790002CA279C
S315000026A04E93508F60627007C0076616201572004 1
S315000026B03207D281D0812F0048790002CA2E4E936C
S315000026C0508F205570003007D080D1C03F10487918
S315000026D00002CA37602E700FC007661420157200FC
S315000026E03207D0812F0048790002CA3D4E93508FA1
S315000026F0205570003007D1C0424010103F00487985
S315000027000002CA464E935C8F5247BE466500FE687D
S31500002710424 0508F33C000A0009E4CDF7CF04E75C7
S315000027204E714E714E7148E7073C33C000A000A0C1
S31500002730247C008040081A1214BC008042461C39D2
S31500002740 00C053843F3C00214EB9000073664EB969
S31500002750 00008ED84EB90001A1384EB90001A1B4CF
S3150000276 04EB9000080D4203C00E000004480068082
S315000027700 00E00240E4802F00487900E000004EB9F6
S315000027800000138642472A7C00804014267C000203
S315000027904356287C000288CE08150006670C08D52B
S315000027A0000613FC00EA0080401530074BC0D080C0
S315000027B03F3408004879 0002CA4C4E935C8F3007BC

S315000027C048C0D0803F3408004EB90001A89A52474D
S315000027D00C4700196DC242B900E0000042B900C0C2
S315000027E000FA2A7C0000040C287C0000970660088A
S315000027F02F0D4E94205D4E90BBFC0000041065F03A
S31500002800487900 02CA654E93588F2A7C000004104E
S3150000281060082F0D4E94205D4E90BBFC00000428EE
S31500002820655F048790002CA7B4E93588F2A7C0000D7
S3150000283004286008 2F0D4E94205D4E90BBFC0000CE
S3150000284004346 5F048790002CA8C4E93588F2A7C6E
S3150000285000000434600 82F0D4E94205D4E90BBFCA2
S31500002860000004386 5F02A7C00000438600 82F0D4B
S31500002870 4E94205D4E90BBFC000004886 5F02A7CD7
S3150000288000000488600 82F0D4E94205D4E90BBFC1E
S3150000289000000488 65F02A7C000004886008 2F0D7B
S315000028A04E94205D4E90BBFC0000048C65F02A7CA3
S315000028B000000048C60082F0D4E94205D4E90BBFCEA
S315000028C0000004B065F02A7C000004C460082F0DE7
S315000028D04E94205D4E90BBFC000004CC65F013C600
S315000028E000C05384487900 02CA9F4E93588F1485BE
S315000028F033C000A000A24CDF3CE04E754E714E7115
S315000029004E7133C000A000A4518F3F3C000B43EF33
S3150000291000024EB9000073C641D72F2800042F3994
S3150000292000002876E48790002CAC74EB900024356B4
S31500002930 4FEF000C3F3C000B43EF00024EB9000086
S3150000294073C641D72F103F3C00634EB900000E1EE0
S31500002950424 0508F33C000A000A64E754E714E7196
S315000029604E7133C000A000A8203900C000FA90B90B
S31500002970 00E000040C80009E34006F0A3F3C000B10
S315000029804EB90000736633C000A000AA4E754E71A2
S315000029904E714E7148E7031C33C000A000AC598F3E
S315000029A02A7C00C000FA2E154A3900C05246670A32
S315000029B013F900C0528F00E00008287C000243563D
S315000029C04A3900C05244670000E64A3900C0524501
S315000029D0670E2E3900C05284DEB900C05288601 8D6
S315000029E02E3900C05284DE952015223C000151800C
S315000029F04E39000270909E804A3900C05247672047
S31500002A00487900027F3E487900C05290486F00081E
S31500002A104EB900023896485 74EB900026622DE804B
S31500002A200C870F0C3F00657E0C87EE6B28006276E4
S31500002A30BE956466267C00C047D44A9367324A93A3
S31500002A4066047C00600620532C28000820159 0861A
S31500002A500C80000151806418 0C39000600C05384B4
S31500002A60640E48790002CB674E94588F7E00602A28
S31500002A7048784B0048790002CBA14EB90001599223
S31500002A803C000C46005967120C460079670C7E0024
S31500002A9048790002CC074E94588F4A87674423C76B
S31500002AA000C000F6603C48790002CC1B60304879D3
S31500002AB00002CC334E942F073F3C00434EB9000032
S31500002AC00E1E48790002CC364E94508F2F073F3C9D
S31500002AD0005A4EB900000E1E48790002CC384E94BA
S31500002AE0588F4240588F33C000A000AE4CDF38C02C
S31500002AF04E754E714E714E7148E7030433C000A007
S31500002B0000B02A6F001042474A3900C05245672874
S31500002B10487900C0001A204F3F2800184EB900001F
S31500002B2084EA1C00487900C0006C2F0D48780080AC
S31500002B304EB9000010B860262F0D487900C0006C11
S31500002B4048780 0804EB9000010B8487900C0001AD5
S31500002B50204F3F2800184EB9000086C81C001006FA
S31500002B604A0067140C000002670E0C000005670C93
S31500002B700C0000046706600642476002 7E013007CB
S31500002B8033C000A000B24CDF20C0205F5C8F4ED067
S31500002B904E714E714E7148E70F3E33C000A000B42F
S31500002BA04FEFFEF6227C0002828A41D7703920D987
S31500002BB051C8FFFC48574EB90001930623FC00009C
S31500002BC02AF800C0528C23FC00002AF800C0528864
S31500002BD0227C000281CC41EF00E8700620D951C862
S31500002BE0FFFC30914A3900C05256670608EF0004D0
S31500002BF000E847EF00EA4A3900C05251660 0008AF1
S31500002C004A3900C0525567040013004E4A3900C0C5
S31500002C1052666 7782A7900C0530C606610150C005E
S31500002C200044 67260C00005467280C000065672ADC

S31500002C300C000053672C0C000050672E0C0000702F
S31500002C4067300C0000736732603608EF000000EA58
S31500002C50602E08EF000100EA602608EF000200EA95
S31500002C60601E08EF000300EA601608EF000400EAA1
S31500002C70600E08EF000500EA600608EF000600EAAD
S31500002C80528D4A1566966004001300FF4DEF00EB67
S31500002C904A3900C05252670000DA4A3900C052670A
S31500002CA0670608EF000600E94A3900C05268670661
S31500002CB008EF000500E94A2F00EA660608EF000261
S31500002CC000E84A3900C05262670608EF000700E9CB
S31500002CD0103C00FFD03900C052BF1F4000EB4A39FC
S31500002CE000C052546726103900C052C7D02F00EBDF
S31500002CF053001F4000EC08EF000200E80C2F003FD5
S31500002D0000EC630C1F7C003F00EC60041F4000ECED
S31500002D104A3900C0525E674E08EF000700E82F7977
S31500002D2000C052EC00EE4A3900C0526567082F79A0
S31500002D3000C0530800F24A3900C0525F670A2F7973
S31500002D4000C052F000F660324A3900C05261661A7D
S31500002D504A3900C0525166122F6F00EE00F608EF96
S31500002D60000100E8601442AF00EE70FF2F4000F64D
S31500002D70600842161F7C004000EC4A3900C05261D0
S31500002D80670608EF000500E84A3900C05264670686
S31500002D9008EF000300E84A3900C05263670608EFEF
S31500002DA0000600E849EF01024A3900C0524967307F
S31500002DB00CB90000000100C05298631E2E3900C0F5
S31500002DC052985587207900C095102007E788D0874C
S31500002DD0D080D1C028A80008600628B900C0903A5B
S31500002DE04A3900C052656710082F000700E86608D8
S31500002DF02F7900C0530801024240102F00EC4241D7
S31500002E00122F00EB904155400C4000025DC044007B
S31500002E1048803A002E3C000151804A3900C0524E8B
S31500002E20672C203900C052AC22074EB9000274A4A8
S31500002E304EB900027B582F4000FA4A3900C052575B
S31500002E406710203900C052D0D1AF00FA600442AFFB
S31500002E5000FA4A3900C0524F672C203900C052B0E0
S31500002E6022074EB9000274A44EB900027B582F40C7
S31500002E7000FE4A3900C052586712203900C052D4A9
S31500002E80D1AF00FE600670FF2F4000FE247C00C01C
S31500002E90001A4A3900C05246660E486F00E8224AB8
S31500002EA04EB9000081786012227C000281B8204A67
S31500002EB0703320D951C8FFFC30914A3900C05245C1
S31500002EC0671443EF00E8207C00C0002E700620D96E
S31500002ED051C8FFFC30914A3900C05245670678FD5B
S31500002EE0600005384A3900C05246670678FE600021
S31500002EF0052A42442A7C000243564A3900C0525CE5
S31500002F00660A4A3900C052596700023E4A2F00EA53
S31500002F1066061F7C00FF00EA42461C2F00EB287C59
S31500002F2000C00106247C00C005CC6000020C3E06F1
S31500002F30307C00B8D1D470003007D080D1C03010BA
S31500002F40720BE268024000074241123900C0538406
S31500002F50B041620001E270003007E5880680000299
S31500002F60874220404A90670001CE700030070680F5
S31500002F70000345DC2040424010104241122F00EA77
S31500002F80C041670001B24A3900C0525C670000CEFA
S31500002F904240102F00EBBE40660A48790002D1235A
S31500002FA04E95588F307C00B8D1D470003007D08051
S31500002FB0D1C03010E248024003FF3F00307C00B829
S31500002FC0D1D470003007D080D1C00828000000019D
S31500002FD067063F3C005960043F3C004E307C00B819
S31500002FE0D1D472003207D281D1C130100800000E50
S31500002FF067063F3C004E60043F3C0059307C00B8F9
S31500003000D1D472003207D281D1C130100800000F2E
S3150000301067063F3C005960043F3C004E307C00B8D8
S31500003020D1D470003007D080D1C03010720BE26866
S31500003030024000073F0070003007E5880680000266
S31500003040874220402F10300752403F004879000247
S31500003050D1764E954FEF0014600000D64240102FF7
S31500003060000EBBC4066560CB90000000100C052944B
S31500003070664A485748790002D1AC4E95508F4A456A
S31500003080662848790002D1B14E95588F602E70009F
S315000030903006E58806800002874220402F104879D6
S315000030A00002D1DD4E95508F52464240102F00EC63
S315000030B0BC4065DA42461C2F00EB3E064A45670ACD
S315000030C04240102F00EBBC40660E486F00784879EE
S315000030D00002D1E24E95508F4A45662270003007B5
S315000030E0E58806800002874220402F1030065240B5
S315000030F03F0048790002D1E74E954FEF000A700075
S31500003100307E7882F32080448790002D1F14E953E
S31500003110700003007E7882F3208003F3C00634EB945
S3150000312000000E1E48790002D1F94E954FEF000CB3
S31500003130 3F07610002FE52464240102F00ECBC40A1
S3150000314063 00FDEC600002D44A2F00EA663A4A3971
S31500003150 00C0525666324A3900C0525E662A4A3963
S3150000316000C0525266224A3900C0525D661A4A3978
S3150000317000C0525A66124A3900C0525B660A4A3982
S3150000318000C0526067000 2944A3900C0526067006E
S3150000319000154082F000700E8670848790002D1FBB0
S315000031A0600648790002D21B4E95082F000200ECFB
S315000031B0670848790002D23960064879 0002D26A67
S315000031C04E95508F082F000600E8670A48790002DE
S315000031D0D29A4E95588F082F000500E8670A48795D
S315000031E00002D2AD4E95588F082F000400E86708FC
S315000031F048790002D2D1600648790002D2D94879CE
S315000032000002D2C74E954240102F00F352403F00B5
S3150000321048790002D2E94E954240102F00FA5240FA
S3150000322003F0048790002D30F4E95204F2F28010208
S31500003230048790002D3354E95204F2F280112487940
S31500003240 0002D35C4E9548790002D3834E95204FF9
S3150000325 02F2801223F3C00634EB900000E1E48791C
S315000032600002D39F4E954FEF002C204F2F2800FED3
S31500003270 3F3C00634EB900000E1E4AAF01026712C2
S3150000328 0204F2F28010248790002D3BB4E95508F5C
S3150000329 0600A48790002D3DF4E95588F48790002BC
S315000032A0D3FD4E952F1248790002D4004E952F3942
S315000032B000C0001E48790002D4284E95203900C06F
S315000032C00026E5882F0048790002D4504E952F3904
S315000032D000C0002A48790002D4784E954FEF0024AA
S315000032E06000013849EF010628926000011E4A94E9
S315000032F066063E3CFFFF601020543028 0002720A2A
S3150000330 0E2680240003F3E00486F00E82F144EB9C5
S31500003310 0000838A1C000C00000267104A00670C3C
S31500003320 0C000004670000D8600000D620542F2847
S3150000333000042F28000C70003007E5880680000284
S31500003340874220402F10300752403F004879000244
S3150000335 0D4A04E954FEF001220542F2800083F3C72
S31500003360 00434EB900000E1E4A3900C0525D672E5A
S31500003370205430280002024003FF5840E5483F0031
S3150000338 02F144EB90000519A3F002F1448790002BD
S3150000339 0D4B94E954FEF000C3F07610000962054BC
S315000033A030280002024003FF4A40634E4A3900C0FB
S315000033B0525B67464A3900C0525A663E4247602C05
S315000033C07007C007660A48790002D4C94E95588F1F
S315000033D0307C0010D1D470003007E588D1C02F10A2
S315000033E048790002D4CC4E95508F5247205430284D
S315000033F00002024003FFBE4065C64A0667024294C9
S3150000340 02F14224C4EB900006A124A94670C2054BD
S31500003410 0C68FFFF00026600FED630044FEF010A7B
S31500003420 33C000A000B64CDF7CF04E754E714E7175
S3150000343 04E712F0733C000A000B87E01302F000860
S3150000344048C00680000345DC204042401010C047BB
S31500003450 0C40000167260C40000267280C4000045F
S31500003460672A0C400008672C0C400010672E0C40A1
S315000034700002067300C4000406732603E4879000209
S31500003480D4D3602E48790002D4D56026487900024C
S31500003490D4D7601E48790002D4D960164879000254
S315000034A0D4DB600E48790002D4DD600648790002 5C
S315000034B0D4DF4EB90002435 6588FDE476600FF7EC2
S315000034C033C000A000BA2E1F205F548F4ED04E711D
S315000034D04E714E7133C000A000BC23FC00000A00F0
S315000034E000C0523C4A3900C05384672A487900021A
S315000034F0D4E24EB9000243562F3900C000FA3F3CD1
S31500003500 00434EB900000E1E48790002D4F34EB9AE

S31500003510000024356508F4EB90001A17E4EB90001FC
S31500003520A17E4EB90001A17E70FF33C000A000BE8F
S315000035304E754E714E714E7133C000A000C023F916
S31500003540000283840080401820390OC0538C0C8010
S31500003550000010000644 80C402580670E0C404B00BB
S31500003560671A0C4096006726603402390OF800801E
S315000035704018003900030080401B6022023900F824
S315000035800080401808F90001008040186010023 9D8
S31500003590 00F80080401808F9000000804018223C1E
S315000035A000E000004441203C00E003D4D04133C099
S315000035B000804050203C00E005D3D04133C000805D
S315000035C04052203C00E005D4D04133C00080405436
S315000035D0203C00E00673D04133C00080405633C023
S315000035E000A000C24E754E714E714E7148E7033E03
S315000035F033C000A000C42A7C00C05386247C00800F
S3150000360040 5C3C2F00204A15630000A80C46000AC7
S31500003610660000A0287C00C0538752141014B01511
S31500003620650000 90103C00FED01518802A7C000230
S3150000363083 94267C0002838C2C7C000035EC600A87
S31500003640 2F13101D48803F004E964A1566F24247DA
S3150000365030120800000D67084EB90001A17E6020F7
S31500003660103900 80405A0C00000367080C00002047
S31500003670670A60144EB90001A1A2600C4214600 8EA
S3150000368052470C470F006DC82F133F3C000D4E9656
S31500003690 42472F133F3C00204E9652470C47003CB2
S315000036A06DF02F133F3C000D4E96604C4EB9000155
S315000036B0A17E30120800000C66F2203900C052408C
S315000036C090B900C0523C7240B0816F064EB90001FD
S315000036D0A17E4A3900C049E266183012080000 0D82
S315000036E066100C3900030080405A66064EB9000188
S315000036F0A1A213C600804058300633C000A000C601
S31500003700 4CDF7CC0205F5C8F4ED04E714E714E7187
S3150000371048E7010C33C000A000C8610001F8287C0E
S31500003720 00C05390101 40C0000026302421 42A7C5D
S3150000373000080401A4240101432150241000 3B04185
S3150000374067160255FFEF4240101402400003025 56F
S31500003750FFFC81550055001010390 0C053910C0034
S315000037600000767080C000008672060163015 08007F
S3150000377000 02662A0255FFEF005500040055 0010AE
S31500003780601C13FC000800C05391301508000002AD
S31500003790670C0255FFEF0255FFFB0055001030394C
S315000037A00080405C0800000D670670FF6000015055
S315000037B01E390080405A083900000 0C05392670E37
S315000037C04A3900C0538463061 3C70080405808393D
S315000037D0000000C0539366523015080000 0C661EA8
S315000037E030150800000D66160807000767384A39C5
S315000037F000C0538A6708602E1E390080405A30394F
S31500003800080405C0800000D67EE287C00C0538CE9
S3150000381 00C9400009600660828BC000025806006 0F
S315000038202014D0802880610000EC0807000 7670E8E
S315000038304A3900C0538A660670FC600000C2301523
S315000038400800000D67380255EFFF3015720CE2686C
S315000038500240000102400001720DE3680255DFFFDD
S31500003860815530 15E268024000010240000 1720BEA
S315000038 70E3680255F7FF815570FE600000823015 3F
S31500003880 0800000C67360255EFFF3015720CE2682F
S315000038900240000102400001720DE3680255DFFF9D
S315000038A0815530 15E268024000010240000 1720BAA
S315000038B0E3680255F7FF815570F9604230150800 3C
S315000038C0000B67360255EFFF3015720CE2680240B6
S315000038D00001024000017 20DE3680255DFFF8155C9
S315000038E03015E2680240000102400001720BE368F5
S315000038F00255F7FF815570FA6004424010073 3C045
S31500003900 00A000CA4CDF3080205F588F4ED04E7129
S3150000391 04E714E7133C000A000CC207C0080401850
S31500003920227C0080401A203900C0538C0C80000194
S31500003930000064320C402580670E0C404B00673057
S315000039400C4096006748601E1010020000070C002D
S31500003950000367580251FFEF021000F80010000341
S3150000396000051001060 4623FC00004B0000C0538C41
S31500003970101002000007 0C00000267300251FFEF32
S3150000398002100 0F808D00001005100106 01E02105D
S31500003990 00F808D000007007C01067100251FFEF52
S315000039A0021000F808D00000005100103 3C000A03B
S315000039B000 0CE4E754E714E714E7148E7011C33C0F4
S315000039C000A000D04FEFFFEC4BEF00047E022EAFBD
S315000039D0002C286F0028267C00C054680C94FFFF3A
S315000039E0FFFF6624426D000E2A8C41D72B48000843
S315000039F02B4C00043B47000C2F0D4EB900C0998C90
S31500003A0042471E008F13600608D300027E0430076B
S31500003A104FEF001433C000A000D24CDF3880205F87
S31500003A20508F4ED04E714E714E7148E7011C33C017
S31500003A3000A000D44FEFFFF0286F00244BD77E0282
S31500003A40267C00C054680C94FFFFFFFF6626426D7B
S31500003A5000 0E2A8C41EF00282B4800082B4C00044E
S31500003A603B47000C2F0D4EB900C0998C42471E00F3
S31500003A708F13600608D300027E0430074FEF001054
S31500003A8033C000A000D64CDF3880205F508F4ED068
S31500003A904E714E714E7148E7073C33C000A000D806
S31500003AA04FEFFFF0266F00304BD77A044246284B83
S31500003AB03E06247C00C05468600E0C54FFFF670667
S31500003AC008D200027E045246BC456C044A4767EAA7
S31500003AD04A476624426D000E2A8B41EF00342B487C
S31500003AE00082B4B00043B45000C2F0D4EB900C0BF
S31500003AF0998C42471E008F1230074FEF001033C0DB
S31500003B0000A000DA4CDF3CE0205F4FEF000C4ED007
S31500003B104E714E714E7148E7033C33C000A000DC85
S31500003B204FEFFFF0266F002C4BD74246284B3E0640
S31500003B30247C00C0546860100C54FFFF670608D24E
S31500003B40000 27E045246548CBC6F00346C044A4713
S31500003B5067E64A476624426D000E2A8B2B6F0030BB
S31500003B600082B4B00043B6F0034000C2F0D4EB9A0
S31500003B70 00C0998C42471E008F1230074FEF00108D
S31500003B8033C000A000DE4CDF3CC0205F4FEF000AD0
S31500003B904ED04E714E714E7148E7033C33C000A0C3
S31500003BA000E04FEFFFF0266F002C4BD74246284B24
S31500003BB03E06247C00C0546860100C54FFFF670664
S31500003BC008D200027E045246548C300648C0322F7A
S31500003BD0003448C1D281B08164044A4767DC4A4751
S31500003BE06628426D000E2A8B2B6F003000082B4B87
S31500003BF000004302F0034D0403B40000C2F0D4EB94E
S31500003C0000C0998C42471E008F1230074FEF0010FC
S31500003C1033C000A000E24CDF3CC0205F4FEF000A3B
S31500003C204ED04E714E714E7133C000A000E44A3939
S31500003C3000C0524467084EB900008E60600C23F93C
S31500003C4000283F20080400860FE424033C000A0BC
S31500003C5000E64E754E714E714E7148E7013E33C017
S31500003C6000A000E84FEFFFEA287C00C0985C267CA5
S31500003C7000C050B2247C000243562C7C00C0983E03
S31500003C804A3900C05244670C3E3900C05286534739
S31500003C906000032220 14B08B670C2240204B700773
S31500003CA020D951C8FFFC2A7C00C050B44A3900C054
S31500003CB0525067202 88B7003C07900C052B6E7487F
S31500003CC00255FFE781553015E64802400003 13C050
S31500003CD000C0543C4A3900C052516716288B30390F
S31500003CE000C052BA02400001E54808AD00020001DA
S31500003CF081554A3900C0524C6712288B7003C0792F
S31500003D0000C052A6EB480255FF9F81554A3900C0B4
S31500003D10524D6716288B303900C052AA0240000166
S31500003D20EF4808AD000700 0181554A3900C05245E9
S31500003D306716288B303900C0528A02400001720F84
S31500003D40E3680895000781554A3900C05246571650
S31500003D50288B303900C0528E02400001720EE36893
S31500003D6008950006815 54A3900C0525567182 88BB8
S31500003D70703FC03900C052CB023900C000C050B6F7
S31500003D80813900C050B64A3900C0524E6758288B58
S31500003D902016486F00124EB900025B0C48790002EB
S31500003DA08550487900C052AC486F00164EB90002E3
S31500003DB0384248790002854C486F0012486F00125D
S31500003DC04EB9000238AC486F0012486F000E486FBB
S31500003DD0000E4EB900023896486F00064EB9000232
S31500003DE06622E88836804A3900C0524A6704610074

S31500003DF004584A3900C052486704610003E64A394C
S31500003E0000C0524967126100044022542O4B7007DB
S31500003E1020D951C8FFFC288B4A3900C05247672673
S31500003E202014B08B6616610003F84A40670848798B
S31500003E300002D82A600C61000410600A487900026A
S31500003E40D83B4E92588F4A3900C0524F670000EA5D
S31500003E502016486F00124EB900025B0C303900C0C4
S31500003E605088907900C05084486F000C0280000092
S31500003E70FFFF4EB900025B0C48790002854C486F83
S31500003E800010486F00104EB90002389648 6F0012B5
S31500003E90486F000C486F000C4EB9000238AC4879E8
S31500003EA000028554486F0008486F00084EB90002AA
S31500003EB03842204F2F1048790002D85A4E922016C9
S31500003EC0486F001A4EB900025B0C303900C05090A2
S31500003ED0123900C0508544015801E368486F001448
S31500003EE002800000FFFF4EB900025B0C4879000219
S31500003EF0854C486F0018486F00184EB90002389676
S31500003F00486F001A486F0014486F00144EB900023B
S31500003F1038AC48790002855448 6F0010486F00108D
S31500003F204EB90002384220 4F2F2800084879000277
S31500003F30D8744E924FEF00104A3900C0525267169D
S31500003F40288B303900C052BE02400001720CE36873
S31500003F50089500048155 4A3900C05253671 6288BCC
S31500003F60303900C052C202400001D04008AD000105
S31500003F70000181554A3900C052546714288B3039E4
S31500003F8000 0C052C60240000108AD0000000181558 4
S31500003F904A3900C05256671C288B103900C052CFD0
S31500003FA002000001EF0808B9000700C050B68139C9
S31500003FB000C050B64A3900C0524B670002 0E4A474D
S31500003FC066320C9400000760660848790002D8BC87
S31500003FD060142014B08B660848790002D8C46006C5
S31500003FE048790002D8CD48790002D8944E92508F75
S31500003FF02A54603C300748C0E588068000C050D28D
S31500004000020404A9067204879000 2D8D34E92588FB4
S3150000401007010320748C1E589068100C050D22041A0
S3150000402 0D0902A40600A48790002D8FE4E92588FF6
S315000040304A476714300748C0E588068000C050D25A
S31500004040 20404A90670001844879000 2D9124E92B6
S3150000405 0102D00040200003F4241120030013F00D3
S31500004060082D0002000367084879000 2D99A600605
S315000040704879000 2D99E302D0002E6480240000 32E
S315000040803F00302D0002EA4802400003720 1E16958
S3150000409 030013F00082D0007000367084879000239
S31500004 0A0D98C600648790002D991201648 6F002401
S315000040B04EB900025B0C3015E948486F001E0280BD
S315000040C00000FFFF4EB900025B0C48790002854CE8
S315000040D0486F0022486F00224EB90002389648 6F9A
S315000040E00024486F001E486F001E4EB9000238AC0F
S315000040F048790002855448 6F001A486F001A4EB975
S3150000410000023842204F2F280012082D0006000218
S3150000411067084879 0002D985600648790002D9897E
S31500004120082D000700026708487900 02D97E60065C
S315000041304879000 2D98248790002D94A4E924879D4
S31500004140 0002D9A14E924FEF0026082D000400026E
S3150000415067084879 0002D9B0600648790002D9B8E4
S31500004160 4E924879000 2D9C14E92508F082D000117
S31500004170000367084879 0002D9D36006487900022F
S3150000418 0D9DB4E9248790002D9E44E92508F082D21
S31500004190000000036708487900 02D9EF60064879F5
S315000041A00002D9F94E9248790002DA054E92508FF4
S315000041B0082D00070004670848790002DA0D60063A
S315000041C048790002DA1E4E92588F42404FEF001691
S315000041D033C000A000EA4CDF7C804E754E714E71F4
S315000041E04E7133C000A000EC0CB90000076000C09F
S315000041F0985C671E227C00000760207C00C050B2DD
S31500004200700720D951C8FFFC23FC00C050B200C083
S3150000421 0985C33C000A000EE4E754E714E714E7123
S31500004220 33C000A000F02F3900C0985C3F3C000866
S315000042303F3C002F4EB9000071EA33C000A000F2E7
S315000042404E754E714E714E712F0D33C000A000F4A5
S315000042504FEFFFF03F3C002F43EF000E4EB900003A
S315000042607 38E4AAF000C67607010D0AF000C2A4006
S31500004270700030152F40000420390 0C0983E486F6A
S3150000428000084EB900025B0C48790002855848 6F59
S3150000429 0000C486F00084EB90002389648574EB9D0
S315000042A000026622E888222F0004B280641A206F7A
S315000042B0000C30280002024003FF0C40000866088C
S315000042C023CD00C0985C600A23FC0000076000C094
S315000042D0985C4FEF001033C000A000F62A5F4E75C1
S315000042E04E714E714E7148E73F3E33C000A000F854
S315000042F04FEFFF6A76034247287C000243563C078D
S3150000430048C641EF00482006D080D086E588D1C057
S31500004310300748C0E588D1C020BC3F8000003C077C
S31500004320 48C641EF006C2006D080D086E588D1C013
S31500004330300748C0E588D1C020BC3F80000042461 7
S31500004340380748C43A0748C560503007D046320798
S31500004350E5499041504041EF00242204D281D284A5
S31500004360E589D1C1320648C1E589D1C12F0848C0C7
S315000043704EB900025AEC41EF00242005D080D085CA
S31500004380E588D1C0300648C0E588D1C02F104879ED
S3150000439 00002DA264E94508F5246BC436DAC4879E3
S315000043A00002DA2B4E94588F5247BE436D00FF50E1
S315000043B048790002DA2D4E9448790002DA2F4E949D
S315000043C0508F42464BEF002047EF001C45EF00148C
S315000043D04DEF0010600002947 8FF3E0660403A07F9
S315000043E048C541EF00242005D080D085E588D1C09E
S315000043F0300648C0E588D1C02F1043EF001C4EB9E7
S3150000440000 0262A448790002855C486F001C4EB920
S31500004410 000238DA4A406F0438076006 5247BE4346
S315000044206DBC4A446C1048790002DA314E94588FBC
S31500004430700160 00043AB846670000F6424530064F
S31500004440 48C02F4000183006 48C02F4000143004E2
S31500004450 48C02F4000103004 48C02F40000C3006E2
S31500004460 48C02F4000083006 48C02F4000043004E2
S31500004470 48C02E80340448C2600000B0300548C0F1
S31500004480E5882E0041EF0024202F0018D080D0AF01
S31500004490 0018E588D1C02AB0780043EF0024202F09
S315000044A00010D080D0AF0010E588D3C041EF0024C3
S315000044B0202F0014D080D0AF0014E588D1C021B1E0
S315000044C07800780041EF0024202F000CD080D0AF78
S315000044D0000CE588D1C02195780041EF0048202FD7
S315000044E00008D080D0AF0008E588D1C02AB0780097
S315000044F043EF00482017D080D097E588D3C041EF1E
S3150000450000 48202F0004D080D0AF0004E588D1C039
S31500004510 21B17800780041EF00482002D080D08297
S31500004520E588D1C02195780052 45BA436D00FF4E0B
S315000045303A065245300648C02F4000183006 48C09B
S315000045402F40000C300648C02F40000460000114C4
S315000045503E0548C741EF00242008222F0018D281CB
S31500004560D2AF0018E589D081320648C1E589D081ED
S315000045702F0041EF00282007D080D087E588D1C0E2
S31500004580300648C0E588D1C02F082F0B4EB900026F
S31500004590 38AC4244300548C02480300548C02C80E1
S315000045A0300548C02F40000834054 8C2600000AC02
S315000045B0300448C0E5882E0041EF0024202F000C6F
S315000045C0D080D0AF000CE588D1C0487078002F0BA2
S315000045D0486F00084EB90002389648 5741EF002848
S315000045E02016D080D096E588D1C04870780041EF7B
S315000045F0 0002C2012D080D092E588D1C04870780077
S315000046004EB90002386A41EF0048202F0004D080DE
S31500004610D0AF0004E588D1C0487078002F0B486FF2
S315000046200000 84EB90002389648 5741EF004C200268
S31500004630D080D082E588D1C0D1C72F0841EF005085
S31500004640202F0010D080D0AF0010E588D1C0487070
S31500004650 78004EB90002386A5244B8436D00FF52E2
S31500004660 5245BA436D00FEEA524630035340BC4001
S315000046706D00FD663E03534748C741EF00242007FF
S31500004680D080D087E588D1C030035340 48C0E58844
S31500004690D1C02F1043EF001C4EB9000262A4487926
S315000046A000002855C486F001C4EB9000238DA4A40A9
S315000046B06C1048790002DA454E94588F70026000FB
S315000046C001AE424547EF00903003534048C0268074

```
S315000046D02F4000182F4000142F40001070FED043CA
S315000046E03F4000946000013C41EF00242008222F47
S315000046F00010D281D2AF0010E589D0812213E5895E
S31500004700D0812F0041EF004C2008222F0018D281C3
S31500004710D2AF0018E589D081320548C1E589D0813C
S315000047202F0041EF00742008222F0020D281D2AF43
S3150000473000020E589D081320548C1E589D0812F0066
S315000047404EB9000238AC3E2F0094600000CE2ABC61
S3150000475000000003C075246340748C2604C380649
S315000047604 8C441EF006C2004D080D084E588D1C0D5
S31500004770300548C0E588D1C02F0841EF0028200247
S31500004780D080D082E588D1C0300648C0E588D1C047
S315000047902F08486F00144EB9000238964 86F000C77
S315000047A02F0D4EB9000235D05246BC436DB03407CA
S315000047B048C2380748C43C0748C62F0D41EF004C95
S315000047C02004D080D084E588D1C0300548C0E58873
S315000047D0D1C02F08486F00144EB90002386A41EF65
S315000047E000242006D080D086E588D1C0300748C096
S315000047F0E588D1C02F08486F001041EF00742002F1
S31500004800D080D082E588D1C0300548C0E588D1C0C7
S3150000481 02F084EB9000238AC53474A476C00FF30A8
S31500004820 5245BA436D00FEC24245603C42473C05D4
S315000048304 8C6602441EF006C2006D080D086E5880B
S31500004840D1C0300748C0E588D1C02F104879000292
S31500004850DA5A4E94508F5247BE436DD848790002BB
S31500004860DA5F4E94588F5245BA436DC042404FEFBF
S315000048700009633C000A000FA4CDF7CFC4E754E71EA
S315000048804E714E7133C000A000FC227C00804100B6
S31500004890 13FC000200804060323CFE5F300151C9CB
S315000048A0FFFC12BC0038323C018B300151C9FFFCC1
S315000048B012BC0038323C008D300151C9FFFC12BCDD
S315000048C000387238300151C9FFFC12BC00387270D2
S315000048D0300151C9FFFC12BC00087238300151C9C1
S315000048E0FFFC12BC0001323C0922300151C9FFFC19
S315000048F012BC00067238300151C9FFFC12BC000C14
S31500004900 7238300151C9FFFC33C000A000FE4E755D
S315000049104E714E714E7148E7051433C000A0010078
S31500004920226F0014207C00804102267C008041001A
S31500004930 16BC008072383E0151C9FFFC2A4972102C
S31500004940600A109D7E383A0751CFFFFC4A15672250
S3150000495 04A415EC0440048803E0053414A476712C0
S3150000496060E07E383A0751CFFFFC10BC00201AFCED
S31500004970 00204A415EC0440048803E0053414A47F9
S315000049806 6E072383E0151C9FFFC16BC00A97238B8
S315000049903E0151C9FFFC4BE900207210600A109DD0
S315000049A07E383A0751CFFFFC4A1567224A415EC05E
S315000049B0440048803E0053414A47671260E07E3813
S315000049C03A0751CFFFFC10BC00201AFC00204A41D8
S315000049D05EC0440048803E0053414A4766E033C00B
S315000049E000A001024CDF28A0205F588F4ED04E71E8
S315000049F04E714E7133C000A0010413FC000100800B
S31500004A004100323C0922300151C9FFFC33C000A0ED
S31500004A1001064E754E714E714E712F0733C000A0C0
S31500004A2001081E390080400813FC00800080400801
S31500004A3061000BD0610042446100 41EE610008D480
S31500004A40610000846100096213C70080400833C01A
S31500004A5000A0010A2E1F4E754E714E714E7148E729
S31500004A60030033C000A0010C0CAF03FFFFFF000CD6
S31500004A70633A424760263C0748C6207900C0951035
S31500004A802206E789D286D281D1C12028000 8B0AF9C
S31500004A90000C66063007524060165247300748C081
S31500004AA0B0B900C097DC65CE7EFF60024247300792
S31500004AB033C000A0010E4CDF00C0205F588F4ED0DF
S31500004AC04E714E714E7148E71F3E33C000A0011073
S31500004AD0598F487800584879 00C02D042A7C000078
S31500004AE013864E954878005848 7900C014044E95B0
S31500004AF04878004148 7900C047B04E95487800197B
S31500004B00487900C048B44E9548780019487900C0E5
S31500004B1049184E954878030D487900C007CC4E9544
S31500004B20267C00C0140042934878008048 7900C073
S31500004B3005CC4E9542B900C0058842B900C000ECCC
S31500004B4042472C7C00C04648300748C0D0803DBC58
S31500004B50FFFF0800300748C0D080068000C0467AB4
S31500004B60204030BCFFFF4A476F14300748C0E58835
S31500004B70068000C0497C204020BC000346585247AE
S31500004B800C4700196DC242454BD7263C0000FFFF7B
S31500004B90247C00028B46600001FA300448C0E5889B
S31500004BA02AB20800670001E8600001B820550CA889
S31500004BB003FFFFFF0004630C2F2800046100FEA022
S31500004BC03E00600242474A476D0000FC20553028EF
S31500004BD00002720AE2680240003F0C400033662E73
S31500004BE028487C3FCC6C000E300748C0E188068020
S31500004BF000C01404320648C1E589D0812040208CCB
S31500004C00300748C0D0803D8608006000 00BA3028D2
S31500004C100002E2680240003F0C4000376632284836
S31500004C207C3FCC6C000E300748C0E188068000C08F
S31500004C302D04320648C1E589D0812040208C3007FA
S31500004C4048C0D080068000C0467A20403086607614
S31500004C504A476F2430280002E2680240003F0C40B9
S31500004C6000038661430075340 48C0E588068000C007
S31500004C7048B42040209560 4E4A476F26205530287C
S31500004C800002720AE2680240003F0C40002B6612E6
S31500004C90300748C0E588068000C0497C224022884B
S31500004CA06024205530280002720AE2680240003F64
S31500004CB00C4000396610300748C0E588068000C001
S31500004CC04918224022882 3D500C000EC4A476600D6
S31500004CD0008A23D500C048B04A9566063E3CFFFFD1
S31500004CE06010205530280002720AE2680240003F38
S31500004CF03E000C47001E670A7004D09523C000C012
S31500004D0005884A9566042E03601220553028000255
S31500004D10720AE2680240003F7E003E00327C0008D4
S31500004D20D3D52007E788068000C005CC204020D9CF
S31500004D3020914A9566042E03601220553028000201
S31500004D40720AE2680240003F7E003E002007E588C6
S31500004D50068000C047B0204020952F15224D6100E7
S31500004D601CB24A95672A20153204524148C1E5898A
S31500004D70B0B21800641A20403228000 2700AE069B6
S31500004D800241003F0C41003567066000FE207A199B
S31500004D905245300548C0D080068000C098082040A3
S31500004DA038100C44FFFF67080C4500196D00FDEC38
S31500004DB02A7900C0487C2F0D61003C404A406710AC
S31500004DC0487900C007CC2F0D61000F3426806002A1
S31500004DD042934A93661C3F3C00006100066C2A40E1
S31500004DE04A80670E487900C007CC2F0D61000F106E
S31500004DF02680588F33C000A001124CDF7CF84E7518
S31500004E004E714E714E7133C000A00114610028FA34
S31500004E1023F900C0010200C000FA23F900C000FA1D
S31500004E2000E0000033C000A001164E754E714E71B1
S31500004E304E7148E7010C33C000A00118518F287C41
S31500004E4000C000FA0C940F0C3F006300009C4AB9A6
S31500004E5000C01400670A207900C014002A506002BE
S31500004E609BCD2E3C00015180200D67402F0D610027
S31500004E703B8A4A406736202D000822074EB90002B9
S31500004E8074A422142F41000422072E80202F000430
S31500004E904EB9000274A42217B280661048 7900C089
S31500004EA007CC2F0D61000E584A80663C4AB900C0F7
S31500004EB0488C6732207900C0488C202800082207D9
S31500004EC04EB9000274A422142F41000422072E803A
S31500004ED0202F00044EB9000274A42217B280660681
S31500004EE06100065A6002614850 8F33C000A0011A63
S31500004EF04CDF30804E754E714E714E7133C000A03E
S31500004F00011C0CB903FFFFFF00C0983A65140CB9E9
S31500004F100F0C3F0000C000FA6308610013DA61005D
S31500004F20FF1233C000A0011E4E754E714E714E71B8
S31500004F3033C000A001200CB903FFFFFF00C0983A60
S31500004F4065240CB90F0C3F0000C000FA62084AB98C
S31500004F5000C000F667106100FAC26100115A6100D4
S31500004F6005646100FAB633C000A001224E754E7189
S31500004F704E714E7133C000A00124518F0CB903FF4E
S31500004F80FFFF00C0983A65680CB90F0C3F0000C0DF
S31500004F9000F6635C6100FA84203900C000F6223C0A
S31500004FA0000151804EB9000274A4223900C000FAF3
```

S31500004FB02F410004223C000151802E80202F000446
S31500004FC04EB9000274A42217B280670A610010E885
S31500004FD0610004F26016203900C000F6B0B900C0C6
S31500004FE000FA6408610010D0610005526100FA2CD5
S31500004FF0508F33C000A001264E754E714E714E7112
S315000050048E7070033C000A001287CFF4247602C18
S3150000501030074 8C0D0800680000288CE20403A1073
S315000050203005 48C0E58806800002884620402F10DB
S3150000503061000 0F44A4066023C0552470C46FFFFF9
S315000050406606 0C4700196DC8300633C000A0012A59
S31500005050 4CDF00E04E754E714E714E7148E70F04FD
S315000050603 3C000A0012C78FF7C004247300748C0BF
S3150000507 0D0800680000288CE20403A10300548C015
S31500005080E58806800002884620402A502F0D6100E0
S315000050900 0964A40670CBCAD000C64062C2D000C33
S315000050A0380552470C4700196DC2300433C000A0C2
S315000050B0012E4CDF20F04E754E714E714E7148E751
S315000050C00F0C33C000A001307CFF7AFF4247287CDA
S315000050D0000288CE300748C0D08038340800320736
S315000050E048C1D2813034180048C0E58806800002E5
S315000050F0884620402A502F0D612C4A40670CBCADD3
S315000051000 00C63062C2D000C3A0452470C4700197C
S31500005110 6DC2300533C000A001324CDF30F04E7551
S31500005120 4E714E714E7133C000A00134558F226FFF
S315000051300 0063EB9000285682009674830290010 3C
S31500005140 48C0E58806800002884620 40B3D0663411
S31500005150302900 02B057662C0CA9EE6B2800000817
S315000051606 4220CA90F0C3F000008631830290014B4
S3150000517 0B05766100CA90030D400000C55C044008E
S31500005180488060024240548F33C000A00136205F41
S3150000519 0588F4ED04E714E714E7148E7030033C0A2
S315000051A000A001387CFF4247227C0002884660222C
S315000051B0202F000C320748C1E589B0B118006510F0
S315000051C03207524148C1E589B0B1180064023C0774
S315000051D052470C4700206C060C46FFFF67D20C4670
S315000051E000036D060C46001B6F080C46001F670285
S315000051F07CFF300633C000A0013A4CDF00C0205FC0
S31500005200588F4ED04E714E714E7148E7070C33C021
S31500005210 00A0013C7CFF4247287C000288CE300774
S315000052204 8C0D0803A340800320748C1D2813034B1
S31500005230180048C0E58806800002884620402A50AB
S315000052402F0D6100FEE24A40670C202F0018B0AD1A
S315000052500 00C66023C0552470C4700196DC030062B
S31500005260 33C000A0013E4CDF30E0205F588F4ED0A7
S31500005270 4E714E714E7148E7031C33C000A00140C9
S315000052802A6F0018266F001C0C55FFFF6712301599
S315000052904 8C0E58806800002884620402850600203
S315000052A099CC0C53FFFF6712301348C0E58806807F
S315000052B00002884620402A5060029BCD2F0C6100D8
S315000052C0FE663C002F0D6100FE5E3E004A466720EA
S315000052D04A476718202C000CB0AD000C671AB0AD19
S315000052E0000C64047EFF60127E01600E70FF600C8D
S315000052F04A476704700160044247300733C000A084
S31500005300 01424CDF38C0205F508F4ED04E714E7137
S315000053104E7148E7010C33C000A0014442472A7C85
S315000053200 00288CE287C00C09808300748C0D0808C
S315000053300C75FFFF08006720320748C1D28130355F
S315000053401 80048C0E58806800002884620402F10D5
S3150000535 06100FDD44A40660E300748C0D08039BC93
S315000053 60FFFF0800601232074 8C1D281300748C0EB
S31500005370D08039B518000800524 70C4700196DAAAD
S3150000538 048790000527648780002487800192F0CB8
S31500005390 4EB90002557633C000A001464CDF30807E
S315000053A04E754E714E714E7148E7010433C000A030
S315000053B00148227900C00106207C00C04604701016
S315000053C020D951C8FFFC0279E0FF00C0460808F961
S315000053D0000000C0460823F900C0983A00C0460401
S315000053E0700F207900C00580C06800100279FFF0B8
S315000053F000C04608817900C0460842473207700857
S31500005400D0B900C001062A403015E4480240000128
S31500005410DE403015E64802400001DE403015EA481D
S31500005420024007FF4A4063025247524158 8D0C41E1
S315000054300 00F6DD4300733C000A0014A4CDF208036
S315000054404E754E714E714E7148E7010C33C000A087
S31500005450014C4FEFF3CC302F0C4448C0D08006806F
S31500005460 00C0464820403E1099CC6034302F0C4492
S3150000547048C0E188068000C01404320748C1E589A7
S31500005480D08120402A502F0D610035704A40670EAA
S31500005490 48572F0D610008684A806702284D534718
S315000054A04A476D04200C67C4200C4FEF0C3433C000
S315000054B000A0014E4CDF3080205F548F4ED04E71DD
S315000054C04E714E712F0733C000A001504FEFFFEC15
S315000054D00CB903FFFFFF00C0983A65483F3C0080C7
S315000054E03F3C003743EF00086100 1650486F000448
S315000054F043EF000461001B764A97671C3F3C00801F
S3150000550048790 0C005CC206F0006486800104EB9E7
S315000055100 0003B983E0060027E014A47660861 1C17
S3150000552 03E0060027EFF30074FEF001433C000A03C
S315000055300 1522E1F4E754E714E714E7148E7010C89
S31500005540 33C000A001544FEFF3B86100FE5C4A403F
S31500005550670000963F3C00113F3C003343EF0008D4
S31500005560610015D8486F000443EF000461001AFE7D
S3150000557 02A57200D67723F3C0011487900C0460447
S31500005580486D00104EB900003B983E00200D675A4A
S315000055904A476656486F00142F0D610001044A40C1
S315000055A06646287C00C014002F14486F00182F0D83
S315000055B0610002E23E00662C486F00142F0D610068
S315000055C0073E4A80671E43EF0014207C00C007CCCC
S315000055D0203C0000030C20D951C8FFFC28BC00C0A9
S315000055E007CC6006429460027EFF30074FEF0C48FE
S315000055F033C000A001564CDF30804E754E714E719F
S315000056004E7148E7010433C000A00158598F48780D
S31500005610 0041487900C046AC4EB9000013862F39C8
S315000056200 00288C26100FB004A4067604BD72ABC73
S31500005630 003E0000603A4A9566082E3C0000FFFFD7
S315000056406012205530280002720AE2680240003FCC
S3150000565 07E003E002007E588068000C046AC20405C
S31500005660209523D500C047AC2F15224D610013A409
S31500005670 0C95003E000065142015B0B9003E4000B0
S31500005680640A20400C68FFFF000266AA588F33C0E8
S3150000569000A0015A4CDF20804E754E714E714E713E
S315000056A048E7071C33C000A0015C598F266F002015
S315000056B02A6F00242EB90002856A42450CB903FF01
S315000056C0FFFF00C0983A650001B0200D670001AAEF
S315000056D0200B670001A44878030D2F0D4EB900007A
S315000056E01386303C00FFC045E148025700FF815752
S315000056F049ED00044BEB001847EF00027CFF600009
S31500005700016608AF00020002082F000200026612BE
S31500005710302D0002720DE268024000014A40660E1A
S315000057206024301 5E448024000014A406718302FD3
S3150000573 00002720AE26802400001720032 00E58946
S31500005740200129860800082F00020002661230 2D6B
S315000057500 0002720EE268024000014A40660E6024B2
S31500005760 3015E648024000014A406718302F000213
S31500005770720AE2680240000172003200E5892001E7
S3150000578029860808082F000200026612302D000242
S31500005790720FE268024000014A40660E607E3015D4
S315000057A0EA48024007FF4A4067720257FF0060401E
S315000057B0302F0002720AE268024000017E003E00BD
S315000057C041EC00102007D080D087EB88D1C030177D
S315000057D0024000FF72003200E589D1C120863017F1
S315000057E0024000FF5240024000FF0257FF0081576F
S315000057F04A45662808 2F000200026604 7E016012F0
S315000058003015024000037201028100 00FFFF82C0D2
S3150000581 03E013017024000FFB0476594302F00026A
S31500005820720AE2680240000152400240000 1E36849
S315000058300 08AF00020002816F0002302F0002E2680A
S31500005840024000014A406600FEC03017E0480240B0
S3150000585000FF5240024000FFE148025700FF815717
S3150000586049EC00D0588D3017E048024000FF0C404C
S31500005870000F6500FE8E60027A013005588F33C036
S31500005880 00A0015E4CDF38E0205F508F4ED04E7195

S315000058904E714E7148E7233E33C000A001604FEFC2
S315000058A0FFD84DEF001C2A6F00502CB90002856E00
S315000058B042460CB903FFFFFF00C0983A650004207A
S315000058C04AAF004C670004182 00D670004124EB959
S315000058D000008E28303C00FFC046E148025600FF1B
S315000058E0815645ED00047018D0AF004C2840367C38
S315000058F0FFFF600002D808AF0002001E322F001E14
S3150000590 0740AE469024100017400 3401E58A220246
S31500005910203218 00B08B66000130302F001E720A4C
S315000059 20E268024000013F00206F004E4868001008
S31500005930 2F0C610025C83F003F3C003243EF0008B2
S31500005940610011F8486F000443EF001C6100171E48
S3150000595 04AAF0018670000F27010D0AF00182F4051
S31500005960001420402210B28B660000DE7014D0AF07
S31500005970 00182A40026F0FFF001E6000009A0256B0
S31500005980FF0060482015B08B662E202D0004B08BDA
S31500005990 6626204F2F2800543F3C00082F1643EF61
S315000059A0002A61000D663F3C0004486F00222F0D5F
S315000059B04EB900003B168C403016024000FF5240A4
S315000059C0024000FF0256FF008156508D082F00024C
S315000059D0001E66047E016012301402400003720 14C
S315000059E002810000FFFF82C03E013016024000FF28
S315000059F0B04765900256FF00302F001E720CE26819
S31500005A00 0240000F52400240000FE368026F0FFF92
S31500005A10001E816F001E302F001E720CE2680240CD
S31500005A20000F206F004C322800140241000FB041D5
S31500005A306500FF4C3F3C00012F0E204F2F28001A17
S31500005A404EB900003B988C40322F001E740AE46960
S31500005A50024100017400 3401E58A2202203218084E
S31500005A60B08B6658302F001E720AE2680240001B1
S31500005A703F00206F004E486800102F0C6100252063
S31500005A803F003F3C003143EF0008610010AE486F15
S31500005A90000443EF001C610015D44AAF0018671CD0
S31500005AA07010D0AF00182A402015B08B660E3F3C10
S31500005AB000012F0E2F0D4EB900003B98303CFFE041
S31500005AC0C054670000BE0256FF0060000088302FF9
S31500005AD0001E720AE268024000017E003E0041EAB2
S31500005AE000102207D281D287EB89D1C1321602413A
S31500005AF000FF74003401E58AD1C22010B08B6642E3
S31500005B002F0C610023BC3F003F3C003043EF0008F0
S31500005B1061001028486F000443EF001C6100154E19
S31500005B204AAF0018671C7010D0AF00182A40201525
S31500005B30B08B660E3F3C00012F0E2F0D4EB90000B4
S31500005B403B983016024000FF5240024000FF0256CA
S31500005B50FF0081564A46662A082F0002001E660488
S31500005B607E016012301402400003720102810000BF
S31500005B70FFFF82C03E013016024000FFB0476500BD
S31500005B80FF4E302F001E720AE268024000015240AA
S31500005B9002400001E36808AF0002001E816F001E8C
S31500005BA0302F001EE268024000014A406600FD4EAA
S31500005BB03016E048024000FF5240024000FFE14834
S31500005BC0025600FF815645EA00D0588C3016E04850
S31500005BD0024000FF0C40000F6500FD1C08AF0002EC
S31500005BE0001E2A7C00001418287C00E00052025691
S31500005BF0FF00607E025600FF6058301602 4000FF2C
S31500005C007E003E0048780001302F0022720AE268CA
S31500005C10024000013200C2FC00A8D28C3016E048D7
S31500005C20024000FF3400C4FC00A8D2822007D080C6
S31500005C30D087E588D28020012F004E953016E048A7
S31500005C40024000FF5240024000FFE148025600FFBA
S31500005C5081563016E048024000FF0C40000E659A5F
S31500005C603016024000FF5240024000FF0256FF007D
S31500005C7081563016024000FF0C4000016500FF7699
S31500005C80302F001E720AE268024000015240024 0B4
S31500005C900001E36808AF0002001E816F001E302F6E
S31500005CA0001EE268024000014A406600FF42487852
S31500005CB00001487900E001A24E953F3C00003F3CC0
S31500005CC0003443EF000861000E72486F000443EF92
S31500005CD000004610013984EB900008E4460027C01F6
S31500005CE030064FEF002833C000A001624CDF7CC4B1
S31500005CF0205F4FEF000C4ED04E714E714E7148E74B
S31500005D002F3E33C000A00164518F266F00342C6FE4
S31500005D1000387CFF2A7C00C0983A283C03FFFFFF2E
S31500005D202015B0846500036E200E67000368200B03
S31500005D30670003622F0E2F0B6100F9662C8B49EF6B
S31500005D400004288B7C0145EF00027AFF2F14224CB9
S31500005D5061000CC04A946318205420280004B0AB9C
S31500005D6000010670CB08464E4202B0010B09566DC4C
S31500005D704A94670001064A946712205430280002AC
S31500005D80720AE2680240003F3E0060043E3CFFFFAC
S31500005D9030070640FFD00C40000462 0000E4D0400B
S31500005DA0303B00064EFB000200820046000A00D28D
S31500005DB000D620542EA800102017B085670000C218
S31500005DC041EE00043017E048024000FF3200C2FCFA
S31500005DD000D0D1C1302F0002720AE26802400001F1
S31500005DE072003200E589D1C120946000 0942054ED
S31500005DF02EA800102017B0856700008641EE00042B
S31500005E003017E048024000FF3200C2FC00D0D1C18A
S31500005E105088302F0002720AE268024000017200C8
S31500005E203200E589D1C12094605620542EA8001076
S31500005E302017B085674A302F0002720AE2680240D6
S31500005E4000017E003E0041EE00043017E0480240AB
S31500005E5000FF3200C2FC00D0D1C141E8001020078B
S31500005E60D080D087EB88D1C03017024000FF720087
S31500005E703200E589D1C1209460067CFF600242466B
S31500005E800C4600016700FEC64A46660002084297B5
S31500005E90025700FF49EE00044BEB0018600001E2D8
S31500005EA008AF000200020 82F000200026612302D21
S31500005EB00002720DE268024000014A40660E60442C
S31500005EC03015E448024000014A406738322F00028C
S31500005ED0740AE469024100017400 3401E58A220271
S31500005EE020341800B085671A302F0002720AE26863
S31500005EF0024000017200 3200E58920014AB4080020
S31500005F0066027C01082F000200026612302D000294
S31500005F10720EE268024000014A40660E6044301587
S31500005F20E648024000014A406738322F0002740AF0
S31500005F30E469024100017400 3401E58A220220343A
S31500005F401808B085671A302F0002720AE26802400C
S31500005F50000172003200E58920014AB40808660291
S31500005F607C01082F000200026614302D0002720F19
S31500005F70E268024000014A406612600000BA30152D
S31500005F80EA48024007FF4A40670000AC0257FF009C
S31500005F906076302F0002720AE268024000017E003D
S31500005FA03E0041EC00102207D281D287EB89D1C195
S31500005FB03217024100FF74003401E58AD1C2201075
S31500005FC0B0856730302F0002720AE268024000019 5
S31500005FD07E003E0041EC00102007D080D087EB8881
S31500005FE0D1C03017024000FF72003200E589D1C1EE
S31500005FF04A9066027C013017024000FF5240024080
S315000060000 0FF0257FF0081574A46662A082F000202
S3150000601000 00266047E016012301502400003720120
S31500006020 02810000FFFF82C03E013017024000FFE0
S31500006030B0476500FF5E302F0002720AE268024038
S315000060400001524002400001E36808AF000200026E
S31500006050816F0002302F0002E268024000014A40D0
S315000060606600FE443017E048024000FF52400240FE
S3150000607000FFE148025700FF815749EC00D0588DD8
S3150000608004A4666103017E048024000FF0C40000FF9
S315000060906500FE0E4A466604200E60027000508FB0
S315000060A033C000A001664CDF7CF4205F508F4ED0D9
S315000060B04E714E714E7148E7273E33C000A001680D
S315000060C04FEFFFF4267900C014007C012C530CB965
S315000060D003FFFFFF00C0983A65000204200B67002B
S315000060E001FE200E670001F84EB900008E284246D8
S315000060F045EF000A303C03FFC0460252FC008152C5
S31500006100303C00FFC046026FFF000008816F0008A8
S3150000611030060240000172 0AE3680892000281 52CA
S31500006120303C00FFC046E148026F00FF0008816F67
S31500006130000084BEE00187AFF6000018C082D000362
S3150000614000 01660A082D000600026700015C41EBAB
S31500006150 0004302F0008E048024000FF3200C2FC75
S315000061600 00D0D1C12848026F0FFF000A600001204D

S3150000617008AF0002000A302F000A720AE2680240E5
S31500006180000172003200E58920014AB40808670060
S3150000619000B2026FFF000008607C2F0542A72F0B9C
S315000061A0204F2F28001443EF0010610012543F3C8B
S315000061B00004486F00027014322F0010740AE4695C
S315000061C00241000174003401E58A2202D0B41808A5
S315000061D0322F0010740CE4690241000F7400340180
S315000061E0E78AD082322F000E024100FF740034018C
S315000061F0E78AD0822F004EB900003B168C40302F24
S31500006200000080240000FF5240024000FF026FFF00FC
S315000062100008816F0008082F0002000A66047E014C
S3150000622060123015024000037201028100000FFFF78
S315000062308 2C03E01302F0008024000FFB0476500D3
S31500006240FF5A302F000A720AE268024000015240EB
S315000062500024000 1E36808AF0002000A816F000AED
S31500006260302F000AE268024000014A406600FF083B
S31500006270302F000A720CE2680240000F52400240C2
S315000062800000FE368026F0FFF000A816F000A302FCC
S31500006290000A720CE2680240000F322E001402411E
S315000062A0000FB0416500FECA302F0008E0480240EA
S315000062B000FF5240024000FFE148026F00FF000865
S315000062C0816F0008588D302F0008E048024000FF1B
S315000062D00C40000E6500FE664EB900008E44300686
S315000062E04FEF000C33C000A0016A4CDF7CE44E7512
S315000062F04E714E714E7148E73F3E33C000A0016CAF
S315000063004FEFFFE645EF000824B9000285742C79AB
S31500006310 00C014000CB903FFFFFF00C0983A6500E7
S31500006320 0320200E6700031A2F5600164AAF0016E8
S3150000633067000 30E4244303C00FFC044E14802526D
S31500006340 00FF81527018D0AF00162640263C00018F
S3150000635051806000 02DA3013EA48024007FF3C0031
S315000063604A46670002B22003320648C14EB900020F
S31500006370502A2E00203900E0000422074EB9000200
S315000063807 4A4223900C000FA2F41000422072E808F
S31500006390202F00044EB9000274A42217B28066387A
S315000063A04AB900C000F66700026E203900C000F648
S315000063B022074EB9000274A4223900E000042F41DE
S315000063C0000422072E80202F00044EB9000274A478
S315000063D02217B28067000240203900E00004220341
S315000063E04EB9000274A42A00206F00162028000867
S315000063F04EB9000274A4BA806600021C203900E07F
S31500006400000422032F4000042005C1414EB90002BA
S31500006410 7B58C14193AF0004202F000422074EB9D8
S3150000642000274A42C0008AF0002000A082F000224
S31500006430000A66047A016008301302 4000033A003D
S31500006440 082F0002000A6614302B0002720FE26861
S315000064500024000014A4066126000018E3013EA488D
S31500006460024007FF4A40670001800252FF006000B9
S3150000647001522F0E2F12610001E22A40300648C059
S3150000648 0D080D08D6700012A300648C0D0800C75B8
S31500006490FFFF08006600011A3012E048024000FFC4
S315000064A00C40000E64403012E048024000FF7E00B3F
S315000064B03E00302F000A720AE268024000013200F4
S315000064C0C2FC00A8068100E0005230120240000FF24
S315000064D03400C4FC00A8D2822007D080D087E5888B
S315000064E0D2802841601A3012E048024000FF064080
S315000064F0FFF272003200E789068100E001A228411E
S315000065003012E048024000FF0C400003670E3012D4
S31500006510E048024000FF0C40000866082F124EB902
S3150000652000013A163012E048024000FF72003200C5
S31500006530D2810681000006D020413F102F2C000496
S31500006540 2F1443EF000E4EB900018 2BE204F2F28E4
S31500006550000443EF00184EB900018 0C4204F558F48
S31500006560 3EA80014300648C0D080D08D2F006100B0
S31500006570 16644A4067047801 60363012E0480240EB
S31500006580 00FF72003200D281068100 0006D0204151
S31500006590 3F10204F558F3EA8001643EF00104EB90E
S315000065A0 0001821A486F000C2F0C4EB900018516A7
S315000065B03012024000FF5240024000FF0252FF002C
S315000065C081523012E048024000FF0C40000E650484
S315000065D07E016008700148C081C53E00301202404D
S315000065E000FFB0476500FE8C302F000A720AE26891
S315000065F002400000152400240 0001E36808AF000279
S31500006600000A816F000A302F000AE268024000018A
S31500006610 4A406600FE183012E048024000FF524031
S31500006620024000FFE148025200FF8152588B3012AF
S31500006630E048024000FF0C40000F6500FD1A6002B2
S31500006640 780130044FEF001A33C000A0016E4CDF12
S315000066507CFC4E754E714E714E7148E7210C33C06D
S31500006660000A00170226F001899CC200967000084F1
S31500006670 41E90004302F0014E048024000FF3200D8
S31500006680C2FC00D0D1C12A48200D6766302F001603
S31500006690720AE268024000017E003E0041ED0010F1
S315000066A02007D080D087EB88D1C0302F001402405D
S315000066B000FF72003200E589D1C14A906734302F5D
S315000066C00016720AE268024000017E003E00701465
S315000066D041ED00102207D281D287EB89D1C1322F3A
S315000066E00014024100FF74003401E58AD1C2D09043
S315000066F02840200C33C000A001724CDF3084205F9C
S31500006700508F4ED04E714E714E714E56FFE248E795
S315000067103F3C33C000A001742D49FFFC45EE000844
S3150000672 03C2E000C286E000E227C0002856041EE95
S31500006730FFF420D9209143EEFFF441EEFFEC20D97F
S3150000674 02091200C67042A5460029BCD200D6622FE
S31500006750302E000A024003FF3F00610013FE321292
S31500006760E049024100FF74003401E58AD0822640E8
S31500006770601641ED00183012E048024000FF72003A
S31500006780 3200E589D1C12648082B000400016604C1
S315000067900 8C60000303C03FFC06E000A670408C646
S315000067A00003283C00015180200C6720200D671C47
S315000067B03013EA48024007FF3E004A476F0E2004A6
S315000067C0320748C14EB90002502A2600267C000135
S315000067D083FA200C6740200D673C202D0008220418
S315000067E04EB9000274A44EB900027B582A0008066E
S315000067F000016622200C671E3006024000013F00A1
S31500006800 2F0C2F1243EEFFE4610010DE486EFFE40A
S31500006810486EFFF44E93200C670000C2200D6700FF
S315000068200 00BC080600026600000B44A476F0000AECE
S31500006830 2F0C2F126100FE242A404A806700009E1A
S315000068402E05607C0806000066242F0743EEFFE253
S315000068504EB900017F28302E000A720CE268024011
S31500006860000F41EEFFE242411210B041664E200D8C
S31500006870674A0C55FFFF674423CD00C000F233D5AD
S31500006880000C000F0307C0018D1D43012E04802403D
S31500006890 00FF72003200E589D1C1302800020240B3
S315000068A0003F3F00558F3E9543EEFFE44EB9000191
S315000068B0821A486EFFE4486EFFEC4E93DE83548DD9
S315000068C02004D085BE80640ABEB900C000FA650007
S315000068D0FFF74486EFFEC486EFFF44E930806000303
S315000068E0660000C608060000662A2F3900C000FAB6
S315000068F043EEFFE24EB900017F28302E000A720CEB
S3150000690 0E2680240000F41EEFFE242411210B04140
S31500006910 660000963012E048024000FF0C40000E70
S315000069206440 3012E048024000FF7E003E00302EF8
S31500006930000A720AE26802400001 3200C2FC00A8A6
S31500006940068100E0005230120240000FF3400C4FC11
S315000069500 00A8D2822007D080D087E588D2802A413D
S31500006960601A3012E048024000FF0640FFF2720053
S31500006970 3200E789068100E001A22A413012E04890
S31500006980024000FF0C400003670E3012E048024050
S31500006990 00FF0C40000866082F124EB900013A1697
S315000069A02F0D486EFFF44E9343EEFFF4206EFFFC6E
S315000069B020D9209133C000A001764CDF3CFC4E5E0E
S315000069C0205F4FEF000A4ED04E714E714E714E56FB
S315000069D0FFF433C000A001782D49FFFC2F3900C019
S315000069E014003F2E000C2F2E000843EEFFF461002A
S315000069F0FD1A43EEFFF4206EFFFC20D9209133C030
S31500006A0000A0017A4E5E205F5C8F4ED04E714E71B3
S31500006A104E714E56FFF448E7231C33C000A0017C9C
S31500006A202D49FFFC4BEE000849EEFFF842944A95CB
S31500006A30670000E820550C68FFFF0002670000DAD7
S31500006A40267C00028846302800027 20AE26802406C

S31500006A50003F0C40003566220CA803FFFFFF000430
S31500006A606218302800020240003FF72003200E589F6
S31500006A70200128B30800600000A27010D0952055B0
S31500006A8032280002024103FF74003401E58AD082F5
S31500006A902880204000C68FFFF0002670A301022554C
S31500006AA0B069000267742F156100E6F03C000C46E1
S31500006AB0001F6764300648C0E5882D730800FFF4A0
S31500006AC0429442472A7C00C098086036300748C086
S31500006AD0D080BC75080066285247 0C4700196C2008
S31500006AE0300748C0D0800C75FFFF080067123207D8
S31500006AF048C1D2813035180048C0E58828B308005F
S31500006B005247300748C0D0800C75FFFF0800670A5F
S31500006B100C4700196C0460B44294224C206EFFFCB2
S31500006B20209133C000A0017E4CDF38C44E5E205F4A
S31500006B30588F4ED04E714E714E714E56FFEC48E74F
S31500006B402F0433C000A001802D49FFFC3E2E000813
S31500006B504AB900C000F667200CB90F0C3F0000C010
S31500006B6000FA650C0C47000A670E0C47001E670802
S31500006B70283900C000F66006283900C000FA2A79D4
S31500006B8000C0488C200D671241ED0010300748C048
S31500006B90E788D1C02A28000460027A00300748C07E
S31500006BA0E588058000C047B020404A906714300749
S31500006BB048C0E788068000C005CC20402C28000489
S31500006BC060324A8563042C05602A300748C0E58890
S31500006BD0068000C046AC20404A906716300748C081
S31500006BE0E588068000C046AC224020512C28000CC7
S31500006BF060027C00703FC047720AE368026E03FFC2
S31500006C00FFEE816EFFEE303C03FFC06E000A026E9F
S31500006C10FC00FFEE816EFFEE200652802D40FFF84D
S31500006C2020390080401 0E0887203C2B9008040100D
S31500006C307418E5A9D0812D40FFF02D44FFF443EEF2
S31500006C40FFEC206EFFFC700320D951C8FFFC33C057
S31500006C5000A001824CDF20F44E5E205F588F4ED09C
S31500006C604E714E714E7148E73F3E33C000A001841D
S31500006C70518F47EF00382A6F003C4247302D000203
S31500006C80720AE2680240003F3C00302D00020240DA
S31500006C9003FF3F4000062F136100E50038000C4457
S31500006CA0001F57C0440048803A0066204AB900C019
S31500006CB0488C6718307C0010D1F900C0488C30062B
S31500006CC048C0E788D1C0242800046002740 0307CE4
S31500006CD000B8D1F900C00106300648C0D080D1C046
S31500006CE03010E248024003FF3E800C44FFFF67007D
S31500006CF0035E0CAD0F0C3F000008630003564A45C7
S31500006D006716300648C0E588068000C046AC2840B5
S31500006D10247C00C047AC6014300648C0E588068075
S31500006D2000C047B02840247C00C048B03004524020
S31500006D3048C0E58806800002884620402F500002A1
S31500006D404A45660A0C46000367047614600276041 8
S31500006D502003E58891AF00027010D093322F000611
S31500006D6048C1E589D081B0AF0002651242934A4519
S31500006D70670608C70000605A08C700016054302D36
S31500006D800002720AE2680240003F72003200068189
S31500006D900000345DC2041081000006712302D000278
S31500006DA0720AE2680240003F0C40003366244A94AF
S31500006DB06720205420280 00C9082321748C1B081E9
S31500006DC0651042934A45670608C70002600408C773
S31500006DD000034A476600027C0C460036671420 53BF
S31500006DE030280002024003FF720032005881E58914
S31500006DF0D3934A93670002522053 0C68FFFF0002A8
S31500006E00660002462C7C0080400814161CBC0080DC
S31500006E103F3C0007486D000220534868 00024EB907
S31500006E20000003B168E400CAD03FFFFFF00046264BA
S31500006E3028932493327C0008D3D3300648C0E788D1
S31500006E40068000C005CC204020D920914A936606D2
S31500006E50363CFFFF60102053302800027 20AE268B9
S31500006E600240003F36000C43001E670E7004D0B986
S31500006E7000C048B023C000C005884A4766160C46C5
S31500006E8000366610 3F042053486800104EB90001D2
S31500006E90A8F88E404A45660623D300C000EC701061
S31500006EA0D093322F000648C1E589D0812F400002D9
S31500006EB04A4766123F2D0002204F2F2800044EB984
S31500006EC00001A8F88E401C824A47660001860CAD78
S31500006ED003FFFFFF00046300017A20532F280004FC
S31500006EE06100DB7C3C004A466F000168302D0002E1
S31500006EF0720AE2680240003F0C400033666C7A3F3B
S31500006F00CA6D000E300648C0E188068000C0140431
S31500006F10320548C1E589D081204020932A7C00C0F3
S31500006F204648300648C0D0804A7508006D2E20536A
S31500006F302028000C320648C1E189068100C01404ED
S31500006F40360648C3D6833435380048C2E58AD2822D
S31500006F5022412051B0A8000C630000F8300648C05A
S31500006F60D0803B85080060000 0EA302D0002E26810
S31500006F700240003F0C40003766687A3FCA6D000E3B
S31500006F80300648C0E188068000C02D04320548C19D
S31500006F90E589D081204020932A7C00C0467A3006BD
S31500006FA048C0D0804A7508006D2C20532028000C5C
S31500006FB0320648C1E189068100C02D04360648C361
S31500006FC0D6833435380048C2E58AD2822241205120
S31500006FD0B0A8000C637C300648C0D0803B85080012
S31500006FE06070302D0002E2680240003F0C4000391C
S31500006FF066123006 48C0E588068000C04918204061
S3150000700002093604E302D0002E2680240003F0C40A3
S315000070100002B6612300648C0E588068000C0497C11
S3150000702020402093602C302D0002E2680240003F91
S315000070300C40002F661C300648C0E588068000C05C
S31500007040 50D220402093600A08C70004600408C795
S315000070500000130075 08F33C000A001864CDF7CFC56
S31500007060205F508F4ED04E714E714E714E56FFDEE0
S3150000707048E7033C33C000A001882D49FFFC47EEDA
S31500007080FFF82A6E00084293302D0002720AE26869
S3150000709000240003F3E000CB90F0C3F0000C000FA52
S315000070A0620A4AB900C000F667000120287C00C0C9
S315000070B000EC0C47003666000 0B26100DF443E007B
S315000070C00C47FFFF66126100DFF63E000C47FFFF2C
S315000070D066063E39000288CE45EEFFF424944A92B5
S315000070E0675E2F126100E0B43C000C46FFFF67505C
S315000070F0026E03FFFFF2006ED400FFF2303C03FF86
S3150000710 0C047026EFC00FFF2816EFFF23F2EFFF2D7
S315000071102052486800024EB90001A8F8300648C05F
S315000071200E58806800002884620402690201290932B
S31500007130E4803F002053486800124EB90001A8F8C9
S315000071403F074EB90001A89A300748C0E588068077
S31500007150000288462040269 02F0D2F136100FB0861
S31500007160 6100E1B06100D96060604A94661C3F3CF2
S31500007170000013F3C003643EEFFE26100F9BE486E77
S3150000718 0FFE243EEFFDE6100FEE42F0D2F146100E7
S31500007190FAD63E000807000167263F3C00013F3C47
S315000071A0003643EEFFE26100F992486EFFE243EEDD
S315000071B0FFDE6100FEB82F0D2F146100FAAA3E0013
S315000071C04A4766042694600242932 24B206EFFFCD7
S315000071D0209133C000A0018A4CDF3CC04E5E205F88
S315000071E0588F4ED04E714E714E7148E7073E33C0F0
S315000071F000A0018C4FEFFFEC3C2F00383A2F003AED
S315000072002A6F003C4247287C00C047AC247C000023
S3150000721 06B3A2C7C00006C660C46002166460CB965
S315000072200F0C3F0000C000FA630001204AB900C0FD
S3150000723048B0670001164A94670001103F073F3CBB
S31500007240003643EF00044E9248572F144E963F07E0
S315000072503F3C002143EF00044E9248572F144E96B0
S31500007260600000E80CB90F0C3F0000C000FA620A8B
S3150000727 04AB900C000F6670000D047EF00104A94F4
S31500007280662E26B9000288C22F136100DE9A4A4094
S3150000729 0661E3F3C001F4EB90001A89A3F3C000104
S315000072A03F3C003643EF00044E9248572F134E964C
S315000072B03F053F0643EF00044E92307C00B8D1F9FB
S315000072C000C0010670003006D080D1C0082800003A
S315000072D000016732 48572F144E963E0066284A45ED
S315000072E06724200D67203F052F0D70003006E588C6
S315000072F0068000C046AC22402051486800104EB9B6
S315000073000000 3B988E40307C00B8D1F900C00106E1
S31500007310720032 06D281D1C130100800000F672AF0
S3150000732048 57224B6100FD464A93671C4A45671A37

S31500007330200D67163F052F0D2053486800104EB9E3
S3150000734000003B988E4060027E0130074FEF00142C
S315000073503 3C000A0018E4CDF7CE0205F508F4ED002
S315000073604E714E714E7133C000A0019042A73F3C52
S31500007370000204F3F28000A6100FE7033C000A0C5
S31500007380019 2205F548F4ED04E714E714E714E5603
S31500007390FFFC33C000A001942D49FFFC7000302E85
S315000073A00008E588068000C046AC2240206EFFFC3F
S315000073B0209133C000A001964E5E205F548F4ED0C0
S315000073C04E714E714E714E56FFFC33C000A00198AF
S315000073D02D49FFFC7000302E0008E788068000C0AB
S315000073E005CC2240206EFFFC20D9209133C000A09E
S315000073F0019A4E5E205F548F4ED04E714E714E7183
S315000074004E56FFE648E73F3C33C000A0019C2D499D
S31500007410FFFC286E000C227C0002857841EEFFF40A
S315000074202 0D92091200C670001B62654263C000185
S3150000743051802 02B000822034EB9000274A44EB9D5
S3150000744000027B5828002D44FFF841EB0018302E2F
S31500007450008E048024000FF72003200E589D1C111
S315000074602A48303CFFE0C05567000174 20033215FE
S31500007470EA49024107FF7400340122024EB90002B4
S31500007480502A2C002F0C2F2E00086100F1CE2A4026
S31500007490247C00C00106200D6700010C49EEFFF0B8
S315000074A028847A01600000F2202EFFF0B0AE0010B2
S315000074B0650000DA70003006D0AEFFF0B0AE001402
S315000074C0620000CA302B00140240000F0C4000017D
S315000074D067282F2EFFF043EEFFEA4EB900017F2802
S315000074E0302E000A720CE2680240000F41EEFFEAFD
S315000074F042411210B041660000942D7C000000004D
S31500007500FFEC2052302800060 24000FFBA40657C9E
S31500007510424760443 00748C04480D080D08D6736EB
S3150000752030 0748C04480D0800C75FFFF08006726EE
S3150000753030 0748C04480D080558F3EB5080043EEE2
S31500007540FFE84EB90001806E486EFFE8486EFFEC1A
S315000075504EB9000235D0524720523028000602406C
S31500007560 00FFBE4065AE486EFFF4486EFFEC4EB9B4
S3150000757000 0238DA4A406F142D6EFFECFFF4202E1D
S31500007580FFF072003206D0812D40FFF87000300601
S31500007590D1AEFFF05245548D2003D084222EFFF049
S315000075A0B2806500FF042052302800060 24000FF2A
S315000075B0C0C6323C0E1002810000FFFF82C03001BF
S315000075C0486EFFE602800000FFFF4EB900025B0C2A
S315000075D0486EFFE6486EFFF44EB9000235F443EEFE
S315000075E0FFF4206EFFFC20D9209133C000A0019E3D
S315000075F04CDF3CFC4E5E205F4FEF00104ED04E71CC
S315000076004E714E714E56F2D048E7033C33C000A08F
S31500007610 01A02D49FFFC2E2E000C2C2E0010227CE2
S315000076200002858041EEF2D0703920D951C8FFFCA6
S3150000763045EEF3A024AE00082007223C000151804D
S315000076404EB9000274A4C1414EB900027B58C14133
S315000076502D41F3AC2D46F3B02D7C00000000FFF465
S31500007660 42AEFFF849EEF3B82D7C00003102F3A4D8
S31500007670 47EEFFEC605C2F0C2F2EF3A0610005BCDB
S315000076802A404A80670C202D0004B0876504B08626
S3150000769063122F062F072F0C2F2EF3A0224B61000B
S315000076A0FD606008224D204B20D92091486EFFF4E2
S315000076B02F0B4EB9000238DA4A406F16202EFFF023
S315000076C0B087650EB086620A224B41EEFFF420D9E0
S315000076D020912F0C486EF2D04EB900018DF24A006F
S315000076E0669443EEFFF4206EFFFC20D9209133C050
S315000076F000A001A24CDF3CC04E5E205F4FEF000CA5
S315000077004ED04E714E714E7148E7230433C000A02F
S315000077 1001A4598F227C00C001024AB900C048B0BA
S31500007720670000822A7C00C005880839000700C06F
S3150000773049E066682C3C03FFFFFF203900804010BB
S31500007740E0887203C2B90080401074 18E5A9D081A0
S3150000775020559090CC804A7900C0522666047E005F
S3150000776060282006323900C0522648C1243C0098C1
S31500007770 96802E8020024EB90002502A2200201741
S315000077804EB9000274A42E802E004A95671C20066E
S31500007790D0872055D0A8000422806010205522A84A
S315000077A000D04600842B900E000004291588F33C0DF
S315000077B000A001A64CDF20C44E754E714E714E716D
S315000077C048E7270C33C000A001A83A2F001C9BCD28
S315000077D07CFF4247287C00C01404300548C0E1887D
S315000077E0D08C320748C1E589D08120402F10610036
S315000077F0120A4A40673E2F0D610012004A40671E7A
S31500007800320548C1E189D28C340748C2E58AD28262
S3150000781022412051202 8000CB0AD000C6416300522
S31500007820 48C0E188D08C320748C1E589D081204024
S31500007830 2A503C0752470C4700406D9E300633C025
S31500007840 00A001AA4CDF30E4205F548F4ED04E7169
S315000078504E714E7148E7270C33C000A001AC3A2F99
S31500007860001C9BCD7CFF4247287C00C014043005D9
S31500007870 48C0E188D08C320748C1E589D0812040D4
S315000078802F10610011764A40673E2F0D6100116C82
S315000078904A40671E320548C1E189D28C340748C286
S315000078A0E58AD28222412051202 8000CB0AD000C7E
S315000078B06316300548C0E188D08C320748C1E58997
S315000078C0D08120402A503C0752470C4700405D9E0D
S315000078D0300633C000A001AE4CDF30E4205F548F89
S315000078E04ED04E714E714E714E56FFF448E73F3CF6
S315000078F033C000A001B02D49FFFC266E000C227C8F
S31500007900 00029E1441EEFFF420D92091200B67005F
S31500007910 02242A53200D6700021C302D0014E04873
S31500007920 0240001F3A00302E0008E048024000FFE7
S31500007930 72003200E589303518180240000338001D
S315000079404A44660C0C4500186D047803600238053D
S31500007950302D00140240000F3C0045EE000A082EB0
S3150000796000000000116708424736065343602830126C
S31500007970720CE2680240000FB0466506424776FF89
S3150000798060143012E2680240000F3E003012E268D5
S31500007990 0240000F36003C076000019441EB0004F2
S315000079A0302E0008E048024000FF3200C2FC00D042
S315000079B0D1C12848302E000A720AE268024000014E
S315000079C072003200E58920014AB408006700015EB2
S315000079D09BCD082E0002000A670848C58BC46000CC
S315000079E0000230050C40000167280C400002674A7F
S315000079F00C400003676C0C400008670000920C40C6
S31500007A000000C670000B00C40001867000 0D460004E
S31500007A1000FA7014322E000A740AE4690241000169
S31500007A2074003401E58A2202D0B41800320648C137
S31500007A30E789D0812A40600000D27014322E000AF5
S31500007A40740AE4690241000174003401E58A2202E5
S31500007A50D0B41800320648C1E989D0812A406000B6
S31500007A6000AA3E0648C77014322E000A740AE4695A
S31500007A700241000174003401E58A2202D0B41800E4
S31500007A802207D281D287E789D0812A40607C701490
S31500007A90322E000A740AE4690241000174003401BE
S31500007AA0E58A2202D0B41800320648C1ED89D08199
S31500007AB02A4060563E0648C77014322E000A740AE1
S31500007AC0E4690241000174003401E58A2202D0B45F
S31500007AD018002207D281D287EB89D0812A40602AFA
S31500007AE03E0648C77014322E000A740AE469024141
S31500007AF000 0174003401E58A2202D0B4180022077E
S31500007B00D281D287ED89D0812A40200D671E302E82
S31500007B10000 8024000FF72003200E7892001487524
S31500007B20080 0486EFFF44EB9000183FA5246BC4382
S31500007B306F00FE6A43EEFFF4206EFFFC20D9209111
S31500007B4033C000A001B24CDF3CFC4E5E205F4FEF1D
S31500007B5000 0A4ED04E714E714E7148E7010C33C08B
S31500007B6000A001B43E2F00104A47661C2A7900C0C7
S31500007B70487C2F0D61000E844A40663C6100D82A7D
S31500007B80287C00C0460C603470003007E18806B00F
S31500007B9000C0140472003207D281068100C0464834
S31500007BA02041321048C1E589D08120402A502F0D4E
S31500007BB061000E484A40670449ED0018200C33C0A6
S31500007BC000A001B64CDF3080205F548F4ED04E713E
S31500007BD04E714E7133C000A001B8558F3EAF000AFA
S31500007BE0204F3F10204F2F2800084EB90001A8F85B
S31500007BF0548F33C000A001BA205F5C8F4ED04E7107
S31500007C004E714E712F0D33C000A001BC2A6F0008C3

S31500007C10200D67103F3C0004486F000E2F0D4EB933
S31500007C2000003B1633C000A001BE2A5F205F4FEF65
S31500007C30000C4ED04E714E714E7148E7230C33C086
S31500007C4000A001C0226F001C99CC205130280014DE
S31500007C50E0480240001F3E00302F0018E048024076
S31500007C6000FF72003200E58930301818024000032B
S31500007C703C004A46660C0C4700186D047C03600203
S31500007C803C07200967000222241E90004302F001852
S31500007C90E048024000FF3200C2FC00D0D1C12A48B1
S31500007CA0200D670002044 3EF001A3011720AE268E1
S31500007CB00240000172003200E58920014AB5080839
S31500007CC0670001E608110002670848C78FC6600012
S31500007CD0000230070C400001672A0C40000267686A
S31500007CE00C40000367000 0A60C40000B670000E88F
S31500007CF00C40000C670001240C400018670001646A
S31500007D00600001A67014322F001A740AE469024159
S31500007D10000174003401E58A2202D0B51808322F1A
S31500007D20001A740CE4690241000F74003401E78AFA
S31500007D30D082322F0018024100FF74003401E78A16
S31500007D40D0822840600001627014322F001A740A33
S31500007D50E469024100017400340 1E58A2202D0B5CB
S31500007D601808322F001A740CE4690241000F7400DF
S31500007D703401E98AD082322F0018024100FF7400D4
S31500007D803401E78AD08228406000011E302F001A95
S31500007D90720CE2680240000F7E003E007014322F23
S31500007DA0001A740AE4690241000174003401E58A8C
S31500007DB02202D0B518082207D281D287E789D0815E
S31500007DC0322F0018024100FF74003401E78AD08286
S31500007DD02840600000D47014322F001A740AE46937
S31500007DE0024100017400340 1E58A2202D0B5180868
S31500007DF0322F001A740CE4690241000F740034013A
S31500007E00ED8AD082322F0018024100FF740034013F
S31500007E10E78AD0822840600000903 02F001A720C4A
S31500007E20E2680240000F7E003E007014322F001AF6
S31500007E30740AE4690241000174003401E58A2202F1
S31500007E40D0B518082207D281D287EB89D081322F8C
S31500007E500018024100FF74003401E78AD0822840EE
S31500007E606046302F001A720CE2680240000F7E0056
S31500007E703E007014322F001A740AE4690241 0001B0
S31500007E8074003401E58A2202D0B518082207D2818F
S31500007E90D287ED89D081322F0018024100FF74008D
S31500007EA03401E78AD0822840200C33C000A001C2EA
S31500007EB04CDF30C4205F508F4ED04E714E714E71E4
S31500007EC033C000A001C4226F0004303CFFE0C05163
S31500007ED067163011EA48024007FF72003200D2816D
S31500007EE05C81E489300160024240 33C000A001C6D3
S31500007EF0205F588F4ED04E714E714E7148E7030089
S31500007F0033C000A001C8226F000C206F001030287B
S31500007F100004E0480240001F3C004A6F0014673A24
S31500007F2008290000 20001675A3011024000033 20698
S31500007F3002810000FFFF82C03C01300648C0E7888E
S31500007F405C80E4882E000829000400016736 30288A
S31500007F5000040240000FCEC0602A0829000200017A
S31500007F606720300648C0E7885C80E4882E00082930
S31500007F70000400016 70E302800040240000FCEC046
S31500007F80600242473007 33C000A001CA4CDF00C080
S31500007F90205F4FEF000A4ED04E714E714E7148E78A
S31500007FA0030033C000A001CC226F000C206F00102C
S31500007FB0302B0004E0480240001F3E004A6F0014CB
S31500007FC06732301102400003320702810000FFFFD2
S31500007FD082C03E0108290000300016738302 80004EA
S31500007FE00240000FC0C772003200E7895C81E48955
S31500007FF02C01602208290000600026718302 80004B8
S315000080000240000FC0C772003200E7895C81E48934
S3150000801 02C016002424630063 3C000A001CE4CDF80
S3150000802000C0205F4FEF000A4ED04E714E714E7168
S31500008030 33C000A001D02239003A00200481003A62
S3150000804000007018B2806F0C0C81000020006C04D8
S31500008050 2001600270FF33C000A001D24E754E7140
S31500008060 4E714E7148E7011C33C000A001D461C0B7
S315000080704A806F4A7E00267C003A00002013B08BAF
S31500008080 65080C80003A200063202A7C00034188A2
S31500008090 284B600E2014B09567047EFF600C588D47
S315000080A0588CBBFC0003419865EA4A8766122A4B46
S315000080B06002DE9DBBF9003A002065F660027EFF95
S315000080C0200733C000A001D64CDF38804E754E71B4
S315000080D04E714E712F0733C000A001D8598F610031
S315000080E0FF504A806D122079003A002020102E8021
S315000080F06100FF72D09767187E0123F90003419053
S3150000810000 0C0058023F90003418800C0058460167D
S31500008110424723F9003A000800C0058023F9003AD7
S315000081200000000C005843007588F33C000A001DA74
S315000081302E1F4E754E714E714E7133C000A001DC7C
S3150000814042410C79001E003C046E661A2039003C40
S31500008150 0464B0B900C0983A660C0CB90F0C3F0025
S3150000816 0003C046064027201300133C000A001DEED
S315000081704E754E714E714E714E56FF2648E7213CA4
S31500008180 33C000A001E02D49FFFC2A6E0008227CC6
S31500008190 0002866841EEFF26703320D951C8FFFCE5
S315000081A03091224D41EEFF3A700620D951C8FFFCAE
S315000081B03091082D000500016708 2E3C0000FFFFE6
S315000081C060027EFF49EEFFF808150004671 04AB901
S315000081D000C047AC672428BC003E0000601C4AB9BA
S315000081E000C048B06714303900C0980848C0E58818
S315000081F00680000288462040 28904A946700016263
S31500008200 47EEFF7660000 0B42F0D2F146100017C4D
S31500008210 1D40FF764A00670A0C00000267046000F2
S3150000822000092081500076742424 0102D00032054B3
S31500008230 3228000 2740AE4690241003FB0416672C6
S31500008240082D00060001661020 2D0006C087222892
S31500008250000CC287B081665A4AAD000A670C202D11
S3150000826 0000A2054B0A8000466480815000 6671ADC
S315000082702F14224C6100E79C2F0D2F146100010C76
S31500008280 1D40FF760C00000167E6082D0006000180
S31500008290 67124AAD000E660C205420 28000C52804E
S315000082A02B40000E2D54FF262D6EFF26FF5842AEA2
S315000082B0FF6C2F14224C6100E75A4AAEFF26660671
S315000082C04A946600FF447E0528AEFF2647EEFF3639
S315000082D045EEFF3260702F0D2F14610000AE1E00B8
S315000082E04A0067140C000002672C0C000004674C5F
S315000082F00C000005673E604652AEFF36205430281B
S31500008300002024003FF72003 2005881D3AEFF32F2
S31500008310 2D48FF2A602852AEFF362054302800022E
S31500008320024003FF720032005881D3AEFF322D485F
S31500008330FF2A600842AEFF3642AEFF3242942F1447
S31500008340224C6100E6CE4A94668C082D0007000197
S315000083500670E0C070004670842AEFF3642AEFF32D6
S31500008360 43EEFF26206EFFFC703320D951C8FFFC78
S3150000837 0309133C000A001E24CDF3C844E5E205FAA
S31500008380588F4ED04E714E714E7148E7030833C078
S31500008390 00A001E449EF0010226F0014082900052F
S315000083A0000167082E3C0000FFFF60027EFF4A9432
S315000083B06700008E4A9466047CFF601020543028C3
S315000083C00002720AE2680240003F3C002029001ABF
S315000083D0B0B900C0983A660E20540CA803FFFFFF00
S315000083E00004620000E82029001AB0B900C0993ADB
S315000083F0670E4A80630A2054B0A80004660000CEC7
S3150000840008110005670A2014B0B900C0487C67301F
S315000084100811000767364240102 90003B046662C53
S31500008420 2029000EC08720542228000CC287B08164
S31500008430661A0811000166140829000700016 7067C
S31500008440 7E046000008E7E02600000884240102993
S31500008450 0003B04666324240102900 04B046662842
S31500008460 2054202 8000CC08722290006C287B0812C
S31500008470655A2028000CC0872229000EC287B081C9
S315000084806 3064AA9000E6244205420280008B0A9B9
S31500008490 00166438B0A9001265320811000267168A
S315000084A0424010290003BC406D224240102900 04BE
S315000084B0BC406E18601A424010290002207C00035E
S315000084C045DC424112306000C04166047E01600214
S315000084D04207100733C000A001E64CDF10C0205F42
S315000084E0508F4ED04E714E714E7148E7071C33C007

S315000084F000A001E8598F3C2F00202A6F0022302D62
S31500008500004AB0466604424760240C4600016608ED
S315000085104AAD000C620E60104A6D004C660A52406D
S31500008520B04666047E0160061B7C0005005049D7F4
S315000085304A47670001503B46004A424748780020B8
S31500008540486D00524EB9000013B641ED005228881E
S31500008550267C00C0983A600001144AAD0046661AAF
S31500008560226D00322054316900020002206D003273
S315000085703B680002004E600000EC0CAD00000001FC
S3150000858000466620082D0003001467102F134EB90D
S3150000859000018A8020542080600000CA2054209365
S315000085A0600000C2206D003230280002024003FF46
S315000085B0720032005881202D0046B081664C20544E
S315000085C030AD004E2054317CFFFF00020C2D00021E
S315000085D00050660E1B7C000400503B46004C6000B9
S315000085E0008C42AD00462F2D003243ED0032610073
S315000085F0E422486D00142F2D00326100FD8E1B40D1
S3150000860000500C00000167DE6062082D00030014B4
S3150000861067427204B081651E200866063A3CFFFF79
S31500008620600E30280002720AE2680240003F3A00FB
S315000086300C450030671E206D0032202D0046E5886F
S31500008640D1C02F1052AD00464EB900018A80205489
S3150000865020806014226D0032202D0046E588D3C0AC
S315000086602054209152AD0046524758940C470020A2
S315000086706C124A2D00506700FEE20C2D00020050DD
S315000086806700FED80C2D00040050660E3B6D004AB4
S31500008690004C2054317CFFFF00024A6D004C630CF5
S315000086A0BC6D004C63061B7C00050050102D00506D
S315000086B0588F33C000A001EA4CDF38E0205F5C8FA2
S315000086C04ED04E714E714E7148E7030C33C000A078
S315000086D001EC598F3C2F00182A6F001A0C46000136
S315000086E066124A6D004A660C42AD00467E01422D76
S315000086F000506016302D004A5240B04666047E0196
S3150000870060081B7C0005005042474A47670000D6B8
S3150000871049D741ED005228883B46004A424760004A
S3150000872000B6202D00467203B0816248D040303B2F
S3150000873000064EFB00020008001A0022002A205400
S315000087403B680002003820543B680002004E607E01
S3150000875020542B50003A607620542B50003E606E19
S3150000876020542B500042486D003643ED000861004E
S31500008770E8FC605A302D004E024003FF72003200C2
S315000087805881202D0046B081652820543010B06DE8
S31500008790004E67081B7C00050050603A0C68FFFF1E
S315000087A0000266081B7C00020050602A42AD0046AB
S315000087B0602420542F107010D0AD000872FCD2AD8A
S315000087C00046E589D0812F004EB900003A2A589418
S315000087D0524752AD00460C4700206C084A2D005007
S315000087E06700FF40102D0050588F33C000A001EEE7
S315000087F04CDF30C0205F5C8F4ED04E714E714E7193
S3150000880048E7073E33C000A001F05D8F42052C7C8F
S3150000881000C0010A203900C00106B08E660001962C
S315000088202F0E610002664A406700018842472A7C93
S3150000883000C00112287C0003461C267C00C001866D
S31500008840247C00C0014E0C47000E6C0000EE303C4C
S31500008850FFE0320748C1E589C07518006700008847
S31500008860300748C0E5882C0030356800EA480240E9
S3150000887007FF485702800000FFFF4EB900025B0C5D
S3150000888048574874680048736800 4EB9000238AC0F
S31500008890320748C1E589303518020800000F6734F1
S315000088A0300748C0E5882C0030356800EA480240A9
S315000088B007FF485702800000FFFF4EB900025B0C1D
S315000088C048574874680048726800 4EB9000238ACD0
S315000088D0600000D4320748C1E58930351802080027
S315000088E0000D66226044300748C0E588083500025E
S315000088F008016728320748C1E589300748C0E5887E
S3150000890027B418000800320748C1E589300748C077
S31500008910E58825B418000800600000 8C300748C0C0
S31500008920E58827BC0000000008003007 48C0E5883D
S3150000893025BC000000000800606C303CFFE03207F8
S3150000894048C1E589C0751800674232 0748C1E58904
S3150000895030351800EA48024007FF485702800000F9
S31500008960FFFF4EB900025B0C4857300748C0E58848
S31500008970D08C2F0070F2D04748C0E588068000C032
S315000089800 1BE2F004EB9000238AC601A300748C04D
S31500008990E58872F2D24748C1E589068100C001BE6A
S315000089A0204120B4080052470C47000F6D00FE9886
S315000089B060027AFF4A05662C203900C00106B08E97
S315000089C0660A2F0E610000C44A4067162F3900C0A0
S315000089D001063F3C004E3F3C001C6100E80E3A0099
S315000089E060027AFF10055C8F33C000A001F24CDFF5
S315000089F07CE04E754E714E714E7148E7010433C0EE
S31500008A0000A001F42E3C03FFFFFF2A6F000C200D8F
S31500008A10670E202D0004B0876506B0AD00106746CE
S31500008A200200D674C202D0004B08764442039 00C017
S31500008A30983AB087653A222D0010B2806632302D02
S31500008A40 0014E0480240001F0C4000016622302D51
S31500008A50 00140240000F72003200207900C0058029
S31500008A60B2A8000E660A486D0010611E3E00600244
S31500008A704247300733C000A001F64CDF2080205F5C
S31500008A80588F4ED04E714E714E7148E7230033C059
S31500008A9000A001F8226F00107C01424741E900085E
S31500008AA060000162303CFFE0C050671C3010EA48AD
S31500008AB0024007FF323C05A002810000FFFF82C092
S31500008AC048414A416200013B7003C028000167002E
S31500008AD0012E303C1F00C06900046700012 23010DF
S31500008AE0024000033229000 4E0490241001FB04160
S31500008AF06200010C30290004E0480240001F3210D9
S31500008B00024100030280 0000FFFF80C148404A4046
S31500008B10660000EC700FC0290005670000E2082817
S31500008B200003000 1676C303CFFE0C050670000D0D6
S31500008B30303CFF00C0690006670000C44A290007F0
S31500008B40670000BC30290006E048024000FF3229D9
S31500008B5000 06024100FF02800000FFFF80C148407E
S31500008B604A406200009A30290006E048024000FFB1
S31500008B703210EA49024107FF343C05A00282000098
S31500008B80FFFF84C102800000FFFF80C248404A40C8
S31500008B90626C0828000600026766082800070002C3
S31500008BA0675C303CFF00C069000667524A2900072F
S31500008BB0674C30290006E048024000FF32290006D3
S31500008BC0024100FF02800000FFFF80C148404A408A
S31500008BD0622C30290006E048024000FF3210EA49C4
S31500008BE0024107FF343C05A002820000FFFF84C15A
S31500008BF002800000FFFF80C248404A4063024246AE
S31500008C0052475 8884A466F080C47000F6D00FE967B
S31500008C10300633C000A001FA4CDF00C4205F588F35
S31500008C204ED04E714E714E7133C000A001FC598F6B
S31500008C303F3C001C43EF00026100E7544A97671A65
S31500008C40205748680010 6100FE424A40670C7010C9
S31500008C500D09723C000C00106600A23FC000344A489
S31500008C60000C00106203900C00106588F33C000A09D
S31500008C7001FE4E754E714E714E7133C000A002005A
S31500008C80598F3F3C002243EF00026100E7024A97FA
S31500008C900670A205723E8001000C0983A588F33C05F
S31500008CA000A002024E754E714E714E7133C000A087
S31500008CB00204007908000080400833C000A00206C4
S31500008CC04E754E714E714E7148E7C0FC33C000A020
S31500008CD00208598F2A7C000004CC6004205D4E9067
S31500008CE0BBFC000004EC65F4247C008040140812F0
S31500008CF00006673A08D20006287C00C07B4C2A4C46
S31500008D00267C00C07B566002548DBBCB64044A555A
S31500008D1066F6BBCB661813FC00EA00804015200BF4
S31500008D20908CE2802F002F0C4EB9000013262A7C6F
S31500008D3000C000FE0C15003F660000D44215287CDA
S31500008D40000C052264A54673A267C00C0010053539D
S31500008D5066304A546F04521560025 3154A5466042D
S31500008D604253601E3F144EB900024A4248C0223C9C
S31500008D7000002625A2E81220020174EB90002502AA4
S31500008D803680287C00E0000052942A7C000004EC27
S31500008D906004205D4E90BBFC000004EC65F42014DA
S31500008DA0723C4EB9000270904A8066542A7C0000CC
S31500008DB004EC6004205D4E90BBFC000004EC65F4FE
S31500008DC02014223C00000E104EB9000270904A801A

S31500008DD0663E2A7C000004EC6004205D4E90BBFCDD
S31500008DE0000004EC65F42014223C000151804EB9C9
S31500008DF0000270904A8066182A7C000004EC600429
S31500008E00205D4E90BBFC000004EC65F46002521538
S31500008E1008D20007588F33C000A0020A4CDF3F0378
S31500008E204E734E714E714E7133C000A0020C08F99C
S31500008E30000100C049E033C000A0020E4E754E711D
S31500008E404E714E7133C000A0021008B9000100C077
S31500008E5049E033C000A002124E754E714E714E713C
S31500008E602F0D33C000A002144FEFFFC0007C070097
S31500008E7023F9000008B2008040082A7C000005643F
S31500008E80600A2F0D61000880205D4E90BBFC00003B
S31500008E90057065EE48780040486F00044EB9000042
S31500008EA012C648790002DCD7486F00044878000BE8
S31500008EB04EB9000010B848574EB9000049164EB9D1
S31500008EC00001A2BC4FEF004033C000A002162A5F8B
S31500008ED04E754E714E714E712F0733C000A00218A9
S31500008EE02E3900E00004203C00C000004480068OCB
S31500008EF000C0998CE4802F00487900C000004EB96C
S31500008F00000013864879000349 9C487900C097F809
S31500008F10203C00C097F84480068000C0998CE4800D
S31500008F202F004EB90000119023C700E0000433C0A3
S31500008F3000A0021A2E1F4E754E714E714E7133C02F
S31500008F4000A0021C598F4A7900C052266608427951
S31500008F5000C0010060263F3900C052264EB900020B
S31500008F604A4248C0223C0002625A2E812200201743
S31500008F704EB90002502A33C000C00100588F33C0DA
S31500008F8000A0021E4E754E714E714E7133C000A088
S31500008F90022013FC00010080400013FC000000804A
S31500008FA0400213FC000E00804004203C00C0E2F8A2
S31500008FB04480068000C0E478E4802F00487900C031
S31500008FC0E2F84EB90000138642380000033C000A014
S31500008FD002224E754E714E714E7148E7013E33C006
S31500008FE000A00224598F6100FEF0203C00C0998C3D
S31500008FF04480068000C0E2F8E4802F00487900C073
S3150000900000998C4EB9000013862A7C008040080255D0
S315000090107FFF3015720FE26802400001024000 0136
S31500009020720EE3680255BFFF81553015E26802 40B3
S315000090300001024000 01720DE3680255DFFF815511
S3150000904030 15E268024000010240000 1720CE3683C
S31500009050 0255EFFF81553015E26802400001 0240DB
S3150000906000 01720BE3680255F7FF81553015E2687F
S315000090700240000102400001720AE3680255FBFF4C
S315000090808155 3015E268024000010240000 1720974
S315000090 90E3680255FDFF815533FC001900E00FF22D
S315000090A033FC001A00E00FF433FC001B00E00FF65F
S315000090B033FC001C00E00FF833FC001D00E00FFA43
S315000090C033FC001E00E00FFC33FC001F00E00FFE27
S315000090D04EB90001A1384EB90001A1B4027CF8FFD7
S315000090E0027CDFFF4EB9000080D4287C00C049E036
S315000090F0227C000008B6204C10D910912A7C0080F2
S31500009100400A3015E2480240000102000001 0894BE
S3150000911000000811430150800000 7670A005500801A
S315000091200 8D4000760283015080000 05670A0055B6
S31500009130002008D4000660163015080000 06670AED
S31500009140005500 4008D40004600408D40003267CBF
S3150000915000080401 42C7C0080401508130006670828
S315000091600 8D300061CBC00EA2A7C00000410247CFC
S31500009170000009706600 82F0D4E92205D4E90BBFCB6
S3150000918000000428 65F0081300066 70808D30006E7
S3150000919001CBC00EA2A7C0000042860082F0D4E92B1
S315000091A0205D4E90BBFC0000043465F008130006F9
S315000091B0670808D300061CBC00EA0814000566 0010
S315000091C0014047D726B900C048B02A7C00C000FA43
S315000091D02C7C00E000000814000767000088203C93
S315000091E000E0000044800680 00E00240E4802F009A
S315000091F0487900E000004EB9000013864A936732B2
S315000092004A9366063E3CFFFF6010205330280 0025A
S31500009210720AE2680240003F3E000C4700036612F5
S315000092204A93660642954296602E20532AA8000865
S31500009230 60244AB900C00588660842B900C0010228
S3150000924 0600E207900C0058823E8000400C00102F2
S31500009250 2AB900C001022C953F3C00064EB9000019
S3150000926073 6660564EB9000077082AB900C001023D
S315000092702C95081400066 7563F3C00044EB90000C2
S31500009280736 64A9367204A9366063E3CFFFF60106A
S3150000929020533028 0002720AE2680240003F3E0076
S315000092A00C470003671 03F3C00074EB90000736689
S315000092B008D4000260044A93660842B900E000043C
S315000092C0603E205323E8000800E00004603208 14E2
S315000092D0000046706 3F3C000560043F3C00084EB9A9
S315000092E00000736620 3900E00004B0966208728 8B8
S315000092F0D296B081640A7088D09623C000E000043C
S31500009300 2A7C000004346008 2F0D4E92205D4E909A
S31500009310BBFC0000043865F02A7C000004386008B5
S31500009320 2F0D4E92205D4E90BBFC0000048865F028
S31500009330 2A7C0000048860082F0D4E92205D4E9016
S31500009340BBFC0000048865F02A7C000004886008E5
S31500009350 2F0D4E92205D4E90BBFC0000048C65F0F4
S31500009360 2A7C0000048C60082F0D4E92205D4E90E2
S31500009370BBFC000004B065F008140000670A3F3C1F
S3150000938000 0004EB90000736630390080400E720D41
S31500009390E26802400001020000010894000811406
S315000093A03F3C00024EB900007366089400052A7C13
S315000093B0000004B060082F0D4E92205D4E90BBFC5D
S315000093C0000004C465F02A7C000004C460082F0D68
S315000093D04E92205D4E90BBFC000004CC65F06116F9
S315000093E060FC588F33C000A002264CDF7C804E758F
S315000093F04E714E714E7148E7203E33C000A00228E0
S31500009400287C00C000FA267C00E00000247C00C016
S3150000941000F62C7C000073664A92674E0C940F0C83
S315000094203F0063063F3C000A4E962A7C000004EC8F
S31500009430600A2F0D610002D0205D4E90BBFC00003B
S3150000944004EC65EE2A7C00000538600A2F0D6100E9
S31500009450 02B6205D4E90BBFC0000054865EE2892E2
S3150000946026944 2923F3C00094E962014B093620A1D
S3150000947020139094 7214B08163062893600001C093
S3150000948020 13B094630001B852944AB900C048B0A2
S31500009490670000944EB90000 77080C930000001492
S315000094A0636A2A7C00C001024A956712700AD0934B
S315000094B02215B280640870F6D093B280624E4EB91F
S315000094C000000770824952A7C000004EC600A2F0D22
S315000094D0610002342 05D4E90BBFC000004EC65EE9A
S315000094E02A7C00000538600A2F0D6100021A205DF3
S315000094F04E90BBFC0000054865EE3F3C001E4E96B4
S31500009500289226944 2923F3C00094E962014207 9D8
S3150000951000C048B090A800080C8000000E1063063A
S315000095203F3C002A4E962A7C000004EC6004205D35
S315000095304E90BBFC0000051065F42A7C0080400EAE
S31500009540267C0080400A103900C049E00200000174
S3150000955042411200301574 0DE46802400001B24029
S31500009560674 63015E46802400001207900C0985C27
S31500009570322800020241 0001B04166063F3C00006D
S3150000958060043F3C00014E963015720DE2680240C1
S315000095900001020000010 8B9000000C049E081395D
S315000095A000C049E00253FFFD207900C0985C0828FE
S315000095B000000003661A30150800000D671230130C
S315000095C0080000 01670A3F3C00004E960253FFFD6B
S315000095D02014723C4EB9000270904A8066602A7C64
S315000095E0000005106004205D4E90BBFC00000530B5
S315000095F065F42014223C00000E104EB90002709053
S315000096004A80663A2A7C0000053060 04205D4E9050
S31500009610BBFC0000053865F42014223C0001518093
S315000096204EB9000270904A8066142A7C0000053804
S31500009630 6004205D4E90BBFC0000053865F42A7C72
S31500009640000005486004205D4E90BBFC00000564E8
S3150000965065F423D400E000044A7900C07B4C660818
S3150000966033FC000100C07B4C33C000A0022A4CDF53
S3150000967007C044E754E714E714E7133C000A0022CA3
S31500009680 4FEFFFC04EB900004884487800404 86F4D
S315000096900 0044EB9000012C62F3900C0AE343F395F
S315000096A000C0AE623F3900C0AE603F3900C0AE6652

S315000096B048790002DCE2486F000E4EB90002438C86
S315000096C03F3900C0AE5E3F3900C0AE5C3F3900C0D6
S315000096D0AE5A3F3900C0AE5848790002DCF2486FF6
S315000096E0003E4EB90002438C4FEF002248574EB958
S315000096F0000049164FEF004033C000A0022E4E7501
S315000097004E714E714E7133C000A002304FEFFFC054
S31500009710487800404 86F00044EB9000012C64879E8
S3150000972000002DD0C48790002DD03486F00084EB9DF
S315000097300002438C204F2F28005048790002DD1983
S31500009740486F00344EB90002438C4FEF001848575B
S315000097504EB9000049164FEF004033C000A0023258
S31500009760205F588F4ED04E714E714E7133C000A09F
S31500009770023442390 0C049E2227C00C0AE6822BCF5
S3150000978000C0CE6C2051213C0001568A228890FCF4
S31500009790002C228833C000A002364E754E714E71E1
S315000097A04E7133C000A002380C39000200C049E2F5
S315000097B066064EB90001A15633C000A0023A4E75A6
S315000097C04E714E714E7148E7033E33C000A0023C15
S315000097D02A7C00C049E24A1566084EB90001A15626
S315000097E060700C15000366602C7C008040081C1617
S315000097F01CBC00804247287C00804014267C00C0A8
S315000098000 0FE247C00E00000602C08140007672698
S31500009810081400066714524708D40006529242 13F1
S315000098201 3FC00EA008040156008521 34EB900018F
S31500009830A15608D400070C15000366060C4702580B
S31500009840 65C81C864215600A0C150001660 41ABC20
S31500009850000233C000A0023E4CDF7CC04E754E7144
S315000098604E714E7148E7030C33C000A002404FEF23
S31500009870FFF4286F00203C2F00242A7C00C0518A68
S3150000988053462E3C000000AA70003006EF889E80EA
S31500009890 4A876F0000E24A3900C052456700008CD3
S315000098A04A46666B4878000348790002E267486FCE
S315000098B000084EB9000258AA1F7C000100032F7948
S315000098C000C0983A00041F7C000100081F7C0018A5
S315000098D000091F7C0001000A1F7C0004000B48578A
S315000098E02F0C4878000C4EB9000010B80C87000009
S315000098F000806D082C3C0000008060022C072F0DB4
S31500009900486C000C70F4D0862F006064700030063E
S31500009910EF88D08D0680FFFFFF42F002F0C0C87F9
S315000099200000000806C422F0760464A4666200C877E
S3150000993000000806D082C3C0000008060022C07AF
S31500009940486C000C2F0D70F4D0862F0060222F0C6F
S3150000995070003006EF88D08D0680FFFFFF42F00E1
S3150000996 00C87000000806D0648780080600 22F0793
S315000099704EB9000010B84A876E0C4A3900C05246EC
S3150000998067046100165070 00B0875CC044004880D0
S315000099904FEF000C33C000A002424CDF30C0205F06
S315000099A05C8F4ED04E714E714E7148E73F3E33C0CC
S315000099B000A002444FEFFEDC42463406227C000241
S315000099C08D3A41EF0012703920D951C8FFFC486F1B
S315000099D000124EB90001930623FC0000986400C0F3
S315000099E0528C23FC0000986400C052884A3900C09B
S315000099F05269670C3F3900C0531A4EB900013EE068
S31500009A00247C00024356267C00C0519A4A3900C085
S31500009A105268670007CA4A3900C05257660007C035
S31500009A202A7C00C0518430154 86F000E0280000069
S31500009A30FFFF4EB900025B0C487900028E22486F88
S31500009A4000012486F01184EB9000238AC287C00C0DD
S31500009A50517E30159054486F000C02800000FFFFC5
S31500009A604EB900025B0C487900028E22486F001046
S31500009A70486F00104EB9000238AC487900028E26B5
S31500009A80486F000C486F000C4EB900023896486FBC
S31500009A9000004486F0114486F011C4EB90002386A71
S31500009AA030159054486F000C02800000FFFF4EB93D
S31500009AB000025B0C487900028E22486F0010486F46
S31500009AC000104EB9000238AC487900028E26486F65
S31500009AD0000C486F000C4EB900023896486F00041F
S31500009AE0486F0114486F01204EB9000238422A7CA3
S31500009AF0000005CC2C7C00C0517A4A3900C0525275
S31500009B00670002D448790002E26B4E92588F4A39B8
S31500009B1000C05255670A363900C052CA3A0360047B
S31500009B2042457617 3E0549EF01206000029A3A0742
S31500009B3048C5320748C1E58930331800486F000E22
S31500009B4048C04EB900025AEC487900028E2E486F82
S31500009B500012486F00124EB90002389648790002 8A
S31500009B608E2A486F000E486F000E4EB9000238422A
S31500009B70486F00062005D080D085D080D08D2F007C
S31500009B80486F000A4EB900023896204F2F2800026F
S31500009B90224C4EB9000262A4300748C0D08006802D
S31500009BA000C0513620403A103005487900028E2216
S31500009BB0486F0118486F00163F4000184EB9000262
S31500009BC03896486F000E4EB900026622916F000C5F
S31500009BD0487900028E22486F011C486F00104EB96A
S31500009BE000023896486F00084EB900026622904 57A
S31500009BF0322F000CB24064243805487900028E22C8
S31500009C00486F0118486F00164EB900023896486F23
S31500009C1000000E4EB90002662298406022487900028 2
S31500009C208E22486F011C486F00164EB90002389606
S31500009C30486F000E4EB9000266223800984532 7C05
S31500009C40001 0D3F900C0497C41EF00FA700420D916
S31500009C5051C8FFFC3091320748C1D281068100020B
S31500009C609DD020413010486F000E48C04EB900020A
S31500009C705AEC487900028E32486F0012486F001283
S31500009C804EB9000238AC2F0C486F000E486F000E1C
S31500009C904EB900023896486F00FA486F000A486FBE
S31500009CA0000A4EB900023896204F2F2800023004D1
S31500009CB0486F001002800000FFFF4EB900025B0CE7
S31500009CC02F0C486F0014486F00144EB900023896E6
S31500009CD0487900028E36486F0010486F00104EB962
S31500009CE000238AC486F00FE486F000C486F000C4D
S31500009CF04EB900023896204F2F2800043004486FD2
S31500009D0000014028 00000FFFF4EB900025B0C487988
S31500009D1000028E22486F0018486F00184EB90002E4
S31500009D2038AC204F2F280010300590 56486F001889
S31500009D3048C04EB900025AEC487900028E22486F9C
S31500009D40001C486F001C4EB9000238AC204F2F286B
S31500009D5000143005486F001C02800000FFFF4EB95A
S31500009D6000025B0C487900028E22486F0020486F83
S31500009D70 0020 4EB9000238AC204F2F2800183007BB
S31500009D8048C0E5880680000006FC2F0048790002DE
S31500009D908E3A486F002A4EB9000238AC204F2F2861
S31500009DA000227003C04748C0068000C051662040AC
S31500009DB0424010103F003F0748790002E2A94E9248
S31500009DC04FEF00205247BE436F00FD64423900C08A
S31500009DD05252600004 0A4240103900C050603F00F1
S31500009DE048790002E2D84E9242401 03900C0505FD6
S31500009DF03F0048790002E2F74E923016486F001A8B
S31500009E0002800000FFFF4EB900025B0C4879000299
S31500009E108E22486F001E486F001E4EB9000238ACF5
S31500009E20204F2F2800164 8790002E30B4E92303956
S31500009E3000C0517C486F002202800000FFFF4EB92F
S31500009E40000 25B0C487900028E22486F0026486F9C
S31500009E50002 64EB9000238AC204F2F28001E487944
S31500009E6000002E3204E923014486F002A0280000060
S31500009E70FFFF4EB900025B0C487900028E22486F44
S31500009E80002E486F002E4EB9000238AC204F2F2806
S31500009E90002648790002E33B4E92203900C0983EE6
S31500009EA0486F00324EB900025B0C487900028E22E0
S31500009EB0486F0036486F00364EB9000238AC204F66
S31500009EC02F28002E48790002E35B4E92303900C0FD
S31500009ED05182486F003A02800000FFFF4EB900022F
S31500009EE05B0C487900028E22486F003E486F003EA8
S31500009EF04EB9000238AC204F2F28003648790002B0
S31500009F00E3754E92204F2F28014448790002E392D0
S31500009F104E92204F2F28015048790002E3A74E9217
S31500009F204FEF0044204F2F28011848790002E3BC68
S31500009F304E92303900C05084486F001602800000EF
S31500009F40FFFF4EB900025B0C487900028E22486F73
S31500009F50001A486F001A4EB9000238AC204F2F285D
S31500009F6000124 8790002E3D24E92303900C0508682
S31500009F70486F001E02800000FFFF4EB900025B0C16
S31500009F8048 7900028E22486F0022486F00224EB99F

S31500009F90000238AC204F2F28001A48790002E3E867
S31500009FA04E92303900C05088486F0026028000006B
S31500009FB0FFFF4EB900025B0C487900028E22486F03
S31500009FC0002A486F002A4EB9000238AC204F2F28CD
S31500009FD0002248790002E3F74E92303900C0508AD9
S31500009FE0486F002E02800000FFFF4EB900025B0C96
S31500009FF0487900028E22486F0032486F00324EB90F
S3150000A000000238AC204F2F28002A48790002E406C7
S3150000A0104E9248790002E4154E924FEF002C4247CB
S3150000A02049EF011C320748C1E589068100C0518A03
S3150000A03020413010486F000E48C04EB900025AEC5D
S3150000A040487900028E2E486F0012486F00124EB9F2
S3150000A050000238964879000028E2A486F000E486F33
S3150000A060000E4EB900023842486F000641ED0090DE
S3150000A070300748C0E788D1C02F082F0C4EB9000220
S3150000A0803896300748C0D080068000C0516A20400C
S3150000A0903A10300544400640FFF0BA4064043805E3
S3150000A0A06006383CFFF09845487900028E3E2F0C3A
S3150000A0B0486F00164EB900023896204F2F28000E22
S3150000A0C03004486F001002800000FFFF4EB9000206
S3150000A0D05B0C2F0C486F0014486F00144EB9000239
S3150000A0E038964879000028E36486F0010486F001087
S3150000A0F04EB9000238AC204F2F28000830044 86FB4
S3150000A1000014028000000FFFF4EB900025B0C487984
S3150000A11000028E22486F0018486F00184EB90002E0
S3150000A12038AC204F2F28001030059056486F001885
S3150000A13048C04EB900025AEC487900028E22486F98
S3150000A140001C486F001C4EB9000238AC204F2F2867
S3150000A150001432074 8C1D281068100C051722041E5
S3150000A16030 10486F001E02800000FFFF4EB900024B
S3150000A1705B0C487900028E22486F0022486F00224D
S3150000A1804EB9000238AC204F2F28001A320748C1BA
S3150000A190D281068100C0516A20413010486F0022EA
S3150000A1A002800000FFFF4EB900025B0C48790002F6
S3150000A1B08E22486F0026486F00264EB9000238AC42
S3150000A1C0204F2F28001E3F0748790002E44D4E928B
S3150000A1D04FEF001E52470C4700046D00FE484A39F7
S3150000A1E000C05257672A4A3900C0526867224AB9E6
S3150000A1F000C052D052C04400488002400001ED48E1
S3150000A20008B9000600C051FD817900C051FC7C01EF
S3150000A2104A3900C0525F671A7003C07900C052F213
S3150000A220E1480279FCFF00C051FC817900C051FC75
S3150000A2307C014A3900C05260671C7003C07900C0B7
S3150000A24052F6720AE3680279F3FF00C051FC817985
S3150000A25000C051FC7C014A3900C05261671C70077E
S3150000A260C07900C052FA720CE36802798FFF00C011
S3150000A27051FC817900C051FC7C014A3900C0526210
S3150000A2806718700FC07900C052FE0279FFF000C057
S3150000A29051FA817900C051FA7C014A3900C05263F3
S3150000A2A0673A700FC07900C053020240000FE948B8
S3150000A2B00279FF0F00C051FA817900C051FA2039A6
S3150000A2C000C05300E88802400001E14808B90000D8
S3150000A2D000C051FA817900C051FA7C014A3900C0A8
S3150000A2E05264671C703FC07900C053067209E36868
S3150000A2F0027981FF00C051FA817900C051FA7C01D0
S3150000A3004A3900C052656718703FC07900C0530AC9
S3150000A3100279FFC000C051FC817900C051FC7C016C
S3150000A3204A3900C0526A67263F3C00042F3900C0F4
S3150000A330531C43EF00144EB90002631C486F000E15
S3150000A3404EB90002662233C000C051FE7C014A3974
S3150000A35000C0525E670A13F900C052EF00C05224D3
S3150000A3604A3900C0525A67000092227C00028904D2
S3150000A370207C00C0518A702620D951C8FFFC30913C
S3150000A380424542477C003C0570003007D08006807D
S3150000A390000289A222402006D080D086EB88D08B8E
S3150000A3A072003207E589D08120403151000025247C0
S3150000A3B00C47001865D252450C45000165C4227C45
S3150000A3C0000289D2207C00C051FA700920D951C8F8
S3150000A3D0FFFC309113FC000100E001AA423900E0C5
S3150000A3E001AB423900E001AC13FC000100E001AD15
S3150000A3F0427900C052267C0134062A7C0080404007
S3150000A400287C0080404 42C7C0080403C4A3900C0B7
S3150000A41052676728 0279EFFF0080400802547FFFE9
S3150000A42000056800002567FFF0255FEFF0255FDFFD3
S3150000A430005580000079100000804008 4A3900C0AD
S3150000A440526D6756487900028E42487900C05328FB
S3150000A450486F00164EB900023896486F000E4EB986
S3150000A460000265FC33C000C052264A4066084279A5
S3150000A47000C0010060244A406C083E00444748C7BB
S3150000A48060043E0048C7203C0001312D22074EB92A
S3150000A4900002502A33C000C001004A3900C052668B
S3150000A4A0670274014A3900C0526B671E4A3900C000
S3150000A4B0525567167003C0B900C052C8068000C066
S3150000A4C05166204010B900C053234A3900C0526774
S3150000A4D0670000FC13FC000100C050540279EFFF36
S3150000A4E00080400802793FFF00804046007940002 6
S3150000A4F00080404608B90006008040241039008 0DC
S3150000A50040240200000342441800023900FC008087
S3150000A51040240279F3FF00804046005502000054B3
S3150000A5208000000550100301602401FFF3A00303C03
S3150000A5300FFFC07900C053120254F00081542A7CE8
S3150000A54000C0523C0C9500001E006C062ABC0000A0
S3150000A5501E002E3CFFFFF100DE9560164A7900C012
S3150000A5607B4E660833FC000100C07B4E4EB90001ED
S3150000A570A17E2F39000283884EB9000037100C40A7
S3150000A580FFFF66062015B08762D20254F000005421
S3150000A59008007003C004023900FC008040248139A1
S3150000A5A00080402408B900060080402408F900060F
S3150000A5B00080402408B9000700804024303C1FFF7B
S3150000A5C0C0450256E00081564 23900C050544A390F
S3150000A5D000C0525B670000D44A3900C05251660081
S3150000A5E000CA2A7C00C050574A3900C05268662407
S3150000A5F04A3900C0526C661C4A3900C0525566146E
S3150000A6004A3900C05259660C4215423900C05054AE
S3150000A610600000984A3900C05268670808F90001CE
S3150000A62000C050544A3900C0526C670C23F900C070
S3150000A630532400C05050600A23FC0000000000C0F4
S3150000A6405050 4A3900C05255671813F900C052CB12
S3150000A65000C0505908F9000000C050541ABC00044C
S3150000A660 60147018B03900C05059640A13C000C095
S3150000A670505960000 0024A3900C05259671813F950
S3150000A68000C052DB00C0505D08F9000000C0505405
S3150000A6901ABC000460147004B03900C0505D640A2E
S3150000A6A013C000C0505D600000024A3900C0525815
S3150000A6B06704610010F64A4667064EB900014D620E
S3150000A6C04A42673A487900C0518A3F3C00283F3CDD
S3150000A6D000204EB9000071EA610008FA42472A7C60
S3150000A6E000C04D6A3F072F0D4EB9000133AE4BED4A
S3150000A6F002E452470C47000165EA600008A64BEFEA
S3150000A70000E62E3C000240484A3900C0526F6700FE
S3150000A71001D22A87600001B6082F000600F96714E7
S3150000A720486F001248790002E4774E92508F2A7CD7
S3150000A730003C00004247424678003806 7A003A0656
S3150000A74041ED00903007C0FC00C8D1C010280006BB
S3150000A75048803F0041ED00903007C0FC00C8D1C0E2
S3150000A7603F28000441ED00904A30080767063F3C49
S3150000A770002D60043F3C002B41ED00903007C0FCEB
S3150000A78000C8D1C01028000248803F0041ED00906B
S3150000A79003007C0FC00C8D1C03F1041ED00904A30E0
S3150000A7A0080367063F3C002D60043F3C002B41ED4B
S3150000A7B000903007C0FC00C8D1C050887000300639
S3150000A7C0E788D1C01028000648803F0041ED009080
S3150000A7D03007C0FC00C8D1C05088700030 06E7883A
S3150000A7E0D1C03F28000441ED00903007C0FC00C8EE
S3150000A7F0D1C0508870003006E788D1C04A280007CB
S3150000A80067063F3C002D60043F3C002B41ED009065
S3150000A81003007C0FC00C8D1C0508870003006E788F9
S3150000A820D1C01028000248803F0041ED009030075B
S3150000A830C0FC00C8D1C0508870003006E788D1C07F
S3150000A8403F1041ED00903007C0FC00C8D1C05088D1
S3150000A85070003006E788D1C04A28000367063F3CEF
S3150000A860002D60043F3C002B2205D281D285D28187

```
S3150000A87010351802488O3F002004D080D084D08054
S3150000A8803F3508007A003A062005D080D085D08072
S3150000A8904A35080367063F3C002D60043F3C002B09
S3150000A8A03F063F07486F00AC48790002E4B74E9276
S3150000A8B04FEF002A52460C4600186500FE7C5247B0
S3150000A8C00C4700046500FE704BED03C242A7486FBB
S3150000A8D000164EB900018DF24A006600FE3C60008B
S3150000A8E006C2287C00C052C44DEF00E24A3900C0BF
S3150000A8F05256660A4A3900C05257670000B44A39B0
S3150000A90000C05255670000A04A3900C05254670083
S3150000A91000962F4700E6026F00FF00E24A3900C0AA
S3150000A9205254671013FC000100C0524D23D400C0DE
S3150000A93052A8605E700128806058102F00F8488089
S3150000A940206F00CA321002410003C0C13C00303CF7
S3150000A950FFFFD07900C052C6D0467E003E002007D9
S3150000A960D080D087EB88D08B223900C052C8E589C9
S3150000A970D0812A404A3900C0525767063AB900C00A
S3150000A98052D24A3900C0525667083B7900C052CEAF
S3150000A990000242A7486F00164EB900018DF24A0028
S3150000A9A06698600005FE48790002E4F9600000E25E
S3150000A9B04A3900C0525D660A4A3900C0525C6700D7
S3150000A9C000D84A3900C05253670000C04A3900C057
S3150000A9D05259670000B608AF000200E42F7C00025F
S3150000A9E0404000E6026F00FF00E24A3900C05253C1
S3150000A9F06700008413FC000100C0524D23F900C01B
S3150000AA0052C000C052A8606E302F00E2024000FF24
S3150000AA100C40000164603039000C052C2122F00F8A9
S3150000AA204881206F00CA341002420003C2C2D041DE
S3150000AA3053407200320006810000075C204110106E
S3150000AA40488048C0E988068000C0518A223900C083
S3150000AA5052D8E589D0812A404A3900C0525D67083C
S3150000AA603B7900C052EA00024A3900C0525C6706D0
S3150000AA703AB900C052E642A7486F00164EB9000127
S3150000AA808DF24A0066826000051A48790002E545A3
S3150000AA904E92588F6000050C4A3900C0525167002B
S3150000AAA003C070402A8008AF000200E44A3900C0A3
S3150000AAB052536700039613FC000100C0524D23F960
S3150000AAC000C052C000C052A860000380302F00E2D0
S3150000AAD0024000FF0C400001640003700082F0006CE
S3150000AAE000F9670002044A3900C05259660001FAAB
S3150000AAF04A3900C05253660001F04240103900C086
S3150000AB00505D3F004240103900C050593F004A395D
S3150000AB1000C050546608487900002E59160064879FD
S3150000AB200002E5A64E92508F4A3900C0525B66007D
S3150000AB3001B8487900028E46487900C050504EB997
S3150000AB400000238DA4A406F102F3900C05050487959
S3150000AB500002E5C64E92508F0C39000100C05054D9
S3150000AB60630A48790002E5E84E92588F1039008052
S3150000AB704024E808020000037200120OE7890681FB
S3150000AB8000029E1C20412F280004103900804024lA
S3150000AB90E4080200000342411200300l3F00103970
S3150000ABA0008040240200000342411200300l3F00B1
S3150000ABB02F3900C049EA48790002E5FA4E92303949
S3150000ABC000C0522648C0720FE3A8486F001A4EB95B
S3150000ABD000025AEC487900028E4A486F001E486F00
S3150000ABE0001E4EB9000238AC204F2F2800164879B7
S3150000ABF00002E63C4E92303900C051FCE04802406B
S3150000AC0000033F00303900C051FC720AE26802407E
S3150000AC1000033F00303900C051FC720CE26802406C
S3150000AC2000073F00303900C051FA0240000F3F00D4
S3150000AC303039000C051FAE04802400001E948323993
S3150000AC4000C051FAE8490241000FD0413F003039B7
S3150000AC5000C051FA7209E2680240003F3F0048799D
S3150000AC600002E65E4E92303900C051FC0240003FC1
S3150000AC703F0048790002E6944E92083900600C06B
S3150000AC8051FD670848790002E6BB60064879000274
S3150000AC90E6C348790002E6A84E92303900C051FE5C
S3150000ACA0486F00440280000FFFF4EB900025B0CB3
S3150000ACB0487900028E22486F0048486F00484EB916
S3150000ACC0000238AC204F2F28004048790002E6CA1F
S3150000ACD04E92103900C0522448803F004879000245
S3150000ACE0E6EA4E924FEF00444A3900C05259670ACD
S3150000ACF03C3900C052DA3A06600442457C03082F0C
S3150000AD00000600F967124A3900C0526E660A487991
S3150000AD100002E7014E92588F3E0560000128302F51
S3150000AD2000E2024000FF72003200E989068100C09D
S3150000AD30518A70003007E588D2802A414A3900C01E
S3150000AD40526E670000DE302F00E2024000FF320044
S3150000AD50C2FC00B00681000005CC264141EB009004
S3150000AD6070003007E788D1C02848302D0002486FB0
S3150000AD70000E48C04EB900025AEC487900028E2EE9
S3150000AD80486F0012486F00124EB9000238964879 93
S3150000AD9000028E2A486F000E486F000E4EB9000260
S3150000ADA03842486F0006486C0004486F000A4EB9E6
S3150000ADB000023896204F2F2800023015486F0012E7
S3150000ADC048C04EB900025AEC487900028E2E486FF0
S3150000ADD00016486F00164EB9000238964879O002F0
S3150000ADE08E2A486F0012486F00124EB90002384290
S3150000ADF0486F000A2F0C486F000E4EB900023896B5
S3150000AE00204F2F2800063F07302F00EC024000FF9E
S3150000AE1052403F0048790002E71A4E924FEF001069
S3150000AE2060203F2D00023F153F07302F00E802400B
S3150000AE3000FF52403F0048790002E73D4E924FEF37
S3150000AE40000C5247BE466300FED642A7486F001666
S3150000AE504EB900018DF24A006600FC7260000144A2
S3150000AE604A3900C05252670001 3A2A87025600FF4B
S3150000AE704A3900C0525466067001 2880600E13FCE1
S3150000AE800000100C0524D23D400C052A84A3900C068
S3150000AE904D42670000FC08EF000000E6600000F28B
S3150000AEA04A3900C05255670A3A3900C052CA3C05B1
S3150000AEB0600442467A17082F000600F9670E486FAD
S3150000AEC0001248790002E74E4E92508F3E0660000F
S3150000AED000BA302F00E2024000FF7C003C00200652
S3150000AEE0D080D086EB88D08B72003207E589D0817E
S3150000AEF02A404A3900C0526E67767C003C073F2DD7
S3150000AF00000230154 86F001048C04EB900025AECD6
S3150000AF10487900028E2E486F0014486F00144EB90F
S3150000AF200002389648790002 8E2A486F0010486F52
S3150000AF3000104EB900023842486F00082006D08043
S3150000AF40D086D0800680000005CC2F00486F000C0C
S3150000AF504EB900023896204F2F2800043F07486F4D
S3150000AF600009248790002E7614E924FEF0010601898
S3150000AF703F2D00023F153F07486F009048790002B9
S3150000AF80E77F4E924FEF000E5247BE456300FF44E7
S3150000AF9042A7486F00164EB900018DF24A006600BE
S3150000AFA0FF004A3900C0524567047EFD600E4A39EB
S3150000AFB000C0524667047EFE6002424730074FEFEC
S3150000AFC0012433C000A002464CDF7CFC4E754E7156
S3150000AFD04E714E7148E73F3E33C000A002484FEF26
S3150000AFE0FFCC2F79003C0468000C3F3C001E4EB994
S3150000AFF00001A89A0279EFFF0080400842442F7CA6
S3150000B000000005CC00184BEF001249EF001C30047D
S3150000B010C0FC03C20680003C00002F4000144245DD
S3150000B02074003404760036042O3C00000090D0AF53
S3150000B03000143205C3FC00C8D0812C40203C00001F
S3150000B0400090D0AF00183205 48C1E789D08126406C
S3150000B0507200320406810000075C20411210488l0C
S3150000B06048C1E989068100C0518A3C0548C6E58E7B
S3150000B070D2862041301 0486F000848C04EB9000201
S3150000B0805AEC487900028E2E486F000C486F000C6F
S3150000B0904EB9000238964879O0028E2A486F000899
S3150000B0A0486F00084EB90002384248572F0B486FC8
S3150000B0B0002C4EB9000238967200320406810000 58
S3150000B0C0075C2041121048814 8C1E989068100C009
S3150000B0D0518A3C0548C6E58ED28620413028 0002BA
S3150000B0E0486F000848C04EB900025AEC4879000281
S3150000B0F08E2E486F000C486F000C4EB90002389631
S3150000B100487900028E2A486F0008486F00084EB939
S3150000B11000023842485748 6B0004486F00284EB971
S3150000B120000238964246246F0018486F0020486F88
S3150000B130024486F00104EB900023896487900 0284
S3150000B1408E4E486F000C486F00344EB90002389698
```

S3150000B150486F0024486F0028486F00104EB900025F
S3150000B16038964879000028E4E486F000C486F0038BA
S3150000B1704EB9000238964A7900C07B4E660833FC09
S3150000B180000100C07B4E203900C0524090B900C07B
S3150000B190523C7240B0816F064EB90001A17E220377
S3150000B1A0D281D283EB89068100C0519A3E0648C7F8
S3150000B1B0E58FD28720413010486F000848C04EB94D
S3150000B1C000025AEC487900028E2E486F000C486F38
S3150000B1D0000C4EB900023896487900028E2A486F54
S3150000B1E00008486F00084EB90002384248572F0A37
S3150000B1F0486F00304EB900023896207900C0985C3E
S3150000B200302800020800000E67104879000005C8C3
S3150000B210486F002C4EB9000235F44A4566000126F7
S3150000B220486F0028486F002C486F00104EB9000286
S3150000B230389648790000028E4E486F000C2F0C4EB996
S3150000B240000238967020D079000006D83F002F14EF
S3150000B250224C4EB90002631C422F001260123F3C82
S3150000B26000012F14224C4EB90002631C532F00120A
S3150000B27048790000028E522F0C4EB9000238DA4A4045
S3150000B2806C34102F001248804A406C0A1E2F0012A0
S3150000B2904887444760061E2F001248870C47001057
S3150000B2A06C1460BA3F3CFFFF2F14224C4EB90002CB
S3150000B2B0631C522F00124879000028E562F0C4EB98D
S3150000B2C0000238DA4A406F20102F001248804A40A8
S3150000B2D06C0A1E2F001248874447600061E2F001274
S3150000B2E048870C4700106DBC2F0C4EB90002662231
S3150000B2F03F400010422F00133E0648C7202F00147F
S3150000B3002207D281D287D281D08126403F3C0002DB
S3150000B310486F00122F0B4EB900003B162002D0805A
S3150000B320D082EB88068000C0519A320648C1E58972
S3150000B330D08120403E2800023F07486B00044EB9EA
S3150000B3400001A8F841EE0008300648C0E788D1C0E1
S3150000B3502648486F0024486F002C486F00104EB9ED
S3150000B36000023896487900028E4E486F000C2F0C6A
S3150000B3704EB900023896487900028E462F0C4EB917
S3150000B380000238DA4A405DC0440048801F4000137E
S3150000B3902F14224C4EB9000262A47020D07900000E
S3150000B3A006D03F002F14224C4EB90002631C422FD8
S3150000B3B0001260123F3C00012F14224C4EB90002CD
S3150000B3C0631C532F00124879000028E522F0C4EB97F
S3150000B3D0000238DA4A406C34102F001248804A4086
S3150000B3E06C0A1E2F00124887444760061E2F001263
S3150000B3F048870C4700106C1460BA3F3CFFFF2F14BF
S3150000B400224C4EB90002631C522F001248790002EA
S3150000B4108E562F0C4EB9000238DA4A406F20102F94
S3150000B420001248804A406C0A1E2F00124887444783
S3150000B43060061E2F001248870C4700106DBC2F0CAB
S3150000B4404EB9000266223F4000103F3C0002486FA2
S3150000B45000122F0B4EB900003B16486F0020486FB4
S3150000B460002C486F00104EB900023896487900249
S3150000B4708E4E486F000C2F0C4EB900023896487954
S3150000B480000028E462F0C4EB9000238DA4A405DC0E3
S3150000B490440048801F4000132F14224C4EB900026E
S3150000B4A062A47020D079000006D03F002F14224CF1
S3150000B4B04EB90002631C422F001260123F3C00018D
S3150000B4C02F14224C4EB90002631C532F00124879E8
S3150000B4D000028E522F0C4EB9000238DA4A406C3404
S3150000B4E0102F001248804A406C0A1E2F001248870F
S3150000B4F0444760061E2F001248870C4700106C1444
S3150000B50060BA3F3CFFFF2F14224C4EB90002631C69
S3150000B510522F0012487900028E562F0C4EB90002A7
S3150000B52038DA4A406F20102F001248804A406C0AD1
S3150000B5301E2F00124887444760061E2F00124887B8
S3150000B5400C4700106DBC2F0C4EB9000266223F401E
S3150000B55000103F3C0002486F0012486300044EB9D1
S3150000B560000003B1628AF00307020D079000006E4BA
S3150000B5703F002F14224C4EB90002631C422F0012CA
S3150000B58060123F3C00012F14224C4EB90002631C8E
S3150000B590532F00124879000028E522F0C4EB900022A
S3150000B5A038DA4A406C34102F001248804A406C0A40
S3150000B5B01E2F00124887444760061E2F0012488738
S3150000B5C00C4700106C1460BA3F3CFFFF2F14224C4E
S3150000B5D04EB90002631C522F00124879000028E56A3
S3150000B5E02F0C4EB9000238DA4A406F20102F001295
S3150000B5F048804A406C0A1E2F00124887444760065E
S3150000B6001E2F001248870C4700106DBC2F0C4EB938
S3150000B610000266223F400010422F00133F3C00020A
S3150000B620486F00122F0E4EB900003B1628AF002CB3
S3150000B6307020D079000006E63F002F14224C4EB948
S3150000B64000002631C422F001260123F3C00012F14BF
S3150000B650224C4EB90002631C532F00124879000297
S3150000B6608E522F0C4EB9000238DA4A406C34102F35
S3150000B670001248804A406C0A1E2F00124887444731
S3150000B68060061E2F001248870C4700106C1460BA23
S3150000B6903F3CFFFF2F14224C4EB90002631C522F71
S3150000B6A000124879000028E562F0C4EB9000238DA85
S3150000B6B04A406F20102F001248804A406C0A1E2F05
S3150000B6C000124887444760061E2F001248870C4721
S3150000B6D000106DBC2F0C4EB9000266223F400010D0
S3150000B6E0422F00133F3C0002486F0012486E0004D0
S3150000B6F04EB900003B1652465C8A0C4600186D0097
S3150000B700FA7652450C4500046D00F91E524406AF08
S3150000B71000000000B000180C4400016500F8F23F3C40
S3150000B720004F487900C0518A4879003C03C24EB99F
S3150000B73000003B162F3900C000FA4879003C04602F
S3150000B7404EB900003A2A206F000C4868000148797B
S3150000B750003C04684EB900003A2A2F3900C0983AD6
S3150000B76048790003C04644EB900003A2A3F3C000187
S3150000B7704879003C046C4EB90001A8F83F3C001E15
S3150000B7804879003C046E4EB90001A8F80079100013
S3150000B790008040084FEF003433C000A0024A4CDF5F
S3150000B7A07CFC4E754E714E714E7148E72F3E33C08C
S3150000B7B000A0024C4FEFFFE8227C003C03C2207C35
S3150000B7C000C0518A702620D951C8FFFC30914EB96D
S3150000B7D000014D624246267C000005CC4DEF001468
S3150000B7E03006C1FC03C20680003C000024404247EC
S3150000B7F02A4A284B380648C43A0648C52C9420796C
S3150000B80000C0985C302800020800000E670E4879D8
S3150000B81000005C82F0E4EB9000235F4102D0002A7
S3150000B8204880907900006D80640FFE03F003015BA
S3150000B830486F000A02800000FFFF4EB900025B0C51
S3150000B840204F2F28000A43EF00124EB90002631C56
S3150000B85048790000028E5A486F0010486F00104EB9A2
S3150000B86000023896204F2F28000843EF00144EB9E7
S3150000B870000255D42F0E486F0014486F00104EB9C1
S3150000B880000238AC204F2F28000843EF00104EB9B5
S3150000B890000262A4487900028E62486F0010486F69
S3150000B8A000104EB900023842487900028E2E486FC9
S3150000B8B0000C486F000C4EB9000238AC4879000203
S3150000B8C08E5E486F0008486F00084EB90002384285
S3150000B8D0204F2F1043EF00144EB900026088486FC6
S3150000B8E000104EB9000265FC2204D281D284EB8995
S3150000B8F0068100C0519A340748C2E58AD2822041A7
S3150000B90030802005D080D085EB88068000C0519A13
S3150000B910320748C1E589D0812040316D000400021C
S3150000B92052475C8C5C8D0C4700186D00FED00C46AF
S3150000B93000016C000202424749EB00904BEA00907E
S3150000B9402C94102D000248809079000006E40640F1
S3150000B950FFE03F003015486F000A02800000FFFF3D
S3150000B9604EB900025B0C204F2F28000A43EF00124D
S3150000B9704EB90002631C487900028E5A486F0010C7
S3150000B980486F00104EB900023896204F2F28000845
S3150000B99043EF00144EB9000255D42F0E486F001421
S3150000B9A0486F00104EB900238AC204F2F2800080F
S3150000B9B043EF00104EB9000262A4487900028E627D
S3150000B9C0486F0010486F00104EB90002384248799F
S3150000B9D000028E2E486F000C486F000C4EB9000214
S3150000B9E038AC487900028E5E486F0008486F000840
S3150000B9F04EB900023842204F2F1043EF00144EB9C3
S3150000BA0000026088486F00104EB9000265FC207C79
S3150000BA100000075C1230600048814 8C1E989068150
S3150000BA2000C0518A340748C2E58AD282204130805C

S3150000BA302CAC0004102D00064880907900006E624
S3150000BA400640FFE03F00302D0004486F000A0280E8
S3150000BA500000FFFF4EB900025B0C204F2F28000AA2
S3150000BA6043EF00124EB90002631C487900028E5A59
S3150000BA70486F0010486F00104EB900023896204FEC
S3150000BA802F28000843EF00144EB9000255D42F0E9C
S3150000BA90486F0014486F00104EB9000238AC204FB2
S3150000BAA02F28000843EF00104EB9000262A448791F
S3150000BAB000028E62486F0010486F00104EB90002F7
S3150000BAC03842487900028E2E486F000C486F000CF1
S3150000BAD04EB9000238AC487900028E5E486F000805
S3150000BAE0486F00084EB900023842204F2F1043EF2E
S3150000BAF000144EB900026088486F00104EB900026B
S3150000BB0065FC207C0000075C12306000488148C15B
S3150000BB10E989068100C0518A340748C2E58AD28283
S3150000BB20204131400000252474BED00C8508C0C4773
S3150000BB3000046D00FE0C524647EB00B00C460001B7
S3150000BB406D00FC9E4FEF001833C000A0024E4CDF84
S3150000BB507CF44E754E714E714E7133C000A002508A
S3150000BB604A3900C050546714227C00C050574A110D
S3150000BB70670A53116606423900C0505433C000A00C
S3150000BB8002524E754E714E714E7133C000A0025472
S3150000BB90424033C000A00256205F5C8F4ED04E71EB
S3150000BBA04E714E7148E73F3E33C000A002584FEF3A
S3150000BBB0FEB66100131638003A3CFFF3DA444243FE
S3150000BBC0227C0002906641EF0028703920D951C8C6
S3150000BBD0FFFC4A3900C0524B67284A3900C04D4223
S3150000BBE067202A7C00C052A00C9500000002660661
S3150000BBF070012A80600C0C95000000008660470062F
S3150000BC002A80486F00284EB90001930623FC0000E5
S3150000BC10BB8A00C0528C23FC0000BB8A00C052883D
S3150000BC204BEF00FC47EF0130247C000243564A39B3
S3150000BC3000C052536700011E2ABC0023C0DC08EF77
S3150000BC400003 00FA600000F8082F0006010F670ED7
S3150000BC50486F002848790002EB7C4E92508F302FB7
S3150000BC6000F8E048024000FF0C4000036710302F48
S3150000BC7000F8E048024000FF0C400008662C025322
S3150000BC80FF00601A2F134EB900013A163013024016
S3150000BC9000FF5240024000FF0253FF008153301361
S3150000BCA0024000FF0C40000165DA4A3900C0525CD0
S3150000BCB066164A3900C05255660E486F00A048798C
S3150000BCC00002EB814E92508F2F3900C014003F3C8A
S3150000BCD00001204F2F2800FE43EF00224EB900003E
S3150000BCE0670A206F00E0302800020240003F3F0054
S3150000BCF0204F2F28001E2F28001A43EF002A4EB986
S3150000BD0000186C4204F2F2800F0486F001C4EB952
S3150000BD100000236DE486F0018486F0024486F00188E
S3150000BD204EB9000236A0204F2F2800142F280010ED
S3150000BD30206F00F84868000D4E924FEF00CC42A7A6
S3150000BD40486F002C4EB900018DF24A006600FEFADB
S3150000BD50600011604A3900C0525A67542A7C00803C
S3150000BD6040241015E808020000037200120 0E7895B
S3150000BD70068100029E1C20412F2800041015E408AD
S3150000BD80020000034241120030013F00101502007C
S3150000BD90000342411200300 13F002F3900C049EA3A
S3150000BDA048790002EB864E924FEF001060001104B6
S3150000BDB008AF000200FA2ABC0002C0484A3900C097
S3150000BDC0525766084A3900C05255670800AF00014D
S3150000BDD0000400FC4A3900C04D42670608EF000027
S3150000BDE000FC2C7C00C0497C4A3900C052576700D1
S3150000BDF00FB40C39000500C05384640A08EF00072D
S3150000BE0000FF60000FA04A3900C04D42671008AF1E
S3150000BE100002013208AF000000FD60000F8808EF45
S3150000BE2000000400FF60000F7E26AF00F8082F000612
S3150000BE30010F67444A4463404A3900C05259663884
S3150000BE400C440013660A4A3900C0525C6702544526
S3150000BE500C440013660A4A3900C04D42670 2564533
S3150000BE60486F002870003005E588068000028E665F
S3150000BE7020402F104E92508F3013024000FF3200AB
S3150000BE80C2FC02E4068100C04D6A2A4142461C2DCE
S3150000BE9002B642471E2D02B74A3900C052556616F1
S3150000BEA04A3900C05257660E486F00A04879000212
S3150000BEB0EBC84E92508F30040640FFF30C4000074B
S3150000BEC062000EE2D040303B00064EFB000200103E
S3150000BED0034E0ED601A80CF00D4805D80DA4082F68
S3150000BEE00006010F671C227C00029E1441EF01141C
S3150000BEF020D92091227C00029E1441EF011C20D9FA
S3150000BF0020913F073F0648790002EBCD4E92508FB5
S3150000BF1042472079 00C0985C302800020800000FD4
S3150000BF206708287C00029044605A287C00029040F2
S3150000BF306052101C4880024000FFE148025300FF97
S3150000BF4081533013E048024000FF3F002F0D4EB9E9
S3150000BF5000013A963F3C000141ED01BE3013E04836
S3150000BF60024000FF72003200E589D1C12F102F1365
S3150000BF7042A74EB90001621A48790002EBD64E92EA
S3150000BF80588F52470C4700046DA842474A47660639
S3150000BF90025300FF6008025300FF0BD300003F3C35
S3150000BFA000012F1343EF012E4EB9000069CE206F1A
S3150000BFB000DC3013E048024000FF72003200E589E1
S3150000BFC0D1C10828000200016700009 4204F2F28E5
S3150000BFD0012C2F28012841EF011C300748C0E788B3
S3150000BFE0D1C02F2800042F1043EF0124300748C08A
S3150000BFF0E788D3C04EB90001836A206F00E030287D
S3150000C000000020240003F3F00204F2F28012E2F281C
S3150000C010012A43EF002A4EB9000186C4204F2F287B
S3150000C02000F0486F001C4EB9000236DE486F00185B
S3150000C030486F0024486F00184EB9000236A0204F02
S3150000C0402F2800142F280010206F00F84868000DD4
S3150000C0504E924FEF000C48790002EBD86006487903
S3150000C0600002EBDA4E92588F52470C4700026D00E1
S3150000C070FF1C60000D302F134EB900013A164247DF
S3150000C080207900C0985C302800020800000F67087D
S3150000C090287C0002904D605A287C0002904860522D
S3150000C0A0101C4880024000FFE148025300FF815304
S3150000C0B03013E048024000FF3F002F0D4EB900014B
S3150000C0C03A963F3C000141ED01BE3013E048024084
S3150000C0D000FF72003200E589D1C12F102F1342A74D
S3150000C0E04EB90001621A48790002EBE64E92588F6B
S3150000C0F052470C4700046DA83013024000FF3F0072
S3150000C10043EF00264EB900014A82204F2F28002413
S3150000C11048790002EBE84E923013024000FF3F00E0
S3150000C12043EF002E4EB900014A00204F2F28002C65
S3150000C13048790002EBF24E924FEF00102A7C000283
S3150000C14090 52287C00029056600000C4101548806A
S3150000C150024000FFE148025300FF8153206F00DCDC
S3150000C1603013E048024000FF72003200E589D1C179
S3150000C170082800020001670000883F3C00012F13D9
S3150000C18043EF001E4EB9000069CE206F00E0302854
S3150000C190000020240003F3F00204F2F28001E2F289C
S3150000C1A0001A43EF002A4EB9000186C4204F2F28FB
S3150000C1B000F0486F001C4EB9000236DE486F0018CA
S3150000C1C0486F0024486F00184EB9000236A0204F71
S3150000C1D02F2800142F280010206F00F84868000D43
S3150000C1E04E922F1448790002EBFA4E924FEF00144C
S3150000C1F0BBFC000290556712 48790002EBFD600611
S3150000C20048790002EBFF4E92588F528D588CBBFC3A
S3150000C210000290566500FF3660000B8A4A3900C05E
S3150000C2205256660001780253 00FF08D300023F3CD5
S3150000C23000042F0D4EB900013A962F2D01CE4879F4
S3150000C2400002EC0B4E9248790002EC154E92301328
S3150000C250024000FF3F0043EF00324EB900014B1889
S3150000C260204F2F280030487900 02EC174E920253D7
S3150000C27000FF00530A003F3C00012F1343EF00323A
S3150000C2804EB9000069CE206F00F43028000202404B
S3150000C290003F3F00204F2F2800322F28002E43EF6B
S3150000C2A0003E4EB9000186C4204F2F280104486F76
S3150000C2B000304EB9000236DE486F002C486F003859
S3150000C2C0486F002C4EB9000236A0204F2F280028B8
S3150000C2D02F280024206F010C4868000D4E92307CF8
S3150000C2E0009AD1EF010C3013E048024000FF320003
S3150000C2F0C2FC002CD1C14868001A48790002EC2122
S3150000C3004E92025300FF00530B003F3C00012F13D7

S3150000C31043EF00464EB9000069CE206F0108302871
S3150000C32000020240003F3F00204F2F2800462F28E2
S3150000C330004243EF00524EB9000186C4204F2F2819
S3150000C3400118486F00444EB9000236DE486F0040BF
S3150000C350486F004C486F00404EB9000236A0204F8F
S3150000C3602F28003C2F28003B206F01204868000D38
S3150000C3704E924FEF0034307C009AD1EF00EC301330
S3150000C380E048024000FF3200C2FC002CD1C14868E0
S3150000C390001A48790002EC266000035C3013024064
S3150000C3A000FF3F0043EF00264EB900014A823013DA
S3150000C3B0024000FF3F0043EF00224EB900014A0051
S3150000C3C03013024000FF3F0043EF001E4EB900014C
S3150000C3D04B18204F2F28001C204F2F280024204FB9
S3150000C3E02F28002C3F073F0648790002EC2B4E927F
S3150000C3F04FEF00144A3900C05252670009A8287C42
S3150000C40000029C9C6000009210144880024000FFCD
S3150000C410E148025300FF81533013E048024000FF19
S3150000C4203F002F0D4EB900013A9641ED01BE301383
S3150000C430E048024000FF72003200E589D1C12F10AA
S3150000C44048790002EC454E923013E048024000FF66
S3150000C4500C400004660848790002EC53602C303C1E
S3150000C460FF00C053660848790002EC55601C301383
S3150000C470E048024000FF0C40000166084879002CF
S3150000C480EC57600648790002EC5948790002EC4EF8
S3150000C4904E924FEF0010528CB9FC00029CA0650032
S3150000C4A0FF68600009004A3900C0525C660002500D
S3150000C4B0486F00A048790002EC5B4E92508F4A39D1
S3150000C4C000C04D426730303CFF00C05366084879D3
S3150000C4D00002EC62601C3013E048024000FF0C4092
S3150000C4E00005660848790002EC6660064879000295
S3150000C4F0EC6A4E92588F0C39000400C05384640EC7
S3150000C500206F00E00828000200016700089808EF85
S3150000C51000030132203C000000AAD0963213E04905
S3150000C520024100FF3401C4FC002CD08206800000CA
S3150000C5300016224041EF0134700420D951C8FFFC97
S3150000C54030913F3C000D2F1343EF001E4EB9000003
S3150000C55069CE3013E048024000FF72003200D281FB
S3150000C560068100006D020413F10204F2F28001ED4
S3150000C5702F28001A43EF002A4EB9000186C43F3C1B
S3150000C580000B2F1343EF00164EB9000069CE30138F
S3150000C590E048024000FF72003200D28106810000AE
S3150000C5A006D020413F10204F2F2800162F280012BA
S3150000C5B043EF00224EB9000186C43F3C00072F130B
S3150000C5C043EF000E4EB9000069CE3013E04802403A
S3150000C5D000FF72003200D2810681000006D02041A1
S3150000C5E03F10204F2F28000E2F28000A43EF001A75
S3150000C5F04EB9000186C4486F0134486F000C4EB92D
S3150000C600000236DE486F0008486F0014486F0008C5
S3150000C6104EB9000236A0204F2F2800042F10486F75
S3150000C620013C486F001C4EB9000236DE486F001808
S3150000C630486F0024486F00184EB9000236A0204FFC
S3150000C6402F2800142F280010486F0144486F002C33
S3150000C6504EB9000236DE486F0028486F0034486F36
S3150000C66000284EB9000236A0204F2F2800242F287C
S3150000C670002048790002EC6E4E924FEF001C4A39BA
S3150000C68000C0525B6752302F0132720AE2680240E4
S3150000C69000017E003E00486F01347044D0B900C0EE
S3150000C6A001062207E7899287E789D0813213E0499C
S3150000C6B0024100FF74003401E58AD0822F00486FE2
S3150000C6C0002C4EB900023896204F2F280024487986
S3150000C6D00002EC874E92508F4A3900C04D42660CDC
S3150000C6E0486F013848790002EC8F600A486F0138BC
S3150000C6F048790002EC924E92508F600006A83013E3
S3150000C700E048024000FF0C4000036600025230 2F52
S3150000C7100132720AE2680240000013200C2FC00A83F
S3150000C720068100E00052301302 4000FF3400C4FCD2
S3150000C73000A8D282068100000242A41224D41EF42
S3150000C74001242 0D920D92091486F00A04879000201
S3150000C750EC974E923F39000006D62F2D00082F2D5C
S3150000C76000042F1543EF00364EB900018788302F9D
S3150000C770013A720AE268024000017C003C00301374
S3150000C780024000FF7E003E003F39000006D820062A
S3150000C790D080D086E588068000E0000A2207D28194
S3150000C7A0D287E589D08120402F2800082F28000451
S3150000C7B02F1043EF002E4EB900018788302F013A23
S3150000C7C0720AE268024000017C003C00301302401D
S3150000C7D000FF7E003E003F39000006E42006D080C0
S3150000C7E0D086E588068000E0003A2207D281D2870B
S3150000C7F0E589D08120402F2800082F2800042F101B
S3150000C80043EF00264EB900018788205648 68027813
S3150000C810486F00144EB9000236DE486F0010486FAC
S3150000C820001C486F00104EB9000236A0204F2F287A
S3150000C830000C2F2800082056486801 70486F002415
S3150000C8404EB9000236DE486F0020486F002C486F54
S3150000C85000204EB9000236A0204F2F28001C2F289A
S3150000C86000182056486801 44486F00344EB900024B
S3150000C87036DE486F0030486F003C486F00304EB9D6
S3150000C8800002 36A0204F2F28002C2F280028487998
S3150000C8900002EC9C4E924FEF00242F134EB900017C
S3150000C8A03A163F39000006D62F2D00082F2D00041A
S3150000C8B02F1543EF002E4EB900018788204F2F28F1
S3150000C8C0012C2F2801282F2801242F2D00082F2D79
S3150000C8D000042F1543EF00244EB90001854C3F3963
S3150000C8E000006D6204F2F2800162F2800122F28CA
S3150000C8F0000E43EF00264EB900018788205648688F
S3150000C900 0144486F00144EB9000236DE486F00102D
S3150000C910486F001C486F00104EB9000236A0204F29
S3150000C9202F28000C2F28000820564868 0144486F1D
S3150000C93000244EB9000236DE486F0020486F002CF6
S3150000C940486F00204EB9000236A0204F2F28001C49
S3150000C9502F280018 48790002ECB56000030C30134C
S3150000C960E048024000FF0C400008660004 38302F03
S3150000C970013 2720AE2680240000132 00C2FC00A8DD
S3150000C98006 8100E00052301302 4000FF3400C4FC70
S3150000C99000 0A8D282068100000 0602A41224D41EFA4
S3150000C9A0012420D920D92091486F00A04879000 29F
S3150000C9B0ECC64E923F39000006E02F2D00082F2DC1
S3150000C9C000042F1543EF00364EB900018788302F3B
S3150000C9D0013A720AE268024000017C003C00301312
S3150000C9E0024000FF7E003E003F39000006E22006BE
S3150000C9F0D080D086E588068000E000222207D2811A
S3150000CA00D287E589D08120402F2800082F280004EE
S3150000CA102F1043EF002E4EB900018788302F013AC0
S3150000CA20720AE268024000017C003C0030130240BA
S3150000CA3000FF7E003E003F39000006E42006D0805D
S3150000CA40D086E588068000E0003A2207D281D287A8
S3150000CA50E589D08120402F2800082F2800042F10B8
S3150000CA6043EF00264EB9000187882056486802 78B1
S3150000CA70486F00144EB9000236DE486F0010486F4A
S3150000CA80001C486F00104EB9000236A0204F2F2818
S3150000CA90000C2F2800082056486802 4C486F0024D6
S3150000CAA04EB9000236DE486F0020486F002C486FF2
S3150000CAB000204EB9000236A0204F2F28001C2F2838
S3150000CAC000182056486802 20486F00344EB900020C
S3150000CAD036DE486F0030486F003C486F00304EB974
S3150000CAE0000236A0204F2F28002C2F280028487936
S3150000CAF00002ECCB4E924FEF00242F134EB90001EB
S3150000CB003A163F39000006E02F2D00082F2D0004AD
S3150000CB102F1543EF002E4EB900018788204F2F288E
S3150000CB20012C2F2801282F2801242F2D00082F2D16
S3150000CB3000042F1543EF00244EB90001854C3F3900
S3150000CB4000006E0204F2F2800162F2800122F285D
S3150000CB50000E43EF00264EB900018788205648682C
S3150000CB600220486F00144EB9000236DE486F0010EE
S3150000CB70486F001C486F00104EB9000236A0204FC7
S3150000CB802F28000C2F2800082056486802 20486FDE
S3150000CB9000244EB9000236DE486F0020486F002C94
S3150000CBA0486F00204EB9000236A0204F2F28001CE7
S3150000CBB02F28001848790002ECE4600000AC30131E
S3150000CBC0E048024000FF0C400007640001D8486FAF
S3150000CBD000A048790002ECF54E92508F3013E048E1
S3150000CBE0024000FF3F002F0D4EB900013A963F3C30

S3150000CBF0000241ED01BE3013E048024000FF720022
S3150000CC003200E589D1C12F102F1342A74EB900017A
S3150000CC10621A60000190301302400OFF3F0043EFAC
S3150000CC2000264EB900014A823013024000FF3F0041
S3150000CC3043EF00224EB900014A003013024000FFC4
S3150000CC403F0043EF001E4EB900014B18204F2F281E
S3150000CC50001C204F2F280024204F2F28002C3F0790
S3150000CC603F0648790002ECFA4E924FEF001460003E
S3150000CC7001343013024000FF3F0043EF00264EB957
S3150000CC8000014C9E025300FF08D300003F3C000009
S3150000CC902F2D01C22F1342A74EB90001621A4879FF
S3150000CCA00002ED144E92025300FF08D300013F3CF0
S3150000CCB000002F2D01C62F1342A74EB90001621A9C
S3150000CCC048790002ED164E92025300FF005306000B
S3150000CCD03013024000FF3F0043EF011A4EB9000136
S3150000CCE04BFE3F3C0000204F2F28011A2F1342A76E
S3150000CCF04EB90001621A48790002ED184E920253AD
S3150000CD0000FF005306003F3C0000486F011E486DBF
S3150000CD1001D6486F00364EB90002386A204F2F28D8
S3150000CD20002E2F1342A74EB90001621A487900025D
S3150000CD30ED1A4E923F3C00002F2D01D62F1342A72D
S3150000CD404EB90001621A48790002ED1C4E9230136A
S3150000CD50024000FF3F0043EF00364EB900014A8211
S3150000CD6030130240O0FF3F0043EF00324EB900018E
S3150000CD704A00204F2F280030204F2F2800384879AE
S3150000CD800002914E486F0044486F00444EB90002BD
S3150000CD903896204F2F28003C48790002ED1E4E920F
S3150000CDA04FEF002442A7486F002C4EB900018DF2C8
S3150000CDB04A006600F0744A3900C05248660000F422
S3150000CDC04A3900C05247660000EA4A3900C052514B
S3150000CDD0670000E04A3900C05259660000D6206F4D
S3150000CDE000E0301002400003OC400001630000C464
S3150000CDF0082F000200FA660A48790002ED324E92C8
S3150000CE00588F42474A47660602530OFF600802539E
S3150000CE1000FF08D30000206F00DC3013E04802401A
S3150000CE2000FF72003200E589D1C108280002000126
S3150000CE30676C206F00E0302800020240003F3F0090
S3150000CE4041EF0116300748C0E788D1C02F280004FB
S3150000CE502F1043EF002A4EB9000186C4204F2F2819
S3150000CE6000F0486F001C4EB9000236DE486F00180D
S3150000CE70486F0024486F00184EB9000236A0204FB4
S3150000CE802F2800142F280010206F00F84868000D86
S3150000CE904E924FEF000C48790002ED6A6006487921
S3150000CEA00002ED6C4E92588F52470C4700026D00FF
S3150000CEB0FF5430034FEF014A33C000A0025A4CDF43
S3150000CEC07CFC4E754E714E714E7133C000A0025CF3
S3150000CED0720D70003001068000C0524420404A1096
S3150000CEE067043001600A52410C41001463E4424079
S3150000CEF033C000A0025E4E754E714E714E7148E70A
S3150000CF003F3E33C000A002604FEFF2884242227CCF
S3150000CF10000294B441EF0020703920D951C8FFFCBB
S3150000CF20486F00204EB90001930623FC0000EAD6A4
S3150000CF3000C0528C23FC0000EAD600C052882A7C2E
S3150000CF40000243560CB903FFFFFF00C0983A640A7B
S3150000CF5048790002F5866000090247EF00D8247C74
S3150000CF6000C001064A3900C0525F6700046A00AF7C
S3150000CF700029400400F408EF000300F208EF000265
S3150000CF8000F249EF00E02C7C00C05250302F00F236
S3150000CF90024003FFB0426300037A4A166600037438
S3150000CFA0322F00F2024103FF76003601D683068354
S3150000CFB000C0464820433010B0426D0003561CBCEA
S3150000CFC00001302F00F2024003FF72003200D281CE
S3150000CFD0068100C046482041301048C023C000C02A
S3150000CFE052B46000032E082F000601076700014AAD
S3150000CFF0302F00F2024003FF4A4063184AAF00DCBC
S3150000D00067044A16660E48790002F5A54E95588FB4
S3150000D010600003124A16675E4AAF00DC672A703F5B
S3150000D020206F00DCC0A8000C2F0048790002F5B97B
S3150000D0304E95508F206F00DC2F2800083F3C00449F
S3150000D0404EB900000E1E605E0C92000344A46608F2
S3150000D05048790002F62E60160C9200C0010A660896
S3150000D06048790002F63660064879O002F63F4879AC
S3150000D0700002F604602C0C92000344A4660848796A
S3150000D0800002F66560160C9200C0010A660848792F
S3150000D0900002F66D60064879O002F67648790002CD
S3150000D0A0F6454E95508F206F00E02F10487900020C
S3150000D0B0F67C4E95206F00E830280004E0480240D8
S3150000D0C0001F3F0048790002F68F4E95206F00EE54
S3150000D0D0302800040240000F3F0048790002F6A7FE
S3150000D0E04E95206F00F430280006E048024000FF0D
S3150000D0F03F0048790002F6C44E95206F00FA3028AA
S3150000D10000060240O0FF3F0048790002F6D94E951E
S3150000D1104FEF00204A3900C05260660C486F00206D
S3150000D12048790002F6E8600A486F002048790002S4
S3150000D130F7184E95508F78004A3900C05260660045
S3150000D14000C8206F00D830280002024000 3F3F0090
S3150000D150206F00DA302800020800000D67063F3C09
S3150000D16000S960043F3C004E206F00DC302800026E
S3150000D1700800000E67063F3C005960043F3C004E25
S3150000D180206F00DE302800020800000F67063F3CD3
S3150000D190005960043F3C004E206F00E03010024012
S3150000D1A00003 3F00206F00E2082800020001670626
S3150000D1B03F3C005960043F3C004E206F00E40828C5
S3150000D1C000003000167063F3C005960043F3C004EE7
S3150000D1D0206F00E6082800040001670 63F3C00595E
S3150000D1E060043F3C004E206F00E83010EA480240E1
S3150000D1F007FF3F00486F00AA48790002F73C4E95AA
S3150000D2004FEF001A6000010C204F2F2800D84EB9AE
S3150000D21000007EC07A003A0067405885206F00D82B
S3150000D2203028000208000 00F67047E0160024247B2
S3150000D230206F00D8301002400003720102810000 06
S3150000D240FFFF82C0D24770003001E5882205C14148
S3150000D2504EB900027B58C1412A013F3C0001204FD4
S3150000D2602F2800E2204F2F2800DE4EB900007EFC5A
S3150000D2707C003C0067305886206F00D830280002BA
S3150000D2800800000D671E3F3C0000204F2F2800E2DB
S3150000D290204F2F2800DE4EB900007EFC72003200BF
S3150000D2A0DC815886E58E3F3C0001204F2F2800E2A6
S3150000D2B0204F2F2800DE4EB900007F9E7E003E00E4
S3150000D2C067305887206F00D8302800020800000E0B
S3150000D2D0671E3F3C0000204F2F2800E2204F2F28DA
S3150000D2E000DE4EB900007F9E72003200DE81588754
S3150000D2F0E58F2605D686D6872F032F072F062F05FF
S3150000D300486F00A848790002F76D4E954FEF001858
S3150000D310D88342A7486F00244EB900018DF24A0017
S3150000D3206600FCC44A3900C05260670016562F04D6
S3150000D33049EF00602F0C48790002F7854E954FEFB4
S3150000D340000C4A3900C0524B660016384878022055
S3150000D350486F006048790002F79D4E9506840000EC
S3150000D3600220487800 64486F006C48790002F7B6DE
S3150000D3704E950684000000642F04486F00784879B3
S3150000D3800002F7CE4E954FEF0024303C03FFC06FEE
S3150000D39000F266015EE4879002FFAEC486F00603F
S3150000D3A048790002F7DE4E954FEF000C4A8467007D
S3150000D3B015D2203C002FFAEC22044EB9000274A4C8
S3150000D3C02F00486F006048790002F7F54E954FEF41
S3150000D3D0000C600015AE7CFF4A3900C052716654DD
S3150000D3E04A3900C05272664C4A3900C0524B670037
S3150000D3F002B24A3900C05268663A4A3900C05269D8
S3150000D40066324A3900C0526A662A4A3900C0526BEF
S3150000D41066224A3900C0526C661A4A3900C0526DFB
S3150000D42066124A3900C0526E660A4A3900C0526F07
S3150000D430670002703F3C001C43EF010A4EB9000032
S3150000D440738E0C9200C0010A674E24BC00C0010A0C
S3150000D4504AAF0108672E327C0010D3EF0108207C0A
S3150000D46000C0010A704D20D951C8FFFC487900035D
S3150000D470455C487900C001C2487800404EB90000BA
S3150000D4801246014227C000344A4207C00C0010AFD
S3150000D490704D20D951C8FFFC4A3900C05271671A35
S3150000D4A0303C00FFC07900C0533AE148027900FFE2
S3150000D4B000C00110817900C001104A3900C05272C3
S3150000D4C06718303C00FFC07900C0533E0279FF0068

S3150000D4D000C00110817900C00110287C00C0011233
S3150000D4E0267C00C052A04A3900C05268674A4AB931
S3150000D4F000C053146726203C000005A0223900C056
S3150000D50053144EB9000270904A80631048790002A5
S3150000D510F8144E95588F42406000146A303C07FF5D
S3150000D520C07900C05316EB482213D286E5890274EF
S3150000D530001F1800817418004A3900C05269671C20
S3150000D540303900C0531A02400001E9482213D2863E
S3150000D550E58908B40004180181741800 4A3900C02E
S3150000D560526A673C2213D286E58930341800EA48AD
S3150000D570024007FF4A40631E303900C0531E024076
S3150000D5800001E7482213D286E58908B40003180192
S3150000D59081741800600A48790002F82F4E95588F5A
S3150000D5A04A3900C0526B671C303900C05322024012
S3150000D5B00001E5482213D286E58908B40002180165
S3150000D5C0817418004A3900C0526C67187003C0791C
S3150000D5D000C053262213D286E5890274FFFC180088
S3150000D5E0817418004A3900C0526D671E303900C078
S3150000D5F0532A02400001720FE3682213D286E5899E
S3150000D60008B4000718028174180 24A3900C0526E25
S3150000D610674E2213D286E58930341800EA48024064
S3150000D62007FF4A4063302213D286E5893034180258
S3150000D6300B00000F6720303900C0532E0240000159
S3150000D640720EE3682213D286E58908B40006180232
S3150000D65081741802600A48790002F8614E95588F65
S3150000D6604A3900C0526F671E303900C05332024 03B
S3150000D670000172 0DE3682213D286E58908B400051D
S3150000D68018028174180248 7900C0010A4EB90000D8
S3150000D6908A8A4A40660012EC48790002F8B86000AF
S3150000D6A001BA4A3900C0527067344EB9000088008A
S3150000D6B00C000001670C4A0067100C00000267129C
S3150000D6C0602448790002F8CF600E48790002F8E637
S3150000D6D0600648790002F8FD4E95588F60084A3971
S3150000D6E000C05273670A4EB900008C28600012947D
S3150000D6F04A3900C05274671E24BC00C0010A227C4D
S3150000D700000344A4207C00C0010A704D20D951C8F2
S3150000D710FFFC6000126E287C00C00580283C0001DA
S3150000D72051802C7C00017F284A3900C0525967007D
S3150000D73001324A3900C05246660000B048790002FC
S3150000D740F91348790002F90E4E95508F4A3900C0F8
S3150000D750524E67082C3900C052AC60062C3900C006
S3150000D76000FA2A062005223C00093A804EB900023A
S3150000D77074A4C1414EB900027B58C1410681FFFE27
S3150000D780AE802A01424776085243 0C4300076518CB
S3150000D79042434879000 2F9634E95588F2F053F3C66
S3150000D7A000444EB900000E1E48790002F9664E95F7
S3150000D7B02F0543EF00264E96307C00DAD1D443EF96
S3150000D7C00022700010290001EB88D1C048680018BB
S3150000D7D048790002F9684E954FEF000C5247DA84FB
S3150000D7E00C47008C6DA26000119A0C39000500C030
S3150000D7F0538464104AB900C048B0670848790002EB
S3150000D800F96F60564AB900C048B0671648790000FB
S3150000D81096004879 0002F9AC4EB9000159923E00D3
S3150000D82060027E590C47005967060C47007966244A
S3150000D8304EB90001A17E4EB90001A17E3F3C001DFC
S3150000D8404EB90001A89A74FB13FC000100C049E818
S3150000D85060001130487900 02F9D74E95588F600064
S3150000D86011224A3900C0525D674608EF000000F7F2
S3150000D8706028303C03FFC06F00F2660C3F3C000B93
S3150000D8804EB900007366601 2302F00F2024003FFAB
S3150000D89053403F004EB9000233C6486F013C486F03
S3150000D8A000244EB900018DF24A0066C6600010D40D
S3150000D8B04A3900C0526467584A3900C0525366500C
S3150000D8C04A3900C05265670A23F900C0530800E0D0
S3150000D8D001AE4A3900C05266670010A84A3900C036
S3150000D8E0524E6700109E23F900C0530C00E001B6AB
S3150000D8F023F900C052AC00E001D2487900C0530CB5
S3150000D90048 7900E001B24EB9000235D060001074CB
S3150000D9104A3900C0525C6700009E203900C052E4BC
S3150000D92022044EB9000274A44EB900027B582A00A4
S3150000D9302F0543EF00224E96307C00DAD1D443EF18
S3150000D940001E70001029 0001EB88D1C0486800183D
S3150000D95048790002F9EB4E95508F42462E05700726
S3150000D960C0066616487 90002FA0A4E95588F2F07A8
S3150000D9703F3C00744EB900000E1E2F0743EF0022F5
S3150000D9804E9641EF001E7A001A10701AD0942205A6
S3150000D990D281D285E589D0812F0048790002FA0D1F
S3150000D9A04E95508F5246068700000 3840C46006051
S3150000D9B065AC60000FCE4A3900C0525A67744247C0
S3150000D9C0307C00DAD1D4300748C0EB88D1C04A2871
S3150000D9D000186752307C00DAD1D4300748C0EB8893
S3150000D9E0D1C0486800183007524 03F00487900020D
S3150000D9F0FA154E954FEF000A4246307C00DAD1D434
S3150000DA00300748C0EB88D1C070003006D1C0101076
S3150000DA1048803F0048790002FA234E955C8F5246B3
S3150000DA200C46001865D452470C4700106D926000F2
S3150000DA300F524A3900C0525B6746287900C00584F8
S3150000DA40603448790002FA294E952F1C3F3C00436A
S3150000DA504EB900000E1E48790002FA2C4E952F1C76
S3150000DA603F3C00434EB900000E1E48790002FA2ED4
S3150000DA704E954FEF000C2014B08666C660000F046A
S3150000DA804DEF00E84A3900C05255662A4A3900C0AF
S3150000DA90525866224A3900C05254661A4A3900C0A2
S3150000DAA0525666124A3900C05257660A4A3900C0B1
S3150000DAB05262670004E44A3900C0527667064EB9DE
S3150000DAC000004AC649EF013C00AF0018C00000F450
S3150000DAD008EF000300F21F7C000401054A3900C06C
S3150000DAE05261660003B800AF0065003800F445EFE8
S3150000DAF000010600003900 82F000601076726486F94
S3150000DB0000020487900 02FA304E95508F4A3900C0FD
S3150000DB1052616710487 90002FA3C48790002FA35EA
S3150000DB204E95508F2A2F00F470C3C1AF00F408EF52
S3150000DB30000100F71F7C00FF010460000330102F76
S3150000DB400104488048C081FC000448404A406602FF
S3150000DB5042464A3900C05256660A4A3900C05257F0
S3150000DB606700010A082F00070107670000DE206F23
S3150000DB7000D80828000300016708082F000200F2F9
S3150000DB80661A082F000200F2660000C0206F00D857
S3150000DB90302800020800000E670000B04A466642C0
S3150000DBA07C01486F009848790002FA424E95508FE2
S3150000DBB04247601C4A3900C05257670848790002 3C
S3150000DBC0FA47600648790002FA594E95588F52472F
S3150000DBD0102F0104488048C081FC00044840BE4024
S3150000DBE06DD24A4667000286487 90002FA634E956E
S3150000DBF0588F2F0C204F2F2800F44EB900007C3A86
S3150000DC00224041EF0D7020D920914A3900C0525769
S3150000DC10670E204F2F280D743F3C0063600000EC18
S3150000DC20204F2F2800E8486F0D74486F00244EB926
S3150000DC3000023B96204F2F28001C206F00F04868FD
S3150000DC40000D4E95508F600002244A466700021E62
S3150000DC504A3900C05257670A48790002FA656000DF
S3150000DC6001784879 0002FA776000016E4A3900C0EF
S3150000DC7052626600016C082F00070107670001 3E2B
S3150000DC80206F00D808280002000167000130082F25
S3150000DC900000200F2660A082800050002670001 1E5D
S3150000DCA04A4666427C01486F009848790002FA812C
S3150000DCB04E95508F4247601C4A3900C05254670 83F
S3150000DCC048790002FA866006487 90002FA924E9573
S3150000DCD0588F5247102F0104488048C081FC000429
S3150000DCE04840BE406DD24A4667000182487900022C
S3150000DCF0FA9E4E95588F4A3900C052546716206FC7
S3150000DD0000DC2F2800083F3C00444EB900000E1EE0
S3150000DD106000015A3F3C00002F0C204F2F2800F6D0
S3150000DD2043EF01364EB9000078E8206F00D830285E
S3150000DD300002024000 3F3F004A3900C052586720A7
S3150000DD40204F2F28013A2F280136204F2F28013A3D
S3150000DD502F280136224A4EB9000184AE224A6004B9
S3150000DD6043EF012E2F2900042F1143EF00224EB955
S3150000DD70000186C4204F2F2800E8486F000C4EB9DA
S3150000DD800000236DE486F0008486F001C486F000826
S3150000DD904EB9000236A0204F2F2800042F10206F06
S3150000DDA0C0F04868000D4E954FEF000C43EF012C34

S3150000DDB041EF013420D9209160000B24A46670045
S3150000DDC000AC4A3900C0525467084879000 2FAA0EC
S3150000DDD060064879000 2FAAC4E95588F6000008EB6
S3150000DDE04A3900C05262670000842F6F00DC0108C8
S3150000DDF04A4666107C01486F009848790002FAB8D6
S3150000DE004E95508F204F2F2801084EB90000519A89
S3150000DE103F00082F0007010967063F3C00446004E5
S3150000DE203F3C002D206F00E0486800104EB900000E
S3150000DE308A8A4A4067063F3C006D60043F3C002DDD
S3150000DE40204F2F2800E24EB9000089FA4A406706A3
S3150000DE503F3C004360043F3C002D204F2F2800E448
S3150000DE6048790002FABD4E954FEF0010486F013C0D
S3150000DE70486F00244EB900018DF24A006600FCC0CE
S3150000DE802F4500F4486F013C486F00244EB900014D
S3150000DE908DF24A006600FC6060000AE808EF0002A6
S3150000DEA000F27C0008EF000100F7600000D4082FA4
S3150000DEB000060107671E486F002048790002FACE67
S3150000DEC04E9548790002FADA48790002FAD34E955F
S3150000DED04FEF0010102F0104488048C081FC000459
S3150000DEE048404A4066264 86F009848790002FAE0A2
S3150000DEF04E95508F4A3900C052616710487900022A
S3150000DF00FAEC48790002FAE54E95508F48790002FE
S3150000DF10FAF04E95588F4A3900C0526267262F6F25
S3150000DF2000DC0108204F2F2801084EB90000519A45
S3150000DF303F00204F2F2800DE48790002FAF24E9566
S3150000DF404FEF000A082F00070107672A4A3900C069
S3150000DF5052586604 7E0060022E0620542028000 4D3
S3150000DF6090872F0048790002FAFD4E95508F205475
S3150000DF702C280004600A48790002FB034E95588F4E
S3150000DF80486F013C486F00244EB900018DF24A00EB
S3150000DF906600FF1C600009EC4A3900C05252670057
S3150000DFA0033208EF000300F200AF006D40FC00F4FE
S3150000DFB0287C000069CE60000304082F00060107D4
S3150000DFC0672E48790002FB6048790002FB5A4879BF
S3150000DFD00002FB5148790002FB4748790002FB41E9
S3150000DFE0486F003448790002FB0E4E954FEF001C37
S3150000DFF0486F009848790002FB674E95508F206F56
S3150000E00000D80828000200016708082F000200F265
S3150000E010661A206F00D830280002080000D67003D
S3150000E02001B2082F000200F2660001A83F3C000C76
S3150000E030204F2F2800F243EF013A4E943F3C000A4E
S3150000E040204F2F2800F243EF01224E943F3C00065A
S3150000E050204F2F2800F243EF011A4E943F3C000058
S3150000E060204F2F2800F243EF01124E94206F00D864
S3150000E0703028000202400 03F3F00204F2F28013A7F
S3150000E0802F28013643EF00224EB9000186C4204FE7
S3150000E0902F2800E8486F00144EB9000236DE486F9C
S3150000E0A00010486F001C486F00104EB9000236A0E1
S3150000E0B0204F2F28000C2F280008206F00F04868FA
S3150000E0C0000D4E95206F00E43028000202400 03F0C
S3150000E0D03F00204F2F28012E2F28012A43EF002E24
S3150000E0E04EB9000186C4204F2F2800F4486F002047
S3150000E0F04EB9000236DE486F001C486F0028486F94
S3150000E100001C4EB9000236A0204F2F2800182F28D9
S3150000E1100014206F00FC4868000D4E95206F00F03B
S3150000E1203028000202400 03F3F00204F2F280132D6
S3150000E1302F28012E43EF003A4EB9000186C4204F26
S3150000E1402F280100486F002C4EB9000236DE486FBA
S3150000E1500028486F0034486F00284EB9000236A0EB
S3150000E160204F2F2800242F280020206F0108486800
S3150000E170000D4E95206F00FC30280002024000 3F43
S3150000E1803F00204F2F2801362F28013243EF00464B
S3150000E1904EB9000186C4204F2F28010C486F003865
S3150000E1A04EB9000236DE486F0034486F0040486FB3
S3150000E1B000344EB9000236A0204F2F2800302F28F9
S3150000E1C0002C206F01144868000D4E954FEF00306B
S3150000E1D0601048790002FB7448790002FB6C4E958A
S3150000E1E0508F4A3900C05260675C206F00D80828FB
S3150000E1F000003000167000C6302F00F0E04802402F
S3150000E20000FF7E003E007044D0922207E789928785
S3150000E210E789D081486F00184EB900025B0C204F89
S3150000E2202F2800E8486F001C486F001C4EB90002FA
S3150000E2303896204F2F280014206F00EC4868000DF8
S3150000E2404E95508F6076206F00D80828000300195
S3150000E250676A3F3C000B43EF001A4EB9000073C6D5
S3150000E2602F3900C000FA41EF001C2F10204F2F2835
S3150000E27000F843EF0D7C4EB900007604204F2F289E
S3150000E28000E8486F0D74486F00244EB90002389 6B6
S3150000E290204F2F28001C206F00F04868000D4E9577
S3150000E2A048790002FB764E954FEF000C204F2F2841
S3150000E2B00D743F3C00634EB900000E1E42A7486F26
S3150000E2C000244EB900018DF24A006600FCEE6000A3
S3150000E2D006B2263CEE6B28004A3900C0525367004E
S3150000E2E003AC48790002959C487900E001AE4EB92E
S3150000E2F0000238DA4A406F184A3900C0524E66109A
S3150000E3002F7900E001CA00FC2F7900E001CE010060
S3150000E31049EF013C08EF000300F245EF0124082F06
S3150000E320000501076700034 6082F000601076740 3E
S3150000E330486F002048790002FB784E95204F2F2821
S3150000E34001043F3C00444EB900000E1E487900020D
S3150000E350FB8F4E95204F2F28010C3F3C00444EB9B1
S3150000E3600000 00E1E48790002FB9B4E954FEF0010F1
S3150000E370227C00029E14204A20D92091224A41EF95
S3150000E380013420D9209178002A0642471F7C00FFDD
S3150000E39001042F7C006DF20200F460485247206FA2
S3150000E3A000DC20280008B08564182A003F3C0000E5
S3150000E3B02F0C204F2F2800F643EF013E4EB90000E8
S3150000E3C078E8206F00DC20280008B084631628005 7
S3150000E3D03F3C00002F0C204F2F2800F6224A4EB952
S3150000E3E0000078E8486F013C486F00244EB90001F0
S3150000E3F08DF24A0066A6204F2F280100204F2F28B5
S3150000E400 0100204F2F2800F843EF0D7C4EB9000085
S3150000E41076044A476E124AAF0D7463000250202FED
S3150000E4200D74B08364000246486F00984879000274
S3150000E430FBBE4E95508F4A476F0001B0303CFF003F
S3150000E440C06F00F066464A3900C05264673E48799C
S3150000E45000002959C487900E001AE4EB9000238DA18
S3150000E4604A406F28224A207C00E001C220D9209130
S3150000E470205423E8000800E001CE4A3900C0526764
S3150000E480670A23F900C0531000E001B23F0748793C
S3150000E49000002FBC34E95206F00DE302800020240CA
S3150000E4A0003F3F00204F2F2801402F28013C43EF1B
S3150000E4B000284EB9000186C4204F2F2800EE486F71
S3150000E4C0001A4EB9000236DE486F0016486F002269
S3150000E4D0486F00164EB9000236A0204F2F280012B2
S3150000E4E02F28000E206F00F64868000D4E954879DB
S3150000E4F00002FBC94E952F053F3C00444EB9000073
S3150000E5000E1E206F00EE302800020240003F3F0042
S3150000E5102F2A00042F1243EF00384EB9000186C49B
S3150000E520204F2F2800FE486F002A4EB9000236DE23
S3150000E530486F0026486F0032486F00264EB9000229
S3150000E54036A0204F2F2800222F28001E206F0106FC
S3150000E5504868000D4E9548790002FBCB4E952F0476
S3150000E5603F3C00444EB900000E1E48790002FBCD28
S3150000E5704E95204F2F2801622F28015E2F2A000476
S3150000E5802F1243EF004A4EB9000184AE206F0102FC
S3150000E5903028000202400 03F3F00204F2F28004055
S3150000E5A02F28003C43EF004C4EB9000186C4204F93
S3150000E5B02F28011 2486F003E4EB9000236DE486F22
S3150000E5C0003A486F0046486F003A4EB9000236A03E
S3150000E5D0204F2F2800362F280032206F011A486856
S3150000E5E0000D4E954FEF003660104879 0002FBD8BB
S3150000E5F048790002FBD04E95508F4AAF0D74636C7C
S3150000E600202F0D74B08364644879 0002FBDA4E95BE
S3150000E610588F202F0D74B0836448204F2F2800E8B0
S3150000E620486F0D74486F00244EB900023896204F8B
S3150000E6302F28001C206F00F04868000D4E95487981
S3150000E6400002FBDC4E954FEF000C204F2F280D7477
S3150000E6503F3C00634EB900000E1E48790002FBDE07
S3150000E660600648790002FBE04E95588F2F7C006DBE
S3150000E670C07D00F4486F013C486F00244EB900018C
S3150000E6808DF24A006600FC98600002F800AF00EDCB

```
S3150000E690C0FD00F4247C00C052514A126708287954
S3150000E6A000C01400600C49EF013C00AF00100003ED
S3150000E6B000F408EF000300F2600002AC082F000629
S3150000E6C0010767224A3900C05275670C486F00205F
S3150000E6D048790002FBFB600A486F00204879000277
S3150000E6E0FC2D4E95508F4A12660A082F0007010727
S3150000E6F067000274486F009848790002FC5D4E95E9
S3150000E700508F206F00D8082800020001670808 2FE4
S3150000E710000200F2661A206F00D8302800020800B6
S3150000E720000D67000112082F000200F266000108C2
S3150000E7304A1267182F0C3F3C0000204F2F2800F686
S3150000E74043EF013E4EB90000670A60163F3C0000E9
S3150000E7502F0C204F2F2800F643EF013E4EB9000044
S3150000E76078E8206F00D8302800020240003F3F00C2
S3150000E770204F2F28013A2F28013643EF00224EB9A9
S3150000E780000186C4204F2F2800E8486F00144EB9B8
S3150000E790000236DE486F0010486F001C486F0010FC
S3150000E7A04EB9000236A0204F2F28000C2F28000853
S3150000E7B0206F00F04868000D4E954FEF000C4A3967
S3150000E7C000C052756752206F00DC20280008486F91
S3150000E7D000184EB900025ACC4879000295A8486F35
S3150000E7E0001C486F00184EB9000236BE4879000278
S3150000E7F095A0486F0014486F00104EB90002363CD1
S3150000E800204F2F28000C2F28000848790002FC62B0
S3150000E8104E954FEF000C602E48790002FC6B4E952A
S3150000E820588F206F00DC2F2800083F3C00444EB96B
S3150000E83000000E1E601048790002FC754879000 23F
S3150000E840FC6D4E95508F206F00D80828000300 01FC
S3150000E8506708082F000200F2661A206F00D83028D9
S3150000E86000020800000E670000FE082F000200F2FA
S3150000E870660000F44A12672C3F3C000B43EF001A77
S3150000E8804EB9000073C62F3900C000FA41EF001CD4
S3150000E8902F10204F2F2800F843EF0D7C4EB90000B3
S3150000E8A0760460182F0C204F2F2800F44EB9000074
S3150000E8B07C3A224041EF0D7020D92091202F0D7413
S3150000E8C0B083640000A248790002FC774E95204F81
S3150000E8D02F2800EC486F0D78486F00284EB90002CB
S3150000E8E03896204F2F280020206F00F44868000D2E
S3150000E8F04E954FEF000C4A3900C05275674E202FD7
S3150000E9000D74486F00184EB900025ACC48790002BF
S3150000E91095A8486F001C486F00184EB9000236BE15
S3150000E9204879000295B0486F0014486F00104EB940
S3150000E930002363C204F2F28000C2F28000848796B
S3150000E9400002FC794E954FEF000C601A48790002E0
S3150000E950FC824E95588F204F2F280D743F3C006344
S3150000E9604EB900000E1E4A12670442A76004486FA3
S3150000E970013C486F00244EB900018DF24A00660042
S3150000E980FD3C30024FEF0D7833C000A002624CDF31
S3150000E9907CFC4E754E714E714E7133C000A0026400
S3150000E9A0207900C0058023E8000E00C049E44EB976
S3150000E9B000008C2833C000A002664E754E714E7161
S3150000E9C04E7133C000A002684FEFFFEC2F790002B2
S3150000E9D095B8000C487900E001AE4EB9000238C285
S3150000E9E04A00670000C4026F00FF000C08EF000237
S3150000E9F0000E3F3C0001204F2F28000E43EF000A77
S3150000EA004EB9000069CE2F3900E001C62F3900E06B
S3150000EA1001C2204F2F2800102F28000C43EF0010B2
S3150000EA204EB9000184AE3F39000006D0204F2F2892
S3150000EA3000062F28000243EF00124EB90001828E15
S3150000EA40486F0008207900C0497C486800C0486FBC
S3150000EA5000184EB9000238964879000C052284EB9BF
S3150000EA600000238C24A006738487900C05228486F09
S3150000EA700014486F00104EB90002386A487900E069
S3150000EA8001B2486F000C486F000C4EB90002389670
S3150000EA90486F0004487900E001B24EB90002360 61C
S3150000EAA023EF001000C052284A3900C049E8671415
S3150000EAB04A3900C0538A660C4EB9000080D44239E8
S3150000EAC000C049E84FEF001433C000A0026A4E753B
S3150000EAD04E714E714E7148E7030433C000A0026CBC
S3150000EAE04FEFFF802A6F0090303CFFFFD06F0094FD
S3150000EAF072003200EF892E014A3900C05259675818
S3150000EB002C3C000020009C874A866F4C4A3900C086
S3150000EB1052456718203C003A0000D0872F002F0D81
S3150000EB20487800804EB9000010B8602C2F0D486F51
S3150000EB30000448780080 4EB9000010B83F3C004001
S3150000EB40486F00022007E488E5880680003A000046
S3150000EB502F004EB900003B167000B0865CC0440022
S3150000EB6048804FEF008033C000A0026E4CDF20C00B
S3150000EB70205F5C8F4ED04E714E714E7148E73F3E1E
S3150000EB8033C000A002704FEFF29A426F010A227C56
S3150000EB900002970E41EF0022703920D951C8FFFCC0
S3150000EBA0486F00224EB9000193062C7C00024356A2
S3150000EBB00CB903FFFFFF00C0983A640E48790002C3
S3150000EBC0FED94E96588F60000996287C00C0525197
S3150000EBD047EF00F24A1466124A3900C05252660ADA
S3150000EBE04A3900C05256670002184BEF01221F7CBB
S3150000EBF0000401072F7C0039C01800F608EF000357
S3150000EC0000F445EF0106600001E0082F0006010947
S3150000EC10670E486F002248790002FEED4E96508F2F
S3150000EC202F7C0039C00200F61F7C00FF0106600041
S3150000EC30019C102F0106488048C081FC0004484012
S3150000EC404A4066024247082F00070109670001642F
S3150000EC50303CFFE0206F00DAC05067000156082FF5
S3150000EC600000200F4660A0828000700026700014453
S3150000EC704A47663E7E01486F009A48790002FEF2D6
S3150000EC804E96508F424660184A146708487900022B
S3150000EC90FEF7600648790002FF034E96588F5246EB
S3150000ECA0102F0106488048C081FC00044840BC4043
S3150000ECB065D60C470001660001144A14672048799E
S3150000ECC00002FF0F4E96588F206F00DE2F28000897
S3150000ECD03F3C00444EB900000E1E600000F0082FB5
S3150000ECE0000200F4670C206F00DA082800020001 19
S3150000ECF0661A082F000200F4660000B0206F00DAE2
S3150000ED003028000208000 0D670000A048790002C4
S3150000ED10FF114E96588F4A3900C0525667182F0D6C
S3150000ED203F3C000B204F2F2800F843EF01204EB93F
S3150000ED300000670A60163F3C00012F0D204F2F2868
S3150000ED4000F843EF01204EB9000078E8206F00DAA2
S3150000ED5030280002024000 3F3F00204F2F28011CB0
S3150000ED602F28011843EF00244EB9000186C4204F16
S3150000ED702F2800EA486F00164EB9000236DE486FAB
S3150000ED800012486F001E486F00124EB9000236A0EE
S3150000ED90204F2F28000E2F28000A206F00F2486807
S3150000EDA0000D4E964FEF000C602248790002FF13CB
S3150000EDB060164A4767164A14670848790002FF1F1B
S3150000EDC0600648790002FF2B4E96588F486F012245
S3150000EDD0486F00264EB900018DF24A006600FE54C7
S3150000EDE02F7C0039C01800F6486F0122486F0026B4
S3150000EDF04EB900018DF24A006600FE106000076001
S3150000EE002A3C0001518045EF01124A3900C0525098
S3150000EE106700042241EF01222F480D56422F0107B9
S3150000EE20103900C052554880024000 01720BE36859
S3150000EE3008AF000300F4816F00F42F7C00B9C45AB8
S3150000EE40 00F62F7C000297F60D62600003D0082FB3
S3150000EE5000060109670E486F002248790002FF3755
S3150000EE604E96508F082F00070109670003B04A39F4
S3150000EE7000C0525367142039 00C052C022054EB953
S3150000EE8000002709 02F40011A600442AF011A206FF1
S3150000EE9000DE2028000822054EB9000274A44EB9EF
S3150000EEA000027B582E004A3900C0525467122607CA
S3150000EEB0203900C052C44EB900027090D6B060045A
S3150000EEC02605D687206F00DA3010EA48024007FF91
S3150000EED03C00303CFFE0C05067000342082F0002B0
S3150000EEE000F46614082800070002670003 30082FA4
S3150000EEF0000200F466000326204F2F280D56204FEF
S3150000EF002F2800F64EB90000665A2A402005320620
S3150000EF1048C14EB90002502A3F40010E4A3900C08E
S3150000EF2052536604424260122 02F011A322F010EFC
S3150000EF3048C14EB9000274A4240070003002D0808B
S3150000EF40DBC03F7C000A010C2807D8AF011A60001D
S3150000EF5002C2526F010C0C4605A066047E0A6002CE
S3150000EF607E08302F010CB047652E426F010C23FC42
```

S3150000EF700000028000C0523C4EB90001A17E486FDD
S3150000EF80009A48790002FF594E96508F2F043F3C55
S3150000EF9000534EB900000E1E48790002FF5E4E96E1
S3150000EFA0588F302F00F2E048024000FF0C40000A64
S3150000EFB06720302F00F2E048024000FF0C400004BA
S3150000EFC06710302F00F2E048024000FF0C40000BB3
S3150000EFD066462F6F00F2011E302F011EE0480240E8
S3150000EFE000FF0C40000A670E0C40000467160C4038
S3150000EFF0000B67186022026F00FF011E08EF000277
S3150000F000011E6014026F00FF011E600C026F00FFFC
S3150000F010011E006F0500011E200D672C200D6608DD
S3150000F020426F0110424760100C55FFFF56C0440066
S3150000F03048803F4001103E004A47670C558F3E9579
S3150000F040224A4EB90001806E4A6F011066544A3951
S3150000F05000C05255663E302F00F2E048024000FFE5
S3150000F0600C40000A6720302F00F2E048024000FF03
S3150000F0700C400004671030 2F00F2E048024000FF09
S3150000F0800C40000B660E3F3C00042F3C00000000C5
S3150000F09060000014048790002FF604E96588F60007C
S3150000F0A001664A3900C05255660000A0302F00F2B2
S3150000F0B0E048024000FF0C40000E6736303C05A0D9
S3150000F0C048C081C6486F001C48C04EB900025AECC1
S3150000F0D0486F001C4879000297FA486F00204EB925
S3150000F0E0000238AC486F00182F0A4EB9000235F4FA
S3150000F0F060584879000297FE2F0A4EB9000235F48F
S3150000F1003006486F001848C04EB900025AAC486F26
S3150000F11000184879000298024 86F00184EB900029C
S3150000F12036BE2F0A486F000C4EB9000236DE486F15
S3150000F1300010486F000C486F00084EB9000236BE3A
S3150000F14048572F0A4EB9000237024A3900C05255B5
S3150000F15066000090302F00F2E048024000FF0C40AD
S3150000F160000A6720302F00F2E048024000FF0C4002
S3150000F17000004671030 2F00F2E048024000FF0C4008
S3150000F180000B665E082F000200F46606286F0D620B
S3150000F190601E206F00DA301002400003486F0D5ADF
S3150000F1A002800000FFFF4EB900025B0C49EF0D5ACA
S3150000F1B02F0C2F0A486F00264EB9000238AC204F9C
S3150000F1C02F28001E224A4EB9000255D43F3C0001AA
S3150000F1D02F12204F2F28012442A74EB90001621A90
S3150000F1E06024204F2F2800EA2F0A486F00264EB9C8
S3150000F1F000023896204F2F28001E206F00F2486824
S3150000F200000D4E96508F5242548D302F010E48C03D
S3150000F210D880B4466406B8836500FD38486F01227D
S3150000F220486F00264EB900018DF24A006600FC20A8
S3150000F2306000032C41EF01222F480D56422F010793
S3150000F240103900C052554880024000017 20BE36835
S3150000F25008AF000300F4816F00F400AF00ABC41BDD
S3150000F26000F62F7C000297F60D62600002DE082F82
S3150000F2700006010967224A3900C05257670C486FD9
S3150000F28000224879 0002FF69600A486F0022487927
S3150000F2900002FF844E96508F082F00070109670071
S3150000F2A002AA206F00DE2028000822054EB90002BF
S3150000F2B074A44EB900027B582600206F00DA301085
S3150000F2C0EA48024007FF3E00204F2F280D56204FE8
S3150000F2D02F2800F64EB90000665A2A4042442C03F5
S3150000F2E060000262200532 0748C14EB90002502A6A
S3150000F2F02600200D67000244200D6700023E0C55D3
S3150000F300FFFF67000236486F009A48790002FF9FA8
S3150000F3104E96508F4A3900C05257674C2006486FA8
S3150000F32000164EB900025ACC4879000298024 86F7E
S3150000F330001A486F00164EB9000236BE4879000220
S3150000F340980A486F0012486F000E4EB90002363C0C
S3150000F350204F2F28000A2F28000648790002FFA414
S3150000F3604E964FEF000C60162F063F3C00534EB9E9
S3150000F37000000E1E48790002FFAE4E96588F4A399D
S3150000F38000C05255660001 50302F00F2E04802409E
S3150000F39000FF0C40000A6722302F00F2E0480240CE
S3150000F3A000FF0C400004671230 2F00F2E0480240D4
S3150000F3B000FF0C40000B6600011E558F3E95224A49
S3150000F3C04EB90001806E4A3900C052556634303C51
S3150000F3D005A048C081C7486F001C48C04EB900024E
S3150000F3E05AEC486F001C4879000297FA486F0020D3
S3150000F3F04EB9000238AC486F00182F0A4EB9000209
S3150000F40035F4082F000200F46606286F0D62601EB0
S3150000F410206F00DA301002400003486F0D5E028054
S3150000F4200000FFFF4EB900025B0C49EF0D5E2F0C8A
S3150000F4302F0A486F00264EB9000238AC204F2F28FD
S3150000F440001E224A4EB9000255D4302F00F2E04881
S3150000F45002400 0FF0C40000A6720302F00F2E0480F
S3150000F460024000FF0C400004671030 2F00F2E04815
S3150000F470024000FF0C40000B66462F6F00F2011E93
S3150000F480302F011EE048024000FF0C40000A670EC4
S3150000F4900C40000467160C40000B67186022026FD0
S3150000F4A000FF011E08EF0002011E6014026F00FF3C
S3150000F4B0011E600C026F00FF011E006F0500011E99
S3150000F4C03F3C00012F12204F2F28012442A74EB99E
S3150000F4D00001621A6064206F00DA30280002024 0E0
S3150000F4E0003F3F00558F3E9543EF011A4EB900018C
S3150000F4F0821A206F00DA302800020240003F3F00E7
S3150000F500204F2F28011C2F28011843EF00284EB941
S3150000F5100001828E204F2F2800EA486F0022486F94
S3150000F52000224EB900023896204F2F28001A206F6D
S3150000F53000F24868000D4E96508F5244548D3003A9
S3150000F54048C0DC80B8476500FD9C486F0122486FC3
S3150000F55000264EB900018DF24A006600FD12302FDA
S3150000F560010A4FEF0D6633C000A002724CDF7CFC2F
S3150000F5704E754E714E714E7148E7033E33C000A082
S3150000F58002744FEFFFF44A3900C0524A6704610023
S3150000F59006903F3C002B43EF00024EB90000738EED
S3150000F5A0287C00C00242267C00034658247C00C00A
S3150000F5B0497C2C7C000243564A3900C05244670CF1
S3150000F5C03C3900C0528653466000020442464A391E
S3150000F5D000C0524567000146 2012B08C672C248C6F
S3150000F5E04A9767142257204C203C000000CE20D9B1
S3150000F5F051C8FFFC30916012224B204C203C000089
S3150000F6000CE20D951C8FFFC30914A3900C052566D
S3150000F6106756203900C0528853807216C1414EB9D0
S3150000F62000027B58C141068100C002522A414A3974
S3150000F63000C0524D67062AB900C052A84A3900C018
S3150000F640524E67000162487800 08486D001A4EB9AC
S3150000F65000012C62F3900C052AC486D001A4EB9D0
S3150000F6600002587E60000140203900C05288538055
S3150000F670722CC1414EB900027B58C141068100C0BF
S3150000F68002EC2A414A3900C0525367082B7900C060
S3150000F69052C000164A3900C0525067062AB900C047
S3150000F6A052B44A3900C05251671E48780008486D66
S3150000F6B00044EB9000012C62F3900C052B8486D7A
S3150000F6C00044EB90002587E4A3900C05254671EE3
S3150000F6D048780008486D001A4EB9000012C62F3946
S3150000F6E00C052C4486D001A4EB90002587E4A390D
S3150000F6F00CC05252670C7030D03900C052BF1B4058
S3150000F7000274A3900C0524F6700009C7030D0393C
S3150000F71000C052B31B4000106000008C4A3900C084
S3150000F720524B66084A3900C0524C677A2012B08C98
S3150000F7306714248C224B204C203C000000CE20D99C
S3150000F74051C8FFFC30914A3900C0524B670A2F79E5
S3150000F75000C052A00008601648790003470 22052F4
S3150000F760486800AA486F00104EB9000238AC4A3902
S3150000F77000C0524C670A2F7900C052A400046016DC
S3150000F7804879000347B220524868015A486F000C76
S3150000F7904EB9000238AC204F2F280004204F2F28E6
S3150000F7A0000C610002B44A3900C052496714610076
S3150000F7B004B44A406714487900 0302964E96588F5F
S3150000F7C060084A3900C0525567046100 01AC4A39E5
S3150000F7D000C0524666124A3900C05247660A4A3984
S3150000F7E000C0524867000 17A4A3900C05248671281
S3150000F7F04A97660E4879000302A74E96588F600016
S3150000F8000160320648C1E58920321800B08B6608CF
S3150000F8104879000302F160184A46660E2012B08C41
S3150000F82066084879000302F96006487900003030276
S3150000F8304879000302CD4E96508F4A3900C0525681
S3150000F840677E4879000303084E96588F42474A461A

S3150000F850661C4A3900C0524867144A9767107010F0
S3150000F860D0973207C3FC0016D0812A40602E4A3951
S3150000F87000C05246671870103206 48C1E589D0B2FA
S3150000F88018003207C3FC0016D0812A40600E3007EC
S3150000F890C1FC00160680000346682A40486D000435
S3150000F8A02F15300752403F004879000303 1F4E963C
S3150000F8B04FEF000E52470C4700076D92600000A202
S3150000F8C04879000303324E96588F42474A46661CD3
S3150000F8D04A3900C052486714203C000000AAD0975D
S3150000F8E03207C3FC002CD0812A4060324A3900C05E
S3150000F8F05246671C203C000000AA320648C1E58932
S3150000F900D0B218003207C3FC002CD0812A40600E0A
S3150000F9103007C1FC002C0680000347022A40486DD0
S3150000F920001A2F2D0016102D002748800640FFD004
S3150000F9303F00486D00042F15102D0010488006402A
S3150000F940FFD03F00300752403F004879000303666E
S3150000F9504E964FEF001A52470C47000F6D00FF6E90
S3150000F96042404FEF000C33C000A002764CDF7CC053
S3150000F9704E754E714E714E7148E7010C33C000A0B2
S3150000F9800278598F3F3C002B49EF0002224C4EB9BA
S3150000F9900000738E7010D0942A40424760000084A5
S3150000F9A041ED009A3007C1FC002CD1C00C2800257F
S3150000F9B0000D662241ED009A0C300038080E6616DE
S3150000F9C00C30002E080F660E0C3000660811660615
S3150000F9D04A30081267024294 41ED009A3007C1FC92
S3150000F9E0002CD1C00C2800250023663241ED009A78
S3150000F9F00C300031082466260C3000300825661EBF
S3150000FA000C30002E082666160C30004C0828660EB0
S3150000FA100C30006608296606 4A30082A67024294B6
S3150000FA2052474A9463080C47000F6D00FF744A94CE
S3150000FA30670823D400C0497C600A23FC00034658AB
S3150000FA4000C0497C588F33C000A0027A4CDF30805A
S3150000FA504E754E714E714E7148E71F3E33C000A081
S3150000FA60027C518F4DEF00342C96227C00034658C1
S3150000FA70207C00C00242203C000000CE20D951C8A4
S3150000FA80FFFC30914246287C00C002EC267C000236
S3150000FA909964247C0002999C42474245601C2F0EC3
S3150000FAA03006C1FC002CD08C3207C3FC0016D08176
S3150000FAB02F004EB9000235F45245300648C0E5889D
S3150000FAC0D08B320748C1D281D0812040BA5065CE52
S3150000FAD04245601E486F00383006C1FC002CD08CB1
S3150000FAE03207C3FC0016D0812F004EB9000235F450
S3150000FAF05245300648C0E588D08A320748C1D281CF
S3150000FB00D0812040BA5065CC52470C4700026D8A1E
S3150000FB1042473006C1FC002C0680000347023 2052E
S3150000FB20C3FC0016D0812F003006C1FC002CD08CFF
S3150000FB303207C3FC0016D0812F00486F00084EB96B
S3150000FB400000238AC204F2F1043EF00084EB90002D8
S3150000FB505274486F00044EB9000265FC36004A47ED
S3150000FB6066D0478036002780430 06C1FC002CD08C51
S3150000FB703207C3FC0016D08106800000000DD08439
S3150000FB802A4097150C1500306C041ABC00305247F9
S3150000FB900C4700026D00FF7C52460C46000E6D00BD
S3150000FBA0FEF842462A7C00C00252424760142F0EDD
S3150000FBB03006C1FC0016D08D2F004EB9000235F478
S3150000FBC05247300648C0D0800680000299D42040B3
S3150000FBD0BE5065DA42476016486F00383006C1FCF1
S3150000FBE00016D08D2F004EB9000235F4524730066C
S3150000FBF048C0D0800680000299E22040BE5065D8F9
S3150000FC0052460C4600076DA2508F33C000A0027EFC
S3150000FC104CDF7CF8205F508F4ED04E714E714E7186
S3150000FC2033C000A002800CB90003465800C0497CCE
S3150000FC3067 24227C00034658207C00C00242203CF8
S3150000FC40000000CE20D951C8FFFC309123FC00C033
S3150000FC50024200C0497C33C000A002824E754E713C
S3150000FC604E714E7133C000A00284207900C0497CD9
S3150000FC70486800103F3C00CC3F3C002B4EB90000CA
S3150000FC8071EA33C000A002864E754E714E714E71F8
S3150000FC9033C000A002884A3900C05244670A13F9EB
S3150000FCA000C0528700C05386424010 3900C05386B8
S3150000FCB03F004879000303994EB9000243565C8F12
S3150000FCC0424033C000A0028A4E754E714E714E718D
S3150000FCD048E73F3E33C000A0028C4FEFFE80227CF7
S3150000FCE000029CA041EF0020703920D951C8FFFCCA
S3150000FCF0486F00204EB9000193063F3C00004EB904
S3150000FD00000007B5A2F40010A287C00C05256267CF0
S3150000FD1000804040247C000243562C7C00804046F4
S3150000FD204A3900C0525C6700060413FC000100C09B
S3150000FD3050540279EFFF0080400802563FFF0056FC
S3150000FD4040000005302000 2797FFF00804044 0053C8
S3150000FD50010008B90006008040247007C07900C081
S3150000FD6052E6720BE3680253C7FF81534A3900C05B
S3150000FD7052666714700 3C07900C0530E720AE368B6
S3150000FD800256F3FF81566004 0256F3FF4A3900C05B
S3150000FD905254671A701FC07900C052C6720AE368CF
S3150000FDA00279 83FF0080402C81790080402C4A39FB
S3150000FDB000C0525367187003C07900C052C2E148B0
S3150000FDC00279FCFF0080402C81790080402C4A3962
S3150000FDD000C0525567187003C07900C052CAE54882
S3150000FDE00279FFF30080402C81790080402C4A394B
S3150000FDF000C0525267167003C07900C052BE027925
S3150000FE00FFFC0080402C81790080402C4A3900C0DC
S3150000FE105261670C13F900C052FB00804042600833
S3150000FE2013FC0080008040424A3900C0525E6710D1
S3150000FE307003C07900C052EEE1480256FCFF8156BD
S3150000FE404A3900C0525D671A7007C07900C052EA8D
S3150000FE50720CE36802798FFF008040A681790080EA
S3150000FE6040A630390080403C02401FFF3F40013031
S3150000FE700CB900005A0000C0523C6C0A23FC00007A
S3150000FE805A0000C0523C4A3900C05262671848798D
S3150000FE9000003097F4E92588F4A14670A4879000377
S3150000FEA009BD4E92588F203CFFFFB500D0B900C067
S3150000FEB0523C2F4001422A7C00C052FE6000040AD8
S3150000FEC04A3900C05262670003B03016720AE2680F
S3150000FED0024000034A4063040256EFFF78002F44B5
S3150000FEE001222F4401262F44011A2F44011E260405
S3150000FEF02A3C00000FFF24032F4201166000017AFE
S3150000FF004A14672E0CB90000000500C052E4661EB4
S3150000FF107003C07900C052EEE1480256FCFF8156DC
S3150000FF2000530100424752470C47000A65F8025346
S3150000FF30FEFF4A3900C0526367183013024000 03BF
S3150000FF403F40012A7003C07900C053020253FFFCF0
S3150000FF5081533016720AE268024000034A40630485
S3150000FF600056100000530400301308 00000E66F817
S3150000FF703016720AE268024000034A4063040256E1
S3150000FF80EFFF30390080404402400FFF7E003E0004
S3150000FF900253FBFF4A1467520CB90000000500C06B
S3150000FFA052E466120256FCFF0053010042465246D6
S3150000FFB00C46000A65F84A3900C05264670E7C0098
S3150000FFC060025286BCB900C0530465F600530400B3
S3150000FFD03013080000E66F83039008040440240B5
S3150000FFE00FFF7C003C000253FBFF4A3900C05263FE
S3150000FFF0670C7003C06F012A0253FFFC8153005344
S31500010000000100BE8564022A07BE8363022607D487E0
S315000100102F6F012601122007220 74EB900027B58D5
S31500010020D1AF0126202F0112B0AF0126630452AFD2
S315000100300 1222E2F011E4A14671CDDAF0116200670
S3150001004022064EB900027B58D1AF011EBEAF011E7A
S315000100506304 52AF011A4A7900C07B4E660833FC2D
S31500010060000100C07B4E4A7900C07B4C660833FC18
S31500010070000100C07B4C52847001123900C052FF4E
S31500010080E3A8B880641C0CB90000001200C052FC41
S31500010090 6500FE6E30390080405C0800000D66008B
S315000100A0FE60301544403F002002486F001A4EB9E9
S315000100B000025B0C204F2F28001A43EF01184EB99E
S315000100C00002631C301544403F00202F0128486F71
S315000100D000164EB900025B0C204F2F28001643EF85
S315000100E0001E4EB90002631C30154440064000 2034
S315000100F03F00202F0124486F00164EB900025B0C09
S31500010100204F2F28001643EF00224EB90002631C30
S31500010110486F0112486F0116486F001C4EB9000264
S3150001012038 96486F001C486F001C486F00184EB97E

S3150001013000023842486F0014486F0014486F0014DB
S315000101404EB90002386A204F2F28000C43EF0112E6
S315000101504EB9000255D420039085E288486F0018F5
S315000101604EB900025B0C486F010E486F001C486FC8
S3150001017000 1C4EB9000238AC204F2F280014204F26
S315000101802F280112204F2F28011A200390852F00B6
S315000101902F052F032F044879000309D44E924FEF00
S315000101A000204A146700010C301544403F00202FFF
S315000101B00118486F001E4EB900025B0C204F2F2814
S315000101C0001E43EF01184EB90002631C301544406E
S315000101D03F00202F0120486F00164EB900025B0C2C
S315000101E0204F2F28001643EF001E4EB90002631C54
S315000101F030154440064000203F00202F011C486F67
S3150001020000164EB900025B0C204F2F28001643EF53
S3150001021000224EB90002631C486F0112486F011695
S31500010220486F001C4EB900023896486F001C486F93
S31500010230001C486F00184EB900023842486F00147E
S31500010240486F0014486F00144EB90002386A204FF7
S315000102502F28000C43EF01124EB9000255D4204F4E
S315000102602F28010E204F2F2801164879000309FF78
S3150001027004E924FEF000C603A202F013EB0B900C0FC
S315000102805 23C672E2F7900C0523C013E3016720A4D
S31500010290E268024000034A406318303900C0523E0A
S315000102A00240000102400001720CE3680256EFFFB2
S315000102B081564A7900C07B4E660833FC000100C0B6
S315000102C07B4E4EB90001A17E2F39000283884EB9BB
S315000102D00000037100C40FFFF660E203900C0523C6B
S315000102E0B0AF01426200FBDA303C1FFFC06F013044
S315000102F00279E0000080403C81790080403C08B9E9
S3150001030000060080402408F900060080402408B950
S315000103100007008040240253FEFF0253FDFF0079CF
S31500010320100000804008423900C050544A3900C0CC
S31500010330525B670000EA4A3900C0525C660000E081
S315000103404A3900C05251660000D61839008040086B
S31500010350 13FC008000804008103900804024020010
S31500010360000342431600023900FC0080402400537A
S315000103700200000798000008040440053010042479A
S315000103803C073A0660682A7C0080401408150077D
S31500010390673008150006672008D5000652B900E047
S315000103A0000052B900C000FA423900C000FE13FC39
S315000103B000EA008040156006523900C000FE08D5EB
S315000103C000074A46660A0C470FFF67085247601244
S315000103D04A47660C4A4657C0440048803C006002C2
S315000103E0534730070040800033C0008000442F3956
S315000103F0000283884EB9000037100C40FFFF6606E5
S3150001040000C45003C658013C40080400870 03C0039E
S31500010410023900FC008040248139008040244A3999
S3150001042000C05258676A4A1466667003C03900C034
S31500010430 52D7E908023900CF008040248139008073
S31500010440 40244A3900C0525267167003C03900C0B1
S315000104505 2BF023900FC00804024813900804024CB
S3150001046 04A3900C05255671870 03C03900C052CBD3
S31500010470E508023900F300804024813900804024D8
S31500010480 08B90006008040240 8F9000600804024CF
S3150001049 04A146700013A4A3900C0525C66000130CD
S315000104A04A3900C05258660001264A3900C05253E3
S315000104B0670000A62A7C00C052C00C95000000010E
S315000104C0621813F900C052C300C0505A423900C025
S315000104D0505B423900C0505C606E13FC000100C0E5
S315000104E0505C423900C0505A0C9500000002660A61
S315000104F013FC000100C0505B60180C950000000035E
S3150001050 0660A13FC000200C0505B6006423900C057
S31500010510505B4240103900C050590240001F720A18
S3150001052 0E368027983FF00C0506B817900C0506892
S315000105300279FCFF00C0506802563FFF005640009A
S315000105400253C7FF0256FCFF13FC000200C05056BF
S315000105 5013FC001E00C050584A3900C05252671A97
S3150001056013F900C052BF00C0505E13FC000200C068
S31500010570505613FC001E00C050584A3900C0525252
S315000105 80664C4A3900C0525366444A3900C0525A31
S3150001059 0663C423900C05058423900C05056423973
S315000105A000C0505C423900C0505B427900C05064C3
S315000105B042472A7C00C04D6A3F072F0D4EB9000104
S315000105C033AE4BED02E452470C47000165EA4A3966
S315000105D000C05253670A3E3900C052C253476002F7
S315000105E042474A3900C0525A670000B433F900C085
S315000105F052DE00C0506413FC001E00C050584A79F8
S31500010600 00C050646F1C33FC01A000C0506210078B
S31500010610520013C000C0505A13FC000400C05056CB
S315000106206 07C0C79FFFF00C0506466724A14665CF8
S315000106304 87900030A0D4E92588F13FC000400C03E
S31500010640505660064EB90001A17E0C39000200C069
S315000106505 05662F0487900030A254E92588F60067B
S3150001066 04EB90001A17E4A7900C0506262F2487912
S315000106700 00030A3C4E92588F60064EB90001A17ED6
S315000106800C39000100C0505662F0600813FC0001ED
S31500010690 00C05056487900030A544E92588F4A3981
S315000106A000C0525967000786300 7C1FC02E4068084
S315000106B000C04D6A2A40303C00FFC047026FFF0070
S315000106C00146816F0146026F0FFF014842451A2D0F
S315000106D002DF4242600007360CB90000028000C00A
S315000106E0523C6C0A23FC0000050000C0523C42400B
S315000106F0102D02DFBA406700070E524242451A2DFD
S315000107000 02DF42471E2D02B64243162D02B7287C50
S31500010710000005CC0C4700186D067C1728066006FC
S315000107203C0748C628062004D080D086D080D08CCD
S315000107302F400178780038050C4700186D047C17A6
S31500010740600 43C0748C62204D281D284EB89068123
S315000107500 00C0519A2006E588D28020413010486FAA
S315000107600 01C48C04EB900025AEC487900029D8C23
S31500010770486F0020486F00204EB90002389648792C
S3150001078000 0029D88486F001C486F001C4EB900028C
S3150001079 03842486F0014204F2F28017C486F0166AC
S315000107A04EB900023896720032050681 0000075CD8
S315000107B020411210488148C1E989068100C0518A49
S315000107C0380348C4E58CD2842041 3010486F001CA0
S315000107D048C04EB900025AEC487900029D8C486F18
S315000107E00020486F00204EB9000238964879000271
S315000107F09D88486F001C486F001C4EB900023842A4
S315000108004 86F001441EC0090300348C0E788D1C01E
S315000108102F08486F01624EB900023896 43ED01F682
S31500010820 41EF013220D920D92091302F0132906F2A
S315000108300134E2483C00302F0136906F0138E2481E
S315000108403 8003F3C00002F0D4EB900013A963F3C5F
S31500010850000 42F0D4EB900013A962F6D01BE0156C7
S315000108602F6D01CE0152204F2F28015E43EF00204C
S315000108704EB9000262A43006486F0016028000 00DD
S315000108800FFFF4EB900025B0C486F001C486F001A4F
S31500010890486F001A4EB900023896486F0156486FE4
S315000108A00016486F01524EB9000238AC3004486F49
S315000108B0001A02800000FFFF4EB900025B0C486F70
S315000108C0015A486F001E486F001E4EB90002389645
S315000108D0486F0152486F001A486F01564EB900021F
S315000108E038AC3F2D026C202D0268486F001E4EB9B0
S315000108F000025B0C487900029D90486F0022486F08
S3150001090000224EB900023896204F2F28001A3F05C3
S3150001091 03F033F074A7900C0506263063F3C0068C7
S315000109 20603E0C79FFFF00C0506466063F3C004301
S3150001093 0602E4A7900C050646F063F3C0047602034
S315000109404A3900C0505667063F3C005460124A3986
S315000109500 00C0505467063F3C004860043F3C0041DC
S31500010960487900030A6B4E924FEF00124A3900C0D4
S315000109705257660000A8204F2F28014E204F3F28CE
S315000109800 13C204F3F28013C3F2D02BA302D020485
S31500010990486F002602800000FFFF4EB900025B0C83
S315000109A0487900029D94486F002A486F002A4EB983
S315000109B0000238AC204F2F280022204F2F28015843
S315000109C0204F3F280146204F3F2801463F2D02B8C0
S315000109D0302D0202486F00340280000 0FFFF4EB93D
S315000109E000025B0C487900029D94486F0038486FFD
S315000109F000384EB9000238AC204F2F280030302D78
S31500010A0002D0905D02CE3F003F2D02DA48790003F5

S31500010A100A864E924FEF0024600001B008EF0003F2
S31500010A20014808AF00020148026F00FF0146203C61
S31500010A30000000AAD0B900C0497C322F0146E04926
S31500010A40024100FF3601C6FC002CD083068000005F
S31500010A500016224041EF0162700420D951C8FFFC03
S31500010A6030910CB90F0C3F0000C000FA630000E49E
S31500010A703F3C000D204F2F28014843EF00164EB989
S31500010A80000069CE302F0146E048024000FF7200A7
S31500010A903200D2810681000006D020413F10204F4E
S31500010AA02F2800162F28001243EF00224EB900010D
S31500010AB086C43F3C000B204F2F28014843EF000E10
S31500010AC04EB9000069CE302F0146E048024000FFD2
S31500010AD072003200D2810681000006D020413F100B
S31500010AE0204F2F28000E2F28000A43EF001A4EB977
S31500010AF0000186C4486F0162486F000C4EB90002BE
S31500010B0036DE486F0008486F0014486F00084EB97A
S31500010B10000236A0204F2F2800042F10486F016ACB
S31500010B20486F001C4EB9000236DE486F0018486F48
S31500010B300024486F00184EB9000236A0204F2F2816
S31500010B4000142F280010487900030AC04E924FEF77
S31500010B5000143F3C0007204F2F28014843EF0016A1
S31500010B604EB9000069CE302F0146E048024000FF31
S31500010B7072003200D2810681000006D020413F106A
S31500010B80204F2F2800162F28001243EF00224EB9BE
S31500010B90000186C4486F0162486F00144EB9000215
S31500010BA036DE486F0010486F001C486F00104EB9C2
S31500010BB000236A0204F2F28000C2F280008487964
S31500010BC000030AD14E924FEF000C287C00029C9C38
S31500010BD0600000A0101448B0024000FFE148026F47
S31500010BE000FF0146816F0146302F0146E048024071
S31500010BF000FF3F002F0D4EB900013A9641ED01BEAF
S31500010C00302F0146E048024000FF72003200E589BC
S31500010C10D1C12F10487900030ADB4E92302F014EC5
S31500010C20E048024000FF0C400004660848790003D2
S31500010C300AE96030303CFF00C06F014E6608487912
S31500010C4000030AEB601E302F014EE048024000FF10
S31500010C500C40000166084879000 30AED60064879F0
S31500010C6000030AEF487900030AE44E924FEF0010A1
S31500010C70528CB9FC00029CA06500FF5A203900C0C5
S31500010C80983E486F001C4EB900025B0C303900C01B
S31500010C905084907900C05086486F0016028000008B
S31500010CA0FFFF4EB900025B0C486F001C486F001A2B
S31500010CB0486F001A4EB9000238AC204F2F28001297
S31500010CC0303900C05084907900C05086486F001EAC
S31500010CD002800000FFFF4EB900025B0C487900025A
S31500010CE09D94486F0022486F00224EB9000238AC2D
S31500010CF0204F2F28001A487900030AF34E92203913
S31500010D0000C0983E486F00284EB900025B0C30398E
S31500010D1000C05088907900C05084486F002202803C
S31500010D200000FFFF4EB900025B0C486F0028486FB8
S31500010D300026486F00264EB9000238AC204F2F28F6
S31500010D40001E303900C05088907900C05084486F29
S31500010D50002A02800000FFFF4EB900025B0C4879B1
S31500010D6000029D94486F002E486F002E4EB9000276
S31500010D7038AC204F2F280026487900030B054E92E8
S31500010D80203900C0983E486F00344EB900025B0C12
S31500010D90303900C05084907900C0508A486F002EC7
S31500010DA002800000FFFF4EB900025B0C486F003461
S31500010DB0486F0032486F00324EB9000238AC204FFE
S31500010DC02F28002A303900C05084907900C0508AFB
S31500010DD0486F003602800000FFFF4EB900025B0C2F
S31500010DE0487900029D94486F003A486F003A4EB91F
S31500010DF000238AC204F2F280032487900030B152A
S31500010E004E924FEF00244EB90001A17E0C79FFFFEF
S31500010E1000C050646700F8C22F39000283884EB9BA
S31500010E20000037100C40FFFF6700F8AE4A3900C0DA
S31500010E305251670002644A3900C05267674C424703
S31500010E407C003C07207C00C050A41030680048801C
S31500010E5048C0E588068000C0984420402F1020062F
S31500010E60D080D086E588068000029E4420402F2847
S31500010E7000084879 00030B254E924FEF000C5247AC
S31500010E800C47000A65BA600002104A3900C0525B7D
S31500010E90660002064A3900C0505667000120 4240EA
S31500010EA0103900C050583F002F3900C05050424001
S31500010EB0103900C0505E3F004240103900C0505A00
S31500010EC03F00487900030B314E924FEF000E0C396B
S31500010ED0000100C0505B6608487900030B6B601087
S31500010EE00C39000200C0505B660A487900030B9F6B
S31500010EF04E92588F4A3900C0505C6700009E48796F
S31500010F0000030BCE4E923013720BE2680240007CB
S31500010F103F00487900030BFF4E923016E04802402D
S31500010F2000033F00487900030C114E9230390080CE
S31500010F30402C720AE2680240001F3F004879000314
S31500010F400C234E9230390080402CE04802400003C9
S31500010F503F00487900030C344E9230390080402C12
S31500010F60E448024000033F00487900030C464E92D4
S31500010F7030390080402C024000033F0048790003CD
S31500010F800C574E924240103900804042 3F0048794A
S31500010F9000030C694E924FEF002E3F3900C050649A
S31500010FA0487900030C7B4E923F3900C05062487964
S31500010FB00030C884E924FEF000C600A487900033B
S31500010FC00C984E92588F103900804024E808020090
S31500010FD0000372001200E789068100029E1C20416F
S31500010FE02F28000410390080 4024E408020000381
S31500010FF04241120030013F001039008040240200B6
S315000110000003424112003001 3F002F3900C049EA76
S31500011010487900030CAD4E924FEF00104A3900E0BB
S31500011020001AB67343039008 0400E0800000F6708B5
S31500011030487900030CEF601A30390080400E080031
S315000110400000A6708487900030D066006487900031F
S315000110500D314E92588F60404240103900E001AD8B
S3150001106003F004240103900E001AC52403F00307C65
S31500011070 0010D1F900C0497C4240103900E001AAB4
S3150001108003200C2FC0016D1C14868000448790003 49
S315000110900D534E924FEF000C4A3900C0525767006C
S315000110A0076A4A3900C05259660007602F7C000260
S315000110B0C04800F408AF000200F26000073C2F6F41
S315000110C000D8010A082F000601076716486F00209D
S315000110D0487900030DCF487900030D7C4E924FEFFE
S315000110E0000C102F01064880206F00D832100241F3
S315000110F00003C0C13200C2FC02E4068100C04D6A91
S31500011100302F00F0024000FF3400C4FC02E4D2821A
S315000111102A41302F00F0024000FF360042471E2DC3
S3150001112002B642461C2D02B72C7C000005CC0C47AA
S31500011130000186D067A17280560063A0748C528057E
S315000111402004D080D085D080D08E28407800380306
S3150001115 00C4700186D047A1760043A0748C5220443
S315000111600D281D284EB89068100C0519A2405E58A91
S3150001117 0D28220413010486F001C48C04EB900028F
S31500011180 5AEC487900029D8C486F0020486F002078
S315000111904EB90002389648790002 9D88486F001CB6
S315000111A0486F001C4EB900023842486F00142F0CDC
S315000111B0486F01664EB9000238964 1EE009030063E
S315000111C048C0E788D1C02848720032030681000072
S315000111D0075C20411210488148C1E989068100C097
S315000111E0518A340648C2E58AD282204130104 86FBE
S315000111F0001C48C04EB900025AEC487900029D8C89
S31500011200486F0020486F00204EB900023896487991
S31500011210 00029D88486F001C486F001C4EB90002F1
S31500011220 3842486F00142F0C486F01624EB9000214
S315000112303896720032030681 0000075C20411210C5
S31500011240 488148C1E989068100C0518A340648C2ED
S31500011250E58AD2822041302800 02486F001C48C02E
S315000112604EB900025AEC487900029D8C486F002065
S31500011270486F00204EB9000238964879 00029D88D1
S31500011280486F001C486F001C4EB900023842486F77
S31500011290 0014486C0004486F015E4EB900023896 8E
S315000112A03F3C00002F0D4EB900013A963F3C000429
S315000112B02F0D4EB900013A963F3C00052F0D4EB950
S315000112C000013A962F6D01BE01522F6D01CE014EDE
S315000112D02F6D01D2014A43ED01F641EF013220D9CA
S315000112E020D92091342F0132946F0134382F0136E1

S315000112F0986F0138362F013A966F013C30390080DC
S31500011300403C02401FFF4440064020003F0030138E
S315000113100240000332 3C0100E0617006C0C13F009B
S3150001132030390080402A32390080403C02411FFF9B
S31500011330904102400FFF3F0030390080402832398A
S31500011340008040 3C02411FFF904102400FFF3F00D9
S3150001135030390080402A32390080403C02411FFF6B
S31500011360904102400FFF3F0030390080402832395A
S31500011370008040 3C02411FFF904102400FFF3F00A9
S315000113803039008040263239008040 3C02411FFF3F
S31500011390904102400FFF3F00486F00A648790003C5
S315000113A00E03487900030DDB4E924FEF001A0C47EE
S315000113B000186D047A1760043A0748C5303900C031
S315000113C0517A486F001C02800000FFFF4EB90002EF
S315000113D05B0C487900029D94486F0020486F0020FD
S315000113E04EB9000238AC204F2F280018320648C1EA
S315000113F0D281068100C05172204130 10486F002011
S3150001140002800000FFFF4EB900025B0C4879000222
S315000114109D94486F0024486F00244EB9000238ACF1
S31500011420204F2F28001C320648C1D281068100C0F8
S315000114305172204130 10486F002402800000FFFFE6
S315000114404EB900025B0C487900029D94486F002852
S31500011450486F00284EB9000238AC204F2F280020D3
S31500011460320648C1D281068100C0516A204130103E
S31500011470486F002802800000FFFF4EB900025B0C96
S3150001148048790 0029D94486F002C486F002C4EB994
S31500011490000238AC204F2F280024320648C1D281E1
S315000114A0068100C0516A20413010486F002C02802D
S315000114B00000FFFF4EB900025B0C487900029D94C3
S315000114C0486F0030486F00304EB9000238AC204FEB
S315000114D02F2800282205D281068100C051362041DD
S315000114E03010486F003002800000FFFF4EB9000245
S315000114F05B0C487900029D94486F0034486F0034B4
S315000115004EB9000238AC204F2F28002C486F00B08E
S31500011510487900030E40487900030E104E923F3C75
S3150001152000003F3C0000302D0206486F0044028057
S3150001153000000FFFF4EB900025B0C487900029D9442
S31500011540486F0048486F00484EB9000238AC204F3A
S3150001155 02F280040302D0204486F004802800000 09
S31500011560FFFF4EB900025B0C487900029D94486F5B
S315000115700004C486F004C4EB9000238AC204F2F2862
S315000115800044302D0202486F004C02800000FFFF2C
S315000115904EB900025B0C487900029D94486F0050D9
S315000115A0486F00504EB9000238AC204F2F28004832
S315000115B0486F00CC487900030E78487900030E4E37
S315000115C04E924FEF00400C4700186D047A176002E7
S315000115D03A077003C04548C0068000C051662040E6
S315000115E0424010103F00486F009A487900030E9759
S315000115F0487900030E874E92204F2F280164204F11
S315000116002F280168204F2F280170204F2F280174A1
S31500011610204F2F28017C486F00BA487900030ED06D
S31500011620487900030EA64E923F063F07486F00CA4F
S31500011630424010 2D02DF3F00487900030EF648793B
S31500011640000030EDE4E924FEF0040204F3F28013A35
S31500011650204F3F280138204F3F280136486F009E12
S31500011660487900030F1D487900030EFB4E92204F67
S3150001167 03F28014E204F3F28014C204F3F28014A69
S31500011680486F00B0487900030F48487900030F26D8
S315000116904E923F033F043F02486F00C24879000360
S315000116A00F73487900030F514E92204F2F28019452
S315000116B043EF00564EB9000262A4486F018C486F91
S315000116C00184486F00564EB9000238AC204F2F28CE
S315000116D0004E486F0194486F018C486F005A4EB90D
S315000116E0000238AC204F2F280052486F005A486F2D
S315000116F00194486F005E4EB9000238AC204F2F2885
S3150001170000056486F00DA487900030FA448790003B0
S3150001171 00F7C4E924FEF004E204F2F28015E43EF74
S3150001172000204EB9000262A43003E248486F001659
S3150001173002800000FFFF4EB900025B0C486F0156A4
S31500011740486F001A486F001A4EB900023896486F62
S315000117500014A486F0016486F00164EB9000238ACB0
S31500011760204F2F28000E3004E248486F001A0280ED
S31500011770 0000FFFF4EB900025B0C486F015E486F27
S315000117800001E486F001E4EB900023896486F01527E
S31500011790486F001A486F001A4EB9000238AC204F44
S315000117A02F2800123002E248486F001E0280000016
S315000117B0FFFF4EB900025B0C486F0024486F002200
S315000117C0486F00224EB900023896486F015A486F99
S315000117D0001E486F001E4EB9000238AC204F2F285C
S315000117E00016486F00A4487900030FD0487900031A
S315000117F00FA84E924FEF001842A7486F00244EB92A
S3150001180000018DF24A006600F8B64A3900C05265F9
S3150001181067 00013C2A7C00C0530820157204B08180
S3150001182062 00012CD040303B00064EFB0002000A4C
S31500011830001C002E00520052007980000080400EEC
S315000118400279FBFF0080400E602202797FFF008053
S31500011850400E0279FBFF0080400E601002797FFF87
S3150001186000080400E0079040000 80400E13FC000148
S31500011870 00E001AB13FC000200C05055600000D02F
S3150001188000C95000000003660 47C0160027C020C9545
S31500011890000000003660442 0760027E01307C0008F6
S315000118A0D1F900C0010670001007E588D1C00828EB
S315000118B0000020001670 0008E13C600E001AA4A3942
S315000118C000 0C052446730103C00FFD03900C0528737
S315000118D0206F010A321002410003C0C113C000E0AB
S315000118E001AC301002400003D03900E001AC13C056
S315000118F000E001AD60384A3900C0524D671A103C0C
S31500011900 00FFD03900C052AB13C000E001AC520059
S31500011910 13C000E001AD6016423900E001AC206F52
S3150001192 0010A301002400003 13C000E001AD027944
S31500011930FBFF0080400E423900E001AB423900C096
S3150001194 05055600A487900030FDD4E92588F4A3987
S3150001195000C05267672C4A3900C052516624423989
S3150001196000C050AE42477000300706 8000C050A448
S31500011970204010BC000152470C47000A65E861008F
S31500011980 02A442404FEF018033C000A0028E4CDF1B
S315000119907CFC4E754E714E714E7148E7011C33C089
S3150001 19A000A002904FEFFFF6287C00C050564A1463
S315000119B0670001842A7C00C0506447EF00084A7919
S315000119C000C05062637A0C55FFFF6774537900C0FB
S315000119D05062662E53140C1400036726421442 39D2
S315000119E000C0505842472A7C00C04D6A3F072F0D60
S315000119F04EB9000133AE4BED02E452470C470001EC
S31500011A006DEA2A7C00C04D6A602243ED02CE41D7C1
S31500011A1020D920D93091026FFCFF000843D741ED50
S31500011A2002CE20D920D930914BED02E4BBFC00C097
S31500011A30504E65D60279FCFF0080402E600000F80A
S31500011A404A556F6A5355660833FC01A000C05062BF
S31500011A502A7C00C04D6A604A43ED02CE41D720D9A7
S31500011A6020D930914240103900C0505A024000033B
S31500011A70E148026FFCFF0008816F000842401039FF
S31500011A8000C0505E02400003026FFFFC0008816F38
S31500011A900008 43D741ED02CE20D920D930914BED34
S31500011AA002E4BBFC00C0504E65AE6000008A0C55D6
S31500011AB0FFFF670000820C140002667A2A7C00C0D0
S31500011AC04D6A604A43ED02CE41D720D920D93091E3
S31500011AD04240103900C0505A02400003E148026FEB
S31500011AE0FCFF0008816F00084240103900C0505EBB
S31500011AF002400003026FFFFC0008816F000843D714
S31500011B0041ED02CE20D920D930914BED02E4BBFC48
S31500011B1000C0504E65AE4240103900C0505A0240D6
S31500011B20003E1480279FCFF0080402E81790080A4
S31500011B30402E18BC00014FEF000A33C000A00292EC
S31500011B404CDF38804E754E714E714E7133C000A018
S31500011B502944A3900C050566732227C00C0505860
S31500011B604A11672853116624423900C0505642393A
S31500011B7000C0505C4240103C000033C000C05062BF
S31500011B8033C000C0506413C000C0505B4A3900E046
S31500011B9001AB671C227C00C050554A116712531 1D4
S31500011BA0660E0279FBFF0080400E423900E001AB70
S31500011BB033C000A002964E754E714E714E712F07BD
S31500011BC033C000A002981E2F000D488748C7202F5A

S31500011BD000082207D281D287E589068100029E4448
S31500011BE02041B0906D047E0460241E2F000D4887AD
S31500011BF048C72207D281D287E589068100029E4421
S31500011C002041B0A800046E047E0560024207100759
S31500011C1033C000A0029A2E1F205F5C8F4ED04E71FA
S31500011C204E714E7148E7013C33C000A0029C4FEF54
S31500011C30FFE62A7C00C050AE0C15000A6C00026853
S31500011C40287C00C05060267C00C05184247C00C0E2
S31500011C5050A410150C0000096200023A4880D040D9
S31500011C60303B00064EFB00020014005C0072008847
S31500011C70009E00DA016601F0021E021E4A1462008D
S31500011C800214303900C05084907900C05086E8486B
S31500011C90486F001402800000FFFF4EB900025B0C82
S31500011CA0487900029D98486F0018486F00184EB990
S31500011CB0000238AC486F00104EB9000265FC2E00D8
S31500011CC0600001AC4A14620001CC303900C0517A7F
S31500011CD0E8487E003E00600001964A14620001B6A3
S31500011CE0303900C0517CE8487E003E00600001802A
S31500011CF04A14620001A0303900C05182E8487E00D2
S31500011D003E006000016A4A146200018A3013486F7E
S31500011D10001602800000FFFF4EB900025B0C4879F5
S31500011D2000029D94486F001A486F001A4EB90002CE
S31500011D3038AC486F00124EB9000265FC2E006000F7
S31500011D40012E4A146200014E3013907900C0517E73
S31500011D50486F001402800000FFFF4EB900025B0CC1
S31500011D60487900029D94486F0018486F00184EB9D3
S31500011D70000238AC487900029D88486F0014486F0C
S31500011D8000144EB90002389630134 86F00080280DD
S31500011D900000FFFF4EB900025B0C487900029D94DA
S31500011DA0486F000C486F000C4EB9000238AC486F02
S31500011DB0000C486F0008486F00084EB90002386AE7
S31500011DC048574EB9000265FC2E00600000A24A1475
S31500011DD0620000C23013907900C0517E486F001432
S31500011DE002800000FFFF4EB900025B0C4879000239
S31500011DF09D94486F0018486F00184EB9000238AC20
S31500011E00487900029D88486F0014486F00144EB946
S31500011E1000023896301348 6F000802800000FFFF69
S31500011E204EB900025B0C487900029D94486F000C84
S31500011E30486F000C4EB9000238AC486F000C486F71
S31500011E4000008486F00084EB90002384248574EB99B
S31500011E50000265FC2E0060164A146238303900C053
S31500011E605088907900C05084E8487E003E001015E5
S31500011E7048803F002F076100FD461215488148C181
S31500011E8015801800600C1015488048C015BC000369
S31500011E90080052150C15000A6C0C1015488048C034
S31500011EA015BC000208004FEF001A33C000A0029EC5
S31500011EB04CDF3C804E754E714E714E712F0D33C005
S31500011EC000A002A0598F2A6F000C0257FF00303C78
S31500011ED000FFC06F0010E148025700FF8157026FF3
S31500011EE00FFF000208EF00030002307C00AAD1F9BF
S31500011EF000C0497C3017E048024000FF3200C2FCB6
S31500011F00002CD1C14868001A4879000310132F0D1F
S31500011F104EB90002438C2F3900027D7A48790003BD
S31500011F20101C486D00204EB90002438C4FEF00187B
S31500011F30588F33C000A002A22A5F205F5C8F4ED06B
S31500011F404E714E714E712F0D33C000A002A4598FF0
S31500011F502A6F000C0257FF0070F0D06F001002408C
S31500011F6000FFE148025700FF8157026F0FFF000291
S31500011F7008EF00030002307C00AAD1F900C0497CB9
S31500011F803017E048024000FF3200C2FC002CD1C1EC
S31500011F9048680004487900031025 2F0D4EB9000248
S31500011FA0438C2F3900027D7A48790003102E486D43
S31500011FB000204EB90002438C4FEF0018588F33C0F2
S31500011FC000A002A62A5F205F5C8F4ED04E714E7133
S31500011FD04E7148E7230C33C000A002A8598F2EB9D1
S31500011FE000029DC07C00303C00FFC06F0020E1482C
S31500011FF0025700FF8157026FFC0000023F3C0000C0
S315000120004EB900007B5A28403017E048024000FFD5
S3150001201072003200E589D28C2A41082D00020001A6
S315000120200675E7003C02D00016756082D000200018E
S315000120306604 2E06602E082D0004000166047 00158
S3150001204060 20207900C005802028000E7201B08131
S31500012050660 47001600C207900C005802028000EFE
S3150001206052802E002007321502410003740034010C
S31500012070 22024EB9000274A42C00206F001C42906B
S3150001208020065 88F33C000A002AA4CDF30C4205F5F
S315000120905C8F4ED04E714E714E7148E7230C33C0A2
S315000120A000A002AC598F2EB900029DC47C0070F0CD
S315000120B0D06F0020024000FFE148025700FF815720
S315000120C0026FFC0000023F3C00004EB900007B5A43
S315000120D028403017E048024000FF72003200E589CF
S315000120E0D28C2A41082D00030001674A7003C02DD6
S315000120F0000167420 82D0003000166042E06601ADE
S31500012100082D00040001660470 01600A207900C0F0
S3150001211005802028000ED0802E002007321502 41AE
S3150001212000037400340122024EB9000274A42C008B
S315000121300206F001C42902006588F33C000A002AECB
S3150001214 04CDF30C4205F5C8F4ED04E714E714E71A4
S31500012150 33C000A002B033C000A002B2205F588F86
S3150001216004ED04E714E714E7133C000A002B433C0D1
S3150001217000A002B6205F588F4ED04E714E714E713F
S31500012180048E7213E33C000A002B84FEFFFDC45EF20
S31500012190002 2286F00440252FC00303C00FFC06F51
S315000121A0004CE148026F00FF0020816F00203F3C98
S315000121B000004EB900007B5A2640302F0020E0482F
S315000121C0024000FF72003200E589D28B2A41267C4B
S315000121D000C00580082D0002000166044247601E0A
S315000121E0082D00040001670C2053202 8000E7201FF
S315000121F0B08166047E0160063E280010DE414A4732
S315000122006700022E08EF00020022202F0048320745
S31500012210048C14EB90002502A024000FF026FFF007A
S3150001222000020816F0020202F0048320748C14EB997
S31500012230 0002507C0240000F720CE368026F0FFF30
S31500012240 0022816F00220C4700016F2C303CF00008
S31500012250C06F002266047E01601E302F0022E268F4
S31500012260 0240000F53400240000FE368026F0FFF68
S31500012270 0022816F002242474A476622302F002200
S31500012280720CE2680240000F7E003E00701AD09385
S315000122902207D281D287E589D0812F00600648794D
S315000122A0 0003103F4879000310372F0C2C7C0002E5
S315000122B0438C4E964FEF000C267C00C0497C30398A
S315000122C000C00012E848024000070C400004673ACB
S315000122D00839000000C000FD6730082D0004000128
S315000122E067282F3900C000FA43EF00224EB90001DA
S315000122F07F2841EF001E42401010322F0022740C3D
S31500012300E4690241000FB041672C307C00AAD1D3A9
S31500012310302F0020E048024000FF3200C2FC002CB2
S31500012320D1C14868001A487900031046486C000874
S3150001233 04E964FEF000C3F3C0000204F2F28002205
S31500012340 43EF001E4EB9000069CE302F0020E04851
S315000123500024000FF72003200D281068100000 6D0E1
S31500012360 20413F10204F2F28001E2F28001A43EF2F
S315000123700001A4EB9000186C4307C00AAD1D3302F91
S3150001238000020E048024000FF3200C2FC002CD1C10F
S3150001239048680016486F000C4EB9000236DE486FD9
S315000123A000008486F0014486F00084EB9000236A0B5
S315000123B0204F2F2800042F10307C00AAD1D3302FB4
S315000123C00028E048024000FF3200C2FC002CD1C1C7
S315000123D0486800 23486C00204E964FEF00107003AA
S315000123E0C02D0001674A3015024000037201028 1C7
S315000123F00000FFFF82C00C41000163 34302F002032
S315000124000024000FF32150241000302800000FFFF77
S31500012410 80C152403F0048790003104C486C0020AF
S31500012420 4EB9000266484874082 04E964FEF000ADE
S315000124304FEF002433C000A002BA4CDF7C84205F3A
S3150001244 04FEF000A4ED04E714E714E7148E7273C50
S31500012450 33C000A002BC4FEFFFEC45EF000A2A6F24
S31500012460 00380252FC0070F0D06F0040024000FFBD
S31500012470E148026F00FF0008816F00083F3C000041
S3150001248004EB900007B5A2640302F0008E048024032
S3150001249000 0FF72003200E589D28B2841267C00C0FC
S315000124A00580082C0003000166044247601808 2CC9

S315000124B00004000166047C01600620533C280010DC
S315000124C03006D0403E004A4767000234202F003CC8
S315000124D0320748C14EB90002502A024000FF026F7E
S315000124E0FF000008816F0008202F003C320748C119
S315000124F04EB90002507C2C0072024EB90002502ADD
S31500012500024000F720CE368026F0FFF000A816F31
S31500012510000A2A060245000108EF0002000A3F3CB4
S31500012520000B43EF00024EB9000073C62F3900C0FD
S315000125300OFA41EF00042F10204F2F28001043EF1F
S3150001254000184EB900007604307C0008D1F900C0AD
S31500012550010630 2F0008E048024000FF72003200F9
S31500012560E589D1C10828000400016604 7E016006E0
S315000125702 0532E28000E7001BE806322302F000AE0
S31500012580720CE2680240000F7E003E00701AD09382
S3150001259022 07D281D287E589D0812F00600648794A
S315000125A00003105748790003105 32F0D267C0002B3
S315000125B0438C4E9348790003105F2F0D4EB90002EC
S315000125C06648487508004E934FEF00147003C02CFF
S315000125D000016748301402400003720102810000C5
S315000125E0FFFF82C00C410001633230 2F0008024018
S315000125F000FF3214024100030280 0000FFFF80C188
S3150001260052403F004879000310632F0D4EB9000276
S31500012610664848750 8004E934FEF000A30054A4058
S3150001262 0670C0C400001670000C2600000D24879C7
S31500012630000 29DC8486F00104EB9000238DA4A40C0
S31500012640 6C0000BC487900029DCC486F00104EB961
S31500012650000238DA4A406D0000A6287C00C0497C99
S31500012660203C000000AAD094322F0008E049024124
S31500012670 00FF3401C4FC002CD0822F00486F0010EB
S31500012680486F000C4EB900023896204F2F280004DF
S31500012690307C00AAD1D4302F000CE048024000FF64
S315000126A03200C2FC002CD1C14868000D486D0020E3
S315000126B04E93307C00AAD1D4302F0014E04802405A
S315000126C000FF3200C2FC002CD1C1486800044879E1
S315000126D00003106A486D00204EB90002664848752D
S315000126E008204E934FEF00186014486D0020204FCC
S315000126F02F2800143F3C00634EB900000B064FEF34
S3150001270 0001433C000A002BE4CDF3CE4205F4FEF53
S31500012710000A4ED04E714E714E7133C000A002C0F8
S31500012720227C00C05038207C0080402620D920D948
S31500012730309113F900C05045008040430 0791000E4
S3150001274000804008 33C000A002C24E754E714E7122
S31500012750 4E7148E7030C33C000A002C44FEFFFF6E9
S31500012760 2A6F001E3C2F002243ED02CE41D720D90D
S31500012770 20D930917003C046E548026FFFF3000887
S31500012780816F000843D741ED02CE20D920D930917F
S31500012790 1B4602E249ED001A203C00000090D0AD34
S315000127A000163206C3FC00C8D081288020402B5079
S315000127B0000C20542B68000400100839000600C0E4
S315000127C051FD672C4A6D020467267008D06D02041C
S315000127D0E8483E003B4702BA3B4702BC7008D06D51
S315000127E00208E8483E003B4702BE3B4702C0604440
S315000127F0300648C0D0802E007008207C00C0516A87
S31500012800D0707800E8483B4002BA7008D070780072
S31500012810E8483B4002BC7008207C00C05172D07071
S315000128207800E8483B4002C07008D0707800E8485C
S31500012830 3B4002BE284D0C2D000302E2660E0C2D14
S31500012840003C02DD6606426D000C6004422D02DD8D
S31500012850204C3228000C303900C05094C2C0D281BD
S3150001286048413141000C32280010303900C05094E3
S31500012870C2C0D2814841314100104FEF000A33C036
S31500012880 00A002C64CDF30C0205F5C8F4ED04E7177
S31500012890 4E714E7148E7010C33C000A002C84FEFDC
S315000128A0FFF62A6F001A43ED02CE41D720D920D96F
S315000128B03091701FC06F001E720AE368026F83FFBA
S315000128C00008816F000843D741ED02CE20D920D9F7
S315000128D030911B6F001F02E04240102D02E00240C2
S315000128E0001FE368026D83FF02D6816D02D67E006A
S315000128F01E2D02E0202D00162207D281D287D28119
S31500012900D08128402A947028D06C00047201B2400C
S31500012910 6F04700160067028D06C0004323C00C858
S31500012920B2406C043E0160187028D06C000472013C
S31500012930B2406F04700160067028D06C00043E003E
S3150001294 03B47001442401 02D02E00240000348C0FC
S3150001295006 8000C051662040424010103B4002DA1A
S31500012960 0839000600C051FD67144A6D0202670E60
S3150001297070 08D06D0202E8483B4002B8601A700840
S315000129807200122D02E0D281068100C0513620412B
S31500012990D050E8483B4002B80C2D001702E0660C07
S315000129A00C2D006402DE6604425560044 22D02DEEF
S315000129B0284D204C3210303900C05096C2C0D28109
S315000129C0484130814FEF000A33C000A002CA4CDFF4
S315000129D03080205F5C8F4ED04E714E714E7148E74C
S315000129E0000C33C000A002CC2A6F000C7008D0ADD9
S315000129F0001A7200122D02E0E789D08128402B547B
S31500012A000 0042B6C000400080C2D001702E0660878
S31500012A100C2D006402DE67100C2D000302E2661025
S31500012A200C2D003C02DD6608426D0004426D000873
S31500012A30284D204C3228000430 3900C05098C2C0BD
S31500012A40D2814841314100043228 0008303900C0A2
S31500012A505098C2C0D28148413141000833C000A01C
S31500012A6002CE4CDF3000205F588F4ED04E714E7132
S31500012A704E7148E7C7FE33C000A002D04FEFFFEA10
S31500012A800079800000804 0400279BFFF0080400845
S31500012A90287C00C054402C7C00C050420C390002F6
S31500012AA000C0543C66000082423900C05450207C6C
S31500012AB00080400E00500300600A207C0080400E1A
S31500012AC0005001002E147001123900C05453E3A8BE
S31500012AD0CE80207C0080400E0250FEFF2A7C00C082
S31500012AE054520C55000A642653554A87670C207CBC
S31500012AF00080400E00500300602E207C0080400EB6
S31500012B0030100240FDFF004001003080601A0C5574
S31500012B10FFFF66083ABC000A70FF28800C9400008B
S31500012B2004006404 3ABC0009287C00C04D362A54CE
S31500012B30227C00804030204D20D920D920914AADF9
S31500012B40000E6706206D000E4E907046D1940C94CF
S31500012B5000C04D36650628BC00C049EE30390080FC
S31500012B60402E720AE2680240001F20541140000CF8
S31500012B7020544228000D20541028000CB03900C002
S31500012B80504A671A42411200024100 1F700AE16968
S31500012B90027983FF00C05040837900C05040 30392C
S31500012BA00080403C02401FFF02400FFF44400640A8
S31500012BB0100072003200D3B900C050A07028D05660
S31500012BC033C000C050383016D07900C04D7E33C0B6
S31500012BD000C0503A0640003C33C000C0503C227C45
S31500012BE000C05038207C0080402620D920D9309161
S31500012BF0303C1FFFC0560279E0000080403C8179DD
S31500012C00 0080403C13F900C05045008040432054E9
S31500012C104AA8001267062268 00124E910079400008
S31500012C20008040084A3900C050496708287C00C026
S31500012C304E7E6006287C00C04DD4207900C0985C89
S31500012C4030280002080000 0F67063E2D00046004CC
S31500012C503E2D00020C470FE16E060C47001E6C0666
S31500012C60523900C05046203CFFFFFEE8D08D0C8053
S31500012C700 0C049EE650647EDFEE8600447ED023007
S31500012C803F6B000600103F6B00080014302D000258
S31500012C90907900C050243F40000E303900C05024C6
S31500012CA0916F0010302D0004907900C050283F40EC
S31500012CB000012303900C05028916F00147000302D79
S31500012CC00002D1AC004C7000302D0006D1AC005092
S31500012CD07000302D0004D1AC00587000302D000872
S31500012CE0D1AC0054303900C05032B06D00026308D7
S31500012CF033ED000200C05032303900C05030B06DA3
S31500012D000002640833ED000200C05030303900C0C3
S31500012D105036B06D0004630833ED000400C0503630
S31500012D20303900C05034B06D0004640833ED00043E
S31500012D30 00C05034526C006042472C3900C050A08C
S31500012D409CB900C04D8823F900C050A000C04D8831
S31500012D50247C00C04D6A47ED00164BEF000C20792C
S31500012D6000C0985C30280002080000 0F6700018649
S31500012D70204B224D2F4200082F4A0004244A508836
S31500012D8045EA0008508845EA00085088 30290006BF

S31500012D9032290008C1C16B084A2A0003670A60523A
S31500012DA044804A2A0003674A32123406C2C2142AF0
S31500012DB000026B04E5A160044402E4A12401C4C03D
S31500012DC021420004240148424840C4C02082240113
S31500012DD0C4C048404841C0C14281D480D3814841E2
S31500012DE0484232024242D5A800042410D5812082ED
S31500012DF0605232123406C2C2142A00026B04E5A1E3
S31500012E0060044402E4A12401C4C021420004240157
S31500012E1048424840C4C020822401C4C048404841B9
S31500012E20C0C14281D480D3814841484232024242E4
S31500012E30D5A800042410D581208244A800042010BE
S31500012E40408020805088598A30290002C1C0321240
S31500012E503406C2C2142A00026B04E5A160044402CE
S31500012E60E4A12401C4C0214200042401484248408F
S31500012E70C4C020822401C4C048404841C0C1428127
S31500012E80D480D3814841484232024242D5A8000447
S31500012E902410D5812082508858BA30290006C1C065
S31500012EA032123406C2C2142A00026B04E5A1600480
S31500012EB04402E4A12401C4C0214200042401484281
S31500012EC04840C4C020822401C4C048404841C0C112
S31500012ED04281D480D3814841484232024242D5A838
S31500012EE000042410D5812082242F0008246F0004B9
S31500012EF06000017E204B224D2F4200082F4A00041C
S31500012F00244A5088588A508845EA00085088302952
S31500012F10000232290004C1C16B084A2A0003670A6C
S31500012F20605244804A2A0003674A32123406C2C2FA
S31500012F30142A00026B04E5A160044402E4A1240101
S31500012F40C4C021420004240148424840C4C0208232
S31500012F502401C4C048404841C0C14281D480D381C4
S31500012F6048414842320242420D5A800042410D58184
S31500012F7020826052321234O6C2C2142A00026B0445
S31500012F80E5A160044402E4A12401C4C02142000475
S31500012F9024014842484OC4C020822401C4C048409C
S31500012FA04841C0C14281D480D38148414842320 25E
S31500012FB04242D5A800042410D581208244A80004E9
S31500012FC020104080208050883029 0002C1C0321272
S31500012FD03406C2C2142A00026B04E5A1600444024D
S31500012FE0E4A12401C4C0214200042401484248400E
S31500012FF0C4C020822401C4C048404841C0C14281A6
S315000130000D480D3814841484232024242D5A80004C5
S315000130102410D5812082508858 8A30290006C1C0E3
S315000130203212340 6C2C2142A00026B04E5A16004FE
S315000130304402E4A12401C4C021420004240148 42FF
S3150001304048 40C4C020822401C4C048404841C0C190
S315000130504281D480D3814841484232024242D5A8B6
S3150001306000042410D5812082242F0008246F000437
S315000130702A7C00C04D8C204B224D2F42000843E98B
S315000130800004841E800302020D1A1222120205BC246
S315000130900488248C2D38022812221D38222812020E4
S315000130A0D1A1222120205BC2488248C2D38022813D
S315000130B02221D38222812020D1A1222120205BC27C
S315000130C0488248C2D38022812221D38222812020B4
S315000130D0D1A1222120205BC2488248C2D38022810D
S315000130E02221D38222812020D1A1222120205BC24C
S315000130F0488248C2D38022812221D3822281202084
S31500013100D1A1222120205BC2488248C2D3802281DC
S3150001311022 21D3822281242F00084A47660000EA31
S315000131204 2461C3900C0504C4A3900C05054660012
S3150001313 0008E207900C0985C302800020800000F3C
S315000131406 7063A2F001260043A2F000E2A7C00C04F
S31500013150 50470C460003662 80C45FAAB6F160C4522
S315000131600 5556C100C15003C643652150C15003CC7
S315000131700 662E60240C15003C662408C70001601EFB
S31500013180 0C45FCCE6F180C4503326C1252150C150A
S315000131900 03C650C4215524608C70001600242150 3
S315000131A00C39001400C05046652C4A466F28534618
S315000131B008C70001423900C05046421560184240 16
S315000131C0103900C0505DBC40670C42461C3900C036
S315000131D0505D08C700014A4767260807000167 20B6
S315000131E03F06487900C04D6A6100F5687003C04624
S315000131F0E5480279FFF30080402E81790080402E58
S3150001320033FC000100C050B00C39003D00C000FE87
S31500013210630001624A3900C0504967082A7C00C030
S3150001322004DD460062A7C00C04E7E4A6D0060660061
S315000132300144 7003C02C00616600013A297900C07F
S31500013240050A0005C4A3900C05054670A08F90007CB
S3150001325000C0503E600808B9000700C0503E423920
S3150001326000C05046227C00C0502C207C00C04F601C
S31500013270020D920D92091227C000007A4207C00C0FF
S315000132800502C20D920D9209142 4747EC00622A7C54
S3150001329000C04D8C224D204B20D920D92091524778
S315000132A04BED000C47EB000C0C4700066DE64A3966
S315000132B000C0504957C04400488013C000C050495F
S315000132C03016B07900C0522C67663CB900C0522C4A
S315000132D07028D05633C000C05038702 8D07900C04D
S315000132E04D7E7201B2406F0470016008 7028D0797A
S315000132F000C04D7E323C00C8B2406C043E01601CE9
S3150001330070 28D07900C04D7E7201B2406F04700101
S3150001331060087028D07900C04D7E3E003016D04737
S31500013320 33C000C0503A0640003C33C000C0503C98
S3150001333 02A7C00C098424A15673A0C15000264348B
S315000133404240103900C0504C3F00487900C04D6AD8
S315000133506100F40042401039 00C0504A3F004879EC
S3150001336000C04D6A6100F52E487900C04D6A6100C2
S315000133700F66E53154A7900C07B4E660833FC000190
S3150001338000C07B4E0C39000200C0543C660A207C0A
S31500013390 0080400E0250FCFF4FEF001633C000A024
S315000133A002D24CDF7FE34E734E714E714E7148E788
S315000133B00F0C33C000A002D42A6F001C3A2F002044
S315000133C04A3900C05056663620 7C0000075E103030
S315000133D05000488002400003E148026DFCFF02D61E
S315000133E0816D02D6207C0000075D103050004880B8
S315000133F002400003026DFFFC02D6816D02D64247F0
S3150001340001E2D02E24244182D02E0207900C0985C8C
S31500013410302800020800000E670A0079200000 80AB
S3150001342040466008027 9DFFF00804046287C008024
S315000134304024101402000003424112002 07C0000C7
S31500013440075D103050004880B24066347003B047C3
S3150001345 06C043C0060023C071014E40802000003FF
S3150001346042411200B2466718 7003B0476C047C03F0
S3150001347060021C077003C006E508021400F38114FC
S315000134803005C1FC03C20680003C00002B4000163B
S315000134903B7900C0522C02D83F072F0D6100F2B4D0
S315000134A03F042F0D6100F3EE2F0D6100F53233C09D
S315000134B000A002D64CDF30F0205F5C8F4ED04E71FB
S315000134C04E714E7133C000A002D833C000A002DA9B
S315000134D04E754E714E714E7148E73F3E33C000A0A6
S315000134E002DC4FEFFFD447D7227C0000085A204B5D
S315000134F020D920D920914EB9000053A83039008037
S315000135004008080000 0C670004F8025300FF605CE5
S3150001351030 13E048024000FF72003200E5890681 5F
S3150001352000C0460C2041301002400003 41EF001E4E
S315000135303213E049024100FF74003401D1C2108008
S3150001354041EF00103013E048024000FF72003200E4
S315000135 50D1C110BC00013013E048024000FF5240C7
S31500013560024000FFE148025300FF81533013E04857
S31500013570024000FF0C40000E65964240103900C023
S315000135805054024000017 20FE36808B9000700C0F9
S31500013590506881790 0C050680253FF002A7C00C040
S315000135A04D6A2C7C00E00052600004484A2D02DF7F
S315000135B0670645ED006A600445ED01144A2D02DFF8
S315000135C0670649ED0114600449ED006A4A6A006024
S315000135D06300040A224A41ED020C702920D951C820
S315000135E0FFFC3091202A005C90AC005C2B40026805
S315000135F00C39000200C0505464062F0D61000430DE
S3150001360000C2D006402DE65047E1860041E2D02E0A6
S31500013610 1B4702B60C2D003C02DD65047E046004E6
S3150001362 01E2D02E21B4702B7025300FF607A3013D8
S3150001363 0E048024000FF7A003A003013E0480240B9
S31500013640 00FF7C003C003013E048024000FF7E0092
S31500013650 3E002007D080D087E5882F34086A2F34B2
S31500013660 08662F34086241ED026E2006D080D086AE

S31500013670E58BD1C02F2800082F2800042F1043ED1C
S31500013680020C2005D080D085E588D3C04EB9000153
S31500013690854C3013E048024000FF5240024000FFD3
S315000136A0E148025300FF81533013E048024000FF16
S315000136B00C4000066500FF7808AF00020002302FBB
S315000136C00002720AE268024000017E003E00486D77
S315000136D0023C302F0006E268024000013200C2FCC3
S315000136E000A8D28E3013024000FF41EF00142407D8
S315000136F0E78A9487D482D1C21428000A48820280BC
S3150001370000000FFFF80C23400C4FC00A8D282204121
S315000137104868007 84EB900018680302F0002720A8F
S31500013720E268024000017E003E00486D0248302FEB
S315000137300006E268024000013200C2FC00A8D28EF7
S3150001374030130 24000FF41EF00142407E78A9487F3
S31500013750D482D1C21428000B48820280000 0FFFFE8
S315000137608 0C23400C4FC00A8D2822041486800848B
S315000137704EB900018680302F0002720AE2680240CB
S31500013780000178003800302F0002E268024000193
S3150001379 07E003E003013024000FF41EF0010220779
S315000137A0E7899287D281D1C11228000A4881028015
S315000137B00000FFFF80C17A003A00207900C0985CC2
S315000137C03028000 20800000F67067E052C076004FA
S315000137D07E042C0741ED020C2006D080D087E588B7
S315000137E0D1C02F082004D080D084E588068000E06F
S315000137F0003A2205D281D285E589D0812F004EB9C2
S3150001380000186804AB900C048B06700018C0253A6
S315000138 1000FF60000174302F0002720AE268024064
S3150001382000017E003E0048790000866 7044D0B968
S315000138 3000C001062207E7899287E789D081321302
S31500013840E049024100FF74003401E58AD0822F006D
S315000138504EB9000238DA4A406F000118302F0002D3
S31500013860720AE268024000017C003C003013E04825
S31500013870024000FF7E003E00302F0002E268024057
S3150001388000013200C2FC00A8D28E3013024000FFB4
S3150001389041EF00102406E78A9486D482D1C23413FC
S315000138A0E04A024200FF76003602D1C31410488274
S315000138B002800000FFFF80C23400C4FC00A8D2824F
S315000138C02007D080D087E588D28028413013E04890
S315000138D0024000FF72003200D2810681000006D04C
S315000138E020413F102F2C00042F1443EF00164EB930
S315000138F00001828E48790000866486F00104EB9B3
S31500013900000238DA4A406D42302F0002720AE2683C
S31500013910024000017E003E007044D0B900C001069D
S31500013920 2207E7899287E789D0813213E04902416C
S3150001393000FF74003401E58AD0822F00486F001021
S315000139404EB9000238DA4A406F28224C41EF000492
S31500013950 20D920912F0B3F3C00033F3C001F4EB95D
S3150001396000 0071EA227C00029E08204C20D920D951
S31500013970 20913013E048024000FF5240024000FF10
S3150001398 0E148025300FF81533013E048024000FF33
S31500013990 0C40000E6500FE80302F0002720AE268BC
S315000139A002400001524002400001E36808AF0002F4
S315000139B00002816F0002302F0002E268024000011E
S315000139C04A406600FCFA227C0000079041EA004862
S315000139D0700420D951C8FFFC426A006030130240CE
S315000139E000FF5240024000FF0253FF0081534BED9E
S315000139F002E43013024000FF0C4000016500FBAEFB
S31500013A004FEF002C33C000A002DE4CDF7CFC4E756C
S31500013A104E714E714E7133C000A002E033C000A05A
S31500013A2002E2205F588F4ED04E714E714E712F07B4
S31500013A3033C000A002E4226F00087E003E29026C1A
S31500013A4020290258E98822074EB9000274A433409E
S31500013A5002042029025CE9884EB9000274A43340AD
S31500013A6002062029 0264E9884EB9000274A4334093
S31500013A70020820290260E9884EB9000274A4334085
S31500013A80020A33C000A002E62E1F205F588F4ED0D7
S31500013A904E714E714E7148E7030C33C000A002E827
S31500013AA04FEFFFEC2A6F00283E2F002C0C47000732
S31500013AB06C000126202D026848574EB900025B0CA6
S31500013AC048790000086A486F0004486F00144EB92F
S31500013AD0000238963C0748C641ED020C2006D0800C
S31500013AE0D086E588D1C02F68000400043C0748C68B
S31500013AF041ED020C2006D080D086E588D1C02F6822
S31500013B0000000800080C470001670C0C470002670615
S31500013B100C47000366164AAF00046C10486F000498
S31500013B204EB9000184820A6F8000000C49EF001033
S31500013B307020320748C1D281068 1000006EE20417D
S31500013B40D0503F00204F2F28000A2F280006224C74
S31500013B504EB90001828E486F000C2F0C4EB900023F
S31500013B6035E230070C400006626ED040303B00065D
S31500013B704EFB0002000E002400240024000E000E5D
S31500013B8000342F1443ED01BE300748C0E588D3C089
S31500013B904EB9000255D4604041ED01BE300748C020
S31500013BA0E588D1C020946030207900C0985C302827
S31500013BB000020800000F67047E0560027E04486D5E
S31500013BC001BE41ED01BE2007E588D1C02F08486D31
S31500013BD001D64EB9000238964FEF001433C000A04B
S31500013BE002EA4CDF30C0205F5C8F4ED04E714E71C1
S31500013BF04E7148E7033A33C000A002EC267C00C0B0
S31500013C0050604A136300028E4A3900C0505C660058
S31500013C1002844A7900C050666600027A227C00C09E
S31500013C20505F0C1100266700026C4A11650000E026
S31500013C300C11002562 0000D80C130002620E7010F0
S31500013C40D0B900C05186EA882E0060063E3900C010
S31500013C5051880C11000362164240101148C0D080F1
S31500013C6068000C0516A20403087600000A20C1116
S31500013C700007621842401011594048C0D0800680A2
S31500013C8000C05172204030876 00000840C11001F73
S31500013C90622A7CF842401011DC40300648C0D080D0
S31500013CA068000C05136204030870C11001F665E29
S31500013CB00C130001635812BC002660520C1100203F
S31500013CC0660833C700C0517C60440C1100216608A8
S31500013CD033C700C0517E60360C110022660833C717
S31500013CE000C05180602 80C110023660833C700C04C
S31500013CF05182601A0C110024660833C700C0518432
S31500013D00600C0C110025660633C700C0517A4A13B0
S31500013D10630001820C11002866080C130001622A57
S31500013D20602E0C110026672A52110C130001630440
S31500013D307E1F60027E2542401011B0476F144A1360
S31500013D40630253130C130001630612BC001C6002CC
S31500013D5042114A116500013E0C110025620001362F
S31500013D60287C00C050680254FCFF0254FFFC247CEE
S31500013D7000C0506C0C110003621814BC00014240D3
S31500013D80101102400003E5480254FFF381546 0001C
S31500013D9000CA0C110007621A14BC0002424010113D
S31500013DA059400240 0003E5480254FFF38154600084
S31500013DB000AA0C11001F6236421242401011 5140F6
S31500013DC00240001F720AE368025483FF8154424095
S31500013DD0101151400240000348C0068000C05166E0
S31500013DE020404240101033C000C0506A606C0C1174
S31500013DF00020660614BC000660602C7C00C0506D75
S31500013E000C110021660E14BC0005025483FF1CBC74
S31500013E100001604 60C110022660E14BC0005025416
S31500013E2083FF1CBC000260320C110023660E14BC19
S31500013E3000005025483FF1CBC0003601E0C11002404
S31500013E40660C14BC0005025483FF4216600C0C116B
S31500013E50002566064212005 47C0042B900C0518614
S31500013E600C130002630A33FC001000C050666008A0
S31500013E7033FC020000C05066227C00C04A34600C4C
S31500013E80237C0001412800124 3E900D2B3FC00C0A3
S31500013E904D3665EC33C000A002EE4CDF5CC04E75BA
S31500013EA04E714E714E7133C000A002F04A3900C006
S31500013EB05054661E4A3900C050606616427900C0E9
S31500013EC0506613FC002800C0505F13FC000500C0BB
S31500013ED0506033C000A002F24E754E714E714E71A4
S31500013EE033C000A002F4427900C0506613FC0028DA
S31500013EF000C0505F13EF000500C0506033C000A042
S31500013F0002F6205F548F4ED04E714E714E7133C002
S31500013F1000A002F8027983FF0080402C7003C0796B
S31500013F2000C0507202400003E1480279FCFF0080A4
S31500013F304046817900804046 0279C7FF00804040B3
S31500013F4000792800008040400279F3FF0080404656

S31500013F5033C000A002FA4E754E714E714E7148E79C
S31500013F60031C33C000A002FC7E03CE7900C0507250
S31500013F70267C0080403A300748C0D080068000C0C9
S31500013F80508C204030930C47000266582A7C00C0B2
S31500013F9049E1287C00C0985C3013323900C0518455
S31500013FA0E84990412054B050643852154240101 5EA
S31500013FB020543228000 2E0490241000FB041632437
S31500013FC00839000100C049E066084EB900008E605C
S31500013FD0601230280002E0480240000F52001A80A9
S31500013FE060024215287C00C050747000301332 07FD
S31500013FF048C1E589D1B418004A3900C0984367041D
S315000140007C0A60027C0D7002D0067201E1A92E01C4
S315000140102A7C00C050705295201 5B087654642959E
S3150001402042473 20748C1E58920341800123C00FC9A
S31500014030D206E2A8320748C1D281068100C0508467
S3150001404020413080300748C0E58842B40800524715
S315000140500C4700046DCC13FC000200C098424239A3
S315000140600 0C0984333C000A002FE4CDF38C04E7535
S315000140704E714E714E7148E7010433C000A0030032
S315000140804FEFFFF60C39000200C0984266000084 2B
S315000140902A7C00C0983E303900C05084907900C017
S315000140A05086486F000402800000FFFF4EB90002EF
S315000140B05B0C487900000 86E486F0008486F0008DD
S315000140C04EB9000238AC48574EB9000266227200 5A
S315000140D032002A8166062ABC00008000203C40008E
S315000140E0000022154EB9000274A42E0022074EB913
S315000140F000027B58720FE2A833C000C0509833C04B
S315000141000 00C0509633C000C0509413FC000100C09B
S315000141109842 4FEF000A33C000A003024CDF208013
S315000141204E754E714E714E7133C000A003044A792B
S315000141300 00C05066637A227C00C050684A3900C0CC
S3150001414050546706 08D100076004089100073 3D16F
S315000141500080402C13F900C0506B0080404242406 1
S3150001416010 3900C0506D02400003E1480279FCFF9E
S3150001417000804046817900804046424010 3900C0A7
S315000141800506C02400007720BE3680279C7FF00809A
S31500014190404081790080404002 79F3FF008040462B
S315000141A0207900C04D36217C000141C8000E600A0D
S315000141B0207900C04D3642A8001233C000A0030684
S315000141C04E754E714E714E7133C000A0030853797E
S315000141D000C050667000303900804 03AD1B900C045
S315000141E05186207900C04D3642A8000E33C000A08A
S315000141F0030A4E754E714E714E7148E7033C33C04A
S3150001420000A0030C4FEFFFF40C39002600C0505FED
S315000142106 60000AE7C14267C00000872287C000033
S315000142200876 45EF0008300648C0D080068000C0F9
S3150001423051362040 7E003E107000303900C0517A60
S3150001424 09E80200748574EB900025AEC300648C0F6
S31500014250E5880680000006FC2F00486F00042F0A3F
S315000142604EB9000238964879000008662F0A4EB901
S31500014270000238DA4A406C042A4B60022A4C2F0AA3
S31500014280 2F0D486F000C4EB900023842486F0004EA
S315000142904EB9000265FC3E00100748803E007003DF
S315000142A0C04648C0068000C0516620409F10524655
S315000142B00C4600186D00FF7013FC002700C0505F0C
S315000142C04FEF000C33C000A0030E4CDF3CC04E750F
S315000142D04E714E714E7148E7013C33C000A0031088
S315000142E023FC00C049EE00C04D3661000A762A7CE7
S315000142F00080404002 55FFFC005500012 87C0080EB
S3150001430040460254EFFF0254F3FF0079800000801B
S315000143104 03C0279FF800080403E0079000C00801D
S3150001432040 3E005502000055010002797FFF0080E2
S31500014330403C0255FFEF0255FFF30055000413FC04
S31500014340 00BC0080404213FC00800080404302 54C0
S3150001435 03FFF00544000423900C05054227C000007
S31500014360067C207C00C05136701420D951C8FFFC50
S3150001437 03F3C000A6100FB6A6100F87800550100C4
S315000143800255FBFF4247287C00C05066267C008010
S3150001439040142 47C00C0518660500813000 6670E45
S315000143A013FC00EA0080401508D30006524761005D
S315000143B0FD784A54632C0255FEFF0055040030156 2
S315000143C00800000E66F8535430390080404402401C
S315000143D00FFF72003200D3920255FBFF0055010018
S315000143E060086100F80E6100FE124A3900C0506093
S315000143F063060C47000F6DA242B900C0507033F935
S315000144000 00C0518400C0508433F900C0517E00C001
S315000144105086 33F900C0518000C0508833F900C07E
S31500014420518200C0508A4247300748C0E58806805D
S315000144300 00C05074204042905247 0C4700046DE87A
S31500014440 3F3C00046100FA9A33C000A003124CDF1E
S315000144503C804E754E714E714E7148E7033E33C036
S315000144600 0A00314598F2EB900000 87A423900C002
S315000144704 9E12A7C00C049EE60142B7C00013F5EB5
S3150001448000 0E2B7C00013F0E00124BED00D2BBFC4F
S315000144900 00C04D3665E42C7C00C050A042964246D1
S315000144A02A7C00C04D6A3B7900C0522C02D81B7C85
S315000144B0001702E01B7C000202E23F062F0D61009D
S315000144C0EEEE424745ED006A47ED01141B4702DF58
S315000144D04A476704284A6002284B227C000007B03D
S315000144E0204C702920D951C8FFFC30912956005C17
S315000144F04A4666144A47661043ED02CE207C008088
S315000145004 02620D920D9309152470C4700026DBC74
S31500014510303C00FFC0460257FF00815752464BED23
S3150001452002E40C4600016D00FF7E588F33C000A0E7
S315000145300 3164CDF7CC04E754E714E714E7148E7C5
S3150001454021 3E33C000A0031802797FFF008040445A
S315000145502A7C00804024089500062 67C00804014B1
S31500014560 08D3000733FC000300C0523233FC0001BC
S31500014570 00C05236287C00C05230247C00C0523A1A
S315000145802C7C00C052346000014033FC000100C0A5
S3150001459052386000011842 5434BC0001600000EE3C
S315000145A04A52670A33FC000300C05232600833FCEA
S315000145B00 00200C052320895000 64A5267047E0383
S315000145C0600242077003C007E908021500CF811592
S315000145D07003C03900C05237E508021500F3811592
S315000145E07003C03900C05239021500FC811508D587
S315000145F00006427900C0522E4254607808950007A1
S31500014600425660 1E0813000767185256081300062 3
S315000146100670C13FC00EA0080401508D3000608D396
S3150001462000073016121 5E8090201000374001401 8F
S31500014630D482068200029E3C2042B0506C060815C8
S31500014640000767C0081500076716 23F90080402098
S31500014650000 C04D3A33FC000100C04D405254601475
S31500014660 42B900C04D3A427900C04D404254527998
S31500014670 00C0522E3014B07900C052326C0C0C7945
S3150001468000 0600C0522E6D00FF7453524A526D1639
S3150001469004A526704424760063E3900C0523230141E
S315000146A0B0476C00FEFC527900C052383014B07924
S315000146B000C052326C0C0C79000100C052386F00F8
S315000146C0FED6527900C052363014B07900C052324B
S315000146D06C0C0C79000300C052366F00FEAE7003FD
S315000146E0C0156608021500FC08D500007030C0151B
S315000146F0671C0895000602150 0CF021500F308D5C0
S315000147000 03021500FC08D5000008D5000633FC9D
S315000147100 00100C04D40615A2A7C0080403C005592
S3150001472080000279FDFF008040400279FEFF008093
S315000147304040303C1FFFC07900C0522C0255E000BA
S315000147408155 7E28DE7900C0522C33C7008040267 1
S31500014750 33C7008040 2A33C70080402802557FFFB7
S31500014760 33C000A0031A4CDF7C844E754E714E7126
S315000147704E7148E7210433C000A0031C4FEFFFF43C
S31500014780 4A7900C04D4067000138427900C04D406A
S315000147902A7C00C049EA4A3900C05054672048794A
S315000147A00000 866487900C050504EB9000238DA58
S315000147B04A406F0A2AB900C05050600000A24AB9A7
S315000147C000C04D3A67000092203900C04D3A486F4B
S315000147D00084EB900025B0C123900804024E8093A
S315000147E002010003740014 01E78A068200029E1C7E
S315000147F020422028 00004486F00044EB900025B0CD9
S31500014800487900 00087E486F0008486F00084EB9D5
S31500014810 00023896486F0008486F00042F0D4EB904
S3150001482000 0238AC4879000008822F0D4EB900020B

S3150001483038DA4A406C082ABC4220000060204879D8
S31500014840000008862F0D4EB9000238DA4A406F0E75
S3150001485O2ABC428C000060062ABC425C00003E3C39
S315000148602000 2F0D487900000892486F00104EB9BC
S31500014870000238AC48790000088E486F000C486F7A
S31500014880000C4EB9000238424879000008 8A486F88
S315000148900008486F00084EB9000238AC48574EB9B7
S315000148A000266229E40303C0FFFC047323C0FFF9C
S315000148B0C27900C0522CB041670633C700C0522CE2
S315000148C04FEF000C33C000A0031E4CDF20844E7551
S315000148D04E714E714E7148E7201C33C000A0032073
S315000148E0287C00C04D3E267C00C04D404A3900C0A0
S315000148F0505467364879000086648790 0C0505020
S315000149004EB9000238DA4A406F20487900C049EAB8
S31500014910487900C050504EB9000238DA4A40670A59
S315000149203 6BC0001425460000 0C62A7C0080402447
S31500014930081500 07673A425436BC000123F9008086
S3150001494040200 0C04D3A1015E80802000 00372002D
S315000149501200E789068100029E1C20012F0048797A
S31500014960 00E001A24EB9000183FA08950007607EB6
S31500014970525430141215E80902010003740014019F
S31500014980D482068200029E3C2042B0506F6042B93A
S315000149900 00C04D3A425436BC00010895000610157 8
S315000149A00200000035200020000030215 00FC8115FB
S315000149B07003C0156608021500FC08D500 00021533
S315000149C000CF70031215020100034242140153 4243
S315000149D03202C3FC02E4068100C04D6A2041C028B0
S315000149E002E2E508021500F3811508D5000633C079
S315000149F000A003224CDF38044E754E714E714E7184
S31500014A004E56FFF448E7000C33C000A003242D499D
S31500014A10FFFC302E0008C1FC02E4068000C04D6A8E
S31500014A202A4049ED01BE3F3C00022F0D6100F068AE
S31500014A303F3C00012F0D6100F05E2F2C00042F2C4E
S31500014A40000843EEFFF84EB900024E5A48790000BD
S31500014A500896486EFFF8486EFFF44EB90002389684
S31500014A6043EEFFF4206EFFFC209133C000A0032625
S31500014A704CDF30004E5E205F548F4ED04E714E712A
S31500014A804E714E56FFF848E7001C33C000A00328BC
S31500014A902D49FFFC302E0008C1FC02E4068000C04F
S31500014AA04D6A2A4049ED01BE207900C0985C302844
S31500014AB000020800000F67063F3C000560043F3C0A
S31500014AC000042F0D267C00013A964E933F3C0000D0
S31500014AD02F0D4E933F3C00062F0D4E933F3C000198
S31500014AE02F0D4E93486C0018486C0004486EFFF871
S31500014AF04EB9000238AC43EEFFF8206EFFFC209160
S31500014B0033C000A0032A4CDF38004E5E205F548F6D
S31500014B104ED04E714E714E714E56FFF048E7031C52
S31500014B2033C000A0032C2D49FFFC302E0008C1FC28
S31500014B3002E4068000C04D6A2A4049ED01BE3F3CB1
S31500014B40000032F0D6100EF50267C00C0985C2053B6
S31500014B5030280002080000 0F67063F3C000560048C
S31500014B603F3C00042F0D6100EF2E20533028000238
S31500014B700800000F67047C0560027C04205330287E
S31500014B800000208 00000F67047E0560027E0420070C
S31500014B90E588D08C2F002006E588D08C2F00486E42
S31500014BA0FFF44EB90002389648 6EFFF4486C000CCB
S31500014BB0486EFFF04EB9000238AC2F2EFFF043EEDF
S31500014BC0FFF84EB900024AA4487900000896486EDB
S31500014BD0FFF8486EFFF44EB90002389643EEFFF433
S31500014BE0206EFFFC209133C000A0032E4CDF38C09D
S31500014BF04E5E205F548F4ED04E714E714E714E56A1
S31500014C00FFEC48E7000C33C000A003302D49FFFC40
S31500014C10302E0008C1FC02E4068000C04D6A28401F
S31500014C204BEC01BE3F3C00022F0C6100EE6A3F3C9B
S31500014C3000012F0C6100EE60486D0008486D000808
S31500014C40486EFFF44EB90002389648 6D0004486D6F
S31500014C5000004486EFFF04EB90002389648 6EFFF424
S31500014C60486EFFF0486EFFEC4EB900023842 2F2E17
S31500014C70FFEC43EEFFF84EB9000255D443EEFFF8C0
S31500014C80206EFFFC209133C000A003324CDF3000C0
S31500014C904E5E205F548F4ED04E714E714E714E5600
S31500014CA0FFF048E7000C33C000A003342D49FFFC98
S31500014CB0302E0008C1FC02E4068000C04D6A2A407D
S31500014CC049ED01BE207900C0985C3028000208 0039
S31500014CD0000F67063F3C000560043F3C00042F0DB2
S31500014CE06100EDB43F3C00002F0D6100EDAA3F3C91
S31500014CF000062F0D6100EDA0486C00184EB90002A8
S31500014D0038C24A0067323F2E000843EEFFF46100C5
S31500014D10FEEE486EFFF4486C0018486EFFF04EB97F
S31500014D2000002386A486C0018486EFFF0486EFFF8BA
S31500014D304EB9000238AC60082D7C00000000FFF877
S31500014D4043EEFFF8206EFFFC209133C000A003362E
S31500014D504CDF30004E5E205F548F4ED04E714E7147
S31500014D604E7133C000A00338207C00C051FA3010C8
S31500014D707209E2680240003F0240003FD0400279DA
S31500014D80FF8100804046817900804 0463010E0482E
S31500014D9002400001024000010279FFFE0080404608
S31500014DA0817900804046227C008040483010E848E6
S31500014DB00240000F0240000F720CE36802510FFF20
S31500014DC081513010024 0000F0240000FE1480251AC
S31500014DD0F0FF8151207C00C051FC3010E268024096
S31500014DE0000702400007E9480251FF8F8151301048
S31500014DF0720AE26802400003024 00003E5480251DC
S31500014E00FFF381513010E048024000030240 0003E5
S31500014E100251FFFC815130100240003F0240003F29
S31500014E200279FFC000804060817900804060 33C014
S31500014E3000A0033A4E754E714E714E712F0633C066
S31500014E4000A0033C222F00087C0FCC41E889303CAE
S31500014E500F0C041DC40E889303C0F00C041DC4035
S31500014E60E889303CF000C041DC40300633C000A088
S31500014E70033E2C1F205F588F4ED04E714E714E71DE
S31500014E8048E7030033C000A003403C2F000C303C30
S31500014E90F000C0467E003E00E98F303C0F00C04660
S31500014EA072003200DE81E98F303C00F0C0467200AC
S31500014EB03200DE81E98F700FC04672003200DE815A
S31500014EC0200733C000A003424CDF00C0205F548F8F
S31500014ED04ED04E714E714E712F0733C000A0034460
S31500014EE042417E01302F0008C04767025241DE472A
S31500014EF066F20801000057C04400488033C000A094
S31500014F0003462E1F205F548F4ED04E714E714E7147
S31500014F102F0733C000A0034842417E01202F00081D
S31500014F20C08767025241DE8766F20801000057C05A
S31500014F304400488033C000A0034A2E1F205F588FCB
S31500014F404ED04E714E714E712F0733C000A0034CE7
S31500014F5042417E01202F0008C08767025241DE8749
S31500014F6066F2300133C000A0034E2E1F205F588F1A
S31500014F704ED04E714E7148E73F3E33C000A090
S31500014F8003504FEFFEB2342F017E227C00029F8236
S31500014F9041EF0004704F20D951C8FFFC42974DEFF5
S31500014FA00146283C00C053E4448476FF600006A411
S31500014FB07040D04272003200 23C100C0523C3F0211
S31500014FC03F3C004C487900C053944EB900017442ED
S31500014FD050400C40000862000674D040303B000689
S31500014FE04EFB0002008000300044006C00580012A5
S31500014FF0001C001200802EBC000034D46000064E56
S315000150004A3900C0538463000 63E487900031220E2
S3150001501060000062C4A3900C0538463000 62A487989
S3150001502000031234600006184A3900C05384630035
S31500015030061648790003124460000 6044A3900C086
S31500015040538463000 602487900031253600005F099
S315000150504A3900C05384630005EE4879000312659E
S31500015060600005DC487900C0539448790 0C053E4D8
S31500015070487800504EB9000010B8487900031275FF
S31500015080487900C053E44EB9000259702A404A805B
S315000150906700 05B40C15003F660000964A3900C04A
S315000150A05384630000 8C267C000340666076 20539F
S315000150B010280010B03900C0538462660C2D0068B8
S315000150C000016616487900031279 4EB9000243566B
S315000150D0588F2F0B610006C26048487900 0312C53C
S315000150E04EB900024356588F0C39000300C0538451
S315000150F065182053424010280010 3F0048790003EC
S31500015100012C84EB9000243565C8F20532F28000C5B

S315000151102F104879000312CD4EB9000243564FEFC6
S31500015120000C588BB7FC000340F665826000051839
S3150001513043EF0004207C00C05244704F20D951C86F
S31500015140FFFC7E01267C000340666000037C205341
S315000151502F102F0D4EB9000258444A4066000368CD
S3150001516010390OC053842053B028001065000358 3D
S31500015170420 77A01600003280C07000967080C152D
S3150001518000 2D6606528D1E1D60041E0552050C0774
S315000151900068661 44A3900C05384630C2F0B610002
S315000151A005F87E0A600003200C0700236642247C72
S315000151B000C0539442476006101A4880DE400C1224
S315000151C000236708B5FC00C053E465EC3F3C0000D2
S315000151D0486F014C2F0D700030072F40000A4EB961
S315000151E000025A422217B280677A7E086000028264
S315000151F0205328680008600449EC0010102C0001B7
S31500015200B0076708422F0144420660141039 00C0F6
S3150001521053 84B01454C0440048801F4001441C000C
S315000152204A06662470402053B028001164047C406D
S315000152306008 42461C28001148C6200C205390A83D
S3150001524000 08E880B0866DB04A2F014466067E02EA
S315000152506000021E4A2C000266104A1567067E0986
S3150001526060 00020E42076000020842074A15661AEC
S31500015270487900 0312E142A74EB9000259702A404B
S315000152804A8066067E036000023E102C000253002F
S315000152900C000007620001DA4880D040303B00066E
S315000152A04EFB0002016E00C8010001380082004C6D
S315000152B00010001 0486F014A2F0D4EB9000178D435
S315000152C02F400146202F014AB08D6700012C202F67
S315000152D00146206C0004B09065000194206C000822
S315000152E0B0906200018AB083660001866000018089
S315000152F0486F014A2F0D4EB9000177E82F4001464C
S31500015300202F014AB08D670000F0202F0146206C46
S3150001531000 04B09065000158206C0008B09063004D
S31500015320015060000 14A486F014A2F0D43EF014EBB
S315000153304EB9000258FE202F014AB08D670000BA0F
S315000153402F2C0004486F014A4EB9000238DA4A4050
S315000153506D00011C2F2C0008486F014A4EB900024E
S315000153603 8DA4A406F00010A600001043F3C000040
S31500015370486F014C2F0D4EB900025A422F4001468B
S31500015380202F014AB08D6770202F0146206C000442
S31500015390B090650000DA206C0008B090630000D27E
S315000153A0600000CC3F3C000A486F014C2F0D4EB9FE
S315000153B0000259DC2F400146202F014AB08D673883
S315000153C0202F0146206C0004B0906D0000A2206CD5
S315000153D00008B0906F00009A600000943F3C0010F6
S315000153E0486F014C2F0D4EB900025A422F4001461B
S315000153F0202F014AB08D66047E036074202F01467A
S31500015400206C0004B0906566206C0008B090636063
S3150001541060 5C1C150C06002267060C060027662038
S31500015420421D200DD084068000C053E42F40014662
S315000154305 28D4A1567061015B00666F442156004CA
S315000154402F4D0146204F2F2801464EB900026648CE
S315000154502C0010064880 48C0206C0004B090650EF0
S3150001546010064880 48C0206C0008B09063027E0791
S31500015470200C205390A80008E880E588068000C02B
S31500015480528420402 0AF0146200C205390A80008EA
S31500015490E880068000C05244204010AF01440C074A
S315000154A0000A67220C0700096700FCCE4A07661648
S315000154B04879000312DD42A74EB9000259702A400D
S315000154C04A806600FCB4588B0C070001660AB7FCDB
S315000154D0000340F66500FC780C07000A67000168C6
S315000154E04A07660000E020632EA800042053 28 68BE
S315000154F000082A7C00C05284247C00C0524460000B
S315000155000009A4A126600008C4A2C00026700008449
S31500015510102C00020C000002671E0C00000367320B
S3150001552 00C00000467120C00000567400C00000621
S31500015530656 00C000008625A2015206C0004B090CA
S3150001554065 08206C0008B0906348206C00042A901E
S315000155506040 2015206C0004B0906D08206C000896
S31500015560B0906F2E206C00042A9060262F2C000428
S315000155702F0D4EB9000238DA4A406D102F2C000863
S315000155802F0D4EB9000238DA4A406F06206C00042E
S315000155902A9049EC0010588D528A70402053B02849
S315000155A0001164047E40600842471E28001148C766
S315000155B0200C205390A80008E880B0876D00FF44B6
S315000155C06000008A4A3900C05384677A4240100756
S315000155D0534048C0E588068000029F5A20402F109C
S315000155E04879000312E44EB9000243565 08F0C0766
S315000155F0000167441E2C00010C0700206C0C1007EB
S315000156004880064000303F006006100748803F0092
S3150001561 00C0700205DC04400488048C0E58806802C
S3150001562000029F7A20402F104879000312EF4EB9ED
S315000156300002435 64FEF000A4879000313014EB9A1
S315000156400002435 6588F2EBC000156744EB9000114
S31500015650A17E4A976700F95A20174FEF014E33C0D2
S3150001566000A003524CDF7CFC205F548F4ED04E715C
S31500015670 4E714E7133C000A00354424033C000A0A6
S31500015680035 64E754E714E714E7148E7013E33C059
S31500015690 00A003582C7C00C053874216423900C033
S315000156A053852A7C00C049E2287C00C0538A267CA7
S315000156B000C05384247C00C0528C207900C0985CC1
S315000156C00828000100036714487900029ED848792A
S315000156D0000313044EB90002435 6508F23FC000009
S315000156E00F0000C0523C0C13000567060C130006A0
S315000156F0660A207900C098742F1060144A13660850
S31500015700 4879000 3130B6008207900C098702F10A8
S315000157104EB900024356588F42163F3CEA6061007B
S31500015720F8582040 4E903E000C47FFFE66141ABC06
S315000157300000118BC00012F124EB900019CBA421497
S31500015740 42150C47FFFB66141ABC000318BC000186
S3150001575 02F124EB900019CBA421460160C47FFFD88
S31500015760 66161ABC00012F3900C052884EB90001D5
S315000157709B3E42156000FF700C47FFFF6600FF6805
S3150001578042136000FF5833C000A0035A4CDF7C80EF
S31500015790 4E754E714E714E7148E73F3C33C000A0C5
S315000157A0035C286F002C4242487900 03130C267CC7
S315000157B0000243564E93588F247C00C053840C122A
S315000157C000036514205442401028001 03F00487918
S315000157D00003130F4E935C8F20542F28000C2F10BB
S315000157E04879000313144E934FEF000C20542A6896
S315000157F00008600001621012B015650001564A15D5
S3150001580062080C000004630001 4A4A426626487990
S315000158100003132 44E93588F0C120003650A48792E
S315000158200003132 74E93588F48790003132C4E9388
S31500015830588F740148790003134F4E93588F0C12F9
S3150001584000036510424010153F00487900031352CA
S31500015850 4E935C8F1A2D00017000102D0002E58811
S31500015860068000029F3620402F100C0500206C0C8C
S3150001587010054880064000303F00600610054880 4C
S315000158803F000C0500205DC04400488048C0E58803
S31500015890068000029F7A20402F1048790003135694
S315000158A04E934FEF000E42472F2D000C4EB90002CA
S315000158B0564826006000009 64A476F204879000333
S315000158C0136D48790003136 34E93508F0C12000336
S315000158D0650A48790003136F4E93588F7827300372
S315000158E090470C4000286F347C28206D000C30074F
S315000158F0D04648C0D1C01A100C0500306D0C0C05FD
S3150001590000396F100C0500416C0A0C4600275C0C1F
S31500015910380660085 3460C46001D6ECE206D000CFD
S315000159204870700048790003137 44E93508F0C44ED
S31500015930002766060647002860120C05002066044B
S3150001594 07C01600242463004D046DE40BE436D0013
S3150001595 0FF684BED001070402054B028001164041C
S31500015960 7E40600842471E28001148C7200D20547A
S31500015970 90A80008E880B0876D00FE7C33C000A0C7
S315000159800035E4CDF3CFC205F588F4ED04E714E714A
S31500015990 4E7148E7030033C000A00360204F2F2853
S315000159A0000C4EB900024356588F2C3900C0523CA8
S315000159B09CAF001060064EB90001A17E2F3900028E
S315000159C0838 84EB9000037103E000C47FFFF660A78
S315000159D0203900C0523CB08662DC300733C000A0DB
S315000159E003624CDF00C0205F508F4ED04E714E7166

```
S315000159F04E7148E7010433C000A003644FEFFFEC8A
S31500015A004A3900C0524467182F3900C05284486F82
S31500015A100004487800144EB9000010B86000012453
S31500015A204A3900C0524767460CB90F0C3F0000C007
S31500015A3000FA640A4879000313FE600000C0487941
S31500015A4000C052903F3C00013F3C00224EB900008D
S31500015A5071EA4A40670A48790003140F6000009E04
S31500015A6023F900C0529000C0983A600000D62A7C03
S31500015A7000C053844A3900C052446700008A4A393B
S31500015A8000C0524567702F3900C052882F3900C0B7
S31500015A9052844EB9000258444A4066520CB90F0C62
S31500015AA03F0000C000FA6408487900031420603002
S31500015AB04A3900C0524667083E3900C0528E60041A
S31500015AC042471E1548573F3C00057023D0473F000B
S31500015AD04EB9000071EA4A40670E48790003143155
S31500015AE04EB900024356588F6100008460544879CC
S31500015AF00003144260064879000314584EB90002A4
S31500015B004356588F603C0C150003653661607E0173
S31500015B1060263007534048C0E588068000C0987863
S31500015B2020402F103F074879000314724EB9000236
S31500015B3043564FEF000A5247424010155340BE40AC
S31500015B406FD042404FEF001433C000A003664CDF14
S31500015B5020804E754E714E714E7133C000A00368A0
S31500015B6033C000A0036A4E754E714E714E7148E7FF
S31500015B70010433C000A0036C598F42474BD77024F0
S31500015B80D0473F00224D4EB90000738E4A956714E7
S31500015B907010D095320748C1E589068100C0987812
S31500015BA020412080524 70C4700056DD2588F33C0E3
S31500015BB000A0036E4CDF20804E754E714E714E7102
S31500015BC033C000A0037033C000A003724E754E713E
S31500015BD04E714E7133C000A00374518F3F3C0003D8
S31500015BE043EF00024EB9000073C641D72F2B0004C7
S31500015BF02F390002874E4879000314BB4EB90002C3
S31500015C0043564FEF000C3F3C000343EF00024EB9F1
S31500015C10000073C641D72F103F3C00634EB9000008
S31500015C200E1E4240508F33C000A003764E754E7152
S31500015C304E714E712F0D33C000A003782A6F0008F4
S31500015C402F390002A13E48790003150 12F0D4EB9E7
S31500015C5000024 38C2F3900027D7A48790003150A28
S31500015C60486D00204EB90002438C4FEF001833C037
S31500015C7000A0037A2A5F205F5C8F4ED04E714E7171
S31500015C804E712F0633C000A0037C7C08083900033F
S31500015C9000C00012660472006004220653812 06F60
S31500015CA0000820812 00633C000A0037E2C1F205F40
S31500015CB05C8F4ED04E714E714E7133C000A0038081
S31500015CC033C000A00382205F588F4ED04E714E71B3
S31500015CD04E7148E7013E33C000A003844FEFFFD861
S31500015CE02A6F00443E2F004A3F3C00004EB9000097
S31500015CF07B5A2C4047EF0024247C0002438C0C473E
S31500015D0000016C524A47660004F63F3C000448799C
S31500015D1000C04D6A4EB900013A96025300FF08D3FE
S31500015D2000022F390002A1424879000315132F0DF5
S31500015D304E924FEF000C3F3C00002F3900C04F3808
S31500015D402F13486D00084EB90001621A1B7C0056DC
S31500015D50000F600004AA534766263F3C000043EF4C
S31500015D60001E4EB900014B18204F2F28001C2F3959
S31500015D700002A14A48790003151A2F0D600002C0DE
S31500015D800C470001662A2F390002A14E4879000030B
S31500015D9015282F0D4E922F3900C049EA4879000384
S31500015DA0152B486D00204E924FEF001860000450ED
S31500015DB00C4700036C0000822F390002A15248797A
S31500015DC0000315352F0D4E924FEF000C025300FFC5
S31500015DD008D300003F3C00002F3C3F8000002F13FA
S31500015DE0486D00084EB90001621A025300FF08D33C
S31500015DF000023F3C00002F3C3F8000002F13486DFE
S31500015E0000204EB90001621A025300FF3F3C000018
S31500015E102F3C3F8000002F13486D00284EB900012A
S31500015E20621A1B7C0057000F1B7C005600271B7C47
S31500015E300041002F600003C83F3C000470FDD047BD
S31500015E403F0043EF00244EB900024F48303C00FFAB
S31500015E50C06F00220253FF00815330130240 00FF3E
S31500015E603200C2FC02E4068100C04D6A284108AF37
S31500015E7000020026302F00200C4000036200038040
S31500015E80D040303B00064EFB0002000801BE02680E
S31500015E9002DA025300FF287C00C0497C3013E04837
S31500015EA0024000FF72003200E58920010836000237
S31500015EB00801670000B63013024000FF52403F0060
S31500015EC0487900031 53C2F0D4E923F3C00012F13DC
S31500015ED043EF00284EB9000069CE3013E048024076
S31500015EE000FF72003200D2810681000006D02041F7
S31500015EF03F10204F2F2800282F28002443EF00248D
S31500015F004EB9000186C4307C00AAD1D43013E048D2
S31500015F10024000FF3200C2FC002CD1C148680016C5
S31500015F20486F00164EB9000236DE486F0012486F00
S31500015F30001E486F00124EB9000236A0204F2F28CE
S31500015F40000E2F28000A307C00AAD1D43013E04875
S31500015F50024000FF3200C2FC002CD1C14868002378
S31500015F60486D00064E924FEF001A025300FF08D308
S31500015F7000003013E048024000FF72003200E5895C
S31500015F8020010B36000208016700027430130240 3E
S31500015F9000FF52403F00487900031544486D002038
S31500015FA04E924FEF000A3F3C00012F1343EF001EB4
S31500015FB04EB9000069CE3013E048024000FF72007E
S31500015FC03200D2810681000006D020413F10204FC9
S31500015FD02F28001E2F28001A43EF001A4EB9000180
S31500015FE086C4307C00AAD1D43013E048024000FFB9
S31500015FF03200C2FC002CD1C148680016486F000C63
S3150001600004EB9000236DE486F0008486F0014486F2B
S31500016010000084EB9000236A0204F2F2800042F1089
S31500016020307C00AAD1D43013E048024000FF320090
S315000160 30C2FC002CD1C148680023486D00264E924F
S31500016040 4FEF0010600001B83F3C00002F0C4EB925
S315000160500 0013A963F3C00012F0C4EB900013A96D9
S3150001606 03F3C00022F0C4EB900013A964240102CDB
S31500016070 02B63F003013024000FF52403F0048790C
S3150001608 0003154C2F0D4E924FEF000C025300FFEB
S3150001609 03F3C00002F2C01BE2F13486D00084EB95E
S315000160A 00001621A025300FF08D300003F3C0000C2
S315000160B 02F2C01C22F13486D00204EB90001621A20
S315000160C 0025300FF08D300013F3C00002F2C01C6FC
S315000160D 02F13486D00284EB90001621A1B7C00413E
S315000160E 0000F1B7C005700271B7C0052002F60000D
S315000160F 0010E3013024000FF52403F004879000371
S3150001610 015572F0D4E92025300FF00530600301310
S3150001611 0024000FF3F0043EF00284EB900014A004C
S3150001612 03013024000FF3F0043EF00244EB9000147
S3150001613 04A82204F2F2800223F3C00DF204F2F2884
S3150001614 0002C48790003156 2486D00204E924FEFEE
S3150001615 0001C3F3C00012F2C01D62F13486D000770
S3150001616 060000096301302 4000FF52403F0048791C
S3150001617 000031573 2F0D4E92025300FF00530600C4
S3150001618 03013024000FF3F0043EF00284EB90001E3
S3150001619 04BFE3F3C0001204F2F2800282F13486D4E
S315000161A 000064EB90001621A1B7C0066000F30130F
S315000161B 0024000FF3F0043EF00284EB900014C9E0C
S315000161C 048790002A166486F002A486F002A4EB935
S315000161D 00002389620 4F2F2800224879000315 7CAB
S315000161E 0486D00204E924FEF00163F3C00012F2CC8
S315000161F 001D62F13486D00264EB90001621A4FEFE2
S3150001620 0002833C000A003864CDF7C80205F4FEF5F
S3150001621 0000A4ED04E714E714E7148E7273E33C08B
S3150001622 000A00388518F246F00303C2F003C701072
S3150001623 0D0B900C0497C322F0034E049024100FF49
S3150001624 03401C4FC0016D08226402C7C0002435641
S3150001625 00C4600036C00042049EF00042F0B486F25
S3150001626 0003C486F00084EB900023896204F2F10A7
S3150001627 0224C4EB9000262A448790002A16A486F15
S3150001628 0003C4EB9000238DA4A406C047A2D6002AD
S3150001629 07A2048790002A16E2F0C4EB9000238DA35
S315000162A 04A406C242A7C0003158A48790002A172AF
S315000162B 02F0C4EB9000235F42F0C4EB9000238C22C
S315000162C 04A006644600001B448790002A1762F0CA9
```

S315000162D04EB9000238DA4A406C082A7C000315924E
S315000162E0601848790002A17A2F0C4EB9000238DAFB
S315000162F04A406C1A2A7C0003159A48790002A17259
S315000163002F0C4EB9000235F47E70600002E2487926
S3150001631000002A17E2F0C4EB9000238DA4A406C0801
S315000163202A7C000315A2603248790002A1822F0C53
S315000163304EB9000238DA4A406C082A7C000315AAD5
S3150001634060184879000 2A1862F0C4EB9000238DA8E
S315000163504A406C1A2A7C000315B248790002A18AC8
S315000163602F0C4EB9000235F47E6E60000282487928
S3150001637000002A18E2F0C4EB9000238DA4A406C0891
S315000163802A7C000315BA603248790002A1922F0CCB
S315000163904EB9000238DA4A406C082A7C000315C25D
S315000163A0601848790002A1962F0C4EB9000238DA1E
S315000163B04A406C1A2A7C000315CA48790002A19A40
S315000163C02F0C4EB9000235F47E7560000222487921
S315000163D000002A19E2F0C4EB9000238DA4A406C0821
S315000163E02A7C000315D2603248790002A1A22F0C43
S315000163F04EB9000238DA4A406C082A7C000315DAE5
S315000164000601848790002A1A62F0C4EB9000238DAAD
S315000164104A406C1A2A7C000315E248790002A1AAB7
S315000164202F0C4EB9000235F47E6D600001C2487929
S3150001643000002A1AE2F0C4EB9000238DA4A406C08B0
S315000164402A7C000315EA603248790002A1B22F0CBA
S315000164504EB9000238DA4A406C082A7C000315F26C
S315000164606018487900002A1B62F0C4EB9000238DA3D
S315000164704A406C0C2A7C000315FA7E206000017OEC
S315000164804879000 2A1BA2F0C4EB9000238DA4A4007
S315000164906C082A7C0003160260324879000 2A1BE0C
S315000164A02F0C4EB9000238DA4A406C082A7C0003E8
S315000164B0160A601848790002A1C22F0C4EB90002D3
S315000164C038DA4A406C1A2A7C00031612487900020F
S315000164D0A1C62F0C4EB9000235F47E6B6000011087
S315000164E048790002A1CA2F0C4EB9000238DA4A4097
S315000164F06C082A7C0003161A603248790002A1CE84
S315000165002F0C4EB9000238DA4A406C082A7C000387
S31500016510162260184879000 2A1D22F0C4EB900024A
S315000165203 8DA4A406C1A2A7C0003162A4879000296
S3150001653 0A1D62F0C4EB9000235F47E4D600000B095
S315000165404879000 2A1DA2F0C4EB9000238DA4A4026
S315000165506C082A7C000316326032487900 02A1DEFB
S315000165602F0C4EB9000238DA4A406C082A7C000327
S31500016570163A601848790002A1E22F0C4EB90002C2
S3150001658038DA4A406C182A7C0003164248790002 20
S3150001659 0A1E62F0C4EB9000235F47E4760504879CA
S315000165A000002A1EA2F0C4EB9000238DA4A406C0803
S315000165B02A7C0003164A601848790002A1EE2F0CC6
S315000165C04EB9000238DA4A406C162A7C000316528C
S315000165D048790002A1F22F0C4EB9000235F4600C85
S315000165E02A7C0003165A28BC4479F99A7E54200A5B
S315000165F066402F143F052F0D4E96100748803F0029
S31500016600487900031662 4E964FEF00100C460001C2
S31500016610660C486B000448790003166560760C46E3
S315000166200000 2660000A2486B000448790003166860
S31500016630 60622F143F052F0D2F0A4EB90002438CBD
S315000166404FEF000E154700060C460001660C486B1D
S3150001665000044879000 3166F60100C4600026610AC
S31500016660486B000448790003 1672486A0007604CBB
S3150001667 0422A00076050200A6620487900031679ED
S315000166804E96588F0C460004663C486B00044879C8
S3150001669 0000316814E96508F602C487900031684AC
S315000166A02F0A4EB90002438C508F0C460004661621
S315000166B0486B000448790003168C2F0A4EB9000274
S315000166C0438C4FEF000C508F33C000A0038A4CDF80
S315000166D07CE4205F4FEF000E4ED04E714E714E712D
S315000166E04 8E7073E33C000A0038C4FEFFFF445D7C0
S315000166F024B90002A3044A3900C0524467560CB9B2
S31500016700000000000100C05284634A3E3900C052862F
S3150001671053474A3900C0524A67163F3900C0529E54
S315000167203F3C00003F3C00003F074EB900023510D8
S315000167304A3900C0524B670003F83F3900C052A2E4
S315000167403F3C00013F3C00003F074EB900023510B7
S315000167506000 3DE2A7C000243564A3900C05245D6
S315000167606700008C08AF000200024247606 40C47D4
S3150001677000016416025200FF00520C00303C00FF7B
S31500016780C0470252FF0081526018025200FF0052B8
S31500016790 0D00303CFFFFD047024000FF0252FF00D0
S315000167A081523F3C00012F1243EF000A4EB900000F
S315000167B069CE204F2F280008204F2F2800083007C8
S315000167C052403F00487900031 81D4E954FEF000EC9
S315000167D05247207900C0985C102800040200003F4F
S315000167E042411200BE4164060C4700026580267CC8
S315000167F000C0543C4A3900C05247670616B900C06A
S31500016800 52934A3900C0524867000 0B80C13000180
S31500016810660000944240103900C0543A3F0048795E
S3150001682000031839 4E955C8F4A3900C0543E676E95
S31500016830487900031855 4E9548790003186 74E9517
S315000168405 08F287C00C0544E0814000067084879 10
S315000168500003187660 16082C000000001670 84879C5
S3150001686000031886600648790003188A4E95487910
S315000168700003188F4E95508F08140001670 8487958
S315000168800003189E6038082C00010001670848794A
S31500016890000318AE602848790003 18B260204879D1
S315000168A0000318B760184A136608487900031 8C927
S315000168B0600C0C130002660A487900031 8E34E9532
S315000168C0588F287C00C054480C130001674C4A3984
S315000168D000C0524666304A3900C0524966284A39D4
S315000168E000C0524C66204A3900C0524D66184A39DA
S315000168F000C0524E66104A3900C0524A66084A39EB
S3150001690000C0524B67140C140012660E487900033E
S31500016910019024E95588F600002184A3900C0524636
S31500016920670A13F900C0528F00C0543A7EFF267CD5
S3150001693000C0544C2C7C00C054364A3900C0524920
S315000169406718 18BC000C42531CBC000C33FC000336
S3150001695000C0543423C700C054444A3900C0524AC7
S3150001696067123F3900C0529E3F3C00003F3C000089
S315000169706100040C4A3900C0524B67123F3900C00E
S31500016980 52A23F3C00013F3C0000610003F24A393C
S3150001699000C0524C671818BC000E42531CBC000EB6
S315000169A033FC000300C0543423C700C054444A39A1
S315000169B000C0524D671C4A3900C0543E660A13FC9A
S315000169C0000100C0543F600A487900031 9214E9521
S315000169D0588F4A3900C0524E671E18BC000F4253E9
S315000169E01C BC000F33FC000300C0543423C700C095
S315000169F05444423900C0543E4A3900C0524F6706DA
S31500016A00183C001142534A3900C05250671818BCCD
S31500016A1000008425 31CBC000833FC000300C0543478
S31500016A2023C700C054444A3900C0525167000102CD
S31500016A304879000 3193C4E95588F08AF00020002B1
S31500016A4042 47287C00E000FA600000C80C470001BC
S31500016A50641 6025200FF00520C00303C00FFC04792
S31500016A600252FF0081526018025200FF00520D00CF
S31500016A70303CFFFFD047024000FF0252FF00815227
S31500016A803F3C00012F1243EF000A4EB9000069CEC8
S31500016A90204F2F280008204F2F2800083007 52408A
S31500016AA03F0048790003 19724E957A003A077C0037
S31500016AB03C073012E048024000FF3200C2FC00A849
S31500016AC0D28C2006D080D086E588D28020412F281E
S31500016AD000043012E048024000FF3200C2FC00A868
S31500016AE0D28C2005D080D085E588D28020412F1018
S31500016AF048790003198C4E95E58E068600E001D68D
S31500016B0020462F1048790003199A4E954FEF00221F
S31500016B105247207900C0985C102800040200003F0B
S31500016B2042411200BE4164080C4700026500FF1E87
S31500016B3042404FEF000C33C000A0038E4CDF7CE0D7
S31500016B404E754E714E714E7148E7033E33C000A03B
S31500016B5003902A7C00C05434287C00C05444267C0F
S31500016B6000C054367EFF247C00C0543E2C7C00C0FD
S31500016B70543F4A16675A0C130012651813FC000E8F
S31500016B8000C05448427900C0544C16BC000E3ABCB1
S31500016B90000328870C55000352C0440048803C007E
S31500016BA053554A466716421613FC001000C0544856

S31500016BB0427900C0544C2887421260140C9400009C
S31500016BC0000E660C421616BC0012288714BC000182
S31500016BD00C13000F620001822014B087661C0C554D
S31500016BE0000352C0440048803E0053554A4767009F
S31500016BF0016816BC0012600001600C39000300C078
S31500016C00543B660001542C7C000243560C13000EC3
S31500016C10661A720EB081660A4879000319A06000EF
S31500016C2000F24879000319B0600000E80C13000C6B
S31500016C3066143F3900C054464879000319C24E967E
S31500016C405C8F600000D20C13000F660642126000D2
S31500016C5000C60C130008664A4879000319E54E96EA
S31500016C60588F421216BC0012288742476012700E4
S31500016C703007E588068000E001D620404290524761
S31500016C80207900C0985C1028000040200003F4241B0
S31500016C901200BE41640000BC0C470002640000B44F
S31500016CA060CC0C130004650000AA0C1300076200F7
S31500016CB000A22A7C00C0544E72001213B081665E97
S31500016CC07205B081660808AD00000001600C72040F
S31500016CD0B081660C08ED00000000108950000602CEB
S31500016CE00C130007660E7207B081660808AD000135
S31500016CF0000160140C13000666120C9400000006D5
S31500016D00660A08ED000100010895000148790003B3
S31500016D101A014E96588F16BC00122887603448799E
S31500016D2000031A1C4E96588F16BC00122887700550
S31500016D30BE8067067004BE80660408D500000C9408
S31500016D400000000767080C9400000006660408D5D9
S31500016D500001423900C0543B33C000A003924CDF0E
S31500016D607CC04E754E714E714E7133C000A00394B6
S31500016D7033C000A003964E754E714E714E712F0DA4
S31500016D8033C000A003982A7C00C05448207C00C070
S31500016D90544C227C00C05436302F000A4A40670802
S31500016DA00C4000016722604E0C6F0001000C660C5E
S31500016DB01ABC0004425012BC0004602A1ABC000529
S31500016DC0425012BC0005601E0C6F0001000C660CDF
S31500016DD01ABC0006425012BC0006600A1ABC000723
S31500016DE0425012BC000733FC000300C0543470FF4C
S31500016DF023C000C0544433C000A0039A2A5F205F19
S31500016E005C8F4ED04E714E714E7133C000A0039C03
S31500016E1033C000A0039E4E754E714E714E7133C044
S31500016E2000A003A0518F3F3C000443EF00024EB97E
S31500016E30000073C641D72F2800042F39000287525C
S31500016E40487900031A534EB9000243564FEF000C1E
S31500016E503F3C000443EF00024EB9000073C641D720
S31500016E602F103F3C00634EB900000E1E4240508F6A
S31500016E7033C000A003A24E754E714E714E7133C0E0
S31500016E8000A003A413FC001000C0544813FC001119
S31500016E9000C0544913FC000800C0544A33FC0002E8
S31500016EA000C0544C33C000A003A64E754E714E71FE
S31500016EB04E7133C000A003A813FC001200C0544851
S31500016EC0427900C0544C423900C0543B227C00C078
S31500016ED0543C207900C0985C30280002E648024004
S31500016EE0000312800C0000026608423900C0543EBD
S31500016EF0600E0C000001660813FC000100C0543F3F
S31500016F0070FF23C000C05444423900C0543A13FCF8
S31500016F10001200C0543833FC030000C0544E33C085
S31500016F2000A003AA4E754E714E714E7148E72F3E71
S31500016F3033C000A003AC518F0C39000100C0543C92
S31500016F40660001EA2A7C00C0543D287C00C0545AE0
S31500016F50247C00C0543B2C7C00C0985C0C120003BE
S31500016F60660001380C39000100C054396400012063
S31500016F700C39000100C0543E66000114267C00C095
S31500016F80545C2E3C07FFFFFF201390B900C05460EC
S31500016F90CE8023D300C054600C870000003846308AD
S31500016FA038BC0003600000F24A546704535442128D
S31500016FB04A54660000E64297201372001215E589CD
S31500016FC0068100E001D620419090028007FFFFFF75
S31500016FD02F40000420560828000700036606E288B1
S31500016FE02F4000040815000067067E0C2C0760047C
S31500016FF07E0D2C07485742401015E2403200C3FC73
S31500017000000A8068100E000FA2006D080D087E58836
S31500017010D28020012F004EB9000183FA0815000025
S3150001702067067C0C280660047C0D280608150000FE
S3150001703067067E0C2A0760047E0D2A07424010155A
S31500017040E2403200C3FC00A8068100E000FA2005F8
S31500017050D080D087E588D280224142401015E24097
S315000170603200C3FC00A8068100E000522004D08053
S31500017070D086E588D280204120D920917000101554
S31500017080E588068000E001D620402093600A23F9B6
S3150001709000C0544000C0544442124A126600008E99
S315000170A0267C00C054480C130012654E0C390001B1
S315000170B000C0543E66764A546638703F2056C02852
S315000170C00004672E424010155240122800040201A6
S315000170D0003F4242140148C081C248401A807200F2
S315000170E01200E589068100E001D6204123D000C0C7
S315000170F0546013D500C05438603213D300C05438DD
S315000171002A7C00C0544C4A55671E535516B900C017
S31500017110544913F900C0544A00C0544913F900C038
S31500017120544B00C0544A600416BC0012508F33C041
S3150001713000A003AE4CDF7CF44E754E714E714E715C
S3150001714048E7213E33C000A003B042072A7C0080F5
S315000171500400E0C39000100C0543C660001F8287C41
S3150001716000C05452267C00C05440247C00C0543BCD
S3150001717004A1266700255FEFF0255FDFF2C7C00C0C7
S3150001718054380C160012645C0C160010660A38BCE2
S315000171900010014BC0004600E0C160011660E38BC0A
S315000171A0000A14BC00051CBC0012603842401016CF
S315000171B04241123900C0543AEB49D04148C02680B9
S315000171C02F00610002344A40670608EB0004000301
S315000171D038BC000914BC000113D600C054391CBCCC
S315000171E000127E012C7C0002A31A0C1200016672A9
S315000171F0301508000008660A4A0766060C54003C6A
S3150001720063580255FEFF303CFFFFD0540240003F59
S3150001721038800C40003E670001CE0C40003D661AE6
S31500017220014BC000242937200123900C05439424024
S31500017230103618003880600001AE2013123900C0E4
S3150001724005453E2A802400001024000017209E368BA
S315000172500255FDFF81556000018E00550100600059
S31500017260001860C120002660000A030150800000815
S315000172706700008E0255FEFF2013D0802680301550
S3150001728002400001720032008393303CFFFFD0546C
S315000172900240003F38806600014E2013123C00FC7C
S315000172A07400143900C05439D2362800E2A82E00E1
S315000172B02F13610001444A40673A4240103900C029
S315000172C0543ABE40662E103C00FB7200123900C0D3
S315000172D05439D0361800721FE1A94681C39323D3CE
S315000172E000C0545C14BC000313FC000100C0543EF2
S315000172F0600000F423D300C0546470FF2680604E02
S3150001730000550100600000E00C120003660C0255F6
S31500017310FEFF0255FDFF600000CE0C12000466144C
S31500017320005501000055020053540C54010063003E
S3150001733000B6601A0C120005660000AC0255FEFF8D
S315000173400255FDFF53540C54000A6300009A421281
S31500017350600000944A3900C0543C6600008A4240ED
S31500017360103900C000FEC07900C054586678287CE8
S3150001737000C0545430150240000112144881B04136
S3150001738067263015024000011880661C487900E026
S3150001739000E24EB9000183D2227C00E000E2207CAB
S315000173A000E0018A20D92091287C00C0545530156F
S315000173B0E2480240000112144881B04167283015A5
S315000173C0E248024000011880661C487900E000EEA0
S315000173D04EB9000183D2227C00E000EE207C00E061
S315000173E0019620D9209133C000A003B24CDF7C84E2
S315000173F04E754E714E714E712F0733C000A003B406
S315000174002E2F0008202F00087210E2A8B18720074E
S31500017410E088B1872007E888B1872007E488B1872B
S315000174202007E288B187028700000001300733C0D8
S3150001743000A003B62E1F205F588F4ED04E714E719D
S315000174404E7148E7071C33C000A003B8267C00C074
S31500017450523C2A6F001C2A137000302F00229A809A
S31500017460284D4247600000AE2F39000283884EB98D
S31500017470000037103C000C40FFFE67320C40FFFA5B
S3150001748067300C40FFFC672E0C40FFF9672C0C405F

```
S315000174900000D672A0C40000A67240C400008672685
S315000174A00C40007E672A0C40FFFF672A604670FE8B
S315000174B0606C70FA606870FC606470F960601AC68E
S315000174C04215424060584A47674A538D53476044C4
S315000174D02A4C4247603E4A856D0E0C9300000040DF
S315000174E06D062013B0856C0470FD60324EB9000143
S315000174F0A17E60200C46000466084A47660470FFB8
S31500017500601C0C46001066084A47660470F8600E57
S3150001751052471AC6BE6F00206500FF4E70FB33C08E
S315000175200A003BA4CDF38E0205F508F4ED04E7179
S315000175304E714E7133C000A003BC33C000A003BE20
S315000175404E754E714E714E712F0733C000A003C0A8
S31500017550 2E3900C0523C7000302F00089E80600614
S31500017560 4EB90001A17E203900C0523CB0876EF0B1
S315000175703 3C000A003C22E1F205F548F4ED04E7120
S315000175804E714E7133C000A003C4227C00C0523C30
S315000175904A916714539167104A7900C07B50660877
S315000175A033FC000100C07B5033C000A003C64E75FA
S315000175B04E714E714E7133C000A003C833C000A096
S315000175C003CA4E754E714E714E7148E7203E33C067
S315000175D000A003CC518F4A3900C05244671C23F9DD
S315000175E000C0528400C097DC203900C097DC52806D
S315000175F023C000C097E0600001DA2A7C00C0058044
S31500017600267C00024356247C00C001062C7C000027
S31500017610 0E1E4A3900C05246675C2015B0B90003F8
S31500017620 4190660A487900031AF2600001A248797E
S315000176300 00031AFF4E9320554B6800062F10207943
S3150001764000 3A00202F104EB90000806444802F00BC
S31500017650 4EB9000080302F002F12487900031B46D7
S315000176604E934FEF00202F39003A00243F3C006330
S315000176704E966000015E4A3900C0524567482F792F
S315000176800 0C047AC0004487900031B6D4E932F39A7
S315000176900 03E4000204F2F28000C4879003E000094
S31500017 6A02F39003A00204879003A00002F3900C0EE
S315000176B005842F152F12487900031BA94E934FEF0E
S315000176C000286000010E487900031BD34E93205514
S315000176D02F28000E2052302800006024000FF3F00EE
S315000176E030280006E048024000FF3F002F3900C065
S315000176F097DC2F3900C097FC3F3C00014879000315
S315000177001C344E9320552F2800163F3C00444E96BC
S315000177104879000031C524E9320552028000163 22822
S3150001772000 1448C1243C000151802F40001E200254
S31500017730 4EB900027B58D0AF001E2F003F3C0044DB
S31500017740 4E96487900031C544E934FEF00223F3C5E
S3150001775000004EB9000077C048C0E588068000C029
S315000177601 40420402A502F0D4EB9000089FA4A40D0
S315000177706 7122F2D00083F3C00444E9648790003BE
S31500017780 1C566006487900031C584E93588F287979
S31500017790 00C01400200C673020542F2800083F3CFD
S315000177A000444E962054202800089 0AD0008223C43
S315000177B000 0151804EB9000274A42F0048790003DC
S315000177C01C644E93508F600A487900031C6A4E93DD
S315000177D0588F4240508F33C000A003CE4CDF7C044B
S315000177E04E754E714E714E7148E7001C33C000A0B4
S315000177F003D04FEFFFEC266F00242A6F0028227C6E
S3150001780000 02A36C41D7700220D951C8FFFC309108
S31500017810 3F3C000A2F0D2F0B4EB900025A423F4042
S315000178200 00E2015B08B6338528028403F3C000A79
S3150001783 02F0D2F0C4EB900025A423F400010201561
S31500017840B08C631C528028403F3C000A2F0D2F0C40
S31500017850 4EB900025A423F4000122015B08C660212
S3150001786002A8B103900E000084A00670E0C0000015F
S31500017870 67160C000002672460341F6F000F0006B4
S3150001788 01F6F00110005600C1F6F000F00051F6FB1
S3150001789 0001100063F6F0012000860123F6F000ED4
S315000178A000081F6F001100051F6F0013000 64857DF
S315000178B04EB90001A048202F000A4FEF001433C033
S315000178C000A003D24CDF3800205F508F4ED04E719E
S315000178D04E714E7148E7031C33C000A003D4266FD6
S315000178E000182A6F001C3F3C000A2F0D2F0B4EB9C2
S315000178F000025A422E002015B08B630000847018D6
S315000179000BE80647C203C00000E1022074EB90002A6
S31500017910 7B582C002015528028403F3C000A2F0D31
S31500017920 2F0C4EB900025A422E002015B08C63501E
S31500017930703CBE80644A2007E9889087E588DC8030
S3150001794020155280264020550C10003A6628528890
S3150001795028483F3C000A2F0D2F0C4EB900025A420F
S3150001796 02E002015B08C630A703CBE806404DC874F
S31500017970 60102A8B600620554A1067067CFF60025C
S315000179802A8B200633C000A003D64CDF38C0205F07
S3150001799 0508F4ED04E714E714E7148E7013C33C047
S315000179A000A003D87E012A7C00C05392287C00C027
S315000179B0538C267C000243564A3900C05244674E16
S315000179C0203900C052840C8000010000 64344A4012
S315000179D067140C40258 0671C0C404B0067160C4051
S315000179E0 9600671 0601C08AD0000000128BC00006D
S315000179F04B00601808ED0000000128B900C0528450
S3150001 7A00600A487900031D664E93588F42474A39EA
S31500017A1000C05245670C13F900C0528B00C0539049
S31500017A2042474A3900C05246670C13F900C0528FCB
S31500017A3000C0539142474A3900C0524867163039 4F
S31500017A4000C0529602400001D04008AD000100017D
S31500017A5081554247247C000283884A3900C0524737
S31500017A6067163039 00C0529202400001E14808957C
S31500017A70000081554247601A4A47661660064EB9AC
S31500017A800001A17E2F124EB9000037100C40FFFFF6
S31500017A9067EC4A3900C0524A6748487900031D7AA3
S31500017AA04E93588F60200C47FFFF6714081500009E
S31500017AB0660E2F39000 2838C3F074EB9000035EC64
S31500017AC04EB90001A17E2F124EB9000037103E00BB
S31500017AD00C47000366D0487900031D7D4E93588FED
S31500017AE042474A3900C05249671E2F0C3F3C0002EB
S31500017AF03F3C002C4EB9000071EA4A40670A4879BA
S31500017B0000031D804E93588F4A47676C082D00016C
S31500017B1000016708487900031DD060064879000313
S31500017B201DD1081500006708487900031DCC6006C1
S31500017B30487900031DCD7000103900C05390E588C7
S31500017B40068000C0986420402F104240103900C0C2
S31500017B5053913F002F14082D0000000016708487952
S31500017B6000031DC26006487900031DC7487900035A
S31500017B701D914E934FEF001A424033C000A003DA25
S31500017B804CDF3C804E754E714E714E7148E70300D5
S31500017B9033C000A003DC227C00C000FE3C2F000C99
S31500017BA0602A1011B007630E4241120042401007CD
S31500017BB092409C416014B00764124241120006 4192
S31500017BC000404240100792409C411E114A466ED227
S31500017BD033C000A003DE4CDF00C0205F548F4ED0BF
S31500017BE04E714E714E7133C000A003E00839000199
S31500017BF000C0539367224A3900C05384661A4879F4
S31500017C0000031DD44EB9000243564879 00031DDD19
S31500017C104EB900024356508F33C000A003E24E75A1
S31500017C204E714E714E7133C000A003E4598F3F3C33
S31500017C30002C43EF00024EB90000738E4A9767127B
S31500017C40327C0010D3D7207C00C0538C20D92091E0
S31500017C5060 10227C00029EC8207C00C0538C20D973
S31500017C602091588F33C000A003E64E754E714E71B8
S31500017C704E7133C000A003E8518F3F3C000243EF31
S31500017C80 00024EB9000073C641D72F2800042F39D0
S31500017C9000002874A487900031DF84EB9000243568F
S31500017CA04FEF000C3F3C000243EF00024EB90000CB
S31500017CB073C641D72F103F3C00634EB900000E1E1C
S31500017CC04240508F33C000A003EA4E754E714E718B
S31500017CD04E7133C000A003EC33C000A003EE4E7515
S31500017CE04E714E714E7133C000A003F0518F3F3C6F
S31500017CF0000043EF00024EB9000073C641D72F289A
S31500017D000042F390002874248790003 1E194EB933
S31500017D1000024356 4FEF000C3F3C000043EF0002C8
S31500017D204EB9000073C641D72F103F3C00634EB9D0
S31500017D30000000E1E4240508F33C000A003F24E7564
S31500017D404E714E714E7133C000A003F433C000A0D2
S31500017D5003F64E754E714E714E7133C000A003F895
S31500017D60518F3F3C000A43EF00024EB9000073C633
```

S31500017D7041D72F2800042F390002876A487900036A
S31500017D801E3B4EB9000243563F3C000A43EF000E2C
S31500017D904EB9000073C641EF000C2F103F3C006343
S31500017DA04EB900000E1E3F3C000943EF000E4EB9CE
S31500017DB0000073C641EF000C2F2800042F39000282
S31500017DC08766487900031E464EB9000243564FEFB7
S31500017DD000183F3C000943EF00024EB9000073C68C
S31500017DE041D72F103F3C00634EB900000E1E4240A2
S31500017DF0508F33C000A003FA4E754E714E714E710D
S31500017E0033C000A003FC33C000A003FE4E754E71C3
S31500017E104E714E7148E7030033C000A004003E2FA7
S31500017E20000C7C0FCC47E84F700FC047720AC2C0E6
S31500017E30DC41E84F700FC0477264C2C0DC41E84FB5
S31500017E40700FC047323C03E8C2C0DC41300633C084
S31500017E5000A004024CDF00C0205F548F4ED04E714B
S31500017E604E714E7148E7010C33C000A00404598FCE
S31500017E703E2F00143F3C000A3F074BEF0004287CCD
S31500017E8000024F48224D4E943E153F3C000A204FBA
S31500017E903F280004224D4E943015E948DE403F3C10
S31500017EA0000A204F3F280004224D4E943015E14828
S31500017EB0DE403F3C000A204F3F280004224D4E94ED
S31500017EC03015720CE368DE403007588F33C000A0CE
S31500017ED004064CDF3080205F548F4ED04E714E71B8
S31500017EE04E7148E7030033C000A004082C2F000C94
S31500017EF03F066100FF207E003E007010E0AE3F06A7
S31500017F006100FF12323C2710C2C070003001DE80D2
S31500017F10200733C000A0040A4CDF00C0205F588F41
S31500017F204ED04E714E714E714E56FFEA48E723040C
S31500017F3033C000A0040C2D49FFFC2A7C00C005803B
S31500017F402E2E00082055202800E7202B081640CE6
S31500017F50422EFFEE422EFFEF600000F0BEA8001693
S31500017F6064042E2800162055202800163228001 4F5
S31500017F7048C1243C000151802D40FFEA20024EB940
S31500017F8000027B58D0AEFFEABE80631620552E282C
S31500017F9000163028001448C022024EB900027B5850
S31500017FA0DE804878070820552028001644802040A6
S31500017FB04870780043EEFFF44EB900024F904878BE
S31500017FC000302F2EFFF843EEFFF44EB900024F901A
S31500017FD03F3C00023F2EFFF643EEFFF04EB9000292
S31500017FE04F48487800022F2EFFF843EEFFF44EB9B2
S31500017FF000024F90307C02DAD1D5D1EEFFF81E1087
S315000180004AAEFFF4660A10074880E8401E00600485
S3150001801002070 00F307C00DAD1D51007488048C02E
S31500018020EB88D1C0302EFFF248C0D1C01C104A6E79
S31500018030FFF0660A10064880E8401C00600402064C
S3150001804000 0F1D46FFEE1D47FFEF43EEFFEE206ECC
S31500018050FFFC10D9109133C000A0040E4CDF20C4E0
S315000180604E5E205F588F4ED04E714E714E714E56F8
S31500018070FFF633C000A004102D49FFFC3D6E000839
S31500018080FFF64A6EFFF6660A2D7C00000000FFF837
S31500018090601470 00302EFFF6720DE3A80680308062
S315000180A000002D40FFF843EEFFF8206EFFFC209103
S315000180B033C000A004124E5E205F548F4ED04E7125
S315000180C04E714E714E56FFF633C000A004142D4971
S315000180D0FFFC2D6E0008FFF648790002A442486EA7
S315000180E0FFF64EB9000238DA4A406C06426EFFFAD4
S315000180F06012203CCF800000D0AEFFF6720DE2A8E0
S3150001810003D40FFFA43EEFFFA206EFFFC309133C08B
S31500018110 00A004164E5E205F588F4ED04E714E71F0
S315000181204E714E56FFF248E7010C33C000A0041809
S3150001813 02D49FFFC43EE000841EEFFF220D92091C4
S3150001814042474BEEFFF649EEFFF44A6EFFF2671225
S315000181503D55FFF83A9438AEFFF23D47FFF2064728
S31500018160000104A6EFFF467143D6EFFF6FFF83D6E90
S31500018170FFF4FFF6426EFFF4064700100CAE000056
S3150001818007FFFFF6631A600C202EFFF6E2882D40EA
S31500018190FFF652470CAE000007FFFFF662EA6022C7
S315000181A00CAE000003FFFFF66418600C202EFFF6EC
S315000181B0D0802D40FFF653470CAE000003FFFFF6BB
S315000181C065EA303C03FFC06EFFF8024003FF026E12
S315000181D0FC00FFFA816EFFFA9E6E00100647001F33
S315000181E006470009703FC047720AE368026E03FF43
S315000181F0FFFA816EFFFA43EEFFFA206EFFFC309123
S3150001820033C000A0041A4CDF30804E5E205F4FEF72
S31500018210000A4ED04E714E714E714E56FFF42F022A
S31500018220 33C000A0041C2D49FFFC227C00029E14D1
S31500018230 41EEFFF420D92091302E0008024003FFC1
S3150001824003D40FFFA08C0000A3D40FFFA302E000A01
S315000182503 22E0008740AE4690241003FD04106400B
S31500018260FFD83F00486EFFF4610007A043EEFFF41C
S31500018270206EFFFC20D9209133C000A0041E241FCC
S315000182804E5E205F588F4ED04E714E714E714E56D6
S31500018290FFF033C000A004202D49FFFC302E001052
S315000182A0444006400 0203F00202E0008486EFFF0A3
S315000182B04EB900025B0C2F2EFFF043EEFFF44EB9D0
S315000182C00002631C302E001044403F00202E000C9B
S315000182D0486EFFF04EB900025B0C2F2EFFF043EE05
S315000182E0FFF84EB90002631C486EFFF8486EFFF4B2
S315000182F0486EFFF04EB90002384243EEFFF0206EA1
S31500018300FFFC209133C000A004224E5E205F4FEF98
S31500018310000A4ED04E714E714E714E56FFF433C067
S31500018320 00A004242D49FFFC3F2E000C486E0008D6
S31500018330486EFFF44EB9000236DE2F2EFFF82F2EBF
S31500018340FFF443EEFFF46100051443EEFFF4206EE3
S31500018350FFFC20D9209133C000A004264E5E205F89
S315000183605C8F4ED04E714E714E714E56FFF048E7FE
S31500018370001C33C000A004282D49FFFC47EEFFF482
S3150001838049EE00084BEE00102D4AFFF0204C224D1D
S31500018390244B2028000422290004D081254000412
S315000183A0201022 11D812480246EFFF043EEFFF4C8
S315000183B0206EFFFC20D9209133C000A0042A4CDF97
S315000183C038004E5E205F4FEF00104ED04E714E7159
S315000183D04E7133C000A0042C206F0004428052A8C5
S315000183E000042210D380208133C000A0042E205F18
S315000183F0588F4ED04E714E714E7133C000A004306D
S31500018400206F0004226F0008202800042229 00049E
S31500018410D08121400004201022 11D181208033C057
S31500018420 00A00432205F508F4ED04E714E714E71B6
S315000184304E56FFF448E7000C33C000A004342D4922
S31500018440FFFC49EEFFF44BEE0008204D224C20289C
S315000184500004448023400004201040802280 43EE23
S31500018460FFF4206EFFFC20D9209133C000A0043612
S3150001847 04CDF30004E5E205F508F4ED04E714E71F4
S315000184804E7133C000A00438206F00042028000478
S3150001849044802140000420104080208033C000A089
S315000184A0043A205F588F4ED04E714E714E714E5622
S315000184B0FFF048E7001C33C000A0043C2D49FFFC37
S315000184C047EEFFF449EE00084BEE00102D4AFFF08F
S315000184D0204C224D244B202800042229000490819F
S315000184E02540000420102211918124 80246EFFF082
S315000184F043EEFFF4206EFFFC20D9209133C000A08B
S31500018500043E4CDF38004E5E205F4FEF00104ED028
S315000185104E714E714E7133C000A00440206F0004AD
S31500018520226F000820280004222900049081 21409E
S3150001853000042010221191 81208033C000A0044242
S31500018540205F508F4ED04E714E714E714E56FFECDC
S31500018550 48E7001C33C000A004442D49FFFC47EE48
S31500018560FFF049EE00084BEE00142D4AFFEC204CBB
S31500018570224D244B2028000822290008908125 40FD
S3150001858000082028000422290004918125400004C6
S3150001859020102211918124 80246EFFEC43EEFFF01E
S315000185A0206EFFFC20D920D9209133C000A00446BB
S315000185B04CDF38004E5E205F4FEF00184ED04E71F3
S315000185C04E714E7133C000A00448206F0004226F23
S315000185D00008202800082229000890812140000 86F
S315000185E0202800042229000491812140000420 1042
S315000185F02211918120 8033C000A0044A205F508F50
S315000186004ED04E714E714E714E56FFEC48E7001C2E
S3150001861033C000A0044C2D49FFFC47EEFFF049EEA4
S31500018620 00084BEE00142D4AFFEC204C224D244B42
S315000186302028000822290008D0812540000820288A
S315000186400004222900 04D18125400004201022 11B2

S31500018650D18124B0246EFFEC43EEFFF0206EFFFCF7
S3150001866020D920D9209133C000A0044E4CDF380018
S315000186704E5E205F4FEF00184ED04E714E714E7117
S3150001868033C000A00450206F0004226F0008202888
S3150001869000082229000 8D0812140000820280004 72
S315000186A022290004D18121400004201022 11D18108
S315000186B0208033C000A00452205F508F4ED04E71EF
S315000186C04E714E714E56FFEC48E7000C33C000A0C8
S315000186D004542D49FFFC2D7C00000000FFF42D7C85
S315000186E000000000FFF84BEEFFF449EE00082D42B2
S315000186F0FFF02D43FFEC203C00000433906E001088
S31500018700204C2628000424106C04448340826606 0B
S315000187102603673E6012223CFFE00000C282670822
S31500018720E28AE293528060EE223C00100000C2828F
S315000187306608E383E392538060EE223C000FFFFF5D
S31500018740C4814840E9808480081000076704 08C294
S31500018750001F204D20C22083242EFFF0262EFFEC81
S31500018760224D206EFFFC2091216900040004 33C0D4
S3150001877000A004564CDF30004E5E205F4FEF000A2A
S315000187804ED04E714E714E714E56FFE848E7000CC1
S3150001879033C000A004582D49FFFC2D7C00000000C9
S315000187A0FFF42D7C00000000FFF84BEEFFF449EECC
S315000187B000082D42FFF02D43FFEC2D44FFE8203C3D
S315000187C000000433906E0014204C28280008262847
S315000187D0000424106C04448340826606260367 4223
S315000187E06014223CFFE00000C282670AE28AE2933B
S315000187F0E294528060EC223C00100000C282660ABC
S31500018800E384E393E392538060EC223C000FFFFF85
S31500018810C4814840E9808480081000076704 08C2C3
S31500018820001F204D20C22083242EFFF0262EFFECB0
S31500018830282EFFE8224D206EFFFC209121690004BD
S3150001884000043 3C000A0045A4CDF30004E5E205FA6
S315000188504FEF000E4ED04E714E714E714E56FFECDB
S3150001886048E7000C33C000A0045C2D49FFFC227CC4
S3150001887000002A44641EEFFF420D920914BEEFFF40D
S3150001888049EE00082D42FFF02D43FFEC204C26282F
S31500018890000042410220202820 00FFFFF0082001052
S315000188A000000281FFF000000881001F4841E889AD
S315000188B004410433D26E00106E0E672E0C41FFC0C8
S315000188C06C20428242836 0220C4100406F0A428240
S315000188D0448242834483601 2E383E392534166F800
S315000188E06008E28AE293524166F8081000076704BD
S315000188F04483408220 4D20C22083242EFFF0262E61
S31500018900FFEC224D206EFFFC20D9209133C000A040
S315000189100045E4CDF30004E5E205F4FEF000A4ED002
S315000189204E714E714E714E56FFE448E7000C33C04E
S3150001893000A004602D49FFFC227C0002A44E41EEFA
S31500018940FFF020D920D920914BEEFFF049EE000827
S315000189502D42FFEC2D43FFE82D44FFE4204C24106B
S315000189602628000442842 2020282000FFFFF0082B1
S3150001897000010000002 81FFF000000881001F48413D
S31500018980E88904410433D26E00106E1067360C413B
S31500018990FFA06C26428242834284 60280C4100601B
S315000189A06F0E42824482428344834284448460142B
S315000189B0E383E392534166F8600AE28AE293E29422
S315000189C0524166F6081000076706448440834082D8
S315000189D0204D20C220C32084242EFFEC262EFFE842
S315000189E0282EFFE4224D206EFFFC20D920D92091AC
S315000189F033C000A004624CDF30004E5E205F4FEFB3
S31500018A00000A4ED04E714E714E7133C000A00464FF
S31500018A10518F2F4200042E83206F000C241026282C
S31500018A2000004322F00106B0C6712E383E39253416B
S31500018A3066F86008E282E293524166F820C220831A
S31500018A40242F00042617508F33C000A00466205F30
S31500018A505C8F4ED04E714E714E712F0733C000A000
S31500018A600468302F0008E0583E00300733C000A0EC
S31500018A70046A2E1F205F548F4ED04E714E714E7177
S31500018A802F0733C000A0046C202F0008E05848408F
S31500018A90E0582E00200733C000A0046E2E1F205F71
S31500018AA0588F4ED04E714E714E7148E7010C33C04E
S31500018AB000A004709BCD2E0D287C000004006002EE
S31500018AC0DE9DBBD465FA487900031E884EB90002C3
S31500018AD04356200744802F0020542F102F082F398A
S31500018AE0000289002F39000008AE487900031EBF35
S31500018AF04EB9000243564FEF001C2F3900027B7C12
S31500018B003F3C00634EB900000E1E424033C000A038
S31500018B1004724CDF30804E754E714E714E7148E7CE
S31500018B20000C33C000A004744FEFFFEA4AB900C03D
S31500018B3048B0670000A40CB90F0C3F0000C000FA52
S31500018B40630000964BEF00122AB900C04894287CB6
S31500018B5000004004A95675423D500C049182079BE
S31500018B6000C0491820280010B0B900028900663CEF
S31500018B7020552028001 4B09466322028001CB0B974
S31500018B8000027B7C6626202800182254B091661CC0
S31500018B902F154EB90000519A3E802F3900C048B0BA
S31500018BA04EB90000519A3217B240672C20542F500B
S31500018BB0000A2F4800062F7900027B7C000E2F79D0
S31500018BC00002890000024 86F00023F3C00043F3C5E
S31500018BD000394EB9000071EA4FEF001633C000A00C
S31500018BE004764CDF30004E754E714E714E712F0674
S31500018BF033C000A004787C060839000300C00012C7
S31500018C0066047200600422065381206F00082081E9
S31500018C10200633C000A0047A2C1F205F5C8F4ED043
S31500018C204E714E714E712F0D33C000A0047C2A6F18
S31500018C30000082F390000089A487900031EE22F0D1B
S31500018C404EB90002438C2F3900027D7A4879000320
S31500018C501EEB486D00204EB90002438C4FEF001801
S31500018C6033C000A0047E2A5F205F5C8F4ED04E7118
S31500018C704E714E7133C000A0048033C000A004823F
S31500018C80205F588F4ED04E714E714E7148E7000CE1
S31500018C9033C000A00484287C0002438C2A6F000C98
S31500018CA0202F00107205B08162000130D040303BA8
S31500018CB000064EFB0002000C00A2008000540030AA
S31500018CC000CE2F390000089A487900031EF42F0DB3
S31500018CD04E944FEF000C2F3900C0983A48790003A3
S31500018CE01EFD60000094487900031F0B48790003BC
S31500018CF01F022F0D4E944FEF000C207900000400 47
S31500018D002F10487900031F14606E2F39000008A246
S31500018D10487900031F1A2F0D4E944FEF000C486D32
S31500018D2000202F3900027B7C3F3C00634EB90000D6
S31500018D300B06600000A62F39000008A6487900033B
S31500018D401F232F0D4E944FEF000C2F39000289007F
S31500018D50487900031F2C60202F39000008AA4879A2
S31500018D60000031F312F0D4E944FEF000C2F390000D9
S31500018D7008AE487900031F3A486D00204E944FEF24
S31500018D80000C60562F3900C0538C0839000000C012
S31500018D905393670848790003 1F4F6006487900031B
S31500018DA01F5448790003 1F412F0D4E94700010394E
S31500018DB000C05390E588068000C0986420402F10BB
S31500018DC04240103900C053913F00487900031F59B2
S31500018DD0486D00204E944FEF001E33C000A004865C
S31500018DE04CDF3000205F4FEF000A4ED04E714E71BE
S31500018DF04E7148E70F3E33C000A004882A3C0100AB
S31500018E0000000283C00020000287C00026648267CFF
S31500018E1000024 38C2A6F00282C6F002C082D0005B8
S31500018E2000E7660001A04EB9000053A8202D00DC22
S31500018E30223C000151804EB900027 09091AD00DCD8
S31500018E4045ED00E006920001517F20124EB9000265
S31500018E507090919208ED000600E708ED000500E725
S31500018E6042154879 00031F6A486D003C4878003C6A
S31500018E704EB9000010B8082D000300D567124879D5
S31500018E80000031F992F0D4E94487508004E93508F7D
S31500018E90082D000100D4671248790003 1F9F2F0D8A
S31500018EA04E94487508004E93508F082D000700D543
S31500018EB06712487900031FA92F0D4E9448750800C3
S31500018EC04E93508F082D000600D66722202D00D420
S31500018ED0C0856708487900031FB36006487900031 7
S31500018EE01FB82F0D4E94487508004E93508F202DB4
S31500018EF000D4C0846722202D00D4C0856708487934
S31500018F00000031FBD6006487900031FC12F0D4E9453
S31500018F10487508004E93508F082D000000D5672232
S31500018F200202D00D4C0856708487900031FC5600657

S31500018F30487900031FC92F0D4E94487508004E93BA
S31500018F40508F082D000200D56712487900031FCD06
S31500018F502F0D4E94487508004E93508F082D00042E
S31500018F6000D56712487900031FD12F0D4E9448751D
S31500018F7008004E93508F082D000600D5671A4879D0
S31500018F8000031FDC487900031FD52F0D4E94487549
S31500018F9008004E934FEF000C082D000500D5671A07
S31500018FA0487900031FE7487900031FE02F0D4E940F
S31500018FB0487508004E934FEF000C2F0D4E94423525
S31500018FC0083C600E082D000600E7670608AD00069E
S31500018FD000E7082D000600E767122F0E2F0D61002E
S31500018FE004822F0D610006A01E0060027E030C079D
S31500018FF0000366182F0D610008CC1E000C07000245
S315000190000660A2F0E2F0D6100045A7E014A07670872
S3150001900102F0D610006721E000C07000367B4422D76
S3150001902000078082D000300D56722302D00D20240BA
S315000190300 3FF52403F00487900031FED486D007859
S3150001904 04E94487508784E934FEF000A082D00019B
S31500019050 00D4674A302D00D2024003FF4A40632202
S3150001906 0302D00D2024003FF53407C003C002039E2
S3150001907 000C095102206E789D286D281D0812F00C1
S3150001908 0600648790003 1FFA487900031FF2486D0C
S3150001909 000784E94487508784E934FEF000C082DD2
S315000190A0000700D56756302D00D2024003FF4A4023
S315000190B06324302D00D2024003FF53407C003C0064
S315000190C0207900C095102006E788D086D080D1C0CF
S315000190D02F28000860104AAD00C0660442A760064A
S315000190E0206D00C02F10487900032003486D0078D9
S315000190F04E94487508784E934FEF000C082D0006E4
S3150001910000D66774082D000200D2664C202D00D4CB
S3150001911 0C0846726202D00D4C085670848790003DE
S3150001912 0200960064879000 3200E486D00784E94A8
S3150001913 04875087 84E93508F603E302D00D002401E
S3150001914 000FF52403F00487900032013486D007824
S3150001915 04E94487508 78601A102D00E648805240F2
S3150001916 03F00487900032019486D00784E944875F0
S3150001917 008784E934FEF000A202D00D4C084674033
S3150001918 0082D000200D267164879000 3201E486D9B
S3150001919 000784E94487508784E93508F6022302D92
S315000191A000D0024000FF52403F00487900032022D0
S315000191B0486D00784E94487508784E934FEF000A33
S315000191C0082D000000D56724302D00D0E04802406C
S315000191D000FF52403F00487900032027486D007880
S315000191E04E94487508784E934FEF000A082D0002F9
S315000191F000D56726302D00D2720CE2680240000FBE
S3150001920052403F0048790003202C486D00784E9467
S3150001921 0487508784E934FEF000A082D000400D5D3
S31500019220673E4A2D00E5660442466014102D00E4AF
S3150001923 04880122D00E5488148C081C148403C0064
S3150001924 0102D00E4488090463F004879000 3203104
S3150001925 0486D00784E94487508784E934FEF000A92
S3150001926 0082D000600D5674E206D00B808280004B9
S3150001927 00001672630 2D00D2720CE2680240000F11
S3150001928 07C003C00701AD0B900C005802206D2814C
S3150001929 0D286E589D0812F0060064879000 3203DFA
S315000192A04879000 32036486D00784E944875087851
S315000192B04E934FEF000C082D000500D56730082DA1
S315000192C0000300D2670A206D00C8486800046008E0
S315000192D0206D00CC48680004487900032 03F486DA2
S315000192E000784E94487508784E934FEF000C10079E
S315000192F033C000A0048A4CDF7CF0205F508F4ED033
S3150001930 04E714E714E7133C000A0048C226F000461
S3150001931 04A3900C05249671E303CFFFFD07900C070
S3150001932 0529A024003FF0269FC0000D2816900D211
S3150001933 008E9000000DB4A3900C0524467121039BF
S3150001934 000C052875300134000E608E9000300DB22
S3150001935 04A3900C05250670E137900C052B700E473
S3150001936 008E9000100DB4A3900C0524C6722303C53
S3150001937 0FFFFD07900C052A602400001720AE368DD
S3150001938 008A9000200D2816900D208E9000400DBC5
S3150001939 04A3900C0524B6720303CFFFFD07900C0EC
S315000193A052A2024000FFE148026900FF00D0816934
S315000193B000D008E9000200DB4A3900C0524A6722A0
S315000193C0303CFFFFD07900C0529E0240000F720C64
S315000193D0E36802690FFF00D2816900D208E900053E
S315000193E000DB4A3900C0524D671E303CFFFFD07981
S315000193F000C052AA024000FF0269FF0000D0816945
S3150001940000D008E9000600DB4A3900C0524E671059
S31500019410237900C052AC00DC08E9000400D66010D4
S31500019420203CFFABA000D0B900C000FA234000DC0D
S3150001943 04A3900C0524F6710237900C052B000E08C
S3150001944 008E9000400D6600823 7900C000FA00E0AC
S3150001945 033C000A0048E205F588F4ED04E714E71DE
S3150001946 04E7148E7211C33C000A00490287C00C03F
S3150001947 0497C2A6F0018266F001C302D00D202404D
S3150001948 003FF4A406332302D00D2024003FF7200CF
S3150001949 03200E5892001 4AB40800631C7010322DA0
S315000194A000D2024103FF74003401E58A2202D0B4DE
S315000194B018002B4000C460087010D0942B4000C4E3
S315000194C0203C0000009AD0AD00C4322D00D0E04906
S315000194D0024100FF3401C4FC002CD082068000004A
S315000194E000162B4000C8203C0000009AD0AD00C4F5
S315000194F0322D00D0E049024100FF3401C4FC002CAA
S3150001950 0D0822B4000CC082D000100D7660A082D19
S3150001951 0000100DB670000AC302D00D2024003FFE2
S3150001952 072003200E189068100C01404102D00E4A6
S3150001953 0488048C0E588D2802041285 0202D00BCB3
S3150001954 0B08C67642B4C00BC67562F0C4EB90000DB
S3150001955 089FA4A40674A7018D0AD00BC2B4000B466
S3150001956 07010D0AD00BC2B4000C0200B672A2F0B1A
S3150001957 02F2D00BC4EB900005CFE4A8066044207EE
S3150001958 060027E011007020000 01EF0808AD000726
S3150001959 000E7812D00E7601008AD000700E76008CD
S315000195A042AD00B442AD00C04AAD00BC660000C287
S315000195B042AD00B442AD00C008AD000700E760004F
S315000195C000B0303C03FFC06D00D26600009C4AB972
S315000195D000C0140067662F0B2F3900C0487C4EB9B6
S315000195E00005CFE4A80660442076002 7E011007A5
S315000195F002000001EF0808AD000700E7812D00E732
S3150001960 0082D000700E7673449ED00BC28B900C002
S3150001961 0487C7018D0942B4000B4302D00D0E0481F
S3150001962 0024000FF72003200E589D2AD00B42B4141
S3150001963 000B87010D0942B4000C060342B7C00C061
S3150001964 0460C00B42B7C00C0460400C0202D00B49B
S3150001965 0322D00D0E049024100FF74003401E58A51
S3150001966 0D0822B4000B8600842AD00B442AD00C0C4
S3150001967 033C000A004924CDF3884205F508F4ED057
S3150001968 04E714E714E7148E7210033C000A004941B
S3150001969 0226F000C4AA900B4670001BC202900B45E
S315000196A0322900D0E049024100FF74003401E58A05
S315000196B0D082234000B87203204 0C228000167000F
S315000196C001E8082900 0200D2674A102900E648800D
S315000196D0206900C032280004E0490241001F2069C8
S315000196E000B834100242000302810000FFFF82C26B
S315000196F0B041640001B4302900D0024000FF206966
S3150001970 000C032280004E0490241001FB04165282B
S3150001971 0600001963029 00D0024000FF206900C098
S3150001972 032280004E0490241001FB0416200017A7B
S3150001973 04A2900E66E000172302900D2720CE268F5
S3150001974 00240000F206900C03228000 40241000FC8
S3150001975 0B041640001544AA900BC672208290004EB
S3150001976 000D66724206900BC20280008B0A900DCC7
S3150001977 065000136B0A900E0630E6000012C0829DE
S3150001978 0000100D766000122082900070 0D76738C3
S3150001979 00829000200D26718206900B808280002CB
S315000197A0000166240828000 30001661C600000FA17
S315000197B0206900B830280002080000 0D660A082852
S315000197C000060002670000E20829000000D66728AB
S315000197D00829000200D2671020 6900B80828000392
S315000197E00001661460000 0C2206900B8302800023A
S315000197F00800000E670000B20829000100D667289C
S315000198000829000200D26710206900B80828000262

S315000198100001661460000092206900B83028000239
S31500019820080000D670000820829000200D6673093
S3150001983008290002000D2670E303CFFE0206900B81B
S31500019840C050661C6062206900B83028000208001A
S31500019850000F660C6052303C1780C06900D666481E
S3150001986008290005000D667080829000700E76738B8
S3150001987008290003000D66734302900D2024003FFCD
S315000198804A406328302900D2024003FF53407E003C
S315000198903E00207900C095102007E788D087D08048
S315000198A0D1C04AA80008660470036002700133C083
S315000198B000A004964CDF0084205F588F4ED04E7175
S315000198C04E714E7148E7070033C000A00498226F1D
S315000198D000107C0342474AA900C0670001544AA907
S315000198E000B86700014C302900D0E048024000FF73
S315000198F00C40000E6400013A0829000600D7676C87
S3150001990008290006000DB66640829000200D26648C1
S31500019910302900D0024000FF5240024000FF02699B
S31500019920FF0000D0816900D0302900D0024000FF3D
S31500019930206900C032280004E0490241001FB041FD
S315000199406512303C00FFC0470269FF0000D0816903
S3150001995000D060187E016014102900E6488002409C
S3150001996000FF0269FF0000D0816900D04A476652B4
S3150001997008290005000D7674A0829000500DB664269
S31500019980302900D2720CE2680240000F52400240B8
S31500019990000FE36802690FFF00D2816900D2302906
S315000199A000D2E2680240000F206900C0322800049C
S315000199B00241000FB041650802690FFF00D2600243
S315000199C07E014A47666A0829000300D767620829AB
S315000199D0000300DB665A0829000200D2674E20699F
S315000199E000C030280004E0480240001F206900B88A
S315000199F032100241000302800000FFFF80C13A00DD
S31500019A00522900E6102900E64880B0456D06422934
S31500019A1000E660027E01102900E64880024000FF50
S31500019A200269FF0000D0816900D06004422900E686
S31500019A304A4766260829000100D7671E0829000142
S31500019A4000DB6616522900E40C29004000E46D068D
S31500019A50422900E460027E017C024A47662A0829FF
S31500019A60000400D767220829000400DB661A0829CA
S31500019A70000200D2670808A9000200D2600808E9BE
S31500019A80000200D27E017C024A476648082900028C
S31500019A9000D767400829000200DB6638302900D06C
S31500019AA0E048024000FF5240024000FFE1480269DF
S31500019AB000FF00D0816900D0302900D0E048024083
S31500019AC000FF0C40000F6508026900FF00D060022C
S31500019AD07E017C024A4766480829000000D7674094
S31500019AE00829000000DB6638302900D2024003FF56
S31500019AF05240024003FF0269FC0000D2816900D294
S31500019B00302900D2024003FF72003200B2B900C010
S31500019B1097E065080269FC0000D260027E017C02C2
S31500019B204A4766024206100633C000A0049A4CDF7B
S31500019B3000E0205F588F4ED04E714E714E7148E74E
S31500019B40073C33C000A0049C4FEFFF78246F00A8A8
S31500019B501F7C0001000149EF00860254C1FF08D4B1
S31500019B600001422F000208D400060254FE7F08ECD1
S31500019B7000007000108D400077A0147EF00046000DE
S31500019B8000FA08140006661030147209E2680240F1
S31500019B90001F0C40000363063F3C030060043F3C8A
S31500019BA000C0610003023E000C47FFFD67060C473B
S31500019BB0000666060814000667080C4700156600CD
S31500019BC000860C470006670608140006675208144B
S31500019BD00007670000C60814000557C04400488005
S31500019BE0DA403F05486F00064E924A40660608D4A1
S31500019BF000076004089400071F450002100546008F
S31500019C001F40000342463E3C00802A4B101D4880FF
S31500019C10DC4053474A4762F41F4600840254C1FFA1
S31500019C2008940006081400076 60A3F3C0004610018
S31500019C3002C4602E3F3C00C03F3C0084486F0005D3
S31500019C406100030C601C0C47001866163014EE48C0
S31500019C5002400003524002400003EF480254FE7FD7
S31500019C608154301447209E2680240001F52400240DA
S31500019C70001FE3680254C1FF81543014EE480240CC
S31500019C8000030C4000026212301472O9E2680240BD
S31500019C90001F0C40001E6300FEEA30140240007FE4
S31500019CA04FEF008833C000A0049E4CDF3CE0205FEC
S31500019CB0588F4ED04E714E714E7148E70F3E33C0EC
S31500019CC000A004A04FEFFF7849EF00862C6F00B08B
S31500019CD00254FF80005400150254C1FF7A0145EF7A
S31500019CE0000247EF00046000012230140240007FA9
S31500019CF03F00610002003F3C0280610001AA3E0074
S31500019D000C47000166000CC2A4A3C3C00837E4099
S31500019D1060222F39000283884EB9000037103800BF
S31500019D200C44FFFF660A4EB90001A17E5347600449
S31500019D301AC453464A476F044A4662D64A476F7069
S31500019D40103C00FFD005122F0002B20066025345F7
S31500019D5042463E3C00802A4B101D4880DC4053475A
S31500019D604A4762F4102F0084B0066600009E100573
S31500019D704600122F0003B20066000090102F000269
S31500019D80B005660000863F05486F00064E964A40BC
S31500019D9066180254FF8000540006303C3E00C05451
S31500019DA067040254C1FF5245606000054007F605A47
S31500019DB030147209E2680240001F52400240001F3F
S31500019DC0E3680254C1FF81540254FF800054001518
S31500019DD060380C4700046706 0C470018660C707F54
S31500019DE0C0470254FF80815460200254FF80005412
S31500019DF0001530147209E2680240001F5240024009
S31500019E00001FE3680254C1FF815430140240007FF1
S31500019E100C400004672A30140240007F0C400018F1
S31500019E20671E30140240007F0C40007F6712301419
S31500019E307209E2680240001F0C40000A6500FEAC90
S31500019E4030140240007F0C400004670C30140240BD
S31500019E50007F0C400018660A3F3C00066100009630
S31500019E60602430140240007F0C40007F66183F3C9E
S31500019E70000A3F3C00114879000320466100000D0EA
S31500019E803F3C00C06120301402400007F4FEF008844
S31500019E9033C000A004A24CDF7CF0205F588F4ED067
S31500019EA04E714E714E7148E7030033C000A004A401
S31500019EB03C2F000C60124A466704534666047EFD39
S31500019EC0601A4EB90001A17E2F39000283884EB96E
S31500019ED00000037103E000C47FFFF67DA300733C03A
S31500019EE000A004A64CDF00C0205F548F4ED04E71F7
S31500019EF04E714E7148E7030033C000A004A81C2F21
S31500019F0000D7E05600853474EB90001A17E4A4700
S31500019F10631A2F390002838810064880 3F004EB924
S31500019F20000035EC3C000C0600FF67DA4A47630681
S31500019F30100648806 00270FD33C000A004AA4CDF01
S31500019F4000C0205F548F4ED04E714E714E7148E75E
S31500019F500070433C000A004AC2A6F00143A2F00187E
S31500019F603E2F001A602C2F390002838810154880 75
S31500019F70024000FF3F004EB9000035EC3C000C46A4
S31500019F80FFFF660A4EB90001A17E53476004528D58
S31500019F9053454A4763044A4562CC4A47630430063F
S31500019FA0600270FD33C000A004AE4CDF20E0205FEC
S31500019FB0508F4ED04E714E714E712F0233C000A09C
S31500019FC004B0323CF83BD26F00087400340 1E58AD4
S31500019FD006820002A59A2042201033C000A004B2D6
S31500019FE0241F205F548F4ED04E714E714E7133C077
S31500019FF000A004B4303CF83AD06F0004720032007D
S3150001A00006810002A892204142401010 33C000A0F0
S3150001A01004B6205F548F4ED04E714E714E7133C0CF
S3150001A02000A004B87200322F0004D281068100021A
S3150001A030A5802041301033C000A004BA205F548FA0
S3150001A0404ED04E714E714E7148E7010C33C000A0DF
S3150001A05004BC598F2A6F00143F2D00084EB9000128
S3150001A0609FEE4A4066047E0060100C2D0002000639
S3150001A07052C0440048803E0048C749ED000A303CC2
S3150001A080FFFFD06D00083F004EB900019FBAD0878F
S3150001A0902E804240102D000653403F004EB900016C
S3150001A0A0A01E72003200D2977000102D0005D280DA
S3150001A0B0538128812E81720720174EB900027090B4
S3150001A0C052001B400001721820144EB900027B5841
S3150001A0D028807000102D0004D194723C20144EB9D2
S3150001A0E000027B5828807000102D0003D1942014A3

S3150001A0F04EB900027B582880700010 2D0002D194C1
S3150001A1000C15000167120C15000266142F144EB9C6
S3150001A1100000145C4A40670804AD00000E10000AF6
S3150001A120588F33C000A004BE4CDF3080205F588FAB
S3150001A1304ED04E714E714E71207C00034BB8227C7D
S3150001A14000C0CE6C203C00000088E488600222D862
S3150001A15051C8FFFC4E7548E73F3E204F2E7900C09F
S3150001A160AE6823C800C0AE68BFFC00C0CE6C6C32BE
S3150001A170BFFC00C0AE686F2A4CDF7CFC4E752039EF
S3150001A18000C0523C23C000C0524048E73F3E204F2A
S3150001A1902E7900C0AE6823C800C0AE684CDF7CFCD7
S3150001A1A04E752E7900C0AE684EB90000976C4CDF33
S3150001A1B07CFC4E75207C00034B30227C00C0998CC0
S3150001A1C0203C00000088E488600222D851C8FFFCC8
S3150001A1D04E7533FC002400C0AE66606E33FC001C75
S3150001A1E000C0AE66606433FC001D00C0AE66605AF6
S3150001A1F033FC002000C0AE66606833FC001F00C05F
S3150001A200AE66605E33FC002300C0AE66605433FC6C
S3150001A210002200C0AE66604A33FC002100C0AE6673
S3150001A220604033FC001E00C0AE66603633FC00247D
S3150001A23000C0AE66602C33FC002500C0AE6660220D
S3150001A24033FC002600C0AE66601833DF00C0AE588E
S3150001A25033DF00C0AE5A33DF00C0AE5C33DF00C06F
S3150001A260AE5E007C070033DF00C0AE6433DF00C0A2
S3150001A270AE6033DF00C0AE6248F9FFFF00C0AE1426
S3150001A28033C000A004C04EB90000967A2E7C00C0EF
S3150001A290AE682F3C00C0AE14203C00C0AE680480FE
S3150001A2A000C0AE14E2403F003F3C001B4EB9000027
S3150001A2B071EA33C000A004C24E72270033C000A069
S3150001A2C004C4007C07002E7C00C0AE68227C00E03E
S3150001A2D00240203C00000000E2402F093F003F3CC5
S3150001A2E000034EB9000071EA33C000A004C64E72E5
S3150001A2F0270048E7030033C000A004C87C0B0839D7
S3150001A300000300C0001266047E0060042E06538717
S3150001A310206F000C208748790002A960487900E087
S3150001A32001AE4EB9000238DA4A406F0420066002D7
S3150001A330700033C000A004CA4CDF00C0205F5C8FF0
S3150001A3404ED04E714E714E712F0D33C000A004CC0C
S3150001A3502A6F00084879000078048790000 32068C1
S3150001A3602F0D4EB90002438C2F3900027D7A4879B0
S3150001A37000032071486D00204EB90002438C4FEF57
S3150001A380001833C000A004CE2A5F205F5C8F4ED038
S3150001A3904E714E714E7133C000A004D033C000A07F
S3150001A3A004D2205F588F4ED04E714E714E7148E7E0
S3150001A3B0033E33C000A004D44FEFFFE42A6F003CF4
S3150001A3C02F790002A9640018026F00FF001808EF38
S3150001A3D00002001A3F3C0001204F2F28001A43EFCC
S3150001A3E000164EB9000069CE2F3900E001C62F399B
S3150001A3F000E001C2204F2F28001C2F28001843EF30
S3150001A40000184EB9000184AE3F39000006D0204F36
S3150001A4102F28000E2F28000A43EF001A4EB900011B
S3150001A420828E247C00C0497C2052486800C048794D
S3150001A43000E001AE486F00144EB90002389648 6F2D
S3150001A44000010486F0010486F001C4EB90002389684
S3150001A4502F3900E001BE2F3900E001BA2F3900E0A3
S3150001A46001C62F3900E001C243EF00144EB90001C5
S3150001A47084AE3F39000006D0204F2F28000A2F282E
S3150001A480000643EF00164EB90001828E205248683D
S3150001A49000C0487900E001AE486F00104EB90002D5
S3150001A4A03896486F000C486F000C486F00184EB97B
S3150001A4B000023896287C00E001CE2C3C00278D0056
S3150001A4C0203900C000FAB094632E2006223900C05C
S3150001A4D000FA92944EB9000274A4486F00044EB972
S3150001A4E000025B0C486F0004486F0018486F0014A7
S3150001A4F04EB90002389660062F6F0010000C48799D
S3150001A5000002A960486F00104EB9000238DA4A40CD
S3150001A5106F7C48790002A960487900E001B24EB922
S3150001A520000238DA4A406F66486F000C487900E04D
S3150001A53001B2486F000C4EB9000238AC48790002EE
S3150001A540A968486F0008486F00084EB9000238969E
S3150001A55048574EB900026622486F00084EB90002FC
S3150001A5605B0C48790002A96C486F000C4EB90002D9
S3150001A57038DA4A406F082F7C4AED4E0000082E1447
S3150001A580486F00084EB900026622DE80601E4879D7
S3150001A5900002A960487900E001B24EB9000238DA3A
S3150001A5A04A406F062E06DE9460022E14267C0002B7
S3150001A5B0438C2C7C00C09860202F0040720AB08129
S3150001A5C0620002BCD040303B00064EFB0002007A1E
S3150001A5D000A800D800C2017400160048022E025ECF
S3150001A5E00294020E48790003207A2F0D4E93508F64
S3150001A5F0486D00202F3900C000FA3F3C006D4EB96E
S3150001A60000000B06204F2F2800142F0E4879000357
S3150001A61020886000024248790003 20932F0D4E9353
S3150001A620508F486D0020205448706800 3F3C006DF3
S3150001A6304EB900000B06204F2F28000C2F0E48792B
S3150001A640000320A2600002104879000320AD2F0DFF
S3150001A6504E93508F486D00202F143F3C006D4EB92C
S3150001A66000000B06204F2F2800102F0E48790003FB
S3150001A67020BD600001E24879000320C82F0D4E93EA
S3150001A680508F486D00202F3900E001CA600001E6B5
S3150001A6904879000320D32F0D4E93508F486D00202B
S3150001A6A02F14600001D04879000320DD2F0D4E9351
S3150001A6B0508F302F0018E048024000FF7200320030
S3150001A6C0D2810681000006D020413F102F3900E0DB
S3150001A6D001BE2F3900E001BA43EF001A4EB900015D
S3150001A6E086C4307C00AAD1D2302F0018E04802403F
S3150001A6F000FF3200C2FC002CD1C148680016486F29
S3150001A700000C4EB9000236DE486F0008486F00148F
S3150001A710486F00084EB9000236A0204F2F280004CA
S3150001A7202F10307C00AAD1D2302F0020E048024001
S3150001A73000FF3200C2FC002CD1C148680023600032
S3150001A74000B64879000320E72F0D4E93508F302F26
S3150001A7500018E048024000FF72003200D2810681F3
S3150001A760000006D020413F102F3900E001C62F39E5
S3150001A77000E001C243EF001A4EB9000186C4307CE5
S3150001A78000AAD1D2302F0018E048024000FF320063
S3150001A790C2FC002CD1C148680016486F000C4EB9A6
S3150001A7A0000236DE486F0008486F0014486F000843
S3150001A7B04EB9000236A0204F2F2800042F10307CFE
S3150001A7C000AAD1D2302F0020E048024000FF32001B
S3150001A7D0C2FC002CD1C148680023601A48790003E5
S3150001A7E020EF2F0D4E93508F2F3900E001AE2F0E23
S3150001A7F04879000320F9486D0020605E487900031E
S3150001A80021062F0D4E93508F486D00202F3900E001
S3150001A81001D23F3C006D4EB900000B062F3900E016
S3150001A82001B62F0E4879000321126 02A48790003E8
S3150001A830211D2F0D4E93508F486D00202F143F3C44
S3150001A840006D4EB900000B062F3900E001B22F0E44
S3150001A85048790003212D486D00254E934FEF0010D6
S3150001A860601C4879000321382F0D4E93508F486D97
S3150001A87000202F073F3C00634EB900000B064FEF47
S3150001A880001C33C000A004D64CDF7CC0205F4FEF14
S3150001A890000A4ED04E714E714E7148E7030033C027
S3150001A8A000A004D81E390080400813FC00800080F7
S3150001A8B0400813FC000100804000302F000C48C006
S3150001A8C0E5880680000288462040 2F104EB900C058
S3150001A8D0CE6C3C0013FC00010080400013C70080D1
S3150001A8E0400833C000A004DA4CDF00C0205F548F5B
S3150001A8F04ED04E714E714E7148E7011C33C000A017
S3150001A90004E44FEFFFF0286F00244BD7267C00C0EC
S3150001A910546830144640C06F00286628426D000E08
S3150001A9202A8C41EF00282B4800082B4C00043B7C65
S3150001A9300001000C2F0D4EB900C0998C42471E0034
S3150001A9408F13600608D300027E0430074FEF001014
S3150001A95033C000A004E64CDF3880205F5C8F4ED008
S3150001A9604E714E714E7133C000A004E84241227C03
S3150001A97000C049EE3001C1FC00D2D0892040217CC3
S3150001A9800001AB84009A3001C1FC00D2D08920407D
S3150001A990217C0001A9EC009E52413001C1FC00D28C
S3150001A9A0D0892040217C0001ABA2009A3001C1FC74
S3150001A9B000D2D0892040217C0001AAB8009E5241D4
S3150001A9C00C4100046DAE08F9000400C05D8513FC5E

S3150001A9D0000700C05D8713FC000400C05D8633C01C
S3150001A9E000A004EA4E754E714E714E7133C000A03F
S3150001A9F004EC3039008040A6720CE2680240000780
S3150001AA004241123900C05D86B04167160241000716
S3150001AA10700CE16902798FFF008040A6837900807E
S3150001AA2040A6227C00804046005110000251F3FFEF
S3150001AA300051040000793800008040404240103933E
S3150001AA4000C05D870240001F720AE368027983FF36
S3150001AA500080402C81790080402C13F9008040420F
S3150001AA6000C0546A0839000300C05D856738303973
S3150001AA700080404A08000006672C207C00C05D3338
S3150001AA8052100C10000F630410BC000F700FC010A1
S3150001AA90023900F000804062813900804062027908
S3150001AAA0FFBF0080404A0251EFFF33C000A004EE11
S3150001AAB04E754E714E714E7133C000A004F030399F
S3150001AAC0008040A6720CE268024000074241123933A
S3150001AAD000C05D86B0416716024100077000CE1694E
S3150001AAE002798FFF008040A68379008040A6227CF0
S3150001AAF000804046005110000251F3FF005108004A
S3150001AB0000079380000804040424010390C05D871E
S3150001AB100240001F720AE368027983FF0080402C1D
S3150001AB2081790080402C13F90080404200C0546AAC
S3150001AB30083900030C05D85673830390080404A16
S3150001AB4008000006672C207C00C05D3352100C10F3
S3150001AB50000F630410BC000F700FC010023900F023
S3150001AB600080406281390080406202797FFBF008027
S3150001AB70404A0251EFFF33C000A004F24E754E71F8
S3150001AB804E714E7133C000A004F433F90080403A8F
S3150001AB9000C05D6E33C000A004F64E754E714E7155
S3150001ABA04E7148E7003C33C000A004F833F9008039
S3150001ABB0403A00C05D702A7C00C05D72303900C029
S3150001ABC05D6E907900C05D703A804A406C024255D4
S3150001ABD0247C00C05D743012B05564023495287C23
S3150001ABE000C05D780C540008641E267C00C05D76AA
S3150001ABF03015D15352540C540008660C3013E648F4
S3150001AC0033C000C05D7A42530B39000400C05D8537
S3150001AC10671061204A40670A42520279FFBF0080ED
S3150001AC20404A33C000A004FA4CDF3C004E754E7119
S3150001AC304E714E7148E73F3C33C000A004FC598F6A
S3150001AC40420642433E3900C05D722A7C00C05473FD
S3150001AC50287C00C05470267C00C0546C247C00C043
S3150001AC6077C4BE7900C077C66508BE7900C077CEC5
S3150001AC70630C1ABC0002425442937C01606070006E
S3150001AC803007D1935254101248803214B240654EA7
S3150001AC902013141248824 8C2D48206820002A97087
S3150001ACA0204212280001E2A82E0038834293BE7981
S3150001ACB000C077C8640A7C010C150002662060 1A80
S3150001ACC0BE7900C077CC640A0C15000166101A869D
S3150001ACD0600C7C010C15000266041ABC00010C39DB
S3150001ACE0001F0080406C66047A016002420578000C
S3150001ACF018051A15488548C52004E788D084E588D3
S3150001AD0006800002ADA02205D281D285E589D081D7
S3150001AD102240204A20D920D920914A066700017E87
S3150001AD20303900C077CAE84872003200D281068104
S3150001AD300002ADF420411C2800013007E8487200EA
S3150001AD403200D28106810002ADF420419C28000127
S3150001AD504A066700014876012A7C00C077C5BC1502
S3150001AD606F041C156012100648801215488144173
S3150001AD70B0416C041C1544062A7C00C05472DD15D2
S3150001AD800C1500256F041ABC00251E151EB900C03E
S3150001AD905D241F7900C05D2500011F7900C05D2675
S3150001ADA000021F7900C05D2700034A076C52440761
S3150001ADB04206604010074880 41D71206488148C1C3
S3150001ADC0D1C142411210B0416F1A41D710064880D5
S3150001ADD048C0D1C09E1041D71006488048C0D1C096
S3150001ADE04210600E41D71006488048C0D1C09F105E
S3150001ADF0420752060C0600046C644A076F6060B491
S3150001AE00420660501007488041D71206488148C162
S3150001AE10D1C142411210444 10641001FB0416F2485
S3150001AE2041D71006488048C0D1C010104400060022
S3150001AE30001F9E0041D71006488048C0D1C010BCF3
S3150001AE40001F600E41D71006488048C0D1C0DF10F0
S3150001AE5042075206 0C0600046C044A076EA61E172A
S3150001AE6013C70080406C13C700C05D201E2F000170
S3150001AE7013C70080406D13C700C05D211E2F00025D
S3150001AE8013C70080406E13C700C05D221E2F00034A
S3150001AE9013C70080406F13C700C05D233003588F6E
S3150001AEA033C000A004FE4CDF3CFC4E754E714E7162
S3150001AEB04E7133C000A0050042B900C0546C4279FE
S3150001AEC000C05470423900C0547208F9000400C031
S3150001AED05D8513FC000700C05D8713FC000400C0FC
S3150001AEE05D8633C000A005024E754E714E714E71DE
S3150001AEF033C000A0050408B9000400C05D8533C055
S3150001AF0000A005064E754E714E714E7148E72F3EF3
S3150001AF1033C000A005084FEFFFD6427900C0547632
S3150001AF2033FC000A00C05478247C00C077D2425218
S3150001AF304252227C00C05D6E41EF0010700520D99F
S3150001AF4051C8FFFC309142453005024000 01E948F5
S3150001AF5008B9000400C05D85817900C05D84267C46
S3150001AF6000C0547436851 3FC000700C05D8708F9DC
S3150001AF7000060080406202 3900CF0080406202 79FB
S3150001AF80FC0000804078007900010080407830396B
S3150001AF900080407802 4003FF52407200320020 3C9C
S3150001AFA001312D004EB9000274A4720AE2A8486F5D
S3150001AFB00084EB900025B0C48790002A9B2487933
S3150001AFC000C05D40486F000C4EB900023896486FCC
S3150001AFD00008486F0008486F00084EB9000238ACF7
S3150001AFE048574EB90002662233C00080407E33F9CD
S3150001AFF00080407E0080407C287C00C077D0388568
S3150001B0003E052A7C008040642C7C0080406C7000E8
S3150001B01030071DBC00000800D08022000275F0FF39
S3150001B02018007000 3007D0800275FF0008005247F3
S3150001B0300C47000465D8423900C05D864247027953
S3150001B040F000008040A63039008040A60800000FBD
S3150001B05067F43039008040A602400FFFD1535247B2
S3150001B0600C47001065D83013E84836800255F0FFCA
S3150001B07038BC0001267C0080406 3283C800000002B
S3150001B080600001EC702AC0F900C0547606400080C9
S3150001B09024000FF0255FF0081550C540005663041
S3150001B0A03015E0480240000F0C4000036606 34BC30
S3150001B0B00004601C303C0F00C0553015E0480240CA
S3150001B0C0000F52400240000FE1480255F0FF815542
S3150001B0D04A52660001601CB90002AD9C13FC0001D6
S3150001B0E000C05D86424616BC00FF38BC0001600008
S3150001B0F0012C427900C05D7860064EB90002010656
S3150001B1000C79000800C05D78640A203900C05D1220
S3150001B110C08467E63E3900C05D7ABE790002B1F4AB
S3150001B1206424424010390 0C05D8653400C36001F2E
S3150001B130000064124240103900C05D865340523609
S3150001B1400000600000D8BE790002B1FC63224240D3
S3150001B150103900C05D8653404A36000063124240F2
S3150001B160103900C05D8653405336000060000 0AEC2
S3150001B1703F3C0010610006703E004240101332074A
S3150001B180E04974003401D48206820002B2042042EE
S3150001B190B050631A3207E04974003401D482068242
S3150001B1A00002B2042042102800019113600416BC6B
S3150001B1B000000C470C0063044246600 80C47080077
S3150001B1C06306524642456054 0C47040063360C46FA
S3150001B1D000004633052137E013015E0480240000F2F
S3150001B1E00240000FE14872003207D2810275F0FF7A
S3150001B1F018008175180052470C47000465DA38BCFF
S3150001B2000002601 84A4763125245300553400C400C
S3150001B2100004630642453 8BC000542464A13630CE6
S3150001B2200C54000166064A526700FEC84A136604BA
S3150001B23038BC00054A5266280C540002662261 0099
S3150001B24002B6388008F900060080406 20C540006F8
S3150001B250660434BC00020C540003660434BC0001CD
S3150001B260203900C05D12C084670434BC00034A5211
S3150001B2706700FE120C52000166 0001027C01424782
S3150001B280287C00C05D247200320770003007 19B6B1
S3150001B29018000800D0802400D281068100C05D1804
S3150001B2A0204130B5280052470C47000465D8423981

S3150001B2B000C05D86427900C05D7860064EB9000225
S3150001B2C001060C79000800C05D78640A203900C0C7
S3150001B2D05D12C08467E6303900C05D7A486F000CA4
S3150001B2E002800000FFFF4EB900025B0C48790002A4
S3150001B2F0A9B6486F0010486F00104EB90002389683
S3150001B300486F00084EB9000266223E000C470190C4
S3150001B310631A600852143007E4489E400C4701C284
S3150001B32062F2600E53143007E448DE400C47015EBA
S3150001B33065F2103900804062E80802000000313C07C
S3150001B34000C05D2913D300C05D2823F900C000FAAF
S3150001B35000C05D2A303900C05084907900C0508AFF
S3150001B36033C000C05D2E43EF0010207C00C05D6E2F
S3150001B370700520D951C8FFFC30916002424608B9D8
S3150001B3800006008040620279FC0000804078007966
S3150001B39000640080407830064FEF002A33C000A0D9
S3150001B3A0050A4CDF7CF44E754E714E714E7148E7BD
S3150001B3B01F3E33C000A0050C4FEFFFEC247C00803C
S3150001B3C0407C3C122C7C0080407E3A16267C008014
S3150001B3D040783013024003FF38004243163900C05B
S3150001B3E05D8642472A7C0080406C720032077000FD
S3150001B3F030071FB518000810207C00C05D241BB063
S3150001B40008001800524 70C47000465DE08F90006DB
S3150001B4100080406202 53FC0000530001301 30240D9
S3150001B42003FF524072003200203C01312D004EB91B
S3150001B430000274A4720AE2A8486F00084EB900021D
S3150001B4405B0C48790002A9B2487900C05D40486F9B
S3150001B450000C4EB900023896486F0008486F000884
S3150001B460486F00084EB9000238AC48574EB9000281
S3150001B47066223E003C87348713FC000400C05D86CB
S3150001B4804EB9000201063F3C00646100035A3E00CA
S3150001B490287C00C0547A0C4708A062060C47076056
S3150001B4A06404525460024254348 63C85303C03FFA6
S3150001B4B0C0440253FC00815313C300C05D8608B922
S3150001B4C0000600804062424772003207700030077 2
S3150001B4D01BB71810080052470C47000465EA3014E0
S3150001B4E04FEF001433C000A0050E4CDF7CF84E75FB
S3150001B4F04E714E714E7148E73F3E33C000A00510B4
S3150001B5004FEFFFEC36390080407C34390080407EB5
S3150001B51030390080407802 4003FF3F4000122A7C08
S3150001B52000C05D86424010153F4000107A0308F9BD
S3150001B5300006008040620279FC00008040780079B4
S3150001B540000100804078303900804078024003FFD6
S3150001B55052407200320020 3C01312D004EB90002EA
S3150001B56074A4720AE2A8486F00084EB900025B0C87
S3150001B57048790002A9B2487900C05D40486F000CC5
S3150001B5804EB900023896486F0008486F0008486FA8
S3150001B59000084EB9000238AC48574EB9000266227F
S3150001B5A03E0033C70080407E33C70080407C1ABC12
S3150001B5B00001287C00C05476267C0080406C247CE7
S3150001B5C0008040642C7C00C05D12283C8000000095
S3150001B5D06000018A424010155340 48C0D080027273
S3150001B5E0FF00080042401015534048C00680000283
S3150001B5F0AD9C20404240101553401790 00001E3C60
S3150001B600008060000142424010074 2461C15534625
S3150001B61048C6DC8632326800024100FF80410240A2
S3150001B62000FF42411215534148C1D2810272FF0007
S3150001B6301800817218004279 00C05D7860064EB923
S3150001B640000201060C79000800C05D786406201628
S3150001B650C08467EA3C3900C05D7A424010155340 08
S3150001B66048C0D08006800002B1F42040BC50641C62
S3150001B6704240101553400C33001F0000640E424037
S3150001B680101553405233000060000 0BC42401015B3
S3150001B690534048C0D08006800002B1FC2040BC5017
S3150001B6A0631A424010155340 4A330000630E42406C
S3150001B6B0101553405333000060000 08C3F3C0010CE
S3150001B6C0610001243C000C46080063324240100729
S3150001B6D0464042461C15534648C6DC86323268004F
S3150001B6E0024100FFC041024000FF42411215534191
S3150001B6F048C1D2810272FF00180081721800E20F60
S3150001B700664442411215534148C1D2813032180074
S3150001B710024000FF0C4000FF660A0C54FFFE67243E
S3150001B7205354601C303C00FF42411215534148C13D
S3150001B730D281C0721800660E0C540002670652547C
S3150001B7407A0460027A064A0763104A7900C077D202
S3150001B75066082016C0846700FEAE52150C1500055A
S3150001B76064160C45000366104A7900C077D2660854
S3150001B7702016C0846700FE5E4A7900C077D2670250
S3150001B7807A0733C30080407C33C20080407E303C60
S3150001B79003FFC06F00120279FC00008040788179B6
S3150001B7A00080407 81AAF001108B900060080406297
S3150001B7B0424770003007720032070681 00C05D24DF
S3150001B7C0204110B3080052470C47000465E43005D8
S3150001B7D04FEF001433C000A005124CDF7CFC4E7500
S3150001B7E04E714E714E7148E73F0433C000A00514F7
S3150001B7F0558F342F00224243 38037C0033C400C0E6
S3150001B8005D7860064EB9000201060C79000800C099
S3150001B8105D78640A0839000700C05D1267E6424593
S3150001B8202A7C008040A6607002 55F0004247600203
S3150001B83052470C47EA6064083015080000 0F67F0AC
S3150001B8400C47EA5F620A300390440C400400630629
S3150001B8507C003A0260403E3C0FFF301502400FFF6C
S3150001B860907900C054740640080042411 23900C064
S3150001B8705D863E80700AE169D257CE41B6476504BE
S3150001B8804A4566023607B84762044A4566023807E2
S3150001B89070003007DC805245BA42658C4A42660424
S3150001B8A07C006010700030022200 20064EB90002B2
S3150001B8B074A42C003006548F33C000A005164CDF4B
S3150001B8C020FC205F548F4ED04E714E714E7133C0A5
S3150001B8D000A005184A7900C077D26616227C00C0FE
S3150001B8E05478321153514A41660833FC000300C0B3
S3150001B8F077D233C000A0051A4E754E714E714E7146
S3150001B90048E70F3E33C000A0051C2A7C00C05D86B7
S3150001B9104240101553400240FFFC6600010C287C92
S3150001B92000080406C424010155340 48C0068000021A
S3150001B930AD9C204042401015534019900000 4245ED
S3150001B940267C00C05D12283C80000000247C00C0DB
S3150001B9505D782C7C0002AFF4600000C042526006A4
S3150001B9604EB9000201060C520008640620 13C08479
S3150001B97067EE3E3900C05D720C15000166263039 4E
S3150001B98000C077CAE84872003200D28120013C36F5
S3150001B99008003007E84872003200D28120019C7607
S3150001B9A00800602C303900C077CAE84872003200BE
S3150001B9B0D28106810002ADF420413C103007E848EF
S3150001B9C072003200D28106810002ADF420419C5002
S3150001B9D04240101553404247 1E340000DE46303CBB
S3150001B9E0FFE0C04767164A466F047E1F60024207A2
S3150001B9F0424010155340198700 00600A4240101555
S3150001BA005340198700000C46FFFF670A4A4667063E
S3150001BA100C46000166027A0A52450C45000A640882
S3150001BA2002013C0846700FF3633C000A0051E4CDF1B
S3150001BA307CF04E754E714E714E7148E73F3E33C0F4
S3150001BA4000A005204FEFFFD67401227C00C05D6E79
S3150001BA5041EF0010700520D951C8FFFC309108B99B
S3150001BA60000400C05D8513FC000700C05D874239F4
S3150001BA7000C05D862C7C0080406208D60006021656
S3150001BA8000CF303C03FFC0420279FC0000804078C1
S3150001BA908179008040783039008040780240 03FF88
S3150001BAA0D04272003200203C01312D004EB9000215
S3150001BAB074A4720AE2A8486F00084EB900025B0C32
S3150001BAC048790002A9BA487900C05D40486F000C68
S3150001BAD04EB900023896486F0008486F0008486F53
S3150001BAE000084EB9000238AC48574EB9000266222A
S3150001BAF03E003C0733C60080407E33C60080407C52
S3150001BB0070003007D080720032074EB900027B58B0
S3150001BB107214E2A026003F034EB90001B7E63800D1
S3150001BB203E022A7C00C05D24287C00804064267C7D
S3150001BB3000C0547C247C00C05D122A3C80000000B9
S3150001BB406000016E303CFFFFD04772003200 2001D9
S3150001BB50323CFFFFD2477C003C0106860080406CE8
S3150001BB60204610B5080013C700C05D866100FD922E
S3150001BB703F034EB90001B7E636803C3C0FFF9044C7
S3150001BB8006400800CC400C460500650A0C460B0031

S3150001BB9062044A53660842427E05600001140C465F
S3150001BBA007C065080C460840630000AE0C46080055
S3150001BBB06450303CFFFFD04772003200D2813034EE
S3150001BBC01800024000FF0C4000FF6436303CFFFFC6
S3150001BBD0D04772003200D28130341800024000FF93
S3150001BBE05240024000FF323CFFFFD2477C003C013D
S3150001BBF0DC8622060274FF001800817418006000BA
S3150001BC0000B00C460800650000A8303CFFFFD04795
S3150001BC1072003200D28130341800024000FF4A40DF
S3150001BC206300008E303CFFFFD04772003200D281A4
S3150001BC3030341800024000FF5340024000FF323CFE
S3150001BC40FFFFD2477C003C01DC8622060274FF001E
S3150001BC5018008174180060583813303CFFFFD04734
S3150001BC6072003200D28130341800024000FF0240D7
S3150001BC7000FF323CFFFFD2477C003C01DC86068692
S3150001BC8000C05D1820460250FF008150303CFFFF86
S3150001BC90D0477200320006810080406C2041303C62
S3150001BCA0FFFFD0477200320020011B900800524767
S3150001BCB00C47000564082012C0856700FE884239DA
S3150001BCC000C05D86427900C05D7860064EB900020B
S3150001BCD001060C79000800C05D7864062012C08553
S3150001BCE067EA303900C05D7A486F000C02800000B7
S3150001BCF0FFFF4EB900025B0C48790002A9BE486FEE
S3150001BD000010486F00104EB900023896486F0008BF
S3150001BD104EB9000266223E000C470190632060087E
S3150001BD2052153007E4489E400C4701C2631C20129D
S3150001BD30C085661660EA53153007E448DE400C47B5
S3150001BD40015E64062012C08567EC0896000610168F
S3150001BD50E8080200000313C000C05D2913F9008042
S3150001BD60406300C05D2823F900C000FA00C05D2AC7
S3150001BD70303900C05084907900C0508A33C000C069
S3150001BD805D2E43EF0010207C00C05D6E700520D94A
S3150001BD9051C8FFFC30910279FC000080407800799F
S3150001BDA000064008040783O024FEF002A33C000A0C3
S3150001BDB005224CDF7CFC4E754E714E714E7133C0BF
S3150001BDC000A0052433C000A005264E754E714E71A4
S3150001BDD04E7148E7073C33C000A005284FEFFFE648
S3150001BDE047EF00122A4B2C3900804074287C00C092
S3150001BDF0547E4A866C087A012E06448760044245C1
S3150001BE002E064A45670000A6224C204B20D92091D8
S3150001BE10204D20390002A9C222072C022401C4C0E8
S3150001BE20D5A800044282D582D590240148424840D3
S3150001BE30C4C0D5902401C4C048404841C0C1428114
S3150001BE40D480D3814841484232024242D5A80004F7
S3150001BE502410D58120822406224B204C20D9209102
S3150001BE60204D20390002A9C622072C022401C4C094
S3150001BE70D5A800044282D582D59024014842484083
S3150001BE80C4C0D5902401C4C048404841C0C14281C4
S3150001BE90D480D3814841484232024242D5A80004A7
S3150001BEA02410D58120822406600000A2224C204B5A
S3150001BEB020D92091204D20390002A9C222072C0247
S3150001BEC02401C4C095A800044282D582959024011C
S3150001BED048424840C4C095902401C4C048404841E6
S3150001BEE0C0C14281D480D381484148423202424294
S3150001BEF095A800042410958120822406224B204C0B
S3150001BF0020D92091204D20390002A9C622072C02F2
S3150001BF102401C4C095A800044282D58295902401CB
S3150001BF2048424840C4C095902401C4C04840484195
S3150001BF30C0C14281D480D381484148423202424243
S3150001BF4095A80004241095812082240062E132A7CAC
S3150001BF5000C05486BEB900C0548C6508BEB900C085
S3150001BF60548863703F3C00224240103900804070 83
S3150001BF705240486F000A48C04EB900025AEC486F59
S3150001BF80000A487900C049EA486F000E4EB900021E
S3150001BF9038964879 0002A9CA486F000A486F000A14
S3150001BFA04EB9000238AC204F2F28000243EF00148F
S3150001BFB04EB90002631C486F000E4EB9000266229C
S3150001BFC0288042B900C054822E141ABC001442398A
S3150001BFD000C0548733C70080407220077210E2A860
S3150001BFE013C0008040714A3900C000FD660261221B
S3150001BFF04A1563085315423900C054874FEF001A9A
S3150001C00033C000A0052A4CDF3CE04E754E714E71DF
S3150001C0104E7133C000A0052C4FEFFFEA3F3C0022D2
S3150001C020424010390080407052404 86F000E48C0AF
S3150001C0304EB900025AEC48790002A9CE487900C0EF
S3150001C04049EA486F00124EB900023896486F000E51
S3150001C050486F000E486F000E4EB90002389648 79B7
S3150001C0600002A9CA486F000A486F000A4EB90002C9
S3150001C07038AC204F2F28000243EF00184EB90002BA
S3150001C080631C486F00124EB9000266223C000C02D
S3150001C09054883F3C002242401039008040705 24093
S3150001C0A0486F000E48C04EB900025AEC48790002AA
S3150001C0B0A9D2487900C049EA486F00124EB9000278
S3150001C0C03896486F000E486F000E486F000E4EB945
S3150001C0D0000238964879 0002A9CA486F000A486FDB
S3150001C0E0000A4EB9000238AC204F2F28000243EF58
S3150001C0F000184EB90002631C486F00124EB90002C7
S3150001C100662223C000C0548C4FEF001633C000A036
S3150001C110052E4E754E714E714E7148E7070433C0B8
S3150001C12000A005304FEFFFEE13FC001700804070B2
S3150001C1303F3C0022424010390080407052 40486F17
S3150001C140000A48C04EB900025AEC486F000A487905
S3150001C15000C049EA486F000E4EB9000238964 87988
S3150001C1600002A9CA486F000A486F000A4EB90002C8
S3150001C17038AC204F2F28000243EF00144EB90002BD
S3150001C180631C486F000E4EB9000266223C000C030
S3150001C190547E42B900C054822C3900C0547E13FC2F
S3150001C1A0001400C054866100FE6A700023C000803E
S3150001C1B040742A7C008040102015E0882E00700310
S3150001C1C0C0957218E3A8DE802A0760102015E08862
S3150001C1D02E007003C0957218E3A8DE8008390007A7
S3150001C1E00080402466102007908502800 3FFFFFF30
S3150001C1F07203B08165D633C6008040722006721084
S3150001C200E2A813C00080407108B9000700804024ED
S3150001C2104FEF001233C000A005324CDF20E04E750F
S3150001C2204E714E714E7148E73F3E33C000A0053452
S3150001C2304FEFFFE82A7C00C05D122ABC0002000015
S3150001C24033FC003B00C05D0A287C00C061AA2C3C7F
S3150001C25080000000267C00C05E96247C0002010658
S3150001C2602C7C00C05D16263C00100000243C801189
S3150001C270E080303C0FFFC07900C05E84662A3F39FA
S3150001C28000C0983C4EB900017E1402B00000FFFFF9
S3150001C29080FC0FA0484002400FFF0279F00000C069
S3150001C2A05E84817900C05E842015C08667226002A3
S3150001C2B04E920839000700E002566714083900065 5
S3150001C2C000E00256670A0839000700C0950C67E0CE
S3150001C2D0089500070C79003C00C05D0A623A0839EE
S3150001C2E0000300E00256660808AD0007000360205F
S3150001C2F00839000700E0025666160 8ED000700033C
S3150001C300023900 0F00C05E9313FC000100C05E926B
S3150001C31033FC038400C05D0A879508ED0006000220
S3150001C320424760044E9252470C470064640C201544
S3150001C330C08367062015C08667EA2015C083670E8D
S3150001C34008AD0004000108ED00060001600608AD15
S3150001C350000600010 82D0001000167584 2473A070F
S3150001C360CAFC004C227C0002AC6CD3C5207C00C008
S3150001C3707694D1C5701220D951C8FFFC78003807D0
S3150001C3802004D080D084E788068000E001E0224 0C6
S3150001C390207C00C07694D1C5700520D951C8FFFC18
S3150001C3A052470C47000365B608AD00010001009530
S3150001C3B00000C000082D00060002671A4EB90001F0
S3150001C3C0DB200C80000003846306 08ED00000001F9
S3150001C3D008AD00060002082D0000000167 6C4EB989
S3150001C3E00001BA3A4A40660808ED000700026008F3
S3150001C3F033FC000100C077D2227C00C05D1841D712
S3150001C400700520D951C8FFFC43D742401016 3200AF
S3150001C410C2FC004C068100C076942041700520D9EB
S3150001C42051C8FFFC7E001E1643D72007D080D08757
S3150001C430E788068000E001E0204070052 0D951C858
S3150001C440FFFC08AD00000001879508 2D00070002DA
S3150001C450670002D24EB90001AF0C4A406754227CF4
S3150001C46000C05D1841D7700520D951C8FFFC43D7DC

S3150001C4704240101632 00C2FC004C068100C0769480
S3150001C4802041700520D951C8FFFC7E001E1643D7F6
S3150001C4902007D080D087E788068000E001E02040B1
S3150001C4A0700520D951C8FFFC879508AD000700012A
S3150001C4B0601E08ED000700010C16000365084239ED
S3150001C4C000C05D17600A101652001 3C000C05D1748
S3150001C4D0029500007FFF6000024C08150002670C00
S3150001C4E0610009126100098A08950002082D0007FA
S3150001C4F00003670001044EB90001AEB2423900C023
S3150001C5005E9426B900C05D3823F900C0983A00C090
S3150001C5105E864247600000C80C4700146200008E28
S3150001C5207000303900C05D0A2213EC8906810000D3
S3150001C530000AB0816576610008BC610009346100BA
S3150001C54009E23880700DC02C000166044A54666009
S3150001C550082C00020001670826B900C05D38600694
S3150001C56026B900C05D3C4A5467060C540001662E8C
S3150001C570303900C06080720CE2680240000F720020
S3150001C5803200E58906810002AA3A224120514E90E5
S3150001C590815467060C540001660461000BE2082D04
S3150001C5A0000300036734029 5FFFFFF378D95602A6C
S3150001C5B00C540002662408 2D0006000366164A166E
S3150001C5C057C04400488013C000C05D170095800025
S3150001C5D04000600626B900C05D3852474E92082DCC
S3150001C5E00007000367000 13C203C8001D800C0958C
S3150001C5F06600013060 00FF22082D00050002671663
S3150001C6000C79003C00C05D0A6306610001446006C6
S3150001C6108D9538EC0100082D00040002670000D684
S3150001C62008D500014EB90001DBDA082D000200022F
S3150001C630674C3F3C00004EB90001DDBE4879A51E9E
S3150001C640BD9161000C762F3900C05E8661000C6CCD
S3150001C6502F3900C05E8661000C063F0061000CA800
S3150001C66008150000 67562F3900C05E8A61000C4C20
S3150001C6702F3900C05E8A61000BE63F00603A3F3CFD
S3150001C68000004EB90001DDBE4879A51EBD916100CD
S3150001C6900C2A082D0001000267064878FFFF600298
S3150001C6A042A761000C16082D0001000267063F3CF7
S3150001C6B0FFFF60043F3C000061000C4C4EB90001D5
S3150001C6C0DE0860024E922015C08267F80295FCFFD3
S3150001C6D0FBFF60024E92303900804008 0800000ED0
S3150001C6E06710203C00200030C09567062015C086E3
S3150001C6F067E28D95082D000300026726227C000261
S3150001C700A9D6207C00C07170700820D951C8FFFCE1
S3150001C7104EB90001E0AC60024E922015C08267F866
S3150001C7208D954E92203C8003C000C0956700FDACFC
S3150001C7300295FCFFC3FF6000FB3A4FEF001833C0C0
S3150001C74000A005364CDF7CFC4E754E714E714E7164
S3150001C7502F0D33C000A005386100069A610007124B
S3150001C7602A7C00C05D1208ED0005000223F900C015
S3150001C7705D3400C05E9623F900C05E8200C06FC2C0
S3150001C780303900C05E82720CE2680240000F72000E
S3150001C7903200E58906810002A9FA224120514E9014
S3150001C7A008AD0005000208ED0004000160064EB95F
S3150001C7B000020106082D0004000167060815 00079E
S3150001C7C067EC303900C061AA33C000A0053A2A5F80
S3150001C7D04E754E714E714E7133C000A0053C303C12
S3150001C7E00FFFC07900E001DE0279F00000C05E842F
S3150001C7F0817900C05E8423F900C0983A00C05E8644
S3150001C80033C000A0053E4E754E714E714E7133C058
S3150001C81000A0054033C000A005424E754E714E7111
S3150001C8204E7133C000A0054433C000A005464E75C5
S3150001C8304E714E714E7133C000A00548303900C0AB
S3150001C8405E8402400FFF33C000E001DE33C000A06A
S3150001C850054A4E754E714E714E7133C000A0054C9E
S3150001C8600279FF0000C06FC208F9000000C06FC363
S3150001C8706100090C610006AC33C000A0054E4E757F
S3150001C8804E714E714E7133C000A0055023F900C0A0
S3150001C89060800 0C06FC20279FF0000C06FC208F954
S3150001C8A0000100C06FC323F900C0983A00C06FC6EB
S3150001C8B0424033C000A005524E754E714E714E7105
S3150001C8C033C000A00554424033C000A005564E7542
S3150001C8D04E714E714E7133C000A00558424033C0AF
S3150001C8E000A0055A4E754E714E714E712F0733C019
S3150001C8F000A0055C0279FF0000C06FC20079000349
S3150001C90000C06FC223F900C05E8E00C06FCA23F952
S3150001C91000C05E8A00C06FC661000864610006043B
S3150001C9203E0033C000A0055E2E1F4E754E714E713E
S3150001C9304E7148E7010C33C000A00560287C00C099
S3150001C9406FC2227C00C06080204C20D920D9209162
S3150001C9502F3900C06FC6610009E82A404A80672462
S3150001C960487900C06FCE2F3900C06FCA2F0D610004
S3150001C9700A203E007003D047024000FF0254FF0028
S3150001C9808154600E0254FF000054000342B900C0F6
S3150001C9906FCA424033C000A005624CDF30804E753D
S3150001C9A04E714E714E7133C000A00564610007D00F
S3150001C9B06100057033C000A005664E754E714E715B
S3150001C9C04E7133C000A00568424033C000A0056A1D
S3150001C9D04E754E714E714E7133C000A0056C0279D1
S3150001C9E0FF0000C06FC208F9000100C06FC323F940
S3150001C9F000C05E8A00C06FC661000784610005241D
S3150001CA0033C000A0056E4E754E714E714E712F0DDD
S3150001CA1033C000A005702F3900C06084610009226F
S3150001CA202A4023DD00C06FC623D500C06FCA23F993
S3150001CA3000C0608000C06FC20279FF0000C06FC2F3
S3150001CA40007900030 0C06FC2424033C000A00572E6
S3150001CA502A5F4E754E714E714E7133C000A005743A
S3150001CA600279FF0000C06FC20079000300C06FC2E7
S3150001CA7023F900C05E8A00C06FC623F900C05E8E2E
S3150001CA8000C06FCA610006F86100049833C000A0B7
S3150001CA9005764E754E714E714E712F0D33C000A045
S3150001CAA005782F3900C06084610008962A4023D595
S3150001CAB000C06FC623F900C0608000C06FC2027952
S3150001CAC0FF0000C06FC208F9000100C06FC34240F9
S3150001CAD033C000A0057A2A5F4E754E714E714E71B4
S3150001CAE033C000A0057C0279FF0000C06FC208F9BF
S3150001CAF0000000C06FC361000686610004263 3C0D2
S3150001CB0000A0057E4E754E714E714E7148E7010CBF
S3150001CB1033C000A0058023F900C0608000C06FC249
S3150001CB200279FF0000C06FC208F9000200C06FC39E
S3150001CB300839000000C06FC8266600839000100C045
S3150001CB405E8267047E1060024247303900C05E840F
S3150001CB50720CE2680240000FD0473200C2FC02E4C8
S3150001CB60068100C04D6A28412A7C00C06FC6424733
S3150001CB703F072F0C4EB900013A9641EC01BE300732
S3150001CB8048C0E588D1C02F10224D4EB9000180C49E
S3150001CB905247548D0C4700066DD6424033C000A063
S3150001CBA005824CDF30804E754E714E714E7133C029
S3150001CBB000A00584610005C86100036833C000A0B8
S3150001CBC005864E754E714E714E7133C000A00588B3
S3150001CBD0424033C000A0058A4E754E714E714E71AA
S3150001CBE033C000A0058C610005966100033633C091
S3150001CBF000A0058E4E754E714E714E7133C000A068
S3150001CC00059042 4033C000A005924E754E714E719B
S3150001CC104E7133C000A00594610005646100 0304F0
S3150001CC2033C000A005964E754E714E714E7133C0DC
S3150001CC3000A00598424033C000A0059A4E754E717A
S3150001CC404E714E7133C000A0059C0279FF0000C0F1
S3150001CC506FC208F9000100C06FC323F900C05E86E8
S3150001CC6000C06FC6610005186100 02B833C000A09C
S3150001CC70059E4E754E714E714E7133C000A005A0D2
S3150001CC804241203900C05E86B0B900C060846704A5
S3150001CC907208605630 3CF000C07900C06082663090
S3150001CCA0227C00E001DE303900C0608202400FFFC5
S3150001CCB0328002400FFF0279F00000C05E84817964
S3150001CCC000C05E84303900C05E8402400FFF3280AE
S3150001CCD023F900C0608000C06FC20279FF0000C066
S3150001CCE06FC208F9000100C06FC3300133C000A054
S3150001CCF005A24E754E714E714E7133C000A005A44A
S3150001CD00610004 7C6100021C33C000A005A64E75BB
S3150001CD104E714E714E7133C000A005A8700133C02B
S3150001CD2000A005AA4E754E714E714E7133C000A01A
S3150001CD3005AC6100044A610001EA33C000A005AEFA
S3150001CD404E754E714E714E7133C000A005B0700123

S3150001CD5033C000A005B24E754E714E714E7133C08F
S3150001CD6000A005B461000418610001B833C000A039
S3150001CD7005B64E754E714E714E7133C000A005B8A1
S3150001CD80700133C000A005BA4E754E714E714E71D9
S3150001CD9033C000A005BC610003E66100018633C013
S3150001CDA000A005BE4E754E714E714E7133C000A086
S3150001CDB005C0700133C000A005C24E754E714E719B
S3150001CDC04E7133C000A005C4610003B46100015473
S3150001CDD033C000A005C64E754E714E714E7133C0FB
S3150001CDE000A005C8700133C000A005CA4E754E717A
S3150001CDF04E714E7148E7010433C000A005CC2A7C70
S3150001CE0000C05D1260064EB9000201060815000653
S3150001CE1067060815000466EE227C0002AA9A207CA9
S3150001CE2000C0607C706B20D951C8FFFC309142472D
S3150001CE30227C0002AA9A3007C1FC01B2068000C01A
S3150001CE40622E2040706B20D951C8FFFC30915247A9
S3150001CE500C4700086DDA33FC000200C061AA33C03A
S3150001CE6000A005CE4CDF20804E754E714E714E717D
S3150001CE7033C000A005D060064EB90002010608398C
S3150001CE80000600C05D12670A0839000300C05D1282
S3150001CE9066E6227C0002AA9A207C00C06FBE706BF7
S3150001CEA020D951C8FFFC309133C000A005D24E7580
S3150001CEB04E714E714E7148E7010C33C000A005D486
S3150001CEC02A7C00C05D122E3C200000008F95287C34
S3150001CED000C05D0E28B900C05E9660064EB900021C
S3150001CEE001062015C087670A4A94630608150007DC
S3150001CEF067EA4A94630A2015C0876604424760OEB2
S3150001CF000815000767063E3C010060027E023007F5
S3150001CF1033C000A005D64CDF30804E754E714E7180
S3150001CF204E7148E73F3E33C000A005D84FEFFFF6EC
S3150001CF30287C00C05D12247C00C061AA0814000789
S3150001CF40660002184EB90001E0AC6100FF6A0C40B0
S3150001CF500100670001FE4A40670C0C4000026700B1
S3150001CF6001F8600001F642477C01780136073A0371
S3150001CF70267C00C0619C4DEF0008600001784EB927
S3150001CF800002010630390OC06076B04664243039AB
S3150001CF9000080400808000000E6718082C00000003F6
S3150001CFA067104A466F0C0C4600286C0608140007E9
S3150001CFB067CC4A4366164A4567127003083700047O
S3150001CFC0080067080C4700036D02760142562A7C69
S3150001CFD000C0622E426F00046000010830O748C09D
S3150001CFE0E5882F3508046100027641ED00C4340757
S3150001CFF048C2D482D1C23210B240670A08ED00029B
S3150001D000012F600000B04A43670489AD01204A45FB
S3150001D0106646302D0004024000FF3C00302D00041E
S3150001D020720CE2680240000F3F400006082C000720
S3150001D030000367047400600274012002ED88068013
S3150001D04000C09890322F000648C1E589D081204062
S3150001D0502E9023D500C0607C082D00030004670CC8
S3150001D06008ED0000012F08EA000000014A6F0004E4
S3150001D0706642524530O748C0E588320748C1E5890E
S3150001D080068100C06080204120B5080443ED00C43C
S3150001D090300748C0D080D3C0300748C0D080068052
S3150001D0A000C06140204030913F7C000100044A43AA
S3150001D0B0670289934A6F0004671252B900C006508D
S3150001D0C023F900C000FA00C0064C601052B900C036
S3150001D0D0066023F900C000FA00C0065C52564BED0B
S3150001D0E001B20C5600086C08081400076700FEEE32
S3150001D0F05247E7ACBE466C08081400076700FE8677
S3150001D10008140007664C700308370000408006712OC
S3150001D1102F132F3900C05E8E610002C423C000C0E8
S3150001D12061A042477003083700000800671A3039CA
S3150001D13000C05E8402400FFF323900C0608202 41A6
S3150001D1400FFFB04167027E08BA46670E08C70002A4
S3150001D15060083E3C010060027E020814000667O476
S3150001D16008D40004348730074FEF000A33C000A00B
S3150001D17005DA4CDF7CFC4E754E714E714E7148E7F7
S3150001D180031C33C000A005DC23FCA51EBD9100C015
S3150001D1906FBE287C00C05D120814000667040 8D41F
S3150001D1A00034EB90001DBDA3F3C00004EB9000135
S3150001D1B0DDBE2F3900C06FBE610001002A7C00C0B0
S3150001D1C06FC24247267C00C070822C3C8000000062
S3150001D1D060262F15610000E42F1D610000823207D1
S3150001D1E048C1D28137801800300748C0D0803F330C
S3150001D1F008006100011252473O3900C06FC2024077
S3150001D20000FFBE4064062014C08667C64EB9000101
S3150001D210DE08082C00070003660E08EC0002000376
S3150001D22060064EB9000201062014C086661E4A79C0
S3150001D23000C05D8C63163039008040080800000E7E
S3150001D240670A203C00200030C09466D633C000A097
S3150001D25005DE4CDF38C04E754E714E714E7148E792
S3150001D2601F0033C000A005E02C2F0018383C00FF3A
S3150001D27042473A0742431606DE473F034EB90001CD
S3150001D2804ED88E40B744E08E52450C4500046DE4FD
S3150001D29070003007D08006800002AA7A20403E1036
S3150001D2A08E44300733C000A005E24CDF00F8205F52
S3150001D2B0588F4ED04E714E714E7148E7030033C000
S3150001D2C000A005E452B900C0066823F900C000FABF
S3150001D2D000C006642E2F000C4246424010073F0054
S3150001D2E04EB90001DDBEE08F52460C4600046DEAE0
S3150001D2F033C000A005E64CDF00C0205F588F4ED03A
S3150001D3004E714E714E712F0733C000A005E83E2FB6
S3150001D310000842401007 3F004EB90001DDBEE04F54
S3150001D32042401007 3F004EB90001DDBE33C000A0E8
S3150001D33005EA2E1F205F548F4ED04E714E714E71ED
S3150001D34048E7000C33C000A005EC302F000C720C2E
S3150001D350E2680240000F72003200E589068100C0D2
S3150001D3605CCA20412A50200D670C204F2F28000C43
S3150001D3704E952840600299CC200C33C000A005EEE2
S3150001D3804CDF3000205F588F4ED04E714E714E717A
S3150001D39048E7050033C000A005F0206F0014226F96
S3150001D3A0000C42452009671C7E013205202F001022
S3150001D3B0C087670420D152455241DE8758890C4106
S3150001D3C000206DE8300533C000A005F24CDF00A057
S3150001D3D0205F4FEF000C4ED04E714E714E7148E7F3
S3150001D3E0030033C000A005F4222F00107C007E014B
S3150001D3F0202F000CC087670A0801000067028C878E
S3150001D400E289DE8766EA200633C000A005F64CDF16
S3150001D41000C0205F508F4ED04E714E714E7148E75D
S3150001D420050033C000A005F8206F000C226F001420
S3150001D43042452009671C7E013205202F0010C08756
S3150001D440670422985245 5241DE8758890C410020D3
S3150001D4506DE8300533C000A005FA4CDF00A0205F5F
S3150001D4604FEF000C4ED04E714E714E7148E7C3FC22
S3150001D47033C000A005FC287C0080400008AC0007F2
S3150001D480007B2A7C00C05D12247C00C05D8C082DC7
S3150001D4900004000367542 67C00C05D8A3013B05235
S3150001D4A0651CB052663C08150001672808150000 86
S3150001D4B0670804400000C368060045D4036807000C9
S3150001D4C03013068000C05D8E2040195000A35253D0
S3150001D4D060000178197C000000A336BC00F06000F2
S3150001D4E0016A6100088600 0015E082D00050001DF
S3150001D4F067146100071A08ED00050003 08AD000571
S3150001D5000001600014608 2D00050003672 00C524A
S3150001D51000F0671008AD0005000308ED00040003E4
S3150001D52060000128197C000000A36000011E082D7F
S3150001D53000040001671A082D000000036704 61005A
S3150001D5400BBA610008E208AD00040001600000FCAE
S3150001D550267C00C05CC2082D00020001671A4253F6
S3150001D560082D00020003670000E261000AA6029589
S3150001D570FFFBFFFB600000D4082D00020003670ECD
S3150001D58061000A9008AD00020003600000BE082D8C
S3150001D5900000000367 0000B00839000000C05D61AB
S3150001D5A0660E0839000300C05D61660442476008E3
S3150001D5B042471E3900C05D314240102C007A0240BC
S3150001D5C0000F4241123900C05D4ED247B041671487
S3150001D5D008AD0000000308ED0002000108ED00029D
S3150001D5E0000360664246 1C3900C05D31207C0002A2
S3150001D5F0B2441E306000488760445253 0C53020007
S3150001D6006D024253301348C0E588068000C0549A23
S3150001D6102A4041EC0080300748C0D080D1C03A9002
S3150001D62041EC0090300748C0D080D1C03B50000289

S3150001D630207C0002B248103060004880DE400C4772
S3150001D64000086DB66004610007DE4A7900C07B54AC
S3150001D650660833FC000100C07B5433C000A005FE00
S3150001D6604CDF3FC34E734E714E714E7148E7033E18
S3150001D67033C000A00600598F267C00C05D12247CB1
S3150001D68000C05CC42C3C200000002013C08667004B
S3150001D69003762A7C00C05D0E4A956700036A53959E
S3150001D6A06000036452520C5202006D0242524A3922
S3150001D6B000C0607A6316523900C0607B0C390007DE
S3150001D6C000C0607B6306423900C0607B2C7C00C0D1
S3150001D6D0549A301248C0E588D08E2A4070F8D0524C
S3150001D6E0024001FF48C0E588D08E2840301590548D
S3150001D6F033C000C05CBA302D0002906C000233C00A
S3150001D70000C05CBC30127200123900C05D31068166
S3150001D7100002B24C2041121048819041024001FFA3
S3150001D72048C0E588D08E28403015905433C000C0DB
S3150001D7305CBE302D0002906C000233C000C05CC09C
S3150001D740227C00C05492207C00C05496428030391D
S3150001D75000C05CBE6C024440D191C0C0D1904280F1
S3150001D760303900C05CC06C024440D191C0C0D19038
S3150001D770082B00000026750082B00030001670810
S3150001D7803E3900C05CBE60063E3900C05CBA2A7CE8
S3150001D79000C05CC770001015E988068000C071944E
S3150001D7A07207C25248C1D281D081204030877007AA
S3150001D7B0C02A00010C000007660E52150C15004028
S3150001D7C065060293FFF7FEFF700FC02A0001667A15
S3150001D7D0203900C05496E88823C000C05D802A7CA9
S3150001D7E000C05D7C203900C05492E8883A804A40E6
S3150001D7F0631A203900C05D80720032154EB90002ED
S3150001D80074A4D081E28833C000C05D7E42B900C0F5
S3150001D810549642B900C054920839000100C05D8592
S3150001D8206728303900C05D7ED0403E002A7C00C0AA
S3150001D8305D403B47000A3B47000C33ED000A008080
S3150001D84040A833ED000C008040AA7007C052320098
S3150001D850C3FC01B2068100C0622E2A41287C00C0A9
S3150001D86060762C7C00C060702013C086670000982B
S3150001D8702015E2882A807007C03900C05CC51B40AC
S3150001D88001304A7900C05CBA6F0408D500070C95CF
S3150001D890A51EBD916618523900C0607A103900C0C4
S3150001D8A0607A5300661633D200C06078600E4A393A
S3150001D8B000C0607A630608ED0001012F4A3900C0F5
S3150001D8C0607A630001420C39000700C0607B660084
S3150001D8D001360893000570012C80427900C06074FE
S3150001D8E042544A3900C0607A52C04400488002401E
S3150001D8F00001EF4808B9000700C05D85817900C0C5
S3150001D9005D84600001024A96674A0C960000000198
S3150001D910660A70003014E58842B508044A7900C0E9
S3150001D9205CBA6F0C221670003014E58883B50804C2
S3150001D9300C39000700C0607B660000CC2016D08041
S3150001D9402C804A80660000C033FC000100C0607470
S3150001D950600000B44A7900C06074670000A80C79C1
S3150001D960000100C06074660E41ED00C47000301401
S3150001D970D080D1C042504A7900C05CBA6F143039A8
S3150001D98000C0607441ED00C472003214D281D1C16D
S3150001D990815008130001673408130000662E2F2DED
S3150001D9A000044EB90001D25E322D00C4B240661C9D
S3150001D9B0202D0004B0B900C05E8A6610301248C03E
S3150001D9C0E588068000C07174204052900C3900072A
S3150001D9D000C0607B6630E3F900C0607466287001A0
S3150001D9E02C80081300016710081300006618D1B9CE
S3150001D9F000C071704254600E5254301453400C40B2
S3150001DA00002865028D933039008040080800000E19
S3150001DA106714082B00000003670C3012B07900C0B0
S3150001DA205CC26600FC80588F33C000A006024CDF42
S3150001DA307CC04E754E714E714E712F0D33C000A0D4
S3150001DA4006042A7C00C05D0A0C550005640808F925
S3150001DA50000700C05D124A55632A53554A556312A1
S3150001DA604A7900C07B52661C33FC000100C07B5220
S3150001DA70601242A73F3C00003F3C001D4EB900002A
S3150001DA8071EA4E4033C000A006062A5F4E754E71FC
S3150001DA904E714E7133C000A0060833C000A0060ABD
S3150001DAA04E754E714E714E7133C000A0060C227C2C
S3150001DAB000C0CEF422BC00C0D2F82051213C0001A6
S3150001DAC0C226228890FC002C228833C000A0060EB4
S3150001DAD04E754E714E714E7133C000A0061033C0A3
S3150001DAE000A006124E754E714E714E7133C000A0E4
S3150001DAF0061408B900020080407B0239003F00800D
S3150001DB0040A208F90007008040A208F9000200803F
S3150001DB10407B33C000A006164E754E714E714E7194
S3150001DB2048E7011C33C000A006182A7C00C05D1717
S3150001DB30287C00C05D16267C00C076941014B015B2
S3150001DB40671C227C00C05D18424112003001C0FCF6
S3150001DB50004CD08B2040701220D951C8FFFC7E00AA
S3150001DB601E152007D080D087E788068000E001E0F7
S3150001DB702240424010153200C2FC004CD28B20419B
S3150001DB80700520D951C8FFFC424010153200C2FC75
S3150001DB90004CD28B2241207C00C05D18701220D926
S3150001DBA051C8FFFC1895700FC014023900F000C06F
S3150001DBB05E93813900C05E93610003E8203900C09D
S3150001DBC000FA90B900C05D2A33C000A0061A4CDFE6
S3150001DBD038804E754E714E714E7133C000A0061CD1
S3150001DBE06100053C427900C05D88427900C05D8ACA
S3150001DBF033FC00F000C05D8C08F9000500C05D1320
S3150001DC0033C000A0061E4E754E714E714E7148E727
S3150001DC10011833C000A00620267C00C05D621039C1
S3150001DC2000C05D5E1213E80902010003D001020083
S3150001DC30000F021300F0811333F900C05D6000800C
S3150001DC40404A287C00C05D5033EC00040080407CD3
S3150001DC5033EC00060080407E303C03FFC06C0008B8
S3150001DC600279FC000080407881790080407833ECAD
S3150001DC70000A008040A833EC000C008040AA43EC67
S3150001DC80000F1011EA080200000142411200024190
S3150001DC9000010279FFFE008040A48379008040A440
S3150001DCA01011E80802000001424112000241000180
S3150001DCB0E9490279FFEF008040A48379008040A4FE
S3150001DCC01011E2080200000102000001D00008B9AB
S3150001DCD000010080407B81390080407B103900C003
S3150001DCE05D5E1213E80902010003D00113C0008032
S3150001DCF0407A227C008040A21013EC080200000347
S3150001DD0002000003ED080211003F8111207900C0D5
S3150001DD10985C30280002080000C67047E0360024C
S3150001DD207E027003C007ED080211003F8111101336
S3150001DD30E8080200000302000003E908021100CF0F
S3150001DD40811110130200000F0200000F021100F0F2
S3150001DD50811108F900000080407B33C000A0062233
S3150001DD604CDF18804E754E714E714E7133C000A056
S3150001DD7006240239003F008040A208F9000700800E
S3150001DD8040A20279FC00008040780079006400809E
S3150001DD90407813FC00020080407A08B90000008038
S3150001DDA0407B08B9000400C05D15427900C05D8C56
S3150001DDB033C000A006264E754E714E714E7133C0AA
S3150001DDC000A00628227C00C05D880C5100EF641279
S3150001DDD070003011068000C05D8E204010AF000536
S3150001DDE05251227C00C05D12082900040003660618
S3150001DDF008E90005000133C000A0062A205F548F00
S3150001DE004ED04E714E714E7133C000A0052C33F9BF
S3150001DE1000C05D8800C05D8C33C000A0062E4E7523
S3150001DE204E714E714E7133C000A00630227C00C087
S3150001DE305D12203C00018000C09166100279FC0051
S3150001DE40000804078007900640080407808B90000BD
S3150001DE500080407B08B900010080407B13FC000272
S3150001DE600080407A33F90002B2500080404A08E946
S3150001DE7000020001007940000080400833C000A084
S3150001DE8006324E754E714E714E7148E7011833C018
S3150001DE9000A00634267C00C05D6033D30080404A72
S3150001DEA0207C0080407B08900000287C00C05D40FB
S3150001DEB033EC00040080407C33EC00060080407E99
S3150001DEC0303C03FFC06C00080279FC0000804078FA
S3150001DED081790080407833EC000A008040A833EC59
S3150001DEE0000C008040AA43EC000F1011EA08020062
S3150001DEF0000142411200024100010279FFFE008049
S3150001DF0040A48379008040A41011E80802000001B2

S3150001DF1042411200024100001E9490279FFEF008006
S3150001DF2040A48379008040A41011E2080200000198
S3150001DF3002000001D000089000018110082B0000AA
S3150001DF400001660C082B00030001660442076D0607
S3150001DF501E3900C05D31103900C05D4ED00713C0B7
S3150001DF600080407A103900C05D300200000010200D5
S3150001DF700001E70808900003811070OFC03900C046
S3150001DF805D33023900F000804062813900804062D1
S3150001DF9033C000A006364CDF18804E754E714E71A7
S3150001DFA04E7133C000A006387003C03900C05D2928
S3150001DFB0E908023900CF0080406281390080406261
S3150001DFC013F900C05D28008040634241300148C01A
S3150001DFD0D080068000C05D182240300148C0D08044
S3150001DFE00680008040642040309122 7C00C05D2084
S3150001DFF0207C0080406C11B11000100052410C4190
S3150001E00000046DC833C000A0063A4E754E714E71BC
S3150001E0104E7133C000A0063C61886100FE6E303946
S3150001E020008040A40800000057C044004880024018
S3150001E03000010279FFFE00C05D84817900C05D8424
S3150001E04008B900040080407B0839000400C05D85E2
S3150001E05067084EB90001AEB2600833FC000100C08A
S3150001E0605490423900C05CC7427900C05CC4423951
S3150001E07000C0607A33FCFFFF00C06078427900C0BF
S3150001E080607642B900C06070427900C0607408B918
S3150001E090000700C05D8508F9000000C05D1533C0AA
S3150001E0A000A0063E4E754E714E714E712F0D33C056
S3150001E0B000A00640610000942A7C00C05D12009514
S3150001E0C000100004601630390080400808000000E78
S3150001E0D066046100FD524EB900020106082D0002D8
S3150001E0E000036706081500076 7DC33C000A0064277
S3150001E0F02A5F4E754E714E714E7133C000A00644B3
S3150001E10008B9000700C05D8508B9000000C05D15AB
S3150001E11033C000A006464E754E714E714E7133C026
S3150001E12000A006480C39000200C0543C660E70007F
S3150001E130103900C05E9223C000C0544033C000A015
S3150001E140064A4E754E714E714E7133C000A0064C93
S3150001E1500C39000200C0543C661E103900C05E93A3
S3150001E160E8080200000F42411200024100003ED4996
S3150001E17048C123C100C0544033C000A0064E4E75AD
S3150001E1804E714E714E7148E70F3E33C000A00650E6
S3150001E1904FEFFF9A422F001E427900C05D782F7C17
S3150001E1A00000000000324247267C0002B6202A7C8D
S3150001E1B00002B6244A4767700C470001670428 4BE2
S3150001E1C06002284D303CFFFFD0477C003C00207C9C
S3150001E1D000C05D2042401030680020 7C00C05D24F4
S3150001E1E0424112306800904 1486F001248C04EB952
S3150001E1F000025AEC2F0C486F0016486F00164EB9F4
S3150001E20000023896486F000E41EF00362006E58879
S3150001E210D1C02F0841EF003A70003007E588D1C020
S3150001E2202F084EB9000238425247 0C47000565845 3
S3150001E23060064EB90001A17E0C79000800C05D7828
S3150001E24065F04BEF002E303900C05D7A2F0D02804C
S3150001E2500000FFFF4EB900025B0C203900C0983E5A
S3150001E260E888486F00104EB900025B0C486F001039
S3150001E270486F00324EB9000235E24240103900C003
S3150001E2805D8744405840486F000E48C04EB90002B1
S3150001E2905AEC204F2F28000E2F3C3FACCCCD43EF3C
S3150001E2A0001C4EB9000252DC486F0014486F003260
S3150001E2B04EB9000235F44247486F004241EF00363D
S3150001E2C070003007E588D1C02F08486F00184EB995
S3150001E2D00002386A48790002B628486F0014486F70
S3150001E2E000144EB9000238AC204F2F28000C2F3CE9
S3150001E2F04120000043EF001C4EB9000252DC486F7A
S3150001E3000014486F003241EF002670003007E5889F
S3150001E310D1C02F084EB9000238965247 0C47000467
S3150001E32065962E3C80000000287C00C05D12247C8E
S3150001E33000024356 4A3900C0525E67608F9448799D
S3150001E340000328254E92588F60064EB90001A17E22
S3150001E3502014C08766F4203900C052EC7203B081E4
S3150001E3606234D040303B00064EFB0002000800102C
S3150001E3700024001E08AC00070003601A08EC000721
S3150001E380000308AC00060003600C08EC0003000360
S3150001E39000094000000C008EC000400012C7C00C0C1
S3150001E3A05D40082C0007000366000B0C2A7C00C0A8
S3150001E3B05E7E4A3900C052446716700FC07900C0AC
S3150001E3C05286720CE368026D0FFF0004816D000432
S3150001E3D04A3900C0524567302B7900C0528800087F
S3150001E3E03F3900C0528A4EB900017E1402400FFF28
S3150001E3F0026DF0000006816D0006302D0006024018
S3150001E4000FFF33C000E001DE4A3900C052466722E1
S3150001E410303C0FFFC07900C0528E026DF00000063D
S3150001E420816D0006302D000602400FFF33C000E06B
S3150001E43001DE4A3900C0524767082B7900C0529065
S3150001E440000C4A3900C0526767082B7900C0531087
S3150001E45000104A3900C052486716700FC07900C0D3
S3150001E4605296720CE368026D0FFF0006816D00067D
S3150001E4704A3900C0524E67081B7900C052AF0016D8
S3150001E4804A3900C0524F67081B7900C052B30017C2
S3150001E4904A3900C05250670E1B7900C052B70014AA
S3150001E4A04EB90001E11E4A3900C05251671A700F78
S3150001E4B0C03900C052BBE908022D000F0015812D9D
S3150001E4C000154EB90001E14A4A3900C05261671888
S3150001E4D0103C00FFD03900C052FB0200000F022D94
S3150001E4E000F00015812D00152A7C00C0524D4A39D5
S3150001E4F000C0524C6716303CFFFFD07900C052A6CF
S3150001E50012154881 48C1E9893D8018084A3900C079
S3150001E5105249671010154880 48C0E9882DB900C0D6
S3150001E52052980800 4A15667C4A3900C05249660865
S3150001E5304A3900C0524C676C1215488148C1E989B5
S3150001E5403036180852404 86F001202800000FFFF63
S3150001E5504EB900025B0C486F00124879 0002B62CD6
S3150001E560486F00524EB9000238AC48790002B63005
S3150001E570486F004E486F001C4EB9000238AC486F18
S3150001E58000142F0E4EB9000238DA4A405DC044002D
S3150001E5904880020000010 8B9000000C05D308139E1
S3150001E5A000C05D304A3900C0524A670000E41215C6
S3150001E5B0488148C1E98930361808524048 6F00122F
S3150001E5C002800000FFFF4EB900025B0C486F00128B
S3150001E5D048790002B62C486F00524EB9000238AC99
S3150001E5E04A156708267C0002B6346018487900028D
S3150001E5F0B630486F004E486F00564EB9000238AC2F
S3150001E60047EF004E2F0B1015488048C0E988487621
S3150001E6100800486F00144EB9000238 42204F2F28D7
S3150001E620000C43EF00144EB9000262A43F3C0014F3
S3150001E630487900C0529C486F0016486F00164EB9C3
S3150001E64000023842486F004C486F0012486F0012B2
S3150001E6504EB9000238AC204F2F28000A43EF001AAA
S3150001E6604EB90002631C48790002B638486F00189B
S3150001E670486F00184EB900023842486F00104EB973
S3150001E6800002662212154881 48C1E9893D801806B3
S3150001E6904A3900C0524B670000E4121548 8148C14F
S3150001E6A0E989303618085240486F0012028000008E
S3150001E6B0FFFF4EB900025B0C486F00124879000259
S3150001E6C0B62C486F00524EB9000238AC4A1567089D
S3150001E6D0267C0002B6346018487900 02B630486FCD
S3150001E6E0004E486F005A4EB9000238AC47EF00524F
S3150001E6F02F0B1015488048C0E98848760800486FF6
S3150001E70000144EB9000238 42204F2F28000C43EF67
S3150001E71000144EB9000262A43F3C0014487900C0BF
S3150001E72052A0486F0016486F00164EB900023842D3
S3150001E730486F004C486F0012486F00124EB9000234
S3150001E74038AC204F2F28000A43EF001A4EB90002B9
S3150001E750631C48790002B638486F0018486F0018E4
S3150001E7604EB900023842486F00104EB900026622C7
S3150001E77012154881 48C1E9893D8018044A3900C00B
S3150001E7805262671A4A15670C13F900C052FF00C09E
S3150001E7905D5E600A13F900C052FF00C05D4E4A3942
S3150001E7A000C0526367284A15671A7003C03900C052
S3150001E7B05303E908023900CF00C05D62813900C008
S3150001E7C05D62600A13F900C0530300C05D314A3926
S3150001E7D000C0526B670002 8E4A3900C0526D670055
S3150001E7E0009C264E203900C0532053807208B08108

S3150001E7F06200008AD040303B00064EFB0002001248
S3150001E8000012001200120002A00360040004A007071
S3150001E810203900C05320538006800C05D2020406F
S3150001E82010B900C0532B605413F900C0532B00C01C
S3150001E8305D33604837790C0532A000A603E377954
S3150001E84000C0532A000C6034302B0004D06B000644
S3150001E850E2483C003006907900C0532A3740000652
S3150001E860303900C0532AD04637400004600E700F7D
S3150001E870C03900C0532B13C000C05D324A3900C0F5
S3150001E880526C6700012E267C00C05326203900C039
S3150001E89053205380720 6B08162000118D040303B8C
S3150001E8A000064EFB0002000E000E000E000E005088
S3150001E8B0006E00BE30130240000102400001E9482B
S3150001E8C008B9000400C05D85817900C05D84082C0B
S3150001E8D000000003670000DC0839000400C05D8504
S3150001E8E0670A4EB90001AEB2600000C84EB9000118
S3150001E8F0AEF0600000BE3013024000010240000 18C
S3150001E900E74808B9000300C05D85817900C05D84D0
S3150001E910600000A030130240000102400001D04017
S3150001E92008B9000100C05D85817900C05D8430139E
S3150001E9300240000202400 00108B9000000C05D85E6
S3150001E940817900C05D8408390001 00C05327670A38
S3150001E95008B9000500C05D4F605808F9000500C000
S3150001E9605D4F604E30130240000102400001D0406D
S3150001E97008B9000100C05D85817900C05D8430134E
S3150001E98002400002024000 0108B9000000C05D8596
S3150001E990817900C05D840839000100C05327670AE8
S3150001E9A008B9000400C05D4F600808F9000400C002
S3150001E9B05D4F424670003006D080068000C05D186B
S3150001E9C0224070003006D080068000804064 2040DE
S3150001E9D0309170003006068000C05D202240700034
S3150001E9E0300606800080406C2040109152460C464D
S3150001E9F0000465C033F900C05D4A008040A833F9C0
S3150001EA0000C05D4C008040AA103900C05D4FEA0885
S3150001EA1002000001424112000241000 10279FFFE9B
S3150001EA20008040A48379008040A4103900C05D4F66
S3150001EA30E80802000001424112000241 0001E949D1
S3150001EA400279FFEF008040A48379008040A4700F13
S3150001EA50C03900C05D33023900F00080406281395F
S3150001EA60008040624A3900C052646752267C00C069
S3150001EA705D604A15671A303900C05306024000012D
S3150001EA8002400001E54808AB000200018153602EF7
S3150001EA9008390001 00C05307670808EB00030001AD
S3150001EAA0600608AB00030001303900C0530602407E
S3150001EAB00001024000010 8AB0000000181534A3900
S3150001EAC000C05265671E103900C0530B02000001D9
S3150001EAD0D0001215488148C1E98908B60001180F0E
S3150001EAE08136180F2A7C00C05D174A3900C0525979
S3150001EAF067080094800200004 2154A3900C0525A44
S3150001EB00670A009480020000 1ABC00014A3900C05D
S3150001EB105261673E103C00FFD03900C052FB1A809B
S3150001EB2042411200 3001C0FC004C06800002AC6C70
S3150001EB3022404240101532 00C2FC004C068100C042
S3150001EB40769420417012 20D951C8FFFC08EC0006CA
S3150001EB5000024A3900C0526967168F9460064EB9A1
S3150001EB600001A17E2014C08766F428BC0000800045
S3150001EB704A3900C0526F671E082C0007000266164C
S3150001EB808F9460064EB90001A17E2014C08766F4F9
S3150001EB90009400014 0004A3900C0525367168F9411
S3150001EBA060064EB90001A17E2014C08766F408EC08
S3150001EBB0000600024A3900C052546700008808EC7A
S3150001EBC00005000223FC00C0761400C05E9A4A3993
S3150001EBD000C0525D663C48780020487900C0761432
S3150001EBE04EB900001386602A3F3C000A4EB9000167
S3150001EBF09EA60C40FFFD671A8F9448790003 2836BC
S3150001EC004E92588F60064EB90001A17E2014C0872E
S3150001EC1066F4082C0005000266CE4A7900C061AA96
S3150001EC2067063F3C000260123F3C0001487900C084
S3150001EC306FBE6100125A3F3C0000487900C0607CFB
S3150001EC406100124C103900C0525548801 23900C07B
S3150001EC5052564881804167 7C8F9460064EB9000107
S3150001EC60A17E2014C08766F44A3900C05256670453
S3150001EC707C0460027C00203900C052C8D08672072D
S3150001EC80B0816250D040303B00064EFB00020010BE
S3150001EC900018002000280030003000380040 0094A1
S3150001ECA002001000602E00940200120060260094FB
S3150001ECB002001400601E00940300140060160 8ECA4
S3150001ECC000003000 2600E00940200080060 06009432
S3150001ECD0030008004A3900C05257670001C23039A3
S3150001ECE00080400808000 00E670001B4082C0000EF
S3150001ECF00003670001AA08140001670001A24A394E
S3150001ED0000C05247671422 7C0002A9D6207C00C0AD
S3150001ED107170700820D951C8FFFC48790003283E5C
S3150001ED204E92588F267C00C0607860000158203 9C9
S3150001ED3000C000FAB085670001462A0008390007BD
S3150001ED4000C05D8567081F7C0056001960061F7CA0
S3150001ED50002000190839000600C05D8567081F7C80
S3150001ED60004300 1A60061F7C0020001A08390000C3
S3150001ED7000C05D8467081F7C0053001B60061F7C72
S3150001ED8000020001B0839000500C05D8567081F7C4F
S3150001ED900042001C60061F7C0059001C2A4E2F39B8
S3150001EDA000C07170424010 3900C0607A3F004A537A
S3150001EDB06E063F3CFFFF60067007C0533F003F39B8
S3150001EDC000C05D74302D0004906D0006E2483F00DE
S3150001EDD03039008040A408000001660C30390080FB
S3150001EDE040A40800000267063F3C002A60043F3C3D
S3150001EDF000203F2D000A30390080404A08000006F5
S3150001EE0067063F3C002A60043F3C0020424010391F
S3150001EE1000C05D333F00486F002D424010 3900C0ED
S3150001EE205D213F00424010 3900C05D203F00487916
S3150001EE300003289C4E924FEF002008390003 00C0C2
S3150001EE405D856606427900C05D74424670003006F3
S3150001EE50E588068000C0717420402F10487900 03B0
S3150001EE6028C64E92508F52460C46000865DE02793E
S3150001EE70FFBF0080404A0279FFFD008040A44EB9E1
S3150001EE800001A17E2F3900028388 4EB90000371098
S3150001EE900C40FFFF66082014C0876700FE924A39BE
S3150001EEA000C0527167108F9460064EB90001A17EB1
S3150001EEB02014C08766F44A3900C052546600018C9A
S3150001EEC042472A7C00C000FE10064880424112 15C6
S3150001EED0B04167041C1552474EB90001A17E0C478B
S3150001EEE0000465E4082C00070003660C487900035A
S3150001EEF028CB4E92588F602E082C000600036 7041B
S3150001EF007C01600242460 82C0003000367047E016F
S3150001EF10600242473006524 0D0473F00487900031D
S3150001EF2028D94E925C8F3039008040080800 0000EC7
S3150001EF30675C203C00200030C0946752303C208042
S3150001EF40C06C0002670A4879000328EA600000BE27
S3150001EF50082C00020002671C082C00010002670A47
S3150001EF604879000329016000 00A44879000329209B
S3150001EF706000009A082C00010002670A4879000324
S3150001EF8029396000008848790003 2954607E082CDD
S3150001EF900007000267084879000329 6F606E082C94
S3150001EFA0000000016708487900032982605E303954
S3150001EFB000080400808 00000E674C082C0000000382
S3150001EFC0674408140001670848790003299560 3CE5
S3150001EFD008140005671808 2C00070003670848791C
S3150001EFE0000329AC60264879000329CB601E082C52
S3150001EFF0000070003670848790003 29E9600E48798C
S3150001F0000000 32A0960064879000 32A284E924240E5
S3150001F010103900C05D1652403F00487900032A337B
S3150001F0204E924FEF000A082C00070001670A487943
S3150001F03000032A444E92588F082C00060001670AE5
S3150001F0404879000 32A5E4E92588F267C00C049EA11
S3150001F0504A3900C0525B670000C82F134879000384
S3150001F0602A7C4E924240103900C05D4E55403F0009
S3150001F0702F1343EF00224EB90002631C204F2F28A5
S3150001F080001C487900032A974E924240103900C06D
S3150001F0905D5E55403F002F1343EF002A4EB9000233
S3150001F0A0631C204F2F2800244879000 32AB14E9271
S3150001F0B0203900804074486F002C4EB900025AEC8A
S3150001F0C048790002B63C486F0030486F00304EB9AF

S3150001F0D0000238AC204F2F280028487900032ACC9B
S3150001F0E04E922F3900C0547E487900032AE04E9291
S3150001F0F03F3C00202F3900C054822F3900C0547E76
S3150001F10043EF00424EB9000186C4204F2F28003C30
S3150001F1102F280038487900032AF54E924FEF003424
S3150001F1204A3900C0526A670004C2487900032B13AA
S3150001F1304E92204F2F280022487900032B4E4E92E3
S3150001F1404FEF000C0839000700C05D8567081F7C7A
S3150001F150005600196006 1F7C0020001908390006B8
S3150001F16000C05D8567081F7C0043001A60061F7C8E
S3150001F1700020001A0839000000C05D8467081F7C62
S3150001F1800053001B60061F7C0020001B0839000588
S3150001F19000C05D8567081F7C0042001C60061F7C5D
S3150001F1A00059001C7E010839000400C05D85670610
S3150001F1B0486F0019600648790003 2B823F07303CEF
S3150001F1C0FFFFD0477200320006 8100C05D2020415A
S3150001F1D0424010103F0041EF003A303CFFFFD0475C
S3150001F1E072003200E589D1C12F0841EF003E70005F
S3150001F1F03007E588D1C02F08486F00244EB90002B8
S3150001F200386A204F2F28001C41EF002A7000300772
S3150001F210E588D1C02F103F07487900032B5D4E9238
S3150001F2204FEF001652470C4700056500FF7A2A4E3C
S3150001F23030390080404A08000000667084879000313
S3150001F2402BAE6006487900032BB20839000300C0D3
S3150001F2505D8567063F3C005960043F3C004E4240D5
S3150001F260103900C05D333F007000103900C05D33B6
S3150001F270D080068000002B22420403F103F3900C0F2
S3150001F2805D74487900032B874E924FEF00100839C1
S3150001F290000300C05D856606427900C05D743039A1
S3150001F2A0008040A408000000267084879000032BE0AB
S3150001F2B06006487900032BE40839000500C05D4F5C
S3150001F2C067063F3C004E60043F3C00590839000187
S3150001F2D000C05D8567063F3C005960043F3C004E17
S3150001F2E03F2D000A302D000A486F001E02800000E3
S3150001F2F0FFFF4EB900025B0C303900C05CBE486F9F
S3150001F300001A48C04EB900025AEC48790002B640CC
S3150001F310486F001E486F001E4EB900023896486FAE
S3150001F320001E486F001A486F001A4EB9000238AC29
S3150001F330204F2F2800123F3900C05CBE48790003D8
S3150001F3402BB54E923039008040A4080000066708AC
S3150001F350487900032C126006487900032C16082D03
S3150001F3600004000F67063F3C004E50043F3C005915
S3150001F3700839000100C05D8567063F3C00596004FD
S3150001F3803F3C004E3F2D000C302D000C486F0032E3
S3150001F39002800000FFFF4EB900025B0C303900C04D
S3150001F3A05CC0486F002E48C04EB900025AEC48793D
S3150001F3B00002B640486F0032486F00324EB9000273
S3150001F3C03896486F0032486F002E486F002E4EB9AE
S3150001F3D0000238AC204F2F2800263F3900C05CC000
S3150001F3E0487900032BE74E92203900C05D80486FB3
S3150001F3F0003C4EB900025B0C204F2F28003C43EF26
S3150001F40000724EB9000255D4302D0004906D0006ED
S3150001F410E2483E00302D00085240486F003A028013
S3150001F4200000FFFF4EB900025B0C486F003A4879B5
S3150001F4300002B62C486F007A4EB9000238AC3F077D
S3150001F440302D0006D06D0004E2483F0048790003E4
S3150001F4502C194E924240102D000E5B403F002F1397
S3150001F46043EF004A4EB90002631C4240103900C006
S3150001F4705D323F00103900C05D32486F00420280A4
S3150001F480000000FF4EB900025B0C486F00046486F52
S3150001F4900046486F00464EB900023896204F2F2885
S3150001F4A0003E487900032C2C4E923039008040A44E
S3150001F4B008000000167084879000032C556006487961
S3150001F4C000032C593F3900C05CBA487900032C432C
S3150001F4D04E924FEF00443039008040A408000005E9
S3150001F4E06708487900032C6E6006487900032C7280
S3150001F4F03F3900C05CBC487900032C5C4E923F3911
S3150001F50000C05D7E3F3900C05D7C204F2F2800542E
S3150001F510487900032C754E924240102D000E5B4037
S3150001F5203F002F1343EF00304EB90002631C302D0C
S3150001F530000A486F002602800000FFFF4EB9000254
S3150001F5405B0C3007486F002048C04EB900025AECE8
S3150001F550486F0026486F0024486F00244EB9000208
S3150001F56038AC204F2F28001C486F00604879 0002F4
S3150001F570B644486F00324EB9000238AC103900C0AB
S3150001F5805D32486F00260280000000FF4EB900027E
S3150001F5905B0C486F002E486F002A486F002A4EB94F
S3150001F5A000023896486F0064486F0026486F0026AF
S3150001F5B04EB9000238AC486F002A486F0022486FE6
S3150001F5C000224EB900023896204F2F28001A48799A
S3150001F5D000032C8D4E924FEF00220279FFBF00806F
S3150001F5E0404A0279FFFD008040A44A3900C05266B4
S3150001F5F0670003DE4A3900C052546600031E4A39C9
S3150001F60000C052566600031 40C39000300C053842F
S3150001F6106362203C00018000C0946758303900804S
S3150001F620406A024000FF3F003039008040680240D6
S3150001F63000FF3F0030390080406 6024000FF3F0076
S3150001F64030390080406 4024000FF3F0042401039DB
S3150001F65000804063 3F003039008040 64E04802404A
S3150001F660000F3F00487900032CA34E924FEF001084
S3150001F6706000035E303900C05084907900C0508A22
S3150001F680907900C05D2E486F001202800000FFFFD6
S3150001F6904EB900025B0C48790002B648486F001665
S3150001F6A0486F00164EB900023896204F2F28000EDB
S3150001F6B0487900032CD34E92487900032D134E92BC
S3150001F6C0203900C000FA90B900C05D2A2F003F3CE6
S3150001F6D000544EB900000E1E4240103900C05D298B
S3150001F6E03F00487900032D244E924240103900C054
S3150001F6F05D283F00487900032D3C4E92487900036E
S3150001F7002D574E924FEF001C1C3C00FF420542470D
S3150001F7102F7C0002B620005A2F7C0002B624005E20
S3150001F7202F7C0002B62000622C7C0002B6244A47D8
S3150001F7306706266F00626002264E4A4767062A6FF1
S3150001F740005A60042A6F005E70003007068000C010
S3150001F7505D24204042401010444006 40001F486F7F
S3150001F760001248C04EB900025AEC2F0B486F001622
S3150001F770486F00164EB900023896204F2F28000E0A
S3150001F78070003007068000C05D2020404240101006
S3150001F79044400640001F486F001648C04EB900029B
S3150001F7A05AEC2F0D486F001A486F001A4EB9000225
S3150001F7B03896204F2F28001270003007068000C0AF
S3150001F7C05D242040424010103F007000300706804 3
S3150001F7D000C05D202040424010103F0070003007FD
S3150001F7E0D080068000C05D18204030100240 00FF26
S3150001F7F03F0070003007D080068000C05D182040B1
S3150001F8003010E0480240000F3F00300752403F00F1
S3150001F810487900032D8E4E924FEF00164240100696
S3150001F82072003207D281068100C05D182041321074
S3150001F830024100FFB041631670003007D080068098
S3150001F84000C05D18204030100240 00FF3C004240DD
S3150001F8501005720032 07D281068100C05D18204171
S3150001F86032100241 00FFB041641670003007D080AB
S3150001F870068000C05D18204030100240 00FF3A00AB
S3150001F88052470C4700046500FEA6487900032DB1D6
S3150001F8904E92588F2A7C00C077D24A556708082CA9
S3150001F8A000070002670848790003 2DC76054082C39
S3150001F8B00000000167084879000032DD9604430151E
S3150001F8C053400C4000046242D040303B00064EFBE0
S3150001F8D00002000A0012001A0022002A48790003D9
S3150001F8E02DEB601E487900032DF060164879000360
S3150001F8F02E04600E487900032E126006487900033 3
S3150001F9002E214E92588F600000C83F1548790003 9A
S3150001F9102E2E4E925C8F600000B8303900804008 70
S3150001F92080000 0E670000AA082C0000000367000B
S3150001F93000A04A3900C05254670808EC00010003D0
S3150001F940600608EC000000024A3900C052706706E2
S3150001F95008EC00030001423900C05CC760064EB9DD
S3150001F960 0001A17E303C0102C06C000267122F39F2
S3150001F97000028 3884EB90000 37100C40FFFF67DE96
S3150001F9800294FFFFFEFD487900032E444E92588FE4
S3150001F99042464879 00032E7F4E92588F42477000A7
S3150001F9A03006E988068000C0719472003207D28160

S3150001F9B0D08120403F10487900032E824E925C8F01
S3150001F9C052470C47000865D652460C46004065C2B0
S3150001F9D04A3900C0525C670003D04240103900C06A
S3150001F9E05D1652403F00487900032E874E924879B2
S3150001F9F000032EA04E924FEF000A42452F7C0002D3
S3150001FA00B63400624A456716303CFFFFD0453200E6
S3150001FA10C2FC004C06810002AC6C26416006267CC5
S3150001FA2000C05D1842474BEB0028302D00085240BC
S3150001FA30486F000602800000FFFF4EB900025B0C12
S3150001FA40486F000648790002B62C486F00524EB93D
S3150001FA50000238AC082D0004000F67264A476708E4
S3150001FA60487900032F41603E0839000100C05D85D9
S3150001FA706708487900032F46602C487900032F4B0D
S3150001FA8060244A476708487900032F5060180839EF
S3150001FA90000100C05D8567084879000032F5560069F
S3150001FAA0487900032F59082D0005000F67264A479C
S3150001FAB06708487900032F24603E0839000100C019
S3150001FAC05D8567084879000032F29602C4879000372
S3150001FAD02F2E60244A47670848790003 2F336018A0
S3150001FAE00839000100C05D8567084879000032F3891
S3150001FAF06006487900032F3C082D0001000F6708B6
S3150001FB00487900032F1C6006487900032F204A47D5
S3150001FB1067063F3C005860043F3C00523F05487968
S3150001FB2000032F064E92302D000852403F004879BF
S3150001FB3000032F5E4E924A47670E302B0048E44879
S3150001FB40024000013F00601A082B000300496704C8
S3150001FB507C0260024246302B00480240001D0463A
S3150001FB603F00487900032F634E924A476714102BD2
S3150001FB70004AE808020000037201E16930013F0012
S3150001FB806020082B00000049660E082B000300497F
S3150001FB9066063F3C0000600A7001122B0019E368FB
S3150001FBA03F00487900032F684E92382D00043F3CF0
S3150001FBB0FFEC3004486F002E02800000FFFF4EB9B3
S3150001FBC000025B0C204F2F28002E43EF00404EB958
S3150001FBD00002631C486F003A486F0074486F003694
S3150001FBE04EB900023896204F2F28002E487900037F
S3150001FBF02F704E923C2D00063F3CFFEC3006486FBD
S3150001FC0000036028 00000FFFF4EB900025B0C204F58
S3150001FC102F28003643EF00484EB90002631C486F97
S3150001FC200042486F007C486F003E4EB900023896 8C
S3150001FC30204F2F28003648790003 2F774E923F3CFC
S3150001FC40FFFE204F2F28008243EF00504EB90002DD
S3150001FC50631C204F2F28004A487900032F7E4E92BD
S3150001FC603F3CFFEC30049046486F004648C04EB911
S3150001FC7000025AEC204F2F28004643EF00584EB998
S3150001FC800002631C486F0052486F008C486F004E9B
S3150001FC904EB900023896204F2F28004648790003B6
S3150001FCA02F864E924FEF00463F3CFFEB3004D04685
S3150001FCB0486F000402800000FFFF4EB900025B0C92
S3150001FCC0204F2F28000443EF000E4EB90002631C9B
S3150001FCD04A4767062C6F00626046082B0000001831
S3150001FCE0671E3F3CFFFE204F2F28004C0A1700805D
S3150001FCF043EF00164EB90002631C43EF0010601873
S3150001FD003F3CFFFE204F2F28004C43EF00124EB917
S3150001FD100002631C43EF000C2F5100564DEF0056B5
S3150001FD20486F0008486F004E486F000C4EB900023C
S3150001FD3038962F0E486F0008486F00084EB900022A
S3150001FD403842204F2F10487900032F8D4E922F15E0
S3150001FD50487900032F944E924240102D000E3F0029
S3150001FD602F3C3E80000043EF001E4EB90002631C8B
S3150001FD70204F2F28001848790003 2F9B4E924FEFF2
S3150001FD8000184A45660A487900032FA24E92588FF9
S3150001FD904BED001052470C4700026500FC8E5245A0
S3150001FDA00C4500046300FC5E4A3900C0527067626C
S3150001FDB04A3900C05256665A082C00070003660EDF
S3150001FDC03F3C0001487900C06FBE610000 2424756
S3150001FDD02A7C00C0622E4A47660E082C00070003E3
S3150001FDE067063F3C000160043F3C00002F0D6100A7
S3150001FDF0009E52474BED01B20C4700086DD8082C06
S3150001FE0000070003670C3F3C0000487900C06FBE45
S3150001FE10617C4A3900C05258675C487900032FB1AA
S3150001FE204E92487900032FD94E92508F487900C0DF
S3150001FE305E7E6100024E487900C05E92610001DA81
S3150001FE40083900050 0C0950C6714487900C05E9E0C
S3150001FE5061000230487900C05EB2610001BC3F3CDE
S3150001FE600001487900C06FBE61243F3C000048791B
S3150001FE7000C0607C611842404FEF006633C000A0AD
S3150001FE8006524CDF7CF04E754E714E714E7148E74D
S3150001FE90030C33C000A00654287C000243562A6F87
S3150001FEA000143E2F0018080700006738487900 0340
S3150001FEB02FE54E94588F08070002670A4879000318
S3150001FEC0303B4E94588F0839000700E00256670A06
S3150001FED04879000330474E94588F48790003304FD4
S3150001FEE04E94588F4879000330574E94588F08071F
S3150001FEF000016708082D0001012F66402F2D0124FE
S3150001FF003F2D012E3F2D00CA2F2D00103F2D00C879
S3150001FF102F2D000C3F2D00C62F2D00083F2D00C4AC
S3150001FF202F2D00042F154240102D01303F00487936
S3150001FF30000 3305A4E944FEF00286010487900 03B1
S3150001FF4030A6487900 03309C4E94508F0807000272
S3150001FF50670A487900C05E92610000BE0839000751
S3150001FF6000E00256671A7002D07900C095083F007A
S3150001FF703F3900C0950A4879000330A84E94508F46
S3150001FF8008070001675A4A6D012E67147C013E0677
S3150001FF9060045247DC46302D012EC04667F46002EC
S3150001FFA0424708390007 00C05D156718700030 0721
S3150001FFB0E58806800002B28620402F1048790003AA
S3150001FFC030B160167000 3007E58806800002B25E27
S3150001FFD020402F104879000330B54E94508F60228F
S3150001FFE00807000 3671C0839000700C05D1567088C
S3150001FFF04879000330B96006487900 0330C34E944E
S315000200000588F33C000A006564CDF30C0205F5C8F8D
S315000200104ED04E714E714E712F0D33C000A0065850
S3150002002 02A6F0008102D00010200000F4241120043
S315000200305 24130013F004240102D00033F00424032
S3150002004 0102D00023F00102D0001E8080200000FEB
S3150002005042411200 30013F00424010153F004879EC
S315000200600 00330CC4EB9000243564FEF000E33C0A8
S3150002007000A0065A2A5F205F588F4ED04E714E71ED
S315000200804E712F0D33C000A0065C2A6F00082F2D7B
S3150002009000010302D0006720CE2680240000F3F008D
S315000200A02F2D000C302D000602400FFF3F002F2D92
S315000200B000008302D0004E2680240000F3F00487934
S315000200C0000330E14EB9000243564FEF001633C02B
S315000200D000A0065E2A5F205F588F4ED04E714E7189
S315000200E04E7133C000A0066048E73F3E204F2E798E
S315000200F000C0CEF423C800C0CEF44CDF7CFC4E75A3
S315000201004E714E714E7133C000A0066248E73F3E03
S31500020110204F2E7900C0CEF423C800C0CEF44CDFA7
S315000201207CFC4E754E714E714E7148E7030433C026
S3150002013000A0066442472A7C00C05D1208D500066C
S31500020140 23FC0003840000C0523C203C180000003F
S3150002015 0C095674E53474A476C067E0A7C05600285
S3150002016 07C0408150004671A300608C000013F0027
S31500020170487900C0607C4EB90001FE8E08950004E5
S31500020180602013FC000C00C070EE300608C00003AD
S315000201903F00487900C06FBE4EB90001FE8E089539
S315000201A000034EB90001A17E2F39000283884EB9A1
S315000201B0000037100C40FFFF660C0CB900000280ED
S315000201C000C0523C6E840295A7FFFFFF424033C037
S315000201D000A006664CDF20C04E754E714E714E7100
S315000201E02F0733C000A006687E0123F900C000FA7B
S315000201F000C05E8E02790FFF00C05E8A0079300071
S3150002020000C05E8A33F900C0991000C05E8C027984
S3150002021 00FFF00C05E82007950000 0C05E823F3C44
S315000202200 0034EB9000218940880000 04A40660294
S3150002023042071007 33C000A0066A2E1F205F4FEF49
S31500020240 00104ED04E714E714E7133C000A0066C36
S3150002025 0700133C000A0066E205F4FEF00104ED033
S315000202604E714E714E7133C000A00670227C00E0C2
S3150002027 0026E08E90003000232BC27600269F80038
S315000202800000200690078000208F9000300E0025942

S3150002029033C000A006724E754E714E714E712F0D0F
S315000202A033C000A006742A7C00C095882ABC0002CE
S315000202B001E02B7C0002024A00044879000331145 3
S315000202C0486D000C487800104EB9000010B8487905
S315000202D00003311D486D001C487800084EB9000025
S315000202E010B833C000A006762A5F4E754E714E7165
S315000202F04E7133C000A0067833C000A0067A4E7550
S315000203004E714E714E7133C000A0067C23FC000272
S3150002031003240 0C05CD633C000A0067E4E754E7123
S315000203204E714E712F0233C000A00680207C00C0A1
S3150002033060882 27C00C000FA20107200322F000A68
S31500020340D0812211B280620E20107400342F000A6E
S31500020350908 2B280640E082F00030008660623D03E
S315000203600 0C000F623D100C07594203C00C07594ED
S3150002037033C000A00682241F205F588F4ED04E71D4
S315000203804E714E7148E7033E33C000A00684287CB6
S3150002039000C077D4303C0FF0C06F0020670C70208D
S315000203A00837000308016700026222 7C000281B856
S315000203B0204C703320D951C8FFFC30912A7C00C0F2
S315000203C077E808D5000708ED000500017CFF23C683
S315000203D000C077FE70200837000208016714 08ED96
S315000203E00006000142B900C077EE42B900C077F6B6
S315000203F0601C7000302F002223C000C077EE302F21
S3150002040000225240720032002 3C100C077F67E00FD
S31500020410267C00C077EB247C00C077EC2C7C00C0E5
S3150002042077EA302F0020720CE2680240000F0C407F
S31500020430000867220C40000967620C400002670050
S3150002044000 0A20C40000567000 0E40C4000066700AD
S3150002045001246000016816BC003314BC00331CBCC6
S31500020460000108ED0007000108950002 2F0D224C3D
S315000204704EB9000081782E3900C077E04A876300C2
S315000204800 13C205430280002720AE2680240003F12
S3150002049000C400033670001266000012016BC0037BD
S315000204A014BC00371CBC004E0895000208ED00077C
S315000204B000012F0D224C4EB9000081782E3900C062
S315000204C077E04A87630000F6205430280002720A59
S315000204D0E2680240003F0C400037670000E060001F
S315000204E000DA16BC003914BC0039421623C600C015
S315000204F077F608D5000208AD000700012F0D224C41
S315000205004EB9000081782E3900C077E04A87630031
S3150002051000AC205430280002720AE2680240003F12
S3150002052000C400039670000966000009008D5000470
S3150002053016BC002B14BC002B421608D5000223C69B
S3150002054000C077F608AD000700012F0D224C4EB908
S3150002055000081782E3900C077E04A87635E205416
S31500020560302800027 20AE2680240003F0C40002B6B
S31500020570674A604608D5000416BC002F14BC002F3B
S31500020580421608D5000223C600C077F608AD00075A
S315000205900001 2F0D224C4EB9000081782E3900C081
S315000205A077E04A87631620543028000272 0AE2680E
S315000205B00240003F0C40002F67027E004A87631408
S315000205C0702008370002080167 0A205433E8000E3B
S315000205D000C06FC823C700C075942A7C00C07594FA
S315000205E07020083700030801676C7E01600C2F0C2F
S315000205F03F074EB9000084EA5247302F0020E848F0
S3150002060002400 0FFBE4065E6604C2F0C302F0024EE
S315000206100E848024000FF3F004EB9000084EA0C00A1
S3150002062000004671 24A00670E0C00000267080C00FD
S3150002063000005672060204879 00C07826487900C006
S31500020640759448780020 4EB9000011C62A7C00C075
S31500020650759460029BCD200D33C000A006864CDF48
S3150002066007CC0205F588F4ED04E714E714E7133C092
S3150002067000A00688227C0002038423C900C05CEA2B
S315000206802 3C900C05CEE23C900C05CDE23C900C0DA
S31500020690 5CE223C900C05CD233C000A0068A4E7554
S315000206A04E714E714E7133C000A0068C42A73F3C7C
S315000206B000003F3C000B4EB9000071EA700033C0E7
S315000206C000A0068E205F588F4ED04E714E714E712D
S315000206D033C000A0069023FC000206A600C05CDA26
S315000206E033C000A006924E754E714E714E7133C0E4
S315000206F000A00694302F0004720BE268024000014B
S315000207003F00102F000842411200300 13F00302FF7
S3150002071000080240 00FF3F004EB900016D7E7000E6
S3150002072033C000A00696205F588F4ED04E714E7190
S315000207304E7133C000A0069823FC000206EE00C0EC
S3150002074 05D0633C000A0069A4E754E714E714E710B
S315000207504 8E72F3E33C000A0069C4FEFFF0E227CD7
S3150002076000 02B8C641D7703920D951C8FFFC485794
S315000207704EB9000193064A3900C0526366084A39E7
S3150002078000C0526467184A3900C0525266104A398C
S3150002079000C05253660813FC000100C052510CB946
S315000207A000C07B5800C0951067504A3900C0525F9E
S315000207B066404A3900C0526366404A3900C0525404
S315000207C066304A3900C0525566284A3900C0525628
S315000207D066204A3900C0526666184A3900C0525F1E
S315000207E066104A3900C0524E66084A3900C0524F56
S315000207F06708487900033410601A4A3900C0526605
S31500020800671E4EB9000219FE4A4067000710487972
S315000208100003343 84EB90002435 6588F600006FE74
S3150002082002F7C0288000100D44DEF00D2283C000143
S315000208305180600006D6302F00D2024003FF4A40A4
S31500020840630000 8C302F00D2024003FF53407E002B
S3150002085003E00203900C095102207E789D287D2814F
S31500020860D0812640302F00D2024003FF534072004F
S31500020870 3200E789068100E002B02841302F00D21B
S31500020880024003FF72003200E589068100E0037030
S3150002089002A41302F00D2024003FF72003200E5895E
S315000208A0068100C0491820414A90660495CA603202
S315000208B07010322F00D2024103FF74003401E58A20
S315000208C0068200C049182042D0902440601497CB7B
S315000208D0284B2A7C00E003707010D0B900C049187A
S315000208E024404A3900C0526367000 15C4A3900C09D
S315000208F0525967127000102D0002223900C052D8D8
S31500020900B280660006064A3900C0525A6712700063
S31500020910102D0003223900C052DCB280660005ECBD
S315000209204A3900C052576710700010152239 00C0AC
S31500020930 52D0B280660005D44A3900C05258671 8B0
S31500020940102D0001E8080200000F72001200B2B971
S3150002095000C052D4660005B4200B670000EA4A398B
S31500020960 00C05256672C203900C052CC223C0000EF
S3150002097000FA04EB900027090322B000C02810000CB
S31500020980FFFF82FC0FA0484174003401B08266006A
S31500020990057A4A3900C05255670E203900C052C83E
S315000209A0B0AB0008660005644A3900C05264670AA3
S315000209B04AB900C052C8620005524A3900C05254B0
S315000209C0672A2F0B486F00ED487800084EB90000E1
S315000209D010B8422F00F2486F00E92F3900C052C406
S315000209E04EB9000258444A40670005204A3900C001
S315000209F0525E670A3A3900C052EE3C2C00064A396A
S31500020A0000C0525D670A3A3900C052EA3C2C000423
S31500020A104A3900C0525B67083A3900C052E23C14B8
S31500020A204A3900C0526067024646 3006C045670032
S31500020A3004DA4A3900C05262670C203900C052FCFF
S31500020A40B092660004C64A3900C0525F6710487801
S31500020A50001 22F0B4EB9000012C6600004AE4A39CE
S31500020A6000C05251670000F0082F000600E7671029
S31500020A70485748790003 34574EB900024356508FFF
S31500020A80486F007848790003349F4EB900024356F6
S31500020A90508F302F00D2024003FF4A406500046C9B
S31500020AA0303C03FFC06F00D266083E3900E001DE2B
S31500020AB060043E2B000C303C0FFFC0473F004879D4
S31500020AC0000334A54EB9000243562F0D4EB900025B
S31500020AD00018200A660442A760022F124879000312
S31500020AE034A94EB9000243564FEF000E302F00D202
S31500020AF0024003FF4A40630004123F2C00063F2CCB
S31500020B0000043F2C00023F144879000334B04EB96A
S31500020B1000024356 7000302B000E22044EB900022A
S31500020B207B582F003F3C00444EB900000E1E487908
S31500020B300003 34C64EB9000243564FEF0010700050
S31500020B40302B001022044EB900027B582F003F3C86
S31500020B50004460000 1624A3900C05252670 0011621
S31500020B600B2F000600E767104857487900 0334C883

S31500020B704EB900024356508F302F00D2024003FF77
S31500020B800C40000165000384700112390OC052BF97
S31500020B90E3683E003014C047671A303CFFFFD04777
S31500020BA0C0546708287C0003350E601E287C0003AB
S31500020BB035166016302C0006C0476708287C0003ED
S31500020BC035206006287C0003352A302F00D20240E9
S31500020BD003FF534072003200E189068100C07D089E
S31500020BE0203900C052BCE988D2802A412F2D000448
S31500020BF02F15486F008048790003352F4EB9000241
S31500020C0043562F2D00083F3C00544EB900000E1EDD
S31500020C1048790003354I4EB9000243562F2D00088C
S31500020C203F3C00444EB900000E1E48790003354 38E
S31500020C304EB9000243562F2D000C3F3C00544EB9CC
S31500020C4000000E1E4879000335454EB90002435690
S31500020C502F2D000C3F3C00444EB900000E1E2F0CF7
S31500020C6048790003354 74EB9000243564FEF002438
S31500020C70600002984A3900C052536744486F0078B0
S31500020C8048790003354B4EB900024356508F200A6D
S31500020C90670002782F2A00082F2A00042F124879AB
S31500020CA000003355I4EB9000243564FEF00102F2A6A
S31500020CB0000C3F3C00434EB900000E1E6000024C81
S31500020CC04A3900C05263660002424A3900C052578E
S31500020CD067061AB900C052D34A3900C0526567186E
S31500020CE0103C00FFD03900C0530B0200000F022D4A
S31500020CF000F00001812D00014A3900C052596708EF
S31500020D001B7900C052DB00024A3900C0525A6708FA
S31500020D101B7900C052DF00034A3900C052586714DB
S31500020D20700FC03900C052D7E908022D000F00012A
S31500020D30812D0001200B670001C44A3900C05254BC
S31500020D40671E2F3900C052C42F0B487800084EB9CF
S31500020D50000010B808AC0000000508EC0000000115
S31500020D604A3900C052556748277900C052C8000860
S31500020D70203900C000FA22044EB9000274A437409A
S31500020D80000E4A3900C0525666263F3900C052CA82
S31500020D904EB900017E1402400FFF3740000C08AC2A
S31500020DA00001000508AC0001000708EC0001000183
S31500020DB04A3900C052566720303C0FFFC07900C046
S31500020DC052CE3740000C08AC0001000508AC000109
S31500020DD0000708EC000100014A3900C0524F6712B1
S31500020DE0203900C052B022044EB9000274A4374022
S31500020DF000104A3900C0524E6712203900C052AC68
S31500020E0022044EB9000274A43740000E4A3900C0CB
S31500020E10525B67384A3900C05260670C303900C0ED
S31500020E2052E24640C15460244A3900C052616715F4
S31500020E30303900C052E28154303900C052E2464095
S31500020E40C16C0006600638B900C052E24A3900C0D9
S31500020E50525E67324A3900C05260670E303900C0AE
S31500020E6052EE4640C16C0006601C4A3900C052610F
S31500020E70670C303900C052EE816C00066008397981
S31500020E8000C052EE00064A3900C0525D67324A3946
S31500020E9000C05260670E303900C052EA4640C16C4B
S31500020EA00004601C4A3900C05261670C303900C028
S31500020EB052EA816C00046008397900C052EA0004E3
S31500020EC04A3900C0525C67424A3900C05260670E16
S31500020ED0303900C052E64640C16C0002602C4A39E5
S31500020EE000C05261670C303900C052E6816C0002C4
S31500020EF06018397900C052E60002600E4879000394
S31500020F0035644EB900024356588F42A7486F000413
S31500020F104EB900018DF24A006600F91C42404FEFBD
S31500020F2000F233C000A0069E4CDF7CF44E754E7173
S31500020F304E714E7133C000A006A04A3900C0524419
S31500020F40670A33F900C0528600E002583F3900E0D2
S31500020F50025848790003335A84EB900024356 5C8F01
S31500020F60424033C000A006A24E754E714E714E71BC
S31500020F7048E7013E33C000A006A42A7C000243567D
S31500020F80287C00C0950C247C00E002564A3900C039
S31500020F905244670000E248790003368B2F3900C0BD
S31500020FA05284267C00C0523C2C7C000283884EB9B7
S31500020FB0000258444A40665808120007670000B803
S31500020FC008140007660000B008D2000608F90007F8
S31500020FD000C05D1248790003368E4E95588F2E3C1E
S31500020FE0FFFFF600DE9360064EB90001A17E2F16C2
S31500020FF04EB9000037100C40FFFF660C08140007BC
S315000210006606201 3B0876EE04EB90002318860662C
S3150002101048790003336AB2F3900C052844EB900021C
S31500021020584 44A40664008140007674A0892000678
S3150002103048790003336AF4E95588F2E3CFFFFF600D7
S315000210400DE9360064EB90001A17E2F164EB900004E
S3150002105037100C40FFFF661E08140007671820139E
S315000210600B0876F1260DE48790003336CD4E95588FF1
S31500021070700160000244A3900C05249671A70FEA4
S31500021080D07900C0529A33C000E0025A0892000694
S3150002109033FC001E00C097E44A3900C0524A671268
S315000210A0103900C0529F02000001E70808920003AF
S315000210B081122C7C00E0025C4A3900C0524567105E
S315000210C03CB900C0528A0C5600026C040892000613
S315000210D0267C00E0025E4A3900C05247670A303970
S315000210E000C05292534036804A3900C052466716B3
S315000210F0303900C0528EE948907900C0528EE548D8
S31500021100033C000E002604A7900E0025A6D1C3F39A2
S31500021110000C097E47002D07900E0025A3F00487995
S3150002112000033 6E94E95508F605A08120007660C86
S31500021130487900033 7234E95588F601E081400071E
S315000211406608487900033747 60064879000 3374F37
S3150002115048790003372C4E95508F2F3900C000FA7C
S3150002116 03F3C00444EB900000E1E48790003375634
S3150002117 04E95588F2F3900C000FA3F3C00544EB9A5
S31500021180000E1E4A7900E0025A6D060C56000156
S31500021190 6E0A4A3900C0524867 0000F26100010C2B
S315000211A0287C00C097EE3014B05366082E3900C072
S315000211B097EA603CB053641C2E3900C097EA303976
S315000211C000E00260321392545341C0C172003200F1
S315000211D0DE81601C2E3900C097EA303900E00260D9
S315000211E03216D25392545341C0C172003200DE818C
S315000211F03014B05366084879000 3376E60064879A2
S3150002120000033775487900033 7584E952F073F3C40
S31500021210 00434EB900000E1E3F3900C097E470022B
S31500021220D07900E0025A3F004879000 3377D4E9597
S31500021230 3F1648790003337AF4E95301352403F00B0
S3150002124048790003337CF4E95303900E0026048C036
S31500021250 81FC003C3F0048790003337F34E95301479
S31500021260 52403F0048790003381C4E95081200038D
S315000212706708487900033852600648790003385 8EF
S3150002128048790003383 74E954FEF0030487900030E
S31500021290385F4E95588F424033C000A006A64CDFF9
S315000212A07C804E754E714E714E7148E7011C33C0FB
S315000212B000A006A82A7C00E002602 87C00C097E60F
S315000212C0267C00E0025C227C00C097EE4A5567420B
S315000212D04A53673E203900C000FA321548C14EB95A
S315000212E0000274A42E00301548C022074EB900022F
S315000212F07B5828802007321348C14EB900027090ED
S31500021300328020143 21548C1D08123C000C097EA2A
S31500021310600A4294425142B900C097EA0C53000156
S31500021320 6F2A4A7900E0025A6C223011B07900E045
S315000213300025E56C04400488002000001ED0808B96A
S315000213400000600E00256813900E0025633C000A0D2
S315000213506AA4CDF38804E754E714E714E7133C0FF
S3150002136000A006AC5100FF444A7900C097E4670812
S3150002137 0537900C097E4660833FCFFFF00E0025A87
S3150002138033C000A006AE4E754E714E714E7133C01B
S31500021390 00A006B033FCFFFF00E0025A427900C00B
S315000213A097E4427900E0025C33FC025800E00260F6
S315000213B033C000A006B24E754E714E714E7148E7AB
S315000213C0030C33C000A006B44A3900C05244675A1F
S315000213D0203900C05284E588068000E002622A4075
S315000213E04A3900C0524667063AB900C0528E4A3997
S315000213F000C052476714303C07FFC07900C05292C2
S31500021400026DF8000002816D00024A3900C052489E
S315000214106718303900C05296024000001720BE36829
S31500021420 08AD00030002816D00024A3900C0524530
S315000214306764487900033 8F64EB900024356588F5E
S3150002144 04247287C00C0951C2A7C00E002627C018F

S315000214503O2D0002720BE268024000013F00302D7F
S315000214600002024007FF3F003F15486C001C486C13
S3150002147000OC3F063F0748790003392B4EB900029C
S3150002148043564FEF00165247DC4649EC0024588D6E
S315000214900C47001065BA424033C000A006B64CDFC6
S315000214A030C04E754E714E714E7133C000A006B8F3
S315000214B0227C00C097F422BC00C0E2F82051213CF5
S315000214C0000214DA228890FC002C228833C000A085
S315000214D006BA4E754E714E714E7148E7073E33C0DD
S315000214E000A006BC2C7C00C0950A0839000600E064
S315000214F0025667064EB900023188103900E00256DC
S31500021500EC080200000102000001EF0808B900071A
S3150002151000C0950C813900C0950C0839000700E01F
S31500021520025667000354083900070OC0950C66008E
S3150002153002E208B9000700C05D154A7900E00254CC
S31500021540 6D60527900C0950E0C79000A00C0950EA6
S315000215506C2408F9000400C0950C33F900E002542B
S3150002156000C09508303900E00240720CE268024081
S3150002157000 0F3C8060644EB900023188303900E0C9
S3150002158002 5448C0E788068000E002B02A4008AD4F
S315000215900000000508ED0000000108AD000000078C
S315000215A0603808B9000400C0950C4A7900E0025A76
S315000215B06D0C33F900E0025A00C09508601C52799E
S315000215C000C09508303900C0950848C0B0B900C0BF
S315000215D097DC6506427900C095083E3900C0950839
S315000215E048C7203900C095102207E789D287D281E1
S315000215F0D0812440303900C0950848C0E78806806B
S3150002160000E002B02A40303900C09508524048C076
S315000216100E588068000E0037026404AAA00086700B3
S3150002162002583A2D00047007806D0002C1553E151E
S31500021630CE7900E00258CE6D000230074640C16DF9
S31500021640000063C2D00063C0730054640CC406602AB
S3150002165003C074A4666144A7900E002546D00021AB3
S31500021660 4EB9000231886000021023EA000800C069
S315000216705E86303C0FFFC06A000C02400FFF027903
S31500021680F00000C05E84817900C05E84224B207C1B
S3150002169000C05E9210D910D910D91091102B0001FA
S315000216A00200000F13C000C05D1700B980004000A1
S315000216B000C05D1260064EB90002203808390007E4
S315000216C000C05D1266F07E01303900C0950848C040
S315000216D0E188068000C07D08284042566008DE4741
S315000216E049EC001052563006C04767F230074640B2
S315000216F0C16D000670003016E588068000C0975C52
S31500021700204028907 0003016E588068000C0979C1D
S315000217102040295000043 0054640C047674C7C00F3
S3150002172 03C162006E788D086E588068000C0951C10
S3150002173020402668 0004200B67122F0C2F0D2F0A5B
S315000217403F163F3900C095084E936016300 7464053
S31500021750C15530074640C16D000630074640C16D8F
S31500021760000048F6D000460000110224B207C00C033
S315000217705E9210D910D910D9109142B900C05E9A62
S3150002178 07C003C162006E788D086E588068000C0E5
S315000217909 51C204026502 00B67602F0C2F0D2F0A18
S315000217A03F163F3900C095084E934A00670A0C005F
S315000217B00001673C600000C2297900C000FA000CF3
S315000217C070003016E588068000C0975C204028909D
S315000217D070003016E588068000C0979C204029508C
S315000217E000048F6D000630074640C1556000008A2E
S315000217F0297900C000FA0008607E30074640C155CC
S315000218 0030074640C16D000630074640C16D0004F0
S315000218106066083900 0500C0950C6752227C00E01C
S31500021820 0370207C00C05E9210D910D910D9109195
S315000218301 03900C05E930200000F13C000C05D178E
S31500021840303C0FFFC07900E001DE0279F00000C0F3
S3150002185 05E84817900C05E8423F900C0983A00C094
S31500021860 5E8600B9000000C000C05D12600A02B9BF
S31500021870FFFFFF3F00C05D124EB900022038600034
S31500021880FC6A33C000A006BE4CDF7CE04E754E718A
S315000218904E714E7148E7070433C000A006C02A7C89
S315000218A000C05D123A2F001408D500022C3C8000BD
S315000218B0000060064EB900022038203C0401C00038
S315000218C0C09567062015C08667EA7E02603008ED7D
S315000218D00005000260064EB900022038082D0005F8
S315000218E000026 7062015C08667EC082D0005000277
S315000218F066083E3900C061AA60027E0253454A4725
S3150002190067 0A4A456F062015C08667C2300733C08C
S315000219100 00A006C24CDF20E0205F548F4ED04E71ED
S3150002192 04E714E7133C000A006C408390007 00E0AC
S31500021930025667083F3C0004610001DA33C000A08A
S3150002194006C64E754E714E714E7133C000A006C862
S3150002195042B900C097DC203C0000001C3F004EB993
S31500021960 0001A89A23FC00C07B5800C0951033C022
S3150002197000A006CA4E754E714E714E7148E70604B6
S31500021980 33C000A006CC2A7C003800004A95635278
S31500021990 0C950000018624A23D500C097DC42412C
S315000219A060343A0148C53C0148C62006E788D0861D
S315000219B0D080068000380004224020 05E788D085C2
S315000219C0D080068000C07B582040700320D951C8C1
S315000219D0FFFC30915241300148C0B0B900C097DCDB
S315000219E065C023FC00C07B5800C0951033C000A020
S315000219F006CE4CDF20604E754E714E714E7148E731
S31500021A000F0033C000A006D00CB900C07B5800C03E
S31500021A10951056C0440048803800 6666203C000097
S31500021A20001C3F004EB90001A89A2F3900C097DC6E
S31500021A3048790038 00004EB900003A2A424760341D
S31500021A403A0748C53C0748C63F3C00092006E788D6
S31500021A50D086D080068000C07B582F002005E788FC
S31500021A60D085D080068000380004 2F004EB90000D1
S31500021A703B165247300748C0B0B900C097DC65C074
S31500021A8061443 00433C000A006D24CDF00F04E752C
S31500021A904E714E714E7133C000A006D44AB9003859
S31500021AA0000063120CB9000000180038000053C091
S31500021AB04400488060024240 33C000A006D64E75FC
S31500021AC04E714E714E7133C000A006D861C84A40AD
S31500021AD0671623FC0038000400C0951023F900386D
S31500021AE0000000C097DC600A23FC00C07B5800C0DF
S31500021AF09510203900C097DC528023C000C097E0C1
S31500021B004EB900004AC633C000A006DA4E754E71C1
S31500021B104E714E7148E7010433C000A006DC42470D
S31500021B20203C00C07B56448006 8000C097F8E480C3
S31500021B302F00487900C07B564EB900001386 61001B
S31500021B40F96A6182302F000C0C400004620000FE2C
S31500021B50D040303B00064EFB0002000A000E002673
S31500021B60006C00B26100FDE42A7C0000057060048E
S31500021B70205D4E90BBFC0000057065F46100FF48D5
S31500021B80203C00E002B04480068000E003D4E480FA
S31500021B902F00487900E002B04EB9000013862A7C75
S31500021BA000000570600420 5D4E90BBFC00000570CD
S31500021BB065F42A7C0000057060042 05D4E90BBFC33
S31500021BC00000057065F4203C00E002404480068077
S31500021BD000E002B0E4802F00487900E002404EB9EE
S31500021BE0000013862A7C000005706004205D4E907A
S31500021BF0BBFC0000059C65F42A7C0000059C600481
S31500021C00205D4E90BBFC0000059C65F408F90007B8
S31500021C1000E0025608B9000600E0025608B90007BD
S31500021C2000C05D1523FC0002B66200C0987023FC5A
S31500021C30 0002B66600C098742A7C0000059C600407
S31500021C40205D4E90BBFC000005C865F4300733C02A
S31500021C5000A006DE4CDF2080205F548F4ED04E71EE
S31500021C604E714E7148E70F1C33C000A006E0424594
S31500021C707C01267C00E00262227C00C0951C203991
S31500021C8000C000FA723C4EB9000274A42E00302B3A
S31500021C9000002024007FF720032009E814A5367101B
S31500021CA07000301322 0020074EB9000270902E00F9
S31500021CB0082B0003000267624A87665E383900C055
S31500021CC097DE53444247 2A7C00E002B0287C00C0DB
S31500021CD07D0860423015C046322D00064641C0419D
S31500021CE0662C30064640C16D00068D55300548C04B
S31500021CF0E588068000C0975C204028903 00548C0E1
S31500021D00E588068000C0979C2040295000045247 6F
S31500021D10508D49EC0010BE446FBA5245DC4643E989
S31500021D20 0024588B0C4500106D00FF5433C000A0F0

S31500021D3006E24CDF38F04E754E714E714E7148E731
S31500021D40033C33C000A006E42A7C00E00240287C63
S31500021D5000E00254267C00E00256247C0002435630
S31500021D604A3900C05248670001164B7900033AB85A
S31500021D704E923F3900C0950E7002D0543F002F3963
S31500021D8000E002442F15303900E0026048C081FCB1
S31500021D90003C3F00303900E0025E52403F003F39CE
S31500021DA000E0025C3F3900E002580B1300036708AE
S31500021DB0487900033BD46006487900033BDA203CAD
S31500021DC000018000C0B900C05D12663A0813000720
S31500021DD0672C0839000700C0950C661A08390004FA
S31500021DE000C0950C6708487900033BAF601E48792E
S31500021DF000033BB76016487900033BC0600E487982
S31500021E0000033BC76006487900033BCB7002D079DA
S31500021E1000E0025A3F003F3900C0950A7002D079AD
S31500021E2000C095083F002F3900C097DC2F3900C04B
S31500021E3095104AB90038000063140CB90000001866
S31500021E4000380000620848790003 3BA3600648791F
S31500021E5000033BA90CB90038000400C095106608BF
S31500021E6048790003 3B946006487900033B9A487917
S31500021E7000033B394E924FEF003A600000C84A39E0
S31500021E8000C0524967767C007E01203900C0619C01
S31500021E90C087670258B6DE8766F0487900033BE111
S31500021EA04E923015E848024000FF4A40620442A7BB
S31500021EB060163015E848024000FF534072003200B7
S31500021EC0EF892041487068002039 00E00250E58819
S31500021ED02F003F3900C0950E2F3900E002442F151E
S31500021EE04A546D087002D0543F0060023F1448798C
S31500021EF000033C154E924FEF001C60484A3900C061
S31500021F00524767066100FBC0603A4A3900C0524533
S31500021F1067066100FA36602C4A3900C052466706E7
S31500021F206100FA5A601E0813000766184A3900C093
S31500021F30524467083F3900C0528660043F3C0004A1
S31500021F406100FBD2424033C000A006E64CDF3CC033
S31500021F504E754E714E714E7148E7010C33C000A0AA
S31500021F6006E82A7C00C0950C287C00E0025608147C
S31500021F70000767580815000766520 8D4000608F9D4
S31500021F80000700C05D12487900033C454EB90002C5
S31500021F904356588F3E3CF600DE7900C0523E60063C
S31500021FA04EB90001A17E2F39000283884EB9000086
S31500021FB037100C40FFFF661408150007660E30073F
S31500021FC048C0223900C0523CB2806ED408150007C0
S31500021FD0672023FC00029ED000C0987023FC0002FA
S31500021FE09ED000C09874089400074EB900023 1884A
S31500021FF0600E487900033C624EB90002435658 8F80
S315000220000424033C000A006EA4CDF30804E754E7166
S315000220104E714E7133C000A006EC48E73F3E204F9A
S315000220202E7900C097F423C800C097F44CDF7CFCDD
S315000220304E754E714E714E7133C000A006EE48E7E2
S315000220403F3E204F2E7900C097F423C800C097F474
S315000220504CDF7CFC4E754E714E714E7148E73F3C2B
S315000220606033C000A006F0246F0034266F00383E2FDE
S315000220700 02C48C72007E7889087E588068000C0BD
S31500022080 78A62A40302F002C524048C0E5880680A8
S315000220900 00E003702840760130 3900C05E840240B9
S315000220A00FFF02400FFF026BF0000002816B00027D
S315000220B0302B0002720CE2680240000F0240000F51
S315000220C0E36802790FFF00C05E84817900C05E84F6
S315000220D0082A00010007670A02790FFF00C05E8224
S315000220E0601002790FFF00C05E820079A00000C076
S315000220F05E8242471E2D001A42451A2D001B700FA2
S31500022100720032070681000 2BB1A2041C010E9089C
S315000221100 22C000F0001812C0001102C0001E8089E
S31500022120 0200000F0200000FE9080239000F00C08A
S3150002213 05E93813900C05E937C003C052006D08008
S31500022140D086068000E002A272003207D0812040CB
S31500022150181018 8413C400C05E92675E3F3C0001EB
S31500022160 4EB900021894 3C0067060C46000166044C
S315000221707C016002424678003805200 4D080D08473
S31500022180D080D08D72003207D281D0812040DD50BE
S315000221904A4667263013720CE2680240000F0C4072
S315000221A0000A661602530FFF08EA0001000508EA54
S315000221B00001000708AA000100017C003C05220676
S315000221C0D281D286D281D28D74003407D482D28251
S315000221D02041301 0B07900E002AE653A700F72000D
S315000221E0320706810002BB1A2041C010E908022C00
S315000221F0000F0001812C00017C003C052006D080E6
S31500022200D086068000E002A272003207D08120400A
S3150002221018904203602052470C470003651042475C
S31500022220 52450C45000465063A07526D00181B47D5
S315000222300 01A1B45001B100333C000A006F24CDF38
S315000222403CFC205F4FEF00104ED04E714E714E7126
S3150002225 02F0733C000A006F423F900C0998600C0F8
S315000222605E82303C0FFF206F000CC068000C0240FB
S3150002227 00FFF0279F00000C05E84817900C05E849F
S315000222803F3C00034EB90002189408800000 4A4001
S315000222906604420760027E01100733C000A006F6FC
S315000222A02E1F205F4FEF00104ED04E714E714E71B1
S315000222B02F0D33C000A006F8206F001420B900C00D
S315000222C09986322F000848C1227C0002BAFA200100
S315000222D0E7889081E588068000C078A620407006CF
S315000222E020D951C8FFFC302F0008524048C0E5886B
S315000222F0068000E003702A40022D000F00014215FD
S31500022300700133C000A006FA2A5F205F4FEF00106B
S315000223104ED04E714E714E7133C000A006FC700154
S31500022320 33C000A006FE205F4FEF00104ED04E7164
S315000223304E714E7133C000A0070013FC000100E08D
S31500022340 02A213FC000200E002A313FC000400E058
S31500022350 02A433FC000500E002AE207C00E002622B
S31500022360 08A80003000208F9000000E0025933C081
S3150002237000A007024E754E714E714E7133C000A019
S31500022380 0704227C00E0026608E90003000232BC70
S31500022390 05A00269F80000020069000A000208F9B5
S315000223A0000100E0025933C000A007064E754E71C7
S315000223B04E714E712F0D33C000A007082A7C00C053
S315000223C0951C2ABC0002205C2B7C000222B0000471
S315000223D0487900033C9C486D000C487800104EB9C1
S315000223E0000010B8487900033CA7486D001C4878E5
S315000223F00 0084EB9000010B833C000A0070A2A5FD1
S315000224004E754E714E714E712F0D33C000A0070CE2
S3150002241 02A7C00C095402ABC000222502B7C000276
S3150002242 0231800044879000 33CAA486D000C48783A
S31500022430 00104EB9000010B8487900033CB3486D4D
S315000224400 01C487800084EB9000010B833C000A03E
S3150002245 0070E2A5F4E754E714E714E7148E70F3E5A
S31500022460 33C000A007104FEFFF18227C0002BC9A6F
S3150002247041D7703920D951C8FFFC267C00E002A260
S315000224804A3900C0525667484A3900C0525B67084B
S315000224903E3900C052E2600242477C003C072006F9
S315000224A0D080D08617B900C052C708007C003C070E
S315000224B02006D080D08617B900C052CB08017C0016
S315000224C03C072006D080D08617B900C052CF08023A
S315000224D04A3900C05253670A33F900C052C200E0BB
S315000224E002AE42B900C052942C7C00C052584A1621
S315000224F066084A3900C05259670813FC000100C039
S31500022500 52482F7C0288080100D4247C00024356DC
S3150002251060000244302F00D2024003FF4A40633873
S31500022520302F00D2024003FF534072003200E78987
S3150002253 0068100E002B02841302F00D2024003FF9C
S3150002254 053407E003E002007E7889087E588068094
S3150002255000C078A62A40600499CC2A4C4A3900C0A9
S31500022560525166164A3900C05252660E4A16660A19
S315000225704A3900C05259670001DE4A3900C0525931
S3150002258067142 00C670E102C0001C02C00030800F3
S3150002259000066029BCD4A16675C200D67584246CC
S315000225A0380660344247602 47A003A072005D08014
S315000225B0D085D080D08D72003204D281D081204065
S315000225C04A5056C0440048803C0052474A46660676
S315000225D00C47000465D252444A4666060C44000380
S315000225E065C24AB900C052D466064A466708600404
S315000225F04A4666029BCD4A3900C052526744082FAA
S3150002260000000600E767000150485748790003 3EF785

S315000226104E92487900033F20487900033F1B4879D0
S3150002262000033EFC4E92487900033F3B4879000383
S315000226303F36487900033F244E924FEF0020600058
S31500022640011608 2F000600E7670000B0424778002F
S3150002265038077A003A077C003C072206D281D286E6
S31500022660424010331802 3F002205D281D2854240F1
S315000226701033180 13F002204D281D2844240103323
S315000226801800 3F00487900033F444E924FEF000A7C
S3150002269052470C47000465B63F3900E002AE48795E
S31500022 6A000033F604E92486F0006487900033F7A66
S315000226B04E924FEF000E424542477C003C053F07D3
S315000226C02006D080D086D08B72003207D08120407F
S315000226D0424010103F00487900033F7F4E92508FD0
S315000226E052470C47000365D652450C45000465C89F
S315000226F0487900033F874E92588F200D6758486FDE
S31500022700007848790003 3F8F4E92508F42454247E8
S315000227107C003C052006D080D086D080D08D720009
S3150002272032 07D281D08120403F10487900033F947E
S315000227304E925C8F52470C47000365D852450C45B2
S3150002274000046 5CA302D001852403F004879000344
S315000227503F994E925C8F42A7486F00044EB9000122
S315000227608DF24A006600FDAE42404FEF00E833C0EC
S3150002277000A007124CDF7CF04E754E714E714E7101
S315000227803 3C000A00714227C00E0026A08E90003B5
S31500022790000232BC05A00269F80000020069002DA1
S315000227A0000208F9000200E0025933C000A0071631
S315000227B04E754E714E714E7133C000A00718227CC1
S315000227C000E0027608E90003000232BC05A00269B5
S315000227D0F80000020069002D000208F9000500E079
S315000227E0025933C000A0071A4E754E714E714E71D2
S315000227F033C000A0071C227C00E0027A08E900032D
S31500022800000232BC05A00269F80000020069002D30
S31500022810000208F9000600E0025933C000A0071EB4
S315000228204E754E714E714E7133C000A00720227C48
S31500022830 00E0028608E90003000232BC05A0026934
S31500022840F80000020069 00F0000208F9000100E049
S315000228500258 33C000A007224E754E714E714E715A
S31500022860 33C000A00724227C00E0028208E90003AC
S31500022870000232BC05A00269F80000020069002DC0
S31500022880000208F9000000E0025833C000A0072643
S315000228904E754E714E714E712F0D33C000A0072832
S315000228A02A6F0014227C0002BD94204D700320D9A9
S315000228B051C8FFFC2AB90002BDA423F90002BDA437
S315000228C000C09764700F23C000C097A4420033C0B3
S315000228D000A0072A2A5F205F4FEF00104ED04E71EC
S315000228E04E714E712F0D33C000A0072C2A6F0014B3
S315000228F0227C0002BDD0204D700320D951C8FFFCB6
S315000229002AB90002BDE023F90002BDE000C0977CAF
S31500022910 70FF23C000C097BC420033C000A0072E40
S315000229202A5F205F4FEF00104ED04E714E714E71EE
S315000229302F0D33C000A007302A6F0014227C00023C
S3150002294 0BDE4204D700320D951C8FFFC2AB900020C
S315000229 50BDF423F90002BDF400C0978070FF23C0C6
S31500022960 00C097C0700133C000A007322A5F205F03
S315000229704FEF00104ED04E714E714E712F0D33C077
S31500022980 00A007342A6F0014227C0002BDA8204D45
S3150002299 0700320D951C8FFFC2AB90002BDB823F939
S315000229A00002BDB800C0977070FF23C000C097B088
S315000229B0420033C000A007362A5F205F4FEF0010A7
S315000229C04ED04E714E714E712F0D33C000A0073896
S315000229D02A6F0014227C0002BDBC204D700320D950
S315000229E051C8FFFC2AB90002BDCC23F90002BDCCB6
S315000229F000C0977470FF23C000C097B4420033C072
S31500022A0000A0073A2A5F205F4FEF00104ED04E71AA
S31500022A104E714E712F0D33C000A0073C2A7C00C0B8
S31500022A2095D02ABC00022C0E2B7C0002297C0004C5
S31500022A30487900033FC0486D000C487800104EB933
S31500022A4000000010B8487900033FCB486D001C487857
S31500022A5000084EB9000010B823F90002BDB800C044
S31500022A60977070FF23C000C097B033C000A0073E26
S31500022A702A5F4E754E714E714E712F0D33C000A0F6
S31500022A8007402A7C00C095F42ABC00022C0E2B7C3F
S31500022A90000229C80004487900033FD1486D000CA2
S31500022AA0487800104EB9000010B8487900033FDBA1
S31500022AB0486D001C487800084EB9000010B823F98A
S31500022AC00002BDCC00C0977470FF23C000C097B44B
S31500022AD033C000A007422A5F4E754E714E714E7189
S31500022AE02F0D33C000A007442A7C00C095642ABC7F
S31500022AF000022C0E2B7C000228980004487900036 1
S31500022B003FE0486D000C487800104EB9000010B83E
S31500022B10487900033FED486D001C487800084EB91D
S31500022B20000010B823F90002BDA400C09764700823
S31500022B3023C000C097A433C000A007462A5F4E7583
S31500022B404E714E714E712F0D33C000A007482A7C7C
S31500022B5000C096602ABC00022C0E2B7C0002293093
S31500022B600004487900033FF3486D000C48780010D2
S31500022B704EB9000010B84879000340 01486D001CA8
S31500022B80487800084EB9000010B823F90002BDF4D7
S31500022B9000C0978042B900C097C033C000A0074A60
S31500022BA02A5F4E754E714E714E712F0D33C000A0C5
S31500022BB0074C2A7C00C0963C2ABC00022C0E2B7CB9
S31500022BC0000228E40004487900034007486D000C1F
S31500022BD0487800104EB9000010B8487900034017 33
S31500022BE0486D001C487800084EB9000010B823F959
S31500022BF00002BDE000C0977C42B900C097BC33C05A
S31500022C0000A0074E2A5F4E754E714E714E7148E70F
S31500022C10273E33C000A00750598F3E2F002C3A2F73
S31500022C20002E2A6F00387C01287C00C05E8A267C32
S31500022C3000E002404A7900E002546C00034C45D79A
S31500022C40300748C0E588068000C048B4204024907A
S31500022C504A92670000A220524A68001C670000984B
S31500022C6030280010720CE2680240000FB045660080
S31500022C700008641E800102A48289542B900C05E8EB7
S31500022C8008EC000300013F3C00034EB90002189411
S31500022C9008800000 4A40660004543 3C700E002542C
S31500022CA023ED000800E00250269508AB0003000160
S31500022CB023ED000400E0024443ED0018207C00C02E
S31500022CC0780A700320D951C8FFFC23ED001400C016
S31500022CD077DC23ED001000C0781A33ED000E00C039
S31500022CE0781E3F3C000020524868001C4EB9000185
S31500022CF0A8F8600003F82C7C00C05E8C30050C40FE
S31500022D0000867220C40000967660C400002670053
S31500022D1000C20C4000056700010 40C400006670073
S31500022D2001426000018402540FFF08D400073007F5
S31500022D3052 4048C0D080068000C0464820404A50D3
S31500022D406D24300752403F004EB900005448 2440DB
S31500022D504A80671208AC00020001302A000E524077
S31500022D603C806000014408EC00020001600001386A
S31500022D7002540FFF0054900030075 24048C0D080E2
S31500022D80068000C0467A20404A506D3C08AC0002DC
S31500022D90000130075 24048C0E188068000C02D0479
S31500022DA03207524148C1D281068100C0467A224189
S31500022DB0321148C1E589D08122402051302 8000EC7
S31500022DC052403C80600000E208EC00020001600014
S31500022DD000D602540FFF08D400053007524048C0FF
S31500022DE0E588068000C0491820404A90672408AC4E
S31500022DF000020001300752 4048C0E588068000C044
S31500022E00491822402051302 8000E52403C80600072
S31500022E1000980 8EC00020001600000 8C02540FFFCB
S31500022E20005450003007524048C0E588068000C072
S31500022E300497C20404A90672208AC00020001300714
S31500022E40524048C0E588068000C0497C2240205195
S31500022E503028000E52403C80604E08EC0002000111
S31500022E6060440 2540FFF00546000300752 4048C0CD
S31500022E70E588068000C050D220404A90672208ACFE
S31500022E800002000130075 24048C0E588068000C0B3
S31500022E9050D22240205130 28000E52403C80600819
S31500022EA008EC00020001425602 54F00F700123C0E2
S31500022EB000C05E8E02790FFF00C05E8208F900052F
S31500022EC000C05E823F3C00044EB9000218944A409C
S31500022ED0600021A303900C06084720CE268024051
S31500022EE0000F3214740CE4690241000FB04166000F

S31500022EF001FC4AB900C0608C660A420661000256AD
S31500022F00600001EA23F900C0608C00E0025033C77A
S31500022F1000E002542AB900C0608408AD0002000134
S31500022F2008AD000300010255F00F08ED0004000190
S31500022F300CB90000002000E00250650870FF2B402B
S31500022F4000046010700112390OE00253E3A85380B6
S31500022F502B400004227C000281B8207C00C077D47A
S31500022F60703320D951C8FFFC3091224D204B70039B
S31500022F7020D951C8FFFC33C700E00254427900C091
S31500022F80950E7C016000016630390OE00254B047BC
S31500022F906600015630137 20CE2680240000FB0451B
S31500022FA066000146301 3E2680240000F0C4000053D
S31500022FB065080C400006620C601E0C4000026600AA
S31500022FC0012460140C4000086500011A0C40000937
S31500022FD0620001126000000230137 20CE2680240C5
S31500022FE0000FB04566000102224B204D700320D926
S31500022FF051C8FFFC289523ED000400C05E8E0279BD
S315000230000FFF00C05E8208F9000500C05E823F3CE9
S315000230100034EB9000218944A40660000D04AB92D
S3150002302000C06088670000BE427900C0950E203954
S3150002303000C061A04680C1AD0004487900C0782670
S315000230402F3900C061A0487900C0608C4EB90001DA
S3150002305 0D41E4AAD0004667E4EB900008E28487919
S3150002306000C077D43015E848024000FF3F004EB951
S3150002307000 0086C82E3900E002503015E8480240AA
S3150002308000FFEB48720032009E814A876E087C017F
S31500023090610000C260167020BE806C0C7001EFA83F
S315000230A053802B40000460067 0FF2B40000430154D
S315000230B0E848024000FF5240024000FFE94802553C
S315000230C0F00F8155224D204B700320D951C8FFFCC9
S315000230D04EB900008E44224D204B700320D951C8B0
S315000230E0FFFC600861226004610000 9E1006588F92
S315000230F033C000A007524CDF7CE4205F4FEF001084
S315000231004ED04E714E714E7133C000A00754598F86
S3150002311 04A7900E002546D2C303900E0025448C06E
S3150002312 0E588068000C048B420402E904A97631274
S315000231303F3C0000206F00024868001C4EB90001A7
S3150002314 0A8F86110588F33C000A007564E754E710D
S315000231504E714E7133C000A0075833FCFFFF00E0EA
S31500023160025442B900E0024442B900E0024042B9C8
S31500023170 00E00250427900C0950E33C000A0075A03
S315000231804E754E714E714E7148E7010433C000A070
S3150002319 0075C4FEFFFC42A7C00E002544A556D00DB
S315000231A000BE4AB900E00250630000B03F7CFFFF58
S315000231B0000C2F7900E0025000082EB900E0024010
S315000231C02F7900E002440004227C00C0780A41EF15
S315000231D00018700320D951C8FFFC2F7900C077DC94
S315000231E000142F7900C0781A00103F7900C0781EAB
S315000231F0000E3F3C000A3F3C003843EF002C4EB91C
S3150002320000006B3A3E1548C7207900C0951020078A
S3150002321 0E788D087D080D1C02F680008002C486F7D
S31500023220002843EF003C4EB90000706C4AAF0038EC
S315000232306 3283F3C000A486F0002206F003E486840
S31500023240 00104EB900003B98301548C0E58806804C
S31500023250 00C048B4204020AF00386100FEF84FEFAE
S315000232600 03C33C000A0075E4CDF20804E754E71D5
S315000232704E714E7133C000A007604A7900E00254D5
S3150002328 06D046100FF0433C000A007624E754E71E3
S315000232904E714E712F0733C000A007647E0102797A
S315000232A00FFF00C05E8200795000 00C05E82027984
S315000232B00FFF00C05E8402790FFF00C05E8A08F924
S315000232C0000600C05E8A3F3C00034EB90002189415
S315000232D0088000004A4066024207100733C000A079
S315000232E007662E1F205F4FEF00104ED04E714E71B3
S315000232F04E712F0D33C000A007682A6F001423F900
S315000233000002BE0800C0976C42B900C097AC227C8E
S3150002331000002BDF8204D700320D951C8FFFC2AB91E
S3150002332000002BE08700133C000A0076A2A5F205F50
S315000233304FEF00104ED04E714E714E7133C000A049
S3150002334 0076C08F9000400E0025933C000A0076EBA
S315000233504E754E714E714E712F0D33C000A007701F
S3150002336023F90002BE0800C097982A7C00C095ACDB
S315000233702ABC000232942B7C000232F20004487905
S31500023380003401C486D000C487800104EB900003E
S31500023390 10B848790003402948 6D001C4878000897
S315000233A04EB9000010B823F90002BE0800C0976C9F
S315000233B042B900C097AC33C000A007722A5F4E75AF
S315000233C04E714E714E7133C000A00774322F000445
S315000233D04A416D28300148C0E788068000E002B005
S315000233E0204008E8000400013001 48C0E788068052
S315000233F000E002B0204008A80004000733C000A085
S3150002340007 76205F548F4ED04E714E714E712F0744
S31500023410 33C000A007787E0102790FFF00C05E82EA
S315000234200079500000C05E8202790FFF00C05E8400
S31500023430 0079F00000C05E8A3F3C00034EB90002EC
S315000234401894088000004A4066024207100733C0FB
S3150002345000A0077A2E1F205F4FEF00104ED04E714C
S315000234604E714E7133C000A0077C23F90002BE1CC8
S3150002347000C0979842B900C097D8700133C000A027
S31500023480077E205F4FEF00104ED04E714E714E7187
S315000234903 3C000A0078008F9000700E0025833C0D5
S315000234A000A007824E754E714E714E712F0D33C0BC
S315000234B000A007842A7C00C097382ABC0002340E7A
S315000234C02B7C000234640004487900034034486DC2
S315000234D000C487800104EB9000010B84879000375
S315000234E0403E486D001C487800084EB9000010B8EE
S315000234F023F90002BE1C00C0979842B900C097D8B3
S31500023500 33C000A007862A5F4E754E714E714E710A
S315000235102F0733C000A007883E2F0008300753400C
S31500023520 48C0E188068000C07D080680FFF80000DA
S3150002353020 40300753404 8C0E788068000E002B0CA
S31500023540 22404A476D3E303C00FFC06F000A0250DF
S31500023550FF0081500228000000 2102F000D812872
S31500023560 0002302F000E02400001720BE368089041
S31500023570000381 5008A90007000608E900070004B5
S3150002358008D1000733C000A0078A2E1F205F508F84
S315000235904ED04E714E714E712E7C00E006742C7C1C
S315000235A0000000013FC00040080400213FC00002F
S315000235B0008040034EB900008F8C2E7C00C0E47858
S315000235C02C7C00C0AE684E664EB900008FDA60FEF3
S315000235D0205F20172F002F08207C000002644EFB7C
S315000235E088FE205F20172F002F08207C000002BCD7
S315000235F04EFB88FE205F20172F002F08207C00003C
S3150002360002944EFB88FE205F20172F002F08207C95
S31500023610000002564EFB88FE206F0004226F00084F
S3150002362020992151000430100880000F0C407FF0D1
S31500023630 6E0408500007205F504F4ED0206F0008DE
S315000236 40226F000C48E73F3E2F2800042F102F2937
S31500023650000042F11610004F2201F221F4CDF7CFCA4
S31500023660206F000420C020C1205F4FEF000C4ED017
S31500023670206F0008226F000C48E73F3E2F28000407
S315000236802F102F2900042F113017670E0880000F04
S31500023690 0C407FF06E04085700076100 04AC60B866
S315000236A0206F0008226F000C48E73F3E2F280004D7
S315000236B02F102F2900042F1161000580609A206FB8
S315000236C00008226F000C48E73F3E2F2800042F1007
S315000236D02F2900042F116100062E6000FF7C206F47
S315000236E0000848E73F3E2F10610002E0201F221F1C
S315000236F04CDF7CFC206F000420C020C1205F504FAD
S315000237004ED0206F000848E73F3E2F2800042F10B6
S3150002371061000296201F4CDF7CFC206F0004208093
S31500023720205F504F4ED0206F0004700032100241CD
S3150002373 07FFF67027001205F584F4ED0206F000452
S31500023740226F000848E73F3E2F2800042F102F293A
S3150002375000042F11610006A64CDF7CFC691C6D0A71
S3150002376 06E107000205F504F4ED070FF205F504F9A
S31500023770 4ED07001205F504F4ED07002205F504FE6
S31500023780 4ED07000222F00084AAF000C67080801CD
S3150002379 0001F670270FF48E73F3E61000252201F8A
S315000237A0221F4CDF7CFC206F000420C020C1205F5A
S315000237B04FEF000C4ED0206F000848E73F3E2F28FF
S315000237C000042F106100027A4CDF7CFC206F00049B

S315000237D02081205F4FEF000C4ED0206F0004700056
S315000237E0081000767027001205F584F4ED0206F05
S315000237F0000470004AA80004661022100881001F07
S315000238000C817FF0000066027001205F584F4ED097
S31500023810206F000442984290205F584F4ED0206F8E
S315000238200004226F0008201122000881001F0C816B
S315000238307F8000006E040840001F2080205F504FEA
S315000238404ED0206F0008226F000C48E73F3E2F1033
S315000238502F116100080E201F4CDF7CFC206F000434
S315000238602080205F4FEF000C4ED0206F0008226FA1
S31500023870000C48E73F3E2F102011220067100881F6
S3150002388001F0C807F8000006E040840001F2F007E
S31500023890610007D060C0206F0008226F000C48E765
S315000238A03F3E2F102F116100084E60AA206F0008BC
S315000238B0226F000C48E73F3E2F102F11610008C40B
S315000238C06094206F00047000221002817FFFFFFC8
S315000238D067027001205F584F4ED0206F0004226F9E
S315000238E0000848E73F3E2F102F116100092C4CDFDC
S315000238F07CFC691C6D0A6E107000205F504F4ED022
S3150002390070FF205F504F4ED07001205F504F4ED057
S315000239107002205F504F4ED07000222F00084AAF2F
S31500023920000C67080801001F670270FF48E73F3E68
S31500023930610000BC61000072201F4CDF7CFC206F1E
S31500023940000042080205F4FEF000C4ED0206F00084D
S3150002395048E73F3E2F10610006664CDF7CFC206F75
S31500023960000042080205F4FEF000C4ED0206F000431
S3150002397070000810000767027001205F584F4ED092
S31500023980206F0004700022100881001F0C817F80C6
S315000239900000066027001205F584F4ED0206F00046F
S315000239A04290205F584F4ED061000546C0406700E6
S315000239B0099E0C4007FF67080640FC806000094C20
S315000239C0E38A66000970600009726100091CC04042
S315000239D0670005B00C4000FF670A06400380428379
S315000239E060000540E38A6600057C60000580205F72
S315000239F095CAC080660AC281660E2F002F004ED07D
S31500023A006C06538A44814080243C0000043EC080F8
S31500023A10660604420020C1410C800000FFFF620CD2
S31500023A20484048413001424104420010C0806B08C0
S31500023A305342E381E3906AF8C1422601600004E43E
S31500023A40610004AE61024ED0C0406606908042819B
S31500023A504E750C4003FF640A42804281003C00110D
S31500023A604E7504400043E6D0E70FF72FFE288240A12
S31500023A70928291824E75428144400C4000206D0C28
S31500023A80C68356C126024282044000200C40001022
S31500023A906D0E8243360248434242484204400010B9
S31500023AA053406D0AE28AE293E39151C8FFF8B4FCEF
S31500023AB0000067044483408270FFD081C540C7413D
S31500023AC04E756100042C6180640CB4FC000067062C
S31500023AD05381640253804ED0610004160C400433B5
S31500023AE064623800044403FE6E14380A660642A76E
S31500023AF042A74ED042A72F3CBFF000004ED072FF25
S31500023B000C4400206F1E04440020E8A92803C88143
S31500023B106732B983B4FC0000672A42845281D68197
S31500023B20D584601AE8A92802C881B98288834283AB
S31500023B304A846710B4FC0000670A5281D481640487
S31500023B40E2925240600003DC610003480C4007FF2A
S31500023B50661EE38A6600040E0C4107FF6600040E29
S31500023B60E38C66000400B7CA660003FA600003FE2F
S31500023B700C4107FF660CE38C660003EA244B6000E7
S31500023B8003ECC2416700039CC040660C300124046A
S31500023B902605244B6000038CB0416408C544C74522
S31500023BA0C141C54B924044410C4100356200037449
S31500023BB00C4100206D082A044284044100200C4175
S31500023BC000106D0C3A04424444845484404410 01032
S31500023BD07EFFE2AFE2BCE2BDCA87B985C887B98576
S31500023BE0B7CA6612D685D5B464000338E292E29398
S31500023BF05240600003 2E9685958464064483408273
S31500023C00244BC482660CC54304400020C48267006C
S31500023C1003720C820000FFFF620C484248433403E1
S31500023C20424304400 0104A826B0002F85340E38B81
S31500023C30E3925BC8FFFA600002EA610002563C0AA0
S31500023C403E0BBD473447C040660C0C4107FF670078
S31500023C5003146000032E0C4007FF661EE38A66000B
S31500023C600304C241670002FE0C4107FF660002FE22
S31500023C70E38C670002F8600002ECC24167000304AD
S31500023C800C4107FF660AE38C670002E2600002D677
S31500023C90D041044003FE364020022205612C2A0050
S31500023CA0200322046124260020022204611C42828F
S31500023CB0D685D582D681D580300B4A826B000264C6
S31500023CC0E383E39253406000025A3C004841CCC170
S31500023CD0484048413E01CEC0DE869D86448648461F
S31500023CE048473C073E014841C2C04840C0C7424718
S31500023CF0C141D287D1864E7561000198C54BC1413B
S31500023D00C544C74560046100018A3C0A3E0BBD47B3
S31500023D103447C0406618C2416700024A0C4107FF99
S31500023D206600024AE38C67000244600002380C40D7
S31500023D3007FF6618E38A6600022CC2416700024446
S31500023D400C4107FF66000238600002 1AC241670092
S31500023D5002320C4107FF660AE38C6700021060001C
S31500023D6002049240064103FF36412F052F047C01CF
S31500023D70E49E48428CC238063E06484442468CC2FD
S31500023D8038062C024246E28E8CC2CCC7E08EEE8EFC
S31500023D909886E38C9D86888648422004611A44836D
S31500023DA040822B006112E383E392640474FF76FF83
S31500023DB0281F2A1F6000FEE23202C2C44842484 35C
S31500023DC03E033C02CEC4CCC43E064246484648 4761
S31500023DD0DE814281DD8148443A033202CAC4C2C44A
S31500023DE0DE85DD8148424843C6C4C4C43602424227
S31500023DF048424843D687D58648444E7561000094AA
S31500023E000C4007FF662AE38A6706700244C04ED05A
S31500023E100C4107FF6608E38C66F0B6CA67EC300A07
S31500023E200A4000086002300B0240000844C04ED02F
S31500023E300C4107FF6606E38C66D060EAB6CA66E600
S31500023E403C003E009C416A043E014446E24E670A3B
S31500023E5092409140320AB34060CE3F072F083E0A95
S31500023E6046473447 41FA00066000FD18201F221F0C
S31500023E7020572E812F002F08610000753A1FC0407E
S31500023E80670C9A400C4500336C04300A609A9040E5
S31500023E904ED0225F205F201F261F9442E390954258
S31500023EA03442E198E7982400024007FF6714B142C2
S31500023EB0E28A08C2001FE19BE79BB7420243F80071
S31500023EC0B742221F2A1F9844E39199443644E19946
S31500023ED0E7992801024107FF6714B344E28C0BC43C
S31500023EE0001FE19DE79DBB440245F800BB444ED14D
S31500023EF0225F205F201F261F9442E39095423442A0
S31500023F00E198E7982400024007FF6714B142E28A6B
S31500023F1008C2001FE19BE79BB7420243F800B74283
S31500023F204ED10683000004 00640A52826406E292BD
S31500023F30E2935240C0406F460C4007FF6C2E02438C
S31500023F40F800B5430242F800B5439241E392D440E9
S31500023F50E09AE69A300AE340E292E093E69B2F0360
S31500023F602F024ED070FF2F002F004ED0200A223C87
S31500023F70FFE00000E340E29142A72F014ED04E71CE
S31500023F8060024E7142A742A74ED0205F95CAC080FA
S31500023F9066042F004ED06C04538A4480243C0000F1
S31500023FA0008E4840C04067064840064200 10C08066
S31500023FB06B065342E3806AFAC1426000034E610017
S31500023FC003286102 4ED0C040660490804E750C40B4
S31500023FD0007F64089080003C00114E750440009EEC
S31500023FE0650870FFE288908A4E754440E0BA72FF17
S31500023FF0E0A94681C282B382200AB580908A74FF04
S315000240000D2824E75610002E261BC6408B4FC000013
S3150002401067025 3804ED0610002D00C4000966400C5
S3150002402002EA36000443007E6E14340A66082F3C08
S315000240300000000004ED02F3CBF8000004ED072FF21
S31500024040E6A97601D681C282670002C0B382B4FCB9
S3150002405000006700 02B6D4836404E3925240600013
S31500024060 02AA610002460C4000FF661EE38A660051
S3150002407002C40C4100FF660002C2E38B660002B670
S31500024080B7CA660002B0600002B20C4100FF660CBD
S31500024090E38B660002A0244B600002A0C241670ABD
S315000240A0C040660A30012403244B60000274B0410A

```
S315000240B06406C543C141C54B924044410C410018B8
S315000240C062000248E2ABB7CA660ED4836400023CC1
S315000240D0E29252406000023494836700027264O4E2
S315000240E04482244BC4826B0002225340D4825BC8B2
S315000240F0FFFC6000021661000lB2380A3A0BB945AC
S31500024100344 5C040660C0C4100FF6700022860007F
S31500024110023E0C4000FF661EE38A66000218C24198
S31500024120670002120C4100FF66000210E38B670073
S315000241300 20A60000200C241670002140C4100FF3D
S315000241406 60AE38B670001F4600001EAD04104408D
S31500024150007E38023A034842CAC24843C8C3C4C3AF
S31500024160DA849B4544454845D4856B00019E5340FD
S31500024170D48260000196610001 32C54BC141C5433C
S3150002418060046100012638 0A3A0BB9453445C0403D
S31500024190661 8C2416700019E0C4100FF6600019C41
S315000241A0E38B670001966000018C0C4000FF6618E5
S315000241B0E38A66000180C241670001940C4100FF58
S315000241C0660001886000016EC241670001820C41EF
S315000241D000FF660AE38B67000162600001589041A6
S315000241E04440064 0007FC5432802E28C484388C308
S315000241F034043A044842424488C3340428034244FD
S31500024200E28C88C3C8C5E08CEE8C94846B0000FCFB
S31500024210534 0D482600000F4610000900C4000FF1D
S31500024220662AE38A6706700244C04ED00C4100FF3C
S31500024230660 8E38B66F0B6CA67EC300A0A400008E5
S315000242406002300B0240000844C04ED00C4100FF11
S315000242506605E38B66D060EAB6CA66E638003A00BE
S3150002426098416A043A014444E24C670A92409140FA
S31500024270320AB34060CE3F052F083A0A4645344516
S31500024280 41FA00066000FE16201F20572E802F08D6
S31500024290610000563A1FC040670C9A400C45001454
S315000242A06C04300A609E90404ED0225F205F201F31
S315000242B0E38095423442E1982400024000FF670AF7
S315000242C00242FE00E28A08C2001F221FE3819743D0
S315000242D03643E1992601024100FF670A0243FE00C6
S315000242E0E28B08C3001F4ED1225F205F201FE380AE
S315000242F095423442E1982400024000FF670A0242D6
S31500024300FE00E28A08C2001F4ED10682000000802B
S31500024310 6404E2925240C0406F300C4000FF6C1AB7
S31500024320 0242FF00E382D440E09A300AE340E2927E
S31500024330 2F024ED070FF2F004ED0200A223CFF00E3
S3150002434 00000E340E2912F014ED04E7160024E71A1
S315000243509 0802F004ED02F0733C000A0078C486FE5
S31500024360000C204F2F28000C2F390002838C48792D
S31500024370000035EC4EB9000244D43E0033C000A022
S3150002438 0078E2E1F4E754E714E714E712F0733C01A
S3150002439000A00790206F00084210486F0010204FBF
S315000243A02F280010486F0010487900025B2C4EB986
S315000243B0000244D43E0033C000A007922E1F4E7561
S315000243C04E714E714E714BE7070C33C000A0079438
S315000243D03E2F00183A2F001A2A6F001C286F002061
S315000243E0600E2F0C3F054E95B045670470016012B2
S315000243F04A475EC0440048803C0053474A4666E24C
S31500024400424033C000A007964CDF30E0205F4FEFFA
S31500024410000C4ED04E714E714E7148E7071C33C0E8
S31500024420000A007983A2F001C266F0022286F00264C
S315000244302A6F002A1C2B000348861E13488 70C4746
S3150002444000030671A4A2B000566142F0D2F0C3F0702
S31500024450204F3F28002A6100FF6E4A4066584A45AF
S31500024460670A2F0D3F054E94B045664A4A466726AF
S31500024470 4A6F001E67202F0D3F3C00304E940C40C1
S3150002448 0003066320C6F0002001E660A2F0D3F06D0
S3150002449 04E94B04666200C470030661E4A2B000535
S315000244A066182F0D2F0C3F07204F3F28002A610068
S315000244B0FF164A40670470FF6002424033C000A004
S315000244C0079A4CDF38E0205F4FEF00124ED04E7154
S315000244D04E714E7148E73F3E33C000A0079C4FEF36
S315000244E0FFCC2C6F0064246F00682A6F006C286F63
S315000244F0007042 44422F0028600005220C47002526
S31500024500660C528D1E1548870C47002566125244CA
S315000245102F0A3F074E96B0476700050060000 4F871
S315000245201F7C0020000C1F7C0020000D422F000E75
S31500024530422F000F422F0010422F00113F7CFFFF37
S3150002454000123F7CFFFF00140C47002D66081F7CFB
S31500024550000100116036 0C47002B66081F7C000123
S31500024560000E60280C47002066081F7C0001001020
S31500024570601A0C47002366081F7C0001000F600CBE
S3150002458 00C470030660E1F7C0030000C528D1E1543
S315000245904887 66B40C47002A57C0440048803F400B
S315000245A0002C4A406708528D1E154887602E207CD3
S315000245B00002C01D08300002700067202F0D4EB9A0
S315000245C000025CF63F400012528D1E154887207C81
S315000245D00002C01D0830000270006 6EC42430C4720
S315000245E0002E663E528D1E1548870C47002A57C07C
S315000245F04400488036006708528D1E15488760229F
S315000246002F0D4EB900025CF63F4000146006528D33
S315000246101E154887207C0002C01D083000027000 6B
S31500024620 66EC42450C470068670C0C47006C67064F
S31500024630 0C47004C66083A07528D1E154887426F92
S31500024640003 2426F0030426F002A3F07487900026B
S31500024650BE204EB900027674 26404A80670000B832
S3150002466 04A6F002C67185 48C3F6CFFFE00124A6F8B
S31500024670001 26C0A1F7C00010011446F00124A43AB
S3150002468 06714548C3F6CFFFE00144A6F00146C06CC
S31500024690 3F7CFFFF0014B7FC0002BE216212300508
S315000246A00C40006C672C548C342CFFFE48C26066AA
S315000246B0B7FC0002BE25621230050C40006C671280
S315000246C0548C7400342CFFFE604CB7FC0002BE26EC
S315000246D06208588C242CFFFC603CB7FC0002BE2A00
S315000246E065340C6FFFFF001466063F7C000600145B
S315000246F00C45004C6610508C2F6CFFF800042F6C92
S31500024700FFFC00086010588C486CFFFC486F0008DC
S315000247104EB9000236DE30070C4000786200017C9A
S31500024720207C000000 33720E5288B03B88FE53C9CB
S31500024730FFF866000166D281323B18064EFB100274
S3150002474000A8008A011C00A2006C00F6002E00D010
S3150002475000D000D0002E015200A200D000D0454762
S315000247605 8636465666 7696E6F707375784E486FD5
S31500024770001 73F3C00003F3C000A2F024EB90002E0
S3150002478 06EDA2640101B48803F4000324A2F000E48
S3150002479066740C40002B666E4A2F001067083F7C39
S315000247A00020003260 60426F0032605A486F0017B4
S315000247B03F3C00003F3C00082F024EB90002702029
S315000247C026403F7C00010030603C486F00173F3CAA
S315000247D00003F3C000A2F024EB90002702026401C
S315000247E060243F7C0001002A486F0017204F3F28B3
S315000247F0002E3F3C00102F024EB900027020 2640C8
S315000248003F7C000200303F7C0001002E600000A0C9
S31500024810486F000C3F07486F000A2F0A2F0E4EB949
S31500024820 00026AB63C004A466D0001ECD8463F7C5F
S3150002483000 02002E607830050C40006C660E588C23
S3150002484 0300448C0206CFFFC20806 00858 8C206C25
S31500024850FFFC30843F7C0003002E6052588C266C8D
S31500024860FFFC426F002E0C6FFFFF0014660C2F0B2D
S315000248704EB9000266482C0060342E8B4246600414
S31500024880524652 97BC6F00146C2420574A10671E7A
S31500024890 60EE548C42471E2CFFFF1F47002747EF4E
S315000248A000273F7C000100147C01426F002E0C6F32
S315000248B0 0001002E660000E80C6FFFFF0014670679
S315000248C01F7C0020000C4A826612426F0030424072
S315000248D01F40000F4A6F00146602421 32F0B4EB997
S315000248E0000266482C00362F001496464A436F1281
S315000248F04A2F000F670E0C6F000100306606534305
S3150002490060242433A2F00129A469A434A2F000FF8
S315000249106 70C9A6F0030D86F00301F47000F4A6F3E
S31500024920003267045345 52444A456C0242453006FA
S31500024930D045D043D8402F0A2F0E486F00143F05AA
S31500024940204F3F28003E204F3F2800426100FACC0C
S315000249504A40660000C22F0A2F0E3F3C00303F033A
S3150002496 06100FA644A40671060 0000AC2F0A3F07F4
S315000249704E96B047660000A042471E1B66EE4A2FBF
S315000249800011670000962F0A2F0E102F001548807F
```

```
S315000249903F003F056100FA304A40677E60784A6F01
S315000249A0002E66760C6FFFFF0014670A302F001484
S315000249B0B0466C023C003E2F00129E464A476C02ED
S315000249C042473006D047D8404A2F001166262F0AA2
S315000249D02F0E102F001448803F003F076100F9E8B0
S315000249E04A40671060304245lA1B2F0A3F054E9611
S315000249F0B04566223A0651CEFFEE4A2F0011671ADB
S31500024A002F0A2F0E102F001548803F003F07610026
S31500024A10F9B64A40670470FF600C528D42471E1574
S31500024A206600FADA30044FEF003433C000A0079E66
S31500024A304CDF7CFC205F4FEF00104ED04E714E7162
S31500024A404E7133C000A007A0322F00044A416E0601
S31500024A50300144406002300133C000A007A2205F4B
S31500024A60548F4ED04E714E714E714E56FFF833C072
S31500024A7000A007A42D49FFFC3F3C00002F2E000892
S31500024A8043EEFFF8615843EEFFF8206EFFFC2091DB
S31500024A9033C000A007A64E5E205F588F4ED04E71DF
S31500024AA04E714E714E56FFF833C000A007A82D492D
S31500024AB0FFFC3F3C00012F2E000843EEFFF8611E6B
S31500024AC043EEFFF8206EFFFC209133C000A007AA38
S31500024AD04E5E205F588F4ED04E714E714E714E56BD
S31500024AE0FFDC48E7031C33C000A007AC2D49FFFCDE
S31500024AF048790002BE58486E00084EB9000238DAFC
S31500024B004A405DC0440048803C003E2E000C4BEEFD
S31500024B10FFF82F2E0008224D4EB9000262A449EE7C
S31500024B20FFF448790002BE6C2F0D4EB9000238DA46
S31500024B304A406C0628956000010247EEFFF048796C
S31500024B400002BE702F0D4EB9000238DA4A406F726B
S31500024B5030074440524O3E0048790002BE742F0D91
S31500024B604EB9000238DA4A406F1233FC002100C007
S31500024B707B4A227C0002BE586000011C3F3CFFFFBC
S31500024B802F0D48790002BE74486EFFEC4EB9000242
S31500024B90386A2F2EFFEC224B4EB90002631C2F13EC
S31500024BA0224D4EB9000255D43F3C00012F1543EE6B
S31500024BB0FFEC4EB90002631C2AAEFFEC0A558000D8
S31500024BC0600C2F0D2F0D2F0B4EB900023896487927
S31500024BD00002BE303F3C00042F1343EEFFE84EB9FD
S31500024BE00002618E48790002BE443F3C00052F1345
S31500024BF043EEFFEC4EB90002620C2F0B2F0D486EEE
S31500024C00FFE44EB900023896486EFFE8486EFFE4AC
S31500024C10486EFFE04EB900023896486EFFEC486EC9
S31500024C20FFE0486EFFDC4EB9000238AC486EFFDC8E
S31500024C302F0D2F0C4EB9000238424A6E000C673611
S31500024C404A4667183007480E58806800002BE64F7
S31500024C502F002F0C4EB9000235D060382F0C3007CA
S31500024C6048C0E58806800002BE5C2F002F0C4EB9B4
S31500024C700002386A601E300748C0E58806800002D6
S31500024C80BE5C2F002F0C4EB9000235D04A4667048F
S31500024C900A548000224C206EFFFC209133C000A0F3
S31500024CA007AE4CDF38C04E5E205F5C8F4ED04E7131
S31500024CB04E714E714E56FFDC48E7010C33C000A020
S31500024CC007B02D49FFFC42474BEEFFF82F2E000896
S31500024CD0224D4EB9000262A448790002BEA82F0DE9
S31500024CE04EB9000238DA4A406F122F0D4879000297
S31500024CF0BEA82F0D4EB9000238AC7E0248790002DA
S31500024D00BEAC2F0D4EB9000238DA4A406F4A4879D6
S31500024D100002BEB02F0D486EFFEC4EB900023842BB
S31500024D2048790002BEB02F0D486EFFE84EB9000268
S31500024D303896487900002BEB4486EFFE8486EFFE432
S31500024D404EB900023842486EFFEC486EFFE42F0D62
S31500024D504EB9000238AC52472F1543EEFFEC4EB95E
S31500024D600000262A449EEFFF048790002BEB8486E1E
S31500024D70FFEC4EB9000238DA4A406C06289560000C
S31500024D800822F0D2F0D486EFFF44EB900023896A1
S31500024D9048790002BE783F3C00032F2EFFF443EE13
S31500024DA0FFE84EB90002618E48790002BE883F3C98
S31500024DB000042F2EFFF443EEFFEC4EB90002620C04
S31500024DC0486EFFF42F0D486EFFE44EB900023896 86
S31500024DD0486EFFE8486EFFE4486EFFE04EB90002F7
S31500024DE03896486EFFEC486EFFE0486EFFDC4EB91F
S31500024DF0000238AC486EFFDC2F0D2F0C4EB90002B4
S31500024E0038420C4700016F040A548000300748C03C
S31500024E10E5880680002BE982F002F0C4EB90002CC
S31500024E2035D048790002BEBC486E00084EB9000271
S31500024E3038DA4A406C040A548000224C206EFFFC89
S31500024E40209133C000A007B24CDF30804E5E205F57
S31500024E50588F4ED04E714E714E714E56FFF02F0D39
S31500024E6033C000A007B42D49FFFC4BEEFFF8486E95
S31500024E7000C4EB9000238C24A006620486E00088D
S31500024E804EB9000238C24A00664633FC002100C011
S31500024E907B4A227C0002BEBC60000092486E000C77
S31500024EA0486E0008486EFFF04EB9000238AC2F2E4D
S31500024EB0FFF043EEFFF44EB9000262A44879000205
S31500024EC0BEC0486EFFF44EB9000238DA4A406D0899
S31500024ED02ABC3FC90FDB600A2F2EFFF4224D610068
S31500024EE0FDD448790002BEBC486E000C4EB90002E1
S31500024EF038DA4A406C1C2D55FFF40A6E8000FFF426
S31500024F0048790002BEC4486EFFF42F0D4EB9000266
S31500024F1038424B790002BEBC486E00084EB900020B
S31500024F2038DA4A406C040A558000224D206EFFFC96
S31500024F30209133C000A007B62A5F4E5E205F508FD5
S31500024F404ED04E714E714E714E56FFF848E7030031
S31500024F5033C000A007B82D49FFFC3E2E00083C2EA8
S31500024F600000A41EEFFF8300748C081C6208043EEB2
S31500024F70FFF8206EFFFC209133C000A007BA4CDF79
S31500024F8000C04E5E205F588F4ED04E714E714E71EC
S31500024F904E56FFF448E7030033C000A007BC2D4974
S31500024FA0FFFC2E2E00082C2E000C41EEFFF42007EB
S31500024FB06A02448022066A0244810C8100010000D2
S31500024FC0641280C1690E2200424148410280000FB
S31500024FD0FFFF601E2F011F3C00204281E388E39100
S31500024FE0B2AF0002650692AF00025280531766EC1A
S31500024FF05C8F4A876A024481208122O7B3866A024D
S3150002500004480214000443EEFFF4206EFFFC20D9C9
S3150002501020913 3C000A007BE4CDF00C04E5E205F69
S3150002502050 8F4ED04E714E714E712F002F014A8015
S315000250306A0244804A816A0244810C8100010000AE
S31500025040641280C1690E22004241484102800007A
S31500025050FFFF601E2F011F3C00204281E388E3917F
S31500025060B2AF0002650692AF00025280531766EC99
S3150002507005C8F221FB39F6A0244804E7548E7C000C8
S315000250804A806A0244804A816A0244810C81000194
S31500025090000641280C1690E220042414841028O2A
S315000250A00000FFFF601E2F011F3C00204281E388A3
S315000250B0E391B2AF0002650692AF00025280531727
S315000250C066EC5C8F4A9F6A02448120O1221F4E755C
S315000250D04E56FFCE48E7000C33C000A007C02D494C
S315000250E0FFFC49EE000848790002BEDC2F0C4EB9DF
S315000250F0000238DA4A406C1233FC002100C07B4AB7
S31500025100227C0002BEDC6000014E2F0C4EB900026A
S31500025110038C24A00661233FC002200C07B4A227C57
S3150002512000002BEE0600001304BEEFFF62ABC3F8073
S31500025130000486EFFFA2F14224C4EB9000262DAC2
S3150002514048790002BEE42F0C4EB9000238DA4A4012
S3150002515006E0A2ABC3F000000536EFFFA3F3C000174
S3150002516 02F0D2F0C486EFFF24EB9000238422F0D5A
S3150002517 02F0C486EFFEE4EB90002386A486EFFF2F7
S315000251804 86EFFEE486EFFEA4EB9000238AC2F2E8B
S31500025190FFEA224D4EB90002631C2F0D2F0D486EF9
S315000251A0FFF24EB900023896487900002BEC83F3C6B
S315000251B000022F2EFFF243EEFFEA4EB90002618E85
S315000251C048790002BED43F3C00022F2EFFF243EE86
S315000251D0FFEE4EB90002620C302EFFFA486EFFE671
S315000251E048C04EB900025AEC48790002BEE8486E41
S315000251F0FFE6486EFFE24EB900023896486EFFF2AD
S315000252002F0D486EFFDE4EB900023896486EFFEA51
S31500025210486EFFDE486EFFDA4EB900023896486ED7
S31500025220FFEE486EFFDA486EFFD64EB9000238AC82
S31500025230486EFFD62F0D486EFFD24EB90002384295
S31500025240486EFFE2486EFFD2486EFFCE4EB90002AC
S31500025250384243EEFFCE206EFFFC209133C000A001
S31500025260007C24CDF30004E5E205F588F4ED04E7123
```

S315000252704E714E714E56FFF433C000A007C42D493D
S31500025280FFFC2F2E000843EEFFF86100FE4448792A
S315000252900002BEE0486EFFF84EB9000238DA4A4014
S315000252A06608227C0002BEE0601848790002BEEC65
S315000252B0486EFFF8486EFFF44EB90002389643EE88
S315000252C0FFF4206EFFFC209133C000A007C64E5E9D
S315000252D0205F588F4ED04E714E714E714E56FFF072
S315000252E048E7010433C000A007C82D49FFFC4BEE76
S315000252F0000C4247486E00084EB9000238C24A0006
S3150002530066144879002BEDC2F0D4EB9000238DA67
S31500025310 4A406F32603848790002BEDC486E0008A7
S315000253204EB9000238DA4A406C2E2F1543EEFFF8CA
S315000253304EB900026088486EFFF82F0D4EB9000282
S3150002534038DA4A40671033FC002100C07B4A227CCF
S3150002535000002BEDC60727E014A4767122D6E0008AB
S31500025360FFF00A6E8000FFF043EEFFF0600443EEAA
S3150002537000082F1143EEFFF46100FD56486EFFF45C
S31500025380 2F0D486EFFF04EB9000238962F2EFFF011
S315000253904 3EEFFF84EB900025D904A4767262F3C5E
S315000253A0400000002F1543EEFFF44EB900025F8E57
S315000253B0486EFFF44EB9000238C24A0067060A6E0A
S315000253C08000FFF843EEFFF8206EFFFC209133C009
S315000253D000A007CA4CDF20804E5E205F508F4ED061
S315000253E04E714E714E7148E70F3E33C000A007CC96
S315000253F02C6F00282A2F0030200ED085244078FFFB
S31500025400 60342A4A602A200D908526402F0D2F0BE4
S31500025410 206F003C4E904A406F1A284D2A4B2E05AB
S31500025420 60081C1418D51AC6DE844A8762F42A4B11
S31500025430BBCE62D2D5C5B5EF002C63C633C000A081
S31500025440 07CE4CDF7CF0205F4FEF00104ED04E713E
S315000254504E714E7148E70F3E33C000A007D078FF69
S31500025460266F00282C2F0030600000D82007E28823
S31500025470 22064EB900027B58D08B28402A4B2E06B4
S31500025480 60081A1418D51AC5DE844A8762F4200BFE
S31500025490D08628402A6F002C6002D9C6B9EF002CAC
S315000254A064122F0B2F0C206F003C4E904A406C0466
S315000254B060E89BC6BBCB630E2F0B2F0D206F003C03
S315000254C04E904A406EECB9CD641A2C4C244D2E06F1
S315000254D060081A161CD214C5DE844A8762F4D9C63D
S315000254E09BC660B8BBCB67142C4D244B2E066008B6
S315000254F01A161CD214C5DE844A8762F4200D908BDC
S31500025500222F002C928CB0816F1E204F2F28003440
S31500025510 2F06204F2F2800342F0C6100FF38200D54
S31500025520 90862F40002C601ABBCB6714204F2F2881
S31500025530 00342F06200D90862F002F0B6100FF16D8
S315000255400264C202F002CB08B6314908B22064EB96A
S31500025550000274A42E00700ABE806400FF1033C0DD
S315000255600 0A007D24CDF7CF0205F4FEF00104ED038
S315000255704E714E714E7148E7011C33C000A007D42C
S31500025580286F00142E2F001C266F00204AAF001829
S315000255900672A202F0018538022074EB900027B5833
S315000255A0D08C2A402F0B2F072F0D2F0C6100FEA641
S315000255B02F0B2F072F0D2F0C6100FE2C33C000A0DE
S315000255C007D64CDF3880205F4FEF00104ED04E7169
S315000255D04E714E714E56FFEA48E7030433C000A0EF
S315000255E007D82D49FFFC486E00084EB9000238C2A2
S315000255F04A00671C48790002BEF0486E00084EB9A0
S3150002560000238DA4A406C1233FC002100C07B4AA1
S31500025610227C0002BEF0600000AA486EFFF22F2E26
S31500025620000843EEFFF44EB9000262DA4BEEFFF8D1
S31500025630 48790002BEF8486EFFF4486EFFEE4EB996
S315000256400002389648790002BEF4486EFFEE2F0D2E
S315000256504EB9000238427E0260303F3CFFFF2F0DFA
S31500025660486EFFF4486EFFEE4EB9000238AC486E43
S31500025670FFEE2F0D486EFFEA4EB9000238422F2E7A
S31500025680FFEA224D4EB90002631C3C0751CFFFCC04
S31500025690082E0000FFF3671248790002BEFC2F0DA8
S315000256A04EB9000235F4526EFFF2302EFFF2E2409E
S315000256B03F002F1543EEFFEE4EB90002631C43EE88
S315000256C0FFEE206EFFFC209133C000A007DA4CDF0C
S315000256D020C04E5E205F588F4ED04E714E714E7175
'S315000256E04E56FFE448E7013C33C000A007DC2D49D3
S315000256F0FFFC49EE000847EE000C2F0C4EB90002E3
S3150002570038C24A0066162F0B4EB9000238C24A004A
S31500025710660A227C0002BEF0600000DA2F14224CD8
S315000257204EB9000262A42F13224B4EB9000262A4A4
S3150002573 02F0B2F0C4EB9000238DA4A405EC04400E5
S31500025740488 03E0067142F0C2F0B486EFFF44EB9AB
S315000257500000238AC4BEEFFF460122F0B2F0C486E92
S31500025760FFF84EB9000238AC4BEEFFF845EEFFF0FB
S31500025770249 52F0A2F0A486EFFE84EB90002389682
S31500025780 48790002BF00486EFFE8486EFFE44EB952
S31500025790000238422F2EFFE443EEFFEC6100FE3694
S315000257A04A4767042A4C60022A4B2495486EFFEC4E
S315000257B048790002BF04486EFFE84EB9000238ACD1
S315000257C0486EFFE82F0A4EB9000238DA4A406F10D7
S315000257D033FC002200C07B4A227C0002BF04601414
S315000257E0486EFFEC2F0A486EFFE84EB90002389663
S315000257F043EEFFE8206EFFFC209133C000A007DED7
S31500025800 4CDF3C804E5E205F508F4ED04E714E7103
S315000258104E712F0B33C000A007E0226F0008206FE5
S31500025820000C26494A1966FC538912D866FC200BDD
S31500025830 33C000A007E2265F205F508F4ED04E7124
S315000258404E714E7133C000A007E4226F0004206F30
S3150002585000008600452895288101 1B01066044A008A
S31500025860 66F242401011424112109041 33C000A02C
S31500025870 07E6205F508F4ED04E714E714E712F0B40
S31500025880 33C000A007E8226F0008206F000C2649EB
S31500025890 12D866FC200B33C000A007EA265F205F01
S315000258A0508F4ED04E714E714E7148E7061033C07E
S315000258B000A007EC226F0010206F0014222F0018A0
S315000258C026497AFF6006D28512D867084A8162F6AF
S315000258D0600242194A8152C0440048803C00D28587
S315000258E04A4666EE200B33C000A007EE4CDF086086
S315000258F0205F4FEF000C4ED04E714E714E714E56D8
S31500025900FFF848E7001C33C000A007F02D49FFFC52
S31500025910266E0008286E000C2A4B6002528D70001B
S31500025920101506800002C01D20400810000366EC18
S31500025930 3F3CFFFF2F0C2F0D43EEFFF84EB900023E
S3150002594 05B5A200C67082014B08D6602288B43EE42
S31500025950FFF8206EFFFC209133C000A007F24CDF57
S31500025960 38004E5E205F508F4ED04E714E714E7192
S31500025970 48E7013E33C000A007F42C7C00C07B46FA
S31500025980266F001C246F0020200B660226562F0A63
S31500025990 2F0B4EB900025670D7C04A136604700018
S315000259A06024284B60182A4A1015B007660A42146A
S315000259B041EC00012C88500C4A1D66EC528C1E14C8
S315000259C066E42C8C200B33C000A007F64CDF7C80EB
S315000259D0205F508F4ED04E714E714E7148E7011CBA
S315000259E033C000A007F8266F0014286F00182A4B50
S315000259F06002528D70001015 06800002C01D204004
S31500025A00 0810000366EC3F3CFFFF204F3F28001EB4
S31500025A102F0C2F0D4EB900026F2E2E00200C670898
S31500025A2 02014B08D6602288B200733C000A007FA27
S31500025A304CDF3880205F4FEF000A4ED04E714E7118
S31500025A404E7148E7011C33C000A007FC266F001404
S31500025A50286F00182A4B6002528D700010150680BE
S31500025A600002C01D20400810000366EC4878FFFFC4
S31500025A703F3CFFFF204F3F2800222F0C2F0D4EB92F
S31500025A80 00025C382E00200C67082014B08D6602D6
S31500025A900288B200733C000A007FE4CDF3880205F2A
S31500025AA04FEF000A4ED04E714E714E714E560000A7
S31500025AB0487800012F002F2E0008207CFFFFDCC251
S31500025AC04EBB88FE4E5E205F584F4ED04E560000AB
S31500025AD0487800002F002F2E0008207CFFFFDCA252
S31500025AE04EBB88FE4E5E205F584F4ED04E5600008B
S31500025AF0487800012F002F2E0008207CFFFFDE18B9
S31500025B004EBB88FE4E5E205F584F4ED04E5600006A
S31500025B10487800002F002F2E0008207CFFFFDDF8BA
S31500025B204EBB88FE4E5E205F584F4ED033C000A05B
S31500025B300800226F0006205110AF00055291205135
S31500025B404210424 0102F000533C000A00802205F19

S31500025B505C8F4ED04E714E714E714E56FFF448E731
S31500025B60010C33C000A008042D49FFFC286E000C6E
S31500025B703F2E0010486E00084BEEFFF82F0D4EB96F
S31500025B800002679б3E0066562F0D4EB9000238C2D5
S31500025B904A00674A48790002BF082F0D4EB9000233
S31500025BA038DA4A406F027E0148790002BF0C2F0D97
S31500025BB04EB9000238DA4A406C027EFF2F1543EED8
S31500025BC0FFF44EB9000262A448790002BF10486E83
S31500025BD0FFF44EB9000238DA4A406C027E020C47E4
S31500025BE0FFFF66062ABCFF7FFFFF0C470001660621
S31500025BF02ABC7F7FFFFF0C47000266062ABC000014
S31500025C0000004A47670833FC002200C07B4A200C8A
S31500025C10670428AE0008224D206EFFFC209133C097
S31500025C2000A008064CDF30804E5E205F4FEF000A70
S31500025C304ED04E714E714E7148E7033E33C000A0FE
S31500025C400808518F286F0028266F002C3E2F00323D
S31500025C502A4C424645EF00044DD70C15002D66042A
S31500025C607C0160060C15002B66124A4766062C8CD0
S31500025C70429260604A476F025347528D204F3F2837
S31500025C8000303F072F0E2F0D2F0A4EB9000272FE6B
S31500025C904A40670E0C400001671E0C40000267284E
S31500025CA0603242922C8C4A47672A0C1500306624D1
S31500025CB041ED00012C88601C2012B0AF003462084E
S31500025CC04A4667104492600C24AF003433FC00222B
S31500025CD000C07B4A200B67022696201250 8F33C0E3
S31500025CE000A0080A4CDF7CC0205F4FEF00104ED0A8
S31500025CF04E714E714E7148E7070033C000A0080C82
S31500025D00226F0010424642471E113A066006528929
S31500025D1042471E11207C0002C01D0830000370009D
S31500025D2066EC0C47002D66047A01601A0C47002BBC
S31500025D30661A528942471E116012700AC0C672D094
S31500025D40D247D0413C00528942471E11207C0002B4
S31500025D50C01D08300002700066E04A45671A0C460C
S31500025D607FFF630E303C8001D04644006408001EE
S31500025D70600830064440600230063 3C000A0080EB8
S31500025D804CDF00E0205F588F4ED04E714E714E713F
S31500025D904E56FFDC48E7010C33C000A008102D491F
S31500025DA0FFFC4BEE000848790002BF282F0D4EB9C2
S31500025DB0000238DA4A405DC0440048803E00487915
S31500025DC00002BF2C2F0D4EB9000238DA4A406F127C
S31500025DD033FC002200C07B4A227C0002BF306000F6
S31500025DE0019048790002BF342F0D4EB9000238DA0D
S31500025DF04A406C0A227C0002BF28600001742F15FB
S31500025E00224D4EB9000262A448790002BF382F0D16
S31500025E104EB9000238DA4A406C0A227C0002BF3CC4
S31500025E206000014E486EFFF448790002BF402F0D14
S31500025E30486EFFE44EB9000238962F2EFFE443EE79
S31500025E40FFE84EB9000263AC2F2EFFE843EEFFECEB
S31500025E504EB9000262A448790002BF44486EFFECC4
S31500025E604EB9000238DA4A406D1048790002BF3C4A
S31500025E70486EFFF44EB9000235D048790002BF4899
S31500025E80486EFFF4486EFFE84EB900023896486E37
S31500025E90FFE82F0D486EFFEC4EB90002386A486ED5
S31500025EA0FFEC486EFFEC486EFFE84EB900023896EA
S31500025EB048790002BF143F3C00022F2EFFE843EE52
S31500025EC0FFE44EB90002618E49EEFFF0486EFFE430
S31500025ED0486EFFEC2F0C4EB900023896487900024 4
S31500025EE0BF203F3C00022F2EFFE843EEFFE44EB9EF
S31500025EF00002620C2F0C486EFFE4486EFFE04EB9BA
S31500025F0000002386A486EFFE02F0C486EFFDC4EB97D
S31500025F1000023 8AC48790002BF44486EFFDC2F0C01
S31500025F204EB900023842 48790002BF4C486EFFF46F
S31500025F30486EFFEC4EB900023842486EFFEC4EB98D
S31500025F400000265FC3F002F14224C4EB90002631C6E
S31500025F504A4767182F0C48790002BF3C486EFFF883
S31500025F604EB9000238AC4BEEFFF860022A4C224DC5
S31500025F70206EFFFC209133C000A008124CDF308057
S31500025F804E5E205F588F4ED04E714E714E714E56F8
S31500025F90FFE833C000A008142D49FFFC486E000C30
S31500025FA04EB9000238C24A00661233FC002100C014
S31500025FB07B4A227C0002BF50600000B42F2E000CE8
S31500025FC043EEFFF04EB9000262A4486EFFF0486E3F
S31500025FD00008486EFFF84EB9000238AC486EFFF86A
S31500025FE04EB9000238C24A00660643EE0008607ED9
S31500025FF02F2EFFF843EEFFEC4EB9000262A4487959
S315000260000002BF54486EFFEC4EB9000238DA4A402D
S315000260106D3448790002BF50486EFFF84EB900024F
S3150002602038DA4A406F1033FC002200C07B4A227CD9
S3150002603000002BF54603833FC002200C07B4A227C37
S315000260400002BF586028486EFFF42F2EFFF843EE79
S31500026050FFEC4EB9000263AC486EFFEC486EFFF0EF
S315000260600486EFFE84EB90002389643EEFFE8206E0E
S31500026070FFFC209133C000A008164E5E205F508FB1
S315000260804ED04E714E714E714E56FFF433C000A083
S3150002609008182D49FFFC48790002BF50486E0008D7
S315000260A04EB9000238DA4A406C202F2E00080A1731
S315000260B0008043EEFFF861422D6EFFF8FFF40A6E90
S315000260C08000FFF443EEFFF46016486E00082F2EA0
S315000260D000843EEFFF84EB9000263AC43EE000837
S315000260E0206EFFFC209133C000A0081A4E5E205F8E
S315000260F0588F4ED04E714E714E714E56FFF42F0D83
S315000261003 3C000A0081C2D49FFFC4BEE000848795D
S3150002611000002BF502F0D4EB9000238DA4A406C20F9
S3150002612002F150A17008043EEFFF86100FF5C2D6E03
S31500026130FFF8FFF40A6E8000FFF443EEFFF46032CC
S3150002614002F0D2F1543EEFFF84EB9000263AC4879C6
S3150002615000002BF50486EFFF84EB9000238DA4A40D4
S315000261606F0E48790002BF5C2F0D4EB9000235D082
S31500026170224D206EFFFC209133C000A0081E2A5F2C
S315000261804E5E205F588F4ED04E714E714E714E56F6
S31500026190FFF448E7030C33C000A008202D49FFFC9A
S315000261A03E2E000C2A6E000E4A476C08227C000224
S315000261B0BF506038300748C0E588DBC049EEFFF8BB
S315000261C02895601E486E00082F0C486EFFF44EB9E3
S315000261D0000238962F0D486EFFF42F0C4EB90002BE
S315000261E03842598D3C0751CFFFDC224C206EFFFC12
S315000261F0209133C000A008224CDF30C04E5E205FE3
S315000262004FEF000A4ED04E714E714E714E56FFF44C
S3150002621048E7030C33C000A008242D49FFFC3E2E9C
S3150002622000C2A6E000E4A476C08227C0002BF5000
S31500026230 60524A476608227C0002BF5C60465347AA
S31500026240300748C0E588DBC049EEFFF82F0D486EDF
S315000262500082F0C4EB900023842601E486E000834
S3150002626002F0C486EFFF44EB9000238962F0D486E79
S31500026270FFF42F0C4EB900023842598D3C0751CF1C
S31500026280FFDC224C206EFFFC209133C000A00826C2
S3150002629004CDF30C04E5E205F4FEF000A4ED04E718B
S315000262A04E714E714E56FFFC33C000A008282D4990
S315000262B0FFFC486E00084EB9000263EA43EE00088E
S315000262C0206EFFFC209133C000A0082A4E5E205F9C
S315000262D0588F4ED04E714E714E714E56FFF833C0E6
S315000262E000A0082C2D49FFFC486EFFF8486E0008F6
S315000262F04EB900026420206E000C30AEFFFA43EE67
S3150002630000008206EFFFC209133C000A0082E4E5ECE
S31500026310205F508F4ED04E714E714E714E56FFF425
S3150002632033C000A008302D49FFFC4A6E000C6C08F1
S3150002633003D7CFFFFFFF86004426EFFF83D6E000CE5
S31500026340FFFA486EFFF4486EFFF8486E00084EB931
S31500026350000264A04A6EFFF6673448790002BF6005
S315000263600486E00084EB9000238DA4A406C1033FC17
S31500026370002200C07B4A227C0002BF64601433FC08
S31500026380002200C07B4A227C0002BF68600443EE02
S3150002639000008206EFFFC209133C000A008324E5E3A
S315000263A0205F5C8F4ED04E714E714E714E56FFF885
S315000263B033C000A008342D49FFFC2F2E000C486E76
S315000263C0FFF8486E00084EB90002653843EEFFF842
S315000263D0206EFFFC209133C000A008364E5E205F7F
S315000263E0508F4ED04E714E714E712F0D33C000A09C
S315000263F008382A6F00082F0D4EB90002396C4A8000
S3150002640 0670A2F0D2F0D4EB90002381E33C000A0A9
S31500026410083A2A5F205F588F4ED04E714E714E71E8
S315000264204 8E7010C33C000A0083C4FEFFFF42A6F87

S31500026430001C285F00202F0D4EB9000238C24A8078
S31500026440671C2F0D486F00044EB9000276E67030C5
S31500026450C02F000A6608082F0006000A6704429445
S31500026460060243E2F000848C752873F7CFFFF000882
S315000264704857 4EB9000279369E80288748572F0D15
S315000264804EB9000274F44FEF000C33C000A0083E70
S315000264904CDF3080205F508F4ED04E714E714E7160
S315000264A048E7011C33C000A008404FEFFFF42A6FF3
S315000264B00020266F0024286F002842942F0D4EB923
S315000264C0000238C24A8067542F0D486F00044EB945
S315000264D0000276E67030C02F000A6640082F0006DA
S315000264E0000A66382E13302F000848C0DE800C875B
S315000264F000003E806E220C87FFFFC1806D1A3F4767
S31500026500000848572F0D4EB9000274F42F0D4EB9EC
S31500026510000239804A806704700128804FEF000C20
S315000265203 3C000A008424CDF3880205F4FEF000CDA
S31500026530 4ED04E714E714E7148E7001C33C000A01A
S315000265400 08444FEFFFE42A6F002C286F0030266FB5
S31500026550000342F0D4EB9000238C24A80671C2F0D37
S31500026560486F00144EB9000276E67030C02F001A4A
S3150002657066 08082F0006001A6706289526956060A9
S315000265804A6F00186C0C28952F0B4EB90002399CE5
S31500026590604E4BD72ABC7FFFFFFF43EF001041EF4F
S315000265A0000420D920D9209142A7302F001C48C0D0
S315000265B02F002F0D4EB90002785E2015C1AF0010D4
S315000265C046952015C1AF0004486F00102F0C4EB936
S315000265D0000274F4486F00042F0B4EB9000274F4E3
S315000265E04FEF001C33C000A008464CDF3800205F86
S315000265F04FEF000C4ED04E714E714E714E56FFFC4F
S3150002660048780 0012F2E0008486EFFFC207CFFFF11
S31500026610D33A4EBB88FE202EFFFC4E5E205F584FBB
S315000266204ED04E56FFFC487800002F2E0008486ECA
S31500026630FFFC207CFFFFD3144EBB88FE202EFFFCFE
S3150002664 04E5E205F584F4ED033C000A00848226FDE
S3150002665000 0420494A1966FC20099088538033C0F9
S3150002666000A0084A205F588F4ED04E714E714E716F
S31500026670 48E7010433C000A0084C226F000C206FCB
S31500026680001072006 0102A481015B00767064A1DEE
S3150002669066F6600652811E1966EC200133C000A020
S315000266A0084E4CDF2080205F508F4ED04E714E71C7
S315000266B04E7148E7070433C000A008502A6F001441
S315000266C03C2F00183A2F001A0C4602606D06424013
S315000266D0600000AE0C4601306F26044601304A4582
S315000266E0661048790002C0182F0D4EB9000235F423
S315000266F0600E48790002C0182F0D4EB9000235E22D
S315000267007E0FCE4667364A45671A3007534048C061
S31500026710E58806800002BF942F002F0D4EB90002B5
S31500026720 35E2601830075 34048C0E58806800002 0B
S31500026730BF942F002F0D4EB9000235F47E1F30068E
S31500026740E840CE404A4767364A45671A3007534003
S315000267 5048C0E58806800002BFD02F002F0D4EB933
S31500026760000235E260183007534048C0E5880680CB
S3150002677000 002BFD02F002F0D4EB9000235F4700172
S31500026780 33C000A008524CDF20E0205F508F4ED06D
S315000267904E714E714E7148E73F3E33C000A0085419
S315000267A0518F286F0038266F003C3E2F004042462C
S315000267B0422F000738062A533F4400043F44000292
S315000267C03A043605420245EF0001148228BC000055
S315000267D000002C7C000266B24A47670000A20C1534
S315000267E0002B67080C15002D660000940C15002D71
S315000267F066063F7C000100044A476F025347528DEA
S31500026800607C1F7C000100074A4666060C150030B4
S3150002681067025246 0C4600096F0E0C437FEE6C046B
S315000268205243605274 01604E0C15003067424A446E
S3150002683067123F3C00003F042F0C4E964A40660208
S31500026840740142444 8790002BF942F0C4EB90002EB
S315000268503 5F4101548800640FFD048C0E58806800A
S3150002686000 002BF6C2F002F0C4EB9000235D0600615
S315000268704A46670252444A476F025347528D4A4775
S31500026880670E0C1500306D080C1500396F00FF7489
S3150002689 04A4467123F3C00003F042F0C4E964A4082
S3150002 68A0660274 0142444A47670000A80C15002E8E
S315000268B0660000A04A476F025347528D600000826D
S315000268C01F7C000100074A4666060C150030670267
S315000268D052460C4600096F045346605C0C43801214
S315000268E06F045343600414BC00014A46674A0C1500
S315000268F0003067424A4467123F3C00003F042F0CB7
S315000269004E964A40660274014244487 90002BF9498
S31500026910 2F0C4EB9000235F4101548800640FFD000
S315000269204 8C0E58806800002BF6C2F002F0C4EB9C6
S31500026930000235D0600252444A476F025347528DD5
S315000269404A47670E0C1500306D080C1500396F00AA
S31500026950FF70D6444A2F0007670001404A6F0004C1
S3150002696067040A5480004A476700009E0C150065BA
S3150002697067080C15004566000090 4A476F025347A8
S31500026980528D4A4767200C15002B67060C15002D01
S31500026990 66140C15002D66063F7C000100024A476C
S315000269A06F025347528D4A4767540C1500306D4E9D
S315000269B00C1500396F2E60460C450CCB6F104A6FD2
S315000269C0000267061 4BC000160127401600ECAFC64
S315000269D0000A101548800640FFD0DA404A476F0287
S315000269E05347528D4A47670C0C1500306D060C153D
S315000269F000396FC44A6F0002670E4445600A28BC1C
S31500026A00000000000600000944A46660842453605CA
S31500026A1034031482300548C0320348C1D0810C8049
S31500026A2000007FEE6F063A3C7FEE601A300548C0E2
S31500026A30320348C1D0810C80FFFF80126C063A3CBB
S31500026A4080126002DA434247BA476C047E0144452B
S31500026A503F073F052F0C4E964A40660C4A4767068B
S31500026A6014BC00016002740126 8D4A02670E4A6F49
S31500026A70000466047001602470FF60204A126706F3
S31500026A8028BC000000002F0C4EB9000238C24A0092
S31500026A9066084A4667047002600242405 08F33C05D
S31500026AA000A008564CDF7CFC205F4FEF000A4ED058
S31500026AB04E714E714E7148E73F3E33C000A00858F2
S31500026AC04FEFFFC4286F006C266F0070342F0078DA
S31500026AD0426F003A426F003842453F4500363F4515
S31500026AE000343C053F4600323F4600303F46002E0A
S31500026AF03F46002A95CA226F007A41EF000220D94A
S31500026B0020D930914DEF000A3016B0466C043CBCD9
S31500026B1000060C42004566047465600 80C42004794
S31500026B20660874673F7C0001002A30020C4000664A
S31500026B3067100C40006567240C40006767306000F0
S31500026B40036 4486F0026486F002C204F3F2800122E
S31500026B50204F2F28007E3F3C00016036486F0026FA
S31500026B60486F002C302F001252403F00601A4A6FC5
S31500026B700000A66063F7C0001000A486F0026486F3D
S31500026B80002C204F3F280012204F2F28007E3F3C2A
S31500026B9000 0486F00244EB9000270D04BEF00147B
S31500026BA06002528D4A1566FA6002538D200F0680E6
S31500026BB000000014BBC063080C2D0030FFFF67EA1B
S31500026BC0200D3E0041EF00149E484A4766084243A4
S31500026BD03F4300286006362F002853434BEF002C14
S31500026BE00C42006766160C43FFFC6D06B66F000A80
S31500026BF06D04425560123ABC0001600C0C420066FC
S31500026C0057C0440048803A804A6F00266704782DB0
S31500026C106002782B4A2F000466124A6F0026660C21
S31500026C204A2F0006670478206002424 44A556734B8
S31500026C304A6F00286E143F7C00010036302F002870
S31500026C4044403F4000343C07602C302F0028B047B8
S31500026C506D0A3A0790473F400036601A3A003C07F1
S31500026C609C4560124A4767087A013C07534660060C
S31500026C703F7C000100360C420067662E4A2F000553
S31500026C80673C4A45670A3E05DE6F0036DE46600A05
S31500026C904A4667043E0660027E01302F000AB0476C
S31500026CA06F1C90473F40003260143E2F0034DE4690
S31500026CB0302F000AB0476F0690473F4000324A2FF6
S31500026CC00005660E302F0034D046D06F00324A409F
S31500026CD06F047401600242424A5566644A436C0A72
S31500026CE03EBC002D3E03444760063EBC002B3E03DD
S31500026CF045EF0014300748C081FC000A48400600F0
S31500026D000030150048C78FFC000A4A4766E6200F86

S31500026D100680000000013B5C06604153C0030152F2E
S31500026D200001538A4A6F002A67047E4560027E6527
S31500026D30148741EF000C5048200A90C03F480030AB
S31500026D404A4467047E01600242473607D645D66F3B
S31500026D500036D642D66F0034D646D66F0032D66F8C
S31500026D6000304BEF00084A2F0007670E3015B0437C
S31500026D706F2490433F40002E601C3015B0436F16BF
S31500026D803E009E430C2F0030000266063F47003845
S31500026D9060043F47003A4BEF0014424760122F0B44
S31500026DA03F3C00204E940C40002066000OF85247FB
S31500026DB0BE6F003A6DE84A44670C2F0B3F044E94AF
S31500026DC0B044660000E0424760122F0B3F3C0030A1
S31500026DD04E940C400030660000CC5247BE6F00381D
S31500026DE06DE8424760121 81D48842F0B3F044E94EB
S31500026DF0B044660000B05247BE456DEA4247601293
S31500026E002F0B3F3C00304E940C400030660000963B
S31500026E105247BE6F00366DE84A42670E2F0B3F3C63
S31500026E20002E4E940C40002E667A424760102F0BBD
S31500026E303F3C00304E940C40003066685247BE6FAD
S31500026E4000346DEA424760101A1D48852F0B3F0534
S31500026E504E94B045664E5247BE466DEC42466010B1
S31500026E602F0B3F3C00304E940C40003066365246A3
S31500026E70BC6F00326DEA2A4A424660101E1D4887E0
S31500026E802F0B3F074E94B047661A5246BC6F00302E
S31500026E906DEA424660142F0B3F3C00204E940C4094
S31500026EA00020670470FF60165246BC6F002E6DE626
S31500026EB0302F003AD043D06F0038D06E002E4EEEFC
S31500026EC0003C33C000A0085A4CDF7CFC205F4FEF29
S31500026ED000124ED04E714E714E7148E71F0433C0F8
S31500026EE000A0085C2A2F001C362F0020382F002213
S31500026EF07C2B2E054A856C062E0544877C2D204F59
S31500026F002F2800243F043F032F074EB900027020AA
S31500026F102A401B06200D33C000A0085E4CDF20F875
S31500026F20205F4FEF000C4ED04E714E714E7148E706
S31500026F30073E33C000A00860518F286F002C266FD1
S31500026F4000303C2F00362A4C42474DD70C15002DF7
S31500026F5066047E0160060C15002B66144A46660816
S31500026F602C8C7E00600000984A466F025346528D72
S31500026F70204F3F2800343F062F0E2F0D45EF0010FD
S31500026F802F0A2A3C7FFFFFFF4EB9000272FE4A40DB
S31500026F90670E0C400001671E0C400002674A605EE5
S31500026FA07E002C8C4A4667560C150030665041ED21
S31500026FB000012C8860484A4767240C928000000032
S31500026FC062262012B08562062E00448760302E3C6F
S31500026FD08000000106808000000019E806020201251
S31500026FE0B08562042E0060164A4767082E3C800070
S31500026FF0000060022E0533FC002200C07B4A200BF3
S315000270006702269620075 08F33C000A008624CDF25
S315000270107CE0205F4FEF000C4ED04E714E714E71E8
S315000270204 8E7070833C000A008642E2F00143C2F3F
S3150002703000183A2F001A4A456708287C0003404484
S3150002704060062 87C00034055700ED0AF001C22401B
S31500027050421120073206 48C14EB900027090133 41D
S315000270600800300648C0220020074EB9000274A468
S31500027070 2E004A8766DC200933C000A008664CDF72
S31500027080 10E0205F4FEF000C4ED04E714E714E71E4
S3150002709 02F010C8100010000641280C1690E2200DA
S315000270A04241484102800000FFFF601E2F011F3C43
S315000270B000204281E388E391B2AF0002650692AFF7
S315000270C000025280531766EC5C8F2001221F4E7518
S315000270D048E7073E33C000A008684FEFFFE42A6F77
S315000270E000403C2F004A246F004C266F0050284D6A
S315000270F04DEF0010206F00462C902D68000400040E
S3150002710042534879 0002C1B62F0E4EB90002373CEF
S31500027110 4A406C0836BC00010A56800042457E0988
S3150002712 0267C0002C16E6042300748C0E788D08BD9
S3150002713 02F002F0E486F00084EB9000236704879AC
S315000271400002C1B6486F00044EB90002373C4A40FD
S3150002715 06D18300748C0E788D08B2F002F0E4EB926
S315000271600002744670 01EF68DA4053474A476CB82A
S31500027170 2F0E4EB900023726 4A00675C7E09604A26
S31500027180300748C0E788D08B2F002F0E486F0010BB
S3150002719 04EB9000236A02F0B486F000C486F00084C
S315000271A04EB90002367048790002C1B6486F000433
S315000271B04EB90002373C4A406C102CAF00082D6FC6
S315000271C0000C00047001EF689A4053474A476CB0BE
S315000271D03005524034806002425 24A6F00446718BA
S315000271E0DC524A466C122CBC000000002D7C0000CA
S315000271F00000000442463486 0C4600116F3A7C11A8
S31500027200 60362F0E4EB9000274582F400018302FE8
S315000272100001A48C0E788068000 02C11E2F002F0E02
S31500027220 4EB9000276A42F0B2F0E4EB9000274E25D
S31500027230 7030D02F001B18C03E0651CEFFC6421436
S31500027240 2F0E4EB9000274582F4000187205B081F5
S31500027250 6642302F001A48C0E78806800002C11E27
S31500027260 2F002F0E4EB9000276A42F0E4EB9000241
S31500027270 37264A006610B9CD671470D0D02CFFFFAE
S31500027280 08000000670870062F4000186006 7004A8
S31500027290 2F4000180CAF0000000500186F42200CAA
S315000272A03E00200D9E40534760145235 70000C3547
S315000272B0003970006F0C1BBC0030700053474A4700
S315000272C06CE84A476C1AB9CD67061ABC0031600EE3
S315000272D04A6F0044670A1ABC0031422D000152521D
S315000272E0200D4FEF001C33C000A0086A4CDF7CE083
S315000272F0205F4FEF00144ED04E714E714E7148E72B
S3150002730 03F3E33C000A0086C518F2C6F00382A6FA5
S31500027310003C246F00403C2F00443A2F00467E007A
S3150002732 042041604 0C15003066444A46670000E221
S31500027330 4A466F025346528D4A46672A0C15007812
S31500027340 67060C15005866 1E4A4567060C4500106E
S3150002735 0661442047A104A46670000B64A466F022D
S3150002736 05346528D600878014A4566027A084A45B4
S3150002737 066027A0A0C4500246E0000960C4500024D
S31500027380 6D00008E300548C0448006800002C1E2CE
S3150002739 026403005 48C072FF2E81220020174EB9C2
S315000273A0000274A42F400004605E101548803F005E
S315000273B04EB9000276B63F002F0B4EB90002767424
S315000273C028404A80674A7801243C0002C1E1200C29
S315000273D094404A466F025346528DBEAF0004630282
S315000273E07601300548C02207C1414EB900027B58DA
S315000273F0C1412E01300248C044805380BE806302E0
S3150002740 07601300248C0DE804A1567044A46669A0B
S315000274 10200A6702248D4A046606429642 40600CA0
S31500027420 2C874A036604700160027002508F33C0D3
S3150002743 000A0086E4CDF7CFC205F4FEF00104ED0A0
S31500027440 4E714E714E71205F20172F002F08207C3F
S315000274 50FFFFC26A4EFB88FE4E56FFFC48780001CB
S31500027460 2F2E0008486EFFFC207CFFFFC3484EBB50
S31500027470 88FE202EFFFC4E5E205F584F4ED04E56A1
S3150002748 0FFFC487800002F2E0008486EFFFC207C87
S3150002749 0FFFFC3224EBB88FE202EFFFC4E5E205FFE
S315000274A0584F4ED02F010C8100010000641280C19A
S315000274B0690E22004241484102800000FFFF601E21
S315000274C02F011F3C00204281E388E391B2AF000204
S315000274D0650692AF000252805317 66EC5C8F221F3C
S315000274E04E75205F20172F002F08207CFFFFC1B0AA
S315000274F04EFB88FE48E7200433C000A00870598F6F
S31500027500 2A6F00144A95670001322F0D4EB9000208
S3150002751 07936916D00080C6DFF8200086C38302DAB
S3150002752 0000848C044800680FFFFFF82721FB081B8
S31500027530 6F06429560000 10442A7302D000848C03C
S31500027540 448020404868FF822F0D4EB90002785EC3
S3150002755 03B7CFF8200080C6D007F00086F0A08ED75
S3150002756 00006000A600000E820390002C1E40C802F
S3150002757 00001000064140C400001676 40C40000224
S31500027580675E0C400003670000AA0C2D0080000312
S3150002759 067182EBC000000804 8572F0D4EB9000216
S315000275A079064A806700008C60740C6D007F0008C3
S315000275B06D100C95FFFFFF80660808ED0006000AB5
S315000275C06070082D000000267682EBC0000008073
S315000275D048572F0D4EB9000279064A806754603E1D
S315000275E00CB9000000010002C1E457C04400488003

S315000275F048C0122D000AEE0902010001740014O1AE
S31500027600B082672E4A2D000367282EBC00000100B7
S315000276104857 2F0D4EB9000279064A8067144878FA
S315000276200001487800012F0D4EB90002785E526DB6
S315000276300008 0295FFFFFF006606426D0008600E15
S315000276400C6D007F00086F0608ED0006000A2F0D7C
S31500027650204F2F2800144EB90002779A588F33C054
S3150002766000A008724CDF2004205F508F4ED04E716E
S31500027670 4E714E7133C000A00874226F0004322F7F
S315000276800008 1011B0016604200960064A1966F264
S31500027690700033C000A00876205F5C8F4ED04E711A
S315000276A04E714E71205F20172F002F08207CFFFF9E
S315000276B0BFBE4EFB88FE33C000A00878322F0004FE
S315000276C00C4100616D0C0C41007A6E0670E0D041EF
S315000276D06002300133C000A0087A205F548F4ED07A
S315000276E04E714E714E7148E7010833C000A0087C06
S315000276F0226F000C206F001049E9000A08100007EB
S31500027700 56C04400488048C002000001EF080894B1
S315000277100007811420107217E2A8024000FF3340CE
S3150002772000008203C007FFFFFC090E1882280089479
S3150002773000006021400CF0C6900FF0008662A4A916F
S31500027740671E0811000667047E0160027E0270034E
S31500027750C007E908022900CF000A8129000A60242D
S315000277600 8E90006000A601C4A690008660C4A918C
S31500027770 6712337CFF820008600A08D10007046999
S31500027780007F000833C000A0087E4CDF1080205F17
S31500027790508F4ED04E714E714E712F0733C000A0DE
S315000277A00880226F000C08290007000A67082E3C91
S315000277B080000000060027E007030C029000A673C2B
S315000277C000877F80000020110880001FE0888E80DD
S315000277D0203C0003FFFFC087660600870007FFFF05
S315000277E01029000AE808020000030C0000016606E0
S315000277F008C70012604E0887001260480829000672
S31500027800000A670800877F80000060384A91660692
S3150002781008 87001F602E0C69FF82000866082011 87
S31500027820E0888E80601E302900084BC0068000006D
S315000278300 07F7217E3A88E802011E0880280007F05
S31500027840FFFF8E80206F00082087 33C000A00882C9
S315000278502E1F205F508F4ED04E714E714E7148E7EB
S31500027860030033C000A00884226F000C2C1102868C
S3150002787000000001 0CAF0000002000106D044291D0
S31500027880601C4AAF001467082E3C800000006002AC
S31500027890 7E002011122F0013E2A880872280200684
S315000278A033C000A008864CDF00C0205F4FEF000CFB
S315000278B04ED04E714E714E712F0733C000A008880C
S315000278C0226F00080811000756C04400488048C0CD
S315000278D02E000CAF00000020000C6D044291600ED9
S315000278E02011122F000FE3A880AF0010228020077C
S315000278F033C000A0088A2E1F205F4FEF000C4ED027
S315000279004E714E714E7133C000A0088C226F000476
S31500027910206F00082010D1912011B09055C044006C
S31500027920488048C033C000A0088E205F508F4ED0DA
S315000279304E714E714E7148E7010433C000A00890A3
S3150002794 02A6F000C0815000766044A956604700043
S31500027950 60162F154EB900027AC22E0042A72F07D3
S315000279602F0D6100FF54200733C000A008924CDFA0
S31500027970 2080205F588F4ED04E714E714E7148E76F
S315000279803F0033C000A00894598F206F00282810AA
S31500027990206F002C2A10203C0000FFFFC084223CEE
S315000279A00000FFFFC2854EB900027B582E00203C24
S315000279B00000FFFFC08422057410E4A94EB900023C
S315000279C07B58260020047210E2A8223C0000FFFF2A
S315000279D0C2854EB900027B58240020047210E2A828
S315000279E022052E807010E0A92017C1414EB900026F
S315000279F07B58C1412C0120077210E2A8223C0000EC
S31500027A00FFFFC283D081223C0000FFFFC282D081E9
S31500027A107210E2A8DC802003E2A822027810E8A90C
S31500027A20D081DC80203C0000FFFFC083E9A8DE8015
S31500027A30203C0000FFFFC082E9A8DE80206F002004
S31500027A402086206F00242087588F33C000A0089616
S31500027A504CDF00FC205F4FEF00104ED04E714E718E
S31500027A604E7148E7011C33C000A008982A6F001423
S31500027A70286F0018266F001C7E0042A74878000176
S31500027A802F0C6100FE342F00487800012F0D610093
S31500027A90FE284A8066062015B09365062013919546
S31500027AA0529452877020BE806DD033C000A0089ACF
S31500027AB04CDF3880205F4FEF000C4ED04E714E7176
S31500027AC04E7148E7030033C000A0089C222F000C29
S31500027AD04A8166047000602A203CFFFF0000C081D4
S31500027AE0670A2E3C800000007C00600E2E3C0000DF
S31500027AF080007C106004E28F52862007C08167F600
S31500027B00200633C000A0089E4CDF00C0205F588FBD
S31500027B104ED04E714E714E7133C000A008A04AAFCE
S31500027B200004670A204F2F28000461966 0184AAFA6
S31500027B300008 6710204F2F2800086186068 0000083
S31500027B40002060027 00033C000A008A2205F508FA0
S31500027B504ED04E714E714E7148E7C000C0C1C2D7B9
S31500027B6048414241D081322F0002C2EF000448410F
S31500027B704241D081222F0004508F4E7514FD5013BE
S31500027B80000000000000FFFF00000000FFFFFFFFF3
S31500027B90000000000000FFFF00000000000010400DA
S31500027BA000027B8000027B840002C1EC00530400C9
S31500027BB000027B8800027B8C0002C1F80073000081
S31500027BC0000000000000000000002C1FE0470040074
S31500027BD000027B9000027B940002C2070031010082
S31500027BE000027B980002A0C60002C2170032010002
S31500027BF000027B980002A0C60002C22400330100E4
S31500027C0000027B980002A0C60002C23100340100C5
S31500027C1000027B980002A0C60002C23E00350100A7
S31500027C2000027B980002A0C60002C24B0036010089
S31500027C3000027B980002A0C60002C258003701006B
S31500027C4000027B980002A0C60002C2550071000015
S31500027C50000000000000000000002C27D0064000077
S31500027C60000000000000000000002C28A004400007A
S31500027C70000000000000000000002C2950457020046
S31500027C80000029EBC00029EBC0002C2B30002C2CD2C
S31500027C900000008B800027B9C0002C2D2000F00025C
S31500027CA0C3160002C31D0002C3250002C32F000231
S31500027CB0C3380002C33F0002C3480002C3C6000025
S31500027CC0104400000000000002C3CC01000002C3EA17
S31500027CD000001494000014CC0000151A0000158E42
S31500027CE00000000300000100036400000000000000F4
S31500027CF00000000000002C42603630000000000002A
S31500027D000000000000002C43D0373000000000000F2
S31500027D1000000000000002C4520401020000029EC0DC
S31500027D2000027CE00002C4680402020000029EC057
S31500027D3000027CE40002C48B0443020000029EBCE3
S31500027D40000029EBC0002C4AA0457020000029EBCA6
S31500027D50000029EBC0002C4C1047200000000000C2
S31500027D600000000000002C4D80002C5040000166626
S31500027D7000027CE80002C50903080002C65C000096
S31500027D80000D000C000D000C0000000000000800039
S31500027D9000000000FFFFFFFF149F2CA7149F2CA73
S31500027DA0000000000000000000000001F00FFFFFFAF
S31500027DB0000004D20501040000027DA000027DAC91
S31500027DC00002C6FE0502040000027DA000027DAC90
S31500027DD00002C70905730200000 27D8800027D8C3D
S31500027DE00002C712054C0000000000000000000005F
S31500027DF00002C72F054600000000000000000000038
S31500027E000002C74E0569000000000000000000000E5
S31500027E100002C777056C0000000000000000000000A9
S31500027E200002C78F056300000000000000000000008A
S31500027E300002C7A70548040000027D9000027D9457
S31500027E400002C7C30566050000027D9B00027D9CFC
S31500027E500002C80E0574000000000000000000000C9
S31500027E600002C84E05530200000 27DA400027DA84E
S31500027E700002C853056500000000000000000000073
S31500027E800002C866054302000027DB000027DB012
S31500027E900002C887056D00000000000000000000017
S31500027EA00002C89C0575000000000000000000000EA
S31500027EB00002C8AD0002C8C8000020F200027DB46C
S31500027EC00002C8CB05100002CAB600002902000053

```
S31500027ED000000002CAB9010000015180FFFFFFFE47
S31500027EE0000000241C00000C1C0000003010700FB
S31500027EF000029EC000027ED80002CAD20302060019
S31500027F0000029EC000027EDC0002CAEA016602008E
S31500027F1000029EC000027EE00002CB0A034F05006B
S31500027F2000027EE800027EE40002CB380002CB5A51
S31500027F30000029940027EEC0002CB5D010445613B
S31500027F40000000000123400000000100000040FFFFA4
S31500027F50FFFF00000008084D020000029EC4000256
S31500027F60A5640002CC3C01580000000000000009D
S31500027F7000000002CC54055200000000000000080
S31500027F8000000002CC77017A020000029EC400C003
S31500027F9097E00002CC990147000000000000000B3
S31500027FA000000002CCB8012402000029EC400C0F8
S31500027FB097E00002CCCD0850020000029EC40002E7
S31500027FC0A56C0002CCE5085102000029EC4000224
S31500027FD0873E0002CD06083D020000029EC4000252
S31500027FE0A5680002CD210870020000029EC40002AC
S31500027FF0A5780002CD3F023E060000029EC00002A6
S31500028000A5700002CD67023C060000029EC0000277
S31500028010A5700002CD76086C020000029EC0000226
S31500028020A57C0002CD830241000000000000000092
S3150002803000000002CD8D02010200000027F4600020E
S315000280407F4A0002CDAD04430200000027F420002D5
S315000280507F420002CDBA036E020000027F46000292
S315000280607F4A0002CDCB034C0000000000000000056
S3150002807000000002CDD603610000000000000000EF
S3150002808000000002CDEB027408000029EC000C090
S315000280900FA0002CE0202540800000029EC000C08E
S31500028 0A000FA0002CE1D02640000000000000007B
S315000280B00000002CE36034E00000000000000061
S315000280C000000002CE4803690000000000000000024
S315000280D000000002CE66036D0000000000000000F2
S315000280E000000002CE8B0570000000000000000B8
S315000280F00000002CEAA020202000029EC0000296
S315000281007F4E0002CED20203020000029EC00028F
S315000281107F4E0002CEFA02730000000000000004B
S3150002812000000002CF400275000000000000000BF
S3150002813000000002CF6802780000000000000000084
S3150002814000000002CF88023100000000000000009B
S3150002815000000002CFA60249000000000000000055
S3150002816000000002CFC5045304000002A0D600029C
S31500028170A0D20002CFD60567010000029EC400020B
S315000281807F520002D00F0566000000000000000CA
S3150002819000000002D09F0563000000000000000FE
S315000281A000000002D0D50002D10B00002B9600027F
S315000281B07F560002D1110125000000000000000D8
S315000281C0000000000000000000000000000000000A7
S315000281D00000000000000000000000000000000097
S315000281E00000000000000000000000000000000087
S315000281F00000000000000000000000000000000077
S31500028200000000000000000000000000000000000066
S31500028210000000000000000000000000000000000056
S31500028220000000000000000000000000000000000046
S31500028230000000000000000000000000000000000036
S31500028240000000000000000000000000000000000026
S31500028250000000000000000000000000000000000016
S31500028260000000000000000000000000000000000006
S315000282700000000000000000000000000000000000F6
S315000282800000000000000000000000000000000000E6
S315000282900000000000000000000000000000000000D6
S315000282A00000000000000000000000000000000000C6
S315000282B00000000000000000000000000000000000B6
S315000282C00000000000000000000000000000000000A6
S315000282D0000000000000000000000000000000000096
S315000282E0000000000000000000000000000000000086
S315000282F0000000000000000000000000000000000076
S31500028300000000000000000000000000000000000065
S31500028310000000000000000000000000000000000055
S31500028320000000000000000000000000000000000045
S31500028330000000000000000000000000000000000035
S31500028340000000000000000000000000000000000025
S31500028350000000000000000000000000000000000015
S31500028360000000000000000000000000000000000005
S3150002837000000002D4F6000034D40000000000021F
S31500028380D4FB0100027E0018000000000000000007D
S31500028390000000000A747970652073706163652 0BD
S315000283A0666F72206E6578742070616765 2C204353
S315000283B05220666F72206F6E65206C696E652C2086
S315000283C06374726C2D4320746F2061626F72740045
S315000283D0015000000000000000000000000002D5125B
S315000283E00002D52700003C28000283D00002D52CCB
S315000283F003010000000000000000024030000041A01E
S315000284000000000000000030000003001240200000208
S3150002841 09EC400C097E00002D5380444020000 0260
S3150002842 09EC000029EC40002D550045302000 00200
S3150002843 09EC000029EC40002D57B0457020000 02C1
S3150002844 09EBC00029EBC0002D59D0443020000 02AF
S3150002845 09EBC00029EBC0002D5BA046C0000000 05D
S31500028460000000000000002D5E0473000000000D1
S315000284700000000000000002D62001640000000097
S315000284800000000000000002D6470444020000 0279
S31500028490 9EC000028402000 2D658044202000 00274
S315000284A09EC000029EC40002D692045505000 00238
S315000284B083FA000283FE0002D6BB0475000000 00A8
S315000284C0000000000000002D6E9047002000 0026B
S315000284D09EC0000283F60002D6F505740200000271
S315000284E09EC000029EC40002D726046202000 00259
S315000284F09EC000029EC40002D7590463020000 0215
S3150002850 09EC000029EC40002D77E045402000002EE
S3150002851 09EC000029EC40002D7A4046E020000 029E
S3150002852 09EC000028406000 2D7C1044B020000 026C
S3150002853 09EC000029EC40002D7DE0002D8080000D8
S3150002854 03C5A0002840A0002D80D01134298000028
S31500028550C01F5C29401F5C293E6BEC9938D1B717C6
S315000285600000000000000000D801000000000002A
S315000285700000000000000000000000000000000000F3
S315000285800000000000000000000000000000000000E3
S315000285900000000000000000000000000000000000D3
S315000285A00000000000000000000000000000000000C3
S315000285B00000000000000000000000000000000000B3
S315000285C00000000000000000000000000000000000A3
S315000285D0000000000000000000000000000000000093
S315000285E0000000000000000000000000000000000083
S315000285F0000000000000000000000000000000000073
S31500028600000000000000000000000000000000000062
S31500028610000000000000000000000000000000000052
S31500028620000000000000000000000000000000000042
S31500028630000000000000000000000000000000000032
S31500028640000000000000000000000000000000000022
S31500028650000000000000000000000000000000000012
S31500028660000000000000000000000000000000000002
S315000286700000000000000000000000000000000000F2
S315000286800000000000000000000000000000000000E2
S315000286900000000000000000000000000000000000D2
S315000286A00000000000000000000000000000000000C2
S315000286B00000000000000000000000000000000000B2
S315000286C00000000000000000000000000000000000A2
S315000286D0000000000000000000000000000000000092
S315000286E0000000000000000000000000000000000082
S315000286F0000000000000000000000000000000000072
S31500028700000000000000000000000000000000000061
S31500028710000000000000000000000000000000000051
S31500028720000000000000000000000000000000000041
S315000287300000000000000000000000000000E000023
S31500028740000F0002DA620002DA690002DA70000241
S31500028750DA790002DA830002DA8D0002DA96000282
S31500028760DAA10002DAAC0002DAB80002DAC30002C9
S31500028770DAD00002DAD90002DAE00002DAE7000211
S31500028780DAEE0002DAFA0002DB030002DB0C000278
S31500028790DB140002DB1D0002DB240002DB2B0002DD
S315000287A0DB320002DB390002DB400002DB4700025B
```

S315000287B0DB4E0002DB590002DB650002DB6F0002C2
S315000287C0DB790002DB810002DB8C0002DB96000211
S315000287D0DBA10002DBAA0002DBB50002DBC000025D
S315000287E0DBCB0002DBD60002DBE10002DBEC00029F
S315000287F0DBF40002DBFF0002DC090002DC150002EA
S31500028800DC1F0002DC290002DC330002DC3B000232
S31500028810DC470002DC510002DC590002DC64000283
S31500028820DC700002DC790002DC82000000000000003D
S315000288300000000000000000000000000000000030
S3150002884000000000000000000000000200000000041A
S3150002885000000006000000080000000A0000000CEC
S315000288600000000E000000100000001200000014BC
S3150002887000000016000000180000001A0000001C8C
S315000288800000001E00000020000000220000002 45C
S3150002889000000026000000280000002A0000002C2C
S315000288A00000002E00000030000000320000003 4FC
S315000288B000000036000000380000003A0000003CCC
S315000288C00000003E000000400000FFFFFFFF000323
S315000288D0000400050006000700080009000A000B54
S315000288E0000C000D000E000F001000110012001304
S315000288F000140015001600170018001900 1A001BB4
S315000289003B210101000000000000000000000000 01
S31500028910000000000000000000000000000000004F
S31500028920000000000000000000000000000000003F
S31500028930000000000000000000000000000000002F
S31500028940000000000000000000000000000000001F
S31500028950000000000000000000000000000000000F
S3150002896000000000000000000000000000000000FF
S3150002897000000000000000000000000000000000EF
S3150002898000000000000000000000000000000000DF
S3150002899000000000000000000000000000000000CF
S315000289A00000001400140014001400140014001433
S315000289B000150016001800190019001A001B001CE9
S315000289C0001E001F00210023002600 28002A002C7A
S315000289D0002D41084A27000000000000000000000000A8
S315000289E0000000000000000000000000000000007F
S315000289F0000000000000000000000000FFFFFA2453
S31500028A00FFFFFF8142780000424000000000000000A4
S31500028A10451C4000C2C8000042C8000000005DC38
S31500028A200000012C0000000000000003000000000E
S31500028A300000001700000004000000FF00000000D8
S31500028A4000000003000000030000000700000000F02
S31500028A500000001F0000003F0000003F0000000071
S31500028A6000000FFF000004D2014D020000029EC466
S31500028A700002A5640002DD28015800000000000083
S31500028A80000000000002DD40047200000000000049
S31500028A90000000000002DD63017A020000029EC4AB
S31500028AA000C097E00002DD850147000000000000DB
S31500028AB0000000000002DDA40124020000029EC4A0
S31500028AC000C097E00002DDB90250020000029EC417
S31500028AD00002A56C0002DDD10251020000029EC412
S31500028AE00002873E0002DDF2023D020000029EC441
S31500028AF00002A5680002DE0D0270020000029EC49A
S31500028B000002A5780002DE2B023E060000029EC08D
S31500028B100002A5700002DE53023C060000029EC05F
S31500028B200002A5700002DE62026C020000029EC014
S31500028B300002A57C0002DE6F046400000000000053
S31500028B40000000000002DE7904630000000000005D
S31500028B50000000000002DE880556020000029EC4E4
S31500028B6000029E000002DE9F0549020000029EC42A
S31500028B7000029E000002DEAD0552020000028A2CAF
S31500028B8000028A300002DEBB0544030000028A00AE
S31500028B9000028A200002DEC905410300000289FCA8
S31500028BA000028A1C0002DEE305530000000000 00FA
S31500028BB0000000000002DF040576020000028A249B
S31500028BC000028A280002DF280543020000029EBC3A
S31500028BD000029EBC0002DF3605480000000000 00CD
S31500028BE0000000000002DF4A054E0300000289FC75
S31500028BF000028A1C0002DF63054C0300000289FCA6
S31500028C0000028A1C0002DF9D05730300000289FC34
S31500028C1000028A1C0002DFD40536020000028A3CEA
S31500028C2000028A400002E0050537020000028A3C83
S31500028C3000028A440002E0160538020000028A3C5D
S31500028C4000028A480002E0270539020000028A3C37
S31500028C5000028A4C0002E0380530020000028A3C1B
S31500028C6000028A500002E0490531020000028A3CF5
S31500028C7000028A540002E05B0566020000028A3C9A
S31500028C8000028A580002E06D0557020000029EBCEF
S31500028C9000029EBC0002E08A0561020000028A5CB4
S31500028CA000028A600002E09E046F0000000000 00DD
S31500028CB0000000000002E0DE054F020000029EC036
S31500028CC000028A340002E12C0542050000028A0CE9
S31500028CD000028A100002E1550562020000029EC0EF
S31500028CE000028A380002E1710546050000028A0880
S31500028CF000028A040002E1A60578050000028A1431
S31500028D0000028A180002E1CA0575000000000000 90
S31500028D10000000000002E1DB055400000000000034
S31500028D20000000000002E2140002E254000099AAC8
S31500028D3000028A680002E257042C000000000000CC
S31500028D40000000000000000000000000000000001B
S31500028D50000000000000000000000000000000000B
S31500028D6000000000000000000000000000000000FB
S31500028D7000000000000000000000000000000000EB
S31500028D8000000000000000000000000000000000DB
S31500028D9000000000000000000000000000000000CB
S31500028DA000000000000000000000000000000000BB
S31500028DB000000000000000000000000000000000AB
S31500028DC0000000000000000000000000000000009B
S31500028DD0000000000000000000000000000000008B
S31500028DE0000000000000000000000000000000007B
S31500028DF0000000000000000000000000000000006B
S31500028E00000000000000000000000000000000005A
S31500028E10000000000000000000000000000000004A
S31500028E200000418000003F91EB863F80000038D170
S31500028E30B7173FB504EE41B504EE3D80000044107D
S31500028E409A7843988000000000004B1896802FA263
S31500028E50E3FF469C4000471C40004F492A6A3F00F8
S31500028E600000BF8000000002E7900002E7D800027F
S31500028E70E7D90002E7EE0002E7F10002E7F6000298
S31500028E80E8190002E8500002E8930002E8EC014DFE
S31500028E90020000029EC40002A5640002E9260158EF
S31500028EA0000000000000000000000002E93E05523A
S31500028EB0000000000000000000000002E961017AE3
S31500028EC0020000029EC400C097E00002E983014747
S31500028ED0000000000000000000000002E9A20124D8
S31500028EE0020000029EC400C097E00002E9B70850E3
S31500028EF0020000029EC40002A56C0002E9CF0251E4
S31500028F00020000029EC40002873E0002E9F0023D12
S31500028F10020000029EC40002A5680002EA0B087065
S31500028F20020000029EC40002A5780002EA29023E5F
S31500028F30060000029EC00002A5700002EA51023C31
S31500028F40060000029EC00002A5700002EA60086CDC
S31500028F50020000029EC00002A57C0002EA6D0270B9
S31500028F60000000000000000000000002EA7702563E
S31500028F70000000000000000000000002EA7E01542A
S31500028F80000000000000000000000002EA84025017
S31500028F90000000000000000000000002EA8B0264EC
S31500028FA0000000000000000000000002EA960244F1
S31500028FB0000000000000000000000002EAA704749E
S31500028FC0000000000000000000000002EAB30248B0
S31500028FD0000000000000000000000002EAC5027165
S31500028FE0000000000000000000000002EADF024666
S31500028FF0000000000000000000000002EAE504781C
S31500029000000000000000000000000002EAEF047603
S31500029010000000000000000000000002EB1405350D
S31500029020000000000000000000000002EB30000219
S31500029030EB500000BBA400028E8E0002EB53011A15
S31500029040000401020005010204000102060500 01F6
S31500029050020600010304 0002EB680002EB6C000248
S31500029060EB720002EB7700000000000000000000 37
S3150002907000000000000000000000000000000000E8
S3150002908000000000000000000000000000000000D8

S315000290900000000000000000000000000000000C8
S31500029 0A0000000000000000000000000000000000B8
S315000290B000000000000000000000000000000000A8
S315000290C0000000000000000000000000000000098
S315000290D0000000000000000000000000000000088
S315000290E0000000000000000000000000000000078
S315000290F0000000000000000000000000000000068
S3150002910000000000000000000000000000000057
S3150002911000000000000000000000000000000047
S3150002912000000000000000000000000000000037
S3150002913000000000000000000000000000000027
S315000291400000000000000000000000000042C80D
S31500029150000000000000047C35000C7C3500047C3C9
S3150002916050000000005A00000001E014D0200000292
S315000291709EC40002A5640002ED78015800000000BA
S3150002918000000000000000002ED9004520000000002
S31500029190000000000000000002EDB3017A02000002A6
S315000291A09EC400C097E00002EDD50147000000012
S315000291B000000000000000002EDF40124020000029B
S315000291C09EC400C097E00002EE09025002000002AF
S315000291D09EC40002A56C0002EE21025102000002AA
S315000291E09EC40002873E0002EE42023D02000002D9
S315000291F09EC40002A5680002EE5D0270020000233
S315000292009EC40002A5780002EE7B023E0600000222
S315000292109EC00002A5700002EEA3023C06000002F8
S315000292209EC00002A5700002EEB2026C02000002AD
S315000292309EC00002A57C0002EEBF01540000000A1
S31500029240000000000000000002EEC9027400000000E7
S315000292500000000000000002EECF02420000000003
S3150002926000000000000000002EED3024C00000000E5
S315000292700000000000000002EEE002440000000D0
S3150002928000000000000000002EEED0264000000093
S315000292900000000000000000002EF040248000000087
S315000292A0000000000000000002EF220263000000003E
S315000292B0000000000000000002EF3F037900000000FA
S315000292C0000000000000000002EF610359000000000E8
S315000292D0000000000000000002EFBA0353000000085
S315000292E0000000000000000002EFEA03750600000021B
S315000292F09EC00002A5700002F01203430200002A3
S315000293009EBC00029EBC0002F0390171000000002
S31500029310000000000000000002F043036D00000000A0
S3150002932000000000000000002F049047800000007E
S3150002933000000000000000002F0790472000000044
S315000293400000000000000000002F0B00473000000000FC
S315000293500000000000000000002F0E202700200002BB
S315000293609EC40002A5780002F1090262000000014
S315000293700000000000000000002F131026B050000024D
S315000293809152000291560002F163026105000000249
S315000293909152000291560002F1940241050000228
S315000293A0915A0002915E0002F1D3053102000002D9
S315000293B09EC00002916200002F21D0532020000206
S315000293C09EC000029EC40002F2810533020000222
S315000293D09EC000029EC40002F2B005340200002E2
S315000293E09EC000029EC40002F2E5053502000029C
S315000293F09EC40002A5780002F3270536020000289
S315000294009EC00002A5780002F364053702000023E
S315000294109EC00002A5780002F3AB0538020000002E6
S315000294209EC00002A5780002F3F2055702000000270
S315000294309EBC00029EBC0002F43E0577020000002BA
S315000294409EC40002916200002F45B056F02000002F4
S315000294509EC40002916600002F47C057A02000002B4
S315000294609EBC00029EBC0002F4C0055A020000225
S315000294709EBC00029EBC0002F4E4044500000000B
S3150002948000000000000000002F5130546000000007F
S315000294900000000000000000002F5520002F56600001E
S315000294A0CEFE0002916A0002F56A0133000000056
S315000294B0000000000000000000000000000000000A4
S315000294C000000000000000000000000000000000094
S315000294D000000000000000000000000000000000084
S315000294E000000000000000000000000000000000074
S315000294F000000000000000000000000000000000064
S315000295000000000000000000000000000000000053
S315000295100000000000000000000000000000000043
S315000295200000000000000000000000000000000033
S315000295300000000000000000000000000000000023
S315000295400000000000000000000000000000000013
S315000295500000000000000000000000000000000003
S3150002956000000000000000000000000000000000F3
S3150002957000000000000000000000000000000000E3
S3150002958000000000000000000000000000000000D3
S3150002959000000000000000000000000000000000C3
S315000295A040E00D400000000040F5180000000000F9
S315000295B03FF0000000000000000000000014D020024
S315000295C000029EC40002A5640002FC840358000047
S315000295D00000000000000000002FC9C0552000092
S315000295E00000000000000000002FCBF017A020039
S315000295F000029EC400C097E00002FCE101470000A1
S31500029600000000000000000000002FD00012402002C
S3150002961000029EC400C097E00002FD15025002003F
S3150002962000029EC40002A56C0002FD2D025102003A
S3150002963000029EC40002873E0002FD4E023D020069
S3150002964000029EC40002A5680002FD6902700200C3
S3150002965000029EC40002A5780002FD87023E0600B3
S3150002966000029EC00002A5700002FDAF023C060089
S3150002967000029EC00002A5700002FDBE026C02003E
S3150002968000029EC00002A57C0002FDCB024C000037
S31500029690000000000000000000002FDD502440000A8
S315000296A0000000000000000000002FDDE0274080057
S315000296B000029EC000C000FA0002FDED025408003E
S315000296C000029EC000C000FA0002FE080177000F8
S315000296D0000000000000000000002FE2101630000FD
S315000296E0000000000000000000002FE52044500000D7
S315000296F0000000000000000000002FE860002FEC517
S315000297000000EB7C000295BC0002FEC901140000B9
S315000297100000000000000000000000000000000041
S315000297200000000000000000000000000000000031
S315000297300000000000000000000000000000000021
S315000297400000000000000000000000000000000011
S315000297500000000000000000000000000000000001
S3150002976000000000000000000000000000000000F1
S3150002977000000000000000000000000000000000E1
S3150002978000000000000000000000000000000000D1
S3150002979000000000000000000000000000000000C1
S315000297A000000000000000000000000000000000B1
S315000297B000000000000000000000000000000000A1
S315000297C0000000000000000000000000000000000091
S315000297D0000000000000000000000000000000000081
S315000297E0000000000000000000000000000000000071
S315000297F000000000000003F8000004270000497433
S315000298002400 40F5180000000000040E00D40000072
S31500029810000000000000060AD78EC000000080000C7
S3150002982000006012402000029EC400C097E0000266
S31500029830FFB0025002000029EC400029E04000213
S31500029840FFC80164000000000000000000000002E2
S31500029850FFE10244000000000000000000000002D8
S31500029860FFF50277000000000000000000000000380
S3150002987000220457020000029EBC00029EBC0003A6
S315000298800004B04430200000 29EBC00029EBC000381
S31500029890006604490500000298120002981600003A9
S315000298A0009104560500000298120002981600361
S315000298B000A5043105000002981200029816000362
S315000298C000BA043201000029EC40002981A000384
S315000298D000E6043302000029EC00002981E000346
S315000298E0010D043405000002981200029816003C6
S315000298F001370435010000029EC40002981A0003D3
S31500029900016004360200000029EC00002981E000397
S31500029910018404370500000298120002981600031B
S31500029920 01B3043801000029EC40002981A000323
S31500029930 01E10453000000000000000000000003E3
S3150002994 0020A0472000000000000000000000038A
S31500029950023B000302780000F5780002982200319
S31500029960027E01130001000100010001000100 0155

S3150002997000010001000200020001000100010001D5
S315000299800001000100010001000200020000000C7
S31500029990000000000000000000000000000010001BD
S315000299A0000100010001000100010001000000000A9
S315000299B00001000100010001000100010001000197
S315000299C000000000000020002000200020000000087
S315000299D00000000000001000100010000000000007C
S315000299E00001000000001000100020002000200165
S315000299F00000002802010200000029EC0000299F047
S31500029A0000030'38E000303AB0000FC90000299F4EE
S31500029A10000303B00101FFFFFFFF0000000400086
S31500029A20000300000F00000000070000000300001.2
S31500029A30001700000018000003E800000003000001
S31500029A40000400000000200000FFF014D02000002A8
S31500029A509EC40002A564000303E60158000000004C
S31500029A600000000000000000303FE056F0000000076
S31500029A700000000000000000030421017A0200000237
S31500029A809EC400C097E00003044301470000000A3
S31500029A9000000000000000003046201240200000 22C
S31500029AA09EC400C097E0000304770850020000023B
S31500029AB09EC40002A56C0003048F08510200000236
S31500029AC09EC40002873E000304B0083D0200000265
S31500029AD09EC40002A568000304CB027002000002C5
S31500029AE09EC40002A578000304E9083E06000002AF
S31500029AF09EC00002A57000030511083C0600000284
S31500029B009EC00002A57000030520086C0200000238
S31500029B109EC00002A57C0003052D0464000000001F
S31500029B200000000000000000305370456020000029 0
S31500029B309EC000029A1E00030546044902000000266
S31500029B409EC000029A1E0003055404520200000023F
S31500029B508A2C00029A2E00030562047602000000295
S31500029B608A2400028A28000305700448000000000C7
S31500029B70000000000000000305900454000000000ED
S31500029B8000000000000000305CD04460200000 2AA
S31500029B909EC000029A1E000305D60472000000000 51
S31500029BA00000000000000003063E04670300000 2F6
S31500029BB09A1600029A2200030664047700000000 47
S31500029BC00000000000000003069904410200000 2A2
S31500029BD09EC000029A26000306E8044E0200000216
S31500029BE09EC000029A260003072A04780200000299
S31500029BF09EC000029A2A0003076D04630200000257
S31500029C009EC000029A46000307AE04430200000209
S31500029C109EC000029A46000307C604620200000 2C2
S31500029C209EC000028A38000307DC046E0200000 2AE
S31500029C309EC000029A3200030811047302000000259
S31500029C409EC000029A3A0003083C04440200000 245
S31500029C509EC000029A36000308 5B044C0200000212
S31500029C609EC000029A3E0003088A046D0200000 2AA
S31500029C709EC000029A42000309010474000000001B
S31500029C8000000000000000003093A0003097100000 9
S31500029C90FCD000029A4A00030974042400040102 5B
S31500029CA000000000000000000000000000000000AC
S31500029CB0000000000000000000000000000000009C
S31500029CC0000000000000000000000000000000008C
S31500029CD0000000000000000000000000000000007C
S31500029CE0000000000000000000000000000000006C
S31500029CF0000000000000000000000000000000005C
S31500029D00000000000000000000000000000000004B
S31500029D10000000000000000000000000000000003B
S31500029D20000000000000000000000000000000002B
S31500029D30000000000000000000000000000000001B
S31500029D40000000000000000000000000000000000B
S31500029D500000000000000000000000000000000 0FB
S31500029D600000000000000000000000000000000 0EB
S31500029D700000000000000000000000000000000 0DB
S31500029D800000000000000000003F8000038D1B71735
S31500029D90358F2A63418000003F547AE10003100E9A
S31500029DA000011FD200011EBC000121500001 2180CA
S31500029DB00001209A00011F46000121680001244C7F
S31500029DC000000000000000004974240000000000AA
S31500029DD007D007D007D007D004A1050D042C04BC78
S31500029DE004A1050D03C8044A0432049403C8044AB4
S31500029DF00432049403C8044A0432049403C805AA2C
S31500029E0000000000100000000F0000000000000003A
S31500029E10000000000000000000000000000000003A
S31500029E2000000040000000000000000100000000 0DA
S31500029E30000000004000000000000000001012C004B9D
S31500029E40001800100000089800000708000310B56B
S31500029E500000089800000708000310C500000E74F1
S31500029E6000000800000310CD000006680000019AF9
S31500029E70000310DD0000089800000708000310EF39
S31500029E8000000032000000064000310FA00000FA087
S31500029E9000000CE40003111700000266000000044F3
S31500029EA0000311350000000000000000000003114904
S31500029EB000000000000000000000003115F000004D251
S31500029EC00000000000000000100004B000008000036
S31500029ED0000311B20003118954 4D582D3520736FEA
S31500029EE06674776172652043 6F7079726967687408
S31500029EF020313939352D313939392C32303030204B
S31500029F00517561646C6F67696320436F6E74726F1B
S31500029F106C7320436F72706F726174696F6E2E0D6F
S31500029F200A416C6C207269676874732072657365 86
S31500029F30727665642E000003119000031198 0003E7
S31500029F40119F000311A7000311AE000311B2000313
S31500029F5011B8000311BD000311C6000311CC0003A2
S31500029F6011D4000311E3000311EA000311F2000306
S31500029F7011F6000311FD0003120300031 20C000385
S31500029F80121600000000000000000000000000000A1
S31500029F900000000000000000000000000000000 0B9
S31500029FA0000000000000000000000000000000000A9
S31500029FB00000000000000000000000000000000 0099
S31500029FC00000000000000000000000000000000 0089
S31500029FD00000000000000000000000000000000 0079
S31500029FE00000000000000000000000000000000 0069
S31500029FF00000000000000000000000000000000 0059
S3150002A000000000000000000000000000000000000048
S3150002A010000000000000000000000000000000000038
S3150002A020000000000000000000000000000000000028
S3150002A030000000000000000000000000000000000018
S3150002A040000000000000000000000000000000000008
S3150002A0500000000000000000000000000000000000F8
S3150002A0600000000000000000000000000000000000E8
S3150002A0700000000000000000000000000000000000D8
S3150002A0800000000000000000000000000000000000C8
S3150002A0900000000000000000000000000000000000B8
S3150002A0A00000000000000000000000000000000000A8
S3150002A0B0000000000000000000000000000000000098
S3150002A0C0000000000000050000000090000004D20000A4
S3150002A0D00007FFFFFFFF04000000004010100000269
S3150002A0E0A0C20002A0C60003137E04020100000201
S3150002A0F0A0C20002A0C600031389056C020000027A
S3150002A1009EC00002A0CE000313A6045304000000260
S3150002A110A0D60002A0D2000313B5000313EB000180
S3150002A12059F20002A0DA000313F20104000314AC90
S3150002A13000015BD40000000000000314AF010000031D
S3150002A14014C6000314D7000314DD000314E300034E
S3150002A15014ED000314FC00015C8200015C34000172
S3150002A16 05CBA00015CD242C80000000000002D2F3C
S3150002A170E9BF5368D4A52EDBE42E30896E9D322BBF
S3150002A180CA4433D6BCD5358636054E6E6B2837277C
S3150002A190C38738D1B4683A8310C1497424003C237A
S3150002A1A0D4F13DCCCA2E3F7FFCB9447A0000411F50
S3150002A1B0FDF442C7FD714479FCCD461C3E0047C3FF
S3150002A1C04D80497420E03A83126F4B18948C4CBE32
S3150002A1D0B9AF4E6E681B358637BD5015011151BA9F
S3150002A1E041555368D1AA3089705F5511830A56B515
S3150002A1F0E3CD2B8CBCCC0000000F0000000200005 7
S3150002A20004D201240200000029EC400C097E00003AB
S3150002A21016900363000000000000000000000000327
S3150002A22016A80373020000029EC00002A1F60003F4
S3150002A23016BC037002000 0029EC00002A1FA0003CF
S3150002A24016D20364000000000000000000000003B4

S3150002A250170303610000000000000000000000000375
S3150002A2601712034102000029EC000029EC40003B0
S3150002A270173E0342020000029EC000029EC4000373
S3150002A2801763036500000000000000000000000003E1
S3150002A2901788035700000000000000000000000003BA
S3150002A2A017990453000000000000000000000000039C
S3150002A2B017A5035200000000000000000000000000382
S3150002A2C017BB034302000002A1FE0002A1FE000327
S3150002A2D017D3037400000000000000000000000000312
S3150002A2E017E70369000000000000000000000000003F9
S3150002A2F017FC0003180F000166E00002A202000329
S3150002A3001812030F0000000000031A4600016E1E19
S3150002A310000000000000031A490100202020209093C
S3150002A3200909090909090D0909090401020000002BE
S3150002A3309EC00002B65E00031A5E047000000000B2
S3150002A340000000000000000031AB0043800000000FC
S3150002A350000000000000000031AC500031AD2000123
S3150002A36075CA0002A32A00031AD5010302000000DF
S3150002A370000000000000000000000000000020000D3
S3150002A38096000000000070000000803010200000218
S3150002A3909EC00002A37E00031C7E03700200000220
S3150002A3A09EC00002A37A00031CA3016E02000002F3
S3150002A3B0A3820002A38600031CC0016502000002FC
S3150002A3C09EC000029EC400031CD9016D0200000259
S3150002A3D09EC000029EC400031CEF0157020000249
S3150002A3E09EBC00029EBC00031D070174000000013
S3150002A3F000000000000000031D3100031D4D000196
S3150002A400799A0002A38A00031D52010700031DEC7C
S3150002A41000017C72000000000000031DEF0100000332
S3150002A4201E0400017CE6000000000000031E0B010072
S3150002A43000031E2400017D5A000000000000031E27AF
S3150002A44001003080002B900000000000000000000098
S3150002A4500000000000000000000000000031E50000182
S3150002A4608AAA000000000000031E5401000018BEEC0
S3150002A47000018C2600018C7400018C8C0000000007
S3150002A48000000000000000000000000000000000C4
S3150002A49000000000000000000000000000000000B4
S3150002A4A00000000000000000000000000000000A4
S3150002A4B0000000000000000000000000000000094
S3150002A4C0000000000000000000000000000000084
S3150002A4D0000000000000000000000000000000074
S3150002A4E0000000000000000000000000000000064
S3150002A4F0000000000000000000000000000000054
S3150002A500000000000000000000000000000000043
S3150002A510000000000000000000000000000000033
S3150002A520000000000000000000000000000000023
S3150002A530000000000000000000000000000000013
S3150002A540000000000000000000000000000000003
S3150002A5500000000000000000000000000000000F3
S3150002A56000000000000000180000000200000010B9
S3150002A570FFFF0000000001900000001800000040EC
S3150002A5800000001F003B005A0078009700B500D477
S3150002A59000F301110130014E016D000000000000C0
S3150002A5A0016D000002DA00000448000005B5000053
S3150002A5B00722000088F000009FD00000B6A000058
S3150002A5C00CD700000E4400000FB20000111F00005D
S3150002A5D0128C000013F90000156700016D4000063
S3150002A5E01841000019AE00001B1C00001C89000067
S3150002A5F01DF600001F63000020D10000223E00006D
S3150002A60023AB000025180000268600027F3000071
S3150002A61029600002ACD00002C3B00002DA8000076
S3150002A6202F150000308200031F00000335D00007B
S3150002A63034CA00003637000037A50000391200080
S3150002A6403A7F00003BEC00003D5A00003EC7000086
S3150002A65040340000041A10000430F0000447C00008A
S3150002A66045E9000047560000048C400004A31000090
S3150002A6704B9E00004D0B00004E7900004FE6000095
S3150002A6805153000052C00000542E0000559B00009A
S3150002A6905708000058750000059E300005B5000009F
S3150002A6A05CBD00005E2A00005F980000610500000A4
S3150002A6B06272000063DF0000654D000066BA0000AA
S3150002A6C06827000069940000 6B0200006C6F0000AE
S3150002A6D06DDC00006F49000070B7000072240000B4
S3150002A6E07391000074FE0000766C000077D90000BA
S3150002A6F0794600007AB300007C2100007D8E0000BE
S3150002A7007EFB0000806800081D600008343000C3
S3150002A71084B00000861D0000878B000088F80000C8
S3150002A7208A6500008BD200008D400008EAD0000CD
S3150002A730901A00009187000092F500009462000D2
S3150002A74095CF0000973C000098AA00009A170000D7
S3150002A7509B8400009CF100009E5E00009FCB0000DF
S3150002A760A1380000A2A50000A4130000A5800000E5
S3150002A770A6ED0000A85A0000A9C80000AB350000EB
S3150002A780ACA20000AE0F0000AF7D0000B0EA0000F0
S3150002A790B2570000B3C40000B5320000B69F0000F5
S3150002A7A0B80C0000B9790000BAE70000BC540000FA
S3150002A7B0BDC10000BF2E0000C09C0000C2090000FF
S3150002A7C0C3760000C4E30000C6510000C7BE000005
S3150002A7D0C92B0000CA980000CC060000CD73000009
S3150002A7E0CEE00000D04D0000D1BA0000D327000011
S3150002A7F0D4940000D6010000D76F0000D8DC000018
S3150002A800DA490000DBB60000DD240000DE9100001C
S3150002A810DFFE0000E16B0000E2D90000E446000022
S3150002A820E5B30000E7200000E88E0000E9FB000027
S3150002A830EB680000ECD50000EE430000EFB000002C
S3150002A840F11D0000F28A0000F3F80000F565000031
S3150002A850F6D20000F83F0000F9AD0000FB1A000036
S3150002A860FC870000FDF40000FF62000100CF00013A
S3150002A870023C000103A900010517000106840013C
S3150002A88007F10001095E00010ACC00010C39000142
S3150002A8900DA60000100000001000000010000000FA
S3150002A8A0010000000100000001000000010000009C
S3150002A8B0010000000100000001000000010000008C
S3150002A8C0010000000100000001000000010000007C
S3150002A8D0010000000100000001000000010000006C
S3150002A8E0010000000100000001000000010000005C
S3150002A8F0010000000100000001000000010000004C
S3150002A900000000000100000001000000010000003C
S3150002A910010000000100000001000000010000002B
S3150002A920010000000000000001000000010000001C
S3150002A930010000000100000001000000010000000B
S3150002A9400100000001000000010000000100004EAD
S3150002A9500001A2F20001A3480001A3960001A3AEE2
S3150002A96000000000000000004A1E34004AED4E00BE
S3150002A970000000000000100010002000200020002C5
S3150002A98000030003000300030003000300030003A7
S3150002A990000400040004000400040004000400048F
S3150002A9A000040004000400040004000400040047F
S3150002A9B00005448000003FB4FDF4448000003FB42B
S3150002A9C0FDF40000023500002A2A4B9896803F9932
S3150002A9D0999A3F4CCCCD000000000000000000000018
S3150002A9E000000000000000000000000000000000005F
S3150002A9F000000000000000000000001C85A00012B
S3150002AA00C8C00001C8EC0001C9A60001C9D80001EE
S3150002AA10CA5A0001CAE00001CBAE0001CBE0000138
S3150002AA20CC120001CC440001CCFA0001CD2C00016D
S3150002AA30CD5E0001CD900001CDC20001C8860001A5
S3150002AA40C8D60001C9320001C9C20001CA0E0001FE
S3150002AA50CA9A0001CB0C0001CBCA0001CBFC000153
S3150002AA60CC2E0001CC7A0001CD160001CD480001A2
S3150002AA70CD7A0001CDAC0001CDDE0C001200210022
S3150002AA803F00470059006A0074008B009500A6003B
S3150002AA90B800C000DE00ED00F300000000000000078
S3150002AAA0000000000000000000000000000000009E
S3150002AAB0000000000000000000000000000000008E
S3150002AAC0000000000000000000000000000000007E
S3150002AAD0000000000000000000000000000000006E
S3150002AAE0000000000000000000000000000000005E
S3150002AAF0000000000000000000000000000000004E
S3150002AB00000000000000000000000000000000003D
S3150002AB10000000000000000000000000000000002D
S3150002AB20000000000000000000000000000000001D

S3150002AB3000000000000000000000000000000000000D
S3150002AB400000000000000000000000000000000000FD
S3150002AB500000000000000000000000000000000000ED
S3150002AB600000000000000000000000000000000000DD
S3150002AB700000000000000000000000000000000000CD
S3150002AB800000000000000000000000000000000000BD
S3150002AB900000000000000000000000000000000000AD
S3150002ABA000000000000000000000000000000000009D
S3150002ABB000000000000000000000000000000000008D
S3150002ABC000000000000000000000000000000000007D
S3150002ABD000000000000000000000000000000000006D
S3150002ABE000000000000000000000000000000000005D
S3150002ABF000000000000000000000000000000000004D
S3150002AC0000000000000000000000000000000000003C
S3150002AC1000000000000000000000000000000000002C
S3150002AC2000000000000000000000000000000000001C
S3150002AC3000000000000000000000000000000000000C
S3150002AC400000000000000000000000000000000000FC
S3150002AC500000000000000000000000000000000000EC
S3150002AC6000000000000000000000000001810174E5
S3150002AC700172014 60D0604060D060406B90000001F
S3150002AC8000000000000020809000000C00000018068
S3150002AC9000000B4046E5D7891523038600AB012C3D
S3150002ACA0012C023046E5D7890C100C0A000140003F
S3150002ACB0220002300007A400018101740172014 6DC
S3150002ACC00D0604060D060406B9000000000000000089
S3150002ACD000020809000000C00000018000000B40CD
S3150002ACE0471D9E000F5C028F007C0190019002308E
S3150002ACF0471D9E00108A108400014000220002308 7
S3150002AD000007A4000181017401720146 0D060406C2
S3150002AD100D060406B9000000000000000002080942
S3150002AD20000000C0000000C000000B4047AF11DB6E
S3150002AD3006E2012600370190019002304 7AF11DB8F
S3150002AD4024BA24B4000140002200023 00007A40005
S3150002AD50018101740172014 60D0604060D06040600
S3150002AD60B900000000000000002080900000 0C04F
S3150002AD70000000C000000B40476CAEF70A3301B377
S3150002AD8000520190019002304 76CAEF718D418CFEA
S3150002AD900001400022000230000 7A4001510101026
S3150002ADA00801009601A90258035205DC010400C8F5
S3150002ADB001DB0258030704B00110012C02580258A5
S3150002ADC0025803E80801009601A90258035205DC5D
S3150002ADD0010400C801DB0258030704B00110012C6C
S3150002ADE0025802580258 03E80110012C0258025870
S3150002ADF0025803E8000000000000050008000A000BE4
S3150002AE00000C000E000E000F001000110011 0012BF
S3150002AE1000120013001300140014001 4001500158C
S3150002AE200015001600160016001700170017001767
S3150002AE300018001800180018001900190019001946
S3150002AE4000190019001A001A001A001A001A001A2C
S3150002AE50001B001B001B001B001B001B001B001C11
S3150002AE60001C001C001C001C001C001C001C001DF9
S3150002AE70001D001D001D001D001D001D001D001DE2
S3150002AE80001E001E001E001E001E001E001E001ECA
S3150002AE90001E001E001E001F001F001F001F001FB5
S3150002AEA0001F001F001F001F001F001F001F001FA2
S3150002AEB000020002000200020002000200020002 08A
S3150002AEC00002000200020002000200020002100217 8
S3150002AED000021002100210021002100210021002162
S3150002AEE00002100210021002100210021002100225 1
S3150002AEF000022002200220022002200220022002 23A
S3150002AF000002200220022002200220022002200222 9
S3150002AF1000022002200230023002300230023002313
S3150002AF2000023002300230023002300230023002301
S3150002AF30000230023002300230023002300230023F1
S3150002AF40000240024002400240024002400240024D9
S3150002AF50000240024002400240024002400240024C9
S3150002AF60000240024002400240024002400240024B9
S3150002AF70000240024002500250025002500250025A3
S3150002AF8000025002500250025002500250025002591
S3150002AF9000025002500250025002500250025002581
S3150002AFA000025002500250025002500250025002670
S3150002AFB000026002600260026002600260026002659
S3150002AFC000026002600260026002600260026002649
S3150002AFD000026002600260026002600260026002639
S3150002AFE000026002600260026002600260026002629
S3150002AFF0002600270000000000003000500060007E7
S3150002B00000080008000 9000A000A000A000B000BEB
S3150002B010000B000C000C000C000D000D000D000DC5
S3150002B020000D000E000E000E000E000E000E000FA8
S3150002B030000F000F000F000F000F000F001000108E
S3150002B04000010001000100010001000100010001177
S3150002B05000110011001100110011001100110011 60
S3150002B06000110011001100120012001200120012 4B
S3150002B07000120012001200120012001200120012 38
S3150002B08000120013001300130013001300130013 21
S3150002B09000130013001300130013001300130013 10
S3150002B0A00013001300130013001400140014 0014FC
S3150002B0B00014001400140014001400140014 0014E8
S3150002B0C00014001400140014001400140014 0014D8
S3150002B0D00014001400140015001500150015 0015C3
S3150002B0E00015001500150015001500150015 0015B0
S3150002B0F00015001500150015001500150015 0015A0
S3150002B10000150015001500150015001500150015 8F
S3150002B11000160016001600160016001600160016 77
S3150002B12000160016001600160016001600160016 67
S3150002B13000160016001600160016001600160016 57
S3150002B14000160016001600160016001600160016 47
S3150002B15000160016001600160017001700170017 33
S3150002B16000170017001700170017001700170017 1F
S3150002B17000170017001700170017001700170017 0F
S3150002B1800017001700170017001700170017 0017FF
S3150002B1900017001700170017001700170017 0017EF
S3150002B1A00017001700170017001700170017 0017DF
S3150002B1B00017001700180018001800180018 0018C9
S3150002B1C00018001800180018001800180018 0018B7
S3150002B1D00018001800180018001800180018 0018A7
S3150002B1E00018001800180018001800180018001897
S3150002B1F0001800180 12C01540154015401F401CC29
S3150002B20001CC01CC00010001000100010001000196
S3150002B2100001000100010001000100010001000 11E
S3150002B2200001000100000010E021D032C043A05492B
S3150002B230065807660875F873F982FA91FB9FFCAE09
S3150002B240FDBDFECB0001030701020408010204084A
S3150002B2500007000321440003214800032 14E000396
S3150002B26021540003215F0003216A00032173 0003B6
S3150002B2702180000 3218B00032195000321A00003F6
S3150002B28021AE000321AF000321B5000321C2000352
S3150002B29021CD000321DD000321EA0003220 300037E
S3150002B2A0220D000322180003222600032235000085
S3150002B2B00000000000000F000000000000000100000 67
S3150002B2C00000000000000800000000000000003 00006B
S3150002B2D00000900000007700000000000000001 00000D6
S3150002B2E0000000000000200000000000000000 700004D
S3150002B2F000000000000030000000000000000003000040
S3150002B30000000000000080000000000000000000002D
S3150002B310000100000 3FF0000000300000000200001D
S3150002B3200004C7AFC80047AFC8000000400004438E
S3150002B33004000002B2AE0002B2B20003223B047362
S3150002B340040000027B8800027B8C0003223F04700B
S3150002B350020000027B8000027B840003224504 7205
S3150002B360040000027B8800027B8C0003224A0452FE
S3150002B37004000002B2D60002B2DA0003224F0463CE
S3150002B38005000002B3220002B32600032253043052
S3150002B39005000002B3220002B326000 3226C043128
S3150002B3A005000002B3220002B3260003229C046CAD
S3150002B3B002000002B30E0002B312000322CD0458AB
S3150002B3C000000000000000000000000000322EA04530F
S3150002B3D004000002B2B60002B2BA000323100 44807
S3150002B3E004000002B2BE0002B2C2000323220454C9
S3150002B3F004000002B2C60002B2D2000323340449 9A
S3150002B40004000002B2DE0002B2E20003234A044450

S3150002B41004000002B2E60002B2EA000323720461EB
S3150002B42000000000000000000000000003237D0478F5
S3150002B43000000000000000000000000003238A046AE6
S3150002B44004000002B2EE0002B2F200032393046982
S3150002B45000000000000000000000000323E3047A5D
S3150002B46000000000000000000000000003241904642C
S3150002B47000000000000000000000000003243A04411E
S3150002B480000000000000000000000000032445044202
S3150002B490000000000000000000000000003244C0450DD
S3150002B4A000000000000000000000000324530457BF
S3150002B4B0000000000000000000000000032466044FA4
S3150002B4C000000000000000000000000003248 2045A6D
S3150002B4D002000002B2F60002B2FA000324A50459E1
S3150002B4E002000002B2E60002B2EA000324B00455EA
S3150002B4F002000002B3060002B30A000324B3046E71
S3150002B500020000029EC40002B31E000324DD046290
S3150002B51003000002B2FE0002B302000324EC04465A
S3150002B520030000029EC00002B31600032530044C3D
S3150002B530020000029EC00002B31A00032571044DE8
S3150002B540020000029EC000029EC4000325DF0466BC
S3150002B550000000000000000000000000003262004 6D29
S3150002B560040000027B8800027B8C0003266A0456D4
S3150002B570000000000000000000000000003267F0476A1
S3150002B5800000000000000000000000000032697047976
S3150002B590000000000000000000000000003264A4044E84
S3150002B5A0020000029EC40002B2CE000326B7046760
S3150002B5B0020000029EC00002B2CA000326F9044736
S3150002B5C0020000029EC00002B32A0003272F047461
S3150002B5D000000000000000000000000003276E046B5C
S3150002B5E000000000000000000000000000032777043876
S3150002B5F000000000000000000000000000327B6046FF0
S3150002B600000000000000000000000000327FC000309
S3150002B610281A0001E1860002B32E0003281C042E1C
S3150002B6203FA000004000000041A000004B98968019
S3150002B63040800000000000003F0000004F80000034
S3150002B64042C80000498000039102DE00003310293
S3150002B6500002012A00000000000331080100000078
S3150002B660001800033120000331250000000F0000FE
S3150002B6700FFFFFFFFFFF00000063000000770000DE
S3150002B6800007000000FFFFFFFF8000000080000AF
S3150002B6900007000000008084D020000029EC40002D6
S3150002B6A0A5640003312A015800000000000000000D2
S3150002B6B000000000331420372000000000000000097
S3150002B6C00000000033165017A020000029EC400C038
S3150002B6D097E00003318701470000000000000000E8
S3150002B6E000000000331A60124020000029EC400C02D
S3150002B6F097E0000331BB0850020000029EC400021C
S3150002B700A56C000331D30851020000029EC4000258
S3150002B710873E000331F4083D020000029EC4000287
S3150002B720A5680003320F0870020000029EC40002E0
S3150002B730A57800033322D023E060000029EC00002DA
S3150002B740A570000333255023C060000029EC00002AC
S3150002B750A57000033264086C020000029EC000025B
S3150002B760A57C000332710264000000000000000000A4
S3150002B7700000000003327B0262020000029EC0000249
S3150002B780B66A0003328002760000000000000000064
S3150002B79000000000033298036C010000029EC40002FE
S3150002B7A0B692000332A60273040000029EC0000293
S3150002B7B0B672000332BF0270020000029EC00028F
S3150002B7C0B66E000332CD0254040000029EC00028F
S3150002B7D0B67A000332DA0249040000029EC0000271
S3150002B7E0B67E000332E90253040000029EC0000244
S3150002B7F0B682000332F80248040000029EC00022C
S3150002B800B6820003330602520400000029EC0000202
S3150002B810B6720003331402410400000029EC0000205
S3150002B820B67200033325026904000029EC00002BC
S3150002B830B672000333340243040000029EC00002C3
S3150002B840B672000333347045A020000029EBC00028D
S3150002B8509EBC00033358036100000000000000000094
S3150002B8600000000033361036F000000000000000C7
S3150002B870000000000333760356040000029EC0000255
S3150002B880B672000333890366000000000000000060
S3150002B8900000000003339E034200000000000000087
S3150002B8A00000000333D3036E020000029EC40002AE
S3150002B8B0B31E000333ED0157020000029EBC0002D4
S3150002B8C09EBC000333FC00000000000000000000E4
S3150002B8D00000000000000000000000000000000000060
S3150002B8E00000000000000000000000000000000000050
S3150002B8F00000000000000000000000000000000000040
S3150002B9000000000000000000000000000000000000002F
S3150002B9100000000000000000000000000000000000001F
S3150002B9200000000000000000000000000000000000000F
S3150002B930000000000000000000000000000000000000FF
S3150002B940000000000000000000000000000000000000EF
S3150002B950000000000000000000000000000000000000DF
S3150002B960000000000000000000000000000000000000CF
S3150002B970000000000000000000000000000000000000BF
S3150002B980000000000000000000000000000000000000AF
S3150002B9900000000000000000000000000000000000009F
S3150002B9A0000000000000000000000000000000000038C
S3150002B9B03575000207500002B69600033357801235A
S3150002B9C00000FFFF020104000029EC00002B9C08F
S3150002B9D00003359400035C000020F340002B9C4D7
S3150002B9E0000335C601010000000500000004000000A
S3150002B9F00001000005A0020101000029EC400022F
S3150002BA00B9E6000335F4025402000029EC00002A9
S3150002BA10B9EA0003360802690200002B9EE000222
S3150002BA20B9F20003361D026E020000029EC4000235
S3150002BA30B9EA00033639026400000000000000000083
S3150002BA4000000000336560224020000029EC000C017
S3150002BA5097E00003365B0253020000029EC000021A
S3150002BA609EC400033676000000F0000FFFF0000B0
S3150002BA70059F0000000401010200000029EC00002B0
S3150002BA80BA72000339900443020000029EBC00020F
S3150002BA909EBC00033A21046C00000000000000000076
S3150002BAA0000000033A4E04730000000000000000008C
S3150002BAB00000000033A89026400000000000000000052
S3150002BAC00000000033AA902780000000000000000000E
S3150002BAD0000000033AAE00033C3500021D3E0002A0
S3150002BAE0BA7600033C3A010600033C8D00021F5859
S3150002BAF000000000000033C9101000000000000006D
S3150002BB00000000000000000000000000000000000002D
S3150002BB1000000000000000000000000001024E0000CC
S3150002BB2003E80000999000000004084D0200000293
S3150002BB309EC40002A56400033CBA015800000003E
S3150002BB400000000000000000033CD20352000000087
S3150002BB50000000000000000033CF5017A020000022A
S3150002BB609EC400C097E000033D170147000000095
S3150002BB700000000000000000033D36012402000021E
S3150002BB809EC400C097E000033D4B085002000022D
S3150002BB909EC40002A56C00033D6308510200000228
S3150002BBA09EC40002873E00033D84083D0200000257
S3150002BBB09EC40002A56800033D9F087002000002B1
S3150002BBC09EC40002A57800033DBD023E06000002A7
S3150002BBD09EC00002A57000033DE5023C060000027D
S3150002BBE09EC00002A57000033DF4086C020000022C
S3150002BBF09EC00002A57C00033E0102640000000014
S3150002BC000000000000000000033E0B025300000008B
S3150002BC100000000000000000033E10026C0200000259
S3150002BC209EC40002BB1E00033E2002010400000265
S3150002BC309EC00002B67A00033E30020204000002F1
S3150002BC409EC00002B67A00033E4B020304000002C5
S3150002BC509EC00002B67A00033E66026900000003A
S3150002BC600000000000000000033E81026602000029E
S3150002BC709EC000029EC40033E9C02720000000A9
S3150002BC80000000000000000033EB50249020000267
S3150002BC909EC00002BB2600033ECC00000000000004E
S3150002BCA0000000000000000000000000000000000008C
S3150002BCB0000000000000000000000000000000000007C
S3150002BCC0000000000000000000000000000000000006C
S3150002BCD0000000000000000000000000000000000005C
S3150002BCE0000000000000000000000000000000000004C

S3150002BCF0000000000000000000000000000000003C
S3150002BD00000000000000000000000000000000002B
S3150002BD10000000000000000000000000000000001B
S3150002BD20000000000000000000000000000000000B
S3150002BD3000000000000000000000000000000000FB
S3150002BD4000000000000000000000000000000000EB
S3150002BD5000000000000000000000000000000000DB
S3150002BD6000000000000000000000000000000000CB
S3150002BD7000000000000000000000000000000000BB
S3150002BD8000000000033F9E0002245C0002BB2A00035F
S3150002BD903FA1011800000000000000000F0000000093
S3150002BDA0FFFFFFFF200000000000000000000000006F
S3150002BDB000000000FFFFFFFF50000000000000002F
S3150002BDC00000000000000000FFFFFFFF600000000F
S3150002BDD0000000000000000000000000FFFFFFFF5F
S3150002BDE008000000000000000000000000000000CB
S3150002BDF0FFFFFFFF9000000000000000000000000AF
S3150002BE0000000000FFFFFFFF40000000000000000EE
S3150002BE100000000000000000FFFFFFFF00000002E
S3150002BE2064696F757858706E637366654567470017
S3150002BE30C1DAF2AD4264D53AC21EC165412270BB77
S3150002BE40BF325DEEC324360243D09278C3BEEE788B
S3150002BE504316F3E5C1BE97430000000000000000050
S3150002BE603FC90FDB40490FDB3FC90FDB322BCC77D3
S3150002BE703F0000003F800000C15B0533C1A40BFEFA
S3150002BE80C107E9FBBF566BD7422443E642AC50904A
S3150002BE90426E50524170624F000000003F060A9205
S3150002BEA03FC90FDB3F860A923F8000003E8930A4DD
S3150002BEB03FDDB3D7BF800000322BCC7700000000F5
S3150002BEC07F7FFFFF40490FDB3FE61F47BEEB2F6731
S3150002BED03CB5576D41AC9775C10BF8D0000000018
S3150002BEE0FF7FFFFF3F3504F33F3172183EDE5BD919
S3150002BEF0000000003ED8E33D3F15539D3F3504F355
S3150002BF003F8000007F7FFFFF7F7FFFFFFF7FFFFFF6
S3150002BF100080000043FC15F841600C8D3D0876B3A5
S3150002BF20447C15F842E011C90000000042B000004E
S3150002BF307F7FFFFFC2AE0000233877AA3F80000052
S3150002BF403FB8AA3B3F0000003F3172183F8CCCCD70
S3150002BF50000000007F7FFFFFFF7FFFFF3F800000A2
S3150002BF6000000000FF7FFFFF7F7FFFFF0000000051
S3150002BF703F80000040000000404000004080000007A
S3150002BF8040A0000040C0000040E000004100000068
S3150002BF904110000041200000042C80000447A00001F
S3150002BFA0461C400047C35000497424004B18968033
S3150002BFB04CBEBC204E6E6B28501502F951BA43B7DF
S3150002BFC05368D4A5551184E756B5E62158635FA98F
S3150002BFD05A0E1BCA749DC5AE7F8000007F8000008A
S3150002BFE07F8000007F8000007F8000007F8000004D
S3150002BFF07F8000007F8000007F8000007F8000003D
S3150002C0007F8000007F8000007F8000007F8000002C
S3150002C0107F8000007F8000007F800000002020200BB
S3150002C0202020202020202028282828282020202020E0
S3150002C03020202020202020202020202020481010F0
S3150002C04010101010101010101010101010108484848C
S3150002C050848484848484841010101010101008181CA
S3150002C0608181818101010101010101010101010101B8
S3150002C070010101010101010101101010101082824C
S3150002C080828282820202020202020202020202020288
S3150002C09002020202020202021010101020000000028
S3150002C0A000000000000000000000000000000000088
S3150002C0B000000000000000000000000000000000078
S3150002C0C000000000000000000000000000000000068
S3150002C0D000000000000000000000000000000000058
S3150002C0E000000000000000000000000000000000048
S3150002C0F000000000000000000000000000000000038
S3150002C10000000000000000000000000000000000027
S3150002C1100000000000000000000000000004E0000C9
S3150002C120000000000000003FF000000000000400098
S3150002C130000000000000040080000000000000040105F
S3150002C1400000000000000040140000000000000040183B
S3150002C150000000000000000401C000000000000040201B
S3150002C16000000000000000402200000000000000402401
S3150002C17000000000000000405900000000000000040C31B
S3150002C180880000000000004197D784000000000434168
S3150002C190C37940000000004693B8B5C00000007FF0A6
S3150002C1A00000000000000007FF00000000000007FF0A9
S3150002C1B000000000000000000000000000000005A59C4
S3150002C1C05B5756555453525150 4F4E4D4C4B4A495F
S3150002C1D0484746454443424139383736353433287
S3150002C1E03130004E000000000000000005365726905
S3150002C1F0616C20706F6C6C005365726E6F004E6FCF
S3150002C200205365726E6F007365742073657269617F
S3150002C2106C20706F6C6C006C766C203120706173D0
S3150002C2207373776400 6C766C2032207061737377 6466
S3150002C230006C766C20332070617373776400 6C76C1
S3150002C2406C20342070617373776400 6C766C2035D1
S3150002C2502070617373776400 6C766C20362070618F
S3150002C2607373776400 6C766C2035207465 6D70206C
S3150002C27063616C6962207061737377640071 7569BA
S3150002C28065742 06C6F6720696E0064756D7020732B
S3150002C290657 26E6F0064756D70207365726E6F20C5
S3150002C2A0776974686F7574206C6F6767696E67204B
S3150002C2B0696E0073746F7265207365726961 6C20B2
S3150002C2C0706F6C6C2061646472657373006174 7460
S3150002C2D06E006C6F676F6E000D0A4D617820696E95
S3150002C2E0206172636869766500343332316664733D
S3150002C2F061000D25730D0A4C6F676F6E20746F20F7
S3150002C300256C78206174200000D0A000D0A25386C10
S3150002C3107820257800 4E4D6F6E64617900547565FC
S3150002C3207364617900576564 6E657364617900545C
S3150002C330687572736461790046726964617900 5343
S3150002C3406174757264617900 53756E6461790 02552
S3150002C3503032643A253032643A2530326400253070
S3150002C36032643A253032640020002532642F2532A9
S3150002C370642F25346400 2532642F2532642F253438
S3150002C38064002534642F2532642F25326400200090
S3150002C3902532642F253264002532642F253264004B
S3150002C3A0252D332E33732025730044535400002564
S3150002C3B03034642530326425303264 2E25303264BE
S3150002C3C025303264004E626F78636C00626F7820AB
S3150002C3D0636C6F7365642065766 56E7473000D0A0F
S3150002C3E025732025376C6420004E4576656E7420D1
S3150002C3F0446961676E6F7374696300252D31362E49
S3150002C40031367300252D31362E3136730054696D5F
S3150002C410652000446174652000252D31302E3130AF
S3150002C420732536 6C640064756D70206469737706C74
S3150002C43061792072656769737465727300 64756DDC
S3150002C44070 20636F6C756D6E20686561646 96E67D6
S3150002C45073006475 6D702073637 26F6C6C20726505
S3150002C46067697374657273007370656369667920B0
S3150002C470636F6C756D6E206E756D626572206 66F88
S3150002C48072202D64206F72202D730073706563 69AC
S3150002C49066792072656769737465722 06E756D625E
S3150002C4A065722066 6F72202D7300636C656172205F
S3150002C4B07468652073637 26F6C6C207461626C655C
S3150002C4C0005772697465207468652073637 26F6CB5
S3150002C4D06C207461626C6500726570656174656476
S3150002C4E06C792064756D7020746865207265676961
S3150002C4F073746572206F6E20746865206469737048
S3150002C5006C6179006469737000 64756D70206469 8A
S3150002C51073706C61792072656769737465727300F2
S3150002C52000D0A2532642025336420 7C253136737C3E
S3150002C5302000207C252D31362E3136737C00207C5E
S3150002C540252D31362E3136737C000D0A25326420B4
S3150002C55025336420 7C253136737C20000D0A253272
S3150002C560642025336420 7C253136737C2000207CB0
S3150002C570252D31362E3136737C00207C252D313621
S3150002C5802E3136737C000D0A53706563696669 65E0
S3150002C5906420726567697374657220646F657320BF
S3150002C5A06E6F74206578697374206 96E2073706586
S3150002C5B06369666965642063 6F6C756D6E000D0A4A
S3150002C5C05370656369666965642072656769737429

S3150002C5D06572206F7574206F6620626F756E647364
S3150002C5E020666F72207370656369666965642063 8D
S3150002C5F06F6C756D6E000D0A53706563696669 65C9
S3150002C6006420636F6C756D6E20697320656D70743E
S3150002C61079000D0A537065636966696564206 36F04
S3150002C6206C756D6E206973206F7574206F6620625B
S3150002C6306F756E6473000D0A5363726F6C6C2074AF
S3150002C64061626C652066756C6C000D0A4D6178201E
S3150002C650696E2061726368697665004E5265676924
S3150002C66073746572730025 2D31362E31367300438D
S3150002C6706F707972696768742031393939 00252DEE
S3150002C68031362E3136730051756164 6C6F6769639A
S3150002C69020544D582D35000D0A2532642025336469
S3150002C6A02000207C252D31362E3136737C00207CED
S3150002C6B0252D31362E3136737C00252D31362E311D
S3150002C6C03673005265766572736500466F727761DE
S3150002C6D0726400252D31362E31367300496E697427
S3150002C6E069616C697A696E6700252D31362E31369D
S3150002C6F07300506C656173652077616974005374C9
S3150002C70061727420616464720045 6E642061646 4BF
S3150002C71072004C656E677468207 46F2064697 3706A
S3150002C7206C617920696E20646563696D616C006471
S3150002C7306973706C617920617320363 42D62697475
S3150002C740206C6F6E6720646F75626C657300646936
S3150002C75073706C617920617320333 22D62697420A3
S3150002C760666C6F6174696E6720706F696E74206E95
S3150002C770756D626572730064697370 6C61792061AC
S3150002C78073203136206269742077 6F726473006495
S3150002C7906973706C6179206173203 3322062697427
S3150002C7A0206C6F6E6773006469737 06C61792061C7
S3150002C7B07320382062697420636861726163 7465EC
S3150002C7C07273006669 6C6C206D656D6F7279207785
S3150002C7D06974682068657820766 16C75652C2061BD
S3150002C7E06464202D69206F72202D6C20666F722082
S3150002C7F03136206F722033322062697473 2C2064C2
S3150002C80065666 1756C74203820626974730066 69A6
S3150002C8106C6C206D656D6F7279207769746820661D
S3150002C8206C6F617420 76616C75652C2061646420 7E
S3150002C8302D4C20666F72203820627974652C206434
S3150002C8406566 61756C742034206279746500746 55E
S3150002C850737400657261736520666C61736820 7318
S3150002C8606563746F72007072696E7420666C6F61B4
S3150002C87074732069 6E20657870 6F6E656E7469 6177
S3150002C8806C20666F726D00636F6C642073746172E4
S3150002C8907420746865206D657465720070 72696EC5
S3150002C8A07420736563746F72206D617000 646973BE
S3150002C8B0706C6179206173203136206269742 0754B
S3150002C8C0666C6F6174732000646D0064756D702010
S3150002C8D06D656D6F7279000D0A53232053656374 7B
S3150002C8E05479706520562053416464722020536542
S3150002C8F0637453697A65204461746120202020554F
S3150002C90073656420205365637453 6571232053 65F0
S3150002C91063745469 6D6520202053656374446174A1
S3150002C92065202020202020202025 5443204E756D443D
S3150002C930617973000D0A25326420005072 6F6772A6
S3150002C940616D2000446174612020202000587265C8
S3150002C95066202020200041726368697665200043C4
S3150002C960616C436F6E737400384B546F7554616219
S3150002C970004E6F74205573656400202563202530B0
S3150002C980366C782025386C640020202020202 02553
S3150002C990376C642025396C78200020202020202046
S3150002C9A025376C642025396C6420002020202020 45
S3150002C9B02025376C642025396C642000204F706571
S3150002C9C06E2025376C640020446F6E652025376C17
S3150002C9D06400204F70656E2025376C64002025396F
S3150002C9E06C6420002025396C640020253764000D14
S3150002C9F00A2530366C782000254C6500254C6700E8
S3150002CA000D0A2530366C78200025650025670 00D55
S3150002CA100A2530366C782000256500256700 0D0A48
S3150002CA202530366C782000253038 6C7820000D0AC7
S3150002CA302530366C7820002530347820000D0A2502
S3150002CA4030366C78200025303278 20000D0A457287
S3150002CA506173696E672064617461 20736563746FC4
S3150002CA6072202564000D0A526573746172746 96ED0
S3150002CA706720686172647761726500 0D0A52657398
S3150002CA8074617274696E67206C6F67000D0A496E75
S3150002CA90697469616C697A696E67207 2616D000DED
S3150002CAA00A526573746F72696E6720696E74657275
S3150002CAB07275707473006472006465 6D616E6420D1
S3150002CAC07265736574 73000D0A25732025376C64CD
S3150002CAD02000 54696D6520696E2048483A4D4D3AEA
S3150002CAE0535320666F726D6174004461746 52D66DE
S3150002CAF06F726D617420737065632764206279209A
S3150002CB002D66206F7074696F6E00666F726D617448
S3150002CB1020303D4D4D2F44442F5959595920313D0E
S3150002CB2044442F4D4D2F59595959 20323D5959597F
S3150002CB30592F4D4D2F4444006F6666736574206607
S3150002CB40726F6D20656E74657265642064617465CA
S3150002CB5020696E20686F757273006474007 4696D63
S3150002CB60652F64617465000D0A4D696E696D756D98
S3150002CB702074696D65206265747765656E207265DD
S3150002CB8076657273652074696D652063686 16E6788
S3150002CB9065732069732032342068 6F7572730D0ACB
S3150002CBA0000D0A5761726E696E67202D20726576D6
S3150002CBB06572736520746 96D65206368616E676569
S3150002CBC07320647570 6C696361746520646179733E
S3150002CBD020616E642072656475636520617661 69A1
S3150002CBE06C61626C65206 66C617368206D656D6F41
S3150002CBF072792E204F4B20746F2050726F636565D9
S3150002CC00643F20592F4E000D0A4F70657261746998
S3150002CC106F6E2061626F7274656 4000D0A496E76EA
S3150002CC20616C69642054696D6520436861 6E67654D
S3150002CC300 0D0A000D0A0020000D0A004E6E756D6287
S3150002CC406572206F66206C6F676963616C206D6523
S3150002CC5074657200747261 6E73666572 20646174C3
S3150002CC606120627920586D6F64656D2066726F6D02
S3150002CC70206D657465720052656365697665206428
S3150002CC806174612069 6E746F206D657465722062CD
S3150002CC907920586D6F64656D006E756D62657 220E0
S3150002CCA06F6620736C6F7473202D207573 65642014
S3150002CCB077697468202D2400676C6F62616C20743A
S3150002CCC06F20616C6C206D65746572730074 72619D
S3150002CCD06E73706F6E646572 20736C6F74206E75FE
S3150002CCE06D626572200073706563696679 20544F558B
S3150002CCF0207065726 96F6420666F72206C6F6720A0
S3150002CD006C697374730073706563696679207768FA
S3150002CD10696368206C6F67207175616E74697479D6
S3150002CD20003D3120736 96E676C652070686173 65BA
S3150002CD302C203D3220706F6C7970686173650073C8
S3150002CD40706563696679207068617365206E756DBA
S3150002CD50626572 20696E20706F6C7970686173 65A6
S3150002CD60206D65746572004C6F672073746172740E
S3150002CD702064617465004C6F6720656E642064618F
S3150002CD807465004C6F67 20696E646578 00416C6C4F
S3150002CD902065766 56E7473202D20696E636C7564EA
S3150002CDA06520616C6C2067726F75707300657665BD
S3150002CDB06E74206E756D6265720063 6C65617220B9
S3150002CDC0706C632065766 56E7473006E756D206592
S3150002CDD076656E747300 64756D7020657665 6E7423
S3150002CDE0206C6F672067726F7570006475 6D7020B6
S3150002CDF061726368697665206576656E74206C6F0C
S3150002CE0067006C6F67207374617274207 4696D6554
S3150002CE1020666F722064697370 6C6179006C6F674B
S3150002CE2020656E642074696D6520666F7220646980
S3150002CE3073706C61790064756D70206576656E74C9
S3150002CE4020746F74616C73007375 70707265737 39E
S3150002CE50206865782064617461 20696E206C6F6752
S3150002CE602064756D7000696E636C756465 2068 6513
S3150002CE7078206D657373616765 2064617461 2069EA
S3150002CE806E206C6F672064756D70006C6973742018
S3150002CE906C6F6767696E67206F7074696F6E732057
S3150002CEA06F66206576656E74730064756D702070AA

S3150002CEB06F696E7465727320616E64207365637444
S3150002CEC06F7273206F6E206576656E74206C6F6765
S3150002CED07300646973706C6179206576656E74207F
S3150002CEE06F66207370656369666965642063 6F7532
S3150002CEF06E7420696E206C6F6700646973706C6172
S3150002CF0079206576656E742077697468696E207219
S3150002CF10616E6765206F6620636F756E7473207726
S3150002CF2068656E207573656420776974682 06F7012
S3150002CF3074696F6E20706F736974696F6E20320048
S3150002CF40646973706C6179206F6E6C79207472619A
S3150002CF506E736665722073697A6520616E642070ED
S3150002CF606F696E7465727300656E64206265666FC2
S3150002CF707265206669727374207 56E66696E69736E
S3150002CF8068656420646179006578636C7564652000
S3150002CF90656E64206576656E7420696E206C6F67B7
S3150002CFA02064756D7000736B697020312065766653B
S3150002CFB06E742061667465722066697273742 06D80
S3150002CFC0617463680069 6E74656C206279746520A9
S3150002CFD06F72646572007365 6C656374207365 7243
S3150002CFE06E6F202D206D757374206265206772 65E1
S3150002CFF0617465722074686 16E206F722065717546
S3150002D000616C20746F2030343030303030303000693B
S3150002D0106E636C7564652064617461206772 6F75F6
S3150002D0207073206279206C6574746572202D674472
S3150002D03054655350707320 2D2044617461 2C5461E1
S3150002D0406D7065722C6576656E742C53746172749C
S3150002D05075702C504C432C70756C73652C7365720D
S3150002D06069616C202D20616E79206E756D62657224
S3150002D070206F662067726F7570206C657474 6572B6
S3150002D0807320737472756E6720746F67657468 6552
S3150002D0907220696E20616E79206F72646572007308
S3150002D0A074617274206F6E206669727374206576 7D
S3150002D0B0656E7420636E7472206D617463686 56454
S3150002D0C020666F722073706563696669656420 65A0
S3150002D0D076656E74006D61746368206F6E203136FA
S3150002D0E020626974207368 6F727420636F756E7440
S3150002D0F0657220696E7374656164206F66206C6F59
S3150002D1006E6720636F756E74657200657 6656E7400
S3150002D110006469676E6F737469632065 76656E14
S3150002D1207473000D0A4523204576656E742020200F
S3150002D130202020202020202020202020202020 50B7
S3150002D14065726D4C766C20204C6F674461696C7910
S3150002D15020204D73674461696C7920202041 7263F7
S3150002D16068697665204D6178457665 6E74732047E9
S3150002D170726F757073000D0A25326420252D3230C8
S3150002D1807320253964202020202020202020 25639A
S3150002D190202020202020202020256320202020203F
S3150002D1A02020202025632025396420000D0A2573BE
S3150002D1B00045232065766 56E74206E616D652020BC
S3150002D1C0202020202020636F756E742020202020CE
S3150002D1D020206C617374206576656E7400 25323585
S3150002D1E073000D0A2573002532752025 2D31327301
S3150002D1F000202531306C75200020000D0A53746121
S3150002D2007274206F6E6C79206F6E20737065 63691D
S3150002D2106669656420657 6656E74000D0A537461ED
S3150002D2207274206F6E20616E79206D617463686915
S3150002D2306E67206576656E74000D0A44756D702002
S3150002D2406F6E6C79206576656E74732077697 46883
S3150002D250696E2072616E6765206F66206576656EFF
S3150002D26074206E756D62657273000D0A44756D7079
S3150002D27020616C6C20657 6656E74732073746172BE
S3150002D28074696E672077697468207370656369666E
S3150002D2906965642065766 56E74000D0A536B697064
S3150002D2A020666972737420657 6656E74000D0A5382
S3150002D2B0746F7020626566 6F726520637572726 53F
S3150002D2C06E74206461790 00D0A44756D70202573B1
S3150002D2D00061726368697665006461696C792065CC
S3150002D2E076656E74206C6F67000D0A5374617274F2
S3150002D2F0696E67206576656E74206E756D626572FD
S3150002D3002020202020202020202020202531306 4000DDE
S3150002D3100A456E64696E67206576656E74206E7561
S3150002D3206D62657220202020202020202020202020CF
S3150002D33025313064000D0A4576656E7420636F757B
S3150002D3406E742072616E6765206C6F776572206CF1
S3150002D350696D697420202531306C64000D0A4576AA
S3150002D360656E7420636F756E742072616E676520D8
S3150002D37075707065722 06C696D697420202531307 4
S3150002D3806C75000D0A446174652F54696D65206CD5
S3150002D3906F776572206C696D69742020202000 0DFC
S3150002D3A00A446174652F54696D65207570706572E3
S3150002D3B0206C696D69742020202000 0D0A44617476
S3150002D3C061206F6E6C7920666F72207365726961 77
S3150002D3D06C206E756D62657220 2530386C78000D92
S3150002D3E00A446174612066 6F7220616C6C207365F9
S3150002D3F07269616C206E756D62657273000D0A004A
S3150002D4000D0A466972737420 6D65737361676520D0
S3150002D410616464722020202020202020202020 20E9
S3150002D42020202020202530386C78000D0A4C617374206D1B
S3150002D430657373616765206164647220202020 2011
S3150002D44020202020202020202020202025386C780033
S3150002D45000D0A5866657220 73697A65202869 6E20FE
S3150002D46062797465732920202020202020202020 24
S3150002D47020202020 25386C64000D0A4E756D62657297
S3150002D480206F66206576656E747320696E207866F5
S3150002D4906572202020202020202020202025386C640060
S3150002D4A00D0A2532642025 2D313273202531306C48
S3150002D4B0642025 30386C7820002025 30386C78209E
S3150002D4C025326420253664 20000D0A00253038 6C8A
S3150002D4D078200044005400650053005000700073 29
S3150002D4E0004E0D0A6C6F67676564206F7574206164
S3150002D4F0742000 0D0A0065786974006578697420E5
S3150002D500616E6420726573657420736572 69616CFD
S3150002D510004E73696D756C74617465206F776502
S3150002D520722066 61696C0068616C740068616C7473
S3150002D530206D65746572004E7472616E73706F6EE3
S3150002D54064657220736C6F74206E756D6265720 00D
S3150002D550777965206F722064656C7461206D6561F0
S3150002D560737572656D656E74732028777965 3D30C3
S3150002D5702C2064656C74613D31290063 74206F72DE
S3150002D580207368756E74206D657465722028 6374E5
S3150002D5903D302C207368756E743D312900777269AF
S3150002D5A0746520686477722063 6F6E6669672074 9B
S3150002D5B06F20617263686976650067657420646 5C9
S3150002D5C06661756C742068647772 20636F6E666933
S3150002D5D06720746F2072616D20666F7220656469C0
S3150002D5E074696E67007265737 46F726520686477 1A
S3150002D5F07220636F6E666967206C6173742073 6153
S3150002D60076656420746F20666C6173682074 6F207F
S3150002D61072616D20666F722065646974696E670057
S3150002D620736574206864777220636F6E6669 67201B
S3150002D630746F206C617374207361766564 20746FF5
S3150002D64020666C6173680064756D702068647772 19
S3150002D65020636F6E66696700707 56C736520696E0C
S3150002D66070757420646 5626F756E63652074696D8A
S3150002D6706520303D312F363420313D322F3634206D
S3150002D680323D342F363420333D382F363420 7365FD
S3150002D69063007 0756C736520696E70757420636FB4
S3150002D6A0756E7420656467657320 2D42313D626F25
S3150002D6B07468202D42303D6F6E6500706C75732064
S3150002D6C05520706F7765722073757 0706C7920744F
S3150002D6D0726970207 06F696E7420666F7220706F47
S3150002D6E077657220666169 6C0064756D7020706C76
S3150002D6F07573205500536574 2070756C73654F758C
S3150002D70074203 03D7374642C20313D2070756C7327
S3150002D71065207365726961 6C2C20323D6D632073DE
S3150002D720657269616C00456E61626C652074657331
S3150002D7307420627574746F6E20617320676174 65FC
S3150002D74020746F206C6F67696E206C6576656C73EA
S3150002D7502035206 16E6420360045 6E61626C657309
S3150002D76020627269646765206D6F646520666F72F8
S3150002D77020504C43207472616E736D697400446963
S3150002D78073706C617973206 36F707972696768 74FC

S3150002D790206D6573736167652075706F6E207265A3
S3150002D7A0736574004 56E61626C6573206E6F726D8F
S3150002D7B0616C6C79206F70656E2074616D70657234
S3150002D7C000536574206E756D626572206F662070F7
S3150002D7D0756C736520636F756E74657273002D4B7D
S3150002D7E031206D617020444B5220746F204469735E
S3150002D7F0702053772C202D4B3020646F6E277420B7
S3150002D8006D617020444B5200686477720073657 4D0
S3150002D810206D65746572732C207068617365732060
S3150002D820706572206D65746572000D0A4D6178200F
S3150002D830696E20617263686976665000D0A4D7573BB
S3150002D84074206265206E20656469742072616D58
S3150002D85020746F20777269746500 0D0A706C757397
S3150002D8602075203D202531302E3266206176657284
S3150002D870616765000D0A706C75732075203D202561
S3150002D88031302E326620696E7374616E74616E6514
S3150002D8906F7573000D0A6C6F636174696F6E206F2A
S3150002D8A066206861726477617265206 36F6E66696D
S3150002D8B06720696E666F202D20257300446566 61B8
S3150002D8C0756C74004564697420526 16D00466C6122
S3150002D8D07368000D0A6C6F636174696F6E206F6600
S3150002D8E0206861726477617265206 36F6E6669672C
S3150002D8F020696E666F202D20666C617368000D0AC2
S3150002D9004E6F2064617461206176 61696C61626C3C
S3150002D91065000D0A44454C5441205348554E542047
S3150002D9204D696E2B552050756C736545646765208D
S3150002D93044656 26F756E6365205069632054 657332
S3150002D94074422023 70756C7365000D0A252D352EE1
S3150002D95035732025 2D352E35732025352E3266203A
S3150002D960252D392E3973202534752F36347320250B
S3150002D97033642025 2D352E3573202536640059 65EE
S3150002D98073004E6F00596573004E6F00426F7468E4
S3150002D990004E6567617469766500596573004E6F5E
S3150002D9A0000D0A504C43206272696467653A200092
S3150002D9B0456E61626C656400446973616 26C65649C
S3150002D9C0002020504F5220436F7079726967687445
S3150002D9D03A2000456E61626C6564004469736162 57
S3150002D9E06C656400202054616D7065723A20004EA9
S3150002D9F06F726D204F70656E004E6F726D20436CB4
S3150002DA006F736564002020444B523A20006D6170AA
S3150002DA1070656420746F204469737073776 00456E75
S3150002DA2061626C656400256C6620000A000A000AC1
S3150002DA3000496E76657273696F6E206572726F72D7
S3150002DA402121210A00496E76657273696F6E207014
S3150002DA50726F626C656D20320A00256C6620000AC0
S3150002DA60004E54616D70657200436F6F736564009D
S3150002DA7053746172747570 7300506F7765722044C7
S3150002DA806E7300506F776572205570730057 61741C
S3150002DA9063686 46F67004E6F2042617474657279C1
S3150002DAA00042616450777 2446F776E005370 7572EC
S3150002DAB0696F7573527374 0054696D6563686E6736
S3150002DAC0546F0054696D6563686E6746726F6D00C8
S3150002DAD0446D6472657365740050756C73653100CC
S3150002DAE050756C7365320050756C736533004C6902
S3150002DAF06E6520437963 6C657300476F6F642050CF
S3150002DB006B74004E6F205265706C79004261642 01E
S3150002DB10506B7400586D697420506B74004C6F67BB
S3150002DB206F7574004C6F67696E31004C6F67696E72
S3150002DB3032004C6F67696E33004C6F67696E340052
S3150002DB404C6F67696E35004C6F67696E36004372BB
S3150002DB50617368 4576656E740053746F7265436FC0
S3150002DB606E66696700506C63467265657A65005435
S3150002DB70696D654572726F72005068 4572726F7296
S3150002DB80005374 6F726543616C69620043 6F6C6423
S3150002DB9053746172740053746F7265536572 6E6F5B
S3150002DBA0053746F726550504D004E6577506173 25
S3150002DBB0737764 31004E657750617373776432 0010
S3150002DBC04E6577506173737764 33004E65775061A3
S3150002DBD07373776434004E6577506173737764 3577
S3150002DBE0004E657750617373776436005379 6E63BE
S3150002DBF0525443005374 6F72654D756C74730053BF
S3150002DC00746F726553747479005374 6F72655363DB
S3150002DC10726F6C6C0053746F7265506F6C6C00534C
S3150002DC20746F726548647772 00496E746572 7661C4
S3150002DC306C730044656D616E6473004461696C794E
S3150002DC4041636375 6D7300537461727444617461E8
S3150002DC5000456E64446174 61004E657874536563 71
S3150002DC60746F7200537461727453656374 6F7200D9
S3150002DC70537461727444617900446174 6158 6665D3
S3150002DC807200536F66745665727369 6F6E005365E0
S3150002DC907269616C20230052656C6561736520436D
S3150002DCA06F64650052656C6561736520 54696D65C4
S3150002DCB000536F6674776172652056657273696F79
S3150002DCC06E004153494320566572 73696F6E004672
S3150002DCD05331303034 4600506F77657220466169A1
S3150002DCE06C0025326425303278253034782538 6C3C
S3150002DCF0780025303478253034782530347825304C
S3150002DD00347800252D31362E313673004 96E69740A
S3150002DD1069616C697A696E67002530386C782020F3
S3150002DD202020202020202000 4E6E756D626572206FC5
S3150002DD3066206C6F676963616C206D65746572003D
S3150002DD4074726 16E7366657220646174612 06279B1
S3150002DD5020586D6F64656D2066726F6D206D6574F7
S3150002DD6065720052656365697665206461746120 37
S3150002DD70696E746F206D65746572206279 20586DC4
S3150002DD806F64656D006E756D626572206F662073D5
S3150002DD906C6F7473202D207573656420776974 68BF
S3150002DDA0202D2400676C6F62616C20746F20616C99
S3150002DDB06C206D6574657273007472616E73706F38
S3150002DDC06E6465722073 6C6F74206E756D62657217
S3150002DDD000737065636966792 0544F5520706572C9
S3150002DDE0596F6420666F72206C6F67206C6973744 4A
S3150002DDF07300737065636966792077686963682062
S3150002DE006C6F67207175616E74697479003D31209B
S3150002DE1073696E676C652070686173652C203D328C
S3150002DE20207 06F6C79706861736500737065 6369E1
S3150002DE3066792070686173652 06E756D6265722001
S3150002DE40696E20706F6C7970686173652 06D657498
S3150002DE506572004C6F67207374617274 206461741A
S3150002DE6065004C6F6720656E64206461746500 4CC2
S3150002DE706F6720696E646578006475 6D7020636FE4
S3150002DE806E7374616E747300 64756D7020637572 5F
S3150002DE9072656E7420636F6E7374616E747300566E
S3150002DEA06F6C7461676520506861736500437572B3
S3150002DEB072656E742050686173650043757272658F
S3150002DEC06E742072616E67650044656C61792069C3
S3150002DED06E20757365632066726F6D204920746FBC
S3150002DEE0205600416 46A7573742063757272656E9A
S3150002DEF07420696E20756E697473206F6620302EE9
S3150002DF003031250072652D53796E6368726F6E69C2
S3150002DF107A652072616D20746F20726F6D20636F57
S3150002DF206E7374616E747300766F6C74616765 20CC
S3150002DF3072616E676500636C656172207468652044
S3150002DF40636F6E7374616E747300686F6C642061C4
S3150002DF5020726 16E676520666F72203420686F7565 65
S3150002DF6072730061646A757374 20766F6C7461678C
S3150002DF7065206D656173757265642 06C696E6520D6
S3150002DF80746F206E65757472616C20696E20756E91
S3150002DF90697473206F6620302E303125006164 6A01
S3150002DFA07573742076 6F6C74616765206D65617335
S3150002DFB0757265642 06C696E6520746F206C696E7B
S3150002DFC06520696E20756E697473206F6620302E27
S3150002DFD0303125006164 6A757374206375727265E7
S3150002DFE06E74207368756E7420616D706C696669F3
S3150002DFF06572206 96E20756E697473206F662030B3
S3150002E0002E3031250061646A757374204144 4320C1
S3150002E010626974203600616 46A7573742041444 3F0
S3150002E0202062697420370061646A757374204144 02
S3150002E03043206269742038006164 6A75737420 41F2
S3150002E0404443206269742039006164 6A757374 20DE
S3150002E050414443206269742031300061646A7573F9
S3150002E06074204144432062697420313100616 46A3C

S3150002E070757374204144432076 6F6C746167652022
S3150002E0807265666572656E6365005772697465 20AE
S3150002E09043616C20436F6E7374616E7473007370A8
S3150002E0A0656369666965642044414320636F6465FC
S3150002E0B020746F2050484F55542070696E20666F49
S3150002E0C07220363020736563636F6E64732C20616E26
S3150002E0D079206B657920746F2073746F7000647594
S3150002E0E06D7020444143206F666673657420636FCA
S3150002E0F07272656374696F6E20616E6420726573F5
S3150002E100756C74616E74206F6666736574206F66D3
S3150002E1102063757272656E7420616D707320666F0E
S3150002E1207220656163682067616E007265646F5B
S3150002E130206F6666736574206D6561737572656DB1
S3150002E140656E747320616E6420636F7272656374A8
S3150002E150696F6E73007365742061646320636166C1A
S3150002E1606962726174696F6E20767320767265 6673
S3150002E17000736574204441432063757272656E7440
S3150002E180206F6666736574206 36F72726563746965
S3150002E1906F6E206F6E20382062697420636F6E7610
S3150002E1A0657274657200736574206672657175 6551
S3150002E1B06E637920647572696E672063616C696249
S3150002E1C072617465206D6F6465007874616C206598
S3150002E1D072726F7220696E20487A00646973706C7D
S3150002E1E0617920666C6F6174696E6720706F696E03
S3150002E1F07420636F6E7374616E7473207769 7468CA
S3150002E200207 56E697473206F6E202D6320616E64B3
S3150002E210202D640064697370 6C617920746162 6C8C
S3150002E22065206F662063616C6962726174696F6EE4
S3150002E23020636F6E7374616E7473206173206D61F7
S3150002E2406E746973736120616E64206578706F6E E97
S3150002E250656E74006D6300 63616C696272617465F8
S3150002E260206D6574657200434 14C000D0A205220F0
S3150002E2702044414320202069536C6F706520694F0A
S3150002E2806666736574202069457 2726F722068 65CE
S3150002E2906164726F6F6D20202020206D61784920A5
S3150002E2A0202020206D696E49000D0A253264202542
S3150002E2B034642025382E33662025372E31662025F4
S3150002E2C0372E31662 02025372E31662025382E330B
S3150002E2D0662025382E3366000D0A4F66667365740E
S3150002E2E0206974657261 74696F6E73207065 64FD
S3150002E2F0696E67202564000D0A4F66667365742091
S3150002E300636F756E7465722025640 0D0A4144437D
S3150002E310206F6666736574203D2025382E336600AD
S3150002E3200D0A4261747465727920414443 20636F19
S3150002E3306465203D2025382E3366000D0A52656637
S3150002E340207265736973746F72 2041444320636F50
S3150002E3506465203D2025382E3366000D0A436F750D
S3150002E3606E747320706572 20766F6C74203D202562
S3150002E370382E3366000D0A526566206964F64653D
S3150002E3802041444320636F6465203D2025382E33A7
S3150002E39066000D0A475041206F6 656736574203D1C
S3150002E3A02025382E3366000D0A4C6F772074726969
S3150002E3B0702049203D2025382E3366000D0A486913
S3150002E3C067682074726970204 9203D2025382E33F3
S3150002E3D066000D0A56726566206F6E204750412010
S3150002E3E03D2025382E3366000D0A47504131203D27
S3150002E3F02025382E3366000D0A47504132203D2033
S3150002E40025382E3366000D0A47504133203D20251C
S3150002E410382E3366000D0A205220764F66667365E3
S3150002E420742076644F6666736574207645 72726FE1
S3150002E43072206865616 4726F6D20202020206DE6
S3150002E44061785620202020206D696E56000D0A251F
S3150002E45032642025372E31662025372E3166202557
S3150002E460372E31662025382E31662025382E336622
S3150002E4702025382E3366000D0A2573 762020522079
S3150002E480416D70732E2E2E2E2E2057617474 73AC
S3150002E4902E2E2E2E2E2044776174 74732E2E2E2E3F
S3150002E4A020566F6C74732E2E2E2E2E2044766F6C91
S3150002E4B074732E2E2E2E000D0A2573253264202506
S3150002E4C0316420253264202563253575202533 6481
S3150002E4D02025632535752025336420256325357 56A
S3150002E4E020253364202563253575 2025336420 25B0
S3150002E4F06325357520253364000D0A4375727265EE
S3150002E5006E74204E6F742055706461746564202D9C
S3150002E51020796F75206D7573742073706563696 6F3
S3150002E52079202D497B69706861 73657D20616E640F
S3150002E530202D527B6972616E67657D206F707469EA
S3150002E5406F6E0D0A000D0A566F6C74616765204E78
S3150002E5506F74205570646174656420 2D20796F751F
S3150002E560206D7573742073706563696679202D5604
S3150002E5707B7670686173657D20616E64202D767B83
S3150002E58076726 16E67657D206F7074696F6E0D0AB3
S3150002E590000D0A4175746F2D72616E676520656E96
S3150002E5A061626C6564000D0A52616E67652068657A
S3150002E5B06C6420746F20253275202869292025 3243
S3150002E5C0752028762 9000D0A486F6C64696E6720EB
S3150002E5D06672657175656E637920746F2025382EB3
S3150002E5E034662028487A29000D0A486F6C64696EE1
S3150002E5F0672 05F666673657473000D0A46726571ED
S3150002E60075656E6379202D2D25362E336620487A6D
S3150002E6102 06F6E207068617365202564 2C20676107
S3150002E620696E2025642C2061 7665726167696E6762
S3150002E63020256C642063 79636C6573000D0A546946
S3150002E64 06D6572207874616C2061646A75737420DA
S3150002E6502D2020202025332E336620487A000D0AED
S3150002E6604144432061646A7573742062697473203D
S3150002E670313120746872752036202D20253475209C
S3150002E6802534752025347520253475202534 7520CA
S3150002E690253475000D0A567265662061646A7573C3
S3150002E6A074202D20253464000D0A4F666673657446
S3150002E6B02061646A757374202573006479 6E616DD6
S3150002E6C0696300737461746963000D0A41444320EF
S3150002E6D07673205672656620616 46A757374206368
S3150002E6E06F646520253 82E3266000D0A492073684C
S3150002E6F0756E742061646A757374202D20253464E6
S3150002E700000D0A2056702076 52204E2D3E56416448
S3150002E7106A204C2D3E5641646A000D0A2533642553
S3150002E720336420253132 2E346520562F6C736220D5
S3150002E73025 31322E346520562F6C7362000D0A2560
S3150002E74033642533642025376420253764000D0A97
S3150002E750257320 52202041646A4920 44656C617900
S3150002E760000D0A2573253264202531322E346520A8
S3150002E770412F6C7362202535642075536563000D45
S3150002E7800A2573253264202535642025 3564004E1A
S3150002E7900D0A257352692076522020 20416D70732E
S3150002E7A0202020202056 6F6C7473202020205761741D
S3150002E7B074732020202020566172732020202020208E
S3150002E7C0202020202020202020206B5748722020202045
S3150002E7D0206B56415248720000 0D0A2573202020F4
S3150002E7E0202020434F4E5320554E495453000D0AC4
S3150002E7F0000D0A2573000D0A2573526920765220F0
S3150002E800507772466163742056497 0686173652059
S3150002E810564152706861 7365000D0A2573202020E7
S3150002E82020202020446 1696C79416363756D20202044
S3150002E830202020202020446 56C7461204C6F672020C4
S3150002E84020202020202020202070682041636375 6D00FF
S3150002E8500D0A2573202057415454202020202020568B
S3150002E8604152202020202020564 1662020544844 2D23
S3150002E870564120202020202020205641202054484 42D55
S3150002E88025252050777246616374205649 70686167
S3150002E8907365000D0A2573202020202020496E6974B5
S3150002E8A0616C2056416 87220202020202020202041C1
S3150002E8B0326872 20496E6372202020202020202098
S3150002E8C05632687220496E637220202020202020 2052
S3150002E8D0466 96E616C2056416872202020202020F5
S3150002E8E02044656C74612056416872000D0A2573D6
S3150002E8F05154202020202020202044616 96C794163F4
S3150002E900637 56D2020202020202020446 56C7461D0
S3150002E910204C6F6720202020202020202020706820 95
S3150002E92041636375 6D006E756D626572206F662058
S3150002E93 06C6F676769 6E67206D657465 72007472D1
S3150002E940616E73666572206461746120 6279205813

S3150002E9506D6F64656D2066726F6D206D657465728C
S3150002E960005265636569766520646174612069 6E2B
S3150002E970746F206D65746572206279205 86D6F64BC
S3150002E980656D006E756D626572206F6620736C6FC1
S3150002E9907473202D20757365642077697468202D41
S3150002E9A02400676C6F62616C20746F20616C6C204E
S3150002E9B06D657465727300747261 6E73706F6E64E6
S3150002E9C0657220736C6F74206E756D62657200736A
S3150002E9D070656369667920544F5520706572696F58
S3150002E9E06420666F72206C6F67206C6973747300A3
S3150002E9F07370656369667920776869636820 6C6FEE
S3150002EA006720717561 6E74697479003D312073698E
S3150002EA106E676C65207068617365 2C203D322070CC
S3150002EA206F6C7970686173650073706563696679 86
S3150002EA302070686173652 06E756D62657220696EFD
S3150002EA4020706F6C7970686173652 06D657465728C
S3150002EA50004C6F6720737461727420646174650080
S3150002EA604C6F6720656E6420646174650 04C6F6745
S3150002EA7020696E646578005068617365730056 6F2D
S3150002EA806C747300546F74616C7300 66756C6C20E1
S3150002EA90706861736500616C6C206D657465726582
S3150002EAA064206461746100646961676E6F7374697E
S3150002EAB063730037206469676974206B77682F6B0C
S3150002EAC07661726800746F74616C20486172 6D6F52
S3150002EAD06E6963204469737 46F7274696F6E007134
S3150002EAE07569657400667265717565 6E6379007025
S3150002EAF072696E7420706820616363756D756C61EE
S3150002EB00746F72206C696D697473206F6E206D6408
S3150002EB10202D74007072696E742056412074 6573DC
S3150002EB2074206461746120 6F6E206D64202D740000
S3150002EB3064756D6D79206F7074696F6E20666F7281
S3150002EB40206F6C642063616C69627261746F72001B
S3150002EB506D64006D65746572207265616C207469FE
S3150002EB606D65206461746100 6B5748006B564152B3
S3150002EB7048006B564148006B413248000D0A257326
S3150002EB80000D0A2573000D0A467265717565 6E637E
S3150002EB9079202D2025362E336620487A206F6E2066
S3150002EBA0706861736520 25642C206761696E202573
S3150002EBB0642C206176657261676 96E6720256C64D4
S3150002EBC0206379636C6573000D0A25730025326430
S3150002EBD020253264200020002000202020202032
S3150002EBE02020202020 2000200025362E336620504685
S3150002EBF0200025362E31660D0A0025730020 0020DE
S3150002EC002020202020202020202000202531302EE8
S3150002EC10336656200020 0025362E316644656720 6D
S3150002EC2000202573200020257320002532642025 2C
S3150002EC3032642025372E33662025372E3266202 56C
S3150002EC40382E326600202531302E336620002025EC
S3150002EC5073200056004100570056415200 0D0A2506
S3150002EC6073002032200020382000205820002531 51
S3150002EC70362E374C66202531362E374C6620253106
S3150002EC80362E374C6620002531322E3166200025 7D
S3150002EC9073006B574872000D0A257300253136 2E14
S3150002ECA0374C66202531362E374C66202531362ED6
S3150002ECB0374C6620002531362E374C66202531 36F4
S3150002ECC02E374C6620000D0A257300253136 2E3765
S3150002ECD04C66202531362E374C66202531362E37A6
S3150002ECE04C662000 2531362E374C6620253136 2ECD
S3150002ECF0374C6620000D0A257300253264202532 22
S3150002ED0064202537 2E33662025372E3266202538 95
S3150002ED102E32660020002000200020002000 25342C
S3150002ED202E316625252025372E33662025372E32AD
S3150002ED3066000D0A20202020202020202020202020CE
S3150002ED4020202020202020202020202020202020 BB
S3150002ED502020202020202020202020202020746F74B4
S3150002ED60616C2020202020202000200020202020 4E
S3150002ED7020202020202020006E756D626572206F93
S3150002ED8066206C6F67696361 6C206D65746572 00DD
S3150002ED907472616E73666572206461746120627951
S3150002EDA020586D6F64656D2066726F6D206D657497
S3150002EDB065720052656365697665206461746120D7
S3150002EDC0696E746F206D6574657220627920586D64
S3150002EDD06F64656D006E756D626572206F66207375
S3150002EDE06C6F7473202D20757365642077697468 5F
S3150002EDF0202D2400676C6F62616C20746F20616C39
S3150002EE006C206D6574657273007472616E73706FD7
S3150002EE106E6465722073 6C6F74206E756D626572B6
S3150002EE2000737065636966792054 4F5520706572 68
S3150002EE30696F6420666F72206C6F67206C697374E9
S3150002EE4073007370656369667920776869636820 01
S3150002EE506C6F6720717561 6E74697479003D31203B
S3150002EE6073696E676C652070686173652C203D322C
S3150002EE7020706F6C79706861736500737065636981
S3150002EE806679207068617365206E756D62657220A1
S3150002EE90696E20706F6C7970686173652 06D657438
S3150002EEA06572004C6F67207374617274206461 74BA
S3150002EEB065004C6F6720656E642064617465004C62
S3150002EEC06F6720696E6465780054 6F74616C0054D4
S3150002EED06F750042696C6C696E67206C69737400A9
S3150002EEE0546F75206C6F672064617973004461 69A1
S3150002EEF06C7920746F75206C6F67207265616469 26
S3150002EF006E67730064697370 6C617920746F752023
S3150002EF106C6F672064616 96C792064656D616E64EB
S3150002EF2073006469737 06C617920746 96D6573200E
S3150002EF306F66206461696C792070656 16B73006429
S3150002EF406973706C617920646 1696C7920746F757C
S3150002EF50206C6F6720636F6E73756D7074696F6E68
S3150002EF60006469737 06C61792074686520646179E4
S3150002EF70207479706573206 66F72206120726 16EEB
S3150002EF8067652 06F662064617465732C206F72203A
S3150002EF9072637620386B20636F6E666967206669D6
S3150002EFA06C652062792 0786D6F64656D20772F20FD
S3150002EFB02D52206F7074696F6E0064697370 6C6194
S3150002EFC0792074686520646179207479706520748B
S3150002EFD061626C65206F662075 7020746F2031 3611
S3150002EFE02064617920747970650064697370 6C615C
S3150002EFF079207468652064617 96C6967687420 7326
S3150002F0006176696E67207469 6D6520746162 6CDE
S3150002F01065006469737 06C617920746F7520707213
S3150002F0206F66696C6520666F7220737065636966C8
S3150002F030696564206461746500436C6561722044 8D
S3150002F0406D640071756965740 06C697374206C6F08
S3150002F050672F746F752F64656D616E6420636F6EC2
S3150002F060666967757261746 96F6E206F662070617A
S3150002F07072616D6574657273007072696E7420 7068
S3150002F08068206163637 56D756C61746F72206C695B
S3150002F0906D697473206F6E206D6474202D742C203C
S3150002F0A073697A6573206F6E206D6474202D6D000E
S3150002F0B07072696E742072746320 6C6F6720776851
S3150002F0C0656E20757365642077697468202D442CFB
S3150002F0D0202D48206F72202D63206F7074696F6E29
S3150002F0E07300647 56D7020736563746F727320614B
S3150002F0F06E6420707472 73206F6E202D4C207769B7
S3150002F100746820646174657300737065636966 79F7
S3150002F11020706861736520 6E756D62657220696E16
S3150002F12020706F6C7970686173652 06D65746572A5
S3150002F13000737065636966792 06F7220646973 7003
S3150002F1406C61792070617261 6D6574657273 206 97
S3150002F1506F7220626 96C6C696E672064697370 6C89
S3150002F16061790075736520776974 68202D6220 7451
S3150002F1706F207370656369667920 72617465 2066B3
S3150002F1806F72204B574820626 96C6C2064 697370F9
S3150002F1906C617900757365207769746 8202D622029
S3150002F1A0746F2064657 06F73697420 6D6F6E657914
S3150002F1B020746F207468697320616 3636F756E745F
S3150002F1C0206173206F6620737065 6327 6420646113
S3150002F1D07465007573652077697468202D622061F5
S3150002F1E06E64202D4220746F2073706563696679A0
S3150002F1F0206163636F756E742062616C616E636514
S3150002F200206173206F6620656E64696E6720646193
S3150002F210746520696E206D6474202D42007370 65DA
S3150002F2206369667920 6E756D626572206F662070FD

S3150002F2306572696F6473207065722064617920 66F5
S3150002F2406F7220696E74657276616C206461746196
S3150002F25020616E6420656E61626C65207265636F03
S3150002F2607264696E67206F6620706F6C797068617 0
S3150002F270736520696E74657276616C20646174616F
S3150002F2800073656C65637420746F752028312920BC
S3150002F2906F72206E6F20746F752028302920666F7A
S3150002F2A0722074686973207175616E74697479006D
S3150002F2B07265636F7264206465 6D616E64202831C5
S3150002F2C029206F72206E6F2064656D616E6420283E
S3150002F2D0302920666F72207468697320 7175616EB9
S3150002F2E0746974790072656 36F7264206163637511
S3150002F2F06D756D6C61746F72732028312920 6F727F
S3150002F300206E6F20616363756D756C61746F7273C5
S3150002F3102028302920666F7220746869732071 75FF
S3150002F320616E746974790073657420 6E756D6265B9
S3150002F33072206F6620706861736573207065722033
S3150002F3406D657465722066 6F7220696E7465727679
S3150002F350616C206C6F677320616E642064656D61F9
S3150002F3606E6473006C6F6720283129206F722064E7
S3150002F3706F6E2774206C6F67202830292073696EA0
S3150002F380676C652070686173652069 6E7465727654
S3150002F390616C20646174612066 6F72207468 69739F
S3150002F3A02070617261 6D6574657200 7265636F7259
S3150002F3B06420283129206F7220646F6E27742072B0
S3150002F3C065636F72642028302920736 96E676C65E5
S3150002F3D020706861736520 64656D616E6473206672
S3150002F3E06F722074686973207061 72616D657465ED
S3150002F3F07200726 5636F7264202831 29206F722051
S3150002F400646F6E2774207265636F72642028302 9D8
S3150002F4102073696E676C652070686173652061632D
S3150002F42063756D756C61746F727320666F722074 8A
S3150002F430686973207061 72616D657465720073 74B8
S3150002F4406F726520636F6E666967757261 74696F44
S3150002F4506E20746F20666C6173680073706563 69F1
S3150002F46066792064656D616E642077696E646F7774
S3150002F47020696E206D696E757465730073706563BD
S3150002F480696679206E756D626572206F6620696E97
S3150002F49074657276616C206C6F6720706572696F35
S3150002F4A06473207 46F206F7665726C617020666F6C
S3150002F4B07220646 56D616E642077696E646F770091
S3150002F4C073657420636F6E66696720626 1636B2081
S3150002F4D0746F206C61737420666C61736 820766148
S3150002F4E06C756500636C65617220656469742072 6F
S3150002F4F0616D206F6620636F6E6669672062616365
S3150002F5006B20746F2064656661756C7420766 16C1D
S3150002F51075650064697370 6C61792074696D652024
S3150002F520696E20457863656C20666F726D61742022
S3150002F5302D204A756C69616E446174652E4672614E
S3150002F5406374696F6E2066726F6D20312F312F39A9
S3150002F550300072656669 6C6C20746865202D4C20DB
S3150002F56074616 26C65006D647400746F752F6465F6
S3150002F5706D616E6420616E64206D6474206C6F67C9
S3150002F580206461746100 0D0A4D757374206669 7298
S3150002F590737420736574207365 7269616C206E756D
S3150002F5A06D626572000D0A4E6F2064617461206 19E
S3150002F5B07661696C61626C65000D0A6C6F636174D9
S3150002F5C0696F6E206F6620636F6E66696720 74616D
S3150002F5D0626C65202D2064616 96C7920666C6173AA
S3150002F5E06820666F722064617920696E646578208E
S3150002F5F02320256C6420776974682064617465 2011
S3150002F6006F6620000D0A4E6F20636F6E66696720 73
S3150002F6107461626C6520666F72207468697320 6417
S3150002F6206179202D20757369 6E67202573004 46504
S3150002F63066617 56C74004564697420 52616D00469A
S3150002F6406C617368000D0A6C6F636174696F6E207A
S3150002F6506F6620636F6E66696720746 1626C6520EF
S3150002F6602D20257300446566 61756C7400456469D6
S3150002F670742052616D00466C617368000D0A536511
S3150002F6807269616C202320 3D20253038 6C78000D8C
S3150002F6900A4E756D626572206F6620706861 7365C9
S3150002F6A073203D202564000D0A4E756D6265722039
S3150002F6B06F6620746F75 20706572696F6473203D82
S3150002F6C0202564000D0A44656D616E642077696EBB
S3150002F6D0646F77203D202564000D0A4F7665726CB3
S3150002F6E06170203D202564000D0A0D0A25734C6FBA
S3150002F6F0672F446179 20544F5520444D44204143 9D
S3150002F7004320505 04D204C6F673120446D643120A8
S3150002F710416363312042 50000D0A25734C6F6753D3
S3150002F720697A65204143 53697A6520444D4453BF
S3150002F730697A6520546F7453697A65000D0A2573D8
S3150002F74025376420202020256320202020 25632020 20C1
S3150002F750256320253364202020202025632020 20 20B5
S3150002F76025632020202020256320253264000D0A25EA
S3150002F77073253 76C6420253 76C6420253 76C64202A
S3150002F78025376C64000D0A25732533316C642044D9
S3150002F790617461205375627 46F74616C000D0A2581
S3150002F7A0732533316C642045766 56E74204F766519
S3150002F7B07268656164000D0A25732533316C642015
S3150002F7C044617461204F7665726865616 4000D0A52
S3150002F7D025732533316C6420546F74616C000D0AF5
S3150002F7E025732533316C6420557361626C6520661E
S3150002F7F06C617368000D0A25732533316C64204DE4
S3150002F80061786 96D756D20646179732073746F72A6
S3150002F81061676 5000D0A4D757374206265206120 6B
S3150002F820666163746F72206F6620313434 30000D66
S3150002F8300A4C6F67206D75737420626520736574 58
S3150002F84020746F2062652061206661637 46F722086
S3150002F8506F662064656D616E642077696E646F778A
S3150002F860000D0A4C6F67206D757374206265 2073F4
S3150002F870657420746F206265206120666163746F0F
S3150002F88072206F662064656D616E642077696E64AE
S3150002F8906F7720616E642073696E676C652070688D
S3150002F8A0617365206C6F67206D75737420626520C5
S3150002F8B0656E61626C6564000D0A496E76616C69FB
S3150002F8C06420636F6E66696720746162 6C65000D01
S3150002F8D00A496E76616C696420636F6E6669672099
S3150002F8E07461626C65000D0A436F6E666967207407
S3150002F8F061626C65207772697474656E000D0A4DDB
S3150002F9006178206 96E2061726368697665 000D0A06
S3150002F910257300446179205479706573202053 75EC
S3150002F9206E646179 20202020 4D6F6E646179 2020FB
S3150002F93020205475657364617920202020576564 EB2
S3150002F9406573646179205468757273646179 2020E5
S3150002F9504672696461792020202020536174757 2644D
S3150002F9606179000D0A00200025 2D392E3973000D0C
S3150002F9700A596F75206D75737420636F6C642073FA
S3150002F98074617274207468652075 6E697420626 58C
S3150002F990666F7265206C6F6164696E6720746865 54
S3150002F9A020386B2066696C652E0D0A000D0A4C6FB5
S3150002F9B06164207072 6F6772616D207769746 86F17
S3150002F9C0757420636F6C6473746172 74696E6720F8
S3150002F9D028592F4E293F000D0A4F70657261 7469CE
S3150002F9E06F6E2061626F72746564000D0A544F 5522
S3150002F9F02070726F66696C6520666F72 2064617929
S3150002FA0020747970652025732000 0D0A0020252DAB
S3150002FA10392E3973000D0A25326420252D382E38E9
S3150002FA20732000202530327 8000D0A002000200 0C5
S3150002FA300 0D0A257300252D382E387300556E69740C
S3150002FA4073000D0A257300202D2D3A2D2D202D2D04
S3150002FA502F2D2D2F2D2D2D2D00207878787 82E788C
S3150002FA6078780020 00202D2D3A2D2D202D2D2F2D9A
S3150002FA702D2F2D2D2D2D0020787878782E787878D8
S3150002FA800000D0A257300202D2D2F2D2D2F2D2D2D06
S3150002FA902D002078787878 78782E7878780020008B
S3150002FAA0202D2D2F2D2D2F2D2D2D2D0020787878E0
S3150002FAB07878782E787878000D0A2573002025 3616
S3150002FAC06C7825632563256320253264 20000D0AA0
S3150002FAD0257300252D382E387300556E6974730010
S3150002FAE000D0A257300252D382E38730052544 30013
S3150002FAF020002025366C782025326420002531 30FE
S3150002FB006C7500202020787878787878 78000D0A4D

S3150002FB1025732531302E3130732531302E31307335
S3150002FB202531302E3130732531302E313073253860
S3150002FB302E38732054494D45204F46205045414B9F
S3150002FB40004461696C7900496E74657276616C7302
S3150002FB500052616D416363756D00546F74616C0090
S3150002FB6044656D616E64000D0A2573002534302EDE
S3150002FB70343073002000020000D0A257320234461CF
S3150002FB8079732020202020202053746172742000 2073
S3150002FB902020202020202020456E64200020436F6E73B3
S3150002FBA0756D7074696F6E20202020446566D616E6498
S3150002FBB02054494D45204F46205045414B000D0AE1
S3150002FBC02573002025356420002000200020200017
S3150002FBD02536312E36317300200020002000200009
S3150002FBE020787878782E7878782030303A3030203D
S3150002FBF030312F30312F31393930000D0A2573203B
S3150002FC002020202020434F4E5320434F4E53444141
S3150002FC1054455544494D4520202020205045414B2033
S3150002FC205045414B4441544554494D45000D0A2522
S3150002FC3073202020202020434F4E53202020434F64
S3150002FC404E53444154452020202020205045414B200C
S3150002FC5054494D45206F66205045414B000D0A25FB
S3150002FC6073002025313E2E364C6600200025313 0B5
S3150002FC702E31307300200020002025313 22E364CE2
S3150002FC80660020006E756D626572206F66206C6F6D
S3150002FC90676963616C206D657465720074 72616E6A
S3150002FCA07366657220646174612062792058 6D6F93
S3150002FCB064656D2066726F6D206D657465720052A3
S3150002FCC065636569766520646174612069 6E746F27
S3150002FCD0206D657465722062792058 6D6F64656D5A
S3150002FCE0006E756D626572206F6620736C6F747339
S3150002FCF0202D2075736564207769 7468202D240091
S3150002FD00676C6F62616C20746F20616C6C206D652C
S3150002FD1074657273007472616E73706F6E6465726D
S3150002FD2020736C6F74206E756D626572007370 65F8
S3150002FD306369667920544F5520706572696F642035
S3150002FD40666F72206C6F67206C69737473007370D0
S3150002FD50656369667920776869636820 6C6F6720D6
S3150002FD607175616E74697479003D312073696E67CD
S3150002FD706C652070686173652C203D3220706F6C53
S3150002FD807970686173650073706563696679 20705E
S3150002FD9068617365206E756D6265722 0696E20708A
S3150002FDA06F6C79706861736520 6D65746572004C5D
S3150002FDB06F672073746172742064617465004C6F9E
S3150002FDC06720656E642064617465004C6F6720 6904
S3150002FDD06E6465780046756C6C206C6F67004461D2
S3150002FDE0696C792052656164696E6773006C6F672E
S3150002FDF020737461727420746 96D6520666F722057
S3150002FE00646973706C6179006C6F6720656E64203B
S3150002FE1074696D6520666F72206469 73706C6179AE
S3150002FE2000646973706C61792072617720636F6E0A
S3150002FE3073756D7074696F6E20646174612066 6E84
S3150002FE40206D6477202D6C5B5D20636F6D6D616E36
S3150002FE5064006469 73706C617920636F6E73756D 8B
S3150002FE607074696F6E2064617461207065722064BB
S3150002FE7061792066 726F6D206E74657276616C47
S3150002FE80206C6F677300646973706C6179207469A2
S3150002FE906D6520696E20457863656C20666F726DAC
S3150002FEA06174202D204A756C69616E446174652EF9
S3150002FEB04672616374696F6E2066726F6D20312FB0
S3150002FEC0312F3930006D64770064656D616E642090
S3150002FED06C6F672064617461000D0A536574207348
S3150002FEE0657269616C206E756D626572000D0A2518
S3150002FEF073000D0A257300202D2D2F2D2D2F2D2D4C
S3150002FF002D2D00207878782E7878782E7878780020E9
S3150002FF1000020002078787878787878 2E787878002013
S3150002FF202D2D2F2D2D2F2D2D2D2D00207878787803
S3150002FF3078782E787878000D0A25735959595944DC
S3150002FF406174652E54696D65202020496E74657250
S3150002FF5076616C20446174617461000D0A2573002000ED
S3150002FF6078787878782E787878000D0A2573202D44D3
S3150002FF706174652E54696D652D2D20202020416304
S3150002FF8063756D000D0A25735959595959446174 6593
S3150002FF902E54696D6520202020416363756D000D26
S3150002FFA00A2573002025313 22E364C6620002000A9
S3150002FFB07472616E73706F6E6465722073 6C6F74A7
S3150002FFC0206E756D6265720073706563696679206D
S3150002FFD07061726D65746572206E756D626572AF
S3150002FFE000646973706C6179206D756C7469706CEC
S3150002FFF0696572730064697370 6C617920646566 01
S31500030000616C74206D756C7469706C6965727357
S3150003001020776974686F757420636C656172696EA5
S31500030020670064697370 6C6179206D756C746970AF
S315000300306C69657273206C617374207772697474 6A
S3150003004065 6E207769746820 2D5700737 46F726527
S31500030050206D756C7469706C69657273 20746F209A
S315000300606 66C617368004 36C656172206D756C74B0
S3150003007069706C69657273207769746 86F7574202B
S3150003008073746F72696E6720696E20666C6173683C
S3150003009000 6D756C7469706C69657220666F722089
S315000300A0616D7073006D756C7469706C696572202F
S315000300B0666F7220766F6C7473006D756C746970FD
S315000300C06C69657220666F72207265616C20746953
S315000300D06D6520706172616D2073706563 764209E
S315000300E06279202D5000756E6974732066 6F7220D5
S315000300F07265616C2074696D6520706172616D2033
S3150003010073706563 764206279202D50006E756DC8
S31500030110626572206F662064656369 6D616C207029
S315000301206E696E747320666F722064656D616E64A9
S3150003013020666965 6C64006D756C7469706C6965BD
S3150003014072 20666F722064656D616E6420706172E1
S31500030150616D2073706563 764206279202D5000DA
S31500030160756E69747320666F722064656D616E6463
S315000301702070617261 6D2073706563 764206279F4
S31500030180202D50006E756D626572206F6620646562
S3150003019063696D616C20706F696E747320666F722C
S315000301A020636F6E73756D7074696F6E20666 96513
S315000301B06C64006D756C7469706C69657220666F2A
S315000301C07220636F6E73756D7074696F6E207061E4
S315000301D072616D2073706563 764206279202D50E8
S315000301E000756E69747320666F7220636F6E737524
S315000301F06D7074696F6E20706172616D207370 65C6
S31500030200637 64206279202D500073796E6320641E
S315000302106174612069 6E2072616D206261636B2077
S31500030220746F20666C61736820646174612C206549
S31500030230726173652065646974730064756D7020FB
S31500030240 6F72206D6F6469667920726561 6C2074C4
S31500030250696D6520756E6974732028 6F746865729D
S3150003026077697365206163637 56D756C61746F720D
S31500030270207 56E6974732900 6D6D756C74007365F2
S3150003028074206F7220766965772 06D756C746970 5A
S315000302906C696572 73000D0A4D617820696E206181
S315000302A07263686976 65000D0A4E6F207772697 40A
S315000302B065732 06F66206D756C7469706C69657201
S315000302C073 20696E2061726368697665000D0A6C36
S315000302D06F636174696F6E206F66206D756C7469E8
S315000302E0706C69657220746162 6C65202D202573BC
S315000302F000446566 61756C74 00 456469742052 61D7
S31500030300 6D00466C6173 68000D0A205020202020 2082
S31500030310722D4D756C7420722D556E6974 73000DB4
S3150003032000A253264202539 2E336520252D382E38AB
S3150003033073000D0A205020645F4450202020 20645F
S31500030340 2D4D756C7420642D556E697473202063 6E
S31500030350 2D44502020202020632D4D756C7420632D71
S31500030360556E697473000D0A253264202534 6420A2
S3150003037025392E336520252D382E387320253464F0
S3150003038020253 92E336520252D382E3873006C69C8
S31500030390 6E65206C696D6974000D0A4C696E652083
S315000303A06C696D6974203D2025640 06D6F7265006C
S315000303B07365742074 6865206C696D6974206F6653
S315000303C0206C696E65732064 6973706C6179656 40A
S315000303D0207065722070616765 2C20303D6E6F203A
S315000303E06C696D6974006E756D626572206F662047

S315000303F06C6F676963616C206D65746572007472F6
S31500030400616E7366657220646174612062792058 37
S315000304106D6F64656D2066726F6D206D65746572B0
S3150003042000526563656976652064617461206 96E4F
S31500030430746F206D657465722062792058 6D6F64E0
S31500030440656D006E756D626572206F6620736C6FE5
S315000304507473202D20757365642077697468202D65
S315000304602400676C6F62616C20746F20616C6C2072
S315000304706D6574657273007472616E73706F6E640A
S3150003048065722073 6C6F74206E756D62657200738E
S315000304907065636966792054 4F5520706572696F7C
S315000304A06420666F72206C6F67206C6973747300C7
S315000304B07370656369667920776869636 8206C6F12
S315000304C067207175616E74697479003D31207369B3
S315000304D06E676C652070686173652C203D322070F1
S315000304E06F6C7970686173650073706563696679AB
S315000304F020706861736520 6E756D6265722069 6E22
S3150003050020706F6C79706861736520 6D65746572B0
S3150003051000 4C6F672073746172742064617465 00A4
S315000305204C6F6720656E642064617465004C6F6769
S31500030530206 96E6465780064756D702074657374E4
S31500030540206461746100566F6C7461676520506 83E
S315000305506173650043757272656E74205068 6173CA
S315000305606500437572726 56E742072616E6765000D
S31500030570766F6C74616765207261 6E6765202D20E6
S3150003058075736564 20696E206D74202D465B5D006E
S31500030590686F6C6420612070686173652066 6F7292
S315000305A02034206D696E757465732C206F72207705
S315000305B02F202D41206578706 5726369736 5207472F7
S315000305C061636B20616E6420686F6C640072756E84
S315000305D02074657374007365742061766572616750
S315000305E0696E67206F662066 72657175656E6379DD
S315000305F0206D656173757265 6D656E7420303D3569
S31500030600342C313D31362C323D342C333D302C20C5
S31500030610757365202D765B5D20616E64202D565BB8
S315000306205D20746F20736574206761696E20726143
S31500030630 6E6765206 16E6420706861736500726 51C
S315000306407065617465646C792064756D70207265 7C
S31500030650616469 6E67732065766572792073656375
S31500030660 6F6E6400676174652074686520 6D6574D8
S3150003067065722 06F6E20666F722073706563696 69C
S31500030680696564206E756D626572206F6620737589
S31500030690627365636F6E647300676 56E657261741A
S315000306A0652061207261 6D70207761766520 6F6EBB
S315000306B0205048206F75742C2072656 36F72642016
S315000306C06120686973746F6772616D20772F2D419E
S315000306D02C202D647720746F2064756D70206869F3
S315000306E073746F6772616D004144432073656C6573
S315000306F0637420302C312C322C352C362C37202D9C
S31500030700 3E20492C564E2C56442C475041492C56D4
S31500030710424154542C504C432046696C74657220F4
S31500030720746F204D4F2070696E00504C43206669EC
S315000307306C74657220737 56C65637420666F7220D2
S3150003074075736520772F202D4120636F6D6D616E64
S3150003075064 20302D343D66696C7465722C353D44D6
S3150003076053 4D206F7665727261 6E67650041555809
S3150003077020 73656C65637420302C312C322C332046
S31500030780 2D3E20767265662C204750416931 2C2018
S3150003079047504169322C2047504169332069 66200E
S315000307A04144432073656C6563743D3D3500737442
S315000307B061727420636F646520666F72202D64779F
S315000307C02064756D7000656E6420636F64652066D2
S315000307D06F72202D64772064756D700073657420C5
S315000307E04441432063757272656E74206F66667347
S315000307F065742063 6F7272656374696F6E206F6EC2
S3150003080020382062697420636F6E766572746572 30
S31500030810006E756D626572206F662061766572 6122
S3150003082067657320666F72202D41206173 2065789A
S31500030830706F6E656E74206F6620320053412063BD
S315000308406C6F636B2073656C65637420666F7220CF
S31500030850 2D41207769746820 2D6E0044656C61799B
S3150003086020626574776565 6E2074776F20636F6E9B
S31500030870766572736 96F6E7320666F72202D4120E1
S315000308802D4E20616E64202D48004C45442073652F
S315000308906C656374 20302C312C322C332C34202D90
S315000308A03E204F46462C204F4E2C205854414C2C6C
S315000308B0206B48722C206B56617 268202D2075734D
S315000308C065207769746 8202D70206F72202D4D2066
S315000308D0746F2073656C6563742070686173652 03B
S315000308E06F72206D65746572206E756D6265722C0C
S315000308F020646973706C6179207769746 8202D644C
S31500030900006175782 06D6F6465202875736520779F
S315000309102F202D4129207B302E2E32202D3E666F2F
S315000309206C6C6F7765727C706F73207065616B7C1E
S315000309306E6567207065616B7D0052756E20736509
S315000309406C66207465737420 2D2D20757365207 76E
S315000309506974682 02D6420746F2064756D7020732C
S31500030960656C6620746573742072657375 6C747335
S31500030970006D740074657374206D65746572000D83
S3150003098000A20202053616D706C6573202B506561BE
S31500030990 6B202D5065616B20205 0746F50202020F2
S315000309A04176672D44432020202020202020524DCD
S315000309B05320204372657374466163740020202 0BC
S315000309C0204176672D444332202020202020202052C8
S315000309D04D5332000D0A2531306C752025356C7563
S315000309E02025356C752025356C752025382E316606
S315000309F0202531302E3366202531302E35660020F2
S31500030A0025382E3166202531302E3366000D0A49EE
S31500030A10204F6666202D2057616974203173742038
S31500030A2063686172000D0A49204F6E202D202063F2
S31500030A3068617220686F6C646F666 6000D0A4920F0
S31500030A404F6E202D20205761697420326E64206317
S31500030A5068617 2000D0A49204F6666202D20576192
S31500030A606974206E657720636D64000D0A25632023
S31500030A70253264202564202564202531302E3666F0
S31500030A80202534642000253464202534642025364B
S31500030A902E316620253475202534752025347520 9E
S31500030AA025372E346620253 62E3166202534752 0CB
S31500030AB025347520253475202537 2E34660D0A0016
S31500030AC020 2531342E374C66202531342E374C669B
S31500030AD00020 2531342E374C6620 00202531302E58
S31500030AE0336620002025732000560041005700 5628
S31500030AF04152000D0A202531322E3366202531322C
S31500030B002E336656002025313 22E33662025313 2A8
S31500030B102E336656002025313 22E3366202531 3298
S31500030B202E336656000D0A252D333573253230 7361
S31500030B300000D0A7068617365206865 6C6420746FC4
S31500030B4020253275202869292025327520287629 03
S31500030B5020 25382E3466202848 7A2920666F72208D
S31500030B602564206D696E7574 6573000D0A6375726D
S31500030B7072656E74206D656173757265 6D656E74ED
S31500030B8073207265706C61636564206279206175 98
S31500030B9078206D656173757265 6D656E7473000D8E
S31500030BA00A63757272656E74206D6561737572651D
S31500030BB06D656E7473207265706C61636564206223
S31500030BC0792076726566206174204144 43000D0ADC
S31500030BD0617578206F6666736574206D6561737 5DC
S31500030BE0726 56D656E74732064697361626C6564A6
S31500030BF02C2061757820726561646 96E673A000D11
S31500030C000A61646320 73656C656374203D20256403
S31500030C100000D0A6175782073656C656374203D2049
S31500030C20256 4000D0A617578206 94761696E203D68
S31500030C3020256400 0D0A61757820697068617365 03
S31500030C40203D20256400 0D0A6175782076476169 89
S31500030C506E203D20256400 0D0A617578207670 6844
S31500030C6061736520 3D20256400 0D0A617578206F48
S31500030C70666673657420 3D20256400 0D0A676174 FA
S31500030C8065203D20253 664000D0A686F6C646F6627
S31500030C9066203D202536 64000D0A74657374206D45
S31500030CA06F6465206469736162 6C6564000D0A464E
S31500030CB0726571756 56E6379202D20 25362E336630
S31500030CC020487A206F6E2070686173652025642C36

S31500030CD0206761696E2025642C20617665726167E1
S31500030CE0696E6720256C64206379636C6573000DF8
S31500030CF00A4C45442074656D706F726172696C7934
S31500030D00206F66662E000D0A4C45442074656D708F
S31500030D106F726172696C79206F7574707574696E20
S31500030D206720636C6F636B2063727973746616C2ED7
S31500030D30000D0A4C45442074656D706F72617269CB
S31500030D406C792074656D706F726172696C79206F4E
S31500030D506E2E000D0A4C45442070756C73696E67E0
S31500030D602025732073756D6D696E67207068173D6
S31500030D7065732025642074 6F202564000D0A252DD4
S31500030D8031352E3135732573202020202020202055
S31500030D9020692020202020202020202076202020AB
S31500030DA020202020766C20202020202020207664FE
S31500030DB0202020202020202076646C202020202044
S31500030DC020414443202020202020746F74616C004D21
S31500030DD0656173757265656D656E74000D0A252D3137
S31500030DE0352E3135732573253964202539642025 3D
S31500030DF03964202539642025396420253964202562
S31500030E003964005361 6D706C652074696D65730098
S31500030E100D0A252D31352E313573257325392E319E
S31500030E2066202539 2E3166202539 2E316620253 94F
S31500030E302E3166202539 2E3166202539 2E3166005E
S31500030E4053746174 6963206F6666736574000D0A73
S31500030E50252D31352E31357325732539 2E316620EF
S31500030E60253 92E3166202539 2E3166202539 2E3136
S31500030E7066202539 2E3166004479 6E616D6963 20DB
S31500030E806F6666736574000D0A252D31352E31356F
S31500030E9073257325396400444143206 36F72726579
S31500030EA06374696F6E000D0A252D31352E31357346
S31500030EB025732539 2E3666202539 2E366620 2539A3
S31500030EC02E3666202539 2E3666202539 2E366600BF
S31500030ED043616C20436F6E7374616E7473000D0A05
S31500030EE0252D31322E31327325642020 2573253981
S31500030EF064202539640047 61696E000D0A252D318A
S31500030F00352E31357325732539 6420253964202020
S31500030F102020202020202020202025396400506F73B4
S31500030F202020706561 6B000D0A252D31352E31357321
S31500030F302573253964202539642020202020202020 8C
S31500030F402020202020253964004E6567207065616B7B
S31500030F50000D0A252D31352E3135732573253964 58
S31500030F60202539642020202020202020202020202511
S31500030F7039640050 6B20746F20506B000D0A252DC9
S31500030F8031352E31357325732539 2E3266202539B1
S31500030F902E3266202020202020202020202020 2539C4
S31500030FA02E3266005 24D53000D0A252D31352E3152
S31500030FB035732573253 92E3466202539 2E346620 5C
S31500030FC020202020202020202020 25392E326600B4
S31500030FD04372657374204661 63746F72000D0A4F22
S31500030FE06E6C792062696C6C696E67207061 7261E0
S31500030FF06D657465727320636 16E2062652072 6F1E
S315000310007574656420746F204C454420004E50650A
S3150003101061 6B00252D31362E3136730025 2D313681
S315000310202E31367300252D31362E31367300252D9C
S3150003103031362E3136730025 2D382E387320004174
S315000310406C6C48727300253 82E387300204D2325A7
S31500031050326400257320 00416C6C2D4872730050 76
S315000310606420 00204D2325326400202 52D382E3898
S31500031070730050 41535345540020 00202A2A2A2056
S3150003108063616C63756C6174696E67202A2A2A0032
S315000310904E4F544553540020 2A2A2A2020 68696754
S315000310A06820202A2A2A002A2A2A20206C6F7720E1
S315000310B0202A2A2A00436F756E74732070 65722086
S315000310C0766F6C74004F666673657473004261 7461
S315000310D07465727920766F6C74616765005465 6D0B
S315000310E0706572617475726520446F 6F6465004743
S315000310F05041204F6666736574004C6F77205472B7
S31500031100697020506F696E7420666F72204D657426
S315000311106572206167630048696768205472697065
S3150003112020506F696E7420666F72204D6574657208
S3150003113020616763 00556E726567756C61746564 4DB
S3150003114020566F6C7461676500566F6C74616765D2
S3150003115020726 16E6765206F7665726C61700043FD
S31500031160757272656E742072616E6765206F76653F
S31500031170726C6170004E6E6F00657665 6E006F640B
S3150003118064000D0A4349503A000D0A4349502300AF
S315000311902D2D2D2D2D3E00537472696E6700443F
S315000311A065 63696D616C00536967 6E6564004865C4
S315000311B07800466C6F617400446174650048483A70
S315000311C04D4D3A53530048483A4D4D00436F6D6DAC
S315000311D0616E6400556E6B6E6F776E204F70746927
S315000311E06F6E0053796E746178004465 63696D614F
S315000311F06C004865780053747269 6E670052616EBD
S315000312006765004368656 36B73756D006C6574 741D
S31500031210657220202D00706F73697469 6F6E2000EC
S31500031220 0D0A4368617261637465722 06F76657235
S3150003123072756E000D0A4672616D696E672065727E
S31500031240726F72000D0A5061726974792065727249
S31500031250 6F72000D0A436861726163746572206 57B
S3150003126072726F72000D0A4C696E6520746F6F207F
S315000312706C6F6E67 00200D0A000D0A2D2D2D2D2D86
S31500031280 2D2D2D2D2D2D2D2D2D2D2D2D2D2D2D2D85
S315000312902D2D2D2D2D2D2D2D2D2D2D2D2D2D2D2D75
S315000312A02D2D2D2D2D2D2D2D2D2D2D2D2D2D2D2D65
S315000312B02D2D2D2D2D2D2D2D2D2D2D2D2D2D2D2D55
S315000312C02D2D0D0A000D0A0025346420 00252D312D
S315000312D0352E3135733A20252D3430730020 0D0A0F
S315000312E0 00200D000D0A2573204572726F720020CF
S315000312F06F6E206F7074696F6E2025732563 0D0AF8
S31500031300000D0A000D0A25730D0A00000D0A0025BB
S315000313103464200025 2D32302E3230733A20252DA9
S3150003132034307300 0D0A0050 65726D0020547970 D5
S315000313306520202020204F70742050 61726D20207C
S3150003134020202044 65736372697074696F6E000DA3
S31500031350 0A002534640020 2573256320202025 2DCB
S31500031360 3873000D0A2532322E323273002000 20E4
S3150003137020202000202 52D34302E343073006E6556
S3150003138077207061737377640070617373776420 79
S315000313906F7079206666F7220636F6E6669726D14
S315000313A06174696F6E007061737377 6F7264206C1A
S315000313B06576656C0073657420736572 6E6F202D98
S315000313C0206D757374206265206772656174 65723A
S315000313D0207468616E206F72206571756 16C20746C
S315000313E06F2030343030303030300070617373 77B3
S315000313F064006475 6D702070617373776400 0D0A01
S315000314005365742074696D6520666972737400 0D83
S3150003141000A4D617820696E2061726368697665009A
S31500031420 0D0A5365742074696D652066697273 7459
S31500031430000D0A4D617820696E206172636869 76D2
S3150003144065000D0A50617373776F7264732064 6F5E
S31500031450206E6F74206D617463680000D0A456E74A7
S3150003146065722070617373776F7264 20747769 6332
S3150003147065000D0A25752025313073007265616498
S3150003148065723100746563 6832 00537570657 23333
S31500031490 0055744 96C497459340 06C4576456C6241
S315000314A0416C00713575 3261 3064 38007064 0070C8
S315000314B06F7765725F646F776E73000D0A2573200D
S315000314C025376C642000 50686173652044 69616741
S315000314D06E6F7374696 300566F6C7473004465 6C46
S315000314E07461005641522050686173 65004C696E01
S315000314F06520467265717565 6E6379004D756C740A
S3150003150000252D31362E31367300252D31362E31F9
S31500031510367300252D382E387300252D31302E31A4
S3150003152030732536 2E3166002573002531332E336D
S31500031530662048 7A00252D382E3873006B574825C8
S3150003154032642000 6B524825326420005068 2532ED
S3150003155064205225326400506820256420202020 10
S315000315602000253 62E316625632025352E33662049
S31500031570504600506825326420202000253 42E3141
S315000315806625254420202020200025632535 2E337B
S3150003159066002563253 52E326600256325352E31F3
S315000315A066002563253 52E336600256325352E32E1

S315000315B06600256325352E316600256325352E33D2
S315000315C06600256325352E326600256325352E31C3
S315000315D06600256325352E336600256325352E32B1
S315000315E06600256325352E316600256325352E33A2
S315000315F06600256325352E326600256325352E3193
S3150003160066002563253S2E336600256325352E3280
S3150003161066002563253S2E316600256325352E3371
S315000316206600256325352E326600256325352E3162
S315000316306600256325352E336600256325352E3250
S315000316406600256325352E316600256325352E3341
S315000316506600256325352E326600256325352E3132
S31500031660660025630025730025 2D382E3873002563
S31500031670730025 2D382E3873002D7878782E7870E0
S31500031680002573002D7878782E7870002573004E28
S31500031690747 2616E73706F6E64657220736C6F74AF
S315000316A0206E756D6265720064756D702070756C61
S315000316B0736520636F756E746572730053657420 6A
S315000316C050494320536572 69616C206E756D62657E
S315000316D072005365742070756C73654F7574203092
S315000316E03D7374642C20313D2070756C73652073D3
S315000316F06572 69616C2C20323D6D63207365726976
S31500031700616C0044756D7020504943205374 6174B5
S31500031710650043686563 6B206D6178696D756D203F
S31500031720766 16C7565206F6E20504943207375 6230
S3150003173 02D416363756D756C61746F727300436FCE
S31500031740 6E74726F6C20526 56C61792041202D2D69
S3150003175020312074 75726E73206F6E2072656C6112
S315000317607973 00436F6E74726F6C2052656C617986
S3150003177020422 02D2D203120747572 6E73206F6EDA
S31500031780207265 6C6179730052657175657374 2097
S315000317905049432065636 86F0057616B6520757018
S315000317A02050494300507 5742050494320696E20E8
S315000317B0736C656570206D6F64650052657365743F
S315000317C020504943 20636F6D6D756E69636174695B
S315000317D06F6E004572617 3652050494320526567F9
S315000317E06973746572730044756D702064 6961670B
S315000317F06E6F737469632064617461 00526563611B
S3150003180 06C63756C617465206375 72626F780070C2
S315000318107400707 56C736520746573740 00D0A50DB
S31500031820756C7365202534642020202020 20253004
S31500031830386C782530386C78000D0A2020205365E3
S315000318407269616C204E756D626572202020 3D20A1
S31500031850202532640 00D0A20202050494320636F5F
S31500031860756E74696E67000D0A20202052656C61DF
S315000318707920412 03D00205354415455532055 4E61
S3150003188004B4E4F574E00204F4E00204F4646000DFD
S3150003189 00A20202052656C61792042203D002053A6
S315000318A05441545553 20554E4B4E4F574E00204FDF
S315000318B04E00204F4646000D0A2020205049432063
S315000318C0736C656570696E67000D0A20202053747A
S315000318D0616E6461726420 50756C7365 20436F7525
S315000318E06E74000D0A2020204D696E6920436C6FCB
S315000318F073657420492F4F2065787061 6E73696F25
S31500031900 6E000D0A20204E6F7420696E2050756C90
S315000319107365 20436F756E74696E67204D6F6465DA
S315000319200050494320 636869702069732061 6C72B3
S315000319306561647920617 7616B652E000D0A20204D
S315000319402020202020202020466C617368202020 40
S315000319502020202020202020202052616D202020BE
S3150003196020202020202020202020202020504943F2
S3150003197020000D0A50756C736520253264202530CE
S31500031980386C782530386C7820202000 2530386C68
S31500031990782530386C782020200025 30386C780084
S315000319A000D0A20504943206563686F206F6B200042
S315000319B000D0A205049432062616420 6D6573616797
S315000319C065000D0A204D6178696D756D2073756 22A
S315000319D02D616363756D756C61746F72203D202094
S315000319E0253464 20000D0A20504943206163637542
S315000319F06D756C61746F727320636C656172656477
S31500031A00000D0A2052656C617920747269676765 F7
S31500031A107220636F6E6669726D6564000D0A202A13
S31500031A202A2A2052454C4159204552524F52202DC5
S31500031A302D205354415455532055 4E4B4E4F574E1C
S31500031A40202A2A2A004E707500706F7765722075FA
S31500031A507073000D0A25732025376C6420007365A7
S31500031A6074206E756D626572206F662065787465 85
S31500031A70726E616C206D65746572732069 6E207376
S31500031A8063616E20696E2072616D206F6E6C7920C2
S31500031A902873 63616E202D5731323334 20746F20DF
S31500031AA077726974 6520746F20666C6173682900A8
S31500031AB0646973706C617920706F696E74657220E6
S31500031AC0696E666F0064756D7020386B20696E668B
S31500031AD06F00736D00736574206D65746572732C86
S31500031AE02070686173657320706572206D65746517
S31500031AF072000D0A44656661756C7420386B000DBF
S31500031B000A386B41646472204669 6C654C656E20C5
S31500031B1053756D4F66386B20203 86B43686B53756E
S31500031B206D20436F6E666967 4944 20546F754E6135
S31500031B306D652 0526 56C6561 73652D54696D650D
S31500031B402F4461746 5000D0A2530366C78202530E4
S31500031B50376C6420253038 6C78202530386C782033
S31500031B602530386C7820252D382E3873000D0A63FE
S31500031B706F6E666967207 46F7574616220646 1793C
S31500031B8074616220737461727438206368656 36B71
S31500031B9070747220207374 4172632 06E787441727C
S31500031BA0632065 6E6441726300 0D0A25366C7820E6
S31500031BB025366C782025366C782025366C782025DA
S31500031BC0386C782025366C782025366C7820253 6B7
S31500031BD06C78000D0A504820696E744D747 2732038
S31500031BE07363616E4D7472732077696E646F7720C9
S31500031BF06F7665726C6170206E756D544F557320E8
S31500031C002020544F5573746172742020202020 5471
S31500031C104F55656E64204F6C64657374 44617465D7
S31500031C20204E657765737444617465204E756D4403
S31500031C3061797 3000D0A2532642025376C642025EB
S31500031C40386C64202537642025376420 25376C6477
S31500031C50200020002000 2000 2D2D2F2D2D2F2D2D8F
S31500031C602D2D200020253 76C64002D2D2F2D2D2F93
S31500031C702D2D2D2D2020202020202020 30004E626186
S31500031C8075647261746520 2D20302028617574 6F28
S31500031C9029203936 30302C31393230302C33383430
S31500031CA03030007061726974792 0303D6E6F6E65F5
S31500031CB02C20313D6576656E2C20323D6F646400C1
S31500031CC06E756D626572206F66206269747320 2873
S31500031CD037206F72203820290 02D6530206E6F2043
S31500031CE06563686F2C202D6531206563686F002D51
S31500031CF06D30206E6F206D6F64656D2C202D6D31F8
S31500031D00206D6F64656D007772697465 20636F6D0E
S31500031D106D756E69636174696F6E2070617261 6D52
S31500031D2065746572732074 6F2061726368697665 82
S31500031D3000746573742 06D6F64656D202D2075 6E58
S31500031D4074696C205E63207479706564007374 74BF
S31500031D5079007465726D696E616C 2070617261 6D74
S31500031D6065746572 73000D0A696E76616C69642029
S31500031D706261756420726174 65000D0A000D0A00C4
S31500031D800 0D0A4D617820696E2061726368697665 14
S31500031D900000D0A257320256C642062617564202575
S31500031DA06420626974732025732070617269747983
S31500031DB0202573206563686F202573206D6F646526
S31500031DC06D00686F6C640068756E7400006E6F005A
S31500031DD0006E6F000D0A617465300D0A000D0A610D
S31500031DE0747130653073303D310D0A0073750073BD
S31500031DF07461727475707 3000D0A25732025376C30
S31500031E006420004E74616D706572 0074616D706557
S31500031E107220657665 6E7473000D0A257320253767
S31500031E206C642000746300 74696D6520636861 6E79
S31500031E30676564206576656E7473000D0A257320E5
S31500031E40253 76C6420002025732025376C64200019
S31500031E5076657200 64756D7020617369632076 65BB
S31500031E6072 73696F6E20616E6420736F6674776137
S31500031E7072652076657273696F6E20616E64206386
S31500031E806865636B73756D000D0A6173696320 2062

S31500031E902020736F667477617265202663686563B5
S31500031EA06B73756D20636865636B73756D20206353
S31500031EB0616C6373756D2072656C65617365000D86
S31500031EC00A252D372E3773202530386C78202025A8
S31500031ED030386C78202530386C782025303 86C788B
S31500031EE02000252D31362E31367300252D31362E21
S31500031EF031367300252D31362E3136730025386C75
S31500031F007800252D31362E31367300436865636BB1
S31500031F1073756D002530386C7800252D31362E31DA
S31500031F20367300252D31362E3136730025386C78FD
S31500031F3000252D31362E31367300252D372E377376
S31500031F40002534732025356C6420626175640048 6E
S31500031F506F6C640048756E740025316420622025 19
S31500031F6073207061726974790 04E202020202020 2E
S31500031F70202020202020202020202020202020202058
S31500031F80202020202020202020202020202020202048
S31500031F9020202020202020202000246C6F7420006C39
S31500031FA06F636174696F6E20002020207365726E03
S31500031FB06F20004D74722000204D232000504820CE
S31500031FC00070232000515420005123200054232065
S31500031FD0006C232000252D382E387300544F5500EE
S31500031FE0252D382E387300556E69747300253464B5
S31500031FF02000252D382E38732000496E7465726EC5
S315000320000616C0025386C78200020203120002020C8
S31500032010053200025326453200025336420002041D9
S31500032020202000253264200025326420002532 6420F6
S3150003203000025326420002 52D382E38730020002514
S315000320402D382E3873001818181818181818080879
S315000320500808080808080800181818181818181808 7F
S3150003206008080808080808 0800252D31362E3136736E
S315000320700 00252D31362E313673004D6F6E74682070
S315000320807 46F2044617465002534 2E347325372E0E
S3150003209032660050726F6A65637465642042696CC8
S31500032 0A06C0025342E347325372E3266004C61734B
S315000320B074204D6F6E74682042696C6C0025342E53
S315000320C0347325372E32660053746172742044616B
S315000320D0746500456E64204461746520007374 6101
S315000320E07274206B776800656E64206B77680042B4
S315000320F0696C6C20526174650025 2D342E3473256A
S31500032100313 22E3566004C617374205570646174E8
S3150003211065 0025342E347325372E326600416363FA
S315000321206F756E742042616C616E63650025342E93
S315000321303473 25372E3266004375746F666620 4402
S31500032140617465005263760058 6D69743000586D8A
S3150003215069 74310047 6F6F642072 65706C7900474C
S315000321606F742073746174757300 4E6F207265709B
S315000321706C79005061726974792065727 26F7200AE
S31500032180416464726 5 73 7206572726F72 0052656 5DE
S3150003219072726F72005265 6 738206572726F7200D1
S31500032 1A048616D6D696E67206572726F72000042D9
S315000321B07265616B0052 637 664206D657373616744
S315000321C06500476F74207374617475730063686187
S315000321D06E6E656C2074696D656F757400506172FF
S315000321E06974792065 72726F720052637664206D2A
S315000321F06573736167652C2077726F6E6720616400
S3150003220064720052656 7206572726F720052656769
S3150003221038206572726F72004861 6D6D696E672052
S31500032220657 2726F7200476C6F62616C20636F6DCB
S31500032230 6D616E640042 7265616B00436D640053A9
S3150003224065726E6F0050 6F6C6C0052656738005292
S315000322506567004365 6E7465722063656E746572A7
S31500032260206672657120696E20487A00706C63205F
S315000322706D6F64656D204E434F206C6F77206672D9
S31500032280657120 2D206465766961746 96F6E2066B9
S31500032290726F6D2063 7472656 7100706C632091
S315000322A06D6F64656D204E434F20686967682066CD
S315000322B0726571202D2064657669617 4696F6E207D
S315000322C066726F6D2063747246 72657100 4C6F633C
S315000322D0616C206F7363696C6C61746F72206 9DF
S315000322E07669646520 636F646500656E7465722044
S315000322F06368616E6E656C20726567697374657277
S31500032300 7320666F7220586D6974206D6F64650063
S3150003231052534D20736F6674776172652074797 0BA
S315000323206500727 36D20686172647761726520 74EB
S315000323307970650078 6D69742072656C6179 2033F4
S315000323402062697420 6D61736B005265636569 76FB
S315000323506520 6D75782D2073656C65637420636FD6
S3150003236 06D6D756E69636174696F6E2070686173F4
S3150003237065 00786D6974206465 6C617900616371C9
S3150003238075697265206368616E006578656320 70A0
S315000323906C63006A616D2028786D6974202D6A7BF1
S315000323A0302C312C322C337D202D3E20302C312CF9
S315000323B0726567 382C726567382F7365726E6F297D
S315000323C07C28726376202D696A7B322C337D202D1F
S315000323D03E20726567382C726567382F7365726E97
S315000323E06F29007475726E206F6E207265636569 5E
S315000323F07665722C20757365207 72F202D727B638B
S315000324006F64657D20746F2061636375 6D207374DB
S3150003241061746973746963730064756D7020737492
S315000324206174697374696373206672 6F6D207820B3
S3150003243 02D69727B636F64657D0064756D702070B2
S315000324406172 6D73006368616E20410063686 16E3B
S315000324502042004475 6D70204261756420504C4CD7
S315000324602044617461004475 6D7020496 20616E95
S31500032470 64204C4F206368616E6E656C20646174E2
S3150003248 061004F766572206167 61696E202D206455
S31500032490 6F6E277420636C65617220452F46206238
S315000324A0756666 7300536C617665204D6F646500CF
S315000324B07265636569766520 64656C6159 00685564
S315000324C06E7420666F7220636F727 26563742072 16
S315000324D06563656976652064656C617900436861 47
S315000324E06E6E656C206E756D626572 0062617564F1
S315000324F020726174652073656C656374204C696E24
S315000325006546 7265712A28325E284E2D32292920A6
S3150003251028757365202D5820666F7220786D69744F
S31500032520 2C206E6F6E6520666F722072637629 00AB
S315000325306C6F6 732286269742074696D652F6465F0
S315000325406D6F642066696C746572207469 6D6529A4
S31500032550202875736520 2D5820666F7220786D6963
S3150003256074 2C206E6F6E6520666F72207263762 9F7
S315000325700004C696D697420285263762 04E3D302ED7
S315000325802E3220666F72207C6E6F20646 56D6F64D9
S3150003259020666 96C7465727C66696C7465727C63AB
S315000325A06C6970706564206 6696C74657229282D80
S315000325B0584C3120746F20636C697020786D697490
S315000325C0206F75747075742C202D584C3020666FEF
S315000325D07220616E616C6F6720786D697429004D96
S315000325E06F64756C6174696F6E20284E3D30206F81
S315000325F07220312 0666F722046534B2F50534B295E
S3150003260028757365202D5820666F7220786D69745E
S315000326102C206E6F6E6520666F72207263762900BA
S3150003262064756D702066696C7465722073657420B9
S31500032630706F696E7473202D206F7220772F202D93
S315000326406920636170747572652064696666 4920E2
S31500032650286F722072656D6F6420772F202D3820C6
S3150003266 06F707429206461746100626974 6D6170AE
S3150003267020666F7220652063 6F6D6D616E640074F2
S3150003268065737420 66696C74657220706861 73651E
S3150003269020646 56C617900616C69676E2066696C9C
S315000326A0746572 0064756D70207265636569766 51D
S315000326B020737461746500737065636966792 0734A
S315000326C07461676520 6E756D626572202831 2D34DD
S315000326D020666 96C7465722C20353D425044534D17
S315000326E02C20363D4941524D2C20373D5141524D08
S315000326F02C20383D4E434F290075736520772F2DC7
S31500032700 4E7B73746167657D20666F7220616763B4
S31500032710202830 2C312C322C333D6E6F6E652C7392
S31500032720 6F66742C686172642C626F7468290075 15
S3150003273073652077 2F2D4E7B73746167657D2066E5
S315000327406F722066696C74657220617474656E2C91
S3150003275042504 4534D206761696E2C6941524D6165
S31500032760 6763206F7220714 1524D61676300546540

S315000327707374 20504C4300547765656B2046696C2F
S31500032780746572202D2D2066696E652061646A75F5
S315000327907374 20616E6420636865636B20696620C9
S315000327A07265616C69676E6D656E74206E656365CF
S315000327B07373617279004 4756D7020726376642059
S315000327C064617461206F6E20616C6C206569676853
S315000327D0742073756262697473206F7220757365F2
S315000327E020772F202D69663820746F2063617074FB
S315000327F02072656D6F76652064617461005475726E36
S31500032800206F6666207472616E736D697420616EE3
S315000328106420726563656976650078 00706C632071
S31500032820636D6473000D0A52657374617274696E25
S31500032830 6720706C63000D0A427265616B000D0AB6
S3150003284066312066322066414 7432044534D206952
S315000328504147432064 4E434F2073696740663420E3
S315000328606620472074726965 7320676F6F64302052
S31500032870676F6F643120676F6F643220676F6F64B1
S31500032880332067 6F6F643420676F6F643520676F1B
S31500032890 6F643620676F6F64370D0A000D25326447
S315000328A020253264202534732025336425632534 9B
S315000328B06425632532534642025367525326420253145
S315000328C06425366C640025366C64000D0A6D6173ED
S315000328D0746572206D6F6465000D0A736C617665AD
S315000328E0206D6F646520253264000D0A5472616E93
S315000328F0736D697474696E6720636F6D6D616E6461
S31500032900000D0A5472616E736D697474696E672083
S315000329107265 67302F7365726E6F206461 74610028
S3150003292000D0A5472616E736D697474696E672072F1
S31500032930656738206461746100 0D0A5472616E73B1
S31500032940 6D697474696E6720746F6E652064617453
S31500032950612031000D0A5472616E736D6974746976
S31500032960 6E6720746F6E6520646174612030000D9C
S31500032970 0A416C69676E696E672066696C74657275
S31500032980 73000D0A5477656 56B696E672066696C1B
S3150003299074657273000D0A526563656976696E67BD
S315000329A020737461746973746963 73000D0A5761E4
S315000329B06974696E6720666F72206564676520 6651
S315000329C0726F6D206D61737465 72000D0A576169CC
S315000329D074696E6720666F72206564676520 667228
S315000329E06F6D20736C617665000D0A5265636569C8
S315000329F0 76696E6720706163 6B6574732066726FA8
S31500032A006D206D6173746572000D0A5265636569A5
S31500032A1076696E67207061636B6574732066726F87
S31500032A206D20736C617665000D0A504C4320696412
S31500032A306C6500202D206F6E206368616E6E656C79
S31500032A40202564 00204641494C206F6E2066696C40
S31500032A5074657220616C69676E6D656E74002046DD
S31500032A6041494C206F6E206261756420 6C6F630D
S31500032A706B20616C69676E6D656E74000D0A4C6937
S31500032A806E6520 46726571756E6379203D2025F6
S31500032A90372E3366487A000D0A5243 56204261 7533
S31500032AA06420526174 65203D2025372E3366487AAB
S31500032AB00000D0A584D49542042617564205261 74D1
S31500032AC065203D2025372E3366487A000D0A42617C
S31500032AD0756420504C4C205068617365202566 0050
S31500032AE00D0A4261756420504C4C20464357 2025FD
S31500032AF031306C64000D0A4261756420504C4C20E1
S31500032B00496E7465677261746F722025313 52E3391
S31500032B104C66000D0A537461676520202020 2053FC
S31500032B2069676E616C2020202020737465 74696E6713
S31500032B3020414743726567 204E20536F66742048D1
S31500032B40617264205361747572617465640 00D0A61
S31500032B50504C435231202531302E3165000D0A4643
S31500032B60696C74 6 25316420 2531302E31652 0253872
S31500032B702E31666442202536642025316420 2534AF
S31500032B8073002020204E000D0A425044534D202549
S31500032B90313064202531306420253664203520 20E9
S31500032BA02020202563202020202020253973005945 25
S31500032BB053004E4F000D0A49526D6F642025313084
S31500032BC0642025392E3166252520253664203620B6
S31500032BD0202020202563202020202563202539 73000B
S31500032BE0594553004E4F000D0A51526D6F6420250F
S31500032BF0313064202539 2E3166252520253664207B
S31500032C00372020202020256320202020202563202539F6
S31500032C10730059455300 4E4F000D0A4E434F202073
S31500032C202020253231642025366 42038000D0A4E6192
S31500032C30744672092531392E3266202534642F38BD
S31500032C402039000D0A646 96666496 202531306420FF
S31500032C50 25333973 00594553004E4F000D0A6469F5
S31500032C606666512 025313064202533397300594572
S31500032C7053004E4F000D0A687970514920253130B3
S31500032C802E3066202531306420253664000D0A4E29
S31500032C90434F2F49202531302E3266202531302EE1
S31500032CA03266000D0A52616E67652025316420 2065
S31500032CB0436F617273656 4202533642020 46696E2F
S31500032CC0654620253364202533642025336420 2577
S31500032CD03364000D0A53696E6365206C6173742057
S31500032CE0616C69676E6D656E74202D2074656D70F9
S31500032CF06572617475726520646966666572656E70
S31500032D006365203D2025352E32662064656772652E
S31500032D10657300202D20656C617073656420746 98A
S31500032D206D6520000D0A46696C74657220436F61F8
S31500032D3072736520 51203D2025 35640020202D2007
S31500032D40636F6D6D6F6E2066726571756E6379FF
S31500032D50203D20253564000D0A53746167652046BE
S31500032D6072657175656E63792046696E6546726566
S31500032D7071204174745265 6720556E6974792064B5
S31500032D8042417474656E2064 4247 61696E000D0AA0
S31500032D902535642025396420253864202536642 0AA
S31500032DA02535642020253 62E31662025362E3166BC
S31500032DB0000D0A416C69676E6D656E742053 74610C
S31500032DC07475733A20200020416C69676E696E67DB
S31500032DD02046696C746572730020547765656B6968
S31500032DE06E672046696C7465727300504153530 0D5
S31500032DF020537461 67653205 56E6D6174636861F2
S31500032E00626C65002054696D65204578706972 654A
S31500032E106400204F7574206F662052616E67657378
S31500032E200020466F726365642045786974002041 0B
S31500032E306C69676E20457869742043 6F64653A2030
S31500032E4020202564000D0A2020202020203020202069
S31500032E502020202031202020202020203220202020 46
S31500032E602033202020202020203420202020202020351D
S31500032E702020202020202036202020202020203700 4F
S31500032E800A0020253664000D0A4F6E20636861 6EC2
S31500032E906E656C206E756D626572203D20256400 3B
S31500032EA00D0A0D0A43205852204D4F4420494147ED
S31500032EB04 3205141474320 6C6F2D646976204C496A
S31500032EC04D2046494C542020312D4E434F4849202E
S31500032ED020302D4E434F4C4F202020202020202020F1
S31500032EE0204C4F2020202020202044455620202043DC
S31500032EF0454E5445522063747267657 20626171
S31500032F0075642F487A000D0A253178202563202021
S31500032F10253 37320253473202534730050534B0017
S31500032F2046534B004E6F6E6500536F6674004E6FCB
S31500032F306E6500486172640048 2B530048617264F1
S31500032F40004E6F6E6500536F6674004E6F6E6500BC
S31500032F504861726400482B5300486172640020255F
S31500032F603664002025336400 2020312F2531640088
S31500032F7020 25382E31660020 25382E31660020257F
S31500032F8031302E3166002025382E3166002025 3853
S31500032F902E3166002025372E3166002025372E3246
S31500032FA06600206163747561 6C2076616C75657368
S31500032FB00000D0A2043207365726E6F2E2E2E20702D
S31500032FC06F6C6C20726567382E2E2E2E20205220B1
S31500032FD06269746D61702E2E0020205420492 0539F
S31500032FE02048206E000D0A0D0A204420656467659B
S31500032FF0636F646520636D642D706F6C6C20706104
S3150003300072502072656 7312E2E2E2E207061 72311A
S31500033010207265673 22E2E2E2E2070617232207238
S31500033020 6567 332E2E2E2E2070617 2332045727201
S31500033030202072637664 6D5170 20002020 5420493D
S315000330402053204820 6E00204C20246C6F740020EF

S31500033050537461747573000D0A0025327820253088
S31500033060386C78202530386C782025303478202544
S3150003307030386C782025303478202530386C782029
S3150003308025303478202530386C7820253034782064
S3150003309025303378202530386C782000252D3830BC
S315000330A02E38307320002000202531782025346403
S315000330B0002025730020257300205265706C796902
S315000330C06E67002053656E64696E6700202532784B
S315000330D0202531782025317820253178202531782F
S315000330E0000D0A253278202530386C782025347572
S315000330F0202530386C7820253278202530386C78B6
S31500033100004E776174636800776174636820736344
S31500033110616E004E7365742074696D650064740096
S315000331200D0A533A000D0A5323006E756D626572DC
S31500033130206F66206C6F676963616C206D657465CB
S3150003314072007472616E73666572206461746120C5
S31500033150627920586D6F64656D2066726F6D206DA0
S31500033160657465720052656365697665206461748A
S315000331706120696E746F206D6574657220627920B3
S31500033180586D6F64656D006E756D626572206F664E
S3150003319020736C6F7473202D2075736564207769B3
S315000331A07468202D2400676C6F62616C20746F2035
S315000331B0616C6C206D6574657273007472616E73F5
S315000331C0706F6E64657220736C6F74206E756D62BA
S315000331D06572007370656369667920544F55207074
S315000331E06572696F6420666F72206C6F67206C6905
S315000331F0737473007370656369667920776869 63AE
S3150003320068206C6F67207175616E74697479003D0F
S31500033210312073696E676C652070686173652C2055
S315000332203D3220706F6C79706861736500737065E9
S3150003323063696679207068617365206E756D626572
S315000332407220696E20706F6C797068617365206D8A
S3150003325065746572004C6F672073746172742064C1
S3150003326061746500 4C6F6720656E642064617465E4
S31500033270004C6F6720696E6465780064756D700035
S3150003328064756D70207363616E2073746174652059
S315000332906269746D6170730064756D702076657212
S315000332A073696F6E73004C6F636174696F6E202868
S315000332B0757020746F2038206368617273290073F8
S315000332C0657269616C206E756D62657200506F6C14
S315000332D06C2061646472657373005472616E736DFE
S315000332E069742052656C61790072656365697665F8
S315000332F02073656C65637400736F667477617265BA
S3150003330020747970650068617264776172652074F0
S3150003331079706500726571756573746564207374 7D
S3150003332061746573 00616C6C6F77656420737461 97
S3150003333074657300696E697469616C697A65642082
S3150003334073746174657300636F6D706C6574656423
S315000333502073746174657300 7A6170207872656690
S315000333600063 6C65617220626974732073706563B0
S315000333706966696564007365742062697473207392
S3150003338070656369666965640076657273696F6EF5
S31500033390206E756D62657220636865636B0066698E
S315000333A06C746572206F6E20636F6D706C657465E7
S315000333B0642C20726571756573746564206F722061
S315000333C0696E697469616C697A6564207374617482
S315000333D065730064756D702074686520626C616E38
S315000333E06B20736C6F7473206F6E6C790043686126
S315000333F06E6E656C206E756D6265720077726974A8
S3150003340065207872656620746F20666C6173680048
S315000334100D0A46697273742073776974636820743E
S315000334206F20656469742072616D20776974682002
S315000334307363616E202D6C000D0A4D7573742062E3
S315000334406520696E20656469742072616D20746FEE
S31500033450207772697465000D0A257320706F6C6C92
S31500033460202054204920532048206E202076657260
S3150003347073696F6E205245515520414C4C57206954
S315000334804E495420434F4D5020202020696E7374BB
S31500033490616C6C2020202020202072656D6F7665000DAF
S315000334A00A2573200025346400202530386C780003
S315000334B020253034782025303478202530347820 80
S315000334C025303478200020000D0A257320526567C5
S315000334D0382E2E2E204269746D61702E2E204CAE
S315000334E06173742D6D6F646966792D74696D652ECC
S315000334F02E2E20436F6D706C6574696F6E2D746923
S315000335006D652E2E2E2E2053746174757300 5065CF
S315000335106E64696E670052657175657374656400E0
S31500033520436F6D706C657465640049646C65000D6A
S315000335300A2573202530386C78202530386C78209E
S3150003354000200020002000253278000D0A25732074
S31500033550002530386C78202530386C782025303 8B3
S315000335606C7820000D0A496E7465726E616C206D6D
S315000335706574657200787200646973706C61792092
S31500033580616E6420656469742073636 16E2078726A
S315000335906566004E416C6C6F776564207363616E7C
S315000335A02073746174657300 0D0A416C6C6F7765E3
S315000335B0642073746174657320 3D202530347800 6C
S315000335C0616C6C6F7700646973706C61792074 68E1
S315000335D065206269746D6170206F66207374617 40F
S315000335E0657320616C6C6F77656420696E2073 6305
S315000335F0616E004E5061757365206F6E2F6F666640
S31500033600206F7074696F6E004E627220535420747B
S315000336106F20696E7465726C6561766500496E74B8
S3150003362065726C6561766520696E74657276616C28
S31500033630206D696E7574657300496E7465726C6589
S31500033640617665206E756D626572206F662074689B
S3150003365069732053540064756D70007363616E2043
S315000336606F6E6C79207468697320736C6F74206E47
S31500033670756D626572006D616B6520746869732090
S315000336806120736C61766520535400 6F6E000D0ADA
S315000336905061757369 6E6720736361 6E202D2050C8
S315000336A06C65617365207761697400 6F6666000DEA
S315000336B00A537461727469 6E6720736361 6E202D99
S315000336C020506C656173652077616974000D0A7516
S315000336D0736167653A2070617573652 05B6F6E5D14
S315000336E0205B6F66665D0D0A000D0A5363616E20EB
S315000336F069732063757272656E746C7920686F6C7A
S3150003370064696E67206F6E206D657465722025335C
S315000337106C7520666F72202533752 06D696E75741E
S31500033720657300 0D0A496E20434950000D0A536321
S31500033730616E20697320637572 72656E746C79208D
S315000337402573206174200072756E6E696E67007052
S3150003375061757365640020000D0A5363616E2077FB
S31500033760696C6C206265202573206174200070618A
S31500033770757365640073746172746564000D0A532E
S3150003378063616E20686F6C64696E67206D6574652E
S3150003379072206E756D626572202D20253375206645
S315000337A06F722025337520 6D696E75746573000D10
S315000337B00A496E7465726C656176696E6720253396
S315000337C075207472616E73706F6E64657273000D2B
S315000337D00A546869732053542068617320696E74B0
S315000337E065726C65617665206E756D62657220 25FE
S315000337F03375000D0A54686520696E7465726C65CD
S3150003380061766520696E74657276616C20697320D2
S3150003381025337520 6D696E75746573000D0A5354EF
S31500033820206E756D626572202533752069732072 6B
S31500033830756E6E696E67000D0A5468697320697345
S315000338402061202573207472616E73706F6E6465D8
S315000338507200736C617665006D6173746572000D39
S315000338600A00706175736500646973706C61792011
S3150003387077686574686572207363616E2069732067
S3150003388070617573656420 6F722072756E6E696EF2
S3150003389067005265717565737465642073636 16E41
S315000338A0207374617465006469737 06C6179007266
S315000338B06573636 16E20696E74657276616C2069E7
S315000338C06E206D696E757465730072657363616EE0
S315000338D0206F666673657420696E206D696E73006A
S315000338E0456E61626C652F44697361626C65207213
S315000338F06573636 16E000D0A5323204D61736B205C
S315000339004465736372697074696F6E20202020208A
S31500033910636F6E74726F6C2020696E746572766164
S315000339206C206F666673657420 45000D0A25326444

S315000339302025303478202520D31352E313573202539
S315000339402D372E3773202539752025367520253109
S31500033950780072657175657374006469737 06C6160
S315000339607 92F6D6F646966792074686520726571 55
S3150003397075657374656420736361 6E207374617413
S315000339806520636F6E74726F6C207461626C650080
S315000339907374617274207363616E2077697468202F
S315000339A0737065636966696564206C6576656C200A
S315000339B0303D6572617365207872656 62C20313DF2
S315000339C0636F6C642073746172742C20323D636C74
S315000339D065617220616C6C2064617461 2C20333DD7
S315000339E0726573746F7265207363616E20646566B6
S315000339F061756C74732028726571756573742F70A5
S31500033A00617573652F6461292C343D7761726D206E
S31500033A107374617274202864656661756C74295DBC
S31500033A200067657420636C6561722063726F7373DC
S31500033A302072656665726 56E636520746F207261B8
S31500033A406D20666F722065646974696E67007265BE
S31500033A5073746F7265207872656620636F6E66692C
S31500033A6067206C61737420736176656420746F20BC
S31500033A70666C6173682 0746F2072616D20666F7265
S31500033A80206564697469 6E6700736574207872656E
S31500033A906620746F206C617374207361766564208D
S31500033AA0746F20666C6173680064756D700064756D
S31500033AB06D7020786665720 00D0A587265662869 0E
S31500033AC06E2920466C6173682024587265665074AB
S31500033AD072206E756D2420246C6F74204C766C20D6
S31500033AE0486F6C642053746174652D2D2D204D61D0
S31500033AF07374657220616C6C6F772023496E7465ED
S31500033B00726C7620496E7465726C762320496E74E6
S31500033B1065726C764D696E7320726567382020 2056
S31500033B202020626974 6D6170202020786665722496
S31500033B3020786665725472790 00D0A252D382E3861
S31500033B407320252D352E35732025386C78202534A2
S31500033B506C642025346420253364202534642025B1
S31500033B602D382E387320252D362E367320202530FA
S31500033B70347820253864202538642025313164 20A3
S31500033B802530386C78202530386C782025356420 2C
S31500033B9025376400466C61736800456469742052 76
S31500033BA0616D0056616C696400456D7074790069D6
S31500033BB06E2058666572007363616E6E696E670088
S31500033BC0706175736564004349500061 6C69676E83
S31500033BD0696E6700736C617665006D617374657 2F7
S31500033BE0000D0A246C6F74207265673 82E2E2E2EF4
S31500033BF0206269746D61702E2E20786665725472 28
S31500033C0079205866657253697A6520427974657 3BB
S31500033C1052637664000D0A253464202530386C78A7
S31500033C20202530386C78202537642025386C6420AD
S31500033C3025386C64007363616E007374617274205B
S31500033C40736361 6E000D0A506175736 96E67207345
S31500033C5063616E202D20506C6561736520776169 01
S31500033C6074000D0A5061757365207363616E206677
S31500033C706972737420776974682063 6F6D6D616E02
S31500033C8064203C7061757365206F6E3E0043495036
S31500033C900073746F70207363616E004E616C6967A5
S31500033CA06E20636F6D6D00646100736574207 06FC1
S31500033CB06C6C007872202D70004E6E756D626572A5
S31500033CC0206F66206C6F676963616C206D65746530
S31500033CD07200747 2616E73666572206461746120 2A
S31500033CE0627920586D6F64656D2066726F6D206D05
S31500033CF0657465720052656365697665206461 74EF
S31500033D00612 0696E746F206D657465722062792017
S31500033D10586D6F64656D006E756D626572206F66B2
S31500033D2020736C6F7473202075736 5642077 6917
S31500033D307468202D2400676C6F62616C20746F2099
S31500033D40616C6C206D6574657273007472616E7359
S31500033D50706F6E64657220736C6F74206E756D621E
S31500033D606572007370656369667920544F552070D8
S31500033D70657269 6F6420666F72206C6F67206 969
S31500033D8073747300737065636966792077 696312
S31500033D9068206C6F672071756 16E74697479003D74
S31500033DA0312073696E676C652070686173652C20BA
S31500033DB03D3220706F6C79706861736500737 0654E
S31500033DC0636966792070686173 65206E756D6265D7
S31500033DD07220696E20706F6C79706861736520 6DEF
S31500033DE065746572004C6F67207374617274206426
S31500033DF0617465004C6F6720656E64206461746549
S31500033E00004C6F6720696E64657800 64756D700099
S31500033E1064756D7020636F6D6D207374617473 00C8
S31500033E20616C69676E6D656E74206C696D6974008B
S31500033E30786D697420726561 6C7920666F72207281
S31500033E4063762072656C61792030 00786D69742021
S31500033E5072656C617920666F7220726376207265 73
S31500033E606C61792031 00786D6974207265 6C6179B3
S31500033E7020666F72207263762072656C61792032D8
S31500033E8000696E636C75646520616C6C206D657486
S31500033E9065727320696E2064756D7000666 96C7453
S31500033EA0657220303D6E6F2D636F6D6D2C20313D35
S31500033EB0636F6D6D006F6E6C792070726 96E74201E
S31500033EC0696620616C69676E696E6700696E646511
S31500033ED07820666F7220616464697469 6F6E616CC1
S31500033EE020786D69742072656C6179207061 7261E6
S31500033EF06D6574657273000D0A257300202020 20FA
S31500033F0020202020202020202 0252D32372E323773E3
S31500033F1020252D32372E323773200067 6F6F6400EA
S31500033F20626164 00252D32372E32377320252D32F8
S31500033F30372E32377300786D6974006E6F207265A1
S31500033F40706C79000D0A786D69742072656C6179FD
S31500033F5073203D2025327820253278202532780 0BB
S31500033F600D0A61637175697369 74696F6E206C6993
S31500033F706D6974203D2025337 5000D0A25730020D5
S31500033F802532782531780020237472696573000D14
S31500033F900A2573002025337500202536750064 61D4
S31500033FA00064756D7020636F6D6D756E6963617402
S31500033FB0696F6E206163717569736974696F6E00E9
S31500033FC072656164206D756C7473006D6D756C74C8
S31500033FD0007265616420686477720068647772 00B2
S31500033FE07265616420766572736 96F6E00787220FC
S31500033FF02D7600657665 6E74202D414C206C6F67B7
S3150003400000657665 6E74006D64742F6D6477202D7C
S315000340100414C206C6F67006D6474004E7265736566
S3150003402074206465 6D616E64006D6474202D433184
S3150003403032333400707 56C7365206F757400707459
S315000340400202D410030313233343536373839414249
S3150003405043444546003031323334353637383961D7
S315000340606263646566 0000027C8C00027CBA00020F
S315000340707D6800027EB400027EC600027F2C000229
S315000340808 1A600028372000283E00002853A0002E1
S31500034090 8D280002902E0002949A000296FC0002DC
S315000340A0995200029A0400029C8A0002A11A000295
S315000340B0A12C0002A2F20002A3080002A35A0002E6
S315000340C0A3FA0002A40C0002A41E0002A4300002FC
S315000340D0A45A0002B60E0002B64C0002B9AE0002A4
S315000340E0B9D400C0991200C099740002BAD600026E
S315000340F0BAE80002BD8200029DA000029DA0000254
S3150003410009DA000029DA000029DA000029DA00002AA
S3150003411009DA000029DA000029DA000029DA000029A
S3150003412009DA000029DA000029DA000029DA000028A
S3150003413009DA000029DA000029DB000029DB000025A
S3150003414009DB000029DB000029DB000029DB000022A
S3150003415009DB000029DB000029DB000029DB000021A
S3150003416009DB000029DB000029DB000029DB000020A
S3150003417009DB000029DB000027CD00002A156000251
S30B00034180A46C0002A95025
S309000341880000341B036
S309000341900000341C816
S315000341A800034996013C708EFFFFFFFF00000000E5
S315000341B800000000000000000000000000000000EE
S315000341C80000000000004465666175 6C74200000F9
S315000341D800010F0100011367940041 4C4C2D4872EE
S315000341E87300000000000200000000000000000002B
S315000341F800000000000000000000000000000000AE

S3150003420800000000000000000000000000000000009D
S3150003421800000000000000000000000000000000008D
S3150003422800000000000000000000000000000000007D
S3150003423800000000000000000000000000000000006D
S3150003424800000000000000000000000000000000005D
S3150003425800000000000000000000000000000000004D
S3150003426800000000000000000000000000000000003D
S3150003427800000000000000000000000000000000002D
S3150003428800000000000000000000000000000000001D
S3150003429800000000000000000000000000000000000D
S315000342A80000000000000000000000000000000000FD
S315000342B80000414C4C44415953000000000000000E3
S315000342C80000000000000000000000000000000000DD
S315000342D80000000000000000000000000000000000CD
S315000342E80000000000000000000000000000000000BD
S315000342F80000000000000000000000000000000000AD
S3150003430800000000000000000000000000000000009C
S3150003431800000000000000000000000000000000008C
S3150003432800000000000000000000000000000000007C
S3150003433800000000000000000000000000000000006C
S3150003434800000000000000000000000000000000005C
S3150003435800000000000000000000000000000000004C
S3150003436800000000000000000000000000000000003C
S3150003437800000000000000000000000000000000002C
S3150003438800000000000000000000000000000000001C
S3150003439800000000000000000000000000000000000C
S315000343A80000000000000000000000000000000000FC
S315000343B80000000000000000000000000000000000EC
S315000343C80000000000000000000000000000000000DC
S315000343D80000000000000000000000000000000000CC
S315000343E80000000000000000000000000000000000BC
S315000343F80000000000000000000000000000000000AC
S3150003440800000000000000000000000000000000009B
S3150003441800000000000000000000000000000000008B
S3150003442800000000000000000000000000000000007B
S3150003443800000000000000000000000000000000006B
S3150003444800000000000000000000000000000000005B
S3150003445800000000000000000000000000000000004B
S3150003446800000000000000000000000000000000003B
S3150003447800000000000000000000000000000000002B
S3150003448800000000000000000000000000000000001B
S3150003449800000000000000000000000000000001000A
S315000344A801010F010001001800010018000100189E
S315000344B80001001800001001A0001001800001001885
S315000344C8000100180001001800001001A0C0100156C
S315000344D8000100150001000000001000000010000B2
S315000344E849EA600049EA600049EA600049EA60006F
S315000344F8496A600049EA600049EA600049EA6000DF
S31500034508 49EA6000496A6000471AA3A14B03D6002B
S315000345184A8E62004A8E620049EA600049EA6000F0
S31500034528 49EA600049EA6000496A600049EA6000AE
S31500034538 49EA600049EA600049EA6000496A60009E
S3150003454 84A6A60004B03D6004A8E62004A8E6200AE
S3150003455 84AD2F000882888288850885088 50A05066
S31500034568A00AA014A028900AA00A903C08000800F4
S315000345780800080008000800080008 00A028982872
S31500034588982898 28A028A828B028B828E029A82871
S31500034598A03CA064E029E029E003E051E051E051A2
S315000345A8E051E051E851F051E050E015E029E029E7
S315000345B8A029A015A00AA00AA00AA00AA00AA00476
S315000345C8A028A004A3E8A00A000000000000000039
S315000345D8000000000202080808080808 0802020288
S315000345E820202010101010104040404042424 2083C
S315000345F842080808424242424040404242420442 7C
S3150003460840404042010101010104040405040000 7D
S31500034618000000049EA600049EA600049EA6000D0
S31500034628 49EA6000496A600049EA600049EA6000AD
S31500034638 49EA600049EA6000496A60004A6A60001C
S3150003464 84B03D6004A8E62004A8E62004AD2F000B5
S3150003465800000000000000000000000000000000 49
S315000346683F80000041000000000000000000000039
S315000346780000000000003F80000057000000000000 13
S3150003468800000000000000000000000003F8000005A
S315000346985641524C6700000000000000000000006D
S315000346A800003F80000056564C00000000000000 42
S315000346B800000000000000003F800000560000 00D4
S315000346C800000000000000000000000000003F801A
S315000346D8000064656C56000000000000000000003E
S315000346E8000000003F80000056410000000000000 63
S315000346F8000000000000000000003A83126F6B57A9
S31500034708000000000000000025382E33660000000074
S315000347183A83126F6B574800000000000000253130BA
S3150003472 82E334C6600003A83126F446B5641524C43
S31500034738 67000025382E336600000003A83126F9F
S315000347484 46B564152484C67002531302E334C662C
S3150003475800003A83126F446B5641524C640000259D
S3150003476 8382E3366000000003A83126F446B5641B5
S3150003477 852484C64002531302E334C6600003A8388
S3150003478 8126F442D6B5641000000025382E336600
S315000347980000000003A83126F442D6B5641480000 0F
S315000347A8002531302E334C6600003A83126F442DB0
S315000347B86B413200000000025382E3366000000000E6
S315000347C83A83126F442D6B413248000000 2531307D
S315000347D82E334C6600003A83126F522D6B57000036
S315000347E8000000 25382E33660000000 3A83126F56
S315000347F8522D6B574800000000 2531302E334C6686
S31500034808 00003A83126F526B5641524C67000025DB
S3150003481 8382E3366000000003A83126F526B5641F6
S3150003482 852484C67002531302E334C6600003A83D4
S3150003483 8126F526B5641524C64000025382E33666C
S315000348480000000003A83126F526B564152484C647B
S31500034858002531302E334C6600003A83126F522DF1
S3150003486 86B5641000000025382E336600000000 11
S3150003487 83A83126F522D6B5641480000002531309A
S3150003488 82E334C6600003A83126F522D6B41320069
S315000348980000025382E3366000000003A83126FA5
S315000348A8522D6B4132480000002531302E334C66B9
S315000348B800003A83126F6B563200000000000002591
S315000348C8382E3366000000003A83126F6B5632485F
S315000348D8000000000002531302E334C6600003A8371
S315000348E8126F64656C6B563200000025382E3366EA
S315000348F80000000003A83126F64656C6B56324800F9
S31500034908002531302E334C6600003F80000004350AB
S3150003491848310000000000025382E306600000000EC
S315000349283F800000436F756E747331000025313084
S31500034938 2E304C6600003F80000043504832000 08A
S3150003494800000025382E30660000000003F80000076
S315000349584 36F756E7473320000 2531302E304C6602
S31500034968 00003991A2B4487A000000000000000252F
S3150003497 8382E33660000000358637BD4D43796 30C
S31500034988 6C6573000002531302E334C660000FFFF3B
S30700034998FFFF16
S3150003499C000000010000000100028842000 2884268
S315000349AC0003000400050006000700080009000ABE
S315000349BC000B000C000D000E000F0010001100126E
S315000349CC00130014001500160017001800 19001A1E
S315000349DC001B0000010000007FF80201000 31072A7
S315000349EC000310790003107B000310900003109 74B
S315000349FC000310A70000076052000000000031176A5
S31500034A0C000311790003117E00029ED000029ED48E
S31500034A1C0003147C000314840003148A000314910A
S31500034A2C0003149A000314A300000000100000000104
S31500034A3C00000001000000010000000100000001 5D
S31500034A4C00000001000000010000000100000001 4D
S31500034A5C00000002000000010000000100000001 3C
S31500034A6C00000001000000010000000100000001 2D
S31500034A7C00000001100000001000000010000000 10D
S31500034A8C00000001000000010000000100000001 0D
S31500034A9C00000002000000010000000100000001FC
S31500034AAC000000010000000 1000F00033862000241
S31500034ABC0F700002B9F600033868010702010 20001
S31500034ACC00029EC00002BA660003389203640 0001B

S31500034ADC00000000000000000000338A70369020071
S31500034AEC00029EC00002BA6A000338AF036F0200CD
S31500034AFC00029EC00002BA6E000338CA03450200C8
S31500034B0C00029EC000029EC4000338E00003395223
S31500034B1C000213BE00C099240003395A0405A002EF
S30700034B2C00007E
S31500034B3048E70D0833C000A004E0226F00144201C9
S31500034B40287C008040081814183C0080424760384F
S31500034B50206900083A102069000430BC0040308503
S31500034B6020690004082800070001 67F408280004E8
S31500034B7000016704720160 1A5269000E524754A974
S31500034B800008549154A900044A016606BE69000C44
S31500034B9065BE2069000430BC005030BC00FF188499
S31500034BA0100133C000A004E24CDF10B0205F588F21
S31500034BB04ED04E714E714E7148E7010833C000A0C6
S31500034BC004DC226F000C7214424732BC002032BC54
S31500034BD000D0287C00804014207C00C05468602AE2
S31500034BE0081400076724081400066718 08D400068B
S31500034BF05341660608D00001601813FC00EA0080E2
S31500034C0040156002524708D40007082900070001 2F
S31500034C1067CE08290005000167041 0BC000132BCF9
S31500034C20005032BC00FF300733C000A004DE4CDF67
S31300034C301080205F588F4ED04E714E714E711C
S70500000000FA

Mini-closet S-Record File

S0030000FC
S315000000000000E003F800021C9E0001BAC80001BAD243
S3150000000100001BADC0001BAE60001BAF00001BB0437
S3150000000200001BB0E0001BABE0001BB220001BB22CB
S3150000000300001BB220001BB220001BB220001BB2242
S3150000000400001BB220001BB220001BB220001BB2232
S3150000000500001BB220001BB220001BB220001BB2222
S3150000000600001BAFA0001BB180001BB18000097E8AE
S31500000007000134D20001BB180001EBDA0001BB1805
S3150000000800001BB040001BB040001BB040001BB046A
S3150000000900001BB040001BB040001BB040001BB045A
S315000000A00001BB040001BB040001BB040001BB044A
S315000000B00001BB040001BB040001BB040001BB043A
S315000000C00001BB2C0001BB2C0001BB2C0001BB2C8A
S315000000D00001BB2C0001BB2C0001BB2C0001BB2C7A
S315000000E00001BB220001BB220001BB220001BB2292
S315000000F00001BB220001BB220001BB220001BB2282
S3150000001000001BB180001BB180001BB180001BB1899
S3150000001100001BB180001BB180001BB180001BB1889
S3150000001200001BB180001BB180001BB180001BB1879
S3150000001300001BB180001BB180001BB180001BB1869
S3150000001400001BB180001BB180001BB180001BB1859
S3150000001500001BB180001BB180001BB180001BB1849
S3150000001600001BB180001BB180001BB180001BB1839
S3150000001700001BB180001BB180001BB180001BB1829
S3150000001800001BB180001BB180001BB180001BB1819
S3150000001900001BB180001BB180001BB180001BB1809
S315000001A00001BB180001BB180001BB180001BB18F9
S315000001B00001BB180001BB180001BB180001BB18E9
S315000001C00001BB180001BB180001BB180001BB18D9
S315000001D00001BB180001BB180001BB180001BB18C9
S315000001E00001BB180001BB180001BB180001BB18B9
S315000001F00001BB180001BB180001BB180001BB18A9
S3150000002000001BB180001BB180001BB180001BB1898
S3150000002100001BB180001BB180001BB180001BB1888
S3150000002200001BB180001BB180001BB180001BB1878
S3150000002300001BB180001BB180001BB180001BB1868
S3150000002400001BB180001BB180001BB180001BB1858
S3150000002500001BB180001BB180001BB180001BB1848
S3150000002600001BB180001BB180001BB180001BB1838
S3150000002700001BB180001BB180001BB180001BB1828
S3150000002800001BB180001BB180001BB180001BB1818
S3150000002900001BB180001BB180001BB180001BB1808
S315000002A00001BB180001BB180001BB180001BB18F8
S315000002B00001BB180001BB180001BB180001BB18E8
S315000002C00001BB180001BB180001BB180001BB18D8
S315000002D00001BB180001BB180001BB180001BB18C8
S315000002E00001BB180001BB180001BB180001BB18B8
S315000002F00001BB180001BB180001BB180001BB18A8
S3150000003000001BB180001BB180001BB180001BB1897
S3150000003100001BB180001BB180001BB180001BB1887
S3150000003200001BB180001BB180001BB180001BB1877
S3150000003300001BB180001BB180001BB180001BB1867
S3150000003400001BB180001BB180001BB180001BB1857
S3150000003500001BB180001BB180001BB180001BB1847
S3150000003600001BB180001BB180001BB180001BB1837
S3150000003700001BB180001BB180001BB180001BB1827
S3150000003800001BB180001BB180001BB180001BB1817
S3150000003900001BB180001BB180001BB180001BB1807
S315000003A00001BB180001BB180001BB180001BB18F7
S315000003B00001BB180001BB180001BB180001BB18E7
S315000003C00001BB180001BB180001BB180001BB18D7
S315000003D00001BB180001BB180001BB180001BB18C7
S315000003E00001BB180001BB180001BB180001BB18B7
S315000003F00001BB180001BB180001BB180001BB18A7
S31500000400000321D400021C9E00021C9E000189E20A
S315000004100002F7000015D4400015FD00001D97219
S3150000004200001F5740001F24C000057E000005B1E6D
S31500000043000005C1400001A62000029A80000500E9B
S31500000044000009A5E0000F4080001034A00014520FE
S315000000450000015AE400015EC80001760000197968B
S3150000004600001C2520001C79E0001DFFC0001F20834
S31500000047000002193A00021B200000C2CA00002054E4
S31500000048000002F04000043A600018A1600019842CE
S315000000490000198B6000199700001E0320001F1F404
S315000004A0000097CC0000A28C0001317A0001F238DE
S315000004B00001F5740001896E0001975600002E7246
S315000004C00000A2C2000123E6000156600001636835
S315000004D000018C9E000191120001EDDA00002FD878
S315000004E00000F43000012670000145340001 5AE492
S315000004F00001873C00018A900001D62A0001F1A87C
S315000005000005C14000125980001591400018 95A65
S3150000005100001D1720000C67E0001914400003 83807
S31500000052000005C8C000175EC00002A1A0000A2E6AF
S315000000530000015C680001620400 01E0460002183C0C
S315000005400001765200 01E05A3E1985F33E16096114
S315000005500003E16096100003E16096100003E16C5
S315000005600961000 0BE1609610000BDDE46C8000034
S31500000570BDB3AF410000BD700F0100003D35DCD3B7
S31500000058000003D06B68900003CD9CCAC00003C9189
S315000005907D750000BC5C70840000BC2349DD000052
S315000005A0BC03FFED0000BBB05A0300003B859987F2
S315000005B000003B45ECED00003B1FFFE900003AD58B
S315000005C0C2710000BAA1F0650000BA6FE8E1000050
S315000005D0BA41F0600000BA018D1E00003EF94F944A
S315000005E03F794F943E794F943EF94F943DF94F949D
S315000005F03E794F943D794F943DF94F943E160961EB
S31500000060000003E16096100003E16096100003E1614
S31500000061009610000BE1609610000BDDE46C8000083
S31500000620BDB3AF410000BD700F0100003D35DCD306
S31500000063000003D06B68900003CD9CCAC00003C91D8
S315000006407D750000BC5C70840000BC2349DD0000A1
S31500000650BC03FFED0000BBB05A0300003B85998741
S31500000066000003B45ECED00003B1FFFE900003AD5DA
S31500000670C2710000BAA1F0650000BA6FE8E100009F
S31500000680BA41F0600000BA018D1E00003EF94F9499
S315000006903F794F943E794F943EF94F943DF94F94EC
S315000006A03E794F943D794F943DF94F943E1609613A
S315000006B000003E16096100003E16096100003E1664
S315000006C009610000BE1609610000BDDE46C80000D3
S315000006D0BDB3AF410000BD700F0100003D35DCD356
S315000006E000003D06B68900003CD9CCAC00003C9128
S315000006F07D750000BC5C70840000BC2349DD0000F1
S31500000700BC03FFED0000BBB05A0300003B85998790
S31500000071000003B45ECED00003B1FFFE900003AD529
S31500000720C2710000BAA1F0650000BA6FE8E10000EE
S31500000730BA41F0600000BA018D1E00003EF94F94E8
S315000007403F794F943E794F943EF94F943DF94F943B
S315000007503E794F943D794F943DF94F943E16096189
S31500000076000003E16096100003E16096100003E16B3
S31500000077009610000BE1609610000BDDE46C8000022
S31500000780BDB3AF410000BD700F0100003D35DCD3A5
S31500000079000003D06B68900003CD9CCAC00003C9177
S315000007A07D750000BC5C70840000BC2349DD000040
S315000007B0BC03FFED0000BBB05A0300003B859987E0
S315000007C000003B45ECED00003B1FFFE900003AD579
S315000007D0C2710000BAA1F0650000BA6FE8E100003E
S315000007E0BA41F0600000BA018D1E00003EF94F9438
S315000007F03F794F943E794F943EF94F943DF94F948B
S315000008003E794F943D794F943DF94F943E160961D8
S31500000081000003E16096100003E16096100003E1602
S31500000082009610000BE1609610000BDDE46C8000071
S31500000830BDB3AF410000BD700F0100003D35DCD3F4
S31500000084000003D06B68900003CD9CCAC00003C91C6
S315000008507D750000BC5C70840000BC2349DD00008F
S31500000860BC03FFED0000BBB05A0300003B8599872F
S31500000087000003B45ECED00003B1FFFE900003AD5C8
S31500000880C2710000BAA1F0650000BA6FE8E100008D
S31500000890BA41F0600000BA018D1E00003EF94F9487
S315000008A03F794F943E794F943EF94F943DF94F94DA
S315000008B03E794F943D794F943DF94F943E16096128
S315000008C000003E16096100003E16096100003E1652
S315000008D009610000BE1609610000BDDE46C80000C1
S315000008E0BDB3AF410000BD700F0100003D35DCD344
S315000008F000003D06B68900003CD9CCAC00003C9116
S315000009007D750000BC5C70840000BC2349DD0000DE
S31500000910BC03FFED0000BBB05A0300003B8599877E
S31500000092000003B45ECED00003B1FFFE900003AD517
S31500000930C2710000BAA1F0650000BA6FE8E10000DC
S31500000940BA41F0600000BA018D1E00003EF94F94D6
S315000009503F794F943E794F943EF94F943DF94F9429
S315000009603E794F943D794F943DF94F943E16096177
S31500000097000003E16096100003E16096100003E16A1
S31500000098009610000BE1609610000BDDE46C8000010
S31500000990BDB3AF410000BD700F0100003D35DCD393
S315000009A000003D06B68900003CD9CCAC00003C9165
S315000009B07D750000BC5C70840000BC2349DD00002E
S315000009C0BC03FFED0000BBB05A0300003B859987CE
S315000009D000003B45ECED00003B1FFFE900003AD567

S315000009E0C2710000BAA1F0650000BA6FE8E100002C
S315000009F0BA41F0600000BA018D1E00003EF94F9426
S31500000A003F794F943E794F943EF94F943DF94F9478
S31500000A103E794F943D794F943DF94F943E160961C6
S31500000A2000003E16096100003E16096100003E16F0
S31500000A3009610000BE1609610000BDDE46C800005F
S31500000A40BDB3AF410000BD700F0100003D35DCD3E2
S31500000A5000003D06B68900003CD9CCAC00003C91B4
S31500000A607D750000BC5C70840000BC2349DD00007D
S31500000A70BC03FFED0000BBB05A0300003B8599871D
S31500000A8000003B45ECED00003B1FFFE900003AD5B6
S31500000A90C2710000BAA1F0650000BA6FE8E100007B
S31500000AA0BA41F0600000BA018D1E00003EF94F9475
S31500000AB03F794F943E794F943EF94F943DF94F94C8
S31500000AC03E794F943D794F943DF94F943E16096116
S31500000AD000003E16096100003E16096100003E1640
S31500000AE009610000BE1609610000BDDE46C80000AF
S31500000AF0BDB3AF410000BD700F0100003D35DCD332
S31500000B0000003D06B68900003CD9CCAC00003C9103
S31500000B107D750000BC5C70840000BC2349DD0000CC
S31500000B20BC03FFED0000BBB05A0300003B8599876C
S31500000B3000003B45ECED00003B1FFFE900003AD505
S31500000B40C2710000BAA1F0650000BA6FE8E10000CA
S31500000B50BA41F0600000BA018D1E00003EF94F94C4
S31500000B603F794F943E794F943EF94F943DF94F9417
S31500000B703E794F943D794F943DF94F943E16096165
S31500000B8000003E16096100003E16096100003E168F
S31500000B9009610000BE1609610000BDDE46C80000FE
S31500000BA0BDB3AF410000BD700F0100003D35DCD381
S31500000BB000003D06B68900003CD9CCAC00003C9153
S31500000BC07D750000BC5C70840000BC2349DD00001C
S31500000BD0BC03FFED0000BBB05A0300003B859987BC
S31500000BE000003B45ECED00003B1FFFE900003AD555
S31500000BF0C2710000BAA1F0650000BA6FE8E100001A
S31500000C00BA41F0600000BA018D1E00003EF94F9413
S31500000C103F794F943E794F943EF94F943DF94F9466
S31500000C203E794F943D794F943DF94F943E160961B4
S31500000C3000003E16096100003E16096100003E16DE
S31500000C4009610000BE1609610000BDDE46C800004D
S31500000C50BDB3AF410000BD700F0100003D35DCD3D0
S31500000C6000003D06B68900003CD9CCAC00003C91A2
S31500000C707D750000BC5C70840000BC2349DD00006B
S31500000C80BC03FFED0000BBB05A0300003B8599870B
S31500000C9000003B45ECED00003B1FFFE900003AD5A4
S31500000CA0C2710000BAA1F0650000BA6FE8E1000069
S31500000CB0BA41F0600000BA018D1E00003EF94F9463
S31500000CC03F794F943E794F943EF94F943DF94F94B6
S31500000CD03E794F943D794F943DF94F943E16096104
S31500000CE000003E16096100003E16096100003E162E
S31500000CF009610000BE1609610000BDDE46C800009D
S31500000D00BDB3AF410000BD700F0100003D35DCD31F
S31500000D1000003D06B68900003CD9CCAC00003C91F1
S31500000D207D750000BC5C70840000BC2349DD0000BA
S31500000D30BC03FFED0000BBB05A0300003B8599875A
S31500000D4000003B45ECED00003B1FFFE900003AD5F3
S31500000D50C2710000BAA1F0650000BA6FE8E10000B8
S31500000D60BA41F0600000BA018D1E00003EF94F94B2
S31500000D703F794F943E794F943EF94F943DF94F9405
S31500000D803E794F943D794F943DF94F943E16096153
S31500000D9000003E16096100003E16096100003E167D
S31500000DA009610000BE1609610000BDDE46C80000EC
S31500000DB0BDB3AF410000BD700F0100003D35DCD36F
S31500000DC000003D06B68900003CD9CCAC00003C9141
S31500000DD07D750000BC5C70840000BC2349DD00000A
S31500000DE0BC03FFED0000BBB05A0300003B859987AA
S31500000DF000003B45ECED00003B1FFFE900003AD543
S31500000E00C2710000BAA1F0650000BA6FE8E1000007
S31500000E10BA41F0600000BA018D1E00003EF94F9401
S31500000E203F794F943E794F943EF94F943DF94F9454
S31500000E303E794F943D794F943DF94F943E160961A2
S31500000E4000003E16096100003E16096100003E16CC
S31500000E5009610000BE1609610000BDDE46C800003B
S31500000E60BDB3AF410000BD700F0100003D35DCD3BE
S31500000E7000003D06B68900003CD9CCAC00003C9190
S31500000E807D750000BC5C70840000BC2349DD000059
S31500000E90BC03FFED0000BBB05A0300003B859987F9
S31500000EA000003B45ECED00003B1FFFE900003AD592
S31500000EB0C2710000BAA1F0650000BA6FE8E1000057
S31500000EC0BA41F0600000BA018D1E00003EF94F9451
S31500000ED03F794F943E794F943EF94F943DF94F94A4
S31500000EE03E794F943D794F943DF94F943E160961F2
S31500000EF000003E16096100003E16096100003E161C
S31500000F0009610000BE1609610000BDDE46C800008A
S31500000F10BDB3AF410000BD700F0100003D35DCD30D
S31500000F2000003D06B68900003CD9CCAC00003C91DF
S31500000F307D750000BC5C70840000BC2349DD0000A8
S31500000F40BC03FFED0000BBB05A0300003B85998748
S31500000F5000003B45ECED00003B1FFFE900003AD5E1
S31500000F60C2710000BAA1F0650000BA6FE8E10000A6
S31500000F70BA41F0600000BA018D1E00003EF94F94A0
S31500000F803F794F943E794F943EF94F943DF94F94F3
S31500000F903E794F943D794F943DF94F943E16096141
S31500000FA000003E16096100003E16096100003E166B
S31500000FB009610000BE1609610000BDDE46C80000DA
S31500000FC0BDB3AF410000BD700F0100003D35DCD35D
S31500000FD000003D06B68900003CD9CCAC00003C912F
S31500000FE07D750000BC5C70840000BC2349DD0000F8
S31500000FF0BC03FFED0000BBB05A0300003B85998798
S3150000100000003B45ECED00003B1FFFE900003AD530
S31500001010C2710000BAA1F0650000BA6FE8E10000F5
S31500001020BA41F0600000BA018D1E00003EF94F94EF
S315000010303F794F943E794F943EF94F943DF94F9442
S315000010403E794F943D794F943DF94F943E16096190
S3150000105000003E16096100003E16096100003E16BA
S3150000106009610000BE1609610000BDDE46C8000029
S31500001070BDB3AF410000BD700F0100003D35DCD3AC
S3150000108000003D06B68900003CD9CCAC00003C917E
S315000010907D750000BC5C70840000BC2349DD000047
S315000010A0BC03FFED0000BBB05A0300003B859987E7
S315000010B000003B45ECED00003B1FFFE900003AD580
S315000010C0C2710000BAA1F0650000BA6FE8E1000045
S315000010D0BA41F0600000BA018D1E00003EF94F943F
S315000010E03F794F943E794F943EF94F943DF94F9492
S315000010F03E794F943D794F943DF94F943E160961E0
S3150000110000003E16096100003E16096100003E1609
S3150000111009610000BE1609610000BDDE46C8000078
S31500001120BDB3AF410000BD700F0100003D35DCD3FB
S3150000113000003D06B68900003CD9CCAC00003C91CD
S315000011407D750000BC5C70840000BC2349DD000096
S31500001150BC03FFED0000BBB05A0300003B85998736
S3150000116000003B45ECED00003B1FFFE900003AD5CF
S31500001170C2710000BAA1F0650000BA6FE8E1000094
S31500001180BA41F0600000BA018D1E00003EF94F948E
S315000011903F794F943E794F943EF94F943DF94F94E1
S315000011A03E794F943D794F943DF94F943E1609612F
S315000011B000003E16096100003E16096100003E1659
S315000011C009610000BE1609610000BDDE46C80000C8
S315000011D0BDB3AF410000BD700F0100003D35DCD34B
S315000011E000003D06B68900003CD9CCAC00003C911D
S315000011F07D750000BC5C70840000BC2349DD0000E6
S31500001200BC03FFED0000BBB05A0300003B85998785
S3150000121000003B45ECED00003B1FFFE900003AD51E
S31500001220C2710000BAA1F0650000BA6FE8E10000E3
S31500001230BA41F0600000BA018D1E00003EF94F94DD
S315000012403F794F943E794F943EF94F943DF94F9430
S315000012503E794F943D794F943DF94F943E1609617E
S3150000126000003E16096100003E16096100003E16A8
S3150000127009610000BE1609610000BDDE46C8000017
S31500001280BDB3AF410000BD700F0100003D35DCD39A
S3150000129000003D06B68900003CD9CCAC00003C916C
S315000012A07D750000BC5C70840000BC2349DD000035
S315000012B0BC03FFED0000BBB05A0300003B859987D5
S315000012C000003B45ECED00003B1FFFE900003AD56E
S315000012D0C2710000BAA1F0650000BA6FE8E1000033
S315000012E0BA41F0600000BA018D1E00003EF94F942D
S315000012F03F794F943E794F943EF94F943DF94F9480
S315000013003E794F943D794F943DF94F943E160961CD
S3150000131000003E16096100003E16096100003E16F7
S3150000132009610000BE1609610000BDDE46C8000066
S31500001330BDB3AF410000BD700F0100003D35DCD3E9
S3150000134000003D06B68900003CD9CCAC00003C91BB
S315000013507D750000BC5C70840000BC2349DD000084
S31500001360BC03FFED0000BBB05A0300003B85998724
S3150000137000003B45ECED00003B1FFFE900003AD5BD
S31500001380C2710000BAA1F0650000BA6FE8E1000082
S31500001390BA41F0600000BA018D1E00003EF94F947C
S315000013A03F794F943E794F943EF94F943DF94F94CF
S315000013B03E794F943D794F943DF94F943E1609611D
S315000013C000003E16096100003E16096100003E1647
S315000013D009610000BE1609610000BDDE46C80000B6
S315000013E0BDB3AF410000BD700F0100003D35DCD339
S315000013F000003D06B68900003CD9CCAC00003C910B

S315000014007D750000BC5C70840000BC2349DD0000D3
S31500001410BC03FFED0000BBB05A0300003B85998773
S315000014200003B45ECED00003B1FFFE900003AD50C
S31500001430C2710000BAA1F0650000BA6FE8E10000D1
S31500001440BA41F0600000BA018D1E00003EF94F94CB
S315000014503F794F943E794F943EF94F943DF94F941E
S315000014603E794F943D794F943DF94F943E1609616C
S3150000147000003E16096100003E16096100003E1696
S31500001480096100000BE1609610000BDDE46C8000005
S31500001490BDB3AF410000BD700F0100003D35DCD388
S315000014A000003D06B68900003CD9CCAC00003C915A
S315000014B07D750000BC5C70840000BC2349DD000023
S315000014C0BC03FFED0000BBB05A0300003B859987C3
S315000014D000003B45ECED00003B1FFFE900003AD55C
S315000014E0C2710000BAA1F0650000BA6FE8E1000021
S315000014F0BA41F0600000BA018D1E00003EF94F941B
S315000015003F794F943E794F943EF94F943DF94F946D
S315000015103E794F943D794F943DF94F943E160961BB
S3150000152000003E16096100003E16096100003E16E5
S31500001530096100000BE1609610000BDDE46C8000054
S31500001540BDB3AF410000BD700F0100003D35DCD3D7
S3150000155000003D06B68900003CD9CCAC00003C91A9
S315000015607D750000BC5C70840000BC2349DD000072
S31500001570BC03FFED0000BBB05A0300003B85998712
S3150000158000003B45ECED00003B1FFFE900003AD5AB
S31500001590C2710000BAA1F0650000BA6FE8E1000070
S315000015A0BA41F0600000BA018D1E00003EF94F946A
S315000015B03F794F943E794F943EF94F943DF94F94BD
S315000015C03E794F943D794F943DF94F9480008000C9
S315000015D08000800080008000800080008000800005
S315000015E080008000800080008000800080008000F5
S315000015F08000800080008000800080808080080E5
S31500001600800080008000800080008000800080000D4
S3150000161080000BB800000000000000000000000009
S3150000162000014001400140014001700140014001411
S315000016300014001700110011000000000000001740
S315000016400014001400110011001100014BDA00A00BE
S31500001650BDA00A00BDA00A00BDA00A003DA00A0068
S315000016603D8834163D6FC2463D36E6DBBCC1FC9B69
S31500001670BCEAB454BC914EF5BC5DB2FA3BEB22AD6C
S315000016803BC81D843BB021A53B865CF5BB0E81A003
S31500001690BAF29063BAD57E1EBAA2DD493A2CBC27AF
S315000016A03A13022C3A0163B539C5695100010200AB
S315000016B0010200010200010200010200010200114
S315000016C00200010201020301020301020301020 3F7
S315000016D0010203010203010203010203010203 01E5
S315000016E0020301020301020301020301020301 02D4
S315000016F003010203005114320300000000000000041
S3150000170000000000000000000000000000000000D3
S31500001710000000C00042696C6C696E67000000000002
S3150000172000000000000000000000000000000000B3
S315000017300000000000000000000000FFFF0000FFFFA7
S3150000174000000FFFF000000000000000000000000095
S31500001750000000000000000000000000000000000083
S31500001760000000000000000000000000000000000073
S31500001770000000000000000000000000000000000063
S31500001780000000000000000000000000000000000053
S31500001790000000000000000000000000000000000043
S315000017A0000000000000000000000000000000000033
S315000017B0000000000000000000000000000000000023
S315000017C0000000000000000000000000000000000013
S315000017D0000000000000000000000000000000000003
S315000017E00000000000000000000000000000000000F3
S315000017F00000000000000000000000000000000000E3
S3150000180000000000000000000000000000000000000D2
S3150000181000000400000000000000002FA2E3FF3F543C
S3150000182007AE1BF0000003F000000000000004B9876
S3150000183096804220000428C0000358F2A63360FC6
S3150000184002A633D95555542652EE00002C2A100026D
S31500001850C2AA0002C2B70002C2C40002C2D5000278
S31500001860C2E200000000000048E7013E33C000A0CD
S3150000187000000598F4EB9000176002A7C00C0A3846F
S31500001880247C00C0A3882C7C00C0C8FE4A3900C056
S31500001890A247670A34B900C0A292600001880C15FD
S315000018A00003632E4A3900C0A2526726700030l228
S315000018B02E8048573F3C00013F3C002E4EB90000A9
S315000018C07D7A4A406700015E48790002AA526000AC
S315000018D0014C287C00C0A245267C00C0A2444A15C3
S315000018E067284A1466144A1366104A14661C4A137B
S315000018F066184A3900C0A250661042153F3C0014D3
S3150000190004EB900007EF66000011C4A3900C0A246AE
S3150000191066244A14670A203900C0A288B096671662
S3150000192004A136700010070003012223900C0A284F9
S31500001930B280660000F07E04700010074A3308008B
S3150000194067564240100759404 8C0E588068000C0E7
S31500001950C93C20402F1070001007E588068000C0A3
S31500001960A28420402F104EB900023F5C4A406628F0
S3150000197000C0700076518207900C0C9200828000256
S315000019800003670A08390006008040176 70A103C02
S3150000199000FDD0071A80600852070C0700096398FB
S315000019A04A3900C0A24E672448790002AA632F393B
S315000019B000C0A2AC4EB900023F5C4A40660E1ABC9B
S315000019C0000613FC000100C02C166006423900C058
S315000019D02C164A15634E42401015064000143F006F
S315000019E04EB900007EF64A3900C0A24F66362F1661
S315000019F0487900028E2448790002AA6C4EB900028A
S315000001A002A6E4FEF000C2F3900C000FA3F3C00430E
S31500001A104EB900001DCE48790002AA824EB90002D6
S31500001A202A6E588F4A3900C0A251660C4A15631CAB
S31500001A304A3900C0A25067143F122F164879000297
S31500001A40AA854EB900022A6E4FEF000A4240588F0F
S31500001A5033C000A000024CDF7C804E754E714E7183
S31500001A604E712F0733C000A00004598F3F3C002E53
S31500001A7043EF00024EB900007F1E4A97670E2057BB
S31500001A802E28001033C700C0A38860182O3900C074
S31500001A90C8FE223C000003E84EB9000257A833C036
S31500001AA000C0A388588F33C000A000062E1F4E75B5
S31500001AB04E714E714E7148E7033E33C000A00008D8
S31500001AC04FEFFFF23E2F002E2C2F00302A6F0034EE
S31500001AD030070C40004A67080C40006A6702601233
S31500001AE0203C0001518022064EB90002625E2F4062
S31500001AF0000A0C47004A670A0C47006A67042F462B
S31500001B0000A48574EB900001F9E204F2F28000A92
S31500001B104EB90000240C1E80287C00022AA430073F
S31500001B200C40004367200C400054671A0C40004DDF
S31500001B30675A0C40006367540C400074674E0C40B3
S31500001B4000536778607442 40102F00023F00424005
S31500001B50102F00053F004240102F00083F00487933
S31500001B600002AAC92F0D4E944FEF000E0C2D002037
S31500001B7000003673E0C2D0020000666081B7C003023
S31500001B80000660381B7C0030000960304240102F90
S31500001B9000033F004240102F00063F004879000234
S31500001BA0AAD82F0D4E944FEF000C0C2D00200003E9
S31500001BB0660A1B7C00300003600242 1547EF0005F1
S31500001BC045EF00062C7C00E0000830070C4000437F
S31500001BD0673E0C40006367380C40004A67400C4083
S31500001BE00044673A0C40004D670000D80C40006D79
S31500001BF0670000DE0C40006A670000D60C40005A01
S31500001C00670001320C40005367000174600001A4B4
S31500001C1048790002AAE22F0D4EB900023F2A2F0D85
S31500001C204EB900024D602E0010164A00670E0C00D9
S31500001C30000167260C000002673E6064204F3F28C3
S31500001C40000084240102F00073F004240102F000AB4
S31500001C503F0048790002AAE4603A204F3F28000876
S31500001C604240102F00083F004240102F00093F005D
S31500001C7048790002AAF0601C4240102F00053F0080
S31500001C804240102F00083F00204F3F28000C4879A3
S31500001C900002AAFC487570004E944FEF000E6002D9
S31500001CA04216300748C0D08D5280284O600C0C1474
S31500001CB00020660418BC0030528C4A1466F060009E
S31500001CC000F248790002AB082F0D4EB900023F2AF8
S31500001CD010164A0067100C000002670A0C0000018B
S31500001CE06728600000CE4240102F00053F004240AA
S31500001CF0102F00083F0048790002AB0A2F0D4EB99D
S31500001D0000024D6048750800602242 40102F000610
S31500001D103F004240102F00073F0048790002AB12F7
S31500001D202F0D4EB900024D6048750800 4E944FEFD6
S31500001D300000C607E4240102F0001534048C0E588E9
S31500001D400680000263A420402F102F064EB9000023
S31500001D50240C4A40670848790002AB24600648799B
S31500001D600002AB2848790002AB1A2F0D4EB90002CB
S31500001D704D60487508004E944FEF001060344240A5
S31500001D80102F00033F004240102F00063F00424044
S31500001D90102F00093F004240102F000C3F00204F3B
S31500001DA03F2800104879 0002AB292F0D4E944FEFC3
S31500001DB000124FEF000E33C000A0000A4CDF7CC0BB
S31500001DC0205F4FEF000A4ED04E714E714E7133C0F8
S31500001DD000A0000C4FEFFFD80CAFEE6B2800002ED2
S31500001DE063082F7CEE6B2800002E4857204F2F28C3
S31500001DF00032204F3F2800346100FCBC48574EB9E2
S31500001E000022A6E588F4FEF002833C000A0000E44
S31500001E10205F5C8F4ED04E714E714E712F0D33C0C8

```
S31500001E2000A00010518F2A6F0010202D000A723C6E
S31500001E304EB9000257A81B4000022F01202D000AB0
S31500001E404EB900025BBC2F0043EF00084EB90002FA
S31500001E5036A81B6F0003000348780018204F2F2870
S31500001E60000843EF00084EB9000236A81B6F0003B6
S31500001E700004202F0004508F33C000A000122A5FF8
S31500001E80205F588F4ED04E714E714E7148E7070451
S31500001E9033C000A00014598F2A6F00183E2F001C73
S31500001EA0300702800000FFFF80FC00074840520018
S31500001EB01B400001524730070280000FFFF80FCF4
S31500001EC000B7E248064007C63B4000086004526D72
S31500001ED000083F2D00087000030072F4000024EB961
S31500001EE00001B8A62217B28062E4303CFFFFD06D35
S31500001EF000083F004EB90001B8A69E403F2D0008DD
S31500001F004EB90001B8DA3A003007EA481B4000062D
S31500001F106004522D00060C2D000D0006642A4A4569
S31500001F2066044246600E0C2D0002000654C04400B2
S31500001F3048803C004240102D00063F004EB900018B
S31500001F40B90AD046BE4062CA4A45660442066014D3
S31500001F504240102D000653400C4000025CC0440075
S31500001F6048803C004240102D000653403F001007B9
S31500001F701F4000054EB90001B90AD006912F000393
S31500001F801B6F00030005588F33C000A000164CDFFE
S31500001F9020E0205F5C8F4ED04E714E714E7148E747
S31500001FA0010433C000A000182A6F000C2F2D000A70
S31500001FB04EB90000240C1A80670806AD00000E100A
S31500001FC0000A2F0D6100FE562E003F072F0D6100FF
S31500001FD0FEBC4A15670804AD00000E10000A33C0A7
S31500001FE000A0001A4CDF2080205F588F4ED04E7123
S31500001FF04E714E7133C000A0001C518F3F3C000152
S3150000200043EF00024EB900007F5641D72F28000447
S315000020102F3900026DEC48790002AB584EB9000228
S315000020202A6E4FEF000C3F3C000143EF00024EB911
S3150000203000007F5641D72F103F3C00634EB9000089
S315000020401DCE4240508F33C000A0001E4E754E710B
S315000020504E714E7133C000A0002033C000A0002294
S315000020604E754E714E714E7133C000A00024202F64
S315000020700004226F000C206F0008600210D951C8BE
S31500002080FFFC04800001000064F233C000A00026BB
S31500002090205F4FEF000C4ED04E714E714E7133C023
S315000020A000A00028202F0004226F000C206F0008DB
S315000020B0600210D951C8FFFC04800001000064F2E0
S315000020C033C000A0002A205F4FEF000C4ED04E71A7
S315000020D04E714E7133C000A0002C202F0004226FD9
S315000020E0000C206F0008600230D951C8FFFC048044
S315000020F00001000064F233C000A0002E205F4FEF05
S31500002100000C4ED04E714E714E7133C000A000309F
S31500002110202F0004226F000C206F0008600230D9C7
S3150000212051C8FFFC04800001000064F233C000A027
S315000021300032205F4FEF000C4ED04E714E714E7143
S3150000214033C000A00034202F0004226F000C206F43
S315000021500008600220D951C8FFFC0480000100007D
S3150000216064F233C000A00036205F4FEF000C4ED063
S315000021704E714E714E7133C000A00038202F0004FE
S31500002180226F000C206F0008600220D951C8FFFCA6
S3150000219004800001000064F233C000A0003A205F12
S315000021A04FEF000C4ED04E714E714E7133C000A0F1
S315000021B0003C202F0004226F000C206F000812390B
S315000021C00008000084239008000008600220D951C80A
S315000021D0FFFC04800001000064F213C100800008C7
S315000021E033C000A0003E205F4FEF000C4ED04E7172
S315000021F04E714E7133C000A00040202F0004226FA4
S31500002200000C206F0008600420D920D951C8FFFABD
S3150000221004800001000064F033C000A00042205F8B
S315000022204FEF000C4ED04E714E714E7133C000A070
S315000022300044202F0004226F000C206F0008123982
S31500002240000800008423900800008600420D920D9A7
S3150000225051C8FFFA04800001000064F013C1008039
S3150000226000833C000A00046205F4FEF000C4ED0A0
S315000022704E714E714E7133C000A00048202F0008E9
S31500002280206F00046002421851C8FFFC0480000160
S31500002290000064F233C000A0004A205F508F4ED089
S315000022A04E714E714E7133C000A0004C202F0008B5
S315000022B0206F00046002421851C8FFFC0480000130
S315000022C0000064F233C000A0004E205F508F4ED055
S315000022D04E714E714E7133C000A00050202F000881
S315000022E0206F00046002425851C8FFFC04800001C0
S315000022F0000064F233C000A00052205F508F4ED021
S315000023004E714E714E7133C000A00054202F00084C
S31500002310206F00046002425851C8FFFC048000018F
S31500002320000064F233C000A00056205F508F4ED0EC
S315000023304E714E714E7133C000A00058202F000818
S31500002340206F00046002429851C8FFFC048000011F
S31500002350000064F233C000A0005A205F508F4ED0B8
S315000023604E714E714E7133C000A0005C202F0008E4
S31500002370206F00046002429851C8FFFC04800001EF
S31500002380000064F233C000A0005E205F508F4ED084
S315000023904E714E714E7133C000A00060202F0008B0
S315000023A0206F00046004429842985 1C8FFFA0480E6
S315000023B00001000064F033C000A00062205F508F6F
S315000023C04ED04E714E714E7133C000A00064202F66
S315000023D00008206F0004123900800008423900808E
S315000023E0000860044298429851C8FFFA0480000130
S315000023F0000064F013C10080000833C000A000662E
S31500002400205F508F4ED04E714E714E7133C000A07A
S315000024100006842412279 00C00574600C4A4157C0E9
S315000024204400488032005889 2011B0AF000465ECA2
S3150000243000133C000A0006A205F588F4ED04E7125
S315000024404E714E712F0633C000A0006C7C400839D7
S3150000245000 0300C0001266047200600422065 38165
S31500002460206F00082081200633C000A0006E2C1FBC
S31500002470205F5C8F4ED04E714E714E712F0D33C062
S315000024800 0A000702A6F00082F39000263D2487935
S3150000249000002AB752F0D4EB900022AA42F39000297
S315000024A0648048790002AB7E486D00204EB9000278
S315000024B02AA44FEF001833C000A000722A5F205FE5
S315000024C05C8F4ED04E714E714E7133C000A00074B9
S315000024D0226F00046022083900030 0C00012670C56
S315000024E053914A916C12703F2280600C52910C916C
S315000024F0000000406D024291307C00B8D1F900C066
S3150000250001062011538 0D080D1C03010720BE268D2
S315000025100240 00070C40000464BC20115380E5888B
S315000025200680 00026DE820404A9067AA33C000A0EA
S3150000253000076205F588F4ED04E714E714E7148E72F
S3150000254001 0433C000A00078518F2A6F00142E2F8B
S31500002550001 84A87664648790002AB872F0D4EB9A8
S3150000256000022AA448790002AB8D486D00204EB9BE
S3150000257000022AA44FEF0010486D00052F3900C055
S31500002580 00FA3F3C00544EB900001AB6486D0025CB
S3150000259002F3900C000FA3F3C0044605A303CFFFF30
S315000025A0D0473F0043EF00024EB900007F5641D7A7
S315000025B02F2800042007538 0E58806800 0026DE876
S315000025C020402F1048790002AB932F0D4EB9000220
S315000025D02AA44FEF0010303CFFFFD0473F0043EFE7
S315000025E00 0024EB900007F56486D002041EF0004FE
S315000025F02F103F3C00634EB900001AB6508F33C00F
S315000026000 0A0007A4CDF2080205F4FEF000A4ED0FA
S315000026104E714E714E7148E7033E33C000A0007CF8
S315000026204FEFFF7847EF008445EF00802C7C0002D7
S315000026302A6E4A3900C0A244670000D642472A7C67
S315000026400003170E600000BC4A3900C0A247670E9F
S31500002650300748C0223900C0A290B280670A4A39C2
S3150000266000C0A247660000983F072F0B2255205155
S315000026704E902C006700008848780040486F0004A0
S315000026804EB9000022763F07486F000222552069A6
S315000026900 0044E904293606024932F0A22552069CD
S315000026A000084E902012B093664C4857204F3F28A2
S315000026B0008A3F0748790002AC9A4E964878004057
S315000026C0486F00504EB9000022763F072F12486F20
S315000026D000522255 2069000C4E90486F004C4879F4
S315000026E0002ACAC4E96486F007448790002ACB854
S315000026F04E964FEF001C52932013B0866D9A588D5C
S3150000270052 47BBFC0003179E6500FF3E6000028235
S3150000271 04A3900C0A245675642472A7C0003170E75
S315000027206 0403F072F0B225520514E902C00672EFC
S31500002730487800 40486F00044EB9000022763F07F3
S31500002740486F00022255206900044E9048573F0604
S3150000275 03F0748790002ACC44E964FEF000C588DE7
S315000027605247BBFC0003179E65B8600002242A7C12
S31500002770 00C0057C287C00C0C8C24A3900C0A249F6
S31500002780670C288D23CD00C0C8C56000016C4A398D
S3150000279000C0A246670001964A3900C0A2476600FB
S315000027A000C02A5460000 0AC301548C0E58806 8099
S315000027B00003170E2840B9FC0003179E6400009220
S315000027C0B9FC0003170E650000883F152F0B225435
S315000027D020514E902E006778302D000248C026808A
S315000027E0B0876C6C3F15486F000222542069 0004C4
S315000027F04E9024932F0A2254206900084E902012EE
S31500002800B093664C4857204F3F28008A3F154879B9
S315000028100002ACD64E9648780040486F00504EB93C
S3150000282000022763F152F12486F005222542069 6D
S31500002830000C4E90486F004C48790002ACE84E966A
```

S31500002840486F007448790002ACF44E964FEF001CB6
S315000028505 88DBBF900C0C8C66500FF4E6000013246
S31500002860 4A3900C0A248670001282014B08D6708C5
S315000028702 88D23CD00C0C8C60CB900C005BC00C059
S3150000288 0C8C6640000A02A7900C0C8C63B7900C04B
S3150000289 0A29600023AB900C0A292301548C0E58857
S315000028A006800003170E2840B9FC0003179E646CCF
S315000028B0B9FC0003170E65643F152F0B22542051F7
S315000028C04E902E00674E302D000248C02680B087FD
S315000028D06C3A3F15486F0002225420690004 4E905E
S315000028E024932F0A2254206900084E902012B09398
S315000028F0561258B900C0C8C633FC012C00C00010CF
S3150000290060000008E48790002AD00604A48790002F6
S3150000291 0AD38604248790002AD70603A48790002ED
S3150000292 0AD8C603248790002ADB0602A4A3900C0E9
S3150000293 0A24A672C2F14203900C0C8C69094E480A0
S315000029403F003F3C002D4EB900007D7A4A40670C9F
S315000029504 8790002ADC44E96588F6034614A6030A3
S315000029604A3900C0A24B672B33FC000100C0000CA6
S3150000297060064EB90001BA6A2F3900026A4E4EB996
S31500002980 00000457E0C40FFFF67E8427900C0000C5E
S315000029904 2404FEF008833C000A0007E4CDF7CC071
S315000029A04E754E714E714E7133C000A00080598F26
S315000029B03F3C002D43EF00024EB900007F1E4A97B0
S315000029C067347010D09723C000C0C8C22057302883
S315000029D00002024003FF72003200E589E489E589BE
S315000029E0D2B900C0C8C223C100C0C8C633FC012C7E
S315000029F000C00010601423FC00026EE800C0C8C2CC
S31500002A0023FC00026EE800C0C8C6588F33C000A081
S31500002A1000824E754E714E714E7148E7003E33C0CE
S31500002A2000A000844FEFFFC02A7C00C00000287C75
S31500002A3000C00012267C00C00008247C0003170E8C
S31500002A402C7C00C0000E08140005660002E030145D
S31500002A50E848024000070C40000562000400D04030
S31500002A60303B00064EFB0002000C0060007600CCF6
S31500002A70010601C848780004 0486F00044EB90000BE
S31500002A8022764879 0002ADE948790002ADE0486F48
S31500002A9000084EB900022AA448790002AE0148791E
S31500002AA00002ADF8486F00344EB900022AA44FEF79
S31500002AB0001848574EB9000056DC0254FF8F08EC48
S31500002AC00000400016000039 60C5600806300038E2C
S31500002AD00254FF8F08EC000500016000082487870
S31500002AE00004 0486F00044EB9000022766 0025895F7
S31500002AF02015908AE4803F002F0B2C55225620513A
S31500002B004E9023C000C0001467E42015908AE4802C
S31500002B103F00486F00022455225220690004 4E905F
S31500002B2048574EB9000056DC0254FF8F005400305F
S31500002B306000032A0C5600806500032220 3900C07D
S31500002B40C8C6B0B900C0C8C2661A0254FF8F005486
S31500002B5000502F0B245522522069000 84E904256F1
S31500002B60600002FA0254FF8F08EC000600010C56C2
S31500002B70004065 0000BC303900C000100280000033
S31500002B80FFFF80FC000648404A40660000A420394A
S31500002B9000C0C8C6B0B900C0C8C26300009420799E
S31500002BA000C00004301048C0E588D08A2A80B08A68
S31500002BB065200C800003179E6418908AE4803F000D
S31500002BC02F0B2055225020514E9023C000C00014D8
S31500002BD066182A8A200A908AE4803F002F0B225228
S31500002BE020514E9023C000C00014207900C000047C
S31500002BF03028000248C02680B0B900C000146C041A
S31500002C004A806C0242932F0B2055225020690008FF
S31500002C104E9058B900C00004203900C00004B0B975
S31500002C2000C0C8C6650A23F900C0C8C200C00004B7
S31500002C300C56000363540814 0006674E4256427948
S31500002C4000C00010089400063014E0480240000757
S31500002C500C40000364260814000367125 3934A933A
S31500002C606C1A203900C0001453802680600E5293DF
S31500002C702013B0B900C000146D0242932F0B2855E3
S31500002C8022542069000 84E9060280C5600406500CA
S31500002C9001CC4256527900C00010303900C00010F5
S31500002CA053400C40012C630A6100025A4EB90000E1
S31500002CB057BA48780004 0486F00044EB900002276A3
S31500002CC02015908AE4803F002F13486F0006265592
S31500002CD022532069000C4E9048574EB9000056DC2E
S31500002CE04A7900C0000C670001743F3900C0000A31
S31500002CF02015908AE4803F0048790002AE114EB953
S31500002D0000022A6E486F000848790002AE1C4EB9D0
S31500002D1000022A6E486F003048790002AE284EB98C
S31500002D2000022A6E4FEF0018600001320C560003B5
S31500002D30633208140007672C4256427900C000101F
S31500002D4008940007 0254F8FF3014E84802400007D0
S31500002D500C40000466000106 0254FF8F0054005028
S31500002D60600000FA0C560080650000F24256 3014EE
S31500002D70E048024000070C400004641 63014E048A6
S31500002D8002400007524002400007E1480254F8FFA3
S31500002D9081543014E048024000070C4000026716D8
S31500002DA00C40000167100C400004675A0C400003F9
S31500002DB0677E600000A80814000357C044004880DE
S31500002DC002400001720BE3680894000381544878BE
S31500002DD00004 0486F00044EB90000227608140003 34
S31500002DE0670848790002AE3D600648790002AE45A4
S31500002DF048790002AE34486F00084EB900022AA492
S31500002E004FEF000C604E0B94000358950C95000394
S31500002E10179E65022A8A2015908AE4803F002F0BB0
S31500002E2028552254205 14E9023C000C0001467DA62
S31500002E3048780004 0486F00044EB900002276 2015FD
S31500002E40908AE4803F00486F000224552252206990
S31500002E5000044E9048574EB9000056DC4FEF004034
S31500002E6033C000A000864CDF7C004E754E714E715B
S31500002E704E7133C000A00088207C00C00012227C66
S31500002E8000C0000E3010E848024000070C40000465
S31500002E906404525160603039008 0400E0800000C16
S31500002EA057C0440048800240000 1720DE36802509A
S31500002EB0DFFF815008100005670E08100004660841
S31500002EC0425108D0000760160810000 5660E08106B
S31500002ED00004670842 5108D000066002525 13010C3
S31500002EE0720DE26802400001024000017 20CE368C4
S31500002EF008900004815033C000A0008A4E754E71C0
S31500002F004E714E7133C000A0008C4FEFFFBE3EB92C
S31500002F1000026484 33D700C00012427900C0000E5C
S31500002F2042B900C00008427900C0001023F900C071
S31500002F30C8C200C0000423FC0003170E00C0000036
S31500002F404EB90000564A48780004 0486F00064EB910
S31500002F500000227648 6F00024EB9000056DC4FEFA3
S31500002F6000 4233C000A0008E4E754E714E714E71F8
S31500002F7033C000A000904FEFFFC04EB90000564A84
S31500002F8048780004 0486F00044EB9000022764 87920
S31500002F900002AE5648790002AE4D486F00084EB9A1
S31500002FA00022AA448790002AE6C48790002AE639A
S31500002FB0486F00344EB900022AA44FEF0018485754
S31500002FC04EB9000056DC4FEF004033C000A000921F
S31500002FD04E754E714E714E7148E7003C33C000A0ED
S31500002FE00094287C00C0C8C2267C0002648630 3962
S31500002FF00080400E0800000E66482A7C00C00018BB
S3150000300000247C00C0C8C62014B08B6714288B24BC4F
S31500003010000264 8E33FC012C00C000104255602E65
S31500003020 0C55000A642852550C55000A6620248067
S315000030302 3C000C000043F3C000B4EB900007EF6E2
S3150000304060 0C2014B08B66064EB9000029A833C068
S315000030500 0A000964CDF3C004E754E714E714E71CD
S3150000306033C000A0009842403 3C000A0009A4E75BD
S3150000307 04E714E714E7148E70F3E33C000A0009C62
S3150000308059 8F4A3900C0A24E6600055C4A3900C015
S315000030 90A24F67163F3900C0A2B24EB90001C186E1
S31500003 0A04EB9000057E06000053E4A3900C0A25103
S31500003 0B06708610005486000052E267C00022A6E1E
S31500003 0C04A3900C0A252670002684879 0002B03649
S31500003 0D04E93588F4247287C00026EEC247C00C039
S31500003 0E017402C7C00C01844300748C0E5882A7475
S31500003 0F008003F0748790002B0934E935C8F424523
S31500003 1000C4700036C1048790002B09A4E93588F12
S31500003 1107A01600000820C4700036D0E0C47001C0C
S31500003 1206E0848790002B0A3600C0C47001F6616B3
S31500003 13048790002B0AC4E93588F2F0D4EB900005F
S31500003 1405E3E3A0060500C47001E661C487900023D
S31500003 150B0B54E93588F4EB900008CCA4A4057C03E
S31500003 160440048803A00602E0C47001D661C4879D2
S31500003 1700002B0BE4E93588F4EB900008C644A4090
S31500003 18057C0440048803A00600C48790002B0C736
S31500003 1904E93588F42453207524148C1E589203443
S31500003 1A01800320748C1E58990B418002F002F0D8A
S31500003 1B04A4567063F3C005960043F3C004E48794B
S31500003 1C00002B0D04E934FEF000E4A4567000154FF
S31500003 1D00C4700036C202F3900026FA82F3900001E
S31500003 1E0040048790002B0DF4E934FEF000C2F39F0
S31500003 1F00002628 2604A0C47001E661E2F39003CA0
S31500003 20063964878639E48790002B0F04E934FEF7C
S31500003 210000C2F39003C638E60260C47001D662E7D
S31500003 220207900C005702F102F39003A0020487908
S31500003 2300002B1014E934FEF000C2F39003A0024E3
S31500003 2403F3C00434EB900001DCE600000D60C473F
S31500003 250001F6626205230280002024003FF72003B

S315000032603200588191CD2008E480D280E589200182
S315000032702F0048790002B112603E0C6DFFFF00126C
S31500003280671270003O2D0012E5882F004879000281
S31500003290B11D602420563028000202400 3FF720050
S315000032A03200588191CD2008E480D280E589200142
S315000032B02F0048790002B1284E932F2D000C487933
S315000032C00002B1334E932F2D00083F3C00434EB908
S315000032D000001DCE2F2D000448790002B13A4E930E
S315000032E04FEF0018424638063 00648C0E58806808B
S315000032F000C013F420402A50200D67122E8D204F57
S315000033002F104EB900005EB2B047660252445246D4
S315000033100C4600406DD23F0448790002B1404E93FE
S315000033205C8F52470C4700206D00FDBE600002B85E
S315000033304A3900C0A244670002AE4A3900C0A2471B
S315000033340670470A0360264A3900C0A24867047A04F3
S3150000335060 1A4A3900C0A24967047A05600E4A39E4
S31500003360 00C0A24A67047A0660027A072A7C00C077
S31500003370A2844A3900C0A24566284A3900C0A2463E
S3150000338067083C3900C0A28E606E4A3900C0A24C64
S31500003390660 84A3900C0A24D67047C01605A7C2049
S315000033A06056287C00C0A288300557400C400004B7
S315000033B06246D040303B00064EFB0002000A001673
S315000033C000220016002E20149095E6802C0052460E
S315000033D0602620149095E4802C005246601A201432
S315000033E09095E2802C005246600E3C3900C0A28ABD
S315000033F09C7900C0A28652464A3900C0A24D660A90
S315000034004A3900C0A24C670000 8A4247287C00C0A7
S31500003410A2A8607630055740 0C400004626AD0408E
S315000034203 03B00064EFB0002000A00200040002E42
S3150000343000522F0C201572003207E789D0812F0029
S3150000344404EB900021DF66040205570003007E58831
S315000034500 1C020946032205570003007E588D1C075
S315000034600 20B900C0A2A46020205570003007D0808B
S315000034700 1C030B900C0A2A6600E2055700030073A
S315000034800 1C010B900C0A2A75247BE4665866000EB
S315000034900 1564247287C00C0A23C247C00C0A250B2
S315000034A06000013E0C9400000 1006C0606940000CA
S315000034B0010030055740 0C40000462000122D04054
S315000034C0303B00064EFB0002000A004A00B40080B2
S315000034D000E4201572003207E789D0812F00487971
S315000034E00002B1454E93205570003007E7B8D1C0E1
S315000034F02F2800042F104A12670848790002B14E9F
S3150000350060064879 0002B1524E934FEF00146000F6
S315000035100 00CE201572003207E589D0812F00487948
S315000035200002B1564E93508F205570003007E58843
S31500003530D1C02F104A12670848790002B15F603681
S315000035404879 0002B162602E7003C0076616201526
S31500003550 72003207E589D0812F0048790002B165F3
S315000035604E93508F205570003007E588D1C02F103C
S315000035704879 0002B16E4E93508F60627007C007A3
S315000035806616201 5720 03207D281D0812F00487945
S315000035900002B1754E93508F205570003007D080D1
S315000035A0D1C03F1048790002B17E602E700FC0076F
S315000035B06614201572003207D0812F004879000268
S315000035C0B1844E93508F205570003007D1C04240D1
S315000035D010103F0048790002B1 3D4E935C8F524720
S315000035E0BE466500FEC04240588F33C000A0009E14
S315000035F04CDF7CF04E754E714E714E7148E7073CBC
S315000036 0033C000A000A0247C008040081A1214BC1D
S3150000361 0008042461C3900C0A3843F3C00214EB9BD
S315000036200 0007EF64EB9000099F84EB90001BA24A2
S315000036304EB90001BAA04EB900008C64203C00E0EF
S315000036400 00044800680 00E00158E4802F0048799D
S31500003650 00E000004EB90000233642472A7C008075
S3150000366040142 67C00022A6E287C00026F7408151E
S315000036700 0066 70C08D5000613FC00EA008040151A
S315000036800300748C0D0803F3408004879 0002B19323
S315000036904E935C8F300748C0D0803F3408004EB947
S315000036A00001C18652470C47001A6DC242B900E0BC
S315000036B0000 0042B900C000FA2A7C0000040C287CF5
S315000036C00000A22660082F0D4E94205D4E90BBFC94
S315000036D00000041065F048790002B1AC4E93588F93
S315000036E02A7C0000041060082F0D4E94205D4E9039
S315000036F0BBFC0000042865F048790002B1C24E9375
S3150000370 0588F2A7C0000042860082F0D4E94205DF7
S315000037104E90BBFC0000043465F048790002B1D33A
S315000037204E93588F2A7C0000043460082F0D4E9467
S3150000373 0205D4E90BBFC0000043465F02A7C00003E
S315000037400043460082F0D4E94205D4E90BBFC0000A3
S31500003750047865F02A7C0000047860082F0D4E94EA
S31500003760205D4E90BBFC0000047865F02A7C0000CA
S3150000377004786008 2F0D4E94205D4E90BBFC00002F
S315000037800047C65F02A7C0000047C60082F0D4E94B2
S3150000379 0205D4E90BBFC000004A065F02A7C000072
S315000037A004B460082F0D4E94205D4E90BBFC0000C3
S315000037B004BC65F013C600C0A38448790002B1E6D4
S315000037C04E93588F148533C000A000A24CDF3CE016
S315000037D04E754E714E714E7133C000A000A4518FCC
S315000037E03F3C000B43EF00024EB900007F5641D725
S315000037F02F2800042F3900026E1448790002B20FF8
S31500003800 4EB900022A6E4FEF000C3F3C000B43EF0F
S31500003810 00024EB900007F5641D72F103F3C00638F
S315000038204EB900001DCE4240508F33C000A000A606
S315000038304E754E714E714E7133C000A000A82039EE
S315000038400 0C000FA90B900E000040C80009E34002D
S31500003850 6F0A3F3C000B4EB900007EF633C000A055
S31500003860 00AA4E754E714E714E7148E7031C33C067
S3150000387000A000AC598F2A7C00C000FA2E154A39E8
S315000038800 00C0A246670A13F900C0A28F00E0000834
S3150000389 0287C00022A6E4A3900C0A244670000E66E
S315000038A04A3900C0A245670E2E3900C0A284DEB98F
S315000038B000C0A28860182E3900C0A284DE952015AB
S315000038C0223C000151804EB9000257A89E804A3919
S315000038D00 0C0A2476720487900026634487900C0D4
S315000038E0A290486F00084EB900021FAE48574EB965
S315000038F0000024D3ADE800C870F0C3F00657E0C8778
S31500003900EE6B2B006276BE956466267C00C017685A
S315000039104A9367324A9366047C00600620532C283B
S31500003920000820159086 0C800001518064180C391F
S31500003930000600C0A384640E48790002B2AF4E941C
S315000039405 88F7E00602A48784B0048790002B2E919
S315000039504EB90001 74243C000C46005967120C460F
S3150000396000 79670C7E0048790002B34F4E94588F59
S315000039704A87674423C700C000F6603C48790002C6
S3150000398 0B363603048790002B37B4E942F073F3C07
S31500003990 00434EB900001DCE48790002B37E4E9416
S315000039A0508F2F073F3C005A4EB900001DCE487974
S315000039B00002B3804E94588F4240588F33C000A007
S315000039C000AE4CDF38C04E754E714E714E7148E7F1
S315000039D0030433C000A000B02A6F001042474A39E2
S315000039E000C0A245672848790 0C0001A204F3F282A
S315000039F000184EB90000900A1C00487900C0006CFF
S31500003A002F0D487800804EB90000206860262F0DE3
S31500003A10487900C0006C487800804EB900002068E4
S31500003A20487900C0001A204F3F2800184EB9000000
S31500003A3091E81C0010064A0067140C000002670E8D
S31500003A400C000005670C0C0000046706600642478 0
S31500003A5060027E01300733C000A000B24CDF20C0F8
S31500003A60205F5C8F4ED04E714E714E7148E70F3E0F
S31500003A7033C000A000B44FEFFEF6227C000269506E
S31500003A8041D7703920D951C8FFFC48574EB90001BB
S31500003A90ACC623FC000039CE00C0A28C23FC00007B
S31500003AA039CE00C0A288227C0002689241EF00E86D
S31500003AB0700620D951C8FFFC30914A3900C0A25681
S31500003AC0670608EF000400E847EF00EA4A3900C03D
S31500003AD0A2516600008A4A3900C0A2556704001345
S31500003AE0004E4A3900C0A26567782A7900C0A3084B
S31500003AF06066101 50C0000446726 0C000054672809
S31500003B000C000065672A0C000053672C0C0000505F
S31500003B10672E0C00007067300C000073673260364 9
S31500003B2008EF000000EA602E08EF000100EA6026B8
S31500003B3008EF000200EA601E08EF000300EA6016C4
S31500003B4008EF000400EA600E08EF000500EA6006D0
S31500003B5008EF000600EA528D4A1566966004001 3C7
S31500003B6000FF4DEF00EB4A3900C0A252670000B0DB
S31500003B704A2F00EA660608EF000200E8103C00FF44
S31500003B80D03900C0A2BF1F4000EB4A3900C0A25482
S31500003B90672610 3900C0A2C7D02F00EB53001F4084
S31500003BA000EC08EF000200E80C2F003F00EC630C6D
S31500003BB01F7C003F00EC60041F4000EC4A3900C047
S31500003BC0A25E674E08EF000700E82F7900C0A2EC5E
S31500003BD000EE4A3900C0A26467082F7900C0A3042A
S31500003BE000F24A3900C0A25F670A2F7900C0A2F02E
S31500003BF000F660324A3900C0A261661A4A3900C02E
S31500003C00A25166122F6F00EE00F608EF000100E8E1
S31500003C10601442AF00EE70FF2F4000F660084216B7
S31500003C201F7C004000EC4A3900C0A261670608EF1D
S31500003C30000500E84A3900C0A263670608EF0003E2
S31500003C4000 0E84A3900C0A262670608EF000600E8ED
S31500003C504A3900C0A2646710082F000700E866080A
S31500003C602F7900C0A30401024240102F00EC42410C
S31500003C70122F00EB904155400C4000025DC04400FD

S31500003C8048803A002E3C000151804A3900C0A24EBD
S31500003C90672C203900C0A2AC22074EB900025BBCDB
S31500003CA04EB90002625E2F4000FA4A3900C0A257A0
S31500003CB06710203900C0A2D0D1AF00FA600442AF2D
S31500003CC000FA49EF00FE4A3900C0A24F67282039A2
S31500003CD000C0A2B022074EB900025BBC4EB900027A
S31500003CE0625E28804A3900C0A258670E203900C09B
S31500003CF0A2D4D194600470FF2880247C00C0001AEE
S31500003D004A3900C0A246660E486F00E8224A4EB9FC
S31500003D1000008D086012227C0002687E204A703303
S31500003D2020D951C8FFFC30914A3900C0A24567141A
S31500003D3043EF00E8207C00C0002E700620D951C851
S31500003D40FFFC30914A3900C0A245670678FD600045
S31500003D5005384A3900C0A246670678FE6000052A83
S31500003D6042442A7C00022A6E4A3900C0A25C660AD6
S31500003D704A3900C0A2596700023E4A2F00EA660689
S31500003D801F7C00FF00EA42461C2F00EB287C00C087
S31500003D900106247C00C005BC6000020C3E06307C97
S31500003DA000B8D1D470003007D080D1C03010720B6B
S31500003DB0E268024000074241123900C0A384B041C4
S31500003DC0620001E270003007E588068000026DE8B7
S31500003DD020404A90670001CE70003007068000033D
S31500003DE01BF42040424010104241122F00EAC0410D
S31500003DF0670001B24A3900C0A25C670000CE4240AB
S31500003E00102F00EBBE40660A48790002B7E14E95D6
S31500003E10588F307C00B8D1D470003007D080D1C024
S31500003E203010E248024003FF3F00307C00B8D1D496
S31500003E3070003007D080D1C008280000001670656
S31500003E403F3C005960043F3C004E307C00B8D1D462
S31500003E5072003207D281D1C130100800000E670609
S31500003E603F3C004E60043F3C0059307C00B8D1D442
S31500003E7072003207D281D1C130100800000F6706E8
S31500003E803F3C005960043F3C004E307C00B8D1D422
S31500003E9070003007D080D1C03010720BE26802404B
S31500003EA000073F0070003007E588068000026DE8D5
S31500003EB020402F10300752403F0048790002B834A6
S31500003EC04E954FEF0014600000D64240102F00EBD5
S31500003ED0BC4066560CB9000000100C0A294664AB8
S31500003EE0485748790002B86A4E95508F4A45662869
S31500003EF048790002B86F4E95588F602E70003006D4
S31500003F00E588068000026DE820402F1048790002FF
S31500003F10B89B4E95508F52464240102F00ECBC4045
S31500003F2065DA42461C2F00EB3E064A45670A4240C8
S31500003F30102F00EBBC40660E486F007848790002EF
S31500003F40B8A04E95508F4A45662270003007E58826
S31500003F5068000026DE820402F10300652403F00D8
S31500003F6048790002B8A54E954FEF000A7000300759
S31500003F70E7882F32080448790002B8AF4E957000E2
S31500003F803007E7882F3208003F3C00634EB9000037
S31500003F901DCE48790002B8B74E954FEF000C3F078B
S31500003FA0610002FE5246424 0102F00ECBC40630006
S31500003FB0FDEC600002D44A2F00EA663A4A3900C096
S31500003FC0A25666324A3900C0A25E662A4A3900C045
S31500003FD0A25266224A3900C0A25D661A4A3900C05A
S31500003FE0A25A66124A3900C0A25B660A4A3900C064
S31500003FF0A260670002944A3900C0A26067000154BB
S315000040000082F000700E8670848790002B8B960067B
S3150000401048790002B8D94E95082F000200EC6708CF
S3150000402048790002B8F7600648790002B9284E952B
S31500004030508F082F000600E8670A48790002B95831
S3150000404004E95588F082F000500E8670A4879000248
S31500004050B96B4E95588F082F000400E867084879 19
S3150000406000002B98F600648790002B997487900 02C4
S31500004070B9854E954240102F00F352403F004879D3
S31500004080000 2B9A74E954240102F00FA52403F0059
S3150000409048790002B9CD4E95204F2F280102487964
S315000040A00002B9F34E95204F2F28011248790002DD
S315000040B0BA1A4E9548790002BA414E95204F2F28DC
S315000040C001223F3C00634EB900001DCE4879000234
S315000040D0BA5D4E954FEF002C204F2F2800FE3F3C37
S315000040E000634EB900001DCE4AAF01026712204F91
S315000040F02F28010248790002BA794E95508F600A3E
S3150000410048790002BA9D4E95588F48790002BABB8D
S315000041104E952F1248790002BABE4E952F3900C02F
S315000041200001E48790002BAE64E95203900C00026E6
S31500004130E5882F0048790002BB0E4E952F3900C046
S31500004140002A48790002BB364E954FEF00246000E6
S3150000415001384 9EF0106289 26000011E4A9466065E
S31500004160 3E3CFFFF60102054302800027 20AE268CD
S31500004170 0240003F3E00486F00E82F144EB9000091
S3150000418 08EDC1C000C0000267104A00670C0C0055
S315000041900004670000D8600000D620542F280004D1
S315000041A02F28000C70003007E588068000026DE8B5
S315000041B020402F10300752403F0048790002BB5E76
S315000041C04E954FEF001220542F2800083F3C004325
S315000041D04EB900001DCE4A3900C0A25D672E20549C
S315000041E030280002024003FF5840E54B3F002F14E4
S315000041F04EB900005EB23F002F1448790002BB772B
S315000042004E954FEF000C3F07610000962054302872
S315000042100002024003FF4A40634E4A3900C0A25BD7
S3150000422067464A3900C0A25A663E4247602C70076C
S31500004230C007660A48790002BB874E95588F307CC6
S315000042400010D1D470003007E588D1C02F1048790E
S315000042500002BB8A4E95508F5247205430280002E8
S31500004260024003FFBE4065C64A06670242942F1409
S315000042700224C4EB9000076084A94670C20540C680C
S31500004280FFFF00026600FED630044FEF010A33C07E
S31500004290000A000B64CDF7CF04E754E714E714E712B
S315000042A02F0733C000A000B87E01302F000848C099
S315000042B0068000031BF4204042401010C0470C400B
S315000042C0000167260C40000267280C400004672A9C
S315000042D00C400008672C0C400010672E0C40002094
S315000042E067300C4000406732603E48790002BB915F
S315000042F0602E48790002BB93602648790002BB9580
S31500004300601E48790002BB97601648790002BB9987
S31500004310600E48790002BB9B600648790002BB9D8F
S315000043204EB900022A6E588FDE476600FF7E33C004
S3150000433000A000BA2E1F205F548F4ED04E714E71D2
S315000043404E7133C000A000BC23FC00000A0000C070
S3150000435 0A23C4A3900C0A384672A48790002BBA060
S31500004360 4EB900022A6E2F3900C000FA3F3C0043C6
S315000043704EB900001DCE48790002BBB14EB900020D
S31500004380 2A6E508F4EB90001BA6A4EB90001BA6A58
S315000043904EB90001BA6A70FF33C000A000BE4E7568
S315000043A04E714E714E7133C000A000C023F9000259
S315000043B06A4A00804018203900C0A38C0C80000196
S315000043C0000064480C402580670E0C404B00671ABD
S315000043D00C40960067266034023900F800804018C9
S315000043E000390003008040186022023900F800807E
S315000043F0401808F90001008040186010023900F8E2
S31500004400000080401808F9000000804018223C00E0B7
S3150000441000004441203C00E00158D04133C00080F8
S315000044204050203C00E00357D04133C0008040524A
S31500004430203C00E00358D04133C000804054203C6B
S3150000444000E003F7D04133C00080405633C000A0DF
S3150000445000C24E754E714E714E7148E7033E33C031
S3150000446000A000C42A7C00C0A386247C0080405C97
S315000044703C2F00204A15630000A80C46000A66007F
S3150000448000A0287C00C0A38752141014B015650044
S315000044900090103C00FED01518802A7C00026A5A53
S315000044A0267C00026A522C7C0000445A600A2F13B4
S315000044B0101D48803F004E964A1566F2424730125C
S315000044C00800000D67084EB90001BA6A602010396D
S315000044D00080405A0C00000367080C000020670AA1
S315000044E060144EB90001BA8E600C4214600852473F
S315000044F00C470F006DC82F133F3C000D4E964247E8
S315000045002F133F3C00204E9652470C47003C6DF05F
S315000045102F133F3C000D4E96604C4EB90001BA6A0F
S3150000452030120800000C66F2203900C0A24090B993
S3150000453000C0A23C7240B0816F064EB90001BA6A53
S315000045404A3900C0184E661830120800000D661071
S315000045500C3900030080405A66064EB90001BA8E37
S3150000456013C600804058300633C000A000C64CDF9A
S315000045707CC0205F5C8F4ED04E714E714E7148E705
S31500004580010C33C000A000C8610001F8287C00C0FF
S31500004590A39010140C000002630242142A7C0080CF
S315000045A0401A42401014321502410003B04167160A
S315000045B00255FFEF42401014024000030255FFFC73
S315000045C0815500550010103900C0A3910C0000075A
S315000045D067080C0000086720601630150800000205
S315000045E0662A0255FFEF0055000400550010601CB6
S315000045F013FC000800C0A391301508000002670CE8
S315000046000255FFEF0255FFFB0055001030390080C0
S31500004610405C0800000D670670FF600001501E39FF
S315000046200080405A0839000000C0A392670E4A393C
S3150000463000C0A384630613C70080405808390000F1
S3150000464000C0A393665230150800000C661E301594
S315000046500800000D66160807000767384A3900C0CB
S31500004660A38A6708602E1E390080405A30390080C0
S31500004670405C0800000D67EE287C00C0A38C0C94FB
S3150000468000009600660828BC0000258060062014FD
S31500004690D0802880610000EC08070007670E4A39C1

S315000046A000C0A38A660670FC600000C230150800D0
S315000046B0000D67380255EFFF3015720CE2680240B4
S315000046C0000102400001720DE3680255DFFF8155CB
S315000046D03015E2680240000102400001720BE368F7
S315000046E00255F7FF815570FE600000823015080004
S315000046F0000C67360255EFFF3015720CE268024077
S31500004700000102400001720DE3680255DFFF81558A
S315000047103015E2680240000102400001720BE368B6
S315000047200255F7FF815570F9604230150800000BFD
S3150000473067360255EFFF3015720CE2680240000141
S3150000474002400001720DE3680255DFFF8155301506
S31500004750E2680240000102400001720BE368025564
S31500004760F7FF815570FA60044240100733C000A07D
S3150000477000CA4CDF3080205F588F4ED04E714E718C
S315000047804E7133C000A000CC207C00804018227CF3
S315000047900080401A203900C0A38C0C800001000064
S315000047A064320C402580670E0C404B0067300C408D
S315000047B096006748601E1010020000070C000003F8
S315000047C067580251FFEF021000F800100003005175
S315000047D00010604623FC00004B0000C0A38C1010A4
S315000047E0020000070C00000267300251FFEF0210C2
S315000047F000F808D0000100510010601E021000F8F9
S3150000480008D000007007C01067100251FFEF0210B9
S3150000481000F808D000000051001033C000A000CE00
S315000048204E754E714E714E7148E7011C33C000A0A3
S3150000483000D04FEFFFEC4BEF00047E022EAF002CB2
S31500004840286F0028267C00C0A4680C94FFFFFFFF99
S315000048506624426D000E2A8C41D72B4800082B4C4B
S3150000486000043B47000C2F0D4EB900C0C9D6424785
S315000048701E008F13600608D300027E0430074FEF38
S31500004880001433C000A000D24CDF3880205F508F68
S315000048904ED04E714E714E7148E7011C33C000A0D8
S315000048A000D44FEFFFF0286F00244BD77E02267C02
S315000048B000C0A4680C94FFFFFFFF6626426D000E41
S315000048C02A8C41EF00282B4800082B4C00043B475C
S315000048D0000C2F0D4EB900C0C9D642471E008F13DB
S315000048E0600608D300027E0430074FEF001033C085
S315000048F000A000D64CDF3880205F508F4ED04E711E
S315000049004E714E7148E7073C33C000A000D84FEF08
S31500004910FFF0266F00304BD77A044246284B3E06FE
S31500004920247C00C0A468600E0C54FFFF670608D202
S3150000493000027E045246BC456C044A4767EA4A4771
S315000049406624426D000E2A8B41EF00342B48000886
S315000049502B4B00043B45000C2F0D4EB900C0C9D6A9
S3150000496042471E008F1230074FEF001033C000A0E1
S3150000497000DA4CDF3CE0205F4FEF000C4ED04E716A
S315000049804E714E7148E7033C33C000A000DC4FEF88
S31500004990FFF0266F002C4BD74246284B3E06247C60
S315000049A000C0A46860100C54FFFF670608D200021E
S315000049B07E045246548CBC6F00346C044A4767E64A
S315000049C04A476624426D000E2A8B2B6F0030000882
S315000049D02B4B00043B6F0034000C2F0D4EB900C06A
S315000049E0C9D642471E008F1230074FEF001033C062
S315000049F000A000DE4CDF3CC0205F4FEF000A4ED027
S31500004A004E714E714E7148E7033C33C000A000E082
S31500004A104FEFFFF0266F002C4BD74246284B3E0641
S31500004A20247C00C0A46860100C54FFFF670608D2FF
S31500004A3000027E045246548C300648C0322F0034A1
S31500004A4048C1D281B08164044A4767DC4A47662878
S31500004A50426D000E2A8B2B6F003000082B4B000492
S31500004A60302F0034D0403B40000C2F0D4EB900C013
S31500004A70C9D642471E008F1230074FEF001033C0D1
S31500004A8000A000E24CDF3CC0205F4FEF000A4ED092
S31500004A904E714E714E7133C000A000E44A3900C019
S31500004AA0A24467084EB900009980600C23F9000201
S31500004AB06AB800B0400860FE424033C000A000E6AD
S31500004AC04E754E714E714E7148E7003E33C000A0E0
S31500004AD000E84FEFFFEA2A7C00C0C920287C00C00E
S31500004AE098562015B08C670C2240204C700720D9B0
S31500004AF051C8FFFC267C00C098584A3900C0A24F16
S31500004B0067202A8C7003C07900C0A2B2E74802531E
S31500004B10FFE781533013E6480240000313C000C08C
S31500004B20A43C4A3900C0A25067162A8C303900C00E
S31500004B30A2B602400001E54808AB0002000181531D
S31500004B404A3900C0A24B67122A8C7003C07900C094
S31500004B50A2A2EB480253FF9F81534A3900C0A24CE0
S31500004B6067162A8C303900C0A2A602400001EF4821
S31500004B7008AB0007000181534A3900C0A2446716FA
S31500004B802A8C303900C0A28602400001720FE36809
S31500004B900893000781534A3900C0A24567162A8C3C
S31500004BA0303900C0A28A02400001720EE368089301
S31500004BB0000681534A3900C0A25467162A8C02396E
S31500004BC0000000C0985A103900C0A2C7813900C041
S31500004BD0985A2C7C00C0C9024A3900C0A24D6758B9
S31500004BE02A8C2016486F00124EB9000242244879DA
S31500004BF000026BF6487900C0A2A8486F00164EB9AD
S31500004C00000021F5A487900026BF2486F0012486F83
S31500004C1000124EB900021FC4486F0012486F000E02
S31500004C20486F000E4EB900021FAE486F00064EB91F
S31500004C3000024D3AE88838804A3900C0A249670424
S31500004C40610003CC4A3900C0A24767046100035AD9
S31500004C504A3900C0A2486712610003B42255204CAD
S31500004C60700720D951C8FFFC2A8C247C00022A6ECA
S31500004C704A3900C0A24667262015B08C6616610028
S31500004C8003664A40670848790002BEA6600C6100C8
S31500004C90037E600A48790002BEB74E92588F4A39A1
S31500004CA000C0A24A670001A00C95000016F4660831
S31500004CB048790002BEFE60142015B08C660848795B
S31500004CC00002BF066006487900 02BF0F487900025D
S31500004CD0BED64E9248790002BF154E922055102836
S31500004CE00004424112003001 3F0008280002000380
S31500004CF0670848790002BF9D600648790002BFA197
S31500004D0020553028 0002E64802400003 3F003028C4
S31500004D10 0002EA48024000037201E16930013F00E7
S31500004D200828000700036708487900 02BF8F60065D
S31500004D3048790002BF942016486F002C4EB9000235
S31500004D4004224205530 10E948486F002602800000B2
S31500004D50FFFF4EB900024224487900026BF2486F09
S31500004D600002A486F002A4EB900021FAE486F002C79
S31500004D70486F0026486F00264EB900021FC44879C6
S31500004D8000026BFA486F0022486F00224EB90002FB
S31500004D901F5A204F2F28001A20553028000208 00DD
S31500004DA0000E670848790002BF886006487900024D
S31500004DB0BF8C20553028000208 00000F670848798C
S31500004DC00002BF816006487900 02BF85487900026B
S31500004DD0BF4D4E9248790002BFA44E924FEF002E6F
S31500004DE020553028000208 00000C670848790002A8
S31500004DF0BFB3600648790002BFBB4E924879 0002F5
S31500004E00BFC44E92508F20550828000100036708 42
S31500004E1048790002BFD6600648790002BFDE4E928E
S31500004E2048790002BFE74E92508F205508280000AF
S31500004E3000036708487900 02BFF26006487900025D
S31500004E40BFFC4E92588F4A3900C0A24E670000EA56
S31500004E502016486F00124EB900024224303900C0B5
S31500004E600982A907900C09826486F000C02800000AE
S31500004E70FFFF4EB900024224487900026BF2486FE8
S31500004E800010486F00104EB900021FAE486F0012A6
S31500004E90486F000C486F000C4EB900021FC44879D9
S31500004EA000026BFA486F0008486F00084EB900020E
S31500004EB01F5A204F2F1048790002C0084E92201624
S31500004EC0486F001A4EB900024224303900C09832A9
S31500004ED0123900C09827440158 01E368486F00144E
S31500004EE0028 00000FFFF4EB900024224487900020A
S31500004EF06BF2486F0018486F00184EB900021FAEDB
S31500004F00486F001A486F0014486F00144EB900022B
S31500004F101FC4487900026BFA486F0010486F0010F2
S31500004F204EB900021F5A204F2F280008487900 0268
S31500004F30C0224E924FEF00104A3900C0A2516716A8
S31500004F402A8C303900C0A2BA02400001720CE36814
S31500004F5008930004 81534A3900C0A25267162A8C6E
S31500004F60303900C0A2BE02400001D04008AB0001AB
S31500004F70000181534A3900C0A25367142A8C303984
S31500004F80 00C0A2C2024000010 8AB00000000181532C
S31500004F9042404FEF001633C000A000EA4CDF7C0011
S31500004FA04E754E714E714E7133C000A000EC0CB9B7
S31500004FB0000016F400C0C920671E227C000016F40B
S31500004FC0207C00C0985670 0720D951C8FFFC23FCEE
S31500004FD000C0985600C0C92033C000A000EE4E7530
S31500004FE04E714E714E7133C000A000F02F3900C0D3
S31500004FF0C9203F3C00083F3C002F4EB900007D7A97
S31500005000033C000A000F24E754E714E714E712F0DD9
S31500005010033C000A000F44FEFFFF03F3C002F43EFFA
S315000050200000E4EB900007F1E4AAF000C676070107C
S315000050300D0AF000C2A40700030152F4000042039F4
S3150000504000C0C902486F00084EB90002422448 79E0
S315000050500 00026BFE486F000C486F00084EB9000254
S31500005060 1FAE48574EB900024D3AE888222F000479
S315000050700B280641A206F000C302800020240 03FF41
S31500005080 0C40000866082 3CD00C0C920600A23FC36
S315000050900000016F400C0C9204FEF001033C000A076
S315000050A000F62A5F4E754E714E714E7148E73F3ECF
S315000050B033C000A000F84FEFFFF6A76034247287C12

S315000050C000022A6E3C0748C641EF00482006D08001
S315000050D0D086E588D1C0300748C0E588D1C020BC5D
S315000050E03F8000003C0748C641EF006C2006D08098
S315000050F0D086E588D1C0300748C0E588D1C020BC3D
S315000051003F800000424638074 8C43A0748C5605009
S31500005110300 7D0463207E5490415 04041EF002420
S315000051202204D281D284E589D1C1320648C1E589FB
S31500005130D1C12F0848C04EB90002420441EF0024F5
S31500005140 2005D080D085E588D1C0300648C0E588E6
S315000051 50D1C02F1048790002C0424E94508F52465B
S31500005160BC436DAC48790002C0474E94588F5247F5
S31500005170BE436D00FF5048790002C0494E944879FD
S31500005180 0002C04B4E94508F42464BEF002047EF33
S315000051 90001C45EF00144DEF0010600002947 8FFEC
S315000051A03E0660403A0748C541EF00242005D080FE
S315000051B0D085E588D1C0300648C0E588D1C02F101B
S315000051C043EF001C4EB9000249BC487900026C024C
S315000051D0486F001C4EB900021FF24A406F043807A0
S315000051E060065247BE436DBC4A446C1048790002C3
S315000051F0C04D4E94588F70016000043AB84667005F
S31500005200 00F64245300648C02F400018300648C018
S31500005210 2F400014300448C02F400010300448C00E
S31500005220 2F40000C300648C02F400008300648C00A
S31500005230 2F400004300448C02E80340448C2600069
S31500005240 00B0300548C0E5882E0041EF0024202F2D
S31500005250 0018D080D0AF0018E588D1C02AB07800F9
S31500005260 43EF0024202F0010D080D0AF0010E58837
S31500005270D3C041EF0024202F0014D080D0AF0014FB
S31500005280E588D1C021B17800780041EF0024202FB5
S31500005290 00CD080D0AF000CE588D1C021957800F5
S315000052A041EF0048202F0008D080D0AF0008E588E5
S315000052B0D1C02AB0780043EF00482017D080D0979D
S315000052C0E588D3C041EF0048202F0004D080D0AF3E
S315000052D00004E588D1C021B17800780041EF00488C
S315000052E02002D080D082E588D1C021957800524531
S315000052F0BA436D00FF4E3A065245300648C02F406D
S31500005300 0018300648C02F40000C300648C02F4019
S31500005310 000460000 1143E0548C741EF0024200840
S31500005320222F0018D281D2AF0018E589D08132062B
S315000053304 8C1E589D0812F0041EF00282007D080A1
S31500005340D087E588D1C0300648C0E588D1C02F088F
S31500005350 2F0B4EB900021FC44244300548C02480BA
S315000053603 00548C02C80300548C02F400008340561
S31500005370 48C2600000AC300448C0E5882E0041EF0A
S31500005380 0024202F000CD080D0AF000CE588D1C0BF
S3150000539048 7078002F0B486F00084EB900021FAE08
S315000053A0485741EF00282016D080D096E588D1C016
S315000053B04 870780041EF002C2012D080D092E5880A
S315000053C0D1C0487078004EB900021F8241EF0048F4
S315000053D0202F0004D080D0AF0004E588D1C04870EB
S315000053E078002F0B486F00084EB900021FAE4857D1
S315000053F041EF004C2002D080D082E588D1C0D1C7D1
S315000054002F0841EF0050202F0010D080D0AF0010A1
S31500005410E588D1C0487078004EB900021F82524418
S31500005420B8436D00FF525245BA436D00FEEA52463C
S315000054303003534 0BC406D00FD663E03534748C7EA
S3150000544041EF00242007D080D087E588D1C0300303
S31500005450534048C0E588D1C02F1043EF001C4EB919
S31500005460000249BC487900026C02486F001C4EB924
S3150000547000021FF24A406C1048790002C0614E9447
S31500005480588F7002600001AE424547EF009030032E
S3150000549053404 8C026802F4000182F4000142F404C
S315000054A0001070FED0433F4000946000013C41EF85
S315000054B000242008222F0010D281D2AF0010E589E7
S315000054C0D0812213E589D0812F0041EF004C2008BE
S315000054D0222F0018D281D2AF0018E589D08132057B
S315000054E048C1E589D0812F0041EF00742008222FA2
S315000054F00020D281D2AF0020E589D081320548C193
S315000055 00E589D0812F004EB900021FC43E2F0094BA
S315000055106 00000CE2ABC000000003C07524634075B
S315000055 2048C2604C380648C441EF006C2004D08065
S31500005530D084E588D1C0300548C0E588D1C02F08A1
S31500005540 41EF00282002D080D082E588D1C0300605
S31500005550 48C0E588D1C02F08486F00144EB9000234
S31500005560 1FAE486F000C2F0D4EB900021CD65246D6
S31500005570BC436DB0340748C2380748C43C0748C628
S31500005580 2F0D41EF004C2004D080D084E588D1C097
S3150000559030 0548C0E588D1C02F08486F00144EB9C1
S315000055A000021F8241EF00242006D080D086E588C5
S315000055B0D1C0300748C0E588D1C02F08486F001019
S315000055C041EF00742002D080D082E588D1C030053A
S315000055D048C0E588D1C02F084EB900021FC4534702
S315000055E04A476C00FF305245BA436D00FEC2424541
S315000055F0603C42473C0548C6602441EF006C2006EB
S31500005600D080D086E588D1C0300748C0E588D1C0B3
S315000056102F1048790002C0764E94508F5247BE43F1
S315000056206DD848790002C07B4E94588F5245BA43D4
S315000056306DC042404FEF009633C000A000FA4CDF29
S315000056407CFC4E754E714E714E7133C000A000FC4D
S31500005650227C0080410013FC000200804060323C46
S315000056600FE5F300151C9FFFC12BC0038323C018B91
S3150000567030015 1C9FFFC12BC0038323C008D3001AC
S31500005680 51C9FFFC12BC00387238300151C9FFFC09
S3150000569012BC003872703 00151C9FFFC12BC000800
S315000056A07238300151C9FFFC12BC0001323C09229C
S315000056B0300151C9FFFC12BC00067238300151C9D5
S315000056C0FFFC12BC000C7238300151C9FFFC33C01C
S315000056D000A000FE4E754E714E714E7148E70514DE
S315000056E033C000A00100226F0014207C008041021C
S315000056F0267C0080410016BC008072383E0151C9EC
S31500005700FFFC2A497210600A109D7E383A0751CF75
S31500005710FFFC4A1567224A415EC0440048803E00AD
S31500005720 53414A47671260E07E383A0751CFFFFC83
S31500005730 10BC00201AFC00204A415EC0440048808C
S315000057403E0053414A4766E072383E0151C9FFFCAC
S31500005750 16BC00A972383E0151C9FFFC4BE9002076
S31500005760 7210600A109D7E383A0751CFFFFC4A1529
S31500005770 67224A415EC0440048803E0053414A4782
S31500005780 671260E07E383A0751CFFFFC10BC00205C
S315000057901AFC00204A415EC0440048803E00534146
S315000057A04A4766E033C000A001024CDF28A0205F14
S315000057B0588F4ED04E714E714E7133C000A0010409
S315000057C013FC000100804100323C0922300151C91E
S315000057D0FFFC33C000A001064E754E714E714E712E
S315000057E02F0733C000A001081E390080400813FCB3
S315000057F0008000080400861000AA661003F9E6100AB
S315000058003F486100082661346100 08B613C700806E
S315000058104 00833C000A0010A2E1F4E754E714E710E
S315000058204E7133C000A0010C424033C000A0010EEF
S31500005830205F588F4ED04E714E714E7148E71F3E15
S31500005840 33C000A00110598F48780004 0487900C045
S31500005850 14F42A7C000023364E9548780004 0487997
S31500005860 00C013F44E9548780004 1487900C01744AB
S31500005870 4E954878000 1487900C018484E954878FA
S3150000588 0030D487900C007BC4E9542B900C013F01D
S315000058904 8780080487900C005BC4E9542B900C0E2
S315000058A0057842B900C000EC4246267C00C0163C92
S315000058B0247C00C0163E300648C0D0802E00207CD6
S315000058C000 0C0163831BCFFFF780037BCFFFF7800F8
S315000058D0207C00C0163A31BCFFFF780035BCFFFFC4
S315000058E0780052460C4600016DCC424549D7263C0D
S315000058F00000FFFF2C7C00026EEC600001DA300431
S31500005900 48C0E58828B60800670001C8600001980D
S3150000591020540CA803FFFFFF0004630C2F2800048B
S31500005920 6100FF003E00600242474A476D0000DC0E
S3150000593020543028000 2720AE2680240003F0C4000
S31500005940 0033664C2A487C3FCC6D000E300748C0B9
S31500005950E188068000C013F4320648C1E589D0818B
S31500005960204020BD300748C0D080068000C0163801
S3150000597020403086300748C0D0800C73FFFF0800F7
S315000059806600008830074 8C0D08037860800607AF5
S31500005990 3028000 2E2680240003F0C400037664AA9
S315000059A02A487C3FCC6D000E300748C0E18806804F
S315000059B000 0C014F4320648C1E589D0812040208D0C
S315000059C0300748C0D080068000C0163A2040308696
S315000059D0300748C0D0800C72FFFF0800662C3007E5
S315000059E048C0D0803586080060203028000 2E26872
S315000059F0 0240003F0C40003866103007 48C0E5887A
S31500005A00 068000C0184820402094 23D400C000EC33
S31500005A104A476600008A23D400C018444A946606A2
S31500005A203E3CFFFF6010205430280002720AE268F4
S31500005A300240003F3E000C47001E670A7004D094E7
S31500005A4023C000C005784A9466042E0360122054D1
S31500005A503028000 2720AE2680240003F7E003E00E3
S31500005A60327C0008D3D42007E788068000C005BC36
S31500005A702040 20D920914A9466042E0360122054B7
S31500005A803028000 2720AE2680240003F7E003E00B3
S31500005A902007E588068000C01744204020942F1474
S31500005AA0224C61001B644A94672A20143204524136
S31500005AB048C1E589B0B61800641A204032280002B1
S31500005AC0700AE0690241003F0C410035670660003C
S31500005AD0FE407A1A5245300548C0D080068000C084

S31500005AE0C8CA204038100C44FFFF67080C45001A4E
S31500005AF06D00FE0C487900C007BC2F3900C0181095
S31500005B0061000DD823C000C013F0588F33C000A029
S31500005B1001124CDF7CF84E754E714E714E7133C0DA
S31500005B2000A001146100277223F900C0010200C021
S31500005B3000FA23F900C000FA00E0000033C000A01C
S31500005B4001164E754E714E714E7148E7010C33C009
S31500005B5000A00118518F287C00C000FA0C940F0C8D
S31500005B603F006300009C4AB900C013F0670A207921
S31500005B7000C013F02A5060029BCD2E3C00015180DC
S31500005B80200D67402F0D610039924A406736202D5F
S31500005B90000822074EB900025BBC22142F41000404
S31500005BA022072E80202F00044EB900025BBC22176C
S31500005BB0B2806610487900C007BC2F0D61000D1C2D
S31500005BC04A80663C4AB900C018206732207900C076
S31500005BD018202028000822074EB900025BBC2214B8
S31500005BE02F41000422072E80202F00044EB9000208
S31500005BF05BBC2217B2806606610005DE6002614862
S31500005C00508F33C000A0011A4CDF30804E754E71A4
S31500005C104E714E7133C000A0011C0CB903FFFFFF8B
S31500005C2000C0C8FE65140CB90F0C3F0000C000FA96
S31500005C306308610012A66100FF1233C000A0011EB6
S31500005C404E754E714E714E7133C000A001200CB9D5
S31500005C5003FFFFFF00C0C8FE65240CB90F0C3F0010
S31500005C6000C000FA62084AB900C000F66710610079
S31500005C70FB706100101E610004E86100FB6433C024
S31500005C8000A001224E754E714E714E7133C000A0B8
S31500005C900124518F0CB903FFFFFF00C0C8FE6568E1
S31500005CA00CB90F0C3F0000C000F6635C6100FB32CC
S31500005CB0203900C000F6223C000151804EB9000296
S31500005CC05BBC223900C000FA2F410004223C0001CF
S31500005CD051802E80202F00044EB900025BBC221793
S31500005CE0B280670A61000FAC610004766016203945
S31500005CF000C000F6B0B900C000FA640861000F9455
S31500005D00610004D66100FADA508F33C000A0012684
S31500005D104E754E714E714E7148E7070033C000A0B4
S31500005D2001287CFF4247602C300748C0D08006809F
S31500005D3000026F7420403A10300548C0E58806809E
S31500005D4000026EEC20402F10610000F44A4066020B
S31500005D503C0552470C46FFFF66060C47001A6DC805
S31500005D60300633C000A0012A4CDF00E04E754E71AC
S31500005D704E714E7148E70F0433C000A0012C78FF26
S31500005D807C004247300748C0D080068000026F740E
S31500005D9020403A10300548C0E588068000026EECC7
S31500005DA020402A502F0D610000964A40670CBCAD7A
S31500005DB0000C64062C2D000C380552470C47001ABF
S31500005DC06DC2300433C000A0012E4CDF20F04E75AA
S31500005DD04E714E714E7148E70F0C33C000A0013072
S31500005DE07CFF7AFF4247287C00026F74300748C068
S31500005DF0D0803834080032074BC1D2B130341800C8
S31500005E0048C0E588068000026EEC20402A502F0D1F
S31500005E10612C4A40670CBCAD000C63062C2D000CAF
S31500005E203A0452470C47001A6DC2300533C000A031
S31500005E3001324CDF30F04E754E714E714E7133C0EB
S31500005E4000A00134558F226F00063EB900026C0E89
S31500005E50200967483029001048C0E58806800002FE
S31500005E606EEC2040B3D0663430290002B057662C61
S31500005E700CA9EE6B2800000864220CA90F0C3F0049
S31500005E8000008631830290014B05766100CA90030BA
S31500005E90D400000C55C04400488060024240548F34
S31500005EA033C000A00136205F588F4ED04E714E7120
S31500005EB04E7148E7030033C000A001387CFF42471B
S31500005EC0227C00026EEC6022202F000C320748C1B3
S31500005ED0E589B0B1180065103207524148C1E5891D
S31500005EE0B0B1180064023C0752470C4700206C060C
S31500005EF00C46FFFF67D20C4600036D060C46001CDD
S31500005F006F080C46001F67027CFF300633C000A0F6
S31500005F10013A4CDF00C0205F588F4ED04E714E7153
S31500005F204E7148E7070C33C000A0013C7CFF424796
S31500005F30287C00026F74300748C0D0803A340800CD
S31500005F40320748C1D2813034180048C0E58806803F
S31500005F5000026EEC20402A502F0D6100FEE24A40FE
S31500005F60670C202F0018B0AD000C66023C055247A6
S31500005F700C47001A6DC0300633C000A0013E4CDF4E
S31500005F8030E0205F588F4ED04E714E714E7148E70B
S31500005F90031C33C000A001402A6F0018266F001CA6
S31500005FA00C55FFFF6712301548C0E58806800002D1
S31500005FB06EEC20402850600299CC0C53FFFF67120C
S31500005FC0301348C0E588068000026EEC20402A5057
S31500005FD060029BCD2F0C6100FE663C002F0D610018
S31500005FE0FE5E3E004A4667204A476718202C000C92
S31500005FF0B0AD000C671AB0AD000C64047EFF6012F1
S315000060007E01600E70FF600C4A47670470016004F1
S315000060104247300733C000A001424CDF38C0205F42
S31500006020508F4ED04E714E714E7148E7010C33C001
S3150000603000A0014442472A7C00026F74287C00C0FD
S31500006040C8CA300748C0D0800C75FFFF080067201B
S31500006050320748C1D2813035180048C0E58806802D
S31500006060000026EEC20402F106100FDD44A40660EFF
S31500006070300748C0D08039BCFFFF080060123207E5
S3150000608048C1D281300748C0D08039B51B00080011
S3150000609052470C47001A6DAA487900005F8E48786F
S315000060A000024878001A2F0C4EB900023C8E33C00D
S315000060B000A001464CDF30804E754E714E714E7118
S315000060C048E7010433C000A00148227900C0010658
S315000060D0207C00C015F4701020D951C8FFFC02794D
S315000060E0E0FF00C015F80079180000C015F823F984
S315000060F000C0C8FE00C015F4700F207900C00570FE
S31500006100C06800100279FFF000C015F8817900C060
S3150000611015F8424732077008D0B900C001062A4078
S315000061203015E44802400001DE403015E6480240E2
S315000061300001DE403015EA48024007FF4A4063028C
S3150000614052475241588D0C41000F6DD4300733C071
S3150000615000A0014A4CDF20804E754E714E714E7183
S315000061602F0733C000A0014C4FEFFFEC0CB903FF23
S31500006170FFFF00C0C8FE65483F3C00803F3C00373B
S3150000618043EF0008610015AA486F000443EF0004BE
S3150000619061001A6A4A97671C3F3C0080487900C034
S315000061A005BC206F0006486800104EB900004A067C
S315000061B03E0060027E014A476608611C3E0060029E
S315000061C07EFF30074FEF001433C000A0014E2E1F94
S315000061D04E754E714E714E7148E7010C33C000A0EA
S315000061E001504FEFF3B86100FED84A4067000096B1
S315000061F03F3C00113F3C003343EF0008610015327D
S31500006200486F000443EF0004610019F22A57200D7D
S3150000621067723F3C0011487900C015F4486D0010C4
S315000062204EB900004A063E00200D675A4A47665698
S31500006230486F00142F0D610001044A406646287C11
S3150000624000C013F02F14486F00182F0D610002E2F2
S315000062503E00662C486F00142F0D6100067E4A80B2
S31500006260671E43EF0014207C00C007BC203C0000E2
S315000062700030C20D951C8FFFC28BC00C007BC60062F
S31500006280429460027EFF30074FEF0C4833C000A0F7
S3150000629001524CDF30804E754E714E714E7148E79B
S315000062A0010433C000A00154598F48780041487951
S315000062B000C016404EB9000023362F3900026F6821
S315000062C06100FB7C4A4067604BD72ABC003E000059
S315000062D0603A4A9566082E3C0000FFFF6012205582
S315000062E030280002720AE2680240003F7E003E004B
S315000062F02007E588068000C016402040209523D55B
S3150000630000C017402F15224D610012FE0C95003E6D
S31500006310000065142015B0B9003E4000640A204014
S315000063200C68FFFF000266AA588F33C000A0015612
S315000063304CDF20804E754E714E714E7148E7071C3A
S3150000634033C000A00158598F266F00202A6F002401
S315000063502EB900026C1042450CB903FFFFFF00C0C6
S31500006360C8FE650001B0200D670001AA200B67007A
S3150000637001A44878030D2F0D4EB900002336303C9A
S3150000638000FFC045E148025700FF815749ED000470
S315000063904BEB001847EF00027CFF6000016608AF78
S315000063A0000020002082F0002000266123 02D0002D1
S315000063B0720DE268024000014A40660E6024301504
S315000063C0E448024000014A406718302F0002720A72
S315000063D0E2680240000172003200E5892001298648
S315000063E00800082F000200026612302D0002720E0D
S315000063F0E268024000014A40660E60243015E64815
S31500006400024000014A406718302F0002720AE26813
S315000064100240000172003200E58920012986080841
S31500006420082F000200026612302D0002720FE26889
S31500006430024000014A40660E607E3015EA4802407E
S3150000644007FF4A4067720257FF006040302F000284
S31500006450720AE268024000017E003E0041EC001034
S315000064602007D080D087EB88D1C03017024000FFCC
S3150000647072003200E589D1C120863017024000FF44
S315000064805240024000FF0257FF0081574A456628E6
S31500006490082F0002000266047E18601230150240C2
S315000064A00003721802810000FFFF82C03E01301710
S315000064B0024000FFB0476594302F0002720AE2687E
S315000064C002400001524002400001E36808AF0002AA
S315000064D00002816F0002302F0002E26802400001D4
S315000064E04A406600FEC03017E048024000FF5240B6
S315000064F0024000FFE148025700FF815749EC00D0F7

S31500006500588D3017E048024000FF0C40000F650030
S31500006510FE8E60027A013005588F33C000A0015A02
S315000065204CDF38E0205F508F4ED04E714E714E7169
S315000065303048E7233E33C000A0015C4FEFFFD8246F2D
S31500006540004C2A6F00502F7900026C14001C424642
S3150000655000CB903FFFFFF00C0C8FE6500035E200AFA
S31500006556067000358200D670003524EB90000994892
S31500006570303C00FFC046E148026F00FF001C816FFF
S31500006580001C47ED000449EA00183C7CFFFF600050
S3150000659002F408AF0002001E322F001E740AE469DE
S315000065A0024100017400340 1E58A220220331800FA
S315000065B0B08E6600013A302F001E720AE268024071
S315000065C000013F00486A00102F0C610024C03F0004
S315000065D03F3C003243EF00086100115 6486F00044B
S315000065E043EF001C610016164AAF00186700010051
S315000065F07010D0AF00182F40001420402210B28E29
S31500006600660000EC7014D0AF00182A40026F0FFF2E
S31500006610001E600000AA026FFF00001C60522015D9
S31500006620B08E6632202D0004B08E662A204F2F28A9
S3150000663000543F3C0008204F2F28002243EF002A39
S31500006640610 00CB83F3C0004486F00222F0D4EB984
S3150000665000004984 8C40302F001C024000FF52404D
S31500006660024000FF026FFF00001C816F001C508D6E
S31500006670082F0002001E66047E1860123014024 0C5
S3150000668000037218028100 00FFFF82C03E01302F16
S31500006690001C024000FFB0476584026FFF00001C2B
S315000066A0302F001E720CE2680240000F524002407A
S315000066B0000FE368026F0FFF001E816F001E302F70
S315000066C0001E720CE2680240000F322A00140241DA
S315000066D0000FB0416500FF403F3C0001486F001EBF
S315000066E0204F2F28001A4EB900004A068C40322F40
S315000066F0001E740AE46902410001740034 01E58A4F
S315000067002202220331808B08E6656302F001E720AF9
S31500006710E268024000013F00486A00102F0C610049
S31500006720240E3F003F3C003143EF00086100100299
S31500006730486F000443EF001C610014C24AAF001802
S31500006740671E7010D0AF00182A402015B08E661054
S315000067503F3C0001486F001E2F0D4EB900004A064F
S31500006760303CFFE0C054670000CC026FFF00001C05
S31500006770600000092302F001E720AE268024000019B
S315000067807E003E0041EB00102207D281D287EB89C2
S31500006790D1C1322F001C024100FF74003401E58A8A
S315000067A0D1C22010B08E66442F0C610022A43F0097
S315000067B03F3C003043EF0008610 00F76486F00044D
S315000067C043EF001C610014364AAF0018671E7010B4
S315000067D0D0AF00182A402015B08E66103F3C00014D
S315000067E0486F001E2F0D4EB900004A06302F001CC0
S315000067F0024000FF5240024000FF026FFF00001CF3
S3150000680 0816F001C4A46662C082F0002001E660493
S31500006810 7E186012301402400003721802810000D4
S31500006820FFFF82C03E01302F001C024000FFB04730
S3150000683 06500FF42302F001E720AE268024000 0126
S31500006840524002400001E36808AF0002001E816F5B
S31500006850001E302F001EE268024000014A4066001A
S31500006860FD38302F001CE048024000FF5240024035
S31500006870 00FFE148026F00FF001C816F001C47EB20
S3150000688000D0588C302F001CE048024000FF0C401E
S31500006890000F6500FCFE3F3C00003F3C003443EF28
S315000068A000086100 0E8C486F000443EF000461008D
S315000068B0134C4EB90000996460027C0130064FEF1C
S315000068C0002833C000A0015E4CDF7CC4205F4FEF80
S315000068D0000C4ED04E714E714E7148E72F3E33C0BC
S315000068E000A00160518F266F00342C6F00387CFFAA
S315000068F02A7C00C0C8FE283C03FFFFFF2015B08499
S31500006900 6500036E200E670003682 00B67000362B4
S31500006910 2F0E2F0B6100FA262C8B49EF0004288BD3
S31500006920 7C0145EF00027AFF2F14224C61000CDA3D
S315000069304A9463182054 20280004B0AB0010670C5A
S31500006940B08464E4202B0010B09566DC4A9467009E
S31500006950 01064A94671220543028 0002720AE2683F
S31500006960 0240003F3E0060043E3CFFFF3007064009
S31500006970FFD00C400004620000E4D040303B00062B
S31500006980 4EFB000200820046000A00D200D62054C8
S31500006990 2EA800102017B085670000C241EE000443
S315000069A03017E048024000FF3200C2FC00D0D1C1DF
S315000069B0302F0002720AE26802400001720032 00C3
S315000069C0E589D1C12094600000942054 2EA80010BF
S315000069D02017B0856700 008641EE00043017E048B6
S315000069E0024000FF3200C2FC00D0D1C15088302FD7
S315000069F00002720AE268024000017200320 0E58974
S31500006A00D1C12094605620542EA800102017B085BE
S31500006A10674A302F0002720AE268024000017E00D7
S31500006A203E0041EE00043017E048024000FF32000D
S31500006A30C2FC00D0D1C141E800102007D080D08729
S31500006A40EB88D1C03017024000FF72003200E589A2
S31500006A50D1C1209460067CFF600242460C460001CC
S31500006A606700FEC64A4666000208429702570 0FFC4
S31500006A7049EE00044BEB0018600001E208AF00028B
S31500006A8000002082F000200026612302D0002720D6D
S31500006A90E268024000014A40660E60443015E44850
S31500006AA0024000014A406738322F0002740AE46946
S31500006AB00024100017400340 1E58A220220341800E4
S31500006AC0B085671A302F0002720AE26802400001A0
S31500006AD072003200E58920014AB4080066027C0192
S31500006AE0082F000200026612302D0002720EE268C4
S31500006AF0024000014A40660E60443015E6480240F6
S31500006B000000 14A406738322F0002740AE4690241E4
S31500006B10000174003401E58A220220341808B08589
S31500006B20671A302F0002720AE26802400001720002
S31500006B303200E58920014AB408086 6027C01082F64
S31500006B4000020002661430 2D0002720FE268024055
S31500006B5000014A4066126000 0BA3015EA48024059
S31500006B6007FF4A40670000AC0257FF006076302FEF
S31500006B700002720AE268024000017E003E0041EC1B
S31500006B8000102207D281D287EB89D1C13217024188
S31500006B90 00FF74003401E58AD1C22010B085673049
S31500006BA0302F0002720AE268024000017E003E00B9
S31500006BB041EC00102007D080D087EB88D1C0301779
S31500006BC0024000FF72003200E589D1C14A90660298
S31500006BD07C013017024000FF5240024000FF02577E
S31500006BE0FF00815 74A46662A082F00020002660403
S31500006BF07E1860123015024000037218028 10000F0
S31500006C00FFFF82C03E013017024000FFB04765001B
S31500006C10FF5E302F0002720AE268024000 01524015
S31500006C2002400001E36808AF00020002816F000223
S31500006C30302F0002E268024000014A406600FE442E
S31500006C403017E048024000FF5240024000FFE14892
S31500006C5025700FF815749EC00D0588D4A4666100E
S31500006C603017E048024000FF0C40000F6500FE0EA2
S31500006C704A466604200E60027000508F33C000A0A2
S31500006C8001624CDF7CF4205F508F4ED04E714E7106
S31500006C904E7148E7273E33C000A001644FEFFFF472
S31500006CA0267900C013F07C012C530CB903FFFFFFBB
S31500006CB000C0C8FE6500020C200B67000206200E0D
S31500006CC0670002004EB9000099484246 45EF000AA7
S31500006CD0303C03FFC0460252FC008152303C00FFAC
S31500006CE0C046026FFF000008816F000830060240B0
S31500006CF000001720AE3680892000 28152303C00FFEC
S31500006D00C046E148026F00FF0008816F00084BEEA5
S31500006D1000187AFF60000194082D00030001660A3E
S31500006D20082D00060002670001 6441EB0004302FC5
S31500006D30008E048024000FF3200C2FC00D0D1C18A
S31500006D402848026F0FFF000A6000012808AF000202
S31500006D50000A302F000A720AE268024000 0172003F
S31500006D603200E58920014AB40808670000BA026FBC
S31500006D70FF0000086000 00842F0542A72F0B204F5C
S31500006D802F28001443EF0010610012 06302F000A6E
S31500006D90720CE2680240000F7E003E003F3C000499
S31500006DA0486F00027014322F0010740AE469024121
S31500006DB0000174003401E58A2202D0B418082207C3
S31500006DC0D281D287ED89D081322F000E024100FF99
S31500006DD074003401E78AD0822F004EB90000498 43E
S31500006DE08C40302F0008024000FF5240024000FF56
S31500006DF0026FFF000008816F0008082F0002000ADA
S31500006E0066047E18601230150240000372 18028173
S31500006E10000FFFF82C03E01302F0008024000FF45
S31500006E20B0476500FF54302F000A720AE26802403C
S31500006E30000152400 2400001E36808AF0002000A68
S31500006E40816F000A302F000AE268024000014A40C2
S31500006E506600FF00302F000A720CE2680240000F45
S31500006E6052400240000FE368026F0FFF000A816F75
S31500006E70000A302F000A720CE2680240000F322E20
S31500006E800014024100 0FB0416500FEC2302F000819
S31500006E90E048024000FF5240024000FFE148026F16
S31500006EA000FF0008816F0008588D302F0008E04869
S31500006EB0024000FF0C40000E6500FE5E4EB9000069
S31500006EC0996430064FEF000C33C000A001664CDF1A
S31500006ED07CE44E754E714E714E7148E73F3E33C0AD
S31500006EE000A001684FEFFFE645EF000824B9000255
S31500006EF06C1A2C7900C013F00CB903FFFFFF00C019
S31500006F00C8FE6500032C200E670003262F560016C8
S31500006F104AAF00166700031A4243303C00FFC043E5

```
S31500006F20E148025200FF81527018D0AF0016264089
S31500006F30243C000151806000002E63013EA4802401A
S31500006F4007FF3C004A46670002BE2002320648C1DF
S31500006F504EB9000237422E00203900E00004220715
S31500006F604EB900025BBC223900C000FA2F41000472
S31500006F7022072E80202F00044EB900025BBC221788
S31500006F80B28066384AB900C000F66700027A203936
S31500006F9000C000F622074EB900025BBC223900E0B1
S31500006FA000042F41000422072E80202F00044EB932
S31500006FB000025BBC2217B2806700024C203900E059
S31500006FC0000422024EB900025BBC2C00206F0016A2
S31500006FD0202800084EB900025BBCBC80660002286F
S31500006FE0203900E000042202 2F4000042006C1419F
S31500006FF04EB90002625EC14193AF0004202F000427
S315000070002207 4EB900025BBC2A0008AF0002000A44
S315000070100082F0002000A66047801600830130 24057
S31500007020000033800082F0002000A6614302B000205
S315000070300720FE268024000014A4066126000019A3F
S31500007040301 3EA48024007FF4A406700018C0252AB
S31500007050FF006000015E2F0E2F12610001EE2A4034
S315000070603 00548C0D080D08D67000136300548C055
S315000070700D0800C75FFFF080066000126301 2E0483C
S31500007080024000FF0C40000E644C302F000A720ACA
S315000070900E26802400 0017C003C003012E0480240F9
S315000070A000FF7E003E002006ED889086ED88068073
S315000070B000C032D83212024100FF2F40000430 01D6
S315000070C0C0FC00A8D0AF00042207D281D287E58990
S315000070D0D0812840601A3012E048024000FF064086
S315000070E0FFF272003200E789068100C052582841 3B
S315000070F03012E048024000FF0C400003670E3012D9
S31500007100E048024000FF0C40000866082F124EB906
S31500007110000 14EC43012E048024000FF7200320007
S31500007120D2810681000016202041 3F102F2C00043A
S315000071302F1443EF000E4EB900019DFE204F2F285D
S31500007140000443EF00184EB900019C34204F558FC0
S31500007150 3EA80014300548C0D080D08D2F006100B5
S3150000716016044A406704760160363012E048024051
S31500007170 00FF72003200D2810681000016202041F5
S3150000718 03F10204F558F3EA8001643EF00104EB912
S31500007190000 19D8A486F000C2F0C4EB90001A08695
S315000071A03012024000FF5240024000FF0252FF0030
S315000071B081523012E048024000FF0C40000E650488
S315000071C07E016008701848C081C43E00301202403B
S315000071D000FFB0476500FE80302F000A720AE268A1
S315000071E0024000015240024000 01E36808AF00027D
S315000071F0000A816F000A302F000AE268024000018F
S3150000720 04A406600FE0C3012E048024000FF524041
S31500007210024000FFE148025200FF8152588B3012B3
S31500007220E048024000FF0C40000F6500FD0E6002C2
S315000072307 60130034FEF001A33C000A0016A4CDF1D
S315000072407CFC4E754E714E714E7148E7210C33C071
S3150000725000A0016C226F001899CC200967000084F9
S31500007260 41E90004302F0014E048024000FF3200DC
S31500007270C2FC00D0D1C12A48200D6766302F001607
S315000072807 20AE268024000017E003E0041ED0010F5
S3150000729 02007D080D087EB88D1C0302F0014024061
S315000072A000FF72003200E589D1C14A906734302F61
S315000072B00016720AE268024000017E003E00701469
S315000072C041ED00102207D281D287EB89D1C1322F3E
S315000072D00014024100FF74003401E58AD1C2D09047
S315000072E02840200C33C000A0016E4CDF3084205FA4
S315000072F0508F4ED04E714E714E714E56FFE248E79A
S315000073003F3C33C000A001702D49FFFC45EE00084C
S3150000731 03C2E000C286E000E227C00026C0641EE0C
S31500007320FFF420D9209143EEFFF441EEFFEC20D983
S3150000733 02091200C67042A5460029BCD200D662202
S315000073403 02E000A024003FF3F006100139E3212F6
S31500007350E049024100FF74003401E58AD0822640EC
S31500007360601641ED00183012E048024000FF72003E
S31500007370 3200E589D1C12648082B000400016604C5
S315000073808C60000303C03FFC06E000A670408C64A
S3150000739 00003283C00015180200C6720200D671C4B
S315000073A03013EA48024007FF3E004A476F0E2004AA
S315000073B0320748C14EB9000237422600267C00013A
S315000073C09F6A200C6740200D673C202D0008220490
S315000073D04EB900025BBC4EB90002625E2A00080686
S315000073E0000166222 00C671E300602400001 3F00A5
S315000073F02F0C2F1243EEFFE46100107E486EFFE46F
S31500007400486EFFF44E93200C670000C2200D670003
S31500007410 00BC08060002660000B44A476F0000AED2
S315000074202F0C2F126100FE242A404A806700009E1E
S31500007430 2E05607C0806000066242F0743EEFFE257
S315000074404EB900019A98302E000A720CE26802408A
S3150000745000 0F41EEFFE242411210B041664E200D90
S315000074606 74A0C55FFFF674423CD00C000F233D5B1
S31500007470 00C000F0307C0018D1D43012E048024041
S3150000748000FF72003200E589D1C1302800020240B7
S3150000749000 3F3F00558F3E9543EEFFE44EB9000195
S315000074A09D8A486EFFE4486EFFEC4E93DE83548D52
S315000074B02004D085BE80640ABEB900C000FA65000B
S315000074C0FF74486EFFEC486EFFF44E930806000307
S315000074D0660000CC08060000662A2F3900C000FAB4
S315000074E043EEFFE24EB900019A98302E000A720C64
S315000074F0E2680240000F41EEFFE242411210B04145
S31500007500 6600009C3012E048024000FF0C40000E6E
S3150000751 06446302E000A720AE268024000017C00CE
S315000075203C003012E048024000FF7E003E0020068C
S3150000753 0ED889086ED88068000C032D83212 02416E
S3150000754000FF3401C4FC00A8D0822207D281D28772
S315000075 50E589D0812A40601A3012E048024000FFD7
S3150000756 00640FFF272003200E789068100C05258D9
S3150000757 02A413012E048024000FF0C400003670E2B
S31500007580 3012E048024000FF0C40000866082F1247
S31500007590 4EB900014EC42F0D486EFFF44E9343EED4
S315000075A0FFF4206EFFFC20D9209133C000A00172A9
S315000075B04CDF3CFC4E5E205F4FEF000A4ED04E7112
S315000075C04E714E714E56FFF433C000A001742D4922
S315000075D0FFFC2F3900C013F03F2E000C2F2E0008A1
S315000075E043EEFFF46100FD1443EEFFF4206EFFFC52
S315000075F020D9209133C000A001764E5E205F5C8FBB
S315000076004ED04E714E714E714E56FFF448E7231C14
S3150000761033C000A001782D49FFFC4BEE000849EE6F
S31500007620FFF842944A95670000E820550C68FFFF72
S315000076300002670000DA267C00026EEC30280002A9
S3150000764 0720AE2680240003F0C40003566220CA830
S315000076 5003FFFFFF00046218302800020240 03FF08
S3150000766 072003200E589200128B30800600000A2FC
S3150000767 07010D0952055322800020241 03FF740095
S3150000768 03401E58AD082288020400C68FFFF000282
S3150000769 0670A30102255B069000267742F15610021
S315000076A0E8123C000C46001F6764300648C0E588B7
S315000076B02D730800FFF4429442472A7C00C0C8CAD2
S315000076C06036300748C0D080BC750800662852472F
S315000076D00C47001A6C20300748C0D0800C75FFFF9D
S315000076E008006712320748C1D2813035180048C0F9
S315000076F0E58828B30800524730074 8C0D0800C758B
S31500007700FFFF0800670A0C47001A6C0460B4429435
S31500007710224C206EFFFC209133C000A0017A4CDF82
S315000077203 8C44E5E205F588F4ED04E714E714E71EA
S315000077304E56FFEC48E72F0433C000A0017C2D49CC
S31500007740FFFC3E2E00084AB900C000F667200CB9BF
S31500007750 0F0C3F0000C000FA650C0C47000A670ECC
S31500007760 0C47001E6708283900C000F66006283955
S315000077700 00C000FA2A7900C01820200D671241EDDA
S3150000778000 10300748C0E788D1C02A2800046002EC
S315000077907A00300748C0E588068000C017442040BC
S315000077A04A906714300748C0E788068000C005BCC9
S315000077B020402C28000460324A8563042C05602A88
S315000077C0300748C0E588068000C0164020404A9031
S315000077D06716300748C0E588068000C0164022407C
S315000077E020512C28000C60027C00703FC047720AB2
S315000077F0E368026E03FFFFEE816EFFEE303C03FF8F
S31500007800C06E000A026EFC00FFEE816EFFEE2006DF
S3150000781052802D40FFF8203900804010E0887203 26
S31500007820C2B90080401 07418E5A9D0812D40FFF040
S3150000783 02D44FFF443EEFFEC206EFFFC700320D9CD
S3150000784 051C8FFFC33C000A0017E4CDF20F44E5E21
S315000078502 05F588F4ED04E714E714E7148E73F3EB5
S3150000786 033C000A00180518F47EF00382A6F003CDB
S3150000787 04247302D0002720AE2680240003F3C0097
S3150000788 0302D0002024003FF3F4000062F13610027
S3150000789 0E62238000C44001F57C0440048803A00D6
S315000078A066204AB900C018206718307C0010D1F94C
S315000078B000C01820300648C0E788D1C0242800043C
S315000078C060027400307C00B8D1F900C001063006B1
S315000078D048C0D080D1C03010E248024003FF3E804D
S315000078E00C44FFFF670002F80CAD0F0C3F000008C8
S315000078F0630002F04A456716300648C0E5880680F0
S31500007900 00C016402840247C00C017406014300692
S3150000791048C0E588068000C017442840247C00C083
S315000079201844300452404 8C0E588068000026EECD8
S3150000793020402F5000024A45660A0C4600036704A1
```

S31500007940761460027604200 3E58891AF0002701079
S31500007950D093322F000648C1E589D081B0AF00022E
S31500007960651242934A45670608C70000605A08C771
S315000079700001 6054302D0002720AE2680240003FA6
S31500007980720032000 68100031BF42041081000003B
S31500007990671 2302D0002720AE2680240003F0C4076
S315000079A0003366244A94672020542028000C9082D5
S315000079B0321748C1B081651042934A45670608C729
S315000079C00002600408C700034A47660002160C4618
S315000079D000366714205330280002024003FF72006D
S315000079E032005881E589D3934A93670001EC20530E
S315000079F00C68FFFF0002660001E02C7C0080400856
S31500007A0014161CBC00803F3C0007486D0002205342
S31500007A10486800024EB9000049848E400CAD03FF51
S31500007A20FFFF0004626428932493327C0008D3D3BA
S31500007A30300648C0E788068000C005BC204020D933
S31500007A4020914A936606363CFFFF6010205330288B
S31500007A500002720AE2680240003F36000C43001E34
S31500007A60670E7004D0B900C0184423C000C0057862
S31500007A704A4766160C46003666103F04205348688F
S31500007A8000104EB90001C1E48E404A45660623D374
S31500007A9000C000EC7010D093322F000648C1E58973
S31500007AA0D0812F4000024A4766123F2D0002204F28
S31500007AB02F2800044EB90001C1E48E401C824A47BB
S31500007AC0660001200CAD03FFFFFF000463000114F4
S31500007AD020532F2800046100DD4A3C004A466F000F
S31500007AE00102302D0002720AE2680240003F0C409B
S31500007AF00033666C7A3FCA6D000E300648C0E188D6
S31500007B00068000C013F4320548C1E589D0812040C3
S31500007B1020932A7C00C01638300648C0D0804A75AB
S31500007B2008006D2E20532028000C320648C1E1893A
S31500007B30068100C013F4360648C3D68334353800B0
S31500007B4048C2E58AD28222412051B0A8000C6300C7
S31500007B500092300648C0D0803B8508006000008453
S31500007B60302D0002E2680240003F0C40003766728A
S31500007B707A3FCA6D000E300648C0E18806B000C014
S31500007B8014F4320548C1E589D081204020932A7C2F
S31500007B9000C0163A300648C0D0804A7508006D2CE1
S31500007BA020532028000C320648C1E189068100C016
S31500007BB014F4360648C3D6833435380048C2E58AFD
S31500007BC0D28222412051B0A8000C6316300648C06C
S31500007BD0D0803B850800600A08C70004600408C717
S31500007BE000013007508F33C000A001824CDF7CFCBF
S31500007BF0205F508F4ED04E714E714E714E56FFDE45
S31500007C0048E7033C33C000A001842D49FFFC47EE42
S31500007C10FFF82A6E00084293302D0002720AE268CD
S31500007C200240003F3E000CB90F0C3F0000C000FAB6
S31500007C30620A4AB900C000F667000120287C00C02D
S31500007C4000EC0C47003666000B26100E0CC3E0056
S31500007C500C47FFFF66126100E17E3E000C47FFFF06
S31500007C6066063E3900026F7445EEFFF424944A928C
S31500007C70675E2F126100E23C3C000C46FFFF675036
S31500007C80026E03FFFFF2006ED400FFF2303C03FFEA
S31500007C90C047026EFC00FFF2816EFFF23F2EFFF23C
S31500007CA02052486800024EB90001C1E4300648C0BF
S31500007CB0E588068000026EEC204026902012909304
S31500007CC0E4803F0020534B6800124EB90001C1E429
S31500007CD03F074EB90001C186300748C0E5880680D7
S31500007CE000026EEC204026902F0D2F136100FB6ED4
S31500007CF06100E3386100DB4660604A94661C3F3CE5
S31500007D0000013F3C003643EEFFE26100FA24486E74
S31500007D10FFE243EEFFDE6100FEE42F0D2F1461004B
S31500007D20FB3C3E000807000167263F3C00013F3C44
S31500007D30003643EEFFE25100F9F846EFFE243EEDB
S31500007D40FFDE6100FEB82F0D2F146100FB103E0010
S31500007D504A47660426946002429 3224B206EFFFC3B
S31500007D60209133C000A001864CDF3CC04E5E205FF0
S31500007D70588F4ED04E714E714E7148E7073E33C054
S31500007D8000A001884FEFFFEC3C2F00383A2F003A55
S31500007D902A6F003C4247287C00C01740247C000024
S31500007DA077302C7C0000785C0C46002166460CB9C6
S31500007DB00F0C3F0000C000FA630001204AB900C062
S31500007DC01844670001164A9467000110 3F073F3CBC
S31500007DD0003643EF00044E9248572F144E963F0745
S31500007DE03F3C002143EF00044E9248572F144E9615
S31500007DF0600000E80CB90F0C3F0000C000FA620AF0
S31500007E004AB900C000F6670000D047EF00104A9458
S31500007E10662E26B900026F682F136100E0224A40E1
S31500007E20661E3F3C001F4EB90001C1863F3C000163
S31500007E303F3C003643EF00044E9248572F134E96B0
S31500007E403F053F0643EF00044E92307C00B8D1F95F
S31500007E5000C001067 0003006D080D1C0082800009E
S31500007E600001673248572F144E963E0066284A4551
S31500007E7067 24200D67203F052F0D70003006E5882A
S31500007E80068000C0164022402051486800104EB9B6
S31500007E9000004A068E40307C00B8D1F900C00106C9
S31500007EA072003206D281D1C130100800000F672A55
S31500007EB04857224B6100FD464A93671C4A45671A9C
S31500007EC0200D67163F052F0D2053486800104EB948
S31500007ED00004A068E4060027E0130074FEF001414
S31500007EE033C000A0018A4CDF7CE0205F508F4ED06B
S31500007EF04E714E714E7133C000A0018C42A73F3CBB
S31500007F000000204F3F28000A6100FE7033C000A029
S31500007F10018E205F548F4ED04E714E714E714E566B
S31500007F20FFFC33C000A001902D49FFFC7000302EED
S31500007F300008E588068000C01640224020 6EFFFC3F
S31500007F40209133C000A001924E5E205F548F4ED028
S31500007F504E714E714E714E56FFFC33C000A0019417
S31500007F602D49FFFC7000302E0008E788068000C00F
S31500007F7005BC2240206EFFFC20D9209133C000A012
S31500007F8001964E5E205F548F4ED04E714E714E71EB
S31500007F904E56FFE648E73F3C33C000A001982D4906
S31500007FA0FFFC286E000C227C00026C1E41EEFFF4E2
S31500007FB020D92091200C670001B62654263C0001EA
S31500007FC05180202B000822034EB900025BBC4EB93B
S31500007FD00002625E28002D44FFF841EB0018302EA7
S31500007FE00008E048024000FF72003200E589D1C176
S31500007FF02A48303CFFE0C055670001742003321563
S31500008000EA49024107FF7400340122024EB9000218
S315000080103742 2C002F0C2F2E00086100F22E2A402A
S31500008020247C00C00106200D6700010C49EEFFF01C
S31500008030288 47A01600000F2202EFFF0B0AE001016
S31500008040650000DA70003006D0AEFFF0B0AE001466
S31500008050620000CA302B00140240000F0C400001E1
S31500008060 67282F2EFFF043EEFFEA4EB900019A98DB
S31500008070302E000A720CE2680240000F41EEFFEA61
S315000080804241 1210B041660000942D7C00000000B1
S31500008090FFEC205230280006024000FFBA40657C03
S315000080A0424760443 00748C04480D080D08D673650
S315000080B0300748C04480D0800C75FFFF0800672653
S315000080C0300748C04480D080558F3EB5080043EE47
S315000080D0FFE84EB900019BDE486EFFE8486EFFECF4
S315000080E04EB900021CD6524720523028000 60240E4
S315000080F000FFBE4065AE486EFFF4486EFFEC4EB919
S31500008100000021FF24A406F142D6EFFECFFF4202E82
S31500008110FFF072003206D0812D40FFF87000300665
S31500008120D1AEFFF05245548D2003D084222EFFF0AD
S31500008130B2806500FF04205230280006024000FF8E
S31500008140C0C6323C0E1002810000FFFF82C0300123
S31500008150486EFFE602800000FFFF4EB9000242248F
S31500008160486EFFE6486EFFF44EB900021D0C43EE62
S31500008170FFF4206EFFFC20D9209133C000A0019AA5
S315000081804CDF3CFC4E5E205F4FEF00104ED04E7130
S315000081904E714E714E56F2D048E7033C33C000A0F4
S315000081A0019C2D49FFFC2E2E000C2C2E0010227C4B
S315000081B000026C2641EEF2D0703920D951C8FFFC7E
S315000081C045EEF3A024AE0008200 7223C00015180B2
S315000081D04EB900025BBCC1414EB90002625EC141AC
S315000081E02D41F3AC2D46F3B02D7C00000000FFF4CA
S315000081F042AEFFF849EEF3B82D7C00003102F3A43D
S3150000820047EEFFEC605C2F0C2F2EF3A0610005BC3F
S3150000821 02A404A80670C202D0004B0876504B0868A
S31500008220631 22F062F072F0C2F2EF3A0224B61006F
S315000082 30FD606008224D204B20D92091486EFFF446
S315000082402F0B4EB900021FF24A406F16202EFFF088
S31500008250B087650EB086620A224B41EEFFF420D944
S3150000826020912F0C486EF2D04EB90001AB924A0018
S31500008270669443EEFFF4206EFFFC20D9209133C0B4
S31500008280 00A0019E4CDF3CC04E5E205F4FEF000C0D
S315000082904ED04E714E714E7148E7230433C000A094
S315000082A001A0598F227C00C001024AB900C01844BF
S315000082B0670000822A7C00C0057808390007 00C0E4
S315000082C0184C66682C3C03FFFFFF203900804010E5
S315000082D0E0887203C2B9008040107418E5A9D08105
S315000082E020559090CC804A7900C0A22666047E0074
S315000082F060282006323900C0A22648C1243C0098D6
S31500008300968 02E8020024EB90002374222002017A6
S315000083104EB900025BBC2E802E004A95671C2006D3
S31500008320D0872055D0A8000422806010205522A8AE
S31500008330000004600842B900E000004291588F33C043
S31500008340 00A001A24CDF20C44E754E714E714E71D5
S31500008350 48E7270C33C000A001A43A2F001C9BCD90

S315000083607CFF4247287C00C013F430054BC0E188F2
S31500008370D08C320748C1E589D08120402F1061009A
S31500008380119A4A40673E2F0D610011904A40671EC0
S31500008390320548C1E189D28C340748C2E58AD282C7
S315000083A0224120512028000CB0AD000C6416300587
S315000083B048C0E188D08C320748C1E589D081204089
S315000083C02A503C0752470C4700406D9E300633C08A
S315000083D000A001A64CDF30E4205F548F4ED04E71D2
S315000083E04E714E7148E7270C33C000A001A83A2F02
S315000083F0001C9BCD7CFF4247287C00C013F430054F
S3150000840048C0E188D08C320748C1E589D081204038
S31500008410 2F10610011064A40673E2F0D610010FCC7
S31500008420 4A40671E320548C1E189D28C340748C2EA
S31500008430E58AD282224120512028000CB0AD000CE2
S315000084406316300548C0E188D08C320748C1E589FB
S31500008450D08120402A503C0752470C4700406D9E71
S31500008460300633C000A001AA4CDF30E4205F548FF1
S315000084704ED04E714E714E714E56FFF448E73F3C5A
S31500008480 33C000A001AC2D49FFFC266E000C227CF7
S31500008490000028D6041EEFFF420D92091200B670089
S315000084A002242A53200D6700021C302D0014E048D8
S315000084B00240001F3A00302E0008E048024000FF4C
S315000084C072003200E589303518180240000 3380082
S315000084D04A44660C0C4500186D047803 6023805A2
S315000084E0302D00140240000F3C0045EE000A082E15
S315000084F0000000011670842473606534360283012D1
S31500008500720CE2680240000FB046650642 4776FFED
S31500008510 60143012E2680240000F3E003012E2683A
S31500008520 0240000F36003C076000019441EB000456
S31500008530302E0008E048024000FF3200C2FC00D0A6
S31500008540D1C12848302E000A720AE2680240000 1B2
S31500008550 72003200E58920014AB408006700015E16
S31500008560 9BCD082E0002000A670848C58BC4500030
S3150000857000023 0050C400001672 80C400002674AE3
S31500008580 0C400003676C0C400008670000920C402A
S31500008590000C670000B00C400018670000D46000B3
S315000085A000FA7014322E000A740AE46902410001CE
S315000085B074003401E58A2202D0B41800320648C19C
S315000085C0E789D0812A40600000D27014322E000A5A
S315000085D0740AE469024100017400 3401E58A22024A
S315000085E0D0B41800320648C1E989D0812A4060001B
S315000085F000AA3E0648C77014322E000A740AE469BF
S3150000860002410001740 03401E58A2202D0B4180048
S31500008610 2207D281D287E789D0812A40607C7014F4
S31500008620322E000A740AE469024100017400340122
S31500008630E58A2202D0B41800320648C1ED89D081FD
S315000086402A4060563E0648C77014322E000A740A45
S31500008650E46902410001740 03401E58A2202D0B4C3
S31500008660 18002207D281D287EB89D0812A40602A5E
S31500008670 3E0648C77014322E000A740AE4690241A5
S315000086800001740 03401E58A2202D0B418002207E2
S31500008690D281D287ED89D0812A40200D671E302EE7
S315000086A00008024000FF72003200E7892001487589
S315000086B00800486EFFF44EB900019F6A5246BC435B
S315000086C06F00FE6A43EEFFF4206EFFFC20D9209176
S315000086D033C000A001AE4CDF3CFC4E5E205F4FEF86
S315000086E000A4ED04E714E714E7148E7010C33C0F0
S315000086F000A001B03E2F00104A47661C2A7900C030
S31500008700018102F0D61000E144A40663C6100D9B264
S31500008710 287C00C015FC603470003007E188680B4
S31500008720 00C013F472003207D281068100C01638E9
S31500008730 2041321048C1E589D08120402A502F0DB2
S315000087406 1000DD84A40670449ED0018200C33C07B
S31500008750 00A001B24CDF3080205F548F4ED04E71A6
S315000087604E714E7133C000A001B4558F3EAF000A62
S31500008770204F3F10204F2F2800084EB90001C1E4BA
S31500008780548F33C000A001B6205F5C8F4ED04E716F
S315000087904E714E712F0D33C000A001B82A6F00082C
S315000087A0200D67103F3C0004486F000E2F0D4EB998
S315000087B0000498433C000A001BA2A5F205F4FEF52
S315000087C0000C4ED04E714E714E7148E7230C33C0EB
S315000087D000A001BC226F001C99CC20513028001447
S315000087E0E0480240001F3E00302F0018E0480240DB
S315000087F000FF72003200E58930301818024000038D
S31500008800 3C004A46660C0C4700186D047C03600267
S31500008810 3C0720096700022241E90004302F0018B6
S31500008820E048024000FF3200C2FC00D0D1C12A4815
S31500008830200D6700020443EF001A3011720AE26845
S315000088400240000172003200E58920014AB508089D
S31500008850670001E608110002670848C78FC6600076
S31500008860000230070C400001672A0C4000026768CE
S315000088700C400003670000A60C400008670000E8F3
S31500008880 0C40000C670001240C40001867000164CE
S31500008890600001A67014322F001A740AE4690241BE
S315000088A00001740 03401E58A2202D0B51808322F7F
S315000088B0001A740CE4690241000F74003401E78A5F
S315000088C0D082322F0018024100FF74003401E78A7B
S315000088D0D0822840600001627014322F001A740A98
S315000088E0E46902410001740 03401E58A2202D0B530
S315000088F01808322F001A740CE4690241000F740044
S31500008900 3401E98AD082322F0018024100FF740038
S31500008910 3401E78AD0822840600011E302F001AF9
S31500008920720CE2680240000F7E003E007014322F87
S31500008930001A740AE46902410001740 03401E58AF0
S315000089402202D0B518082207D281D287E789D081C2
S31500008950322F0018024100FF74003401E78AD082EA
S31500008960284060000D47014322F001A740AE4699B
S3150000897002410001740 03401E58A2202D0B51808CC
S31500008980322F001A740CE4690241000F740034019E
S31500008990ED8AD082322F0018024100FF74003401A4
S315000089A0E78AD0822840600000 90302F001A720CAF
S315000089B0E2680240000F7E003E007014322F001A5B
S315000089C0740AE46902410001740 03401E58A220256
S315000089D0D0B518082207D281D287EB89D081322FF1
S315000089E00018024100FF74003401E78AD082284053
S315000089F06046302F001A720CE2680240000F7E00BB
S3150000 8A003E007014322F001A740AE469024100 0114
S31500008A1074003401E58A2202D0B518082207D281F3
S31500008A20D287ED89D081322F0018024100FF7400F1
S31500008A303401E78AD0822840200C33C000A001BE52
S31500008A404CDF30C4205F508F4ED04E714E714E7148
S31500008A5033C000A001C0226F0004303CFFE0C051CB
S31500008A606716301 1EA48024007FF72003200D281D1
S31500008A705C81E48930016002424033C000A001C23B
S31500008A80205F588F4ED04E714E714E7148E70300ED
S31500008A9033C000A001C4226F000C206F00103028E4
S31500008AA00004E0480240001F3C004A6F0014673A89
S31500008AB0082900020001675A30110240000 33206FD
S31500008AC002810000FFFF82C03C01300648C0E788F3
S31500008AD05C80E4882E00082900040001673 63028EF
S31500008AE000040240000FCEC0602A082900020001DF
S31500008AF0672030 0648C0E7885C80E4882E00082995
S31500008B000000400016 70E30280004024000 0FCEC0AA
S31500008B10600242473007 33C000A001C64CDF00C0E8
S31500008B20205F4FEF000A4ED04E714E714E7148E7EE
S31500008B30030033C000A001C8226F000C206F001094
S31500008B403028000 4E0480240001F3E004A6F00142F
S31500008B50673230110240000 33207028100 00FFFF36
S31500008B60 82C03E010829000 30001673830 2800044E
S31500008B70 0240000FC0C772003200E7895C81E489B9
S31500008B802C01602208290006000267183028 00041C
S31500008B900240000FC0C772003200E7895C81E48999
S31500008BA02C0160024246300633C000A001CA4CDFE9
S31500008BB000C0205F4FEF000A4ED04E714E714E71CD
S31500008BC033C000A001CC2239003A00200481003ACB
S31500008BD000007018B2806F0C0C81000020006C043D
S31500008BE02001600270FF33C000A001CE4E754E71A9
S31500008BF04E714E7148E7011C33C000A001D061C020
S31500008C004A806F4A7E00267C003A00002013B08B13
S31500008C1065080C80003A200063202A7C000317A018
S31500008C20284B600E2014B09567047EFF600C588DAB
S31500008C30588CBBFC000317B065EA4A8766122A4BBC
S31500008C406002DE9DBBF9003A002065F660027EFFF9
S31500008C50200733C000A001D24CDF38804E754E711C
S31500008C604E714E712F0733C000A001D4598F610099
S31500008C70FF504A806D122079003A00202 0102E8085
S31500008C806100FF72D09767187E0123F9000317A8C9
S31500008C9000C0057023F9000317A000C00574601614
S31500008CA0424723F9003A000800C0057023F9003A4C
S31500008CB0000000C005743007588F33C000A001D6ED
S31500008CC02E1F4E754E714E714E7133C000A001D8E5
S31500008CD042410C79001E003C639C661A2039003C18
S31500008CE06392B0B900C0C8FE660C0CB90F0C3F0009
S31500008CF0003C638E64027201300133C000A001DAC9
S31500008D004E754E714E714E714E56FF2648E7213C08
S31500008D1033C000A001DC2D49FFFC2A6E0008227C2E
S31500008D2000026D0E41EEFF26703320D951C8FFFCBC
S31500008D303091224D41EEFF3A700620D951C8FFFC12
S31500008D40309149EEFFF80815000467104AB900C0D3
S31500008D50174067242 8BC003E0000601C4AB900C0CA
S31500008D6018446714303900C0C8CA48C0E588068070
S31500008D7000026EEC204028904A946700013647EEC8

S31500008D80FF76600000882F0D2F14610001501D40F2
S31500008D90FF764A0067080C0000026702606081545
S31500008DA0000767324240102D00032054322800028B
S31500008DB0740AE4690241003FB0416648202D00066E
S31500008DC0B0A8000C663E4AAD000A670A202D000ACC
S31500008DD0B0A80004662E08150006671A2F14224C48
S31500008DE06100E8262F0D2F14610000F21D40FF766A
S31500008DF00C00000167E62D54FF262D6EFF26FF5856
S31500008E0042AEFF6C2F14224C6100E7FE4AAEFF26ED
S31500008E1066064A946600FF707E0528AEFF2647EE7A
S31500008E20FF3645EEFF3260702F0D2F14610000AE45
S31500008E301E004A0067140C000002672C0C00000498
S31500008E40674C0C000005673E604652AEFF36205464
S31500008E503028000202 4003FF720032005881D3AE70
S31500008E60FF322D48FF2A602852AEFF3620543028A4
S31500008E700002024003FF720032005881D3AEFF3277
S31500008E802D48FF2A600842AEFF3642AEFF324294BA
S31500008E902F14224C6100E7724A94668C082D000755
S31500008EA00001670E0C070004670842AEFF3642AEAB
S31500008EB0FF3243EEFF26206EFFFC703320D951C8E7
S31500008EC0FFFC309133C000A001DE4CDF3C844E5ED7
S31500008ED0205F588F4ED04E714E714E7148E7010893
S31500008EE033C000A001E049EF000C226F00104A9445
S31500008EF0670000884A9466047EFF6010205430287C
S31500008F0000002720AE2680240003F3E002029001A71
S31500008F10B0B900C0C8FE660E20540CA803FFFFFFC0
S31500008F200004620000C82029001AB0B900C0C8FEBB
S31500008F30670E4A80630A2054B0A80004660000AE9B
S31500008F40081100056 70A2014B0B900C01810672A76
S31500008F50081100076 72C424010290003B04766221B
S31500008F6020290000E2054B0A8000C66160811000136
S31500008F706610082900070001670 47E0460747E02FB
S31500008F806070424010290003B047661C4240102919
S31500008F900004B04766122054202 8000CB0A9000631
S31500008FA0654AB0A9000E6244205420280008B0A9E2
S31500008FB000166438B0A9001265320811000267165F
S31500008FC0424010290003BE406D2242401029000491
S31500008FD0BE406E18601A424010290002207C000331
S31500008FE01BF4424112307000C04166047E016002EB
S31500008FF04207100733C000A001E24CDF1080205F5B
S3150000900050 8F4ED04E714E714E7148E7071C33C0DB
S315000090100 0A001E4598F3C2F00202A6F0022302D3A
S3150000902000 04AB04666044247602 40C460001660BC2
S315000090304AAD000C620E60104A6D004C660A524042
S31500009040B04666047E0160061B7C0005005049D7C9
S315000090504A47670001503B46004A4247487800208D
S31500009060486D00524EB90000236641ED0052288833
S31500009070267C00C0C8FE600001144AAD0046661A90
S31500009080226D00322054316900020002206D003248
S315000090903B680002004E600000EC0CAD00000001D1
S315000090A000466620082D0003001467102F134EB9E2
S315000090B00001A5F020542080600000CA20542093AF
S315000090C0600000C2206D003230280002024003FF1B
S315000090D0720032005881202D0046B081664C205423
S315000090E030AD004E2054317CFFFF00020C2D0002F3
S315000090F00050660E1B7C000400503B46004C60008E
S31500009100008C42AD00462F2D003243ED0032610047
S31500009110E4F8486D00142F2D00326100FDC01B409D
S3150000912000500C00000167DE6062082D0003001489
S315000091306742720 4B081651E200866063A3CFFFF4E
S31500009140600E30280002720AE2680240003F3A00D0
S315000091500C450030671E206D0032202D0046E58844
S31500009160D1C02F1052AD00464EB90001A5F02054D3
S3150000917020806014226D0032202D0046E588D3C081
S315000091802054209152AD0046524758940C47002077
S315000091906C124A2D00506700FEE20C2D00020050B2
S315000091A06700FED80C2D00040050660E3B6D004A89
S315000091B0004C2054317CFFFF00024A6D004C630CCA
S315000091C0BC6D004C63061B7C00050050102D005042
S315000091D0588F33C000A001E64CDF38E0205F5C8F7B
S315000091E04ED04E714E714E7148E7030C33C000A04D
S315000091F001E8598F3C2F00182A6F001A0C4600010F
S3150000920066124A6D004A660C42AD00467E01422D4A
S3150000921000506016302D004A5240B04666047E016A
S3150000922060081B7C0005005042474A47670000D68D
S3150000923049D741ED005228883B46004A4247600024
S315000092400B6202D00467203B0816248D040303B04
S3150000925000064EFB00020008001A0022002A2054D5
S315000092603B680002003820543B680002004E607ED6
S31500009270020542B50003A607620542B50003E606EEE
S31500009280020542B500042486D003643ED0008610023
S31500009290E96C605A302D004E024003FF7200320026
S315000092A05881202D0046B081652820543010B06DBD
S315000092B0004E67081B7C00050050603A0C68FFFFF3
S315000092C0000266081B7C00020050602A42AD004680
S315000092D0602420542F107010D0AD000872FCD2AD5F
S315000092E00046E589D0812F004EB90000489858947 1
S315000092F0524752AD00460C4700206C084A2D0050DC
S31500009300 6700FF40102D0050588F33C000A001EABF
S3150000931004CDF30C0205F5C8F4ED04E714E714E7167
S31500009320 48E7073E33C000A001EC5D8F42052C7C68
S3150000933000C0010A203900C00106B08E6600019601
S31500009340 2F0E610002664A406700018842472A7C68
S31500009350 00C00112287C00031C34267C00C0018654
S31500009360247C00C0014E0C47000E6C0000EE303C21
S31500009370FFE0320748C1E589C07518006700 00881C
S3150000938030 0748C0E5882C0030356800EA480240BE
S315000093900 7FF48570280000 0FFFF4EB90002422433
S315000093A048574874680048736800 4EB900021FC4E5
S315000093B0320748C1E5893035180208 00000F6734C6
S315000093C0300748C0E5882C0030356800EA4802407E
S315000093D007FF485702800000FFFF4EB900024224F3
S315000093E04857487468004872680 04EB900021FC4A6
S315000093F0600000D4320748C1E589303518020800FC
S31500009400000D66226044300748C0E5880835000232
S31500009410080167283207 48C1E589300748C0E58852
S31500009420 27B418000800320748C1E589300748C04C
S31500009430E58825B418000800600 0008C300748C095
S31500009440E58827BC0000000008003 00748C0E58812
S3150000945025BC000000000800606C303CFFE03207CD
S31500009460 48C1E589C0751800674232 0748C1E589D9
S3150000947030351800EA48024007FF485702800000CE
S31500009480FFFF4EB9000242244857300748C0E5881E
S31500009490D08C2F0070F2D04748C0E588068000C007
S315000094A001BE2F004EB900021FC4601A300748C023
S315000094B0E58872F2D24748C1E589068100C001BE3F
S315000094C0204120B4080052470C47000F6D00FE985B
S315000094D060027AFF4A05662C203900C00106B08E6C
S315000094E0660A2F0E610000C44A4067162F3900C075
S315000094F001063F3C004E3F3C001C6100E87E3A00FE
S3150000950060027AFF10055C8F33C000A001EE4CDFCD
S31500009510 7CE04E754E714E714E7148E7010433C0C2
S3150000952000A001F02E3C03FFFFFF2A6F000C200D68
S31500009530670E202D0004B0876506B0AD00106746A3
S315000095400 200D674C202D0004B087644 4203900C0EC
S31500009550C8FEB087653A222D0010B2806632302DE3
S3150000956000 14E0480240001F0C40001866 22302D0F
S31500009570 00140240000F72003200207900C005700E
S31500009580B2A8000E660A486D0010611E3E00600219
S3150000959042 47300733C000A001F24CDF2080205F35
S315000095A0588F4ED04E714E714E7148E7230033C02E
S315000095B000A001F4226F00107C01424741E9000837
S315000095C060000162303CFFE0C050671C3010EA4882
S315000095D0024007FF323C05A002810000FFFF82C067
S315000095E048414A41620001387003C0280001670003
S315000095F0012E303C1F00C06900046700 01223010B4
S31500009600024000033 2290004E0490241001FB04134
S31500009610 6200010C30290004E0480240001F3210AD
S315000096200241000302800000FFFF80C148404A401B
S31500009630660000EC700FC0290005670000E20828EC
S3150000964000030001676C303CFFE0C050670000D0AB
S315000096503 03CFF00C0690006670000C44A290007C5
S31500009660670000BC30290006E048024000FF3229AE
S3150000967000 06024100FF02800000FFFF80C1484053
S3150000968 04A406200009A30290006E048024000FF86
S315000096903210EA49024107FF343C05A0028200006D
S315000096A0FFFF84C102800000FFFF80C248404A409D
S315000096B0626C0828000600026766082800070002 98
S315000096C0675C303CFF00C069000667524A29000704
S315000096D0674C30290006E048024000FF32290006A8
S315000096E0024100FF02800000FFFF80C148404A405F
S315000096F0622C30290006E048024000FF3210EA4999
S31500009700024107FF343C05A002820000FFFF84C12E
S315000097100 2800000FFFF80C248404A406302424682
S315000097205247 58884A466F080C47000F6D00FE9650
S31500009730300633C000A001F64CDF00C4205F588F0E
S3150000974 04ED04E714E714E7133C000A001F8598F44
S315000097503F3C001C43EF00026100E7C44A97671ACA
S31500009760205748680 0106100FE424A40670C70109E
S31500009770D09723C000C00106600A23FC00031ABC70
S31500009780 00C00106203900C00106588F33C000A072
S31500009790 01FA4E754E714E714E7133C000A001FC38

S315000097A0598F3F3C002243EF00026100E7724A975F
S315000097B0670A205723E8001000C0C8FE588F33C040
S315000097C000A001FE4E754E714E714E7133C000A061
S315000097D0020000790800008040083 3C000A00202A1
S315000097E04E754E714E714E7148E7C0FC33C000A0F5
S315000097F00204598F2A7C000004BC6004205D4E9050
S31500009800BBFC000004DC65F4247C008040140812D4
S31500009810006673A08D20006287C00C0C8AC2A4C6D
S31500009820267C00C0C8B66002548DBBCB64044A5582
S3150000983066F6BBCB661813FC00EA00804015200BC9
S31500009840908CE2802F002F0C4EB9000022D62A7C85
S3150000985000C000FE0C15003F660000D44215287CAF
S3150000986000C0A2264A54673A267C00C00100535322
S3150000987066304A546F045215600253154A54660402
S315000098804253601E3F144EB90002315A48C0223C72
S3150000989000002625A2E81220020174EB9000237427A
S315000098A03680287C00E0000052942A7C000004DC0C
S315000098B06004205D4E90BBFC000004DC65F42014BF
S315000098C0723C4EB9000257A84A8066642A7C0000A2
S315000098D004DC6004205D4E90BBFC000004DC65F4F3
S315000098E02014223C00000E104EB9000257A84A80F0
S315000098F0663E2A7C000004DC6004205D4E90BBFCC2
S3150000990000000004DC65F42014223C000151804EB9AD
S31500009910000257A84A8066182A7C000004DC60040E
S31500009920205D4E90BBFC000004DC65F4600252151D
S3150000993008D20007588F33C000A002064CDF3F0351
S315000099404E734E714E714E7133C000A0020808F975
S3150000995000010 0C0184C33C000A0020A4E754E71BB
S31500009960 4E714E7133C000A0020C08B9000100C050
S31500009970184C33C000A0020E4E754E714E714E71DA
S315000099802F0D33C000A002104FEFFFC0007C070870
S3150000999023F9000018620080400 82A7C0000054078
S315000099A0600A2F0D61000880205D4E90BBFC000010
S315000099B0054865EE48780040486F00044EB900003F
S315000099C0227648790002C2EA486F00044878000B04
S315000099D04EB90000206848574EB9000056DC4EB913
S315000099E00001BBA84FEF004033C000A002122A5F5F
S315000099F04E754E714E714E712F0733C000A0021482
S31500009A002E3900E00004203C00C00000448006809F
S31500009A1000C0C9D6E4802F00487900C000004EB9C6
S31500009A2000002336487900031FA4487900C0C8B651
S31500009A30203C00C0C8B64480068000C0C9D6E48079
S31500009A402F004EB90000214023C700E0000433C0B8
S31500009A5000A002162E1F4E754E714E714E7133C008
S31500009A6000A00218598F4A7900C0A22666084279DA
S31500009A7000C0010060263F3900C0A2264EB9000290
S31500009A80315A48C0223C0002625A2E812200201719
S31500009A904EB90002374233C000C00100588F33C0B0
S31500009AA000A0021A4E754E714E714E7133C000A061
S31500009AB0021C13FC00010080400013FC0000008023
S31500009AC0400213FC000E00804004203C00C0FF4210
S31500009AD044800680000C100C2E4802F00487900C09F
S31500009AE0FF424EB900023364238000033C000A0C2
S31500009AF0021E4E754E714E714E7148E7013E33C0DF
S31500009B0000A00220598F6100FEF0203C00C0C9D69B
S31500009B104480068000C0FF42E4802F00487900C0E0
S31500009B20C9D64EB9000023362A7C0080400802556B
S31500009B307FFF3015720FE2680240001024000010B
S31500009B40720EE3680255BFFF81553015E268024088
S31500009B5000010240001720DE3680255DFFF8155E6
S31500009B603015E26802400001024000017 20CE36811
S31500009B700255EFFF81553015E268024000010240B0
S31500009B800001720BE3680255F7FF81553015E26854
S31500009B900240000102400001720AE3680255FBFF21
S31500009BA081553015E2680240000102400001720949
S31500009BB0E3680255FDFF815533FC001900E00FF202
S31500009BC033FC001A00E00FF433FC001B00E00FF634
S31500009BD033FC001C00E00FF833FC001D00E00FFA18
S31500009BE033FC001E00E00FFC33FC001F00E00FFEFC
S31500009BF04EB90001BA244EB90001BAA0027CF8FFA2
S31500009C00027CDFFF4EB900008C64287C00C0184C33
S31500009C10227C00001866204C10D910912A7C008006
S31500009C20400A3015E2480240000102000001089493
S31500009C3000008114301508000007670A00550080EF
S31500009C4008D400076028301508000005670A00558B
S31500009C50002008D40006601630150800006670AC2
S31500009C600055004008D40004600408D40003267C94
S31500009C700008040142C7C00804015081300066708FD
S31500009C8008D300061CBC00EA2A7C00000410247CD1
S31500009C900000A22660082F0D4E92205D4E90BBFC60
S31500009CA00000042865F008130006570808D30006BC
S31500009CB01CBC00EA2A7C0000042860082F0D4E9286
S31500009CC0205D4E90BBFC0000043465F008130006CE
S31500009CD0670808D300061CBC00EA0814000566 00E5
S31500009CE0014047D726B900C018442A7C00C000FAB4
S31500009CF02C7C00E00000081400076700008 8203C68
S31500009D0000E0000448006800 0E00158E4802F0057
S31500009D10487900E000004EB9000023364A936732C6
S31500009D204A9366063E3CFFFF6010205330280002 2F
S31500009D30720AE2680240003F3E000C4700036612CA
S31500009D404A9366064295429660 2E20532AA800083A
S31500009D50 60244AB900C00578660842B900C001020D
S31500009D60600E207900C0057823E8000400C00102D7
S31500009D702AB900C001022C953F3C00064EB90000EE
S31500009D807EF660564EB9000082982AB900C00102DC
S31500009D902C950814000667563F3C00044EB9000097
S31500009DA07EF64A9367204A9366063E3CFFFF6010A4
S31500009DB0205330280002720AE2680240003F3E004B
S31500009DC00C47000367103F3C00074EB900007EF6C3
S31500009DD008D4000260044A93660842B900E0000411
S31500009DE0603E205323E8000800E0000460320814B7
S31500009DF0000467063F3C000560043F3C00084EB97E
S31500009E0000007EF6203900E00004B09662087288F1
S31500009E10D296B081640A7088D09623C000E0000410
S31500009E202A7C0000043460082F0D4E92205D4E906F
S31500009E30BBFC0000043465F02A7C0000043460 0892
S31500009E402F0D4E92205D4E90BBFC0000047865F00D
S31500009E502A7C0000047860082F0D4E92205D4E90FB
S31500009E60BBFC0000047865F02A7C000004786008DA
S31500009E702F0D4E92205D4E90BBFC0000047C65F0D9
S31500009E802A7C0000047C60082F0D4E92205D4E90C7
S31500009E90BBFC000004A065F008140000670A3F3C04
S31500009EA000004EB900007EF630390080400E720D7B
S31500009EB0E268024000010200000108940000 8114DB
S31500009EC03F3C00024EB900007EF6089400052A7C4D
S31500009ED0000004A060082F0D4E92205D4E90BBFC42
S31500009EE0000004B465F02A7C000004B460082F0D5D
S31500009EF04E92205D4E90BBFC000004BC65F06116DE
S31500009F0060FC588F33C000A002224CDF7C804E7567
S31500009F104E714E714E7148E7203E33C000A00224B8
S31500009F20287C00C000FA267C00E00000247C00C0EB
S31500009F3000F62C7C00007EF64A92674E0C940F0CBD
S31500009F403F0063063F3C000A4E962A7C000004DC74
S31500009F50600A2F0D610002D0205D4E90BBFC000010
S31500009F6004DC65EE2A7C0000051C600A2F0D6100EA
S31500009F7002B6205D4E90BBFC0000052865EE2892D7
S31500009F8026944292 3F3C00094E962014B093620AF2
S31500009F90201390947214B08163062893600001C068
S31500009FA02013B094630001B852944AB900C0184413
S31500009FB0570000944EB9000082980C9300000014CC
S31500009FC0636A2A7C00C001024A956712700AD09320
S31500009FD02215B280640870F6D093B280624E4EB9F4
S31500009FE000008298 24952A7C000004DC600A2F0D6C
S31500009FF061000234205D4E90BBFC000004DC65EE7F
S3150000A0002A7C0000051C600A2F0D6100021A205DE3
S3150000A0104E90BBFC0000052865EE3F3C001E4E96A8
S3150000A020289226944292 3F3C00094E9620142079AD
S3150000A03000C0184490A800080C8000000E106306AB
S3150000A0403F3C002A4E962A7C000004DC6004205D1A
S3150000A0504E90BBFC0000050065F42A7C0080400E93
S3150000A060267C0080400A103900C0184C020000010E
S3150000A070424112003015740DE4680240 0001B240FE
S3150000A08067463015E46802400001207900C0C92007
S3150000A090322800020241 0001B04166063F3C000042
S3150000A0A060043F3C00014E963015720DE268024096
S3150000A0B000010200000108B9000000C0184C8139F7
S3150000A0C000C0184C0253FFFD207900C0C9200828A3
S3150000A0D000000003661A3015080000 0D67123013E1
S3150000A0E0080000001670A3F3C00004E960253FFFD40
S3150000A0F02014723C4EB9000257A84A8066602A7C3A
S3150000A100000005006004205D4E90BBFC00000514B5
S3150000A11065F42014223C00000E104EB9000257A828
S3150000A1204A80663A2A7C0000051460 04205D4E9041
S3150000A130BBFC0000051C65F42014223C0001518084
S3150000A14004EB9000257A84A8066142A7C0000051CF6
S3150000A15060 04205D4E90BBFC0000051C65F42A7C63
S3150000A1600000005286004205D4E90BBFC0000054001
S3150000A17065F423D400E000044A7900C0C8AC660840
S3150000A18033FC000100C0C8AC33C000A002264CDF7F
S3150000A19007C044E754E714E714E7133C000A002287C
S3150000A1A04FEFFFC04EB90000564A48780040486F4E
S3150000A1B000044EB9000022762F3900C0DA7E3F39FE

S3150000A1C000C0DAAC3F3900C0DAAA3F3900C0DAB0C5
S3150000A1D048790002C2F5486F000E4EB900022AA463
S3150000A1E03F3900C0DAA83F3900C0DAA63F3900C0BF
S3150000A1F0DAA43F3900C0DAA248790002C305486FE5
S3150000A200003E4EB900022AA44FEF002248574EB92D
S3150000A210000056DC4FEF004033C000A0022A4E7506
S3150000A2204E714E714E7133C000A0022C4FEFFFC02D
S3150000A23048780004486F00044EB9000022764879FD
S3150000A2400002C31F48790002C316486F00084EB9C2
S3150000A25000022AA4204F2F28005048790002C32C60
S3150000A260486F00344EB900022AA44FEF0018485731
S3150000A2704EB9000056DC4FEF004033C000A0022E5E
S3150000A280205F588F4ED04E714E714E7133C000A074
S3150000A2900230423900C0184E227C00C0DAB222BC1D
S3150000A2A000C0FAB62051213C0001711C228890FCA6
S3150000A2B0002C228833C000A002324E754E714E71BA
S3150000A2C04E7133C000A002340C39000200C0184E93
S3150000A2D066064EB90001BA4233C000A002364E757A
S3150000A2E04E714E714E7148E7033E33C000A00238EE
S3150000A2F02A7C00C0184E4A1566084EB90001BA42BB
S3150000A30060700C15000366602C7C008040081C16EB
S3150000A3101CBC00804247287C00804014267C00C07C
S3150000A32000FE247C00E00000602C0814000767266D
S3150000A330081400066714524708D4000652924213C6
S3150000A34013FC00EA008040156008521 34EB9000164
S3150000A350BA4208D400070C15000366060C470258DB
S3150000A36065C81C864215600A0C15000166041ABCF5
S3150000A370000233C000A0023A4CDF7CC04E754E711D
S3150000A3804E714E7148E7030C33C000A0023C4FEFFC
S3150000A390FFF4286F00203C2F00242A7C00C098CAB6
S3150000A3A053462E3C0000096A70003006EF889E80F6
S3150000A3B04A876F0000E24A3900C0A2456700008C58
S3150000A3C04A4666684878000348790002C879486FAB
S3150000A3D000084EB900023FC21F7C000100032F791E
S3150000A3E000C0C8FE00041F7C001800081F7C00186F
S3150000A3F000091F7C0003000A1F7C0004000B48575D
S3150000A4002F0C4878000C4EB9000020680C8700001D
S3150000A41000806D082C3C000000806002 2C072F0D88
S3150000A420486C000C70F4D0862F006064700030061 3
S3150000A430EF88D08D0680FFFFFFF42F002F0C0C87CE
S3150000A440000000806C422F0760464A4666200C8753
S3150000A450000000806D082C3C0000008060022C0784
S3150000A460486C000C2F0D70F4D0862F0060222F0C44
S3150000A47070003006EF88D08D0680FFFFFFF42F00B6
S3150000A4800C87000000806D064878008060022F0768
S3150000A4904EB9000020684A876E0C4A3900C0A246B1
S3150000A4A067046100165070000B0875CC044004880A5
S3150000A4B04FEF000C33C000A0023E4CDF30C0205FDF
S3150000A4C05C8F4ED04E714E714E7148E73F3E33C0A1
S3150000A4D000A002404FEFFEDC42463406227C00021A
S3150000A4E07CA241EF0012703920D951C8FFFC486F99
S3150000A4F000124EB90001ACC623FC0000A38400C0C4
S3150000A500A28C23FC0000A38400C0A2884A3900C0A4
S3150000A510A269670C3F3900C0A31A4EB90001594E13
S3150000A520247C00022A6E267C00C098FA4A3900C0B4
S3150000A530A268670007C64A3900C0A257660007BC72
S3150000A5402A7C00C098C43015486F000E02800000B7
S3150000A550FFFF4EB90002422448 7900027D8A486F07
S3150000A5600012486F01184EB900021FC4287C00C0B3
S3150000A57098BE30159054486F000C02800000FFFF13
S3150000A5804EB900024224487900027D8A486F0010C5
S3150000A590486F00104EB900021FC4487900027D8E34
S3150000A5A0486F000C486F000C4EB900021FAE486F92
S3150000A5B00004486F0114486F011C4EB900021F8247
S3150000A5C030159054486F000C02800000FFFF4EB912
S3150000A5D000024224487900027D8A486F0010486FC5
S3150000A5E000104EB900021FC4487900027D8E486FE4
S3150000A5F0000C486F000C4EB900021FAE486F0004F5
S3150000A600486F0114486F01204EB900021F5A2A7C78
S3150000A6100000054C2C7C00C098BA4A3900C0A252F2
S3150000A620670002D048790002C87D4E92588F4A3999
S3150000A63000C0A255670A363900C0A2CA3A036004B0
S3150000A640424576173E0549EF0120600002963A071B
S3150000A65048C5320748C1E58930331800486F000EF7
S3150000A66048C04EB9000242044879000 27D96486F00
S3150000A67000012486F00124EB900021FAE4879000260
S3150000A6807D92486F000E486F000E4EB900021F5AA9
S3150000A690486F00062005D080D085D080D08D2F0051
S3150000A6A0486F000A4EB900021FAE204F2F28000245
S3150000A6B0224C4EB9000249BC300748C0D080068003
S3150000A6C000C0987620403A103005487900027D8A0D
S3150000A6D0486F0118486F00163F4000184EB9000237
S3150000A6E01FAE486F000E4EB900024D3A916F000C36
S3150000A6F0487900027D8A486F011C486F00104EB9E8
S3150000A70000021FAE486F00084EB900024D3A904550
S3150000A710322F000CB24064243805487900027D8A45
S3150000A720486F0118486F00164EB900021FAE486FF9
S3150000A730000E4EB900024D3A9840602248790002 58
S3150000A7407D8A486F011C486F00164EB900021FAE85
S3150000A750486F000E4EB900024D3A380098452279EE
S3150000A76000C0C8BE41EF00FA700420D951C8FFFCF2
S3150000A77030913 20748C1D281068100028D1C2041EA
S3150000A7803010486F000E48C04EB9000242044879A6
S3150000A79000027D9A486F0012486F00124EB90002FF
S3150000A7A01FC42F0C486F000E486F000E4EB90002F2
S3150000A7B01FAE486F00FA486F000A486F000A4EB98C
S3150000A7C000021FAE204F2F2800023004486F0010F1
S3150000A7D002800000FFFF4EB9000242242F0C486F92
S3150000A7E00014486F00144EB900021FAE48790002EB
S3150000A7F07D9E486F0010486F00104EB900021FC4BE
S3150000A800486F00FE486F000C486F000C4EB90002FE
S3150000A8101FAE204F2F2800043004486F001402801A
S3150000A8200000FFFF4EB900024224487900027D8AEB
S3150000A830486F0018486F00184EB900021FC4204F19
S3150000A8402F28001030059056486F001848C04EB9A2
S3150000A85000024204487900027D8A486F001C486F56
S3150000A860001C4EB900021FC4204F2F2800143005CB
S3150000A870486F001C02800000FFFF4EB90002422410
S3150000A880487900027D8A486F0020486F00204EB943
S3150000A89000021FC4204F2F2800183007 48C0E58843
S3150000A8A00680000164C2F00487900027DA2486FF2
S3150000A8B0002A4EB900021FC4204F2F280022700321
S3150000A8C0C04748C0068000C098A6204042401010ED
S3150000A8D03F003F0748790002C8BB4E924FEF002069
S3150000A8E05247BE436F00FD68423900C0A252600065
S3150000A8F0040A4240103900C098003F00487900021F
S3150000A900C8EA4E924240103900C097FF3F0048798E
S3150000A9100002C9094E923016486F001A0280000 0E4
S3150000A920FFFF4EB900024224487900027D8A486F33
S3150000A930001E486F001E4EB900021FC4204F2F286C
S3150000A940001648790002C91D4E92303900C098BCE5
S3150000A950486F002202800000FFFF4EB90002422429
S3150000A960487900027D8A486F0026486F00264EB956
S3150000A97000021FC4204F2F28001E48790002C9324A
S3150000A9804E923014486F002A02800000FFFF4EB935
S3150000A99000024224487900027D8A486F002E486FE3
S3150000A9A0002E4EB900021FC4204F2F280026 4879DA
S3150000A9B00002C94D4E92203900C0C902486F0032CC
S3150000A9C04EB900024224487900027D8A486F00365B
S3150000A9D0486F00364EB900021FC4204F2F28002EA4
S3150000A9E048790002C96D4E92303900C098C2486F4E
S3150000A9F0003A02800000FFFF4EB9000242244879 67
S3150000AA00000027D8A486F003E486F003E4EB9000244
S3150000AA101FC4204F2F28003648790002C9874E925E
S3150000AA20204F2F28014448790002C9A44E92204F96
S3150000AA302F28015048790002C9B94E924FEF0044C1
S3150000AA40204F2F28011848790002C9CE4E9230397E
S3150000AA5000C09826486F00160280000 0FFFF4EB91E
S3150000AA6000024224487900027D8A486F001A486F26
S3150000AA70001A4EB900021FC4204F2F2800124879 31
S3150000AA800002C9E44E92303900C09828486F001E73
S3150000AA9002800000FFFF4EB900024224487900 02FE
S3150000AAA07D8A486F0022486F00224EB900021FC4FB
S3150000AAB0204F2F28001A48790002C9FA4E923039E1
S3150000AAC000C0982A486F002602800000FFFF4EB99A
S3150000AAD000024224487900027D8A486F002A486FA6
S3150000AAE0002A4EB900021FC4204F2F2800224879A1
S3150000AAF00002CA094E92303900C0982C486F002EC9
S3150000AB0002800000FFFF4EB90002422448790002 8D
S3150000AB107D8A486F0032486F00324EB900021FC46A
S3150000AB20204F2F28002A48790002CA184E924879E9
S3150000AB300002CA274E924FEF002C424749EF011CF4
S3150000AB40320748C1E589068100C098CA2041301005
S3150000AB50486F000E48C04EB900024204487900 0210
S3150000AB607D96486F0012486F00124EB900021FAE64
S3150000AB70487900027D92486F000E486F000E4EB96C
S3150000AB800000 21F5A486F000641ED0090300748C08A
S3150000AB90E788D1C02F082F0C4EB900021FAE300730
S3150000ABA048C0D080068000C098AA20403A103005E0
S3150000ABB044400640FFF0BA406404380560063 83C5D
S3150000ABC0FFF09845487900027DA62F0C486F0016C5
S3150000ABD04EB900021FAE204F2F28000E3004486FDA

S3150000ABE0001002800000FFFF4EB9000242242F0C25
S3150000ABF0486F0014486F00144EB900021FAE487922
S3150000AC0000027D9E486F0010486F00104EB900028A
S3150000AC101FC4204F2F2800083004486F00140280FC
S3150000AC200000FFFF4EB900024224487900027D8AE7
S3150000AC30486F0018486F00184EB900021FC4204F15
S3150000AC402F28001030059056486F001848C04EB99E
S3150000AC5000024204487900027D8A486F001C486F52
S3150000AC60001C4EB900021FC4204F2F2800143207C3
S3150000AC7048C1D281068100C098B220413010486F89
S3150000AC80001E02800000FFFF4EB9000242244879F0
S3150000AC9000027D8A486F0022486F00224EB90002EA
S3150000ACA01FC4204F2F28001A320748C1D2810681BF
S3150000ACB000C098AA20413010486F00220280000090
S3150000ACC0FFFF4EB900024224487900027D8A486F90
S3150000ACD00026486F00264EB900021FC4204F2F28B9
S3150000ACE0001E3F0748790002CA5F4E924FEF001ED2
S3150000ACF052470C4700046D00FE484A3900C0A2576F
S3150000AD00672A4A3900C0A26867224AB900C0A2D0A1
S3150000AD1052C04400488002400001ED4608B90006D0
S3150000AD2000C0A1FD817900C0A1FC7C014A3900C0A8
S3150000AD30A25F671A7003C07900C0A2F2E1480279E7
S3150000AD40FCFF00C0A1FC817900C0A1FC7C014A394E
S3150000AD5000C0A260671C7003C07900C0A2F6720A28
S3150000AD60E3680279F3FF00C0A1FC817900C0A1FC71
S3150000AD707C014A3900C0A261671C7007C07900C017
S3150000AD80A2FA720CE36802798FFF00C0A1FC8179F8
S3150000AD9000C0A1FC7C014A3900C0A2626718700F8E
S3150000ADA0C07900C0A2FE0279FFF000C0A1FA817945
S3150000ADB000C0A1FA7C014A3900C0A263673A700F4D
S3150000ADC0C07900C0A3020240000FE9480279FF0FD4
S3150000ADD000C0A1FA817900C0A1FA203900C0A30001
S3150000ADE0E88802400001E14808B9000000C0A1FA65
S3150000ADF0817900C0A1FA7C014A3900C0A264671CAF
S3150000AE00703FC07900C0A3067209E368027981FF2A
S3150000AE1000C0A1FA817900C0A1FA7C014A3900C0BC
S3150000AE20A2656718703FC07900C0A30A0279FFC007
S3150000AE3000C0A1FC817900C0A1FC7C014A3900C098
S3150000AE40A26A67263F3C00042F3900C0A31C43EFCB
S3150000AE5000144EB900024A34486F000E4EB9000283
S3150000AE604D3A33C000C0A1FE7C014A3900C0A25E43
S3150000AE70670A13F900C0A2EF00C0A2244A3900C035
S3150000AE80A25A67000096227C00026FAC207C00C0AC
S3150000AE9098CA203C0000025620D951C8FFFC3091C8
S3150000AEA0424542477C003C0570003007D080068052
S3150000AEB00002790A22402006D080D086EB88D08B0B
S3150000AEC072003207E589D081204031510002524795
S3150000AED00C47001865D252450C45001865C4227C03
S3150000AEE00002793A207C00C0A1FA700920D951C825
S3150000AEF0FFFC309113FC000100E0000A423900E03B
S3150000AF00000B423900E0000C13FC000100E0000DCC
S3150000AF10427900C0A2267C0134062A7C008040408B
S3150000AF20287C008040442C7C0080403C4A3900C08C
S3150000AF30A26767280279EFFF0080400802547FFF6E
S3150000AF400056800002567FFF0255FEFF0255FDFFA8
S3150000AF500055800000791000008040084A3900C082
S3150000AF60A26D6756487900027DAA487900C0A328D9
S3150000AF70486F00164EB900021FAE486F000E4EB95C
S3150000AF8000024D1433C000C0A2264A40660842792A
S3150000AF9000C0010060244A406C083E00444748C790
S3150000AFA060043E0048C7203C0001312D22074EB9FF
S3150000AFB00002374233C000C001004A3900C0A26611
S3150000AFC0670274014A3900C0A26B671E4A3900C085
S3150000AFD0A25567167003C0B900C0A2C8068000C09B
S3150000AFE098A6204010B900C0A3234A3900C0A26722
S3150000AFF0670000FC13FC000100C097F40279EFFF24
S3150000B0000080400802793FFF0080404600794000FA
S3150000B0100080404608B900060080402410390080B0
S3150000B0204024020000034244180002390 0FC00805C
S3150000B03040240279F3FF0080404600550200005488
S3150000B04080000005501003016024 01FFF3A00303CD8
S3150000B0500FFFC07900C0A3120254F00081542A7C6D
S3150000B06000C0A23C0C9500001E006C062ABC000025
S3150000B0701E002E3CFFFFF100DE9560164A7900C0E7
S3150000B080C8AE660833FC000100C0C8AE4EB9000168
S3150000B090BA6A2F3900026A4E4EB90000457E0C404E
S3150000B0A0FFFF66062015B08762D20254F0000054F6
S3150000B0B008007003C004023900FC0080402481397 6
S3150000B0C00080402408B900060080402408F90006E4
S3150000B0D00080402408B900070080402430 3C1FFF50
S3150000B0E0C0450256E000815642 3900C097F44A39FD
S3150000B0F000C0A25B670000D44A3900C0A2516600B6
S3150000B10000CA2A7C00C097F74A3900C0A2686624A4
S3150000B1104A3900C0A26C661C4A3900C0A2556614A2
S3150000B1204A3900C0A259660C4215423900C097F44C
S3150000B130600000984A3900C0A268670808F9000153
S3150000B14000C097F44A3900C0A26C670C23F900C00E
S3150000B150A32400C097F0600A23FC0000000000C092
S3150000B16097F04A3900C0A255671813F900C0A2CB60
S3150000B17000C097F908F9000000C097F41ABC000453
S3150000B18060147018B03900C097F9640A13C000C083
S3150000B19097F9600000024A3900C0A259671813F9EE
S3150000B1A000C0A2DB00C097FD08F9000000C097F4BC
S3150000B1B01ABC000460147004B03900C097FD640A1C
S3150000B1C013C000C097FD600000024A3900C0A258B3
S3150000B1D06704610010F64A4667064EB9000167F437
S3150000B1E04A42673A487900C098CA3F3C02583F3CF9
S3150000B1F000204EB900007D7A610008FA42472A7C99
S3150000B20000C052863F072F0D4EB90001440A4BED90
S3150000B21002E452470C47001865EA600008A64BEFA7
S3150000B22000E62E3C000240484A3900C0A26F670083
S3150000B23001D22A87600001B6082F000600F96714BC
S3150000B240486F001248790002CA894E92508F2A7CB4
S3150000B250003C0000424742467800380 67A003A062B
S3150000B26041ED00903007C0FC00C8D1C01028000690
S3150000B27048803F0041ED00903007C0FC00C8D1C0B7
S3150000B2803F28000441ED00904A30080767063F3C1E
S3150000B290002D60043F3C002B41ED00903007C0FCC0
S3150000B2A000C8D1C01028000248803F0041ED009040
S3150000B2B03007C0FC00C8D1C03F1041ED00904A30B5
S3150000B2C0080367063F3C002D60043F3C002B41ED20
S3150000B2D000903007C0FC00C8D1C05088700030060E
S3150000B2E0E788D1C01028000648803F0041ED009055
S3150000B2F03007C0FC00C8D1C05088700003006E7880F
S3150000B300D1C03F28000441ED00903007C0FC00C8C2
S3150000B310D1C05088700003006E788D1C04A2800079F
S3150000B32067063F3C002D60043F3C002B41ED00903A
S3150000B33003007C0FC00C8D1C05088700003006E788CE
S3150000B340D1C01028000248803F0041ED0090300730
S3150000B350C0FC00C8D1C05088700003006E788D1C054
S3150000B3603F1041ED00903007C0FC00C8D1C05088A6
S3150000B37070003006E788D1C04A2800367063F3CC4
S3150000B380002D60043F3C002B2205D281D285D2B15C
S3150000B39010351802 48803F002004D080D084D08029
S3150000B3A03F3508007A003A062005D080D085D08047
S3150000B3B04A35080367063F3C002D60043F3C002BDE
S3150000B3C03F063F07486F00AC48790002CAC94E9253
S3150000B3D04FEF002A52460C4600186500FE7C524785
S3150000B3E00C4700046500FE704BED03C242A7486F90
S3150000B3F000164EB90001A8924A006600FE3C6000A5
S3150000B40006C2287C00C0A2C44DEF00E24A3900C043
S3150000B410A256660A4A3900C0A257670000B44A39E4
S3150000B42000C0A255670000A04A3900C0A2546700B8
S3150000B43000962F4700E6026F00FF00E24A3900C07F
S3150000B440A254671013FC000100C0A24D23D400C013
S3150000B450A2A8605E7001288060581 02F00F848800E
S3150000B460206F00CA321002410003C0C13C00303CCC
S3150000B470FFFFD07900C0A2C6D0467E003E0020075E
S3150000B480D080D087EB88D08B223900C0A2C8E5894E
S3150000B490D0812A404A3900C0A25767063AB900C08F
S3150000B4A0A2D24A3900C0A25667083B7900C0A2CE94
S3150000B4B0000242A7486F00164EB90001A8924A0042
S3150000B4C06698600005FE48790002CB0B600000E23A
S3150000B4D04A3900C0A25D660A4A3900C0A25C67000C
S3150000B4E00D84A3900C0A253670000C04A3900C0DC
S3150000B4F0A259670000B608AF000200E42F7C0002E4
S3150000B500404000E6026F00FF00E24A3900C0A25345
S3150000B51067000008413FC000100C0A24D23F900C09F
S3150000B520A2C000C0A2A8606E302F00E2024000FF59
S3150000B5300C40000364603039 00C0A2C2122F00F82C
S3150000B5404881206F00CA341002420003C2C2D041B3
S3150000B55053407200320006810000 16AC20411010E4
S3150000B560488048C0E988068000C098CA223900C0D1
S3150000B570A2D8E589D0812A404A3900C0A25D670871
S3150000B5803B7900C0A2EA00024A3900C0A25C670505
S3150000B5903AB900C0A2E642A7486F00164EB90001AC
S3150000B5A0A8924A006682600005 1A48790002CB57C5
S3150000B5B04E92588F6000050C4A3900C0A2516700B0
S3150000B5C003C070402A8008AF000200E44A3900C078
S3150000B5D0A25367000396 13FC000100C0A24D23F995
S3150000B5E000C0A2C000C0A2A86000038 0302F00E205
S3150000B5F0024000FF0C40000364000370082F0006A1

S3150000B60000F9670002044A3900C0A259660001FA2F
S3150000B6104A3900C0A253660001F04240103900C00A
S3150000B62097FD3F004240103900C097F93F004A3964
S3150000B63000C097F4660848790002CBA360064879F3
S3150000B6400002CBB84E92508F4A3900C0A25B66000A
S3150000B65001B8487900027DAE487900C097F04EB92E
S3150000B66000021FF24A406F102F3900C097F0487948
S3150000B6700002CBD84E92508F0C39000100C097F4CF
S3150000B680630A48790002CBFA4E92588F103900802F
S3150000B6904024E8080200000372001200E7890681D0
S3150000B6A000028D6820412F280004103900804024B4
S3150000B6B0E408020000034241120030013F00103945
S3150000B6C00080402402000003424112003001 3F0086
S3150000B6D02F3900C0185648790002CC0C4E923039EA
S3150000B6E000C0A2264BC0720FE3A8486F001A4EB9E0
S3150000B6F000024204487900027DB2486F001E486F7E
S3150000B700001E4EB900021FC4204F2F28001648798C
S3150000B7100002CC4E4E92303900C0A1FCE048D240F7
S3150000B72000033F00303900C0A1FC720AE268024003
S3150000B73000033F00303900C0A1FC720CE2680240F1
S3150000B74000073F00303900C0A1FA0240000F3F0059
S3150000B750303900C0A1FAE04802400001E948323918
S3150000B76000C0A1FAE8490241000FD0413F0030393C
S3150000B77000C0A1FA7209E2680240003F3F00487922
S3150000B7800002CC704E92303900C0A1FC0240003F4E
S3150000B7903F0048790002CCA64E920839000600C048
S3150000B7A0A1FD670848790002CCCD60064879000201
S3150000B7B0CCD548790002CCBA4E92303900C0A1FEF1
S3150000B7C0486F004402800000FFFF4EB90002422489
S3150000B7D0487900027D8A486F0048486F00484EB994
S3150000B7E000021FC4204F2F280004048790002CCDCFD
S3150000B7F04E92103900C0A22448803F0048790002CA
S3150000B800CCFC4E924FEF00444A3900C0A259670A59
S3150000B8103C3900C0A2DA3A06600442457C03082F90
S3150000B820000600F967124A3900C0A26E660A487916
S3150000B8300002CD134E92588F3E0560000128302F2E
S3150000B84000E2024000FF72003200E989068100C072
S3150000B85098CA70003007E588D2802A414A3900C06C
S3150000B860A26E670000DE302F00E2024000FF3200C9
S3150000B870C2FC00B006810000054C264141EB009059
S3150000B88070003007E788D1C02848302D0002486F85
S3150000B890000E48C04EB900024204487900027D9667
S3150000B8A0486F0012486F00124EB900021FAE487969
S3150000B8B000027D92486F000E486F000E4EB90002DE
S3150000B8C01F5A486F0006486C0004486F000A4EB9BC
S3150000B8D000021FAE204F2F2800023015486F0012BD
S3150000B8E048C04EB900024204487900027D96486F6E
S3150000B8F00016486F00164EB900021FAE48790002C6
S3150000B9007D92486F0012486F00124EB900021F5A0E
S3150000B910486F000A2F0C486F000E4EB900021FAE8A
S3150000B920204F2F2800063F07302F00EC024000FF73
S3150000B93052403F0048790002CD2C4E924FEF001046
S3150000B94060203F2D00023F153F07302F00E80240E0
S3150000B95000FF52403F0048790002CD4F4E924FEF14
S3150000B960000C5247BE466300FED642A7486F00163B
S3150000B9704EB90001A8924A006600FC7260000144BC
S3150000B9804A3900C0A2526700013A2A87025600FFD0
S3150000B9904A3900C0A254660670012880600E13FC66
S3150000B9A0000100C0A24D23D400C0A2A84A3900C09D
S3150000B9B02C16670000FC08EF000000E6600000F2AD
S3150000B9C04A3900C0A255670A3A3900C0A2CA3C05E6
S3150000B9D0600442467A17082F000600F9670E486F82
S3150000B9E0001248790002CD604E92508F3E066000EC
S3150000B9F000BA302F00E2024000FF7C003C00200627
S3150000BA00D080D086EB88D08B72003207E589D08152
S3150000BA102A404A3900C0A26E67767C003C073F2D5B
S3150000BA2000023015486F001048C04EB900024204AB
S3150000BA30487900027D96486F0014486F00144EB98D
S3150000BA4000021FAE487900027D92486F0010486FD1
S3150000BA5000104EB900021F5A486F00082006D08019
S3150000BA60D086D08006800000054C2F00486F000C61
S3150000BA704EB900021FAE204F2F2800043F07486F23
S3150000BA80009248790002CD734E924FEF0010601875
S3150000BA903F2D00023F153F07486F0090487900028E
S3150000BAA0CD914E924FEF000E5247BE456300FF44C4
S3150000BAB042A7486F00164EB90001A8924A006600D8
S3150000BAC0FF004A3900C0A24567047EFD600E4A3970
S3150000BAD000C0A24667047EFE6002424730074FEF71
S3150000BAE0012433C000A002424CDF7CFC4E754E712F
S3150000BAF04E714E7148E73F3E33C000A002444FEFFF
S3150000BB00FFCC2F79003C6396000C3F3C001E4EB9DB
S3150000BB100001C1860279EFFF0080400842442F7C75
S3150000BB200000054C00184BEF001249EF001C3004D2
S3150000BB30C0FC03C20680003C00002F4000144245B2
S3150000BB4074003404760036042O3C00000090D0AF28
S3150000BB5000143205C3FC00C8D0812C40203C0000F4
S3150000BB600090D0AF0018320548C1E789D081264041
S3150000BB7072003204068100016AC2041121048818 2
S3150000BB8048C1E989068100C098CA3C0548C6E58EC9
S3150000BB90D28620413010486F000848C04EB90002D6
S3150000BBA04204487900027D96486F000C486F000CED
S3150000BBB04EB900021FAE487900027D92486F000818
S3150000BBC0486F00084EB900021F5A48572F0B486F9E
S3150000BBD0002C4EB900021FAE72003204068100002E
S3150000BBE016AC2041121048814 8C1E989068100C07F
S3150000BBF098CA3C0548C6E58ED28620413028000208
S3150000BC00486F000848C04EB90002420448790002 55
S3150000BC107D96486F000C486F000C4EB900021FAEAF
S3150000BC20487900027D92486F0008486F00084EB9B7
S3150000BC3000021F5A4857486B0004486F00284EB947
S3150000BC4000021FAE4246246F0018486F0020486F5E
S3150000BC500024486F00104EB900021FAE487900025A
S3150000BC607DB6486F000C486F00344EB900021FAE17
S3150000BC70486F0024486F0028486F00104EB9000234
S3150000BC801FAE487900027DB6486F000C486F003839
S3150000BC904EB900021FAE4A7900C0C8AE660833FC32
S3150000BCA0000100C0C8AE203900C0A24090B900C053
S3150000BCB0A23C7240B0816F064EB90001BA6A2203F7
S3150000BCC0D281D283EB89068100C098FA3E0648C726
S3150000BCD0E58FD28720413010486F000848C04EB922
S3150000BCE000024204487900027D96486F000C486FB6
S3150000BCF0000C4EB900021FAE487900027D92486FD3
S3150000BD000008486F00084EB900021F5A48572F0A0C
S3150000BD10486F00304EB900021FAE207900C0C9201E
S3150000BD20302800020800000E671048790000054818
S3150000BD30486F002C4EB900021D0C4A4566000126CC
S3150000BD40486F0028486F002C486F00104EB900025B
S3150000BD501FAE487900027DB6486F000C2F0C4EB915
S3150000BD6000021FAE7020D079000016283F002F1465
S3150000BD70224C4EB900024A34422F001260123F3C58
S3150000BD8000012F14224C4EB900024A34532F0012E0
S3150000BD90487900027DBA2F0C4EB900021FF24A40C4
S3150000BDA06C34102F001248804A406C0A1E2F001275
S3150000BDB04887444760061E2F001248870C4700102C
S3150000BDC06C1460BA3F3CFFFF2F14224C4EB90002A0
S3150000BDD04A34522F001248790002 7DBE2F0C4EB90C
S3150000BDE000021FF24A406F20102F001248804A407E
S3150000BDF06C0A1E2F00124887444760061E2F001249
S3150000BE0048870C4700106DBC2F0C4EB900024D3A06
S3150000BE103F400010422F00133E0648C7202F001453
S3150000BE202207D281D287D281D08126403F3C0002B0
S3150000BE30486F00122F0B4EB9000049842002D080B3
S3150000BE40D082EB88068000C098FA320648C1E589A0
S3150000BE50D08120403E2800023F07486B00044EB9BF
S3150000BE600001C1E441EE0008300648C0E788D1C0B1
S3150000BE702648486F0024486F002C486F00104EB9C2
S3150000BE8000021FAE487900027DB6486F000C2F0CE9
S3150000BE904EB900021FAE487900027DAE2F0C4EB996
S3150000BEA000021FF24A405DC0440048801F40001354
S3150000BEB02F14224C4EB9000249BC7020D0790000E4
S3150000BEC016203F002F14224C4EB900024A34422F4E
S3150000BED0001260123F3C00012F14224C4EB90002A2
S3150000BEE04A34532F001248790002 7DBA2F0C4EB9FE
S3150000BEF000021FF24A406C34102F001248804A405C
S3150000BF006C0A1E2F00124887444760061E2F001237
S3150000BF1048870C4700106C1460BA3F3CFFFF2F1493
S3150000BF20224C4EB900024A34522F00124879 0002C0
S3150000BF307DBE2F0C4EB900021FF24A406F20102F13
S3150000BF40001248804A406C0A1E2F00124887444758
S3150000BF5060061E2F001248870C4700106DBC2F0C80
S3150000BF604EB900024D3A3F4000103F3C0002486F78
S3150000BF7000122F0B4EB9000049844 86F0020486F0D
S3150000BF80002C486F00104EB900021FAE487900021F
S3150000BF907DB6486F000C2F0C4EB900021FAE4879D3
S3150000BFA00027DAE2F0C4EB900021FF24A405DC062
S3150000BFB0440048801F4000132F14224C4EB9000243
S3150000BFC049BC7020D079000016203F002F14224C67
S3150000BFD04EB900024A34422F001260123F3C000163
S3150000BFE02F14224C4EB900024A34532F00124879BE
S3150000BFF000027DBA2F0C4EB900021FF24A406C3483
S3150000C000102F001248804A406C0A1E2F00124887E3
S3150000C01044476 0061E2F001248870C4700106C1418

S3150000C02060BA3F3CFFFF2F14224C4EB900024A343F
S3150000C030522F0012487900027DBE2F0C4EB9000225
S3150000C0401FF24A406F20102F001248804A406C0AA7
S3150000C0501E2F0012488744476006 1E2F001248878D
S3150000C0600C4700106DBC2F0C4EB900024D3A3F40F4
S3150000C07000103F3C0002486F0012486B00044EB9A6
S3150000C0800000498428AF00307020D07900001634B3
S3150000C0903F002F14224C4EB900024A34422F0012A0
S3150000C0A060123F3C00012F14224C4EB900024A3464
S3150000C0B0532F0012487900027DBA2F0C4EB90002A8
S3150000C0C01FF24A406C34102F001248804A406C0A16
S3150000C0D01E2F0012488744476006 1E2F001248870D
S3150000C0E00C4700106C1460BA3F3CFFFF2F14224C23
S3150000C0F04EB900024A34522F0012487900027DBE22
S3150000C1002F0C4EB900021FF24A406F20102F00126A
S3150000C11048804A406C0A1E2F0012488744476006 32
S3150000C1201E2F001248870C4700106DBC2F0C4EB90D
S3150000C13000024D3A3F400010422F00133F3C0002E0
S3150000C140486F00122F0E4EB90000498428AF002C0C
S3150000C1507020D079000016363F002F14224C4EB9BD
S3150000C16000024A34422F001260123F3C00012F1495
S3150000C170224C4EB900024A34532F0012487900026D
S3150000C1807DBA2F0C4EB900021FF24A406C34102FB4
S3150000C19000124880 4A406C0A1E2F0012488744476 06
S3150000C1A060061E2F001248870C4700106C1460BAF8
S3150000C1B03F3CFFFF2F14224C4EB900024A34522F47
S3150000C1C00012487900027DBE2F0C4EB900021FF204
S3150000C1D04A406F20102F001248804A406C0A1E2FDA
S3150000C1E0001248874447 60061E2F001248870C47F6
S3150000C1F000106DBC2F0C4EB900024D3A3F400010A6
S3150000C200422F00133F3C0002486F0012486EB0004A4
S3150000C2104EB90000498452465C8A0C4600186D00EF
S3150000C220FA7652450C4500046D00F91E524406AFDD
S3150000C230000000B000180C4400186500F8F23F3CFE
S3150000C24004AF487900C098CA4879003C5A304EB9C4
S3150000C250000049842F3900C000FA4879003C638EFB
S3150000C2604EB900004898206F000C486800014879D4
S3150000C270003C63954EB9000048982F3900C0C8FEAE
S3150000C2804879003C63924EB9000048983F3C00183C
S3150000C2904879003C639A4EB90001C1E43F3C001E58
S3150000C2A04879003C639C4EB90001C1E40079100056
S3150000C2B0008040084FEF003433C000A002464CDF38
S3150000C2C07CFC4E754E714E714E7148E72F3E33C061
S3150000C2D000A002484FEFFFE8227C003C5A30207C49
S3150000C2E000C098CA203C0000025620D951C8FFFC65
S3150000C2F030914EB9000167F44246267C0000054C99
S3150000C3004DEF00143006C1FC03C20680003C00005D
S3150000C310244042472A4A284B380648C43A0648C5AC
S3150000C3202C94207900C0C92030280002080000 0E95
S3150000C330670E48790000005482F0E4EB900021D0C05
S3150000C340102D0002488090790000016280640FFE074
S3150000C3503F003015486F000A02800000FFFF4EB90B
S3150000C36000024224204F2F28000A43EF00124EB944
S3150000C37000024A34487900027DC2486F0010486FB7
S3150000C38000104EB900021FAE204F2F28000843EFC1
S3150000C39000144EB900023CEC2F0E486F0014486F93
S3150000C3A000104EB900021FC4204F2F28000843EF8B
S3150000C3B000104EB9000249BC487900027DCA486F98
S3150000C3C00010486F00104EB900021F5A487900024B
S3150000C3D07D96486F000C486F000C4EB900021FC4D2
S3150000C3E0487900027DC6486F0008486F00084EB9EC
S3150000C3F000021F5A204F2F1043EF00144EB90002BF
S3150000C40047A0486F00104EB900024D142204D28195
S3150000C410D284EB69068100C098FA340748C2E58ABF
S3150000C420D2822041308020 05D080D085EB880680DE
S3150000C43000C098FA320748C1E589D0812040316DA5
S3150000C4400004000252475C8C5C8D0C4700186D009E
S3150000C450FED00C4600036C000202424749EB0090F6
S3150000C4604BEA00902C94102D0002488090790000 31
S3150000C47016340640FFE03F003015486F000A028080
S3150000C4800000FFFF4EB900024224204F2F28000A69
S3150000C49043EF00124EB900024A34487900027DC2C9
S3150000C4A0486F0010486F00104EB900021FAE204FB3
S3150000C4B02F28000843EF00144EB900023CEC2F0E63
S3150000C4C0486F0014486F00104EB900021FC4204F79
S3150000C4D02F28000843EF00104EB9000249BC4879E6
S3150000C4E000027DCA486F0010486F00104EB9000266
S3150000C4F01F5A487900027D96486F000C486F000C61
S3150000C5004EB900021FC4487900027DC6486F000874
S3150000C510486F00084EB900021F5A204F2F1043EFF4
S3150000C52000144EB9000247A0486F00104EB9000231
S3150000C5304D14207C000016AC12306000488148C1C2
S3150000C540E989068100C098CA340748C2E58AD282C2
S3150000C55020413080 2CAC0004102D000648809079D4
S3150000C56000001636 0640FFE03F00302D0004486FFD
S3150000C570000A02800000FFFF4EB900024224204F4D
S3150000C5802F28000A43EF00124EB900024A344879B8
S3150000C59000027DC2486F0010486F00104EB90002BD
S3150000C5A01FAE204F2F28000843EF00144EB900029B
S3150000C5B03CEC2F0E486F0014486F00104EB9000275
S3150000C5C01FC4204F2F28000843EF00104EB9000269
S3150000C5D049BC487900027DCA486F0010486F0010B8
S3150000C5E04EB900021F5A487900027D96486F000C2A
S3150000C5F0486F000C4EB900021FC4487900027DC680
S3150000C600486F0008486F00084EB900021F5A204FB5
S3150000C6102F1043EF00144EB9000247A0486F0010DB
S3150000C6204EB900024D14207C000016AC123060009A
S3150000C630488148C1E989068100C098CA340748C2C2
S3150000C640E58AD28220413140000252474BED00C8B4
S3150000C650508C0C4700046D00FE0C524647EB00B0B0
S3150000C6600C4600186D00FC9E4FEF001833C000A06A
S3150000C670024A4CDF7CF44E754E714E714E7133C0DA
S3150000C68000A0024C4A3900C097F46714227C00C00F
S3150000C69097F74A11670A5311660 6423900C097F4A4
S3150000C6A033C000A0024E4E754E714E714E7133C0AE
S3150000C6B000A00250424033C000A00252205F5C8FAF
S3150000C6C04ED04E714E714E7148E73F3E33C000A0CA
S3150000C6D002544FEFFEB66100131C38003A3CFFF3DC
S3150000C6E0DA444243227C00027FCE41EF00287039B3
S3150000C6F020D951C8FFFC4A3900C0A24B67284A39E5
S3150000C70000C02C1667202A7C00C0A2A00C95000051
S3150000C7100000266067001 2A80600C0C950000000875
S3150000C720660470062A80486F00284EB90001ACC620
S3150000C73023FC0000C6AE00C0A28C23FC0000C6AEDF
S3150000C74000C0A2884BEF00FC47EF0130247C0002BA
S3150000C7502A6E4A3900C0A2536700011E2ABC002374
S3150000C760C0DC08EF000300FA600000F8082F00069E
S3150000C770010F670E486F00284879 0002D18E4E924D
S3150000C780508F302F00F8E048024000FF0C400003B5
S3150000C7906710302F00F8E048024000FF0C40000808
S3150000C7A0662C0253FF00601A2F134EB900014EC4C7
S3150000C7B03013024000FF5240024000FF0253FF00C8
S3150000C7C08153301302400 0FF0C40001865DA4A39E5
S3150000C7D000C0A25C66164A3900C0A255660E486FB4
S3150000C7E000A048790002D1934E92508F2F3900C095
S3150000C7F013F03F3C0001204F2F2800FE43EF00229C
S3150000C8004EB9000072FA206F00E030280002 0240A4
S3150000C810003F3F00204F2F28001E2F28001A43EF0D
S3150000C820002A4EB90001A234204F2F2800F0486F8D
S3150000C830001C4EB900021DF6486F0018486F002410
S3150000C840486F00184EB900021DB8204F2F2800145B
S3150000C8502F280010206F00F84868000D4E924FEF09
S3150000C860000C42A7486F002C4EB90001A8924A005E
S3150000C8706600FEFA600011664A3900C0A25A675483
S3150000C8802A7C008040241015E80802000003 72008C
S3150000C89 01200E789068100028D6820412F280004D6
S3150000C8A01015E40802000003424112003 0013F0067
S3150000C8B010150200000342411200300 13F002F39DB
S3150000C8C000C018564879 0002D1984E924FEF0010DA
S3150000C8D06000110A08AF000200FA2ABC0002C04834
S3150000C8E04A3900C0A25766084A3900C0A2556708EF
S3150000C8F000AF0001000400FC4A3900C02C16670690
S3150000C90008EF000000FC2C7C00C0C8BE4A3900C0FD
S3150000C910A25767000FBA0C39000500C0A384640A49
S3150000C92008EF000700FF60000FA64A3900C02C166A
S3150000C930671008AF0002013208AF000000FD60007A
S3150000C9400F8E08EF000400FF60000F8426AF00F88A
S3150000C950082F0006010F673E4A44633A4A3900C071
S3150000C960A25966320C440013660A4A3900C0A25C1A
S3150000C970670254454A3900C02C166702564 5486F6F
S3150000C98000287000 3005E588068000027DCE204034
S3150000C9902F104E92508F3013024000FF3200C2FC1F
S3150000C9A002E4068100C052862A4142461C2D02B688
S3150000C9B042471E2D02B74A3900C0A25566164A39AB
S3150000C9C000C0A257660E486F00A048790002D1DA6F
S3150000C9D04E92508F30040640FFF30C400007620071
S3150000C9E00EEED040303B00064EFB00020010034E18
S3150000C9F00EE201A80CFC0D5405D80DB0082F000658
S3150000CA00010F671C227C00028D6041EF011420D9C2
S3150000CA102091227C00028D6041EF011C20D92091DB
S3150000CA203F073F0648790002D1DF4E92508F4247BA
S3150000CA30207900C0C920302800020800000F6708CE

S3150000CA40287C00027FAC605A287C00027FA86052D6
S3150000CA50101C4880024000FFE148025300FF81534A
S3150000CA603013E048024000FF3F002F0D4EB9000191
S3150000CA7055043F3C000141ED01BE3013E048024041
S3150000CA8000FF72003200E589D1C12F102F1342A793
S3150000CA904EB900017E3448790002D1E84E92588F93
S3150000CAA052470C4700046DA842474A476606253A0
S3150000CAB000FF6008025300FF08D300003F3C00015E
S3150000CAC02F1343EF012E4EB9000075C4206F00DC12
S3150000CAD03013E048024000FF72003200E589D1C100
S3150000CAE008280002000167000094204F2F28012C1F
S3150000CAF02F28012841EF011C300748C0E788D1C024
S3150000CB002F2800042F1043EF0124300748C0E78880
S3150000CB10D3C04EB900019EDA206F00E3028000233
S3150000CB200240003F3F00204F2F28012E2F28012AC8
S3150000CB3043EF002A4EB90001A234204F2F2800F0FF
S3150000CB40486F001C4EB900021DF6486F0018486F6A
S3150000CB500024486F00184EB900021DB8204F2F2838
S3150000CB6000142F280010206F00F84868000D4E9220
S3150000CB704FEF000C48790002D1EA600648790002BE
S3150000CB80D1EC4E92588F52470C4700026D00FF1CA5
S3150000CB9060000D3C2F134EB900014EC44247207968
S3150000CBA000C0C920302800020800000F6708287C52
S3150000CBB000027FB5605A287C00027FB06052101CCC
S3150000CBC04880024000FFE148025300FF81533013C2
S3150000CBD0E048024000FF3F002F0D4EB9000155040A
S3150000CBE03F3C000141ED01BE3013E048024000FF2A
S3150000CBF072003200E589D1C12F102F1342A74EB91A
S3150000CC0000017E3448790002D1F84E92588F52477F
S3150000CC100C4700046DA83013024000FF3F0043EFAD
S3150000CC2000264EB900016514204F2F2800244879AC
S3150000CC300002D1FA4E923013024000FF3F0043EF4C
S3150000CC40002E4EB900016492204F2F28002C4879FF
S3150000CC500002D2044E924FEF00102A7C00027FBAE7
S3150000CC60287C00027FBE600000C410154880024088
S3150000CC7000FFE148025300FF8153206F00DC3013B0
S3150000CC80E048024000FF72003200E589D1C1082861
S3150000CC9000020001670000883F3C00012F1343EFAC
S3150000CCA0001E4EB9000075C4206F00E3028000257
S3150000CCB00240003F3F00204F2F28001E2F28001A59
S3150000CCC043EF002A4EB90001A234204F2F2800F06E
S3150000CCD0486F001C4EB900021DF6486F0018486FD9
S3150000CCE00024486F00184EB900021DB8204F2F28A7
S3150000CCF000142F280010206F00F84868000D4E928F
S3150000CD002F1448790002D20C4E924FEF0014BBFC50
S3150000CD1000027FBD671248790002D20F600648798B
S3150000CD200002D2114E92588F528D588CBBFC0002D5
S3150000CD307FBE6500FF3660000B964A3900C0A256DA
S3150000CD4066000178025300FF08D300023F3C00044E
S3150000CD502F0D4EB9000155042F2D01CE4879000242
S3150000CD60D21D4E9248790002D2274E9230130240CD
S3150000CD7000FF3F0043EF00324EB9000165AA204F85
S3150000CD802F28003048790002D2294E92025300FF24
S3150000CD9000530A003F3C00012F1343EF00324EB907
S3150000CDA0000075C4206F00F4302800020240003FE6
S3150000CDB03F00204F2F2800322F28002E43EF003E41
S3150000CDC04EB90001A234204F2F280104486F0030CD
S3150000CDD04EB900021DF6486F002C486F0038486FA8
S3150000CDE0002C4EB900021DB8204F2F2800282F28EE
S3150000CDF00024206F010C4868000D4E92307C009A8A
S3150000CE00D1EF010C3013E048024000FF3200C2FCB3
S3150000CE10002CD1C14868001A48790002D2334E92DC
S3150000CE20025300FF00530B003F3C00012F1343EF5A
S3150000CE3000464EB9000075C4206F01083028000274
S3150000CE400240003F3F00204F2F2800462F28004277
S3150000CE5043EF00524EB90001A234204F2F2801188B
S3150000CE60486F00444EB900021DF6486F0040486FF7
S3150000CE70004C486F00404EB900021DB8204F2F28C5
S3150000CE80003C2F280038206F01204868000D4E9284
S3150000CE904FEF0034307C009AD1EF00EC3013E048BD
S3150000CEA0024000FF3200C2FC002CD1C14868001AC3
S3150000CEB048790002D2386000035C3013024000FF5C
S3150000CEC03F0043EF00264EB90001651430130240BF
S3150000CED000FF3F0043EF00224EB900016492301379
S3150000CEE0024000FF3F0043EF001E4EB9000165AA55
S3150000CEF0204F2F28001C204F2F280024204F2F289A
S3150000CF00002C3F073F0648790002D23D4E924FEF74
S3150000CF1000144A3900C0A252670009B4287C0002F6
S3150000CF208BE86000009210144880024000FFE14840
S3150000CF30025300FF81533013E048024000FF3F00D8
S3150000CF402F0D4EB90001550441ED01BE3013E048E6
S3150000CF50024000FF72003200E589D1C12F104879E6
S3150000CF600002D2574E923013E048024000FF0C40B8
S3150000CF7000004660848790002D265602C303CFF0048
S3150000CF80C05366084B790002D267601C3013E04837
S3150000CF90024000FF0C40000166084879000 2D26991
S3150000CFA0600648790002D26B48790002D2604E9240
S3150000CFB04FEF0010528CB9FC00028BEC6500FF6845
S3150000CFC06000090C4A3900C0A25C66000250486F36
S3150000CFD000A048790002D26F4E92508F4A3900C0A5
S3150000CFE02C166730303CFF00C053660848790002B3
S3150000CFF0D274601C3013E048024000FF0C4000056C
S3150000D00066084879000 2D278600648790002D27C28
S3150000D0104E92588F0C39000400C0A384640E206F12
S3150000D02000E008280002000167 0008A408EF0003DA
S3150000D030013 2203C0000009AD0963213E0490241AA
S3150000D04000FF3401C4FC002CD082068000000016CC
S3150000D05022 4041EF0134700420D951C8FFFC3091C1
S3150000D0603F3C000D2F1343EF001E4EB9000075C460
S3150000D07 03013E048024000FF72003200D281068180
S3150000D080000016202041 3F10204F2F28001E2F2879
S3150000D090001A43EF002A4EB90001A2343F3C000BB0
S3150000D0A02F1343EF00164EB9000075C43013E04845
S3150000D0B0024000FF72003200D28106810000162075
S3150000D0C020413F10204F2F2800162F28001243EF33
S3150000D0D000224EB90001A2343F3C00072F1343EF54
S3150000D0E0000E4EB9000075C43013E048024000FF40
S3150000D0F072003200D28106810000162020413F10C6
S3150000D100204F2F28000E2F28000A43EF001A4EB991
S3150000D1100001A234486F0134486F000C4EB900027A
S3150000D1201DF6486F0008486F0014486F00084EB996
S3150000D13000021DB8204F2F2800042F10486F013C15
S3150000D140486F001C4EB900021DF6486F0018486F64
S3150000D15000024486F00184EB900021DB8204F2F2832
S3150000D16000142F280010486F0144486F002C4EB958
S3150000D17000021DF6486F0028486F0034486F0028EB
S3150000D1804EB900021DB8204F2F2800242F2800205A
S3150000D19048790002D2804E924FEF001C4A3900C0F7
S3150000D1A0A25B6752302F0132720AE2680240000128
S3150000D1B07E003E00486F01347044D0B900C00106BD
S3150000D1C02207E7899287E789D0813213E049024135
S3150000D1D000FF74003401E58AD0822F00486F002CCE
S3150000D1E04EB900021FAE204F2F28002448790002B6
S3150000D1F0D2994E92508F4A3900C02C16660C486F51
S3150000D2000013848790002D2A1600A486F013848798E
S3150000D210002D2A44E92508F600006B43013E0484C
S3150000D220024000FF0C40000366000258302F013216
S3150000D230720AE2680240000 17E003E002007ED8887
S3150000D2409087ED88068000C032D83213024100FF75
S3150000D2503401C4FC00A8D082068000000242A40C5
S3150000D260224D41EF012420D920D92091486F00A0FA
S3150000D27048790002D2A94E923F39000016262F2D7A
S3150000D280000 82F2D00042F1543EF00364EB900017C
S3150000D290A2F8302F013A720AE268024000017C00CF
S3150000D2A03C003013024000FF7E003E003F39000084
S3150000D2B016282006E788D086EB88068000C02C1842
S3150000D2C02207D281D287E589D08120402F28000805
S3150000D2D02F2800042F1043EF002E4EB90001A2F8AC
S3150000D2E0302F013A720AE268024000017C003C00DD
S3150000D2F03013024000FF7E003E003F390000163426
S3150000D3002006E788D086EB88068000C03098220782
S3150000D310D281D287E589D08120402F2800082F2886
S3150000D32000042F1043EF00264EB90001A2F8205644
S3150000D33048680268486F00144EB900021DF6486F2F
S3150000D3400010486F001C486F00104EB900021DB84F
S3150000D350204F2F28000C2F2800082056486801600F
S3150000D360486F00244EB900021DF6486F0020486F32
S3150000D370002C486F00204EB900021DB8204F2F2800
S3150000D380001C2F28001820564868013 4486F0034C6
S3150000D3904EB900021DF6486F0030486F003C486FDA
S3150000D3A00304EB900021DB8204F2F28002C2F2820
S3150000D3B000284879000 2D2AE4E924FEF00242F1378
S3150000D3C04EB900014EC43F39000016262F2D000825
S3150000D3D02F2D00042F1543EF002E4EB90001A2F8A1
S3150000D3E0204F2F28012C2F2801282F2801242F2DEC
S3150000D3F00082F2D00042F1543EF00244EB900011D
S3150000D400A0BC3F3900001626204F2F2800162F28D3
S3150000D4100 0122F28000E43EF00264EB90001A2F895
S3150000D42020564868013 4486F00144EB900021DF6B4
S3150000D430486F0010486F001C486F00104EB900027C
S3150000D4401DB8204F2F28000C2F2800082056 4868AA
S3150000D45000134486F00244EB900021DF6486F0020C3

S3150000D460486F002C486F00204EB900021DB8204FAF
S3150000D4702F28001C2F28001848790002D2C7600008
S3150000D4800312301 3E048024000FF0C40000866001B
S3150000D490043E302F0132720AE26802400017E002B
S3150000D4A03E002007ED889087ED88068000C032D8C0
S3150000D4B03213024100FF3401C4FC00A8D08206806A
S3150000D4C0000000602A40224D41EF012420D920D9D6
S3150000D4D02091486F00A048790002D2D84E923F3979
S3150000D4E0000016302F2D00082F2D00042F1543EFB6
S3150000D4F000364EB90001A2F8302F013A720AE268EE
S3150000D50002400017C003C003013024000FF7E0018
S3150000D5103E003F39000016322006E788D086EB88A9
S3150000D520068000C02E582207D281D287E589D08195
S3150000D53020402F2800082F2800042F1043EF002E2C
S3150000D5404EB90001A2F8302F013A720AE268024091
S3150000D55000017C003C003013024000FF7E003E00CC
S3150000D5603F39000016342006E788D086EB8806800F
S3150000D57000C030982207D281D287E589D081204029
S3150000D5802F2800082F2800042F1043EF00264EB93D
S3150000D5900001A2F82056486802 68486F00144EB988
S3150000D5A000021DF6486F0010486F001C486F0010FF
S3150000D5B04EB900021DB8204F2F28000C2F28000856
S3150000D5C020564868023C486F00244EB900021DF6FA
S3150000D5D0486F0020486F002C486F00204EB90002AB
S3150000D5E01DB8204F2F28001C2F2800182056486 8E9
S3150000D5F00210486F00344EB900021DF6486F003025
S3150000D600486F003C486F00304EB900021DB8204FED
S3150000D6102F28002C2F2800284879 0002D2DD4E92B0
S3150000D6204FEF00242F134EB900014EC43F390000BE
S3150000D63016302F2D00082F2D00042F1543EF002E36
S3150000D6404EB90001A2F8204F2F28012C2F280128BF
S3150000D6502F2801242F2D00082F2D00042F1543EF0E
S3150000D66000244EB90001A0BC3F39000016302 04FFF
S3150000D6702F2800162F2800122F28000E43EF002611
S3150000D6804EB90001A2F820564868 0210486F0014EF
S3150000D6904EB900021DF6486F0010486F001C486F17
S3150000D6A000104EB900021DB8204F2F28000C2F285D
S3150000D6B0000820564868 0210486F00244EB9000240
S3150000D6C01DF6486F0020486F002C486F00204EB9A9
S3150000D6D000021DB8204F2F28001C2F280018 48795B
S3150000D6E00002D2F6600000AC3013E048024000FFB2
S3150000D6F00C400007640001D8486F00A04879 00027A
S3150000D700D3074E92508F3013E048024000FF3F008F
S3150000D7102F0D4EB9000155043F3C000241ED01BEFC
S3150000D7203013E048024000FF72003200E589D1C1A3
S3150000D7302F102F1342A74EB900017E3460000190CE
S3150000D7403013024000FF3F0043EF00264EB90001B0
S3150000D75065143013024000FF3F0043EF00224EB92C
S3150000D760000164923013024000FF3F0043EF001EA9
S3150000D7704EB9000165AA204F2F28001C204F2F28E4
S3150000D780002 4204F2F28002C3F073F06487900022F
S3150000D790D30C4E924FEF001460000134301302405 8
S3150000D7A000FF3F0043EF00264EB900016730025 3E9
S3150000D7B000FF08D300003F3C00002F2D01C22F13AD
S3150000D7C042A74EB900017E3448790002D3264E9214
S3150000D7D0025300FF08D300013F3C00002F2D01C675
S3150000D7E02F1342A74EB900017E3448790002D32890
S3150000D7F04E92025300FF005306003013024000FF12
S3150000D8003F0043EF011A4EB900016 6903F3C00000D
S3150000D810204F2F28011A2F1342A74EB900017E343C
S3150000D82048790002D32A4E92025300FF00530600A5
S3150000D8303F3C0000486F011E486D01D6486F003618
S3150000D8404EB900021F82204F2F28002E2F1342A709
S3150000D8504EB900017E3448790002D32C4E923F3CEB
S3150000D86000002F2D01D62F1342A74EB900017E349A
S3150000D87048790002D32E4E923013024000FF3F003B
S3150000D88043EF00364EB90001651430130240 00FF25
S3150000D8903F0043EF00324EB900016492204F2F281B
S3150000D8A00030204F2F28003848790002 80B6486F94
S3150000D8B00044486F00444EB900021FAE204F2F2887
S3150000D8C0003C48790002D3304E924FEF002442A725
S3150000D8D0486F002C4EB90001A8924A006600F06E0F
S3150000D8E04A3900C0A248660000F44A3900C0A2477F
S3150000D8F0660000EA4A3900C0A251670000E04A39D2
S3150000D90000C0A259660000D6206F00E03010024029
S3150000D91000030C400001630000C4082F000200FA57
S3150000D920660A48790002D3444E92588F42474A47C6
S3150000D93066060253 00FF6008025300FF08D300008A
S3150000D940206F00DC3013E048024000FF7200320016
S3150000D950E589D1C108280002 0001676C206F00E04C
S3150000D96030280002 0240003F3F0041EF0116300719
S3150000D97048C0E788D1C02F2800042F1043EF002AA3
S3150000D9804EB90001A234204F2F2800F0486F001C2A
S3150000D9904EB900021DF6486F0018486F0024486F04
S3150000D9A000184EB900021DB8204F2F2800142F284A
S3150000D9B00010206F00F84868000D4E924FEF000CE3
S3150000D9C048790002D37C600648790002D37E4E92E5
S3150000D9D0588F52470C4700 26D00FF5430034FEF3B
S3150000D9E0014A33C000A002564CDF7CFC4E754E71D6
S3150000D9F04E714E7133C000A00258720D7000300196
S3150000DA00068000C0A24420404A1067043001600A24
S3150000DA1052410C41001463E4424033C000A0025A54
S3150000DA204E754E714E714E7148E73F3E33C000A0B1
S3150000DA30025C4FEFF2884242227C0002841C41EFD6
S3150000DA400020703920D951C8FFFC486F00204EB91C
S3150000DA500001ACC623FC0000F54400C0A28C23FCE8
S3150000DA600000F54400C0A2882A7C00022A6E0CB988
S3150000DA7003FFFFFF00C0C8FE640A48790002DB9876
S3150000DA806000087E47EF00D8247C00C001062C7C8D
S3150000DA9000C0010A4A3900C0A25F6700041000AF47
S3150000DAA00029400400F408EF000300F208EF00022A
S3150000DAB000F249EF00E060000330082F000601077E
S3150000DAC06700014C4A3900C0A250660C302F00F2A4
S3150000DAD0024003FF4A40635C4AAF00DC672A703F9E
S3150000DAE0206F00DCC0A8000C2F0048790002DBB7CD
S3150000DAF04E95508F206F00DC2F2800083F3C0044D5
S3150000DB004EB900001DCE60740C9200031ABC660864
S3150000DB1048790002DC2C60142012B08E6608487921
S3150000DB200002DC34600648790002DC3D48790002D8
S3150000DB30DC026034303C03FFC06F00F266300C92AA
S3150000DB4000031ABC660848790002DC636014 2012E0
S3150000DB50B08E6608487900 02DC6B600648790002E0
S3150000DB60DC7448790002DC434E95508F600E48798C
S3150000DB700002DC7A4E95588F60000280206F00E02C
S3150000DB802F1048790002DC8E4E95206F00E8302871
S3150000DB90004E0480240001F3F0048790002DCA173
S3150000DBA04E95206F00EE302800040240000F3F0023
S3150000DBB048790002DCB94E95206F00F43028000643
S3150000DBC0E0480240 00FF3F0048790002DCD64E954F
S3150000DBD0206F00FA302800060240 00FF3F00487917
S3150000DBE00002DCEB4E954FEF00204A3900C0A260E0
S3150000DBF0660C486F002048790002DCFA600A486F1C
S3150000DC00002048790002DD2A4E95508F78004A3967
S3150000DC1000C0A260660000C8206F00D8302800024D
S3150000DC200240003F3F00206F00DA30280002080063
S3150000DC30000D67063F3C005960043F3C004E206FD4
S3150000DC4000DC302800020800000E67063F3C005941
S3150000DC5060043F3C004E206F00DE302800020800C2
S3150000DC60000F67063F3C005960043F3C004E206FA2
S3150000DC7000E03010024000033F00206F00E2082859
S3150000DC8000020001 67063F3C005960043F3C004E1D
S3150000DC90206F00E408280003000167063F3C005996
S3150000DCA060043F3C004E206F00E608280004000197
S3150000DCB067063F3C005960043F3C004E206F00E879
S3150000DCC03010EA48024007FF3F00486F00AA487933
S3150000DCD00002DD4E4E954FEF001A6000010C204FFA
S3150000DCE02F2800D84EB900008A507A003A006740C3
S3150000DCF05885206F00D8302800020800000F6704FE
S3150000DD007E1860024247206F00D8301002400003A0
S3150000DD10721802810000FFFF82C0D24770003001F6
S3150000DD20E5882205C1414EB90002625EC1412A0161
S3150000DD303F3C0001204F2F2800E2204F2F2800DE15
S3150000DD404EB900008A8C7C003C0067305886206FF4
S3150000DD500000D830280002 0800000D671E3F3C000076
S3150000DD60204F2F2800E2204F2F2800DE4EB900005A
S3150000DD708A8C72003200DC815886E58E3F3C0001B9
S3150000DD80204F2F2800E2204F2F2800DE4EB900003A
S3150000DD908B2E7E003E0067305887206F00D83028D3
S3150000DDA000020800000E671E3F3C0000204F2F288F
S3150000DDB000E2204F2F2800DE4EB900008B2E7200A5
S3150000DDC03200DE815887E58F2605D686D6872F0353
S3150000DDD02F072F062F05486F00A848790002DD7F20
S3150000DDE04E954FEF0018D88342A7486F00244EB9CE
S3150000DDF00001A8924A006600FCC24A3900C0A2602F
S3150000DE00670015EE2F0449EF00602F0C48790002D9
S3150000DE10DD974E954FEF000C4A3900C0A24B6600C5
S3150000DE2015D048780220486F006048790002DDAFBF
S3150000DE304E950684000002204878006448 6F006C06
S3150000DE4048790002DDC84E95068400000 0642F0460
S3150000DE50486F007848790002DDE04E954FEF0024C8
S3150000DE60303C03FFC06F00F2660015864879 00312A
S3150000DE70FAB8486F006048790002DDF04E954FEF22

S3150000DE80000C4A846700156A203C0031FAB8220467
S3150000DE904EB900025BBC2F00486F00604879000253
S3150000DEA0DE074E954FEF000C600015467CFF4A39A1
S3150000DEB000C0A27166544A3900C0A272664C4A3943
S3150000DEC000C0A24B6700028A4A3900C0A268663ABF
S3150000DED04A3900C0A26966324A3900C0A26A662A77
S3150000DEE04A3900C0A26B66224A3900C0A26C661A83
S3150000DEF04A3900C0A26D66124A3900C0A26E660A8F
S3150000DF004A3900C0A26F670002483F3C001C43EF3D
S3150000DF10010A4EB900007F1E2012B08E672C248E97
S3150000DF204AAF01086714327C0010D3EF0108204E77
S3150000DF30704D20D951C8FFFC6010227C00031ABC2A
S3150000DF40204E704D20D951C8FFFC4A3900C0A2713D
S3150000DF50671A303C00FFC07900C0A33AE148027955
S3150000DF6000FF00C00110817900C001104A3900C0CD
S3150000DF70A2726718303C00FFC07900C0A33E027948
S3150000DF80FF0000C00110817900C00110287C00C08C
S3150000DF900112267C00C0A2A04A3900C0A268674AC6
S3150000DFA04AB900C0A3146726203C000005A0223908
S3150000DFB000C0A3144EB9000257A84A8063104879DE
S3150000DFC00002DE264E95588F424060001426303CF3
S3150000DFD007FFC07900C0A316EB482213D286E58955
S3150000DFE00274001F1800817418004A3900C0A26923
S3150000DFF0671C303900C0A31A02400001E948221309
S3150000E000D286E58908B400041801817418004A39DB
S3150000E01000C0A26A673C2213D286E5893034180014
S3150000E020EA48024007FF4A40631E303900C0A31E7B
S3150000E03002400001E7482213D286E58908B40003AE
S3150000E040180181741800600A48790002DE414E9575
S3150000E050588F4A3900C0A26B671C303900C0A32212
S3150000E06002400001E5482213D286E58908B4000281
S3150000E0701801817418004A3900C0A26C6718700331
S3150000E080C07900C0A3262213D286E5890274FFFC5C
S3150000E0901800817418004A3900C0A26D671E303915
S3150000E0A000C0A32A02400001720FE3682213D28641
S3150000E0B0E58908B400071802817418024A3900C0BD
S3150000E0C0A26E674E2213D286E58930341800EA48DC
S3150000E0D0024007FF4A4063302213D286E589303476
S3150000E0E018020800000F6720303900C0A32E024036
S3150000E0F00001720EE3682213D286E58908B4000691
S3150000E100180281741802600A48790002DE734E957F
S3150000E110588F4A3900C0A26F671E303900C0A3323B
S3150000E12002400001720DE3682213D286E58908B425
S3150000E13000051802817418022F0E4EB900095AA28
S3150000E1404A40660012AC48790002DECA600001B29D
S3150000E1504A3900C0A27067344EB9000093200C0003
S3150000E1600001670C4A0067100C0000026712602469
S3150000E17048790002DEE1600E48790002DEF86006AA
S3150000E18048790002DF0F4E95588F60084A3900C063
S3150000E190A273670A4EB900009748600012544A39C4
S3150000E1A000C0A2746716248E227C00031ABC204E7F
S3150000E1B0704D20D951C8FFFC60001236287C00C083
S3150000E1C00570283C000151802C7C00019A984A3940
S3150000E1D000C0A259670001324A3900C0A246660053
S3150000E1E000B048790002DF2548790002DF204E950D
S3150000E1F0508F4A3900C0A24E67082C3900C0A2AC25
S3150000E20060062C3900C000FA2A062005223C0009C7
S3150000E2103A804EB900025BBCC1414EB90002625E53
S3150000E220C1410681FFFEAE802A014247760852436D
S3150000E2300C4300076518424348790002DF754E9586
S3150000E240588F2F053F3C00444EB900001DCE48793B
S3150000E2500002DF784E952F0543EF00264E96307C60
S3150000E26000DAD1D443EF0022700010290001EB88B8
S3150000E270D1C04868001848790002DF7A4E954FEF02
S3150000E280000C5247DA840C47008C6DA260001162C4
S3150000E2900C39000500C0A38464104AB900C01844B4
S3150000E2A0670848790002DF8160564AB900C0184401
S3150000E2B0671648790000960048790002DFBE4EB91D
S3150000E2C0000174243E0060027E590C47005967061F
S3150000E2D00C47007966244EB90001BA6A4EB90001AE
S3150000E2E0BA6A3F3C001D4EB90001C18674FB13FC9F
S3150000E2F0000100C01854600010F848790002DFE9F8
S3150000E3004E95588F600010EA4A3900C0A25D670E2C
S3150000E3103F3C000B4EB900007EF6600010D44A392F
S3150000E32000C0A26467584A3900C0A25366504A39F1
S3150000E33000C0A265670A23F900C0A30800E0000E2A
S3150000E3404A3900C0A266670010A84A3900C0A24E2A
S3150000E3506700109E23F900C0A30C00E0001623F905
S3150000E36000C0A2AC00E00032487900C0A30C487996
S3150000E37000E000124EB900021CD6600010744A3943
S3150000E38000C0A25C6700009E203900C0A2E42204FF
S3150000E3904EB900025BBC4EB90002625E2A002F0530
S3150000E3A0043EF00224E96307C00DAD1D443EF001EB4
S3150000E3B070001029 0001EB88D1C048680018487920
S3150000E3C00002DFFD4E95508F42462E057007C006AF
S3150000E3D0661648790002E01C4E95588F2F073F3C81
S3150000E3E000744EB900001DCE2F0743EF00224E9653
S3150000E3F041EF001E7A001A10701AD0942205D281BD
S3150000E400D285E589D0812F0048790002E01F4E951C
S3150000E410508F5246068700003840C46006065ACA8
S3150000E42060000FCE4A3900C0A25A67744247307C5A
S3150000E43000DAD1D4300748C0EB88D1C04A2800188A
S3150000E4406752307C00DAD1D4300748C0EB88D1C09F
S3150000E45048680018300752403F0048790002E0271C
S3150000E4604E954FEF000A4246307C00DAD1D4300791
S3150000E47048C0EB88D1C070003006D1C0101048806B
S3150000E4803F0048790002E0354E955C8F52460C46B7
S3150000E490001865D452470C4700106D9260000F5269
S3150000E4A04A3900C0A25B6746287900C0057460340B
S3150000E4B048790002E03B4E952F1C3F3C00434EB985
S3150000E4C000001DCE48790002E03E4E952F1C3F3CD1
S3150000E4D000434EB900001DCE48790002E0404E953B
S3150000E4E04FEF000C2014B08666C660000F044DEF97
S3150000E4F000E84A3900C0A255662A4A3900C0A25827
S3150000E50066224A3900C0A254661A4A3900C0A25689
S3150000E51066124A3900C0A257660A4A3900C0A2628A
S3150000E520670004E44A3900C0A27667064EB90000C7
S3150000E530583C49EF013C00AF0018C00000F408EF5A
S3150000E540000300F21F7C000401054A3900C0A261E5
S3150000E55066000 3B800AF0065003800F445EF001010
S3150000E56060000390082F000601076726486F002009
S3150000E57048790002E0424E95508F4A3900C0A261A8
S3150000E58067104879 0002E04E48790002E0474E9550
S3150000E590508F2A2F00F470C3C1AF00F408EF0001BA
S3150000E5A000F71F7C00FF010460000330102F0104F8
S3150000E5B0488048C081FC000448404A406602424602
S3150000E5C04A3900C0A256660A4A3900C0A2576700F7
S3150000E5D0010A082F0007010767 0000DE206F00D838
S3150000E5E008280003000167 08082F000200F2661AD7
S3150000E5F0082F000200F2660000C0206F00D8302805
S3150000E600000208 00000E670000B04A4666427C0120
S3150000E610486F009848790002E0544E95508F424763
S3150000E620601C4A3900C0A257670848790002E059C1
S3150000E630600648790002E06B4E95588F5247102FBE
S3150000E6400104488048C081FC00044840BE406DD2A9
S3150000E6504A46670002864879 0002E0754E95588F53
S3150000E6602F0C204F2F2800F44EB9000087CA2240F5
S3150000E67041EF0D7020D920914A3900C0A257670E8C
S3150000E680204F2F280D743F3C0063600000EC204FA4
S3150000E6902F2800E8486F0D74486F00244EB9000219
S3150000E6A01FAE204F2F28001C206F00F04868000D79
S3150000E6B04E95508F600002244A466700021E4A3972
S3150000E6C000C0A257670A48790002E077600017827
S3150000E6D048790002E0896000016E4A3900C0A262F2
S3150000E6E06600016C082F000701076700013E206FD6
S3150000E6F000D80828000200016700013 0082F000238
S3150000E7000F2660A0828000500026700011E4A4654
S3150000E71066427C01486F009848790002E0934E9566
S3150000E720508F4247601C4A3900C0A254670848 7996
S3150000E7300002E0986006487900 02E0A44E95588FE2
S3150000E7405247102F0104488048C081FC000448400D
S3150000E750BE406DD24A466700018248790002E0B0A9
S3150000E7604E95588F4A3900C0A2546716206F00DCB8
S3150000E7702F2800083F3C00444EB900001DCE600023
S3150000E780015A3F3C00002F0C204F2F2800F643EF84
S3150000E79001364EB900008478206F00D83028000278
S3150000E7A00240003F3F004A3900C0A2586720204F70
S3150000E7B02F28013A2F280136204F2F28013A2F28DB
S3150000E7C00136224A4EB90001A01E224A600443EFD8
S3150000E7D0012E2F2900042F1143EF00224EB900010C
S3150000E7E0A234204F2F2800E8486F000C4EB90002D3
S3150000E7F01DF6486F0008486F001C486F00084EB9A8
S3150000E80000021DB8204F2F2800042F10206F00F0A3
S3150000E8104868000D4E954FEF000C43EF012C41EF79
S3150000E820013420D9209160000B24A46670000AC4E
S3150000E8304A3900C0A254670848790002E0B260066F
S3150000E84048790002E0BE4E95588F6000008E4A3926
S3150000E85000C0A262670000842F6F00DC01084A46F0
S3150000E86066107C01486F009848790002E0CA4E9510
S3150000E870508F204F2F2801084EB900005EB23F008E
S3150000E880082F0007010967063F3C004460043F3C2F
S3150000E890002D206F00E0486800104EB9000095AAD0

S3150000E8A04A4067063F3C006D60043F3C002D204F08
S3150000E8B02F2800E24EB90000951A4A4067063F3CF1
S3150000E8C0004360043F3C002D204F2F2800E4487988
S3150000E8D00002E0CF4E954FEF0010486F013C486FA5
S3150000E8E000244EB90001A8924A006600FCC02F45DC
S3150000E8F000F4486F013C486F00244EB90001A8920D
S3150000E9004A006600FC6050000AE808EF000200F2B8
S3150000E9107C0008EF000100F7600000D4082F000615
S3150000E9200107671E486F002048790002E0E04E9517
S3150000E93048790002E0EC48790002E0E54E954FEF99
S3150000E9400010102F0104488048C081FC0004484094
S3150000E9504A406626486F009848790002E0F24E95D4
S3150000E960508F4A3900C0A261671048790002E0FE64
S3150000E97048790002E0F74E95508F48790002E1028F
S3150000E9804E95588F4A3900C0A26267262F6F00DC69
S3150000E9900108204F2F2801084EB900005EB23F0043
S3150000E9A0204F2F2800DE48790002E1044E954FEFF4
S3150000E9B0000A082F00070107672A4A3900C0A25833
S3150000E9C066047E0060022E062054202800049087EC
S3150000E9D02F0048790002E10F4E95508F20542C28C5
S3150000E9E00004600A48790002E1154E95588F486F79
S3150000E9F0013C486F00244EB90001A8924A00660007
S3150000EA00FF1C600009EC4A3900C0A25267000332BD
S3150000EA1008EF000300F200AF006D40FC00F4287C14
S3150000EA20000075C460000304082F00060107672E66
S3150000EA3048790002E17248790002E16C48790002E7
S3150000EA40E16348790002E15948790002E153486FD1
S3150000EA50003448790002E1204E954FEF001C486FC4
S3150000EA60009848790002E1794E95508F206F00D8C2
S3150000EA70082800020001670808 2F000200F2661A43
S3150000EA80206F00D830280002080000D670001B290
S3150000EA90082F000200F2660001A83F3C000C204F40
S3150000EAA02F2800F243EF013A4E943F3C000A204FD4
S3150000EAB02F2800F243EF01224E943F3C0006204FE0
S3150000EAC02F2800F243EF011A4E943F3C0000204FDE
S3150000EAD02F2800F243EF01124E94206F00D8302801
S3150000EAE000020240003F3F00204F2F28013A2F2806
S3150000EAF0013643EF00224EB90001A234204F2F28E1
S3150000EB0000E8486F00144EB900021DF6486F001069
S3150000EB10486F001C486F00104EB900021DB8204F08
S3150000EB202F28000C2F280008206F00F04868000DE1
S3150000EB304E95206F00E430280002 0240003F3F005F
S3150000EB40204F2F28012E2F28012A43EF002E4EB9E1
S3150000EB500001A234204F2F2800F4486F00204EB940
S3150000EB6000021DF6486F001C486F0028486F001C05
S3150000EB704EB900021DB8204F2F2800182F28001468
S3150000EB80206F00FC4868000D4E95206F00F030287D
S3150000EB9000020240003F3F00204F2F2801322F285D
S3150000EBA0012E43EF003A4EB90001A234204F2F2820
S3150000EBB00100486F002C4EB900021DF6486F002870
S3150000EBC0486F0034486F00284EB900021DB8204F28
S3150000EBD02F2800242F280020206F01084868000DE8
S3150000EBE04E95206F00FC30280002 0240003F3F0097
S3150000EBF0204F2F2801362F28013243EF00464EB909
S3150000EC000001A234204F2F28010C486F00384EB95E
S3150000EC1000021DF6486F0034486F0040486F00340C
S3150000EC204EB900021DB8204F2F2800302F28002C87
S3150000EC30206F01144868000D4E954FEF00306010AC
S3150000EC4048790002E18648790002E17E4E95508FB0
S3150000EC504A3900C0A260675C206F00D8082800030C
S3150000EC6000001670000C6302F00F0E048024000FFB8
S3150000EC707E003E007044D0922207E7899287E7899A
S3150000EC80D081486F00184EB900024224204F2F2829
S3150000EC9000E8486F001C486F001C4EB900021FAE0A
S3150000ECA0204F2F280014206F00EC4868000D4E9569
S3150000ECB0508F6076206F00D808280003 0001676A2D
S3150000ECC03F3C000B43EF001A4EB900007F562F3928
S3150000ECD000C000FA41EF001C2F10204F2F2800F82B
S3150000ECE043EF0D7C4EB900008194204F2F2800E899
S3150000ECF0486F0D74486F00244EB900021FAE204FB6
S3150000ED002F28001C206F00F04868000D4E954879AA
S3150000ED100002E1884E954FEF000C204F2F280D740E
S3150000ED203F3C00634EB900001DCE42A7486F002449
S3150000ED304EB90001A8924A006600FCEE600006B2D9
S3150000ED40263CEE6B28004A3900C0A253670003AC8C
S3150000ED5048790002850448790 0E0000E4EB90002A9
S3150000ED601FF24A406F184A3900C0A24E66102F792A
S3150000ED7000E0002A00FC2F7900E0002E010049EF98
S3150000ED80013C08EF000300F245EF0124082F0005BF
S3150000ED900107670003460 82F000601076740486F12
S3150000EDA00020487900 02E18A4E95204F2F28010461
S3150000EDB03F3C00444EB900001DCE48790002E1A157
S3150000EDC04E95204F2F28010C3F3C00444EB90000C1
S3150000EDD01DCE48790002E1AD4E954FEF0010227C22
S3150000EDE000028D60204A20D92091224A41EF013449
S3150000EDF020D9209178002A0642471F7C00FF010493
S3150000EE002F7C006DF20200F460485247206F00DC50
S3150000EE1020280008B08564182A003F3C00002F0C0B
S3150000EE20204F2F2800F643EF013E4EB900008478AC
S3150000EE30206F00DC20280008B084631628003F3CC1
S3150000EE4000002F0C204F2F2800F6224A4EB9000052
S3150000EE508478486F013C486F00244EB90001A8929F
S3150000EE604A0066A6204F2F280100204F2F280100B8
S3150000EE70204F2F2800F843EF0D7C4EB900008194F7
S3150000EE804A476E124AAF0D7463000250202F0D746C
S3150000EE90B0836400024648 6F009848790002E1D0CA
S3150000EEA04E95508F4A476F0001B0303CFF00C06F4F
S3150000EEB000F066464A3900C0A264673E48790002FF
S3150000EEC0850448790 0E0000E4EB900021FF24A4060
S3150000EED06F28224A207C00E0002220D9209120546D
S3150000EEE023E8000800E0002E4A3900C0A267670A3E
S3150000EEF023F900C0A31000E000123F074879000282
S3150000EF00E1D54E95206F00DE302800020240003F1A
S3150000EF103F00204F2F2801402F28013C43EF0028B7
S3150000EF204EB90001A234204F2F2800EE486F001A78
S3150000EF304EB900021DF6486F0016486F0022486F52
S3150000EF4000164EB900021DB8204F2F2800122F2898
S3150000EF50000E206F00F64868000D4E954879 0002B5
S3150000EF60E1DB4E952F053F3C00444EB900001DCE17
S3150000EF70206F00E302800020240003F3F002F2A9B
S3150000EF8000042F1243EF00384EB90001A234204F7F
S3150000EF902F2800FE486F002A4EB900021DF6486F62
S3150000EFA00026486F0032486F00264EB900021DB891
S3150000EFB0204F2F2800222F28001E206F01064868A8
S3150000EFC0000D4E954879 0002E1DD4E952F043F3C39
S3150000EFD000444EB900001DCE48790002E1DF4E958F
S3150000EFE0204F2F2801622F28015E2F2A00042F129E
S3150000EFF043EF004A4EB90001A01E206F01023028DF
S3150000F00000020240003F3F00204F2F2800402F28DB
S3150000F010003C43EF004C4EB90001A234204F2F288C
S3150000F020112486F003E4EB900021DF6486F003AC5
S3150000F030486F0046486F003A4EB900021DB8204F8F
S3150000F0402F2800362F280032206F011A4868000D3D
S3150000F0504E954FEF003660104879 0002E1EA487994
S3150000F0600002E1E24E95508F4AAF0D74636C202F7B
S3150000F0700D74B083646448790002E1EC4E95588FB4
S3150000F080202F0D74B0836448204F2F2800E8486F66
S3150000F0900D74486F00244EB900021FAE204F2F2872
S3150000F0A0001C206F00F04868000D4E95487900025C
S3150000F0B0E1EE4E954FEF000C204F2F280D743F3C8C
S3150000F0C000634EB900001DCE48790002E1F06006EB
S3150000F0D048790002E1F24E95588F2F7C006DC07D75
S3150000F0E000F4486F013C486F00244EB90001A89215
S3150000F0F04A006600FC98600002F800AF00EDC0FD13
S3150000F10000F4247C00C0A2514A126708287900C086
S3150000F11013F0600C49EF013C00AF0010000300F44F
S3150000F12008EF000300F2600002AC082F000601079A
S3150000F13067224A3900C0A275670C486F00204879DB
S3150000F1400002E20D600A486F002048790002E23FA3
S3150000F1504E95508F4A12660A082F0007010767006E
S3150000F1600274486F009848790002E26F4E95508FFE
S3150000F170206F00D808280002000167 08082F000247
S3150000F18000F2661A206F00D830280002 0800000D31
S3150000F19067000112082F000200F2660001084A12F9
S3150000F1A067182F0C3F3C0000204F2F2800F643EF36
S3150000F1B0013E4EB9000072FA60163F3C00002F0C6B
S3150000F1C0204F2F2800F643EF013E4EB90000847809
S3150000F1D0206F00D830280002 0240003F3F00204F39
S3150000F1E02F28013A2F28013643EF00224EB900019D
S3150000F1F0A234204F2F2800E8486F00144EB90002B1
S3150000F2001DF6486F0010486F001C486F00104EB97D
S3150000F21000021DB8204F2F28000C2F280008206F51
S3150000F22000F04868000D4E954FEF000C4A3900C0BB
S3150000F230A2756752206F00DC20280008486F00186E
S3150000F2404EB9000241E44879000 28510486F001C5F
S3150000F250486F00184EB900021DD6487900028508 8D
S3150000F260486F0014486F00104EB900021D54204F1D
S3150000F2702F28000C2F28000848790002E2744E95CA
S3150000F2804FEF000C602E48790002E27D4E95588FB4
S3150000F290206F00DC2F2800083F3C00444EB90000D8
S3150000F2A01DCE6010487900 02E28748790002E27FAD
S3150000F2B04E95508F206F00D80828000300 0167087C

S3150000F2C0082F000200F2661A206F00D830280002CC
S3150000F2D00800000E670000FE082F000200F266001C
S3150000F2E000F44A12672C3F3C000B43EF001A4EB95C
S3150000F2F000007F562F3900C000FA41EF001C2F1086
S3150000F300204F2F2800F843EF0D7C4EB9000819462
S3150000F31060182F0C204F2F2800F44EB90000087CA22
S3150000F320224041EF0D7020D92091202F0D74B0831B
S3150000F330640000A248790002E2894E95204F2F28EA
S3150000F34000EC486F0D78486F00284EB900021FAEDA
S3150000F350204F2F280020206F00F44868000D4E959E
S3150000F3604FEF000C4A3900C0A275674E202F0D746E
S3150000F370486F00184EB9000241E448790002851032
S3150000F380486F001C486F00184EB900021DD6487918
S3150000F39000028508486F0014486F00104EB900023D
S3150000F3A01D54204F2F28000C2F28000848790002F2
S3150000F3B0E28B4E954FEF000C601A48790002E294FA
S3150000F3C04E95588F204F2F280D743F3C00634EB941
S3150000F3D000001DCE4A12670442A76004486F013C34
S3150000F3E0486F00244EB90001A8924A006600FD3C11
S3150000F3F030024FEF0D7833C000A0025E4CDF7CFC7C
S3150000F4004E754E714E714E7133C000A00260207968
S3150000F41000C0057023E8000E00C018504EB9000069
S3150000F420974833C000A002624E754E714E714E7100
S3150000F43033C000A002644FEFFEC2F79000285185D
S3150000F440000C487900E0000E4EB900021FDA4A00AF
S3150000F450670000C4026F00FF000C08EF0002000EF8
S3150000F4603F3C0001204F2F28000E43EF000A4EB903
S3150000F470000075C42F3900E000262F3900E0002275
S3150000F480204F2F2800102F28000C43EF00104EB9F4
S3150000F4900001A01E3F39000162O204F2F2800062D
S3150000F4A02F28000243EF00124EB900019DFE486F5F
S3150000F4B00008207900C0C8BE486800B0486F001830
S3150000F4C04EB900021FAE487900C0A2284EB900020C
S3150000F4D01FDA4A006738487900C0A228486F00142E
S3150000F4E0486F00104EB900021F82487900E00012F2
S3150000F4F0486F000C486F000C4EB900021FAE486FF3
S3150000F5000004487900E000124EB900021D1E23EFE8
S3150000F51000100C0A2284A3900C0185467144A399E
S3150000F52000C0A38A660C4EB90000BC64423900C044
S3150000F53018544FEF001433C000A002664E754E718A
S3150000F5404E714E7148E7030433C000A002684FEFC6
S3150000F550FF802A6F0090303CFFFFD06F0094720 04E
S3150000F5603200EF892E014A3900C0A25967582C3C57
S3150000F570000020009C874A866F4C4A3900C0A2458D
S3150000F5806718203C003A0000D0872F002F0D4878DE
S3150000F59000804EB90000206B602C2F0D486F0004D3
S3150000F5A0487800804EB90000206 83F3C0040486F14
S3150000F5B000022007E488E5880680003A00002F0054
S3150000F5C04EB9000049847000B0865CC04400488093
S3150000F5D04FEF008033C000A0026A4CDF20C0205FDE
S3150000F5E05C8F4ED04E714E714E7148E73F3E33C030
S3150000F5F000A0026C4FEFF2A4426F0104227C0002CD
S3150000F600866E41EF001C703920D951C8FFFC486F47
S3150000F610001C4EB90001ACC6247C00022A6E0CB94F
S3150000F62003FFFFFF00C0C8FE640E48790002E4EB4A
S3150000F6304E92588F6000093E287C00C0A25147EFC9
S3150000F64000EC4DEF00D44A1466124A3900C0A252AB
S3150000F650660A4A3900C0A256670002144BEF011829
S3150000F6601F7C000401012F7C0039C01800F008EF50
S3150000F670000300EE600001E0082F00060103670E9C
S3150000F680486F001C48790002E4FF4E92508F2F7C91
S3150000F6900039C00200F01F7C00FF01006000019CE1
S3150000F6A0102F0100488048C081FC000448404A40B1
S3150000F6B066024247082F00070103670001643 03CD9
S3150000F6C0FFE0206F00D4C05067000156082F0002EB
S3150000F6D000EE660A082800070002670001444A4750
S3150000F6E0663E7E01486F009448790002E5044E921A
S3150000F6F0508F424660184A14670848790002E509A7
S3150000F700600648790002E5154E92588F5246102F32
S3150000F7100100488048C081FC00044840BC4065D6D2
S3150000F7200C470001660001144A146720487900025C
S3150000F730E5214E92588F206F00D82F2800083F3CB5
S3150000F74000044 4EB900001DCE600000F0082F0002F4
S3150000F75000EE670C206F00D408280002000166 1A2C
S3150000F760082F000200EE660000B0206F00D430289B
S3150000F77000020800000D670000A048790002E5239A
S3150000F7804E92588F4A3900C0A25667182F0D3F3C3B
S3150000F790000B204F2F2800F243EF01164EB9000050
S3150000F7A072FA60163F3C00012F0D204F2F2800F201
S3150000F7B043EF01164EB900008478206F00D430283C
S3150000F7C000020240003F3F00204F2F2801122F2841
S3150000F7D0010E43EF001E4EB90001A234204F2F2820
S3150000F7E000E4486F00104EB900021DF6486F000C89
S3150000F7F0486F0018486F000C4EB900021DB8204F24
S3150000F8002F2800082F280004206F00EC4868000D00
S3150000F8104E924FEF000C602248790002E5256016F3
S3150000F8204A4767164A14670848790002E5316006B8
S3150000F83048790002E53D4E92588F486F0118486F8F
S3150000F84000204EB90001A8924A006600FE542F7CA3
S3150000F8500039C01800F0486F0118486F00204EB9F3
S3150000F8600001A8924A006600FE10600007082C3CC2
S3150000F870000151804A3900C0A250670003C441EF1D
S3150000F88001182F480D4C422F0101103900C0A25516
S3150000F890488002400001720BE36808AF000300EEE7
S3150000F8A0816F00EE2F7C00B9C45A00F02F7C000255
S3150000F8B087560D5860000372082F00060103670E75
S3150000F8C0486F001C48790002E5494E92508F082F78
S3150000F8D00007010367000 3524A3900C0A2536714A8
S3150000F8E0203900C0A2C022064EB9000257A82F40F8
S3150000F8F0011060 0442AF0110206F00D820280008D4
S3150000F90022064EB900025BBC4EB90002625E2E00B2
S3150000F9104A3900C0A254671226072 03900C0A2C483
S3150000F9204EB9000257A8D68060042606D687206FF7
S3150000F93000D43010EA48024007FF3800303CFFE0B0
S3150000F940C050670002E4082F000200EE6614082883
S3150000F9500007000267000 2D2082F000200EE6600D0
S3150000F96002C8204F2F280D4C204F2F2800F04EB9EB
S3150000F970000724A2A402006320448C14EB90002ED
S3150000F98037423F4001084A3900C0A253660442424A
S3150000F99060122 02F0110322F010848C14EB9000213
S3150000F9A05BBC240070003002D080DBC03F7C000AC4
S3150000F9B001062A07DAAF011060000264526F0106E1
S3150000F9C00C4405A066047E0A60027E08302F0106FC
S3150000F9D0B047652E426F010623FC0000028000C07E
S3150000F9E0A23C4EB90001BA6A486F009448790002F9
S3150000F9F0E56B4E92508F2F053F3C00534EB90000E9
S3150000FA001DCE48790002E5704E92588F302F00ECDB
S3150000FA10E048024000FF0C40000A6720302F00EC4F
S3150000FA20E048024000FF0C4000046710302F00EC55
S3150000FA30E048024000FF0C40000B66462F6F00ECCA
S3150000FA400114302F0114E048024000FF0C40000A68
S3150000FA50670E0C40000467160C40000B6718602206
S3150000FA6026F00FF011408EF0002011460140 26F18
S3150000FA7000FF0114600C026F00FF0114006F050007
S3150000FA800114200D672E200D6608426F010A4247B9
S3150000FA9060100C55FFFF56C0440048803F40010AE5
S3150000FAA03E004A47670E558F3E9543EF010E4EB90D
S3150000FAB000019BDE4A6F010A66544A3900C0A2550E
S3150000FAC0663E302F00ECE048024000FF0C40000A82
S3150000FAD06720302F00ECE048024000FF0C40000495
S3150000FAE06710302F00ECE048024000FF0C40000B8E
S3150000FAF0660E3F3C00042F3C00000000600000DE64
S3150000FB0048790002E5724E92588F600001064A3924
S3150000FB1000C0A2556636303C05A048C081C4486F77
S3150000FB2001648C04EB9000242 04486F00164879D4
S3150000FB300002875A486F001A4EB900021FC4486F68
S3150000FB400012486F01104EB900021D0C4A3900C060
S3150000FB50A25566000098302F00ECE048024000FFF6
S3150000FB600C40000A6720302F00ECE048024000FFFE
S3150000FB700C4000046710302F00ECE048024000FF04
S3150000FB800C40000B6666082F000200EE6606286F22
S3150000FB900D58601E206F00D43010024000003486FDD
S3150000FBA00D5002800000FFFF4EB9000242 2449EFCB
S3150000FBB00D502F0C486F0110486F00204EB90002FF
S3150000FBC01FC4204F2F28001843EF01104EB9000222
S3150000FBD03CEC3F3C0001204F2F28010E204F2F28E0
S3150000FBE0011A42A74EB900017E346026204F2F2805
S3150000FBF000E4486F0110486F00204EB900021FAEA6
S3150000FC00204F2F280018206F00EC4868000D4E92F8
S3150000FC10508F5242548D302F010848C0DA80B444C8
S3150000FC206406BA836500FD96486F0118486F002088
S3150000FC304EB90001A8924A006600FC7E60000336B9
S3150000FC4041EF01182F480D4C422F0101103900C019
S3150000FC50A2554880024000 01720BE36808AF00031A
S3150000FC6000 0EE816F00EE00AF00ABC41B00F02F7CEE
S3150000FC700000287560D58600002E8082F00060103AF
S3150000FC8067224A3900C0A257670C486F001C4879A2
S3150000FC900002E57B600A486F001C48790002E59681
S3150000FCA04E92508F082F00070103670002B4206FA1
S3150000FCB000D82028000822064EB900025BBC4EB9C7
S3150000FCC00002625E2600206F00D43010EA4802402F
S3150000FCD007FF3A00204F2F280D4C204F2F2800F009

S3150000FCE04EB90000724A2A4042442E036000026C5C
S3150000FCF02006320548C14EB9000237422600200DC3
S3150000FD006700024E200D670002480C55FFFF670092
S3150000FD100240486F009448790002E5B14E92508F38
S3150000FD204A3900C0A257674A2007486F00104EB9EB
S3150000FD30000241E4487900028766486F0014486F64
S3150000FD4000104EB900021DD648790002875E486F42
S3150000FD50000C486F00084EB900021D54204F2F2892
S3150000FD6000042F1048790002E5B64E924FEF000CC2
S3150000FD7060162F073F3C00534EB900001DCE487950
S3150000FD800002E5C04E92588F4A3900C0A25566005F
S3150000FD90015C302F00ECE048024000FF0C40000AF6
S3150000FDA06722302F00ECE048024000FF0C400004C0
S3150000FDB06712302F00ECE048024000FF0C40000BB9
S3150000FDC06600012A558F3E9543EF01124EB9000198
S3150000FDD09BDE4A3900C0A2556636303C05A048C0B5
S3150000FDE081C5486F001648C04EB900024204486FEC
S3150000FDF0001648790002875A486F001A4EB9000269
S3150000FE001FC4486F00012486F01144EB900021D0C42
S3150000FE10082F000200EE6606286F0D58601E206F40
S3150000FE2000D4301002400003486F0D540280000D9
S3150000FE30FFFF4EB90002422449EF0D542F0C486FC4
S3150000FE400114486F00204EB900021FC4204F2F280E
S3150000FE50001843EF01144EB900023CEC302F00ECC1
S3150000FE60E048024000FF0C40000A6720302F00ECFB
S3150000FE70E048024000FF0C4000046710302F00EC01
S3150000FE80E048024000FF0C40000B66462F6F00EC76
S3150000FE900114302F0114E048024000FF0C40000A14
S3150000FEA0670E0C40000467160C40000B67186022B2
S3150000FEB0026F00FF0114008EF000201146014026FC4
S3150000FEC000FF0114600C026F00FF0114006F0500B3
S3150000FED001143F3C0001204F2F280112204F2F28EC
S3150000FEE0011A42A74EB900017E346064206F00D427
S3150000FEF030280002024000F3F00558F3E9543EFF9
S3150000FF0001104EB900019D8A206F00D430280002EE
S3150000FF100240003F3F00204F2F2801122F28010EDC
S3150000FF2043EF00224EB900019DFE204F2F2800E42A
S3150000FF30486F001C486F001C4EB900021FAE204FD0
S3150000FF402F280014206F00EC4868000D4E92508F49
S3150000FF505244548D300348C0DE80B8456500FD929A
S3150000FF60486F0118486F00204EB90001A8924A0058
S3150000FF706600FD08302F01044FEF0D5C33C000A072
S3150000FF80026E4CDF7CFC4E754E714E714E7148E729
S3150000FF90013E33C000A002704FEFFF44A3900C0A3
S3150000FFA0A24967046100064A3F3C002B43EF00026A
S3150000FFB04EB900007F1E287C00C00242267C00C08D
S3150000FFC0C8BE4A3900C0A2446700014A2013B08C5B
S3150000FFD06734268C4A976718327C0010D3D7204C9A
S3150000FFE0203C000000CA20D951C8FFFC30916016A1
S3150000FFF0227C00031C70204C203C000000CA20D943
S31500010000051C8FFFC30914A3900C0A25567522039C8
S315000100100000C0A28453807216C1414EB90002625ECD
S31500010020C141D28C2A414A3900C0A24C67062AB97D
S3150001003000C0A2A44A3900C0A24D670001664878F3
S315000100400008486D001A4EB9000022762F3900C00B
S3150001005 0A2A8486D001A4EB900023F9660000144FD
S315000100602039 00C0A2845380722CC1414EB90002CE
S31500010070625EC141068100C002DC2A414A3900C0E4
S31500010080A25267082B7900C0A2BC00164A3900C0EB
S31500010090A24F67062AB900C0A2B04A3900C0A250D1
S315000100A0671E48780008486D00044EB900002276A4
S315000100B02F3900C0A2B4486D00044EB900023F9624
S315000100C04A3900C0A253671E48780008486D001AD5
S315000100D04EB9000022762F3900C0A2C0486D001A21
S315000100E04EB900023F964A3900C0A251670C7030E2
S315000100F0D03900C0A2BB1B4000274A3900C0A24E1E
S31500010100670000A07030D03900C0A2AF1B400010BC
S315000101100600000904A3900C0A24A66084A3900C008
S31500010120A24B677E2013B08C6718268C227C0003B5
S315000101301C70204C203C000000CA20D951C8FFFC8D
S31500010140309 14A3900C0A24A670A2F7900C0A29CA1
S3150001015000086016487900031D0A20534868009A72
S31500010160486F00104EB900021FC44A3900C0A24BA5
S31500010170670A2F7900C0A2A000046016487900031F
S31500010180 1DBA20534868014A486F000C4EB9000257
S315000101901FC4204F2F280004204F2F28000C610078
S315000101A0028E247C00022A6E2C7C00C0A2474A39AA
S315000101B000C0A245660E4A3900C0A24666064A1626
S315000101C06700014A4A1667124A97660E487900028 5
S315000101D0E8904E92588F6000015A0C9300031C70F0
S315000101E0660848790002E8DA60142013B08C6608C4
S315000101F048790002E8E2600648790002E8EB4879AE
S3150001020000002E8B64E92508F4A3900C0A255676C7B
S315000102104879 0002E8F14E92588F42474A16671410
S31500010220 4A9767107010D0973207C3FC0016D08129
S3150001023 02A4060244A3900C0A245670E20133207BE
S31500010240C3FC0016D0812A40600E3007C1FC00169F
S3150001025006800003 1C702A40486D00042F153007E4
S315000102605 2403F0048790002E9084E924FEF000ED6
S3150001027052470C4700076DA460000 09248790002BE
S31500010280E91B4E92588F42474A166714203C0000DC
S315000102900 00AAD0973207C3FC002CD0812A40602ADD
S315000102A04A3900C0A2456714203C0000009AD09349
S315000102B03207C3FC002CD0812A40600E3007C1FCF6
S315000102C0002C068000031D0A2A40486D001A2F2DB6
S315000102D00016102D00274880 0640FFD03F00486DCC
S315000102E000042F15102D00104880 0640FFD03F0056
S315000102F0300752403F0048790002E94F4E924FEFD6
S3150001030001A52470C47000F6D00FF7E4A3900C0A4
S315000103 10A24867146100031E4A40671448790002 27
S31500010320E9774E92588F60084A3900C0A254670295
S315000103306118 42404FEF000C33C000A002724CDF3F
S315000103407C804E754E714E714E7148E7010C33C07B
S3150001035000A00274598F3F3C002B49EF0002224C4A
S315000103604EB900007F1E7010D0942A404247 6000AB
S31500010370008441ED009A3007C1FC002CD1C00C2845
S315000103800025000D662241ED009A0C300038080E5A
S31500010390066160C30002E080F660E0C30006608112A
S315000103A066064A3008126702429441ED009A300708
S315000103B0C1FC002CD1C00C28002500236 63241ED7A
S315000103C0009A0C300031082466260C3000300825CE
S315000103D0661E0C30002E082666160C30004C0828C6
S315000103E0660E0C30006608296606 4A30082A67023E
S315000103F0429452474A9463080C47000F6D00FF74FC
S315000104004A94670C7010D09423C000C0C8BE600A1D
S31500010410 23FC00031C7000C0C8BE588F33C000A067
S315000104200 02764CDF30804E754E714E714E7148E743
S3150001043 01F3E33C000A00278518F267C00C00242C5
S31500010440227C00031C70204B203C000000CA20D9EE
S31500010450 51C8FFFC30914246287C00C002DC247C56
S31500010460000288B02C7C000288E842474245601EA3
S315000104704 86F00343006C1FC002CD08C3207C3FC17
S31500010480 0016D0812F004EB900021D0C52453006D0
S31500010490 48C0E588D08A320748C1D281D081204040
S315000104A0BA5065CC4245601E486F00383006C1FC23
S315000104B0002CD08C3207C3FC0016D0812F004EB918
S315000104C000021D0C5245300648C0E588D08E320721
S315000104D048C1D281D0812040BA5065CC52470C47E1
S315000104E00026D8842473006C1FC002C06800003DD
S315000104F01D0A3205C3FC0016D0812F003006C1FC4F
S31500010500002CD08C3207C3FC0016D0812F00486F17
S3150001051000084EB900021FC4204F2F1043EF0008F8
S315000105204EB90002398C486F00044EB900024D14D1
S3150001053036004A47660478036002780 43006C1FC37
S31500010540002CD08C3207C3FC0016D081068000037
S31500010550000DD0842A4097150C1500306C041ABC86
S31500010560003052470C4700026D00FF7C52460C4694
S315000105700000E6D00FEF6424642476016486F003493
S31500010580 3006C1FC0016D08B2F004EB900021D0C9F
S31500010590 5247300648C0D0800680000 2892020409C
S315000105A0BE5065D842476016486F00383006C1FC18
S315000105B00016D08B2F004EB900021D0C5247300693
S315000105C048C0D080068000002892E2040BE5065D8E2
S315000105D052460C4600076DA050BF33C000A0027A28
S315000105E04CDF7CF8205F508F4ED04E714E714E71AC
S315000105F033C000A0027C0CB900031C7000C0C8BE49
S315000106006724227C00031C70207C00C00242203C2F
S3150001061000000 0CA20D951C8FFFC309123FC00C05C
S3150001062002420 0C0C8BE33C000A0027E4E754E71A4
S315000106304E714E7133C000A002802F3900C0C8BE72
S3150001064 03F3C00CC3F3C002B4EB900007D7A33C0C5
S31500010650 00A002824E754E714E714E7133C000A0DC
S315000106600 2844A3900C0A244670A13F900C0A2876E
S3150001067000C0A3864240103900C0A3863F004879D6
S31500010680 0002E9934EB900022A6E5C8F424033C0E4
S315000106900 00A002864E754E714E714E7148E73F3E7F
S315000106A033C000A002884FEFFE80227C00028BEC53
S315000106B041EF0020703920D951C8FFFC486F002056
S315000106C04EB90001ACC63F3C00004EB9000086EAB7
S315000106D02F40010A287C00C0A256267C008040409B
S315000106E0247C00022A6E4A3900C0A25C67000646D5
S315000106F013FC000100C097F40279EFFF0080400867

S3150001070002793FFF00804046007940000080404664
S315000107100053020002797FFF00804044005301002C
S3150001072008B90006008040247007C07900C0A2E61F
S31500010730720BE3680253C7FF81534A3900C0A266B0
S31500010740671C7003C07900C0A30E720AE3680279C0
S31500010750F3FF00804046817900804046600802 79B7
S31500010760F3FF008040464A3900C0A254671A701F41
S31500010770C07900C0A2C6720AE368027983FF0080CD
S31500010780402C81790080402C4A3900C0A253671859
S315000107907003C07900C0A2C2E1480279FCFF008063
S315000107A0402C81790080402C4A3900C0A255671837
S315000107B07003C07900C0A2CAE5480279FFF3008040
S315000107C0402C81790080402C4A3900C0A25267161C
S315000107D07003C07900C0A2BE0279FFFC0080402CE4
S315000107E081790080402C4A3900C0A261670C13F957
S315000107F000C0A2FB00804042600813FC008000801C
S31500010800040424A3900C0A25E67187003C07900C031
S31500010810A2EEE1480279FCFF008040468179008022
S31500010820040464A3900C0A25D671A7007C07900C008
S31500010830A2EA720CE36802798FFF008040A68179F3
S31500010840008040A630390080403C02401FFF3F40F7
S3150001085001300CB900005A0000C0A23C6C0A23FC0E
S3150001086000005A0000C0A23C4A3900C0A2626718C3
S315000108704879 0002EF794E92588F4A14670A4879EF
S315000108800002EFB74E92588F203CFFFFB500D0B95A
S3150001089000C0A23C2F4001422A7C00C0A2FE2C7C53
S315000108A000C0C8AE6000042A4A3900C0A2626700CF
S315000108B003CC303900804046720AE26802400003E8
S315000108C04A4063080279EFFF0080404678002F44D2
S315000108D001222F4401262F44011A2F44011E26040A
S315000108E02A3C00000FFF24032F4201166000018EEF
S315000108F04A1467360CB90000000500C0A2E466265A
S315000109007003C07900C0A2EEE1480279FCFF0080C5
S3150001091040468179008040460053010042475247D4
S315000109200C47000A65F80253FEFF4A3900C0A2636C
S31500010930671830130240000033F40012A7003C07953
S3150001094000C0A3020253FFFC8153303900804046A8
S315000109500720AE268024000034A4063080079100007
S315000109600080404600530400301308000 00E66F86C
S31500010970303900804046720AE268024000034A406C
S3150001098063080279EFFF0080404630390080404419
S3150001099002400FFF7E003E000253FBFF4A146756DA
S315000109A00CB90000000500C0A2E466160279FCFF3E
S315000109B00080404600530100424652460C46000A5A
S315000109C065F84A3900C0A264670E7C00600252864F
S315000109D0BCB900C0A30465F6005304003013080037
S315000109E0000E66F830390080404402400FFF7C005B
S315000109F03C000253FBFF4A3900C0A263670C700337
S31500010A00C06F012A0253FFFC815300530100BE85CA
S31500010A1064022A07BE8363022607D4872F6F012645
S31500010A200112200722074EB90002625ED1AF0126EC
S31500010A30202F0112B0AF0126630452AF01222E2FDF
S31500010A40011E4A14671CDDAF0116200622064EB9A7
S31500010A500002625ED1AF011EBEAF011E630452AF3A
S31500010A60011A4A5666043CBC00014A7900C0C8AC6A
S31500010A70660833FC000100C0C8AC5284700112390B
S31500010A8000C0A2FFE3A8B880641C0CB900000012E4
S31500010A9000C0A2FC6500FE5A30390080405C0800A7
S31500010AA0000D6600FE4C301544403F002002486FA1
S31500010AB0001A4EB900024224204F2F28001A43EF94
S31500010AC001184EB900024A34301544403F00202F28
S31500010AD00128486F00164EB900024224204F2F28E4
S31500010AE0001643EF001E4EB900024A343015444049
S31500010AF0064000203F00202F0124486F00164EB902
S31500010B0000024224204F2F28001643EF00224EB93F
S31500010B1000024A34486F0112486F0116486F001CE3
S31500010B204EB900021FAE486F001C486F001C486F8B
S31500010B3000184EB900021F5A486F0014486F00147E
S31500010B40486F00144EB900021FB2204F2F28000C57
S31500010B5043EF01124EB900023CEC20039085E28876
S31500010B60486F00184EB900024224486F010E486FC3
S31500010B70001C486F001C4EB900021FC4204F2F28CD
S31500010B800014204F2F280112204F2F28011A20036D
S31500010B9090852F002F052F032F04487900002EFCEF1
S31500010BA04E924FEF00204A14670001183015444059
S31500010BB03F00202F0118486F001E4EB90002422443
S31500010BC0204F2F28001E43EF01184EB900024A3468
S31500010BD0301544403F00202F0120486F00164EB9C2
S31500010BE000024224204F2F28001643EF001E4EB963
S31500010BF000024A34301544400064000203F00202FB1
S31500010C00011C486F00164EB900024224204F2F28BE
S31500010C10001643EF00224EB900024A34486F011212
S31500010C20486F0116486F001C4EB900021FAE486F8F
S31500010C30001C486F001C486F00184EB900021F5A6D
S31500010C40486F0014486F0014486F00144EB9000233
S31500010C501F82204F2F28000C43EF01124EB90002CC
S31500010C603CEC204F2F28010E204F2F280116487 9E2
S31500010C700002EFF94E924FEF000C6046202F013E25
S31500010C80B0B900C0A23C673A2F7900C0A23C013E30
S31500010C9030390080404672 0AE268024000034A4049
S31500010CA06320303900C0A23E024000010240000 12B
S31500010CB0720CE3680279EFFF008040468179 00807B
S31500010CC040464A5666043CBC00014EB90001BA6A68
S31500010CD02F3900026A4E4EB90000457E0C40FFFFD7
S31500010CE0660E203900C0A23CB0AF01426200FBBAD9
S31500010CF0303C1FFFC06F01300279E0000080403CAC
S31500010D0081790080403C08B90006008040 2408F93A
S31500010D1000006008040 2408B9000700804024025 3E1
S31500010D20FEFF0253FDFF007910000080400842 39A2
S31500010D3000 0C097F44A3900C0A25B670000E84A394F
S31500010D4000 0C0A25C660000DE4A3900C0A2516600FE
S31500010D5000 0D4183900804008 13FC00800080400848
S31500010D6010390080402402000003424316000 23974
S31500010D7000 0FC00804024005302000079800000 80BE
S31500010D80404400530100424 73C073A0660662A7C0C
S31500010D9000080401408150007672E2C7C00C000FE59
S31500010DA00081500066 71C08D5000652B900E00000C8
S31500010DB052B900C000FA421613FC00EA0080401541
S31500010DC0600252160 8D500074A46660A0C470FFF0D
S31500010DD0670852476 0124A47660C4A4657C04400A4
S31500010DE048803C006002534730070040800033C012
S31500010DF00080000442F3900026A4E4EB90000457E3C
S31500010E000C40FFFF66060C45003C658213C400805A
S31500010E1040087003C003023900FC00804024813978
S31500010E2000 08040244A3900C0A258676A4A1466669F
S31500010E307003C03900C0A2D7E908023900CF00808B
S31500010E40402481390080402 44A3900C0A2526716E5
S31500010E507003C03900C0A2BF023900FC00804024E3
S31500010E60813900804024 4A3900C0A25567187003B1
S31500010E70C03900C0A2CBE508023900F30080402446
S31500010E808139008040 2408B90006008040 2408F911
S31500010E90000600804024 4A14670001464A3900C012
S31500010EA0A25C6600013C4A3900C0A25866000132C4
S31500010EB04A3900C0A253670000B22A7C00C0A2C012
S31500010EC00C95000000186218 13F900C0A2C300C0F7
S31500010ED097FA423900C097FB423900C097FC607A05
S31500010EE013FC000100C097FC423900C097FA0C952B
S31500010EF0000000019660A13FC000100C097FB601888
S31500010F000C95000000 1A660A13FC000200C097FB4C
S31500010F1060064239 00C097FB4240103900C097F97C
S31500010F2000240001F720AE368027983FF00C0980A33
S31500010F30817900C0980A0279FCFF00C0980A0279FB
S31500010F403FFF008040460079400000804046025342
S31500010F50C7FF0279FCFF0080404613FC000200C077
S31500010F60 97F613FC001E00C097F84A3900C0A2523A
S31500010F70671A13F900C0A2BF00C097FE13FC000256
S31500010F80 00C097F613FC001E00C097F84A3900C04E
S31500010F90A252664C4A3900C0A25366444A3900C07F
S31500010FA0A25A663C423900C097F8423900C097F60A
S31500010FB0423900C097FC423900C097FB427900C014
S31500010FC0980642472A7C00C052863F072F0D4EB92C
S31500010FD00001440A4BED02E452470C47001865EA4A
S31500010FE04A3900C0A253670A3E3900C0A2C253471C
S31500010FF0600242474A3900C0A25A670000B433F979
S3150001100000C0A2DE00C0980613FC001E00C097F8BF
S315000110104A7900C098066F1C33FC01A000C09804F1
S3150001102010075200 13C000C097FA13FC000400C059
S31500011030 97F6607C0C79FFFF00C0980666724A1429
S31500011040665C48790002F0074E92588F13FC000443
S31500011050 00C097F660064EB90001BA6A0C39000263
S31500011060 00C097F662F048790002F01F4E92588F41
S3150001107060064EB90001BA6A4A7900C0980462F264
S3150001108048790002F0364E92588F60064EB900013B
S31500011090BA6A0C39000100C097F662F0600813FCC9
S315000110A0000100C097F648790002F04E4E92588F23
S315000110B04A3900C0A2596700076C3007C1FC02E437
S315000110C0068000C052862A404DEF0146303C00FFA3
S315000110D0C0470256FF008156026F0FFF0148424585
S315000110E01A2D02DF4242600007 1C0CB90000028083
S315000110F000C0A23C6C0A23FC0000050000C0A23C13
S3150001110 04A7900C0984666000 6F64240102D02DF75
S315000111100BA40670006EA524242451A2D02DF4247AB

S315000111201E2D02B64243162D02B7287C0000054C3F
S315000111300C4700186D067C17280660063C0748C652
S315000111402806200 4D080D086D080D08C2F4001780C
S3150001115078003805 0C4700186D047C1760043C07BD
S315000111604 8C62204D281D284EB89068100C098FA4E
S315000111702006E588D28020413010486F001C48C007
S315000111804EB900024204487900028CD8486F00200B
S315000111190486F00204EB900021FAE487900028CD478
S315000111A0486F001C486F001C4EB900021F5A486F59
S315000111B00014204F2F28017C486F01664EB90002AA
S315000111C01FAE72003205068100016AC20411210D6
S315000111D0488148C1E989068100C098CA380348C4D4
S315000111E0E58CD28420413010486F001C48C04EB9AE
S315000111F00002420448790002 8CD8486F0020486FEB
S315000112000 00204EB900021FAE487900028CD4486F07
S315000112100 01C486F001C4EB900021F5A486F00148B
S3150001122041EC0090300348C0E788D1C02F08486FD1
S315000112300 1624EB900021FAE43ED01F641EF0132E4
S31500011240 20D920D92091302F0132906F0134E24804
S315000112503C00302F0136906F0138E24838003F3CA0
S315000112600 00002F0D4EB9000155043F3C00042F0D1F
S315000112704EB9000155042F6D01BE01562F6D01CEE9
S3150001128001522 04F2F28015E43EF00204EB9000284
S315000112904 9BC3006486F001602800000FFFF4EB9B8
S315000112A000024224486F001C486F001A486F001A5A
S315000112B04EB900021FAE486F0156486F0016486FBF
S315000112C001524EB900021FC43004486F001A028051
S315000112D00000FFFF4EB90002422448 6F015A486FD1
S315000112E0001E486F001E4EB900021FAE486F015224
S315000112F0486F001A486F01564EB900021FC43F2DB0
S315000113000026C202D0268486F001E4EB9000242246D
S315000113100 487900028CDC486F0022486F00224EB9E2
S315000113200 0021FAE204F2F28001A3F053F033F073B
S315000113304A7900C0980463063F3C0068603E0C7918
S315000113 40FFFF00C0980666063F3C0043602E4A79BF
S315000113500 0C098066F063F3C004760204A3900C02E
S315000113609 7F667063F3C005460124A3900C097F46D
S315000113706 7063F3C004860043F3C00414879000253
S315000113 80F0654E924FEF00124A3900C0A25766002F
S315000113900 0A8204F2F28014E204F3F28013C204F07
S315000113A03F28013C3F2D02BA302D0204486F00262A
S315000113B002800000FFFF4EB900024224487900027 4
S315000113C08CE0486F002A486F002A4EB900021FC4FC
S315000113D0204F2F280022204F2F280158204F3F2829
S315000113E00146204F3F2801463F2D02B8302D02020B
S315000113F0486F003402800000FFFF4EB9000242240C
S3150001140048790002 8CE0486F0038486F00384EB9C1
S315000114100 0021FC4204F2F280030302D02D0906DBE
S315000114200 2CE3F003F2D02DA48790002F0804E924B
S315000114304FEF00246000019A08EF0003014808AF4E
S3150001144000002014802 5600FF203C0000009AD0B974
S315000114500 0C0C8BE3216E049024100FF3601C6FC93
S31500011460002CD08306800000001622404 1EF016265
S315000114707004 20D951C8FFFC30910CB90F0C3F0004
S3150001148000C000FA630000D83F3C000D2F1643EF61
S3150001149000164EB9000075C43016E048024000FF40
S315000114A07200 3200D2810681000016202041 3F10D1
S315000114B0204F2F2800162F28001243EF00224EB985
S315000114C00001A2343F3C000B2F1643EF000E4EB92C
S315000114D00000075C43016E048024000FF7200320079
S315000114E0D2810681000016202041 3F10204F2F286F
S315000114F0000E2F28000A43EF001A4EB90001A2344C
S31500011500486F0162486F000C4EB900021DF6486F24
S31500011510000 8486F0014486F00084EB900021DB854
S315000115 20204F2F2800042F10486F016A486F001CB6
S315000115304EB900021DF6486F0018486F0024486F27
S315000115400 00184EB900021DB8204F2F2800142F286D
S315000115500 001048790002F0BA4E924FEF00143F3C5A
S315000115600 00072F1643EF00164EB9000075C430165A
S31500011570E048024000FF72003200D281068100007D
S315000115801620 20413F10204F2F2800162F28001229
S3150001159043EF00224EB90001A234486F0162486F41
S315000115A000014 4EB900021DF6486F0010486F001C6A
S315000115B0486F00104EB900021DB8204F2F28000CAD
S315000115C02F2800084879 0002F0CB4E924FEF000C0D
S315000115D0287C00028BE860000092101448800240CB
S315000115E000FFE148025600FF81563016E0480240EE
S315000115F000FF3F002F0D4EB900015504 41ED01BE1C
S315000116003016E048024000FF72003200E589D1C180
S31500011610 2F1048790002F0D54E923016E04802406C
S315000116 2000FF0C40000466084879000 2F0E3602CD4
S31500011630303CFF00C056660848790002F0E5601CA0
S315000116403016E048024000FF0C400001660848796 8
S31500011650000 2F0E760064879000 2F0E948790002E5
S31500011660F0DE4E924FEF0010528CB9FC00028BEC6B
S315000116706500FF68203900C0C902486F001C4EB9D9
S3150001168000024224303900C09826907900C098287B
S31500011690486F00160280000 0FFFF4EB90002422487
S315000116A0486F001C486F001A486F001A4EB90002B5
S315000116B01FC4204F2F280012303900C09826907978
S315000116C000C09828486F001E02800000FFFF4EB937
S315000116D00002422448790002 8CE0486F0022486FDC
S315000116E000224EB900021FC4204F2F28001A487944
S315000116F00002F0ED4E92203900C0C902486F002861
S315000117004EB90002422430 3900C0982A907900C0AF
S3150001171098264 86F002202800000FFFF4EB90002A2
S3150001172042244 86F0028486F0026486F00264EB9AC
S31500011730 00021FC4204F2F28001E303900C0982AEE
S3150001174090790 0C09826486F002A02800000FFFFAA
S315000117504EB900024224487900028CE0486F002EFF
S31500011760486F002E4EB900021FC4204F2F280026B5
S3150001177048790002F0FF4E92203900C0C902486F35
S31500011780003 44EB900024224303900C098269079BF
S31500011790 00C0982C486F002E02800000FFFF4EB952
S315000117A00002422448 6F0034486F0032486F00320D
S315000117B04EB900021FC4204F2F28002A303900C01D
S315000117C09826907900C0982C486F0036028000005 8
S315000117D0FFFF4EB900024224487900028CE0486FAF
S315000117E0003A486F003A4EB900021FC4204F2F2815
S315000117F000032 48790002F10F4E924FEF00244EB9A4
S3150001180000 01BA6A0C79FFFF00C098066700F8DC90
S31500011810 2F3900026A4E4EB90000457E0C40FFFF8B
S315000118206700F8C84A3900C0A251670002644A3904
S315000118300 0C0A267674C42477C003C07207C00C081
S315000118409 84810306B00488048C0E588068000C086
S31500011850C90820402F102006D080D086E588068052
S3150001186000 0028D9020402F2800084879000 2F11FC0
S315000118704E924FEF000C52470C47000A65BA6000C2
S3150001188 0 02104A3900C0A25B660002064A3900C04E
S315000118909 7F66700012442401039 00C097F83F00CF
S315000118A02F3900C097F0424010 3900C097FE3F0023
S315000118B04240103900C097FA3F0048790002F12BE7
S315000118C04E924FEF000E0C39000100C097FB6608DF
S315000118D048790002F16560100C39000200C097FBDF
S315000118E0660A48790002F1994E92588F4A3900C02A
S315000118F097FC670000A248790002F1C84E923013A6
S3150001190 0720BE268024000073F0048790002F1F9D4
S315000119104E92303900804046E048024000033F00C5
S3150001192048790002F20B4E92303900804 02C720A3F
S31500011930E2680240001F3F0048790002F21D4E9204
S3150001194030390080402CE048024000033F004879CE
S31500011950000 2F22E4E923039008040 2CE4480240BB
S3150001196000 0033F0048790002F2404E923039008070
S315000119704 02C024000033F0048790002F2514E928A
S315000119804240103900804 0423F0048790002F2632C
S315000119904E924FEF002E3F3900C0980648790002 5B
S315000119A0F2754E923F3900C09804487900 02F282DE
S315000119B04E924FEF000C600A48790002F2924E9265
S315000119C0588F103900804024E808020000037200 95
S315000119D01200E7890681000 28D6820412F28000444
S315000119E0103900804024E408020000034241 12003D
S315000119F030013F001039008040240200000342 41BB
S31500011A00120030013F002F3900C01856487900 02F4
S31500011A10F2A74E924FEF00104A3900E0000B6734EF
S31500011A2030390080400E0800000F670848790002 2F
S31500011A30F2E9601A30390080400E0800000A670892
S31500011A4048790002F30060064879000 2F32B4E92B2
S31500011A50588F603C4240103900E0000D3F00424083
S31500011A60103900E0000C52403F00207900C0C8BE8A
S31500011A704240103900E0000A3200C2FC0016D1C112
S31500011A80486800044 8790002F34D4E924FEF000C6E
S31500011A904A3900C0A257670007BE4A3900C0A25999
S31500011AA0660007B42F7C0002C04800F408AF0002AC
S31500011AB000F2600007902F6F00D8010A082F000678
S31500011AC0010767 16486F002048790002F3C9487973
S31500011AD00002F3764E924FEF000C102F010648805C
S31500011AE0206F00D832100241000 3C0C13200C2FC8F
S31500011AF002E4068100C05286302F00F0024000FF4A
S31500011B003400C4FC02E4D2822A41302F00F00240A4
S31500011B1000FF360042471E2D02B642461C2D02B773
S31500011B202C7C0000054C0C4700186D067A17280519
S31500011B3060063A0748C528052004D080D085D080A4

S31500011B40D08E2840780038030C4700186D047A17A8
S31500011B5060043A0748C52204D281D284EB89068102
S31500011B6000C098FA2405E58AD2822041301048 6FD8
S31500011B70001C48C04EB900024204487900028CD8C4
S31500011B80486F0020486F00204EB900021FAE487909
S31500011B9000028CD4486F001C486F001C4EB900022D
S31500011BA01F5A486F00142F0C486F01664EB9000288
S31500011BB01FAE41EE0090300648C0E788D1C02848E4
S31500011BC07200320306810000016AC204112104881D2
S31500011BD048C1E989068100C098CA340648C2E58A27
S31500011BE0D28220413010486F001C48C04EB9000215
S31500011BF04204487900028CD8486F0020486F0020C3
S31500011C004EB900021FAE487900028CD4486F001C01
S31500011C10486F001C4EB900021F5A486F00142F0C62
S31500011C20486F01624EB900021FAE7200320306818F
S31500011C30000016AC20411210488148C1E98906818D
S31500011C4000C098CA340648C2E58AD28220413028AB
S31500011C500002486F001C48C04EB900024204487990
S31500011C6000028CD8486F0020486F00204EB9000250
S31500011C701FAE487900028CD4486F001C486F001CC7
S31500011C804EB900021F5A486F0014486C0004486F91
S31500011C90015E4EB900021FAE3F3C00002F0D4EB94A
S31500011CA0000155043F3C00042F0D4EB900015504B7
S31500011CB03F3C00052F0D4EB9000155042F6D01BEA5
S31500011CC001522F6D01CE014E2F6D01D2014A43ED16
S31500011CD001F641EF013220D920D92091342F01326A
S31500011CE0946F0134382F0136986F0138362F013A37
S31500011CF0966F013C30390080403C02401FFF444052
S31500011D00064020003F0030130240000 3323C010030
S31500011D10E0617006C0C13F0030390080402A323987
S31500011D200080403C02411FFF904102400FFF3F00EF
S31500011D3030390080402832390080403C02411FFF83
S31500011D40904102400FFF3F0030390080402A32396E
S31500011D500080403C02411FFF904102400FFF3F00BF
S31500011D6030390080402832390080403C02411FFF53
S31500011D70904102400FFF3F0030390080402632 3942
S31500011D800080403C02411FFF904102400FFF3F008F
S31500011D90486F00A648790002F3FD48790002F3D5A1
S31500011DA04E924FEF001A0C4700186D047A17600423
S31500011DB03A0748C5303900C098BA486F001C0280FE
S31500011DC00000FFFF4EB900024224487900028CE070
S31500011DD0486F0020486F00204EB900021FC4204FF3
S31500011DE02F28001832 0648C1D281068100C098B258
S31500011DF020413010486F00200 2800000FFFF4EB9DD
S31500011E0000024224487900028CE0486F0024486FA2
S31500011E1000244EB900021FC4204F2F28001C320691
S31500011E2048C1D281068100C098B220413010486F66
S31500011E30002402800000FFFF4EB9000242244879C7
S31500011E4000028CE0486F0028486F00284EB9000256
S31500011E501FC4204F2F28002032 0648C1D281068197
S31500011E6000C098AA20413010486F002802800000 67
S31500011E70FFFF4EB900024224487900028CE0486F08
S31500011E80002C486F002C4EB900021FC4204F2F288A
S31500011E9000243 20648C1D281068100C098AA204199
S31500011EA03010486F002C02800000FFFF4EB900027F
S31500011EB04224487900028CE0486F0030486F0030B8
S31500011EC04EB900021FC4204F2F2800282205D281B7
S31500011ED0068100C0987620413010486F003002809C
S31500011EE00000FFFF4EB900024224487900028CE04F
S31500011EF0486F0034486F00344EB900021FC4204FAA
S31500011F002F28002C486F00B048790002F43A48792E
S31500011F100002F40A4E92302D020A486F00400280F8
S31500011F200000FFFF4EB900024224487900028CE00E
S31500011F30486F0044486F00444EB900021FC4204F49
S31500011F402F28003C302D0208486F00440280000013
S31500011F50FFFF4EB900024224487900028CE0486F27
S31500011F6000048486F00484EB900021FC4204F2F2871
S31500011F700040302D0206486F004802800000FFFF36
S31500011F804EB900024224487900028CE0486F004CA9
S31500011F90486F004C4EB900021FC4204F2F28004441
S31500011FA0302D0204486F004C02800000FFFF4EB93D
S31500011FB000024224487900028CE0486F0050486FC5
S31500011FC000504EB900021FC4204F2F280048302D63
S31500011FD00202486F005002800000FFFF4EB9000266
S31500C11FE04224487900028CE0486F0054486F00543F
S31500011FF04EB900021FC4204F2F28004C486F00D055
S3150001200048790002F47248790002F4484E924FEF83
S315000120100440C4700186D047A1760023A077003F2
S31500012020C04548C0068000C098A62040424010 1016
S315000120303F00486F009A48790002F49148790002FE
S31500012040F4814E92204F2F280164204F2F280168DA
S31500012050204F2F280170204F2F280174204F2F2841
S31500012060017C486F00BA48790002F4CA4879000237
S31500012070F4A04E923F063F07486F00CA4240102D1A
S31500012080 02DF3F0048790002F4F048790002F4D8F3
S315000120904E924FEF0040204F3F28013A204F3F28F4
S315000120A00138204F3F280136486F009E48790002CB
S315000120B0F51748790002F4F54E92204F3F28014E5C
S315000120C0204F3F28014C204F3F28014A486F00B05E
S315000120D048790002F54248790002F5204E923F0305
S315000120E03F043F02486F00C248790002F56D487906
S315000120F00002F54B4E92204F2F28019443EF0056D4
S3150001210004EB9000249BC486F018C486F0184486F83
S315000121100 00564EB900021FC4204F2F28004E486FAB
S31500012120 0194486F018C486F005A4EB900021FC4D2
S31500012130204F2F280052486F005A486F0194486F6C
S315000121400005E4EB900021FC4204F2F280056486F6B
S3150001215000 0DA48790002F59E48790002F5764E923A
S3150001216 04FEF004E204F2F28015E43EF00204EB95E
S31500012170000249BC3003E248486F001602800000A5
S31500012180FFFF4EB900024224486F0156486F001AFC
S31500012190486F001A4EB900021FAE486F014A486FD8
S315000121A00016486F00164EB900021FC4204F2F2893
S315000121B0000E3004E248486F001A02800000FFFF5B
S315000121C04EB900024224486F015E486F001E486FF7
S315000121D0001E4EB900021FAE486F0152486F001A29
S315000121E0486F001A4EB900021FC4204F2F28001253
S315000121F03002E248486F001E02800000FFFF4EB920
S31500012200 00024224486F0024486F0022486F0022D2
S315000122104EB900021FAE486F015A486F001E486F43
S31500012220001E4EB900021FC4204F2F280016486F0A
S31500012230 00A448790002F5CA48790002F5A24E9237
S3150001224 04FEF001842A7486F00244EB90001A8922B
S315000122504A006600F8624A3900C0A2656700013C7F
S31500012260 2A7C00C0A30820157204B0816200012CEB
S31500012270D040303B00064EFB0002000A001C002E37
S315000122800005200520079800000 80400E0279FBFF67
S31500012290 0080400E602202797FFF0080400E0279A5
S315000122A0FBFF0080400E601002797FFF0080400E28
S315000122B0007904000080400E13FC000100E0000BD1
S315000122C013FC000200C097F5600000D00C950000D9
S315000122D000036604 7C0160027C020C950000000389
S315000122E06604420760027E01307C0008D1F900C015
S315000122F0010670001007E588D1C00828000 2000118
S315000123006700008E13C600E0000A4A3900C0A244E5
S3150001231067301 03C00FFD03900C0A287206F010A48
S315000123203210024100 03C0C113C000E0000C30109E
S31500012330 02400003D03900E0000C13C000E0000D9C
S315000123406038 4A3900C0A24D671A103C00FFD039E7
S31500012350 00C0A2AB13C000E0000C520013C000E0A5
S31500012360000D6016423900E0000C206F010A3010A2
S31500012370024000 0313C000E0000D0279FBFF00805C
S31500012380400E423900E0000B423900C097F5600A61
S315000123904879 0002F5D74E92588F4A3900C0A26794
S315000123A0672C4A3900C0A251662442 3900C09852AE
S315000123B04247700030070 68000C09848204010BC94
S315000123C0000152470C47000A65E8610002A4424039
S315000123D04FEF018033C000A0028A4CDF7CFC4E75B2
S315000123E04E714E714E7148E7011C33C000A0028C3C
S315000123F04FEFFFF6287C00C097F64A146700018468
S3150001240 02A7C00C0980647EF00084A7900C0980464
S31500012410637A0C55FFFF6774537900C09804662EE2
S3150001242053140C14000367264214423900C097F86E
S3150001243042472A7C00C052863F072F0D4EB9000144
S31500012440440A4BED02E452470C4700186DEA2A7C18
S3150001245000C05286602243ED02CE41D720D920D951
S31500012460 3091026FFCFF000843D741ED02CE20D91F
S31500012470 20D930914BED02E4BBFC00C097E665D64E
S3150001248 00279FCFF0080402E600000F84A556F6A11
S315000124905355660833FC01A000C098042A7C00C08D
S315000124A05286604A43ED02CE41D720D920D93091D8
S315000124B04240103900C097FA02400003E148026F1A
S315000124C0FCFF0008816F00084240103900C097FEEA
S315000124D002400003026FFFFC0008816F000843D72A
S315000124E041ED02CE20D920D930914BED02E4BBFC5F
S315000124F000C097E665AE6000008A0C55FFFF6700D5
S315000125000 00820C140002667A2A7C00C05286604A58
S31500012510 43ED02CE41D720D920D93091424010391E
S31500012520 00C097FA02400003E148026FFCFF000871
S31500012530816F00084240103900C097FE0240000337
S315000125400026FFFFC0008816F000843D741ED02CE00
S31500012550 20D920D930914BED02E4BBFC00C097E6AF

S3150001256065AE4240103900C097FA02400003E148C7
S315000125700279FCFF0080402E81790080402E18BC34
S3150001258000014FEF000A33C000A0028E4CDF3880F5
S315000125904E754E714E714E7133C000A002904A398C
S315000125A000C097F66732227C00C097F84A11672867
S315000125B053116624423900C097F6423900C097FC90
S315000125C04240103C000033C000C0980433C000C034
S315000125D0980613C000C097FB4A3900E0000B671C40
S315000125E0227C00C097F54A1167125311660E0279D3
S315000125F0FBFF0080400E423900E0000B33C000A013
S3150001260002924E754E714E714E712F0733C000A066
S31500012610002941E2F000D488748C7202F0008220765
S3150001262 0D281D287E589068100028D902041B09042
S315000126306D047E0460241E2F000D488748C72207BB
S315000126400D281D287E589068100028D902041B0A80A
S3150001265000046E047E0560024207100733C000A025
S3150001266002962E1F205F5C8F4ED04E714E714E71B9
S3150001267048E7013C33C000A002984FEFFFE62A7CF1
S3150001268000C098520C15000A6C000268287C00C034
S315000126909800267C00C098C4247C00C09848101578
S315000126A00C0000096200023A4880D040303B000627
S315000126B04EFB00020014005C00720088009E00DAE6
S315000126C0016601F0021E021E4A146200021430392C
S315000126D000C09826907900C09828E848486F0014F1
S315000126E002800000FFFF4EB900024222448790000231
S315000126F08CE4486F0018486F00184EB900021FC4D9
S31500012700486F00104EB900024D142E00600001AC56
S315000127104A14620001CC303900C098BAE8487E00FC
S315000127203E00600001964A14620001B6303900C0CD
S3150001273098BCE8487E003E00600001804A146200B1
S3150001274001A0303900C098C2E8487E003E00600012
S31500012750016A4A146200018A3013486F001602802A
S31500012760000000FFFF4EB900024224487900028CE0C6
S31500012770486F001A486F001A4EB900021FC4486F0D
S31500012780000124EB900024D142E006000012E4A14AB
S315000127906200014E3013907900C098BE486F001454
S315000127A002800000FFFF4EB900024224487900 0270
S315000127B08CE0486F0018486F00184EB900021FC41C
S315000127C0487900028CD4486F0014486F00144EB942
S315000127D000021FAE3013486F000802800000FFFFA1
S315000127E04EB900024224487900028CE0486F000C81
S315000127F0486F000C4EB900021FC4486F000C486FA9
S3150001280000008486F00084EB900021F8248574EB9AA
S31500012810000024D142E00600000A24A14620000C29C
S315000128203013907900C098BE486F001402800000F2
S31500012830FFFF4EB900024224487900028CE0486F3E
S315000128400018486F00184EB900021FC448790002EB
S315000128508CD4486F0014486F00144EB900021FAEA5
S315000128603013486F000802800000FFFF4EB90002D6
S31500012870422448790002 8CE0486F000C486F000C36
S315000128804EB900021FC4486F000C486F0008486F1C
S3150001289000084EB900021F5A48574EB900024D149E
S315000128A02E0060164A146238303900C0982A907991
S315000128B000C09826E8487E003E00101548803F007B
S315000128C02F076100FD461215488148C11580180081
S315000128D0600C1015488048C015BC0003080052154D
S315000128E00C15000A6C0C1015488048C015BC000276
S315000128F008004FEF001A33C000A0029A4CDF3C805B
S315000129004E754E714E714E712F0D33C000A0029C53
S31500012910598F2A6F000C0257FF00303C00FFC06F31
S3150001292000010E148025700FF8157026F0FFF0002B6
S3150001293008EF00030002307C009AD1F900C0C8BE3E
S315000129403017E048024000FF3200C2FC002CD1C122
S315000129504868001A48790002F60D2F0D4EB900029B
S315000129602AA42F390002648048790002F616486DC0
S3150001297000204EB900022AA44FEF0018588F33C029
S3150001298000A0029E2A5F205F5C8F4ED04E714E7171
S315000129904E712F0D33C000A002A0598F2A6F000C73
S315000129A00257FF0070F0D06F0010024000FFE148AF
S315000129B00025700FF8157026F0FFF000208EF000365
S315000129C0000023 07C009AD1F900C0C8BE3017E04839
S315000129D0024000FF3200C2FC002CD1C1486800044D
S315000129E048790002F61F2F0D4EB900022AA42F398D
S315000129F00002648048790002F628486D00204EB92D
S31500012A0000022AA44FEF0018588F33C000A002A27B
S31500012A102A5F205F5C8F4ED04E714E714E7148E732
S31500012A20270C33C000A002A4598F2EB900028D0CC9
S31500012A307A00303C00FFC06F0024E148025700FFD6
S31500012A408157026FFC0000023F3C00004EB90000B6
S31500012A5086EA28403017E048024000FF7200320043
S31500012A60E589D28C2A41082D00020001676870 03AE
S31500012A70C02D00016760082D0002000166062E05C3
S31500012A802C076030082D000400016604700160 20E7
S31500012A90207900C00570202 8000E7201B0816604FD
S31500012AA07001600C207900C00570202800 0E52804C
S31500012AB02E002C072006D080D087E78832150241E8
S31500012AC00003740034012 2024EB900025BBC2A00E5
S31500012AD0206F002042902005588F33C000A002A627
S31500012AE04CDF30E4205F5C8F4ED04E714E714E71DB
S31500012AF048E7270C33C000A002A8598F2EB900025F
S31500012B008D107A0070F0D06F0024024000FFE1487A
S31500012B10025700FF8157026FFC0000023F3C000094
S31500012B204EB9000086EA28403017E048024000FF0F
S31500012B3072003200E589D28C2A41082D000300017A
S31500012B4067547003C02D0001674C082D0003000176
S31500012B5066062E052C07601C082D0004000166047C
S31500012B607001600A207900C00570202800 0ED0800F
S31500012B702E002C072006D080D087E7883215024127
S31500012B800003740034012 2024EB900025BBC2A0024
S31500012B90206F002042902005588F33C000A002AA62
S31500012BA04CDF30E4205F5C8F4ED04E714E714E711A
S31500012BB033C000A002AC33C000A002AE205F588F24
S31500012BC04ED04E714E714E7133C000A002B033C06B
S31500012BD000A002B2205F588F4ED04E714E714E71D9
S31500012BE048E7213E33C000A002B44FEFFFDC45EF3A
S31500012BF00022286F00440252FC00303C00FFC06FE7
S31500012C0004CE148026F00FF0020816F00203F3C2D
S31500012C1000004EB9000086EA2640302F0020E04829
S31500012C2024000FF72003200E589D28B2A41267CE0
S31500012C3000C00570082D000200016604424 7601EAF
S31500012C40082D00040001670C20532028000E720194
S31500012C50B08166047E0160063E280010DE414A47C7
S31500012C60 6700022E08EF00020022202F00483207DB
S31500012C7048C14EB900023742024000FF026FFF0011
S31500012C800020816F0020202F00483207 48C14EB92D
S31500012C90000237940240000F720CE368026F0FFFC7
S31500012CA00022816F00220C4700016F2C303CF0009E
S31500012CB0C06F002266047E01601E302F0022E2688A
S31500012CC00240000F53400240000FE368026F0FFFFE
S31500012CD00022816F002242474A476622302F002296
S31500012CE0720CE2680240000F7E003E00701AD0931B
S31500012CF02207D281D287E589D0812F0060064879E3
S31500012D00002F63948790002F6312F0C2C7C0002BC
S31500012D102AA44E964FEF000C267C00C0C8BE30395F
S31500012D2000C00012E848024000070C400004673A60
S31500012D3008390000 00C000FD6730082D00040001BD
S31500012D4067282F3900C000FA43EF00224EB900016F
S31500012D509A9841EF001E42401010322F0022740C47
S31500012D60E4690241000FB041672C307C009AD1D34F
S31500012D70302F0020E048024000FF3200C2FC002C48
S31500012D80D1C14868001A48790002F640486C00082B
S31500012D904E964FEF000C3F3C0000204F2F2800229B
S31500012DA043EF001E4EB9000075C4302F0020E048E5
S31500012DB0024000FF72003200D281068100 00162017
S31500012DC020413F10204F2F28001E2F28001A43EFC5
S31500012DD0001A4EB90001A234307C009AD1D3302FAB
S31500012DE00020E048024000FF3200C2FC002CD1C1A5
S31500012DF048680016486F000C4EB900021DF6486F70
S31500012E000008486F0014486F00084EB900021DB84B
S31500012E10204F2F2800042F10307C009AD1D3302F59
S31500012E200028E048024000FF3200C2FC002CD1C15C
S31500012E3048680023486C00204E964FEF001070033F
S31500012E40C02D0001674A3015024000037218028145
S31500012E500000FFFF82C00C410001633430 2F0020C7
S31500012E6024000FF32150241000302800000FFFF0D
S31500012E7080C152403F0048790002F646486C002066
S31500012E804EB900024D60487408204E964FEF000A75
S31500012E904FEF002433C000A002B64CDF7C84205FD4
S31500012EA04FEF000A4ED04E714E714E7148E7273CE6
S31500012EB033C000A002B84FEFFFEC45EF000A2A6FBE
S31500012EC000380252FC0070F0D06F0040024000FF53
S31500012ED0E148026F00FF0008816F00083F3C0000D7
S31500012EE04EB9000086EA2640302F0008E04802402D
S31500012EF000FF72003200E589D28B2841267C00C092
S31500012F000570082C000300016604424 76018082C6E
S31500012F1000040001660 47C0160062053 3C28001071
S31500012F203006D0403E004A4767000234202F003C5D
S31500012F30320748C14EB900023742024000FF026F14
S31500012F40FF000008816F0008202F003C320748C1AE
S31500012F504EB9000237942C0072024EB90002374274
S31500012F600240000F720CE368026F0FFF000A816FC7
S31500012F70000A2A060245000108EF0002000A3F3C4A

S31500012F80000B43EF00024EB900007F562F3900C0F7
S31500012F9000FA41EF00042F10204F2F28001043EFB5
S31500012FA000184EB900008194307C0008D1F900C0A8
S31500012FB00106302F0008E048024000FF720032008F
S31500012FC0E589D1C10828000400166047E01600676
S31500012FD020532E28000E7001BE806322302F000A76
S31500012FE0720CE2680240000F7E003E00701AD09318
S31500012FF02207D281D287E589D0812F0060064879E0
S315000130000002F65148790002F64D2F0D267C00028A
S315000130102AA44E9348790002F6592F0D4EB90002A3
S315000130204D60487508004E934FEF00147003C02C95
S315000130300001674830140240000372180281000043
S31500013040FFFF82C00C4100016332302F00080240AD
S3150001305000FF3214024100030280000FFFF80C11D
S3150001306052403F0048790002F65D2F0D4EB900022D
S315000130704D60487508004E934FEF000A30054A40EF
S315000130806 70C0C400001670000C2600000D248795D
S315000130900028D14486F00104EB900021FF24A401B
S315000130A06C0000BC487900028D18486F00104EB9BB
S315000130B000021FF24A406D0000A6287C00C0C8BE6F
S315000130C0203C0000009AD094322F0008E0490241CA
S315000130D000FF3401C4FC002CD0822F00486F001081
S315000130E0486F000C4EB900021FAE204F2F28000476
S315000130F0307C009AD1D4302F000CE048024000FF0A
S3150001310003200C2FC002CD1C14868000D486D002078
S315000131104E93307C009AD1D4302F0014E0480240FF
S3150001312000FF3200C2FC002CD1C1486800004487976
S31500013130002F664486D00204EB900024D604875E4
S3150001314008204E934FEF00186014486D0020204F61
S315000131502F2800143F3C00634EB900001AB64FEF0A
S31500013160001433C000A002BA4CDF3CE4205F4FEFED
S31500013170000A4ED04E714E714E7133C000A002BC92
S31500013180227C00C05554207C0080402620D920D9BD
S31500013190309113F900C05561008040430079100059
S315000131A000804008833C000A002BE4E754E714E71BC
S315000131B04E7148E7030C33C000A002C04FEFFFF683
S315000131C02A6F001E3C2F002243ED02CE41D720D9A3
S315000131D020D930917003C046E548026FFFF300081D
S315000131E0816F000843D741ED02CE20D920D9309115
S315000131F01B4602E249ED001A203C00000090D0ADCA
S3150001320000163206C3FC00C8D081288020402B500E
S31500013210000C20542B68000400100839000600C079
S31500013220A1FD672C4A6D020467267008D06D020461
S31500013230E8483E003B4702BA3B4702BC7008D06DE6
S3150001324000208E8483E003B4702BE3B4702C06044D5
S31500013250300648C0D0802E007008207C00C098AA95
S31500013260D0707800E8483B4002BA7008D070780008
S31500013270E8483B4002BC7008207C00C098B2D07080
S315000132807800E8483B4002C07008D0707800E848F2
S315000132903B4002BE284D0C2D000302E2660E0C2DAA
S315000132A0000A02DD6606426D000C6004422D02DD55
S315000132B0204C3228000C303900C09836C2C0D28169
S315000132C048413141000C32280010303900C098368F
S315000132D0C2C0D2814841314100104FEF000A33C0CC
S315000132E000A002C24CDF30C0205F5C8F4ED04E7111
S315000132F04E714E7148E7010C33C000A002C44FEF76
S31500013300FFF62A6F001A43ED02CE41D720D920D904
S3150001331030917 01FC06F001E720AE368026F83FF4F
S315000133200008816F000843D741ED02CE20D920D98C
S3150001333030911B6F001F02E04240102D02E0024057
S315000133400001FE368026D83FF02D6816D02D67E00FF
S315000133501E2D02E0202D00162207D281D287D281AE
S31500013360D08128402A94702BD06C00047201B240A2
S315000133706F04700160067028D06C0004323C00C8EE
S31500013380B2406C043E0160187028D06C00047201D2
S31500013390B2406F04700160067028D06C00043E00D4
S315000133A03B4700144240102D02E00240000348C092
S315000133B0068000C098A62040424010103B4002DA29
S315000133C00839000600C0A1FD67144A6D0202670EA6
S315000133D07008D06D0202E8483B4002B8601A7008D6
S315000133E07200122D02E0D281068100C0987620413A
S315000133F0D050E8483B4002B80C2D001702E0660C9D
S315000134000C2D001402DE660442556004422D02DED4
S31500013410284D204C3210303900C09838C2C0D281B4
S3150001342048413081 4FEF000A33C000A002C64CDF8D
S315000134303080205F5C8F4ED04E714E714E7148E7E1
S315000134400000C33C000A002C82A6F000C7008D0AD72
S31500013450001A7200122D02E0E789D08128402B5410
S3150001346000042B6C000400080C2D001702E066080E
S315000134700C2D001402DE67100C2D000302E266100B
S315000134800C2D000A02DD6608426D0004426D00083B
S31500013490284D204C3228000430390 0C0983AC2C069
S315000134A0D281484131410004322800 0B303900C038
S315000134B0983AC2C0D2814841314100 0833C000A0C8
S315000134C002CA4CDF3000205F588F4ED04E714E71CC
S315000134D04E7148E7FFFE33C000A002CC4FEFFFE676
S315000134E00079800000804040027 9BFFF00804008DB
S315000134F04243163900C09801287C00C0980213D4B3
S315000135000 0C098012C7C00C097EA2A56267C00C090
S31500013510 97E62C9352140693000002E4247C00C023
S31500013520A4400C9300C097E66508421426BC00C06F
S3150001353052860C39000200C0A43C6600008413D4F4
S31500013540 00C0A450660C207C0080400E0050030091
S31500013550600A207C0080400E005001002E1270018E
S31500013560123900C0A453E3A8CE80207C0080400E0F
S3150001357 00250FEFF287C00C0A4520C54000A6426A7
S3150001358053544A87670C207C0080400E005003008C
S315000135906 02E207C0080400E30100240FDFF00406E
S315000135A001003080601A0C54FFFF660838BC000A1F
S315000135B070FF24800C9200000400640438BC0009EA
S315000135C0247C00C02C0A2852227C00804030204CEA
S315000135D020D920D920914AAC000E6706206C000E36
S315000135E04E907046D1920C9200C02C0A650624BCFE
S315000135F000C0185A30390080402E720AE268024033
S315000136000 01F20521140000C2052117900C0980170
S3150001361000 0D20521028000C2056B02802E0671633
S3150001362042411200024100 1F700AE169026883FFEC
S31500013630 02D6836802D630390080403C02401FFF23
S315000136400 02400FFF44400640100072003200D3B919
S3150001365000C0984270282053D06802D8314002CE6B
S31500013660302802D8D0680014314002D0064000301C
S31500013670314002D22E88203C000002CED097204055
S31500013680227C0080402622D822D83290303C1FFF6F
S3150001369 02053C06802D80279E0000080403C81795D
S315000136A00080403C13E802D30080404320524AA8D8
S315000136B00012670622680012 4E91007940000080D0
S315000136C040084A2D02DF670647ED0114600447ED05
S315000136D0006A207900C0C92030280002080000 0FC6
S315000136E067063E2C00046004 3E2C00020C470FE1E5
S315000136F06E060C47001E6C04522D02DC203CFFFFB7
S31500013700F970D08C0C8000C0185A650645ECF9702A
S31500013710600445EC0D203F6A000600143F6A00086C
S315000137200018302D02B890543F400010302C000292
S31500013730906D02BA3F400012302D02BA916F00140B
S31500013740302C0004906D02BE3F400016302D02BEA3
S31500013750916F001870003014D1AB00487000302C06
S315000137600 002D1AB004C7000302C0006D1AB0050EA
S31500013770 7000302C0004D1AB00587000302C0008CA
S31500013780D1AB0054302D02C4B05463043B5402C47F
S31500013790302D02C2B05464043B5402C2302D02C81B
S315000137A0B06C000263063B6C000202C8302D02C6F3
S315000137B0B06C000264063B6C000202C6302D02CCDE
S315000137C0B06C000463063B6C000402CC302D02CAC7
S315000137D0B06C000464063B6C000402CA0C79FFFF5E
S315000137E000C0980666760C39000400C097F6660A92
S315000137F013FC000300C097F66062247C00C09804A5
S315000138002C7C00026A4E0C39000300C097F6661C38
S3150001381 02F164EB90000457E0C40FFFF673E13FC94
S31500013820000200C097F634BC5A0060300C39000221
S31500013830 00C097F666264A52630C53522F164EB9AC
S31500013840000457E60162F164EB90000457E0C40DD
S31500013850FFFF670813FC000100C097F6526B00607A
S3150001386042464240102D02E0322D02D6740AE46926
S31500013870 0241001FB04167167CFF4240102C000C2C
S3150001388 03F002F0D6100FA6E2F0D6100FBB22E393C
S315000138 9000C098429EAD001E2B7900C09842001EC2
S315000138A02C4D45EC001649EF0010207900C0C920C7
S315000138B03028000208 00000F6700033E204A224C10
S315000138C02F42000C2F4A0008244E3011C1C032127B
S315000138D03407C2C2142A00026B04E5A16004440243
S315000138E0E4A12401C4C02142000424014842484005
S315000138F0C4C020822401C4C048404841C0C142819D
S3150001390 0D480D3814841484232024242D5A80004BC
S3150001391 02410D5812082508845EA000830113229C9
S3150001392 00006C1C16B084A2A0003670A6052448037
S3150001393 04A2A0003674A32123407C2C2142A000215
S315000139406B04E5A160044402E4A12401C4C0214240
S31500013950000424014842484 0C4C020822401C4C056
S3150001396048404841C0C14281D480D3814841484240
S31500013970 3202424 2D5A800042410D5812082605229
S315000139803212340 7C2C2142A00026B04E5A1600494
S3150001399 04402E4A12401C4C0214200042401484296

S315000139A04840C4C020822401C4C048404841C0C127
S315000139B04281D480D3814841484232024242D5A84D
S315000139C000042410D581208244A8000420104080E0
S315000139D020805088301132290008C1C16B084A2A5B
S315000139E00003670A605244804A2A0003674A32127A
S315000139F03407C2C2142A00026B04E5A16004440222
S31500013A00E4A12401C4C021420004240148424840E3
S31500013A10C4C020822401C4C048404841C0C142817B
S31500013A20D480D3814841484232024242D5A800049B
S31500013A302410D5812082605232123407C2C2142A60
S31500013A4000026B04E5A160044402E4A12401C4C0A0
S31500013A5021420004240148424840C4C02082240176
S31500013A60C4C048404841C0C14281D480D381484145
S31500013A70484232024242D5A800042410D581208250
S31500013A8044A8000420104080208045EA00085088A0
S31500013A903029000632290008C1C16B084A2A0003F1
S31500013AA0670A605244804A2A0003674A3212340781
S31500013AB0C2C2142A00026B04E5A160044402E4A117
S31500013AC02401C4C021420004240148424840C4C024
S31500013AD020822401C4C048404841C0C14281D480EB
S31500013AE0D3814841484232024242D5A800042410FB
S31500013AF0D5812082605232123407C2C2142A0002D2
S31500013B006B04E5A160044402E4A12401C4C021427E
S31500013B1000004240148424840C4C094
S31500013B2048404841C0C14281D480D381484148427E
S31500013B3032024242D5A800042410D581208244A82D
S31500013B40000042010408020805088598A30290002C4
S31500013B50C1C032123407C2C2142A00026B04E5A1A5
S31500013B6060044402E4A12401C4C0214200042401EA
S31500013B7048424840C4C020822401C4C0484048414C
S31500013B80C0C14281D480D381484148423202424277
S31500013B90D5A800042410D58120825088588A30295E
S31500013BA00006C1C032123407C2C2142A00026B04D5
S31500013BB0E5A160044402E4A12401C4C02142000439
S31500013BC0240148424840C4C020822401C4C0484060
S31500013BD04841C0C14281D480D38148414842320222
S31500013BE04242D5A800042410D5812082242F000C3E
S31500013BF0246F000860000336204A224C2F42000C35
S31500013C002F4A0008244E3011C1C032123407C2C2F5
S31500013C10142A00026B04E5A160044402E4A1240114
S31500013C20C4C021420004240148424840C4C0208245
S31500013C302401C4C048404841C0C14281D480D381D7
S31500013C404841484232024242D5A800042410D58197
S31500013C5020825088588A301132290002C1C16B086E
S31500013C604A2A0003670A605244804A2A0003674AC7
S31500013C7032123407C2C2142A00026B04E5A16004A1
S31500013C804402E4A12401C4C02142000424014842A3
S31500013C904840C4C020822401C4C048404841C0C134
S31500013CA04281D480D3814841484232024242D5A85A
S31500013CB000042410D5812082605232123407C2C218
S31500013CC0142A00026B04E5A160044402E4A1240164
S31500013CD0C4C021420004240148424840C4C0208295
S31500013CE02401C4C048404841C0C14281D480D38127
S31500013CF04841484232024242D5A800042410D581E7
S31500013D00208244A800042010408020805088301171
S31500013D1032290004C1C16B084A2A0003670A6052AE
S31500013D2044804A2A0003674A32123407C2C2142A5F
S31500013D3000026B04E5A160044402E4A12401C4C0AD
S31500013D4021420004240148424840C4C02082240183
S31500013D50C4C048404841C0C14281D480D381484152
S31500013D60484232024242D5A800042410D58120825D
S31500013D70605232123407C2C2142A00026B04E5A152
S31500013D8060044402E4A12401C4C0214200042401C8
S31500013D9048424840C4C020822401C4C0484048412A
S31500013DA0C0C14281D480D381484148423202424255
S31500013DB0D5A800042410D581208244A8000420102F
S31500013DC04080208045EA00085088302900023229C7
S31500013DD00004C1C16B084A2A0003670A6052448085
S31500013DE04A2A0003674A32123407C2C2142A000261
S31500013DF06B04E5A160044402E4A12401C4C021428C
S31500013E0000004240148424840C4C020822401C4C0A1
S31500013E1048404841C0C14281D480D381484148428B
S31500013E2032024242D5A800042410D5812082605274
S31500013E3032123407C2C2142A00026B04E5A16004DF
S31500013E404402E4A12401C4C02142000424014842E1
S31500013E504840C4C020822401C4C048404841C0C172
S31500013E604281D480D3814841484232024242D5A898
S31500013E7000042410D581208244A80004201040802B
S31500013E802080508830290002C1C032123407C2C2D4
S31500013E90142A00026B04E5A160044402E4A1240192
S31500013EA0C4C021420004240148424840C4C02082C3
S31500013EB02401C4C048404841C0C14281D480D38155
S31500013EC04841484232024242D5A800042410D58115
S31500013ED020825088588A30290006C1C03212340720
S31500013EE0C2C2142A00026B04E5A160044402E4A1E3
S31500013EF02401C4C021420004240148424840C4C0F0
S31500013F0020822401C4C048404841C0C14281D480B6
S31500013F10D3814841484232024242D5A800042410C6
S31500013F20D5812082242F000C246F00080C79FFFF15
S31500013F3000C09806660C0C39000200C097F66600B0
S31500013F4000AA49ED0022204A224C2F42000C43E9E7
S31500013F5000484 1E800302020D1A1222120205BC267
S31500013F60488248C2D38022812221D3822281202005
S31500013F70D1A1222120205BC2488248C2D38022815E
S31500013F802221D38222812020D1A1222120205BC29D
S31500013F90488248C2D38022812221D38222812020D5
S31500013FA0D1A1222120205BC2488248C2D38022812E
S31500013FB02221D38222812020D1A1222120205BC26D
S31500013FC0488248C2D38022812221D38222812020A5
S31500013FD0D1A1222120205BC2488248C2D3802281FE
S31500013FE02221D3822281242F000C4A46660001B287
S31500013FF042471E2D02E242451A2D02E04A3900C00F
S315000140000097F4660001180C45001766340C6FFAAB7D
S3150001401000106F1E0C6F055500106C160C2D001448
S315000140202002DE6464522D02DE0C2D001402DE665897
S315000140300604C0C2D001402DE664A08C6000060447E
S3150001404030054 8C0D08006800028D1C204030100B
S3150001405044403 22F0010B2406F2A300548C0D0804C
S31500014060068000028D1C2040B2506C18522D02DED3
S3150001407 00C2D001402DE6510422D02DE524508C6E3
S31500014080000060044 22D02DE207900C0C9203028DC
S31500014090000020800000F6706382F0016600438 2F4B
S315000140A000120C47000366300C44FAAB6F1C0C443B
S315000140B005556C160C2D000A02DD6444522D02DDF5
S315000140C00C2D000A02DD6638602C0C2D000A02DD7B
S315000140D0662A08C6000160240C44FCCE6F1E0C44FF
S315000140E003326C18522D02DD0C2D000A02DD65101B
S315000140F0422D02DD524708C60001600442 2D02DD51
S3150001410 00C2D001402DC65484A476F44534708C624
S31500014110 0001422D02DC422D02DD6034422D02DE19
S3150001412042401 03900C097F9BA40670C42451A3926
S31500014130 00C097F908C6000042401 03900C097FD3B
S31500014140BE40670C42471E3900C097FD08C60001F4
S315000141504A4667440806000167083F072F0D6100BC
S31500014160F0520806000067 2A207900C0C920302 8CD
S3150001417000020800000E670A007920000080404610
S31500014180600802 79DFFF008040463F052F0D610080
S31500014190F1642F0D6100F2A833FC000100C09854B0
S315000141A04A3900E0000B660000DE287C00C052643C
S315000141B04240103900E0000CB64066207E001E39F0
S315000141C000E0000A43ED00222007D080D087E58871
S315000141D0D3C0204C20D920D92091602C42401039DF
S315000141E000E0000DB6406C207E001E3900E0000A9A
S315000141F041ED00222007D080D087E588D1C02F0865
S31500014200 2F0C4EB90001A1F04240103900E0000D1B
S3150001421053 40B6406670224C207C00C0527020D9B3
S31500014220 20D92091287C00C05260203900C05274E8
S3150001423072 14E2A80240000F38803039008 0400E27
S3150001424 00800000F661E0C54000865180C54000C7B
S31500014250641233D400C05262227C0080400E0051A9
S31500014260 800060223039008 0400E0800000F67167A
S31500014270 0C54000464 1033D400C05262227C0080C6
S3150001428 0400E02517FFF0C39003B00C000FE630067
S31500014290 01404A2D02DF670649ED006A600449EDD7
S315000142A001144A6C0060660001287003C02B00618E
S315000142B0660 0011E277900C09842005C4A3900C099
S315000142C097F467047E016002424730070240 00010D
S315000142D0720FE36808AD000702D4816D02D4422D46
S315000142E002DC43ED02C241ED01F620D920D920912D
S315000142F0227C0000173841ED02C220D920D9209135
S31500014300424745EB006249ED0022224C204A20D962
S31500014310 20D92091524749EC000C45EA000C0C4784
S31500014320 00066DE64A2D02DF57C0440048801B4057
S31500014330 02DF302D02D8B07900C0A22C675E3B792E
S3150001434 000C0A22C02D87028D06D02D83B4002CE04
S3150001435 07028D06D00147201B2406F0470016006BE
S3150001436 07028D06D0014323C00C8B2406C043E0186
S31500014370 60187028D06D00147201B2406F0470018C
S31500014380 60067028D06D00143E00302D02D8D0474B
S315000143903B4002D0064000303B4002D2287C00C0A0
S315000143A0C9064A14672A0C14001964244240102DC8
S315000143B002E23F002F0D6100EDFA4240102D02E0AE

S315000143C03F002F0D6100EF2E2F0D6100F072531487
S315000143D04A7900C0C8AE660833FC000100C0C8AE09
S315000143E00C39000200C0A43C660A207C0080400E05
S315000143F00250FCFF4FEF001A33C000A002CE4CDF83
S315000144007FFF4E734E714E714E714BE70F0C33C0EC
S3150001441000A002D02A6F001C3A2F00204A3900C0A2
S3150001442097F66636207C000016DC10305000488076
S3150001443002400003E148026DFCFF02D6816D02D6FF
S31500014440207C000016C41030500048800240000352
S31500014450026DFFFC02D6816D02D642471E2D02E295
S315000144604244182D02E0207900C0C92030280002FC
S315000144700800000E670A00792000008040466008A7
S315000144800279DFFF00804046287C00804024101 41A
S3150001449002000003424112002 07C000016C41030C5
S315000144A050004880B24066347003B0476C043C004B
S315000144B060023C071014E40802000003424112 00A6
S315000144C0B24667187003B0476C047C0360021C0790
S315000144D07003C006E508021400F381143005C1FC1F
S315000144E003C206B0003C00002B4000163B7900C049
S315000144F0A22C02D83F072F0D6100ECB83F042F0D07
S315000145006100EDF22F0D6100EF3633C000A002D23B
S315000145104CDF30F0205F5C8F4ED04E714E714E7184
S3150001452033C000A002D433C000A002D64E754E712E
S315000145304E714E7148E73F3E33C000A002D84FEF9F
S31500014540FFD045D7227C000017EE204A20D920D97A
S3150001455020914EB9000060C02A7C00C09846525591
S315000145600C55000665000948425530390080400 85F
S315000145700800000C67000938025200FF605C301227
S31500014580E048024000FF72003200E589068100C062
S3150001459015FC2041301002400D0341EF001E32128B
S315000145A0E049024100FF74003401D1C2108041EF9D
S315000145B000103012E048024000FF72003200D1C103
S315000145C010BC00013012E048024000FF5240024098
S315000145D000FFE148025200FF81523012E0480240DA
S315000145E000FF0C40000E65964240103900C097F45A
S315000145F002400001720FE36808B9000700C0980A7B
S31500014600817900C0980A0252FF002A7C00C05286B6
S3150001461047EF00022C7C000016206000 08844A2D1A
S3150001462002DF670A41ED006A2F48002C600841ED60
S3150001463001142F48002C4A2D02DF670649ED0114AB
S31500014640600449ED006A206F002C4A68006063002F
S31500014650083A43ED020C702922D851C8FFFC32906A
S31500014660206F002C2028005C90AC005C2B40026877
S315000146700C39000200C097F464062F0D61000E0E7E
S315000146800C2D001402DE65047E1860041E2D02E066
S315000146901B4702B60C2D000A02DD65047E04600488
S315000146A01E2D02E21B470237025200FF607A30124A
S315000146B0E048024000FF7A003A003012E04802402A
S315000146C000FF7C003C003012E048024000FF7E0003
S315000146D03E002007D080D087E5882F34086A2F3422
S315000146E008662F34086241ED026E2006D080D0861E
S315000146F0E588D1C02F2800082F2800042F1043ED8C
S31500014700020C2005D080D085E588D3C04EB90001C2
S31500014710A0BC3012E048024000FF5240024000FFB8
S31500014720E148025200FF81523012E048024000FF88
S315000147300C4000066500FF7808AF000200024AAD92
S3150001474002186C000204302F0002720AE26802406D
S3150001475000017C003C00302F0002E26802400001AB
S315000147607E003E00486D020C2006ED889086ED889D
S31500014770068000C032D83212024100FF41EF001418
S315000147802407E78A9487D482D1C214280009488273
S3150001479002810000FFFF82C23401C4FC00A8D0825E
S315000147A020404868006C4EB90001A1F0302F00028C
S315000147B0720AE268024000017A003A00302F0002D4
S315000147C0E268024000017E003E003012024000FF16
S315000147D041EF00102207E7899287D281D1C11228C1
S315000147E00009488102800000FFFF80C17C003C0077
S315000147F0486D020C2005E788D085EB88068000C04D
S315000148002E582206D281D286E589D0812F004EB953
S315000148100001A1F0302F0002720AE2680240000195
S315000148207C003C00302F0002E268024000017E005D
S315000148303E00486D02182006ED889086ED880680B8
S3150001484000C032D83212024100FF41EF00142407A2
S31500014850E78A9487D482D1C2142800054882028 14E
S315000148600000FFFF82C23401C4FC00A8D0822040B0
S315000148704868003C4EB90001A1344AAD02246C647B
S31500014880302F0002720AE268024000017C003C00FF
S31500014890302F0002E268024000017E003E00486DB2
S315000148A002242006ED889086ED88068000C032D865
S315000148B03212024100FF41EF00142407E78A948770
S315000148C0D482D1C214280006488202810000FFFF6B
S315000148D082C23401C4FC00A8D08220404868004846
S315000148E0600001FA302F0002720AE26802400001FC
S315000148F07C003C00302F0002E268024000017E008D
S3150001490003E00486D02242006ED889086ED880680DB
S315000149100 00C032D83212024100FF41EF00142407D1
S3150001492 0E78A9487D482D1C2142800074882028 17B
S31500014930 0000FFFF82C23401C4FC00A8D0822040DF
S3150001494 04868005460000 1FE302F0002720AE268D6
S3150001495002400 0017C003C00302F0002E268024068
S31500014960 00017E003E00486D020C2006ED8890860F
S31500014970ED88068000C032D83212024100FF41EFB5
S31500014980 00142407E78A9487D482D1C2142800042C
S31500014990 48820281 0000FFFF82C23401C4FC00A8E4
S315000149A0D0822040486800304EB90001A1F0302F76
S315000149B00002720AE268024000017A003A00302FD2
S315000149C00002E268024000017E003E003012024011
S315000149D000FF41EF00102207E7899287D281D1C1FA
S315000149E01228000448810280 0000FFFF80C17C007C
S315000149F03C00486D020C2005E788D085EB880680CF
S31500014A0000C02C182206D281D286E589D0812F00DA
S31500014A104EB90001A1F0302F0002720AE26802408D
S31500014A2000017C003C00302F0002E26802400001D8
S31500014A307E003E00486D02182006ED889086ED88BE
S31500014A4006 8000C032D83212024100FF41EF001445
S31500014A502407E78A9487D482D1C21410488202813E
S31500014A600000FFFF82C23401C4FC00A8D0822F00DF
S31500014A704EB90001A1F04AAD02246C68302F000244
S31500014A80720AE268024000017C003C00302F0002FD
S31500014A90E268024000017E003E00486D02242006C5
S31500014AA0ED889086ED88068000C032D83212024128
S31500014AB000FF41EF00142407E78A9487D482D1C20C
S31500014AC01428000248820281 0000FFFF82C23401DD
S31500014AD0C4FC00A8D08220404868001 84EB90001E5
S31500014AE0A1346066302F0002720AE26802400001BA
S31500014AF07C003C00302F0002E268024000017E008B
S31500014B003E00486D02242006ED889086ED880680D9
S31500014B1000C032D83212024100FF41EF00142407CF
S31500014B20E78A9487D482D1C214280001488202817F
S31500014B300000FFFF82C23401C4FC00A8D0822040DD
S31500014B404868000C4EB90001A1F0302F0002720A2C
S31500014B50E268024000017C003C00302F0002E2685E
S31500014B6002400 0017E003E00486D023C2006ED88B1
S31500014B709086ED88068000C032D83212024100FFCD
S31500014B8041EF00142407E78A9487D482D1C21428FE
S31500014B90000A48820281 0000FFFF82C23401C4FC80
S31500014BA000A8D0822040486800784EB90001A1F0E3
S31500014BB0302F0002720AE268024000017C003C00CC
S31500014BC0302F0002E268024000017E003E00486D7F
S31500014BD002482006ED889086ED88068000C032D80E
S31500014BE03212024100FF41EF00142407E78A94873D
S31500014BF0D482D1C21428000B48820281 0000FFFF33
S31500014C0082C23401C4FC00A8D082204048680084D6
S31500014C104EB90001A1F0302F0002720AE26802408B
S31500014C2000017A003A00302F0002E26802400001DA
S31500014C307E003E003012024000FF41EF00102207C5
S31500014C40E7899287D281D1C11228000A4881028060
S31500014C500000FFFF80C178003800207900C0C9201C
S31500014C6030280002080000 0F67067E052C07600445
S31500014C707E042C0741ED020C2006D080D087E58802
S31500014C80D1C02F082005E788D085EB88068000C0B3
S31500014C9030982204D281D284E589D0812F004EB981
S31500014CA00001A1F04AB900C018446700019 20252FE
S31500014CB000FF6000017A302F0002720AE2680240AA
S31500014CC000017E003E004879000017FA7044D0B911
S31500014CD000C001062207E7899287E789D08132124F
S31500014CE0E049024100FF74003401E58AD0822F00B9
S31500014CF04EB900021FF24A406F00011E302F00021A
S31500014D000720AE268024000017A003A00302F00027E
S31500014D10E268024000017C003C003012E04802409B
S31500014D2000FF7E003E002005ED889085ED88068017
S31500014D3000C032D83212024100FF41EF00102406B2
S31500014D40E78A9486D482D1C23412E04A024200FF35
S31500014D507 6003602D1C3141048820281 0000FFFF9B
S31500014D6082C23401C4FC00A8D0822207D281D28734
S31500014D70E589D08128403012E048024000FF7200E8
S31500014D803200D2B120013F3608002F2C00042F1457
S31500014D9043EF00164EB900019DFE4879000017FA4F
S31500014DA0486F00104EB900021FF24A406D42302F83
S31500014DB00002720AE268024000017E003E00704471
S31500014DC0D0B900C001062207E7899287E789D08119
S31500014DD03212E049024100FF74003401E58AD082B3

S31500014DE02F00486F00104EB900021FF24A406F288B
S31500014DF0224C41EF000420D920912F0A3F3C0003A9
S31500014E003F3C001F4EB900007D7A227C00028D5482
S31500014E10204C20D920D920913012E048024000FFD1
S31500014E205240024000FFE148025200FF8152301217
S31500014E30E048024000FF0C40000E6500FE7A302F6C
S31500014E400002720AE268024000015240024000017B
S31500014E50E3680BAF00020002816F0002302F0002F2
S31500014E60E268024000014A406600F8D4227C000054
S31500014E701724307C0048D1EF002C700420D951C88A
S31500014E80FFFC206F002C426800603012024000FFD8
S31500014E905240024000FF0252FF0081524BED02E4F4
S31500014EA03012024000FF0C4000186500F7724FEF08
S31500014EB0003033C000A002DA4CDF7CFC4E754E7127
S31500014EC04E714E7148E7233E33C000A002DC4FEF1E
S31500014ED0FFC447EF0060227C000017FE41EF00107F
S31500014EE020D920D92091025300FF08D30002302F88
S31500014EF00062720AE268024000017C003C00301345
S31500014F00024000FF7E003E0049EF00303F390000BD
S31500014F1016282006E788D086EB88068000C02C1864
S31500014F202207D281D287E589D08120402F28000827
S31500014F302F2800042F10224C4EB90001A2F8302F61
S31500014F400062720AE268024000017C003C003013F4
S31500014F50024000FF7E003E002006E788D086EB88EF
S31500014F60068000C030982207D281D287E589D08198
S31500014F702A40207900C0C920302800020800000F0D
S31500014F80670A025300FF00530B006008025300FF3B
S31500014F9000530A003013E048024000FF720032005D
S31500014FA0D281068100001620204l3F102F2D0008D6
S31500014FB02F2D00042F1543EF00164EB90001A2F85C
S31500014FC0486F00082F0C4EB900021CFA4BEF00285F
S31500014FD0487900001 80A2F0C4EB900021E544A40A7
S31500014FE06F0000942F0C486F00104EB900021E1A74
S31500014FF0204F2F28000C43EF003C4EB900023CEC39
S3150001500486F00382F0D4EB900021DF62F0D2F0CDB
S315000150 10486F00104EB900021DD62F0D486F000CC7
S31500015020486F00084EB900021D5448790000181255
S31500015030486F00042F0D4EB900021DD62F0D2F0CFF
S31500015040486F00104EB900021DD62F0D486F000C97
S31500015050486F00084EB900021D5448790000181225
S31500015060486F00042F0D4EB900021DD62895296DF3
S315000150700000400046 00E28BC00000000297C00002A
S31500015080000000043F39000016262F2C00042F14BF
S3150001509043EF00264EB90001A4962F0C486F003C41
S315000150A04EB900021E1A2C7C00028D544AB900C06A
S315000150B01844676 4302F0012720AE268024000148
S315000150C07E003E00307C0044D1F900C00106200775
S315000150D0E7889087E788D1C0486800 20486F003C80
S315000150E04EB900021FF24A406F2E2F53001043EFB4
S315000150F0001C41EF001420D92091486F00103F3C5D
S3150001510000033F3C001F4EB900007D7A224E41EF5D
S315000151100 01C20D920D92091302F0062720AE26842
S31500015120024000017E003E00486F001C2007ED880A
S3150001513090 87ED88068000C032D83213024100FF05
S31500015140340 1C4FC00A8D0822040486800244EB92E
S31500015150 0001A1F0025300FF00530900302F006245
S31500015160720AE268024000017C003C0030130240F2
S3150001517000FF7E003E003F390000163 22006E78818
S31500015180D086EB88068000C02E582207D281D287AE
S31500015190E589D08120402F2800082F2800042F10F0
S315000151A0224C4EB90001A2F8302F0062720AE26861
S315000151B0024000017C003C003013024000FF7E00EB
S315000151C03E002006E788D086EB88068000C030982E
S315000151D02207D281D287E589D0812440207900C077
S315000151E0C920302800020800000F670A025300FF99
S315000151F000530B006008025300FF00530A003013EE
S31500015200E048024000FF72003200D2810681 0000B0
S31500015210162020413F102F2A00082F2A00042F12A2
S3150001522043EF00164EB90001A2F8486F00082F0C93
S315000152304EB900021CFA224E204A20D920D92091CB
S31500015240487900001 80A2F0C4EB900021E544A4034
S315000152506F0000942F0C486F00104EB900021E1A01
S31500015260204F2F28000C43EF003C4EB900023CECC6
S31500015270486F00382F0D4EB900021DF62F0D2F0C69
S31500015280486F00104EB900021DD62F0D486F000C55
S31500015290486F00084EB900021D54487900001812E3
S315000152A0486F00042F0D4EB900021DD62F0D2F0C8D
S315000152B0486F00104EB900021DD62F0D486F000C25
S315000152C0486F00084EB900021D54487900001812B3
S315000152D0486F00042F0D4EB900021DD62895296D81
S315000152E000004000 4600E28BC00000000297C0000B8
S315000152F0000000043F39000016302F2C00042F1443
S315000153 0043EF00264EB90001A4962F0C486F003CCE
S31500015310 4EB900021E1A4AB900C0184467 64302FFC
S315000153200012720AE268024000017E003E00307CF3
S31500015330 0044D1F900C001062007E7889087E78875
S315000153 40D1C0486800 20486F003C4EB900021FF2E8
S31500015350 4A406F2E2F53001043EF001C41EF0014FB
S315000153 6020D92091486F00103F3C00033F3C001FAD
S315000153704EB900007D7A224E41EF001C20D920D97A
S31500015380 2091302F0062720AE268024000017E001D
S315000153903E00486F001C2007ED889087ED88068047
S315000153A000C032D83213024100FF3401C4FC00A808
S315000153B0D0822040486800604EB90001A1F0302F2C
S315000153C00062720AE268024000017C003C00301370
S315000153D0024000FF7E003E00224E2006E788D0866E
S315000153E0EB88068000C02C182207D281D287E58976
S315000153F0D081204020D920D92091302F0062720A15
S31500015400E268024000017C003C003013024000FFCC
S315000154107E003E00224E2006E788D086EB88068075
S31500015420 00C030982207D281D287E589D0812040F9
S315000154 3020D920D92091302F0062720AE2680240F9
S31500015440 00017C003C003013024000FF7E003E005C
S315000154502 24E2006E788D086EB88068000C02E5BAB
S31500015460 2207D281D287E589D081204020D920D94F
S315000154702 0914FEF003C33C000A002DE4CDF7CC41C
S31500015480205F588F4ED04E714E714E712F0733C02B
S31500015490 00A002E0226F00087E003E29026C20294E
S315000154A00254E98822074EB900025BBC334002026E
S315000154B020290258E9884EB900025BBC3340020438
S315000154C02029025CE9884EB900025BBC3340020622
S315000154D020290264E9884EB900025BBC3340020808
S315000154E020290260E9884EB900025BBC3340020AFA
S315000154F033C000A002E22E1F205F588F4ED04E719E
S3150001550 04E714E7148E7030C33C000A002E44FEF21
S31500015510FFEC2A6F00283E2F002C0C4700076C0079
S3150001552000126202D02684857 4EB9000242244879C7
S31500015530000 00181A486F0004486F00144EB90002A3
S31500015540 1FAE3C0748C641ED020C2006D080D0862E
S3150001555 0E588D1C02F68000400043C0748C641ED28
S315000155 60020C2006D080D086E588D1C02F68000 8BD
S3150001557000080C470001670C0C47000267060C4740
S315000155800003661 64AAF00046C10486F00044EB95A
S31500015590000 19FF20A6F8000000C49EF0010702095
S315000155A0320748C1D28106810000163E2041D05003
S315000155B03F00204F2F28000A2F280006224C4EB903
S315000155C000019DFE486F000C2F0C4EB900021CE82D
S315000155D030070C400006626ED040303B00064EFBA1
S315000155E00002000E00240024 0024000E000E0034E8
S315000155F02F1443ED01BE300748C0E588D3C04EB92C
S31500015600 00023CEC604041ED01BE300748C0E58830
S31500015610D1C020946030207900C0C9203028000212
S3150001562 00800000F67047E0560027E04486D01BE16
S315000156304 1ED01BE2007E588D1C02F08486D01D68E
S31500015640 4EB900021FAE4FEF001433C000A002E6B0
S31500015650 4CDF30C0205F5C8F4ED04E714E714E7163
S315000156604 8E7033A33C000A002E8267C00C0980050
S315000156704A136300028E4A3900C097FC6600028411
S31500015680 4A7900C098086600027A227C00C097FF1A
S3150001569 00C110026670002 6C4A11650000E00C112E
S315000156A00025620000D80C130002620E7010D0B9FA
S315000156B000C098C6EA882E0060063E3900C098C828
S315000156C00C110003621642401011 48C0D0800680BA
S315000156D000C098AA20403087600000A20C11000784
S315000156E06218424010115940 48C0D080068000C05F
S315000156F098B220403087600000840C11001F622A96
S315000157007CF842401011DC40300648C0D08006804B
S3150001571000C09876204030870C11001F665E0C137E
S31500015720000163581 2BC002660520C110020660865
S3150001573033C700C098BC60440C110021660833C70A
S3150001574000C098BE60360C110022660833C700C03F
S31500015750 98C060280C110023660833C700C098C2A0
S31500015760601A0C110024660833C700C098C4600C87
S3150001577 00C110025660633C700C098BA4A136300A8
S315000157800 01820C110028660 80C130001622A602EA2
S3150001579 00C110026672A52110C13000163047E1FA7
S315000157A060027E2542401011B0476F144A1363020E
S315000157B053130C130001630612BC001C6002421154
S315000157C04A116500013E0C1100256200013 6287C54
S315000157D000C0980A0254FCFF0254FFFC247C00C05E
S315000157E0980E0C110003621814BC000142401011FE
S315000157F002400000 3E5480254FFF38154600000CAE9

S315000158000C110007621A14BC0002424010115940E3
S3150001581002400003E5480254FFF38154600000AAE8
S3150001582000C11001F6236421242401011515400240D3
S3150001583000001F720AE368025483FF8154424010112B
S3150001584051400240000348C0068000C098A620408F
S31500015850424010103 3C000C0980C606C0C1100203F
S31500015860660614BC000660602C7C00C0980F0C1103
S31500015870002166 0E14BC0005025483FF1CBC000106
S315000158806 0460C110022660E14BC0005025483FF0B
S3150001589 01CBC000260320C110023660E14BC00050C
S315000158A0025483FF1CBC0003601E0C110024660C0D
S315000158B014BC0005025483FF4216600C0C1100252E
S315000158C06606421200547C0042B900C098C60C1309
S315000158D00002630A33FC001000C09808600833FC1C
S315000158E0020000C09808227C00C018A0600C237C2E
S315000158F000015B96001243E900D2B3FC00C02C0AFA
S31500015900065EC33C000A002EA4CDF5CC04E754E71F7
S315000159104E714E7133C000A002EC4A3900C097F4B3
S31500015920661E4A3900C098006616427900C098087A
S315000159301 3013FC002800C097FF13FC000500C0980067
S3150001594033C000A002EE4E754E714E714E7133C0DA
S3150001595000A002F0427900C0980813FC002800C09C
S31500015960 97FF13EF000500C0980033C000A002F2B4
S315000159702 05F548F4ED04E714E714E7133C000A0D0
S31500015980002F4027983FF0080402C7003C07900C0C5
S31500015990981402400003E1480279FCFF008040466A
S315000159A0817900804046 0279C7FF00804040007936
S315000159B0280000804040 0279F3FF0080404633C052
S315000159C000A002F64E754E714E714E7148E7031CEA
S315000159D033C000A002F87E03CE7900C09814267C5D
S315000159E00080403A300748C0D080068000C0982E1B
S315000159F0204030930C47000266582A7C00C0184D9F
S315000015A00287C00C0C9203013323900C098C4E84947
S31500015A1090412054B05064385215424010152054 1C
S31500015A2032280002E0490241000FB04163240839DF
S31500015A30000100C0184C66084EB90000998060123A
S31500015A4030280002E0480240000F52001A8060022E
S31500015A504215287C00C098167000301332 0748C1E1
S31500015A60E589D1B418004A3900C0C90767047C0A20
S31500015A7060027C0D7002D0067201E1A92E012A7C1A
S31500015A8000C0981252952015B08765464295424747
S31500015A90320748C1E58920341800123C00FCD206C1
S31500015AA0E2A8320748C1D281068100C0982620416A
S31500015AB03080300748C0E58842B4080052470C4799
S31500015AC000046DCC13FC001900C0C906423900C0A0
S31500015AD0C90733C000A002FA4CDF38C04E754E71BB
S31500015AE04E714E7148E7010433C000A002FC4FEF2E
S31500015AF0FFF60C39001900C0C906660000842A7C2D
S31500015B0000C0C902303900C09826907900C0982893
S31500015B10486F000402800000FFFF4EB900024224D4
S31500015B2048790000181E486F0008486F00084EB9F2
S31500015B3000021FC448574EB900024D3A72003200A6
S31500015B402A8166062ABC00008000203C4000000035
S31500015B5022154EB900025BBC2E0022074EB9000287
S31500015B60625E720FE2A833C000C0983A33C000C02B
S31500015B70983833C000C0983613FC001800C0C90617
S31500015B804FEF000A33C000A002FE4CDF20804E75A5
S31500015B904E714E714E7133C000A003004A7900C0A8
S31500015BA09808637A227C00C0980A4A3900C097F4A3
S31500015BB0670608D10007600408910007 33D1008009
S31500015BC0402C13F900C0980D008040424240103924
S31500015BD000C0980F02400003E1480279FCFF0080F3
S31500015BE040468179008040464240103900C0980EF7
S31500015BF002400007720BE3680279C7FF008040404C
S31500015C008179008040400279F3FF00804046207987
S31500015C1000C02C0A217C00015C36000E600A207946
S31500015C2000C02C0A42A8001233C000A003024E7520
S31500015C304E714E714E7133C000A00304537900C0FA
S31500015C40980870003039008040 3AD1B900C098C632
S31500015C50207900C02C0A42A8000E33C000A003061A
S31500015C604E754E714E714E7148E7033C33C000A02C
S31500015C7003084FEFFFF40C39002600C097FF6600BA
S31500015C8000AE7C14267C00001822287C0000182611
S31500015C9045EF0008300648C0D080068000C09876DF
S31500015CA020407E003E1070003039 00C098BA9E80B8
S31500015CB0200748574EB900024204300648C0E5881D
S31500015CC006800000164C2F00486F00042F0A4EB9BB
S31500015CD000021FAE4879000017FA2F0A4EB90002DA
S31500015CE01FF24A406C042A4B60022A4C2F0A2F0DE0
S31500015CF0486F000C4EB900021F5A486F00044EB996
S31500015D0000024D143E00100748803E007003C04655
S31500015D1048C0068000C098A620409F1052460C46F7
S31500015D2000186D00FF7013FC002700C097FF4FEFAE
S31500015D30000C33C000A0030A4CDF3CC04E754E7107
S31500015D404E714E7148E7013C33C000A0030C23FCA1
S31500015D5000C0185A00C02C0A61000A9A2A7C0080E9
S31500015D6040400255FFFC0055000 2287C0080404659
S31500015D700254EFFF0254F3FF00798000080403C9B
S31500015D800279FF800080403E0079000C0080403E91
S31500015D90005502000055010002797FFF0080403C5A
S31500015DA00255FFEF0255FFF30055000413FC00BC3A
S31500015DB00080404213FC0080008040430254 3FFFB4
S31500015DC000544000423900C097F4227C000015CCF3
S31500015DD0207C00C09876701420D951C8FFFC3F3C46
S31500015DE0000A6100FB6A6100F878005501000 2555E
S31500015DF0FBFF4247287C00C09808267C008040149F
S31500015E00247C00C098C6605008130006670E13FC78
S31500015E1000EA0080401508D3000652476100FD786C
S31500015E204A54632C0255FEFF005504003015080044
S31500015E30000E66F8535430390080404402400FFF8B
S31500015E4072003200D3920255FBFF00550100600833
S31500015E506100F80E6100FE124A3900C0980063061F
S31500015E600C47000F6DA242B900C0981233F900C069
S31500015E7098C400C0982633F900C098BE00C098287F
S31500015E8033F900C098C000C0982A33F900C098C2FF
S31500015E9000C0982C4247300748C0E588068000C0FC
S31500015EA0981620404290524 70C4700046DE83F3C4B
S31500015EB000046100FA9A33C000A0030E4CDF3C8057
S31500015EC04E754E714E714E7148E7033E33C000A0C8
S31500015ED00310598F2EB90000182A423900C0184DF7
S31500015EE023FC00C0185A00C02C0A287C00C0528628
S31500015EF023CC00C097E623CC00C097EA423900C004
S31500015F009802423900C098012A7C00C0185A6014D0
S31500015F102B7C000159CC000E2B7C0001597C001210
S31500015F204BED00D2BBFC00C02C0A65E42C7C00C002
S31500015F3098424296424 62A4C3B7900C0A22C02D88E
S31500015F401B7C001702E01B7C000202E23F062F0DBC
S31500015F506100E4B842474 5ED006A47ED01141B476D
S31500015F6002DF4A476704284A6002284B227C000068
S31500015F701744204C702920D951C8FFFC309129566D
S31500015F80005C4A4666144A47661043ED02CE207C01
S31500015F900080402620D920D9309152470C47000273
S31500015FA06DBC303C00FFC0460257FF008157524688
S31500015FB04BED02E40C4600186D00FF7E588F33C08E
S31500015FC000A003124CDF7CC04E754E714E714E71AE
S31500015FD048E7213E33C000A0031402797FFF008009
S31500015FE040442A7C008040240895000 6267C0080D7
S31500015FF0401408D3000733FC000300C0A23233FC6F
S31500016000000100C0A236287C00C0A230247C00C05A
S31500016010A23A2C7C00C0A2346000014033FC00018E
S3150001602000C0A238600001184254 34BC000160006F
S3150001603000EE4A52670A33FC000300C0A232600830
S31500016040 33FC000200C0A232089500064A526704DA
S3150001605 07E0360024207700 3C007E908021500CFFC
S3150001606081157003C03900C0A237E508021500F397
S3150001607081157003C03900C0A239021500FC8115D3
S315000160808D50006427900C0A22E425460780895D0
S31500016090000742566 01E08130007671852560813 78
S315000160A00006670C13FC00EA0080401508D30006C1
S315000160B008D30007301612 15E809020100037400 1F
S315000160C01401D482068200028D882042B0506C06EB
S315000160D00815000767C00815000767162 3F9008031
S315000160E0402000C02C0E33FC000100C02C14525479
S315000160F0601442B900C02C0E427900C02C144254DF
S31500016100527900C0A22E3014B07900C0A2326C0CB4
S31500016110 0C79000600C0A22E6D00FF7453524A523C
S31500016120 6D164A5267044247600 63E3900C0A232E4
S3150001613 03014B0476C00FEFC527900C0A23830140E
S31500016140B07900C0A2326C0C0C79000300C0A238F1
S31500016150 6F00FED6527900C0A2363014B07900C065
S31500016160A2326C0C0C79000300C0A2366F00FEAEA1
S31500016170 7003C01566080 21500FC08D500007030D2
S31500016180C015671C0895000 6021500CF021500F31D
S315000161900 08D50003021500FC08D5000008D5000645
S315000161A033FC000100C02C14615A2A7C0080403C5B
S315000161B000055800 00279FDFF008040400279FEFF14
S315000161C000080404 0303C1FFFC07900C0A22C025520
S315000161D0E00081557E28DE7900C0A22C33C70080FD
S315000161E0402633C70080402A33C70080402 8025525
S315000161F07FFF33C000A003164CDF7C844E754E71C1
S31500016200 4E714E7148E7210433C000A003184FEFC9
S31500016210FFF44A7900C02C14670001384 27900C0A6

S315000162202C142A7C00C018564A3900C097F46720FE
S315000162304879000017FA487900C097F04EB9000274
S315000162401FF24A406F0A2AB900C097F0600000A207
S315000162504AB900C02C0E67000092203900C02C0EEE
S31500016260486F00084EB900024224123900804024CA
S31500016270E809020100037400140 1E78A068200029C
S315000162808D68204220280004486F00044EB90002A0
S3150001629042244879000018 2E486F0008486F00080C
S315000162A04EB900021FAE486F0008486F00042F0D5B
S315000162B04EB900021FC44879000018322F0D4EB99D
S315000162C000021FF24A406C082ABC422000006020EE
S315000162D048790000183 62F0D4EB900021FF24A40C8
S315000162E06F0E2ABC428C000060062ABC425C00008C
S315000162F03E3C20002F0D48790000184248 6F0010DF
S315000163004EB900021FC448790000183E486F000CC0
S31500016310486F000C4EB900021F5A48790000183A1E
S31500016320486F0008486F00084EB900021FC448575D
S315000163304EB900024D3A9E40303C0FFFC047323CF9
S31500016340 0FFFC27900C0A22CB041670633C700C057
S31500016350A22C4FEF000C33C000A0031A4CDF20849F
S315000163604E754E714E714E7148E7201C33C000A028
S3150001637003 1C287C00C02C12267C00C02C144A3930
S3150001638000C097F467364879000017FA487900C0CB
S31500016390 97F04EB900021FF24A406F20487900C0BB
S315000163A01856487900C097F04EB900021FF24A40CC
S315000163B0670A36BC00014254600000C62A7C008090
S315000163C04024081500076 73A425436BC000123F9F8
S315000163D00080402000C02C0E1015E80802000003C2
S315000163E072001200E789068100028D6820012F00E4
S315000163F0487900C05258 4EB900019F6A08950007B6
S315000164000607E525430141215E80902010003 74002B
S315000164101401D482068200028D882042B0506F603A
S31500016420 42B900C02C0E425436BC00010895000644
S31500016430101502000003520002000003021500FCC1
S3150001644081157003C0156608021500FC08D5000009
S31500016450021500CF70031215020100034242140116
S3150001646053423202C3FC02E4068100C05286204137
S31500016470C02802E2E508021500F3811508D50006D9
S3150001648033C000A0031E4CDF38044E754E714E71A9
S315000164904E714E56FFF448E7000C33C000A00320AE
S315000164A02D49FFFC302E0008C1FC02E4068000C025
S315000164B052862A4049ED01BE3F3C00022F0D610084
S315000164C0F0443F3C00012F0D6100F03A2F2C0004EF
S315000164D02F2C000843EEFFF84EB900023572 4879B9
S315000164E000001846486EFFF8486EFFF44EB90002E8
S315000164F01FAE43EEFFF4206EFFFC209133C000A0D7
S31500016500 03224CDF30004E5E205F548F4ED04E7119
S315000165104E714E714E56FFF848E7001C33C000A07D
S3150001652003242D49FFFC302E0008C1FC02E406803D
S3150001653000C052862A4049ED01BE207900C0C9201B
S3150001654030280002080000 0F67063F3C0005600482
S3150001655003F3C00042F0D267C000155044E933F3C21
S315000165600002F0D4E933F3C00062F0D4E933F3CEE
S315000165700 0012F0D4E93486C0018486C0004486EBC
S31500016580FFF84EB900021FC443EEFFF8206EFFFC70
S31500016590209133C000A003264CDF38004E5E205FF9
S315000165A0548F4ED04E714E714E714E56FFF048E7E4
S315000165B0 0031C33C000A003282D49FFFC302E000820
S315000165C0C1FC02E4068000C052862A4049ED01BEA4
S315000165D03F3C00032F0D6100EF2C267C00C0C92033
S315000165E02053302800020800000F67063F3C0005D3
S315000165F060043F3C00042F0D6100EF0A2053302850
S31500016600000 20800000F67047C0560027C04205329
S315000166103028000208000 00F67047E0560027E0430
S3150001662020 07E588D08C2F002006E588D08C2F0026
S31500016630486EFFF44EB900021FAE486EFFF4486C77
S31500016640000C486EFFF04EB900021FC42F2EFFF05A
S3150001665043EEFFF84EB9000231BC487900001846F6
S31500016660486EFFF8486EFFF44EB900021FAE43EEC6
S31500016670FFF4206EFFFC209133C000A0032A4CDFFB
S3150001668038C04E5E205F548F4ED04E714E714E71A2
S315000166904E56FFEC48E7000C33C000A0032C2D49F1
S315000166A0FFFC302E0008C1FC02E4068000C05286C1
S315000166B028404BEC01BE3F3C00022F0C6100EE4628
S315000166C03F3C00012F0C6100EE3C486D0008486D0F
S315000166D00008486EFFF44EB900021FAE486D000473
S315000166E0486D0004486EFFF04EB900021FAE486EB9
S315000166F0FFF4486EFFF0486EFFEC4EB900021F5AD8
S315000167002F2EFFEC43EEFFF84EB900023CEC43EEB0
S31500016710FFF8206EFFFC209133C000A0032E4CDF52
S3150001672030004E5E205F548F4ED04E714E714E71C9
S315000167304E56FFF048E7000C33C000A003302D4948
S31500016740FFFC302E0008C1FC02E4068000C0528620
S315000167502A4049ED01BE207900C0C9203028000237
S315000167600800000F67063F3C000560043F3C00043B
S315000167702F0D6100ED903F3C00002F0D6100ED866D
S315000167803F3C00062F0D6100ED7C486C00184EB9A8
S3150001679000021FDA4A0067323F2E000843EEFFF47B
S315000167A06100FEEE486EFFF4486C0018486EFFF07B
S315000167B04EB900021F82486C0018486EFFF0486E01
S315000167C0FFF84EB900021FC460082D7C00000000CE
S315000167D0FFF843EEFFF8206EFFFC209133C000A0C6
S315000167E003324CDF30004E5E205F548F4ED04E7127
S315000167F04E714E7133C000A00334207C00C0A1FA53
S31500016800030107209E2680240003F0240003FD0406A
S315000168100279FF8100804046817900804046301030
S31500016820E048024000010240000102 79FFFE0080BB
S31500016830404681790080404 6227C008040483010E5
S31500016840E8480240000F0240000F720CE368025153
S315000168500FFF815130100240000F0240000FE14846
S3150001686002 51F0FF8151207C00C0A1FC3010E2688A
S3150001687002400007024000 07E9480251FF8F81519B
S315000168803010720AE26802400003 02400003E54844
S315000168900251FFF381513010E048024000030240EB
S315000168A000030251FFFC815130100240003F0240BB
S315000168B00003F0279FFC0008040608179008040601E
S315000168C033C000A003364E754E714E714E712F06C0
S315000168D033C000A00338222F00087C0FCC41E88981
S315000168E0303C00F0C041DC40E889303C0F00C0413B
S315000168F0DC40E889303CF000C041DC40300633C062
S3150001690000A0033A2C1F205F588F4ED04E714E7156
S315000169104E7148E7030033C000A0033C3C2F000C36
S315000169200303CF000C0467E003E00E98F303C0F004F
S31500016930C04672003200DE81E98F303C00F0C0466D
S3150001694072003200DE81E98F700FC046720032009C
S31500016950DE81200733C000A0033E4CDF00C0205F6C
S31500016960548F4ED04E714E714E712F0733C000A019
S315000169700034042417E01302F0008C0476702524161
S31500016980DE4766F20801000057C04400488033C064
S3150001699000A003422E1F205F548F4ED04E714E71C0
S315000169A04E712F0733C000A0034442417E01202FC0
S315000169B0008C08767025241DE8766F208010000BF
S315000169C057C04400488033C000A003462E1F205FF5
S315000169D0588F4ED04E714E714E712F0733C000A0A5
S315000169E0034842417E01202F0008C08767025241B9
S315000169F0DE8766F2300133C000A0034A2E1F205FF6
S31500016A00588F4ED04E714E714E7148E73F3E33C09E
S31500016A1000A0034C4FEFFEB2342F017E227C000210
S31500016A208ECE41EF0004704F20D951C8FFFC42972A
S31500016A304DEF0146283C00C0A3E4448476FF600084
S31500016A4006A47040D0427200320023C100C0A23CAD
S31500016A503F023F3C004C487900C0A3944EB9000167
S31500016A608FD050400C40000862000674D040303B85
S31500016A7000064EFB0002008000300044006C005806
S31500016A800012001C001200802EBC00004342600070
S31500016A90064E4A3900C0A3846300063E48790002C7
S31500016AA0F81A6000062C4A3900C0A3846300062A3E
S31500016AB048790002F82E600006184A3900C0A384FE
S31500016AC06300061648790002F83E600006044A395A
S31500016AD000C0A38463000602487900 02F84D6000F5
S31500016AE005F04A3900C0A384630005EE4879000227
S31500016AF0F85F600005DC487900C0A394487900C0BE
S31500016B00A3E44487800504EB900020684879000295
S31500016B10F86F487900C0A3E44EB9000240882A40C4
S31500016B204A80670005B40C15003F660000964A3995
S31500016B3000C0A3846300008C267C0003169A60764D
S31500016B40205310280010B03900C0A38462660C2DB2
S31500016B5000680001661648790002F8734EB9000212
S31500016B602A6E588F2F0B610006C2604848790002D1
S31500016B70F8BF4EB900022A6E588F0C39000300C0C7
S31500016B80A384651820534240102800103F0048791D
S31500016B900002F8C24EB900022A6E5C8F20532F28DC
S31500016BA0000C2F1048790002F8C74EB900022A6E70
S31500016BB04FEF000C588BB7FC0003170E658260007F
S31500016BC0051843EF0004207C00C0A244704F20D971
S31500016BD051C8FFFC7E01267C0003169A6000037CE7
S31500016BE020532F102F0D4EB900023F5C4A4066001C
S31500016BF00368103900C0A3842053B0280010650033
S31500016C00035842077A01600003280C070009670848
S31500016C100C15002D6606528D1E1D60041E055205BB
S31500016C200C07006866144A3900C0A384630C2F0B55
S31500016C30610005F87E0A600003200C070023664206

S31500016C40247C00C0A39442476006101A4880DE40A7
S31500016C500C1200236708B5FC00C0A3E465EC3F3CB9
S31500016C600000486F014C2F0D700030072F40000ABD
S31500016C704EB90002415A2217B280677A7E08600037
S31500016C800282205328680008600449EC0010102C89
S31500016C900001B0076708422F01444206601410390B
S31500016CA000C0A384B01454C0440048801F4001446E
S31500016CB01C004A06662470402053B0280011640463
S31500016CC07C40600842461C28001148C6200C20530F
S31500016CD090A80008E880B0866DB04A2F0144660688
S31500016CE07E026000021E4A2C000266104A156706E3
S31500016CF07E096000020E42076000020842074A153B
S31500016D00661A48790002F8DB42A74EB900024088AC
S31500016D102A404A8066067E036000023E102C00026D
S31500016D2053000C000007620001DA4880D040303B76
S31500016D3000064EFB0002016E00C801000138008208
S31500016D40004C00100010486F014A2F0D4EB900018A
S31500016D5094442F400146202F014AB08D6700012C33
S31500016D60202F0146206C0004B09065000194206C30
S31500016D700008B0906200018AB08366000186600057
S31500016D800180486F014A2F0D4EB9000193582F40DB
S31500016D900146202F014AB08D670000F0202F0146E1
S31500016DA0206C0004B09065000158206C0008B0907A
S31500016DB0630001506000014A486F014A2F0D43EFFD
S31500016DC0014E4EB900024016202F014AB08D6700D0
S31500016DD000BA2F2C0004486F014A4EB900021FF277
S31500016DE04A406D00011C2F2C0008486F014A4EB91C
S31500016DF000021FF24A406F00010A600001043F3C95
S31500016E000000486F014C2F0D4EB90002415A2F4028
S31500016E100146202F014AB08D6770202F0146206C54
S31500016E200004B090650000DA206C0008B0906300A1
S31500016E3000D2600000CC3F3C000A486F014C2F0D88
S31500016E404EB9000240F42F400146202F014AB08D71
S31500016E506738202F0146206C0004B0906D0000A217
S31500016E60206C0008B0906F00009A600000943F3CCF
S31500016E700010486F014C2F0D4EB90002415A2F40A8
S31500016E800146202F014AB08D66047E036074202FCF
S31500016E900146206C0004B0906566206C0008B09035
S31500016EA06360605C1C150C06002267060C06002751
S31500016EB06620421D200DD084068000C0A3E42F4029
S31500016EC00146528D4A1567061015B00666F442153D
S31500016ED060042F4D0146204F2F2801464EB900026E
S31500016EE04D602C001006488048C0206C0004B0900C
S31500016EF0650E1006488048C0206C0008B0906302F9
S31500016F007E07200C205390A80008E880E5880680BB
S31500016F1000C0A284204020AF0146200C205390A837
S31500016F200008E880068000C0A244204010AF01445A
S31500016F300C07000A67220C0700096700FCCE4A0706
S31500016F40661648790002F8D742A74EB90002408872
S31500016F502A404A806600FCB4588B0C070001660A79
S31500016F60B7FC0003170E6500FC780C07000A6700E2
S31500016F7001684A07660000E020632EA8000420533A
S31500016F80286800082A7C00C0A284247C00C0A24490
S31500016F906000009A4A126600008C4A2C00026700C3
S31500016FA00084102C00020C000002671E0C00000376
S31500016FB067320C00000467120C00000567400C00E4
S31500016FC0000665600C000008625A2015206C00045A
S31500016FD0B0906508206C0008B0906348206C0004EE
S31500016FE02A9060402015206C0004B0906D08206C3A
S31500016FF00008B0906F2E206C00042A9060262F2C7A
S31500017000000042F0D4EB900021FF24A406D102F2CBD
S3150001701000082F0D4EB900021FF24A406F06206C80
S3150001702000042A9049EC0010588D528A7040205372
S31500017030B028001164047E40600842471E280011F2
S3150001704048C7200C205390A8000BE880B0876D003F
S31500017050FF446000008A4A3900C0A384677A42402F
S315000170601007534048C0E588068000028EA62040DE
S315000170702F1048790002F8DE4EB900022A6E508FB1
S315000170800C07000167441E2C00010C0700206C0C44
S3150001709010074880064000303F0060061007488010
S315000170A03F000C0700205DC04400488048C0E588C9
S315000170B0068000028EC620402F1048790002F8E9AA
S315000170C04EB900022A6E4FEF000A48790002F8FB1A
S315000170D04EB900022A6E588F2EBC000171064EB9B8
S315000170E00001BA6A4A976700F95A20174FEF014E15
S315000170F033C000A0034E4CDF7CFC205F548F4ED082
S315000171004E714E714E7133C000A00350424033C0E0
S3150001711000A003524E754E714E714E7148E7013E05
S3150001712033C000A003542C7C00C0A3874216423909
S3150001713000C0A3852A7C00C0184E287C00C0A38A03
S31500017140267C00C0A384247C00C0A28C207900C0C8
S31500017150C92008280001000367144879000028E241B
S315000171604879000 2F8FE4EB900022A6E508F23FCC0
S315000171700000 0F0000C0A23C0C13000567060C13AB
S3150001718000006660A207900C0C9382F1060144A1318
S3150001719066084879 0002F9056008207900C0C934FB
S315000171A02F104EB900022A6E588F42163F3CEA60F4
S315000171B06100F85820404E903E000C47FFFE6614D1
S315000171C01ABC000118BC00012F124EB90001B5A668
S315000171D0421442150C47FFFB66141ABC000318BC87
S315000171E000012F124EB90001B5A6421460160C47D4
S315000171F0FFFD66161ABC00012F3900C0A2884EB9E0
S315000172000001B42A42156000FF700C47FFFF6600BB
S31500017210FF6842136000FF5833C000A003564CDFDD
S315000172207C804E754E714E714E7148E73F3C33C0BE
S315000172300 0A00358286F002C424248790002F90643
S31500017240267C00022A6E4E93588F247C00C0A384AC
S3150001725 00C12000365142054424010280010 3F0010
S31500017260487 90002F9094E935C8F20542F28000CAF
S31500017270 2F1048790002F90E4E934FEF000C20545F
S31500017280 2A68000860000162101 2B01565000156F7
S31500017290 4A1562080C0000046300014A4A42662648
S315000172A048790002F91E4E93588F0C120003650AA5
S315000172B048790002F9214E93588F48790002F92640
S315000172C04E93588F740148790002F9494E93588FAD
S315000172D00C120003651042401015 3F004879000268
S315000172E0F94C4E935C8F1A2D00017000102D00028F
S315000172F0E58806800002 8E8220402F100C050020B2
S3150001730060C0C1005488006400030 3F0060061005F1
S31500017310488 03F000C0500205DC04400488048C0FD
S31500017320E588068000028EC620402F1048790002AB
S31500017330F9504E934FEF000E42472F2D000C4EB9D8
S31500017340000 24D602600600000964A476F2048798A
S3150001735000 02F96748790002F95D4E93508F0C12CD
S3150001736000036 50A48790002F9694E93588F782718
S315000173703003904 70C4000286F347C28206D000CA8
S31500017380 3007D04648C0D1C01A100C0500306D0C2C
S315000173900 0C0500396F100C0500416C0A0C460027DC
S315000173A06C0C3806600853460C46001D6ECE206DE7
S315000173B0000C48707000487 90002F96E4E93508FA8
S315000173C00C4400276606064700286 0120C050020BB
S315000173D066047C016002424630 04D046DE40BE436C
S315000173E06D00FF684BED00107040 2054B02800116D
S315000173F064047E40600842471E28001148C7200DDC
S3150001740020549 0A80008E880B0876D00FE7C33C048
S315000174100 00A0035A4CDF3CFC205F588F4ED04E71C2
S3150001742004E714E7148E7030033C000A0035C204F44
S315000174302F28000C4EB900022A6E588F2C3900C035
S31500017440A23C9CAF001060064EB90001BA6A2F3902
S3150001745000026A4E4EB90000457E3E000C47FFFF12
S31500017460660A203900C0A23CB08662DC300733C010
S3150001747000A0035E4CDF00C0205F508F4ED04E71DE
S3150001748 04E714E7148E7010433C000A003604FEF0F
S31500017490FFEC4A3900C0A24467182F3900C0A28404
S315000174A0486F0004487800144EB90000206 8600057
S315000174B001244A3900C0A24767460CB90F0C3F00A8
S315000174C000C000FA640A48790002F9F8600000C0B9
S315000174D0487900C0A2903F3C00013F3C00224EB9D2
S315000174E000007D7A4A40670A48790002FA0960007D
S315000174F0009E23F900C0A29000C0C8FE600000D61D
S3150001750 02A7C00C0A3844A3900C0A2446700008ACD
S31500017510 4A3900C0A24567702F3900C0A2882F39A9
S3150001752000C0A2844EB900023F5C4A4066520CB9C3
S3150001753 00F0C3F0000C000FA64084879 0002FA1AED
S31500017540 60304A3900C0A24667083E3900C0A28EA3
S315000175506004424 71E1548573F3C00057023D0473B
S31500017560 3F004EB900007D7A4A40670E4879000215
S31500017570FA2B4EB900022A6E588F610000846054BE
S31500017580 48790002FA3C600648790002FA554EB97C
S3150001759000022A6E588F603C0C150003653 6616047
S315000175A07E01602630075340 48C0E588068000C04A
S315000175B0C93C20402F103F0748790002FA6C4EB9AA
S315000175C000022A6E4FEF000A5247424010155340FF
S315000175D0BE406FD042404FEF001433C000A003629B
S315000175E04CDF20804E754E714E714E7133C000A036
S315000175F0036433C000A003664E754E714E714E7121
S31500017600 48E7010433C000A00368598F42474BD7AE
S31500017610 7024D0473F00224D4EB900007F1E4A9587
S31500017620 67147010D095320748C1E589068100C0FC
S31500017630C93C2041208052470C4700056DD2588F26
S3150001764033C000A0036A4CDF20804E754E714E7127
S31500017650 4E7133C000A0036C33C000A0036E4E759B

S3150001766O4E714E714E7133C000A00370518F3F3C75
S31500017670000343EF00024EB900007F5641D72F2881
S315000176800042F3900026DF448790002FAB54EB9AB
S3150001769000022A6E4FEF000C3F3C000343EF00024D
S315000176A04EB900007F5641D72F103F3C00634EB9BB
S315000176B000001DCE4240508F33C000A003724E75AC
S315000176C04E714E714E712F0D33C000A003742A6F97
S315000176D000082F390002908A48790002FAFB2F0D23
S315000176E04EB900022AA42F39000264804879002AB
S315000176F0FB04486D00204EB900022AA44FEF001882
S31500017700033C000A003762A5F205F5C8F4ED04E7196
S315000177104E714E712F0633C000A00378207900C048
S31500017720C92030280002080000F660472026002B8
S31500017730720 17C63DC4148C60839000300C00012AF
S3150001774066047200600422065381206F00082081BE
S31500017750200633C000A0037A2C1F205F5C8F4ED019
S315000177604E714E7133C000A00037C33C000A030
S315000177770037E205F588F4ED04E714E714E7148E791
S31500017780033E33C000A003804FEFFFD42A6F004CA5
S315000177903E2F00523F3C00004EB9000086EA2F40C2
S315000177A00018207900C0C9203028000208000F07
S315000177B066047C0260027C0147EF0028247C0002FB
S315000177C02AA42C7C00017E34BE466C00016E4A4719
S315000177D06600009A3F3C0004487900C052864EB9C3
S315000177E000015504025300FF08D300022F3900029D
S315000177F0908E48790002FB0D2F0D4E924FEF000C33
S31500017800 3F3C00002F3900C054542F13486D000827
S315000178104E963F3C0004487900C0556A4EB90001B6
S315000178205504 1B7C0041000F3F3C00002F3900C06E
S315000178305738 2F13486D00204E961B7C00420027B7
S315000178403F3C0004487900C0584E4EB9000155042A
S315000178503F3C00002F3900C05A1C2F13486D0028E9
S315000178604E961B7C0043002F600005AE3F3C000591
S31500017870487900C052864EB9000155043F3C0005C7
S31500017880487900C0556A4EB900015504025300FFFC
S315000178900053 05002F39000290924879002FB142B
S315000178A02F0D4E924FEF000C3F3C00002F3900C0C8
S315000178B054582F13486D00084E963F3C00002F394F
S315000178C000C0573C2F13486D00204E963F3C0005E3
S315000178D0487900C0584E4EB9000155043F3C00009E
S315000178E02F3900C05A202F13486D00284E960C2DB3
S315000178F00002000 0E67061B6D000E000D1B7C00416B
S3150001790000 0E1B7C0042000F0C2D0020002667068E
S31500017910 1B6D002600251B7C004200261B7C0043B4
S31500017920002 70C2D0020002E67061B6D002E002D52
S315000179301B7C0043002E6000011A207900C0C9207B
S31500017940 3028000208000 0F660455 4760025347BD
S31500017950 4A4766 5E3F3C000043EF00224EB90001F4
S315000179606 5AA204F2F2800202F39000290964879CA
S315000179700002FB1C2F0D4E924FEF00103F3C000101
S31500017980 43EF00224EB9000165AA3F3C000243EFD6
S31500017990001E4EB9000165AA204F2F28001C204F5A
S315000179A02F28002448790002FB2A486D0020600038
S315000179B002BC0C47000 1662A2F390002909A4879C9
S315000179C00002FB352F0D4E922F3900C0185648790B
S315000179D00002FB38486D00204E924FEF0018600000
S315000179E004380C4700036C742F390002909E4879C5
S315000179F00002FB422F0D4E924FEF000C025300FF87
S31500017A0008D300003F3C00002F3C3F8000002F13AD
S31500017A10486D00084E96025300FF08D300023F3C12
S31500017A2000002F3C3F8000002F13486D00204E962A
S31500017A30025300FF3F3C00002F3C3F8000002F1304
S31500017A40486D00284E961B7C0057000F1B7C005684
S31500017A5000 0271B7C0041002F600003BE3F3C000451
S31500017A6070FDD0473F0043EF00284EB9000236605 3
S31500017A70303C00FFC06F00260253FF0081533013D4
S31500017A80024000FF3200C2FC02E4068100C05286B9
S31500017A902841 08AF0002002A302F00240C400003C1
S31500017AA062000376D040303B00064EFB0002000820
S31500017AB001C8026602D8025300FF287C00C0C8BE76
S31500017AC0206F00183013E048024000FF72003200B8
S31500017AD0E589D1C10828000 2000167000B630130C
S31500017AE0024000FF52403F0048790002FB492F0D3A
S31500017AF04E923F3C00012F1343EF002C4EB900007C
S31500017B0075C43013E048024000FF72003200D28192
S31500017B1006810000162020413F10204F2F28002CFF
S31500017B202F28002843EF00244EB90001A234307CEF
S31500017B30009AD1D43013E048024000FF3200C2FC63
S31500017B40002CD1C148680016486F00164EB90002D4
S31500017B501DF6486F0012486F001E486F00124EB99D
S31500017B6000 0021DB8204F2F28000E2F28000A307C56
S31500017B70009AD1D43013E048024000FF3200C2FC23
S31500017B80002CD1C148680023486D00064E924FEF84
S31500017B90001A025300FF08D30000206F00183013AB
S31500017BA0E048024000FF72003200E589D1C1082891
S31500017BB0000200016700026230130 24000FF5240DA
S31500017BC03F0048790002FB51486D00204E924FEF6D
S31500017BD0000A3F3C00012F1343EF00224EB900007B
S31500017BE075C43013E048024000FF72003200D281B2
S31500017BF006810000162020413F10204F2F28002229
S31500017C002F28001E43EF001E4EB90001A234307C1E
S31500017C10009AD1D43013E048024000FF3200C2FC82
S31500017C20002CD1C148680016486F00104EB90002F9
S31500017C301DF6486F000C486F0018486F000C4EB9CE
S31500017C40000021DB8204F2F2800082F280004307C81
S31500017C50009AD1D43013E048024000FF3200C2FC42
S31500017C60002CD1C148680023486D00264E924FEF83
S31500017C700010600001A43F3C00002F0C4EB900012A
S31500017C8055043F3C00012F0C4EB9000155043F3C01
S31500017C9000022F0C4EB900015504424010 2C02B6C9
S31500017CA03F003013024000FF52403F004879000276
S31500017CB0FB592F0D4E924FEF000C025300FF3F3C34
S31500017CC000002F2C01BE2F13486D00084E9602535B
S31500017CD000FF08D300003F3C00002F2C01C22F13E8
S31500017CE0486D00204E96025300FF08D300013F3C29
S31500017CF000002F2C01C62F13486D00284E961B7CC1
S31500017D000041000F1B7C005700271B7C0052002FEF
S31500017D106000001063013024000FF52403F004879DF
S31500017D200002FB642F0D4E92025300FF0053060022
S31500017D303013024000FF3F0043EF002C4EB9000113
S31500017D4064923013024000FF3F0043EF00284EB912
S31500017D5000016514204F2F2800263F3C00DF204FED
S31500017D602F28003048790002FB6F486D00204E92A3
S31500017D704FEF001C3F3C00012F2C01D62F13486DFD
S31500017D80000760000092301302 4000FF52403F009E
S31500017D9048790002FB802F0D4E92025300FF0053DB
S31500017DA006003013024000FF3F0043EF002C4EB99E
S31500017DB000 0166903F3C0001204F2F28002C2F1315
S31500017DC0486D00064E961B7C0066000F301302407C
S31500017DD000FF3F0043EF002C4EB9000167304879A0
S31500017DE0000290B2486F002E486F002E4EB9000275
S31500017DF01FAE204F2F28002648790002FB89486DC7
S31500017E0000204E924FEF00163F3C00012F2C01D669
S31500017E102F13486D00264E964FEF002C33C000A05D
S31500017E2003824CDF7CC0205F4FEF000A4ED04E71BB
S31500017E304E714E7148E7273E33C000A00384518F2F
S31500017E40246F00303C2F003C203900C0C8BE322FC1
S31500017E5000034E049024100FF3401C4FC0016D0821F
S31500017E6026402C7C00022A6E0C4600036C0004207E
S31500017E7049EF00042F0B486F003C486F00084EB9CC
S31500017E8000021FAE204F2F10224C4EB9000249BCF2
S31500017E904879000290B6486F003C4EB900021FF2C5
S31500017EA04A406C047A2D60027A204879000290BA21
S31500017EB02F0C4EB900021FF24A406C242A7C0002A4
S31500017EC0FB984879000290BE2F0C4EB900021D0C9A
S31500017ED02F0C4EB900021FDA4A006644600001B455
S31500017EE04879000290C22F0C4EB900021FF24A4097
S31500017EF06C082A7C0002FBA06018487900 0290C633
S31500017F002F0C4EB900021FF24A406C1A2A7C00025D
S31500017F10FBA84879000290BE2F0C4EB900021D0C39
S31500017F207E70600002E24879000290CA2F0C4EB9B9
S31500017F3000021FF24A406C082A7C0002FBB0603244
S31500017F404879000290CE2F0C4EB900021FF24A402A
S31500017F506C082A7C0002FBB86018487900 0290D2AE
S31500017F602F0C4EB900021FF24A406C1A2A7C0002FD
S31500017F70FBC04879000290D62F0C4EB900021D0CA9
S31500017F807E6E600002824879000290DA2F0C4EB9AB
S31500017F9000021FF24A406C082A7C0002FBC86032CC
S31500017FA04879000290DE2F0C4EB900021FF24A40BA
S31500017FB06C082A7C0002FBD06018487900 0290E226
S31500017FC02F0C4EB900021FF24A406C1A2A7C00029D
S31500017FD0FBD84879000290E62F0C4EB900021D0C21
S31500017FE07E75600002224879000290EA2F0C4EB994
S31500017FF000021FF24A406C082A7C0002FBE0603254
S315000180004879000290EE2F0C4EB900021FF24A4049
S315000180106C082A7C0002FBE86018487900 0290F29D
S315000180202F0C4EB900021FF24A406C1A2A7C00023C
S31500018030FBF04879000290F62F0C4EB900021D0C98
S315000180407E6D600001C24879000290FA2F0C4EB98C
S3150001805000021FF24A406C082A7C0002FBF86032DB
S315000180604879000290FE2F0C4EB900021FF24A40D9
S315000180706C082A7C0002FC006018487900 02910213

S315000180802F0C4EB900021FF24A406C0C2A7C0002EA
S31500018090FC087E20600001704879000291062F0CD1
S315000180A04EB900021FF24A406C082A7C0002FC10FD
S315000180B06032487900002910A2F0C4EB900021FF274
S315000180C04A406C082A7C0002FC18601848790002B4
S315000180D0910E2F0C4EB900021FF24A406C1A2A7CEF
S315000180E00002FC204879000291122F0C4EB90002C1
S315000180F01D0C7E6B600001104879000291162F0C51
S315000181004EB900021FF24A406C082A7C0002FC2884
S315000181106032487900002911A2F0C4EB900021FF203
S315000181204A406C082A7C0002FC306018487900023B
S31500018130911E2F0C4EB900021FF24A406C1A2A7C7E
S315000181400002FC384879000291222F0C4EB9000238
S315000181501D0C7E4D600000B04879000291262F0C5F
S315000181604EB900021FF24A406C082A7C0002FC400C
S315000181706032487900002912A2F0C4EB900021FF293
S315000181804A406C082A7C0002FC48601848790002C3
S31500018190912E2F0C4EB900021FF24A406C182A7C10
S315000181A00002FC504879000291322F0C4EB90002B0
S315000181B01D0C7E4760504879000291362F0C4EB94E
S315000181C000021FF24A406C082A7C0002FC58601823
S315000181D048790002913A2F0C4EB900021FF24A402B
S315000181E06C162A7C0002FC6048790002913E2F0C35
S315000181F04EB900021D0C600C2A7C0002FC6828BCEA
S315000182004479F99A7E54200A66402F143F052F0DB2
S315000182104E96100748803F0048790002FC704E9642
S315000182204FEF00100C460001660C486B00044879BC
S315000182300002FC7360760C46000266000A2486BE1
S3150001824000044879000 2FC7660622F143F052F0D69
S315000182502F0A4EB900022AA44FEF000E1547000659
S315000182600C460001660C486B000448790002FC7D4F
S3150001827060100C4600026610486B00044879000243
S31500018280FC80486A0007604C422A00076050200AB9
S315000182906620487900002FC874E96588F0C460004EA
S315000182A0663C486B000448790002FC8F4E96508F5D
S315000182B0602C48790002FC922F0A4EB900022AA4CA
S315000182C0508F0C46000466 16486B0004487900027C
S315000182D0FC9A2F0A4EB900022AA44FEF000C508FC8
S315000182E033C000A003864CDF7CE4205F4FEF000E15
S315000182F04ED04E714E714E7148E7073E33C000A015
S315000183003884FEFFFF44DD72CB900029240267C2B
S3150001831000022A6E4A3900C0A244670000 8808AFED
S315000183200000200024247606 40C47001864160256B8
S31500018330 00FF00560C00303C00FFC0470256FF000C
S31500018340815660180256 00FF00560D00303CFFE8CA
S31500018350D047024000FF0256FF0081563F3C000114
S315000183602F1643EF000A4EB9000075C4204F2F287F
S3150001837000008204F2F280008300752403F00487957
S3150001838000002FE134E934FEF000E5247207900C0B4
S31500018390C92010280004424112 00BE4164060C4760
S315000183A000306584287C00C0A43C4A3900C0A2463E
S315000183B0670618B900C0A28F4A3900C0A2476700F4
S315000183C000B80C140001660000944240103900C048
S315000183D0A43A3F0048790002FE2F4E935C8F4A393A
S315000183E000C0A43E676E48790002FE4B4E93487961
S315000183F00002FE5D4E93508F2A7C00C0A44E0815E4
S3150001840000000670848790002FE6C6016082D00001E
S315000184100000167084879 0002FE7C6006487900027F
S31500018420FE804E9348790002FE854E93508F0815C3
S3150001843000001670848790002FE946038082D0001A2
S315000184400000167084879 0002FEA46028487900020 5
S31500018450FEA8602048790002FEAD60184A1466083D
S3150001846048790002FEBF600C0C140002660A4879C6
S315000184700002FED94E93588F2A7C00C0A4480C14E2
S31500018480000001675A103900C0A2454880123900C060
S31500018490A2484881804112 3900C0A24B48818041DF
S315000184A0123900C0A24C48818041123900C0A24D48
S315000184B04881804112 3900C0A24948818041123960
S315000184C000C0A24A48818041671 40C150012660E4D
S315000184D048790002FEF84E93588F600002484A39E7
S315000184E000C0A245670A13F900C0A28B00C0A43AD6
S315000184F07EFF287C00C0A44C247C00C0A4364A39E7
S3150001850000C0A24867181ABC000C425414BC000CE7
S31500018510 33FC000300C0A43423C700C0A4444A3975
S3150001852000C0A249672C4AB900C0A298670C1ABCC0
S31500018530000004425414BC0004600A1ABC00054254EB
S315000185404014BC000533FC000300C0A43423C700C0DB
S31500018550A4444A3900C0A24A672C4AB900C0A29C69
S31500018560670C1ABC0006425414BC0006600A1ABC09
S31500018570000074 25414BC000733FC000300C0A434B6
S315000185802 3C700C0A4444A3900C0A24B67181ABCCD
S31500018590000E425414BC000E33FC000300C0A43488
S315000185A023C700C0A4444A3900C0A24C671C4A39FB
S315000185B000C0A43E660A13FC000100C0A43F600A85
S315000185C048790002FF174E93588F4A3900C0A24DD1
S315000185D0671E1ABC000F425414BC000F33FC000383
S315000185E000C0A43423C700C0A444423900C0A43E3D
S315000185F04A3900C0A24E67061ABC001142544A39D4
S3150001860000C0A24F67181ABC0008425414BC0008E7
S31500018610 33FC000300C0A43423C700C0A4444A3974
S3150001862000C0A250670000FE48790002FF324E9357
S315000186300588F08AF0002000242472A7C00C04298C8
S31500018640600000C80C47001864160256 00FF005669
S3150001865000C00303C00FFC0470256FF0081566018EF
S31500018660025600FF00560D00303CFFE8D04702409D
S315000186700 00FF0256FF0081563F3C00012F1643EFD3
S315000186800000A4EB9000075C4204F2F280008204F5C
S3150001869002F28000 8300752403F0048790002FF6842
S315000186A04E937A003A077C003C073016E0480240B8
S315000186B000FF3200C2FC00A8D28D2006D080D086F1
S315000186C0E588D28020412F2800043016E048024078
S315000186D000FF3200C2FC00A8D28D2005D080D085D3
S315000186E0E588D28020412F1048790002FF824E93FF
S315000186F0E58E068600E0003620462F1048790002F6
S31500018700FF904E934FEF00225247207900C0C920B7
S31500018710102800044241 1200BE4164080C47003093
S31500018720 6500FF2242404FEF000C33C000A0038AD0
S315000187304CDF7CE04E754E714E714E7148E7033E3B
S31500018740 33C000A0038C2A7C00C0A434287C00C05E
S315000187500A444267C00C0A4367EFF247C00C0A43E2F
S31500018760 2C7C00C0A43F4A16675A0C1300126518E8
S315000187701 3FC000E00C0A448427900C0A44C16BCEC
S3150001878000 0E3ABC000328870C55000352C0440072
S31500018790 48803C0053554A466716421613FC0010A2
S315000187A000C0A448427900C0A44C28874212601434
S315000187B00C94000000E660C421616BC00122887A7
S315000187C014BC00010C13000F6200017E2014B08757
S315000187D0661C0C55000352C0440048803E005355A8
S315000187E04A476700016416BC00126000015C0C393F
S315000187F0000300C0A43B660001502C7C00022A6ED7
S315000188000C13000E661A720EB081660A48790002D0
S31500018810FF96600000EE48790002FFA6600000E4C2
S315000188200C13000C66143F3900C0A44648790002B7
S31500018830FFB84E965C8F600000CE0C13000F6606E3
S315000188404212600000C20C130008664648790002 15
S31500018850FFDB4E96588F421216BC001228874247FC
S3150001886060127000 3007E588068000E0003620407F
S3150001887042905247207900C0C92010280004424185
S31500018880 1200BE41640000BC0C470030640000B415
S315000188906 0D00C13000465 0000AA0C1300076200E7
S315000188A000A22A7C00C0A44E72001213B081665E3B
S315000188B07205B081660808AD000000001600C720403
S315000188C0B081660C08ED00000000108950000602CDF
S315000188D00C13000 7660E7207B081660808AD000129
S315000188E0000160140C13000666120C9400000006C9
S315000188F0660A08ED000100010895000148790002A9
S31500018900FFF74E96588F16BC0012288760344879B7
S315000189100000300124E96588F16BC00122887700568
S31500018920BE8067067004BE80660408D500000C94FC
S315000189300000000767080C9400000006660408D5CD
S3150001894000001423900C0A43B33C000A0038E4CDFB6
S31500018950 7CC04E754E714E714E7133C000A00390AE
S31500018960 33C000A003924E754E714E714E7133C0E5
S31500018970 00A0039433C000A003964E754E714E714C
S315000189804E7133C000A00398518F3F3C000443EF62
S3150001899000024EB900007F5641D72F2800042F3917
S315000189A00026DF848790003004 94EB900022A6EAB
S315000189B04FEF000C3F3C000443EF00024EB90000AC
S315000189C07F5641D72F103F3C00634EB900001DCEA4
S315000189D04240508F33C000A0039A4E754E714E71BE
S315000189E04E7133C000A0039C13FC001000C0A448C4
S315000189F013FC001100C0A44913FC000800C0A44ADE
S31500018A0033FC000200C0A44C33C000A0039E4E7587
S31500018A104E714E714E7133C000A003A013FC0012BB
S31500018A2000C0A448427900C0A44C423900C0A43B0E
S31500018A30227C00C0A43C207900C0C9203028000255
S31500018A40E648024000031280 0C0000026608423923
S31500018A5000C0A43E600E0C000001660813FC000174
S31500018A6000C0A43F70FF23C000C0A444423900C027
S31500018A70A43A13FC001200C0A43833FC030000C062
S31500018A80A44E33C000A003A24E754E714E714E71B5
S31500018A9048E72F3E33C000A003A4518F0C390001D3

S31500018AA000C0A43C660001E42A7C00C0A43D287CE9
S31500018AB000C0A45A247C00C0A43B2C7C00C0C92061
S31500018AC00C120003660001380C39001800C0A439E5
S31500018AD0640001200C39000100C0A43E66000114A7
S31500018AE0267C00C0A45C2E3C07FFFFFF201390B933
S31500018AF000C0A460CE8023D300C0A4600C87000010
S31500018B000384630838BC0003600000F24A5467041A
S31500018B10535442124A54660000E64297201372000EB
S31500018B201215E589068100E000362041909002800 9
S31500018B3007FFFFFF2F4000042056082800070003 07
S31500018B406606E2882F4000040815000067067E0CC1
S31500018B502C0760047E0D2C07485742401015E24051
S31500018B603200C3FC00A8068100C042982006D080CE
S31500018B70D087E588D28020012F004EB900019F6A77
S31500018B80081500006 7067C0C280660047C0D280683
S31500018B9008150000 67067E0C2A0760047E0D2A0769
S31500018BA042401015E2403200C3FC00A8068100C015
S31500018BB042982005D080D087E588D2802241424064
S31500018BC01015E2403200C3FC00A8068100C032D86D
S31500018BD02004D080D086E588D280204120D92091FA
S31500018BE070001015E588068000E0003620402093CD
S31500018BF0600A23F900C0A44000C0A44442124A12EC
S31500018C0066000088267C00C0A4480C130012654843
S31500018C100C39000100C0A43E66704A5466322056E3
S31500018C204A280004672A42401015524012280004BF
S31500018C304242140148C081C248401A8072001200A3
S31500018C40E589068100E00036204123D000C0A460FA
S31500018C5013D500C0A438603213D300C0A4382A7CCF
S31500018C6000C0A44C4A55671E535516B900C0A44905
S31500018C7013F900C0A44A00C0A44913F900C0A44BCB
S31500018C8000C0A44A600416BC0012508F33C000A075
S31500018C9003A64CDF7CF44E754E714E714E7148E75A
S31500018CA0213E33C000A003A842072A7C0080400E63
S31500018CB00C39000100C0A43C660001F8287C00C004
S31500018CC0A452267C00C0A440247C00C0A43B4A12C6
S31500018CD066700255FEFF0255FDFF2C7C00C0A438CC
S31500018CE00C160012645C0C160010660A38BC0100F2
S31500018CF014BC0004600E0C160011660E38BC000A86
S31500018D0014BC00051CBC0012603842401016424 1DA
S31500018D10123900C0A43AEB49D04148C026802F0041
S31500018D20610002644A40670608EB0004000338BC90
S31500018D30000914BC000113D600C0A4391CBC0012E2
S31500018D407E012C7C000292560C1200016672301 5CF
S31500018D5008000008660A4A0766060C54003C635878
S31500018D600255FEFF303CFFFFD0540240003F3880E1
S31500018D700C40003E670001FE0C40003D661A14BC23
S31500018D80000242937200123900C0A4394240103 6E3
S31500018D9018003880600001DE2013123900C0A45388
S31500018DA0E2A80240000102400001720 9E36802558F
S31500018DB0FDFF8155600001BE00550100600001B64E
S31500018DC00C120002660000A0301508000008 6700BA
S31500018DD0008E0255FEFF2013D080268030150240FA
S31500018DE0000172003200839330 3CFFFFD0540240F1
S31500018DF0003F38806600017E2013123C00FC74009F
S31500018E00143900C0A439D2362800E2A82E002F1347
S31500018E10610001744A40673A4240103900C0A43AE1
S31500018E20BE40662E103C00FB7200123900C0A43908
S31500018E30D0361800721FE1A94681C39323D300C01F
S31500018E40A45C14BC000313FC000100C0A43E600036
S31500018E50012423D300C0A46470FF2680604E005510
S31500018E60010060000 1100C120003660C0255FEFFA2
S31500018E700255FDFF600000FE0C120004661400554 9
S31500018E8001000055020053540C540100630000E632
S31500018E90601A0C120005660000DC0255FEFF025541
S31500018EA0FDFF53540C54000A630000CA42126000CD
S31500018EB000C44A3900C0A43C660000BA42401039D9
S31500018EC000C000FEC07900C0A458660000A8287C36
S31500018ED000C0A4543015024000011214 4881B0416B
S31500018EE067263015024000011880661C487900C0CB
S31500018EF033684EB900019F42227C00C03368207C52
S31500018F0000C0432820D92091287C00C0A4553015E3
S31500018F10E248024000011214 4881B0416728301529
S31500018F20E24802400001188066 1C487900C033748B
S31500018F304EB900019F42227C00C03374207C00C0E0
S31500018F40433420D92091287C00C0A4563015E44B2A
S31500018F50024000011214 4881B04167183015E448F7
S31500018F60024000011880660C487900C034104EB9E1
S31500018F7000019F4233C000A003AA4CDF7C844E75DA
S31500018F804E714E714E712F0733C000A003AC2E2FC8
S31500018F900008202F00087210E2A8B1872007E08898
S31500018FA0B1872007E888B1872007E488B1872007C1
S31500018FB0E288B1870287000000001300733C000A0B4
S31500018FC003AE2E1F205F588F4ED04E714E714E71DB
S31500018FD048E7071C33C000A003B0267C00C0A23CB2
S31500018FE02A6F001C2A137000302F00229A80284D08
S31500018FF04247600000AE2F3900026A4E4EB90000AA
S3150001900004 57E3C000C40FFFE67320C40FFFA67309C
S31500019010 0C40FFFC672E0C40FFF9672C0C40000D3D
S3150001902067 2A0C40000A67240C40000867260C409A
S315000190300 07E672A0C40FFFF672A604670FE606C5F
S31500019040 70FA606870FC606470F960601AC6421557
S315000190504240 60584A47674A538D534760442A4CF9
S31500019060424760 3E4A856D0E0C93000000406D0636
S31500019070 2013B0856C0470FD60324EB90001BA6AE6
S3150001908060200C46000466084A47660470FF601CAF
S315000190900C460010 66084A47660470F8600E52478F
S315000190A01AC6BE6F00206500FF4E70FB33C000A0DC
S315000190B003B24CDF38E0205F508F4ED04E714E71B7
S315000190C04E7133C000A003B433C000A003B64E7581
S315000190D04E714E714E712F0733C000A003B82E3961
S315000190E000C0A23C7000302F00089E8060064EB979
S315000190F00001BA6A203900C0A23CB0876EF033C0C5
S315000191000000A003BA2E1F205F548F4ED04E714E71B0
S3150001911 04E7133C000A003BC227C00C0A23C4A9120
S315000191206714539167104A7900C0C8B0660833FCCA
S3150001913000 00100C0C8B033C000A003BE4E754E7119
S315000191404E714E7133C000A003C033C000A003C2EC
S315000191504E754E714E714E7148E7203E33C000A0E8
S3150001916003C4518F4A3900C0A24466000 1D62A7C45
S31500019170 00C00570267C00022A6E247C00C0010610
S3150001918002C7C00001DCE4A3900C0A246675C201522
S3150001919 0B0B9000317A8660A4879000300E8600021
S315000191A0019E4879000300F54E9320554868000654
S315000191B02F102079003A00202F104EB900008BF4B1
S315000191C044802F004EB900008BC02F002F12487922
S315000191D00003013C4E934FEF00202F39003A002443
S315000191E03F3C00634E966000015A4A3900C0A245D1
S315000191F067482F7900C017400004487900030163CE
S315000192004E932F39003E4000204F2F28000C4879FD
S3150001921 0003E00002F39003A002048790 03A00004C
S315000192202F3900C005742F152F1248790003019FAD
S315000192304E934FEF0028600001 0A4879000301C9E7
S315000192404E9320552F28000E20523028000602404A
S3150001925000FF3F0030280006E048024000FF3F00C3
S31500019260 42A72F3900C0C8BA3F3C0018487900030D
S31500019270022A4E9320552F2800163F3C00444E9655
S3150001928 048790003024 84E9320552028001 63228BB
S315000192900014 48C1243C000151802F40001E2002C9
S315000192A04EB90002625ED0AF001E2F003F3C004463
S315000192B04E9648790003024A4E934FEF00223F3CF7
S315000192C000004EB90000835048C0E588068000C002
S315000192D013F420402A502F0D4EB90000951A4A402A
S315000192E067122F2D00083F3C00444E964879000333
S315000192F0024C6006487900030 24E4E93588F287936
S31500019300 00C013F0200C673020542F2800083F3C82
S31500019310 00444E9620542028000890AD0008223CB7
S3150001932000 0151804EB900025BBC2F004879000351
S31500019330025A4E93508F600A48790003 02604E9399
S3150001934 0588F4240508F33C000A003C64CDF7C04C7
S315000193504E754E714E714E7148E7001C33C000A028
S3150001936003C84FEFFFEC266F00242A6F0028227CEA
S31500019370000292A841D7700220D951C8FFFC309152
S3150001938003F3C000A2F0D2F0B4EB90002415A3F40B8
S31500019390000E2015B08B6338528028403F3C000AEE
S315000193A02F0D2F0C4EB90002415A3F4000102015D7
S315000193B0B08C631C528028403F3C000A2F0D2F0CB5
S315000193C04EB90002415A3F4000122015B08C660288
S315000193D02A8B103900E000084A00670E0C000001D4
S315000193E067160C000002672460341F6F000F000629
S315000193F01F6F00110005600C1F6F000F00051F6F26
S315000194000001100063F6F001200086012 3F6F000E48
S31500019410000081F6F00110005 1F6F0013000648575 3
S315000194204EB90001B934202F000A4FEF001433C0A2
S3150001943000A003CA4CDF3800205F508F4ED04E711A
S315000194404E714E7148E7031C33C000A003CC266F52
S31500019450000182A6F001C3F3C000A2F0D2F0B4EB936
S3150001946000002415A2E002015B08B63000084701843
S3150001947 0BE80647C203C00000E1022074EB900021B
S31500019480625E2C002015528028403F3C000A2F0DB9
S315000194902F0C4EB90002415A2E002015B08C635094
S31500019 4A0703CBE80644A2007E9889087E588DC80A5
S315000194B020155280264020550C10003A6628528805

S315000194C028483F3C000A2F0D2F0C4EB90002415A85
S315000194D02E002015B08C630A703CBE806404DC87C4
S315000194E060102A8B600620554A1067067CFF6002D1
S315000194F02A8B200633C000A003CE4CDF38C0205F84
S3150001950050 8F4ED04E714E714E7148E7013C33C0BB
S31500019510 00A003D07E012A7C00C0A392287C00C053
S31500019520A38C267C00022A6E4A3900C0A244674EEB
S31500019530203900C0A2840C80000100006434 4A4036
S315000195406714 0C402580671C0C404B0067160C40C5
S3150001955096006710601C08AD0000000128BC0000E1
S315000195604B00601808ED0000000128B900C0A28474
S315000195706 00A4879000 3035C4E93588F42474A3983
S315000195800 0C0A245670C13F900C0A28B00C0A390CE
S3150001959042474A3900C0A246670C13F900C0A28FA0
S31500019 5A000C0A39142474A3900C0A2486716303924
S315000195B000C0A2960240 0001D04008AD00010001A2
S315000195C081554247247C00026A4E4A3900C0A247AF
S315000195D06716303900C0A29202400001E1480895A1
S315000195E00000815542476 01A4A4766166 0064EB921
S315000195F00001BA6A2F124EB90000457E0C40FFFFEA
S31500019600 67EC4A3900C0A24A674848790003037 0EB
S315000196104E93588F60200C47FFFF67140815000012
S31500019620660E2F3900026A523F074EB90000445AAE
S315000196304EB90001BA6A2F124EB90000457E3E00AE
S3150001964 00C47000366D0487900030 3734E93588F85
S3150001965042474A3900C0A249671E2F0C3F3C00020F
S31500019660 3F3C002C4EB900007D7A4A40670A487992
S315000196700000303764E93588F4A47676C082D00010 5
S315000196800001670848790003 03C660064879 0003AC
S31500019690 03C7081500006708487900 0303C260067E
S315000196A0487900 0303C37000103900C0A390E58810
S315000196B0068000C0C92820402F104240103900C042
S315000196C0A3913F002F14082D000000016708487977
S315000196D0000303B8600648790003 03BD4879000317
S315000196E003874E934FEF001A424033C000A003D2C6
S315000196F04CDF3C804E754E714E714E7148E703004A
S31500019700 33C000A003D4227C00C000FE3C2F000C15
S3150001971060 2A1011B007630E42411200424010 0741
S31500019720924 09C416014B007641242411200064106
S315000197300004042401007924 09C411E114A466ED29B
S3150001974033C000A003D64CDF00C0205F548F4ED03B
S315000197504E714E714E7133C000A003D8083900 0115
S3150001976000C0A39367224A3900C0A384661A4879C8
S31500019770000303CA4EB900022A6E4879000303D3D7
S315000197804EB900022A6E508F33C000A003DA4E751F
S315000197904E714E714E7133C000A003DC598F3F3CB0
S315000197A0002C43EF00024EB900007F1E4A97671254
S315000197B0327C0010D3D7207C00C0A38C20D9209105
S315000197C06010227C00028E14207C00C0A38C20D95C
S315000197D02091588F33C000A003DE4E754E714E7135
S315000197E04E7133C000A003E0518F3F3C000243EFAE
S315000197F000024EB900007F5641D72F2800042F39A9
S3150001980000026DF04879000303EE4EB900022A6E9C
S3150001981 04FEF000C3F3C000243EF00024EB900003F
S3150001982 07F5641D72F103F3C00634EB900001DCE35
S31500019830 4240508F33C000A003E24E754E714E7107
S315000198404E7133C000A003E433C000A003E64E7599
S315000198504E714E714E7133C000A003E8518F3F3CEB
S3150001986000 0043EF00024EB900007F5641D72F2872
S315000198700 0042F3900026DE848790003040F4EB940
S315000198800 0022A6E4FEF000C3F3C000043EF00023E
S315000198904EB900007F5641D72F103F3C00634EB9A9
S315000198A000001DCE4240508F33C000A003EA4E7522
S315000198B04E714E714E7133C000A003EC33C000A04F
S315000198C003EE4E754E714E714E7133C000A003F01A
S315000198D0518F3F3C000A43EF00024EB900007F560C
S315000198E041D72F2800042F3900026E104879000352
S315000198F004314EB900022A6E3F3C000A43EF000EC6
S315000199004EB900007F5641EF000C2F103F3C00631B
S315000199104EB900001DCE3F3C000943EF000E4EB983
S31500019920 00007F5641EF000C2F2800042F3900025A
S3150001993 06E0C48790003043C4EB900022A6E4FEFC3
S31500019940 00183F3C000943EF00024EB900007F5664
S3150001995041D72F103F3C00634EB900001DCE424057
S315000199600508F33C000A003F24E754E714E714E7189
S31500019970 33C000A003F433C000A003F64E754E7148
S315000199804E714E7148E7030033C000A003F83E2F25
S31500019990000C7C0FCC47E84F700FC047720AC2C05B
S315000199A0DC41E84F700FC0477264C2C0DC41E84F2A
S315000199B0700FC047323C03E8C2C0DC41300633C0F9
S315000199C000A003FA4CDF00C0205F548F4ED04E71C9
S315000199D04E714E7148E7010C33C000A003FC598F4C
S315000199E03E2F00143F3C000A3F074BEF0004287C42
S315000199F000023660224D4E943E153F3C000A204F30
S31500019A003F280004224D4E943015E948DE403F3C84
S31500019A10000A204F3F280004224D4E943015E1489C
S31500019A20DE403F3C000A204F3F280004224D4E9461
S31500019A303015720CE368DE403007588F33C000A042
S31500019A4003FE4CDF3080205F548F4ED04E714E7135
S31500019A504E7148E7030033C000A004002C2F000C10
S31500019A603F066100FF207E003E007010E0AE3F061B
S31500019A706100FF12323C2710C2C070003001DE8047
S31500019A80200733C000A004024CDF00C0205F588FBE
S31500019A904ED04E714E714E714E56FFEA48E7230481
S31500019AA033C000A004042D49FFFC2A7C00C00570C8
S31500019AB02E2E000820552028000E7202B081640C5B
S31500019AC0422EFFEE422EFFEF600000F0BEA8001608
S31500019AD064042E280016205520280016322800146A
S31500019AE048C1243C000151802D40FFEA20024EB9B5
S31500019AF00002625ED0AEFFEABE80631620552E28B4
S31500019B0000163028001448C022024EB90002625ED7
S31500019B10DE80487807082055202800164480204 01A
S31500019B204870780043EEFFF44EB9000236A8487833
S31500019B3000302F2EFFF843EEFFF44EB9000236A88F
S31500019B403F3C00023F2EFFF643EEFFF04EB9000206
S31500019B503660487800022F2EFFF843EEFFF44EB927
S31500019B60000236A8307C02DAD1D5D1EEFFF81E10FC
S31500019B704AAEFFF4660A10074880E8401E006004FA
S31500019B800207000F307C00DAD1D51007488048C0A3
S31500019B90EB88D1C0302EFFF248C0D1C01C104A6EEE
S31500019BA0FFF0660A10064880E8401C0060040206C1
S31500019BB0000F1D46FFEE1D47FFEF43EEFFEE206E41
S31500019BC0FFFC10D9109133C000A004064CDF20C45D
S31500019BD04E5E205F588F4ED04E714E714E714E566D
S31500019BE0FFF633C000A004082D49FFFC3D6E0008B6
S31500019BF0FFF64A6EFFF6660A2D7C00000000FFF8AC
S31500019C0060147000302EFFF6720DE3A806803080D6
S31500019C1000002D40FFF843EEFFF8206EFFFC209177
S31500019C2033C000A0040A4E5E205F548F4ED04E71A1
S31500019C304E714E56FFF633C000A0040C2D49ED
S31500019C40FFFC2D6E0008FFF648790002937E486EF0
S31500019C50FFF64EB900021FF24A406C06426EFFFA49
S31500019C606012203CCF800000D0AEFFF6720DE2A854
S31500019C703D40FFFA43EEFFFA206EFFFC309133C000
S31500019C8000A0040E4E5E205F588F4ED04E714E716D
S31500019C904E714E56FFF248E7010C33C000A0041086
S31500019CA02D49FFFC43EE000841EEFFF220D9209139
S31500019CB042474BEEFFF649EEFFF44A6EFFF267129A
S31500019CC03D55FFF83A9438AEFFF23D47FFF206479D
S31500019CD000104A6EFFF467143D6EFFF6FFF83D6E05
S31500019CE0FFF4FFF6426EFFF4064700100CAE0000CB
S31500019CF007FFFFF6631A600C202EFFF6E2882D405F
S31500019D00FFF652470CAE000007FFFFF662EA60223B
S31500019D100CAE000003FFFFF66418600C202EFFF660
S31500019D20D0802D40FFF653470CAE000003FFFFF62F
S31500019D3065EA303C03FFC06EFFF8024003FF026E86
S31500019D40FC00FFFA816EFFFA9E6E00100647001FA7
S31500019D5006470009703FC047720AE368026E03FFB7
S31500019D60FFFA816EFFFA43EEFFFA206EFFFC309197
S31500019D7033C000A004124CDF30804E5E205F4FEFEF
S31500019D80000A4ED04E714E714E714E56FFF42F029F
S31500019D9033C000A004142D49FFFC227C00028D6013
S31500019DA041EEFFF420D92091302E0008024003FF36
S31500019DB03D40FFFA08C0000A3D40FFFA302E000A76
S31500019DC0322E0008740AE4690241003FD041064080
S31500019DD0FFD83F00486EFFF4610007A043EEFFF491
S31500019DE0206EFFFC20D9209133C000A00416241F49
S31500019DF04E5E205F588F4ED04E714E714E714E564B
S31500019E00FFF033C000A004182D49FFFC302E0010CE
S31500019E104440064000203F00202E0008486EFFF017
S31500019E204EB9000242242F2EFFF043EEFFF44EB945
S31500019E3000024A34302E001044403F00202E000C10
S31500019E40486EFFF04EB9000242242F2EFFF043EE7A
S31500019E50FFF84EB900024A34486EFFF8486EFFF427
S31500019E60486EFFF04EB900021F5A43EEFFF0206E16
S31500019E70FFFC209133C000A0041A4E5E205F4FEF15
S31500019E80000A4ED04E714E714E714E56FFF433C0DC
S31500019E9000A0041C2D49FFFC3F2E000C486E000853
S31500019EA0486EFFF44EB900021DF62F2EFFF82F2E35
S31500019EB0FFF443EEFFF46100051443EEFFF4206E58
S31500019EC0FFFC20D9209133C000A0041E4E5E205F06
S31500019ED05C8F4ED04E714E714E714E56FFF048E773

S31500019EE0001C33C000A004202D49FFFC47EEFFF4FF
S31500019EF049EE00084BEE00102D4AFFF0204C224D92
S31500019F00244B2028000422290004D0812540000486
S31500019F1020102211D1812480246EFFF043EEFFF43C
S31500019F20206EFFFC20D9209133C000A004224CDF13
S31500019F3038004E5E205F4FEF00104ED04E714E71CD
S31500019F404E7133C000A00424206F0004428052A841
S31500019F5000042210D380208133C000A00426205F94
S31500019F60588F4ED04E714E714E7133C000A00428E9
S31500019F70206F0004226F00082028000422290000413
S31500019F80D0812140000420102211D181208033C0CC
S31500019F9000A0042A205F508F4ED04E714E714E7133
S31500019FA04E56FFF448E7000C33C000A0042C2D499F
S31500019FB0FFFC49EEFFF44BEE0008204D224C202811
S31500019FC0000444802340000420104080228043EE98
S31500019FD0FFF4206EFFFC20D9209133C000A0042E8F
S31500019FE04CDF30004E5E205F508F4ED04E714E7169
S31500019FF04E7133C000A00430206F000420280004F5
S3150001A00044802140000420104080208033C000A0FD
S3150001A0100432205F588F4ED04E714E714E714E569E
S3150001A020FFF048E7001C33C000A004342D49FFFCB3
S3150001A03047EEFFF449EE00084BEE00102D4AFFF003
S3150001A040204C224D244B2028000422290004908113
S3150001A050254000042010221191812480246EFFF0F6
S3150001A06043EEFFF4206EFFFC20D9209133C000A0FF
S3150001A07004364CDF38004E5E205F4FEF00104ED0A5
S3150001A0804E714E714E7133C000A00438206F00042A
S3150001A090226F000820280004222900049081214013
S3150001A0A00004201022119181208033C000A0043ABF
S3150001A0B0205F508F4ED04E714E714E56FFEC51
S3150001A0C048E7001C33C000A0043C2D49FFFC47EEC5
S3150001A0D0FFF049EE00084BEE00142D4AFFEC204C30
S3150001A0E0224D244B20280008222900089081254072
S3150001A0F0000820280004222900049181254000043B
S3150001A1002010221191812480246EFFEC43EEFFF092
S3150001A110206EFFFC20D920D9209133C000A0043E37
S3150001A1204CDF38004E5E205F4FEF00184ED04E7167
S3150001A1304E714E7133C000A00440206F0004226F9F
S3150001A14000082028000822290008908121400008E3
S3150001A15020280004222900049181214000042010B6
S3150001A16022119181208033C000A00442205F508FCC
S3150001A1704ED04E714E714E714E56FFEC48E7001CA3
S3150001A18033C000A004442D49FFFC47EEFFF049EE21
S3150001A19000084BEE00142D4AFFEC204C224D244BB7
S3150001A1A02028000822290008D081254000082028FF
S3150001A1B0000422290004D081254000042010221127
S3150001A1C0D1812480246EFFEC43EEFFF0206EFFFC6C
S3150001A1D020D920D9209133C000A004464CDF380095
S3150001A1E04E5E205F4FEF00184ED04E714E714E718C
S3150001A1F033C000A00448206F0004226F0008202805
S3150001A200000822290008D0812140000820280004E6
S3150001A21022290004D1812140000420102211D1817C
S3150001A220208033C000A0044A205F508F4ED04E716B
S3150001A2304E714E714E56FFEC48E7000C33C000A03C
S3150001A240044C2D49FFFC2D7C00000000FFF42D7C01
S3150001A25000000000FFF84BEEFFF449EE00082D4226
S3150001A260FFF02D43FFEC203C00000433906E0010FC
S3150001A270204C2628000424106C0444834082660680
S3150001A2802603673E6012223CFFFE00000C282670897
S3150001A290E28AE293528060EE223C00100000C28204
S3150001A2A06608E383E392538060EE223C000FFFFFD2
S3150001A2B0C4814840E980848008100007670408C209
S3150001A2C0001F204D20C22083242EFFF0262EFFECF6
S3150001A2D0224D206EFFFC209121690000400433C049
S3150001A2E000A0044E4CDF30004E5E205F4FEF000AA7
S3150001A2F04ED04E714E714E56FFE848E7000C36
S3150001A30033C000A004502D49FFFC2D7C0000000045
S3150001A310FFF42D7C00000000FFF84BEEFFF449EE40
S3150001A32000082D42FFF02D43FFEC2D44FFE8203CB1
S3150001A33000000433906E0014204C282800082628BB
S3150001A3400000424106C044483408266062603674297
S3150001A3506014223CFFFE00000C282670AE28AE293AF
S3150001A360E294528060EC223C00100000C282660A30
S3150001A370E384E393E392538060EC223C000FFFFFFA
S3150001A380C4814840E980848008100007670408C238
S3150001A390001F204D20C22083242EFFF0262EFFEC25
S3150001A3A0282EFFE8224D206EFFFC20912169000432
S3150001A3B00000433C000A004524CDF30004E5E205F23
S3150001A3C04FEF000E4ED04E714E714E714E56FFEC50
S3150001A3D048E7000C33C000A004542D49FFFC227C41
S3150001A3E000002938241EEFFF420D920914BEEFFF457
S3150001A3F049EE00082D42FFF02D43FFEC204C2628A4
S3150001A40000004241022020282000FFFFF00820010C6
S3150001A41000000281FFF000000881001F4841E88921
S3150001A4200441043 3D26E00106E0E672E0C41FFC03C
S3150001A4306C204282428360220C4100406F0A4282B4
S3150001A44044824283448360 12E383E392534166F874
S3150001A4506008E28AE293524166F808100007670431
S3150001A46044834082204D20C22083242EFFF0262ED5
S3150001A470FFEC224D206EFFFC20D9209133C000A0B5
S3150001A48004564CDF30004E5E205F4FEF000A4ED07F
S3150001A4904E714E714E714E56FFE448E7000C33C0C3
S3150001A4A000A004582D49FFFC227C00029 38A41EE4C
S3150001A4B0FFF020D920D920914BEEFFF049EE00089C
S3150001A4C02D42FFEC2D43FFE82D44FFE4204C2410E0
S3150001A4D02628000442842202028 2000FFFFF008226
S3150001A4E00001000000281FFF000000881001F4841B2
S3150001A4F0E88904410433D26E00106E1067360C41B0
S3150001A500FFA06C26428242834284602 80C4100608F
S3150001A5106F0E42824482428344834284448460149F
S3150001A520E383E392534166F8600AE28AE293E29496
S3150001A530524166F608100007670644844083408 24C
S3150001A540204D20C220C32084242EFFEC262EFFE8B6
S3150001A550282EFFE4224D206EFFFC20D920D9209120
S3150001A56033C000A0045A4CDF30004E5E205F4FEF2F
S3150001A570000A4ED04E714E714E7133C000A0045C7C
S3150001A580518F2F4200042E83206F000C24102628A1
S3150001A5900004322F00106B0C6712E383E392 5341E0
S3150001A5A066F86008E282E293524166F820C220838F
S3150001A5B0242F00042617508F33C000A0045E205FAD
S3150001A5C05C8F4ED04E714E714E712F0733C000A075
S3150001A5D00460302F0008E0583E00300733C000A069
S3150001A5E004622E1F205F548F4ED04E714E714E71F4
S3150001A5F02F0733C000A00464202F0008E05848400C
S3150001A600E0582E00200733C000A004662E1F205FED
S3150001A610588F4ED04E714E714E7148E7010C33C0C2
S3150001A62000A004689BCD2E0D287C0000040060026A
S3150001A630DE9DBBD465FA48790003047E4EB900025B
S3150001A6402A6E200744802F0020542F102F082F39FF
S3150001A65000026FA82F390000185E4879000304B57F
S3150001A6604EB900022A6E4FEF001C2F39000262829A
S3150001A6703F3C00634EB900001DCE424033C000A0EE
S3150001A680046A4CDF30804E754E714E714E712F0645
S3150001A69033C000A0046C7C060839000300C0001218
S3150001A6A066047200600422065381206F000820812F
S3150001A6B0200633C000A0046E2C1F205F5C8F4ED095
S3150001A6C04E714E714E712F0D33C000A004702A6F6A
S3150001A6D00082F390000184A4879000304D82F0DC5
S3150001A6E04EB900022AA42F39000264804879 00037A
S3150001A6F004E1486D00204EB900022AA44FEF00186C
S3150001A70033C000A004722A5F205F5C8F4ED04E7169
S3150001A7104E714E7133C000A0047433C000A004769C
S3150001A720205F588F4ED04E714E714E7148E7000C26
S3150001A73033C000A00478287C00022AA42A6F000CEA
S3150001A740202F00107205B08162000130D040303BED
S3150001A75000064EFB0002000C00A200800054 0030EF
S3150001A76000CE2F390000184A4879000304EA2F0D5C
S3150001A7704E944FEF000C2F3900C0C8FE48790003F4
S3150001A78004F360000094487900030501487900 0349
S3150001A79004F82F0D4E944FEF000C207900000400B1
S3150001A7A02F104879000305 0A606E2F3900001852F0
S3150001A7B04879000305102F0D4E944FEF000C486D9C
S3150001A7C000202F39000262823F3C00634EB900002F
S3150001A7D01AB6600000A62F390000185648790003 02
S3150001A7E005192F0D4E944FEF000C2F39000 26FA85B
S3150001A7F0487900030522 60202F390000185A48794C
S3150001A80000305272F0D4E944FEF000C2F39000042
S3150001A810185E48790003 0530486D00204E944FEFCD
S3150001A820000C60562F3900C0A38C0839000000C007
S3150001A830A39367084879000305456006487900 0334
S3150001A840054A4879000305372F0D4E9470001039DB
S3150001A85000C0A390E588068000C0C92820402F10BB
S3150001A86042401039 00C0A3913F0048790003054FCB
S3150001A870486D00204E944FEF001E33C000A0047AAD
S3150001A8804CDF3000205F4FEF000A4ED04E714E7103
S3150001A8904E7148E7073E33C000A0047C2C3C010002
S3150001A8A000002A3C00020000287C00024D60267C44
S3150001A8B000022AA42A6F00242C6F0028082D000507
S3150001A8C000E76600016C4EB9000060C0202D00DC77
S3150001A8D0223C000151804EB9000257A891AD00DC1F
S3150001A8E045ED00E00692 0001517F20124EB90002AB
S3150001A8F057A8919208ED000600E708ED000500E76C

S3150001A90042154879000305604B6D003C4878003CD3
S3150001A9104EB900002068082D000700D56712487956
S3150001A9200003058F2F0D4E94487508004E93508FE6
S3150001A930082D000600D66722202D00D4C0866708A0
S3150001A9404879000305996006487900030 59E2F0D95
S3150001A9504E94487508004E93508F202D00D4C08523
S3150001A9606722202D00D4C086670848790003 05A315
S3150001A97060064879000305A72F0D4E944875080017
S3150001A9804E93508F082D000000D56722202D00D44C
S3150001A990C0866708487900030 5AB6006487900035D
S3150001A9A005AF2F0D4E94487508004E93508F082D14
S3150001A9B0000200D56712487900030 5B32F0D4E94A6
S3150001A9C0487508004E93508F082D000400D5671274
S3150001A9D04879000305B72F0D4E94487508004E932C
S3150001A9E0508F082D000600D5671A4879000305C265
S3150001A9F04879000305BB2F0D4E94487508004E9308
S3150001AA004FEF000C082D000500D5671A48790003A1
S3150001AA1005CD4879000305C62F0D4E9448750800EB
S3150001AA204E934FEF000C2F0D4E944235083C600EAD
S3150001AA30082D000600E7670608AD000600E7082DA9
S3150001AA40000600E767122F0E2F0D610003D62F0DAA
S3150001AA50610005AE1E0060027E030C070003661846
S3150001AA602F0D610007981E000C070002660A2F0EC3
S3150001AA702F0D610003AE7E014A0767082F0D6100A5
S3150001AA8005801E000C07000367B4422D0078082DCF
S3150001AA90000700D567264AAD00C0660442A76006D6
S3150001AAA0206D00C02F104879000305D3486D00784A
S3150001AAB04E94487508784E934FEF000C082D00060A
S3150001AAC000D66774082D000200D2664C202D00D4F2
S3150001AAD0C0856726202D00D4C0866708487900 0303
S3150001AAE005D96006487900030 5DE486D00784E9465
S3150001AAF0487508784E93508F603E302D00D0024045
S3150001AB0000FF52403F0048790003 05E3486D007895
S3150001AB104E9448750878601A102D00E64880524018
S3150001AB203F0048790003 05E9486D00784E94487561
S3150001AB3008784E934FEF000A202D00D4C085674058
S3150001AB40082D000200D2671648790003 05EE486D0C
S3150001AB5000784E94487508784E93508F6022302DB8
S3150001AB6000D0024000FF52403F0048790003 05F241
S3150001AB70486D00784E94487508784E934FEF000A59
S3150001AB80082D000000D56724302D00D0E048024092
S3150001AB9000FF52403F0048790003 05F7486D0078F1
S3150001ABA04E94487508784E934FEF000A082D00021F
S3150001ABB000D56726302D00D2720CE2680240000FE4
S3150001ABC052403F004879000305FC486D00784E94D9
S3150001ABD0487508784E934FEF000A082D000400D5FA
S3150001ABE0673E4A2D00E56604424 66014102D00E4D6
S3150001ABF04880122D00E5488148C081C148403C008B
S3150001AC00102D00E4488090463F0048790003060174
S3150001AC10486D00784E94487508784E934FEF000AB8
S3150001AC20082D000600D5674E206D00B808280004DF
S3150001AC300001672630 2D00D2720CE2680240000F37
S3150001AC407C003C00701AD0B900C005702206D28182
S3150001AC50D286E589D0812F0060064879000 3060D6A
S3150001AC6048790003060 6486D00784E9448750878C1
S3150001AC704E934FEF000C082D000500D56730082DC7
S3150001AC800003 00D2670A206D00C848680004600806
S3150001AC90206D00CC48680004487900030 60F486D12
S3150001ACA000784E94487508784E934FEF000C1007C4
S3150001ACB033C000A0047E4CDF7CE0205F508F4ED075
S3150001ACC04E714E714E7133C000A00480226F000494
S3150001ACD04A3900C0A249671E303CFFFFD07900C047
S3150001ACE0A29A024003FF0269FC0000D2816900D2E8
S3150001ACF008E9000000DB4A3900C0A2446712103996
S3150001AD0000C0A28753001340 00E608E9000300DBF8
S3150001AD104A3900C0A250670E137900C0A2B700E4F9
S3150001AD2008E9000100DB4A3900C0A24C6722303C29
S3150001AD30FFFFD07900C0A2A602400001720AE368B3
S3150001AD4008A9000200D2816900D208E9000400DBEB
S3150001AD504A3900C0A24B6720303CFFFFD07900C0C2
S3150001AD60A2A2024000FFE148026900FF00D081690A
S3150001AD7000 0D008E9000200DB4A3900C0A24A672276
S3150001AD80303CFFFFD07900C0A29E0240000F720C3A
S3150001AD90E36802690FFF00D2816900D208E9000564
S3150001ADA000DB4A3900C0A24D671E303CFFFFD07957
S3150001ADB000C0A2AA024000FF0269FF0000D081691B
S3150001ADC000D008E9000600DB4A3900C0A24E671030
S3150001ADD0237900C0A2AC00DC08E9000400D66010AB
S3150001ADE0203CFFABA000D0B900C000FA234000DC34
S3150001ADF04A3900C0A24F6710237900C0A2B000E013
S3150001AE0008E9000400D66008237900C000FA00E0D2
S3150001AE1033C000A00482205F588F4ED04E714E7110
S3150001AE204E7148E7211C33C000A00484287C00C071
S3150001AE30C8BE2A6F0018266F001C2B5400C4203C84
S3150001AE400000009AD094322D00D0E049024100FF63
S3150001AE503401C4FC002CD082068000000162B4071
S3150001AE6000C8203C0000009AD094322D00D0E04961
S3150001AE70024100FF3401C4FC002CD0822B4000CCDF
S3150001AE80082D000100D7660A082D000100DB6700C6
S3150001AE9000AC302D00D2024003FF72003200E1897E
S3150001AEA0068100C013F4102D00E4488048C0E588EF
S3150001AEB0D2802041285020 2D00BCB08C67642B4CD9
S3150001AEC000BC67562F0C4EB90000951A4A40674AD6
S3150001AED07018D0AD00BC2B4000B47010D0AD00BCD2
S3150001AEE02B4000C0200B672A2F0B2F2D00BC4EB91B
S3150001AEF0000068DA4A806604420760027E01100794
S3150001AF0002000001EF0808AD000700E7812D00E708
S3150001AF10601008AD000700E7600842AD00B442AD1D
S3150001AF2000C04AAD00BC660000C242AD00B442ADED
S3150001AF3000C008AD000700E7600000B0303C03FF29
S3150001AF40C06D00D26600009C4AB900C013F0676666
S3150001AF502F0B2F3900C018104EB9000068DA4A804D
S3150001AF60660442076002 7E011007020000 01EF0835
S3150001AF7008AD000700E7812D00E7082D000700E76F
S3150001AF80673449ED00BC28B900C018107018D09478
S3150001AF902B4000B4302D00D0E048024000FF720083
S3150001AFA03200E589D2AD00B42B4100B87010D094BF
S3150001AFB02B4000C060342B7C00C015FC00B42B7CF8
S3150001AFC000C015F400C0202D00B4322D00D0E04998
S3150001AFD0024100FF74003401E58AD0822B4000B89B
S3150001AFE0600842AD00B442AD00C033C000A0048683
S3150001AFF04CDF3884205F508F4ED04E714E714E71AA
S3150001B0002F0233C000A00488226F00084AA900B4A9
S3150001B010670001B6202900B4322900D0E049024177
S3150001B02000FF74003401E58AD082234000B8720320
S3150001B0302040C22800016700 01AA0829000200D2A7
S3150001B040674A102900E64880206900C032280004BA
S3150001B050E0490241001F206900B834100242000392
S3150001B06002810000FFFF82C2B041640001763029EF
S3150001B07000 0D0024000FF206900C032280004E049E8
S3150001B080241001FB041652860000158302900D0F7
S3150001B090024000FF206900C032280004E049024155
S3150001B0A0001FB0416200013C4A2900E66E000134EE
S3150001B0B0302900D2720CE2680240000F206900C0FC
S3150001B0C0322800040241000FB041640001164AA96A
S3150001B0D000BC67220B29000400D66724206900BC49
S3150001B0E020280008B0A900DC650000F8B0A900E03E
S3150001B0F0630E600000EE0829000100D7660000E437
S3150001B1000829000700D7673808290002 00D2671806
S3150001B110206900B80828000200016624082800 03F7
S3150001B12000001661C600000BC206900B830280002DE
S3150001B1300800000D660A0828000600 02670000A440
S3150001B1400829000000D6672608290002 00D26710E8
S3150001B150206900B808280003000166126000008417
S3150001B160206900B83028000208000 00E677408291B
S3150001B170000100D667240829000200D2670E206963
S3150001B18000B808280002000166106056206900B860
S3150001B190302800020800000D67480829000200D681
S3150001B1A067300829000200D2670E303CFFFE02069B3
S3150001B1B000B8C050661C602A206900B83028000219
S3150001B1C00800000F660C601A303C1780C06900D673
S3150001B1D0661008290005 00D6670C0829000700E754
S3150001B1E0660470036002700133C000A0048A241F44
S3150001B1F0205F588F4ED04E714E714E7148E7070051
S3150001B20033C000A0048C226F00107C0342474AA978
S3150001B21000C0670001544AA900B86700014C3029F3
S3150001B2200D0E048024000FF0C40000E6400013AE5
S3150001B2300829000600D7676C0829000600DB66644A
S3150001B2400829000200D2664830290 0D0024000FFDA
S3150001B250524002 4000FF0269FF0000D0816900D020
S3150001B260302900D0024000FF206900C032280004C6
S3150001B270E0490241001FB0416512303C00FFC04762
S3150001B2800269FF0000D0816900D060187E01601458
S3150001B290102900E64880024000FF0269FF0000D045
S3150001B2A0816900D04A4766520829000500D7674AD6
S3150001B2B00829000500DB6642302900D2720CE268DB
S3150001B2C00240000F52400240000FE36802690FFF7F
S3150001B2D000D2816900D2302900D2E2680240000F13
S3150001B2E0206900C032280004 0241000FB041650800
S3150001B2F002690FFF00D260027E014A47666A082989
S3150001B300000300D7676208290003 00DB665A082993
S3150001B310000200D2674E206900C030280004E048D0

S3150001B3200240001F206900B832100241000302806A
S3150001B3300000FFFF80C13A00522900E6102900E60D
S3150001B3404880B0456D06422900E660027E0110295B
S3150001B35000E64880024000FF0269FF0000D08169D3
S3150001B36000D06004422900E64A4766260829000102
S3150001B37000D7671E0829000100DB6616522900E482
S3150001B3800C29004000E46D06422900E460027E01BA
S3150001B3907C024A47662A0829000400D76722082941
S3150001B3A0000400DB661A0829000200D2670808A912
S3150001B3B0000200D2600808E9000200D27E017C0288
S3150001B3C04A4766480829000200D767400829000253
S3150001B3D000DB6638302900D0E048024000FF5240C9
S3150001B3E0024000FFE148026900FF00D0816900D0F8
S3150001B3F0302900D0E048024000FF0C40000F6508EC
S3150001B400026900FF00D060027E017C024A476602A3
S3150001B4104206100633C000A0048E4CDF00E0205F18
S3150001B420588F4ED04E714E7148E7073C33C06E
S3150001B43000A004904FEFFF78246F00A81F7C000145
S3150001B440000149EF00860254C1FF08D40001422FD2
S3150001B450000208D400060254FE7F08EC0007000132
S3150001B46008D400077A0147EF0004600000FA0814C7
S3150001B4700006661030147209E2680240001F0C4093
S3150001B480000363063F3C030060043F3C00C06100CB
S3150001B49003023E000C47FFFD67060C4700066606E1
S3150001B4A00814000667080C470015660000860C475D
S3150001B4B0000667060814000667520814000076700AD
S3150001B4C000C60814000657C044004880DA403F050C
S3150001B4D0486F00064E924A40660608D4000760048B
S3150001B4E0089400071F450002100546001F4000038F
S3150001B4F042463E3C00802A4B101D4880DC405347A3
S3150001B5004A4762F41F4600840254C1FF08940006AC
S3150001B51008140007660A3F3C0004610002C4602E5D
S3150001B5203F3C00C03F3C0084486F00056100030CAE
S3150001B530601C0C47001866163014EE4802400003E2
S3150001B540524002400003EF480254FE7F81543014FA
S3150001B5507209E2680240001F52400240001FE36880
S3150001B5600254C1FF81543014EE48024000030C40DE
S3150001B5700002621230147209E2680240001F0C4098
S3150001B580001E6300FEEA30140240007F4FEF008880
S3150001B59033C000A004924CDF3CE0205F588F4ED0B0
S3150001B5A04E714E714E7148E70F3E33C000A00494B0
S3150001B5B04FEFFF7849EF00862C6F00B00254FF80F1
S3150001B5C0005400150254C1FF7A0145EF000247EF0E
S3150001B5D0000046000012230140240007F3F00610038
S3150001B5E002003F3C0280610001AA3E000C470001B7
S3150001B5F0660000CC2A4A3C3C00837E4060222F39FB
S3150001B60000026A4E4EB90000457E38000C44FFFF29
S3150001B610660A4EB90001BA6A534760041AC4534612
S3150001B6204A476F044A4662D64A476F70103C00FF8C
S3150001B630D005122F0002B2006602534542463E3C37
S3150001B64000802A4B101D4880DC4053474A4762F46C
S3150001B650102F0084B0066600009E10054600122FCA
S3150001B6600003B20066000090102F0002B0056600CC
S3150001B67000863F05486F00064E964A4066180254FA
S3150001B680FF8000540006303C3E00C054670402545B
S3150001B690C1FF524560600054007F605A3014720940
S3150001B6A0E2680240001F52400240001FE368025454
S3150001B6B0C1FF81540254FF800054001560380C47C5
S3150001B6C0000467060C470018660C707FC0470254D9
S3150001B6D0FF80815460200254FF800054001530140D
S3150001B6E07209E2680240001F52400240001FE368EF
S3150001B6F00254C1FF815430140240007F0C40000403
S3150001B700672A30140240007F0C400018671E30146F
S3150001B7100240007F0C40007F571230147209E26814
S3150001B7200240001F0C40000A6500FEAC30140240C6
S3150001B730007F0C400004670C30140240007F0C406F
S3150001B74000018660A3F3C000661000096602430142A
S3150001B7500240007F0C40007F66183F3C000A3F3CD8
S3150001B76000011487900030616610000D03F3C00C075
S3150001B770612030140240007F4FEF008833C000A0E3
S3150001B78004964CDF7CF0205F588F4ED04E714E717F
S3150001B7904E7148E7030033C000A004983C2F000C0B
S3150001B7A060124A466704534666047EFD601A4EB926
S3150001B7B00001BA6A2F3900026A4E4EB90000457E71
S3150001B7C03E000C47FFFF67DA300733C000A0049A3A
S3150001B7D04CDF00C0205F548F4ED04E714E714E71BA
S3150001B7E048E7030033C000A0049C1C2F000D7E0512
S3150001B7F0600853474EB90001BA6A4A47631A2F399E
S3150001B80000026A4E100648803F004EB90000445AB5
S3150001B8103C000C0600FF67DA4A47630610064880BB
S3150001B820600270FD33C000A0049E4CDF00C0205FA3
S3150001B830548F4ED04E714E714E7148E7070433C096
S3150001B840000A004A02A6F00143A2F00183E2F001AF8
S3150001B850602C2F3900026A4E10154880024000FF05
S3150001B8603F004EB90000445A3C000C46FFFF660AF1
S3150001B8704EB90001BA6A53476004528D53454A478F
S3150001B88063044A4562CC4A4763043006600270FD90
S3150001B89033C000A004A24CDF20E0205F508F4ED0C1
S3150001B8A04E714E714E712F0233C000A004A4323C7A
S3150001B8B0F83BD26F000874003401E58A0682000263
S3150001B8C094D62042201033C000A004A6241F205F76
S3150001B8D0548F4ED04E714E714E7133C000A004A8E4
S3150001B8E0303CF83AD06F0004720032000681000243
S3150001B8F097CE20414240101033C000A004AA205F19
S3150001B900548F4ED04E714E714E7133C000A004ACAF
S3150001B9107200322F0004D2810681000294BC2041BC
S3150001B920301033C000A004AE205F548F4ED04E714C
S3150001B9304E714E7148E7010C33C000A004B0598F17
S3150001B9402A6F00143F2D00084EB90001B8DA4A40AB
S3150001B95066047E0060100C2D0002000652C04400F1
S3150001B96048803E0048C749ED000A303CFFFFD06DD4
S3150001B97000083F004EB90001B8A6D0872E8042408C
S3150001B980102D000653403F004EB90001B90A72005E
S3150001B9903200D2977000102D0005D2805381288184
S3150001B9A02E81720720174EB9000257A852001B407C
S3150001B9B00001721820144EB90002625E28807000E0
S3150001B9C0102D0004D194723C20144EB90002625E1F
S3150001B9D028807000102D0003D19420144EB9000266
S3150001B9E0625E28807000102D0002D1940C150001B2
S3150001B9F067120C15000266142F144EB90000240CB0
S3150001BA004A40670804AD00000E10000A588F33C083
S3150001BA1000A004B24CDF3080205F588F4ED04E71AB
S3150001BA204E714E71207C0003214C227C00C0FAB677
S3150001BA30203C00000088E488600222D851C8FFFC3F
S3150001BA404E7548E73F3E204F2E7900C0DAB223C833
S3150001BA5000C0DAB2BFFC00C0FAB66C32BFFC00C04F
S3150001BA60DAB26F2A4CDF7CFC4E75203900C0A23C4D
S3150001BA7023C000C0A24048E73F3E204F2E7900C0B8
S3150001BA80DAB223C800C0DAB24CDF7CFC4E752E79DF
S3150001BA9000C0DAB24EB90000A28C4CDF7CFC4E75B8
S3150001BAA0207C000320C4227C00C0C9D6203C0000B3
S3150001BAB00088E488600222D851C8FFFC4E7533FC29
S3150001BAC0002400C0DAB0606E33FC001C00C0DAB09E
S3150001BAD0606433FC001D00C0DAB0605A33FC0020FC
S3150001BAE000C0DAB0606833FC001F00C0DAB0605EE7
S3150001BAF033FC002300C0DAB0605433FC002200C0DE
S3150001BB00DAB0604A33FC002100C0DAB0604033FC91
S3150001BB10001E00C0DAB0603633FC002400C0DAB083
S3150001BB20602C33FC002500C0DAB0602233FC00260D
S3150001BB3000C0DAB0601833DF00C0DAA233DF00C01C
S3150001BB40DAA433DF00C0DAA633DF00C0DAA8007C4E
S3150001BB50070033DF00C0DAAE33DF00C0DAAA33DF15
S3150001BB6000C0DAAC48F9FFFF00C0DA5E33C000A0BE
S3150001BB7004B44EB90000A19A2E7C00C0DAB22F3C63
S3150001BB8000C0DA5E203C00C0DAB2048000C0DA5E92
S3150001BB90E2403F003F3C001B4EB900007D7A33C0B6
S3150001BBA000A004B64E72270033C000A004B8007C82
S3150001BBB007002E7C00C0DAB2227C00E00158203C4E
S3150001BBC000000000E2402F093F003F3C00034EB950
S3150001BBD000007D7A33C000A004BA4E72270048E700
S3150001BBE0030033C000A004BC7C0B0839000300C06D
S3150001BBF0001266047E0060042E065387206F000C37
S3150001BC00208748790002989C487900E0000E4EB9D9
S3150001BC1000021FF24A406F0420066002700033C022
S3150001BC2000A004BE4CDF00C0205F5C8F4ED04E7179
S3150001BC304E714E712F0D33C000A004C02A6F00084B
S3150001BC404879000017144879000306382F0D4EB9BC
S3150001BC5000022AA42F3900026480487900030641B4
S3150001BC60486D00204EB900022AA44FEF001833C0D8
S3150001BC7000A004C22A5F205F5C8F4ED04E714E71C8
S3150001BC804E7133C000A004C433C000A004C6205FB7
S3150001BC90588F4ED04E714E714E7148E7033E33C0F8
S3150001BCA000A004C84FEFFFE42A6F003C2F79000281
S3150001BCB098A00018026F00FF001808EF0002001A92
S3150001BCC03F3C0001204F2F28001A43EF00164EB9C2
S3150001BCD0000075C42F3900E000262F3900E000224C
S3150001BCE0204F2F28001C2F28001843EF00184EB9AB
S3150001BCF00001A01E3F3900001620204F2F28000EFC
S3150001BD002F28000A43EF001A4EB900019DFE247C3C
S3150001BD1000C0C8BE2052486800B0487900E0000E55
S3150001BD20486F00144EB900021FAE486F0010486FED
S3150001BD3000010486F001C4EB900021FAE2F3900E0FB

S3150001BD40001E2F3900E0001A2F3900E000262F3996
S3150001BD5000E0002243EF00144EB90001A01E3F3956
S3150001BD6000001620204F2F28000A2F28000643EF37
S3150001BD7000164EB900019DFE2052486800B0487970
S3150001BD8000E0000E486F00104EB900021FAE486F6A
S3150001BD90000C486F000C486F00184EB900021FAE28
S3150001BDA0287C00E0002E2C3C00278D00203900C0A5
S3150001BDB000FAB094632E2006223900C000FA92944C
S3150001BDC04EB900025BBC486F00044EB90002422422
S3150001BDD0486F0004486F0018486F00144EB90002FE
S3150001BDE01FAE60062F6F0010000C48790002989C68
S3150001BDF0486F00104EB900021FF24A406F7C487925
S3150001BE000002989C487900E000124EB900021FF228
S3150001BE104A406F66486F000C487900E00012486F8F
S3150001BE20000C4EB900021FC44879000298A4486F5D
S3150001BE300008486F00084EB900021FAE48574EB9B8
S3150001BE4000024D3A486F00084EB90002422448797З
S3150001BE50000298A8486F000C4EB900021FF24A4032
S3150001BE606F082F7C4AED4E0000082E14486F00081B
S3150001BE704EB900024D3ADE80601E48790002989C58
S3150001BE80487900E000124EB900021FF24A406F06DF
S3150001BE902E06DE9460022E14267C00022AA42C7C37
S3150001BEA000C0C924202F0040720AB081620002BC82
S3150001BEB0D040303B00064EFB0002007A00A800D8B5
S3150001BEC000C2017400160048022E025E0294020EA0
S3150001BED048790003064A2F0D4E93508F486D002076
S3150001BEE02F3900C000FA3F3C006D4EB900001AB66A
S3150001BEF0204F2F2800142F0E4879000306586000A2
S3150001BF0002424879000306632F0D4E93508F486D08
S3150001BF10002020544870680003F3C006D4EB9000077
S3150001BF201AB6204F2F28000C2F0E48790003067 2EF
S3150001BF306000021048790003067D2F0D4E93508F45
S3150001BF40486D00202F143F3C006D4EB900001AB613
S3150001BF50204F2F2800102F0E48790003068D600010
S3150001BF6001E24879000306982F0D4E93508F486DD4
S3150001BF7000202F3900E0002A600001E6487900031D
S3150001BF8006A32F0D4E93508F486D00202F1460008D
S3150001BF9001D048790003 06AD2F0D4E93508F302FF7
S3150001BFA00018E048024000FF72003200D28106818B
S3150001BFB0000016202041 3F102F3900E0001E2F39C6
S3150001BFC000E0001A43EF001A4EB90001A234307C9A
S3150001BFD0009AD1D2302F0018E048024000FF32000B
S3150001BFE0C2FC002CD1C148680016486F000C4EB93E
S3150001BFF000021DF6486F0008486F0014486F0008DC
S3150001C0004EB900021DB8204F2F2800042F10307C96
S3150001C010009AD1D2302F0020E048024000FF3200C2
S3150001C020C2FC002CD1C1486800236000 00B64879E3
S3150001C030000306B72F0D4E93508F302F0018E0489E
S3150001C040024000FF72003200D28106810000 1620F4
S3150001C05020413F102F3900E000262F3900E0002251
S3150001C06043EF001A4EB90001A234307C009AD1D2B6
S3150001C070302F0018E048024000FF3200C2FC002CBD
S3150001C080D1C148680016486F000C4EB900021DF672
S3150001C090486F0008486F0014486F00084EB9000247
S3150001C0A01DB8204F2F2800042F10307C009AD1D2C2
S3150001C0B0302F0020E048024000FF3200C2FC002C75
S3150001C0C0D1C148680023601A4879000306BF2F0DC5
S3150001C0D04E93508F2F3900E0000E2F0E4879000342
S3150001C0E006C9486D0020605E4879000306D62F0D0B
S3150001C0F04E93508F486D00202F3900E000323F3CAF
S3150001C100006D4EB900001AB62F3900E000162F0E49
S3150001C1104879000306E2602A4879000306ED2F0DEF
S3150001C1204E93508F486D00202F143F3C006D4EB941
S3150001C13000001AB62F3900E000122F0E48790003CD
S3150001C14006FD486D00254E934FEF0010601C48799F
S3150001C150000307082F0D4E93508F486D00202F07BF
S3150001C1603F3C00634EB900001AB64FEF001C33C0C6
S3150001C17000A004CA4CDF7CC0205F4FEF000A4ED0FE
S3150001C1804E714E714E7148E7030033C000A004CCD6
S3150001C1901E390080400813FC0080008 0400813FC13
S3150001C1A0000100804000302F000C48C0E588068061
S3150001C1B00026EEC20402F104EB900C0FAB63C00CA
S3150001C1C013FC00010080400013C70080400833C003
S3150001C1D000A004CE4CDF00C0205F548F4ED04E71BC
S3150001C1E04E714E7148E7011C33C000A004D84FEFD1
S3150001C1F0FFF0286F00244BD7267C00C0A4683014BA
S3150001C2004640C06F00286628426D000E2A8C41EF19
S3150001C21000282B4800082B4C00043B7C0001000C35
S3150001C2202F0D4EB900C0C9D642471E008F136006B6
S3150001C23008D300027E0430074FEF001033C000A080
S3150001C24004DA4CDF3880205F5C8F4ED04E714E7120
S3150001C2504E7133C000A004DC4241227C00C0185A52
S3150001C2603001C1FC00D2D0892040217C0001C4707C
S3150001C270009A3001C1FC00D2D0892040217C000106
S3150001C280C2D8009E52413001C1FC00D2D089204063
S3150001C290217C0001C48E009A3001C1FC00D2D089F4
S3150001C2A02040217C0001C3A4009E52410C4100188C
S3150001C2B06DAE08F9000400C0AD8313FC000700C091
S3150001C2C0AD8513FC000400C0AD8433C000A004DEBC
S3150001C2D04E754E714E714E7133C000A004E0303977
S3150001C2E0008040A6720CE26802400007424112 3902
S3150001C2F000C0AD84B0416716024100077 00CE169C8
S3150001C30002798FFF008040A68379008040A6227CB7
S3150001C310008040406005110000251F3FF0051040015
S3150001C3200079380000804040424010 3900C0AD8598
S3150001C3300240001F720AE368027983FF0080402CE5
S3150001C34081790080402C13F90080404200C0A46A24
S3150001C3500839000300C0AD836738303900 80404A90
S3150001C360080000 06672C207C00C0AD3152100C106D
S3150001C370000F630410BC000F700FC010023900F0EB
S3150001C380008040628139008040620279FFBF0080EF
S3150001C390404A0251EFFF33C000A004E24E754E71D0
S3150001C3A04E714E7133C000A004E43039008040A6BE
S3150001C3B0720CE26802400007424112 3900C0AD84A6
S3150001C3C0B041671602410007700CE16902798FFFDF
S3150001C3D0008040A68379008040A6227C00804046EA
S3150001C3E0005110000251F3FF005108000079380096
S3150001C3F00080404042401 03900C0AD850240001F18
S3150001C400720AE368027983FF0080402C81790080FB
S3150001C410402C13F90080404200C0A46A0839000389
S3150001C42000C0AD836738303900 80404A08000006F5
S3150001C430672C207C00C0AD3152100C10000F630434
S3150001C44010BC000F700FC010023900F0008040626E
S3150001C4508139008040620279FFBF0080404A025163
S3150001C460EFFF33C000A004E64E754E714E714E715A
S3150001C47033C000A004E833F90080403A00C0AD6C37
S3150001C48033C000A004EA4E754E714E714E7148E7F5
S3150001C490003C33C000A004EC33F90080403A00C0F0
S3150001C4A0AD6E2A7C00C0AD70303900C0AD6C90799C
S3150001C4B000C0AD6E3A804A406C024255247C00C0F1
S3150001C4C0AD723012B05564023495287C00C0AD7649
S3150001C4D00C540008641E267C00C0AD743015D1537F
S3150001C4E052540C540008660C3013E64833C000C0A1
S3150001C4F0AD7842530839000400C0AD83671061204E
S3150001C5004A40670A42520279FFBF0080404A33C05F
S3150001C51000A004EE4CDF3C004E754E714E714E711B
S3150001C52048E73F3C33C000A004F0598F420642431E
S3150001C5303E3900C0AD702A7C00C0A473287C00C0BF
S3150001C540A470267C00C0A46C247C00C0C7C2BE793E
S3150001C55000C0C7C46508BE7900C0C7CC630C1ABC4D
S3150001C5600002425442937C01606070003007D1930F
S3150001C570525410124880 3214B240654E20131412E0
S3150001C580488248C2D482068200029 8AC2042122810
S3150001C5900001E2A82E0038834293BE7900C0C7C6C7
S3150001C5A0640A7C010C1500026620601ABE7900C07F
S3150001C5B0C7CA640A0C15000166101A86600C7C0154
S3150001C5C00C1500026604 1ABC00010C39001F00801C
S3150001C5D0406C66047A016002420578001 8051A1556
S3150001C5E0488548C52004E788D084E588068000028E
S3150001C5F09CDC2205D281D285E589D0812240204A60
S3150001C60020D920D920914A066700017E303900C021
S3150001C610C7C8E84872003200D281068100029D3007
S3150001C620204 11C2800013007E84872003200D281FF
S3150001C630068100029D3020419C2800014A066700C0
S3150001C64014876012A7C00C0C7C3BC156F041C15BE
S3150001C650601210064880121548814441B0416C04AD
S3150001C6601C1544062A7C00C0A472DD150C15002594
S3150001C6706F041ABC00251E151EB900C0AD221F7914
S3150001C68000C0AD2300011F7900C0AD2400021F794F
S3150001C69000C0AD2500034A076C52440742066040BC
S3150001C6A01007488041D71206488148C1D1C142418D
S3150001C6B01210B0416F1A41D71006488048C0D1C048
S3150001C6C09E1041D71006488048C0D1C04210600E66
S3150001C6D041D71006488048C0D1C09F104207520674
S3150001C6E00C0600046C644A076F6060B44206605031
S3150001C6F01007488041D71206488148C1D1C142413D
S3150001C70012104441064 1001FB0416F2441D7100663
S3150001C7104880 48C0D1C0101044000600001F9E008A
S3150001C72041D71006488048C0D1C010BC001F600E1A
S3150001C73041D71006488048C0D1C0DF1042075206D3
S3150001C7400C0600046C044A076EA61E1713C7008068
S3150001C750406C13C700C0AD1E1E2F000113C7008019

S3150001C760406D13C700C0AD1F1E2F000213C7008006
S3150001C770406E13C700C0AD201E2F000313C70080F3
S3150001C780406F13C700C0AD213003588F33C000A0DE
S3150001C79004F24CDF3CFC4E754E714E714E7133C046
S3150001C7A000A004F442B900C0A46C427900C0A47090
S3150001C7B0423900C0A47208F9000400C0AD8313FC1D
S3150001C7C0000700C0AD8513FC000400C0AD8433C072
S3150001C7D000A004F64E754E714E714E7133C000A025
S3150001C7E004F808B9000400C0AD8333C000A004FA00
S3150001C7F04E754E714E714E7148E7273E33C000A00B
S3150001C80004FC4FEFFFD6427900C0A47633FC000A40
S3150001C81000C0A478247C00C0C7D042524252227C78
S3150001C82000C0AD6C41EF0010700520D951C8FFFC66
S3150001C83030914245300502400001E94808B900043B
S3150001C84000C0AD83817900C0AD82267C00C0A4748E
S3150001C850368513FC000700C0AD8508F90006008087
S3150001C8604062023900CF00804062 0279FC000080FC
S3150001C870407800790001008040783039008040 78A6
S3150001C880024003FF524072003200203C01312D006C
S3150001C8904EB900025BBC720AE2A8486F00084EB9A5
S3150001C8A00002422448790002 98EE487900C0AD3E64
S3150001C8B0486F000C4EB900021FAE486F0008486F62
S3150001C8C00008486F00084EB900021FC448574EB908
S3150001C8D000024D3A33C00080407E33F90080407E2D
S3150001C8E00080407C287C00C0C7CE38853E052A7C66
S3150001C8F0008040642C7C0080406C700030071DBCB9
S3150001C90000000800D08022000275F0FF18007000B8
S3150001C9103007D0800275FF00080052470C4700041B
S3150001C92065D8423900C0AD8442470279F0000080E3
S3150001C93040A6303900804 0A60800000F67F4303960
S3150001C940008040A602400FFFD15352470C4700100A
S3150001C95065D83013E84836800255F0FF38BC00012F
S3150001C960267C00804063600001E2702AC0F900C0A5
S3150001C970A47606400080024000FF0255FF00815563
S3150001C9800C54000566303015E0480240000F0C409B
S3150001C99000036606 34BC0004601C303C0F00C05521
S3150001C9A03015E0480240000F52400240000FE148B6
S3150001C9B00255F0FF81554A52660001561CB9000224
S3150001C9C09CD813FC000100C0AD84424616BC00FF92
S3150001C9D038BC000160000122427900C0AD766006D4
S3150001C9E04EB9000218600C79000800C0AD7665F0FA
S3150001C9F03E3900C0AD78BE790002A13064244240C0
S3150001CA00103900C0AD8453400C36001F000064127B
S3150001CA104240103900C0AD845340523600006000D8
S3150001CA2000D8BE790002A138632242401039 00C005
S3150001CA30AD8453404A3600006312424010 3900C0AB
S3150001CA40AD84534053360000600000AE3F3C0010F9
S3150001CA50610006423E00424010133207E04974006D
S3150001CA603401D48206820002A1402042B050631AEA
S3150001CA703207E04974003401D48206820002A140E3
S3150001CA8020421028000191136004 16BC00000C47D7
S3150001CA900C006304424660080C47080063065246D0
S3150001CAA04245605 40C47040063360C46000463306B
S3150001CAB052137E013015E0480240000F0240000F7C
S3150001CAC0E14872003207D2810275F0FF18008175C4
S3150001CAD0180052470C47000465DA38BC000260189A
S3150001CAE04A47631252453005534 00C400004630621
S3150001CAF0424538BC000542464A13630C0C540001FA
S3150001CB0066064A526700FED24A13660438BC00051F
S3150001CB104A5266280C5400026622610002AC388033
S3150001CB2008F90006008040620C540006660434BC15
S3150001CB3000020C540003660434BC00010C79004069
S3150001CB4000C0AD08640434BC00034A526700FE1CF1
S3150001CB500C520001660000F87C014247287C00C0A7
S3150001CB60AD2272003207700030 0719B618000800AE
S3150001CB70D0802400D281068100C0AD16204130B597
S3150001CB80280052470C47000465D8423900C0AD84DD
S3150001CB90427900C0AD7660064EB9000218600C7984
S3150001CBA0000800C0AD7665F0303900C0AD78486F39
S3150001CBB0000C02800000FFFF4EB90002422448 79B2
S3150001CBC0000298F2486F0010486F00104EB900023B
S3150001CBD01FAE486F00084EB900024D3A3E000C47A1
S3150001CBE00190631A600852143007E4489E400C47CE
S3150001CBF001C262F2600E53143007E448DE400C476E
S3150001CC00015E65F2103900804062E808020000 0307
S3150001CC1013C000C0AD2713D300C0AD2623F900C051
S3150001CC2000FA00C0AD28303900C09826907900C0BE
S3150001CC30982C33C000C0AD2C43EF0010207C00C0FF
S3150001CC40AD6C700520D951C8FFFC3091600242469 7
S3150001CC5008B9000600804062 0279FC000080407835
S3150001CC60007900640080407830064FEF002A33C017
S3150001CC7000A004FE4CDF7CE44E754E714E714E7180
S3150001CC8048E71F3E33C000A005004FEFFFEC247CB0
S3150001CC900804 07C3C122C7C0080407E3A16267C2B
S3150001CCA00080407830130240 03FF3B00424316 39B2
S3150001CCB000C0AD8442472A7C0080406C7200320776
S3150001CCC0700030071FB518000810207C00C0AD2287
S3150001CCD01BB00800180052470C47000465DE08F92E
S3150001CCE00000600804062 0253FC000053000130132D
S3150001CCF0024003FF524072003200203C01312D00F8
S3150001CD004EB900025BBC720AE2A8486F00084EB930
S3150001CD1000024224487900029 8EE487900C0AD3EEF
S3150001CD20486F000C4EB900021FAE486F0008486FED
S3150001CD300008486F00084EB900021FC448574EB993
S3150001CD4000024D3A3E003C87348713FC000400C0C4
S3150001CD50AD844EB9000218603F3C006461000336A1
S3150001CD603E00287C00C0A47A0C4708A062060C4746
S3150001CD700760640452546002425434863C85303C58
S3150001CD8003FFC0440253FC00815313C300C0AD84AA
S3150001CD9008B9000600804062 4247720032077000FF
S3150001CDA030071BB7181008005 2470C47000465EA04
S3150001CDB030144FEF001433C000A005024CDF7CF89D
S3150001CDC04E754E714E714E7148E73F3E33C000A01D
S3150001CDD005044FEFFFEE38390080407C363900807C
S3150001CDE0407E303900804078024003FF34002A7CBF
S3150001CDF000C0AD84424010153F4000107A0308F987
S3150001CE0000006008040620279FC000080407B0079CB
S3150001CE10000100804078303900804078024003FFED
S3150001CE2052407200320020 3C01312D004EB9000201
S3150001CE305BBC720AE2A8486F00084EB900024224A0
S3150001CE404879000298EE487900C0AD3E486F000C63
S3150001CE504EB900021FAE486F0008486F0008486FC0
S3150001CE6000084EB900021FC448574EB900024D3A98
S3150001CE703E0033C70080407E33C70080407C1ABC29
S3150001CE800001287C00C0A476267C0080406C247CAE
S3150001CE9000080406 42C7C00C0AD766000176424083
S3150001CEA01015534048C0D0800272FF00080042406E
S3150001CEB01015534048C0068000029CD820404240CD
S3150001CEC01015534017900000 1E3C008060000134 8D
S3150001CED04240100742461C15534648C6DC8632328C
S3150001CEE06800024100FF8041024000FF42411215E5
S3150001CEF0534148C1D2810272FF00180081721800A5
S3150001CF00425660064EB9000218600C56000865F4D8
S3150001CF103C3900C0AD784240101553 4048C0D0801E
S3150001CF2006800002A1302040BC50641C424010150E
S3150001CF3053400C33001F0000640E424010155 3404D
S3150001CF4052330000600000BC424010155340 48C0F7
S3150001CF50D0800680 0002A1382040BC50631A4240AE
S3150001CF6010155 3404A330000630E42401015 5340DA
S3150001CF7053330000600000 8C3F3C0010610001163 5
S3150001CF803C000C46080063324240100746404246C8
S3150001CF901C15534648C6DC8632326800024100FF42
S3150001CFA0C041024000FF42411215534148C1D2819E
S3150001CFB00272FF00180081721800E20F66444241B6
S3150001CFC01215534148C1D281303218000240 00FF88
S3150001CFD00C4000FF660A0C54FFFE67245354601C84
S3150001CFE0303C00FF424112155 34148C1D281C07203
S3150001CFF01800660E0C540002670652547A04600249
S3150001D0007A064A07630A4A7900C0C7D06700FEC29A
S3150001D01052150C15000564100C450003660A4A7981
S3150001D02000C0C7D06700FE784A7900C0C7D0670242
S3150001D0307A0733C40080407C33C30080407E303C95
S3150001D04003FFC0420279FC000080407881790080AC
S3150001D05040781AAF00110 8B90006008040624247C5
S3150001D06070003007720032070 68100C0AD222041F0
S3150001D07010B3080052470C47000465E430054FEF32
S3150001D080001233C000A005064CDF7CFC4E754E71C4
S3150001D0904E714E7148E73F0433C000A00508558F15
S3150001D0A0342F0022424338037C0033C400C0AD76DE
S3150001D0B060064EB9000218600C79000800C0AD7612
S3150001D0C065F042452A7C008040A660700255F0005A
S3150001D0D0424760025247 0C47EA606408301508006F
S3150001D0E0000F67F00C47EA5F620A300390440C4078
S3150001D0F0040063067C003A0260403E3C0FFF301597
S3150001D10002400FFF907900C0A4740640080042411 6
S3150001D110123900C0AD843E80700AE169D257CE4112
S3150001D120B64765044A4566023607B84762044A456A
S3150001D13066023807700030 07DC805245BA42658CBA
S3150001D1404A4266047C006010700030022200200 60C
S3150001D1504EB900025BBC2C003006548F33C000A0D0
S3150001D160050A4CDF20FC205F548F4ED04E714E7164
S3150001D1704E7133C000A0050C4A7900C0C7D06616AF

S3150001D180227C00C0A478321153514A41660833FC0F
S3150001D190000300C0C7D033C000A0050E4E754E7106
S3150001D1A04E714E7148E7073E33C000A005102A7C38
S3150001D1B000C0AD84424010155340240FFFC66009A
S3150001D1C000EE287C0080406C42401015534048C058
S3150001D1D0068000029CD82040424010155340199009
S3150001D1E000004245267C00C0AD76247C00029F30BB
S3150001D1F02C7C00C0C7C8425360064EB900021860B5
S3150001D2000C53000865F43E3900C0AD700C150001E1
S3150001D21066223016E84872003200D28120013C3283
S3150001D22008003007E84872003200D28120019C7262
S3150001D230080060283016E84872003200D281068163
S3150001D24000029D3020413C103007E8487200320050
S3150001D250D281068100029D3020419C50424010152A
S3150001D260534042471E340000DE46303CFFE0C047D3
S3150001D27067164A466F047E1F600242074240101538
S3150001D28053401987000060 0A424010155340198720
S3150001D29000000C46FFFF670A4A4667060C46000176
S3150001D2A066027A0A52450C45000A6500FF4A33C0F8
S3150001D2B000A005124CDF7CE04E754E714E714E7129
S3150001D2C048E73F3E33C000A005144FEFFFD6760175
S3150001D2D0227C00C0AD6C41EF0010700520D951C809
S3150001D2E0FFFC309108B9000400C0AD8313FC0007B0
S3150001D2F000C0AD852C7C00C0AD844216247C008024
S3150001D300406208D20006021200CF303C03FFC04340
S3150001D3100279FC00008040788179008040783039BC
S3150001D32000804078024003FFD04372003200203C67
S3150001D33001312D004EB900025BBC720AE2A8486FAA
S3150001D34000084EB900024224487900029 8F648794D
S3150001D35000C0AD3E486F000C4EB900021FAE486FCB
S3150001D3600008486F0008486F00084EB900021FC444
S3150001D37048574EB900024D3A3E003C0733C600807D
S3150001D380407E33C60080407C70003007D08072003A
S3150001D39032074EB90002625E7214E2A028003F0411
S3150001D3A04EB90001D0943A003E032A7C00C0AD225A
S3150001D3B0287C00804064267C00C0A47C303CFFFFB2
S3150001D3C0D04772003200200 1323CFFFFD247740081
S3150001D3D03401068200804 06C204210B508001C878B
S3150001D3E06100FDC23F044EB90001D09436803C3C39
S3150001D3F00FFF904506400800CC400C460500650A23
S3150001D4000C460B0062044A53660842437E056000DF
S3150001D41001140C4607C065080C460840630000AEBF
S3150001D4200C4608006450303CFFFFD04772003200C2
S3150001D430D28130341800024000FF0C4000FF6436F0
S3150001D440303CFFFFD04772003200D28130341800E1
S3150001D450024000FF5240024000FF323CFFFFD2472C
S3150001D46074003401D48222020274FF001800817410
S3150001D4701800600000B00C460800650000A8303CAA
S3150001D480FFFFD04772003200D281303418000240CB
S3150001D49000FF4A406300008E303CFFFFD047720018
S3150001D4A03200D28130341800024000FF534002405E
S3150001D4B000FF323CFFFFD24774003401D4822202BE
S3150001D4C00274FF001800817418006058 3A13303C4A
S3150001D4D0FFFFD04772003200D2813034180002407B
S3150001D4E000FF024000FF323CFFFFD24774003401C7
S3150001D4F0D482068200C0AD1620420250FF00815040
S3150001D500303CFFFFD04772003200068100804 06C3C
S3150001D5102041303CFFFFD04772003200200 11B90B2
S3150001D520080052470C4700056500FE9242164279F3
S3150001D53000C0AD7660064EB9000218600C7900088D
S3150001D54000C0AD7665F0303900C0AD78486F000C8B
S3150001D55002800000FFFF4EB9000242244879000212
S3150001D56098FA486F0010486F00104EB900021FAEBE
S3150001D570486F00084EB900024D3A3E000C47019033
S3150001D580631A600852153007E4489E400C4701C2F1
S3150001D59062F2600E53153007E448DE400C47015E27
S3150001D5A065F2089200061012E8080200000313C093
S3150001D5B000C0AD2713F90080406300C0AD2623F9F2
S3150001D5C000C000FA00C0AD28303900C09826907915
S3150001D5D000C0982C33C000C0AD2C43EF0010207C56
S3150001D5E000C0AD6C700520D951C8FFFC309102799D
S3150001D5F0FC000080407800790064008040783003A8
S3150001D6004FEF002A33C000A005164CDF7CFC4E7597
S3150001D6104E714E714E7133C000A0051833C000A083
S3150001D620051A4E754E714E714E7148E7073C33C06F
S3150001D63000A0051C4FEFFFE647EF00122A4B2C39DD
S3150001D64000804074287C00C0A47E4A866C087A015A
S3150001D6502E06448760044 2452E064A45570000A609
S3150001D660224C204B20D92091204D2039000298FED2
S3150001D67022072C022401C4C0D5A800044282D58207
S3150001D680D59024014842484 0C4C0D5902401C4C065
S3150001D69048404841C0C14281D480D3814841484273
S3150001D6A032024242D5A800042410D5812082240 6E4
S3150001D6B0224B204C20D92091204D2039000299027D
S3150001D6C022072C022401C4C0D5A800044282D582B7
S3150001D6D0D590240148424840C4C0D5902401C4C015
S3150001D6E048404841C0C14281D480D3814841484223
S3150001D6F032024242D5A800042410D58120822 40694
S3150001D700600000A2224C204B20D92091204D2039C7
S3150001D710000298FE22072C022401C4C095A8000429
S3150001D7204282D5829590240148424840C4C09590D2
S3150001D7302401C4C048404841C0C14281D480D3813C
S3150001D74048414842320242429 5A80004241095817C
S3150001D75020822406224B204C20D92091204D2039AD
S3150001D760000299022 2072C022401C4C095A80004D4
S3150001D7704282D5829590240148424840C4C0959082
S3150001D7802401C4C048404841C0C14281D480D381EC
S3150001D79048414842320242429 5A80004241095812C
S3150001D7A0208224062E132A7C00C0A486BEB900C09E
S3150001D7B0A48C6508BEB900C0A48863703F3C0022F2
S3150001D7C042401039008040705240486F000A48C0FC
S3150001D7D04EB900024204486F000A487900C0185643
S3150001D7E0486F000E4EB900021FAE48790002990635
S3150001D7F0486F000A486F000A4EB900021FC4204F45
S3150001D8002F28000243EF00144EB900024A34486F34
S3150001D810000E4EB900024D3A288042B900C0A482DA
S3150001D8202E141ABC0014423900C0A48733C70080E5
S3150001D83040722007721 0E2A813C0008040714A3975
S3150001D84000C000FD660261224A156308531542397C
S3150001D85000C0A4874FEF001A33C000A0051E4CDF9D
S3150001D8603CE04E754E714E714E7133C000A00520DD
S3150001D8704FEFFFEA3F3C002242401039008040 70E2
S3150001D8805240486F000E48C04EB900024204487922
S3150001D89000002990A487900C01856486F00124EB91D
S3150001D8A000021FAE486F000E486F000E486F000E53
S3150001D8B04EB900021FAE4879000299064 86F000A68
S3150001D8C0486F000A4EB900021FC4204F2F280002DC
S3150001D8D043EF00184EB900024A34486F00124EB9A0
S3150001D8E000024D3A23C000C0A4883F3C00224240BA
S3150001D8F0103900804070524048 6F000E48C04EB942
S3150001D90000024204487900029 90E487900C018566F
S3150001D910486F00124EB900021FAE486F000E486FE5
S3150001D920000E486F000E4EB900021FAE4879000284
S3150001D93099064 86F000A486F000A4EB900021FC4D3
S3150001D940204F2F2800024 3EF00184EB900024A3437
S3150001D950486F00124EB900024D3A23C000C0A48C94
S3150001D9604FEF001633C000A005224E754E714E7161
S3150001D9704E7148E707043 3C000A005244FEFFFEEC0
S3150001D98013FC001700804070 3F3C00224240103 9D2
S3150001D99000804070524048 6F000A48C04EB90002EC
S3150001D9A04204486F000A487900C01856486F000EB5
S3150001D9B04EB900021FAE4879000299064 86F000A67
S3150001D9C0486F000A4EB900021FC4204F2F280002DB
S3150001D9D043EF00144EB900024A34486F000E4EB9A7
S3150001D9E000024D3A23C000C0A47E42B900C0A48201
S3150001D9F02C3900C0A47E13FC001400C0A48661006B
S3150001DA00FE6A700023C0008040742A7C00804010AA
S3150001DA102015E0882E007003C0957218E3A8DE80F9
S3150001DA202A0760102015E0882E007003C095721831
S3150001DA30E3A8DE800839000700804024661020072D
S3150001DA409085028003FFFFFF7203B08165D633C65E
S3150001DA50008040722006721 0E2A813C00080407157
S3150001DA6008B90007008040244FEF001233C000A020
S3150001DA7005264CDF20E04E754E714E714E7148E71A
S3150001DA803F3E33C000A005284FEFFFE82A7C00C0C7
S3150001DA90AD102C3C001000008D9542474EB9000296
S3150001DAA0186052470C47004065F2303C0FFFC079C1
S3150001DAB000C0AE82662A3F3900C0C9004EB90001D6
S3150001DAC0998402800000FFFF80FC0FA048400240BD
S3150001DAD00FFF0279F00000C0AE82817900C0AE82EC
S3150001DAE042473A07CAFC004C227C00029BA8D3C5D8
S3150001DAF0207C00C0C692D1C5701220D951C8FFFC46
S3150001DB00780038072004D080D084E788068000E0BA
S3150001DB1000F82240207C00C0C692D1C5700520D9EC
S3150001DB2051C8FFFC52470C47000465B6267C00C06D
S3150001DB30AD0836BC02580095000140800239000F3D
S3150001DB4000C0AE9113FC000100C0AE90287C00C05D
S3150001DB50B1A8247C00C0AD142C7C00C0AE942A3C34
S3150001DB60011F880283C00010000263CA51EBD914D
S3150001DB70243C8001D8002015C086673242476008E0
S3150001DB804EB90002186052470C470064640620151E
S3150001DB90C08666EC2015C086670E08AD000400013C

S3150001DBA008ED00060001600608AD0006000136BC5E
S3150001DBB0025808ED0007000336BC012C60000392F1
S3150001DBC008950007082D0006000267164EB90001E8
S3150001DBD0F2800C8000000384630289950 8AD00067B
S3150001DBE000022015C0846614203900C000FA90B9DD
S3150001DBF000C0AD280C8000000384636C4EB900019F
S3150001DC00D2C04A40660808ED00070002600833FCEE
S3150001DC10000100C0C7D0227C00C0AD1641D77005F7
S3150001DC2020D951C8FFFC43D7424010123200C2FC32
S3150001DC30004C068100C0C6922041700520D951C80A
S3150001DC40FFFC7E001E1243D72007D080D087E788CD
S3150001DC50068000E000F82040700520D951C8FFFC7D
S3150001DC6008AD000000018D95082D00070002670030
S3150001DC7000844EB90001C7F84A406754227C00C0AF
S3150001DC80AD1641D7700520D951C8FFFC43D7424094
S3150001DC9010123200C2FC004C068100C0C69220411F
S3150001DCA0700520D951C8FFFC7E001E1243D72007FC
S3150001DCB0D080D087E788068000E000F82040700514
S3150001DCC020D951C8FFFC8D9508AD00070001601EE3
S3150001DCD008ED000700010C12000365084239 00C077
S3150001DCE0AD15600A1012520013C000C0AD150295A1
S3150001DCF000007FFF08150002670C610008986100AB
S3150001DD0009100895000 2082D0007000367000 1109D
S3150001DD10423900C0AE922CB900C0AD3623F900C01D
S3150001DD20C8FE00C0AE844247600000BA61000866C2
S3150001DD30610008DE6100098C3880700DC02C00017D
S3150001DD4066044A546668082C00020001670C2CB967
S3150001DD5000C0AD3636BC001E600A2CB900C0AD3A13
S3150001DD6036BC1E004A5467060C540001662E303933
S3150001DD7000C0B07E720CE268024000 0F72003200F1
S3150001DD80E58906810002997622412051 4E908154FF
S3150001DD9067060C540001660461000B60082D000340
S3150001DDA0000367340295FFFFFF378D95602A0C54F7
S3150001DDB000026624082D0006000366164A1257C0A3
S3150001DDC04400488013C000C0AD1508ED00060002EE
S3150001DDD060062CB900C0AD36524736BC00AA4EB912
S3150001DDE0000218600C4700146424082D0007000384
S3150001DDF0671C203900C000FA90B900C0AD280C801C
S3150001DE0000000038464082015C0826700FF200C47C8
S3150001DE1000146500013636BC00056000012E082D90
S3150001DE20000500026704610001 4A082D0004000292
S3150001DE30670000DA08AD0004000208D500014EB9FA
S3150001DE400001F328082D0002000267483F3C00004C
S3150001DE504EB90001F50C2F0361000BCE2F3900C01E
S3150001DE60AE8461000BC42F3900C0AE8461000B5E25
S3150001DE703F0061000C000815000067522F3900C0F1
S3150001DE80AE8861000BA42F3900C0AE8861000B3E3D
S3150001DE903F0060363F3C00004EB90001F50C2F03F0
S3150001DEA061000B86082D00010002670 64878FFFF16
S3150001DEB0600242A761000B72082D0001000267068D
S3150001DEC03F3CFFFF60043F3C000061000BA84EB9D8
S3150001DED00001F55660064EB9000218600C53000A9F
S3150001DEE063062015C08567EE0295FCFFFBFF600601
S3150001DEF04EB900021860303900804008080000 0E53
S3150001DF00670A203C00200030C09566E4082D000316
S3150001DF1000026736227C00029912207C00C0C16E85
S3150001DF20700820D951C8FFFC4EB90001F7F008ADC1
S3150001DF3000030002600 64EB9000218600C53000A85
S3150001DF4063062015C08567EE8D954EB900021860EF
S3150001DF500C5300056200FC6A6000FC1C4FEF0018C0
S3150001DF6033C000A0052A4CDF7CFC4E754E714E7104
S3150001DF704E712F0D33C000A0052C610006186100FB
S3150001DF8006902A7C00C0AD1008ED0005000223F9B9
S3150001DF9000C0AD3200C0AE9433FC003C00C0AD08F9
S3150001DFA023F900C0AE8000C0BFC0303900C0AE80CA
S3150001DFB0720CE2680240000F72003200E5890681A8
S3150001DFC000029936224120514E9008AD000500020B
S3150001DFD008ED0004000160064EB900021860082D24
S3150001DFE00000400016 6F2303900C0B1A833C000A0B8
S3150001DFF0052E2A5F4E754E714E714E7133C000A0CB
S3150001E0000530303C0FFFC07900E000F60279F000E0
S3150001E01000C0AE82817900C0AE8223F900C0C8FE7D
S3150001E02000C0AE8433C000A005324E754E714E71EC
S3150001E0304E7133C000A0053433C000A005364E75BD
S3150001E0404E714E714E7133C000A0053833C000A029
S3150001E050053A4E754E714E714E7133C000A0053CA6
S3150001E060303900C0AE8202400FFF33C000E000F637
S3150001E07033C000A0053E4E754E714E714E7133C0D0
S3150001E08000A005400279FF0000C0BFC008F90000EA
S3150001E09000C0BFC16100086461000 62833C000A04A
S3150001E0A005424E754E714E714E7133C000A0054446
S3150001E0B023F900C0B07E00C0BFC00279FF0000C0D6
S3150001E0C0BFC008F9000100C0BFC123F900C0C8FEE6
S3150001E0D000C0BFC4424033C000A005464E754E7114
S3150001E0E04E714E7133C000A005480279FF0000C091
S3150001E0F0BFC00079003000C0BFC0610007FE6100EB
S3150001E10005C2424033C000A0054A4E754E714E719C
S3150001E1104E7133C000A0054C700133C000A0054EFE
S3150001E1204E754E714E714E712F0733C000A00550CA
S3150001E1300279FF0000C0BFC00079000300C0BFC064
S3150001E14023F900C0AE8C00C0BFC823F900C0AE8859
S3150001E15000C0BFC4610007A4610005683E0033C06A
S3150001E16000A005522E1F4E754E714E714E7148E735
S3150001E170010C33C000A00554287C00C0BFC0227C1E
S3150001E18000C0B07E204C20D920D920912F3900C063
S3150001E190BFC46100091A2A404A806724487900C031
S3150001E1A0BFCC2F3900C0BFC82F0D61000 9523E00F8
S3150001E1B07003D047024000FF0254FF008154600EF5
S3150001E1C00254FF000054000342B900C0BFC84240D8
S3150001E1D033C000A005564CDF30804E754E714E712E
S3150001E1E04E7133C000A00558610007106100 04D4C8
S3150001E1F033C000A0055A4E754E714E714E7133C033
S3150001E20000A0055C424033C000A0055E4E754E710C
S3150001E2104E714E7133C000A005600279FF0000C047
S3150001E220BFC008F9000100C0BFC123F900C0AE8814
S3150001E23000C0BFC4610006C4610004 8833C000A0E9
S3150001E24005624E754E714E714E712F0D33C000A091
S3150001E25005642F3900C0B082610008542A4023DDCD
S3150001E26000C0BFC423D500C0BFC823F900C0B07E1B
S3150001E27000C0BFC00279FF0000C0BFC00079000323
S3150001E28000C0BFC0424033C000A005662A5F4E757C
S3150001E2904E714E714E7133C000A005680279FF00C0
S3150001E2A000C0BFC00079000300C0BFC023F900C091
S3150001E2B0AE8800C0BFC423F900C0AE8C00C0BFC881
S3150001E2C061000638610003FC33C000A0056A4E7583
S3150001E2D04E714E714E712F0D33C000A0056C2F3952
S3150001E2E000C0B082610007C82A4023D500C0BFC460
S3150001E2F023F900C0B07E00C0BFC00279FF0000C094
S3150001E300BFC008F9000100C0BFC1424033C000A030
S3150001E310056E2A5F4E754E714E714E7133C000A067
S3150001E32005706100 05D66100039A33C000A005722D
S3150001E3304E754E714E714E7133C000A00574424048
S3150001E34033C000A005764E754E714E714E7133C0C5
S3150001E35000A00578610005A46100036833C000A030
S3150001E360057A4E754E714E714E7133C000A0057C13
S3150001E370424033C000A0057E4E754E714E714E71FE
S3150001E38033C000A00580610005726100033633C009
S3150001E39000A005824E754E714E714E7133C000A0BC
S3150001E3A00584424033C000A005864E754E714E71FC
S3150001E3B04E7133C000A0058861000540610003 0469
S3150001E3C033C000A0058A4E754E714E714E7133C031
S3150001E3D000A0058C424033C000A0058E4E754E71DB
S3150001E3E04E714E7133C000A005900279FF0000C046
S3150001E3F0BFC008F9000100C0BFC123F900C0AE8447
S3150001E40000C0BFC4610004F4610002B833C000A0BB
S3150001E41005924E754E714E714E7133C000A0059432
S3150001E4204241203900C0AE84B0B900C0B082670451
S3150001E43072086056303CF000C07900C0B08066308A
S3150001E440227C00E000F6303900C0B08002400FFFA8
S3150001E4503280024 00FFF0279F00000C0AE8281795E
S3150001E46000C0AE82303900C0AE8202400FFF32805A
S3150001E47023F900C0B07E00C0BFC00279FF0000C012
S3150001E480BFC008F9000100C0BFC1300133C000A000
S3150001E49005964E754E714E714E7133C000A00598AA
S3150001E4A0610004586100021C33C000A0059A4E7534
S3150001E4B04E714E714E7133C000A0059C700133C080
S3150001E4C000A0059E4E754E714E714E7133C000A06F
S3150001E4D005A0610004266100 01EA33C000A005A27F
S3150001E4E04E754E714E714E7133C000A005A4700178
S3150001E4F033C000A005A64E754E714E714E7133C0E4
S3150001E50000A005A8610003F4610001B833C000A0B2
S3150001E51005AA4E754E714E714E7133C000A005AC01
S3150001E520700133C000A005AE4E754E714E714E712D
S3150001E53033C000A005B0610003C26100018633C08B
S3150001E54000A005B24E754E714E714E7133C000A0DA
S3150001E55005B4700133C000A005B64E754E714E71FB
S3150001E5604E7133C000A005B8610003906100 0154EB
S3150001E57033C000A005BA4E754E714E714E7133C04F
S3150001E58000A005BC700133C000A005BE4E754E71DA
S3150001E5904E714E7148E7010433C000A005C02A7CC4
S3150001E5A000C0AD1060064EB90002186008150006DD
S3150001E5B06706081500046 6EE227C000299D6207CC7

S3150001E5C000C0B07A706B20D951C8FFFC3091424728
S3150001E5D0227C000299D63007C1FC01B2068000C038
S3150001E5E0B22C2040706B20D951C8FFFC30915247A4
S3150001E5F00C4700086DDA33FC000200C0B1A833C035
S3150001E60000A005C24CDF20804E754E714E714E71D1
S3150001E61033C000A005C460064EB9000218600839 6F
S3150001E620000600C0AD10670A0839000300C0AD102E
S3150001E63066E6227C000299D6207C00C0BFBC706BC6
S3150001E64020D951C8FFFC309133C000A005C64E75D4
S3150001E6504E714E714E7148E7010C33C000A005C8DA
S3150001E6602A7C00C0AD102E3C200000008F95287C2E
S3150001E67000C0AD0C28B900C0AE9460064EB90002C8
S3150001E68018602015C087670A4A94630608150007B3
S3150001E69067EA4A94630A2015C08766044247600EFA
S3150001E6A00815000767063E3C010060027E0230073E
S3150001E6B033C000A005CA4CDF30804E754E714E71D5
S3150001E6C04E7148E73F3E33C000A005CC4FEFFFF641
S3150001E6D04EB90001F7F0287C00C0AD10247C00C0C3
S3150001E6E0B1A86100FF720C40010067104A4067142F
S3150001E6F00C400002670001DE600001DC3E3C0100C7
S3150001E700600001D442477C01780136073A03267C32
S3150001E71000C0B19A4DEF000B600001684EB90002D1
S3150001E7201860303900C0B074B046641E30390080BC
S3150001E73040080800000E6712082C00000003670A53
S3150001E7404A466F060C4600286DD24A4366164A456C
S3150001E750671270030837000408006 7080C470003B6
S3150001E7606D02760142562A7C00C0B22C426F00042B
S3150001E770300748C0E5882F3508046100025041ED95
S3150001E78000C4340748C2D482D1C23210B240670AEB
S3150001E79008ED0002012E600000B04A43670489AD0D
S3150001E7A001204A456646302D0004024000FF3C0028
S3150001E7B0302D0004720CE2680240000F3F40000653
S3150001E7C0082C000700036704740060027401 20 22C
S3150001E7D0ED88068000C0C954322F000648C1E5897C
S3150001E7E0D08120402E9023D500C0B07A082D000399
S3150001E7F00004670C08ED0000012F08EA0000000183
S3150001E8004A6F00046642524530 0748C0E588320720
S3150001E81048C1E589068100C0B07E204120B50804C3
S3150001E82043ED00C4300748C0D080D3C0300748C08C
S3150001E830D080068000C0B13E204030913F7C00016F
S3150001E84000044A43670289934A6F0004671252B96A
S3150001E85000C0064023F900C000FA00C0063C601063
S3150001E86052B900C0065023F900C000FA00C0064C98
S3150001E87052564BED01B20C5600086D00FEF452479C
S3150001E880E7ACBE466D00FE9C70030837000408 0025
S3150001E89067122F132F3900C0AE8C610002B023C05E
S3150001E8A000C0B19E424770030837000008 00671A8E
S3150001E8B0303900C0AE8202400FFF323900C0B0804D
S3150001E8C002410FFFB04167027E08BA46670808C7D2
S3150001E8D0000260027E020814000 6670408D40004E0
S3150001E8E0348730074FEF000A33C000A005CE4CDF56
S3150001E8F07CFC4E754E714E714E7148E7011C33C05A
S3150001E90000A005D023FCA51EBD9100C0BFBC287C7C
S3150001E91000C0AD1008140006670408D400034EB900
S3150001E9200001F3283F3C00004EB90001F50C2F39D8
S3150001E93000C0BFBC610000F22A7C00C0BFC04247D4
S3150001E940267C00C0C08060242F15610000DC2F1DCD
S3150001E950617A320748C1D2813780 1800300748C032
S3150001E960D0803F3308006100010C5247303900C0A6
S3150001E970BFC0024000FFBE4065CE4EB90001F5564C
S3150001E980082C00070003660E08EC0002000360066F
S3150001E9904EB9000218600814000 7661E4A7900C0C5
S3150001E9A0AD8A631630390080400808 00000E670AF8
S3150001E9B0203C00200030C09466D633C000A005D2AA
S3150001E9C04CDF38804E754E714E714E7148E71F000F
S3150001E9D033C000A005D42C2F0018383C00FF424755
S3150001E9E03A0742431606DE473F034EB90001696AFC
S3150001E9F08E40B744E08E52450C4500046DE470002C
S3150001EA003007D0800680000299B620403E108E4421
S3150001EA10300733C000A005D64CDF00F8205F588FC1
S3150001EA204ED04E714E714E7148E7030033C000A0BF
S3150001EA3005D852B900C0065823F900C000FA00C033
S3150001EA4006542E2F000C4246424010073F004EB995
S3150001EA500001F50CE08F52460C4600046DEA33C006
S3150001EA6000A005DA4CDF00C0205F588F4ED04E71F2
S3150001EA704E714E712F0733C000A005DC3E2F0008F2
S3150001EA80424010073F004EB90001F50CE04F4240ED
S3150001EA9010073F004EB90001F50C33C000A005DE9A
S3150001EAA02E1F205F548F4ED04E714E714E7148E726
S3150001EAB0000C33C000A005E0302F000C720CE26898
S3150001EAC00240000F72003200E589068100C0ACC821
S3150001EAD020412A50200D670C204F2F28000C4E95FF
S3150001EAE02840600299CC200C33C000A005E24CDF1F
S3150001EAF03000205F588F4ED04E714E714E7148E7EF
S3150001EB00050033C000A005E4206F0014226F000C3D
S3150001EB1042452009671C7E013205202F0010C0875F
S3150001EB20670420D152455241DE8758890C410020A5
S3150001EB306DE8300533C000A005E64CDF00A0205F7C
S3150001EB404FEF000C4ED04E714E714E7148E70300E7
S3150001EB5033C000A005E8222F00107C007E01202F83
S3150001EB60000CC087670A0801000067028C87E289EA
S3150001EB70DE8766EA200633C000A005EA4CDF00C046
S3150001EB80205F508F4ED04E714E714E7148E7050091
S3150001EB9033C000A005EC206F000C226F0014424523
S3150001EBA02009671C7E013205202F0010C0876704EB
S3150001EBB0229852455241DE8758890C4100206DE862
S3150001EBC0300533C000A005EE4CDF00A0205F4FEFFB
S3150001EBD0000C4ED04E714E714E7148E7C3FC33C0E6
S3150001EBE000A005F0287C0080400008AC0007007BEF
S3150001EBF02A7C00C0AD10247C00C0AD8A082D00041B
S3150001EC00000367542 67C00C0AD883013B052651CE2
S3150001EC10B052663C08150001672808150000670810
S3150001EC200440000C368060045D403680700030136D
S3150001EC30068000C0AD8C2040195000A35253600 0DD
S3150001EC400178197C000000A336BC00F06000016A5F
S3150001EC50610008686000015E082D00050001671467
S3150001EC60610006FA08ED0005000308AD0005000184
S3150001EC7060000146082D0005000367200C5200F0D4
S3150001EC80671008AD0005000308ED000400036000ED
S3150001EC900128197C000000A36000011E082D000454
S3150001ECA00001671A082D00000003670461000B8A42
S3150001ECB0610008C208AD000400016000 00FC267C6A
S3150001ECC000C0ACC0082D00020001671A4253082D8E
S3150001ECD00002000367 0000E261000A860295FFFB5D
S3150001ECE0FFFB600000D4082D00020003670E6100DF
S3150001ECF00A7008AD0002000360000 0BE082D000086
S3150001ED00000367 0000B0083900000 0C0AD5F660E61
S3150001ED10083900030 0C0AD5F66044247600842 47F8
S3150001ED201E3900C0AD2F4240102C007A0240000F60
S3150001ED3042411239 00C0AD4CD247B041671408AD0B
S3150001ED40000000 00308ED0002000108ED00020003C7
S3150001ED5060664246 1C3900C0AD2F207C0002A180AE
S3150001ED601E306000488760445253 0C5302006D0206
S3150001ED704253301348C0E588068000C0A4982A4053
S3150001ED8041EC0080300748C0D080D1C03A9041ECB8
S3150001ED90009030 0748C0D080D1C03B50000 2207C93
S3150001EDA00002A18410306000488 0DE400C47000854
S3150001EDB06DB66004610007BE4A7900C0C8B4660832
S3150001EDC033FC000100C0C8B433C000A005F24CDF1B
S3150001EDD03FC34E734E714E714E7148E7033E33C0C9
S3150001EDE000A005F4598F267C00C0AD10247C00C01C
S3150001EDF0ACC22C3C200000002013C08667000376BD
S3150001EE002A7C00C0AD0C4A956700036A53956000E1
S3150001EE1003645252 0C5202006D0242524A3900C03A
S3150001EE20B0786316523900C0B0790C39000700C0BA
S3150001EE30B07963064239 00C0B0792C7C00C0A49831
S3150001EE40301248C0E588D08E2A4070F8D052024070
S3150001EE5001FF48C0E588D08E284030159054 33C054
S3150001EE6000C0ACB8302D0002906C000233C000C067
S3150001EE70ACBA301272001239 00C0AD2F0681000201
S3150001EE80A188204112104881904102400 1FF48C0EB
S3150001EE90E588D08E284030159054 33C000C0ACBCF4
S3150001EEA0302D0002906C000233C000C0ACBE227C43
S3150001EEB000C0A490207C00C0A494428030 3900C0D8
S3150001EEC0ACBC6C024440D191C0C0D1904280303973
S3150001EED000C0ACBE6C024440D191C0C0D190082B99
S3150001EEE000000000 26750082B0003000167083E3945
S3150001EEF000C0ACBC60063E3900C0ACB82A7C00C07C
S3150001EF00ACC570001015E988068000C0C192720771
S3150001EF10C25248C1D281D08120403087 7007C02AB1
S3150001EF200010C000007660E52150C15004065061F
S3150001EF300293FFF7FEFF700FC02A0001667A20399F
S3150001EF4000C0A494E88823C000C0AD7E2A7C00C01E
S3150001EF50AD7A203900C0A490E8883A804A40631A05
S3150001EF60203900C0AD7E720032154EB900025BBC7D
S3150001EF70D081E28833C000C0AD7C42B900C0A49400
S3150001EF8042B900C0A4900839000100C0AD836728CA
S3150001EF90303900C0AD7CD0403E002A7C00C0AD3E79
S3150001EFA03B47000A3B47000C33ED000A008040A8AE
S3150001EFB033ED000C008040AA7007C0523200C3FC3A
S3150001EFC001B2068100C0B22C2A41287C00C0B0746F
S3150001EFD02C7C00C0B06E2013C08667000098 2015F7

S3150001EFE0E2882A807007C03900C0ACC31B400130DB
S3150001EFF04A7900C0ACB86F0408D500070C95A51E6B
S3150001F000BD9166185239O0C0B078103900C0B07889
S3150001F0105300661633D200C0B076600E4A3900C07E
S3150001F020B078630608ED0001012F4A3900C0B078B7
S3150001F030630001420C39000700C0B079660001365 1
S3150001F04008930005700 12C80427900C0B0724254C9
S3150001F0504A3900C0B07852C04400488002400001DD
S3150001F060EF4808B9000700C0AD83817900C0AD82C1
S3150001F070600001024A96674A0C9600000001660A82
S3150001F08070003014E58842B508044A7900C0ACB86E
S3150001F0906F0C221670003014E58883B508040C390C
S3150001F0A0000700C0B079660000CC2016D0802C8005
S3150001F0B04A80660000C033FC000100C0B0726000E7
S3150001F0C000B44A7900C0B072670000A80C7900014B
S3150001F0D000C0B072660E41ED00C470003014D080DD
S3150001F0E0D1C042504A7900C0ACB86F14303900C063
S3150001F0F0B07241ED00C472003214D281D1C1815087
S3150001F10008130001673408130000662E2F2D000432
S3150001F1104EB90001E9CC322D00C4B240661C202D47
S3150001F1200004B0B900C0AE886610301248C0E58848
S3150001F130068000C0C172204052900C39000700C001
S3150001F140B0796630E3F900C0B072662870012C8090
S3150001F15008130001671008130000 6618D1B900C032
S3150001F160C16E4254600E5254301453400C40002874
S3150001F17065028D9330390080400808000 00E67143F
S3150001F180082B00000003670C3012B07900C0ACC038
S3150001F1906600FC80588F33C000A005F64CDF7CC0AA
S3150001F1A04E754E714E714E712F0D33C000A005F88C
S3150001F1B02A7C00C0AD084A55632A53554A55631245
S3150001F1C04A7900C0C8B2661C33FC000100C0C8B24F
S3150001F1D0601242A73F3C00003F3C001D4EB90000B3
S3150001F1E07D7A4E4033C000A005FA2A5F4E754E71F6
S3150001F1F04E714E7133C000A005FC33C000A005FE60
S3150001F2004E754E714E714E7133C000A00600227CC0
S3150001F21000C0FB3E22BC00C0FF422051213C000140
S3150001F220DA7E228890FC002C228833C000A00602D8
S3150001F2304E754E714E714E7133C000A0060433C037
S3150001F24000A006064E754E714E714E7133C000A078
S3150001F250060808B900020080407B0239003F0080A1
S3150001F26040A208F90007008040A208F900020080C8
S3150001F270407B33C000A0060A4E754E714E714E7129
S3150001F28048E7011C33C000A0060C2A7C00C0AD155E
S3150001F290287C00C0C692267C00C0AD141013B015A0
S3150001F2A0671C227C00C0AD1642411200 3001C0FC31
S3150001F2B0004CD08C2040701220D951C8FFFC7E0032
S3150001F2C01E152007D080D087E788068000E000F869
S3150001F2D0224042401015320 0C2FC004CD28C204123
S3150001F2E0700520D951C8FFFC424010153200C2FCFE
S3150001F2F0004CD28C2241207C00C0AD16701220D960
S3150001F30051C8FFFC1695610003E8203900C000FAD8
S3150001F31090B900C0AD2833C000A0060E4CDF38807E
S3150001F3204E754E714E714E7133C000A006106100CC
S3150001F330052C427900C0AD86427900C0AD8833FC08
S3150001F34000F000C0AD8A08F9000500C0AD1133C058
S3150001F35000A006124E754E714E714E7148E70118A6
S3150001F36033C000A00614267C00C0AD60103900C071
S3150001F370AD5C1213E80902010003D0010200000F7F
S3150001F380021300F0811333F900C0AD5E0080404ADC
S3150001F390287C00C0AD4E33EC00040080407C33EC89
S3150001F3A000060080407E303C03FFC06C00080279F5
S3150001F3B0FC00008040788179008040783 3EC000AB7
S3150001F3C0008040A833EC000C008040AA43EC000FFB
S3150001F3D01011EA0802000001424112000241000137
S3150001F3E00279FFFE008040A48379008040A41011B9
S3150001F3F0E8080200000142411200024 10001E94908
S3150001F4000279FFEF008040A48379008040A41011A7
S3150001F410E20802000001020000 01D00008B9000163
S3150001F4200080407B81390080407B103900C0AD5C93
S3150001F4301213E80902010003D00113C00080407ACB
S3150001F440227C008040A21013EC0802000003020097
S3150001F4500003ED080211003F8111207900C0C92087
S3150001F460302800020800000C67047E0360027E0259
S3150001F4707003C007ED080211003F81111013E8085F
S3150001F48002000003020000 03E908021100CF811106
S3150001F490101302000 00F0200000F021100F081118B
S3150001F4A008F900000080407B33C000A006164CDF3F
S3150001F4B018804E754E714E714E7133C000A00618FC
S3150001F4C00239003F008040A208F90007008040A2EF
S3150001F4D00279FC0000804078007900640080407861
S3150001F4E013FC00020080407A08B900000080407BCE
S3150001F4F008B9000400C0AD13427900C0AD8A33C01B
S3150001F50000A0061A4E754E714E714E7133C000A0A1
S3150001F510061C227C00C0AD860C5100EF64127000FF
S3150001F5203011068000C0AD8C204010AF000552514D
S3150001F530227C00C0AD10082900040003660608E914
S3150001F5400005000133C000A0061E205F548F4ED077
S3150001F5504E714E714E7133C000A0062033F900C0C2
S3150001F560AD8600C0AD8A33C000A006224E754E712D
S3150001F5704E714E7133C000A00624227C00C0AD102E
S3150001F580203C00018000C09166100279FC000080D9
S3150001F5904078007900640080407808B90000008056
S3150001F5A0407B08B900010080407B13FC000200800B
S3150001F5B0407A33F90002A18C0080404A08E9000232
S3150001F5C000010079400000080400833C000A00626F3
S3150001F5D04E754E714E714E7148E7011833C000A049
S3150001F5E00628267C00C0AD5E33D30080404A207CCD
S3150001F5F00080407B08900000287C00C0AD3E33ECC3
S3150001F60000040080407C33EC00060080407E303CE4
S3150001F61003FFC06C00080279FC0000804078817904
S3150001F6200080407833EC000A008040A833EC000CDF
S3150001F630008040AA43EC000F1011EA080200000105
S3150001F64042411200024100010279FFFE008040A4FE
S3150001F6508379008040A41011E808020000014241AC
S3150001F660120002410001E9490279FFEF008040A43E
S3150001F6708379008040A41011E20802000001020013
S3150001F6800001D000089000018110082B0000000144
S3150001F690660C082B000300016604420760061E394A
S3150001F6A000C0AD2F103900C0AD4CD00713C000808B
S3150001F6B0407A103900C0AD2E0200000102000019F
S3150001F6C0E708089000038110700FC03900C0AD3102
S3150001F6D0023900F00080406281390080406233C007
S3150001F6E000A0062A4CDF18804E754E714E714E7180
S3150001F6F033C000A0062C7003C03900C0AD27E9084D
S3150001F700023900CF0080406281390080406213F9DE
S3150001F71000C0AD26008040634241300148C0D08020
S3150001F720068000C0AD162240300148C0D080068058
S3150001F7300080406420403091227C00C0AD1E207CB8
S3150001F7400080406C11B11000100052410C410004C0
S3150001F7506DC833C000A0062E4E754E714E714E71A6
S3150001F76033C000A0063061886100FE6E303900802A
S3150001F77040A40800000057C0440048800240000130
S3150001F7800279FFFE00C0AD82817900C0AD8208B961
S3150001F790000040080407B0839000400C0AD83670681
S3150001F7A04EB90001C79E423900C0ACC5427900C0BE
S3150001F7B0ACC2423900C0B07833FCFFFF00C0B0765E
S3150001F7C0427900C0B07442B900C0B06E427900C03F
S3150001F7D0B07208B9000700C0AD8308F9000000C087
S3150001F7E0AD1333C000A006324E754E714E714E7187
S3150001F7F02F0D33C000A006346100008E2A7C00C0A4
S3150001F800AD100095001000046016303900804008E4
S3150001F8100800000E66046100FD5C4EB90002186026
S3150001F820082D0002000366E233C000A006362A5FF7
S3150001F8304E754E714E714E7133C000A0063808B92F
S3150001F840000700C0AD8308B9000000C0AD1333C086
S3150001F85000A0063A4E754E714E714E7133C000A02E
S3150001F860063C0C39000200C0A43C660E700010393B
S3150001F87000C0AE9023C000C0A44033C000A0063E25
S3150001F8804E754E714E714E7133C000A006400C3953
S3150001F890000200C0A43C661E103900C0AE91E80803
S3150001F8A00200000F4241120002410003ED4948C126
S3150001F8B023C100C0A44033C000A006424E754E715C
S3150001F8C04E714E7148E70F3E33C000A006444FEF1C
S3150001F8D0FF9A422F001E427900C0AD762F7C0000B0
S3150001F8E00000000324247287C0002A55C2A7C000207
S3150001F8F0A5604A4767700C47000167 04264C600201
S3150001F900264D303CFFFFD0477C003C00207C00C0E8
S3150001F910AD1E424010306800207C00C0AD2242413D
S3150001F920123068009041486F001248C04EB900027B
S3150001F93042042F0B486F0016486F00164EB900029D
S3150001F9401FAE486F000E41EF00362006E588D1C094
S3150001F9502F0841EF003A70003007E588D1C02F0823
S3150001F9604EB900021F5A52470C47000565846006CE
S3150001F9704EB90001BA6A0C79000800C0AD7665F08F
S3150001F9804BEF002E303900C0AD782F0D02800000FC
S3150001F990FFFF4EB900024224203900C0C902E8889F
S3150001F9A0486F00104EB900024224486F0010486F9C
S3150001F9B000324EB900021CE84240103900C0AD8544
S3150001F9C044405840486F000E48C04EB900024204F8
S3150001F9D0204F2F28000E2F3C3FACCCCD43EF001C0F
S3150001F9E04EB9000239F4486F0014486F00324EB91F
S3150001F9F000021D0C4247486F004241EF003670007D

S3150001FA003007E588D1C02F08486F00184EB90002AB
S3150001FA101F8248790002A564486F0014486F0014DC
S3150001FA204EB900021FC4204F2F28000C2F3C412045
S3150001FA30000043EF001C4EB9000239F4486F001470
S3150001FA40486F003241EF002670003007E588D1C0CB
S3150001FA502F084EB900021FAE52470C4700046596A7
S3150001FA60267C00C0AD102A3C001000004A3900C0B7
S3150001FA70A25E675808D30007203900C0A2EC7203C2
S3150001FA80B0816234D040303B00064EFB00020008D4
S3150001FA9000100024001E08AB00070003601A08EBE3
S3150001FAA00007000308AB00060003600C08EB000327
S3150001FAB000030093000000C08B9360064EB900015D
S3150001FAC0BA6A2013C08566F408930007247C0002F5
S3150001FAD02A6E2C7C00C0AD3E082B00070003660091
S3150001FAE00B662A7C00C0AE7C4A3900C0A244671668
S3150001FAF0700FC07900C0A286720CE368026D0FFF19
S3150001FB000004816D00044A3900C0A24567302B7993
S3150001FB1000C0A28800083F3900C0A28A4EB9000180
S3150001FB20998402400FFF026DF0000006816D000608
S3150001FB30302D000602400FFF33C000E000F64A39BF
S3150001FB4000C0A2466722303C0FFFC07900C0A28EDA
S3150001FB50026DF0000006816D0006302D00060240A0
S3150001FB600FFF33C000E000F64A3900C0A24767081C
S3150001FB702B7900C0A290000C4A3900C0A267670821
S3150001FB802B7900C0A31000104A3900C0A24867169D
S3150001FB90700FC07900C0A296720CE368026D0FFF68
S3150001FBA00006816D00064A3900C0A24E67081B791E
S3150001FBB000C0A2AF00164A3900C0A24F67081B79E0
S3150001FBC000C0A2B300174A3900C0A250670E1B79C4
S3150001FBD000C0A2B700144EB90001F85C4A3900C052
S3150001FBE0A251671A700FC03900C0A2BBE908022DE5
S3150001FBF0000F0015812D00154EB90001F8884A390C
S3150001FC0000C0A2616718103C00FFD03900C0A2FBFA
S3150001FC100200000F022D00F00015812D00152A7C2F
S3150001FC2000C0A24D4A3900C0A24C6716303CFFFF06
S3150001FC30D07900C0A2A61215488148C1E9893D8044
S3150001FC4018084A3900C0A2496710101548804 8C0F3
S3150001FC50E9882DB900C0A29808004A15667C4A3980
S3150001FC6000C0A24966084A3900C0A24C676C121549
S3150001FC70488148C1E98930361808524086F001258
S3150001FC8002800000FFFF4EB900024224486F0012B5
S3150001FC9048790002A568486F00524EB900021FC498
S3150001FCA048790002A56C486F004E486F001C4EB99A
S3150001FCB000021FC4486F00142F0E4EB900021FF236
S3150001FCC04A405DC044004880020000010 8B90000B6
S3150001FCD000C0AD2E813900C0AD2E4A3900C0A24AFE
S3150001FCE0670000E41215488148C1E98930361808D1
S3150001FCF05240486F001202800000FFFF4EB9000219
S3150001FD004224486F001248790002A568486F0052E4
S3150001FD104EB900021FC44A156708287C0002A57067
S3150001FD2060184879 0002A56C486F004E486F00566E
S3150001FD304EB900021FC449EF004E2F0C1015488022
S3150001FD4048C0E98848760800486F00144EB9000299
S3150001FD501F5A204F2F28000C43EF00144EB9000202
S3150001FD6049BC3F3C0014487900C0A29C486F00166C
S3150001FD70486F00164EB900021F5A486F004C486F73
S3150001FD800012486F00124EB900021FC4204F2F28DF
S3150001FD90000A43EF001A4EB900024A3448790002BC
S3150001FDA0A574486F0018486F00184EB900021F5A13
S3150001FDB0486F00104EB900024D3A1215488148C1EC
S3150001FDC0E9893D8018064A3900C0A24B670000E464
S3150001FDD01215488148C1E98930361808524 0486FE2
S3150001FDE0001202800000FFFF4EB900024224486F54
S3150001FDF0001248790002A568486F00524EB9000208
S3150001FE001FC44A156708287C0002A5706018487946
S3150001FE100002A56C486F004E486F005A4EB90002A9
S3150001FE201FC449EF00522F0C1015488048C0E988BD
S3150001FE3048760800486F00144EB900021F5A204F39
S3150001FE402F28000C43EF00144EB9000249BC3F3C79
S3150001FE500014487900C0A2A0486F0016486F00162A
S3150001FE604EB900021F5A486F004C486F0012486F86
S3150001FE70001 24EB900021FC4204F2F28000A43EF7B
S3150001FE80001A4EB900024A3448790002A574486F37
S3150001FE90018486F00184EB900021F5A486F00102B
S3150001FEA04EB900024D3A1215488148C1E9893D8093
S3150001FEB018044A3900C0A262671A4A15670C13F979
S3150001FEC000C0A2FF00C0AD5C600A13F900C0A2FF2A
S3150001FED000C0AD4C4A3900C0A26367284A15671AAB
S3150001FEE07003C03900C0A303E908023900CF00C07E
S3150001FEF0AD60813900C0AD60600A13F900C0A3038B
S3150001FF0000C0AD2F4A3900C0A26B6700028E4A3984
S3150001FF1000C0A26D6700009C284E203900C0A320B6
S3150001FF2053807208B0816200008AD040303B0006DF
S3150001FF304EFB00020012001200120012002A0036C7
S3150001FF400040004A0070203900C0A320538006807B
S3150001FF5000C0AD1E204010B900C0A32B605413F998
S3150001FF6000C0A32B00C0AD316048397900C0A32A77
S3150001FF70000A603E397900C0A32A000C6034302C97
S3150001FF800004D06C0006E2483E003007907900C0BC
S3150001FF90A32A39400006303900C0A32AD047394088
S3150001FFA00004600E700FC03900C0A32B13C000C03F
S3150001FFB0AD304A3900C0A26C6700012E287C00C012
S3150001FFC0A326203900C0A32053807206B0816200A7
S3150001FFD00118D040303B00064EFB0002000E000E19
S3150001FFE0000E000E0050006E00BE301402400001EB
S3150001FFF002400001E94808B9000400C0AD838179D7
S315000200000C0AD82082B00000003670000DC08393F
S31500020010000400C0AD83670A4EB90001C79E6000A6
S31500020020000C84EB90001C7DC600000BE30140240B1
S3150002003000010240001E74808B9000300C0AD8391
S315000200408179 00C0AD82600000A030140240000138
S3150002005002400001D04008B9000100C0AD83817999
S31500020060000C0AD82301402400002024000010 8B90D
S315000200700000000C0AD83817900C0AD82083900015D
S315000200800 00C0A327670A08B9000500C0AD4D605835
S315000200900 08F9000500C0AD4D604E30140240000163
S315000200A002400001D04008B9000100C0AD83817949
S315000200B000C0AD82301402400002024000010 8B9BD
S315000200C00000000C0AD83817900C0AD82083900010D
S315000200D000C0A327670A08B9000400C0AD4D600836
S315000200E008F9000400C0AD4D424770003007D080C9
S315000200F0068000C0AD16224070003007D08006801 0
S3150002010000804064204030917000300706 8000C0B5
S31500020110AD1E22407000300706800080406C2040F1
S3150002012010915247 0C47000465C033F900C0AD4830
S31500020130008040A833F900C0AD4A008040AA1039B9
S31500020140000C0AD4DEA0802000001424112000 24120
S3150002015000010279FFFE008040A48379008040A45A
S315000201600103900C0AD4DE808020000014241 1200FC
S31500020170024100 01E9490279FFEF008040A4837938
S315000201800008040A4700FC03900C0AD31023900F0C2
S3150002019000080406281390080406 24A3900C0A26410
S315000201A06752287C00C0AD5E4A15671A303900C016
S315000201B0A3060240000102400001E54808AC000225
S315000201C000018154602E0839000100C0A3076708AB
S315000201D008EC00030001600608AC00030001303998
S315000201E000C0A30602400001024000010 8AC000064
S315000201F0000181544A3900C0A265671E103900C049
S31500020200A30B02000001D0001215488148C1E989FA
S31500020210 08B60001180F8136180F2A7C00C0AD15EA
S31500020220287C00C0C6924A3900C0A2596730224CC7
S3150002023041D7700520D951C8FFFC4215227C000225
S3150002024 09BA8204C701220D951C8FFFC43D7204CE2
S31500020250700520D951C8FFFC08EB000600024A3996
S315000202600 00C0A25A673E227C00C0C6DE41D7700596
S31500020270 20D951C8FFFC1ABC0001227C00029BF463
S315000202800207C00C0C6DE701220D951C8FFFC43D7BD
S315000202900207C00C0C6DE700520D951C8FFFC08EBE1
S315000202A0000600024A3900C0A261673A103C00FF0C
S315000202B0D03900C0A2FB1A80424112003001C0FCB4
S315000202C0004C068000029BA8224042401015 3200D4
S315000202D0C2FC004CD28C2041701220D951C8FFFCBE
S315000202E008EB000600024A3900C0A269670626BC6E
S315000202F00000080004A3900C0A26F670E082B000773
S315000203000000266060093000140004A3900C0A2536B
S31500020310670608EB000600024A3900C0A254677459
S3150002032008EB0005000223FC00C0C61200C0AE980E
S3150002033 04A3900C0A25D662A48780020487900C082
S315000203 40C6124EB900002336601 83F3C000A4EB969
S31500020350 0001B7920C40FFFD670408D3000708931B
S31500020360 0007082B0005000266E04A7900C0B1AB22
S31500020370 67063F3C000260123F3C0001487900C01C
S315000203 80BFBC6100129C3F3C0000487900C0B07AB5
S315000203 906100128E103900C0A2554880123900C081
S315000203A0A2564881804167 0000B60293FCFFE9FF2E
S315000203B04A3900C0A25667047E0460027E002039D4
S315000203C000C0A2C8D0877207B0816250D040303BCD
S315000203D00064EFB00020010001800200028003024
S315000203E000030003800400093020010006 02E009397
S315000203F0020012006026009302001400601E0093A1
S3150002040003001400601608EB00030002600E00935E
S31500020410020008006006009303000 8004A3900C083

S31500020420A256672460064EB90001BA6A30390080C6
S3150002043040080800000E67EE082B00000003661E47
S3150002044060E44EB90001BA6A3039008040080800FB
S3150002045000 0E67EE203C00200030C09367E44A3964
S3150002046000C0A257670001C6303900804008080064
S31500020470000E670001B8082B000000036700 01AEFA
S315000204808130001670001A64A3900C0A247671493
S31500020490227C00029912207C00C0C16E700820D90D
S315000204A051C8FFFC487900030DB24E92588F287C42
S315000204B000C0B0766000158203900C000FAB0864C
S315000204C0670001462C000839000700C0AD836708A3
S315000204D01F7C0056001960061F7C0020001908398F
S315000204E0000600C0AD8367081F7C0043001A600641
S315000204F01F7C0020001A0839000000C0AD82670880
S315000205001F7C0053001B60061F7C0020001B08395D
S315000205100000500C0AD8367081F7C0042001C600610
S315000205201F7C0059001C2A4E2F3900C0C16E424062
S31500020530103900C0B0783F004A546E063F3CFFFFB8
S3150002054060067007C0543F003F3900C0AD72302DBF
S315000205500004906D0006E2483F003039008040A456
S31500020560080000001660C3039008040A40800000231
S3150002057067063F3C002A60043F3C00203F2D000AEC
S315000205803039008 0404A0800000667063F3C002AD0
S3150002059060043F3C00204240103900C0AD313F00AC
S315000205A0486F002D4240103900C0AD1F3F00424047
S315000205B0103900C0AD1E3F00487900030E104E925E
S315000205C04FEF00200839000300C0AD83660642796A
S315000205D000C0AD72424770003007E588068000C051
S315000205E0C17220402F10487900030E3A4E92508F66
S315000205F052470C47000865DE0279FFBF0080404A79
S3150002060000279FFFD008040A44EB90001BA6A2F3973
S315000206100000026A4E4EB90000457E0C40FFFF660C92
S3150002062 00C79000A00C0AD086200FE8E4A3900C08D
S31500020630A27167128B934A7900C0C7D0660833FC51
S3150002064000 00500C0C7D04A3900C0A2546600018C1A
S315000206504 2472A7C00C000FE10064880424112151D
S31500020660B04167041C1552474EB90001BA6A0C47DD
S315000206700000465E4082B00070003660C48790003B2
S3150002068 00E3F4E92588F602E082B00060003670419
S315000206907C0160024246082B0003000367047E01C8
S315000206A06002424730065240D0473F004879000375
S315000206B00E4D4E925C8F30390080400808 00000EC5
S315000206C0675C203C00200030C0936752303C20809B
S315000206D0C06B0002670A487900030E5E600000BE26
S315000206E0082B00020002671C082B00010002670AA1
S315000206F0487900030E75600000A4487900030E9441
S315000207006000009A082B00010002670A487900037C
S31500020710 0EAD6000008B487900030EC8607E082B83
S3150002072000070002670848790003 0EE3606E082B93
S3150002073000000001670848790003 0EF6605E303952
S3150002074000804008080000 0E674C082B00000003DA
S3150002075067440813000167084879000 30F09603CE3
S31500020760081300056718082B00070003670848797 5
S3150002077000030F20602648790003 0F3F601E082BF6
S31500020780 0007000367084879000 30F5D600E487989
S31500020790000 30F7D600648790003 0F9C4E9242408B
S315000207A0103900C0AD1452403F00487900030FA72C
S315000207B04E924FEF000A082B00070001670A48799C
S315000207C00003 0FB84E92588F082B00060001670AE5
S315000207D0487900030FD24E92588F287C00C01856D3
S315000207E04A3900C0A25B670000C82F144879000 38B
S315000207F00FF04E924240103900C0AD4C55403F00BA
S31500020800 2F1443EF00224EB900024A34204F2F28FC
S315000208100001C487900031 00B4E924240103900C06A
S31500020820AD5C55403F002F1443EF002A4EB900023B
S315000208304A34204F2F2800244879000310254E926F
S31500020840203900804074486F002C4EB900024204E1
S31500020850 48790002A578486F0030486F00304EB9DB
S31500020860 00021FC4204F2F2800284879000 3104099
S315000208704E922F3900C0A47E4879000310544E923E
S3150002088 03F3C00202F3900C0A4822F3900C0A47E2D
S31500020890 43EF00424EB90001A234204F2F28003CFC
S315000208A02F280038487900031 0694E924FEF003422
S315000208B04A3900C0A26A670004C2487900031 08759
S315000208C04E92204F2F2800224879000310C24E92E2
S315000208D04FEF000C0839000700C0AD8367081F7C84
S315000208E00056001960061F7C002000190839000610
S315000208F000C0AD8367081F7C0043001A60061F7C98
S31500020900 00020001A0839000000C0AD8267081F7C6B
S3150002091000 53001B60061F7C0020001B08390005DF
S31500020920 00C0AD8367081F7C0042001C60061F7C66
S315000209300059001C7E010839000400C0AD83670619
S3150002094 0486F0019600648790003 10F63F07303CED
S3150002095 0FFFFD04772003200068100C0AD1E204163
S31500020960424010103F0041EF003A303CFFFFD047B3
S315000209707072003200E589D1C12F0841EF003E7000B6
S315000209803007E588D1C02F08486F00244EB900020F
S31500020990 1F82204F2F28001C41EF002A70003007CB
S315000209A0E588D1C02F103F07487900031 0D14E9237
S315000209B04FEF001652470C4700056500FF7A2A4E94
S315000209C0303900804 04A08000006670848790 0036B
S315000209D0112260064879000311260839000300C077
S315000209E0AD8367063F3C005960043F3C004E4240DF
S315000209F0103900C0AD313F007000103900C0AD3172
S31500020A00D08006800002A16020403F103F3900C01E
S31500020A10AD724879000310FB4E924FEF0010083971
S31500020A200000300C0AD8366064279 00C0AD7230395C
S31500020A30008040A408000002670848790003 1154A8
S31500020A406006487900031158083900 0500C0AD4D0B
S31500020A5067063F3C004E60043F3C00590839 0001DE
S31500020A60 00C0AD8367063F3C005960043F3C004E20
S31500020A7003F2D000A302D000A486F001E028000003A
S31500020A80FFFF4EB900024224303900C0ACBC486FA9
S31500020A90001A48C04EB900024204487900 02A57CF9
S31500020AA0486F001E486F001E4EB900021FAE486F07
S31500020AB0001E486F001A486F001A4EB900021FC482
S31500020AC0204F2F2800123F3900C0ACBC48790003E2
S31500020AD011294E92303900 8040A408000006670 8AA
S31500020AE0487900031186600648790003118A082DA9
S31500020AF00004000F67063F3C004E60043F3C00596D
S31500020B00083900 0100C0AD8367063F3C0059600406
S31500020B103F3C004E3F2D000C302D000C486F00323A
S31500020B2002800000FFFF4EB900024224303900C0A5
S31500020B30ACBE486F002E48C04EB900024204487946
S31500020B400002A57C486F0032486F00324EB900029F
S31500020B501FAE486F0032486F002E486F002E4EB906
S31500020B60 00021FC4204F2F2800263F3900C0ACBE0A
S31500020B704879000 3115B4E92203900C0AD7E486F62
S31500020B80003C4EB900024224204F2F28003C43EF7E
S31500020B90 00724EB900023CEC302D0004906D000646
S31500020BA0E2483E00302D00085240486F003A02806B
S31500020BB00000FFFF4EB900024224486F003A48790E
S31500020BC00002A568486F007A4EB900021FC43F07AB
S31500020BD0302D0006D06D0004E2483F004879000 33C
S31500020BE0118D4E924240102D000E5B403F002F1495
S31500020BF043EF004A4EB900024A344240103900C05F
S31500020C00AD303F00103900C0AD30486F004202805F
S31500020C1000000 0FF4EB900024224486F0046486FAA
S31500020C2000 46486F00464EB900021FAE204F2F28DD
S31500020C30003E487900 0311A04E923039008040A44C
S31500020C400800000167084879000311C9600648795F
S31500020C50000311CD3F3900C0ACB8487900 0311B783
S31500020C604E924FEF0044303900 8040A40800000540
S31500020C7067084879000311E26006487900031 1E625
S31500020C803F3900C0ACBA4879000311D04E923F39C1
S31500020C9000 0C0AD7C3F3900C0AD7A204F2F280054EA
S31500020CA0487900 0311E94E924240102D000E5B4036
S31500020CB03F002F1443EF00304EB900024A34302D64
S31500020CC0000A486F002602800000FFFF4EB90002AC
S31500020CD042243007486F002048C04EB9000 2420441
S31500020CE0486F0026486F0024486F00244EB9000260
S31500020CF01FC4204F2F28001C486F0060487900024D
S31500020D00A580486F00324EB900021FC4103900C0D8
S31500020D10AD30486F0026028000 0000FF4EB9000287
S31500020D204224486F002E486F002A486F002A4EB9A7
S31500020D3000 021FAE486F0064486F0026486F002607
S31500020D404EB900021FC4486F002A486F0022486F3E
S31500020D500 0224EB900021FAE204F2F28001A4879F2
S31500020D6000 0312014E924FEF00220279FFBF00806C
S31500020D700404A0279FFFD008040A44A3900C0A266BB
S31500020D80670003E44A3900C0A254660003244A39C4
S31500020D9000 0C0A2566600031A0C39000300C0A384E1
S31500020DA06362203C00018000C0936758303900809E
S31500020DB0406A024000FF3F0030390080406802402E
S31500020DC000 0FF3F003039008040660 24000FF3F00CE
S31500020DD0303900804064024000FF3F004240103933
S31500020DE0008040633F003039008040 64E0480240A2
S31500020DF00000F3F0048790003 12174E924FEF001082
S31500020E0060000364303900C09826907900C0982C9F
S31500020E10907900C0AD2C486F0012028000 00FFFFDF
S31500020E204EB90002422448790002A584486F001692
S31500020E30486F00164EB900021FAE204F2F28000E33

S31500020E404879000312474E924879000312874E9260
S31500020E50203900C000FA90B900C0AD282F003F3CEF
S31500020E6000544EB900001DCE4240103900C0AD27D5
S31500020E703F004879000312984E924240103900C052
S31500020E80AD263F004879000312B04E92487900031E
S31500020E9012CB4E924FEF001C1A3C00FF420642470D
S31500020EA02F7C0002A55C005A2F7C0002A560005E22
S31500020EB02F7C0002A55C00622C7C0002A5604A47DA
S31500020EC06706286F00626002284E4A4767062A6F45
S31500020ED0005A60042A6F005E700030070680000C068
S31500020EE0AD22204042401010444006400001F486F89
S31500020EF0001248C04EB9000242042F0C486F001679
S31500020F00486F00164EB900021FAE204F2F28000E62
S31500020F1070003007068000C0AD1E204042401010 0F
S31500020F2044400640001F486F001648C04EB90002F2
S31500020F3042042F0D486F001A486F001A4EB900027C
S31500020F401FAE204F2F280012700030070680000C007
S31500020F50AD2220404240101 03F007000300706804C
S31500020F6000C0AD1E204042401010 3F007000300706
S31500020F70D080068000C0AD162040301002 4000FF2F
S31500020F803F0070003007D080068000C0AD162040BA
S31500020F903010E0480240000F3F00300752403F0049
S31500020FA04879000313024E924FEF00164240100595
S31500020FB072003207D281068100C0AD16204132107E
S31500020FC0024100FFB041631670003007D0800680F0
S31500020FD000C0AD1620403010024000FF3A004240E9
S31500020FE0100672003207D281068100C0AD1620417A
S31500020FF03210024100FFB041641670003007D08003
S31500021000068000C0AD1620403010024000FF3C00B2
S3150002101052470C47000465 00FEA64879000311325D3
S315000210204E92588F4A7900C0C7D06708082B00072E
S315000210300000267084879000313 3B6058082B00003A
S3150002104000001670848790003134D6048303900C033
S31500021050C7D053400C4000046242D040303B0006E9
S315000210604EFB0002000A0012001A0022002A4879EA
S31500021070000031 35F601E48790003136460164879 03
S31500021080000031378600E48790003138660064879D8
S315000210900003139 54E92588F600000CC3F3900C072
S3150002 10A0C7D04879000313A24E925C8F600000B845
S315000210B030390080400808 00000E670000AA082B9D
S315000210C0000000003670000A04A3900C0A254670866
S315000210D008EB00010003600608EB000000024A3933
S315000210E000C0A270670608EB00030001423900C087
S315000210F0ACC560064EB90001BA6A303C0102C06B4B
S31500021100000267122F3900026A4E4EB90000457E70
S31500021110 0C40FFFF67DE0293FFFFFEFD48790003E6
S3150002112013B84E92588F424648790003 13F34E92F3
S31500021130588F424770003006E988068000C0C19287
S31500021140 72003207D281D08120403F1048790003D5
S3150002115013F64E925C8F52470C47000865D65246EC
S31500021160 0C46004065C24A3900C0A25C670003D043
S31500021170 4240103900C0AD1452403F004879000386
S3150002118013FB4E924879000314144E924FEF000A55
S315000211904 2462F7C0002A57000624A466716303C22
S315000211A0FFFFD0463200C2FC004C068100029BA81B
S315000211B028416006287C00C0AD1642474BEC002849
S315000211C0302D000852404 86F000602800000FFFFE3
S315000211D04EB900024224486F000648790002A5680B
S315000211E0486F00524EB900021FC4082D0004000FBA
S315000211F067264A4767084879000314B5603E0839EE
S3150002120000010 0C0AD8367084879000314BA602C58
S315000212104879000314BF60244A4767084879 0003E7
S31500021220 14C46018083900 0100C0AD836708487904
S31500021230000314C960064879000314CD082D000581
S3150002124000 0F67264A47670848790003149B603EEC
S315000212500839000100C0AD8367084879000 3149D70
S31500021260602C4879000314A260244A47670848792B
S315000212700000314A7601808390001 00C0AD8367088F
S315000212804879000314AC60064879000314B0082DAF
S31500021290 0001000F670848790003149060064879 38
S315000212A0000314944A4767063F3C005860043F3CDB
S315000212B000523F0648790003147A4E92302D0008F8
S315000212C052403F004879000314D24E924A47670EB5
S315000212D0302C0048E448024000013F00601A082C06
S315000212E00003004967047A026002424530 2C004836
S315000212F002400001D0453F004879000314D74E92C0
S315000213004A476714102C004AE8080200000037201DB
S31500021310E16930013F006020082C00000049660E9A
S3150002132082C0003004966063F3C0000600A700173
S31500021330122C0019E3683F004879000314DC4E9230
S31500021340382D00043F3CFFEC3004486F002E02802B
S315000213500 00FFFF4EB900024224204F2F28002E24
S3150002136043EF00404EB900024A34486F003A486FD4
S31500021370000744 86F00364EB900021FAE204F2F2868
S31500021380002E4879000314E44E923A2D00063F3CA3
S31500021390FFEC3005486F003602800000FFFF4EB9B1
S315000213A000024224204F2F28003643EF00484EB950
S315000213B000024A34486F0042486F007C486F003E84
S315000213C04EB900021FAE204F2F280036487900037F
S315000213D014EB4E923F3CFFFE204F2F28008243EF34
S315000213E000504EB900024A34204F2F28004A48794D
S315000213F0000314F24E923F3CFFEC30049045486FD6
S31500021400004648C04EB900024204204F2F2800462B
S315000214104 3EF00584EB900024A34486F0052486FF3
S31500021420008C486F004E4EB900021FAE204F2F2887
S315000214300004648790003 14FA4E924FEF00463F3CAD
S31500021440FFEB3004D045486F000402800000FFFF26
S3150002145 04EB900024224204F2F28000443EF000E0B
S315000214604EB900024A344A47670 62C6F006260464C
S31500021470082C00000018671E3F3CFFFE204F2F2855
S31500021480004C0A17008043EF00164EB900024A3498
S315000214904 3EF001060183F3CFFFE204F2F28004C00
S315000214A043EF00124EB900024A3443EF000C2F51AB
S315000214B000564DEF0056486F0008486F004E486FC1
S315000214C000C4EB900021FAE2F0E486F0008486F7F
S315000214D00084EB900021F5A204F2F104879000308
S315000214E015014E922F154879000315084E92424077
S315000214F0102D000E3F002F3C3E80000043EF001EE1
S315000215004EB900024A34204F2F28001848790003AA
S315000215101 50F4E924FEF00184A46660A48790003A5
S31500021520 15164E92588F4BED001052470C4700028B
S31500021530 6500FC8E52460C4600046300FC5E4A3986
S31500021540 00C0A27067624A3900C0A256665A082BCA
S3150002155000070003660E3F3C0001487900C0BFBC8D
S31500021560610000BE42472A7C00C0B22C4A47660E82
S315000215700 82B0007000367063F3C000160043F3C5E
S3150002158 00002F0D6100009A52474BED01B20C4745
S315000215900006DD8082B00070003670C3F3C0000CB
S315000215A04879 00C0BFBC61784A3900C0A258674872
S315000215B04879000315254E9248790003154D4E923F
S315000215C04879 00C0AE7C61000214487900C0AE9032
S315000215D0610001A048790003155 94E924FEF000CA5
S315000215E03F3C0001487900C0BFBC61343F3C00006B
S315000215F04879 00C0B07A6128082B00070003660804
S3150002160033FC0E1000C0AD0842404FEF006633C0F7
S31500021610 00A006464CDF7CF04E754E714E714E713F
S31500021620 48E7030C33C000A00648287C00022A6E55
S315000216302A6F00143E2F001808070000 6724487915
S3150002164000 03155C4E94588F08070002670A487912
S31500021650000315B24E94588F4879000315BE4E9476
S31500021660588F4879000315C64E94588F0807000113
S3150002167067 08082B0001012F66402F2D01243F2DFA
S31500021680012E3F2D00CA2F2D00103F2D00C82F2DF1
S3150002169 0 000C3F2D00C62F2D00083F2D00C42F2D14
S315000216A000042F154240102D01303F0048790003F7
S315000216B015C94E944FEF0028601048790003 16159D
S315000216C04879 0003160B4E94508F08070002670AEA
S315000216D04879 00C0AE906100009A08070001675A77
S315000216E04A6D012E67147C013E0660045247DC46B1
S315000216F0302D012EC04667F46002424708390007C2
S3150002170000C0AD13671870003007E5880680000236
S31500021710A1C220402F1048790003161760167000E8
S3150002172003007E58806800002A19A20402F104879EA
S31500021730000 3161B4E94508F602208070003671C95
S315000217400839000700C0AD136708487900031 61F61
S3150002175060064879000316284E94588F33C000A0BD
S31500021760064A4CDF30C0205F5C8F4ED04E714E7100
S315000217704E712F0D33C000A0064C2A6F0008102DA3
S31500021780000102000 00F42411200524130013F00A7
S31500021790424010 2D00033F004240102D00023F0040
S315000217A0102D0001E808020000 0F4241120030012C
S315000217B03F00424010153F004879000316314EB9EA
S315000217C000022A6E4FEF000E33C000A0064E2A5FBB
S315000217D0205F588F4ED04E714E714E712F0D33C011
S315000217E000A006502A6F00082F2D0010302D00068B
S315000217F0720CE2680240000F3F002F2D000C302DC4
S3150002180000 0602400FFF3F002F2D0008302D000476
S31500021810E2680240000F3F004879000316464EB9BF
S31500021820 00022A6E4FEF001633C000A006522A5F4E
S31500021830205F588F4ED04E714E714E7133C000A04C
S3150002184 0065448E73F3E204F2E7900C0FB3E23C890
S31500021850 00C0FB3E4CDF7CFC4E754E714E714E71E4

S3150002186033C000A0065648E73F3E204F2E7900C0FF
S31500021870FB3E23C800C0FB3E4CDF7CFC4E754E711E
S315000218804E714E7148E7030433C000A00658424722
S315000218902A7C00C0AD1008D5000623FC00004B00D0
S315000218A000C0A23C203C18000000C095674E53477A
S315000218B04A476C067E0A7C0560027C04D815000411
S315000218C0671A300608C000013F00487900C0B07AA6
S315000218D04EB900021620089500046020132FC000C85
S315000218E000C0C0EC300608C000033F00487900C0C3
S315000218F0BFBC4EB900021620089500034EB900017E
S3150002190 0BA6A2F3900026A4E4EB90000457E0C4073
S31500021910FFFF660C0CB90000028000C0A23C6E8478
S315000219200295A7FFFFFF424033C000A0065A4CDFD4
S3150002193020C04E754E714E714E7133C000A0065CCA
S315000219402 3FC0002195800C0ACD433C000A0065EC6
S315000219504E754E714E714E712F0233C000A0066055
S31500021960207C00C0B086227C00C000FA20107200E3
S31500021970322F000AD0812211B280620E201074002A
S315000219803 42F000A9082B280640E082F00030008EA
S31500021990660623D000C000F623D100C0C592203CC3
S315000219A000C0C59233C000A00662241F205F588F74
S315000219B04ED04E714E714E7148E70F1C33C000A0D7
S315000219C00664287C00C0C7D2267C00C0C592303C83
S315000219D00FF0C06F0020660000E2227C0002687EE3
S315000219E0204C703320D951C8FFFC30917800424513
S315000219F02A7C00C013F470200837000208016 71C15
S31500021A00303900C0163CB0456D4C48C0E58822000E
S31500021A10207518002C28000C7A01603A3E05300722
S31500021A2048C0E5884AB508006724302F00223207ED
S31500021A3048C1E58920751800B068000E66103007A7
S31500021A4048C0E588207508002C28000C7A01524708
S31500021A500C4700406DC84A45675C207900C01810E3
S31500021A60BCA8000C645023C600C0C7EC20065280F6
S31500021A7023C000C0C7F413FC003300C0C7E913FC3F
S31500021A80003300C0C7EA2A7C00C0C7E608D50007B3
S31500021A9070FF23C000C0C7FC13FC000100C0C7E8EA
S31500021AA008ED000700012F0D224C4EB900008D08EB
S31500021AB0283900C0C7DE2684604E7020083700032E
S31500021AC0080166442F0C302F0024E848024000FF2C
S31500021AD03F004EB90000900A4A0067140C0000024B
S31500021AE0670E0C000004671E0C00000567186018DC
S31500021AF0487900C0C8242F0B487800204EB9000050
S31500021B0021762A4B60029BCD200D33C000A00666CB
S31500021B104CDF38F0205F588F4ED04E714E714E71A9
S31500021B2033C000A0066823FC000219B800C0ACE866
S31500021B3023FC00021B4800C0ACEC33C000A0066ABE
S31500021B404E754E714E714E7148E70F1C33C000A0A0
S31500021B50066C287C00C0C7D2267C00C0C592303CE9
S31500021B600FF0C06F0020660000E2227C0002687E51
S31500021B70204C703320D951C8FFFC30917800424581
S31500021B802A7C00C014F470200837000208016 71C82
S31500021B90303900C0163EB0456D4C48C0E58822007B
S31500021BA0207518002C28000C7A01603A3E05300791
S31500021BB048C0E5884AB508006724302F002232075C
S31500021BC048C1E58920751800B068000E66103007 16
S31500021BD048C0E588207508002C28000C7A01524777
S31500021BE00C4700406DC84A45675C207900C0181052
S31500021BF0BCA8000C645023C600C0C7EC2006528065
S31500021C0023C000C0C7F413FC003700C0C7E913FCA9
S31500021C10003700C0C7EA2A7C00C0C7E608D500071D
S31500021C2070FF23C000C0C7FC13FC004E00C0C7E80B
S31500021C3008ED000700012F0D224C4EB900008D0859
S31500021C40283900C0C7DE2684603C702008370003AE
S31500021C50080166322F0C302F0024E848024000FFAC
S31500021C603F004EB90000900A4A0067080C000002C5
S31500021C7067026012487900C0C8242F0B48780020FA
S31500021C804EB900002176200B33C000A0066E4CDF51
S31500021C9038F0205F588F4ED04E714E714E712E7CA9
S31500021CA000E003F82C7C0000000013FC0004008016
S31500021CB0400213FC0000008040034EB900009AACBB
S31500021CC02E7C00C100C22C7C00C0DAB24E664EB930
S31500021CD000009AFA60FE205F20172F002F08207C52
S31500021CE0000002764EFB88FE205F20172F002F0889
S31500021CF0207C000002CE4EFB88FE205F20172F00BC
S31500021D002F08207C000000B04EFB88FE205F2017C3
S31500021D102F002F08207C000002944EFB88FE205FD5
S31500021D2020172F002F08207C000002564EFB88FE4B
S31500021D30206F0004226F000820992151000430100 0
S31500021D400880000F0C407FF06E0408500007205FE9
S31500021D50504F4ED0206F0008226F000C48E73F3EDE
S31500021D602F2800042F102F2900042F11610004F2DE
S31500021D70201F221F4CDF7CFC206F000420C020C1E4
S31500021D80205F4FEF000C4ED0206F0008226F000C30
S31500021D9048E73F3E2F2800042F102F2900042F1159
S31500021DA03017670E0880000F0C407FF06E0408574C
S31500021DB00007610004AC60B8206F0008226F000CB7
S31500021DC048E73F3E2F2800042F102F2900042F1129
S31500021DD061000580609A206F0008226F000C48E7B8
S31500021DE03F3E2F2800042F102F2900042F116100D7
S31500021DF0062E6000FF7C206F000848E73F3E2F104A
S31500021E00610002E0201F221F4CDF7CFC206F0004D1
S31500021E1020C020C1205F504F4ED0206F000848E7F7
S31500021E203F3E2F2800042F1061000296201F4CDF30
S31500021E307CFC206F00042080205F504F4ED0206F24
S31500021E4000004700032100241 7FFF67027001205FBA
S31500021E50584F4ED0206F0004226F000848E73F3EDD
S31500021E602F2800042F102F2900042F11610006A627
S31500021E704CDF7CFC691C6D0A6E107000205F504FAF
S31500021E804ED070FF205F504F4ED07001205F504FF2
S31500021E904ED07002205F504F4ED07000222F0008A5
S31500021EA04AAF000C67080801001F670270FF48E787
S31500021EB03F3E61000252201F221F4CDF7CFC206F36
S31500021EC0000420C020C1205F4FEF000C4ED0206FCF
S31500021ED0000848E73F3E2F2800042F106100027ACF
S31500021EE04CDF7CFC206F00042081205F4FEF000C4A
S31500021EF04ED0206F00047000081000076702700 1C0
S31500021F00205F584F4ED0206F000470004AA800048C
S31500021F1066102210088100 1F0C817FF00000660205
S31500021F207001205F584F4ED0206F000442984290B5
S31500021F30205F584F4ED0206F0004226F00082011F8
S31500021F4022000881001F0C817F8000006E04084079
S31500021F50001F2080205F504F4ED0206F0008226F56
S31500021F60000C48E73F3E2F102F116100080E201F7C
S31500021F704CDF7CFC206F00042080205F4FEF000CBA
S31500021F804ED0206F0008226F000C48E73F3E2F100C
S31500021F9020112200671008810 01F0C807F8000003C
S31500021FA06E040B40001F2F00610007D060C0206F3A
S31500021FB00008226F000C48E73F3E2F102F116100E8
S31500021FC0084E60AA206F0008226F000C48E73F3EC9
S31500021FD02F102F11610008C46094206F0004700056
S31500021FE0221002817FFFFFFF67027001205F584FB8
S31500021FF04ED0206F0004226F000848E73F3E2F10A4
S315000220002F116100092C4CDF7CFC691C6D0A6E10D5
S31500022010700020 5F504F4ED070FF205F504F4ED061
S315000220207001205F504F4ED07002205F504F4ED04D
S315000220307000222F00084AAF000C67080801001F33
S31500022040670270FF48E73F3E610000BC6100007214
S31500022050201F4CDF7CFC206F00042080205F4FEFA6
S31500022060000C4ED0206F000848E73F3E2F1061005B
S3150002207006664CDF7CFC206F00042080205F4FEF59
S31500022080000C4ED0206F00047000081000076702 93
S315000220907001205F584F4ED0206F0004700022104E
S315000220A00881001F0C817F800000660270 01205F9C
S315000220B0584F4ED0206F00044290205F584F4ED0AA
S315000220C061000546C0406700099E0C4007FF67088D
S315000220D00640FC806000094CE38A6600097060 00D5
S315000220E00972610009 1CC040670005B00C4000FF80
S315000220F0670A06400380428360000540E38A660061
S3150002210 0057C60000580205F95CAC080660AC28190
S315000221100660E2F002F004ED06C06538A44814080F3
S315000221200243C0000043EC080660604420020C141F1
S31500022130 0C800000FFFF620C48404841300142 41DA
S3150002214004420010C0806B085342E381E3906AF8B0
S3150002215 0C14226016 00004E4610004AE61024ED071
S315000221600C04066069080428 14E750C4003FF640AA9
S3150002217042804281003C00114E750440043E6D0EC1
S31500022180 70FF72FFE288240A928291824E75428122
S315000221904440 0C4000206D0CC68356C12602428282
S315000221A0044000200C4000106D0E82433602484364
S315000221B0424248420440001053406D0AE28AE293CA
S315000221C0E39151C8FFF8B4FC00006704448 34082DF
S315000221D070FFD081C540C7414E756100042C6180F5
S315000221E0640CB4FC0000670653816402538 04ED02F
S315000221F0610004160C4004336462380004440 3FE92
S31500022200 6E14380A660642A742A74ED042A72F3C52
S3150002221 0BFF000004ED072FF0C4400206F1E044433
S315000222200020E8A92803C8816732B983B4FC0000FC
S31500022230672A42845281D681D584601AE8A9280287
S315000222400C881B982888342834A846710B4FC00003D
S31500022250670A5281D4816404E29252406000 03DC30
S3150002226061000348 0C4007FF661EE38A6600040EFF
S3150002227 00C4107FF6600040EE38C66000400B7CA31

S31500022280660003FA600003FE0C4107FF660CE38C4E
S31500022290660003EA244B600003ECC2416700039C1C
S315000222A0C040660C300124042605244B6000038CD2
S315000222B0B0416408C544C745C141C54B924044413B
S315000222C00C410035620003740C4100206D082A049B
S315000222D04284044100200C4100106D0C3A04424431
S315000222E0484548440441001 07EFFE2AFE2BCE2BD2D
S315000222F0CA87B985C887B985B7CA6612D685D5840D
S3150002230064000338E292E29352406000032E9685FF
S315000223109584640644834082244BC482660CC5437A
S3150002232004400020C482670003720C820000FFFF93
S31500022330620C4842484334034243044000104A8236
S315000223406B0002F85340E38BE3925BC8FFFA60002E
S3150002235002EA610002563C0A3E0BBD473447C040C2
S31500022360660C0C4107FF670003146000032E0C4045
S3150002237007FF661EE38A66000304C241670002FE87
S315000223800C4107FF660002FEE38C670002F860005C
S3150002239002ECC241670003040C4107FF660AE38CA4
S315000223A0670002E2600002D6D041044003FE3640D6
S315000223B020022205612C2A00200322046124260021
S315000223C020022204611C4282D685D582D681D5801E
S315000223D0300B4A826B000264E383E392534060004F
S315000223E0025A3C004841CCC1484048413E01CEC059
S315000223F0DE869D864486484648473C073E0148415C
S31500022400C2C04840C0C74247C141D287D1864E7535
S3150002241061000198C54BC141C544C74560046100CE
S31500022420018A3C0A3E0BBD473447C0406618C2418A
S315000224306700024A0C4107FF6600024AE38C670006
S315000224400244600002380C4007FF6618E38A660001
S31500022450022CC241670002440C4107FF66000238A3
S3150002246060000021AC241670002320C4107FF660A87
S31500022470E38C67000210600002049240064103FFEB
S3150002248036412F052F047C01E49E48428CC2380651
S315000224903E06484442468CC238062C024246E28E2A
S315000224A08CC2CCC7E08EEE8E9886E38C9D8688869B
S315000224B048422004611A4483408228006112E38361
S315000224C0E392640474FF76FF281F2A1F6000FEE26F
S315000224D03202C2C4484248433E033C02CEC4CCC484
S315000224E03E06424648464847DE814281DD814844EF
S315000224F03A033202CAC4C2C4DE85DD814842484379
S31500022500C6C4C4C43602424248424843D687D58628
S31500022510484 44E75610000940C4007FF662AE38A20
S315000225206706700244C04ED00C4107FF6608E38C72
S31500022530066F0B6CA67EC300A0A4000086002300B41
S315000225400024000844C04ED00C4107FF6606E38CE9
S31500022550066D060EAB6CA66E63C003E009C416A0462
S3150002256003E014446E24E670A92409140320AB34027
S3150002257060CE3F072F083E0A4647344741FA000617
S3150002258060000FD18201F221F20572E812F002F08C2
S31500022590610000763A1FC040670C9A400C45003332
S315000225A06C04300A609A90404ED0225F205F201F52
S315000225B0261F9442E39095423442E198E79824001C
S315000225C0024007FF6714B142E28A08C2001FE19B7C
S315000225D0E79BB7420243F800B742221F2A1F9844DC
S315000225E0E39199443644E199E7992801024107FFAC
S315000225F06714B344E28C08C4001FE19DE79DBB4407
S3150002260000245F800BB444ED1225F205F201F261FE1
S315000226109442E39095423442E198E79824000240BE
S31500022620 07FF6714B142E28A08C2001FE19BE79BDB
S31500022630B7420243F800B7424ED1068300000400B7
S315000226406 40A52826406E292E2935240C0406F46A6
S3150002265 00C4007FF6C2E0243F800B5430242F80015
S31500022660B5439241E392D440E09AE69A300AE340B7
S31500022670E292E09BE69B2F032F024ED070FF2F00C3
S3150002268 02F004ED0200A223CFFE00000E340E291F8
S3150002269042A72F014ED04E7160024E7142A742A749
S315000226A04ED0205F95CAC08066042F004ED06C04BF
S315000226B0538A4480243C0000008E4840C04067068E
S315000226C04840064200 10C0806B065342E3806AFA15
S315000226D0C1426000034E6100032861024ED0C04031
S315000226E0660490804E750C40007F64089080003C22
S315000226F000114E750440009E650870FFE288908ABC
S315000227004E754440E0BA72FFE0A94681C282B382A6
S3150002271 0200AB580908A74FFD2824E75610002E269
S31500022720 61BC6408B4FC0000670253804ED06100AD
S31500022730 02D00C400096640002EA36000443007E92
S31500022740 6E14340A66082F3C000000004ED02F3C5F
S315000227500BF8000004ED072FFE6A97601D681C28202
S31500022760670002C0B382B4FC0000670002B6D483DD
S315000227706404E3925240600002AA610002460C40E1
S315000227800 0FF661EE38A660002C40C4100FF660073
S315000227900 2C2E38B660002B6B7CA660002B06000E8
S315000227A002B20C4100FF660CE38B660002A0244BCA
S315000227B0600002A0C241670AC040660A30012403D3
S315000227C0244B60000274B0416406C543C141C54B47
S315000227D0924044410C41001862000248E2ABB7CA7B
S315000227E0660ED4836400023CE29252406000 0234D8
S315000227F09483670002726404448 2244BC4826B0091
S31500022800 0225340D4825BC8FFFC600002166100BC
S31500022810 01B2380A3A0BB9453445C040660C0C4140
S31500022820 00FF670002286000023E0C4000FF661EA1
S31500022830E38A66000218C241670002120C4100FFD9
S31500022840 66000210E38B6700020A60000200C241C2
S31500022850670002140C4100FF660AE38B670001F46D
S315000228606 00001EAD0410440007E38023A03484241
S31500022870CAC24843C8C3C4C3DA849B4544454845D3
S31500022880D4856B00019E5340D4826000019661009C
S315000228900132C54BC141C543600461000126380AB5
S315000228A03A0BB9453445C0406618C2416700019EDD
S315000228B00C4100FF6600019CE38B670001966000F5
S315000228C0018C0C4000FF6618E38A66000180C24153
S315000228D0670001940C4100FF660001886000016EEA
S315000228E0C2416700 01820C4100FF660AE38B670062
S315000228F00162600001589041444006400 07FC54392
S315000229002802E28C484388C334043A0448424244CB
S31500022910 88C3340428034244E28C88C3C8C5E08CC9
S31500022920EE8C94846B0000FC5340D482600000F469
S3150002293061000 0900C4000FF662AE38A6706700277
S31500022940 44C04ED00C4100FF6608E38B66F0B6CA5F
S31500022950 67EC300A0A40000860023 00B02400008A9
S31500022960 44C04ED00C4100FF6606E38B66D060EA97
S31500022970B6CA66E638003A0098416A043A01444407
S31500022980E24C670A92409140320AB34060CE3F055C
S3150002299 02F083A0A4645344541FA00066000FE16FB
S315000229A0201F20572E802F08610000563A1FC04074
S315000229B0670C9A400C4500146C04300A609E9040E5
S315000229C04ED0225F205F201FE38095423442E19879
S315000229D02400024000FF670A0242FE00E28A08C2A1
S315000229E0001F221FE38197433643E19926010241E4
S315000229F000FF670A0243FE00E28B08C3001F4ED1A6
S31500022A00225F205F201FE38095423442E198240032
S31500022A1 0024000FF670A0242FE00E28A08C2001F65
S31500022A204ED1068200000806404E2925240C04009
S31500022A306F300C4000FF6C1A0242FF00E382D44062
S31500022A40E09A300AE340E2922F024ED070FF2F0046
S31500022A504ED0200A223CFF000000E340E2912F0103
S31500022A604ED04E7160024E7190802F004ED02F07CD
S31500022A7033C000A00670486F000C204F2F28000CB0
S31500022A802F3900026A5248790000445A4EB90002B0
S31500022A902BEC3E0033C000A006722E1F4E754E71FF
S31500022AA04E714E712F0733C000A00674206F0008C6
S31500022AB04210486F0010204F2F280010486F001058
S31500022AC04879000242444EB900022BEC3E0033C064
S31500022AD000A006762E1F4E754E714E714E7148E756
S31500022AE0070C33C000A006783E2F00183A2F001AB2
S31500022AF02A6F001C286F0020600E2F0C3F054E9592
S31500022B00B0456704700160124A475EC044004880BF
S31500022B103C0053474A4666E2424033C000A0067A6A
S31500022B204CDF30E0205F4FEF000C4ED04E714E71FD
S31500022B304E7148E7071C33C000A0067C3A2F001CE2
S31500022B40266F0022286F00262A6F002A1C2B0003FC
S31500022B5048861E1348870C470030671A4A2B000521
S31500022B6066142F0D2F0C3F07204F3F28002A61C0C5
S31500022B70FF6E4A4066584A45670A2F0D3F054E9436
S31500022B80B045664A4A4667264A6F001E67202F0DE1
S31500022B903F3C00304E940C40003066320C6F00020F
S31500022BA0001E660A2F0D3F064E94B04666200C475D
S31500022BB00030661E4A2B000566182F0D2F0C3F07A4
S31500022BC0204F3F28002A6100FF164A40670470FF23
S31500022BD0600242 4033C000A0067E4CDF38E0205F30
S31500022BE04FEF00124ED04E714E714E7148E73F3E86
S31500022BF033C000A006804FEFFFCC2C6F0064246F19
S31500022C0000682A6F006C286F00704244422F002829
S31500022C10600005220C470025660C528D1E1548875A
S31500022C200C47002566125244 2F0A3F074E96B047BC
S31500022C3067000500600004F81F7C0020000C1F7C62
S31500022C400020000D422F000E422F000F422F0010CF
S31500022C50422F00113F7CFFFF00123F7CFFFF001452
S31500022C600C47002D66081F7C0001001160360C47D8
S31500022C70002B66081F7C0001000E60280C4700200E
S31500022C8066081F7C00010010601A0C4700236608C4
S31500022C901F7C0001000F600C0C470030660E1F7C83

S31500022CA00030000C528D1E15488766B40C47002A68
S31500022CB057C0440048803F40002C4A406708528D66
S31500022CC01E154887602E207C0002A7970830000256
S31500022CD0700067202F0D4EB90002440E3F400012CD
S31500022CE0528D1E154887207C0002A79708300002E5
S31500022CF0700066EC42430C47002E663E528D1E154E
S31500022D0048870C47002A57C0440048803600670BA7
S31500022D10528D1E15488760222F0D4EB90002440EB1
S31500022D203F4000146006528D1E154887207C000223
S31500022D30A797083000002700066EC42450C4700680F
S31500022D40670C0C47006C67060C47004C66083A078E
S31500022D50528D1E154887426F0032426F0030426F15
S31500022D60002A3F0748790002A59A4EB900025D7A09
S31500022D7026404A80670000B84A6F002C6718548CB8
S31500022D803F6CFFFE00124A6F00126C0A1F7C0001A4
S31500022D900011446F00124A436714548C3F6CFFFEC5
S31500022DA000144A6F00146C063F7CFFFF0014B7FC48
S31500022DB00002A59B621230050C40006C672C548CF5
S31500022DC0342CFFFE48C26066B7FC0002A59F621261
S31500022DD030050C40006C6712548C7400342CFFFED4
S31500022DE0604CB7FC0002A5A06208588C242CFFFC9C
S31500022DF0603CB7FC0002A5A465340C6FFFFF00140B
S31500022E0066063F7C000600140C45004C6610508C8A
S31500022E102F6CFFF800042F6CFFFC00086010588C22
S31500022E20486CFFFC486F00084EB900021DF63007D9
S31500022E300C4000786200017C207C0000003372OE98
S31500022E405288B03B88FE53C9FFF866000166D281FC
S31500022E50323B18064EFB100200A8008A011C00A293
S31500022E60006C00F6002E00D000D000D0002E0152D9
S31500022E7000A200D000D04547586364656667696E54
S31500022E806F707375784E486F00173F3C00003F3CE9
S31500022E90000A2F024EB9000255F22640101B488046
S31500022EA03F4000324A2F000E66740C40002B666EBD
S31500022EB04A2F001067083F7C002000326060426F94
S31500022EC00032605A486F00173F3C00003F3C000842
S31500022ED02F024EB90002573826403F7C00010030CF
S31500022EE0603C486F00173F3C00003F3C000A2F023F
S31500022EF04EB90002573826406024 3F7C0001002A62
S31500022F00486F0017204F3F28002E3F3C00102F022B
S31500022F104EB90002573826403F7C000200303F7C03
S31500022F200001002E600000A0486F000C3F07486FAA
S31500022F30000A2F0A2F0E4EB9000251CE3C004A4615
S31500022F406D0001ECD8463F7C0002002E6078300509
S31500022F500C40006C660E588C300448C0206CFFFC96
S31500022F60208060085 88C206CFFFC30843F7C000374
S31500022F70002E6052588C266CFFFC426F002E0C6F9E
S31500022F80FFFF0014660C2F0B4EB900024D602C0099
S31500022F9060342E8B4246600452465297BC6F001430
S31500022FA06C2420574A10671E60EE548C42471E2C32
S31500022FB0FFFF1F47002747EF00273F7C0001001451
S31500022FC07C01426F002E0C6F0001002E660000E8A5
S31500022FD00C6FFFFF001467061F7C0020000C4A825C
S31500022FE06612426F003042401F40000F4A6F0014C3
S31500022FF060242132F0B4EB900024D602C00362F8B
S315000230000001496464A436F124A2F000F670E0C6F42
S31500023010000100306606534360024 2433A2F001213
S315000230209A469A434A2F000F670C9A6F0030D86F60
S315000230300000301F47000F4A6F00326704534552445F
S31500023040 4A456C0242453006D045D043D8402F0A45
S3150002305 02F0E486F00143F05204F3F28003E204F99
S31500023060 3F2800426100FACC4A40660000C22F0A9D
S31500023070 2F0E3F3C00303F036100FA644A4067105E
S31500023080600000AC2F0A3F074E96B047660000A0CC
S31500023090 42471E1B66EE4A2F00116700009 62F0A52
S315000230A02F0E102F001548803F003F056100FA30B1
S315000230B04A40677E60784A6F002E66760C6FFFFF85
S315000230C00014670A302F0014B0466C023C003E2FF3
S315000230D000129E464A476C0242473006D047D84005
S315000230E04A2F001166262F0A2F0E102F0014488031
S315000230F03F003F076100F9E84A40671060304245E9
S3150002310 01A1B2F0A3F054E96B04566223A0651CE45
S31500023110FFEE4A2F0011671A2F0A2F0E102F0015E5
S315000231 2048803F003F076100F9B64A40670470FFD6
S31500023130600C528D42471E156600FADA30044FEFD4
S3150002314 0003433C000A006824CDF7CFC205F4FEFC8
S315000231500 00104ED04E714E714E7133C000A00684DF
S31500023160322F00044A416E0630014440600230 01AB
S31500023170 33C000A00686205F548F4ED04E714E712A
S31500023180 4E714E56FFF833C000A006882D49FFFC4B
S3150002319 03F3C00002F2E000843EEFFF8615843EE35
S315000231A0FFF8206EFFFC209133C000A0068A4E5E17
S315000231B0205F588F4ED04E714E714E714E56FFF8AB
S315000231C033C000A0068C2D49FFFC3F3C00012F2E88
S315000231D0000843EEFFF8611E43EEFFF8206EFFFC87
S315000231E0209133C000A0068E4E5E205F588F4ED0CF
S315000231F04E714E714E714E56FFDC48E7031C33C0CA
S3150002320000A006902D49FFFC48790002A5D2486E1F
S31500023210 00084EB900021FF24A405DC044004880D1
S3150002322 03C003E2E000C4BEEFFF82F2E0008224DDE
S315000232304EB9000249BC49EEFFF448790002A5E600
S3150002324 02F0D4EB900021FF24A406C062895600007
S31500023250010247EEFFF048790002A5EA2F0D4EB9AA
S31500023260 00021FF24A406F723007444052403E004D
S3150002327048790002A5EE2F0D4EB900021FF24A4010
S3150002328 06F1233FC002100C0C8A8227C0002A5D21E
S3150002329 06000011C3F3CFFFF2F0D48790002A5EE9E
S315000232A0486EFFEC4EB900021F822F2EFFEC224B16
S315000232B04EB900024A342F13224D4EB900023CEC9D
S315000232C03F3C00012F1543EEFFEC4EB900024A3493
S315000232D02AAEFFEC0A558000600C2F0D2F0D2F0B26
S315000232E04EB900021FAE48790002A5AA3F3C00046F
S315000232F02F1343EEFFE84EB9000248A648790002B2
S31500023300A5BE3F3C00052F1343EEFFEC4EB900026B
S3150002331049242F0B2F0D486EFFE44EB900021FAE53
S315000233 20486EFFE8486EFFE4486EFFE04EB90002C1
S31500023330 1FAE486EFFEC486EFFE0486EFFDC4EB9EA
S315000233400 00021FC4486EFFDC2F0D2F0C4EB900027F
S31500023350 1F5A4A6E000C67364A466718300748C03D
S31500023360E58806800002A5DE2F002F0C4EB900026A
S31500023370 1CD660382F0C300748C0E588068000024C
S31500023380A5D62F002F0C4EB900021F82601E3007F1
S3150002339048C0E58806800002A5D62F002F0C4EB93C
S315000233A000021CD64A4667040A548000224C206E4C
S315000233B0FFFC209133C000A006924CDF38C04E5E5F
S315000233C0205F5C8F4ED04E714E714E714E56FFDCB1
S315000233D048E7010C33C000A006942D49FFFC424782
S315000233E04BEEFFF82F2E0008224D4EB9000249BCC3
S315000233F048790002A6222F0D4EB900021FF24A405A
S3150002340 06F122F0D48790002A6222F0D4EB9000227
S31500023410 1FC47E0248790002A6262F0D4EB900026D
S3150002342 01FF24A406F4A48790002A62A2F0D486EBB
S31500023430FFEC4EB900021F5A48790002A62A2F0D48
S31500023440486EFFE84EB900021FAE48790002A62E6A
S31500023450486EFFE8486EFFE44EB900021F5A486EF6
S31500023460FFEC486EFFE42F0D4EB900021FC452470F
S31500023470 2F1543EEFFEC4EB9000249BC49EEFFF0B0
S3150002348048790002A632486EFFEC4EB900021FF2DE
S315000234904A406C062895600000822F0D2F0D486E5B
S315000234A0FFF44EB900021FAE48790002A5F23F3C76
S315000234B000032F2EFFF443EEFFE84EB9000248A6A2
S315000234C048790002A6023F3C00042F2EFFF443EE89
S315000234D0FFEC4EB900024924486EFFF42F0D486EE8
S315000234E0FFE44EB900021FAE486EFFE8486EFFE4E5
S315000234F0486EFFE04EB900021FAE486EFFEC486E02
S31500023500FFE0486EFFDC4EB900021FC4486EFFDCC6
S315000235102F0D2F0C4EB900021F5A0C4700016F04E3
S31500023520 0A548000300748C0E58806800002A612C9
S3150002353 02F002F0C4EB900021CD648790002A6367F
S31500023540486E00084EB900021FF24A406C040A5443
S31500023550 8000224C206EFFFC209133C000A006960C
S315000235604CDF30804E5E205F588F4ED04E714E71CA
S315000235704E714E56FFF02F0D33C000A006982D490E
S31500023580FFFC4BEEFFF8486E000C4EB900021FDA44
S315000235904A006620486E00084EB900021FDA4A0049
S315000235A0664633FC002100C0C8A8227C0002A6366B
S315000235B060000092486E000C486E0008486EFFF0EC
S315000235C04EB900021FC42F2EFFF043EEFFF44EB990
S315000235D0000249BC48790002A63A486EFFF44EB989
S315000235E000021FF24A406D082ABC3FC90FDB600A7F
S315000235F02F2EFFF4224D6100FDD448790002A63633
S31500023600486E000C4EB900021FF24A406C1C2D5542
S31500023610FFF40A6E8000FFF448790002A63E486E67
S31500023620FFF42F0D4EB900021F5A48790002A63642
S31500023630486E00084EB900021FF24A406C040A5551
S3150002364 08000224D206EFFFC209133C000A0069A16
S3150002365 02A5F4E5E205F508F4ED04E714E714E7174
S315000236604E56FFF848E7030033C000A0069C2D49DA
S31500023670FFFC3E2E00083C2E000A41EEFFF8300702
S3150002368048C081C6208043EEFFF8206EFFFC2091E1
S3150002369033C000A0069E4CDF00C04E5E205F588FEE
S315000236A04ED04E714E714E714E56FFF448E70300EE
S315000236B033C000A006A02D49FFFC2E2E00082C2E9A

S315000236C0000C41EEFFF420076A02448022066A02D9
S315000236D044810C8100D10000641280C1690E22003F
S315000236E04241484102800000FFFF601E2F011F3C3D
S315000236F000204281E388E391B2AF0002650692AFF1
S31500023700000025280531766EC5C8F4A876A02448134
S315000237102081220 7B3866A024480214000 0443EED8
S31500023720FFF4206EFFFC20D9209133C000A006A230
S3150002373 04CDF00C04E5E205F508F4ED04E714E71F0
S315000237404E712F002F014A806A0244804A816A0222
S31500023750448 10C81000100006412 80C1690E2200BE
S315000237604241484102800000FFFF601E2F011F3CBC
S3150002377000204281E388E391B2AF0002650692AF70
S31500023780000025280531766EC5C8F221FB39F6A02B7
S315000237904480 4E7548E7C0004A806A0244804A81E6
S315000237A06A0244810C8100010000641280C1690E24
S315000237B022004241484102800000FFFF601E2F01A5
S315000237C01F3C00204281E388E391B2AF0002650606
S315000237D092AF00025280531766EC5C8F4A9F6A02D0
S315000237E044812001221F4E754E56FFCE48E7000C3B
S315000237F033C000A006A42D49FFFC49EE0008487913
S31500023800 0002A6562F0C4EB900021FF24A406C1255
S315000238101033FC002100C0C8A8227C0002A656600024
S3150002382 0014E2F0C4EB900021FDA4A00661233FC13
S315000238300002200C0C8A8227C0002A65A60000130FD
S31500023840 4BEEFFF62ABC3F800000486EFFFA2F14AB
S3150002385 0224C4EB9000249F248790002A65E2F0CAC
S31500023860 4EB900021FF24A406E0A2ABC3F0000000F
S315000238705 36EFFFA3F3C00012F0D2F0C486EFFF2EC
S31500023880 4EB900021F5A2F0D2F0C486EFFEE4EB98D
S31500023890 00021F82486EFFF2486EFFEE486EFFEA94
S315000238A04EB900021FC42F2EFFEA224D4EB9000266
S315000238B04A342F0D2F0D486EFFF24EB900021FAE8D
S315000238C048790002A6423F3C00022F2EFFF243EE49
S315000238D0FFEA4EB9000248A648790002A64E3F3CCE
S315000238E000022F2EFFF243EEFFEE4EB900024924EC
S315000238F0302EFFFA486EFFE648C04EB90002420477
S3150002390048790002A662486EFFE6486EFFE24EB9AB
S31500023910000021FAE486EFFF22F0D486EFFDE4EB953
S31500023920000021FAE486EFFEA486EFFDE486EFFDAFF
S315000239304EB900021FAE486EFFEE486EFFDA486EC1
S31500023940FFD64EB900021FC4486EFFD62F0D486E31
S31500023950FFD24EB900021F5A486EFFE2486EFFD2EE
S31500023960486EFFCE4EB900021F5A43EEFFCE206EBE
S31500023970FFFC209133C000A006A64CDF30004E5E4D
S31500023980205F588F4ED04E714E714E714E56FFF4D7
S3150002399033C000A006A82D49FFFC2F2E000843EED7
S315000239A0FFF86100FE4448790002A65A486EFFF805
S315000239B04EB900021FF24A406608227C0002A65A4D
S315000239C0601848790002A666486EFFF8486EFFF452
S315000239D04EB900021FAE43EEFFF4206EFFFC2091AB
S315000239E033C000A006AA4E5E205F588F4ED04E719D
S315000239F04E714E714E56FFF048E7010433C000A0E7
S31500023A0006AC2D49FFFC4BEE000C4247486E0008FF
S31500023A104EB900021FDA4A006614487900002A65619
S31500023A202F0D4EB900021FF24A406F3260384879B4
S31500023A3000002A656486E00084EB900021FF24A401E
S31500023A406C2E2F1543EEFFF84EB9000247A0486EC2
S31500023A50FFF82F0D4EB900021FF24A40671033FCE1
S31500023A6000002100C0C8A8227C0002A65660727E0110
S31500023A704A4767122D6E0008FFF00A6E8000FFF0BB
S31500023A8043EEFFF0600443EE00082F1143EEFFF40D
S31500023A906100FD56486EFFF42F0D486EFFF04EB9D9
S31500023AA000021FAE2F2EFFF043EEFFF84EB90002C2
S31500023AB044A84A4767262F3C400000002F1543EED4
S31500023AC0FFF44EB9000246A6486EFFF44EB9000254
S31500023AD01FDA4A0067060A6E8000FFF843EEFFF817
S31500023AE0206EFFFC209133C000A006AE4CDF208082
S31500023AF04E5E205F508F4ED04E714E714E7148E72A
S31500023B000F3E33C000A006B02C6F00282A2F0030CB
S31500023B10200ED085244078FF60342A4A602A200D80
S31500023B20908526402F0D2F0B206F003C4E904A4069
S31500023B306F1A284D2A4B2E0560081C1418D51AC672
S31500023B40DE844A8762F42A4BBBCE62D2D5C5B5EF74
S31500023B50002C63C633C000A006B24CDF7CF0205FA7
S31500023B604FEF00104ED04E714E714E7148E70F3E28
S31500023B7033C000A006B478FF266F00282C2F003031
S31500023B80600000D82007E28822064EB90002625E73
S31500023B90D08B28402A4B2E0660081A1418D51AC54F
S31500023BA0DE844A8762F4200BD08628402A6F002CD6
S31500023BB06002D9C6B9EF002C64122F0B2F0C206FAE
S31500023BC0003C4E904A406C0460E89BC6BBCB630E39
S31500023BD02F0B2F0D206F003C4E904A406EECB9CD54
S31500023BE0641A2C4C244D2E0660081A161CD214C5D3
S31500023BF0DE844A8762F4D9C69BC660B8BBCB67141B
S31500023C002C4D244B2E0660081A161CD214C5DE84CF
S31500023C104A8762F4200D908B222F002C928CB08161
S31500023C206F1E204F2F2800342F06204F2F2B0034D6
S31500023C302F0C6100FF38200D90862F40002C601A51
S31500023C40BBCB6714204F2F2800342F06200D9086F9
S31500023C502F002F0B6100FF16264C202F002CB08B55
S31500023C606314908B22064EB900025BBC2E00700ACA
S31500023C70BE806400FF1033C000A006B64CDF7CF0A5
S31500023C80205F4FEF00104ED04E714E714E7148E7D5
S31500023C90011C33C000A006B8286F00142E2F001C8A
S31500023CA0266F00204AAF0018672A202F001853807B
S31500023CB022074EB90002625ED08C2A402F0B2F07D4
S31500023CC02F0D2F0C6100FEA62F0B2F072F0D2F0C89
S31500023CD06100FE2C33C000A006BA4CDF3880205F9C
S31500023CE04FEF00104ED04E714E714E714E56FFEA96
S31500023CF048E7030433C000A006BC2D49FFFC486E0A
S31500023D0000084EB900021FDA4A00671C4879000211
S31500023D10A66A486E00084EB900021FF24A406C12AB
S31500023D2033FC002100C0C8A8227C0002A66A6000FB
S31500023D3000AA486EFFF22F2E000843EEFFF44EB99A
S31500023D40000249F24BEEFFF848790002A672486E6D
S31500023D50FFF4486EFFEE4EB900021FAE487900022C
S31500023D60A66E486EFFEE2F0D4EB900021F5A7E0256
S31500023D7060303F3CFFFF2F0D486EFFF4486EFFEEAA
S31500023D804EB900021FC4486EFFEE2F0D486EFFEAC1
S31500023D904EB900021F5A2F2EFFEA224D4EB90002DB
S31500023DA04A343C0751CFFFCC082E0000FFF36712BE
S31500023DB048790002A6762F0D4EB900021D0C526EEE
S31500023DC0FFF2302EFFF2E2403F002F1543EEFFEEE8
S31500023DD04EB900024A3443EEFFEE206EFFFC2091FC
S31500023DE033C000A006BE4CDF20C04E5E205F588F57
S31500023DF04ED04E714E714E714E56FFE448E7013C6D
S31500023E0033C000A006C02D49FFFC49EE000847EE6C
S31500023E10000C2F0C4EB900021FDA4A0066162F0B51
S31500023E204EB900021FDA4A00660A227C0002A66A1E
S31500023E30600000DA2F14224C4EB9000249BC2F133F
S31500023E40224B4EB9000249BC2F0B2F0C4EB9000271
S31500023E501FF24A405EC0440048803E0067142F0CA1
S31500023E602F0B486EFFF44EB900021FC44BEEFFF44F
S31500023E7060122F0B2F0C486EFFF84EB900021FC4BA
S31500023E804BEEFFF845EEFFF024952F0A2F0A486EF7
S31500023E90FFE84EB900021FAE48790002A67A486EC4
S31500023EA0FFE8486EFFE44EB900021F5A2F2EFFE4C8
S31500023EB043EEFFEC6100FE364A4767042A4C600275
S31500023EC02A4B2495486EFFEC48790002A67E486E7E
S31500023ED0FFE84EB900021FC4486EFFE82F0A4EB92A
S31500023EE000021FF24A406F1033FC002200C0C8A82D
S31500023EF0227C0002A67E6014486EFFEC2F0A486EF2
S31500023F00FFE84EB900021FAE43EEFFE8206EFFFC4B
S31500023F10209133C000A006C24CDF3C804E5E205F7B
S31500023F20508F4ED04E714E714E712F0B33C000A082
S31500023F3006C4226F0008206F000C26494A1966FC47
S31500023F40538912D866FC200B33C000A006C6265F32
S31500023F50205F508F4ED04E714E714E7133C000A00D
S31500023F6006C8226F0004206F000860045289528836
S31500023F701011B01066044A0066F242401011424126
S31500023F801210904133C000A006CA205F508F4ED057
S31500023F904E714E714E712F0B33C000A006CC226FAC
S31500023FA00008206F000C264912D866FC200B33C08D
S31500023FB000A006CE265F205F508F4ED04E714E7106
S31500023FC04E7148E7061033C000A006D0226F0010DB
S31500023FD0206F0014222F001826497AFF6006D28528
S31500023FE012D867084A8162F6600242194A8152C0B3
S31500023FF0440048803C00D2854A4666EE200B33C018
S315000240000000A006D24CDF0860205F4FEF000C4ED0B6
S315000240104E714E714E714E56FFF848E7001C33C082
S3150002402000A006D42D49FFFC266E0008286E000C5F
S315000240302A4B6002528D7000101506800002A79767
S3150002404020400810000366EC3F3CFFFF2F0C2F0DAB
S3150002405043EEFFF84EB900024272200C67082014A4
S31500024060B08D6602288B43EEFFF8206EFFFC20918E
S3150002407033C000A006D64CDF38004E5E205F508F5C
S315000240804ED04E714E714E7148E7013E33C000A0CC
S3150002409006D82C7C00C0C8A4266F001C246F002002
S315000240A0200B660226562F0A2F0B4EB900024D88A8
S315000240B0D7C04A13660470006024284B60182A4A47
S315000240C01015B007660A421441EC00012C88600CF8
S315000240D04A1D66EC528C1E1466E42C8C200B33C0EF

S315000240E000A006DA4CDF7C80205F508F4ED04E71E6
S315000240F04E714E7148E7011C33C000A006DC266FE4
S31500024100014286F00182A4B6002528D7000101599
S315000241100680002A79720400810000366EC3F3C89
S31500024120FFFF204F3F28001E2F0C2F0D4EB9000215
S315000241305646 2E00200C67082014B08D6602288B86
S31500024140200733C000A006DE4CDF3880205F4FEF29
S31500024150000A4ED04E714E714E7148E7011C33C0B3
S31500024160000A006E0266F0014286F00182A4B600292
S315000241705 28D700010150680000 2A7972040081085
S3150002418000036 6EC4878FFFF3F3CFFFF204F3F28C5
S315000241900022 2F0C2F0D4EB9000243502E00200C88
S315000241A067082014B08D6602288B200733C000A052
S315000241B006E24CDF3880205F4FEF000A4ED04E7188
S315000241C04E714E714E56000048780001 2F002F2E78
S315000241D00008207CFFFFDCC24EBB88FE4E5E205FDD
S315000241E0584F4ED04E560000487800002F002F2E12
S315000241F00008207CFFFFDCA24EBB88FE4E5E205FDD
S31500024200584F4ED04E5600004878000 12F002F2EF0
S3150002421000008207CFFFFDE184EBB88FE4E5E205F44
S31500024220584F4ED04E560000487800002F002F2ED1
S3150002423000008207CFFFFDDF84EBB88FE4E5E205F45
S31500024240584F4ED033C000A006E4226F000620511C
S31500024250 10AF00055291205142104240102F000526
S31500024260 33C000A006E6205F5C8F4ED04E714E71C1
S3150002427 04E714E56FFF448E7010C33C000A006E823
S31500024280 2D49FFFC286E000C3F2E0010486E0008D8
S31500024290 4BEEFFF82F0D4EB900024EAE3E006656AB
S315000242A02F0D4EB900021FDA4A00674A487900020A
S315000242B0A6822F0D4EB900021FF24A406F027E01FE
S315000242C048790002A6862F0D4EB900021FF24A4017
S315000242D06C027EFF2F1543EEFFF44EB9000249BC75
S315000242E048790002A68A486EFFF44EB900021FF210
S315000242F04A406C027E020C47FFFF66062ABCFF7F1D
S31500024300FFFF0C47000166062ABC7F7FFFFF0C47B2
S315000243100000266062ABC000000004A47670833FC12
S315000243200002200C0C8A8200C670428AE0008224D4F
S3150002433020 6EFFFC209133C000A006EA4CDF3080DD
S315000243404E5E205F4FEF000A4ED04E714E714E7197
S315000243504 8E7033E33C000A006EC518F286F0028C1
S315000243600266F002C3E2F00322A4C424645EF0004AF
S3150002437 04DD70C15002D66047C0160060C15002B2A
S315000243800 66124A4766062C8C429260604A476F0262
S3150002439053475 28D204F3F2800303F072F0E2F0DD7
S315000243A02F0A4EB900025A164A40670E0C40000107
S315000243B0671E0C40000267286032429 22C8C4A47E4
S315000243C0672A0C15003066 2441ED00012C88601C1A
S315000243D02012B0AF003462084A4667104492600C5D
S315000243E024AF003433FC002200C0C8A8200B6702A9
S315000243F026962012508F33C000A006EE4CDF7CC0FA
S31500024400205F4FEF00104ED04E714E714E7148E74D
S315000244100 70033C000A006F0226F00104246424752
S31500024420 1E113A06600652894 2471E11207C00027E
S315000244 30A7970830000 3700066EC0C47002D66044F
S315000244407A01601A0C47002B661A528942471E11DE
S31500024450 6012700AC0C672D0D247D0413C0052895F
S31500024460 42471E11207C0002A797083000027000 06
S31500024470 66E04A45671A0C467FFF630E303C8001B0
S31500024480D046444006408001600830064440600 23F
S31500024490300633C000A006F24CDF00E0205F588FE2
S315000244A04ED04E714E714E714E56FFDC48E7010CEE
S315000244B033C000A006F42D49FFFC4BEE00084879F4
S315000244C00002A6A22F0D4EB900021FF24A405DC09D
S315000244D0440048803E0048790002A6A62F0D4EB938
S315000244E000021FF24A406F1233FC002200C0C8A825
S315000244F0227C0002A6AA600001904879 0002A6AEBC
S31500024500 2F0D4EB900021FF24A406C0A227C0002AD
S31500024510A6A2600001742F15224D4EB9000249BCB5
S31500024520 48790002A6B22F0D4EB900021FF24A4088
S31500024530 6C0A227C0002A6B66000014E486EFFF4A9
S315000245404 8790002A6BA2F0D486EFFE44EB9000262
S3150002455 01FAE2F2EFFE443EEFFE84EB900024AC417
S31500024560 2F2EFFE843EEFFEC4EB9000249BC487914
S31500024570 0002A6BE486EFFEC4EB900021FF24A4088
S31500024580 6D1048790002A6B6486EFFF44EB90002D5
S31500024590 1CD648790002A6C2486EFFF4486EFFE8B0
S315000245A04EB900021FAE486EFFE82F0D486EFFECB3
S315000245B04EB900021F82486EFFEC486EFFEC486E51
S315000245C0FFE84EB900021FAE48790002A68E3F3CB4
S315000245D000022F2EFFE843EEFFE44EB9000248A682
S315000245E049EEFFF0486EFFE4486EFFEC2F0C4EB921
S315000245F000021FAE48790002A69A3F3C00022F2E07
S31500024600FFE843EEFFE44EB9000249242F0C486E40
S31500024610FFE4486EFFE04EB900021F82486EFFE0DB
S31500024620 2F0C486EFFDC4EB900021FC44879000207
S31500024630A6BE486EFFDC2F0C4EB900021F5A4879FF
S31500024640 0002A6C6486EFFF4486EFFEC4EB90002A1
S31500024650 1F5A486EFFEC4EB900024D143F002F144C
S31500024660 224C4EB900024A344A4767182F0C487941
S31500024670 0002A6B6486EFFF84EB900021FC44BEE02
S31500024680FFF860022A4C224D206EFFFC209133C0B7
S31500024690 00A006F64CDF30804E5E205F588F4ED06B
S315000246A04E714E714E714E56FFE833C000A006F8A9
S315000246B02D49FFFC486E000C4EB900021FDA4A0073
S315000246C0661233FC002100C0C8A8227C0002A6CADA
S315000246D0600000B42F2E000C43EEFFF04EB900022C
S315000246E049BC486EFFF0486E0008486EFFF84EB9A6
S315000246F000021FC4486EFFF84EB900021FDA4A00D4
S31500024700660643EE0008607E2F2EFFF843EEFFECAE
S315000247104EB9000249BC48790002A6CE486EFFECAB
S315000247204EB900021FF24A406D3448790002A6CA09
S31500024730486EFFF84EB900021FF24A406F1033FC72
S31500024740 0002200C0C8A8227C0002A6CE603833FC34
S31500024750 0002200C0C8A8227C0002A6D26028486EA9
S31500024760FFF42F2EFFF843EEFFEC4EB900024AC4C7
S315000247704 86EFFEC486EFFF0486EFFE84EB9000245
S31500024780 1FAE43EEFFE8206EFFFC209133C000A06F
S3150002479006FA4E5E205F508F4ED04E714E714E71AC
S315000247A04E56FFF433C000A006FC2D49FFFC4879A3
S315000247B00002A6CA486E00084EB900021FF24A401D
S315000247C06C202F2E00080A17008043EEFFF8614284
S315000247D02D6EFFF8FFF40A6E8000FFF443EEFFF43D
S315000247E06016486E00082F2E000843EEFFF84EB9F9
S315000247F000024AC443EE0008206EFFFC209133C03B
S31500024800000A006FE4E5E205F588F4ED04E714E714E
S315000248104E714E56FFF42F0D33C000A007002D49EE
S31500024820FFFC4BEE000848790002A6CA2F0D4EB9CE
S31500024830000021FF24A406C202F150A17008043EE31
S31500024840FFF86100FF5C2D6EFFF8FFF40A6E800030
S31500024850FFF443EEFFF460322F0D2F1543EEFFF8FF
S315000248604EB900024AC448790002A6CA486EFFF849
S315000248704EB900021FF24A406F0E48790002A6D6D0
S315000248802F0D4EB900021CD6224D206EFFFC209140
S3150002489033C000A007022A5F4E5E205F588F4ED0BB
S315000248A04E714E714E714E56FFF448E7030C33C0FB
S315000248B000A007042D49FFFC3E2E000C2A6E000EB6
S315000248C04A476C08227C0002A6CA6038300748C0F4
S315000248D0E588DBC049EEFFF82895601E486E0008A1
S315000248E02F0C486EFFF44EB900021FAE2F0D486E14
S315000248F0FFF42F0C4EB900021F5A598D3C0751CFB7
S31500024900FFDC224C206EFFFC209133C000A007067C
S315000249104CDF30C04E5E205F4FEF000A4ED04E7124
S315000249204E714E714E56FFF448E7030C33C000A099
S3150002493007082D49FFFC3E2E000C2A6E000E4A4740
S315000249406C08227C0002A6CA60524A476608227C8C
S315000249500002A6D660465347300748C0E588DBC04A
S31500024960 49EEFFF82F0D486E00082F0C4EB90002D3
S31500024970 1F5A601E486E00082F0C486EFFF44EB98F
S31500024980 00021FAE2F0D486EFFF42F0C4EB9000227
S31500024990 1F5A598D3C0751CFFFDC224C206EFFFC7B
S315000249A0209133C000A0070A4CDF30C04E5E205F64
S315000249B04FEF000A4ED04E714E714E714E56FFFCAD
S315000249C033C000A0070C2D49FFFC486E00084EB903
S315000249D00024B0243EE0008206EFFFC209133C01A
S315000249E000A0070E4E5E205F588F4ED04E714E715C
S315000249F04E714E56FFF833C000A007102D49FFFC3A
S31500024A00486EFFF8486E00084EB900024B38206E19
S31500024A10000C30AEFFFA43EE0008206EFFFC209138
S31500024A2033C000A007124E5E205F508F4ED04E71EB
S31500024A304E714E714E56FFF433C000A007142D4935
S31500024A40FFFC4A6E000C6C083D7CFFFFFFF8600419
S31500024A50426EFFF83D6E000CFFFA486EFFF4486E98
S31500024A60FFF8486E00084EB900024BB84A6EFFF6D0
S31500024A70673448790002A6DA486E00084EB9000289
S31500024A801FF24A406C1033FC002200C0C8A8227CE8
S31500024A900002A6DE601433FC002200C0C8A8227CF5
S31500024AA00002A6E2600443EE0008206EFFFC20919D
S31500024AB033C000A007164E5E205F5C8F4ED04E714B
S31500024AC04E714E714E56FFF833C000A007182D499D
S31500024AD0FFFC2F2E000C486EFFF8486E00084EB9F8
S31500024AE000024C5043EEFFF8206EFFFC209133C0CB
S31500024AF000A0071A4E5E205F508F4ED04E714E7147

S31500024B004E712F0D33C000A0071C2A6F00082F0D0F
S31500024B104EB9000220844A80670A2F0D2F0D4EB926
S31500024B2000021F3633C000A0071E2A5F205F588F7F
S31500024B304ED04E714E714E7148E7010C33C000A043
S31500024B4007204FEFFFF42A6F001C286F00202F0D5D
S31500024B504EB900021FDA4A80671C2F0D486F000407
S31500024B604EB900025DEC7030C02F000A6608082FAD
S31500024B700006000A670442946024 3E2F000848C7D4
S31500024B8052873F7CFFFF000848574EB90002603C3F
S31500024B909E80288748572F0D4EB900025BFA4FEFC9
S31500024BA0000C33C000A007224CDF3080205F508FFC
S31500024BB04ED04E714E714E7148E7011C33C000A0B3
S31500024BC007244FEFFFF42A6F0020266F0024286F78
S31500024BD0002842942F0D4EB900021FDA4A8067540C
S31500024BE02F0D486F00044EB900025DEC7030C02FE5
S31500024BF0000A6640082F0006000A66382E13302F78
S31500024C00000848C0DE800C8700003E806E220C87BA
S31500024C10FFFFC1806D1A3F47000848572F0D4EB956
S31500024C2000025BFA2F0D4EB9000220984A806704F3
S31500024C30700128804FEF000C33C000A007264CDF1E
S31500024C403880205F4FEF000C4ED04E714E714E7180
S31500024C5048E7001C33C000A007284FEFFFE42A6F85
S31500024C60002C286F0030266F00342F0D4EB900023B
S31500024C701FDA4A80671C2F0D486F00144EB90002D6
S31500024C805DEC7030C02F001A6608082F0006001A65
S31500024C906706289526956 0604A6F00186C0C289561
S31500024CA02F0B4EB9000220B4604E4BD72ABC7FFFB1
S31500024CB0FFFF43EF001041EF000420D920D92091D5
S31500024CC042A7302F001C48C02F002F0D4EB90002FC
S31500024CD05F642015C1AF001046952015C1AF0004D0
S31500024CE0486F00102F0C4EB900025BFA486F0004A1
S31500024CF02F0B4EB900025BFA4FEF001C33C000A027
S31500024D00072A4CDF3800205F4FEF000C4ED04E7161
S31500024D104E714E714E56FFFC487800012F2E000848
S31500024D20486EFFFC207CFFFFD33A4EBB88FE202E46
S31500024D30FFFC4E5E205F584F4ED04E56FFFC487821
S31500024D4000002F2E0008486EFFFC207CFFFFD314C4
S31500024D504EBB88FE202EFFFC4E5E205F584F4ED083
S31500024D6033C000A0072C226F000420494A1966FCB2
S31500024D7020099088538033C000A0072E205F588FE9
S31500024D804ED04E714E714E7148E7010433C000A0F9
S31500024D900730226F000C206F0010720060102A4844
S31500024DA01015B00767064A1D66F6600652811E197F
S31500024DB066EC200133C000A007324CDF2080205F62
S31500024DC0508F4ED04E714E714E7148E7070433C074
S31500024DD000A007342A6F00143C2F00183A2F001A3D
S31500024DE00C4602606D064240600000AE0C46013081
S31500024DF06F26044601304A45661048790002A7929A
S31500024E002F0D4EB900021D0C600E48790002A792C2
S31500024E102F0D4EB900021CE87E0FCE4667364A4574
S31500024E20671A30075340 48C0E58806800002A70E7D
S31500024E302F002F0D4EB900021CE860183007534080
S31500024E4048C0E58806800002A70E2F002F0D4EB936
S31500024E5000021D0C7E1F3006E840CE404A476736E8
S31500024E604A45671A3007534048C0E5880680000263
S31500024E70A74A2F002F0D4EB900021CE86018300712
S31500024E80534048C0E58806800002A74A2F002F0D2E
S31500024E904EB900021D0C700133C000A007364CDF6C
S31500024EA020E0205F508F4ED04E714E714E7148E712
S31500024EB03F3E33C000A00738518F286F0038266F57
S31500024EC0003C3E2F00404246422F000738062A5336
S31500024ED03F4400043F4400023A043605420245EFCD
S31500024EE00001148228BC000000002C7C00024DCA7E
S31500024EF04A47670000A20C15002B67080C15002D07
S31500024F00660000940C15002D66063F7C0001000425
S31500024F104A476F025347528D607C1F7C000100078F
S31500024F204A4666060C150030670252460C460009D0
S31500024F306F0E0C437FEE6C04524360527401604E56
S31500024F400C15003067424A4467123F3C00003F049A
S31500024F502F0C4E964A40660274014244487900027A
S31500024F60A70E2F0C4EB900021D0C10154880064OE4
S31500024F70FFD048C0E58806800002A6E62F002F0C67
S31500024F804EB900021CD660064A46670252444A4798
S31500024F906F025347528D4A47670E0C1500306D0853
S31500024FA00C1500396F00FF744A4467123F3C00003B
S31500024FB03F042F0C4E964A40660274014 2444A4709
S31500024FC0670000A80C15002E660000A04A476F0273
S31500024FD05347528D600000821F7C000100074A463B
S31500024FE066060C150030670252460C4600096F042D
S31500024FF05346605C0C4380126F045343600414BC36
S315000250000014A46674A0C15003067424A44671255
S315000250103F3C00003F042F0C4E964A406602740144
S31500025020424448790002A70E2F0C4EB900021D0C0D
S3150002503010154880064OFFD048C0E5880680000269
S31500025040A6E62F002F0C4EB900021CD660025244 6F
S315000250504A476F025347528D4A47670E0C15003076
S31500025060 6D080C1500396F00FF70D6444A2F0007F1
S315000250706700 01404A6F000467040A5480004A47E9
S315000250806700009E0C15006567080C150045660052
S3150002509000904A476F025347528D4A4767200C15C4
S31500025 0A0002B67060C15002D66140C15002D6606DE
S315000250B03F7C000100024A476F025347528D4A471E
S315000250C067540C1500306D4E0C1500396F2E604674
S315000250D00C450CCB6F104A6F0002670614BC000128
S315000250E060127401600ECAFC000A1015488006406 0
S315000250F0FFD0DA404A476F025347528D4A47670C40
S315000251000C1500306D060C1500396FC44A6F00028B
S31500025110670E4445600A28BC00000000600000944 7
S31500025120 4A46660842453605340314823 00548C0AD
S3150002513032 0348C1D0810C8000007FEE6F063A3CF4
S3150002514007FEE601A300548C0320348C1D0810C8018
S31500025150FFFF80126C063A3C80126002DA43424735
S315000251 60BA476C047E0144453F073F052F0C4E9615
S315000251704A40660C4A47670614BC0001600274 0185
S31500025180268D4A02670E4A6F00046604700 1602487
S31500025190 70FF60204A12670628BC000000002F0C30
S315000251A04EB900021FDA4A0066084A4667047002D0
S315000251B060024240508F33C000A0073A4CDF7CFCAD
S315000251C0205F4FEF000A4ED04E714E714E7148E786
S315000251D03F3E33C000A0073C4FEFFFC4286F006C70
S315000251E0266F0070342F0078426F003A426F003803
S315000251F042453F4500363F4500343C053F460032B6
S31500025200 3F4600303F46002E3F46002A95CA226F8F
S315000252100007A41EF000220D920D930914DEF000AE1
S31500025220 3016B0466C043CBC00060C4200456604CF
S315000252307465 60080C420047660874673F7C00018B
S3150002524 0002A30020C40006667100C400065672495
S3150002525 00C40006767306000036448 6F0026486FA1
S315000252600 02C204F3F280012204F2F28007E3F3C63
S31500025270000 16036486F0026486F002C302F00125E
S31500025280 52403F00601A4A6F000A66063F7C0001E0
S3150002529 0000A486F0026486F002C204F3F28001254
S315000252A0204F2F28007E3F3C0000486F00244EB955
S315000252B0000257E84BEF00146002528D4A1566FA57
S315000252C06002538D200F068000000014BBC06308E5
S315000252D00C2D0030FFFF67EA200D3E0041EF00145F
S315000252E09E484A47660842433F4300286006362FD7
S315000252F0002853434BEF002C0C42006766160C4302
S315000253000FFFC6D06B66F000A6D04425560123ABC88
S315000253100001600C0C42006657C0440048803A8087
S3150002532 04A6F00266704782D6002782B4A2F000404
S31500025330 66124A6F0026660C4A2F00066704782 01A
S3150002534 060024 2444A5567344A6F00286E143F7C15
S3150002535 000010036302F002844403F4000343C070D
S31500025360602C302F0028B0476D0A3A0790473F401D
S31500025370 0036601A3A003C079C4560124A476708A5
S3150002538 07A013C07534660063F7C000100360C4218
S315000253900 0067662E4A2F0005673C4A45670A3E05A6
S315000253A0DE6F0036DE46600A4A4667043E06600243
S315000253B07E01302F000AB0476F1C90473F400032F3
S315000253C060143E2F0034DE46302F000AB0476F06C7
S315000253D0 90473F4000324A2F0005660E302F0034B8
S315000253E0D046D06F00324A406F0474016002 4242D6
S315000253F04A5566644A436C0A3EBC002D3E03444746
S3150002540060063EBC002B3E0345EF0014300748C041
S31500025410 81FC000A48400600003015004 8C78FFC90
S315000254200 00A4A4766E6200F068000000013B5C050
S315000254306604153C0030152F0001538A4A6F002A74
S3150002544067047E4560027E65148741EF000C504872
S315000254500200A90C03F4800304A4467047E01600239
S31500025460 42473607D645D66F0036D642D66F003447
S315000254700D646D66F0032D66F00304BEF00084A2F61
S31500025480 0007670E3015B0436F2490433F40002E4D
S31500025490601C3015B0436F163E009E430C2F003041
S315000254A00002 66063F47003860043F47003A4BEF6A
S315000254B0001442 4760122F0B3F3C00204E940C40D2
S315000254C00020660000F85247BE6F003A6DE84A4473
S315000254D0670C2F0B3F044E94B04466000 0E042472F
S315000254E060122F0B3F3C00304E940C400030660099
S315000254F000CC5247BE6F00386DE84247601218 1D55
S3150002550048842F0B3F044E94B04466000 0B05247C5
S31500025510BE456DEA424760122F0B3F3C00304E9467

S315000255200C40003066000096524 7BE6F00366DE8AA
S315000255304A42670E2F0B3F3C002E4E940C40002E23
S31500025540667A424760102F0B3F3C00304E940C4067
S3150002555000306668524 7BE6F00346DEA42476010FB
S315000255601A1D48852F0B3F054E94B045664E52478D
S31500025570BE466DEC424660102F0B3F3C00304E9407
S315000255800C40003066365246BC6F00326DEA2A4A3B
S3150002559042466010 1E1D48872F0B3F074E94B047A8
S315000255A0661A5246BC6F00306DEA424660142F0BF3
S315000255B03F3C00204E940C40002067047 0FF6016AA
S315000255C05246BC6F002E6DE6302F003AD043D06FA4
S315000255D00038D06F002E4FEF003C33C000A0073ECC
S315000255E04CDF7CFC205F4FEF00124ED04E714E71A5
S315000255F04E7148E71F0433C000A007402A2F001C43
S31500025600362F0020382F00227C2B2E054A856C0669
S315000256102E0544877C2D204F2F2800243F043F036C
S315000256202F074EB9000257382A401B06200D33C0F9
S3150002563000A007424CDF20F8205F4FEF000C4ED04F
S315000256404E714E714E7148E7073E33C000A00744C3
S31500025650518F286F002C266F00303C2F00362A4CC3
S3150002566042474DD70C15002D66047E0160060C15C7
S31500025670002B66144A4666082C8C7E006000009851
S315000256804A466F025346528D204F3F2800343F064A
S315000256902F0E2F0D45EF00102F0A2A3C7FFFFFFF2A
S315000256A04EB900025A164A40670E0C400001671EA8
S315000256B00C400002674A605E7E002C8C4A466756A2
S315000256C00C15003066504 1ED00012C8860484A47AF
S315000256D067240C928000000062262012B0856206C2
S315000256E02E00448760302E3C800000010680800038
S315000256F000019E806020 2012B08562042E00601692
S315000257004A4767082E3C800000006002 2E0533FCE3
S315000257100022 00C0C8A8200B670226962007508FD9
S3150002572033C000A007464CDF7CE0205F4FEF000C41
S3150002573 04ED04E714E714E7148E7070833C000A035
S315000257400748 2E2F00143C2F00183A2F001A4A45FC
S3150002575067082 87C00031678600628 7C00031689F1
S31500025760700ED0AF001C224042112007320648C1FB
S315000257704EB9000257A81334080030 0648C022006A
S31500025780020074EB900025BBC2E004A8766DC200960
S3150002579033C000A0074A4CDF10E0205F4FEF000C39
S315000257A04ED04E714E714E712F010C810001 0000D8
S315000257B0641280C1690E22004241484 10280000003
S315000257C0FFFF601E2F011F3C00204281E388E39108
S315000257D0B2AF0002650692AF00025280531766EC22
S315000257E05C8F2001221F4E7548E7073E33C000A09A
S315000257F0074C4FEFFFE42A6F00403C2F004A246F0C
S3150002580000 4C266F0050284D4DEF0010206F0046C9
S315000258102C902D680004000442534879 0002A930F6
S315000258202F0E4EB900021E544A406C0836BC0001C7
S3150002583 00A5680004245 7E09267C0002A8E860429C
S315000258403007 48C0E788D08B2F002F0E486F00081C
S315000258504EB900021D8848790002A930486F00043B
S315000258604EB900021E544A406D18300748C0E788F8
S31500025870D08B2F002F0E4EB900025B5E7001EF68CF
S31500025880DA4053474A476CB82F0E4EB900021E3E05
S315000258904A00675C7E09604A300748C0E788D08BB9
S315000258A02F002F0E486F00104EB900021DB82F0BA5
S315000258B0486F000C486F00084EB900021D884879EF
S315000258C00002A930486F00044EB900021E544A4035
S315000258D06C102CAF00082D6F000C00047001EF68ED
S315000258E09A4053474A476CB030055240348 06002B2
S315000258F042524A6F00446718DC524A466C122CBC6C
S315000259000000000002D7C000000000004 42463486A0
S315000259100C4600116F3A7C1160362F0E4EB900020A
S315000259205B702F400018302F001A48C0E7880680A7
S3150002593000 02A8982F002F0E4EB900025DAA2F0B67
S315000259402F0E4EB900021CFA7030D02F001B18C061
S31500025950 3E0651CEFFC642142F0E4EB900025B70B0
S315000259602F4000187205B0816642302F001A48C0D7
S31500025970E78806800002A8982F002F0E4EB9000273
S315000259805DAA2F0E4EB900021E3E4A006610B9CD20
S31500025990671470D0D02CFFFF080000006708700 65D
S315000259A02F400018600670042F4000180CAF00004C
S315000259B00005001 86F42200C3E00200D9E40534702
S315000259C06014523570000C35003970006F0C1BBC28
S315000259D00030700053474A476CE84A476C1AB9CD03
S315000259E067061ABC0031600E4A6F0044670A1ABC89
S315000259F00031422D00015252200D4FEF001C33C0E0
S31500025A0000A0074E4CDF7CE0205F4FEF00144ED023
S31500025A104E714E714E7148E73F3E33C000A00750AB
S31500025A20518F2C6F00382A6F003C246F00403C2FA8
S31500025A3000 0443A2F00467E00420416040C1500303C
S31500025A4066444A46670000E24A466F02534652BD52
S31500025A504A46672A0C15007867060C150058661E1A
S31500025A604A4567060C4500106614420 47A104A46F7
S31500025A70670000B64A466F025346528D60087801A7
S31500025A804A4566027A084A4566027A0A0C450024A5
S31500025A906E0000960C4500026D00008E300548C06F
S31500025AA0448006800002A95C2640300548C072FF89
S31500025AB02E8122002 0174EB900025BBC2F40000443
S31500025AC0605E101548803F004EB900025DBC3F0083
S31500025AD02F0B4EB900025D7A28404A80674A780148
S31500025AE0243C0002A95B200C94404A466F025346AE
S31500025AF0528DBEAF00046302760130054 8C022070C
S31500025B00C1414EB90002625EC1412E01300248C057
S31500025B1044805380BE8063027601300248C0DE8034
S31500025B204A1567044A46669A200A6702248D4A0481
S31500025B306606429642406 00C2C874A036604700150
S31500025B406002700 2508F33C000A007524CDF7CFC0B
S31500025B50205F4FEF00104ED04E714E714E71205F96
S31500025B6020172F002F08207CFFFFC26A4EFB88FEFB
S31500025B704E56FFFC487800012F2E0008486EFFFCA7
S31500025B80207CFFFFC3484EBB88FE202EFFFC4E5EE4
S31500025B90205F584F4ED04E56FFFC487800002F2EFD
S31500025BA00008486EFFFC207CFFFFC3224EBB88FE26
S31500025BB0202EFFFC4E5E205F584F4ED02F010C81E7
S31500025BC00000 10000641280C1690E22004241484170
S31500025BD002800000FFFF601E2F011F3C0020428151
S31500025BE0E388E391B2AF0002650692AF00025280EB
S31500025BF0531766EC5C8F221F4E7548E7200433C0AC
S31500025C0000A00754598F2A6F00144A956700013283
S31500025C102F0D4EB90002603C916D00080C6DFF829B
S31500025C2000086C38302D000848C044800680FFFF0B
S31500025C30FF82721FB0816F0642956000010442A77F
S31500025C40302D000848C0448020404868FF822F0D4E
S31500025C504EB900025F643B7CFF8200080C6D007F38
S31500025C6000086F0A08ED0006000A600000E8203905
S31500025C700002A95E0C800001000064140C400001C1
S31500025C8067640C4000026 75E0C400003670000AACE
S31500025C900C2D00080000367182EBC000000804857B8
S31500025CA02F0D4EB90002600C4A806700008C6074AA
S31500025CB00C6D007F00086D100C95FFFFFF806608D3
S31500025CC008ED0006000A6070082D000000026768F1
S31500025CD02EBC0000008048572F0D4EB90002600C02
S31500025CE04A806754603E0CB9000000010002A95EBA
S31500025CF057C04400488048C0122D000AEE0902012E
S31500025D00000174001401B082672E4A2D0003672831
S31500025D102EBC0000010048572F0D4EB90002600C40
S31500025D204A8067144878000148780001 2F0D4EB961
S31500025D3000025F64526D00080295FFFFFF006606CF
S31500025D40426D00080E0C6D007F00086F0608EDBC
S31500025D500006000A2F0D204F2F2800144EB900020C
S31500025D605EA0588F33C000A007564CDF2004205F88
S31500025D70508F4ED04E714E714E7133C000A00758EF
S31500025D80226F0004322F00081011B00166042009A8
S31500025D9060064A1966F2700033C000A0075A205FF7
S31500025DA05C8F4ED04E714E714E71205F20172F00C0
S31500025DB02F08207CFFFFBFD04EFB88FE33C000A019
S31500025DC0075C322F00040C4100616D0C0C41007A15
S31500025DD06E0670E0D0416002300133C000A0075E5B
S31500025DE0205F548F4ED04E714E714E7148E70108B6
S31500025DF033C000A00760226F000C206F001049E933
S31500025E00000A0810000756C04400488048C002C035
S31500025E100001EF08089400078114201 07217E2A807
S31500025E2002 4000FF33400008203C007FFFFFC09085
S31500025E30E18822800B940006021400CF0C6900FF54
S31500025E400008662A4A91671E0811000667047E0149
S31500025E5060027E027003C007E908022900CF000A29
S31500025E608129000A602408E90006000A601C4A69C2
S31500025E700008660C4A916712337CFF820008600AAA
S31500025E8008D100070469007F000833C000A007623A
S31500025E904CDF1080205F508F4ED04E714E714E7186
S31500025EA02F0733C000A00764226F000C08290007E1
S31500025EB0000A67082E3C8000000060027E007030F7
S31500025EC0C029000A673C00877F80000020110880F5
S31500025ED0001FE0888E80203C0003FFFFC087660615
S31500025EE000870007FFFF1029000AE80802000003E6
S31500025EF00C000001660608C70012604E08870012F1
S31500025F006048082900 06000A670800877F800000AB
S31500025F1060384A9166060887001F602E0C69FF8268
S31500025F2000086608 2011E0888E80601E302900086D
S31500025F3048C006800000007F7217E3A88E802011F9

S31500025F40E0880280007FFFFF8E80206F0008208796
S31500025F5033C000A007662E1F205F508F4ED04E71B1
S31500025F604E714E7148E7030033C000A00768226FE6
S31500025F70000C2C11028600000010CAF000000206C
S31500025F8000106D044291601C4AAF001467082E3C53
S31500025F90800000000060027E002011122F0013E2A88A
S31500025FA080872280200633C000A0076A4CDF00C02B
S31500025FB0205F4FEF000C4ED04E714E714E712F077F
S31500025FC033C000A0076C226F00080811000756C0F4
S31500025FD04400488048C02E000CAF00000020000C90
S31500025FE06D044291600E2011122F000FE3A880AFBC
S31500025FF000102280200733C000A0076E2E1F205FEC
S315000260004FEF000C4ED04E714E714E7133C000A050
S315000260100770226F0004206F00082010D191201112
S31500026020B09055C04400488048C033C000A00772F3
S31500026030205F508F4ED04E714E714E7148E701046B
S3150002604033C000A007742A6F000C08150007660407
S315000260504A956604700060162F154EB9000261C893
S315000260602E0042A72F072F0D6100FF54200733C0D1
S3150002607000A007764CDF2080205F588F4ED04E71ED
S315000260804E714E7148E73F0033C000A00778598F22
S31500026090206F00282810206F002C2A10203C0000B8
S315000260A0FFFFC084223C0000FFFFC2854EB90002FA
S315000260B0625E2E00203C0000FFFFC08422057410A1
S315000260C0E4A94EB90002625E26002004 7210E2A81C
S315000260D0223C0000FFFFC2854EB90002625E240028
S315000260E020047210E2A822052E807010E0A9201763
S315000260F0C1414EB90002625EC1412C0120077210F5
S315000261002E2A8223C0000FFFFC283D081223C0000AD
S31500026110FFFFC282D0817210E2A8DC802003E2A8CF
S315000261202 2027810E8A9D081DC80203C0000FFFF23
S31500026130C083E9A8DE80203C0000FFFFC082E9A8F8
S31500026140DE80206F00202086206F00242087588F53
S3150002615033C000A0077A4CDF00FC205F4FEF00102F
S3150002616004ED04E714E714E7148E7011C33C000A0ED
S3150002617 0077C2A6F0014286F0018266F001C7E0009
S31500026180 42A7487800012F0C6100FE342F004878A0
S3150002619000 0012F0D6100FE284A8066062015B09385
S315000261A06506201391955 29452877020BE806DD059
S315000261B033C000A0077E4CDF3880205F4FEF000C13
S315000261C04ED04E714E714E7148E7030033C000A0A7
S315000261D00780222F000C4A8166047000602A203C48
S315000261E0FFFF0000C081670A2E3C800000007C0091
S315000261F0600E2E3C000080007C106004E28F528606
S315000262002007C08167F6200633C000A007824CDF54
S3150002621000C0205F588F4ED04E714E714E7133C002
S31500026220000A007844AAF0004670A204F2F28000403
S3150002623061966018 4AAF00086710204F2F280008A1
S315000262406186068000000206002700033C000A054
S31500026250 0786205F508F4ED04E714E714E7148E7C1
S31500026260C000C0C1C2D748414241D081322F00028C
S31500026270C2EF000448414241D081222F0004508FD0
S315000262804E7514EBF76C000000000000FFFF0000E3
S31500026290 0000FFFFFFFF000000000000FFFF0000FC
S315000262A000000000104000002628 60002628A000207
S315000262B0A966005304000002628E00026292000286
S315000262C0A972007300000000000000000000000236
S315000262D0A97804700400000262960002629A000223
S315000262E0A981003101000002629E000290120002A2
S315000262F0A991003201000002629E00029012000281
S31500026300A99E003301000002629E00029012000262
S31500026310A9AB003401000002629E00029012000244
S31500026320A9B8003501000002629E00029012000226
S31500026330A9C5003601000002629E00029012000208
S31500026340A9D2003701000002629E000290120002EA
S31500026350A9DF0071000000000000000000000023A
S31500026360A9F700640000000000000000000000021F
S31500026370AA04004400000000000000000000000221
S31500026380AA0F045702000028E0800028E080002BD
S31500026390AA2D0002AA470000186800 0262A20002A3
S315000263A0AA4C000F0002AA900002AA970002AA9F16
S315000263B00002AAA90002AAB20002AAB90002AAC24F
S315000263C00002AB4000001FF4000000000002AB46D2
S315000263D0010000002AB64000024440000247C00009B
S315000263E024CA0000253E00000030000001000364BC
S315000263F0000000000000000000000002ABA00363E2
S3150002640000000000000000000000002ABB70373AA
S315000264100000000000000000000000002ABCC0401F6
S3150002642002000 0028E0C000263E60002ABE20402E6
S315000264300200000 28E0C000263EA0002AC0504436D
S31500026440020000028E0800028E080002AC240457E5
S31500026450020000028E0800028E080002AC3B0472A3
S3150002646000000000000000000000000002AC52000222
S31500026470AC7E00002616000263EE0002AC8303081F
S3150002648000002ADD6000000D000C000D000C00004D
S31500026490000000008000000000FFFFFFFF1493E
S315000264A0F2CA7149F2CA00000000000000000000B2
S315000264B0001F00FFFFFF000004D205010400002D6
S315000264C064A6000264B20002AE780502040000026D
S315000264D064A6000264B20002AE83057302000002E3
S315000264E0648E000264920002AE8C054C000000002D
S315000264F0000000000000000002AEA9054600000000F0
S3150002650000000000000000002AEC80569000000009D
S315000265100000000000000000002AEF1056C0000000061
S31500026520000000000000000002AF090563000000041
S31500026530000000000000000002AF21054804000022E
S3150002654064960002649A0002AF3D0566050000 02E9
S31500026550649E000264A20002AF88057400000000077
S31500026560000000000000000002AFC8055302000024E
S31500026570 64AA000264AE0002AFCD056500000000009
S31500026580000000000000000002AFE0054302000 00226
S31500026590 64B6000264B60002B001056D0000000098
S315000265A0000000000000000002B0160002B027000042
S315000265B0307600 0264BA0002B02A050F0002B1FE6C
S315000265C000000037D80000000000002B20101000001FD
S315000265D05180FFFFFFFE0000000241C00000C1C063
S315000265E00000030107000 0028E0C000265CE0002C5
S315000265F0B21A030206000028E0C000265D20002E5
S31500026600B232016602000028E0C000265D600025A
S31500026610B252034F0500000265DE000265DA00028F
S31500026620B2800002B2A20000386A000265E20002ED
S31500026630B2A50104456100000000123400000000109
S3150002664000000040FFFFFFFF0000000 8084D0200A7
S31500026650000028E10000294A00002B38401580000CA
S3150002666000000000000000000002B39C055200007A
S3150002667000000000000000000002B3BF087A02001A
S31500026680000 28E1000028E100002B3E101470000E4
S31500026690000000000000000000002B4000824020000E
S315000266A000028E1000028E100002B415085002007D
S315000266B000028E10000294A80002B42D08510200B6
S315000266C000028E1000026DE40002B44E083D020084
S315000266D000028E10000294A40002B469087002003F
S315000266E000028E10000294B40002B487023E060035
S315000266F000028E0C000294AC0002B4AF023C06000B
S31500026700000 28E0C000294AC0002B4BE086C0200B9
S31500026710000 28E0C000294B80002B4CB02410000C3
S315000267200000000000000000000002B4D502010200D1
S3150002673000002663C000266400002B4F5044302 0011
S3150002674000002663800026638 0002B502036E0200D5
S3150002675000002663C000266400002B513034C0000CC
S31500026760000000000000000000002B51E03610000E8
S315000267700000000000000000000002B53302740800A9
S31500026780000028E0C00C000FA0002B54A025408004C
S31500026790000028E0C00C000FA0002B5650264000019
S315000267A0000000000000000000002B57E034E00005B
S315000267B0000000000000000000002B590036900001E
S315000267C0000000000000000000002B5AE036D0000EC
S315000267D0000000000000000000002B5D305700000B2
S315000267E0000000000000000000002B5F202020200F2
S315000267F000028E0C000266440002B61A0203020070
S3150002680000028E0C000266440002B64202730000C9
S315000268100000000000000000000002B68802750000B9
S315000268200000000000000000000002B6B002310000C5
S315000268300000000000000000000002B6D0024900007D
S315000268400000000000000000000002B6EF045304003E
S3150002685000002902200002901E0002B70005670100A6
S3150002686000028E1000026648 0002B7390002B7C95C
S31500026870000 03A6C0002664C0002B7CF012200000B
S3150002688000000000000000000000000000000000000
S315000268900000000000000000000000000000000000F0
S315000268A00000000000000000000000000000000000E0
S315000268B00000000000000000000000000000000000D0
S315000268C00000000000000000000000000000000000C0
S315000268D00000000000000000000000000000000000B0
S315000268E00000000000000000000000000000000000A0
S315000268F0000000000000000000000000000000000090
S31500026900000000000000000000000000000000000007F
S31500026910000000000000000000000000000000000006F
S31500026920000000000000000000000000000000000005F
S31500026930000000000000000000000000000000000004F
S31500026940000000000000000000000000000000000003F
S31500026950000000000000000000000000000000000002F

S31500026960000000000000000000000000000000001F
S31500026970000000000000000000000000000000000F
S3150002698000000000000000000000000000000000FF
S3150002699000000000000000000000000000000000EF
S315000269A000000000000000000000000000000000DF
S315000269B000000000000000000000000000000000CF
S315000269C000000000000000000000000000000000BF
S315000269D000000000000000000000000000000000AF
S315000269E0000000000000000000000000000000009F
S315000269F0000000000000000000000000000000008F
S31500026A00000000000000000000000000000000007E
S31500026A10000000000000000000000000000000006E
S31500026A20000000000000000000000000000000005E
S31500026A3000000000000000000000002BBB4000043425B
S31500026A40000000000002BBB90100027E001800002F
S31500026A500000000000000000000000A747970652042
S31500026A6073706163652066F72206E657874207703C
S31500026A706167652C20435220566F72206F6E652017
S31500026A806C696E652C206374726C2D4320746F20C2
S31500026A9061626F72740001500000000000000000085
S31500026AA000000002BBD00002BBE500004A960002CD
S31500026AB06A960002BBEA030100000000000000000221
S31500026AC04030000041A0000000000003000000303A
S31500026AD0044402000028E0C00028E100002BBF675
S31500026AE0045302000028E0C00028E100002BC212A
S31500026AF0045702000028E0800028E080002BC4300
S31500026B0004430200028E0800028E080002BC60E6
S31500026B10046C00000000000000000000002BC8BB4
S31500026B2004730000000000000000000002BCC662
S31500026B300164000000000000000000000002BCED3D
S31500026B40044402000028E0C00026AC80002BCFE67
S31500026B50044202000028E0C00028E100002BD38B2
S31500026B60045505000026AC000026AC40002BD6143
S31500026B700475000000000000000000000002BD8F46
S31500026B80047002000028E0C00026ABC0002BD9B69
S31500026B90057402000028E0C00028E100002BDCCAB
S31500026BA0046202000028E0C00028E100002BDFF7B
S31500026BB0046302000028E0C00028E100002BE2444
S31500026BC0045402000028E0C00028E100002BE4A1D
S31500026BD0046E02000028E0C00026ACC0002BE673E
S31500026BE00002BE8400004AC800026AD00002BE89C2
S31500026BF00111429B0000C01F5C29401F5C293E6BB0
S31500026C00EC9938D1B717000000000000000000D80147
S31500026C1000000000000000000000000000000006C
S31500026C2000000000000000000000000000000005C
S31500026C30000000000000000000000000000000004C
S31500026C40000000000000000000000000000000003C
S31500026C50000000000000000000000000000000002C
S31500026C60000000000000000000000000000000001C
S31500026C70000000000000000000000000000000000C
S31500026C8000000000000000000000000000000000FC
S31500026C9000000000000000000000000000000000EC
S31500026CA000000000000000000000000000000000DC
S31500026CB000000000000000000000000000000000CC
S31500026CC000000000000000000000000000000000BC
S31500026CD000000000000000000000000000000000AC
S31500026CE0000000000000000000000000000000009C
S31500026CF0000000000000000000000000000000008C
S31500026D00000000000000000000000000000000007B
S31500026D10000000000000000000000000000000006B
S31500026D20000000000000000000000000000000005B
S31500026D30000000000000000000000000000000004B
S31500026D40000000000000000000000000000000003B
S31500026D50000000000000000000000000000000002B
S31500026D60000000000000000000000000000000001B
S31500026D70000000000000000000000000000000000B
S31500026D8000000000000000000000000000000000FB
S31500026D9000000000000000000000000000000000EB
S31500026DA000000000000000000000000000000000DB
S31500026DB000000000000000000000000000000000CB
S31500026DC000000000000000000000000000000000BB
S31500026DD000000000000000000000000000000000AB
S31500026DE00000000E0000000F0002C07E0002C085F7
S31500026DF00002C08C0002C0950002C09F0002C0A91A
S31500026E000002C0B20002C0BD0002C0C80002C0D467
S31500026E100002C0DF0002C0EC0002C0F50002C0FCA6
S31500026E200002C1030002C10A0002C1160002C11F0C
S31500026E300002C12B0002C1330002C13C0002C14361
S31500026E400002C14A0002C1510002C1580002C15FDC
S31500026E500002C1660002C16D0002C1780002C1844F
S31500026E600002C18E0002C1980002C1A00002C1AB9D
S31500026E700002C1B50002C1C00002C1C90002C1D4EC
S31500026E800002C1DF0002C1EA0002C1F50002C2002F
S31500026E900002C20B0002C2130002C21E0002C22876
S31500026EA00002C2340002C23E0002C2480002C252BE
S31500026EB00002C25A0002C2660002C2700002C27812
S31500026EC00002C2830002C28F0002C29800000000C4
S31500026ED000000000000000000000000000000000AA
S31500026EE0000000000000000000000000000000009A
S31500026EF0000200000004000000060000000800076
S31500026F00000A0000000C0000000E0000001000045
S31500026F1000012000000140000001600000018000015
S31500026F20001A0000001C0000001E000000200000E5
S31500026F300022000000240000002600000028000B5
S31500026F40002A0000002C0000002E00000030000085
S31500026F5000032000000340000003600000038000055
S31500026F60003A0000003C0000003E00000040000025
S31500026F70FFFFFFFF00030004000500060007 0008EC
S31500026F800009000A000B000C000D000E000F001095
S31500026F9000110012001300140015001600170018 45
S31500026FA00019001A001B001C392A010100000000A
S31500026FB000000000000000000000000000000000C9
S31500026FC000000000000000000000000000000000B9
S31500026FD000000000000000000000000000000000A9
S31500026FE00000000000000000000000000000000099
S31500026FF00000000000000000000000000000000089
S31500027000000000000000000000000000000000078
S31500027010000000000000000000000000000000068
S31500027020000000000000000000000000000000058
S31500027030000000000000000000000000000000048
S31500027040000000000000000000000000000000038
S31500027050000000000000000000000000000000028
S31500027060000000000000000000000000000000018
S31500027070000000000000000000000000000000008
S3150002708000000000000000000000000000000000F8
S3150002709000000000000000000000000000000000E8
S315000270A000000000000000000000000000000000D8
S315000270B000000000000000000000000000000000C8
S315000270C000000000000000000000000000000000B8
S315000270D000000000000000000000000000000000A8
S315000270E00000000000000000000000000000000098
S315000270F00000000000000000000000000000000088
S31500027100000000000000000000000000000000077
S31500027110000000000000000000000000000000067
S31500027120000000000000000000000000000000057
S31500027130000000000000000000000000000000047
S31500027140000000000000000000000000000000037
S31500027150000000000000000000000000000000027
S31500027160000000000000000000000000000000017
S31500027170000000000000000000000000000000007
S3150002718000000000000000000000000000000000F7
S3150002719000000000000000000000000000000000E7
S315000271A000000000000000000000000000000000D7
S315000271B000000000000000000000000000000000C7
S315000271C000000000000000000000000000000000B7
S315000271D000000000000000000000000000000000A7
S315000271E00000000000000000000000000000000097
S315000271F00000000000000000000000000000000087
S31500027200000000000000000000000000000000076
S31500027210000000000000000000000000000000066
S31500027220000000000000000000000000000000056
S31500027230000000000000000000000000000000046
S31500027240000000000000000000000000000000036
S31500027250000000000000000000000000000000026
S31500027260000000000000000000000000000000016
S31500027270000000000000000000000000000000006
S3150002728000000000000000000000000000000000F6
S3150002729000000000000000000000000000000000E6
S315000272A000000000000000000000000000000000D6
S315000272B000000000000000000000000000000000C6
S315000272C000000000000000000000000000000000B6
S315000272D000000000000000000000000000000000A6
S315000272E00000000000000000000000000000000096
S315000272F00000000000000000000000000000000086
S31500027300000000000000000000000000000000075
S31500027310000000000000000000000000000000065
S31500027320000000000000000000000000000000055
S31500027330000000000000000000000000000000045
S31500027340000000000000000000000000000000035
S31500027350000000000000000000000000000000025
S31500027360000000000000000000000000000000015
S31500027370000000000000000000000000000000005

S31500027380000000000000000000000000000000000F5
S31500027390000000000000000000000000000000000E5
S315000273A0000000000000000000000000000000000D5
S315000273B0000000000000000000000000000000000C5
S315000273C0000000000000000000000000000000000B5
S315000273D0000000000000000000000000000000000A5
S315000273E000000000000000000000000000000000095
S315000273F000000000000000000000000000000000085
S31500027400000000000000000000000000000000000074
S31500027410000000000000000000000000000000000064
S31500027420000000000000000000000000000000000054
S31500027430000000000000000000000000000000000044
S31500027440000000000000000000000000000000000034
S31500027450000000000000000000000000000000000024
S31500027460000000000000000000000000000000000014
S31500027470000000000000000000000000000000000004
S315000274800000000000000000000000000000000000F4
S315000274900000000000000000000000000000000000E4
S315000274A0000000000000000000000000000000000D4
S315000274B0000000000000000000000000000000000C4
S315000274C0000000000000000000000000000000000B4
S315000274D0000000000000000000000000000000000A4
S315000274E000000000000000000000000000000000094
S315000274F000000000000000000000000000000000084
S31500027500000000000000000000000000000000000073
S31500027510000000000000000000000000000000000063
S31500027520000000000000000000000000000000000053
S31500027530000000000000000000000000000000000043
S31500027540000000000000000000000000000000000033
S31500027550000000000000000000000000000000000023
S31500027560000000000000000000000000000000000013
S31500027570000000000000000000000000000000000003
S315000275800000000000000000000000000000000000F3
S315000275900000000000000000000000000000000000E3
S315000275A0000000000000000000000000000000000D3
S315000275B0000000000000000000000000000000000C3
S315000275C0000000000000000000000000000000000B3
S315000275D0000000000000000000000000000000000A3
S315000275E000000000000000000000000000000000093
S315000275F000000000000000000000000000000000083
S31500027600000000000000000000000000000000000072
S31500027610000000000000000000000000000000000062
S31500027620000000000000000000000000000000000052
S31500027630000000000000000000000000000000000042
S31500027640000000000000000000000000000000000032
S31500027650000000000000000000000000000000000022
S31500027660000000000000000000000000000000000012
S31500027670000000000000000000000000000000000002
S315000276800000000000000000000000000000000000F2
S315000276900000000000000000000000000000000000E2
S315000276A0000000000000000000000000000000000D2
S315000276B0000000000000000000000000000000000C2
S315000276C0000000000000000000000000000000000B2
S315000276D0000000000000000000000000000000000A2
S315000276E000000000000000000000000000000000092
S315000276F000000000000000000000000000000000082
S31500027700000000000000000000000000000000000071
S31500027710000000000000000000000000000000000061
S31500027720000000000000000000000000000000000051
S31500027730000000000000000000000000000000000041
S31500027740000000000000000000000000000000000031
S31500027750000000000000000000000000000000000021
S31500027760000000000000000000000000000000000011
S31500027770000000000000000000000000000000000001
S315000277800000000000000000000000000000000000F1
S315000277900000000000000000000000000000000000E1
S315000277A0000000000000000000000000000000000D1
S315000277B0000000000000000000000000000000000C1
S315000277C0000000000000000000000000000000000B1
S315000277D0000000000000000000000000000000000A1
S315000277E000000000000000000000000000000000091
S315000277F000000000000000000000000000000000081
S31500027800000000000000000000000000000000000070
S31500027810000000000000000000000000000000000060
S31500027820000000000000000000000000000000000050
S31500027830000000000000000000000000000000000040
S31500027840000000000000000000000000000000000030
S31500027850000000000000000000000000000000000020
S31500027860000000000000000000000000000000000010
S31500027870000000000000000000000000000000000000
S315000278800000000000000000000000000000000000F0
S315000278900000000000000000000000000000000000E0
S315000278A0000000000000000000000000000000000D0
S315000278B0000000000000000000000000000000000C0
S315000278C0000000000000000000000000000000000B0
S315000278D0000000000000000000000000000000000A0
S315000278E000000000000000000000000000000000090
S315000278F000000000000000000000000000000000080
S31500027900000000000000000000000000140014001433
S3150002791000140014001400140015001600180019B3
S315000279200019001A001B001C001E001F0021002364
S31500027930002600280002A002C002D41084A270000B4
S3150002794000000000000000000000000000000000002F
S3150002795000000000000000000000000000000000001F
S31500027960000000000FFFFA24FFFFFF81427800000BB
S315000279704240000000000000451C4000C2C8000052
S31500027980042C80000000005DC0000012C00000000D7
S3150002799000000000300000000000000170000004085
S315000279A0000000FF0000000000000000300000003CA
S315000279B000000007000000F0000001F0000003F4B
S315000279C00000003F0000000000000FFF000004D28C
S315000279D0014D02000028E10000294A00002C33A7A
S315000279E00158000000000000000000000002C3521F
S315000279F00472000000000000000000000002C375CF
S31500027A00087A02000028E1000028E100002C3974E
S31500027A1001470000000000000000000000002C3B69B
S31500027A2008240200000028E1000028E100002C3CB50
S31500027A3002500200000028E10000294A80002C3E364
S31500027A4002510200000028E1000026DE40002C4041C
S31500027A50023D02000028E10000294A40002C41F1E
S31500027A600270020000028E10000294B40002C43DAD
S31500027A70023E06000028E0C000294AC0002C465AF
S31500027A80023C06000028E0C000294AC0002C47492
S31500027A90026C02000028E0C000294B80002C4813D
S31500027AA00464000000000000000000000002C48B15
S31500027AB00463000000000000000000000002C49AF7
S31500027AC005560200000028E1000028D4C0002C4B15F
S31500027AD0054902000028E1000028D4C0002C4BF4E
S31500027AE005520200000279940002799800002C4CD80
S31500027AF005440300000279680002798800002C4DBAB
S31500027B0005410300000279640002798400002C4F58B
S31500027B1005530000000000000000000000002C51628
S31500027B20057602000002798C000279900002C53ABD
S31500027B300543020000028E0800028E080002C548B4
S31500027B4005480000000000000000000000002C55CBD
S31500027B50054E0300000279640002798400002C575AD
S31500027B60054C0300000279640002798400002C5AF65
S31500027B7005730300000279640002798400002C5E6F7
S31500027B800536020000279A4000279A80002C6178F
S31500027B900537020000279A4000279AC0002C62869
S31500027BA00538020000279A4000279B00002C63943
S31500027BB00539020000279A4000279B40002C64A1D
S31500027BC00530020000279A4000279B80002C65B01
S31500027BD00531020000279A4000279BC0002C66DDA
S31500027BE00566020000279A4000279C00002C67F7F
S31500027BF005570200000028E0800028E080002C69C8B
S31500027C000561020000279C4000279C80002C6B00A
S31500027C10046F000000000000000000000002C6F031
S31500027C20054F02000028E0C0002799C0002C73E3C
S31500027C300542050000027974000279780002C767DE
S31500027C40056202000028E0C000279A00002C783C0
S31500027C500546050000027970000279 6C0002C7B879
S31500027C600578050000002797C00027980002C7DCF3
S31500027C70057500000000000000000000000002C7EDCC
S31500027C80055400000000000000000000000002C826A3
S31500027C900002C8660000A4CA000279D00002C869C0
S31500027CA0042C00000000000000000000000000009C
S31500027CB000000000000000000000000000000000BC
S31500027CC000000000000000000000000000000000AC
S31500027CD0000000000000000000000000000000009C
S31500027CE0000000000000000000000000000000008C
S31500027CF0000000000000000000000000000000007C
S31500027D00000000000000000000000000000000006B
S31500027D10000000000000000000000000000000005B
S31500027D20000000000000000000000000000000004B
S31500027D30000000000000000000000000000000003B
S31500027D40000000000000000000000000000000002B
S31500027D50000000000000000000000000000000001B
S31500027D6000000000000000000000000000000000000B
S31500027D700000000000000000000000000000000000FB
S31500027D80000000000000000000000000418000003F915A
S31500027D90EB863F80000038D1B7173FB504EE41B5F8

S31500027DA004EE3D80000044109A784398800000005B
S31500027DB000004B1896802FA2E3FF469C4000471C0A
S31500027DC040004F492A6A3F000000BF8000000002BF
S31500027DD0CDA20002CDEA0002CDEB0002CE000002E7
S31500027DE0CE030002CE080002CE2B0002CE620002B3
S31500027DF0CEA50002CEFE014D020000028E10000248
S31500027E0094A00002CF3801580000000000000000D4
S31500027E1000000002CF5005520000000000000000E2
S31500027E2000000002CF73087A020000028E100002E0
S31500027E308E100002CF9501470000000000000000EE
S31500027E4000000002CFB40824020000028E100002D5
S31500027E508E100002CFC90850020000028E100002E6
S31500027E6094A80002CFE10251020000028E10000225
S31500027E706DE40002D002023D020000028E100002F2
S31500027E8094A40002D01D0870020000028E100002A7
S31500027E9094B40002D03B023E060000028E0C0002A1
S31500027EA094AC0002D063023C060000028E0C000273
S31500027EB094AC0002D072086C020000028E0C000222
S31500027EC094B80002D07F027000000000000000009B
S31500027ED000000002D08902560000000000000000E7
S31500027EE000000002D09001540000000000000000D3
S31500027EF000000002D09602500000000000000000C0
S31500027F0000000002D09D02640000000000000000094
S31500027F1000000002D0A802440000000000000000099
S31500027F2000000002D0B904740000000000000000046
S31500027F3000000002D0C502480000000000000000058
S31500027F4000000002D0D7027100000000000000000D
S31500027F5000000002D0F1024600000000000000000E
S31500027F6000000002D0F704780000000000000000C4
S31500027F7000000002D10104760000000000000000AE
S31500027F8000000002D12605350000000000000000B6
S31500027F9000000002D1420002D1620000C6C80002FF
S31500027FA07DF60002D165011A0004010200050102F4
S31500027FB00400010206050001020600010304000294
S31500027FC0D17A0002D17E0002D1840002D18900005A
S31500027FD00000000000000000000000000000000099
S31500027FE00000000000000000000000000000000089
S31500027FF00000000000000000000000000000000079
S3150002800000000000000000000000000000000000068
S3150002801000000000000000000000000000000000058
S3150002802000000000000000000000000000000000048
S3150002803000000000000000000000000000000000038
S3150002804000000000000000000000000000000000028
S3150002805000000000000000000000000000000000018
S3150002806000000000000000000000000000000000008
S31500028070000000000000000000000000000000000F8
S31500028080000000000000000000000000000000000E8
S31500028090000000000000000000000000000000000D8
S315000280A000000000000000000000000000000000C8
S315000280B000000000000042C800000000000047C3A4
S315000280C05000C7C3500047C35000000005A000007F
S315000280D0001E014D020000028E10000294A0000252
S315000280E0D38A0158000000000000000000000002D0
S315000280F0D3A2045200000000000000000000002AB
S31500028100D3C5087A020000028E1000028E10000209
S31500028110D3E70147000000000000000000000000253
S31500028120D4060824020000028E1000028E100002FD
S31500028130D41B0250020000028E10000294A8000214
S31500028140D4330251020000028E1000026DE40002D6
S31500028150D454023D020000028E10000294A40002D2
S31500028160D46F0270020000028E10000294B4000264
S31500028170D48D023E060000028E0C000294AC000270
S31500028180D4B5023C060000028E0C000294AC00023A
S31500028190D4C4026C020000028E0C000294B80002E3
S315000281A0D4D1015400000000000000000000002CB
S315000281B0D4DB0274000000000000000000000000290
S315000281C0D4E10242000000000000000000000002AC
S315000281D0D4E5024C000000000000000000000000028E
S315000281E0D4F20244000000000000000000000000279
S315000281F0D4FF0264000000000000000000000000023C
S31500028200D51602480000000000000000000000022F
S31500028210D534026300000000000000000000002E6
S31500028220D551037900000000000000000000002A2
S31500028230D5730359000000000000000000000000290
S31500028240D5CC0353000000000000000000000022D
S31500028250D5FC0375060000028E0C000294AC0002E7
S31500028260D6240343020000028E0800028E08000292
S31500028270D64B0171000000000000000000000000261
S31500028280D655036D000000000000000000000000249
S31500028290D65B0478000000000000000000000000227
S315000282A0D68B04720000000000000000000000002ED
S315000282B0D6C204730000000000000000000000002A5
S315000282C0D6F40270020000028E10000294B400027C
S315000282D0D71B02620000000000000000000000023E
S315000282E0D743026B0500000280BA000280BE00027C
S315000282F0D77502610500000280BA000280BE000244
S31500028300D7A602410500000280C2000280C6000212
S31500028310D7E50531020000028E0C000280CA000277
S31500028320D82F0532020000028E0C00028E100002C7
S31500028330D8930533020000028E0C00028E10000252
S31500028340D8C20534020000028E0C00028E10000212
S31500028350D8F70535020000028E10000294B400021E
S31500028360D9390536020000028E0C000294B40002CE
S31500028370D9760537020000028E0C000294B4000280
S31500028380D9BD0538020000028E0C000294B4000228
S31500028390DA040557020000028E0800028E08000267
S315000283A0DA500577020000028E10000280CA00022F
S315000283B0DA6D056F020000028E10000280CE000206
S315000283C0DA8E057A020000028E0800028E0800028A
S315000283D0DAD2055A020000028E0800028E08000256
S315000283E0DAF60445000000000000000000000000026A
S315000283F0DB2505460000000000000000000000000228
S31500028400DB640002DB780000DA28000280D2000278
S31500028410DB7C01330000000000000000000000000C9
S3150002842000000000000000000000000000000000044
S3150002843000000000000000000000000000000000034
S3150002844000000000000000000000000000000000024
S3150002845000000000000000000000000000000000014
S3150002846000000000000000000000000000000000004
S31500028470000000000000000000000000000000000F4
S31500028480000000000000000000000000000000000E4
S31500028490000000000000000000000000000000000D4
S315000284A0000000000000000000000000000000000C4
S315000284B0000000000000000000000000000000000B4
S315000284C0000000000000000000000000000000000A4
S315000284D00000000000000000000000000000000094
S315000284E00000000000000000000000000000000084
S315000284F00000000000000000000000000000000074
S3150002850000000000000000003FF000000000000034
S3150002851040F518000000000000000000014D0200B6
S31500028520000028E10000294A00002E2960358000098
S3150002853000000000000000000002E2AE055200004A
S3150002854000000000000000000002E2D1087A0200EA
S3150002855000028E1000028E100002E2F301470000B4
S3150002856000000000000000000002E31208240200DE
S3150002857000028E1000028E100002E3270250020053
S3150002858000028E10000294A80002E33F025102008C
S3150002859000028E1000026DE40002E360023D02005A
S315000285A000028E10000294A40002E37B0270020015
S315000285B000028E10000294B40002E399023E060005
S315000285C000028E0C000294AC0002E3C1023C0600DB
S315000285D000028E0C000294AC0002E3D0026C020090
S315000285E000028E0C000294B80002E3DD024C000089
S315000285F000000000000000000002E3E70244000061
S3150002860000000000000000000002E3F00274080000F
S3150002861000028E0C00C000FA0002E3FF02540800BA
S3150002862000028E0C00C000FA0002E41A0177000074
S3150002863000000000000000000002E43301630000B5
S3150002864000000000000000000002E464044500008F
S3150002865000000000000000000002E4980002E4D7D7
S315000286600000F5EA0002851C0002E4DB01140000AA
S31500028670000000000000000000000000000000000F2
S31500028680000000000000000000000000000000000E2
S31500028690000000000000000000000000000000000D2
S315000286A0000000000000000000000000000000000C2
S315000286B0000000000000000000000000000000000B2
S315000286C0000000000000000000000000000000000A2
S315000286D00000000000000000000000000000000092
S315000286E00000000000000000000000000000000082
S315000286F00000000000000000000000000000000072
S3150002870000000000000000000000000000000000061
S3150002871000000000000000000000000000000000051
S3150002872000000000000000000000000000000000041
S3150002873000000000000000000000000000000000031
S3150002874000000000000000000000000000000000021
S315000287500000000000003F800000427000003FF071
S31500028760000000000000000040F5180000000000B4
S31500028770000060AD78EC0000000800000006025020
S31500028780020000028E1000028D500002E5C2016452
S3150002879000000000000000000000002E5DB0244C9
S315000287A000000000000000000000002E5EF027772
S315000287B000000000000000000000002E61C045752

S315000287C0020000028E0800028E080002E6450443FB
S315000287D0020000028E0800028E080002E6600449CA
S315000287E005000002876E000287720002E68B0456BD
S315000287F005000002876E000287720002E69F0431BE
S3150002880005000002876E000287720002E6B4043297
S31500028810010000028E10000287760002E6E00433B1
S315000288200200000028E0C0002877A0002E707043477
S3150002883005000002876E000287720002E7310435E6
S315000288400100000028E10000287760002E75A043603
S315000288500200000028E0C0002877A0002E77E0437CD
S3150002886005000002876E000287720002E7AD043837
S315000288700100000028E10000287760002E7DB045335
S31500028880000000000000000000000002E80404727C
S315000288900000000000000000000000002E8350002AF
S315000288A0E8720000FF8E0002877E0002E87801125D
S315000288B000010001000100010001000100010001A8
S315000288C00002000200020001000100010001000196
S315000288D0000100010002000200000000000000008A
S315000288E000000000000000000001000100010017C
S315000288F0000100010001000100000000000100016A
S31500028900000100010001000100010001000000059
S31500028910000200020002000200000000000000000047
S315000289200001000100010000000000000000100003B
S3150002893000010001000200020002000100000028FE
S315000289400201020000028E0C0002893C0002E98844
S315000289500002E9A50001065C000289400002E9AABC
S31500028960010 1FFFFFFFF0000001B0000000300000E3
S315000289700F00000000700000003000000170000BF
S315000289800018000003E800000003000000040000D5
S315000289900002000000FFF014D020000028E100002CD
S315000289A094A00002E9E00158000000000000000067
S315000289B000000002E9F8056F000000000000000058
S315000289C000000002EA1B087A020000028E10000272
S315000289D08E100002EA3D014700000000000000080
S315000289E000000002EA5C0824020000028E10000267
S315000289F08E100002EA710850020000028E10000278
S31500028A0094A80002EA890851020000028E100002B0
S31500028A106DE40002EAAA083D020000028E1000027E
S31500028A2094A40002EAC50270020000028E1000023F
S31500028A3094B40002EAE3083E060000028E0C00022D
S31500028A4094AC0002EB0B083C060000028E0C0002FE
S31500028A5094AC0002EB1A086C020000028E0C0002B3
S31500028A6094B80002EB27046400000000000000000036
S31500028A7000000002EB310456020000028E0C0002D6
S31500028A80896A0002EB400449020000028E0C0002D1
S31500028A90896A0002EB4E04520200000279940002 37
S31500028AA0897A0002EB5C047602000002798C0002ED
S31500028AB079900002EB6A0448000000000000000002
S31500028AC000000002EB8A0454000000000000000000CF
S31500028AD000000002EBC70446020000028E0C0002F0
S31500028AE0896A0002EBD00472000000000000000058
S31500028AF000000002EC3804670300000289620002EB
S31500028B00896E0002EC5E047700000000000000009F
S31500028B1000000002EC930441020000028E0C0002E7
S31500028B2089720002ECE2044E020000028E0C000280
S31500028B3089720002ED240478020000028E0C000203
S31500028B4089760002ED670463020000028E0C0002C1
S31500028B5089920002EDA80443020000028E0C000274
S31500028B6089920002EDC00462020000028E0C00022D
S31500028B7079A00002EDD6046E020000028E0C0002FD
S31500028B80897E0002EE0B0473020000028E0C0002C4
S31500028B9089860002EE360444020000028E0C0002B0
S31500028BA089820002EE55044C020000028E0C00027D
S31500028BB0898A0002EE84046D020000028E0C000215
S31500028BC0898E0002EEFB047400000000000000000023
S31500028BD000000002EF340002EF6B0001069C000267
S31500028BE089960002EF6E04240004010200000000D0
S31500028BF0000000000000000000000000000000006D
S31500028C00000000000000000000000000000000005C
S31500028C10000000000000000000000000000000004C
S31500028C20000000000000000000000000000000003C
S31500028C30000000000000000000000000000000002C
S31500028C40000000000000000000000000000000001C
S31500028C50000000000000000000000000000000000C
S31500028C6000000000000000000000000000000000FC
S31500028C7000000000000000000000000000000000EC
S31500028C8000000000000000000000000000000000DC
S31500028C9000000000000000000000000000000000CC
S31500028CA000000000000000000000000000000000BC
S31500028CB000000000000000000000000000000000AC
S31500028CC0000000000000000000000000000000009C
S31500028CD0000000000003F80000038D1B717358F2A63A5
S31500028CE0418000003F547AE10002F60800012A1E84
S31500028CF00001290800012BB000012BE000012AF037
S31500028D000001299200012BC800012EAC00000000D0
S31500028D100000000049742400000000000007D007D0BC
S31500028D2007D007D004A1050D042C04BC04A1050D2F
S31500028D3003C8044A0432049403C8044A043204945D
S31500028D4003C8044A0432049403C805AA00000018A2
S31500028D500000000F000000000000000000000000FC
S31500028D60000000000000000000000000000000040BB
S31500028D7000000000000000001000000000000000004D7
S31500028D800000000000000000001012C004B001800103A
S31500028D9000000898000007080002F6AF00000898D5
S31500028DA0000007080002F6BF00000E74000008006B
S31500028DB00002F6C700000668000019A0002F6D714
S31500028DC000000898000007080002F6E900000320E8
S31500028DD000000000640002F6F400000FA000000CE49C
S31500028DE00002F711000002660000000440002F72F9D
S31500028DF000000000000000000000002F743000000002F
S31500028E00000000000000002F759000004D200000000032
S31500028E10000000000100004B000008000000002F77C81
S31500028E200002F783544D582D3520736F66747761AF
S31500028E3072652043 6F7079726967687420313939B7
S31500028E40352D313939392C32303030205175616443
S31500028E506C6F67696320436F6E74726F6C73204325
S31500028E606F72706F726174696F6E2E0D0A416C6C4F
S31500028E702072696768747320726573657276656 4B9
S31500028E802E000002F78A0002F7920002F79900020A
S31500028E90F7A10002F7A80002F7AC0002F7B200023F
S31500028EA0F7B70002F7C00002F7C60002F7CE0002CB
S31500028EB0F7DD0002F7E40002F7EC0002F7F0000229
S31500028EC0F7F70002F7FD0002F8060002F8100000AC
S31500028ED0000000000000000000000000000000008A
S31500028EE0000000000000000000000000000000007A
S31500028EF0000000000000000000000000000000006A
S31500028F000000000000000000000000000000000059
S31500028F100000000000000000000000000000000049
S31500028F200000000000000000000000000000000039
S31500028F300000000000000000000000000000000029
S31500028F400000000000000000000000000000000019
S31500028F500000000000000000000000000000000009
S31500028F6000000000000000000000000000000000F9
S31500028F7000000000000000000000000000000000E9
S31500028F8000000000000000000000000000000000D9
S31500028F9000000000000000000000000000000000C9
S31500028FA000000000000000000000000000000000B9
S31500028FB000000000000000000000000000000000A9
S31500028FC00000000000000000000000000000000099
S31500028FD00000000000000000000000000000000089
S31500028FE00000000000000000000000000000000079
S31500028FF00000000000000000000000000000000069
S315000290000000000000000000000000000000000058
S3150002901000050000000900004D200000007FFFF5F
S3150002902 0FFFF04000000004010100000 2900E00028E
S31500029030901200 02F978040201000002900E00026A
S315000290409012000 2F983056C020000028E0C0002E7
S31500029050901A0002F9A004530400000290220002B2
S31500029060901E0002F9AF0002F9E50001748400002C5
S315000290709026000 2F9EC01040002FAA600017666C7
S3150002908000000000000002FAA901000002FAC0000274
S31500029090FAD10002FAD70002FADD0002FAE700026C
S315000290A0FAF6000177140001 76C6000177600C120
S315000290B0777E42C80000000000002D2FE9BF5368EA
S315000290C0D4A52EDBE42E30896E9D322BCA4433D6CC
S315000290D0BCD5358636054E6E6B283727C38738D101
S315000290E0B4683A8310C1497424003C23D4F13DCCC0
S315000290F0CA2E3F7FFCB9447A0000411FFDF442C7E5
S31500029100FD714479FCCD461C3E0047C34D8049742F
S31500029110 20E03A83126F4B18948C4CBEB9AF4E6E58
S31500029120681B358637BD5015011151BA4155536832
S31500029130D1AA3089705F5511830A56B5E3CD2B8CBF
S31500029140BCCC0000000F000000020000004D2036342
S315000291500000000000000000000000002FC9E0373F5
S3150002916002000 00028E0C000291420002FCB2037061
S3150002917002000 00028E0C000291460002FCC8036443
S31500029180000000000000000000000002FCF903617C
S31500029190000000000000000000000002FD0803417C
S315000291A0020000028E0C00028E100002FD34034201
S315000291B0020000028E0C00028E100002FD590365A9
S315000291C0000000000000000000000002FD7E0357C0
S315000291D0000000000000000000000002FD8F0453A2

S315000291E00000000000000000000000002FD9B035288
S315000291F00000000000000000000000002FDB1034371
S3150002920002000002914A0002914A0002FDC903745B
S31500029210000000000000000000000002FDDD0369FE
S31500029220000000000000000000000002FDF2000243
S31500029230FE05000182F80002914E0002FE08030EAE
S315000292400000000000003003C0001898200000000CB
S3150002925000003003F0100202020200909090909090D
S315000292600909 0D09090904010200000 28E0C000217
S315000292708E0C00030054047000000000000000000081
S31500029280000000300A6043800000000000000000F1
S31500029290000000300BB000300C80001915800025 1
S315000292A09266000300CB010302000000000000000EA
S315000292B000000000000000000000020000960000000E
S315000292C0000700000008030102000028E0C0002E3
S315000292D092BA0003027403700200000028E0C0002AE
S315000292E092B6000302990 16E0200000292BE0002CB
S315000292F092C2000302B6016502000028E0C000251
S315000293008E10000302CF016D020000028E0C0002D5
S315000293108E10000302E5015702000028E080002C9
S315000293208E08000302FD017400000000000000000028
S3150002933000000000303270003034300001950A00020D
S315000293409 2C60003034801070003 03E2000197E205
S315000293500000000000000303E5010000303FA000118
S315000293609856000000000000304010100000 3041ADD
S3150002937000019 8CA0000000000003041D01003080AD
S315000293800 2B90000000000000000000000000000001A
S3150002939000000000000000030446 0001A61A0000B7
S315000293A000000000 3044A01000001A68E0001A6C6C1
S315000293B00001A7140001A72C00000000000000000015
S315000293C00000000000000000000000000000000000095
S315000293D00000000000000000000000000000000000085
S315000293E00000000000000000000000000000000000075
S315000293F00000000000000000000000000000000000065
S31500029400000000000000000000000000000000000054
S31500029410000000000000000000000000000000000044
S31500029420000000000000000000000000000000000034
S31500029430000000000000000000000000000000000024
S31500029440000000000000000000000000000000000014
S31500029450000000000000000000000000000000000004
S315000294600000000000000000000000000000000000F4
S315000294700000000000000000000000000000000000E4
S315000294800000000000000000000000000000000000D4
S315000294900000000000000000000000000000000000C4
S315000294A000000018000000020000010FFFF00008C
S315000294B000000019000000018000000400000001F9C
S315000294C0003B005A0078009700B500D400F3011162
S315000294D00130014E016D000000000000016D000028
S315000294E002DA0000044800000 5B5000007220000 69
S315000294F0088F000009FD00000B6A00000CD700006F
S3150002950000E4400000FB20000111F0000128C000072
S31500029510 13F900001567000016D400001841000078
S315000295201 9AE00001B1C00001C8900001DF600007D
S315000295301F63000020D10000223E000023AB000082
S3150002954025180000268600002 7F30000296000087
S315000295502ACD00002C3B00002DA800002F1500008C
S31500029560308200003 1F00000335D000034CA000092
S31500029570363700003 7A50000391200003A7F000096
S315000295803BEC00003D5A00003EC700004034 00009C
S31500029590 41A10000430F0000447C000045E90000A1
S315000295A04756000048C400004A3100004B9E0000A6
S315000295B04D0B00004E7900004FE60000515300 00AB
S315000295C052C00000542E0000559B00005708000 0B0
S315000295D05875000059E300005B5000005CBD0000B6
S315000295E05E2A00005F980000610500006272000 0BA
S315000295F063DF0000654D000066BA000068270000C0
S315000296006994000006B0200006C6F00006DDC0000C4
S31500029610 6F49000070B700007224000073910000C9
S31500029620 74FE0000766C000077D9000079460000CF
S3150002963007AB300007C2100007D8E00007EFB0000D4
S315000296408068000081D6000083430000084B00000D9
S31500029650861D0000878B000088F800008A650000DE
S315000296608BD200008D400008EAD0000901A0000E3
S3150002967091870000092F5000094620000 95CF0000E9
S315000296809 73C000098AA00009A17000 09B840000ED
S3150002969 09CF100009E5E00009FCB0000A1380000F6
S315000296A0A2A50000A4130000A5800000A6ED0000FC
S315000296B0A85A0000A9C80000AB350000ACA2000001
S315000296C0AE0F0000AF7D0000B0EA0000B257000006
S315000296D0B3C40000B5320000B69F0000B80C00000B
S315000296E0B9790000BAE70000BC540000BDC1000011
S315000296F0BF2E0000C09C0000C2090000C376000015
S3150002970 0C4E30000C6510000C7BE0000C92B00001A
S31500029710CA980000CC060000CD730000CEE000001F
S31500029720D04D0000D1BA0000D3270000D494000027
S31500029730D6010000D76F0000D8DC0000DA4900002D
S31500029740DBB60000DD240000DE910000DFFE000033
S31500029750E16B0000E2D90000E4460000E5B3000038
S31500029760E7200000E88E0000E9FB0000EB6800003D
S31500029770ECD50000EE430000EFB00000F11D000042
S31500029780F28A0000F3F80000F5650000F6D2000048
S31500029790F83F0000F9AD0000FB1A0000FC8700004C
S315000297A0FDF40000FF62000100CF0001023C00014F
S315000297B003A9000105170001068400010 7F1000153
S315000297C0095E00010ACC00010C3900010DA6000059
S315000297D0010000000100000001000000010000007D
S315000297E0010000000100000001000000010000006D
S315000297F0010000000100000001000000010000005D
S31500029800010000000100000001000000010000004C
S31500029810010000000100000001000000010000003C
S31500029820010000000100000001000000010000002C
S31500029830010000000100000001000000000000001D
S3150002984001000000010000000100000001000000 0C
S315000298500100000001000000010000000100000 0FC
S315000298600000000001000000010000000100000 0ED
S31500029870010000000100000001000000010000 00DC
S31500029880010000000100000001000 04E0001BBDEE5
S3150002989000001BC340001BC820001BC9A0000000039
S315000298A000000004A1E34004AED4E00000000008F
S315000298B000001000100020002000200020003000390
S315000298C00003000300030003000300030004000476
S315000298D00004000400040004000400040004000460
S315000298E0000400040004000400040004000544808F
S315000298F000003FB4FDF4448000003FB4FDF40000D4
S3150002990002350000 2A2A4B9896803F99999A3F4C35
S31500029910CCCD00000000000000000000000000000A6
S31500029920000000000000000000000000000000000002F
S315000299300000000000000001E07E0001E0E40001FA
S31500029940E1280001E1E20001E2140001E2960001D1
S31500029950E31C0001E34E0001E3800001E3B20001D3
S31500029960E3E40001E49A0001E4CC0001E4FE000114
S31500029970E5300001E5620001E0AA0001E112000102
S31500029980E16E0001E1FE0001E24A0001E2D60001B9
S31500029990E3380001E36A0001E39C0001E3CE000123
S315000299A0E41A0001E4B60001E4E80001E51A000148
S315000299B0E54C0001E57E0C00120021003F00470045
S315000299C059006A0074008B009500A600B800C0001A
S315000299D0DE00ED00F3000000000000000000000000C1
S315000299E00000000000000000000000000000000006F
S315000299F00000000000000000000000000000000005F
S31500029A0000000000000000000000000000000000004E
S31500029A1000000000000000000000000000000000003E
S31500029A2000000000000000000000000000000000002E
S31500029A3000000000000000000000000000000000001E
S31500029A4000000000000000000000000000000000000E
S31500029A500000000000000000000000000000000000FE
S31500029A600000000000000000000000000000000000EE
S31500029A700000000000000000000000000000000000DE
S31500029A800000000000000000000000000000000000CE
S31500029A900000000000000000000000000000000000BE
S31500029AA00000000000000000000000000000000000AE
S31500029AB000000000000000000000000000000000009E
S31500029AC000000000000000000000000000000000008E
S31500029AD000000000000000000000000000000000007E
S31500029AE000000000000000000000000000000000006E
S31500029AF000000000000000000000000000000000005E
S31500029B0000000000000000000000000000000000004D
S31500029B1000000000000000000000000000000000003D
S31500029B2000000000000000000000000000000000002D
S31500029B3000000000000000000000000000000000001D
S31500029B4000000000000000000000000000000000000D
S31500029B500000000000000000000000000000000000FD
S31500029B600000000000000000000000000000000000ED
S31500029B700000000000000000000000000000000000DD
S31500029B800000000000000000000000000000000000CD
S31500029B900000000000000000000000000000000000BD
S31500029BA0000000000000000181017401720146FC
S31500029BB00D0604060D060406B900000000000000AA
S31500029BC0000208090000000C0000001B000000B40EE
S31500029BD046E5D7891523038600AB012C012C0230FA
S31500029BE046E5D7890C100C0A00014000220002301B
S31500029BF00007A4000181017401720146 0D060406E4

S31500029C000D060406B9000000000000000002080963
S31500029C10000000C00000018000000B40471D9E00AE
S31500029C200F5C028F007C019001900230471D9E005E
S31500029C30108A108400014000220002300007A400AE
S31500029C4001810174017201460D0604060D06040621
S31500029C50B900000000000000000002080900000C070
S31500029C60000000C000000B4047AF11DB06E20126F0
S31500029C700037019001900230 47AF11DB24BA24B4B9
S31500029C8000014000220002300007A4000181017495
S31500029C90017201460D0604060D060406B90000000F
S31500029CA0000000000000020809000000C0000000C019
S31500029CB000000B40476CAEF70A3301B30052019025
S31500029CC001900230476CAEF718D418CF000140005D
S31500029CD0220002300007A400151010100801009699
S31500029CE001A90258035205DC010400C801DB02582F
S31500029CF0030704B00110012C02580258025803E867
S31500029D000801009601A90258035205DC010400C8A5
S31500029D1001DB0258030704B00110012C0258025855
S31500029D20025803E80110012C02580258025803E8AF
S31500029D30000000000000050008000A000B000C000EDF
S31500029D40000E000F00100011001100120012001385
S31500029D50001300140014001400150015001501657
S31500029D6000160016001700170017001700180018 33
S31500029D7000180018001900190019001900190019 15
S31500029D80001A001A001A001A001A001A001B001BF9
S31500029D90001B001B001B001B001B001C001C001CE0
S31500029DA0001C001C001C001C001C001D001D001DC8
S31500029DB0001D001D001D001D001D001D001E001EB1
S31500029DC0001E001E001E001E001E001E001E001E9B
S31500029DD0001E001F001F001F001F001F001F001F84
S31500029DE0001F001F001F001F001F001F0020002071
S31500029DF000200020002000200020002000200020 5B
S31500029E0000020002000200020002100210021002146
S31500029E1000210021002100210021002100210021 32
S31500029E200021002100210021002100220022 00221F
S31500029E3000220022002200220022002200220022 0A
S31500029E4000220022002200220022002200220022FA
S31500029E5000230023002300230023002300230023E2
S31500029E6000230023002300230023002300230023D2
S31500029E7000230023002300230023002300240024C0
S31500029E8000240024002400240024002400240024AA
S31500029E90002400240024002400240024002400249A
S31500029EA0002400240024002400240024002400248A
S31500029EB000250025002500250025002500250025 72
S31500029EC000250025002500250025002500250025 62
S31500029ED000250025002500250025002500250025 52
S31500029EE0002500250025002500250026002600263F
S31500029EF0002600260026002600260026002600262A
S31500029F0000260026002600260026002600260026 19
S31500029F1000260026002600260026002600260026 09
S31500029F20002600260026002600260026002600027F8
S31500029F300000000000030005000600070008 0008F4
S31500029F400009000A000A000A000B000B000B000CB5
S31500029F50000C000C000D000D000D000D000D000E92
S31500029F60000E000E000E000E000E000F000F000F76
S31500029F70000F000F000F000F00100010001000105D
S31500029F8000100010001000100010001100110011 46
S31500029F9000110011001100110011001100110011 31
S31500029FA00011001200120012001200120012 00121A
S31500029FB000120012001200120012001200120013 08
S31500029FC0001300130013001300130013001300 13F1
S31500029FD000130013001300130013001300130013E1
S31500029FE0001300130014001400140014001400 14CB
S31500029FF000140014001400140014001400140014B9
S3150002A000001400140014001400140014001400 14A8
S3150002A0100014001500150015001500150015001591
S3150002A0200015001500150015001500150015001580
S3150002A0300015001500150015001500150015001570
S3150002A040001500150015001500150015001600165E
S3150002A0500016001600160016001600160016001648
S3150002A0600016001600160016001600160016001638
S3150002A0700016001600160016001600160016001628
S3150002A0800016001600160016001600160016001618
S3150002A0900016001600170017001700170017001702
S3150002A0A00017001700170017001700170017 0017F0
S3150002A0B00017001700170017001700170017 0017E0
S3150002A0C00017001700170017001700170017 0017D0
S3150002A0D00017001700170017001700170017 0017C0
S3150002A0E00017001700170017001700170017 0017B0
S3150002A0F0001800180018001800180018001 8001898
S3150002A1000018001800180018001800180018001887
S3150002A1100018001800180018001800180018001877
S3150002A1200018001800180018001800180018001867
S3150002A130012C01540154015401F401CC01CC01CC8F
S3150002A1400001000100010001000100010001 0001FF
S3150002A1500001000100010001000100010001 0001EF
S3150002A16000000010E021D032C043A05490658076633
S3150002A1700875F873F982FA91FB9FFCAEFDBDFECB22
S3150002A1800001030701020408010204080007000394
S3150002A19007140003071800030 71E00030724000321
S3150002A1A0072F0003073A000307430003074A000389
S3150002A1B0074F0003075300030758000307600003 15
S3150002A1C007670003076D00030783000307 8E00037A
S3150002A1D0079E000307A5000307AA000307AE0003B4
S3150002A1E007B3000307BB000307C2000000000000 1C
S3150002A1F0000F00000000000000100000000000 0038
S3150002A200000080000000000000003000000090000032
S3150002A2100077000000000000000010000000000000AF
S3150002A22000002000000000000000700000000000001D
S3150002A2300000300000000000000003000000000000010
S3150002A240000080000000000000000000000000 10000FD
S3150002A25003FF000000030000000200000004C7AF75
S3150002A260C80047AFC8000000400000443040000002D3
S3150002A270A1EA0002A1EE000307C80473040000026B
S3150002A280628E00026292000307CC0470020000 0292
S3150002A29062860002628A000307D2047204000002 88
S3150002A2A0628E00026292000307D70452040000 0283
S3150002A2B0A2120002A216000307DC046305000002D4
S3150002A2C0A25E0002A262000307E0043005000025B
S3150002A2D0A25E0002A262000307F904310500000231
S3150002A2E0A25E0002A2620003082904 5C02000002B8
S3150002A2F0A24A0002A24E0003085A045800000000B7
S3150002A30000000000000000000308770453040000266
S3150002A310A1F20002A1F60003089D04480400000 20F
S3150002A320A1FA0002A1FE000308AF045404000002D1
S3150002A330A2020002A20E000308C1044904000002A0
S3150002A340A21A0002A21E000308D704440400000257
S3150002A350A2220002A226000308FF046100000000F8
S3150002A36000000000000000000309 0A047800000000 53
S3150002A37000000000000000000309 17046A040000023E
S3150002A380A22A0002A22E000309200469000000008E
S3150002A390000000000000000030970047A00000000BB
S3150002A3A000000000000000000309A604640000 0008B
S3150002A3B00000000000000000309C70441000000007D
S3150002A3C0000000000000000000309D204420000000061
S3150002A3D000000000000000000309D90450000000 3C
S3150002A3E000000000000000000309E004570000000 1E
S3150002A3F000000000000000000309F3044F0000000003
S3150002A4000000000000000000030A0F045A02000002C6
S3150002A410A2320002A23600030A32045902000002E6
S3150002A420A2220002A22600030A3D045502000002EF
S3150002A430A2420002A24600030A4B046E0200000278
S3150002A4408E100002A25A00030A6A046203000000286
S3150002A450A23A0002A23E00030A79044603000000261
S3150002A4608E0C0002A25200030ABD044C0200000236
S3150002A4708E0C0002A25600030AFE044D02000002E0
S3150002A4808E0C00028E1000030B6C046600000000A6
S3150002A490000000000000000000030BAD046D0400000282
S3150002A4A0628E0002629200030BF70456000000005F
S3150002A4B00000000000000000030C0C047600000000FF
S3150002A4C00000000000000000030C24047900000000D4
S3150002A4D00000000000000000030C31044E02000002DE
S3150002A4E08E100002A20A00030C4404670200000256
S3150002A4F08E0C0002A20600030C86044702000 0022C
S3150002A5008E0C0002A26600030CBC0474000000005C
S3150002A5100000000000000000030CFB046B00000000BA
S3150002A5200000000000000000030D04043800000000D3
S3150002A53000000000000000000030D43046F000000004D
S3150002A5400000000000000000030D8900030DA70001B2
S3150002A550F8C40002A26A00030DA9042E3FA000005F
S3150002A560400000000041A000004B989680408000009
S3150002A57000000003F0000004F80000042C80000BB
S3150002A5804980000039102DE00003166600021884 87
S3150002A5900000000000003166C010064696F757858AC
S3150002A5A0706E6373666545674700C1DAF2AD426451
S3150002A5B0D53AC21EC165412270BBBF325DEEC324CD
S3150002A5C0360243D09278C3BEEE784316F3E5C1BE97
S3150002A5D0974300000000000000003FC90FDB40491E
S3150002A5E00FDB3FC90FDB322BCC773F0000003F80E9
S3150002A5F00000C15B0533C1A40BFEC107E9FBBF56D0
S3150002A6006BD7422443E642AC5090426E50524170A0
S3150002A610624F000000003F060A923FC90FDB3FB6E9

S3150002A6200A923F8000003E8930A43FDDB3D7BF8047
S3150002A6300000322BCC77000000007F7FFFFF4049ED
S3150002A6400FDB3FE61F47BEEB2F673CB5576D41ACAC
S3150002A6509775C10BF8D000000000FF7FFFFF3F3562
S3150002A66004F33F3172183EDE5BD900000003ED88B
S3150002A670E33D3F15539D3F3504F33F8000007F7F46
S3150002A680FFFF7F7FFFFFFF7FFFFF0080000043FC8D
S3150002A69015F841600C8D3D0876B3447C15F842E00E
S3150002A6A011C90000000042B000007F7FFFFFC2AE6A
S3150002A6B00000233877AA3F8000003FB8AA3B3F003C
S3150002A6C000003F3172183F8CCCCD000000007F7F26
S3150002A6D0FFFFFF7FFFFF3F800000000000000FF7FBB
S3150002A6E0FFFF7F7FFFFF000000003F800000400069
S3150002A6F000004040000004080000040A0000040C032
S3150002A700000040E000004100000041100000041202E
S3150002A710000042C80000447A0000461C400047C3BD
S3150002A7205000497424004B1896804CBEBC204E6ED5
S3150002A7306B28501502F951BA43B75368D4A555117F
S3150002A74084E756B5E62158635FA95A0E1BCA749D63
S3150002A750C5AE7F8000007F8000007F8000007F8082
S3150002A76000007F8000007F8000007F8000007F80E5
S3150002A77000007F8000007F8000007F8000007F80D5
S3150002A78000007F8000007F8000007F8000007F80C5
S3150002A79000007F800000020202020202020202092
S3150002A7A028282828282020202020202020202079
S3150002A7B020202020202020204810101010101010E9
S3150002A7C0101010101010101084848484848484846D
S3150002A7D084101010101010101081818181818101017 5
S3150002A7E0010101010101010101010101010101010151
S3150002A7F001011010101010101082828282820202DF
S3150002A8000202020202020202020202020202020220
S3150002A81002021010101020000000000000000000CC
S3150002A8200000000000000000000000000000000020
S3150002A8300000000000000000000000000000000010
S3150002A8400000000000000000000000000000000000
S3150002A85000000000000000000000000000000000F0
S3150002A86000000000000000000000000000000000E0
S3150002A87000000000000000000000000000000000D0
S3150002A88000000000000000000000000000000000C0
S3150002A890000000000000000004E000000000000000062
S3150002A8A03FF00000000000000400000000000000031
S3150002A8B04008000000000000040100000000000000F8
S3150002A8C040140000000000000401800000000000D4
S3150002A8D0401C0000000000000402000000000000B4
S3150002A8E04022000000000000040240000000000009A
S3150002A8F04059000000000000040C38800000000002C
S3150002A9004197D7840000000004341C379400000000C
S3150002A9104693B8B5C00000007FF00000000000000BA
S3150002A9207FF00000000000007FF000000000000041
S3150002A930000000000000000005A5958575655545 35B
S3150002A9405251504F4E4D4C4B4A494847464544435 7
S3150002A95042413938373635343332313000 4E000011
S3150002A96000000000000005365726961 6C20706F6C14
S3150002A9706C005365726E6F004E6F205365726E6F78
S3150002A98000736574207365726961 6C20706F6C6CFC
S3150002A990006C766C203120706173737764006C767C
S3150002A9A06C2032207061737377 64006C766C20338E
S3150002A9B020706173737764006C766C20342070614A
S3150002A9C07373776400 6C766C20352070617373 77CD
S3150002A9D064006C766C203620706173737764006C49
S3150002A9E0766C20352074656D702063616C69622017
S3150002A9F0706173737764007175696574206C6F6733
S3150002AA0020696E0064756D70207365726E6F0064E6
S3150002AA10756D70207365726E6F207769746 86F75D5
S3150002AA2074206C6F67696E6720696E0073746F56
S3150002AA3072652073657269616C20706F6C6C20613F
S3150002AA40646472657373006174746E006C6F676F11
S3150002AA506E000D0A4D617820696E2061726368 6925
S3150002AA607665003433323166647361000D25730DE9
S3150002AA700A4C6F676F6E20746F20256C78206174A4
S3150002AA8020000D0A000D0A25386C78202578004E24
S3150002AA904D6F6E64617900547565736461790057 10
S3150002AAA065646E65736461790054687572736461 76
S3150002AAB079004672696461790053617475726461E2
S3150002AAC0790053756E646179002530326 43A253017
S3150002AAD032643A2530326400253032643A25303207
S3150002AAE064002000253264 2F2532642F2534640049
S3150002AAF02532642F2532642F25346400 2534642FD1
S3150002AB002532642F25326400200025326 42F253237
S3150002AB1064002532642F25326400252D332E3373CB
S3150002AB202020257300445354000025303464 25303206
S3150002AB3064253032642E25303264253032640 04E6C
S3150002AB40626F78636C00626F7820636C6F73656402
S3150002AB50206576656E7473000D0A25732025376CA1
S3150002AB606420004E4576656E7420446961676E6F97
S3150002AB7073746963 00252D31362E31367300252D07
S3150002AB8031362E313673005469 6D652000446174 86
S3150002AB9065200025 2D31302E3130732536 6C640048
S3150002ABA064756D7020646973706C617920726567 73
S3150002ABB0697374657273006475 6D7020636F6C756A
S3150002ABC06D6E2068656164696E67730064756D7089
S3150002ABD020736372 6F6C6C20726567697374657239
S3150002ABE073007370656369667920636F6C756D6E49
S3150002ABF0206E756D62657220666F72202D64206FFD
S3150002AC0072202D730073706563696679207265 67B9
S3150002AC10697374657220 6E756D62657220666F72F5
S3150002AC20202D7300636C656172207468652073 63FE
S3150002AC30726F6C6C207461626C6500577269746520
S3150002AC4020746865207363726F6C6C207461626C29
S3150002AC5065007265706561746564 6C792064756DF2
S3150002AC6070207468652072656769737465722 06FF7
S3150002AC706E2074686520646973706C6179006469 1A
S3150002AC807370006475 6D7020646973706C617920ED
S3150002AC90726567697374657273000D0A25326420E2
S3150002ACA0253364207C253136737C2000207C252DBB
S3150002ACB031362E3136737C00207C252D31362E31ED
S3150002ACC036737C000D0A253264202533 64207C25E8
S3150002ACD03136737C20000D0A25326420253364 2028
S3150002ACE07C253136737C2000207C252D31362E3191
S3150002ACF036737C00207C252D31362E3136737C004E
S3150002AD000D0A5370656369666965642072656769D1
S3150002AD107374657220646F6573206E6F7420657834
S3150002AD206973742069 6E20737065636966696564 08
S3150002AD3020636F6C756D6E000D0A5370656369 66EC
S3150002AD406965642072656769737465722 06F7574CC
S3150002AD50206F6620626F756E647320666F72207351
S3150002AD607065636966696564 20636F6C756D6E00F4
S3150002AD700D0A537065636966696564 20636F6C7555
S3150002AD806D6E2069732065 6D707479000D0A5370BB
S3150002AD9065636966696564 20636F6C756D6E2069AB
S3150002ADA073206F7574206F6620626F756E64730010
S3150002ADB00D0A5363726F6C6C207461626C65206657
S3150002ADC0756C6C000D0A4D617820696E2061726 3A4
S3150002ADD068697665004E52656769737465727300B9
S3150002ADE0252D31362E313673 00436F7079726967 BD
S3150002ADF06874203139393900252D31362E313673B2
S3150002AE0000517561646C6F676963 20544D582D3526
S3150002AE10000D0A253264202533642000207C252D6E
S3150002AE2031362E3136737C00207C252D31362E317B
S3150002AE3036737C00252D31362E31367300526576F7
S3150002AE4065727365 00466F7277617264 00252D31F3
S3150002AE50362E313673 00496E697469616C697A6996
S3150002AE606E6700252D31362E3136730050 6C6561C2
S3150002AE707365207761697400537461727420616 42A
S3150002AE806472004 56E6420616464720 04C656E678C
S3150002AE90746820746F20646973706C617920696EBE
S3150002AEA0206465636 96D616C00646973706C6179B5
S3150002AEB0206173203634 2D626974206C6F6E6720B0
S3150002AEC0646F75626C6573 00646973706C61792076
S3150002AED06173203332 2D62697420666C6F61746906
S3150002AEE06E6720706F696E74206E756D626572731F
S3150002AEF00064697370 6C6179206173203136206257
S3150002AF0069742077 6F72647300646973706C617917
S3150002AF102061732033322062697420 6C6F6E67730E
S3150002AF20006469737 06C617920617320382062 69EC
S3150002AF3074206368617261637465727300666 96C1A
S3150002AF406C206D656D6F727920776974682068650B
S3150002AF5078207661 6C75652C206164642 02D6920E9
S3150002AF606F72202D6C20666F7220313620 6F722030
S3150002AF7033322062697 4732C20646566617 56C7461
S3150002AF802038206269747300 66696C6C206D656D89
S3150002AF906F72792077697468 20666C6F61742076A7
S3150002AFA0616C75652C2061646420 2D4C20666F727D
S3150002AFB0203820627974652C2064656661756C742C
S3150002AFC0203420627974650074657374 0065726159
S3150002AFD07365206 66C61736820736563746F7200B3
S3150002AFE07072696E7420666C61747320696E206C
S3150002AFF06578706F6E656E7469616C20666F726DCE
S3150002B0000636F6C64207374617274 20746865 20C7
S3150002B0106D6574657200707269 6E742073656374 0F
S3150002B0206F72206D617000 646D0064756D70206DC5
S3150002B030656D6F7279000D0A5323205365637454 4C

S3150002B04079706520562053416464722020536563EB
S3150002B0507453697A652044617461202020205573F7
S3150002B06065642020536563745365712320536563B9
S3150002B0707454696D652020205365637444617465 58
S3150002B0802020202020202020525443204E756D4461FA
S3150002B0907973000D0A25326420000507 26F6772615F
S3150002B0A06D200044617461202020200041726368 93
S3150002B0B06976652000436 16C436F6E737400384B8A
S3150002B0C0546F75546162004E6F742055736564 0047
S3150002B0D02025632025303 66C782025386C640020C4
S3150002B0E0202020202025376C642025396C7820000A
S3150002B0F02020202020202025376C642025396C6420EE
S3150002B10000202020202020202025376C642025396C54FD
S3150002B1102000204F70656E2025376C640020446F36
S3150002B1206E652025376C6400204F70656E202537CA
S3150002B1306C64002025396C6420002025396C64007B
S3150002B14020253764000D0A2530366C782000254C00
S3150002B1506500254C67000D0A2530366C78200025DF
S3150002B1606500256 7000D0A2530366C7820002530EB
S3150002B170386C7820000D0A2530366C78200025 3090
S3150002B18034782000 0D0A2530366C782000253032BE
S3150002B1907820000D0A4572617369 6E6720646174D6
S3150002B1A06120736563746F72202564000D0A52650F
S3150002B1B07374617274696E6720686172647761 7212
S3150002B1C065000D0A52657374617274696E67206C4C
S3150002B1D06F67000D0A496E697469616C697A696EF6
S3150002B1E0672072616D000D0A526573746F72696E23
S3150002B1F06720696E746572727570747473004E64723C
S3150002B2000064656D616E642072657365747 3000D0A
S3150002B2100A2573202537 6C64200054696D65206900
S3150002B2206E2048483A4D4D3A535320666F726D610F
S3150002B2307400446174652D666F726D61742073705B
S3150002B2406563276420627920 2D66206F7074696FAA
S3150002B2506E00666F726D617420303D4D4D2F444411
S3150002B2602F59595959203 13D44442F4D4D2F595983
S3150002B27059595920323D595959592F4D4D2F444400A1
S3150002B2806F66667365742066726F6D20656E74658F
S3150002B2907265642064617465206 96E20686F7572D8
S3150002B2A07300647400746 96D652F64617465000DC2
S3150002B2B00A4D696E696D756D2074696D65206265EA
S3150002B2C0747765656E207265766572736520746 93A
S3150002B2D06D65206368616E67657320697320323419
S3150002B2E020686F7572730D0A000D0A5761726E69D6
S3150002B2F06E67202D2072657665727365207469 6D9E
S3150002B300652063686 16E67657320647 5706C696336
S3150002B3106174652064617 97320616E642072656 46C
S3150002B32075636 5206176 61696C61626C6520666C25
S3150002B330617368206D656D6F72792E204F4B207494
S3150002B3406F2050726F636565643F20592F4E000D62
S3150002B3500A4F7065726174696F6E2061626F7274F2
S3150002B3606564000D0A496E76616C69642054696DE4
S3150002B37065204368616E67650D0A000D0A002000AC
S3150002B3800D0A004E6E756D626572206F66206C6FD7
S3150002B390676963616C206D657465722007472616EB3
S3150002B3A0736665722064617461206279205 86D6FDC
S3150002B3B064656D2066726F6D206D6574657200 52EC
S3150002B3C06563656976652064617461206 96E746F70
S3150002B3D0206D657465722062792058 6D6F64656DA3
S3150002B3E0006E756D626572206F66 20736C6F747382
S3150002B3F0202D207573656420776 97468202D2400DA
S3150002B400676C6F62616C20746F20616C6C206D6575
S3150002B410746572730074726 16E73706F6E646572B6
S3150002B42020736C6F74206E756D626572 0073706541
S3150002B43063696 669 20544F55520706572696F64207E
S3150002B440666F72206C6F67206C69737 47300737019
S3150002B4506563696 6792077686963682 06C6F67201F
S3150002B4607175616E74697479 003D312073 696E6716
S3150002B4706C652070686173652 03D3220706F6C9C
S3150002B48079706861736500737065636966 792070A7
S3150002B4906861736520 6E756D6265722 0696E2070D3
S3150002B4A06F6C79706861736520 6D657465720 04CA6
S3150002B4B06F72207374617274206461746500 4C6FE7
S3150002B4C06720656E6420646174650 04C6F6720694D
S3150002B4D06E64657800416C6C20657665 6E747320C7
S3150002B4E02D20696E636C75646 5206 16C6C206772D1
S3150002B4F06F757073006576656E74 206E756D626524
S3150002B5007200636C656172 20706C6320657665 6E8D
S3150002B5107473006E756D2065766 56E7473006 4755E
S3150002B5206D70206576656E74 206C6F672067726F2A
S3150002B53075700064756D7020617263686976652046
S3150002B5406576656E74206C6F67006C6F6720737426
S3150002B55061727420746 96D6520666F72206469 7306
S3150002B560706C6179006C6F6720656E642074696D1A
S3150002B570652066 6F7220646973706C6179006475 08
S3150002B5806D70206576656E7420746F74616C7300DD
S3150002B5907375707072657373206865782064617460
S3150002B5A06120696E206C6F672064756D7000696E2C
S3150002B5B0636C7564652068657820 6D6573736 16771
S3150002B5C065206461746 120696E206C6F6720647502
S3150002B5D06D70006C697374206C6F67 67696E6720A3
S3150002B5E06F7074696F6E73206F662065766 56E7410
S3150002B5F073006475 6D7020706F696E74657273 2066
S3150002B600616E642073656374 6F7273206F6E20655A
S3150002B61076656E74206C6F677300646973706C6113
S3150002B620792065766 56E74206F66207370656369 2E
S3150002B63066696 56420636F756E7420696E206C6F2F
S3150002B64067006469 73706C617920657665 6E742033
S3150002B6507769746 8696E2072616E6765206F66200D
S3150002B660636F756E74732077686 56E207573656493
S3150002B670207769746 8206F7074696F6E20706F73BB
S3150002B68069746 96F6E2032006469 73706C61792027
S3150002B6906F6E6C79207472616E7366657220 73695F
S3150002B6A07A6520616E6420706F696E7465727300CC
S3150002B6B0656E642062656 66F72652066 6972737470
S3150002B6C020756E66696E6973686564206461 7900C7
S3150002B6D0736B69702031206576656E742061667 4BD
S3150002B6E06572206669727374206D617463 6800699D
S3150002B6F06E74656C2062797465206F726465 72007F
S3150002B70073656C65637420736572 6E6F202D206D90
S3150002B71075737420626520677265617465722074 40
S3150002B72068616E206F7220657175616C20746F207E
S3150002B73030343030303030303000696E636C75646599
S3150002B740206461746 12067726F7570732062 79205C
S3150002B7506C6574746572202D674 4546553507073 1A
S3150002B760202D20446174612C54616D7065722C65C4
S3150002B77076656E742C53746172747 5702C504C43DA
S3150002B7802C70756C73652C7365726961 6C202D2043
S3150002B790616E79206E756D626572206F66206772C2
S3150002B7A06F7570206C657474657273 207374 72752C
S3150002B7B06E6720746F6765746865722 0696E2061B2
S3150002B7C06E79206F7264657200657665 6E740064C8
S3150002B7D06961676E6F73746963206576656E7473EB
S3150002B7E0000D0A45232045 76656E74202020202010
S3150002B7F02020202020202020202020202020205065727A
S3150002B8006D4C766C20204C6F674 461696C79202000
S3150002B8104D73674461 696C79202020204172636869BF
S3150002B82076652 04D6178457 6656E7473 2047726F32
S3150002B83075707 3000D0A25326420252D3230 73206F
S3150002B84025396 420202020202020202025632 02046
S3150002B850202020202020202 02563202020202020209B
S3150002B860202025632025396420000D0A2573004512
S3150002B870232065 76656E74206E616D652020202 01A
S3150002B88020202020636F756E74202020202020202027
S3150002B8906C617374206576656E7400253235 7300AB
S3150002B8A00D0A25730025327520252D3132730020AD
S3150002B8B02531306C7520002 0000D0A53746172 74B4
S3150002B8C0206F6E6C79206F6E2073706563696669 8E
S3150002B8D065642065766 56E74000D0A53746172 7430
S3150002B8E0206F6E20616E79206D617463686 96E6780
S3150002B8F0206576656E74000D0A44756D70206F6E54
S3150002B9006C79206576656E7473207769746 8696EE2
S3150002B9102072616E6765206F6620657665 6E74209B
S3150002B9206E756D62657273000D0A44756D702061E5
S3150002B9306C6C206576656E747320737461727469 6 9BB
S3150002B9406E67207769746820737065636966 6965D6
S3150002B9506420657665 6E74000D0A536B6970206605
S3150002B9606972737420657665 6E74000D0A53746F7E
S3150002B97070206265666F72652063757272656E7499
S3150002B98020646179000D0A44756D702025730061 8B
S3150002B9907263686976650064616 96C792065766 5AB
S3150002B9A06E74206C6F67000D0A53746172746 96E4F
S3150002B9B067206576656E74206E756D6265722020ED
S3150002B9C020202020202020202025313064000D0A4529
S3150002B9D06E64696E67206576656E74206E756D623B
S3150002B9E0657220202020202020202020202020202531A2
S3150002B9F03064000D0A4576656E7420636F756E7449
S3150002BA002072616E6765206C6F776572206C696D56
S3150002BA1069742020202531306C64000D0A4576656E06
S3150002BA207420636F756E742072616E67652075701F
S3150002BA30706572206C696D69742020202531306C75D1
S3150002BA400000D0A446174652F54696D65206C6F7729
S3150002BA506572206C696D69742020202020000D0A44ED

S3150002BA606174652F54696D65207570706572206CFE
S3150002BA70696D697420202020000D0A4461746120DA
S3150002BA806F6E6C7920666F722073657269616C20C5
S3150002BA906E756D626572202530386C78000D0A4429
S3150002BAA061746120666F7220616C6C2073657269C5
S3150002BAB0616C206E756D62657273000D0A000D0A67
S3150002BAC04669727374206D6573736167652061647C
S3150002BAD06472202020202020202020202020202020C8
S3150002BAE02025386C78000D0A4C617374206D6573DD
S3150002BAF07361676520616464722020202020202003
S3150002BB0020202020202020202025386C78000D0AB5
S3150002BB10586665722073697A652028696E20627993
S3150002BB207465732920202020202020202020202018
S3150002BB302025386C64000D0A4E756D626572206FA1
S3150002BB4066206576656E747320696E207866657206
S3150002BB5020202020202020202025386C64000D0A79
S3150002BB6025326420252D313273202531306C642034
S3150002BB702530386C782000202530386C7820253224
S3150002BB806420253664200000D0A002530386C7820A2
S3150002BB9000044005400650053005000700073004ECC
S3150002BBA00D0A6C6F67676564206F75742061742077
S3150002BBB0000D0A0065786974006578697420616E03
S3150002BBC0642072657365742073657269616C004ED8
S3150002BBD073696D756C7461746520706F7765722018
S3150002BBE06661696C0068616C740068616C74206DD2
S3150002BBF065746572004E777965206F722064656C94
S3150002BC007461206D6561737572656D656E747320FE
S3150002BC10287779653D302C2064656C74613D312945
S3150002BC20006374206F72207368756E74206D65747C
S3150002BC306572202863743D302C207368756E743DDE
S3150002BC403129007772697465206864777220636FA0
S3150002BC506E66696720746F20617263686976650033
S3150002BC606765742064656661756C742068647772B2
S3150002BC7020636F6E66696720746F2072616D20663D
S3150002BC806F722065646974696E6700726573746F9A
S3150002BC907265206864777220636F6E666967206CCE
S3150002BCA061737420736176656420746F20666C61BB
S3150002BCB0736820746F2072616D20666F72206564EE
S3150002BCC06974696E670073657420686477722063AD
S3150002BCD06F6E66696720746F206C6173742073617E
S3150002BCE076656420746F20666C6173680064756D96
S3150002BCF070206864777220636F6E6669670070757C
S3150002BD006C736520696E707574206465626F756EFA
S3150002BD1063652074696D6520303D312F36342031DC
S3150002BD203D322F363420323D342F363420333D38DF
S3150002BD302F3634207365630070756C736520696EE7
S3150002BD4070757420636F756E742065646765732001
S3150002BD502D42313D626F7468202D42303D6F6E6513
S3150002BD6000706C7573205520706F77657220737553D
S3150002BD7070706C79207472697020706F696E7420AD
S3150002BD80666F7220706F776572206661696C0064F7
S3150002BD90756D7020706C7573205500536574207034
S3150002BDA0756C73654F757420303D7374642C203145
S3150002BDB03D2070756C73652073657269616C2C2009
S3150002BDC0323D6D632073657269616C00456E616216
S3150002BDD06C65207465737420627574746F6E20616D
S3150002BDE073206761746520746F206C6F67696E20BB
S3150002BDF06C6576656C73203520616E64203600456D
S3150002BE006E61626C657320627269646765206D6F2C
S3150002BE10646520666F7220504C43207472616E73A3
S3150002BE206D697400446973706C61797320636F7015
S3150002BE30797269676874206D6573736167652075C9
S3150002BE40706F6E20726573657400456E61626C6513
S3150002BE5073206E6F726D616C6C79206F70656E20E7
S3150002BE6074616D70657200536574206E756D6265DE
S3150002BE7072206F662070756C736520636F756E74C1
S3150002BE80657273006864777200736574206D6574F9
S3150002BE906572732C207068617365732070657220F9
S3150002BEA06D65746572000D0A4D617820696E2061B8
S3150002BEB0726368697665000D0A4D75737420626552
S3150002BEC020696E20656469742072616D20746F202A
S3150002BED07772697465000D0A6C6F636174696F6EBF
S3150002BEE0206F6620686172647761726520636F6E87
S3150002BEF066696720696E666F202D2025730044658A
S3150002BF006661756C7400456469742052616D004601
S3150002BF106C617368000D0A44454120534855E0
S3150002BF204E54204D696E2E552050756C73654564D1
S3150002BF306765204465626F756E636520506963208C
S3150002BF405465737442202370756C7365000D0A255F
S3150002BF502D352E357320252D352E35732025352E7C
S3150002BF60326620252D392E3973202534752F363425
S3150002BF707073202533642025 2D352E357320253640E
S3150002BF8000596573004E6F00596573004E6F00428B
S3150002BF906F7468004E65676174697665005965 73EA
S3150002BFA0004E6F000D0A504C4320627269646765 49
S3150002BFB03A2000456E61626C656400446973616291
S3150002BFC06C65640020504F5220436F707972696D
S3150002BFD06768743A2000456E61626C656400446964
S3150002BFE073616 26C6564002020 54616D7065723AFB
S3150002BFF020004E6F726D204F70656E004E6F726D2F
S3150002C00020436C6F736564000D0A706C757320753E
S3150002C010203D202531302E32662061766572616789
S3150002C02065000D0A706C7573207520 3D202531 3030
S3150002C0302E326620696E7374616E74616E656F75F9
S3150002C0407300256C6620000A000A000A00496E7613
S3150002C050657273696F6E206572726F72212121 0A91
S3150002C06000496E7665727369 6F6E2070726F626CCC
S3150002C070656D20320A00256C6620000A004E546166
S3150002C0806D706572004 36C6F736564005374617200
S3150002C0907475707300506F776572446E7300502A
S3150002C0A06F776572205570730057617463686 46FA9
S3150002C0B067004E6F2042617474657279004261 6452
S3150002C0C0507772446F776E0053707572696F75732D
S3150002C0D0527374005469 6D6563686E67546F0054D9
S3150002C0E0696D6563686E6746726F6D00446D647252
S3150002C0F06573657400507 56C7365310050756C73A9
S3150002C1006532005075 6C736533004C696E65204369
S3150002C11079636C657300476F6F6420506B740048D7
S3150002C120756E744368616E6E656C004261642050 80
S3150002C1306B7400586D697420506B74004C6F676F96
S3150002C1407574004C6F67696E31004C6F67696E32A9
S3150002C150004C6F67696E33004C6F67696E34004C32
S3150002C1606F67696E35004C6F67696E3600437261A0
S3150002C1707368457665 6E740053746F7265436F6EAD
S3150002C18066696700506C634 67265657A6500546934
S3150002C1906D654572726F7200506 8457272 6F7200F9
S3150002C1A053746F72654361 6C6962004 36F6C6453CA
S3150002C1B0746172740053746F72655365726E6F00A8
S3150002C1C053746F726550504D004E6577506173 73AC
S3150002C1D0776431004E657750617373776432004E2F
S3150002C1E06577506173737764 33004E6577506173 78
S3150002C1F07377643 4004E6577506173737764 3500E4
S3150002C2004E6577506173737764 360053796E635265
S3150002C21054430053746F72654D756C747300537496
S3150002C2206F7265537 474790053746F7265536372D7
S3150002C2306F6C6C0053746F7265506F6C6C00537444
S3150002C2406F726548647 7200496E74657276616CC6
S3150002C2507300446 56D616E64 73004461696C794173
S3150002C26063756D7300537461727444617461 0023
S3150002C270456E6444617461004E6578745365 6374F7
S3150002C2806F720053746172745365637 46F720053F4
S3150002C290746172744461 7900446174615 8666572AE
S3150002C2A000536572 69616C202300526 56C65617387
S3150002C2B06520436F646500526 56C65617365205441
S3150002C2C0696D6500536F66747761726520566 57293
S3150002C2D073696F6E004153494320566572736 96FE5
S3150002C2E06E004653313030344600506F776572 2007
S3150002C2F04661696C0025326425303278253034 78FF
S3150002C30025386C7800253034782530347825303459
S3150002C31078253034780025 2D31362E31367 3004992
S3150002C3206E697469616C697A696E6700253038 6C6A
S3150002C330782020202020202020006E756D6265 72F4
S3150002C340206F66206C6F6769636 16C206D6574652A
S3150002C35072007472616E73666572206461746 12024
S3150002C36062792058 6D6F64656D2066726F6D206DFF
S3150002C3706574657200526563656976652064 6174E9
S3150002C38061 20696E746F206D65746572206279 2012
S3150002C390586D6F64656D006E756D626572206F66AD
S3150002C3A020736C6F7473202D2075736564 20776912
S3150002C3B07468202D2400676C6F62616C20746F2094
S3150002C3C0616C6C206D6574657273 007472616E7354
S3150002C3D0706F6E64657220736C6F74206E756D6219
S3150002C3E0657200737065636966792054 4F552070D3
S3150002C3F06572696F6420666F72206C6F67206C6964
S3150002C4007374737300737065636966792077686 9630C
S3150002C41068206C6F67207175616E74697479003D6E
S3150002C420312073696E676C6520706861 73652C20B4
S3150002C4303D3220706F6C7970686173 6500737065 48
S3150002C440636966792070686173652 06E756D6265D1
S3150002C45072206 96E20706F6C7970686173 6520 6DE9
S3150002C4606574657200 4C6F672073746172742064 20
S3150002C47061746500 4C6F6720656E6420646174 6543

S3150002C480004C6F6720696E64657800064756D702074
S3150002C490636F6E7374616E74730064756D7020637E
S3150002C4A0757272656E7420636F6E7374616E7473E7
S3150002C4B000566F6C74616765205068617365004 34E
S3150002C4C0757272656E74205068617365004375 7289
S3150002C4D072656E742072616E67650044656C61797F
S3150002C4E020696E2075736563206672 6F6D20492020
S3150002C4F0746F20560041646A75737420637572 7294
S3150002C500656E7420696E20756E697473206F66207D
S3150002C510302E3031250072652D53796E6368726F45
S3150002C5206E697A652072616D20746F20726F6D205C
S3150002C530636F6E7374616E747300766F6C74616789
S3150002C540652072616E676500636C6561722074684E
S3150002C5506520636F6E7374616E747300686F6C64CA
S3150002C56020612072616E676520666F72203420 68D2
S3150002C5706F7572730061646A75737420766F6C747A
S3150002C580616765206D65617375726564206C696E9D
S3150002C5906520746F206E65757472616C20696E20F9
S3150002C5A0756E697473206F6620302E3031250061F6
S3150002C5B0646A75737420766F6C74616765206D6545
S3150002C5C061737572656420 6C696E6520746F206C88
S3150002C5D0696E6520696E20756E697473206F6620B8
S3150002C5E0302E3031250061646A7573742063757 26A
S3150002C5F072656E742073687 56E7420616D706C69F5
S3150002C60066696572 20696E20756E697473206F663D
S3150002C61020302E3031250061646A757374204144DE
S3150002C62043206269742036006164 6A75737420411E
S3150002C6304443206269742037006164 6A757374200A
S3150002C640414443206269742038006164 6A757374D8
S3150002C65020414443206269742039006164 6A75731B
S3150002C660742041444320626974203130006164 6A57
S3150002C670757374204144432062697420313100612C
S3150002C680646A75737420414443 20766F6C746167E3
S3150002C6906520726566657265 6E636500577269 74B8
S3150002C6A0652043616C20436F6E7374616E74730010
S3150002C6B07370656369666965642044414320636FEC
S3150002C6C0646520746F20 50484F55542070696E205F
S3150002C6D0666F72203630207365636F6E64732C202A
S3150002C6E0616E79206B657920746F2073746F7000A8
S3150002C6F064756D702044414320 6F666673657420CD
S3150002C700636F7272656374696F6E20616E64207204
S3150002C71065737 56C74616E74206F666673657420DA
S3150002C7206F6620637572 72656E7420616D70732018
S3150002C730666F7220656163682067 61696E00726563
S3150002C740646F206F66667365742 06D6561737572BA
S3150002C750656D656E747320616E6420636F727265B7
S3150002C760637469 6F6E73007365742061646320631A
S3150002C770616C6962726174 696F6E2076732076727B
S3150002C78065660073657420444143 2063757272 6561
S3150002C7906E74206F66667365742063 6F727265636A
S3150002C7A074696F6E206F6E20 38206269742063 6F21
S3150002C7B06E76657274657200736574206672657151
S3150002C7C075656E6379 2064757269 6E672063616C44
S3150002C7D06962726174652 06D6F6465 007874616C5C
S3150002C7E020657 2726F7220696E20487A00646973DE
S3150002C7F0706C617920666C6F6174696E6720706F08
S3150002C800696E7420636F6E7374616E7473207769D8
S3150002C81074682075 6E697473206F6E202D632061B3
S3150002C8206E64202D6400646973706C617920746192
S3150002C830626C65206F662063616C6962726174 69FD
S3150002C8406F6E20636F6E7374616E74732061 7320F2
S3150002C8506D616E7469737361 20616E64206578 70B0
S3150002C8606F6E656E74006D630063616C69627261FE
S3150002C870746520 6D657465720043414C000D0A2093
S3150002C8805220204441 43202020 69536C6F7065205A
S3150002C890694F66667365742020 694572726F7220ED
S3150002C8A068656164726F6F6D20202020206D61784B
S3150002C8B04920202020206D696E49000D0A25326428
S3150002C8C0202534642025382E33662025372E3166FE
S3150002C8D02025372E3166202025372E31662025 3831
S3150002C8E02E33662025382E3366000D0A4F66667390
S3150002C8F06574206974657261746 96F6E7320706500
S3150002C90006E64696E672025640 00D0A4F666673655C
S3150002C9107420636F756E7465722025 64000D0A417A
S3150002C9204443206F6666736574203D2025382E3396
S3150002C93066000D0A4261747465727920414443208F
S3150002C940636F6465203D2025382E3366000D0A523A
S3150002C950656620726573697374 6F7220414443 2061
S3150002C960636F6465203D2025382E3366000D0A4329
S3150002C9706F756E747320 706572 20766F6C74203DCD
S3150002C9802025382E3366000D0A5265662064696FCB
S3150002C9906465204144432063 6F6465203D20253849
S3150002C9A02E3366000D0A475041206F666673657422
S3150002C9B0203D2025382E3366000D0A4C6F772074F1
S3150002C9C07269702049203D2025382E3366000D0AF3
S3150002C9D0486967682074726970204920 3D202538AD
S3150002C9E02E3366000D0A56726566206F6E2047501A
S3150002C9F041203D2025382E3366000D0A475041312D
S3150002CA00203D2025382E3366000D0A47504132203C
S3150002CA103D2025382E3366000D0A47504133203D0E
S3150002CA2020 25382E3366000D0A205220764F666680
S3150002CA307365742076644F66667365742076 4572F4
S3150002CA40726F7220686561 64726F6F6D202020209C
S3150002CA50206D61785 6202020206D696E56000DCB
S3150002CA600A2532642025372E31662025372E316677
S3150002CA702025372E31662025382E31662025382E80
S3150002CA8033662025382E3366000D0A257376202 05C
S3150002CA905220416D70732E2E2E2E2E205761742B
S3150002CAA074732E2E2E2E2E20447761 7474732E2EBE
S3150002CAB02E2E20566F6C74732E2E2E2E2E2044761A
S3150002CAC06F6C74732E2E2E2E000D0A25732532647A
S3150002CAD02025316420253264202563253575 2025DD
S3150002CAE03364202563253575202533642025632587
S3150002CAF035752025336420256325357520253 36455
S3150002CB0020256325357520253364000D0A43757289
S3150002CB1072656E74204E6F74205570646174 65641C
S3150002CB20202D20796F75206D75737420737065637F
S3150002CB30696679202D497B6970686173657D20611C
S3150002CB406E64202D527B6972616E67657D206F70FF
S3150002CB5074696F6E0D0A000D0A566F6C7461676513
S3150002CB60204E6F74205570646174656420 2D20799F
S3150002CB706F75206D7573742073706563696679 20AD
S3150002CB802D567B7670686173657D20616E64202DFB
S3150002CB90767B7672616E67657D206F7074696F6EE3
S3150002CBA00D0A000D0A4175746F2D72616E6765205C
S3150002CBB0656E61626C6564000D0A52616E6765207E
S3150002CBC068656C6420746F20253275 2028692920D7
S3150002CBD025327520287629000D0A486F6C64696E25
S3150002CBE06720667265717565 6E637920746F20259C
S3150002CBF0382E3466202848 7A29000D0A486F6C645C
S3150002CC00696E67205F666673657473000D0A4672F5
S3150002CC1065717565 6E6379202D2025362E33662063
S3150002CC20487A206F6E20706861736520 25642C2017
S3150002CC306761696E202564 2C20617665726167 6979
S3150002CC406E6720256C64206379636C6573000D0A38
S3150002CC5054696D6572207874616C2061646A7573BB
S3150002CC6074202D2020202020 25332E336620487A007A
S3150002CC700D0A4144443206164 6A75737420626974C3
S3150002CC807320313120746872752036202D202534A8
S3150002CC9075202534752025347520253475202534D4
S3150002CCA07520253475000D0A567265662061646A20
S3150002CCB0757374202D20253464000D0A4F66667341
S3150002CCC06574206164 6A757374202573006479 6ED5
S3150002CCD0616D6963 00737461746963000D0A41448E
S3150002CCE043207673205672656620 61646A75737492
S3150002CCF020636F64652025382E3266000D0A4920AE
S3150002CD0073687 56E742061646A757374202D2025AC
S3150002CD103464000D0A20567020765220 4E2D3E565F
S3150002CD2041646A204C2D3E5641646A000D0A253341
S3150002CD30642533642025 31322E346520562F6C73D8
S3150002CD4062202531322E346520562F6C7362000D17
S3150002CD500A25336425336420253764202537640089
S3150002CD600D0A2573205220 2041646A492044656CCD
S3150002CD706179000D0A25732532642025 31322E345D
S3150002CD8065204 12F6C7362202535642075 536563D7
S3150002CD90000D0A2573253264202535642025356465
S3150002CDA0004E0D0A257352692076 52202020416DCD
S3150002CDB07073202020202056 6F6C747320202020 5719
S3150002CDC06174747320202020 5661727320202020 03
S3150002CDD020202020202020202020206B574872 20204F
S3150002CDE020202020 6B56415248720 0000D0A257320FE
S3150002CDF0202020202020434F4E5320554E49545300A5
S3150002CE000D0A000D0A2573000D0A25735269207654
S3150002CE1052205077724661 63742056497068617376
S3150002CE2065205641527068617365000D0A257320AC
S3150002CE302020202020204461696C7941636375 6D204E
S3150002CE4020202020202020 20204465 6C7461204C6F67CE
S3150002CE50202020202020202020202020 706820416363 7536
S3150002CE606D000D0A25732020574154542020 20209E
S3150002CE7020564152202020202020564166202054 4828
S3150002CE80442D564120202020202020564120205448 5F
S3150002CE90442D25252050777246616374205649 70C9

S3150002CEA0686173650000D0A25732020202020496ED3
S3150002CEB06974616C205641687220202020202020204F
S3150002CEC020413268722049 6E6372202020202020 2081
S3150002CED020205632687220496E637220202020205C
S3150002CEE0202046696E616C2056416872202020 20FF
S3150002CEF02020204465 6C7461205641687200 0D0A38
S3150002CF0025735154202020202020204461696C7909
S3150002CF10416363756D20202020202020202044656C0B
S3150002CF207461204C6F6720202020202020202020207052
S3150002CF306820416363756D006E756D626572206F60
S3150002CF4066206C6F676963616C206D65746572003B
S3150002CF507472616E736665722064617461206279AF
S3150002CF6020586D6F64656D2066726F6D206D6574F5
S3150002CF70657200526563656976652064617461 2035
S3150002CF80696E746F206D65746572206279205 86DC2
S3150002CF906F64656D006E756D626572206F662073D3
S3150002CFA06C6F7473202D2075736564207769746 8BD
S3150002CFB0202D2400676C6F62616C20746F20616C97
S3150002CFC06C206D6574657273007472616E73706F36
S3150002CFD06E64657220736C6F74206E756D62657215
S3150002CFE0007370656369667920544F5520706572C7
S3150002CFF0696F6420666F72206C6F67206C69737448
S3150002D000730073706563696679207768696368205F
S3150002D0106C6F67207175616E74697479003D312099
S3150002D02073696E676C6520706861736 52C203D328A
S3150002D03020706F6C7970686173650073706563 69DF
S3150002D040667920706861736520 6E756D62657220FF
S3150002D050696E20706F6C79706861736520 6D657496
S3150002D06065720 04C6F67207374617274206461 7418
S3150002D07065004C6F6720656E6420646174650 04CC0
S3150002D0806F6720696E6465780050686173657300 26
S3150002D090566F6C747300546F74616C7300667 56CB2
S3150002D0A06C20706861736500616C6C206D657465D7
S3150002D0B0726564206461746100646961676E6F738E
S3150002D0C07469637300372064696769742 06B7768D3
S3150002D0D02F6B7661726800746F74616C204861729E
S3150002D0E06D6F6E69632044697374 6F7274696F6ED3
S3150002D0F000717569657400667265717565 6E63792E
S3150002D10000707269 6E7420706820616363756D7554
S3150002D1106C61746F72206C696D697473206F6E2016
S3150002D1206D64202D7400707269 6E742056412074ED
S3150002D13065737420646174612 06F6E206D64202DA6
S3150002D1407400647 56D6D79206F7074696F6E2066F8
S3150002D1506F72206F6C642063616C6962726174 6FB6
S3150002D16072006D64006D657465722072656 16C2073
S3150002D17074696D6520646174610 06B5748006B5673
S3150002D180415248006B564148006B413248000D0A35
S3150002D1902573000D0A2573000D0A467265717565 65C1
S3150002D1A06E6379202D2025362E336620487A206F2D
S3150002D1B06E2070686173652025642C206761696E34
S3150002D1C02025642C2061766572616769 6E67202569
S3150002D1D06C6420637963 6C6573000D0A2573002500
S3150002D1E0326420253264200020002000202020 20E6
S3150002D1F0202020202020200020002025362E336620E5
S3150002D200504620002536 2E31660D0A002573002071
S3150002D2100020202020202020202020200020253130
S3150002D220302E3366562000200025362E31664465A0
S3150002D23067200020257320002025732000253264F4
S3150002D24020253264202537 2E3366202537 2E326676
S3150002D25020253 82E326600202531302E33662000F6
S3150002D260202573200056004100570056415200 0DFA
S3150002D2700A2573002032200020382000205820 0082
S3150002D2802531362E374C66202531362E374C662010
S3150002D2902531362E374C662000253132 2E31662056
S3150002D2A0002573006B574872000D0A25730025315D
S3150002D2B0362E374C66202531362E374C66202531E0
S3150002D2C0362E374C6620002531362E374C66202501
S3150002D2D031362E374C6620000D0A2573002531366D
S3150002D2E02E374C66202531362E374C662025313 6B0
S3150002D2F02E374C6620002531362E374C66202531D6
S3150002D300362E374C6620000D0A257300253264201E
S3150002D31025326420253 72E33662025372E326620A5
S3150002D32025382E32660020002000200020 00200032
S3150002D33025342E31662525202537 2E3366202537BE
S3150002D3402E3266000D0A20202020202020202020 20B8
S3150002D35020202020202020202020202020202020 20C5
S3150002D360202020202020202020202020202020207461
S3150002D3706F74616C202020202020200020002020B5
S3150002D380202020202020202020 20006E756D626572EC
S3150002D390206F66206C6F676963616C206D657465CA
S3150002D3A072007472616E7366657220646174612 0C4
S3150002D3B0627920586D6F64656D2066726F6D206D9F
S3150002D3C0657465720052656365697665206461 7489
S3150002D3D0612069 6E746F206D657465722062792 0B2
S3150002D3E0586D6F64656D006E756D626572206F664D
S3150002D3F020736C6F7473202D2075736564207769B2
S3150002D40074 68202D2400676C6F62616C20746F2033
S3150002D410616C6C206D6574657273007472616E73F3
S3150002D420706F6E64657220736C6F74206E756D62B8
S3150002D43065720073706563696679 20544F55207072
S3150002D44065726 96F6420666F72206C6F67206C6903
S3150002D450737473007370656369667920776869 63AC
S3150002D46068206C6F67207175616E74697479003D0E
S3150002D47031207369 6E676C652070686173652C2054
S3150002D4803D3220706F6C7970686173650073706 5E8
S3150002D49063696679207068617365206E756D626571
S3150002D4A07220696E20706F6C7970686173652 06D89
S3150002D4B06574657200 4C6F6720737461727420 64C0
S3150002D4C06174650 04C6F6720656E6420646174 65E3
S3150002D4D0004C6F6720696E646578005 46F74616CE6
S3150002D4E000546F750042696C6C696E67206C6973D3
S3150002D4F074005 46F75206C6F67206461797300 4401
S3150002D500616 96C7920746F75206C6F672072656132
S3150002D510646 96E677300646973706C617920746FF5
S3150002D52075206C6F672064616 96C792064656D6132
S3150002D5306E6473006469737 06C617920746 96D65D9
S3150002D54073206F6620646 1696C7920706561 6B7304
S3150002D550006469737 06C6179206461696C79207406
S3150002D5606F75206C6F6720636F6E73756D7074696B
S3150002D5706F6E0064697370 6C6179207468652064EB
S3150002D58061792074797065732066 6F72206120 72EA
S3150002D590616E6765206F6620646174657 32C206F07
S3150002D5A072207263762038 6B20636F6E666967201D
S3150002D5B066696C652062792078 6D6F64656D207787
S3150002D5C02F202D52206F7074696F6E00646973701C
S3150002D5D06C617920746865206461792074797065 5C
S3150002D5E0207461626C65206F662075702074 6F20EE
S3150002D5F031362064617920747970650064697370CC
S3150002D6006C617920746865206461796C69676874F5
S3150002D610207361766 96E67207469 6D6520746123
S3150002D620626C650064697370 6C617920746F752031
S3150002D63070726F66696C6520666F722073706563BF
S3150002D6406966696564206461746500436C6561722C
S3150002D65020446D640071756965740 06C6973742089
S3150002D6606C6F672F746F752F64656D616E642063CE
S3150002D6706F6E66696775726174696F6E206F662078
S3150002D68070617261 6D657465727300707269 6E7431
S3150002D6902070682061636375 6D756C61746F7220AA
S3150002D6A06C696D697473206F6E206D64202D74BD
S3150002D6B02C2073697A6573206F6E206D64202D39
S3150002D6C06D0070726 96E742072746320 6C6F6720CD
S3150002D6D07768656E2075736564207769746820 2D96
S3150002D6E0442C202D48206F72202D63206F707469A0
S3150002D6F06F6E730064756D70207365637 46F7273F9
S3150002D70020616E642070747273206F6E202D4C201F
S3150002D710776974682064617465730073706563 6900
S3150002D72066792070686173652 06E756D6265722018
S3150002D730696E20706F6C7970686173652 06D6574AF
S3150002D74065720073706563696679 206F7220646919
S3150002D750737 06C617920706172616D6574657273 44
S3150002D76020666F722062696C6C696E6720646973E9
S3150002D770706C6179007573652077697468202D6213
S3150002D78020746F2073706563696679206172 7465AF
S3150002D79020666F72204B574820626 96C6C20646960
S3150002D7A073706C6179007573652077697468202DD2
S3150002D7B06220746F20646 5706F73697420 6D6F6E7A
S3150002D7C0657920746F207468697320616363 6F756D
S3150002D7D06E7420617320 6F662073706563 27642000
S3150002D7E0646174650 0757365207769 7468202D62BB
S3150002D7F020616E64202D4220746F2073706563 6908
S3150002D800667920616363 6F756E7420 62616C616E06
S3150002D8106365206173206F6620656E64696E67209A
S3150002D8206461746520696E206D64202D420073F4
S3150002D8307065636966792 06E756D626572206F66C2
S3150002D84020706572696F64732070657220646179F5
S3150002D85020666F7220696E74657276616C206461EF
S3150002D8607461 20616E6420656E61626C652072650A
S3150002D870636F7264696E67206F6620706F6C797071
S3150002D88068617365 20696E74657276616C20646185
S3150002D89074610073656C6563742074 6F752028313A
S3150002D8A029206F72206E6F20746F752028302920 10
S3150002D8B0666F7220746869732 07175616E7469741B

S3150002D8C079007265636F72642064656D616E6420AF
S3150002D8D0283129206F72206E6F2064656D616E6437
S3150002D8E0202830292066 6F7220746869732071754A
S3150002D8F0616E7469747900726563 6F726420616324
S3150002D90063756D756D6C61746F7273202831292091
S3150002D9106F72206E6F2061636375 6D756C61746FD3
S3150002D920727320283029206 66F72207468697 3200A
S3150002D93071756 16E746974790073657420 6E756DA4
S3150002D94062657220 6F662070686173657320706508
S3150002D95072206D657465722066 6F7220696E7465D9
S3150002D960727661 6C206C6F677320616E64206465E9
S3150002D9706D616E6473006C6F6720283129206F72A7
S3150002D98020646F6E2774206C6F672028302920 73FD
S3150002D990696E676C65207068617365 20696E74656F
S3150002D9A07276616C2064617461 20666F72207468 9D
S3150002D9B069732070617261 6D65746572 0072656368
S3150002D9C06F7264202831292 06F7220646F6E27746B
S3150002D9D020726563 6F72642028302920 73696E672E
S3150002D9E06C6520706861736520 64656D616E647331
S3150002D9F020666F722074686973 2070617261 6D654A
S3150002DA0074657200726563 6F72642028312920 6F13
S3150002DA107220646F6E277420726563 6F72642028A9
S3150002DA2030292073696E676C652070686173 6520A2
S3150002DA3061636375 6D756C61746F727320666F7264
S3150002DA40207468697320706172616D6574657200 15
S3150002DA5073746F726520636F6E666967757261743F
S3150002DA60696F6E20746F20666C617368 00737065EF
S3150002DA7063696679206465 6D616E642077696E6498
S3150002DA806F7720696E206D696E757465730073 70A9
S3150002DA9065636966792 06E756D626572206F6620B0
S3150002DAA0696E74657276616C206C6F672070657240
S3150002DAB0696F647320746F206F7665726C61702073
S3150002DAC0666F722064656D616E642077696E646F3D
S3150002DAD077007365742063 6F6E666967206261639F
S3150002DAE06B20746F206C61737420666C617368209E
S3150002DAF076616C75650063 6C6561722065646974 34
S3150002DB002072616D206F6620636F6E66696720 62A0
S3150002DB1061636B20746F2064656661756C74207630
S3150002DB20616C75650064697 3706C61792074696DE6
S3150002DB306520696E20457863656C20666F726D613B
S3150002DB4074202D204A756C69616E446174652E4697
S3150002DB5072616374696F6E2066726F6D20312F3148
S3150002DB602F3930007265 66696C6C2074686520 2DE9
S3150002DB704C207461626C65006D647400746F752F5D
S3150002DB8064656D616E6420616E64206D6474206CE0
S3150002DB906F672064617461000D0A4D7573742066A7
S3150002DBA0697273742073657420736572 69616C207F
S3150002DBB06E756D626572000D0A6C6F636174696FD2
S3150002DBC06E206F6620636F6E666967207461626C91
S3150002DBD065202D20646 1696C7920 666C617368200A
S3150002DBE0666F722064617920 6964656 578202320ED
S3150002DBF0256C64207769746820646174652 06F6699
S3150002DC0020000D0A4E6F20636F6E666967207461 8D
S3150002DC10626C6520666F72207468697320646 1792C
S3150002DC20202D207573696E672025730044 65666131
S3150002DC30756C7400456469742052616D00466C61AE
S3150002DC407368000D0A6C6F636174696F6E206F668C
S3150002DC5020636F6E666967207461626C65202D2091
S3150002DC602573004465 6661756C7400456469 7420A9
S3150002DC7052616D00466C617368000D0A4E6F206436
S3150002DC806174612061766169 6C61626C65000D0A7E
S3150002DC905365 7269616C2023203D202530386C78EB
S3150002DCA0000D0A4E756D626572206F66 2070686 19E
S3150002DCB0736573203D202564000D0A4E756D6265FD
S3150002DCC072206F6620746F 7520 706572696F647357
S3150002DCD0203D202564000D0A44656D616E6420773F
S3150002DCE0696E646F77203D202564000D0A4F7665C4
S3150002DCF0726C6170203D202564000D0A0D0A2573A1
S3150002DD004C6F672F44617920 4F5520444D44206F
S3150002DD1041 43432050504D204C6F6 73120446 D647F
S3150002DD20312041636331204 250000D0A25734C6F46
S3150002DD306753697A652041 43 4353697A 6520444DA6
S3150002DD404453697A6520546F7453697A65000D0AE3
S3150002DD5025732537 64202020 2563202020 25632073
S3150002DD6020202563202533 64202020202025632020BF
S3150002DD7020202563202020202025632025 3264000DE3
S3150002DD800A25732537 6C642025376C642025376C89
S3150002DD90642025376C64000D0A25732533316C64C3
S3150002DDA020446174612053 7562746F74616C000D56
S3150002DDB00A25732533316C642045 76656E74204FCF
S3150002DDC07665726865616 4000D0A25732533316CC8
S3150002DDD064204461746120 4F7665726865616400EF
S3150002DDE00D0A25732533316C6420546F74616C00FF
S3150002DDF00D0A25732533316C642055736162 6C6597
S3150002DE0020666C617368000D0A25732533316C64D4
S3150002DE10204D6178696D756D2064617973207374 24
S3150002DE206F72616765000D0A4D75737420626520 15
S3150002DE306120666163746F72206F662031343430FC
S3150002DE40000D0A4C6F67206D757374206265 20732E
S3150002DE5065742074 6F2062652061206661637 46F49
S3150002DE6072206F662064656D616E642077696E64E8
S3150002DE706F77000D0A4C6F67206D757374206265AB
S3150002DE80207365742074 6F2062652061206661 6369
S3150002DE90746F72206F662064656D616E64207769A7
S3150002DEA06E646F7720616E642073696E676C65209D
S3150002DEB0706861736520 6C6F67206D757374206 27C
S3150002DEC06520656E61626C6564000D0A496E766155
S3150002DED06C696420636F6E6669672074 61626C6543
S3150002DEE0000D0A496E76616C696420636F6E66691D
S3150002DEF0672074 61626C65000D0A436F6E6669671E
S3150002DF0020746162 6C6520777269747465 6E000DA7
S3150002DF100A4D617820696E2061726368697665 00D0
S3150002DF200D0A25730044617920547970657320 20A7
S3150002DF3053756E64617920202020204D6F6E6461797D
S3150002DF402020202020547565736461792020 20576 54E
S3150002DF50646E657364617920546875727364617 95D
S3150002DF6020202046726964617920202020205361 7475ED
S3150002DF707264617900 0D0A002000252D392E39734D
S3150002DF800000D0A596F75206D757374 20636F6C648A
S3150002DF9020737461727420746865 20756E697420CA
S3150002DFA06265666F7265206C6F6164696E67207464
S3150002DFB0686520386B2066696C652E0D0A000D0AAD
S3150002DFC04C6F616420 70726F6772616D20776974 3D
S3150002DFD0686F757420636F6C64737461727469 6EB2
S3150002DFE0672028592F4E293F000D0A4F706572612E
S3150002DFF0746 96F6E2061626F727465 64000D0A54F3
S3150002E0004F552070726F66696C6520666F72206468
S3150002E0106179207479706520257320000D0A00202D
S3150002E020252D392E3973000D0A25326420252D3807
S3150002E0302E38732000202530327 8000D0A00200089
S3150002E04020000D0A257300252D382E387300556ED3
S3150002E05069747300 0D0A257300202D2D3A2D2D208B
S3150002E0602D2D2F2D2D2F2D2D2D2D0020787878 78E2
S3150002E0702E787878002000202D2D3A2D2D202D2D5A
S3150002E0802F2D2D2F2D2D2D2D002078787878 2E7876
S3150002E09078 78000D0A257300202D2D2F2D2D2F2D7A
S3150002E0A02D2D2D00207878787878782E787878005B
S3150002E0B02000202D2D2F2D2D2F2D2D2D2D002078BA
S3150002E0C07878787878 2E787878000D0A257300208B
S3150002E0D025366C7825632563 25632025326420 0066
S3150002E0E000D0A257300252D382E387300556E697476
S3150002E0F073000D0A257300252D382E3873005254ED
S3150002E100430020002025366C782025326420002525
S3150002E11031306C75002020207878787878 78 78000D
S3150002E1200 0D0A25732531302E3130732531302E31CB
S3150002E13030732531302E3130732531302E31307324
S3150002E14025382E38732054494D45204F46205045D8
S3150002E150414B004461696C7900496E7465727661 5F
S3150002E1606C73005261 6D41636375 6D00546F746127
S3150002E1706C0044656D616E64000D0A2573002534DA
S3150002E180302E34307300200020000D0A2573202320
S3150002E1904461797320202020202020537461727420F8
S3150002E1A00020202020202020456E642000204 36F7E
S3150002E1B06E73756D7074696F6E2020204465 6D6193
S3150002E1C06E642054494D45204F46205045414B0030
S3150002E1D00D0A257300202535642000200020000202A
S3150002E1E020002536312E3631730020002000200013
S3150002E1F020002078787878 2E78787820303 03A3077
S3150002E2003020303 12F30312F3139393000 0D0A2587
S3150002E21073202020202020 434F4E5320434F4E533D
S3150002E22044415445 54494D45 20202020202050454 123
S3150002E2304B2050454 14B44415445 54494D45000DF0
S3150002E2400A257320202020202020434F4E53202020D1
S3150002E250434F4E534441544520 2020202020504541EF
S3150002E2604B2054494D45206F66205045414B000DC9
S3150002E2700A257300202531322E364C6600200025F1
S3150002E28031302E31307300200020002025313 22E0D
S3150002E290364C66002000 6E756D626572206F6620D0
S3150002E2A06C6F676963616C206D657465720074 7268
S3150002E2B0616E7366657220646174612062792058AA
S3150002E2C06D6F64656D2066726F6D206D657465 7223
S3150002E2D00052656365697665206461746120696EC2

S3150002E2E0746F206D6574657220627920586D6F6453
S3150002E2F0656D006E756D626572206F6620736C6F58
S3150002E3007473202D20757365642077697468202DD7
S3150002E3102400676C6F62616C20746F20616C6C20E4
S3150002E3206D6574657273007472616E73706F6E647C
S3150002E330657220736C6F74206E756D626572007300
S3150002E34070656369667920544F5520706572696FEE
S3150002E3506420666F72206C6F67206C697374730039
S3150002E36073706563696679207768696368206C6F84
S3150002E37067207175616E74697479003D3120736925
S3150002E3806E676C652070686173652C203D32207063
S3150002E3906F6C79706861736500737065636966791D
S3150002E3A0207068617365206E756D62657220696E94
S3150002E3B020706F6C797068617365206D6574657223
S3150002E3C0004C6F6720737461727420646174650017
S3150002E3D04C6F6720656E642064617465004C6F67DC
S3150002E3E020696E6465780046756C6C206C6F6700F8
S3150002E3F04461696C792052656164696E6773006C69
S3150002E4006F672073746172742074696D6520666F1C
S3150002E4107220646973706C6179006C6F6720656E37
S3150002E420642074696D6520666F7220646973706C0E
S3150002E430617900646973706C617920726177206317
S3150002E4406F6E73756D7074696F6E2064617461208E
S3150002E4506F6E206D6477202D6C5B5D20636F6D6D32
S3150002E460616E6400646973706C617920636F6E73A8
S3150002E470756D7074696F6E20646174612070657267
S3150002E480206461792066726F6D20696E746572769A
S3150002E490616C206C6F677300646973706C617920BC
S3150002E4A074696D6520696E20457863656C20666FB8
S3150002E4B0726D6174202D204A756C69616E446174B7
S3150002E4C0652E4672616374696F6E2066726F6D2087
S3150002E4D0312F312F3930006D64770064656D616EBE
S3150002E4E064206C6F672064617461000D0A53657461
S3150002E4F02073657269616C206E756D626572000DBE
S3150002E5000A2573000D0A257300202D2D2F2D2D2F80
S3150002E5102D2D2D2D00207878787878782E787878B9
S3150002E52000200020002078787878782E7878781D
S3150002E53000202D2D2F2D2D2F2D2D2D2D00207878DD
S3150002E540787878782E787878000D0A257359595993
S3150002E55059446174652E54696D65202020496E7494
S3150002E560657276616C2044617461000D0A25730040
S3150002E5702000787878782E787878000D0A2573202E
S3150002E5802D446174652E54696D652D2D2020202041
S3150002E590416363756D000D0A2573595959594461D2
S3150002E5A074652E54696D6520202020416363756D64
S3150002E5B0000D0A257300202531322E364C662000C6
S3150002E5C020007370656369667920706172616D659A
S3150002E5D0746572206E756D62657200646973706C23
S3150002E5E06179206D756C7469706C6965727300640B
S3150002E5F06973706C61792064656661756C74206DEF
S3150002E600756C7469706C6965727320776974686F6A
S3150002E610757420636C656172696E670064697370F4
S3150002E6206C6179206D756C7469706C6965727320A2
S3150002E6306C617374207772697474656E207769747D
S3150002E64068202D570073746F7265206D756C74693E
S3150002E650706C6965727320746F20666C61736800F2
S3150002E660436C656172206D756C7469706C69657254
S3150002E6707320776974686F75742073746F72696E2C
S3150002E6806720696E20666C617368006D756C7469CB
S3150002E690706C69657220666F7220616D7073006DB1
S3150002E6A0756C7469706C69657220666F7220766F1C
S3150002E6B06C7473006D756C7469706C696572206632
S3150002E6C06F72207265616C2074696D65207061726B
S3150002E6D0616D20737065632764206279202D500076
S3150002E6E0756E69747320666F72207265616C207430
S3150002E6F0696D6520706172616D2073706563276450
S3150002E700206279202D50006E756D626572206F66EB
S3150002E71020646563696D616C20706F696E74732025
S3150002E720666F722064656D616E64206669656C64ED
S3150002E730006D756C7469706C69657220666F722003
S3150002E74064656D616E6420706172616D20737065BF
S3150002E750632764206279202D5000756E69747320D8
S3150002E760666F722064656D616E6420706172616DA0
S3150002E77020737065632764206279202D50006E75C0
S3150002E7806D626572206F6620646563696D616C20D7
S3150002E790706F696E747320666F7220636F6E737525
S3150002E7A06D7074696F6E206669656C64006D756C58
S3150002E7B07469706C69657220666F7220636F6E731E
S3150002E7C0756D7074696F6E20706172616D20737001
S3150002E7D065632764206279202D5000756E69747313
S3150002E7E020666F7220636F6E73756D7074696F6EDB
S3150002E7F020706172616D207370656327642062798F
S3150002E800202D500073796E6320646174612069 6EF5
S3150002E8102072616D206261636B20746F20666C6189
S3150002E820736820646174612C2065726173652065 6A
S3150002E830646974730064756D70206F72206D6F6405
S3150002E840696679207265616C2074696D6520756EE2
S3150002E85069747320286F746865727769736520 61BD
S3150002E86063636D756C61746F7220756E6974730E
S3150002E87029006D6D756C740073657420 6F72207655
S3150002E880696577206D756C7469706C6965727300 61
S3150002E8900D0A4E6F20777269746573206F66206D5C
S3150002E8A0756C7469706C6965727320696E20617229
S3150002E8B063686976650 00D0A6C6F636174696F6ED1
S3150002E8C0206F66206D756C7469706C69657220745 0
S3150002E8D061626C65202D20257300446566617 56C46
S3150002E8E07400456469742052616D00466C617368F8
S3150002E8F0000D0A205020202020722D4D756C7420A8
S3150002E900722D556E697473000D0A253264202539FD
S3150002E9102E336520252D382E3873000D0A205020FF
S3150002E920645F445020202020642D4D756C74206451
S3150002E9302D556E6974732020632D445020202020AB
S3150002E940632D4D756C7420632D556E697473000DBD
S3150002E9500A253264202534642025392E3365202584
S3150002E9602D382E3873202534642025392E33652020
S3150002E970252D382E3873000D0A4D617820696E20D8
S3150002E98061726368697665006C696E65206C696D93
S3150002E990697400 0D0A4C696E65206C696D69742094
S3150002E9A03D202564006D6F7265007365742074687E
S3150002E9B065206C696D6974206F66206C696E65737B
S3150002E9C020646973706C6179656420706572207069
S3150002E9D06167652C20303D6E6F206C696D6974002D
S3150002E9E06E756D626572206F66206C6F6769636112
S3150002E9F06C206D657465720074726 16E7366657201
S3150002EA002064617461206279205 86D6F64656D209F
S3150002EA1066726F6D206D65746572005265636569 15
S3150002EA2076652064617461 20696E746F206D657409
S3150002EA306572206279 20586D6F64656D006E756D22
S3150002EA4062657220 6F6620736C6F7473202D207559
S3150002EA507365642077697468202D2400676C6F6281
S3150002EA60616C20746F20616C6C206D6574657273C5
S3150002EA700074726 16E73706F6E64657220736C6F70
S3150002EA8074206E756D626572007370656369667 96E
S3150002EA902054 4F5520706572696F6420666F72202C
S3150002EAA06C6F67206C6973747300737065636966 53
S3150002EAB0792077686963682 06C6F67207175616E6B
S3150002EAC074697479003D312073696E676C652070D4
S3150002EAD06861736 52C203D3220706F6C79706861B5
S3150002EAE0736500737065636966792070686173 6522
S3150002EAF0206E756D62657220696E20706F6C79701A
S3150002EB006861736520 6D65746572004C6F6720736A
S3150002EB1074617274206461746 5004C6F6720656E5F
S3150002EB20642064617465004C6F6720696E64657861
S3150002EB300064756D70207465737420646174610 07D
S3150002EB40566F6C7461676520506861736500437522
S3150002EB507272656E742050686173650043757272D5
S3150002EB60656E742072616E676500566F6C7461679C
S3150002EB7065 2072616E6765202D2075736564206954
S3150002EB806E206D74202D465B5D00686F6C6420619B
S3150002EB902070686173652066 6F722034206D696E1D
S3150002EBA0757465732C206F7220772F202D41206596
S3150002EBB0786572636973652074726163 6B20616E36
S3150002EBC06420686F6C640072756E207465737400DD
S3150002EBD0736574206176657261676 96E6720666F18
S3150002EBE020667265717565 6E6379206D65617375F0
S3150002EBF072656D656E7420303D36342C313D31368A
S3150002EC002C323D342C333D302C20757365202D7605
S3150002EC105B5D20616E64202D565B5D20746F2073F0
S3150002EC2065742067616 96E2072616E676520616E28
S3150002EC306420706861736500726570656174656 4ED
S3150002EC406C792064756D702072656164696E677394
S3150002EC502065766572792073656 36F6E64006761FD
S3150002EC6074652074686520 6D65746572206F6E2008
S3150002EC70666F7220737065636966696564206E7576
S3150002EC806D626572206F662073756273656 36F6E5F
S3150002EC9064730067656E6572617465206120726 1D6
S3150002ECA06D702077617665206F6E205048206F75F3
S3150002ECB0742C207265636F7264206120686973 74B4
S3150002ECC06F6772616D20772F2D412C202D6477207E
S3150002ECD0746F2064756D7020686973746F677261F2
S3150002ECE06D004144432073656C65637420302C319A
S3150002ECF02C322C352C362C37202D3E20492C564EC4

S3150002ED002C56442C475041492C56424154542C50BF
S3150002ED104C432046696C74657220746F204D4F20F7
S3150002ED2070696E00504C432066696C74657220737C
S3150002ED30656C65637420666F722075736520772F24
S3150002ED40202D4120636F6D6D616E6420302D343D40
S3150002ED5066696C7465722C353D44534D206F766539
S3150002ED607272616E67650041555820736C656302
S3150002ED707420302C312C322C33202D3E20767265B5
S3150002ED80662C2047504169312C2047504169322C6C
S3150002ED902047504169332069662041444320736508
S3150002EDA06C6563743D3D35007374617274420636FE4
S3150002EDB0646520666F72202D6477206475 6D70001D
S3150002EDC0656E6420636F646520666F72202D6477BA
S3150002EDD02064756D700073657420444143206375 29
S3150002EDE07272656E74206F66667365742063 6F72E5
S3150002EDF072656374696F6E206F6E20382062697463
S3150002EE0020636F6E766572746572006E756D6265EB
S3150002EE1072206F66206176657261676573 20666F20
S3150002EE2072202D412061732065786 06F6E656E7455
S3150002EE30206F6620320053412063 6F636B207330
S3150002EE40656C65637420666F72202D4120 77697444
S3150002EE5068202D6E0044656C61792062657477 6561
S3150002EE60656E2074776F20636F6E76657273696F55
S3150002EE706E7320666F72202D41202D4E20616E64C6
S3150002EE80202D48004C45442073656C656374203020
S3150002EE902C312C322C332C34202D3E204F46462C3E
S3150002EEA0204F4E2C205854414C2C206B48722C205B
S3150002EEB06B6561617268202D20757365207769746 8B8
S3150002EEC0202D70206F72202D4D20746F2073656C7B
S3150002EED06563742070686173652 06F72206D657456
S3150002EEE06572206E756D6265722C20646973706C32
S3150002EEF0617920776974682 02D6400617578206DC8
S3150002EF006F6465202875736520772F202D4129208F
S3150002EF107B302E2E32202D3E666F6C6C6F776572BB
S3150002EF207C706F73207065616B7C6E65672070659F
S3150002EF30616B7D0052756E2073656C662074657315
S3150002EF4074202D2D207573652077697468202D64D1
S3150002EF5020746F2064756D702073656C662074650D
S3150002EF6073742074726573756C7473006D74007465C6
S3150002EF707374206D65746572000D0A20202053613A
S3150002EF806D706C6573202B5065616B202D5065 6129
S3150002EF906B202050746F502020204176672D444309
S3150002EFA0202020202020202020524D5320204372650D
S3150002EFB0737446616374002020202020417667 2D44D5
S3150002EFC043322020202020202020524D5332000D0AA9
S3150002EFD02531306C752025356C752025356C7520EC
S3150002EFE025356C752025382E3166202531302E3395
S3150002EFF066202531302E3566002025382E316620D2
S3150002F0002531302E3366000D0A49204F6666202DC3
S3150002F01020576169742031737420636861 72000D30
S3150002F0200A49204F6E202D2020636861 7220686F86
S3150002F030 6C646F6666000D0A49204F6E202D2020F3
S3150002F0405761697420326E6420636861 72000D0A2A
S3150002F05049204F6666202D205761697420 6E6577B8
S3150002F06020636D64000D0A2563202532642025 6421
S3150002F07020256420253130 2E3366202534642000 72
S3150002F080253464202534642025362E316620253425
S3150002F09075202534752025347520 25372E346620B3
S3150002F0A025362E31662025347520253475202534E3
S3150002F0B0752025372E34660D0A002020 2531342E3769
S3150002F0C04C66202531342E374C6600202531342EED
S3150002F0D0374C662000202531302E3366200020254D
S3150002F0E0732000560041005700564152000D0A2077
S3150002F0F02531322E3366202531322E3366560020D4
S3150002F1002531322E3366202531322E3366560020C3
S3150002F1102531322E3366202531322E336656000DC6
S3150002F1200A252D33357325323073000D0A70686156
S3150002F1307365206865 6C6420746F202532752028FB
S3150002F14069292025327520287629202538 2E34660D
S3150002F1502028487A2920666F72202564206E696E00
S3150002F16075746573000D0A63757272656E74206D2F
S3150002F1706561737572656D656E7473207265706C08
S3150002F180616365642062792061 7578206D656173BB
S3150002F190757265 6D656E7473000D0A6375727265BC
S3150002F1A06E74206D656173757265 6D656E7473201C
S3150002F1B07265706C6163656420627920 7672656639
S3150002F1C0206174204144 43000D0A617578206F6600
S3150002F1D066736574206D656173757265 6D656E74AF
S3150002F1E0732064697361626C65642C2061 75782092
S3150002F1F072656164696E673A000D0A616463207321
S3150002F200656C656374203D202564000D0A6175787E
S3150002F2102073656C656374203D202564000D0A61C8
S3150002F22075782069 6761696E203D202564000D0AC4
S3150002F2306175782069706861 7365203D20256400D8
S3150002F2400D0A617578207 64761696E203D20256436
S3150002F250000D0A61757820767068617365203D201D
S3150002F2602564000D0A617578206F66667365742 0E1
S3150002F2703D202564000D0A67617465203D20253610
S3150002F28064000D0A686F6C646F6666203D20253641
S3150002F29064000D0A74657374206D6F646520646979
S3150002F2A07361626C6564000D0A4672657175656EFE
S3150002F2B06379202D2025362E336620487A206F6EFC
S3150002F2C0207068617365 2025642C20676169 6E2051
S3150002F2D025642C2061766572616769 6E6720256CEC
S3150002F2E06420637963 6C6573000D0A4C454420748F
S3150002F2F0656D706F726172696C79206F66662E0039
S3150002F3000D0A4C45442074656D706F726172696CAA
S3150002F31079206F7574707574696E6720636C6F639C
S3150002F3206B20637279737461 6C2E000D0A4C45442E
S3150002F33020746 56D706F726172696C792074656DB7
S3150002F340706F726172696C79206F6E2E000D0A4CB5
S3150002F35045442070756C73696E672025732073 753A
S3150002F3606D6D696E672070686173652025642010
S3150002F370746F202564000D0A252D31352E31357323
S3150002F380257320202020202020202069202020 20D4
S3150002F3902020202020207620202020202020 20766C6D
S3150002F3A02020202020202020207664202020202020BB
S3150002F3B020766 46C202020202020202041444320 20F7
S3150002F3C02020202 0746F74616C004D656173757265DF
S3150002F3D06D656E74000D0A252D31352E3135732576
S3150002F3E07325396420253964202539642025396 43A
S3150002F3F0202539642025396420253964005361 6D3E
S3150002F400706C652074696D6573000D0A252D3135A2
S3150002F4102E31357325732539 2E3166202539 2E3145
S3150002F42066202539 2E31662025392E3166202539 6A
S3150002F4302E31662025392E3166005374617469 6354
S3150002F440206F6666736574000D0A252D31352E31DF
S3150002F450357325732539 2E31662025392E316620DE
S3150002F46025392E31662025392E31662025392E3151
S3150002F47066004479 6E616D6963206F66667365 74B2
S3150002F4800000D0A252D31352E3135732573253964 44
S3150002F4900044414320636F7272656374696F6E0044
S3150002F4A00D0A252D31352E313573257325392E3624
S3150002F4B0662025392E36662025392E36662025 39D0
S3150002F4C02E36662025392E36660043616C20436F40
S3150002F4D06E7374616E7473000D0A252D31322E31EE
S3150002F4E032732564202025732539642025396400 6A
S3150002F4F04761696E000D0A252D31352E313573258A
S3150002F50073253964202539642020202020202020DC
S3150002F51020202020253964 00506F73207065616B00CE
S3150002F5200D0A252D31352E3135732573253964 2083
S3150002F530253964202020202020202020202025 3943
S3150002F54064004E6567207065616B000D0A252D31DA
S3150002F550352E3135732573253964202539642020EB
S3150002F56020202020202020202020253964 00506B20D6
S3150002F570746F20506B000D0A252D31352E313573EF
S3150002F58025732539 2E32662025392E3266202020 13
S3150002F590202020202020202025392E32660052 4DA0
S3150002F5A053000D0A252D31352E313573257325 3934
S3150002F5B02E34662025392E34662020202020202055
S3150002F5C02020202025392E326600437265 7374206E
S3150002F5D04661637 46F72000D0A4F6E6C792062 6920
S3150002F5E06C6C696E6720706172616D6574657273A9
S3150002F5F02063616E206265207 26F75746564207483
S3150002F6006F204C454420004E5065616B00252D311C
S3150002F610362E3136730025 2D31362E3136730025BE
S3150002F6202D31362E313673002 52D31362E31367375
S3150002F63000252D382E38732000416C6C 48727300F9
S3150002F64025382E387300204D232532640025732079
S3150002F65000416C6C2D48727300506420 00204D23CB
S3150002F66025326400 20252D382E38730050415 3531D
S3150002F6704544002000202A2A2A2063616C63756CA7
S3150002F6806174696E67202A2A2A004E4F5445 5354E4
S3150002F69000202A2A2A2020686967682 0202A2A2A26
S3150002F6A0002A2A2A20206C6F7720202A2A2A004341
S3150002F6B06F756E74732070657220766F6C74004F6E
S3150002F6C06666736574730042617474657279207636
S3150002F6D06F6C7461676500 54656D70657261 7475EF
S3150002F6E072652044696F6465004750412 04F666623
S3150002F6F0736574004C6F7720547269702050 697D
S3150002F7006E7420666F72204D65746572206167 6340
S3150002F7100048696768205472697020506F696E7478

S3150002F72020666F72204D65746572206167630055AD
S3150002F7306E726567756C6174656420566F6C746170
S3150002F740676500566F6C746167652072616E6765E6
S3150002F750206F7665726C61700043757272656E74A5
S3150002F7602072616E6765206F7665726C6170004EFD
S3150002F7706E6F006576656E006F6464000D0A43491C
S3150002F780503A000D0A43495023002D2D2D2D2D2DC3
S3150002F7903E00537472696E6700446563696D616CFD
S3150002F7A0005369676E65640048657800466C6F6150
S3150002F7B07400446174650048483A4D4D3A5353000B
S3150002F7C048483A4D4D00436F6D6D616E6400556E4B
S3150002F7D06B6E6F776E204F7074696F6E0053796E21
S3150002F7E074617800446563696D616C0048657800F0
S3150002F7F0537472696E670052616E676500436865 8D
S3150002F800636B73756D006C657474657220202D00D0
S3150002F810706F736974696F6E20000D0A43686172B6
S3150002F8206163746572206F76657272756E000D0A79
S3150002F8304672616D696E67206572726F72000D0A9B
S3150002F840506172697479206572726F72000D0A4393
S3150002F850686172616374657220 6572726F72000DFF
S3150002F8600A4C696E6520746F6F206C6F6E6700209C
S3150002F8700D0A000D0A2D2D2D2D2D2D2D2D2D2D2D63
S3150002F8802D2D2D2D2D2D2D2D2D2D2D2D2D2D2D2DA0
S3150002F8902D2D2D2D2D2D2D2D2D2D2D2D2D2D2D2D90
S3150002F8A02D2D2D2D2D2D2D2D2D2D2D2D2D2D2D2D80
S3150002F8B02D2D2D2D2D2D2D2D2D2D2D2D0D0A000D00
S3150002F8C00A002534642000252D31352E3135733A50
S3150002F8D020252D34307300200D0A00200D000D0A5C
S3150002F8E02573204572726F7200206F6E206F7074DE
S3150002F8F0696F6E2025732563 0D0A000D0A000D0A35
S3150002F90025730D0A00000D0A002534642000252DFA
S3150002F91032302E3230733A20252D343073000D0AE0
S3150002F920005065726D0020547970652020202020D9
S3150002F9304F7074205061726D202020202044657320
S3150002F9406372697074696F6E000D0A002534640073
S3150002F950202573256320202025 2D3873000D0A25C6
S3150002F96032322E32327300200020202020002025 41
S3150002F9702D34302E343073006E65772070617373C8
S3150002F98077640070617373776420636F70792066A1
S3150002F9906F7220636F6E6669726D6174696F6E0055
S3150002F9A070617373776F7264206C6576656C007331
S3150002F9B06574207365726E6F202D206D75737420C9
S3150002F9C0626520677265617465722074686168E2073
S3150002F9D06F7220657175616C20746F20303430301F
S3150002F9E03030303000706173737764006475 6D7007
S3150002F9F020706173737764000D0A5365742074690D
S3150002FA006D65206669727374000D0A4D617820690E
S3150002FA106E2061726368697665000D0A536574200B
S3150002FA2074696D65206669727374000D0A4D61789A
S3150002FA3020696E2061726368697665000D0A5061FD
S3150002FA407373776F72647320646F206E6F74206DA8
S3150002FA506174636800 0D0A456E7465722070617385
S3150002FA6073776F7264207477696365000D0A257572
S3150002FA702025313073007265616465723100 7465E8
S3150002FA806368320053757065723300557449 6C4968
S3150002FA907459340 06C4576456C62416C007135755B
S3150002FAA032613064380070640070 6F7765725F642B
S3150002FAB06F776E73000D0A25732025376C6420005C
S3150002FAC05068617365204469616 76E6F7374696318
S3150002FAD000566F6C74730044656C74610056415233
S3150002FAE02050686173650 04C696E65204672657 1C7
S3150002FAF075656E6379004D756C7400252D31362E51
S3150002FB00313673 00252D31362E31367300252D38C8
S3150002FB102E387300252D382E38732000252D3130CE
S3150002FB202E3130732536 2E316600 25382E31662564
S3150002FB30382E3166002573002531332E3366204870
S3150002FB407A00252D382E3873006B5748253264 20EB
S3150002FB50006B52482532642000506825326420 52D8
S3150002FB602532640050682025642020202020 0025AC
S3150002FB70362E3166256320 25352E33662050460003
S3150002FB8050682532642020200025342E3166252532
S3150002FB90442020202020004E256325352E33660082
S3150002FBA0256325352E3266 00256325352E316600FE
S3150002FBB0256325352E3366 00256325352E326600EC
S3150002FBC0256325352E3166 00256325352E336600DD
S3150002FBD0256325352E3266 00256325352E316600CE
S3150002FBE0256325352E3366 00256325352E326600BC
S3150002FBF0256325352E3166 00256325352E336600AD
S3150002FC00256325352E3266 00256325352E3166009D
S3150002FC10256325352E3366 00256325352E3266008B
S3150002FC20256325352E3166 00256325352E3366007C
S3150002FC30256325352E3266 00256325352E3166006D
S3150002FC40256325352E3366 00256325352E3266005B
S3150002FC50256325352E3166 00256325352E3366004C
S3150002FC60256325352E3266 00256325352E3166003D
S3150002FC702563002573 00252D382E387300257300 61
S3150002FC80252D382E3873002D7878782E7870002539
S3150002FC9073002D7878782E7870002573004E64757F
S3150002FCA06D702070756C736520636F756E74657206
S3150002FCB073005365742050494320536572696 16C21
S3150002FCC0206E756D6265720053657420 70756C7373
S3150002FCD0654F757420303D7374642C20313D20705D
S3150002FCE0756C736520736572696 16C2C20323D6D8B
S3150002FCF0632073657269616C0044756D70205049AA
S3150002FD004320537461746500436865636B206D61BB
S3150002FD1078696D756D2076616C7565206F6E205001
S3150002FD2049432073756 22D616363756D756C617409
S3150002FD306F727300436F6E74726F6C2052656C61E2
S3150002FD40792041202D2D2031207475726E73206F1B
S3150002FD506E2072656C61797300436F6E74726F6C9C
S3150002FD602052656C61792042202D2D203120747538
S3150002FD70726E73206F6E2072656C61797300 5265C4
S3150002FD8071756573742050494320656368 6F005727
S3150002FD90616B652075702050494300 50757420 5080
S3150002FDA0494320696E20736C656570206D6F6465CA
S3150002FDB00052657365742050494320636F6D6D75FB
S3150002FDC06E69636174696F6E004572617365205076
S3150002FDD049432052656769737465727300 44756D91
S3150002FDE070206469616 76E6F737469632064617 4FD
S3150002FDF06100526563616C63756C61746520637 53D
S3150002FE0072626F780070740070756C736520746529
S3150002FE107374000D0A50756C736520253464 2020B6
S3150002FE20202020202530386C782530386C78000D5B
S3150002FE300A2020205365726961 6C204E756D6265D9
S3150002FE40722020203D2020253264000D0A20202029
S3150002FE505049432063 6F756E74696E67000D0A2000
S3150002FE60202052656C61792041203D0020535441 87
S3150002FE7054555320554E4B4E4F574E00204F4E0071
S3150002FE80204F4646000D0A20202052656C617920DB
S3150002FE9042203D0020535441545553 20554E4B4E5B
S3150002FEA04F574E00204F4E00204F4646000D0A2067
S3150002FEB02020504943 20736C656570696E67000D9A
S3150002FEC00A2020205374616E64617264205075 6C3E
S3150002FED0736520436F756E74000D0A2020204D69EC
S3150002FEE06E6920436C6F73657420492F4F20657 8C5
S3150002FEF070616E73696F6E000D0A20204E6F74205A
S3150002FF00696E2050756C736520436F756E74696EE9
S3150002FF1067204D6F646500504943206368697020 0D
S3150002FF2069732061 6C726561647920617761 6B65C2
S3150002FF302E000D0A202020202020202020466C6141
S3150002FF407368202020202020202020202020202020 0E
S3150002FF5052616D2020202020202020202020202020D9
S3150002FF6020202050494320000D0A50756C736520ED
S3150002FF702532642025 30386C782530386C7820207C
S3150002FF8020002530386C782530386C782020200007
S3150002FF902530386C78000D0A205049432065636885
S3150002FFA06F206F6B20000D0A205049432062616466
S3150002FFB0206D6573616765000D0A204D6178696D74
S3150002FFC0756D207375622D616363756D756C6174F1
S3150002FFD06F72203D202025346420000D0A205049EE
S3150002FFE04320616363756D756C61746F7273206310
S3150002FFF06C6561726564000D0A2052656C61792038
S315000300007472696767657220636F6E6669726D6580
S3150003001064000D0A202A2A2A2052454C41592045BC
S31500030020 52524F52202D2D205354415455532055 8F
S315000300304E4B4E4F574E202A2A2A004E707500709B
S315000300406F7765722075707300 0D0A2573202537 47
S315000300506C642000736574206E756D626572206F23
S3150003006066206578746572 6E616C206D657465 7261
S315000300707320696E207363616E20696E2072616DF1
S3150003008020 6F6E6C792028736361 6E202D57313291
S31500030090333420746F20777269746520746F206619
S315000300A06C6173682900646973706C617920706F81
S315000300B0696E74657220696E666F0064756D702073
S315000300C0386B20696E666F00736D00736574206DFF
S315000300D065746572732C207068617365732070652F
S315000300E072206D65746572000D0A44656661756CF0
S315000300F07420386B000D0A386B41646472204669BC
S315000301006C654C656E2053756D4F66386B202038D1
S315000301106B43686B53756D20436F6E666967494 41D
S3150003012020546F754E616D65202052656C65617351
S31500030130652D54696D652F44617465000D0A25307C

S315000301403366C78202530376C64202530386C78205F
S315000301502530386C78202530386C7820252D382EBC
S315000301603873000D0A636F6E66696720746F757462
S315000301706162206461797461622073746172743898
S3150003018020636865636B70747220207374417263B5
S315000301902O6E787441726320656E64417263000D4C
S315000301A00A25366C782025366C782025366C78201F
S315000301B025366C782025386C782025366C782025F2
S315000301C0366C782025366C78000D0A504820696E07
S315000301D0744D747273207363616E4D7472732077FA
S315000301E0696E646F77206F7665726C6170206E75C9
S315000301F06D544F5573202020544F55737461727498
S31500030200202020202020544F55656E64204F6C646572
S315000302107374446174652O4E6577657374446174C1
S3150003022065204E756D44617973000D0A253264208D
S3150003023025376C642025386C6420253764202537E0
S31500030240642025376C6420002000200020002D2D1B
S315000302502F2D2D2F2D2D2D2D20002025376C64003D
S315000302602D2D2F2D2D2F2D2D2D2D20202020202020FF
S315000302702030004E6261756472617465202D2030F2
S3150003028020286175746F2920393630302C31393284
S31500030290302C3338343030007061726974792011
S315000302A0303D6E6F6E652C20313D6576656E2C2074
S315000302B0323D6F6464006E756D626572206F6620F1
S315000302C062697473202837206F7220382029002D25
S315000302D06530206E6F206563686F2C202D65312095
S315000302E06563686F002D6D30206E6F206D6F6465DA
S315000302F06D2C202D6D31206D6F64656D00777269ED
S3150003030074652063606D6D756E69636174696F6E75
S3150003031020706172616D657465727320746F2061FC
S315000303207263686976650074657374206D6F6465BE
S315000303306D202D20756E74696C205E632074797050
S3150003034065640073747479007465726D696E616CAB
S3150003035020706172616D6574657273000D0A696E52
S3150003036076616C69642062617564207261746500EC
S315000303700D0A000D0A000D0A4D617820696E206191
S31500030380726368697665000D0A257320256C6420FF
S315000303906261756420256420626974732025732065
S315000303A0706172697479202573206563686F2025EF
S315000303B073206D6F64656D00686F6C640068756E9D
S315000303C07400006E6F00006E6F000D0A6174653075
S315000303D00D0A000D0A61747130653073303D310DBD
S315000303E00A007375007374617274757073000D0A75
S315000303F025732025376C6420004E74616D70657219
S315000304000074616D706572206576656E7473000D98
S315000304100A25732025376C64200074630074696DA4
S3150003042065206368616E676564206576656E7473BF
S315000304300000D0A25732025376C64200020257320C0
S3150003044025376C6420007665720064756D702061D3
S315000304507369632076657273696F6E20616E6420BB
S31500030460736F6674776172652076657273696F6EF2
S3150003047020616E6420636865636B73756D000D0A96
S315000304806173696320202020736F667477617265D8
S3150003049020206636865636B73756D20636865636B9C
S315000304A073756D202063616C6373756D2072656C63
S315000304B065617365000D0A252D372E3773202530A8
S315000304C0386C7820202530386C78202530386C78C5
S315000304D0202530386C782000252D31362E313673A1
S315000304E000252D31362E31367300252D31362E312A
S315000304F036730025386C7800252D31362E31367348
S31500030500000436865636B73756D002530386C78003E
S31500030510252D31362E31367300252D31362E3136C3
S31500030520730025386C7800252D31362E313673004D
S31500030530252D372E3773002534732025356C64201B
S315000305406261756400486F6C640048756E740025BB
S315000305503164206220257320706172697479004EBC
S315000305602020202020202020202020202020202082
S315000305702020202020202020202020202020202072
S315000305802020202020202020202020202020002082
S3150003059020207365726E6F20004D74722000204D0B
S315000305A0232000504820007023200051542000517E
S315000305B0232000542320006C232000252D382E38B9
S315000305C07300544F5500252D382E387300556E6928
S315000305D074730025386C78200020203120002020F9
S315000305E05320002532645320002533642000204124
S315000305F02000253264200025326420002532642041
S31500030600002532642000252D382E3873002000255E
S315000306102D382E38730018181818181818180808C3
S3150003062008080808080800181818181818181808C9
S315000306300808080808080800252D31362E313673B8
S31500030640000252D31362E313673004D6F6E746820BA
S31500030650746F20446174650025342E347325372E58
S3150003066032660050726F6A65637465642042696C12
S315000306706C0025342E347325372E3266004C617395
S3150003068074204D6F6E74682042696C6C0025342E9D
S31500030690347325372E3266005374617274204461B5
S315000306A0746500456E64204461746520007374614B
S315000306B07274206B776800656E64206B77680042FE
S315000306C0696C6C205261746500252D342E347325B4
S315000306D031322E3566004C61737420557064617433
S315000306E0650025342E347325372E32660041636345
S315000306F06F756E742042616C616E63650025342EDE
S31500030700347325372E3266004375746F666620444C
S315000307106174650052637600586D69743000586DD4
S3150003072069743100676F6F64207265706C79006756
S315000307306F7420737461747573006E6F20726570C5
S315000307406C79007061726974790061646472007215
S315000307506567007265677380068616D6D696E67006D
S31500030760676C6F62616C00627265616B00726563D0
S31500030770656976656420676F6F64206D6573736161
S31500030780676500676F7420737461747573006368BB
S31500030790616E6E656C2074696D656F75740070614A
S315000307A072697479006164647200726567007265C8
S315000307B067380068616D6D696E6700676C6F6261AB
S315000307C06C00627265616B00436D64005365726E03
S315000307D06F00506F6C6C0052656738005265670096
S315000307E043656E7465722063656E74657220667206
S315000307F0657120696E20487A00706C63206D6F64A2
S31500030800656D204E434F206C6F77206672657120AD
S315000308102D20646576696174696F6E2066726F6DEB
S315000308202063747224672657100706C63206D6F6429
S31500030830656D204E434F206869676820667265714F
S31500030840202D20646576696174696F6E2066726F08
S315000308506D2063747246726571004C6F63616C2020
S315000308606F7363696C6C61746F7220646976696413
S315000308706520636F646500656E74657220636861E5
S315000308806E6E656C20726567697374657273206634
S315000308906F7220586D6974206D6F64650052534DF5
S315000308A020736F6674776172652074797065007260
S315000308B0736D2068617264776172652074797065FF
S315000308C000786D69742072656C61792033206269E2
S315000308D074206D61736B0052656365697665206D7F
S315000308E075782D2073656C65637420636F6D6D7504
S315000308F06E69636174696F6E2070686173650078F1
S315000309006D69742064656C617900616371756972E0
S3150003091065206368616E006578656320706C6300AB
S315000309206A616D2028786D6974202D6A7B302C31BD
S315000309302C322C337D202D3E20302C312C726567D2
S31500030940382C726567382F7365726E6F297C28722F
S315000309506376202D696A7B322C337D202D3E2072EF
S315000309606567382C726567382F7365726E6F290059
S315000309707475726E206F6E20726563656976657233
S315000309802C2075736520772F202D727B636F64652A
S315000309907D20746F20616363756D20737461746960
S315000309A073746963730064756D702073746174691D
S315000309B073746963732066726F6D2078202D697274
S315000309C07B636F64657D0064756D70207061726D05
S315000309D073006368616E2041006368616E204200A4
S315000309E044756D70204261756420504C4C204461FF
S315000309F074610044756D7020494620616E64204C15
S31500030A004F206368616E6E656C2064617461004F8C
S31500030A1076657220616761696E202D20646F6E278B
S31500030A207420636C6561722045F46206275666685
S31500030A307300536C617665204D6F64650072656360
S31500030A40656976652064656C61590068556E742026
S31500030A50666F7220636F7272656374207265636575
S31500030A606976652064656C6179004368616E6E65BD
S31500030A706C206E756D6265720062617564207261C9
S31500030A8074652073656C656374204C696E65467284
S31500030A9065712A28325E284E2D322929202875733E
S31500030AA065202D5820666F7220786D69742C206E30
S31500030AB06F6E6520666F722072637629006C6F67AE
S31500030AC032286269742074696D652F64656D6F647D
S31500030AD02066696C7465722074696D6529202875B2
S31500030AE07365202D5820666F7220786D69742C20EB
S31500030AF06E6F6E6520666F722072637629004C698D
S31500030B006D69742028526376204E3D302E2E322096
S31500030B10666F72207C6E6F2064656D6F64206669F4
S31500030B206C7465727C66696C7465727C636C6970DF
S31500030B307065642066696C74657229282D584C317A
S31500030B4020746F20636C697020786D6974206F75EB
S31500030B50747075742C202D584C3020666F7220618A

S31500030B606E616C6F6720786D697429004D6F6475CB
S31500030B706C6174696F6E20284E3D30206F72203190
S31500030B8020666F722046534B2F50534B292875739B
S31500030B9065202D5820666F7220786D69742C206E3F
S31500030BA06F6E6520666F7220726376290064756DB9
S31500030BB0702066696C7465722073657420706F6942
S31500030BC06E7473202D206F7220772F202D6920637A
S31500030BD06170747572652064696666492028 6F7250
S31500030BE02072656D6F6420772F202D38206F707407
S31500030BF029206461746100626974 6D617020666F97
S31500030C0072206520636F6D6D616E64007465737425
S31500030C102066696C74657220706861736520646508
S31500030C206C617900616C69676E2066696C746572C4
S31500030C300064756D7020726563656976652073 74EB
S31500030C406174650073706563696679207374616 79F
S31500030C5065206E756D6265722028312D34206669B4
S31500030C606C7465722C20353D425044534D2C20360E
S31500030C703D4941524D2C20373D5141524D2C203890
S31500030C803D4E434F290075736520772F2D4E7B7399
S31500030C907461 67657D20666F72206167632028 3003
S31500030CA02C312C322C333D6E6F6E652C736F66744C
S31500030CB02C686172642C626F7468290075736520F1
S31500030CC0772F2D4E7B73746167657D20666F722067
S31500030CD066696C74657220617474656E2C42504447
S31500030CE0534D2067616 96E2C6941524D61676320DC
S31500030CF06F72207141524D616763005465737420AE
S31500030D00504C4300547765656B2046696C74657275
S31500030D10202D2D2066696E652061646A75737420C3
S31500030D20616E6420636865636B2069662072656122
S31500030D306C69676E6D656E74206E6563657373614A
S31500030D4072790044756D702072637664206461 74F1
S31500030D5061206F6E20616C6C20656967687420730F
S31500030D60756262697473206F72207375736520772FBD
S31500030D70202D69663820746F206361707420726554
S31500030D806D6F642064617461005475726E206F66C2
S31500030D906620747261696E736D697420616E6420726D
S31500030DA065636569766500780070 6C320636D64BE
S31500030DB073000D0A6631206632206641474320449C
S31500030DC0534D2069414743206E4A434F207369675F
S31500030DD0406634204620472074726965732067 6F26
S31500030DE06F643020676F6F643120676F6F643220E2
S31500030DF0676F6F643320676F6F643420676F6F6448
S31500030E003520676F6F643620676F6F64370D0A008E
S31500030E100D25326420253264202534732025336 45E
S31500030E2025632534642563253464202536752532E8
S31500030E306420253164253660640025366C64000D08
S31500030E400A6D6173746572206D6F6465000D0A73B4
S31500030E506C617665206D6F646520253264000D0A2A
S31500030E605472616E736D697474696E67206 36F6D16
S31500030E706D616E64000D0A5472616E736D697474EC
S31500030E80696E672072656 7382F7365726E2F2064AB
S31500030E90617461000D0A5472616E736D69747469CD
S31500030EA06E6720726 56738206461 7461000D0A54A9
S31500030EB072616E736D697474696E6720746F6E65A3
S31500030EC020646174612031000D0A5472616E736D82
S31500030ED0697474696E6720746F6E6520646174 61EA
S31500030EE02030000D0A416C69676E696E672066697A
S31500030EF06C74657273000D0A547765656B696E676A
S31500030F002066696C74657273000D0A5265636569C0
S31500030F1076696E6720737461747469737469637300A9
S31500030F200D0A57616974696E6720666F722065647E
S31500030F3067652066726F6D206D61737465720 00D4F
S31500030F400A57616974696E6720666F72206566 46704
S31500030F5065206672 6F6D20736C617665000D0A52AB
S31500030F6065636569766 96E672070616 36B65747323
S31500030F702066726F6D206D6173746572000D0A527F
S31500030F8065636569766 96E672070616 36B65747303
S31500030F902066726F6D20736C617665000D0A504C86
S31500030FA0432069646C6500202D206F6E20636861A1
S31500030FB06E6E656C2025640020464149 4C206F6E99
S31500030FC02066696C74657220616C69676E6D656E07
S31500030FD07400204641494C206F6E2062617564207F
S31500030FE0636C6F636B20616C69676E6D656E74000D
S31500030FF00D0A4C696E6520467265717565 6E637977
S3150003100020 3D2025372E3366487A000D0A52435673
S31500031010204261756420526174 65203D2025372E78
S3150003102033 66487A000D0A584D4954204261756467
S3150003103020526174 65203D2025372E3366487A0099
S3150003104000D0A4261756420504C4C20506861 7365EB
S3150003105020 2566000D0A4261756420504C4C2046DB
S315000310604357202531306C64000D0A4261756420B4
S315000310 70504C4C20496E746567726174 6F722025FB
S31500031080313 52E334C66000D0A5374616765202093
S315000310902020205369676E616C2020202020736574BD
S315000310A074696E6720414743726567204E20536F0C
S315000310B066742048617264205361747572617465 45
S315000310C064000D0A504C4352312025313 02E3165D0
S315000310D0000D0A46696C742531642025313 02E31A2
S315000310E0652025382E3166644220253664202531 55
S315000310F064202534730020 20204E000D0A425044FC
S31500031100534D20253130642025313064202536 6443
S3150003111020352020202020256320202020 2020 25394B
S31500031120730059455300 4E4F000D0A49526D6F64C3
S315000311302025313064202539 2E3166252520253694
S315000311406420362020202020256320202020256320AC
S3150003115025397300594553004E4F000D0A51526D00
S31500031160 6F64202531306420 25392E3166252520EC
S3150003117025366420372020202025632020202025A3
S31500031180632025397300594553004E4F000D0A4E0F
S31500031190434F2020202025323164202536642038 0031
S315000311A00D0A4E61744672092531392E32662025A1
S315000311B034642F382039000D0A64696666492025 90
S315000311C031306420253339730059 4553004E4F009F
S315000311D00D0A6469666665120253130642025333 94A
S315000311E07300594553004E4F000D0A6879705149F3
S315000311F0202531302E306620253130642025366493
S3150003120000 0D0A4E434F2F4920253130 2E326620DA
S31500031210253130 2E3266000D0A52616E676520 2530
S315000312203164202043 6F6172736546202533642041
S3150003123020 46696E6546202533642025336420 25C0
S3150003124033642025336400 0D0A53696E6365206C8D
S3150003125061737420616C69676E6D656E74202D20F1
S31500031260746 56D706572617475726520646966660E
S31500031270656 72656E6365203D2025352E3266 2064D2
S3150003128065677265657300202D20656C61707365F3
S3150003129064207469 6D6520000D0A46696C74657275
S315000312A020436F61727365205120 3D2025356400 0C
S315000312B0202020 2D20636F6D6D6F6E206672657175CC
S315000312C0656E6379203D2025356400 0D0A537461EC
S315000312D06765204672657152616E676520466 96E61
S315000312E065 46726571204174745265 6720556E694F
S315000312F0747920644241747465 6E2064424761695F
S315000313006E000D0A2535642025396420253864 20AE
S31500031310253664202535642020 25362E3166202582
S31500031320362E3166000D0A416C69676E6D656E7403
S3150003133020537461 7475733A20 200020416C6967E9
S3150003134 06E696E672046696C74657273002054 7704
S315000313506565 6B696E672046696C7465727300 50C8
S31500031360415353002053746167657320 556E6D6155
S31500031370746368 61626C6500 2054696D6520457805
S31500031380706972656400204F7574206F6620526120
S31500031390 6E6765730020466F7263656420457869 DE
S315000313A07400204 16C69676E2045786974 20436F29
S315000313B064653A20202564000D0A202020202020 81
S315000313C030202020202020203120202020202032 20E1
S315000313D020202020202033202020202020342020 20DD
S315000313E02020202035202020202020203620202020 20C9
S315000313F020 37000D0A0020253664000D0A4F6E20A3
S31500031400636861 6E6E656C206E756D626572203DF4
S31500031410202564000D0A0D0A43205852204D4F44 DF
S315000314202049414743205141474320 6C6F2D64694E
S31500031430762 04C494D2046494C5420 20312D4E43AD
S31500031440 4F48492020302D4E434F4C4F202020201B
S31500031450202020 20204C4F20202020202020444556A9
S315000314602020204345 4E544552206374 72467265CC
S3150003147071206261 75642F487A000D0A2531782040
S31500031480256320202533732025347320253473 00E8
S3150003149050534B0046534B004E6F6E6500536F66B9
S315000314A074004E6F6E6500486172640048 2B5300EA
S315000314B04861726400 4E6F6E6500536F6674004E2A
S315000314C06F6E6500486172640048 2B530048617271
S315000314D064002025366400202533640020 20312F44
S315000314E0253164002025382E3166002025382E311B
S315000314F06600202531302E3166002025382E3166D0
S315000315000020 25382E3166002025372E316600202F
S31500031510253 72E32660020616374756 16C2076610F
S315000315206C756573000D0A204320736572 6E6F2E0A
S315000315302E2E20706F6C6C20726567382E2E2E2E21
S315000315402020522062697 46D61702E2E0020205473
S315000315502049205320 48206E000D0A000D0A0D0A6B
S315000315602044206564 6765636F 6465 20636D642D3D
S31500031570706F6C6C207061725020726567312E2E0D

S315000315802E2E207061723120726567322E2E2E1A
S31500031590207061723220726567332E2E2E2070D4
S315000315A06172332045727220207263766646D6170B6
S315000315B020002020542049205320482060E00205329
S315000315C07461747573000D0A002532782025303 84E
S315000315D06C78202530386C78202530347820253 0F7
S315000315E0386C78202530347820253038 6C782025DF
S315000315F03034782025303 86C78202530347820250F
S3150003160030337820253038 6C782000252D38302E5D
S315000316103830732000200020257300202573 0052E4
S3150003162065706C79696E670020536 56E64696E67D1
S3150003163000202532782025317820253178 20253160
S315000316407820253178000D0A2532782025303 86C2C
S3150003165078202534752025303 86C7820253278207B
S315000316602530386C78007761746368007761746 33A
S31500031670 68207363616E004E303132333435 36374A
S31500031680383941424344454600303132333435 36E6
S3150003169037383961626364656600000263920 0024B
S315000316A063C00002646E000265AA000265BC000204
S315000316B066220002686C00026A3800026AA600020B
S315000316C06BE000027C9000027F960002840200 0217
S315000316D0865C0002889E000289500002 8BD60002B7
S315000316E090660002907800029 22E00029244000255
S315000316F09296000293360002934800029 35A000220
S31500031700936C000293960002A54A0002A588000284
S31500031710 8CEC00028CEC00028CEC00028CEC0002D8
S315000317208CEC00028CEC00028CEC00028CEC0002C8
S315000317308CEC00028CEC00028CEC00028CEC0002B8
S315000317408CEC00028CEC00028CEC00028CEC0002A8
S315000317508CFC00028CFC00028CFC00028CFC000258
S315000317608CFC00028CFC00028CFC00028CFC000248
S315000317708CFC00028CFC00028CFC00028CFC000238
S315000317808CFC00028CFC00028CFC00028CFC000228
S3130003179063D6000290A2000293A80002988C72
S309000317A0000317C85A
S309000317A8000317E03A
S315000317C000031F9E013C708EFFFFFFFF0000000019
S315000317D000000000000000000000000000000000
S315000317E00000000000000044656661756C742000000B
S315000317F000010F01000113679400414C4C2D487200
S31500031800730000000000002000000000000000003C
S3150003181000000000000000000000000000000000BF
S3150003182000000000000000000000000000000000AF
S31500031830000000000000000000000000000000009F
S31500031840000000000000000000000000000000008F
S31500031850000000000000000000000000000000007F
S31500031860000000000000000000000000000000006F
S31500031870000000000000000000000000000000005F
S31500031880000000000000000000000000000000004F
S31500031890000000000000000000000000000000003F
S315000318A0000000000000000000000000000000002F
S315000318B0000000000000000000000000000000001F
S315000318C0000000000000000000000000000000000F
S315000318D00000414C4C4441595300000000000000F5
S315000318E000000000000000000000000000000000EF
S315000318F000000000000000000000000000000000DF
S3150003190000000000000000000000000000000000CE
S3150003191000000000000000000000000000000000BE
S3150003192000000000000000000000000000000000AE
S31500031930000000000000000000000000000000009E
S31500031940000000000000000000000000000000008E
S31500031950000000000000000000000000000000007E
S31500031960000000000000000000000000000000006E
S31500031970000000000000000000000000000000005E
S31500031980000000000000000000000000000000004E
S31500031990000000000000000000000000000000003E
S315000319A0000000000000000000000000000000002E
S31500C319B0000000000000000000000000000000001E
S315000319C0000000000000000000000000000000000E
S315000319D000000000000000000000000000000000FE
S315000319E000000000000000000000000000000000EE
S315000319F000000000000000000000000000000000DE
S31500031A0000000000000000000000000000000000CD
S31500031A1000000000000000000000000000000000BD
S31500031A2000000000000000000000000000000000AD
S31500031A30000000000000000000000000000000009D
S31500031A40000000000000000000000000000000008D
S31500031A50000000000000000000000000000000007D
S31500031A60000000000000000000000000000000006D
S31500031A70000000000000000000000000000000005D
S31500031A80000000000000000000000000000000004D
S31500031A90000000000000000000000000000000003D
S31500031AA0000000000000000000000000000000002D
S31500031AB000000000000000000000000000001001C
S31500031AC018010F010C170014000300140003 00147F
S31500031AD00003001400030017000300140003 00149E
S31500031AE00003001400030014000300170003001191
S31500031AF00003001100010000000100000001 0000C6
S31500031B00469AA3A149EA600049EA600049EA6000EF
S31500031B10496A600049EA600049EA600049EA6000F0
S31500031B2049EA6000496A60004A6A60004B03D600CE
S31500031B304A8E62004A8E620049EA600049EA600002
S31500031B4049EA600049EA6000496A600049EA6000C0
S31500031B5049EA600049EA600049EA6000496A6000B0
S31500031B604A6A60004B03D6004A8E62004A8E6200C0
S31500031B704AD2F000882888288850885088 50A05078
S31500031B80A00AA014A028900AA00A903C0800080006
S31500031B90080008000800080008000800A028982884
S31500031BA098289828A028A828B028B828E029A828B3
S31500031BB0A03CA064E029E029E003E051E051E051B4
S31500031BC0E051E051E851F051E050E015E029E029F9
S31500031BD0A029A015A00AA00AA00AA00AA00AA00488
S31500031BE0A028A004A3E8000000000000000000000F5
S31500031BF000000000002020808080808080802020 29A
S31500031C0020202010101010104040404042424208 4D
S31500031C10420808084242424240404040424242044 28D
S31500031C20404040420101010101040404050000000 93
S31500031C300000000049EA600049EA600049EA6000E2
S31500031C4049EA6000496A600049EA600049EA6000BF
S31500031C5049EA600049EA6000496A60004A6A60002E
S31500031C604B03D6004A8E62004A8E62004AD2F000C7
S31500031C703F80000041000000000000000000000005B
S31500031C8000000000000003F800000570000000000035
S31500031C900000000000000000000000003F8000007C
S31500031CA05641524C67000000000000000000000008F
S31500031CB000003F800005656 4C000000000000000064
S31500031CC0000000000000000003F8000005600000 0F6
S31500031CD0000000000000000000000000000003F803C
S31500031CE000006465 6C560000000000000000000000 60
S31500031CF000000003F8000005641000000000000085
S31500031D000000000000000000000003A83126F6B57CA
S31500031D1000000000000000025382E33660000000096
S31500031D203A83126F6B574800000000000000253130DC
S31500031D302E334C6600003A83126F446B5641524C65
S31500031D4067000025382E3366000000003A83126FC1
S31500031D50446B564152484C67002531302E334C664E
S31500031D600003A83126F446B5641524C64000025BF
S31500031D70382E3366000000003A83126F446B5641D7
S31500031D8052484C64002531302E334C6600003A83AA
S31500031D90126F442D6B5641000000025382E336622
S31500031DA0000000003A83126F442D6B564148000031
S31500031DB0002531302E334C6600003A83126F442DD2
S31500031DC06B413200000000025382E33660000000008
S31500031DD03A83126F442D6B41324800000002531309F
S31500031DE02E334C6600003A83126F522D6B57000058
S31500031DF000000025382E3366000000003A83126F78
S31500031E00522D6B5748000000002531302E334C66A7
S31500031E1000003A83126F526B5641524C67000025FD
S31500031E20382E3366000000003A83126F526B564118
S31500031E3052484C67002531302E334C6600003A83F6
S31500031E40126F526B5641524C64000025382E33668E
S31500031E500000000003A83126F526B564152484C649D
S31500031E60002531302E334C6600003A83126F522D13
S31500031E706B5641000000025382E336600000000 33
S31500031E803A83126F522D6B56414800000002531 30BC
S31500031E902E334C6600003A83126F522D6B4132008B
S31500031EA000000025382E3366000000003A83126FC7
S31500031EB0522D6B413248000000 02531302E334C66DB
S31500031EC000003A83126F6B563200000000000025B3
S31500031ED0382E3366000000003A83126F6B56324881
S31500031EE0000000000000 2531302E334C6600003A8393
S31500031EF0126F64656C6B563200000025382E33660C
S31500031F00000000003A83126F64656C6B563248001A
S31500031F10002531302E334C6600003F8000004350CD
S31500031F2048310000000000025382E3066000000000E
S31500031F303F800000436F756E747331000025 3130A6
S31500031F402E304C6600003F800000435048320000AC
S31500031F5000000025382E3066000000003F80000098
S31500031F60436F756E7473320000 2531302E304C6624
S31500031F7000003991A2B4487A000000000000002551
S31500031F80382E336600000000358637BD4D4379632E
S31500031F906C6573000025 31302E334C660000FFFF5D

S30700031FA0FFFF38
S31500031FA4000000010000001800031C7000026EE824
S31500031FB400026EE80003000400050006000700089B
S31500031FC40009000A000B000C000D000E000F0010A0
S31500031FD40011001200130014001500160017001850
S31500031FE40019001A001B001C0000010000007FF802
S31500031FF419010002F66C0002F6730002F67500027C
S315000320004F68A0002F6910002F6A1000016F45200C5
S3150003201400000002F7700002F7730002F77800026B
S315000320248E1C00028E200002FA760002FA7E00025B
S315000320034FA840002FA8B0002FA940002FA9D000065
S31500032044000100000001000000010000000100007F
S31500032054000100000001000000010000000100006F
S31500032064000100000001000000020000000100005E
S31500032074000100000001000000010000000100004F
S31500032084000100000001000000110000000100002F
S31500032094000100000001000000010000000100002F
S315000320A4000100000001000000020000000100001E
S313000320B4000100000001000000010000000111
S315000320C448E70D0833C000A004D4226F001442016C
S315000320D4287C008040081814183C008042476038E6
S315000320E4206900083A1020690004308C004030859A
S315000320F4206900040828000700016 7F4082800047F
S3150003210400016704720160 1A5269000E524754A90A
S31500032114000854915 4A900044A016606BE69000CDA
S315000321246 5BE2069000430BC005030BC00FF18842F
S3150003213410013 3C000A004D64CDF10B0205F588FC3
S315000321444ED04E714E714E7148E7010833C000A05C
S315000321540 4D0226F000C7214424732BC002032BCF6
S3150003216400D0287C008040142 07C00C0A468602A28
S315000321740814000767240814000667180 8D4000621
S3150003218453416606 08D00001601813FC00EA008078
S3150003219440156002524708D40007082900070001C6
S315000321A467CE08290005000167041 0BC000132BC90
S315000321B4005032BC00FF300733C000A004D24CDF0A
S313000321C41080205F588F4ED04E714E714E71B3
S70500000000FA

38230102.S

Transmeter Three Phase S-Record File

S0030000FC
S31500000000000E00820000214C20001B1500001B15AFC
S31500000010001B1640001B16E0001B1780001B18C3C
S315000000200001B1960001B1460001B1AA0001B1AAD2
S315000000300001B1AA0001B1AA0001B1AA0001B1AA4A
S315000000400001B1AA0001B1AA0001B1AA0001B1AA3A
S315000000500001B1AA0001B1AA0001B1AA0001B1AA2A
S315000000600001B1820001B1A00001B1A000008C5EC8
S3150000007000012A8A0001B1A00001E3500001B1A0ED
S315000000800001B18C0001B18C0001B18C0001B18C72
S315000000900001B18C0001B18C0001B18C0001B18C62
S315000000A00001B18C0001B18C0001B18C0001B18C52
S315000000B00001B18C0001B18C0001B18C0001B18C42
S315000000C00001B1B40001B1B40001B1B40001B1B492
S315000000D00001B1B40001B1B40001B1B40001B1B482
S315000000E00001B1AA0001B1AA0001B1AA0001B1AA9A
S315000000F00001B1AA0001B1AA0001B1AA0001B1AA8A
S315000001000001B1A00001B1A00001B1A00001B1A0A1
S315000001100001B1A00001B1A00001B1A00001B1A091
S315000001200001B1A00001B1A00001B1A00001B1A081
S315000001300001B1A00001B1A00001B1A00001B1A071
S315000001400001B1A00001B1A00001B1A00001B1A061
S315000001500001B1A00001B1A00001B1A00001B1A051
S315000001600001B1A00001B1A00001B1A00001B1A041
S315000001700001B1A00001B1A00001B1A00001B1A031
S315000001800001B1A00001B1A00001B1A00001B1A021
S315000001900001B1A00001B1A00001B1A00001B1A011
S315000001A00001B1A00001B1A00001B1A00001B1A001
S315000001B00001B1A00001B1A00001B1A00001B1A0F1
S315000001C00001B1A00001B1A00001B1A00001B1A0E1
S315000001D00001B1A00001B1A00001B1A00001B1A0D1
S315000001E00001B1A00001B1A00001B1A00001B1A0C1
S315000001F00001B1A00001B1A00001B1A00001B1A0B1
S315000002000001B1A00001B1A00001B1A00001B1A0A0
S315000002100001B1A00001B1A00001B1A00001B1A090
S315000002200001B1A00001B1A00001B1A00001B1A080
S315000002300001B1A00001B1A00001B1A00001B1A070
S315000002400001B1A00001B1A00001B1A00001B1A060
S315000002500001B1A00001B1A00001B1A00001B1A050
S315000002600001B1A00001B1A00001B1A00001B1A040
S315000002700001B1A00001B1A00001B1A00001B1A030
S315000002800001B1A00001B1A00001B1A00001B1A020
S315000002900001B1A00001B1A00001B1A00001B1A010
S315000002A00001B1A00001B1A00001B1A00001B1A000
S315000002B00001B1A00001B1A00001B1A00001B1A0F0
S315000002C00001B1A00001B1A00001B1A00001B1A0E0
S315000002D00001B1A00001B1A00001B1A00001B1A0D0
S315000002E00001B1A00001B1A00001B1A00001B1A0C0
S315000002F00001B1A00001B1A00001B1A00001B1A0B0
S315000003000001B1A00001B1A00001B1A00001B1A09F
S315000003100001B1A00001B1A00001B1A00001B1A08F
S315000003200001B1A00001B1A00001B1A00001B1A07F
S315000003300001B1A00001B1A00001B1A00001B1A06F
S315000003400001B1A00001B1A00001B1A00001B1A05F
S315000003500001B1A00001B1A00001B1A00001B1A04F
S315000003600001B1A00001B1A00001B1A00001B1A03F
S315000003700001B1A00001B1A00001B1A00001B1A02F
S315000003800001B1A00001B1A00001B1A00001B1A01F
S315000003900001B1A00001B1A00001B1A00001B1A00F
S315000003A00001B1A00001B1A00001B1A00001B1A0FF
S315000003B00001B1A00001B1A00001B1A00001B1A0EF
S315000003C00001B1A00001B1A00001B1A00001B1A0DF
S315000003D00001B1A00001B1A00001B1A00001B1A0CF
S315000003E00001B1A00001B1A00001B1A00001B1A0BF
S315000003F00001B1A00001B1A00001B1A00001B1A0AF
S3150000040000003139C000214C20C0214C200017F4EB6
S31500000410000020CE00015242000154CE0001D0421D
S315000004200001ED0A0001E9D000004A0C00004D5C15
S31500000430000004E5200000BC000001B060000423AAE
S31500000440000008ED40000E9280000F90600013A30C9
S31500000450000014FE2000153C600016AFE00018D084B
S315000004600001B8DA0001BE260001D6BC0001E98C05
S315000004700002107800021 3E00002144200214A4E5
S315000004800000B740000011B20000206200035C233
S315000004900017F8200018DB400018E2800018EE2EA
S315000004A00001D6F20001E97800008C4200009702B4
S315000004B0000127320001E9BC0001ED0A00017EDAE5
S315000004C000018CC800001FD00000973800119A257
S315000004D000014B5E0001586600018210000186840F
S315000004E00001E55000002136000E95000011C2CF7
S315000004F000013A4400014FE200017C1800017FFC34
S3150000050000001CCFA0001E91E00004E5200011B5406
S31500000510000014E1200017E3A00019C000001C84213
S3150000052000000BAF0000186B600002A2A00004ECA72
S31500000530000016AEA00001B780000975C0001516622
S31500000540000157020001D70600020F7A00016B5026
S31500000550001D71A3E1985F33E16096100003E16C2
S31500000560096100C03E16096100003E16096100009F
S315000005 70BE1609610000BDDE46C80000BDB3AF412E
S315000005800000BD700F0100003D35DCD300003D06C4
S3150000590B68900003CD9CCAC00003C917D750000CA
S315000005A0BC5C70840000BC2349DD0000BC03FFED89
S315000005B00000BBB05A0300003B85998700003B450D
S315000005C0ECED00003B1FFFE900003AD5C2710000C8
S315000005D0BAA1F0650000BA6FE8E10000BA41F06028
S315000005E0000BA018D1E00003EF94F943F794F94EA
S315000005F03E794F943EF94F943DF94F943E794F948E
S3150000060 03D794F943DF94F943E16096100003E1620
S31500000610096100003E16096100003E1609610000EE
S31500000620BE1609610000BDDE46C80000BDB3AF417D
S315000006300000BD700F0100003D35DCD300003D0613
S31500000640B68900003CD9CCAC00003C917D75000019
S31500000650BC5C70840000BC2349DD0000BC03FFEDD8
S315000006600000BBB05A0300003B85998700003B455C
S31500000670ECED00003B1FFFE900003AD5C271000017
S31500000680BAA1F0650000BA6FE8E10000BA41F06077
S3150000069 0000BA018D1E00003EF94F943F794F9439
S315000006A03E794F943EF94F943DF94F943E794F94DD
S315000006B03D794F943DF94F943E16096100003E1670
S315000006C0096100003E16096100003E16096100003E
S315000006D0BE1609610000BDDE46C80000BDB3AF41CD
S315000006E00003D700F0100003D35DCD300003D0663
S315000006F0B68900003CD9CCAC00003C917D75000069
S31500000700BC5C70840000BC2349DD0000BC03FFED27
S315000007100000BBB05A0300003B85998700003B45AB
S31500000720ECED00003B1FFFE900003AD5C271000066
S31500000730BAA1F0650000BA6FE8E10000BA41F060C6
S315000007400000BA018D1E00003EF94F943F794F9488
S31500000750 3E794F943EF94F943DF94F943E794F942C
S31500000760 3D794F943DF94F948000800080008000D1
S31500000770800080008000800080008000800073
S31500000780800080008000800080008000800063
S315000007908000800C80008000808080800 0800053
S315000007A080008000800080008000800 0BB8088
S315000007B00000000000000000000000000016001607
S315000007C000160016001900160016001600160 0196D
S315000007D0001400140000000000000001900160015A6
S315000007E000140014001400163DA00A00BDA00A00E3
S315000007F0BDA00A00BDA00A003DA00A003D8834162F
S31500000800 3D6FC2463D36E6DBBCC1FC9BBCEAB45438
S31500000810BC914EF5BC5DB2FA3BEB22AD3BC81D84E4
S31500000820 3BB021A53B865CF5BB0E81A0BAF2906376
S31500000830BAD57E1EBAA2DD493A2CBC273A13022C41
S31500000840 3A0163B539C56951000102010203010 28B
S31500000850030000 51042A0C00000000000000000004
S3150000086000000000000000000000000000000000082
S315000008700000042696C6C696E670000000000000000B1
S3150000088000000000000000000000000C0000000062
S31500000890000000000000000000FFFF0000FFFF000056
S315000008A0FFFF00000000000000000000000000000044
S315000008B00000000000000000000000000000000000032
S315000008C00000000000000000000000000000000000022
S315000008D00000000000000000000000000000000000012
S315000008E00000000000000000000000000000000000002
S315000008F000000000000000000000000000000000000F2
S3150000090000000000000000000000000000000000000E1
S3150000091000000000000000000000000000000000000D1
S3150000092000000000000000000000000000000000000C1
S3150000093000000000000000000000000000000000000B1
S3150000094000000000000000000000000000000000000A1

S31500000950000000000000000000000000000000000091
S31500000960000000000000000000000000000000000081
S3150000097040000000000000002FA2E3FF3F547AE190
S31500000980BF0000003F00000000000000004B9896806A
S3150000099042200000428C0000358F2A6336D0C87B87
S315000009A03D2AAAAB42652EE00002B3B90002B3C2EB
S315000009B00002B3CF0002B3DC0002B3ED0002B3FACB
S315000009C000000000000048E7013E33C000A0000020
S315000009D0598F4EB900016AFE2A7C00C02022247C71
S315000009E000C020262C7C00C0456E4A3900C01EE59A
S315000009F0670A34B900C01F30600001880C15000377
S31500000A00632E4A3900C01EF0672670003012 2E8011
S31500000A1048573F3C00013F3C002E4EB90000717420
S31500000A204A406700015E487900029A926000014CD4
S31500000A30287C00C01EE3267C00C01EE24A156728FB
S31500000A404A1466144A1366104A14661C4A1366183A
S31500000A504A3900C01EEE661042153F3C00144EB9DE
S31500000A60000072F06000011C4A3900C01EE46624D2
S31500000A704A14670A203900C01F26B09667164A1323
S31500000A80670001007000301222390 0C01F22B280B8
S31500000A90660000F07E04700010074A3308006756AF
S31500000AA04240100759404 8C0E588068000C045AC62
S31500000AB020402F1070001007E588068000C01F2216
S31500000AC020402F104EB9000237804A4066280C0796
S31500000AD000076518207900C0459008280002000329
S31500000AE0670A083900060080401767 0A103C00FDB7
S31500000AF0D0071A80600852070C07000963984A3924
S31500000B0000C01EEC67244879000 29AA32F3900C062
S31500000B101F4A4EB9000237804A40660E1ABC0006CC
S31500000B2013FC000100C0138E6006423900C0138E0C
S31500000B304A15634E42401015064000143F004EB958
S31500000B40000072F04A3900C01EED66362F1648794D
S31500000B5000027E54487900029AAC4EB900022292F5
S31500000B604FEF000C2F3900C000FA3F3C00434EB94E
S31500000B7000000F2C487900029AC24EB90002229258
S31500000B80588F4A3900C01EEF660C4A15631C4A3955
S31500000B9000C01EEE67143F122F16487900029AC550
S31500000BA04EB9000222924FEF000A4240588F33C0DE
S31500000BB000A000024CDF7C804E754E714E714E7166
S31500000BC02F0733C000A00004598F3F3C002E43EF8F
S31500000BD000024EB9000073184A97670E20572E2858
S31500000BE0001033C700C020266018203900C0456EAB
S31500000BF0223C000003E84EB900024FCC33C000C0CF
S31500000C002026588F33C000A000062E1F4E754E7149
S31500000C104E714E7148E7033E33C000A000084FEF07
S31500000C20FFF23E2F002E2C2F00302A6F00343007A3
S31500000C300C40004A67080C40006A67026012203CBC
S31500000C400001518022064EB900025A822F40000A46
S31500000C500C47004A670A0C47006A67042F46000AD9
S31500000C6048574EB9000010FC204F2F28000A4EB9F5
S31500000C700000156A1E80287C000222C830070C403E
S31500000C8000436720 0C400054671A0C40004D675A19
S31500000C900C40006367540C400074674E0C400053D0
S31500000CA067786074424 0102F00023F004240102FC8
S31500000CB000053F004240102F00083F00487900021F
S31500000CC09B092F0D4E944FEF000E0C2D00200003B4
S31500000CD0673E0C2D0020000666081B7C00300006CF
S31500000CE060381B7C0030000960304240102F000342
S31500000CF03F004240102F00063F00487900029B1833
S31500000D002F0D4E944FEF000C0C2D00200003660AA9
S31500000D101B7C003000036002421547EF000545EFDB
S31500000D2000062C7C00E0000830070C400043673EBC
S31500000D300C40006367380C40004A67400C40004492
S31500000D40673A0C40004D670000D80C40006D670004
S31500000D5000DECC40006A670000D60C40005A6700AF
S31500000D6001320C400053670001746000 01A4487909
S31500000D7000029B222F0D4EB90002374E2F0D4EB9A1
S31500000D800002458 42E0010164A00670E0C00000172
S31500000D9067260C000002673E6064204F3F2800086B
S31500000DA04240102F00073F004240102F000A3F002C
S31500000DB0487900029B24603A204F3F28000842 40E1
S31500000DC0102F00083F004240102F00093F004879CD
S31500000DD000029B30601C4240102F00053F0042403D
S31500000DE0102F00083F00204F3F28000C48790002D2
S31500000DF09B3C487570004E944FEF000E6002421601
S31500000E00300748C0D08D52802840600C0C1400205A
S31500000E10660418BC0030528C4A1466F0600000F27A
S31500000E20487900029B482F0D4EB90002374E101626
S31500000E304A0067100C000002670A0C000001672 8D0
S31500000E40600000CE4240102F00053F004240102FA8
S31500000E5000083F00487900029B4A2F0D4EB9000258
S31500000E6045844875080060224240102F00063F0066
S31500000E704240102F00073F00487900029B522F0D79
S31500000E804EB900024584487508004E944FEF000C99
S31500000E90607E4240102F0001534048C0E58806801E
S31500000EA000025BC820402F102F064EB90000156ABD
S31500000EB04A406708487900029B6460064879000248
S31500000EC09B68487900029B5A2F0D4EB90002458453
S31500000ED0487508004E944FEF001060344240102FC2
S31500000EE000033F004240102F00063F004240102FF3
S31500000EF000093F004240102F000C3F00204F3F28C2
S31500000F000010487900029B692F0D4E944FEF001296
S31500000F104FEF000E33C000A0000A4CDF7CC0205FFC
S31500000F204FEF000A4ED04E714E714E7133C000A085
S31500000F30000C4FEFFFD80CAFEE6B2800002E6308B5
S31500000F402F7CEE6B2800002E4857204F2F280032AA
S31500000F50204F3F2800346100FCBC48574EB90002C0
S31500000F602292588F4FEF002833C000A0000E205F5A
S31500000F705C8F4ED04E714E714E712F0D33C000A056
S31500000F800010518F2A6F0010202D000A723C4EB9B6
S31500000F9000024FCC1B4000022F01202D000A4EB943
S31500000FA0000253E02F0043EF00084EB900022ECC9A
S31500000FB01B6F0003000348780018204F2F280008F5
S31500000FC043EF00084EB900022ECC1B6F000300044D
S31500000FD0202F0004508F33C000A000122A5F205F2C
S31500000FE0588F4ED04E714E714E7148E7070433C08C
S31500000FF000A00014598F2A6F00183E2F001C3007DE
S3150000100000028000000FFFF80FC0007484052001B40A2
S3150000101000015247300702800000FFFF80FC00B746
S31500001020E248064007C63B4000086004526D0C08CF
S315000010303F2D0008700030072F4000024EB9000116
S3150000104 0AF2E2217B28062E4303CFFFFD06D00085D
S31500001050 3F004EB90001AF2E9E403F2D00084EB90D
S31500001060001AF623A003007EA481B400006600400
S31500001070522D00060C2D000D0006642A4A45660412
S3150000108 04246600E0C2D0002000654C04400488003
S315000010903C004240102D00063F004EB90001AF92C1
S315000010A0D046BE4062CA4A456604420660144240C3
S315000010B0102D000653400C4000025CC044004880DE
S315000010C03C004240102D000653403F0010071F40D1
S315000010D000054EB90001AF92D006912F00031B6F99
S315000010E000030005588F33C000A000164CDF20E037
S315000010F0205F5C8F4ED04E714E714E7148E70104F1
S3150000110033C000A000182A6F000C2F2D000A4EB91C
S3150000111000000156A1A80670806AD00000E10000A66
S315000011202F0D6100FE562E003F072F0D6100FEBCFD
S31500001130 4A15670804AD00000E10000A33C000A06F
S31500001140001A4CDF2080205F588F4ED04E714E71B2
S315000011504E7133C000A0001C518F3F3C000143EF8D
S3150000116000024EB90000735041D72F2800042F39D2
S3150000117000026660487900029B984EB900022292EE
S315000011804FEF000C3F3C000143EF00024EB9000058
S315000011900735041D72F103F3C00634EB900000F2C0F
S315000011A04240508F33C000A0001E4E754E714E71E6
S315000011B04E7133C000A0002033C000A000224E753F
S315000011C04E714E714E7133C000A00024202F0004D2
S315000011D0226F000C206F0008600210D951C8FFFC76
S315000011E0048C0001000064F233C000A00026205FE6
S315000011F04FEF000C4ED04E714E714E7133C000A0B1
S3150000120000028202F0004226F000C206F00086002C7
S3150000121010D951C8FFFC04800001000064F233C0FD
S3150000122000A0002A205F4FEF000C4ED04E714E7189
S315000012304E7133C000A0002C202F0004226F000C3A
S31500001240206F0008600230D951C8FFFC04800001FD
S31500001250000064F233C000A0002E205F4FEF000CA8
S315000012604ED04E714E714E7133C000A00030202F0B
S315000012700004226F000C206F0008600230D951C8AC
S31500001280FFFC04800001000064F233C000A00032BD
S31500001290205F4FEF000C4ED04E714E714E7133C031
S315000012A000A00034202F0004226F000C206F0008DD

S315000012B0600220D951C8FFFC04800001000064F2DE
S315000012C033C000A00036205F4FEF000C4ED04E71A9
S315000012D04E714E7133C000A00038202F0004226FDB
S315000012E0000C206F0008600220D951C8FFFC048062
S315000012F00001000064F233C000A0003A205F4FEF07
S3150000130000C4ED04E714E714E7133C000A0003CA1
S31500001310202F0004226F000C206F00081239008075
S315000013200008423900800008600220D951C8FFFC3D
S3150000133004800001000064F213C10080000833C07D
S315000013400A0003E205F4FEF000C4ED04E714E7154
S31500001350 4E7133C000A00040202F0004226F000C05
S31500001360206F0008600420D920D951C8FFFA0480F4
S315000013700001000064F033C000A00042205F4FEF80
S3150000138000C4ED04E714E714E7133C000A0004419
S31500001390202F0004226F000C206F00081239008 0F5
S315000013A00008423900800008600420D920D951C8BD
S315000013B0FFFA04800001000064F013C100800008F9
S315000013C033C000A00046205F4FEF000C4ED04E7198
S315000013D04E714E7133C000A00048202F0008206FC8
S315000013E00004600242185 1C8FFFC0480000100009E
S315000013F064F233C000A0004A205F508F4ED04E7179
S3150000140004E714E7133C000A0004C202F0008206F93
S3150000141000004600242185 1C8FFFC0480000100006D
S31500001420 64F233C000A0004E205F508F4ED04E7144
S3150000143004E714E7133C000A00050202F0008206F5F
S315000014400004600242585 1C8FFFC048000010000FD
S31500001450 64F233C000A00052205F508F4ED04E7110
S3150000146004E714E7133C000A00054202F0008206F2B
S315000014700004600242585 1C8FFFC048000010000CD
S31500001480 64F233C000A00056205F508F4ED04E71DC
S3150000149004E714E7133C000A00058202F0008206FF7
S315000014A000046002429851C8FFFC0480000100005D
S315000014B064F233C000A0005A205F508F4ED04E71A8
S315000014C04E714E7133C000A0005C202F0008206FC3
S315000014D00004600242985 1C8FFFC0480000100002D
S315000014E064F233C000A0005E205F508F4ED04E7174
S315000014F04E714E7133C000A00060202F0008206F8F
S3150000150000046004429842985 1C8FFFA0480000122
S315000015100000064F033C000A00062205F508F4ED000
S3150000152004E714E714E7133C000A00064202F00082A
S31500001530206F000412390080000842390080000 83C
S31500001540600442984298 51C8FFFA048000010000E6
S3150000155064F013C10080000833C000A00066205F5D
S315000015600508F4ED04E714E714E7133C000A0006840
S3150000157042412279 00C00584600C4A4157C04400AC
S31500001580488032005889201 1B0AF000465EC300164
S31500001590 33C000A0006A205F588F4ED04E714E7146
S315000015A04E712F0633C000A0006C7C400839000342
S315000015B000C0001266047200600422065381206F88
S315000015C00008208120 0633C000A0006E2C1F205F7B
S315000015D05C8F4ED04E714E714E712F0D33C000A0F0
S315000015E000702A6F00082F3900025BF64879000266
S315000015F09BB52F0D4EB9000222C82F3900025CA4FC
S315000016004879 00029BBE486D00204EB9000222C8F0
S315000016104FEF001833C000A000722A5F205F5C8F76
S3150000162004ED04E714E714E7133C000A00074226FC1
S3150000163000046022083900030 0C00012670C5391B1
S315000016404A916C12703F2280600C52910C910000FE
S31500001650000406D024291307C00B8D1F900C001060D
S315000016602011538 0D080D1C03010720BE268024046
S31500001670000 70C40000464BC20115380E5880680F6
S3150000168000002665C20404A9067AA33C000A000763C
S315000016902 05F588F4ED04E714E714E7148E701044F
S315000016A033C000A00078518F2A6F00142E2F001827
S315000016B04A876645487900029BC72F0D4EB900023D
S315000016C022C8487900029BCD486D00204EB9000221
S315000016D022C84FEF0010486D00052F3900C000FAF0
S315000016E03F3C00544EB900000C14486D00252F39BC
S315000016F000C000FA3F3C0044605A303CFFFFD04730
S31500001700 3F0043EF00024EB90000735041D72F2827
S315000017100000420075380E58806800002665C2040AE
S315000017202F10487900029BD32F0D4EB9000222C814
S31500001730 4FEF0010303CFFFFD0473F0043EF000261
S315000017404EB90000735 0486D002041EF00042F1081
S315000017503F3C00634EB900000C14508F33C000A00C
S31500001760007A4CDF2080205F4FEF000A4ED04E718A
S3150000177004E714E7148E7033E33C000A0007C4FEF28
S3150000178 0FF7847EF008445EF00802C7C0002229210
S3150000179004A3900C01EE2670000D642472A7C000391
S315000017A008B4600000BC4A3900C01EE5670E300769
S315000017B048C0223900C01F2EB280670A4A3900C0CD
S315000017C01EE5660000983F072F0B225520514E90CC
S315000017D02C0067000088487800 40486F00044EB926
S315000017E000013D43F07486F00022255206900040 9
S315000017F04E904293606024932F0A22552069000878
S31500001800 4E902012B093664C4857204F3F28008ACE
S3150000181 03F07487900029CDA4E9648780040486FA8
S31500001820 00504EB9000013D43F072F12486F0052E4
S3150000183022552069000C4E90486F004C48790002F2
S315000018409CEC4E96486F0074487900029CF84E96C0
S3150000185 04FEF001C52932013B0866D9A588D524755
S31500001860BBFC000309446500FF3E600002824A3962
S315000018700 00C01EE3675642472A7C000308B4604056
S3150000188 03F072F0B225520514E902C00672E48788B
S31500001890 0040486F00044EB9000013D43F07486F5C
S315000018A00 0022255206900044E9048573F063F0724
S315000018B0487900029D044E964FEF000C588D524712
S315000018C0BBFC00030944 65B8600002242A7C00C002
S315000018D0058C287C00C0455E4A3900C01EE7670CAF
S315000018E0288D23CD00C045626000016C4A3900C0D6
S315000018F01EE4670001964A3900C01EE5660000C076
S31500001900 2A54600000AC301548C0E588068000 0304
S3150000191008B42840B9FC000309446400 0092B9FCED
S315000019200 00308B4650000883F152F0B2254205190
S3150000193004E902E006778302D000248C02680B08772
S31500001940 6C6C3F15486F00022254206900044E90CB
S315000019502 4932F0A2254206900084E902012B09337
S31500001960664C4857204F3F28008A3F1548790002A9
S315000019709D164E9648780040486F00504EB90000BC
S3150000198013D43F152F12486F0052225420690 00CC1
S3150000199004E90486F004C487900029D284E96486F3D
S315000019A0007448790002 9D344E964FEF001C588D06
S315000019B0BBF900C045626500FF4E600001324A393E
S315000019C000C01EE6670001282014B08D6708288D28
S315000019D023CD00C045620CB900C005CC00C04562ED
S315000019E0640000A02A7900C045623B7900C01F341C
S315000019F000023AB900C01F30301548C0E58806809D
S31500001A000000308B42840B9FC00030944646CB9FC1F
S31500001A1000 00308B465643F152F0B225420514E90E5
S31500001A202E00674E302D000248C02680B0876C3AE3
S31500001A303F15486F00022254206900044E902493FB
S31500001A402F0A22542069000 84E902012B093661285
S31500001A5058B900C0456233FC012C00C0001060007C
S31500001A6 0008E487900029D40604A487900029D78C0
S31500001A706042487900029DB0603A487900029DCCE8
S31500001A806032487900029DF0602A4A3900C01EE89B
S31500001A90672C2F14203900C045629094E4803F00E3
S31500001AA03F3C002D4EB9000071744A40670C4879DE
S31500001AB0 00029E044E96588F6034614A60304A395F
S31500001AC000C01EE9672833FC000100C000C600658
S31500001AD04EB90001B0F22F39000262B24EB90000D1
S31500001AE0379A0C40FFFF67E8427900C0000C42407D
S31500001AF04FEF008833C000A0007E4CDF7CC04E75DF
S31500001B004E714E714E7133C000A00080598F3F3C1C
S31500001B10002D43EF00024EB9000073184A97673450
S31500001B207010D09723C000C0455E20573028 0002B1
S31500001B30024003FF72003200E589E489E589D2B9E3
S31500001B400 0C0455E23C100C0456233FC012C00C0C5
S31500001B500010601423FC0002675C00C0455E23FC95
S31500001B6 0002675C00C04562588F33C000A0008247
S31500001B704E754E714E714E7148E7003E33C000A05F
S31500001B80 00844FEFFFC02A7C00C00000287C00C004
S31500001B90 012267C00C00008247C000308B42C7CBC
S31500001BA000C0000E08140005660002E03014E84884
S31500001BB0024000070C40000562000400D040303BA4
S31500001BC0 00064EFB0002000C0060007600CC010609
S31500001BD0 01C8487800 40486F00044EB9000013D48D
S31500001BE0487900029E29487900029E20486F000825
S31500001BF04EB9000222C8487900029E414879000287
S31500001C009E38486F00344EB9000222C84FEF0018C4

S31500001C1048574EB9000049080254FF8F08EC0004EB
S31500001C200001600003960C5600806300038E025488
S31500001C30FF8F08EC00050001600000824878004034
S31500001C40486F00044EB9000013D460025895201561
S31500001C50908AE4803F002F0B2C55225620514E903F
S31500001C6023C000C0001467E42015908AE4803F007A
S31500001C70486F000224552252206900044E904857AE
S31500001C804EB9000049080254FF8F0054003060002E
S31500001C90032A0C56008065000322203900C04562E5
S31500001CA0B0B900C0455E661A0254FF8F005400505A
S31500001CB02F0B24552252206900084E904256600090
S31500001CC002FA0254FF8F08EC0C0600010C56004091
S31500001CD0650000BC303900C0001002800000FFFF24
S31500001CE080FC000648404A40660000A4203900C037
S31500001CF04562B0B900C0455E63000094207900C01B
S31500001D000004301048C0E588D08A2A80B08A652051
S31500001D100C80000309446418908AE4803F002F0B6E
S31500001D202055225020514E9023C000C00014661842
S31500001D302A8A200A908AE4803F002F0B22522051E3
S31500001D404E9023C000C00014207900C00004302843
S31500001D50000248C02680B0B900C000146C044A8056
S31500001D606C0242932F0B20552250206900084E909A
S31500001D7058B900C00004203900C00004B0B900C042
S31500001D804562650A23F900C0455E00C000040C5692
S31500001D900003635408140006674E4256427900C099
S31500001DA00010089400053014E048024000070C407A
S31500001DB00003642608140003671253934A936C1AAF
S31500001DC0203900C0001453802680600E52932013E1
S31500001DD0B0B900C000146D0242932F0B285522544F
S31500001DE0206900084E9060280C560040650001CC22
S31500001DF04256527900C00010303900C000105340DE
S31500001E000C40012C630A6100025A4EB9000049E6F3
S31500001E1048780040486F00044EB9000013D42015DE
S31500001E20908AE4803F002F13486F00062655225300
S31500001E302069000C4E9048574EB9000049084A796F
S31500001E4000C0000C670001743F3900C0000A20156D
S31500001E50908AE4803F00487900029E514EB9000204
S31500001E602292486F0008487900029E5C4EB9000233
S31500001E702292486F0030487900029E684EB90002EF
S31500001E8022924FEF0018600001320C5600036332B5
S31500001E9008140007672C4256427900C000100894C7
S31500001EA000070254F8FF3014E848024000070C40CF
S31500001EB00004660001060254FF8F005400506000C3
S31500001EC000FA0C560080650000F242563014E048D5
S31500001ED0024000070C40000464163014E04802403B
S31500001EE00007524002400007E1480254F8FF8154BF
S31500001EF03014E048024000070C40000267160C4010
S31500001F00000167100C400004675A0C400003677E0E
S3150C001F10600000A80814000357C04400488002402F
S31500001F200001720BE368089400038154487800406E
S31500001F30486F00044EB9000013D408140003670864
S31500001F40487900029E7D6006487900029E854879A0
S31500001F5000029E74486F00084EB9000222C84FEF77
S31500001F60000C604E0894000358950C950003094434
S31500001F7065022A8A2015908AE4803F002F0B285597
S31500001F80225420514E9023C000C0001467DA4878CE
S31500001F900040486F00C44EB9000013D42015908A03
S31500001FA0E4803F00486F0002245522522069000455
S31500001FB04E9048574EB9000049084FEF004033C0D5
S31500001FC000A000864CDF7C004E754E714E714E713E
S31500001FD033C000A00088207C00C00012227C00C014
S31500001FE0000E3010E848024000070C40000464046C
S31500001FF05251606030390080400E0800000C57C016
S3150000200004400488002400001720DE3680250DFFF81
S31500002010815008100005670E08100004660842513A
S315000020200 08D00007601608100005660E08100004A8
S315000020306708425108D0C006600252513010720DF6
S31500002040E26802400001C2400001720CE368089059
S315000020500004815033C00A0008A4E754E714E7147
S315000020604E7133C000A0008C4FEFFFBE3EB9000298
S3150000207005CA833D700C00012427900C0000E42B9F6
S31500002080000C00008427900C0001023F900C0455E78
S31500002090000C0000423FC000308B400C000004EB9D1
S315000020A00000487648780040486F00064EB90000A8
S315000020B013D4486F00024EB9000049084FEF0042A2
S315000020C033C000A0008E4E754E714E714E7133C0F6
S315000020D000A000904FEFFFC04EB900004876487848
S315000020E00040486F00044EB9000013D4487900023E
S315000020F09E96487900029E8D486F00084EB90002F0
S3150000210022C8487900029EAC487900029EA3486F17
S3150000211000344EB9000222C84FEF001848574EB996
S315000021200000049084FEF004033C000A000924E75F2
S3150000213004E714E714E7148E7003C33C000A00094CA
S315000021400287C00C0455E267C00025CAA30390080EF
S31500002150400E0800000E66482A7C00C00018247C49
S31500002160000C045622014B08B6714288B24BC000283
S3150000217005CB233FC012C00C000104255602E0C5599
S315000021800000A642852550C55000A6620248023C094
S31500002190000C000043F3C000B4EB9000072F0600C1A
S315000021A02014B08B66064EB900001B0633C000A093
S315000021B000964CDF3C004E754E714E714E7133C029
S315000021C000A00098424033C000A0009A4E754E71A0
S315000021D04E714E7148E70F3E33C000A0009C518FF0
S315000021E04A3900C01EEC660005F04A3900C01EEDF3
S315000021F067163F3900C01F504EB90001B2664EB98E
S3150000220000004A0C600005D24A3900C01EEF67087C
S31500002210610005DC600005C2267C000222924A3974
S31500002220000C01EF06700026C48790002A0914E9330
S31500002230588F4247287C00026768247C00C00D74D2
S3150000224002C7C00C00E78300748C0E5882A74080048
S3150000225003F0748790002A0EE4E935C8F42450C473B
S31500002260000046C1048790002A0F54E93588F7A014D
S315000022706000000820C4700046D0E0C4700076E08D4
S3150000228048790002A0FE600C0C47000A66164879E1
S3150000229000002A1074E93588F2F0D4EB90000507CB7
S315000022A03A0060500C470009661C48790002A110EC
S315000022B04E93588F4EB9000080D04A4057C0440014
S315000022C048803A00602E0C470008661C48790002D8
S315000022D0A1194E93588F4EB90000806A4A4057C0E4
S315000022E0440048803A00600C48790002A1224E93CF
S315000022F0588F4245320752414 8C1E58920341800BB
S3150000230032074 8C1E58990B418002F002F0D4A45C1
S31500002310670 63F3C005960043F3C004E4879000286
S3150000232 0A12B4E934FEF000E4A45670001580C470C
S31500002330000046C202F390002679C2F39000004002E
S3150000234048790002A13A4E934FEF000C2F39000254
S3150000235 05AA6604A0C470009661E2F390007ACCC06
S31500002360487 80CD448790002A14B4E934FEF000CED
S31500002370 2F390007ACC460260C470008662E20796A
S31500002380 00C005802F102F390007802048790002F1
S31500002390A15C4E934FEF000C2F39000780243F3C81
S315000023A000434EB900000F2C600000DA0C47000A0B
S315000023B06626205230280002024003FF72003200D7
S315000023C0588191CD2008E480D280E58920012F0034
S315000023D048790002A16D603E0C6DFFFF0012671286
S315000023E07000302D0012E5882F0048790002A17890
S315000023F06024205630280002024003FF720032009B
S31500002400588191CD2008E480D280E58920012F00F3
S3150000241048790002A1834E932F2D000C48790002C3
S315000024200A18E4E932F2D00083F3C00434EB900006D
S3150000243 00F2C2F2D000448790002A1954E934FEFE3
S315000024400018424638063006 46C0E588068000C0B7
S31500002450 0A2C20402A50200D67162F4D0004204FCD
S3150000246 02F2800044EB9000050F0B04766025244CF
S315000024 70 52460C4600406DCE3F0448790002A19BAF
S315000024804E935C8F52470C47000B6D00FDBA6000FF
S315000024900 03484A3900C01EE26700033E4A3900C0BD
S315000024A01EF167047A0F60324A3900C01EE56704E0
S315000024B07A0360264A3900C01EE667047A04601A69
S315000024C04A3900C01EE767047A05600E4A3900C023
S315000024D01EE867047A0660027A072A7C00C01F227B
S315000024E04A3900C01EE366284A3900C01EE4670860
S315000024F03C3900C01F2C60784A3900C01EEA6608C5
S315000025004A3900C01EEB67047C0160647C20606071
S315000025102 87C00C01F2630050C40000367200C40B5
S3150000252000004 67260C40000F672C0C400006671A53
S315000025300C40000567200C400007672660322014 17
S315000025409095E6802C0052466026201 49095E480F3
S3150000255 02C005246601A20149095E2802C005246B8
S31500002560600E3C3900C01F289C7900C01F245246CB

S315000025704A3900C01EEB660A4A3900C01EEA6700E7
S3150000258000AC4247287C00C01F466000009630051C
S315000025900C40000367200C40000467300C40000F1D
S315000025A067380C40000667460C40000567520C4031
S315000025B00007675E606A2F0C201572003207E789F4
S315000025C0D0812F004EB90002161A605420557000B3
S315000025D03007E588D1C0209460462F14225570003C
S315000025E03007D080D3C04EB9000191A66032205585
S315000025F070003007E588D1C020B900C01F426020B6
S3150000260020557000 3007D080D1C030B900C01F44BB
S3150000261060 0E205570003007D1C010B900C01F45AC
S31500002620 5247BE466500FF68600001AE4247287CFF
S3150000263000C01EDA247C00C01EEE600001960C94D9
S3150000264000000 1006C060694000010030050C40F5
S31500002650000 3672A0C40000467640C40000F670003
S3150000266000940C40000667 0000D20C40000567008D
S3150000267000FE0C40000767000126600001542 0158B
S315000026807200 3207E789D0812F0048790002A1A0A5
S315000026904E93205570003007E788D1C02F280004DC
S315000026A02F104A12670848790002A1A960064879E6
S315000026B00002A1AD4E934FEF0014600001142015E7
S315000026C072003207E589D0812F0048790002A1B156
S315000026D04E93508F205570003007E588D1C02F10DB
S315000026E04A12670848790002A1BA607C487900025C
S315000026F0A1BD6074201572003207E589D0812F00D4
S3150000270048790002A1C04E93508F205570003007C3
S31500002710D080D1C0558F3E9043EF00024EB90001E4
S3150000272091502 04F2F104A12670848790002A1C91C
S3150000273060364879 0002A1CC602E7003C007661689
S31500002740201572003207E589D0812F0048790002F2
S315000027 50A1CF4E93508F205570003007E588D1C029
S3150000276 02F1048790002A1D84E93508F60627007EF
S3150000277 0C007661620157200 3207D281D0812F005D
S315000027 8048790002A1DF4E93508F20557000300724
S3150000279 0D080D1C03F1048790002A1E8602E700FAA
S315000027A0C007661420157200 3207D0812F004879C1
S315000027B00002A1EE4E93508F205570003007D1C015
S315000027C0424010103F0048790002A1F74E935C8FFB
S315000027D05247BE466500FE684240508F33C000A097
S315000027E0009E4CDF7CF04E754E714E714E7148E77F
S315000027F0073C33C000A000A0247C008040081A12C9
S3150000280014BC008042461C3900C020223F3C0021F7
S315000028104EB9000072F04EB9000C8E6E4EB900013E
S31500002820B0AC4EB90001B1284EB90000806A203C18
S315000028300 00E00000448006800 0E00580E4802F0070
S31500002840487900E000004EB90000149442472A7C03
S31500002850000804014267C00022292287C00026760D9
S31500002860081500006670C08D5000613FC00EA008070
S3150000287040153007 48C0D0803F3408004879000230
S31500002880A1FD4E935C8F300748C0D0803F340800CE
S3150000289004EB90001B26652470C4700046DC242B9F8
S315000028A000E0000042B900C000FA2A7C0000040CD7
S315000028B0287C0000969C60082F0D4E94205D4E905B
S315000028C0BBFC0000041065F048790002A2164E9386
S315000028D0588F2A7C0000041060082F0D4E94205D4E
S315000028E04E90BBFC0000042865F048790002A22C3B
S315000028F04E93588F2A7C0000042860082F0D4E94B2
S31500002900205D4E90BBFC0000043465F0487900025F
S31500002910A23D4E93588F2A7C0000043460082F0D88
S31500002920 4E94205D4E90BBFC0000043465F02A7C7A
S315000029300 0000043460082F0D4E94205D4E90BBFCC1
S3150000294000000048065F02A7C0000048060082F0DDA
S315000029504E94205D4E90BBFC0000048065F02A7CFE
S31500002960000000 48060082F0D4E94205D4E90BBFC45
S31500002970000000 48465F02A7C0000048460082F0DA2
S315000029804E94205D4E90BBFC000004A865F02A7CA6
S31500002990000004BC60082F0D4E94205D4E90BBFCD9
S315000029A0000004C465F013C600C020224879000266
S315000029B0A2504E93588F148533C000A000A24CDF5E
S315000029C03CE04E754E714E714E7133C000A000A4AE
S315000029D0518F3F3C000B43EF00024EB9000073508D
S315000029E041D72F2800042F3900026688487900025 3
S315000029F0A2794EB9000222924FEF000C3F3C000B29
S31500002A0043EF00024EB90000735041D72F103F3CF0
S31500002A1000634EB900000F2C4240508F33C000A017
S31500002A2000A64E754E714E714E7133C000A000A8BF
S31500002A30203900C000FA90B900E000040C80009E26
S31500002A4034006F0A3F3C000B4EB9000072F033C0F1
S31500002A5000A000AA4E754E714E714E7148E7031CD8
S31500002A6033C000A000AC598F2A7C00C000FA2E1596
S31500002A704A3900C01EE4670A13F900C01F2D00E0A2
S31500002A8000008287C000222924A3900C01EE2670034
S31500002A9000E64A3900C01EE3670E2E3900C01F2229
S31500002AA0DEB900C01F2660182E3900C01F22DE9531
S31500002AB02015223C000151804EB900024FCC9E8069
S31500002AC04A3900C01EE5672048790002 5E684879E9
S31500002AD000C01F2E486F00084EB9000217D2485793
S31500002AE04EB90002455EDE800C870F0C3F00657E06
S31500002AF00C87EE6B28006276BE956466267CC0C065
S31500002B000D9C4A9367324A9366047C006006205304
S31500002B102C28000820159086 0C80000151806418 2E
S31500002B200C39000600C02022640E48790002A31961
S31500002B304E94588F7E00602A48784B0048790002F0
S31500002B40A3534EB9000169223C000C460059671296
S31500002B500C460079670C7E0048790002A3B94E94B2
S31500002B60588F4A87674423C700C000F6603C4879FF
S31500002B70 0002A3CD603048790002A3E54E942F07EA
S31500002B803F3C00434EB900000F2C48790002A3E8F1
S31500002B904E94508F2F073F3C005A4EB900000F2C21
S31500002BA048790002A3EA4E94588F4240588F33C0AA
S31500002BB000A000AE4CDF38C04E754E714E714E719E
S31500002BC048E7030433C000A000B02A6F0010424754
S31500002BD04A3900C01EE36728487900C0001A204F12
S31500002BE03F2800184EB90000848 01C00487900C0B8
S31500002BF0006C2F0D487800804EB9000011C6602683
S31500002C002F0D487900C0006C487800804EB900004E
S31500002C1011C6487900C0001A204F3F2800184EB947
S31500002C20000 0865E1C0010064A0067140C000002B5
S31500002C30670E0C000005670C0C00000467066006B2
S31500002C4042476002 7E01300733C000A000B24CDF6D
S31500002C5020C0205F5C8F4ED04E714E714E7148E79A
S31500002C600F3E33C000A000B44FEFFEF6227C0002F8
S31500002C7061B441D7703920D951C8FFFC48574EB9C5
S31500002C80001A30823FC00002BC000C01F2A23FC60
S31500002C900002BC000C01F26227C000260F641EF18
S31500002CA000E8700620D951C8FFFC30914A3900C0AF
S31500002CB01EF4670608EF000400E847EF00EA4A3909
S31500002CC000C01EEF6600008A4A3900C01EF3670482
S31500002CD00013004E4A3900C01F0467782A7900C0E5
S31500002CE01FAA606610150C00004467260C000054ED
S31500002CF067280C000065672A0C000053672C0C003F
S31500002D00050672E0C00007067300C0000736732AD
S31500002D10603608EF000000EA602E08EF000100EAC6
S31500002D20602608EF000200EA601E08EF000300EAD2
S31500002D30601608EF000400EA600E08EF000500EADE
S31500002D40600608EF000600EA528D4A156696600492
S31500002D50001300FF4DEF00EB4A3900C01EF067007C
S31500002D6000DA4A3900C01F05670608EF000600E9C9
S31500002D704A3900C01F06670608EF000500E94A2F1A
S31500002D8000EA660608EF000200E84A3900C01F00A4
S31500002D90670608EF000700E9103C00FFD03900C0C5
S31500002DA01F5D1F4000EB4A3900C01EF2672610392E
S31500002DB000C01F65D02F00EB53001F4000EC08EF4A
S31500002DC000200E80C2F003F00EC630C1F7C003F64
S31500002DD000EC60041F4000EC4A3900C01EFC674E40
S31500002DE008EF000700E82F7900C01F8A00EE4A3975
S31500002DF000C01F0367082F7900C01FA600F24A39DA
S31500002E0000C01EFD670A2F7900C01F8E00F66032D3
S31500002E104A3900C01EFF661A4A3900C01EEF661204
S31500002E202F6F00EE00F608EF000100E8601442AFD5
S31500002E3000EE70FF2F4000F6600842161F7C00402F
S31500002E4000EC4A3900C01EFF670608EF000500E8DF
S31500002E504A3900C01F02670608EF000300E84A3936
S31500002E6000C01F01670608EF000600E84A3900C0E7
S31500002E701F036710082F000700E866082F7900C0B7
S31500002E801FA601024240102F00EC4241122F00EB18
S31500002E9090415540 0C400002 5DC0440048803A0015
S31500002EA02E3C000151804A3900C01EEC672C2039A7
S31500002EB000C01F4A22074EB9000253E04EB9000275
S31500002EC05A822F4000FA4A3900C01EF56710203991

S31500002ED000C01F6ED1AF00FA600442AF00FA49EF9E
S31500002EE000FE4A3900C01EED6728203900C01F4E7B
S31500002EF022074EB9000253E04EB900025A822880DA
S31500002F004A3900C01EF6670E203900C01F72D194E0
S31500002F10600470FF2880247C00C0001A4A3900C073
S31500002F201EE4660E486F00E8224A4EB90000810E84
S31500002F306012227C000260E2204A703320D951C818
S31500002F40FFFC30914A3900C01EE3671443EF00E8E6
S31500002F50207C00C0002E700620D951C8FFFC30919D
S31500002F604A3900C01EE3670678FD600005384A3915
S31500002F7000C01EE4670678FE6000052A42442A7C3B
S31500002F80000222924A3900C01EFA660A4A3900C077
S31500002F901EF76700023E4A2F00EA66061F7C00FF06
S31500002FA000EA42461C2F00EB287C00C00106247C58
S31500002FB000C305CC6000020C3E06307C00B8D1D4BF
S31500002FC070003007D080D1C03010720BE26802402A
S31500002FD000074241123900C02022B041620001E2DE
S31500002FE070003007E58806800002665C20404A9043
S31500002FF0670001CE70003007068000030D98204060
S315000030000424010104241122F00EAC041670001B24F
S315000030104A3900C01EFA670000CE4240102F00EB6E
S31500003020BE40660A48790002A8D54E95588F307C76
S315000030300000B8D1D470003007D080D1C03010E2483B
S3150000304024003FF3F00307C00B8D1D47000300747
S315000030500D080D1C00828000000167063F3C005917
S3150000306060043F3C004E307C00B8D1D47200320779
S315000030700D281D1C130100800000E67063F3C004ED9
S3150000308060043F3C0059307C00B8D1D4720032074E
S3150000309 0D281D1C130100800000F67063F3C0059AD
S31500003 0A060043F3C004E307C00B8D1D4700030073D
S31500003 0B0D080D1C03010720BE268024000073F009A
S31500003 0C070003007E58806800002665C20402F10FD
S31500003 0D0300752403F0048790002A9284E954FEF2D
S31500003 0E00014600000D64240102FC0EBBC4066562C
S31500003 0F00CB90000000100CC1F32664A48574879E3
S315000031000002A95E4E955C8F4A456628487900020E
S31500003110A9634E95588F6C2E700030C6E5880680AC
S3150000312000C2665C20402F10487900C2A98F4E9558
S31500003130508F52464240102F00ECBC4065DA4246A2
S31500003140 1C2F00EB3E064A45670A4240102F00EB53
S31500003150BC40660E486F007848790002A9944E95E7
S31500003160508F4A456622700030 07E58806800002C7
S3150000317 0665C20402F10300652403F00487900021E
S31500003180A9994E954FEF000A70003007E7882F3255
S3150000319008044879 0002A9A34E9570003007E78815
S315000031A02F3208003F3C00634EB900000F2C4879CF
S315000031B00002A9AB4E954FEF000C3F07610002FEDF
S315000031C052464240102F00ECBC406300FDEC60000C
S315000031D002D44A2F00EA663A4A3900C01EF4663223
S315000031E04A3900C01EFC662A4A3900C01EF0662213
S315000031F04A3900C01EFB661A4A3900C01EF866121C
S315000032004A3900C01EF9660A4A3900C01EFE670028
S3150000321002944A3900C01EFE67000154082F0007B9
S315000032200 0E867084879 0002A9AD600648790002FF
S31500003230A9CD4E95082F000200EC670848790002D8
S31500003240A9EB600648790002AA1C4E95508F082FFC
S3150000325000 0600E8670A48790002AA4C4E95588F86
S3150000326 0082F000500E8670A48790002AA5F4E9514
S31500003270588F082F000400E8670848790002AA83DF
S31500003280600648790002AA8B48790002AA794E9511
S31500003290424 0102F00F352403F0048790002AA9B9B
S315000032A04E954240102F00FA52403F0048790002E6
S315000032B0AAC14E95204F2F28010248790002AAE79D
S315000032C04E95204F2F28011248790002AB0E4E95DD
S315000032D048790002AB354E95204F2F2801223F3CFE
S315000032E000634EB900000F2C48790002AB514E9591
S315000032F04FEF002C204F2F2800FE3F3C00634EB9B5
S315000033000000 0F2C4AAF01026712204F2F2801023E
S3150000331048790002AB6D4E95508F600A48790002DD
S31500003320AB914E95588F48790002ABAF4E952F1250
S3150000333048790002ABB24E952F3900C0001E48797D
S315000033400002ABDA4E95203900C00026E5882F0032
S3150000335048790002AC024E952F3900C0002A487900
S315000033600002AC2A4E954FEF00246000013849EF69
S31500003370010628926000011E4A9466063E3CFFFF45
S3150000338060102054302800 02720AE2680240003FB2
S31500003390 3E00486F00E82F144EB9000083201C0041
S315000033A00C00000267104A00670C0C00000467005E
S315000033B000D8600000D620542F2800042F28000CC7
S315000033C070003007E58806800002665C20402F10FA
S315000033D0300752403F0048790002AC524E954FEFFD
S315000033E0001220542F2800083F3C00434EB900002D
S315000033F00F2C4A3900C01EFB672E205430280002CD
S3150000340 0024003FF5840E5483F002F144EB9000024
S31500003410 50F03F002F1448790002AC6B4E954FEFE9
S315000034200000C3F07610000962054302800020 2403D
S31500003430 03FF4A40634E4A3900C01EF957464A39BF
S3150000344000C01EF8663E4247602C7007C007660A39
S3150000345048790002AC7B4E95588F307C0010D1D451
S31500003460 70003007E588D1C02F1048790002AC7E85
S3150000347 04E95508F5247205430280002024003FFD9
S3150000348 0BE4065C64A06670242942F14224C4EB9C6
S315000034900000699C4A94670C20540C68FFFF0002E8
S315000034A06600FED630044FEF010A33C000A000B616
S315000034B04CDF7CF04E754E714E714E712F0733C046
S315000034C000A000B87E01302F000848C00680000327
S315000034D00D9820404240101 0C0470C40000167265E
S315000034E00C400002672 80C400004672A0C400008C4
S315000034F0672C0C400010672E0C40002067300C40F3
S315000035000040673260 3E48790002AC85602E4879FB
S3150000351 00002AC876026487900 02AC89501E4879B3
S31500003520 0002AC8B601648790002AC8D600E4879BB
S3150000353 00002AC8F600648790002AC914EB90002D9
S315000035402292588FDE476600FF7E33C000A000BA85
S3150000355 02E1F205F548F4ED04E714E714E7133C068
S31500003560 00A000BC23FC00000A000C01EDA4A3995
S31500003570 00C02022672A48790002AC944EB90002A6
S31500003580 22922F3900C000FA3F3C00434EB900009A
S3150000359 00F2C48790002ACA54EB90002229250 8F3A
S315000035A04EB90001B0F24EB90001B0F24EB90001B9
S315000035B0B0F270FF33C000A000BE4E754E714E7162
S315000035C04E7133C000A000C023F9000262AE008035
S315000035D04018203900C0202A0C80000100006448F1
S315000035E00C402580670E0C404B00671A0C40960075
S315000035F067266034023900F800804018003900035D
S315000036000080401860220239 00F80080401808F94E
S3150000361000010080401860100239 00F80080401850
S31500003620 08F9000000804018223C00E000004441F8
S31500003630203C00E00580D04133C000804050203C53
S3150000364000E0077FD04133C000804052203C00E0BC
S3150000365 00780D04133C000804054203C00E0081F62
S31500003660D04133C000804056 33C000A000C24E7522
S315000036704E714E714E7148E7033E33C000A000C440
S3150000368 02A7C00C02024247C0080405C3C2F002043
S31500003690 4A15630000A80C46000A660000A0287CB4
S315000036A000C020255214101 4B01565000090103C7F
S315000036B000FED01518802A7C000262BE267C00021D
S315000036C062B62C7C00003676600A2F13101D4880E7
S315000036D03F004E964A1566F24247301208 00000D2A
S315000036E067084EB90001B0F2602010390080405AD8
S315000036F00C00000367080C000020670A60144EB92E
S31500003700 0001B116600C4214600852470C470F00C6
S31500003710 6DC82F133F3C000D4E9642472F133F3C7A
S315000037200 0204E9652470C47003C6DF02F133F3C4D
S3150000373 0000D4E96604C4EB90001B0F230120800F2
S3150000374 0000C66F2203900C01EDE90B900C01EDAF9
S3150000375 07240B0816F064EB90001B0F24A3900C01E
S31500003760 0E8A66183012080000 0D66100C39000328
S3150000377 00080405A66064EB90001B11613C6008095
S315000037804058300633C000A000C64CDF7CC0205F26
S3150000379 05C8F4ED04E714E714E7148E7010C33C0AE
S315000037A000A000C8610001F8287C00C0202E10147B
S315000037B00C00000263024214 2A7C0080401A424038
S315000037C0101432150241 0003B04167160255FFEF8F
S315000037D04240101402400003 0255FFFC815500557B
S315000037E00010103900C0202F0C00000767080CC0DD
S315000037F00008672060163015080000 02662A025588
S3150000380 0FFEF005500040055001060 1C13FC000873
S3150000381000C0202F301508000002670C0255FFEF8C
S31500003820 0255FFFB005500103 0390080405C08004F

S31500003830000D670670FF600001501E390080405A77
S315000038400839000000C02030670E4A3900C0202227
S31500003850630613C70080405808390000000C02031B5
S3150000386066523015080000C661E3015080000D63
S3150000387066160807000767384A3900C02028670817
S3150000388060 2E1E390080405A30390080405C0800A6
S3150000389000 0D67EE287C00C0202A0C9400009600DC
S31500003 8A0660828BC000025806006 2014D080288089
S3150000038B0610000EC08070007670E4A3900C020289F
S315000038C0660670FC600000C230150800000D6738FF
S315000038D00255EFFF3015720CE268024000010 2400B
S315000038E00001720DE3680255DFFF81553015E2686D
S315000038F0024000010240001720BE3680255F7FF27
S3150000390081 5570FE6000008230150800000C673695
S31500003910025 5EFFF3015720CE26802400001024 0CA
S315000039200001720DE3680255DFFF81553015E2682C
S3150000393002400001024000172 0BE3680255F7FFE6
S3150000394081 5570F96042301508 00000B6736025544
S31500003950EFFF3015720CE26802400001024 00001E0
S3150000396072 0DE3680255DFFF81553015E2680240AB
S3150000397000010240 0001720BE3680255F7FF815512
S3150000398070FA60044240100733C000A000CA4CDF42
S3150000399030 80205F588F4ED04E714E714E7133C0BD
S315000039A000 0A000CC207C00804018227C0080401AB9
S315000039B0203900C0202A0C80000100006 4320C402F
S315000039C02580670E0C404B0067300C409600674818
S315000039D0601E1010020000070C00000367580 25119
S315000039E0FFEF021000F8001000030051001 06046BF
S315000039F023FC00004B0000C0202A10100200000724
S31500003A000C00000267300251FFEF021000F808D0E8
S31500003A100001005100106 01E021000F808D00000DE
S31500003A207007C01067100251FFEF021000F808D0AF
S31500003A3000000051001033C000A000CE4E754E713C
S31500003A404E714E7148E7011C33C000A000D04FEF05
S31500003A50FFEC4BEF00047E022EAF002C286F0028EF
S31500003A60267C00C021060C94FFFFFFFF6624426DF2
S31500003A70000E2A8C41D72B4800082B4C00043B47EC
S31500003A80000C2F0D4EB900C0464642471E008F134C
S31500003A90600608D300027E0430074FEF001433C0DF
S31500003AA000 0A000D24CDF3880205F508F4ED04E7180
S31500003AB04E714E7148E7011C33C000A000D44FEF91
S31500003AC0FFF0286F00244BD77E02267C00C021061B
S31500003AD00C94FFFFFFFF6626426D000E2A8C41EF15
S31500003AE000282B4800082B4C00043B47000C2F0DE8
S31500003AF04EB900C0464642471E008F13600608D3E3
S31500003B00000027E0430074FEF001033C000A000D63D
S31500003B104CDF3880205F508F4ED04E714E714E7103
S31500003B2048E7073C33C000A000D84FEFFFF0266FF0
S31500003B3000304BD77A044246284B3E06247C00C010
S31500003B402106600E0C54FFFF670608D200027E04B1
S31500003B505246BC456C044A4767EA4A476624426DAA
S31500003B60000E2A8B41EF0C342B4800082B4B000433
S31500003B703B45000C2F0D4EB900C0464642471E007D
S31500003B808F1230074FEF001033C000A000DA4CDF71
S31500003B903CE0205F4FEF0C0C4ED04E714E714E71DF
S31500003BA048E7033C33C000A000DC4FEFFFF0266F70
S31500003BB0002C4BD74246284B3E06247C00C02106EB
S31500003BC060100C54FFFF670608D200027E045246BE
S31500003BD0548CBC6F00346C044A4767E64A47662437
S31500003BE0426D000E2A8B2B6F003000082B4B000411
S31500003BF03B6F0034000C2F0D4EB900C046464247BD
S31500003C001E008F1230074FEF001033C000A000DEF9
S31500003C104CDF3CC0205F4FEF000A4ED04E714E7114
S31500003C204E7148E7033C33C000A000E04FEFFFF0C1
S31500003C30266F002C4BD74246284B3E06247C00C0FC
S31500003C40210660100C54FFFF670608D200027E04AE
S31500003C505246548C300648C0322F003448C1D281B7
S31500003C60B08164044A4767DC4A476628426D000E05
S31500003C702A8B2B6F003000082B4B0004302F0034AA
S31500003C80D0403B40000C2F0D4EB900C0464642477F
S31500003C901E008F1230074FEF001033C000A000E265
S31500003CA04CDF3CC0205F4FEF000A4ED04E714E7184
S31500003CB04E7133C000A000E44A3900C01EE2670816
S31500003CC04EB900008DF6600C23F90002631C0080DB
S31500003CD0400860FE424033C000A000E64E754E71BB
S31500003CE04E714E7148E7003E33C000A000E84FEF2A
S31500003CF0FFEA2A7C00C04590287C00C01CD0247CAA
S31500003D0000 0222922C7C00C045724A3900C01EE295
S31500003D10660002FE2015B08C670C2240204C70070E
S31500003D2020D951C8FFFC267C00C01CD24A3900C0ED
S31500003D301EEE67202A8C7003C07900C01F54E74826
S31500003D400253FFE781533013E648024000 0313C0D5
S31500003D5000C020DA4A3900C01EEF67162A8C3039B7
S31500003D6000C01F580240001E54808AB00020001F0
S31500003D7081534A3900C01EEA67122A8C7003C07943
S31500003D8000C01F44EB480253FF9F81534A3900C0CD
S31500003D901EEB67162A8C303900C01F48024000010E
S31500003DA0EF4808AB0007000181534A3900C01EE303
S31500003DB067162A8C303900C01F2802400001720F96
S31500003DC0E3680893000781534A3900C01EE467166A
S31500003DD02A8C303900C01F2C02400001720EE368A5
S31500003DE008930006 81534A3900C01EF367182A8CCF
S31500003DF0703FC03900C01F69023900C000C01CD422
S31500003E00813900C01CD44A3900C01EEC67582A8C80
S31500003E102016486F00124EB900023A48487900024F
S31500003E20646A487900C01F4A486F00164EB90002FE
S31500003E30177E48790002646 6486F0012486F0012C8
S31500003E404EB9000217E8486F0012486F000E486F1F
S31500003E5000 0E4EB9000217D2486F00064EB9000296
S31500003E60455EE88838804A3900C01EE8670461006C
S31500003E7003CA4A3900C01EE667046100003584A397E
S31500003E8000C01EE76712610003B22255204C70077E
S31500003E9020D951C8FFFC2A8C4A3900C01EE5672686
S31500003EA02015B08C66166100036A4A406708487997
S31500003EB00002AFB2600C61000382600A487900021A
S31500003EC0AFC34E92588F4A3900C01EED670000EA14
S31500003ED02016486F00124EB900023A48303900C029
S31500003EE01CA6907900C01CA2486F000C028000003E
S31500003EF0FFF4EB900023A48487900026466486FEF
S31500003F00010486F00104EB9000217D2486F001219
S31500003F10486F000C486F000C4EB9000217E848794C
S31500003F2000 02646E486F0008486F00084EB9000230
S31500003F30177E204F2F1048790002AFE24E922016CE
S31500003F40486F001A4EB900023A48303900C01CAE1C
S31500003F50123900C01CA344015801E368486F0014DD
S31500003F6002800000FFFF4EB900023A48487900027D
S31500003F706466486F0018486F00184EB9000217D2E1
S31500003F80486F001A486F0014486F00144EB90002BB
S31500003F9017E848790002646E486F0010486F0010F9
S31500003FA04EB90002177E204F2F28000848790002DC
S31500003FB0AFFC4E924FEF00104A3900C01EF0671654
S31500003FC02A8C303900C01F5C02400001720CE36885
S31500003FD0089300 0481534A3900C01EF167162A8CE3
S31500003FE0303900C01F6002400001D04008AB00011C
S31500003FF0000181534A3900C01EF267142A8C3039F9
S3150000400000 0C01F64024000010 8AB0000000181539C
S31500004010 4A3900C01EE9670001A40C950000085249
S315000040206608487900 02B04460142015B08C660812
S31500004030487900 02B04C600648790002B0554879CC
S31500004040 0002B01C4E9248790002B05B4E92205599
S31500004050102800040200003F4241120030013F00D8
S315000040600828000200036708487900 02B0E36006EA
S315000040704879000 2B0E7205530280002E6480240A1
S3150000408000 0033F0030280002EA48024000037201A4
S315000040900E16930013F00082800070003670848 79F6
S315000040A00002B0D560064879000 2B0DA2016486FE3
S315000040B0002C4EB900023A4820553010E948486FA6
S315000040C00026028000 00FFFF4EB900023A484879F8
S315000040D00026466486F002A486F002A4EB9000243
S315000040E017D2486F002C486F0026486F00264EB93D
S315000040F0000217E848790002646E486F0022486F94
S31500004100000224EB90002177E204F2F28001A205594
S3150000411030280002080000E67084879000 2B0CE79
S31500004120600648790002B0D2205530280002080007
S315000041300000F67084879000 2B0C76006487900 0298
S31500004140B0CB48790002B0934E9248790002B0EAAB
S3150000415 04E924FEF002E2055302800020800000C2A
S3150000416067084879000 2B0F960064879000 2B10193
S3150000417 04E924879000 2B10A4E92508F2055082877
S3150000418000010003670848790002B11C60064879FF

S315000041900002B1244E9248790002B12D4E92508F02
S315000041A020550828000000036708487900002B13846
S315000041B0600648790002B1424E92588F42404FEF56
S315000041C0001633C000A000EA4CDF7C004E754E712D
S315000041D04E714E7133C000A000EC0CB900000852BD
S315000041E000C04590671E227C00000852207C00C05B
S315000041F01CD0700720D951C8FFFC23FC00C01CD07E
S315000004200000C0459033C000A000EE4E754E714E7151
S315000042104E7133C000A000F02F3900C045903F3CDE
S315000042200000083F3C002F4EB90000717433C000A057
S315000042300000F24E754E714E714E712F0D33C000A0B7
S315000042400000F44FEFFFF03F3C002F43EF000E4EB956
S315000042500000073184AAF000C67607010D0AF000CF6
S315000042602A4070003015 2F400004203900C04572E6
S315000042704 86F00084EB900023A4848790002647255
S31500004280486F000C486F00084EB9000217D2485715
S315000042904EB90002455EE888222F0004B280641AF7
S315000042A0206F000C30280002024003FF0C4000087B
S315000042B0660823CD00C04590600A23FC0000085222
S315000042C000C045904FEF001033C000A000F62A5FF3
S315000042D04E754E714E714E7148E73F3E33C000A099
S315000042E000F84FEFFF6A76034247287C00022292CD
S315000042F03C0748C641EF00482006D080D086E588B6
S31500004300D1C0300748C0E588D1C020BC3F8000003E
S315000043103C0748C641EF006C2006D080D086E58871
S31500004320D1C0300748C0E588D1C020BC3F800C001E
S31500004330424638 0748C43A0748C560503007D04659
S315000043403207E5499041504041EF00242204D281D2
S31500004350D284E589D1C1320648C1E589D1C12F0889
S31500004360 48C04EB900023A2841EF00242005D0800B
S31500004370D085E588D1C0300648C0E588D1C02F1069
S31500004380 48790002B14E4E94508F5246BC436DACF4
S3150000439048790002B1534E94588F5247BE436D0080
S315000043A0FF5048790002B1554E9448790002B15742
S315000043B04E94508F42464BEF002047EF001C45EFCE
S315000043C000144DEF00106000029478FF3E06604036
S315000043D03A0748C541EF00242005D080D085E588FE
S315000043E0D1C0300648C0E588D1C02F1043EF001C6D
S315000043F04EB9000241E0487900026476486F001C1D
S315000044004EB9000218164A406F043807600652473 4
S31500004410BE436DBC4A446C1048790002B1594E94B3
S31500004420588F70016000043AB846670000F64245AE
S31500004430300648C02F400018300648C02F400014F0
S31500004440300448C02F400010300448C02F40000CF4
S31500004450300648C02F400008300648C02F400004F0
S31500004460300448C02E80340448C2600000B03005D5
S315000044704 8C0E5882E0041EF0024202F0018D08088
S31500004480D0AF0018E588D1C02AB0780043EF0024E9
S31500004490202F0010D080D0AF0010E588D3C041EFA8
S315000044A00024202F0014D080D0AF0014E588D1C09E
S315000044B021B17800780041EF0024202F000CD08035
S315000044C0D0AF000CE588D1C02195780041EF0048B7
S315000044D0202F0008D080D0AF0008E588D1C02AB0D0
S315000044E0780043EF00482017D080D097E588D3C0E6
S315000044F041EF0048202F0004D080D0AF0004E588AB
S31500004500D1C021B17800780041EF00482002D08068
S31500004510D082E588D1C0219578005245BA436D0016
S31500004520FF4E3A065245300648C02F400018300666
S3150000453048C02F40000C300648C02F4000046000E1
S315000045400 1143E0548C741EF00242008222F001819
S31500004550D281D2AF0018E589D081320648C1E589FB
S31500004560D0812F0041EF00282007D080D087E58832
S31500004570D1C0300648C0E588D1C02F082F0B4EB9F0
S3150000458 0C00217E84244300548C02480300548C080
S315000045902C803C0548C02F400008340548C2600012
S315000045A000AC300448C0E5882E0041EF0024202FDF
S315000045B0000CD080D0AF000CE588D1C048707800E0
S315000045C02F0B486F00084EB9000217D2485741EF2B
S315000045D000282016D080D096E588D1C04870780093
S315000045E041EF002C2012D080D092E588D1C04870CF
S315000045F078004EB9000217A641EF0048202F0004AC
S31500004600D080D0AF0004E588D1C0487078002F0B69
S31500004610486F00084EB9000217D2485741EF004CC8
S315000046202002D080D082E588D1C0D1C72F0841EFC3
S3150000463000050202F0010D080D0AF0010E588D1C0E8
S31500004640487C78004EB9000217A65244B8436D0070
S31500004650FF525245BA436D00FEEA52463003534 0BC
S31500004660BC406D00FD663E03534748C741EF00243A
S315000046702007D080D087E588D1C03003534048C09A
S31500004680E588D1C02F1043EF001C4EB9000241E06F
S315000046904879000 26476486F001C4EB9000218166D
S315000046A04A406C1048790002B16D4E94588F7002E2
S315000046B0600001AE424547EF00903003534048C0CA
S315000046C026802F4000182F4000142F40C01070FE47
S315000046D0D0433F4000946000013C41EF0024200895
S315000046E0222F0010D281D2AF0010E589D08122138B
S315000046F0E589D0812F0041EF004C2008222F0018B9
S31500004700D281D2AF0018E589D081320548C1E5894A
S31500004710D0812F0041EF00742008222F0020D28183
S31500004720D2AF0020E589D081320548C1E589D08124
S315000047302F004EB9000217E83E2F0094600000CE0D
S31500004740 2ABC000000003C075246340748C2604CB1
S31500004750380648C441EF006C2004D080D084E58838
S31500004760D1C0300548C0E588D1C02F0841EF0028E8
S315000047702002D080D082E588D1C0300648C0E588C6
S31500004780D1C02F08486F00144EB9000217D2486FE7
S31500004790 00C2F0D4EB9000214FA5246BC436DB000
S315000047A0340748C2380748C43C0748C62F0D41EFB6
S315000047B0004C2004D080D084E588D1C0300548C0A4
S315000047C0E588D1C02F08486F00144EB9000217A61D
S315000047D041EF00242006D080D086E588D1C030077E
S315000047E048C0E588D1C02F08486F001041EF00741B
S315000047F02002D080D082E588D1C0300548C0E58847
S31500004800D1C02F084EB9000217E853474A476C003B
S31500004810FF305245BA436D00FEC24245603C4247F6
S3150000482 03C0548C6602441EF006C2006D080D08647
S31500004830E588D1C0300748C0E588D1C02F10487937
S315000048400002B1824E94508F5247BE436DD84879CC
S3150000485 00002B1874E94588F5245BA436DC042400C
S31500004860 4FEF009633C000A000FA4CDF7CFC4E757B
S315000048704E714E714E7133C000A000FC227C008048
S3150000488 0410013FC000200804060323CFE5F3001B4
S31500004890 51C9FFFC12BC0038323C018B300151C9B2
S315000048A0FFFC12BC0038323C008D300151C9FFFCC0
S315000048B012BC003872383 00151C9FFFC12BC0038F6
S315000048C072703C0151C9FFFC12BC00087238300109
S315000048D051C9FFFC12BC0001323C0922300151C90A
S315000048E0FFFC12BC0006723830015 1C9FFFC12BC35
S315000048F0000C7238300151C9FFFC33C000A000FE25
S315000049004E754E714E714E7148E7051433C000A0C6
S31500004910 0100226F0014207C00804102267C00806A
S31500004920410016BC008072383E0151C9FFFC2A497D
S3150000493 07210600A109D7E383A0751CFFFFC4A1567
S3150000494 067224A415EC0440048803E0053414A47C0
S3150000495 0671260E07E383A0751CFFFFC10BC00209A
S31500004960 1AFC00204A415EC0440048803E00534184
S315000049704A4766E072383E0151C9FFFC16BC00A9E1
S3150000498 072383E0151C9FFFC4BE900207210600AE3
S315000049 90109D7E383A0751CFFFFC4A1567224A41DF
S315000049A05EC0440048803E0053414A47671260E0BB
S315000049B07E383A0751CFFFFC10BC00201AFC0020BD
S315000049C04A415EC0440048803E0053414A4766E083
S315000049D033C000A001024CDF28A0205F588F4ED0C4
S315000049E04E714E714E7133C000A0010413FC0001DC
S315000049F000804100323C0922300151C9FFFC33C01E
S31500004A0000A001064E754E714E714E712F0733C0D0
S31500004A1000A001081E390080400813FC00800080B9
S31500004A20400861000B2A610041E861004192610083
S31500004A3008386134610008C813C70080400833C0D5
S31500004A4000A0010A2E1F4E754E714E714E7133C075
S31500004A5000A0010C424033C000A0010E205F588F19
S31500004A604ED04E714E714E7148E71F3E33C000A0C6
S31500004A700110598F48780004048790 0C00B2C2A7CD9
S31500004A8000000014944E9548780004 0487900C00A2CDE
S31500004A904E954878004148790 0C00D784E95487883
S31500004AA000001487900C00E7C4E954878000148798F
S31500004AB000C00E804E954878009748790 0C007CC14
S31500004AC04E9542B900C00A284878008048790 0C04F
S31500004AD005CC4E9542B900C0058842B900C000EC2D
S31500004AEC4247247C00C00C702C7C00C00C7230073E

S31500004AF048C0D08035BCFFFF0800300748C0D080D2
S31500004B003DBCFFFF080052470C4700016DE04245DF
S31500004B104BD7263C0000FFFF267C0002676860003A
S31500004B2001F4300448C0E5882AB30800670001E2B2
S31500004B30600001B220550CA803FFFFF0004630CC0
S31500004B402F2800046100FF083E00600242474A47E2
S31500004B506D0000F620553028000272OAE268024015
S31500004B60003F0C400033662E28487C3FCC6C000E7C
S31500004B70300748C0E188068000C00A2C320648C1CA
S31500004B80E589D0812040208C300748C0D08035860A
S31500004B900800600000B430280002E2680240003FCE
S31500004BA00C400037662C28487C3FCC6C000E300742
S31500004BB048C0E188068000C00B2C320648C1E58952
S31500004BC0D0812040208C300748C0D0803D86080028
S31500004BD060764A476F2430280002E2680240003FB0
S31500004BE00C400038661430075340480E5880680FC
S31500004BF000C00E7C20402095604E4A476F26205507
S31500004C0030280002720AE2680240003F0C40002B86
S31500004C106612300748C0E588068000C00E84224030
S31500004C20228860242055302800027200AE268024079
S31500004C30003F0C40003966103007480CE588068002
S31500004C4000C00E802240228823D500C0C0EC4A47CF
S31500004C506600008A23D500C00E784A9566063E3C5B
S31500004C60FFFF601020553028000272OAE2680240F9
S31500004C70003F3E000C47001E670A7004D09523C013
S31500004C8000C005884A9566042E036012205530281 8
S31500004C900002720AE2680240003F7E003E00327C5B
S31500004CA00008D3D52007E788068000C005CC204041
S31500004CB020D920914A9566042E036012205530288B
S31500004CC00002720AE2680240003F7E003E002007B2
S31500004CD0E588068000C00D78204020952F15224DCE
S31500004CE061001CBA4A95672A20153204524148C110
S31500004CF0E589B0B31800641A2040322800002700A11
S31500004D00E0690241003F0C41003567066000FE265F
S31500004D107A045245300548C0D080068000C04566FA
S31500004D20204C38100C44FFFF67080C4500046D0056
S31500004D30FDF2487900C007CC2F3900C00E4461004F
S31500004D400F1023C000C00A28588F33C000A00112DC
S31500004D504CDF7CF84E754E714E714E7133C000A01B
S31500004D6001146100292E23F900C0010200C000FAD7
S31500004D7023F900C000FA00E0000033C000A00116CD
S31500004D804E754E714E714E7148E7010C33C000A04E
S31500004D900118518F287C00C000FA0C940F0C3F00BC
S31500004DA063000009C4AB900C00A28670A207900C03F
S31500004DB00A282A5060029BCD2E3C00015180200D0E
S31500004DC067402F0D61003BCA4A406736202D000818
S31500004DD022074EB9000253E022142F410004220795
S31500004DE02E80202F00044EB9000253E02217B28015
S31500004DF06610487900C007CC2F0D61000E544A801A
S31500004E00663C4AB900C00E546732207900C00E5481
S31500004E1020280008220748B9000253E022142F4131
S31500004E2000042207 2E80202F00044EB9000253E012
S31500004E302217B28066066100065060026148508FF4
S31500004E4033C000A0011A4CDF30804E754E714E7192
S31500004E504E7133C000A0011C0CB903FFFFFF00C058
S31500004E60456E65140CB90F0C3F0000C000FA6308CC
S31500004E70610013F66100FF1233C000A0011E4E75DB
S31500004E804E714E714E7133C000A001200CB903FF64
S31500004E90FFFF00C0456E65240CB90F0C3F0000C033
S31500004EA000FA62084AB900C000F667106100FB5EAE
S31500004EB061001168610055A6100FB5233C000A011
S31500004EC01224E754E714E714E7133C000A0012401
S31500004ED0518F3CB903FFFFFF00C0456E656B0CB922
S31500004EE00F0C3F0000C000F6635C6100FB20203918
S31500004EF000C000F6223C000151804EB9000253E08A
S31500004F00223900C000FA2F410004223CC0015180E2
S31500004F102E80202F00044EB9000253E02217B280E3
S31500004F20670A610010F6610004E86016203900C0C7
S31500004F300C0F6B0B900C000FA6408610010DE610036
S31500004F4005486100FAC8508F33C000A001264E758F
S31500004F504E714E714E7148E7070033C000A001281C
S31500004F607CFF4247602C300748C0D0800680000294
S31500004F70676020403A10300548C0E5880680000288
S31500004F80676820402F10610000F44A4066023C0525
S31500004F9052470C46FFFF66060C4700046DC83006F4
S31500004FA033C000A0012A4CDF00E04E754E714E71F1
S31500004FB04E7148E70F0433C000A0012C78FF7C0037
S31500004FC04247300748C0D080068000026760204014
S31500004FD03A10300548C0E5880680000267682040 20
S31500004FE02A502F0D610000964A40670CBCAD000C9C
S31500004FF064062C2D000C380552470C4700046DC280
S3150000500300433C000A0012E4CDF20F04E754E71E7
S315000050104E714E7148E70F0C33C000A001307CFF83
S315000050207AFF4247287C00026760300748C0D0807C
S31500005030383408003 20748C1D2813034180048C0DD
S31500005040E5880680000267682 0402A502F0D612CF3
S31500005050 4A40670CBCAD000C63062C2D000C3A04CC
S31500005060 52470C4700046DC2300533C000A0013220
S315000050704CDF30F04E754E714E714E7133C000A04C
S31500005080 0134558F226F00063EB900026482200962
S315000050906748302 9001048C0E5880680000267682 6
S315000050A02040B3D066343029 0002B057662C0CA9D4
S315000050B0EE6B280000086422 0CA90F0C3F000008C4
S315000050C063183029 0014B05766100CA90030D400BC
S315000050D0000C55C04400488060024240548F33C0E3
S315000050E000A00136205F588F4ED04E714E714E7122
S315000050F048E7030033C000A001387CFF4247227C0A
S3150000510000026768602 2202F000C320748C1E5893B
S31500005110B0B118006510320752414 8C1E589B0B1F7
S315000051201800640 23C0752470C47000B6C060C46FD
S31500005130FFFF67D20C4600046D060C4600076F0899
S3150000514 00C46000A67027CFF300633C000A0013A15
S315000051504CDF00C0205F588F4ED04E714E714E719D
S31500005160 48E7070C33C000A0013C7CFF4247287C7F
S31500005170000267603007 48C0D0803A340800320722
S31500005180 48C1D2813034180048C0E5880680000244
S31500005190 676820402A502F0D6100FEE24A40670CE6
S315000051A0202F0018B0AD000C66023C0552470C4794
S315000051B000046DC0300633C000A0013E4CDF30E075
S315000051C0205F588F4ED04E714E714E7148E7031CCA
S315000051D033C000A001402A6F0018266F001C0C5532
S315000051E0FFFF6712301548C0E5880680000267 6831
S315000051F020402850600299CC0C53FFFF67123013F1
S31500005200 48C0E5880680000267682 0402A50600290
S315000052109BCD2F0C6100FE663C002F0D6100FE5EEB
S3150000522 03E004A4667204A476718202C000CB0AD5E
S3150000523 0000C671AB0AD000C64047EFF60127E019C
S31500005240600E70FF600C4A476704700160044247B5
S31500005250300733C000A001424CDF38C0205F508FBA
S3150000526 04ED04E714E714E7148E7010C33C000A00E
S3150000527 0014442472A7C00026760287C00C04566DC
S31500005280300748C0D0800C75FFFF08006720320742
S31500005290 48C1D2813035180048C0E5880680000232
S315000052A06768204 02F106100FDD44A40660E300723
S315000052B048C0D08039BCFFFF080060123 20748C1E1
S315000052C0D281300748C0D08039B5180008005247 4F
S315000052D00C4700046DAA4879000051CC48780002BA
S315000052E0487800042F0C4EB9000234B233C000A037
S315000052F001464CDF30804E754E714E714E7148E757
S3150000530 0010433C000A00148227900C00106207CB8
S31500005310 00C00C2C701020D951C8FFFC0279E0FFA8
S31500005320 00C00C30007903 0000C00C3023F900C027
S31500005330456E00C00C2C700F207900C00580C06837
S315000053400001002 79FFF000C00C30817900C00C30EB
S31500005350424732077008D0B900C001062A4030150E
S31500005360E44802400001DE403015E64802400001F4
S31500005370DE403015EA48024007FF4A4063025247C2
S3150000538052415 88D0C41000F6DD4300733C000A038
S31500005390014A4CDF20804E754E714E714E7148E7C2
S315000053A0010C33C000A0014C4FEFFDA4302F026C5E
S315000053B048C0D030068000C00C7020403E109BCDB7
S315000053C0602A302F026C48C0E188068000C00A2C93
S315000053D0320748C1E589D081204028504857 2F0C14
S315000053E06100086E4A8067022A4C53474A476D049B
S315000053F0200D67CE200D4FEF025C33C000A0014E9A
S31500005400 4CDF3080205F548F4ED04E714E714E71FE
S315000054102F0733C000A0015C4FEFFFEC0CB903FF7C
S31500005420FFFF00C0456E65483F3C00803F3C0037AB
S3150000543043EF00086100168E486F000443EF000436
S315000054406 1001BB44A97671C3F3C0080487900C046

S3150000545005CC206F0006486800104EB900003C22BB
S315000054603E0060027E014A476608611C3E006002FB
S315000054707EFF30074FEF001433C000A001522E1FED
S315000054804E754E714E714E7148E7010C33C000A047
S315000054900154 4FEFFD906100FE664A40670000969A
S315000054A03F3C00113F3C003343EF000861001616F5
S315000054B0486F000443EF000461001B3C2A57200D8F
S315000054C067723F3C0011487900C00C2C486D0010F3
S315000054D04EB900003C223E00200D675A4A476656E8
S315000054E0486F00142F0D610001044A406646287C6F
S315000054F000C00A282F14486F00182F0D610002E221
S315000055003E00662C486F00142F0D610007444A8048
S31500005510671E43EF0014207C00C007CC203C00002F
S315000055200009620D951C8FFFC28BC00C007CC6006F5
S3150000553042946 0027EFF30074FEF027033C000A036
S315000055400 1564CDF30804E754E714E714E7148E7F4
S3150000555001 0433C000A00158598F487800414879AA
S315000055600 0C00C744EB9000014942F3900026790E5
S3150000557061 00FB0A4A4067604BD72ABC0007C0009F
S315000055806 03A4A9566082E3C0000FFFF60122055DF
S315000055903028000 2720AE2680240003F7E003E00A8
S315000055A02007E588068000C00C742040209523D58E
S315000055B000C00D742F15224D610013E20C950007F3
S315000055C0C00065142015B0B900080000640A204028
S315000055D00C68FFFF000266AA588F33C000A0015A6C
S315000055E04CDF20804E754E714E714E7148E7071C98
S315000055F033C000A0015C598F266F00202A6F00245B
S315000056002EB90002648442450CB903FFFFFF00C0B7
S31500005610456E650001B0200D670001AA200B670CEA
S31500005620 01A4487800972F0D4EB900001494303C21
S315000056300 00FFC045E148025700FF815749ED0004CD
S31500005640 4BEB001847EF00027CFF6000016608AFD5
S3150000565000020002082F000200026612302D00022E
S315000056607 20DE268024000014A40660E6024301561
S315000056 70E448024000014A406718302F0002720ACF
S315000056 80E26802400001720032 00E58920012986A5
S315000056900800082F00C20002661230 2D0002720E6A
S315000056A0E268024000014A40660E60243015E64872
S315000056B0024000014A406718302F0002720AE26871
S315000056C00240000172003200E589200129860 8089F
S315000056D0082F000200026612302D0002720FE268E7
S315000056E0024000014A40660E607E3015EA480240DC
S315000056F007FF4A4067720257FF006040302F0002E2
S31500005700720AE268024000017E003E0041EC001091
S315000057102007D080D087E588D1C03017024000FF2F
S3150000572072003200E589D1C120863017024000FFA1
S315000057305240024000FF0257FF0081574A45662843
S31500005740082F0002000266047E0360123015024034
S315000057500003720302810000FFFF82C03E01301782
S31500005760024000FFB0476594302F0002720AE268DB
S3150000577002400001524002400001E36808AFC00207
S315000057800002816F0002302F0002E2680240000131
S315000057904A406600FEC03017E048024000FF524013
S315000057A0024000FFE148025700FF815749EC0028FC
S315000057B0588D3017E048024000FF0C40000F65008E
S315000057C0FE8E60027A013005588F33C000A0015E5C
S315000057D04CDF38E0205F508F4ED04E714E714E71C7
S315000057E048E7273E33C000A001604FEFFFD84DEFDA
S315000057F0001C2A6F00542CB90002648842450CB97B
S3150000580003FFFFFF00C0456E650004264AAF005047
S315000058106700041E200D670004184EB900008DBEF7
S31500005820303C00FFC045E148025600FF815645ED79
S3150000583000047018D0AF00502840367CFFFF60008F
S315000058402D808AF0002001E322F001E740AE46957
S315000058500241000174003401E58A22022032180058
S31500005860B08B66000130302F001E720AE2680240DB
S3150000587000013F00206F0052486800102F0C6100A5
S3150000588026123F003F3C003243EF0008610012360B
S31500005890486F000443EF001C6100175C4AAF001814
S315000058A0670000F27010D0AF00182F40001420409F
S315000058B02210B28B660000DE7014D0AF00182A40AA
S315000058C0026F0FFF001E60C0009A0256FF0060483C
S315000058D02015B08B662E202D0004B08B6626204F37
S315000058E02F2800583F3C00082F1643EF002A61007E
S315000058F00D9E3F3C0004486F00222F0D4EB900005C
S315000059003BA08A403016024000FF5240024000FF92
S31500005910 0256FF008156508D082F0002001E6604B5
S315000059207E0360123014024000037203028100 00FD
S31500005930FFFF82C03E013016024000FFB04765906F
S31500005940 0256FF00302F001E720CE2680240000F64
S315000059505240024000 0FE368026F0FFF001E816F86
S31500005960001E302F001E720CE2680240000F206FEE
S31500005970005032280014024 1000FB0416500FF4C70
S315000059803F3C00012F0E204F2F28001A4EB9000071
S315000059903C228A40322F001E740AE469024100014B
S315000059A074003401E58A220220321808B08B66584A
S315000059B0302F001E720AE268024000013F00206F8D
S315000059C0005248680 0102F0C6100256A3F003F3CDA
S315000059D0003143EF0008610010EC486F000443EF0C
S315000059E0001C610016124AAF0018671C7010D0AF79
S315000059F000182A402015B08B660E3F3C00012F0E82
S31500005A002F0D4EB900003C22303CFFE0C054670029
S31500005A1000BE0256FF0060000088302F001E720A8A
S31500005A20E268024000017E003E0041EA00102207C3
S31500005A30D281D287E589D1C13216024100FF7400B6
S31500005A403401E58AD1C22010B08B66422F0C61006A
S31500005A5024063F003F3C003043EF0008610010661B
S31500005A60486F000443EF001C6100158C4AAF001814
S31500005A70671C7010D0AF00182A402015B08B660E38
S31500005A803F3C00012F0E2F0D4EB900003C22301670
S31500005A90024000FF5240024000FF0256FF008156BE
S31500005AA04A45662A082F0002001E66047E0360121D
S31500005AB0301402400003720302810000FFFF82C01F
S31500005AC03E013016024000FFB0476500FF4E302F02
S31500005AD0001E720AE26802400001524002400001C4
S31500005AE0E36808AF0002001E816F001E302F001E03
S31500005AF0E268024000014A406600FD4E3016E0486A
S31500005B00024000FF5240024000FFE148025600FFFB
S31500005B10815645EA0028588C3016E048024000FFBE
S31500005B200C40000F6500FD1C08AF0002001E2A7C19
S31500005B30000001526287C00E000E20256FF00600007
S31500005B40008402 5600FF605C302F001E720AE26875
S31500005B50024000017E003E003016024000FF7C003D
S31500005B603C00487800012007ED889087E788D08CB4
S31500005B703216E049024100FF3401C4FC00A8D0827D
S31500005B802206D281D286E589D0812F004E95301625
S31500005B90E048024000FF5240024000FFE148025642
S31500005BA000FF81563016E048024000FF0C40000E10
S31500005BB0659630160240 00FF5240024000FF025632
S31500005BC0FF00815630160240 00FF0C4000036500BE
S31500005BD0FF72302F001E720AE26802400001524036
S31500005BE002400001E36808AFC002001E816F001E3C
S31500005BF0302F001EE268024000014A406600FF3C6A
S31500005C0048780001487900E004D24E953F3C0000F8
S31500005C103F3C003443EF000861000EAA486F0004C1
S31500005C2043EF0004610013D04EB900008DDA600224
S31500005C307A0130C54FEF002833C000A001624CDF27
S31500005C407CE4205F4FEF000C4ED04E714E714E71CA
S31500005C5048E73F3E33C000A00164518F266F0038ED
S31500005C602C6F003C7CFF2A7C00C0456E263C03FF5F
S31500005C70FFFF2015B083650003802 00E6700037ABE
S31500005C80200B670003742F0E2F0B6100F9602C8B1D
S31500005C9049EF0004288B7C0145EF00027AFF2F14A0
S31500005CA0224C61000CF84A946318205420280004 02
S31500005CB0B0AB0010670CB08364E4202B0010B095E5
S31500005CC066DC4A94670001184A946712205430280B
S31500005CD00002720AE2680240003F3E0060043E3C59
S31500005CE0FFFF30070640FFD00C40000462 0000F6BC
S31500005CF0D040303B00064EFB0002008E004C000AEE
S31500005D0000E400E820542EA800102017B085670094
S31500005D1000D43017E048024000FF7E003E0041EE0E
S31500005D2000042007E588D087E788D1C0302F00021D
S31500005D30720AE26802400001720032 00E589D1C1B0
S31500005D4020946 00000A020542EA800102017B085D3
S31500005D50670000923017E048024000FF7E003E00D8
S31500005D6041EE00042007E588D087E788D1C0508837
S31500005D70302F0002720AE26802400001720032000F
S31500005D80E589D1C12094605C20542EA8001020170C
S31500005D90B08567503017E048024000FF78003800B1
S31500005DA0302F0002720AE268024000017E003E00C7

S31500005DB041EE00042004E588D084E788D1C041E89C
S31500005DC000102007D080D087E588D1C03017024068
S31500005DD000FF72003200E589D1C1209460067CFF85
S31500005DE0600242460C4600016700FEB44A46660061
S31500005DF002084297025700FF49EE00044BEB0018D9
S31500005E00600001E208AF00020002082F0002000253
S31500005E106612302D0002720DE268024000014A400F
S31500005E20660E60443015E448024000014A40673877
S31500005E30322F0002740AE469024100017400340141
S31500005E40E58A22022034180OB085671A302F000236
S31500005E50720AE268024000017200320OE589200100
S31500005E604AB4080066027C01082F0002000266128E
S31500005E70302D0002720EE268024000014A40660EB2
S31500005E8060443015E648024000014A406738322F28
S31500005E900002740AE4690241000174003401E58AD3
S31500005EA0220220341808B085671A302F0002720AC1
S31500005EB0E268024000017200320OE58920014AB41E
S31500005EC0080866027C01082F0002000266143 02DC5
S31500005ED00002720FE268024000014A40661260004A
S31500005EE000BA3015EA48024007FF4A40670000AC96
S31500005EF00257FF006076302F0002720AE268024005
S31500005F0000017E003E0041EC00102207D281D287BC
S31500005F10E589D1C13217024100FF74003401E58AD8
S31500005F20D1C22010B0856730302F0002720AE268B5
S31500005F30024000017E003E0041EC00102007D080A8
S31500005F40D087E588D1C03017024000FF72003200CA
S31500005F50E589D1C14A9066027C013017024000FFF4
S31500005F605240024000FF0257FF0081574A46662A08
S31500005F70082F0002000266047E03601230150240FC
S31500005F800003720302810000FFFF82C03E0130174A
S31500005F90024000FFB0476500FF5E302F0002720A24
S31500005FA0E268024000015240024000001E36808AF87
S31500005FB000020002816F0002302F0002E2680240F8
S31500005FC000014A406600FE443017E048024000FFE8
S31500005FD05240024000FFE148025700FF815749EC5A
S31500005FE00028588D4A4666103017E048024000FFE8
S31500005FF00C40000F650CFE0E4A466604200E600245
S3150000600070005 08F33C000A001664CDF7CFC205F1F
S31500006010508F4ED04E714E714E7148E7273E33C0B9
S315000060200 00A001684FEFFFF4267900C00A287C0122
S3150000603 02C530CB903FFFFFC0C0456E650002122A
S31500006040200B6700020C200E670002064EB9000006
S3150000605 08DBE424645EF000A303C03FFC046025251
S315000060 60FC008152303C00FFC046026FFF00000872
S31500006070816F00083006024000001720AE368089248
S3150000608000028152303C00FFC046E148026F00FF2B
S3150000609000008816F00084BEE00187AFF6000019A35
S315000060A0082D00030001660A082D0C06000267009D
S315000060B0016A302F0008E04802400CFF7E003E00E3
S315000060C041EB00042007E588D087E788D1C028483F
S315000060D0026F0FFF000A6000012808AF0002000AE5
S315000060E0302F000A720AE268024000017200320094
S315000060F0E58920014AB40808670000BA026FFF006C
S3150000610000086000000842F0542A72F0B204F2F2880
S31500006110001443EF00106100127230 2F000A720C57
S31500006120E2680240000F7E003E003F3C0004486FDC
S3150000613000027014322F0010740AE4690241000153
S31500006140740034 01E58A2202D0B418082207D281ED
S31500006150D287E789D081322F000E024100FF7400FA
S3150000616003401E78AD0822F004EB900003BA08C4054
S31500006170302F0008024000FF5240024000FF026F2D
S31500006180FF000008816F0008082F0002000A66045D
S31500006190 7E03601230150240000372030281000084
S315000061A0FFFF82C03E01302F0008024000FFB047CB
S315000061B06500FF54302F000A720AE2680240000 1AF
S315000061C05240024000 01E36808AF0002000A816FF6
S315000061D0000A302F000AE268024000014A406600C9
S315000061E0FF00302F000A720CE2680240000F524096
S315000061F00240000FE368026F0FFF000A816F000A7A
S31500006200302F000A720CE2680240000F322E001492
S3150000621002410 00FB0416500FEC2302F0008E04881
S31500006220024000FF5240024000FFE148026F00FFBB
S3150000623000008816F0008588D302F0008E0480240A2
S31500006240 00FF0C40000E6500FE584EB900008DDAC6
S31500006250 30064FEF000C33C000A0016A4CDF7CE42F
S31500006260 4E754E714E714E7148E73F3E33C000A0E9
S3150000627 0016C4FEFFFE645EF000824B9000264 8E7B
S315000062802C7900C00A280CB903FFFFFF00C0456E39
S3150000629 06500032C200E670003262F5600164AAF12
S315000062A000166700031A4243303C00FFC043E14832
S315000062B0025200FF81527018D0AF00162640243CCF
S315000062C000015180600002E63013EA48024007FFF1
S315000062D03C004A46670002BE2002320648C14EB95B
S315000062E00022F662E00203900E0000422074EB976
S315000062F000253E0223900C000FA2F4100042207B1
S315000063002E80202F00044EB9000253E02217B280DF
S31500006310 66384AB900C000F66700027A203900C024
S31500006320 00F622074EB9000253E0223900E00004CD
S31500006330 2F41000422072E80202F00044EB90002B0
S315000063405 3E02217B2806700024C203900E00004B7
S3150000635022024EB9000253E02C00206F00162028BE
S315000063600 0084EB9000253E0BC80660002282039BE
S31500006370 00E0000422022F4000042006C1414EB96D
S3150000638000025A82C14193AF0004202F0004220765
S31500006390 4EB9000253E02A0008AF0002000A082F97
S315000063A00002000A66047801600830130240000308
S315000063B03800082F0002000A6614302B0002720F04
S315000063C0E268024000014A40661260000 19A3013FA
S315000063D0EA48024007FF4A406700018C0252FF006C
S315000063E06000015E2F0E2F12610001EE2A4030057B
S315000053F048C0D080D08D670001363005 48C0D080B7
S3150000640 00C75FFFF0800660001263012E0480240C6
S31500006410 00FF0C40000E644C302F000A720AE2683E
S3150000642002 4000017C003C003012E048024000FFC0
S31500006430 7E003E002006ED889086E788068000E014
S31500006440 00E23212024100FF2F4000043001C0FC7E
S31500006450 00A8D0AF00042207D281D287E589D08177
S31500006460 2840601A3012E048024000FF0640FFF262
S3150000647 072003200E789068100E004D2284130121A
S31500006480E048024000FF0C400003670E3012E0486F
S31500006490 024000FF0C40000866082F124EB90001AA
S315000064A043C23012E048024000FF720032 00D2813F
S315000064B00681000007BC20413F102F2C00042F143A
S315000064C043EF000E4EB900019370204F2F280004B1
S315000064D043EF00184EB9000191A6204F558F3EA8F4
S315000064E00014300548C0D080D08D2F00610016768C
S315000064F04A40670476016036 3012E048024000FFE9
S31500006500 72003200D2810681000007BC20413F1094
S31500006510204F558F3EA8001643EF00104EB90001DC
S31500006520 92FC486F000C2F0C4EB9000195F8301202
S31500006530024000FF5240024000FF0252FF0081521B
S315000065403012E048024000FF0C40000E65047E0158
S315000065506008700348C081C43EC03012024000FF4C
S31500006560B0476500FE80302F000A720AE2680240DA
S315000065700001524002400001E36808AF0002000A31
S31500006580816F000A302F000AE268024000014A408B
S31500006590 6600FE0C3012E048024000FF5240024006
S315000065A000FFE148025200FF8152588B3012E0484A
S315000065B0024000FF0C40000F6500FD0E60027601F0
S315000065C030034FEF001A33C000A0016E4CDF7CFC95
S315000065D04E754E714E714E7148E7210C33C000A0C6
S315000065E00170226F001899CC20096700008A302FAD
S315000065F00014E048024000FF7E003E0041E900042E
S31500006600 2007E588D087E788D1C02A48200D67662D
S31500006610302F0016720AE268024000017E003E003A
S31500006620 41ED00102007D080D087E588D1C0302FFB
S31500006630 0014024000FF72003200E589D1C14A9081
S31500006640 6734302F0016720AE268024000017E00AD
S315000066503E00701441ED00102207D281D287E589F1
S31500006660D1C1322F0014024100FF74003401E58AC3
S31500006670D1C2D0902840200C33C000A001724CDF5C
S315000066803084205F508F4ED04E714E714E714E56F3
S31500006690FFE248E73F3C33C000A001742D49FFFCF0
S315000066A045EE00083C2E000C286E000E227C0002EF
S315000066B0647A41EEFFF420D9209143EEFFF441EED7
S315000066C0FFEC20D92091200C67042A5460029BCD50
S315000066D0200D6622302E000A024003FF3F006100B3
S315000066E0140A3212E049024100FF74003401E58ABF
S315000066F0D0822640601641ED00183012E048024074
S31500006700 00FF72003200E589D1C12648082B00043B

S315000067100001660408C60000303C03FFC06E000A94
S315000067206704O8C60003283C00015180200C67203E
S31500006730200D671C3013EA48024007FF3E004A4717
S3150000674O6F0E2004320748C14EB900022F6626009C
S31500006750267C000194DC200C6740200D673C202D30
S315000067600008220 44EB9000253E04EB900025A82D4
S315000067702A00080600016622200C671E3006024029
S3150000678000013F002F0C2F1243EEFFE4610010E4DE
S3150000679O486EFFE4486EFFF44E93200C670000C27B
S315000067A0200D670000BC08060002660000B44A47D8
S315000067B06F0000AE2F0C2F126100FE1E2A404A8089
S315000067C06700009E2E05607C0806000066242F07E1
S315000067D043EEFFE24EB90001900A302E000A720C19
S315000067E0E2680240000F41EEFFE242411210B04162
S315000067F0664E200D674A0C55FFFF674423CD00C047
S31500006800 00F233D500C000F0307C0018D1D430122D
S31500006810E048024000FF72003200E589D1C130280D
S315000068200000 20240003F3F00558F3E9543EEFFE4D5
S3150000683 04EB9000192FC486EFFE4486EFFEC4E93A1
S31500006840DE83548D2004D085BE80640ABEB900C0A4
S315000068500 0FA6500FF74486EFFEC486EFFF44E9335
S31500006860080600036 60000CC08060000662A2F39D9
S315000068700 00C000FA43EEFFE24EB90001900A302E46
S31500006880000A720CE2680240000F41EEFFE242414C
S31500006890 1210B0416600009C3012E048024000FF32
S315000068A00C40000E5446302E0C0A720AE26802406E
S315000068B000017C003C003012E048024000FF7E00F0
S315000068C03E002006ED889086E788068000E000E21C
S315000068D03212024100FF3401C4FC00A8D082220714
S315000068E0D281D287E589D0812A40601A3012E048E9
S315000068F0024000FF0640FFF272003200E78906817F
S315000069 0000E004D22A413012E048024000FF0C4069
S31500006910 0003670E3012E048024000FF0C400008FA
S31500006920 66082F124EB9000143C22F0D486EFFF4C0
S3150000693 04E9343EEFFF4206EFFFC20D9209133C026
S31500006940 00A001764CDF3CFC4E5E205F4FEF000A54
S31500006950 4ED04E714E714E714E56FFF433C000A0AC
S31500006960 01782D49FFFC2F3900C00A283F2E000C64
S3150000697 02F2E000843EEFFF4610 0FD1443EEFFF4F2
S31500006980206EFFFC20D9209133C000A0017A4E5E14
S31500006990205F5C8F4ED04E714E714E714E56FFF495
S315000069A048E7231C33C000A0017C2D49FFFC4BEEB9
S315000069B0000849EEFFF842944A95670000E8205522
S315000069C00C68FFFF0002670000DA267C0002676899
S315000069D030280002720AE2680240003F0C4000358F
S315000069E066220CA803FFFFFF000462183028000 28D
S315000069F0024003FF72003200E589200128B3080037
S31500006A00600000A27010D0952055322800020 24185
S31500006A1003FF74003401E58AD082288020400C6888
S31500006A20FFFF0002670A3010225530690002677442
S31500006A302F156100E6BC3C000C46000A6764300670
S31500006A4048C0E5882D730800FFF4429442472A7C2B
S31500006A5000C0456660363007 48C0D080BC75080067
S31500006A60562852470C4700046C20300748C0DC8087
S31500006A700C75FFFF080057123207 48C1D281303516
S31500006A80180048C0E58828B3080052473007 48C0B8
S31500006A90D0800C75FFFF0800670A0C4700046C04E1
S31500006AA060B44294224C206EFFFC209133C000A0BB
S31500006AB0017E4CDF38C44E5E205F588F4ED04E713B
S31500006AC04E714E714E56FFEC48E72F0433C000A0BE
S31500006AD001802D49FFFC3E2E00084AB900C000F691
S31500006AE067200CB90F0C3F0000C000FA650C0C477C
S31500006AF0000A670E0C47001E67082839 00C000F61A
S31500006B00 6006283900C000FA2A7900C00E54200D0C
S31500006B10671241ED0010300748C0E788D1C02A2827
S31500006B20000460027A00300748C0E588068000C08D
S31500006B300D7820404A906714300748C0E788068 0E1
S31500006B4000 0C005CC20402C28000460324A8563042E
S31500006B502C05602A300748C0E588068000C00C7402
S31500006B60 20404A906716300748C0E588068000C076
S31500006B700C74224020512C28000C60027C00703FCF
S31500006B80C047720AE368026E03FFFFEE816EFFEEF6
S31500006B90303C03FFC06E000A026EFC00FFEE816E01
S31500006BACFFEE200652802D40FFF82039008040106D
S31500006BB0E0887203C2B9008040107418E5A9D0813C
S31500006BC02D40FFF02D44FFF443EEFFEC206EFFFC5A
S31500006BD0700320D951C8FFFC33C000A001824CDFEE
S31500006BE020F44E5E205F588F4ED04E714E714E711E
S31500006BF048E73F3E33C000A00184518F47EF00387D
S31500006C002A6F003C4247302D0002720AE2680240B9
S31500006C10003F3C00302D0002024003FF3F400006CB
S31500006C202F136100E4CC380C0C44000A57C044001E
S31500006C3048803A0066204AB900C00E546718307C76
S31500006C40 0010D1F900C00E54300648C0E788D1C004
S31500006C502428000460027400307C00B8D1F900C01A
S31500006C600106300648C0D080D1C03010E24802404C
S31500006C7003FF3E800C44FFFF6700035E0CAD0F0C64
S31500006C803F00000863000 3564A456716300648C0B1
S31500006C90E588068000C00C742840247C00C00D7472
S31500006CA06014300648C0E588068000C00D7828408C
S31500006CB0247C00C00E7830045 24048C0E588068027
S31500006CC00002676820402F5000024A45660A0C46BB
S31500006CD000036704761460027604200 3E58891AF0A
S31500006CE000027010D093322F000648C1E589D0818A
S31500006CF0B0AF0002651242934A45670608C7000016
S31500006D00605A08C70001605 43C2D0002720AE2681A
S31500006D100240003F72003200068100030D982041B8
S31500006D200810000067123 02D0002720AE268024065
S31500006D30003F0C40003366244A9467202054 2028E4
S31500006D4000 0C9082321748C1B081651042934A45C3
S31500006D50670608C70002600408C700034A476600C2
S31500006D60027C0C46003667142053302800020 2408D
S31500006D7003FF72003200 5881E589D3934A93670076
S31500006D8002522C530C68FFFF00026600C2462C7C6C
S31500006D900080400814161CBC00803F3C0007486D6C
S31500006DA0000220534868 00024EB900003BA08E4006
S31500006DB00CAD03FFFFFF0004626428932493327C2A
S31500006DC00008D3D3300648C0E788068000C005CC4B
S31500006DD0204020D920914A936606363CFFFF60107A
S31500006DE02053302800 02720AE2680240003F360053
S31500006DF00C43001E670E7004D0B900C00E7823C085
S31500006E000 0C005884A4766160C46003666103F04E1
S31500006E10205348680 0104EB90001B2C48E404A455E
S31500006E2066 0623D300C000EC701CD093322F000604
S31500006E3048C1E589D0812F4000024A4766123F2D9E
S31500006E400002204F2F2800044EB90001B2C48E4024
S31500006E501C824A47660001860CAD03FFFFFF000453
S31500006E606300017A20532F28000 46100DBE23C0016
S31500006E704A466F000168302D0002720AE268024 03D
S31500006E80003F0C400033666C7A3FCA6D000E300638
S31500006E9048C0E188068000C00A2C320548C1E58951
S31500006EA0D081204020932A7C00C00C70300648C058
S31500006EB0D0804A7508006D2E2053202800 0C32061B
S31500006EC048C1E189068100C00A2C360648C3D6832C
S31500006ED0343538 0048C2E58AD28222412051B0A812
S31500006EE0000C630000F8300648C0D0803B850800DF
S31500006EF0600000EA302D0002E2680240003F0C40CC
S31500006F0000 03766687A3FCA6D000E300648C0E188D1
S31500006F10068000C00B2C320548C1E589D0812C408F
S31500006F20 20932A7C00C00C72300648C0D0804A7577
S31500006F30 08006D2C20532028000C320648C1E18938
S31500006F40068100C00B2C360648C3D683343538007C
S31500006F5048C2E58AD28222412051B0A8000C637C47
S31500006F60300648C0D0803B8508006070302D000296
S31500006F700E2680240003F0C4000396612300648C005
S31500006F800E588068000C00E8020402093604E302D9C
S31500006F90 0002E2680240003F0C40002B66123006F9
S31500006FA048C0E588068000C00E8420402093602CEF
S31500006FB0302D0002E2680240003F0C40002F661CA4
S31500006FC0300648C0E588068000C01CF020402093AB
S31500006FD0600A08C70004600408C700013007508F24
S31500006FE033C000A001864CDF7CFC205F508F4ED062
S31500006FF04E714E714E714E56FFDE48E7033C33C06C
S315000070000 00A001882D49FFFC47EEFFF82A6E000814
S3150000701042933 02D0002720AE2680240003F3E00B1
S31500007020 0CB90F0C3F0000C000FA620A4AB900C052
S3150000703 000F667000120287C00C000EC0C470036F3
S3150000704066 0000B26100DF103E000C47FFFF6612CB
S3150000705061 00DFC23E000C47FFFF66063E390002B4
S315000070606 76045EEFFF424944A92675E2F12610032

S31500007070E0803C000C46FFFF6750026E03FFFFF204
S315000070800006ED400FFF2303C03FFC047026EFC00E5
S31500007090FFF2816EFFF23F2EFFF220524868000297
S315000070A04EB90001B2C4300648C0E588068000229
S315000070B067682040269020129093E4803F0020537A
S315000070C0486800124EB90001B2C43F074EB900012C
S315000070D0B266300748C0E58806800002676820402F
S315000070E026902F0D2F136100FB086100E17C6100E3
S315000070F0D97860604A94661C3F3C00013F3C0036EC
S31500007100043EEFFE26100F9BE486EFFE243EEFFDEAA
S315000071106100FEE42F0D2F146100FAD63E00080729
S315000071200000167263F3C00013F3C003643EEFFE28C
S315000071306100F992486EFFE243EEFFDE6100FEB8A1
S315000071402F0D2F146100FAAA3E004A4766042694C2
S3150000715060024293224B206EFFFC209133C000A0B8
S31500007160018A4CDF3CC04E5E205F588F4ED04E7178
S3150000717004E714E7148E7073E33C000A0018C4FEFB9
S31500007180FFEC3C2F00383A2F003A2A6F003C42476A
S31500007190287C00C00D74247C00006AC42C7C00008E
S315000071A06BF00C46002166460CB90F0C3F0000C080
S315000071B000FA630001204AB900C00E786700011684
S315000071C04A94670001103F073F3C003643EF000436
S315000071D04E9248572F144E963F073F3C002143EFEF
S315000071E000044E9248572F144E96600000E80CB9E2
S315000071F00F0C3F0000C000FA620A4AB900C000F650
S31500007200670000D047EF00104A94662E26B90002A8
S3150000721067902F136100DE664A40661E3F3C000AF7
S3150000722004EB90001B2663F3C00013F3C003643EFD9
S3150000723000044E9248572F134E963F053F0643EFE4
S3150000724000044E92307C00B8D1F900C001067000EF
S3150000725030006D080D1C008280000000167324857A8
S315000072602F144E963E0066284A456724200D672057
S315000072703F052F0D70003006E588068000C00C74AF
S3150000728022402051486800104EB900003C228E4032
S31500007290307C00B8D1F900C0010672003206D281F6
S315000072A0D1C1301008000000F672A4857224B6100F1
S315000072B0FD464A93671C4A45671A200D67163F0527
S315000072C02F0D2053486800104EB900003C228E4016
S315000072D060027E0130074FEF001433C000A0018E1C
S315000072E04CDF7CE0205F508F4ED04E714E714E7158
S315000072F033C000A0019042A73F3C0000204F3F282A
S3150000730000A6100FE7033C000A00192205F548F16
S3150000731004ED04E714E714E714E56FFFC33C000A0DA
S3150000732001942D49FFFC7000302E0008E588068088
S31500007330000C00C742240206EFFFC209133C000A0D8
S3150000734001964E5E205F548F4ED04E714E714E7137
S315000073504E56FFFC33C000A001982D49FFFC70007B
S31500007360302E0008E788068000C005CC2240206E3B
S31500007370FFFC20D9209133C000A0019A4E5E205F09
S31500007380548F4ED04E714E714E714E56FFE648E701
S315000073903F3C33C000A0019C2D49FFFC286E000C29
S315000073A0227C0002649241EEFFF420D92091200C49
S315000073B0670001B62654263C00015180202B0008A8
S315000073C022034EB9000253E04EB900025A82280049
S315000073D02D44FFF841EB0018302E0008E04802402B
S315000073E000FF72003200E589D1C12A48303CFFE037
S315000073F0C0556700017420033215EA49024107FFB0
S315000074007400340122024EB900022F662C002F0CA4
S315000074102F2E00086100F1C22A40247C00C001061C
S31500007420200D6700010C49EEFFF028847A01600008
S3150000743000F2202EFFF0B0AE0010650000DA7000FA
S315000074403006D0AEFFF0B0AE0014620000CA302B9A
S3150000745000140240000F0C40000167282F2EFFF099
S3150000746043EEFFEA4EB90001900A302E000A720C74
S31500007470E2680240000F41EEFFEA42411210B041BD
S31500007480660000942D7C00000000FFEC205230289E
S31500007490006024000FFBA40657C42476044300760
S315000074A048C04480D080D08D6736300748C04480BD
S315000074B0D0800C75FFFF08006726300748C044805F
S315000074C0D080558F3EB5080043EEFFE84EB9000167
S315000074D09150486EFFE8486EFFEC4EB9000214FA70
S315000074E05247205230280006024000FFBE4065AEDB
S315000074F0486EFFF4486EFFEC4EB9000218164A407B
S315000075006F142D6EFFECFFF4202EFFF07200320692
S31500007510D0812D40FFF870003006D1AEFFF0524505
S31500007520548D2003D084222EFFF0B2806500FF0424
S31500007530205230280006024000FFC0C6323C0E1022
S3150000754002810000FFFF82C03001486EFFE6028024
S3150000755000000FFFF4EB900023A48486EFFE6486E4B
S31500007560FFF44EB90002153043EEFFF4206EFFFC27
S3150000757020D9209133C000A0019E4CDF3CFC4E5E1A
S31500007580205F4FEF00104ED04E714E714E714E5629
S31500007590FCA848E7033C33C000A001A02D49FFFC2E
S315000075A02E2E000C2C2E0010227C0002649A41EE36
S315000075B0FCA8703920D951C8FFFC45EEFD7824AEF1
S315000075C0000082007223C000151804EB9000253E01A
S315000075D0C1414EB900025A82C1412D41FD842D465A
S315000075E0FD882D7C00000000FFF442AEFFF849EE56
S315000075F0FD902D7C00003102FD7C47EEFFEC605CC7
S315000076002F0C2F2EFD78610005C22A404A80670C98
S31500007610202D0004B0876504B08663122F062F075D
S315000076202F0C2F2EFD78224B6100FD606008224D45
S31500007630204B20D92091486EFFF42F0B4EB9000243
S3150000764018164A406F16202EFFF0B087650EB086DA
S31500007650620A224B41EEFFF420D920912F0C486E8E
S31500007660FCA84EB900019ED44A00669443EEFFF48E
S31500007670206EFFFC20D9209133C000A001A24CDF70
S315000076803CC04E5E205F4FEF000C4ED04E714E71E7
S315000076904E7148E7230433C000A001A4598F227C11
S315000076A000C001024AB900C00E78670000822A7C39
S315000076B000C005880839000700C00E8866682C3CA3
S315000076C003FFFFFF203900804010E0887203C2B933
S315000076D0008040107418E5A9D08120559090CC8088
S315000076E04A7900C01EC466047E006028200632392E
S315000076F000C01EC448C1243C009896802E802002FB
S315000077004EB900022F66220020174EB9000253E040
S315000077102E802E004A95671C2006D0872055D0A8BB
S31500007720000422806010205522A80004600842B997
S3150000773000E00004291588F33C000A001A64CDF44
S3150000774020C44E754E714E714E7148E7270C33C0FA
S3150000775000A001A83A2F001C9BCD7CFF4247287C45
S3150000776000C00A2C300548C0E188D08C320748C1D9
S31500007770E589D08120402F10610012164A40673EED
S315000077802F0D6100120C4A40671E320548C1E1897F
S31500007790D28C340748C2E58AD28222412051202861
S315000077A0000CB0AD000C6416300548C0E188D08CE2
S315000077B0320748C1E589D08120402A503C0752470C
S315000077C00C4700406D9E300633C000A001AA4CDF76
S315000077D030E4205F548F4ED04E714E714E7148E7A3
S315000077E0270C33C000A001AC3A2F001C9BCD7CFFB8
S315000077F04247287C00C00A2C300548C0E188D08C5E
S31500007800320748C1E589D08120402F1061001182DE
S315000078104A40673E2F0D610011784A40671E3205C7
S3150000782048C1E189D28C340748C2E58AD282224116
S3150000783020512028000CB0AD000C6316300548C05E
S31500007840E188D08C320748C1E589D08120402A5092
S315000078503C0752470C4700406D9E300633C000A0DF
S3150000786001AE4CDF30E4205F548F4ED04E714E7126
S315000078704E714E56FFF448E73F3C33C000A001B0BE
S315000078802D49FFFC266E000C227C00027D9041EE05
S31500007890FFF420D92091200B6700022A2A53200DDD
S315000078A067000222302D0014E0480240001F3A0013
S315000078B0302E0008E048024000FF72003200E589E1
S315000078C0303518180240000338004A44660C0C454F
S315000078D000186D04780360023805302D001402404C
S315000078E0000F3C0045EE000A082E00000011670854
S315000078F042473606534360283012720CE268024053
S3150000790000FB0466506424776FF60143012E26803
S315000079100240000F3E003012E2680240000F3600EF
S315000079203C076000019A302E0008E048024000FF44
S315000079307E003E0041EB00042007E588D087E788FB
S31500007940D1C02848302E000A720AE26802400001BF
S3150000795072003200E58920014AB408006700015E22
S315000079609BCD082E0002000A670848C58BC460003C
S31500007970000230050C40000167280C400002674AEF
S315000079800C400003676C0C400008670000920C4036
S31500007990000C670000B00C400018670000D46000BF
S315000079A000FA7014322E000A740AE46902410001DA
S315000079B074003401E58A2202D0B41800320648C1A8
S315000079C0E789D0812A40600000D27014322E000A66

S315000079D0740AE469C241000174003401E58A220256
S315000079E0D0B41800320648C1E989D0812A40600027
S315000079F000AA3E0648C77014322E000A740AE469CB
S31500007A000241000174003401E58A2202D0B4180054
S31500007A102207D281D287E789D0812A40607C701400
S31500007A20322E000A740AE46902410001740034012E
S31500007A30E58A2202D0B41800320648C1ED89D08109
S31500007A402A4060563E0648C77014322E000A740A51
S31500007A50E469024100017400340 1E58A2202D0B4CF
S31500007A6018002207D281D287EB89D0812A40602A6A
S31500007A703E0648C77014322E000A740AE4690241B1
S31500007A80000174003401E58A2202D0B418002207EE
S31500007A90D281D287ED89D0812A40200D671E302EF3
S31500007AA00008024000FF72003200E7892001487595
S31500007AB00800486EFFF44EB9000194DC5246BC4300
S31500007AC06F00FE6443EEFFF4206EFFFC20D9209188
S31500007AD033C000A001B24CDF3CFC4E5E205F4FEF8E
S31500007AE0000A4ED04E714E714E7148E7010C33C0FC
S31500007AF000A001B43E2F00104A47661C2A7900C038
S31500007B000E442F0D61000E8A4A40663C6100D7F094
S31500007B10287C00C00C34603470003007E188068091
S31500007B2000C00A2C72003207D281068100C00C7098
S31500007B302041321048C1E589D08120402A502F0DBE
S31500007B4061000E4E4A40670449ED0018200C33C010
S31500007B5000A001B64CDF3080205F548F4ED04E71AE
S31500007B604E714E7133C000A001B8558F3EAF000A6A
S31500007B70204F3F10204F2F2800084EB90001B2C4F5
S31500007B80548F33C000A001BA205F5C8F4ED04E7177
S31500007B904E714E712F0D33C000A001BC2A6F000834
S31500007BA0200D67103F3C0004486F000E2F0D4EB9A4
S31500007BB000003BA033C000A001BE2A5F205F4FEF4C
S31500007BC0000C4ED04E714E714E7148E7270C33C0F3
S31500007BD000A001C0226F002099CC2051302800144B
S31500007BE0E0480240001F3E00302F001CE0480240E3
S31500007BF000FF72003200E5893030181802400003 99
S31500007C003C004A46660C0C4700186D047C036C0273
S31500007C103C07200967000228302F001CE04802407C
S31500007C2000FF7A003A0041E900042005E588D08586
S31500007C30E788D1C02A48200D6700020443EF001EE2
S31500007C403011720AE2680240000172003200E589D2
S31500007C5020014AB50808670001E608110002670816
S31500007C6048C78FC66000000230070C400001672A33
S31500007C700C40000267580C400003670000A60C4039
S31500007C800008670000E80C40000C670001240C4067
S31500007C90000186700015460001A67014322F001EF0
S31500007CA0740AE4690241000174003401E58A220283
S31500007CB0D0B51808322F001E740CE4690241000F7B
S31500007CC074003401E78AD082322F001C024100FF83
S31500007CD074003401E78AD082284060000162701483
S31500007CE0322F001E740AE469024100017400340157
S31500007CF0E58A2202D0B51808322F001E740CE469FA
S31500007D000241000F74003401E98AD082322F001C30
S31500007D10024100FF74003401E78AD08228406000E7
S31500007D20011E302F001E720CE2680240000F7E001A
S31500007D303E007014322F001E740AE46902410001ED
S31500007D4074003401E58A2202D0B518082207D281D0
S31500007D50D287E789D081322F001C024100FF7400D0
S31500007D603401E78AD0822840600000D47014322F94
S31500007D70001E740AE4690241000174003401E58AB8
S31500007D802202D0B51808322F001E740CE469024195
S31500007D90000F74003401ED8AD082322F001C02419C
S31500007DA000FF74003401E78AD0822840600000900A
S31500007DB0302F001E720CE2680240000F7E003E006B
S31500007DC07014322F001E740AE46902410001740027
S31500007DD03401E58A2202D0B518082207D281D2875B
S31500007DE0EB89D081322F001C024100FF7400340160
S31500007DF0E78AD08228406046302F001E720CE26867
S31500007E000240000F7E003E007014322F001E740ADE
S31500007E10E4690241000174003401E58A2202D0B50A
S31500007E2018082207D281D287ED89D081322F001C13
S31500007E30024100FF74003401E78AD0822840200CFA
S31500007E4033C000A001C24CDF30E4205F508F4ED01B
S31500007E504E714E714E7133C000A001C4226F0004F2
S31500007E60303CFFE0C05167163011EA48024007FF78
S31500007E7072003200D2815C81E489300160024240A6
S31500007E8033C000A001C6205F588F4ED04E714E7190
S31500007E904E7148E7030033C000A001C8226F000CF2
S31500007EA0206F001030280004E0480240001F3C000C
S31500007EB04A6F0014673A0829000200016 75A301118
S31500007EC00240000332060281 0000FFFF82C03C012F
S31500007ED0300648C0E7885C80E4882E000829000444
S31500007EE000016736302800040240000FCEC0602A29
S31500007EF00082900020001672030064 8C0E7885C8038
S31500007F00E4882E00082900040001670E30280004CA
S31500007F100240000FCEC06002424730 0733C000A0C7
S31500007F2001CA4CDF00C0205F4FEF000A4ED04E71F1
S31500007F304E714E7148E7030033C000A001CC226F9A
S31500007F40000C206F001030280004E0480240001F9B
S31500007F503E004A6F00146732301102400003 3207B8
S31500007F60028100 00FFFF82C03E0108290003 0001D4
S31500007F7067383028000 40240000FC0C77200320084
S31500007F80E7895C81E4892C016022082900 06000249
S31500007F9067183028000 40240000FC0C77200320084
S31500007FA0E7895C81E4892C0160024246300633C0D1
S31500007FB000A001CE4CDF00C0205F4FEF000A4ED07C
S31500007FC04E714E7133C000A001D022390007A8
S31500007FD08020048100078000701 3B2806F0C0C812D
S31500007FE000020006C042C01600270FF33C000A076
S31500007FF001D24E754E714E714E7148E7011C33C069
S3150000800000A001D461C04A806F4A7E00267C00072A
S31500008010800020 13B08B65080C800007A000632049
S3150000802002A7C00030944284B600E2014B09567048F
S315000080307EFF600C588D588CBBFC0003095465EA22
S3150000804004A8766122A4B6002DE9DBBF90007802034
S3150000805065F660027EFF200733C000A001D64CDF24
S3150000806038804E754E714E714E712F0733C000A089
S31500008070 01D8598F6100FF504A806D1220790007A0
S3150000808080202 0102E806100FF72D09767187E0135
S3150000809023F90003094C00C0058023F900030944B5
S315000080A000C005846015424723F90007800800C017
S315000080B0058023F90007800000C005843007588F2B
S315000080C033C000A001DA2E1F4E754E714E714E71EF
S315000080D033C00CA001DC42410C790009 0007ACD294
S315000080E0661A20390007ACC8B0B900C0456E660CE8
S315000080F00CB90F0C3F000007ACC4640272013001DA
S3150000810033C000A001DE4E754E714E714E714E5653
S315000081 10FF2648E7213C33C000A001E02D49FFFCC3
S3150000812 02A6E0008227C0002658241EEFF2670332B
S31500008130 20D951C8FFFC3091224D41EEFF3A70061E
S3150000814020D951C8FFFC3091082D00050001 6708B1
S3150000815002E3C0000FFFF60027EFF49EEFFF8081587
S315000081600004671 04AB900C00D74672428BC0007D4
S315000081700C000601C4AB900C00E786714303900C0D0
S31500008180456648C0E5880680000267682C4028905A
S3150000819004A946700016247EEFF7660000 0B42F0D37
S315000081A02F146100017C1D40FF764A00670A0C000F
S315000081B000002670460000920815000767424 2400B
S315000081C0102D00032054322800027 40AE46902418B
S315000081D0003FB0416672082D0006000166 10202D92
S315000081E00006C0872228000CC287B081665A4AADB5
S315000081F0000A670C202D000A2054B0A80004664827
S3150000820008150006671A2F14224C6100E7902F0DFF
S31500008210 2F146100010C1D40FF760C0000016 7E67B
S315000082200082D0006000167124AAD000E660C2054A8
S31500008230 2028000C52802B40000E2D54FF262D6E58
S31500008240FF26FF5842AEFF6C2F14224C6100E74E0A
S3150000825 04AAEFF2666064A946600FF447E0528AEAF
S31500008260FF2647EEFF3645EEFF3260702F0D2F14C6
S315000082706 10000AE1E004A0067140C000002672C65
S31500008280 0C000004674C0C000005673E604652AEC9
S31500008290FF3620543028000 2024003FF72003200ED
S315000082A05881D3AEFF322D48FF2A602852AEFF36E2
S315000082B02054302800020 24003FF72003200588129
S315000082C0D3AEFF322D48FF2A600842AEFF3642AEDB
S315000082D0FF3242942F14224C6100E6C24A94668C07
S315000082E0082D00070001670E0C070004670842AE60
S315000082F0FF3642AEFF3243EEFF26206EFFFC7033A0
S3150000830020D951C8FFFC309133C000A001E24CDFF8
S315000083103C844E5E205F588F4ED04E714E714E712A
S31500008320 48E7030833C000A001E449EF0010226FBC

S315000083300014082900050001670B2E3C0000FFFF15
S315000083406002 7EFF4A946700008E4A9466047CFFB2
S3150000835060102054302800027 20AE2680240003F92
S31500008360 3C002029001AB0B900C0456E660E2054A4
S315000083700CA803FFFFFF0004620000E82029001A92
S3150000838 0B0B900C0456E670E4A80630A2054B0A893
S3150000839000046600 00CE08110005670A2014B0B973
S31500008 3A000C00E4467300811000767364240102 9A6
S3150000 83B00003B046662C2029000EC087205422 28D0
S31500008 3C0000CC287B081661A0811000166140829DC
S3150000 83D0000700016706 7E046000008E7E026000D2
S31500008 3E0008842401029000 3B04666324240102 9F8
S31500008 3F00004B0466628205420280 00CC087222995
S3150000 84000006C287B081655A2028000CC087222941
S315000084 10000EC287B08163064AA9000E624420544A
S315000084 2020280008B0A900166438B0A900126532E9
S3150000843008110002671642401029000 3BC406D2255
S31500008440424010290004BC406E18601A42401029B0
S31500008450000 2207C00030D98424112306000C041AA
S315000084606604 7E0160024207100733C000A001E6E1
S315000084704CDF10C0205F508F4ED04E714E714E7142
S3150000848048E7071C33C000A001E8598F3C2F0020A5
S315000084902A6F0022302D004AB04666044247602407
S315000084A00C46000166084AAD000C620E60104A6D6B
S315000084B0004C660A5240B04666047E0160061B7C8C
S315000084C00005005049D74A4767000150 3B46004A1D
S315000084D04247487800204 86D00524EB9000014C447
S315000084E041ED00522888267C00C0456E60000114CC
S315000084F04AAD0046661A226D003220543169000 2E8
S31500008500000 2206D00323B680002004E600000EC65
S315000085100CAD00000000100466620082D0003001483
S31500008520671 02F134EB900019B62205420806 00013
S315000085300 0CA20542093600000C2206D003230280B
S31500008540000202400 3FF72003200588120 2D0046CF
S3150000855 0B081664C205430AD004E2054317CFFFF74
S3150000856000020C2D00020050660E1B7C0004005019
S315000085703B46004C6000008C42AD00462F2D003279
S315000085804 3ED00326100E416486D00142F2D0032D1
S3150000859061 00FD8E1B4000500C00000167DE60622A
S315000085A0082D00030014674272 04B081651E20087E
S315000085B066063A3CFFFF600E30280002720AE26847
S315000085C00240003F3A000C450030671E206D003225
S315000085D0202D0046E588D1C02F1052AD00464EB979
S315000085E000019B62205420806014226D0032202DF1
S315000085F00046E588D3C02054209152AD004652472C
S3150000860058940C4700206C124A2D00506700FEE279
S315000086100C2D000200506700FED80C2D00040050FF
S31500008620660E3B6D004A004C2054317CFFFF000271
S3150000863 04A6D004C630CBC6D004C63061B7C000548
S315000086400050102D0050588F33C000A001EA4CDFB7
S315000086503 8E0205F5C8F4ED04E714E714E7148E708
S31500008660030C33C000A001EC598F3C2F00182A6F71
S31500008670001A0C46000166124A6D004A660C42ADAD
S3150000868000467E01422D00506016302D004A5240B1
S315000086900E04666047E0160081B7C000500500424718
S315000086A04A47670000D649D741ED005228883B4625
S315000086B0004A424760000 0B6202D00467203B08192
S315000086C06248D040303B00064EFB00020008001A0C
S315000086D00022002A20543B68000200382054 3B68E0
S315000086E00002004E607E20542B50003A60762054E3
S315000086F02B50003E606E20542B500042486D0036D1
S31500008700043ED00086100E8F0605A302D004E02404B
S3150000871003FF72003200588120 2D0046B081652883
S315000087202020543010B06D004E67081B7C00050050C9
S3150000873 0603A0C68FFFF000266081B7C00020050CE
S3150000874 0602A42AD0046602420542F107010D0AD30
S315000087500008 72FCD2AD0046E589D0812F004EB9E3
S3150000876000003AB45894524752AD00460C470020D8
S3150000877 06C084A2D00506700FF40102D0050588F9E
S31500008780 33C000A001EE4CDF30C0205F5C8F4ED0BE
S315000087904E714E714E7148E7073E33C000A001F09E
S315000087A05D8F42052C7C00C0010A203900C00106FD
S315000087B0B08E660001962F0E610002664A40670081
S315000087C0018842472A7C00C00112287C00030DD88C
S315000087D0267C00C00186247C00C0014E0C47000E9A
S315000087E06C0000EE303CFFE0320748C1E589C075F9
S315000087F018006700008830 0748C0E5882C0030352F
S315000088006800EA48024007FF485702800000FFFF61
S3150000881 04EB900023A484857487468004873 6800E1
S315000088204EB9000217E8320748C1E589303518020B
S3150000883008 00000F67343 00748C0E5882C00303543
S315000088406800EA48024007FF485702800000FFFF21
S3150000885 04EB900023A4848574874680048726800A2
S3150000886 04EB9000217E8600000D4320748C1E58916
S3150000887 03035180208 00000D66226044300748C0F3
S315000088 80E58808350002080167283 20748C1E589EE
S3150000889 0300748C0E58827B41800080 0320748C1E9
S315000088A0E589300748C0E58825B41800080060004F
S315000088B0008C300748C0E58827BC0000000008008F
S315000088C0300748C0E58825BC000000000800606C41
S315000088D0303CFFE0320748C1E589C07518006742A1
S315000088E0320748C1E58930351800EA48024007FFDB
S315000088F0485702800000FFFF4EB900023A48485729
S31500008900300748C0E588D08C2F0070F2D04748C0A9
S31500008910E588068000C001BE2F004EB9000217E8A8
S31500008920601A300748C0E58872F2D24748C1E58927
S31500008930068100C001BE204120B4080052470C4702
S3150000894 0000F6D00FE9860027AFF4A05662C2039FA
S31500008950 00C00106B08E660A2F0E610000C44A40B0
S3150000896067162F3900C0C1063F3C004E3F3C001CF5
S315000089706100E8023A0060027AFF10055C3F33C09E
S3150000898000A001F24CDF7CE04E754E714E714E71C7
S31500008990 48E7010433C000A001F42E3C03FFFFFFAB
S315000089A02A6F000C200D670E202D0004B087650687
S315000089B0B0AD00106746200D674C202D0004B0872F
S315000089C06444203900C0456EB087653A222D0010F8
S315000089D0B2806632302D0014E0480240001F0C4081
S315000089E0000366223 02D00140240000F7200320090
S315000089F0207900C00580B2A8000E660A486D0010F6
S3150000 8A00611E3E00600242473 00733C000A001F6F7
S31500008A104CDF2080205F588F4ED04E714E714E71C4
S31500008A2048E7230033C000A001F8226F00107C0144
S31500008A3042 4741E9000860000162303CFFE0C05057
S31500008A40671C3010EA48024007FF323C05A002814D
S31500008A5000 0C0FFFF82C048414A41620001387003AE
S31500008A60C02800016700012E303C1F00C0690004C9
S31500008A70670001223010024000 0332290004E04959
S31500008A800241001FB0416200010C30290004E04899
S31500008A900240001F32100241000302800000FFFF67
S31500008AA080C148404A40660000EC700FC0290005AE
S31500008AB0670000E2082800030001676C303CFFE015
S31500008AC0C050670000D0303CFF00C0690006570058
S31500008AD000C44A290007670000BC30290006E048A8
S31500008AE0024000FF3229000 6024100FF028000001A
S31500008AF0FFFF80C148404A406200009A30290006C4
S31500008B00E048024000FF3210EA49024107FF343CC8
S31500008B1005A00282 0000FFFF84C102800000FFFF63
S31500008B2080C248404A40626C0828000600026766 18
S31500008B30082800070002675C303CFF00C069000699
S31500008B4067524A290007674C30290006E048024070
S31500008B5000FF3229000 6024100FF02800000FFFFED
S31500008B6080C148404A40622C30290006E048024055
S31500008B7000FF3210EA49024107FF343C05A0028299
S31500008B80C000FFFF84C102800000FFFF80C2484052
S31500008B904A40630242465247 58884A466F080C4785
S31500008BA0C00F6D00FE96300633C000A001FA4CDFC0
S31500008BB000C4205F588F4ED04E714E714E7133C037
S31500008BC000A001FC598F3F3C001C43EF00026100EE
S31500008BD0E7484A97671A20574868001061 00FE4226
S31500008BE04A40670C7010D09723C000C00106600A87
S31500008BF023FC00030C6000C00106203900C00106FA
S31500008C00588F33C000A001FE4E754E714E714E71E5
S31500008C1033C000A00200598F3F3C002243EF000200
S31500008C206100E6F64A97670A205723E8001000C05D
S31500008C30456E588F33C000A002024E754E714E71BC
S31500008C404E7133C000A0020400790800008040087D
S31500008C5033C000A002064E754E714E714E7148E744
S31500008C60C0FC33C000A00208598F2A7C000004C44F
S31500008C706004205D4E90BBFC000004E465F4247C97
S31500008C8000080401408120006673A08D20006287CC5

S31500008C9000C0454C2A4C267C00C045566002548DC7
S31500008CA0BBCB64044A5566F6BBCB661813FC00EAD8
S31500008CB000804015200B908CE2802F002F0C4EB9BF
S31500008CC0000014342A7C00C000FE0C15003F66002C
S31500008CD000D44215287C00C01EC44A54673A267C3C
S31500008CE000C00100535366304A546F0452156002A7
S31500008CF053154A5466044253601E3F144EB900028F
S31500008D00297E48C0223C0002625A2E81220020178A
S31500008D104EB900022F663680287C00E0000052948F
S31500008D202A7C000004E46004205D4E90BBFC000039
S31500008D3004E465F42014723C4EB900024FCC4A801C
S31500008D4066642A7C000004E46004205D4E90BBFC4F
S31500008D50000004E465F42014223C00000E104EB915
S31500008D6000024FCC4A80663E2A7C000004E4600480
S31500008D70205D4E90BBFC000004E465F42014223C08
S31500008D80000151804EB900024FCC4A8066182A7CF9
S31500008D90000004E46004205D4E90BBFC000004E487
S31500008DA065F46002521508D20007588F33C000A040
S31500008DB0020A4CDF3F034E734E714E714E7133C043
S31500008DC000A0020C08F9000100C00E8833C000A004
S31500008DD0020E4E754E714E714E7133C000A00210D8
S31500008DE008B9000100C00E8833C000A002124E75FB
S31500008DF04E714E714E712F0D33C000A002144FEF0D
S31500008E00FFC0007C070023F9000009C0008040086D
S31500008E102A7C0000054C600A2F0D61000880205D49
S31500008E204E90BBFC0000055465EE48780040486F44
S31500008E3000044EB9000013D448790002B402486F0A
S31500008E4000044878000B4EB9000011C648574EB9C9
S31500008E50000049C84EB90001B2304FEF004033C060
S31500008E6000A002162A5F4E754E714E714E712F0785
S31500008E7033C000A002182E3900E00004203C00C0D8
S31500008E800000448006800 0C04646E4802F004879F2
S31500008E900C000004EB9000014944879000311 5830
S31500008EA0487900C04556203C00C04556448006809F
S31500008EB000C04646E4802F004EB90000129E23C72C
S31500008EC000E0000433C000A0021A2E1F4E754E713A
S31500008ED04E714E7133C000A0021C598F4A7900C0F2
S31500008EE01EC46608427900C0010060263F3900C0F2
S31500008EF01EC44EB90002297E48C0223C0002625AB6
S31500008F002E8122002 0174EB900022F6633C000C002
S31500008F100100588F33C000A0021E4E754E714E716F
S31500008F204E7133C000A0022013FC000100804000F7
S31500008F3013FC0000008040 0213FC000E0080400479
S31500008F40203C00C07BF6448006800 0C07D76E4802D
S31500008F502F00487900C07BF64EB9000014944238C1
S31500008F60000033C000A002224E754E714E714E7144
S31500008F7048E7013E33C0C0A00224598F6100FEF08D
S31500008F80203C00C046464480068000C07BF6E48054
S31500008F902F00487900C046464EB9000014942A7C3A
S31500008FA00080400802557FFF3015720FE2680240CC
S31500008FB000010240000 1720EE3680255BFFF8155B1
S31500008FC03015E26802400001024000 01720DE368BC
S31500008FD00255DFFF81553015E268024C000102406C
S31500008FE00001720CE3680255EFFF81553015E26807
S31500008FF0024000010240000 1720BE3680255F7FFD0
S315000090008155301 5E2680240000102400001720AF3
S31500009010E3680255FBFF81553015E268024000 0106
S315000090200240000172 09E3680255FDFF815533FCD9
S315000090300019 00E00FF233FC001A00E00FF433FCD5
S31500009040001B00E00FF633FC001C00E00FF833FCB9
S31500009050001D00E00FFA33FC001E00E00FFC33FC9D
S31500009060001F00E00FFE4EB90001B0AC4EB9000182
S31500009070B128027CF8FF027CDFFF4EB90000806A4F
S315000090802 87C00C00E88227C000009C4204C10D920
S315000090901 0912A7C0080400A3015E248024000 0107
S315000090A00200000108940000811430150800000732
S315000090B0670A0055008008D40007602830150800AC
S315000090C00005670A0055002008D4000660163 01512
S315000090D0080000006670A0055004008D4000460043 2
S315000090E008D40003267C008040142C7C00804015A8
S315000090F008130C06670808D300061CBC00EA2A7C91
S31500009100000000410247C0000969C60082F0D4E92EF
S31500009110205D4E90BBFC0000042865F00813000695
S315000091206 70808D300061CBC00EA2A7C0000042855
S31500009130 60082F0D4E92205D4E90BBFC000004345B
S315000091406 5F008130006670808D300061CBC00EA91
S31500009150081400056600014047D726B900C00E78FE
S3150000916 02A7C00C000FA2C7C00E0000008140007EE
S315000091706 7000088203C00E0000044800 68000E094
S315000091800580E4802F00487900E000004EB9000019
S31500009190 14944A9367324A9366063E3CFFFF60107A
S315000091A020533028000 2720AE2680240003F3E0067
S315000091B00C47000366124A93660642954296602E55
S315000091C020532AA8000860244AB900C0058866080A
S315000091D042B900C00102600E207900C0058823E86C
S315000091E0000400C001022AB900C001022C953F3CD0
S315000091F000064EB9000072F060564EB90000769235
S31500009200 2AB900C001022C950814000667563F3C97
S31500009210 00044EB9000072F04A9367204A9366062E
S31500009220 3E3CFFFF601020533028000 2720AE268BD
S31500009230 0240003F3E00C47000367103F3C00071A
S31500009240 4EB9000072F008D4000260044A93660822
S31500009250 42B900E00004603E205323E8000800E025
S31500009260 0004603208140004670 63F3C00056004F1
S31500009270 3F3C00084EB9000072F0203900E00004BF
S31500009280 B09662087288D296B081640A7088D096C9
S31500009290 23C000E000042A7C0000043460082F0D7F
S315000092A04E92205D4E90BBFC0000043465F02A7C93
S315000092B00000043460082F0D4E92205D4E90BBFCDA
S315000092C00000048065F02A7C0000048060082F0DF1
S315000092D04E92205D4E90BBFC0000048065F02A7C17
S315000092E00000048060082F0D4E92205D4E90BBFC5E
S315000092F00000048465F02A7C0000048460082F0DB9
S315000093004E92205D4E90BBFC000004A865F0081448
S31500009310000 0670A3F3C00004EB9000072F0303989
S3150000932000 80400E720DE26802400001020000015A
S31500009330 089400081143F3C00024EB9000072F010
S315000093400089400052A7C000004A860082F0D4E92A0
S31500009350205D4E90BBFC000004BC65F02A7C00003A
S3150000936004BC60082F0D4E92205D4E90BBFC0000A1
S315000093700 4C465F0611660FC588F33C000A0022655
S315000093804CDF7C804E754E714E714E7148E7203E23
S3150000939033C000A00228287C00C000FA267C00E02A
S315000093A00000247C00C000F62C7C000072F04A927B
S315000093B0674E0C940F0C3F0063063F3C000A4E9626
S315000093C02A7C000004E4600A2F0D610002D0205DB3
S315000093D04E90BBFC000004E465EE2A7C00000528E4
S315000093E0600A2F0D610002B6205D4E90BBFC0C00A6
S315000093F0053465EE2892269442923F3C00094E962B
S315000094002014B093620A201390947214B0816306FC
S315000094102893600001C02013B094630001B85294F1
S315000094204AB900C00E78670000944EB900007692E3
S315000094300C9300000014636A2A7C00C001024A955E
S315000094406712700AD0932215B280640870F6D09322
S315000094 50B280624E4EB90000769224952A7C0000B6
S315000094600 4E4600A2F0D61000234205D4E90BBFCBF
S31500009470000004E465EE2A7C00000528600A2F0D32
S315000094806100021A205D4E90BBFC0000053465EEBB
S315000094903F3C001E4E962892269442923F3C00097D
S315000094A04E962014207900C00E7890A800080C80F3
S315000094B000000E1063063F3C002A4E962A7C0000F0
S315000094C004E46004205D4E90BBFC0000050865F4D2
S315000094D02A7C0080400E267C0080400A103900C09D
S315000094E00E880200000142411200 3015740DE46836
S315000094F002400001B24067463015E46802400001B0
S3150000950020 7900C045903228000202410001B04196
S31500009510 66063F3C000060043F3C00014E96301555
S31500009520720DE2680240000102000001 08B9000065
S31500009530 00C00E88813900C00E880253FFFD2079D5
S31500009540 00C045900828000000003661A3015080080
S31500009550 000D6712301308000001670A3F3C000047
S315000095604E960253FFFD2014723C4EB900024FCCBA
S315000095704A8066602A7C000005086004205D4E90E3
S31500009580BBFC0000052065F42014223C00000E10F0
S315000095904EB900024FCC4A80663A2A7C000005206C
S315000095A06004205D4E90BBFC0000052865F4201485
S315000095B0223C000151804EB900024FCC4A8066140D
S315000095C02A7C000005286004205D4E90BBFC00004C
S315000095D0052865F42A7C000005346004205D4E9061
S315000095E0BBFC0000054C65F423D400E000044A7976

S315000095F000C0454C660833FC000100C0454C33C032
S3150000960000A0022A4CDF7C044E754E714E714E71DD
S315000096103 3C000A0022C4FEFFFC04EB900004876C1
S31500009620487800 40486F00044EB9000013D42F3923
S315000096300 0C0570A3F3900C057383F3900C0573677
S31500009640 3F3900C0573C48790002B40D486F000E00
S315000096504EB9000222C83F3900C057343F3900C016
S315000096605 7323F3900C057303F3900C0572E48792E
S31500009670 0002B41D486F003E4EB9000222C84FEFEB
S315000096800 02248574EB9000049084FEF004033C04A
S3150000969000 0A0022E4E754E714E714E7133C000A061
S315000096A002304FEFFFC048780040486F00044EB9C3
S315000096B0000013D448790002B43748790002B42E6A
S315000096C0486F00084EB9000222C8204F2F280050CC
S315000096D048790002B444486F00344EB9000222C8EB
S315000096E04FEF001848574EB9000049084FEF0040A9
S315000096F033C000A00232205F588F4ED04E714E719B
S3150000970 04E7133C000A00234423900C00E8A227C5A
S315000097100 0C0573E22BC00C077422051213C0001C8
S31500009720661A228890FC002C228833C000A00236DC
S3150000973 04E754E714E714E7133C000A002380C3911
S3150000974 0000200C00E8A66064EB90001B0CA33C0D8
S3150000975 000A0023A4E754E714E714E7148E7033EB7
S315000097603 3C000A0023C2A7C00C00E8A4A15660857
S3150000977 04EB90001B0CA60700C15000366602C7CFF
S3150000978 00080 40081C161CBC00804247287C0080D4
S31500009790 4014267C00C000FE247C00E00000602C03
S315000097A0081400076726081400066714524708D4F1
S315000097B00006529242 1313FC00EA0080401560082E
S315000097C052134EB90C01B0CA08D400070C150003A5
S315000097D066060C47025865C81C864215600A0C15B9
S315000097E0000166041ABC000233C000A0023E4CDF32
S315000097F07CC04E754E714E714E7148E7030C33C0F6
S3150000980000 0A002404FEFFFF4286F00203C2F0024F9
S31500009810 2A7C00C01D4853462E3C0000018A7C0079
S3150000982003006EF889E804A876F0000E24A3900C002
S3150000983 01EE36700008C4A4666684878000348794C
S31500009840 0002B991486F00084EB9000237E61F7C46
S31500009850 000100032F7900C0456E00041F7C000341
S31500009860000 81F7C001800091F7C0003000A1F7CEB
S31500009870 0004000B48572F0C4878000C4EB9000026
S315000098801 1C60C87000000806D082C3C000000808B
S315000098906 0022C072F0D486C000C70F4D0862F0048
S315000098A0606470003006EF88D08D0680FFFFFFF4FD
S315000098B02F002F0C0C87000000806C422F0760469B
S315000098C04A4666200C87000000806D082C3C00008C
S315000098D0008060022C07486C000C2F0D70F4D086B7
S315000098E02F0060222F0C70003006EF88D08D068086
S315000098F0FFFFFFF42F000C87000000806D064878FC
S3150000990000 8060022F074EB9000011C64A876E0C10
S315000099104A3900C01EE46704610016507000B08723
S315000099205CC0440048804FEF000C33C000A00242E8
S315000099304CDF30C0205F5C8F4ED04E714E714E7141
S3150000994048 73F3E33C000A002444FEFFEDC4246EC
S31500009950340 6227C00026CB641EF0012703920D921
S3150000996051C8FFFC486F00124EB90001A30823FC42
S3150000997000 0097FA00C01F2A23FC000097FA00C0D7
S315000099801F264A3900C01F07670C3F3900C01FB8A1
S315000099904EB900014E4C247C00022292267C00C067
S315000099A01D784A3900C01F06670007CA4A3900C039
S315000099B01EF5660007C02A7C00C01D423015486FA0
S315000099C0000E02800000FFFF4EB900023A484879B7
S315000099D000026D9E486F0012486F01184EB90002D2
S315000099E017E8287C00C01D3C30159054486F000CC9
S315000099F002800000FFFF4EB900023A484879000293
S31500009A006D9E486F0010486F00104EB9000217E8AF
S31500009A10487900026DA2486F000C486F000C4EB9E1
S31500009A20000217D2486F0004486F0114486F011CEA
S31500009A304EB9000217A630159054486F000C0280EC
S31500009A400000FFFF4EB900023A48487900026D9EB9
S31500009A50486F0010486F00104EB9000217E84879A9
S31500009A6000026DA2486F000C486F000C4EB9000250
S31500009A7017D2486F0004486F0114486F01204EB991
S31500009A800002177E2A7C000005582C7C00C01D3879
S31500009A904A3900C01EF0670002D448790002B99521
S31500009AA04E92588F4A3900C01EF3670A363900C0F5
S31500009AB01F683A036004424576173E0549EF0120C8
S31500009AC060000029A3A0748C5320748C1E589303333
S31500009AD01800486F000E48C04EB900023A2848796F
S31500009AE000026DAA486F0012486F00124EB90002BC
S31500009AF017D24879 00026DA6486F000E486F000E17
S31500009B004EB90002177E486F00062005D080D0852A
S31500009B10D080D08D2F00486F000A4EB9000217D2B0
S31500009B20204F2F280002224C4EB9000241E0300798
S31500009B3048C0D080068000C01CF420403A10300592
S31500009B4048790C026D9E486F0118486F00163F4025
S31500009B500 00184EB9000217D2486F000E4EB9000227
S31500009B60455E916F000C487900026D9E486F011C9E
S31500009B70486F00104EB9000217D2486F00084EB960
S31500009B80 0002455E9045322F000CB2406424380531
S31500009B9048790 0026D9E486F0118486F00164EB94D
S31500009BA0000217D2486F000E4EB90002455E98407B
S31500009BB06022487900026D9E486F011C486F0016AE
S31500009BC04EB9000217D2486F000E4EB90002455E2C
S31500009BD038009845327C0010D3F900C00E8441EF5E
S31500009BE000FA700420D951C8FFFC3091320748C1F1
S31500009BF0D281068100027D4C20413010486F000E54
S31500009C0048C04EB900023A28487900026DAE486F46
S31500009C10C012486F00124EB9000217E82F0C486F69
S31500009C20C00E486F000E4EB9000217D2486F00FAB8
S31500009C30486F000A486F000A4EB9000217D2204F3B
S31500009C402F2800023004486F001002800000FFFF3A
S31500009C504EB900023A482F0C486F0014486F0014A2
S31500009C604EB9000217D2487900026DB2486F001053
S31500009C70486F00104EB9000217E8486F00FE486FA3
S31500009C8000 0C486F000C4EB9000217D2204F2F2847
S31500009C900 0043004486F001402800000FFFF4EB934
S31500009CA000023A48487900026D9E486F0018486FD6
S31500009CB000184EB9000217E8204F2F280010300573
S31500009CC09056486F001848C04EB900023A284879A5
S31500009CD000026D9E486F001C486F001C4EB90002C2
S31500009CE017E8204F2F2800143005486F001C02800B
S31500009CF00000FFFF4EB900023A48487900026D9E07
S31500009D00486F0020486F00204EB9000217E8204F28
S31500009D102F2800183007 48C0E58806800000 07E8AD
S31500009D202FC0487900026DB6486F002A4EB900022E
S31500009D3017E8204F2F2800227003C04748C006802E
S31500009D4000C01D242040424010103F003F074879C4
S31500009D5000 02B9D34E924FEF00205247BE436F0028
S31500009D60FD64423900C01EF06000040A424010390A
S31500009D7000C01C7C3F0048790002BA024E92424055
S31500009D80103900C01C7B3F0048790002BA214E9270
S31500009D903016486F001A02800000FFFF4EB900021D
S31500009DA03A48487900026D9E486F001E486F001EB3
S31500009DB04EB9000217E8204F2F2800164879 0002F6
S31500009DC03A354E92303900C01D3A486F00220280E3
S31500009DD00000FFFF4EB900023A48487900026D9E26
S31500009DE0486F0026486F00264EB9000217E8204F3C
S31500009DF02F28001E48790002BA4A4E923014486F46
S31500009E00002A02800000FFFF4EB900023A48487956
S31500009E1000026D9E486F002E486F002E4EB900025C
S31500009E2017E8204F2F2800264879 0002BA654E927F
S31500009E30203900C04572486F00324EB900023A48D8
S31500009E4048790 0026D9E486F0036486F00364EB95D
S31500009E5000 0217E8204F2F28002E48790002BA8505
S31500009E604E92303900C01D40486F003A0280000013
S31500009E70FFFF4EB900023A48487900026D9E486FCE
S31500009E80003E486F003E4EB9000217E8204F2F28CB
S31500009E90003648790002BA9F4E92204F2F2801447F
S31500009EA048790002BABC4E92204F2F2801504879BB
S31500009EB00002BAD14E924FEF0044204F2F280118CE
S31500009EC048790002BAE64E92303900C01CA2486FAB
S31500009ED00001602800000FFFF4EB900023A4848799A
S31500009EE000026D9E486F001A486F001A4EB90002B4
S31500009EF017E8204F2F2800124879 0002BAFC4E922C
S31500009F00303900C01CA4486F001E02800000FFFF0D
S31500009F104EB900023A48487900026D9E486F002209
S31500009F20486F00224EB9000217E8204F2F28001A6A
S31500009F3048790002BB124E92303900C01CA6486F09
S31500009F4000 02602800000FFFF4EB900023A48487919

S31500009F5000026D9E486F002A486F002A4EB9000223
S31500009F6017E8204F2F28002248790002BB214E9285
S31500009F70303900C01CA8486F002E02800000FFFF89
S31500009F804EB900023A48487900026D9E486F003289
S31500009F90486F00324EB9000217E8204F2F28002ADA
S31500009FA048790002BB304E9248790002BB3F4E9280
S31500009FB04FEF002C424749EF011C320748C1E589A3
S31500009FC0068100C01D4820413D10486F000E48C071
S31500009FD04EB900023A28487900026DAA486F00126D
S31500009FE0486F00124EB9000217D2487900026DA6DA
S31500009FF0486F000E486F000E4EB90002177E486F7C
S3150000A000000641ED0090300748C0E788D1C02F0810
S3150000A0102F0C4EB9000217D2300748C0D0800680F8
S3150000A02000C01D2820403A10300544400640FFF08D
S3150000A030BA40640438056006383CFFF09845487914
S3150000A04000026DBA2F0C486F00164EB9000217D2E7
S3150000A050204F2F28000E3004486F001002800000A9
S3150000A060FFFF4EB900023A482F0C486F0014486FA4
S3150000A07000144EB9000217D2487900026DB2486F3B
S3150000A0800010486F00104EB9000217E8204F2F2825
S3150000A09000083004486F001402800000FFFF4EB92C
S3150000A0A000023A48487900026D9E486F0013486FD2
S3150000A0B000184EB9000217E8204F2F28001030056F
S3150000A0C09056486F001848C04EB900023A284879A1
S3150000A0D000026D9E486F001C486F001C4EB90002BE
S3150000A0E017E8204F2F280014320748C1D281068175
S3150000A0F000C01D3020413010486F001E0280000055
S3150000A100FFFF4EB900023A48487900026D9E486F3B
S3150000A1100022486F00224EB9000217E8204F2F2870
S3150000A120001A320748C1D281068100C01D2820418D
S3150000A1303010486F002202800000FFFF4EB9000277
S3150000A1403A48487900026D9E486F0026486F0026FF
S3150000A1504EB9000217E8204F2F28001E3F07487906
S3150000A1600002BB774E924FEF001E52470C47000489
S3150000A1706D00FE484A3900C01EF5672A4A3900C0FC
S3150000A1801F0667224AB900C01F6E52C044004880AD
S3150000A19002400001ED4808B9000600C01E9B817907
S3150000A1A000C01E9A7C014A3900C01EFD671A700362
S3150000A1B0C07900C01F90E1480279FCFF00C01E9ADA
S3150000A1C0817900C01E9A7C014A3900C01EFE671CB8
S3150000A1D07003C07900C01F94720AE3680279F3FF26
S3150000A1E000C01E9A817900C01E9A7C014A3900C0BF
S3150000A1F001EFF671C7007C07900C01F98720CE368C9
S3150000A20002798FFF00C01E9A817900C01E9A7C01D8
S3150000A2104A3900C01F006718700FC07900C01F9C24
S3150000A2200279FFF000C01E98817900C01E987C015B
S3150000A2304A3900C01F01673A700FC07900C01FA0DD
S3150000A2400240000FE9480279FF0F00C01E9881798D
S3150000A25000C01E98203900C01F9EE8880240C001F9
S3150000A260E14808B9000000C01E98817900C01E9818
S3150000A2707C014A3900C01F02671C703FC07900C0CC
S3150000A2801FA47209E368027981FF00C01E988179D4
S3150000A29000C01E987C014A3900C01F036718703F32
S3150000A2A0C07900C01FA80279FFC000C01E9A81793C
S3150000A2B000C01E9A7C014A3900C01F0867263F3C31
S3150000A2C000042F3900C01FBA43EF00144EB9000234
S3150000A2D04258486F000E4EB90002455E33C000C0BA
S3150000A2E01E9C7C014A3900C01EFC670A13F900C097
S3150000A2F01F8D00C01EC24A3900C01EF867000092BA
S3150000A300227C000267A0207C00C01D48705E20D918
S3150000A31051C8FFFC3091424542477C003C05700025
S3150000A3203007D08006800002691E22402006D080B9
S3150000A330D086EB88D08B72003207E589D081204029
S3150000A3403151000252470C47001865D252450C4560
S3150000A350000365C4227C0002694E207C00C01E9862
S3150000A360700920D951C8FFFC309113FC000100E0B0
S3150000A37004DA423900E004DB423900E004DC13FC75
S3150000A380000300E004DD427900C01EC47C013406EF
S3150000A3902A7C00804040287C008040442C7C008041
S3150000A3A0403C4A3900C01F0567280279EFFF00804C
S3150000A3B0400802547FFF0056800002567FFF025578
S3150000A3C0FEFF0255FDFF0055800000791000008059
S3150000A3D040084A3900C01F0B6756487900026DBE17
S3150000A3E0487900C01FC6486F00164EB9000217D242
S3150000A3F0486F000E4EB90002453833C000C01EC477
S3150000A4004A406608427900C0010060244A406C0850
S3150000A4103E00444748C760043E0048C7203C000150
S3150000A420312D22074EB900022F6633C000C001004D
S3150000A4304A3900C01F04670274014A3900C01F0967
S3150000A440671E4A3900C01EF367167003C0B900C004
S3150000A4501F66068000C01D24204010B900C01FC121
S3150000A4604A3900C01F05670000FC13FC000100C04C
S3150000A4701C700279EFFF00804008027933FFF0080E0
S3150000A480404600794000008040460B8B9000600803A
S3150000A49040241039008040240200000034244180082
S3150000A4A0023900FC008040240279F3FF0080404618
S3150000A4B000550200005480000055010030160240 8D
S3150000A4C01FFF3A00303C0FFFC07900C01FB0025496
S3150000A4D0F00081542A7C00C01EDA0C9500001E0094
S3150000A4E06C062ABC00001E002E3CFFFFF100DE9524
S3150000A4F050164A7900C0454E660833FC000100C06C
S3150000A500454E4EB90001B0F22F39000262B24EB983
S3150000A5100000379A0C40FFFF66062015B08762D20E
S3150000A5200254F0000054080070 03C004023900FC15
S3150000A53000804024813900804024 08B9000600804C
S3150000A5402408F9000600804024 08B9000700806E
S3150000A55024303C1FFFC0450256E000815642397 8
S3150000A56000C01C704A3900C01EF967000 D44A3981
S3150000A57000C01EEF660000CA2A7C00C01C734A3960
S3150000A58000C01F0566244A3900C01F0A661C4A39E5
S3150000A59000C01EF366144A3900C01EF7660C421549
S3150000A5A0423900C01C70600000984A3900C01F067E
S3150000A5B0670808F9000100C01C704A3900C01F0A6C
S3150000A5C0670C23F900C01FC200C01C6C600A23FC84
S3150000A5D0000000000000C01C6C4A3900C01EF367185A
S3150000A5E013F900C01F6900C01C7508F9000000C0FF
S3150000A5F01C701ABC000460147018B03900C01C75B9
S3150000A600640A13C000C01C75600000024A3900C00D
S3150000A6101EF7671813F900C01F7900C01C7908F9E6
S3150000A620000000C01C701ABC000460147004B0392D
S3150000A63000C01C79640A13C000C01C7960000002C7
S3150000A6404A3900C01EF6670461001 0F64A466706DE
S3150000A6504EB900015CF24A42673A487900C01D488B
S3150000A66003F3C00603F3C00204EB9000071746100 21
S3150000A67008FA42472A7C00C013B63F072F0D4EB991
S3150000A680001391A4BED02E452470C47000365EA14
S3150000A6906C0008A64BEF00E62E3C000240484A390F
S3150000A6A000C01F0D670001D22A87600C01B6082F7F
S3150000A6B0000600F96714486F001248790002BBA132
S3150000A6C04E92508F2A7C0007A000424742467800EF
S3150000A6D038067A003A0641ED00903007C0FC00C803
S3150000A6E0D1C01028000648803F0041ED0090300799
S3150000A6F0C0FC00C8D1C03F28000441ED00904A309C
S3150000A700080767063F3C002D60043F3C002B41EDE7
S3150000A71000903007C0FC00C8D1C01028000248 8055
S3150000A7203F0041ED00903007C0FC00C8D1C03F108B
S3150000A73041ED00904A30080367063F3C002D600457
S3150000A7403F3C002B41ED00903007C0FC00C8D1C053
S3150000A750508870003006E788D1C01028000648806F
S3150000A7603F0041ED00903007C0FC00C8D1C05088C2
S3150000A77070003006E788D1C03F28000441ED009004
S3150000A78003007C0FC00C8D1C05088700030 06E7888A
S3150000A790D1C04A28000767063F3C002D60043F3CB5
S3150000A7A0002B41ED00903007C0FC00C8D1C0508896
S3150000A7B070003006E788D1C01028000248803F00AC
S3150000A7C041ED00903007C0FC00C8D1C05088700031
S3150000A7D03006E788D1C03F1041ED00903007C0FC3D
S3150000A7E000C8D1C05088700030 06E788D1C04A281A
S3150000A7F0000367063F3C002D60043F3C002B22050A
S3150000A800D281D285D28110351802488 03F002004BB
S3150000A810D080D084D0803F3508007A003A062005E3
S3150000A820D080D085D08C4A35080367063F3C002D8E
S3150000A83060043F3C002B3F063F07486F00AC487959
S3150000A8400002BBE14E924FEF002A52460C4600181A
S3150000A8506500FE7C52470C4700046500FE704BED18
S3150000A8603C242A7486F00164EB900019ED44A00A3
S3150000A8706600FE3C600006C2287C00C01F624DEFE9
S3150000A88000E24A3900C01EF4660A4A3900C01EF5C5
S3150000A890670000B44A3900C01EF3670000A04A39B9
S3150000A8A000C01EF2670000962F4700E6026F00FF09

S3150000A8B000E24A3900C01EF2671013FC000100C016
S3150000A8C01EEB23D400C01F46605E700128806058CE
S3150000A8D0102F00F84880206F00CA32100241000392
S3150000A8E0C0C13C00303CFFFFD07900C01F64D04699
S3150000A8F07E003E002007D080D087EB88D08B22399F
S3150000A90000C01F66E589D0812A404A3900C01EF57D
S3150000A91067063AB900C01F704A3900C01EF46708BE
S3150000A9203B7900C01F6C000242A7486F00164EB963
S3150000A93000019ED44A006698600005FE4879000230
S3150000A940BC23600000E24A3900C01EFB660A4A3991
S3150000A95000C01EFA670000D84A3900C01EF1670021
S3150000A96000C04A3900C01EF7670000B608AF0002F3
S3150000A97000E42F7C0002404000E6026F00FF00E288
S3150000A9804A3900C01EF16700008413FC000100C0B4
S3150000A9901EEB23F900C01F5E00C01F46606E302FFD
S3150000A9A000E2024000FF0C4000036460303900C042
S3150000A9B01F60122F00F84881206F00CA341002422F
S3150000A9C00003C2C2D041534072003200068100002B
S3150000A9D0084820411010488048C0E988058000C019
S3150000A9E01D48223900C01F76E589D0812A404A39A0
S3150000A9F000C01EFB67083B7900C01F8800024A3969
S3150000AA0000C01EFA67063AB900C01F8442A7486FC5
S3150000AA1000164EB900019ED44A0066826000051AEF
S3150000AA2048790002BC6F4E92588F6000050C4A3977
S3150000AA3000C01EEF670003C070402A8008AF000206
S3150000AA4000E44A3900C01EF16700039613FC0001BA
S3150000AA5000C01EEB23F900C01F5E00C01F46600049
S3150000AA600380302F00E2024000FF0C400003640028
S3150000AA700370082F000600F96700C2044A3900C077
S3150000AA801EF7660001FA4A3900C01EF1660001F0A1
S3150000AA904240103900C01C793F004240103900C0C6
S3150000AAA01C753F004A3900C01C70660848790002D0
S3150000AAB0BCBB60C648790002BCD04E92508F4A3922
S3150000AAC000C01EF9660001B8487900026DC24879D7
S3150000AAD000C01C6C4EB9000218164A406F102F3980
S3150000AAE000C01C6C48790002BCF04E92508F0C39A5
S3150000AAF0000100C01C70630A48790002BD124E9224
S3150000AB00588F103900804024E808020000037200C4
S3150000AB101200E789068100027D9820412F28000453
S3150000AB20103900804024E40802000003424112006C
S3150000AB3030013F00103900804024020000034241EA
S3150000AB40120030013F002F3900C00E9248790002F2
S3150000AB50BD244E92303900C01EC448C0720FE3A80F
S3150000AB60486F001A4EB900023A28487900026DC6AD
S3150000AB70486F001E486F001E4EB9000217E8204FAE
S3150000AB802F28001648790002BD564E92303900C063
S3150000AB901E9AE048024000033F00303900C01E9A6A
S3150000ABA0720AE268024000033F00303900C01E9A74
S3150000ABB0720CE268024000073F00303900C01E9860
S3150000ABC00240000F3F00303900C01E98E0480240A6
S3150000ABD00001E948323900C01E98E8490241000FD9
S3150000ABE0D0413F00303900C01E987209E268024029
S3150000ABFC003F3F0048790002BD884E92303900C0C0
S3150000AC001E9A0240003F3F0048790002BDBE4E92A8
S3150000AC100839000600C01E9B670848790002BDE59A
S3150000AC20600648790002BDED48790002BDD24E9219
S3150000AC30303900C01E9C486F004402800000FFFFB0
S3150000AC404EB900023A48487900026D9E486F0048A6
S3150000AC50486F00484EB9000217E8204F2F280040E1
S3150000AC6048790002BDF44E92103900C01EC24880D9
S3150000AC703F0048790002BE144E924FEF00444A3915
S3150000AC8000C01EF7670A3C3900C01F783A06600408
S3150000AC9042457C03082F000600F967124A3900C0B6
S3150000ACA01F0C660A48790002BE2B4E92588F3E054D
S3150000ACB060000128302F00E2024000FF72003200DF
S3150000ACC0E989068100C01D4870003007E588D280FA
S3150000ACD02A414A3900C01F0C670000DE302F00E20F
S3150000ACE0024000FF3200C2FC00B006810000055899
S3150000ACF0264141EB009070003007E788D1C0284814
S3150000AD00302D0002486F000E48C04EB900023A28A6
S3150000AD10487900026DAA486F0012486F00124EB9BA
S3150000AD20000217D2487900026DA6486F000E486FE0
S3150000AD30000E4EB90002177E486F0006486C0004EC
S3150000AD40486F000A4EB9000217D2204F2F28000282
S3150000AD503015486F001248C04EB900023A284879AB
S3150000AD6000026DAA486F0016486F00164EB9000221
S3150000AD7017D2487900026DA6486F0012486F00127C
S3150000AD804EB90002177E486F000A2F0C486F000E5E
S3150000AD904EB9000217D2204F2F2800063F07302F4A
S3150000ADA000EC024000FF52403F0048790002BE44DA
S3150000ADB04E924FEF001060203F2D00023F153F07D7
S3150000ADC0302F00E8024000FF52403F004879000261
S3150000ADD0BE674E924FEF000C5247BE466300FED64A
S3150000ADE042A7486F00164EB900019ED44A0066007D
S3150000ADF0FC72600001444A3900C01EF06700013A47
S3150000AE002A87025600FF4A3900C01EF26606700104
S3150000AE102880600E13FC000100C01EEB23D400C086
S3150000AE201F464A3900C0138E670000FC08EF000079
S3150000AE3000E6600000F24A3900C01EF3670A3A399C
S3150000AE4000C01F683C05600442467A17082F0006BA
S3150000AE5000F9670E486F001248790002BE784E92DC
S3150000AE60508F3E06600000BA302F00E2024000FF1D
S3150000AE707C003C002006D080D086EB88D08B720008
S3150000AE803207E589D0812A404A3900C01F0C67760F
S3150000AE907C003C073F2D00023015486F001048C06B
S3150000AEA04EB900023A28487900026DAA486F00148C
S3150000AEB0486F00144EB9000217D2487900026DA6F9
S3150000AEC0486F0010486F00104EB90002177E486F99
S3150000AED000082006D080D086D08006800000055865
S3150000AEE02F00486F000C4EB9000217D2204F2F28E2
S3150000AEF000043F07486F009248790002BE8B4E92CD
S3150000AF004FEF001060183F2D00023F153F07486FB6
S3150000AF100009048790002BEA94E924FEF000E5247AC
S3150000AF20BE456300FF4442A7486F00164EB90001B4
S3150000AF309ED44A006600FF004A3900C01EE367043B
S3150000AF407EFD600E4A3900C01EE467047EFE600284
S3150000AF5042473007 4FEF012433C000A002464CDFC2
S3150000AF607CFC4E754E714E714E7148E73F3E33C0C4
S3150000AF7000A002484FEFFFCC2F790007ACCC000CA5
S3150000AF803F3C00094EB90001B2660279EFFF00802E
S3150000AF90400842442F7C0000055800184BEF001271
S3150000AFA049EF001C3004C0FC03C206800007A00065
S3150000AFB02F40001442457400340476003604203CC9
S3150000AFC000000090D0AF00143205C3FC00C8D08149
S3150000AFD02C40203C00000090D0AF0018320548C13C
S3150000AFE0E789D08126407200320406810000848B5
S3150000AFF020411210488148C1E989068100C01D48D8
S3150000B0003C0548C6E58ED28620413010486F0008C0
S3150000B01048C04EB900023A28487900026DAA486F26
S3150000B020000C486F000C4EB9000217D24879000296
S3150000B0306DA6486F0008486F00084EB90002177EDB
S3150000B04048572F0B486F002C4EB9000217D27200DA
S3150000B05032040681000008482041121048 8148C188
S3150000B060E989068100C01D483C0548C6E58ED286A2
S3150000B070204130280002486F000848C04EB900023F
S3150000B0803A28487900026DAA486F000C486F000CF8
S3150000B0904EB9000217D2487900026DA6486F000823
S3150000B0A0486F00084EB90002177E4857486B0004E7
S3150000B0B0486F00284EB9000217D24246246F001886
S3150000B0C0486F0020486F0024486F00104EB90002F8
S3150000B0D017D2487900026DCA486F000C486F0034D9
S3150000B0E04EB9000217D2486F0024486F0028486FF7
S3150000B0F000104EB9000217D2487900026DCA486F97
S3150000B100000C486F00384EB9000217D24A7900C0C9
S3150000B110454E660833FC000100C0454E203900C08C
S3150000B1201EDE90B900C01EDA7240B0816F064EB9BD
S3150000B13000001B0F22203D281D283EB89068100C0DE
S3150000B1401D783E0648C7E58FD28720413010486FEC
S3150000B150000848C04EB900023A28487900026DAA94
S3150000B160486F000C486F000C4EB9000217D24879A0
S3150000B17000026DA6486F0008486F00084EB900022D
S3150000B180177E48572F0A486F00304EB9000217D273
S3150000B190207900C0459030280002080000E671094
S3150000B1A04879000005544 86F002C4EB900021 5304E
S3150000B1B04A4566000126486F0028486F002C486FF4
S3150000B1C000104EB9000217D2487900026DCA486FC6
S3150000B1D0000C2F0C4EB9000217D27020D079000057
S3150000B1E007C43F002F14224C4EB90002425842 2F8A
S3150000B1F0001260123F3C00012F14224C4EB900028F
S3150000B2004258532F0012487900026DCE2F0C4EB9CA

S3150000B210000218164A406C34102F001248804A402B
S3150000B2206C0A1E2F0012488744476006 1E2F001224
S315000CB23048870C4700106C1460BA3F3CFFFF2F1480
S3150000B240224C4EB90002425852 2F00124879000291
S3150000B2506DD22F0C4EB9000218164A406F20102FDF
S3150000B26000124880 4A406C0A1E2F00124887444745
S3150000B27060061E2F001248870C4700106DBC2F0C6D
S3150000B2804EB90002455E3F400010422F00133E06B5
S3150000B29048C7202F00142207D281D287D281D081BD
S3150000B2A026403F3C0002486F00122F0B4EB90000AB
S3150000B2B03BA02002D080D082EB88068000C01D789B
S3150000B2C0320648C1E589D08120403E2800023F076A
S3150000B2D0486B00044EB90001B2C441EE00083006C6
S3150000B2E048C0E788D1C02648486F0024486F002C24
S3150000B2F0486F00104EB9000217D2487900026DCA95
S3150000B300486F000C2F0C4EB9000217D24879000284
S3150000B3106DC22F0C4EB9000218164A405DC044009B
S3150000B32048801F4000132F14224C4EB9000241E002
S3150000B3307020D079000007BC3F002F14224C4EB974
S3150000B34000024258422F001260123F3C00012F14A7
S3150000B350224C4EB90002425853 2F0012487900027F
S3150000B3606DCE2F0C4EB9000218164A406C34102FC1
S3150000B37000124880 4A406C0A1E2F00124887444734
S3150000B38050061E2F001248870C4700106C1460BA26
S3150000B3903F3CFFFF2F14224C4EB900024258522F59
S3150000B3A0001248790002 6DD22F0C4EB90002181611
S3150000B3B04A406F20102F001248804A406C0A1E2F08
S3150000B3C00012488744476006 1E2F001248870C4724
S3150000B3D000106DBC2F0C4EB90002455E3F400010B8
S3150000B3E03F3C0002486F00122F0B4EB900003BA0F5
S3150000B3F0486F0020486F002C486F00104EB90002BD
S3150000B40017D2487900026DCA486F000C2F0C4EB94E
S3150000B410000217D2487900026DC22F0C4EB9000205
S3150000B42018164A405DC04400488 01F4000132F1480
S3150000B430224C4EB9000241E07020DC79000007BCD2
S3150000B4403F002F14224C4EB900024258422F0012E0
S3150000B45060123F3CC0012F14224C4EB900024258A4
S3150000B460532F0012487900026DCE2F0C4EB9000200
S315000CB47018164A406C34102F001248804A406C0A55
S315000CB4801E2F00124887444760061E2F0012488769
S3150000B49C0C4700106C1460BA3F3CFFFF2F14224C7F
S3150000B4A04EB900024258522F0012487900026DD25E
S3150000B4B02F0C4EB9000218164A406F20102F0012AA
S3150000B4C048804A406C0A1E2F001248874447600 68F
S3150000B4D01E2F001248870C4700106DBC2F0C4EB96A
S3150000B4E00002455E3F4000103F3C0002486F0012DC
S3150000B4F0486B00044EB900003BA028AF0030702016
S3150000B500D079000007D03F002F14224C4EB900021C
S3150000B5104258422F001260123F3C00012F14224C69
S3150000B5204EB900024258532F0012487900026DCEE0
S3150000B5302F0C4EB9000218164A406C34102F001218
S3150000B54048804A406C0A1E2F00124887444760060E
S3150000B5501E2F001248870C4700106C1460BA3F3C3F
S3150000B560FFFF2F14224C4EB900024258522F0012F0
S3150000B570487900026DD22F0C4EB9000218164A40C7
S3150000B5806F20102F001248804A406C0A1E2F0012AE
S3150000B59048874447600 61E2F001248870C47001054
S3150000B5A06DBC2F0C4EB90002455E3F400010422F85
S3150000B5B000133F3C0002486F00122F0E4EB90000E8
S3150000B5C03BA028AF002C7020D079000007D23F00A6
S3150000B5D02F14224C4EB900024258422F001260121C
S3150000B5E03F3C00012F14224C4EB900024258532F03
S3150000B5F00012487900026DCE2F0C4EB900021816C3
S3150000B6004A406C34102F001248804A406C0A1E2FA4
S3150000B6100001248874447600 61E2F001248870C47D1
S3150000B62000106C1460BA3F3CFFFF2F14224C4EB939
S3150000B63000024258522F0012487900026DD22F0C98
S3150000B6404EB9000218164A406F20102F001248808B
S3150000B6504A406C0A1E2F001248874447600 61E2F78
S3150000B66000124887 0C4700106DBC2F0C4EB9000223
S3150000B670455E3F400010422F00133F3C0002486FDA
S3150000B68000012486E00044EB900003BA052465C8A88
S3150000B6900C4600186D00FA7652450C4500046D0004
S3150000B6A0F91E524406AF000000B000180C44000317
S315000CB6B06500F8F23F3C00BF487900C01D48487954
S3150000B6C00007AB464EB900003BA02F3900C000FA78
S3150000B6D048790007ACC44EB900003AB4206F000C9C
S3150000B6E0486800014879 0007ACCC4EB900003AB46E
S3150000B6F02F3900C0456E48790007ACC84EB9000026
S3150000B7003AB43F3C00034879 0007ACD04EB900017B
S3150000B710B2C43F3C00094879 0007ACD24EB90001DB
S3150000B720B2C40079100000804 0084FEF003433C0E7
S3150000B73000A0024A4CDF7CFC4E754E714E714E7174
S3150000B74048E72F3E33C000A0024C4FEFFFE8227CB3
S3150000B7500007AB46207C00C01D48705E20D951C84A
S3150000B760FFFC30914EB900015CF24246267C000097
S3150000B77005584DEF00143006C1FC03C206800007D1
S3150000B780A0002440424 72A4A284B380648C43A06B5
S3150000B79048C52C94207900C0459030280002080046
S3150000B7A0000E670E487900000 5542F0E4EB90002B0
S3150000B7B01530102D00024880907900000 7C406401D
S3150000B7C0FFE03F003015486F000A02800000FFFFCF
S3150000B7D04EB900023A48204F2F28000A43EF0012C4
S3150000B7E04EB90002425848 7900026DD6486F0010E3
S3150000B7F0486F00104EB9000217D2204F2F280008BC
S3150000B80043EF00144EB9000235102F0E486F001496
S3150000B810486F00104EB9000217E8204F2F28000885
S3150000B82043EF00104EB9000241E0487900026DDE98
S3150000B830486F0010486F00104EB90002177E487915
S3150000B84000026DAA486F000C486F000C4EB900024A
S3150000B85017E8487900026DDA486F0008486F00085B
S3150000B8604EB90002177E204F2F1043EF00144EB939
S3150000B87000023FC4486F00104EB90002453822044A
S3150000B880D281D284EB89068100C01D78340748C274
S3150000B890E58AD28220413080 2005D080D085EB8891
S3150000B8A0068000C01D78320748C1E589D081204056
S3150000B8B0316D0004000252475C8C5C8D0C47001809
S3150000B8C06D00FED00C4600036C000202424749EBB5
S3150000B8D000904BEA00902C94102D0002488090793D
S3150000B8E0000007D00640FFE03F003015486F000A11
S3150000B8F002800000FFFF4EB900023A48204F2F2871
S3150000B900000A43EF00124EB900024258487900027D
S3150000B9106DD6486F0010486F00104EB9000217D25E
S3150000B920204F2F28000843EF00144EB900023510AF
S3150000B9302F0E486F0014486F00104EB9000217E82A
S3150000B940204F2F28000843EF00104EB9000241E0B7
S3150000B950487900026DDE486F0010486F00104EB93E
S3150000B96000002177E487900026DAA486F000C486FE6
S3150000B970000C4EB9000217E8487900026DDA486FEC
S3150000B9800008486F00084EB90002177E204F2F109E
S3150000B99043EF00144EB900023FC4486F00104EB981
S3150000B9A000024538207C00000848123060004881BB
S3150000B9B048C1E989068100C01D48340748C2E58AA6
S3150000B9C0D282204130802CAC0004102D0006488025
S3150000B9D09079000007D20640FFE03F00302D0004BA
S3150000B9E0486F000A02800000FFFF4EB900023A4885
S3150000B9F0204F2F28000A43EF00124EB9000242588A
S3150000BA00487900026DD6486F0010486F00104EB995
S3150000BA10000217D2204F2F28000843EF00144EB91A
S3150000BA2000235102F0E486F0014486F00104EB9F3
S3150000BA3000217E8204F2F28000843EF00104EB9E8
S3150000BA40000241E0487900026DDE486F0010485F41
S3150000BA5000104EB90002177E487900026DAA486FA1
S3150000BA60000C486F000C4EB9000217E84879000236
S3150000BA706DDA486F0008486F00084EB90002177E5D
S3150000BA80204F2F1043EF00144EB900023FC4486FF9
S3150000BA9000104EB900024538207C000008481230DC
S3150000BAA06000488148C1E989068100C01D48340705
S3150000BAB048C2E58AD28220413140000252474BED0E
S3150000BAC000C8508C0C4700046D00FE0C524647EB34
S3150000BAD000B00C4600036D00FC9E4FEF001833C00B
S315C000BAE000A0024E4CDF7CF44E754E714E714E71C5
S3150000BAF033C000A002504A3900C01C706714227C73
S3150000BB0000C01C734A11670A53116606423900C009
S3150000BB101C7033C000A002524E754E714E714E71AC
S3150000BB2033C000A00254424033C000A00256205F3A
S3150000BB305C8F4ED04E714E714E7148E73F3E33C01A
S3150000BB4000A0C2584FEFFEB66100132238003A3CBF
S3150000BB50FFF3DA444243227C00026FE241EF002801
S3150000BB60703920D951C8FFFC4A3900C01EE9672840

S3150000BB704A3900C0138E67202A7C00C01F3E0C95F0
S3150000BB800000000026606700 12A80600C0C95000019
S3150000BB9000086604700 62A80486F00284EB9000126
S3150000BBA0A30823FC0000BB2000C01F2A23FC0000C2
S3150000BBB0BB2000C01F264BEF00FC47EF0130247C62
S3150000BBC0000222924A3900C01EF16700011E2ABCFB
S3150000BBD00023C0DC08EF000300FA600000F8082F1D
S3150000BBE00006010F670E486F002848790002C2A6BA
S3150000BBF04E92508F302F00F8E048024000FF0C4074
S3150000BC000003671030 2F00F8E048024000FF0C40A8
S3150000BC100008662C0253FF00601A2F134EB900016C
S3150000BC2043C23013024000FF5240024000FF02535D
S3150000BC30FF0081533013024000FF0C40000365DA19
S3150000BC404A3900C01EFA66164A3900C01EF3660E4F
S3150000BC50486F00A048790002C2AB4E92508F2F3930
S3150000BC6000C00A283F3C0001204F2F2800FE43EF6A
S3150000BC7000224EB90000668E206F00E030280002D8
S3150000BC800240003F3F00204F2F28001E2F28001A99
S3150000BC9043EF002A4EB9000197A6204F2F2800F047
S3150000BCA0486F001C4EB90002161A486F0018486FFC
S3150000BCB00024486F00184EB9000215DC204F2F28CB
S3150000BCC000142F280010206F00F84868000D4E92CF
S3150000BCD04FEF000C42A7486F002C4EB900019ED4CE
S3150000BCE04A006600FEFA6000116C4A3900C01EF870
S3150000BCF067542A7C008040241015E80802000003DF
S3150000BD0072001200E789068100027D9820412F28E3
S3150000BD1000041015E40802000003424112003 0013D
S3150000BD203F0010150200000342411200300 13F009F
S3150000BD302F3900C00E92487900 02C2B04E924FEFE2
S3150000BD4000010600011 1008AF000200FA2ABC0002C1
S3150000BD50C0484A3900C01EF566084A3900C01EF3BD
S3150000BD60670800AF0001000400FC4A3900C0138ECA
S3150000BD70670608EF000000FC2C7C00C00E844A39E0
S3150000BD8000C01EF567000FC00C39000500C0202258
S3150000BD90640A08EF000700FF60000FAC4A3900C0D4
S3150000BDA0138E671008AF0002013208AF000000FDD5
S3150000BDB060000F9408EF000400FF60000F8A26AFB2
S3150000BDC000F8082F0006010F67444A4463404A39C9
S3150000BDD000C01EF766380C440013660A4A3900C0D4
S3150000BDE01EFA670254450C440013660A4A3900C01D
S3150000BDF0138E67025645486F002870003005E588A7
S3150000BE00068000026DE220402F104E92508F3013B4
S3150000BE10024000FF3200C2FC02E4068100C013B6F5
S3150000BE202A4142461C2D02B642471E2D02B74A39C8
S3150000BE3000C01EF366164A3900C01EF5660E486F2E
S3150000BE4000A048790002C2F24E92508F300406409C
S3150000BE50FFF30C40000762000EEED040303B0006B8
S3150000BE604EFB00020010034E0EE201A80CFC0D541E
S3150000BE7005D8CDB0082F0006010F671C227C0002B2
S3150000BE807D9041EF011420D92091227C00027D9003
S3150000BE9041EF011C20D920913F073F064879000257
S3150000BEA0C2F74E92508F4247207900C04590302805
S3150000BEB000020800000F6708287C00026FC0605A65
S3150000BEC0287C00026FBC6052101C4880024000FFB4
S3150000BED0E148025300FF81533013E048024000FF5F
S3150000BEE03F002F0D4EB900014A023F3C000141EDD3
S3150000BEF001BE3013E048024000FF72003200E589BF
S3150000BF00D1C12F102F1342A74EB90001733248 79C1
S3150000BF100002C3004E92588F52470C4700046DA88A
S3150000BF2042474A47660602530 0FF6008025300FF75
S3150000BF3008D300003F3C00012F1343EF012E4EB9FA
S3150000BF4000006958206F00DC3013E048024000FF13
S3150000BF5072003200E589D1C10828000200016700 9D
S3150000BF600094204F2F28012C2F28012841EF011C77
S3150000BF70300748C0E788D1C02F2800042F1043EFB0
S3150000BF800124300748C0E788D3C04EB90001944C5D
S3150000BF90206F00E030280002024000 3F3F00204FA3
S3150000BFA02F28012E2F28012A43EF002A4EB900011F
S3150000BFB097A6204F2F2800F0486F001C4EB90002AC
S3150000BFC0161A486F0018486F0024486F00184EB9BB
S3150000BFD000 0215DC204F2F2800142F280010206F98
S3150000BFE000F84868000D4E924FEF000C48790002A9
S3150000BFF0C30260064879 0002C3044E92588F524726
S3150000C0000C4700025D00FF1C60000D3C2F134EB95B
S3150000C010000143C2424720 7900C0459030 28000203
S3150000C0200800000F6708287C00026FC9605A287C48
S3150000C03000026FC46052101C4880024000FFE148B5
S3150000C04002 5300FF81533013E048024000FF3F00D7
S3150000C0502F0D4EB900014A023F3C000141ED01BEE1
S3150000C0603013E048024000FF72003200E589D1C17A
S3150000C0702F102F1342A74EB900017332487900 02E0
S3150000C0800C3104E92588F52470C4700046DA83013C8
S3150000C090024000FF3F0043EF00264EB900015A124E
S3150000C0A0204F2F28002448790002C3124E923013E5
S3150000C0B0024000FF3F0043EF002E4EB900015990A9
S3150000C0C0204F2F28002C48790002C31C4E924FEFB8
S3150000C0D000102A7C00026FCE287C00026FD260001E
S3150000C0E000C41015488002 4000FFE148025300FFDB
S3150000C0F08153206F00DC3013E048024000FF7200DD
S3150000C1003200E589D1C1082800020001670000 88D5
S3150000C1103F3C00012F1343EF001E4EB90000695843
S3150000C120206F00E030280002024000 3F3F00204F11
S3150000C1302F28001E2F28001A43EF002A4EB90001AF
S3150000C14097A6204F2F2800F0486F001C4EB900021A
S3150000C150161A486F0018486F0024486F00184EB929
S3150000C160000215DC204F2F2800142F280010206F06
S3150000C17000F84868000D4E922F1448790002C32437
S3150000C1804E924FEF0014BBFC00026FD16712487944
S3150000C1900002C327600648790002C3294E92588FD1
S3150000C1A0528D588CBBFC00026FD26500FF366000D2
S3150000C1B00B964A3900C01EF466000178025300FF50
S3150000C1C008D300023F3C00042F0D4EB900014A027D
S3150000C1D02F2D01CE48790002C3354E9248790002D0
S3150000C1E0C33F4E923013024000FF3F0043EF003240
S3150000C1F04EB900015AA8204F2F280030487900 0276
S3150000C200C3414E9202530 0FF00530A003F3C000117
S3150000C2102F1343EF00324EB90000695820 6F00F427
S3150000C22030280002024000 3F3F00204F2F280032F6
S3150000C2302F28002E43EF003E4EB9000197A6204F4F
S3150000C2402F280104486F00304EB90002161A486FB5
S3150000C250002C486F0038486F002C4EB9000215DCE0
S3150000C260204F2F2800282F280024206F010C486813
S3150000C270000D4E92307C009AD1EF010C3013E0484D
S3150000C280024000FF3200C2FC002CD1C14868001AEF
S3150000C29048790002C34B4E9202530 0FF00530B0035
S3150000C2A03F3C00012F1343EF00464EB90000695 88A
S3150000C2B0206F0108302800020240003F3F00204F57
S3150000C2C02F2800462F28004243EF00524EB90001A6
S3150000C2D097A6204F2F280118486F00444EB9000238
S3150000C2E0161A486F0040486F004C486F00404EB920
S3150000C2F000 0215DC204F2F28003C2F280038206F25
S3150000C30001204868000D4E924FEF0034307C009AB1
S3150000C310D1EF00EC3013E048024000FF3200C2FCCF
S3150000C320002CD1C14868001A48790002C350600049
S3150000C330035C3013024000FF3F0043EF00264EB976
S3150000C340000015A123013024000FF3F0043EF002263
S3150000C3504EB90001599 03013024000FF3F0043EFF1
S3150000C360001E4EB900015AA8204F2F28001C204F4E
S3150000C3702F280024204F2F28002C3F073F064879FE
S3150000C380002C3554E924FEF00144A3900C01EF00A
S3150000C390670009B4287C00027C1860000092101423
S3150000C3A04880024000FFE148025300FF81533013EA
S3150000C3B0E048024000FF3F002F0D4EB900014A023F
S3150000C3C041ED01BE3013E048024000FF720032002A
S3150000C3D0E589D1C12F1048790002C36F4E92301300
S3150000C3E0E048024000FF0C40000466084879 00025D
S3150000C3F0C37D602C303CFF00C053660848790002BC
S3150000C400C37F601C3013E048024000FF0C4000016F
S3150000C4106608487900 02C3816006487900 02C38332
S3150000C42048790002C3784E924FEF0010528CB9FC47
S3150000C43000027C1C6500FF686000090C4A3900C0D8
S3150000C4401EFA66000250486F00A048790002C387B2
S3150000C4504E92508F4A3900C0138E6730303CFF0031
S3150000C460C053660848790002C38C601C3013E0484C
S3150000C470024000FF0C40000566084879 0002C390A0
S3150000C480600648790002C3944E92588F0C39000416
S3150000C49000C02022640E206F00E008280002000180
S3150000C4A0670008A408EF000301322 03C000000AA40
S3150000C4B0D0963213E049024100FF3401C4FC002C3F
S3150000C4C0D08206800000016224041EF013470043D

S3150000C4D020D951C8FFFC30913F3C000D2F1343EF8C
S3150000C4E0001E4EB9000069583013E048024000FFB4
S3150000C4F072003200D2810681000007BC20413F1045
S3150000C500204F2F28001E2F28001A43EF002A4EB96D
S3150000C510000197A63F3C000B2F1343EF00164EB9C0
S3150000C520000069583013E048024000FF72003200F4
S3150000C530D2810681000007BC20413F10204F2F28E2
S3150000C54000162F28001243EF00224EB9000197A6CD
S3150000C5503F3C00072F1343EF000E4EB90000695809
S3150000C5603013E048024000FF72003200D28106813B
S3150000C570000007BC20413F10204F2F28000E2F2817
S3150000C580000A43EF001A4EB9000197A6486F01341E
S3150000C590486F000C4EB90002161A486F0008486F23
S3150000C5A00014486F00084EB9000215DC204F2F28F2
S3150000C5B000042F10486F013C486F001C4EB9000262
S3150000C5C0161A486F0018486F0024486F00184EB9B5
S3150000C5D0000215DC204F2F2800142F280010486F6A
S3150000C5E00144486F002C4EB90002161A486F002805
S3150000C5F0486F0034486F00284EB9000215DC204F02
S3150000C6002F2800242F28002048790002C3984E9234
S3150000C6104FEF001C4A3900C01EF96752302F013215
S3150000C620720AE268024000017E003E00486F013453
S3150000C6307044D0B900C001062207E7899287E789CE
S3150000C640D0813213E049024100FF74003401E58ACB
S3150000C650D0822F00486F002C4EB9000217D2204F0F
S3150000C6602F28002448790002C3B14E92508F4A39D0
S3150000C67000C0138E660C486F013848790002C3B9B2
S3150000C680600A486F013848790002C3BC4E92508F49
S3150000C690600006B43013E048024000FF0C4000037F
S3150000C6A066000258302F0132720AE2680240000129
S3150000C6B07E003E002007ED889087E788068000E030
S3150000C6C000E23213024100FF3401C4FC00A8D0820C
S3150000C6D00680000000242A40224D41EF012420D983
S3150000C6E020D92091486F00A048790002C3C14E921C
S3150000C6F03F39000007C22F2D00082F2D00042F15EB
S3150000C70043EF00364EB90001986A302F013A720A9B
S3150000C710E268024000017C003C003013024000FF4A
S3150000C7207E003E003F39000007C42006E788D08619
S3150000C730E588068000E0000A2207D281D287E589D3
S3150000C740D08120402F2800082F2800042F1043EF07
S3150000C750002E4EB90001986A302F013A720AE2683B
S3150000C760024000017C003C003013024000FF7E00C6
S3150000C7703E003F39000007D02006E788D086E588CE
S3150000C780068000E0009A2207D281D287E589D0810F
S3150000C79020402F2800082F2800042F1043EF0026E2
S3150000C7A04EB90001986A205648680278486F00140E
S3150000C7B04EB90002161A486F0010486F001C486FE9
S3150000C7C000104EB9000215DC204F2F28000C2F2830
S3150000C7D00008205648680170486F00244EB90002D0
S3150000C7E0161A486F0020486F002C486F00204EB97B
S3150000C7F0000215DC204F2F28001C2F280018205679
S3150000C80048680144486F00344EB90002161A486F52
S3150000C8100030486F003C486F00304EB9000215DC0E
S3150000C820204F2F28002C2F28002848790002C3C645
S3150000C8304E924FEF00242F134EB9000143C23F39E9
S3150000C840000007C22F2D00082F2D00042F1543EFDF
S3150000C850002E4EB90001986A204F2F28012C2F2850
S3150000C86001282F2801242F2D00082F2D00042F1515
S3150000C87043EF00244EB90001962E3F39000007C24F
S3150000C880204F2F2800162F2800122F28000E43EFC6
S3150000C89000264EB90001986A205648680144486F40
S3150000C8A000144EB90002161A486F0010486F001C9B
S3150000C8B0486F00104EB9000215DC204F2F28000CDF
S3150000C8C02F280008205648680144486F00244EB9B6
S3150000C8D00002161A486F0020486F002C486F00208F
S3150000C8E04EB9000215DC204F2F28001C2F280018F7
S3150000C8F048790002C3DF600003123013E0480240AB
S3150000C90000FF0C4000086600043E302F0132720A1B
S3150000C910E268024000017E003E002007ED88908715
S3150000C920E788068000E000E23213024100FF34018E
S3150000C930C4FC00A8D0820680000000602A40224D78
S3150000C94041EF012420D920D92091486F00A04879D1
S3150000C9500002C3F04E923F39000007CC2F2D00088D
S3150000C9602F2D00042F1543EF00364EB90001986AAB
S3150000C970302F013A720AE268024000017C003C0056
S3150000C98030130240000FF7E003E003F39000007CE14
S3150000C99020006E788D086E588068000E00052220758
S3150000C9A0D281D287E589D08120402F2800082F2800
S3150000C9B000042F1043EF002E4EB90001986A302F65
S3150000C9C0013A720AE268024000017C003C00301322
S3150000C9D0024000FF7E003E003F39000007D02006DF
S3150000C9E0E788D086E588068000E0009A2207D28193
S3150000C9F0D287E589D08120402F2800082F280004FF
S3150000CA002F1043EF00264EB90001986A2056486859
S3150000CA100278486F00144EB90002161A486F0010CB
S3150000CA20486F001C486F00104EB9000215DC204FFD
S3150000CA302F28000C2F28000820564868024C486F03
S3150000CA4000244EB90002161A486F0020486F002CC9
S3150000CA50486F00204EB9000215DC204F2F28001C1D
S3150000CA602F280018205648680220486F00344EB917
S3150000CA70002161A486F0030486F003C486F0030BD
S3150000CA804EB9000215DC204F2F28002C2F28002835
S3150000CA9048790002C3F54E924FEF00242F134EB98A
S3150000CAA0000143C23F39000007CC2F2D00082F2D6F
S3150000CAB000042F1543EF002E4EB90001986A204F4F
S3150000CAC02F28012C2F2801282F2801242F2D00087C
S3150000CAD02F2D00042F1543EF00244EB90001962E8A
S3150000CAE03F39000007CC204F2F2800162F280012B0
S3150000CAF02F28000E43EF00264EB90001986A2056F3
S3150000CB0048680220486F00144EB90002161A486F92
S3150000CB100010486F001C486F00104EB9000215DC6B
S3150000CB20204F2F28000C2F28000820564868022086
S3150000CB30486F00244EB90002161A486F0020486F4D
S3150000CB40002C486F00204EB9000215DC204F2F281C
S3150000CB50001C2F28001848790002C40E600000ACA3
S3150000CB603013E048024000FF0C400007640001D883
S3150000CB70486F00A048790002C41F4E92508F3013B0
S3150000CB80E048024000FF3F002F0D4EB900014A0267
S3150000CB903F3C000241ED01BE3013E048024000FF79
S3150000CBA072003200E589D1C12F102F1342A74EB96A
S3150000CBB000017332600001903013024000FF3F0015
S3150000CBC043EF00264EB900015A123013024000FF0F
S3150000CBD03F0043EF00224EB9000159903013024046
S3150000CBE000FF3F0043EF001E4EB900015AA8204F38
S3150000CBF02F28001C204F2F280024204F2F28002CE0
S3150000CC003F073F0648790002C4244E924FEF0014B6
S3150000CC10600001343013024000FF3F0043EF00265E
S3150000CC204EB900015C2E025300FF08D300003F3CC2
S3150000CC3000002F2D01C22F1342A74EB900017332F7
S3150000CC4048790002C43E4E92025300FF08D3000109
S3150000CC503F3C00002F2D01C62F1342A74EB90001FD
S3150000CC60733248790002C4404E92025300FF0053CB
S3150000CC7006003013024000FF3F0043EF011A4EB991
S3150000CC80000015B8E3F3C0000204F2F28011A2F1316
S3150000CC9042A74EB90001733248790002C4424E924F
S3150000CCA0025300FF005306003F3C0000486F011E80
S3150000CCB0486D01D6486F00364EB9000217A6204FC0
S3150000CCC02F28002E2F1342A74EB900017332487940
S3150000CCD00002C4444E923F3C00002F2D01D62F1374
S3150000CCE042A74EB90001733248790002C4464E92FB
S3150000CCF03013024000FF3F0043EF00364EB90001FB
S3150000CD005A123013024000FF3F0043EF00324EB983
S3150000CD10000015990204F2F280030204F2F280382F
S3150000CD204879000270CA486F0044486F00444EB903
S3150000CD300000217D2204F2F28003C48790002C44831
S3150000CD404E924FEF002442A7486F002C4EB90001C7
S3150000CD509ED44A006600F0684A3900C01EE66600A6
S3150000CD6000F44A3900C01EE5660000EA4A3900C0F0
S3150000CD701EEF670000E04A3900C01EF7660000D6C5
S3150000CD80206F00E03010024000030C4000016300F9
S3150000CD900C4082F000200FA660A48790002C45C43
S3150000CDA04E92588F42474A476606025300FF600874
S3150000CDB0025300FF08D30000206F00DC3013E04868
S3150000CDC0024000FF72003200E589D1C10828000246
S3150000CDD000001676C206F00E0302800020240003F2F
S3150000CDE03F0041EF0116300748C0E788D1C02F2821
S3150000CDF000042F1043EF002A4EB9000197A6204FDA
S3150000CE002F2800F0486F001C4EB90002161A486F12
S3150000CE100018486F0024486F00184EB9000215DC50
S3150000CE20204F2F2800142F280010206F00F8486884

S3150000CE30000D4E924FEF000C48790002C494600634
S3150000CE4048790002C4964E92588F52470C4700020A
S3150000CE506D00FF5430034FEF014A33C000A0025A61
S3150000CE604CDF7CFC4E754E714E714E7133C000A086
S3150000CE70025C720D70003001068000C01EE2204088
S3150000CE804A10670430C1600A52410C41001463E401
S3150000CE90424033C000A0025E4E754E714E714E7117
S3150000CEA048E73F3E33C000A002604FEFFC604242BD
S3150000CEB0227C0002743041EF0020703920D951C81D
S3150000CEC0FFFC486F00204EB90001A30823FC0000B8
S3150000CED0EA6400C01F2A23FC0000EA6400C01F2683
S3150000CEE02A7C000222920CB903FFFFFF00C0456EA8
S3150000CEF0640A48790002CCB06000090247EF00D806
S3150000CF00247C00C001064A3900C01EFD6700046A81
S3150000CF1000AF0029400400F408EF000300F208EF18
S3150000CF20000200F249EF00E02C7C00C01EEE302F1C
S3150000CF3000F2024003FFB0426300037A4A1666001D
S3150000CF400374322F00F2024103FF76003601D683C6
S3150000CF50068300C00C7020433010B0426D000356AB
S3150000CF601CBC0001302F00F2024003FF72003200A9
S3150000CF70D281068100C00C702041301048C023C009
S3150000CF8000C01F526000032E082F0006010767002D
S3150000CF90014A302F00F2024003FF4A4063184AAFAD
S3150000CFA000DC67044A16660E48790002CCCF4E951F
S3150000CFB0588F600003124A16675E4AAF00DC672A84
S3150000CFC0703F206F00DCC0A8000C2F0048790002DB
S3150000CFD0CCE34E95508F206F00DC2F2800083F3C95
S3150000CFE000444EB900000F2C605E0C9200030C60EA
S3150000CFF0660848790002CD5860160C9200C0010AF6
S3150000D000660848790002CD6060064879002CD695D
S3150000D01048790002CD2E602C0C9200030C60660845
S3150000D02048790002CD8F60160C9200C0010A66088E
S3150000D03048790002CD976006487900002CDA048796C
S3150000D0400002CD6F4E95508F206F00E02F1C48796B
S3150000D0500002CDA64E95206F00E830280004E04877
S3150000D0600240001F3F0048790002CDB94E95206F5F
S3150000D07000EE30280004024000F3F00487900020D
S3150000D080CDD14E95206F00F430280006E0480240CE
S3150000D09000FF3F0048790002CDEE4E95206F00FA62
S3150000D0A030280006024000FF3F0048790002CE0308
S3150000D0B04E954FEF00204A3900C01EFE660C486FA1
S3150000D0C0002048790002CE12600A486F0020487995
S3150000D0D00002CE424E95508F78004A3900C01EFE9F
S3150000D0E0660000C8206F00D830280002024003FCA
S3150000D0F03F00206F00DA30280002080000D6706A6
S3150000D1003F3C005960043F3C004E206F00DC302855
S3150000D1100002080000E67063F3C005960043F3CD1
S3150000D120004E206F00DE302800020800000F670660
S3150000D1303F3C005960043F3C004E206F00E0301039
S3150000D14002400003 3F00206F00E2082800020001B1
S3150000D15067063F3C005960043F3C004E206F00E4E8
S3150000D16000828000300167063F3C005960043F3C65
S3150000D170004E206F00E608280004000167063F3CC9
S3150000D18000596004 3F3C004E206F00E83010EA482A
S3150000D190024007FF3F00486F00AA48790002CE66AA
S3150000D1A04E954FEF001A6000010C204F2F2800D833
S3150000D1B04EB900007E567A003A0067405885206FC7
S3150000D1C000D830280002080000F67047E036002C2
S3150000D1D04247206F00D83010024000372030281DC
S3150000D1E00000FFFF82C0D24770003001E5882205AB
S3150000D1F0C1414EB900025A82C1412A013F3C000199
S3150000D200204F2F2800E2204F2F2800DE4EB90000C5
S3150000D2107E927C003C0067305886206F00D830280C
S3150000D22000020800000D671E3F3C0000204F2F281B
S3150000D23000E2204F2F2800DE4EB900007E927200D9
S3150000D2403200DC815886E58E3F3C0001204F2F28B6
S3150000D25000E2204F2F2800DE4EB900007F347E000A
S3150000D2603E0067305887206F00D83028000208003B
S3150000D270000E571E3F3C0000204F2F2800E2204F83
S3150000D2802F2800DE4EB900007F3472003200DE81A6
S3150000D2905887E58F2605D686D6872F032F072F06B4
S3150000D2A02F05486F00A848790002CE974E954FEF9C
S3150000D2B00018D88342A7486F00244EB900019ED4B7
S3150000D2C04A00660 0FCC44A3900C01EFE67001642CA
S3150000D2D02F0449EF00602F0C48790002CEAF4E951F
S3150000D2E04FEF000C4A3900C01EE966001624487844
S3150000D2F00220486F006048790002CEC74E9506842A
S3150000D300000002204878006 4486F006C48790002EB
S3150000D310CEE04E950684000000642F04486F007826
S3150000D32048790002CEF84E954FEF0024303C03FFBB
S3150000D330C06F00F2660015DA487900027F30486F48
S3150000D3400060487900 02CF084E954FEF000C4A84E2
S3150000D35067001 5BE203C00027F3022044EB9000251
S3150000D36053E02F00486F006048790002CF1F4E95AA
S3150000D3704FEF000C6000159A7CFF4A3900C01F0F62
S3150000D38066544A3900C01F10664C4A3900C01EE96F
S3150000D390670002B24A3900C01F06663A4A3900C021
S3150000D3A01F0766324A3900C01F08662A4A3900C07C
S3150000D3B01F0966224A3900C01F0A661A4A3900C088
S3150000D3C01F0B66124A3900C01F0C660A4A3900C094
S3150000D3D01F0D670002703F3C001C43EF010A4EB967
S3150000D3E0000073180C9200C0010A674E24BC00C0EE
S3150000D3F0010A4AAF0108672E327C0010D3EF0108FC
S3150000D400207C00C0010A704D20D951C8FFFC487924
S3150000D41000030D18487900C001C2487800404EB993
S3150000D42000000123260 14227C00030C60207C00C0D5
S3150000D430010A704D20D951C8FFFC4A3900C01F0FA0
S3150000D440671A303C00FFC07900C01FD8E148027956
S3150000D45000 0FF00C00110817900C001104A3900C0E8
S3150000D4601F106718303C00FFC07900C01FDC02792E
S3150000D470FF0000C00110817900C00110287C00C0A7
S3150000D4800112267C00C01F3E4A3900C01F06674AAB
S3150000D4904AB900C01FB26726203C000005A0223909
S3150000D4A000C01FB24EB900024FCC4A8063104879C3
S3150000D4B00002CF3E4E95588F4240600014 56303CD5
S3150000D4C007FFC07900C01FB4EB482213D286E58956
S3150000D4D00274001F1800817418004A3900C01F0723
S3150000D4E0671C303900C01FB802400001E94822130A
S3150000D4F0D286E58908B4000418018174 18004A39F7
S3150000D5000C01F08673C2213D286E5893034180014
S3150000D510EA48024007FF4A40631E303900C01FBC7C
S3150000D52002400001E7482213D286E58908B40003C9
S3150000D530180181741800600A48790002CF594E9587
S3150000D540588F4A3900C01F09671C303900C01FC0F8
S3150000D55002400001E5482213D286E58908B400029C
S3150000D5601801817418004A3900C01F0A6718700331
S3150000D570C07900C01FC42213D286E5890274FFFC5D
S3150000D58018008174180 04A3900C01F0B671E303915
S3150000D59000C01FC802400001720FE3682213D28642
S3150000D5A0E58908B400071802817418024A3900C0D8
S3150000D5B01F0C674E2213D286E58930341800EA48DC
S3150000D5C0024007FF4A4063302213D286E589303491
S3150000D5D01802080000F6720303900C01FCC024037
S3150000D5E00001720EE3682213D286E58908B40006AC
S3150000D5F0180281741802600A48790002CF8B4E9592
S3150000D600588F4A3900C01F0D671E303900C01FD021
S3150000D61002400001720DE3682213D286E58908B440
S3150000D620000518028174180248790 0C0010A4EB933
S3150000D63000008A204A40660012D848790002CFE2EC
S3150000D6406C0001BA4A3900C01F0E67344EB90000A7
S3150000D65087960C000001670C4A0067100C00000258
S3150000D660671260244879 0002CFF9600E48790002FB
S3150000D670D010600648790002D0274E95588F600872
S3150000D6804A3900C01F11670A4EB900008BBE600000
S3150000D69012804A3900C01F12671E24BC00C0010A4E
S3150000D6A0227C00030C60207C00C0010A704D20D94A
S3150000D6B051C8FFFC6000125A287C00C00580283C37
S3150000D6C0000151802C7C0001900A4A3900C01EF7E7
S3150000D6D0670001324A3900C01EE4660000B048798E
S3150000D6E00002D03D48790002D0384E95508F4A3915
S3150000D6F000C01EEC67082C3900C01F4A60062C3992
S3150000D70000C000FA2A062005223C00093A804EB9DC
S3150000D710000253E0C1414EB900025A82C14106815E
S3150000D720FFFEAE802A014247760852430C430007AB
S3150000D73065184243 48790002D08D4E95588F2F05C3
S3150000D7403F3C00444EB900000F2C48790002D090AF
S3150000D7504E952F0543EF00264E96307C00DAD1D445
S3150000D76043EF00227C0010290001EB88D1C0486801
S3150000D770001848790002D0924E954FEF000C5247A0
S3150000D780DA840C47008C6DA2600011860C39000506

S3150000D79000C0202264104AB900C00E786708487994
S3150000D7A00002D09960564AB900C00E7867164879CB
S3150000D7B00000960048790002D0D64EB900016922D1
S3150000D7C03E0060027E590C47005967060C470079F7
S3150000D7D066244EB90001B0F24EB90001B0F23F3CEA
S3150000D7E000084EB90001B26674FB13FC000100C0CC
S3150000D7F00E906000111C48790002D1014E95588F99
S3150000D8006000110E4A3900C01EFB673208EF0000A7
S3150000D81000F76014303C03FFCC6F00F2660A3F3C1D
S3150000D820000B4EB9000072F0486F013C486F0024AF
S3150000D8304EB900019ED44A0066DA600010D44A3917
S3150000D84000C01F0267584A3900C01EF166504A39A7
S3150000D85000C01F03670A23F900C01FA600E004DE0C
S3150000D8604A3900C01F04670010A84A3900C01EECE0
S3150000D8706700109E23F900C01FAA00E004E623F902
S3150000D88000C01F4A00E00502487900C01FAA487977
S3150000D89000E004E24EB9000214FA600010744A393E
S3150000D8A000C01EFA6700009E203900C01F822204B5
S3150000D8B04EB9000253E04EB900025A822A002F05E3
S3150000D8C043EF00224E96307C00DAD1D443EF001E9F
S3150000D8D07000102900001EB88D1C048680018487 90B
S3150000D8E00002D1154E95508F42462E057007C00690
S3150000D8F0661648790002D1344E95588F2F073F3C63
S3150000D90000744EB900000F2C2F0743EF00224E96ED
S3150000D91041EF001E7A001A10701AD0942205D281A7
S3150000D920D285E589D0812F0048790002D1374E95FE
S3150000D930508F52460687000003840C46006065AC93
S3150000D94060000FCE4A3900C01EF867744247307C2B
S3150000D95000DAD1D4300748C0EB88D1C04A28001875
S3150000D9606752307C00DAD1D4300748C0EB88D1C08A
S3150000D97048680018300752403F0048790002D13FFE
S3150000D9804E954FEF000A4246307C00DAD1D430077C
S3150000D99048C0EB88D1C070003006D1C01010488056
S3150000D9A03F0048790002D14D4E955C8F52460C4699
S3150000D9B0001865D452470C4700106D9260000F5254
S3150000D9C04A3900C01EF96746287900C005846034CC
S3150000D9D048790002D1534E952F1C3F3C00434EB967
S3150000D9E000000F2C48790002D1564E952F1C3F3C63
S3150000D9F000434EB900000F2C48790002D1584E95CD
S3150000DA004FEF000C2014B08666C660000F044DEF81
S3150000DA1000E84A3900C01EF3662A4A3900C01EF6DD
S3150000DA2066224A3900C01EF2661A4A3900C01EF440
S3150000DA3066124A3900C01EF5660A4A3900C01F0040
S3150000DA40670004E44A3900C01F1467064EB9000097
S3150000DA504A6849EF013C00AF0018C00000F408EF27
S3150000DA60000300F21F7C000401054A3900C01EFFB6
S3150000DA70660003B800AF0065003800F445EF0010FB
S3150000DA8060000390082F000601076726486F0020F4
S3150000DA9048790002D15A4E95508F4A3900C01EFF70
S3150000DAA0671048790002D16648790002D15F4E9529
S3150000DAB0508F2A2F00F470C3C1AF00F408EF0001A5
S3150000DAC000F71F7C00FF010460000330102F0104E3
S3150000DAD0488048C081FC000448404A4066024246ED
S3150000DAE04A3900C01EF4660A4A3900C01EF56700AE
S3150000DAF0010A082F00070107670000DE206F00D823
S3150000DB000828000300016708082F000200F2661AC1
S3150000DB10082F000200F2660C00C0206F00D83028EF
S3150000DB2000020800000E670000B04A4666427C010B
S3150000DB30486F009848790002D16C4E95508F424745
S3150000DB40601C4A3900C01EF5670848790002D17189
S3150000DB50600648790002D1834E95588F5247102FA0
S3150000DB60010488048C081FC00044840BE406DD294
S3150000DB704A4667000286487900002D18D4E95588F35
S3150000DB802F0C204F2F2800F44EB900007BCA2240EC
S3150000DB9041EF039820D920914A3900C01EF5670E3F
S3150000DBA0204F2F28039C3F3C0063600000EC204F71
S3150000DBB02F2800E8486F039C486F00244EB90002E6
S3150000DBC017D2204F2F28001C206F00F04868000D48
S3150000DBD04E95508F600002244A466700021E4A395D
S3150000DBE000C01EF5670A48790002D18F60000178EF
S3150000DBF048790002D1A16000016E4A3900C01F00B9
S3150000DC006600016C082F00070107670013E206FC0
S3150000DC1000D808280002000167000130082F000222
S3150000DC2000F2660A08280005000267000 11E4A463F
S3150000DC3066427C01486F009848790002D1AB4E9548
S3150000DC40508F4247601C4A3900C01EF26708487967
S3150000DC500002D1B0600648790002D1BC4E95588FBB
S3150000DC605247102F0104488048C081FC00044840F8
S3150000DC70BE406DD24A46670001824879 0002D1C88B
S3150000DC804E95588F4A3900C01EF26716206F00DC89
S3150000DC902F2800083F3C00444EB900000F2C6000BE
S3150000DCA0015A3F3C00002F0C204F2F2800F643EF6F
S3150000DCB001364EB900007872206F00D83028000275
S3150000DCC00240003F3F004A3900C01EF66720204F41
S3150000DCD02F28013A2F280136204F2F28013A2F28C6
S3150000DCE00136224A4EB900019590224A600443EF5C
S3150000DCF0012E2F2900042F1143EF00224EB90001F7
S3150000DD0097A6204F2F2800E8486F000C4EB9000256
S3150000DD1C161A486F0008486F001C486F00084EB975
S3150000DD20000215DC204F2F2800042F10206F00F072
S3150000DD304868000D4E954FEF000C43EF012C41EF64
S3150000DD40013420D92091600000B24A46670000AC39
S3150000DD504A3900C01EF2670848790002D1CA600637
S3150000DD6048790002D1D64E95588F6000008E4A3908
S3150000DD7000C01F00670000842F6F00DC01084A46C0
S3150000DD8066107C01486F009848790002D1E24E95F2
S3150000DD90508F204F2F2801084EB9000050F03F0049
S3150000DDA0082F0007010967063F3C004460043F3C1A
S3150000DDB0002D206F00E0486800104EB900008A2050
S3150000DDC04A4067063F3C006D60043F3C002D204FF3
S3150000DDD02F2800E24EB9000089904A4067063F3C72
S3150000DDE0004360043F3C002D204F2F2800E4487973
S3150000DDF00002D1E74E954FEF0010486F013C486F87
S3150000DE000000244EB900019ED44A006600FCC02F458E
S3150000DE1000F4486F013C486F00244EB900019ED4BF
S3150000DE204A006600FC6060000AE808EF000200F2A3
S3150000DE307C0008EF000100F7600000D4082F000600
S3150000DE400107671E486F002048790002D1F84E95F9
S3150000DE5048790002D20448790002D1FD4E954FEF71
S3150000DE600010102F0104488048C081FC000448407F
S3150000DE704A406626486F009848790002D20A4E95B5
S3150000DE80508F4A3900C01EFF671048790002D2162B
S3150000DE9048790002D20F4E95508F48790002D21A67
S3150000DEA04E95588F4A3900C01F0067262F6F00DC39
S3150000DEB00108204F2F2801084EB9000050F03F00FE
S3150000DEC0204F2F2800DE48790002D21C4E954FEFD6
S3150000DED0000A082F00070107672A4A3900C01EF604
S3150000DEE066047E0060022E0620542028000490 87D7
S3150000DEF02F0048790002D2274E95508F20542C28A7
S3150000DF00004600A48790002D22D4E95588F486F5A
S3150000DF10013C486F00244EB900019ED44A006600B9
S3150000DF20FF1C600009EC4A3900C01EF0670003328E
S3150000DF3008EF000300F200AF006D40FC00F4287CFF
S3150000DF400000695860000304082F00060107672EC9
S3150000DF5048790002D28A48790002D28448790002C0
S3150000DF60D27B48790002D27148790002D26B486FA1
S3150000DF700034487900 02D2384E954FEF001C486FA6
S3150000DF8000984879 0002D2914E95508F206F00D8A4
S3150000DF90082800020001670 8082F000200F2661A2E
S3150000DFA0206F00D830280002080000D670001B27B
S3150000DFB0082F000200F2660001A83F3C000C204F2B
S3150000DFC02F2800F243EF013A4E943F3C000A204FBF
S3150000DFD02F2800F243EF01224E943F3C0006204FCB
S3150000DFE02F2800F243EF011A4E943F3C0000204FC9
S3150000DFF02F2800F243EF01124E94206F00D83028EC
S3150000E00000020240003F3F00204F2F28013A2F28F0
S3150000E010013643EF00224EB9000197A6204F2F2864
S3150000E02000E8486F00144EB90002161A486F001037
S3150000E030486F001C486F00104EB9000215DC204FD7
S3150000E0402F28000C2F280008206F00F04868000DCC
S3150000E0504E95206F00E4302800020240003F3F004A
S3150000E060204F2F28012E2F28012A43EF002E4EB9CC
S3150000E070000197A6204F2F2800F4486F00204EB9C4
S3150000E0800002161A486F001C486F0028486F001CD3
S3150000E0904EB9000215DC204F2F2800182F28001437
S3150000E0A0206F00FC4868000D4E95206F00F0302868
S3150000E0B000020240003F3F00204F2F2801322F2848
S3150000E0C0012E43EF003A4EB9000197A6204F2F28A4
S3150000E0D00100486F002C4EB90002161A486F00283E
S3150000E0E0486F0034486F00284EB9000215DC204FF7

S3150000E0F02F2800242F280020206F01084868000DD3
S3150000E1004E95206F00FC302800020240003F3F0081
S3150000E110204F2F2801362F28013243EF00464EB9F3
S3150000E120000197A6204F2F28010C486F00384EB9E2
S3150000E1300002161A486F0034486F0040486F0034DA
S3150000E1404EB9000215DC204F2F2800302F28002C56
S3150000E150206F01144868000D4E954FEF0030601097
S3150000E16048790002D29E48790002D2964E95508F89
S3150000E1704A3900C01EFE675C206F00D808280003DD
S3150000E1800001670000C6302F00F0E048024000FFA3
S3150000E1907E003E007044D0922207E7899287E78985
S3150000E1A0D081486F00184EB900023A48204F2F28F8
S3150000E1B000E8486F001C486F001C4EB9000217D2D9
S3150000E1C0204F2F280014206F00EC4868000D4E9554
S3150000E1D0508F6076206F00D8082800030001676A18
S3150000E1E03F3C000B43EF001A4EB9000073502F3925
S3150000E1F000C000FA41EF001C2F10204F2F2800F816
S3150000E20043EF03A44EB90000758E204F2F2800E877
S3150000E210486F039C486F00244EB9000217D2204F66
S3150000E2202F28001C206F00F04868000D4E95487995
S3150000E2300002D2A04E954FEF000C204F2F28039CD2
S3150000E2403F3C00634EB900000F2C42A7486F0024E4
S3150000E2504EB900019ED44A006600FCEE600006B28C
S3150000E260263CEE6B28004A3900C01EF1670003AC5D
S3150000E27048790002751848790OE004DE4EB90002BC
S3150000E28018164A406F184A3900C01EEC66102F79DE
S3150000E29000E004FA00FC2F79C0E004FE010049EFDB
S3150000E2A0013C08EF000300F245EF0124082F0005AA
S3150000E2B0010767000346082FC00601076740486FFD
S3150000E2C0002048790002D2A24E95204F2F28010443
S3150000E2D03F3C00444EB900000F2C48790002D2B9E9
S3150000E2E04E95204F2F28010C3F3C00444EB90000AC
S3150000E2F00F2C48790002D2C54E954FEF0010227CB4
S3150000E30000027D90204A20D92091224A41EF013413
S3150000E3102CD9209178002A0642471F7C00FF01047D
S3150000E3202F7C006DF20200F460485247206F00DC3B
S3150000E33020280008B08564182A003F3C00002F0CF6
S3150000E340204F2F2800F643EF013E4EB900007872A9
S3150000E350206F00DC20280008B084631628003F3CAC
S3150000E36000002F0C204F2F2800F6224A4EB900003D
S3150000E3707872486F013C486F00244EB900019ED464
S3150000E3804A0066A6204F2F280100204F2F280100A3
S3150000E390204F2F2800F843EF03A44EB90000758ED6
S3150000E3A04A476E124AAF039C63000250202F039C1B
S3150000E3B0B08364000246486F009848790002D2E8AC
S3150000E3C04E95508F4A476F0001B0303CFF00C06F3A
S3150000E3D000F066464A3900C01F02673E48790002CF
S3150000E3E07518487900E004DE4EB9000218164A4056
S3150000E3F06F28224A207C00E004F220D92091205484
S3150000E40023E8000800E004FE4A3900C01F05670A39
S3150000E41023F900C01FAE00E004E23F07487900027E
S3150000E420D2ED4E95206F00DE302800020240003FFC
S3150000E4303F00204F2F2801402F28013C43EF0028A2
S3150000E4404EB9000197A6204F2F2800EE486F001AFC
S3150000E4504EB900021 61A486F0016486F0022486F20
S3150000E46000164EB9000215DC204F2F2800122F2867
S3150000E470000E206F00F64868000D4E9548790002A0
S3150000E480D2F34E952F053F3C00444EB900000F2CA9
S3150000E490206F00EE302800020240003F3F002F2A86
S3150000E4A000042F1243EF00384EB9000197A6204F03
S3150000E4B02F2800FE486F002A4EB900002161A486F30
S3150000E4C000026486F0032486F00264EB9000215DC60
S3150000E4D0204F2F2800222F28001E206F0106486893
S3150000E4E0000D4E9548790002D2F54E952F043F3C1B
S3150000E4F000444EB900000F2C48790002D2F74E9521
S3150000E500204F2F2801622F28015E2F2A00042F1288
S3150000E51043EF004A4EB900019590206F0102302862
S3150000E5200002024000 3F3F00204F2F2800402F28C6
S3150000E530003C43EF004C4EB9000197A6204F2F2810
S3150000E5400112486F003E4EB900021 61A486F003A93
S3150000E550486F0046486F003A4EB9000215DC204F5E
S3150000E5602F2800362F280032206F011A4868000D28
S3150000E5704E954FEF003660104879000 2D302487975
S3150000E5800002D2FA4E95508F4AAFC39C636C202F3F
S3150000E590039CB083646448790002D3044E95588F77
S3150000E5A0202F039CB0836448204F2F2800E8486F33
S3150000E5B0039C486F00244EB9000217D2204F2F2823
S3150000E5C0001C206F00F04868000D4E954879000247
S3150000E5D0D3064E954FEF000C204F2F28039C3F3C4F
S3150000E5E000634EB900000F2C48790002D30860067C
S3150000E5F048790002D30A4E95588F2F7C006DC07D56
S3150000E60000F4486F013C486F00244EB900019ED4C7
S3150000E6104A006600FC98600002F800AF00EDC0FDFD
S3150000E62000F4247C00C01EEF4A12670828790OC057
S3150000E6300A28600C49EF013C00AF0010000300F40B
S3150000E6400 8EF000300F2600002AC082F0006010785
S3150000E65067224A3900C01F13670C486F00204879AB
S3150000E660002D325600A486F002048790002D3577C
S3150000E6704E95508F4A12660A082F00070107670059
S3150000E68000274486F009848790002D3874E95508FE0
S3150000E690206F00D808280002000167O8082F000232
S3150000E6A000F2661A206F00D8302800020800000D1C
S3150000E6B067000112082F000200F2660001084A12E4
S3150000E6C067182F0C3F3C0000204F2F2800F643EF21
S3150000E6D0013E4EB90000668E60163F3C00002F0CCE
S3150000E6E0204F2F2800F643EF013E4EB90000787206
S3150000E6F0206F00D8302800020240003F3F0020 4F24
S3150000E7002F28013A2F28013643EF00224EB90C0187
S3150000E71097A6204F2F2800E8486F00144EB9000234
S3150000E720161A486F0010486F001C486F00104EB94B
S3150000E7300000215DC204F2F28000C2F280008206F20
S3150000E74000F04868000D4E954FEF000C4A3900C0A6
S3150000E7501F136752206F00DC20280008486F00183E
S3150000E7604EB900023A0848790002752448 6F001C29
S3150000E770486F00184EB9000215FA48790002751C58
S3150000E780486F0014486F00104EB9C0021578204FEC
S3150000E7902F28000C2F2800084879 0002D38C4E95AC
S3150000E7A04FEF000C602E48790002D3954E95588F96
S3150000E7B0206FC0DC2F2800083F3CC0444EB90000C3
S3150000E7C00F2C6010487900 02D39F48790002D39736
S3150000E7D04E95508F206F00D80828C0030001670867
S3150000E7E0082FC00200F2661A206F00D830280002B7
S3150000E7F00800000E670000FE082F000200F2660007
S3150000E80000F44A12672C3F3C000B43EF001A4EB946
S3150000E810000073502F3900C000FA41EF001C2F1082
S3150000E820204F2F2800F843EF03A44EB90000758E41
S3150000E83060182F0C204F2F2800F44EB900007BCA19
S3150000E84022404 1EF039820D92091202F039CB083CA
S3150000E850640000A248790002D3A14E95204F2F28CC
S3150000E86000 0EC486F03A0486F00284EB9000217D28B
S3150000E870204F2F280020206F00F44868000D4E9589
S3150000E8804FEF000C4A3900C01F13674E202F039C20
S3150000E890486F00184EB900023A08487900027524FC
S3150000E8A0486F001C486F00184EB9000215FA4879E7
S3150000E8B000002752C486F0014486F00104EB9000214
S3150000E8C01578204F2F28000C2F280008487900 02C1
S3150000E8D0D3A34E954FEF000C601A48790002D3ACD3
S3150000E8E04E95588F204F2F28039C3F3C00634EB90E
S3150000E8F000000F2C4A12670442A76004486F013CCF
S3150000E900486F00244EB900019ED44A006600FD3CC3
S3150000E91030024FEF03A033C000A002624CDF7CFC44
S3150000E9204E754E714E714E7133C000A0026420794F
S3150000E93000C0058023E8000E00C00E8C4EB9000012
S3150000E9408BBE33C000A002664E754E714E714E717D
S3150000E95033C000A002684FEFFFEC2F790002753438
S3150000E960000C487900E004DE4EB9000217FE4A00AA
S3150000E970670000C4026F00FF000C08EF0002000EE3
S3150000E9803F3C0001204F2F28000E43EF000A4EB9EE
S3150000E99000069582F3900E004F62F3900E004F230
S3150000E9A0204F2F2800102F28000C43EF00104EB9DF
S3150000E9B0000195903F39000007BC204F2F28000624
S3150000E9C02F28000243EF00124EB900019370486FE2
S3150000E9D000008207900C00E844B6800C0486F0018FF
S3150000E9E04EB9000217D2487900C01EC64EB90002C1
S3150000E9F017FE4A0067384879 00C01EC6486F0014E3
S3150000EA0486F00104EB9000217A6487900E004E2EC
S3150000EA10486F000C486F000C4EB9000217D2486FC1
S3150000EA200004487900E004E24EB90002154223EFE3
S3150000EA30001000C01EC64A3900C00E9067144A393D
S3150000EA4000C02028660C4EB90000806A423900C01A

S3150000EA500E904FEF001433C000A0026A4E754E713F
S3150000EA604E714E7148E7030433C000A0026C4FEFAD
S3150000EA70FF802A6F0090303CFFFFD06F0094720039
S3150000EA803200EF892E014A3900C01EF767582C3C28
S3150000EA90000020009C874A866F4C4A3900C01EE35E
S3150000EAA06718203C00078000D0872F002F0D48787C
S3150000EAB000804EB9000011C6602C2F0D486F00046F
S3150000EAC0487800804EB9000011C63F3C0040486FB0
S3150000EAD000022007E488E5880680000780002F00F2
S3150000EAE04EB900003BA07000B0865CC04400488070
S3150000EAF04FEF008033C000A0026E4CDF20C0205FC5
S3150000EB005C8F4ED04E714E714E7148E73F3E33C01A
S3150000EB1000A002704FEFFC72426F010A227C0002D5
S3150000EB20768A41EF0022703920D951C8FFFC486F20
S3150000EB3000224EB90001A3082C7C00022292CCB9D7
S3150000EB4003FFFFFF00C0456E640E48790002D6033E
S3150000EB504E96588F60000996287C00C01EEF47EF3E
S3150000EB6000F24A1466124A3900C01EF0660A4A3993
S3150000EB7000C01EF4670002184BEF01221F7C000440
S3150000EB8001072F7C0039C01800F608EF000300F4D7
S3150000EB9045EF0106600001E0082F00060109670E37
S3150000EBA0486F002248790002D6174E96508F2F7C68
S3150000EBB00039C00200F61F7C00FF01066000019CC0
S3150000EBC0102F0106488048C081FC000448404A4096
S3150000EBD066024247082F000701096700016430 3CBE
S3150000EBE0FFE0206F00DAC050670001560 82F0002D0
S3150000EBF000F4660A082800070002670001444A4735
S3150000EC00663E7E01486F009A48790002D61C4E96F1
S3150000EC10508F424660184A14670848790002D62188
S3150000EC20600648790002D62D4E96588F5246102F10
S3150000EC3001064880 48C081FC00044840BC4065D6B7
S3150000EC400C470001660001144A1467204879000247
S3150000EC50D6394E96588F206F00DE2F2800083F3C8D
S3150000EC6000044 4EB900000F2C600000F0082F00028F
S3150000EC7000F4670C206F00DA082800020001661A0B
S3150000EC80082F000200F4660000B0206F00DA30287A
S3150000EC90000208000000D670000A048790002D63B7C
S3150000ECA04E96588F4A3900C01EF467182F0D3F3C08
S3150000ECB0000B204F2F2800F843EF01204EB900002B
S3150000ECC0668E60163F3C00012F0D204F2F2800F85E
S3150000ECD043EF01204EB900007872206F00DA302829
S3150000ECE000020240003F3F00204F2F28011C2F2822
S3150000ECF0011843EF00244EB9000197A6204F2F2894
S3150000ED000000EA486F00164EB90002161A486F001244
S3150000ED10486F001E486F00124EB9000215DC204FE6
S3150000ED202F28000E2F28000A206F00F24868000DD9
S3150000ED304E964FEF000C6022487900C2D63D6016D1
S3150000ED404A4767164A14670848790002D64960069A
S3150000ED5048790002D6554E96588F486F0122486F63
S3150000ED6000264EB900019ED44A006600FE542F7C50
S3150000ED700039C01800F6486F0122486F00264EB9C8
S3150000ED800019ED44A006600FE10600007602A3C1F
S3150000ED9000015180 45EF01124A3900C01EEE67009E
S3150000EDA0042241EF01222F48037E422F010710392A
S3150000EDB000C01EF3488002400001720BE36808AFF2
S3150000EDC0000300F4816F00F42F7C00B9C45A00F6EA
S3150000EDD02F7C00027772038A600003D0082F00069A
S3150000EDE00109670E486F002248790002D6614E96E7
S3150000EDF0508F082FC0070109670003B04A3900C089
S3150000EE001EF16714203900C01F5E22054EB90002AC
S3150000EE104FCC2F40011A600442AF011A206F00DE6A
S3150000EE202028000822054EB9000253E04EB9000220
S3150000EE305A822E004A3900C01EF267122607203970
S3150000EE4000C01F624EB900024FCCD6806004260572
S3150000EE50D687206F00DA3010EA48024007FF3C00F0
S3150000EE60303CFFE0C05067000342082F000200F468
S3150000EE70066140828000700026700033 0082F000206
S3150000EE8000F466000326204F2F28037E204F2F28EC
S3150000EE9000F64EB9000065D82A402005320648C162
S3150000EEA04EB900022F663F40010E4A3900C01EF1DE
S3150000EEB0660442426012202F011A322F010E48C109
S3150000EEC04EB9000253E02400700 03002D080DBC04F
S3150000EED03F7C0C0A010C2807D8AF011A600002C265
S3150000EEE0526F010C0C4605A066047E0A60027E087D
S3150000EEF0302F010CB047652E426F010C23FC000039

S3150000EF00028000C01EDA4EB90001B0F2486F009AC6
S3150000EF1048790002D6834E96508F2F043F3C00530B
S3150000EF204EB900000F2C48790002D6884E96588FAD
S3150000EF30302F00F2E048024000FF0C40000A672034
S3150000EF40302F00F2E048024000FF0C400004671 03A
S3150000EF5C302F00F2E048024000FF0C40000B6646EE
S3150000EF602F6F00F2011E302F011EE048024000FF05
S3150000EF700C40000A670E0C400004671 60C40000B9C
S3150000EF8067186022026F00FF011E08EF0002011ED3
S3150000EF906014026F00FF011E600C026F00FF011E6D
S3150000EFA0006F0500011E200D672C200D6608426FBC
S3150000EFB001104247601 00C55FFFF56C04400488CC0
S3150000EFC03F4001103E004A47670C558F3E95224A46
S3150000EFD04EB9000191504A6F011066544A3900C07B
S3150000EFE01EF3663E302F00F2E048024000FF0C4060
S3150000EFF0000A6720302F00F2E048024000FF0C4074
S3150000F000000467 10302F00F2E048024000FF0C4079
S3150000F010000B660E3F3C00042F3C00000000600021
S3150000F0200140487900 02D68A4E96588F60000166E4
S3150000F0304A3900C01EF3660000A0302F00F2E048F7
S3150000F040024000FF0C40000E6736303C05A048C069
S3150000F05081C6486F001C48C04EB900023A28486F66
S3150000F060001C48790002777 6486F00204EB90002EE
S3150000F07017E8486F00182F0A4EB900021530 60587D
S3150000F08048790002777A2F0A4EB9000215303 00609
S3150000F090486F001848C04EB9000239E8486F00189A
S3150000F0A048790002777E486F00184EB9000215FABB
S3150000F0B02F0A486F000C4EB90002161A486F00104E
S3150000F0C0486F000C486F00084EB9000215FA485701
S3150000F0D02F0A4EB90002163E4A3900C01EF36600DA
S3150000F0E00090302F00F2E048024000FF0C40000A7A
S3150000F0F06720302F00F2E048024000FF0C40000479
S3150000F10067 10302F00F2E048024000FF0C40000B71
S3150000F110665E082F000200F46606286F038A601EEA
S3150000F120206F00DA301002400003486F038202802D
S3150000F1300000FFFF4EB900023A4849EF03822F0C48
S3150000F1402F0A486F00264EB9000217E8204F2F28D5
S3150000F150001E224A4EB9000235103F3C00012F1214
S3150000F160204F2F28012442A74EB9000173326024 94
S3150000F170204F2F2800EA2F0A486F00264EB90002BA
S3150000F18017D2204F2F28001E206F00F24868000D6E
S3150000F1904E96508F5242548D302F010E48C0D88063
S3150000F1A0B44664C6B8836500FD38486F0122486F8F
S3150000F1B000264EB900019ED44A006600FC2060007D
S3150000F1C0032C41EF01222F48037E422F01071039FD
S3150000F1D000C01EF3488002400001720BE36808AFCE
S3150000F1E0000300F4816F00F400AF00ABC41B00F60F
S3150000F1F02F7C00027772038A600002DE082F000669
S3150000F20001096722 4A3900C01EF5670C486F0022C3
S3150000F21048790002D693600A486F002248790002B6
S3150000F220D6AE4E96508F082F00070109670002AA36
S3150000F230206F00DE2028000822054EB9000253E0A8
S3150000F2404EB900025A822600206F00DA3010EA48D2
S3150000F250024007FF3E00204F2F28037E204F2F2815
S3150000F26000F64EB9000065D82A4042442C036000DF
S3150000F27002622005320748C14EB900022F662600F9
S3150000F280200D67000244200D6700023E0C55FFFF6B
S3150000F29067000236486F009A48790002D6C94E9632
S3150000F2A0508F4A3900C01EF5674C2006486F00167D
S3150000F2B04EB900023A08487900 02777E486F001A74
S3150000F2C0486F00164EB9000215FA48790002778693
S3150000F2D0486F0012486F000E4EB900021578204F95
S3150000F2E02F28000A2F28000648790002D6CE4E960F
S3150000F2F04FEF000C60162F063F3C00534EB900003E
S3150000F3000F2C48790002D6D84E96588F4A3900C03D
S3150000F3101EF366000150302F00F2E048024000FF65
S3150000F3200C40000A6722302F00F2E048024000FF3E
S3150000F3300C40000467 12302F00F2E048024000FF44
S3150000F340C C40000B6600011E558F3E95224A4EB9B1
S3150000F350000191504A3900C01EF36634303C05A0C6
S3150000F36048C081C7486F001C48C04EB900023A2801
S3150000F370486F001C487900027776486F00204EB926
S3150000F380000217E8486F00182F0A4EB90002153020
S3150000F390082F000200F46606286F038A601E205F9D
S3150000F3A000DA301002400003486F0386028000036

S3150000F3B0FFFF4EB900023A4849EF03862F0C2F0A89
S3150000F3C0486F00264EB9000217E8204F2F28001E6E
S3150000F3D0224A4EB900023510302F00F2E0480240B2
S3150000F3E000FF0C40000A6720302F00F2E048024080
S3150000F3F000FF0C4000046710302F00F2E048024086
S3150000F40000FF0C40000B66462F6F00F2011E302FE6
S3150000F410011EE048024000FF0C40000A670E0C4047
S3150000F42000046716OC40000B67186022026F00FF8D
S3150000F430011E08EF0002011E6014026F00FF011E8C
S3150000F440600C026F00FF011E006F0500011E3F3CAD
S3150000F45000012F12204F2F28012442A74EB9000188
S3150000F46073326064206F00DA30280002024000 3FE9
S3150000F4703F00558F3E9543EF011A4EB9000192FCAD
S3150000F480206F00DA302800020240003F3F00204F84
S3150000F4902F28011C2F28011843EF00284EB9000120
S3150000F4A09370204F2F2800EA486F0022486F0022F1
S3150000F4B04EB9000217D2204F2F28001A206F00F2F3
S3150000F4C04868000D4E96508F5244548D300348C004
S3150000F4D0DC80B8476500FD9C486F0122486F002616
S3150000F4E04EB900019ED44A006600FD12302F010A73
S3150000F4F04FEF038E33C000A002724CDF7CFC4E75CA
S3150000F5004E714E714E7148E7033E33C000A002743F
S3150000F5104FEFFFF44A3900C01EE867046100069009
S3150000F5203F3C002B43EF00024EB900007318287CC5
S3150000F53000C00242267C00030E14247C00C00E8408
S3150000F5402C7C000222924A3900C01EE2670C3C392C
S3150000F55000C01F245346600002044 2464A3900C0D8
S3150000F5601EE3670001462012B08C672C248C4A9754
S3150000F57067142257204C203C000000CE20D951C8E9
S3150000F580FFFC30916012224B204C203C000000CE44
S3150000F59020D951C8FFFC30914A3900C01EF4675685
S3150000F5A0203900C01F2653807216C1414EB9000291
S3150000F5B05A82C141068100C002522A414A3900C01E
S3150000F5C01EEB67062AB900C01F464A3900C01EEC6A
S3150000F5D06700016248780008486D001A4EB90000BD
S3150000F5E013D42F3900C01F4A486D001A4EB90002C5
S3150000F5F037BA60000140203900C01F265380722CA4
S3150000F600C1414EB900025A82C141068100C002ECD6
S3150000F6102A414A3900C01EF167082B7900C01F5ED7
S3150000F62000164A3900C01EEE67062AB900C01F52EE
S3150000F6304A3900C01EEF671E48780008486D00046E
S3150000F6404EB9000013D42F3900C01F56486D000470
S3150000F6504EB9000237BA4A3900C01EF2671E487812
S3150000F66000008486D001A4EB9000013D42F3900C0A7
S3150000F6701F62486D001A4EB9000237BA4A3900C0F7
S3150000F6801EF0670C7030D03900C01F5D1B4000278C
S3150000F6904A3900C01EED6700009C7030D03900C0AA
S3150000F6A01F511B40001060000008C4A3900C01EE943
S3150000F6B066084A3900C01EEA677A2012B08C6714C1
S3150000F6C0248C224B204C203C000000CE20D951C86F
S3150000F6D0FFFC30914A3900C01EE9670A2F7900C045
S3150000F6E01F3E0008601648790003OEBE2052486887
S3150000F6F000AA486F00104EB9000217E84A3900C048
S3150000F7001EEA670A2F7900C01F420004601648797 6
S3150000F71000030F6E20524868015A486F000C4EB91C
S3150000F720000217E8204F2F280004204F2F28000C36
S3150000F730610002B44A3900C01EE76714610004B4D0
S3150000F7404A4067144879 0002D9C04E96588F60081F
S3150000F7504A3900C01EF36704610001AC4A3900C093
S3150000F7601EE466124A3900C01EE5660A4A3900C020
S3150000F7701EE6570017A4A3900C01EE667124A97FC
S3150000F780660E48790002D9D14E96588F6000016006
S3150000F790320648C1E58920321800B08B66084879E0
S3150000F7A00002DA1B60184A46660E2012B08C660804
S3150000F7B048790002DA2360064879 0002DA2C487993
S3150000F7C00002D9F74E96508F4A3900C01EF4677E64
S3150000F7D048790002DA324E96588F42474A46661CEE
S3150000F7E04A3900C01EE667144A9767107010D09712
S3150000F7F03207C3FC0016D0812A40602E4A3900C069
S3150000F8001EE467187010320648C1E589D0B21800A8
S3150000F8103207C3FC0016D0812A40600E3007C1FCB7
S3150000F820001606800003 0E242A40486D00042F159A
S3150000F830300752403F0048790002DA494E964FEFB2
S3150000F840000E52470C4700076D92600000A24879EF
S3150000F8500002DA5C4E96588F42474A46661C4A3981
S3150000F86000C01EE66714203C000000AAD0973207AD
S3150000F870C3FC002CD0812A4060324A3900C01EE405
S3150000F880671C203C000000AA320648C1E589D0B2B8
S3150000F89018003207C3FC002CD0812A40600E3007C6
S3150000F8A0C1FC002C068000030EBE2A40486D001ADB
S3150000F8B02F2D0016102D00274880 0640FFD03F0050
S3150000F8C0486D00042F15102D001048800640FFD00B
S3150000F8D03F00300752403F0048790002DA904E95CA
S3150000F8E04FEF001A52470C47000F6D00FF6E424063
S3150000F8F04FEF000C33C000A002764CDF7CC04E7583
S3150000F9004E714E714E7148E7010C33C000A002786B
S3150000F910598F3F3C002B49EF0002224C4EB90000A4
S3150000F92073187010D0942A4C4247600008441ED5D
S3150000F930009A3007C1FC002CD1C00C28002 5000D10
S3150000F94066224 1ED009A0C300038C80E66160C301F
S3150000F9500C2E080F660E0C300066C81166064A3047
S3150000F9600812670242 9441ED009A3007C1FC002C50
S3150000F970D1C00C2800250023663241ED009A0C30D8
S3150000F980003108246626 0C3000300825661E0C302F
S3150000F990002E082666160C30004C0828660E0C3021
S3150000F9A0006608296606 4A30082A670242945247CA
S3150000F9B04A9463080C47000F6D00FF744A94670869
S3150000F9C023D400C00E84600A23FC00030E1400C07A
S3150000F9D00E84588F33C000A0027A4CDF3C804E75FB
S3150000F9E04E714E714E7148E71F3E33C000A0027C37
S3150000F9F0518F4DEF00342C96227C00030E14207C90
S3150000FA000C00242203C000000CE20D951C8FFFCB5
S3150000FA1030914246287C00C002EC267C000278E049
S3150000FA20247C00027918424742456 01C2F0E30069E
S3150000FA30C1FC002CD08C3207C3FC0016D0812F00ED
S3150000FA404EB900021530524530 0648C0E588D08BC5
S3150000FA50320748C1D281D0812040BA5065CE424596
S3150000FA60601E486F00383006C1FC002CD08C32076F
S3150000FA70C3FC0016D0812F004EB900021530524546
S3150000FA80300648C0E588D08A320748C1D281D08185
S3150000FA902040BA5065CC52470C4700026D8A424757
S3150000FAA03006C1FC002C068000030EBE3205C3FCE6
S3150000FAB00016D0812F003006C1FC002CD08C3207F6
S3150000FAC0C3FC0016D0812F00486F00084EB9000213
S3150000FAD017E8204F2F1043EF00084EB9000231B04F
S3150000FAE0486F0C044EB900024538360 04A4766049E
S3150000FAF0780360027804300 6C1FC002CD08C3207F3
S3150000FB00C3FC0016D08106800000000DD0842A4078
S3150000FB1097150C1500306C041ABC003052470C4780
S3150000FB2000026D00FF7C52460C46000E6D00FEF88A
S3150000FB3042462A7C00C00252424760142F0E30060D
S3150000FB40C1FC0016D08D2F004EB900021530524769
S3150000FB50300648C0D08006800002795 02040BE5052
S3150000FB5065DA42476016486F00383006C1FC001659
S3150000FB70D08D2F004EB900021530524730 0648C0CE
S3150000FB80D080068000027 95E2040BE5065D852467D
S3150000FB90024600076DA2508F33C000A0027E4CDFDA
S3150000FBA07CF8205F508F4ED04E714E714E7133C02F
S3150000FBB000A002800CB900030E1400C00E84672456
S3150000FBC0227C00030E14207C00C00242203C000070
S3150000FBD000CE20D951C8FFFC309123FC00C0024260
S3150000FBE000C00E8433C000A002824E754E714E7165
S3150000FBF04E7133C000A00284207900C00E8448688C
S3150000FC000103F3C00CC3F3C002B4EB90000717405
S3150000FC1033C000A002864E754E714E714E7133C0D0
S3150000FC2000A002884A3900C01EE2670A13F900C024
S3150000FC301F2500C020244240103900C020243F0068
S3150000FC4048790002DAC34EB9000222925C8F424024
S3150000FC5033C000A0028A4E754E714E714E7148E750
S3150000FC603F3E33C000A0028C4FEFFE80227C000294
S3150000FC707C1C41EF0020703920D951C8FFFC486F29
S3150000FC800204EB90001A3083F3C00004EB9000019
S3150000FC907AEA2F40010A287C00C01EF4267C0080E8
S3150000FCA04040247C000222924A3900C01EFA6700B6
S3150000FCB0064613FC000100C01C700279EFFF0080AD
S3150000FCC0400802793FFF0080404600794000 0080EE
S3150000FCD04046005302000279 7FFF008040440053F3
S3150000FCE0010008B9000600804024 7007C07900C0F2
S3150000FCF01F84720BE3680253C7FF81534A3900C061
S3150000FD001F04671C7003C07900C01FAC720AE36849

S3150000FD100279F3FF00804046817900804046600802
S3150000FD200279F3FF008040464A3900C01EF2671A86
S3150000FD30701FC07900C01F64720AE368027983FFEE
S3150000FD400080402C81790080402C4A3900C01EF189
S3150000FD5067187003C07900C01F60E1480279FCFF94
S3150000FD600080402C81790080402C4A3900C01EF367
S3150000FD7067187003C07900C01F68E5480279FFF371
S3150000FD800080402C81790080402C4A3900C01EF04A
S3150000FD9067167003C07900C01F5C0279FFFC008003
S3150000FDA0402C81790080402C4A3900C01EFF670C28
S3150000FDB013F900C01F9900804042600813FC0080C0
S3150000FDC0008040424A3900C01EFC67187003C079A3
S3150000FDD000C01F8CE1480279FCFF00804046817913
S3150000FDE0008040464A3900C01EFB671A7007C0797A
S3150000FDF000C01F88720CE36802798FFF008040A65E
S3150000FE008179008040A630390080403C02401FFFC7
S3150000FE103F4001300CB900005A0000C01EDA6C0ADF
S3150000FE2023FC00005A0000C01EDA4A3900C01F0039
S3150000FE30671848790002E0A94E92588F4A14670A5B
S3150000FE4048790002E0E74E92588F203CFFFFB5004C
S3150000FE50D0B900C01EDA2F4001422A7C00C01F9C88
S3150000FE602C7C00C0454E6000042A4A3900C01F00A1
S3150000FE70670003CC303900804046720AE2680240CF
S3150000FE8000034A4063080279EFFF0080404678008D
S3150000FE902F4401222F4401262F44011A2F44011E0C
S3150000FEA026042A3C00000FFF24032F42011660009F
S3150000FEB0018E4A1467360CB90000000500C01F8287
S3150000FEC066267003C07900C01F8CE1480279FCFFEA
S3150000FED00080404681790080404600530100424739
S3150000FEE052470C47000A65F80253FEFF4A3900C024
S3150000FEF01F0167183013024000033F40012A7003B8
S3150000FF00C07900C01FA00253FFFC81533039008026
S3150000FF104046720AE268024000034A4063080079DC
S3150000FF2010000008040460053040030130800000E05
S3150000FF3066F8303900804046720AE26802400003E3
S3150000FF404A4063080279EFFF00804046303900805E
S3150000FF50404402400FFF7E003E000253FBFF4A145E
S3150000FF6067560CB90000000500C01F8266160279AC
S3150000FF70FCFF0080404600530100424652460C46B4
S3150000FF80000A65F84A3900C01F02670E7C0060024D
S3150000FF905286BCB900C01FA265F600530400301398
S3150000FFA00800000E66F830390080404402400FFF1A
S3150000FFB07C003C000253FBFF4A3900C01F01670C5F
S3150000FFC07003C06F012A0253FFFC815300530100E6
S3150000FFD0BE8564022A07BE8363022607D4872F6F75
S3150000FFE001260112200722074EB900025A82D1AF1C
S3150000FFF00126202F0112B0AF0126630452AF012261
S315000100002E2F011E4A14671CDDAF0116200622069B
S315000100104EB900025A82D1AF011EBEAF011E630462
S3150001002052AF011A4A5666043CBC00014A7900C027
S31500010030454C660833FC000100C0454C52847001F2
S31500010040123900C01F9DE3A8B880641C0CB90000DA
S31500010050001200C01F9A6500FE5A30390080405CCC
S315000100600800000D6600FE4C301544403F0020029A
S31500010070486F001A4EB900023A48204F2F28001A3D
S3150001008043EF01184EB900024258301544403F0073
S315000100900202F0128486F00164EB900023A48204F1A
S315000100A02F28001643EF001E4EB9000242583015A4
S315000100B04440064000203F00202F0124486F0016CF
S315000100C04EB900023A48204F2F28001643EF00226E
S315000100D04EB900024258486F0112486F0116485F27
S315000100E0001C4EB9000217D2486F001C486F001C55
S315000100F0486F00184EB90002177E486F0014486F0A
S3150001010000014486F00144EB9000217A6204F2F287D
S315000101100000C43EF01124EB9000235102003908501
S31500010120E288486F00184EB900023A48486F010E3E
S31500010130486F001C486F001C4EB9000217E8204F9B
S315000101402F280014204F2F280112204F2F28011A83
S31500010150200390852F002F052F032F0448790002D5
S31500010160E0FE4E924FEF00204A1467000118301549
S3150001017044403F00202F0118486F001E4EB900026F
S315000101803A48204F2F28001E43EF01184EB90002AE
S315000101904258301544403F00202F0120486F001679
S315000101A04EB900023A48204F2F28001643EF001E91
S315000101B04EB90002425830154440064000203F0027
S315000101C0202F011C486F00164EB900023A48204FF5
S315000101D02F28001643EF00224EB900024258486FFD
S315000101E00112486F0116486F001C4EB9000217D262
S315000101F0486F001C486F001C486F00184EB900027A
S31500010200177E486F0014486F0014486F00144EB9EA
S315000102100000217A6204F2F28000C43EF01124EB9FA
S3150001022000023510204F2F28010E204F2F280116CE
S3150001023048790002E1294E924FEF000C6046202FCB
S31500010240013EB0B900C01EDA673A2F7900C01EDA46
S31500010250013E303900804046720AE26802400003DE
S315000102604A406320303900C01EDC024000010240D2
S3150001027000001720CE3680279EFFF00804046817944
S315000102800008040464A5666043CBC00014EB9000156
S31500010290B0F22F39000262B24EB90000379A0C4013
S315000102A0FFFF660E203900C01EDAB0AF01426200C0
S315000102B0FBBA303C1FFFC06F01300279E0000080BD
S315000102C0403C81790080403C08B90006008040240A
S315000102D008F900060080402408B900070080402480
S315000102E00253FEFF0253FDFF007910000080400813
S315000102F0423900C01C704A3900C01EF9670000E887
S315000103004A3900C01EFA660000DE4A3900C01EEFF7
S31500010310660000D418390080400813FC0080008074
S3150001032040081039008040240200000342431600B1
S31500010330023900FC0080402400530200007980004D
S31500010340008040440053010042473C073A0660667C
S315000103502A7C0080401408150007672E2C7C00C0FB
S31500010360000FE08150006671C08D5000652B900E014
S315000103700000052B900C000FA421613FC00EA0080E0
S3150001038040156002521608D500074A46660A0C4710
S315000103900FFF6708524760124A47660C4A4657C024
S315000103A0440048803C006002534730070040800003
S315000103B033C0008000442F39000262B24EB90000FA
S315000103C0379A0C40FFFF66060C45003C658213C454
S315000103D0008040087003C003023900FC00804024FD
S315000103E08139008040244A3900C01EF6676A4A14E2
S315000103F066667003C03900C01F75E908023900CF6F
S31500010400008040248139008040244A3900C01EF012
S3150001041067167003C03900C01F5D023900FC0080F9
S3150001042040248139008040244A3900C01EF36718F0
S315000104307003C03900C01F69E508023900F3008066
S31500010440402481390080402408B9000600804024F8
S3150001045008F90006008040244A14670001464A391B
S3150001046000C01EFA6600013C4A3900C01EF666004D
S3150001047001324A3900C01EF1670000B22A7C00C071
S3150001048001F5E0C95000000003621813F900C01F617E
S31500010490000C01C76423900C01C77423900C01C7866
S315000104A0607A13FC000100C01C78423900C01C763A
S315000104B000C95000000004660A13FC000100C01C77BD
S315000104C060180C95000000005660A13FC000200C0C6
S315000104D01C776006423900C01C774240103900C0C3
S315000104E01C750240001F720AE368027983FF00C08F
S315000104F01C86817900C01C860279FCFF00C01C861F
S3150001050002793FFF00804046007940000080404666
S315000105100253C7FF0279FCFF0080404613FC00022C
S3150001052000C01C7213FC001E00C01C744A3900C0B6
S3150001053001EF0671A13F900C01F5D00C01C7A13FC78
S31500010540000200C01C7213FC001E00C01C744A3954
S3150001055000C01EF0664C4A3900C01EF166444A3995
S3150001056000C01EF8663C423900C01C74423900C006
S3150001057001C72423900C01C78423900C01C7742798E
S3150001058000C01C8242472A7C00C013B63F072F0DCC
S3150001059004EB90001391A4BED02E452470C470003EC
S315000105A065EA4A3900C01EF1670A3E3900C01F607C
S315000105B05347600242474A3900C01EF8670000B43B
S315000105C033F900C01F7C00C01C8213FC001E00C052
S315000105D01C744A7900C01C826F1C33FC01A000C048
S315000105E01C801007520013C000C01C7613FC0004C7
S315000105F0000C01C72607C0C79FFFF00C01C82667211
S315000106004A14665C48790002E1374E92588F13FC12
S315000106100000400C01C7260064EB90001B0F20C392C
S31500010620000200C01C7262F048790002E14F4E924E
S31500010630588F60064EB90001B0F24A7900C01C809D
S3150001064062F248790002E1664E92588F60064EB911
S315000106500001B0F20C39000100C01C7262F06008A2
S3150001066013FC000100C01C7248790002E17E4E9223

S31500010670588F4A3900C01EF7670007623007C1FC70
S3150001068002E4068000C013B62A404DEF0146303C15
S3150001069000FFC0470256FF008156026F0FFF014857
S315000106A042451A2D02DF4242600007120CB90000D2
S315000106B0028000C01EDA6C0A23FC0000050000C09F
S315000106C01EDA4240102D02DFBA40670006EA5242A6
S315000106D042451A2D02DF42471E2D02B64243162D10
S315000106E002B7287C000005580C4700186D067C17D8
S315000106F0280660063C0748C628062004D080D08616
S31500010700D080D08C2F4001787800380 50C4700182E
S315000107106D047C1760043C0748C62204D281D2844A
S31500010720EB890681 00C01D782006E588D28020412C
S3150001073030 10486F001C48C04EB900023A2848796B
S315000107400 0027D08486F0020486F00204EB9000264
S3150001075017D2487900027D04486F001C486F001CBF
S3150001076 04EB90002177E486F0014204F2F28017CD6
S31500010770486F01664EB9000217D272003205068132
S31500010780000008482041121048 8148C1E9890681C4
S315000107900 0C01D48380348C4E58CD284204130107E
S315000107A0486F001C48C04EB900023A284879000239
S315000107B07D08486F0020486F00204EB9000217D20D
S315000107C0487900027D04486F001C486F001C4EB931
S315000107D00002177E486F001441EC0090300348C0B8
S315000107E0E788D1C02F08486F01624EB9000217D2BF
S315000107F043ED01F641EF013220D920D92091302F66
S3150001080 00132905F0134E2483C00302F0136906F7F
S31500010810 0138E24838003F3C00002F0D4EB9000177
S315000108204A023F3C00042F0D4EB900014A022F6DCA
S315000108300 1BE01562F6D01CE0152204F2F28015EB8
S31500010840 43EF00204EB9000241E03006486F001622
S315000108500 02800000FFFF4EB900023A48486F001CB3
S31500010860486F001A486F001A4EB9000217D2486F36
S31500010870015 6486F0016486F01524EB9000217E83B
S315000108803004486F001A02800000FFFF4EB90002D3
S315000108903A48486F015A486F001E486F001E4EB90C
S315000108A0000217D2486F0152486F001A486F01566D
S315000108B04EB9000217E83F2D026C202D0268486FE1
S315000108C0001E4EB900023A48487900027D0C486F75
S315000108D00022486F00224EB9000217D2204F2F285E
S315000108E0001A3F053F033F074A7900C01C80630693
S315000108F03F3C0068603E0C79FFFF00C01C82660623
S315000109003F3C0043602E4A7900C01C826F063F3C83
S31500010910004760204A3900C01C7267063F3C0054FC
S31500010920 60124A3900C01C7067063F3C00486004EB
S315000109303F3C004148790002E1954E924FEF00128B
S315000109404A3900C01EF5660000A8204F2F28014E27
S315000109502 04F3F28013C204F3F28013C3F2D02BA42
S31500010960302D0204486F002602800000FFFF4EB9B9
S315000109700 00023A48487900027D10486F002A486F04
S31500010980002A4EB9000217E8204F2F280022204FD7
S315000109902F280158204F3F280146204F3F28014666
S315000109A03F2D02B8302D0202486F0034028000004C
S315000109B0FFFF4EB900023A48487900027D10486FA0
S315000109C00038486F00384EB9000217E8204F2F282B
S315000109D00030302D02D0906D02CE3F003F2D02DA5D
S315000109E048790002E1B04E924FEF0C246000019A6F
S315000109F008EF0003014808AF00020148025600FF54
S31500010A00203C000000AAD0B900C00E843216E0498D
S31500010A10024100FF3601C6FC002CD083068000008F
S31500010A200C16224041EF0162700420D951C8FFFC33
S31500010A3030910CB90F0C3F0000C000FA630000D8DA
S31500010A403F3C000D2F1643EF00164EB900006958C2
S31500010A503016E048024000FF72003200D281068162
S31500010A60000007BC20413F10204F2F2800162F28D9
S31500010A70001243EF00224EB9000197A63F3C000B3E
S31500010A802F1643EF000E4EB900006958301 5EC48A4
S31500010A90024000FF72003200D2810681000007BCCD
S31500010AA020413F10204F2F28000E2F28000A43EF28
S31500010AB0001A4EB9000197A6486F0162486F000CF3
S31500010AC04EB90002161A486F0008486F0014486FA5
S31500010AD000084EB9000215DC204F2F2800042F1004
S31500010AE0486F016A486F001C4EB90002161A486F1A
S31500010AF00018486F0024486F00184EB9000215DC33
S31500010B00204F2F2800142F28001048790002E1EACF
S31500010B104E924FEF00143F3C00072F1643EF00168D
S31500010B204EB9000069583016E048024000FF7200D5
S31500010B303200D2810681000007BC20413F10204FC0
S31500010B402F2800162F28001243EF00224EB900016C
S31500010B5097A6486F0162486F00144EB90002161A33
S31500010B60486F0010486F001C486F00104EB9000214
S31500010B7015DC204F2F28000C2F2800084879000289
S31500010B80E1FB4E924FEF000C287C00027C186000BE
S31500010B900092101448800240 00FFE148025600FF0F
S31500010BA081563016E048024000FF3F002F0D4EB936
S31500010BB000014A0241ED01BE3016E048024000FF45
S31500010BC072003200E589D1C12F1048790002E20591
S31500010BD04E923016E048024000FF0C4000046608C1
S31500010BE048790002E213602C303CFF00C0566608CB
S31500010BF048790002E215601C3016E048024000FF09
S31500010C000C40000166084879 0002E217600648793F
S31500010C100002E21948790002E20E4E924FEF0010EF
S31500010C20528CB9FC00027C1C6500FF68203900C0A3
S31500010C304572486F001C4EB900023A48303900C06F
S31500010C401CA2907900C01CA4486F00160280000007
S31500010C50FFFF4EB900023A48486F001C486F001A60
S31500010C60486F001A4EB9000217E8204F2F280012CC
S31500010C70303900C01CA2907900C01CA4486F001E28
S31500010C8002800000FFFF4EB900023A48487900028F
S31500010C907D10486F0022486F00224EB9000217E806
S31500010CA0204F2F28001A48790002E21D4E92203962
S31500010CB000C04572486F00284EB900023A483039E3
S31500010CC000C01CA6907900C01CA2486F00220280B9
S31500010CD00000FFFF4EB900023A48486F0028486FEE
S31500010CE00026486F00264EB9000217E8204F2F282C
S31500010CF0001E303900C01CA6907900C01CA2486FA6
S31500010D00002A02800000FFFF4EB900023A484879E6
S31500010D1000027D10486F002E486F002E4EB900026A
S31500010D2017E8204F2F28002648790002E22F4E921D
S31500010D30203900C04572486F00344EB9C0023A4866
S31500010D40303900C01CA2907900C01CA8486F002E43
S31500010D5002800000FFFF4EB900023A48486F003496
S31500010D60486F0032486F00324EB9000217E8204F33
S31500010D702F28002A303900C01CA2907900C01CA877
S31500010D80486F003602800000FFFF4EB900023A4864
S31500010D9048790002 7D10486F003A485F003A4EB913
S31500010DA0000217E8204F2F28003248790002E23F5F
S31500010DB04E924FEF00244EB90001B0F20C79FFFFBD
S31500010DC000C01C826700F8E62F39000262B24EB9F4
S31500010DD00000379A0C40FFFF6700F8D24A3900C07D
S31500010DE01EEF670002684A3900C01F05674C42477B
S31500010DF07C003C07207C00C01CC210306800488083
S31500010E0048C0E588068000C0457820402F1020069E
S31500010E10D080D086E588068000027DC020402F283C
S31500010E2000008 48790002E24F4E924FEF000C5247FC
S31500010E300C47000A65BA600002144A3900C01EF95F
S31500010E406600020A4A3900C01C726700012442404A
S31500010E50103900C01C743F002F3900C01C6C424081
S31500010E60103900C01C7A3F004240103900C01C7680
S31500010E703F0048790002E25B4E924FEF000E0C39BB
S31500010E800001 00C01C77660848790002E2956010EF
S31500010E900C39000200C01C77660A48790002E2C9D3
S31500010EA04E92588F4A3900C01C78670000A24879D3
S31500010EB00002E2F84E923013720BE268024000071C
S31500010EC03F00487900C2E3294E92303900804046BE
S31500010ED0E048024000033F0048790002E33B4E929E
S31500010EE030390080402C720AE2680240001F3F0040
S31500010EF048790002E34D4E923039008 0402CE0489B
S31500010F00024000033F0048790002E35E4E92303909
S31500010F100080402CE448024000033F00487900026B
S31500010F20E3704E923039008 0402C024000033F00AE
S31500010F3048790002E3814E924240103900804042D6
S31500010F403F0048790002E3934E924FEF002E3F395E
S31500010F5000C01C8248790002E3A54E923F3900C0C9
S31500010F601C8048790002E3B24E924FEF000C600AF2
S31500010F7048790002E3C24E92588F1039008 0040240E
S31500010F80E808020000037200 1200E78906810002E8
S31500010F907D9820412F280004103900804024E40860
S31500010FA00200000342411200300 13F001039008067
S31500010FB04024020000034241120030013F002F3954
S31500010FC000C00E9248790002E3D74E924FEF00100F

S31500010FD04A3900E004DB673430390080400E0800EE
S31500010FE0000F670848790002E419601A3039008059
S31500010FF0400E0800000A670848790002E4306006DE
S315000110004879002E45B4E92588F604042401039A5
S3150001101000E004DD3F004240103900E004DC5240AC
S315000110203F00307C0010D1F900C00E8442401039D7
S3150001103000E004DA3200C2FC0016D1C1486800049F
S3150001104048790002E47D4E924FEF000C4A3900C008
S315000110501EF5670007BE4A3900C01EF7660007B4D1
S315000110602F7C0002C04800F408AF000200F26000C5
S3150001107007902F6F00D8010A082F0006010767168F
S31500011080486F002048790002E4F948790002E4A695
S315000110904E924FEF000C102F01064880206F00D8AA
S315000110A0321002410003C0C13200C2FC02E40681D3
S315000110B000C013B6302F00F0024000FF3400C4FC1C
S315000110C002E4D2822A41302F00F0024000FF3600AE
S315000110D042471E2D02B642461C2D02B72C7C00004B
S315000110E005580C4700186D067A17280560063A0759
S315000110F048C528052004D080D085D080D08E2840D0
S3150001110078003803OC4700186D047A1760043A0713
S3150001111048C52204D281D284EB89068100C01D789C
S315000111202405E58AD28220413010486F001C48C050
S315000111304EB900023A28487900027D08486F00201E
S31500011140486F00204EB9000217D2487900027D048B
S31500011150486F001C486F001C4EB90002177E486F8D
S315000111600142F0C486F01664EB9000217D241EEEA
S31500011170009030064 8C0E788D1C028487200320383
S315000111800681000084820411210488148C1E989BA
S3150001119006 8100C01D48340648C2E58AD282204134
S315000111A03010486F001C48C04EB900023A284879F1
S315000111B000027D08486F0020486F00204EB90002EA
S315000111C017D2487900027D04486F001C486F001C45
S315000111D04EB90002177E486F00142F0C486F01624A
S315000111E04EB9000217D27200320306810000084888
S315000111F020411210488148C1E989068100C01D4875
S3150001120034 0648C2E58AD2822041302800024 86F5E
S31500011210001C48C04EB900023A2848790 0027D08F0
S31500011220486F0020486F00204EB9000217D2487956
S3150001123000027D04486F001C486F001C4EB9000275
S315000112401 77E486F0014486C0004486F015E4EB962
S3150001125000217D23F3C00002F0D4EB900014A0291
S315000112603F3C00042F0D4EB900014A023F3C0005E8
S315000112702F0D4EB900014A022F6D01BE01522F6D8D
S3150001128001CE014E2F6D01D2014A43ED01F641EF28
S315000112900013220D920D92091342F0132946F0134A3
S315000112A0382F0136986F0138362F013A966F013C77
S315000112B030390080403C02401FFF4440064020007 8
S315000112C03F003013024 00003323C0100E06170062A
S315000112D0C0C13F00303900804 02A32390080403C8D
S315000112E002411FFF904102400FFF3F00303900804D
S315000112F04028323900804 03C02411FFF90410240A4
S3150001130 00FFF3F00303900804 02A32390080403CCF
S31500011310024 11FFF904102400FFF3F00303900801C
S31500011320402832390080403C02411FFF9041024073
S3150001133 00FFF3F003039008040263239008 0403CA3
S3150001134002411FFF904102400FFF3F00486F00A678
S315000113504 8790002E52D48790002E5054E924FEFE6
S31500011360001A0C4700186D047A1760043A0748C53D
S31500011370303900C01D38486F001C02800000FFFF95
S315000113804EB900023A48487900027D10486F0020A4
S31500011390486F00204EB9000217E8204F2F28001889
S315000113A0320648C1D281068100C01D30204130106D
S315000113B0486F002002800000FFFF4EB900023A4844
S315000113C0487900027D10486F0024486F00244EB909
S315000113D000 00217E8204F2F28001C320648C1D2818F
S315000113E0068100C01D3020413010486F0024028064
S315000113F00000FFFF4EB900023A48487900027D100D
S31500011400486F0028486F00284EB9000217E8204FA0
S315000114102F280020320648C1D281068100C01D282E
S315000114202041301 0486F002802800000FFFF4EB9AE
S3150001143000023A48487900027D10486F002C486F37
S315000114400002C4EB9000217E8204F2F28002432063F
S3150001145048C1D281068100C01D2820413010486F45
S315000114600002C02800000FFFF4EB900023A4848797D
S31500011470 00027D10486F0030486F00304EB90002FF
S315000114801 7E8204F2F2800282205D281068100C0A7
S315000114901CF420413010486F003002800000FFFF2D
S315000114A04EB900023A48487900027D10486F00346F
S315000114B0486F00344EB9000217E8204F2F28002C40
S315000114C0486F00B048790002E56A48790002E53ABA
S315000114D04E92302D020A486F004002800000FFFF45
S315000114E04EB900023A48487900027D10486F00441F
S315000114F0486F00444EB9000217E8204F2F28003CE0
S31500011500302D0208486F004402800000FFFF4EB9EB
S3150001151000023A48487900027D10486F0048486F3A
S315000115200048 4EB9000217E8204F2F280040302D01
S31500011530020 6486F004802800000FFFF4EB9000214
S3150001154003A48487900027D10486F004C486F004CBC
S315000115504EB9000217E8204F2F280044302D02040F
S31500011560486F004C02800000FFFF4EB900023A4866
S31500011570487900027D10486F0050486F00504EB9FF
S3150001158000 0217E8204F2F280048302D0202486F2D
S3150001159000 5002800000FFFF4EB900023A48487928
S315000115A00 0027D10486F0054486F00544EB9000286
S315000115B017E8204F2F28004C486F00D048790002C9
S315000115C0E5A248790002E5784E924FEF00440C47B8
S315000115D000186D047A1760023A077003C04548C0C7
S315000115E0068000C01D2420404240101 03F00486F75
S315000115F0009A48790002E5C148790002E5B14E92A8
S3150001160 0204F2F280164204F2F280168204F2F28B3
S3150001161001 70204F2F280174204F2F28017C486F1D
S31500011620 00BA48790002E5FA48790002E5D04E92FF
S315000116303F063F07486F00CA4240102D02DF3F00B8
S3150001164048790002E62048790002E6084E924FEFFB
S315000116500004 0204F3F28013A204F3F280138204FB4
S315000116603F280136486F009E48790002E6474879CF
S315000116700002E6254E92204F3F28014E204F3F287B
S31500011680014C204F3F28014A486F00B048790002BB
S315000116900E67248790002E6504E923F033F043F024C
S315000116A0486F00C248790002E69D48790002E67B50
S315000116B04E92204F2F28019443EF00564EB9000257
S315000116C041E0486F018C486F0184486F00564EB95E
S315000116D00000217E8204F2F28004E486F0194486FEB
S315000116E0018C486F005A4EB9000217E8204F2F2887
S315000116F00052486F005A486F0194486F005E4EB918
S3150001170000 0217E8204F2F280056486F00DA487963
S3150001171000 02E6CE48790002E6A64E924FEF004E51
S31500011720204F2F28015E43EF00204EB9000241E011
S315000117303003E248486F001602800000FFFF4EB9F1
S31500011740000 23A48486F0156486F001A486F001A5E
S315000117504EB9000217D2486F014A486F0016486F0A
S31500011760 00164EB9000217E8204F2F28000E30044C
S31500011770E248486F001A02800000FFFF4EB90002DE
S3150001178 03A48486F015E486F001E486F001E4EB909
S31500011790000217D2486F0152486F001A486F001AAB
S315000117A04EB9000217E8204F2F2800123002E248F6
S315000117B0486F001E02800000FFFF4EB900023A4842
S315000117C0486F0024486F0022486F00224EB900027C
S315000117D017D2486F015A486F001E486F001E4EB956
S315000117E0 000217E8204F2F280016486F00A44879F9
S315000117F00002E6FA48790002E6D24E924FEF00184F
S31500011800 42A7486F00244EB900019ED44A006600E3
S315000118100F8624A3900C01F036700013C2A7C00C0F8
S315000118201FA620157204B0816200012CD040303B06
S31500011830 0064EFB0002000A001C002E0052005258
S31500011840 0079800000 80400E0279FBFF0080400E87
S315000118506 02202797FFF0080400E0279FBFF008043
S31500011860 400E601002797FFF0080400E007904006F
S315000118700 080400E13FC000100E004DB13FC0002B3
S31500011880 00C01C71600000D00C95000000036604C6
S3150001189007C0160027C020C95000000036604420 78D
S315000118A060027E01307C0008D1F900C0010670009B
S315000118B01007E588D1C00828000200016700008EE4
S315000118C013C600E004DA4A3900C01EE26730103C54
S315000118D000FFD03900C01F25206F010A32100241D6
S315000118E00003C0C113C000E004DC30100240000355
S315000118F0D039C0E004DC13C000E004DD60384A3969
S315000119000 00C01EEB671A103C00FFD03900C01F490A
S3150001191013C0C0E004DC520013C000E004DD6016D1
S31500011920423900E004DC206F010A30100240000356

S3150001193013C000E004DD0279FBFF0080400E42394E
S3150001194000E004DB423900C01C71600A48790002DC
S31500011950E7074E92588F4A3900C01F05672C4A394E
S3150001196000C01EEF6624423900C01CCC42477000FD
S31500011970300706800C01CC2204010BC000152473F
S315000119800C47000A65E8610002A442404FEF01805E
S315000119903 3C000A0028E4CDF7CFC4E754E714E7139
S31500011 9A04E7148E7011C33C000A002904FEFFFF6CD
S315000119B0287C00C01C724A14670001842A7C00C07E
S315000119C01C8247EF00084A7900C01C80637A0C55D7
S315000119D0FFFF6774537900C01C80662E53140C14E4
S315000119E000036726421442390 0C01C7442472A7C10
S315000119F000C013B63F072F0D4EB90001391A4BED42
S31500011A0002E452470C4700036DEA2A7C00C013B674
S31500011A10602243ED02CE41D720D920D93091026F01
S31500011A20FCFF000843D741ED02CE20D920D93091E1
S31500011A304BED02E4BBFC00C01C6265D60279FCFFDB
S31500011A400080402E600000F84A556F6A53556608BB
S31500011A5033FC01A000C01C802A7C00C013B6604A7A
S31500011A6043ED02CE41D720D920D9309142401039D9
S31500011A7000C01C7602400003E148026FFCFF00082B
S31500011A80816F00084240103900C01C7A02400003F1
S31500011A90026FFFFC0008816F000843D741ED02CEBB
S31500011AA020D920D930914BED02E4BBFC00C01C6269
S31500011AB065AE6000008A0C55FFFF670000820C14BA
S31500011AC00002667A2A7C00C013B6604A43ED02CE54
S31500011AD041D720D920D93091424010390 0C01C7617
S31500011AE002400003E148026FFCFF0008816F000815
S31500011AF04240103900C01C7A02400003026FFFFC0D
S31500011B000008816F000843D741ED02CE20D920D9C4
S31500011B1030914BED02E4BBFC00C01C6265AE424055
S31500011B2010390 0C01C7602400003E1480279FCFF2F
S31500011B300080402E81790080402E18BC00014FEFB5
S31500011B40000A33C000A002924CDF38804E754E71F8
S31500011B504E714E7133C000A002944A3900C01C7206
S31500011B606732227C00C01C744A116728531166240F
S31500011B70423900C01C72423900C01C784240103CF8
S31500011B800000033C000C01C8033C000C01C8213C0DB
S31500011B9000C01C774A3900E004DB671C227C00C0C8
S31500011BA01C714A1167125311660E0279FBFF008000
S31500011BB0400E423900E004DB33C000A002964E75A8
S31500011BC04E714E714E712F0733C000A002981E2F21
S31500011BD0000D488748C7202F00082207D281D287E7
S31500011BE0E589068100027DC02041B0906D047E0426
S31500011BF060241E2F000D488748C72207D281D2874D
S31500011C00E589068100027DC02041B0A800046E046A
S31500011C107E05600242071007 33C000A0029A2E1FFC
S31500011C20205F5C8F4ED04E714E714E7148E7013C7C
S31500011C3033C000A0029C4FEFFFE62A7C00C01CCCFB
S31500011C400C15000A6C000268287C00C01C7C267CEE
S31500011C5000C01D42247C00C01CC210150C000009E6
S31500011C606200023A4880D040303B00064EFB00023B
S31500011C700014005C00720088009E00DA016601F023
S31500011C80021E021E4A1462000214303900C01CA250
S31500011C90907900C01CA4E848486F00140280000037
S31500011CA0FFFF4EB900023A48487900027D14486F99
S31500011CB00018486F00184EB9000217E8486F001067
S31500011CC04EB9000245382E00600001AC4A146200 8C
S31500011CD001CC303900C01D38E8487E003E00600066
S31500011CE001964A14620001B6303900C01D3AE8482F
S31500011CF07E003E00600001804A14620001A0303976
S31500011D0000C01D40E8487E003E006000016A4A149A
S31500011D1062000 1BA3013486F001602800000FFFF3F
S31500011D204EB900023A48487900027D10486F001A00
S31500011D30486F001A4EB9000217E8486F00124EB9F3
S31500011D4000245382E006000012E4A146200014E41
S31500011D503013907900C01D3C486F001402800000CA
S31500011D60FFFF4EB900023A48487900027D10486FDC
S31500011D700018486F00184EB9000217E848790002AA
S31500011D807D04486F0014486F00144EB9000217D243
S31500011D903013486F000802800000FFFF4EB90002B1
S31500011DA03A48487900027D10486F000C486F000CD4
S31500011DB04EB9000217E8486F000C486F0008486FDB
S31500011DC000084EB9000217A648574EB90002453819
S31500011DD02E00600000A24A14620000C230139079FE
S31500011DE000C01D3C486F001402800000FFFF4EB981
S31500011DF000023A48487900027D10486F0018486F82
S31500011E000184EB9000217E8487900027D04486FB0
S31500011E100014486F00144EB9000217D23013486FF0
S31500011E20000802800000FFFF4EB900023A484879D7
S31500011E3000027D10486F000C486F000C4EB900027D
S31500011E4017E8486F000C486F0008486F00084EB944
S31500011E500002177E48574EB9000245382E0060161B
S31500011E604A146238303900C01CA6907900C01CA201
S31500011E70E8487E003E0010154880 3F002F076100AC
S31500011E80FD461215488148C115801800600C1015D1
S31500011E90488048C015BC0003080052150C15000AFD
S31500011EA06C0C1015488048C015BC000208004FEFA5
S31500011EB0001A33C000A0029E4CDF3C804E754E7165
S31500011EC04E714E712F0D33C000A002A0598F2A6F9B
S31500011ED0000C0257FF00303C00FFC06F0010E148C4
S31500011EE0025700FF8157026F0FFF000208EF000340
S31500011EF00002307C00AAD1F900C00E843017E048F8
S31500011F00024000FF3200C2FC002CD1C14868001A11
S31500011F1048790002E73D2F0D4EB9000222C82F393C
S31500011F2000025CA448790002E746486D00204EB9DC
S31500011F300000222C84FEF0018588F33C000A002A23A
S31500011F402A5F205F5C8F4ED04E714E714E712F0D00
S31500011F5033C000A002A4598F2A6F000C0257FF005C
S31500011F6070F0D06F0010024000FFE148025700FFF9
S31500011F708157026F0FFF000208EF00030002307C59
S31500011F8000AAD1F900C00E843017E048024000FFD4
S31500011F903200C2FC002CD1C1486800044879000215
S31500011FA0E74F2F0D4EB9000222C82F3900025CA45B
S31500011FB048790002E758486D00204EB9000222C850
S31500011FC04FEF0018588F33C000A002A62A5F205F8A
S31500011FD05C8F4ED04E714E714E7148E7270C33C05F
S31500011FE000A002A8598F2EB900027D3C7A00303C30
S31500011FF000FFC06F0024E148025700FF8157026FBE
S3150001200 0FC0000023F3C00004EB900007AEA28407D
S315000120103017E048024000FF72003200E589D28C99
S31500012020 2A41082D00020001676 67003C02D0001D8
S31500012030675E082D00020001 66062E052C0760303A
S31500012040082D0004000166047001602020 7900C09B
S3150001205005802028000E7201B08166047001600CB3
S31500012060207900C005802028000E52802E002C0702
S31500012070 2006D080D0873215024100037400340156
S31500012080 22024EB9000253E02A00206F002042903E
S3150001209020 05588F33C000A002AA4CDF30E4205F30
S315000120A05C8F4ED04E714E714E7148E7270C33C08E
S315000120B000A002AC598F2EB900027D407A0070F063
S315000120C0D06F0024024000FFE148025700FF81570C
S315000120D0026FFC0000023F3C00004EB900007AEAA4
S315000120E028403017E048024000FF72003200E589BF
S315000120F0D28C2A41082D00030001675270 03C02DBE
S3150001210000 01674A082D00030001 66062E052C070B
S315000121100601C082D0004000166047001600A207924
S31500012120 00C005802028000ED0802E002C07200636
S3150001213 0D080D087321502410003740034 01220297
S315000121404EB9000253E02A00206F0020429020057C
S3150001215058 8F33C000A002AE4CDF30E4205F5C8FA5
S315000121604ED04E714E714E7133C000A002B033C0D5
S3150001217000A002B2205F588F4ED04E714E714E7143
S3150001218033C000A002B433C000A002B6205F588F4E
S315000121904ED04E714E714E7148E7213E33C000A0BC
S315000121A002B84FEFFFDC45EF0022286F00440252D0
S315000121B0FC00303C00FFC06F004CE148026F00FF9D
S315000121C00020816F00203F3C00004EB900007AEAF2
S315000121D02640302F0020E048024000FF7200320006
S315000121E0E589D28B2A41267C00C00580082D000294
S315000121F00001660442 47601E082D00040001670CB9
S31500012200 2053202800 0E7201B08166047E0160060B
S3150001221 03E280010DE414A475700022E08EF000201
S315000122200022202F0048320748C14EB900022F660E
S31500012230024000FF026FFF000020816F0020202F67
S3150001224000048320748C14EB900022FB80240000FBC
S31500012250720CE368026F0FFF00228 15F00220C47A8
S31500012260000016F2C303CF000C06F002266047E0135
S31500012270601E302F0022E2680240000F53400240E8
S3150001228 0000FE368026F0FFF0022816F00224247B1

S315000122904A476622302F0022720CE2680240000F84
S315000122A07E003E00701AD0932207D281D287E5893B
S315000122B0D0812F006006487900O2E769487900025B
S315000122C0E7612F0C2C7C000222C84E964FEF000CC2
S315000122D0267C00C00E84303900C00012E848024056
S315000122E000070C400004673A0839000000C000FDF1
S315000122F06730082D0004000167282F3900C000FA55
S315000123004 3EF00224EB90001900A41EF001E424000
S315000123101010322F0022740CE4690241000FB04103
S3150001232 0672C307C00AAD1D3302F0020E048024030
S315000123300 0FF3200C2FC002CD1C14868001A48795E
S315000123400002E770486C00084E964FEF000C3F3CC8
S315000123500000204F2F28002243EF001E4EB9000037
S315000123606958302F0020E048024000FF7200320019
S31500012370D2810681000007BC20413F10204F2F2843
S315000123800 01E2F28001A43EF001A4EB9000197A626
S315000123903 07C00AAD1D3302F0020E048024000FF54
S315000123A03200C2FC002CD1C148680016486F000CEF
S315000123B04EB90002161A486F0008486F0014486F9C
S315000123C000084EB9000215DC204F2F2800042F10FB
S315000123D0307C00AAD1D3302F0028E048024000FFCC
S315000123E03200C2FC002CD1C1486800234 86C002091
S315000123F04E964FEF00107003C02D0001674A30154D
S3150001240002400003720302810000FFFF82C00C41FB
S315000124100001633430 2F0020024000FF32150241D3
S315000124200000302800000FFFF80C152403F0048794F
S315000124300002E776486C00204EB900024584487 4D4
S315000124400 8204E964FEF000A4FEF002433C000A03C
S3150001245002BA4CDF7C84205F4FEF000A4ED04E71EA
S3150001246 04E714E7148E7273C33C000A002BC4FEFC6
S31500012470FFEC45EF000A2A6F00380252FC0070F0AB
S31500012480D06F0040024000FFE148026F00FF0008E4
S31500012490816F00083F3C00004EB900007AEA2640F1
S315000124A0302F0008E048024000FF72003200E58943
S315000124B0D28B2841267C00C00580082C0003000130
S315000124C0660442476018082C00040001660 47C017A
S315000124D0600520533C2800103006D0403E004A4793
S315000124E067000234202F003C320748C14EB9000272
S315000124F02F66024000FF026FFF000008816F00088F
S31500012500202F003C320748C14EB900022FB82C00DB
S3150001251072024EB900022F660240000F720CE36888
S3150001252 0026F0FFF000A816F000A2A0602450001A9
S315000125300 8EF0002000A3F3C000B43EF00024EB9D0
S315000125400000 73502F3900C000FA41EF00042F102C
S315000125502 04F2F28001043EF00184EB90000758E4A
S3150001256 0307C0008D1F900C00106302F0008E04890
S3150001257 0024000FF72003200E589D1C1082800043B
S315000125800 00166047E01600620532E28000E7001AC
S31500012590BE806322302F000A720CE2680240000FEF
S315000125A07E003E00701AD0932207D281D287E58938
S315000125B0D0812F006006487900 02E7814879000240
S315000125C0E77D2F0D267C000222C84E934879000232
S315000125D0E7892FCD4EB90002458448750 8004E93D0
S315000125E04FEF00147003C02C00016748301402 40FD
S315000125F00003720302810000FFFF82C00C4100014B
S3150001260063323 02F0008024000FF321402410003FA
S315000126100280C000FFFF80C152403F00487900025E
S31500012620E78D2F0D4EB90002458448750 8004E937B
S315000126304FEF000A30054A40670C0C400001570065
S315000126400 0C2600000D2487900027D44486F001044
S3150001265 04EB9000218164A406C0000BC48790002C7
S3150001266 07D48486F00104EB9000218164A406D00A9
S315000126700 0A6287C00C00E84203C000000AAD0944D
S31500012680322F0008E049024100FF3401C4FC002C4E
S31500012690D0822F00486F0010486F000C4EB900021F
S315000126A017D2204F2F280004307C00AAD1D4302F16
S315000126B0000CE048024000FF3200C2FC002CD1C1F0
S315000126C04868000D486D00204E93307C00AAD1D495
S315000126D0302F0014E048024000FF3200C2FC002CFB
S315000126E0D1C14868000448790002E794486D00208A
S315000126F04EB900024584487508204E934FEF0018E5
S3150001270060144 86D0020204F2F2800143F3C0063C1
S315000127104EB900000C144FEF001433C000A002BEE6
S315000127204CDF3CE4205F4FEF000A4ED04E714E71F4
S315000127304E7133C000A002C0227C00C01684207CEA
S315000127400080402620D920D9309113F900C0169176
S315000127500080404300791000008040 0833C000A08B
S315000127600 2C24E754E714E714E7148E7030C33C06D
S3150001277000A002C44FEFFFF62A6F001E3C2F002275
S315000127804 3ED02CE41D720D920D930917003C046FE
S3150001279 0E548026FFFF30008816F000843D741ED5A
S315000127A002CE20D920D930911B4602E249ED001A0A
S315000127B0203C00000090D0AD00163206C3FC00C8D4
S315000127C0D081288020402B50000C20542B68000417
S315000127D000100839000600C01E9B672C4A6D0204D2
S315000127E067267008D06D0204E8483E003B4702BAEE
S315000127F03B4702BC7008D06D0208E8483E003B47E3
S3150001280002BE3B4702C06044300648C0D0802E005D
S315000128107008207C00C01D28D0707800E8483B4035
S3150001282002BA7008D0707800E8483B4002BC7008D4
S315000128302 07C00C01D30D0707800E8483B4002C0C3
S315000128407008D0707800E8483B4002BE284D0C2D38
S315000128500 00302E2660E0C2D000A02DD6606426DD9
S315000128600 00C6004422D02DD204C3228000C303968
S3150001287000C01CB2C2C0D28148413141000C32288D
S315000128800 01030 3900C01CB2C2C0D28148413141 6A
S315000128900 0104FEF000A33C000A002C64CDF30C063
S315000128A0205F5C8F4ED04E714E714E7148E7010C20
S315000128B033C000A002C84FEFFFF62A6F001A43ED9E
S315000128C002CE41D720D920D93091701FC06F001E8A
S315000128D0720AE368026F83FF0008816F000843D71D
S315000128E041ED02CE20D920D930911B6F001F02E0A5
S315000128F04240102D02E00240001FE368026D83FF93
S3150001290002D6816D02D67E001E2D02E0202D001614
S3150001291022 07D281D287D281D08128402A94702879
S31500012920D06C00047201B2406F047001600670281 9
S31500012930D06C0004323C00C8B2406C043E01601801
S31500012940 7028D06C00047201B2406F0470016006F9
S3150001295 07028D06C00043E003B4700144240102D05
S3150001296002E00240000348C0068000C01D2420404A
S315000129704240101 03B4002DA0839000600C01E9B97
S31500012980 67144A6D02C2670E7008D06D0202E848AC
S3150001299 03B4002B8601A70087200122D02E0D28123
S315000129A0068100C01CF42041D050E8483B4002B8E3
S315000129B00C2D001702E0660C0C2D001402DE6604D5
S315000129C04255600442 2D02DE284D204C321030392A
S315000129D000C01CB4C2C0D281484130814FEF000A09
S315000129E033C000A002CA4CDF3080205F5C8F4ED01E
S315000129F04E714E714E7148E7000C33C000A002CCF7
S31500012A002A6F000C7008D0AD001A7200122D02E078
S31500012A10E789D08128402B5400042B6C0004000860
S31500012A200C2D001702E066080C2D001402DE67105B
S31500012A300C2D000302E266100C2D000A02DD660869
S31500012A40426D0004426D0008284D204C32280004D6
S31500012A50303900C01CB6C2C0D28148413141 0004A0
S31500012A6032280008303900C01CB6C2C0D2814841A4
S31500012A7031410008 33C000A002CE4CDF3000205F98
S31500012A80588F4ED04E714E714E7148E7FFFE33C0DE
S31500012A9000A002D04FEFFFE600798000008040 40A1
S31500012AA0279BFFF0080400842 43163900C01C7DF1
S31500012AB0287C00C01C7E13D400C01C7D2C7C00C069
S31500012AC01C662A56267C00C01C622C93521406935F
S31500012AD000002E40C9300C01C626508421426BC87
S31500012AE000C013B6247C00C013822852227C0080C9
S31500012AF04030204C20D920D920914AAC000E6706DF
S31500012B00206C000E4E907046D1920C9200C013823A
S31500012B1065 0624BC00C00E963039008 0402E720A2C
S31500012B20E2680240001F20521140000C2052117928
S31500012B3000C01C7D000D20521028000C2056B02824
S31500012B4002E0671642411200024 1001F700AE16964
S31500012B50026883FF02D6836802D630390080403C82
S31500012B6002401FFF02400FFF44400640100 0720062
S31500012B703200D3B900C01CBE70282053D06802D8D9
S31500012B80314002CE302802D8D068001431 4002D03C
S31500012B90064000233140 02D22E88203C000002CE9E
S31500012BA0D0972040227C0080402622D822D832901D
S31500012BB0303C1FFF2053C06802D80279E000008034
S31500012BC0403C81790080403C13E802DB00804043B1
S31500012BD020524AA8001267062268001 24E91007917
S31500012BE0400000080400 84A2D02DF670647ED0114C8

S31500012BF0600447ED006A207900C045903028000244
S31500012C000800000F67053E2C000460043E2C0002FB
S31500012C100C470FE16E060C47001E6C04522D02DCB8
S31500012C20203CFFFFFE5CD08C0C8000C00E96650632
S31500012C3045ECFE5C600445EC03483F6A000600145F
S31500012C403F6A00080018302D02B890543F4000102A
S31500012C50302C0002906D02BA3F400012302D02BAAC
S31500012C60916F0014302C0004906D02BE3F40001697
S31500012C70302D02BE916F001870003014D1AB0048A0
S31500012C807000302C0002D1AB004C7000302C0006D5
S31500012C90D1AB00507000302C0004D1AB005870004D
S31500012CA0302C0008D1AB0054302D02C4B05463045B
S31500012CB03B5402C4302D02C2B05464043B5402C2D8
S31500012CC0302D02C8B06C000263063B6C000202C8DC
S31500012CD0302D02C5B06C000264063B6C000202C6CF
S31500012CE0302D02CCB06C000463063B6C000402CCB0
S31500012CF0302D02CAB06C000464063B6C000402CAA3
S31500012D000C79FFFF00C01C8266760C39000400C0F6
S31500012D101C72660A13FC000300C01C726062247CEC
S31500012D2000C01C802C7C000262B20C39000300C07A
S31500012D301C72661C2F164EB90000379A0C40FFFF15
S31500012D40673E13FC000200C01C7234BC1680603062
S31500012D500C39000200C01C7266264A52630C53529B
S31500012D602F164EB90000379A60162F164EB900007D
S31500012D70379A0C40FFFF670813FC000100C01C7264
S31500012D80526B006042464240102D02E0322D02D6BF
S31500012D90740AE469C241001FB04167167CFF424094
S31500012DA0102C000C3F002F0D6100FB022F0D61005E
S31500012DB0FC462E3900C01CBE9EAD001E2B7900C0FC
S31500012DC01CBE001E2C4D45EC001649EF0010207963
S31500012DD000C045903028000208000000F6700033E3E
S31500012DE0204A224C2F42000C2F4A0008244E301153
S31500012DF0C1C032123407C2C2142A00026B04E5A113
S31500012E0060044402E4A12401C4C021420004240157
S31500012E1048424840C4C020822401C4C048404841B9
S31500012E20C0C14281D480D381484148423202424 2E4
S31500012E30D5A800042410D5812082508845EA0008CF
S31500012E40301132290006C1C16B084A2A0003670AFC
S31500012E50605244804A2A0003674A32123407C2C2CA
S31500012E60142A00026B04E5A160044402E4A12401D2
S31500012E70C4C021420004240148424840C4C0208203
S31500012E802401C4C048404841C0C14281D480D38195
S31500012E9048414842320242 42D5A800042410D58155
S31500012EA020826052321234 07C2C2142A00026B0415
S31500012EB0E5A160044402E4A12401C4C02142000446
S31500012EC0240148424840C4C020822401C4C048406D
S31500012ED04841C0C14281D480D3814841484232022F
S31500012EE04242D5A800042410D581208244A80004BA
S31500012EF020104080208050883011322900 08C1C13D
S31500012F006B084A2A0003670A605244804A2A000372
S31500012F10674A32123407C2C2142A00026B04E5A1C1
S31500012F2060044402E4A12401C4C021420004240136
S31500012F3048424840C4C020822401C4C04840484198
S31500012F40C0C14281D480D3814841484232024242C3
S31500012F50D5A800042410D5812082605232123407 8C
S31500012F60C2C2142A00026B04E5A160044402E4A172
S31500012F702401C4C021420004240148424840C4C07F
S31500012F8020822401C4C048404841C0C14281D48046
S31500012F90D3814841484232024242D5A80004241056
S31500012FA0D581208244A800042010408020804 5EA73
S31500012FB0000850883029000632290008C1C16B0873
S31500012FC04A2A0003670A605244804A2A0003674A74
S31500012FD032123407C2C2142A00026B04E5A160044E
S31500012FE04402E4A12401C4C021420004240148425 0
S31500012FF04840C4C020822401C4C048404841C0C1E1
S3150001300004281D480D3814841484232024242D5A806
S31500013010000042410D58120826052321234 07C2C2C4
S3150001302 0142A00026B04E5A160044402E4A1240110
S31500013030C4C021420004240148424840C4C0208241
S315000130402401C4C048404841C0C14281D480D381D3
S31500013050484148423202 4242D5A800042410D58193
S31500013060208244A800042010408020805088598A7C
S315000130703029000 2C1C032123407C2C2142A00022A
S31500013080 6B04E5A160044402E4A12401C4C0214209
S315000130900004240148424840C4C020822401C4C01F
S315000130A048404841C0C14281D480D3814841484209
S315000130B032024242D5A800042410D58120825088CC
S315000130C0588A30290006C1C032123407C2C2142AF6
S315000130D000026B04E5A160044402E4A12401C4C01A
S315000130E0214200042401484248 40C4C020822401F0
S315000130F0C4C048404841C0C14281D480D3814841BF
S31500013100484232024242D5A800042410D5812082C9
S315000131100242F000C246F000860000336204A224C3D
S3150001312 02F42000C2F4A0008244E3011C1C0321222
S31500013130 3407C2C2142A00026B04E5A160044402EA
S31500013140E4A12401C4C021420004240148424840AC
S31500013150C4C020822401C4C048404841C0C1428144
S31500013160D480D3814841484232024242D5A8000464
S3150001317 02410D581208250885 88A30113229 0002C4
S31500013180C1C16B084A2A0003670A605244804A2A71
S3150001319 00003674A32123407C2C2142A00026B04C2
S315000131A0E5A160044402E4A12401C4C02142000453
S315000131B0240148424840C4C020822401C4C048407A
S315000131C04841C0C14281D480D3814841484232023C
S315000131D04242D5A800042410D5812082605232 12C1
S315000131E03407C2C2142A00026B04E5A1600444023A
S315000131F0E4A12401C4C021420004240148424840FC
S31500013200C4C020822401C4C048404841C0C1428193
S31500013210D480D3814841484232024242D5A80004B3
S3150001322 02410D581208244A8000420104080208 0EB
S31500013230508830113229 0004C1C16B084A2A0003A3
S315000132400670A605244804A2A0003674A32123407E9
S31500013250C2C2142A00026B04E5A160044402E4A17F
S315000132602401C4C021420004240148424840C4C08C
S3150001327020822401C4C048404841C0C14281D48053
S31500013280D3814841484232024242D5A80004241063
S31500013290D581208260523212340 7C2C2142A00023A
S315000132A06B04E5A160044402E4A12401C4C02142E7
S315000132B0000424014842 4840C4C020822401C4C0FD
S315000132C048404841C0C14281D480D38148414842E7
S315000132D032024242D5A800042410D581208244A896
S315000132E00004201040802080 45EA000850883029DB
S315000132F000023229 0004C1C16B084A2A0003670A89
S31500013300605244804A2A0003674A32123407C2C215
S31500013310142A00026B04E5A160044402E4A124011D
S31500013320C4C021420004240148424840C4C020824E
S315000133302401C4C048404841C0C14281D480D381E0
S3150001334048414842320242 42D5A800042410D581A0
S31500013350208260523212340 7C2C2142A00026B0460
S31500013360E5A160044402E4A12401C4C02142000491
S31500013370240148424840C4C020822401C4C04840B8
S315000133804841C0C14281D480D3814841484232027A
S315000133904242D5A800042410D581208244A8000405
S315000133A0201040802080508830290002C1C032128E
S315000133B03407C2C2142A00026B04E5A16004440268
S315000133C0E4A12401C4C021420004240148424840 2A
S315000133D0C4C020822401C4C048404841C0C14281C2
S315000133E0D480D3814841484232024242D5A80004E2
S315000133F02410D581208250885 88A30290006C1C000
S31500013400032123407C2C2142A00026B04E5A1600419
S3150001341044 02E4A12401C4C021420004240148421B
S315000134204840C4C020822401C4C048404841C0C1AC
S315000134304281D480D3814841484232024242D5A8D2
S31500013440000042410D5812082242F000C246F00084B
S31500013450 0C79FFFF00C01C82660C0C39000200C00B
S315000134601C72660000AA49ED0022204A224C2F4216
S3150001347 0000C43E9004841E800302020D1A1222177
S31500013480 20205BC2488248C2D38022812221D38276
S31500013490 22812020D1A1222120205BC2488248C25C
S315000134A0D38022812221D38222812020D1A12221EF
S315000134B0020205BC2488248C2D38022812221D38246
S315000134C022812020D1A1222120205BC2488248C22C
S315000134D0D38022812221D38222812020D1A12221BF
S315000134E020205BC2488248C2D38022812221D38216
S315000134F022812020D1A1222120205BC2488248C2FC
S31500013500D38022812221D382228124 2F000C4A4694
S31500013510660001B242471E2D02E242451A2D02E023
S31500013520 4A3900C01C70660001180C450017663444
S31500013530 0C6FFAAB00106F1E0C6F055500106C1660
S31500013540 0C2D001402DE6464522D02DE0C2D0014D3

S3150001355002DE6658604C0C2D001402DE664A08C66F
S315000135600000060443005 48C0D080068000027D4CD2
S31500013570204030104440322F0010B2406F2A3005EF
S31500013580048C0D080068000027D4C2040B2505C18A5
S31500013590522D02DE0C2D001402DE6510422D02DED4
S315000135A0524508C600006004422D02DE207900C0A3
S315000135B0459030280002080000F6706382F0016D4
S315000135C06004382F00120C47000366300C44FAAB36
S315000135D06F1C0C4405556C160C2D000A02DD644463
S315000135E0522D02DD0C2D000A02DD6638602C0C2DF1
S315000135F0000A02DD662A08C6000160240C44FCCEDE
S31500013600 6F1E0C4403326C18522D02DD0C2D000A7C
S3150001361002DD6510422D02DD524708C60001600435
S31500013620422D02DD0C2D001402DC65484A476F4429
S3150001363053 4708C60001422D02DC422D02DD6034EB
S31500013640422D02DE4240103900C01C75BA40670C9B
S31500013650042451A3900C01C7508C600004240103 99F
S315000136600 0C01C79BE40670C42471E3900C01C7958
S31500013670 08C600014A4667440806000157083F0775
S315000136802F0D6100F0E608060000672A207900CCC8
S3150001369045903028000208 00000E670A00792000D4
S315000136A0008040466008 0279DFFF008040463F0502
S315000136B02F0D6100F1F82F0D6100F33C33FC000181
S315000136C000C01CCE4A3900E004DB660000DE287C1F
S315000136D000C013944240103900E004DCB640662075
S315000136E07E001E3900E004DA43ED00222007D08077
S315000136F0D087E588D3C0204C20D920D92091602CD1
S3150001370004240103900E004DDB6406C207E001E39CF
S31500013710 00E004DA41ED00222007D080D087E58859
S31500013720D1C02F082F0C4EB9000197624240103 9C3
S31500013730 00E004DD5340B6406670224C207C00C098
S31500013740 13A020D920D92091287C00C013902039BC
S31500013750 00C013A47216E2A80240000F3880303967
S3150001376 0080400E0800000F661E0C540008651804
S315000137700C540 00C641233D400C01392227C0080D6
S31500013780400E00518000602230390080400E080052
S31500013790000F67160C540004641033D400C0139252
S315000137A0227C0080400E02517FFF0C39003D00C093
S315000137B000FE630001404A2D02DF670649ED006AFB
S315000137C0600449ED01144A6C006066000128700 32B
S315000137D0C02B00616600011E277900C01CBE005C7B
S315000137E04A3900C01C7067047E01600242473007F7
S315000137F002400001720FE36808AD000702D4816D33
S31500013800 2D4422D02DC43ED02C241ED01F620D97C
S315000138102 0D92091227C0000089641ED02C220D9D0
S315000138202 0D92091424745EB006249ED0022224C06
S3150001383 0204A20D920D92091524749EC000C45EA6B
S31500013840000C0C4700066DE64A2D02DF57C0440006
S3150001385048801B4C02DF302D02D8B07900C01ECA55
S31500013860675E3B7900C01ECA02D87028D06D02D8A7
S31500013870 3B4002CE7028D06D00147201B2406F0435
S3150001388070016006702 8D06D00014323C00C8B24049
S31500013890 6C043E0160187028D06D00147201B240AC
S315000138A06F04700160067028D06D00143E003 02D43
S315000138B002D8D0473B4002D0064000233B4002D20B
S315000138C0287C00C045764A14672A0C140004642437
S315000138D04240102D02E23F002F0D6100EE8E424064
S315000138E0102D02E03F002F0D6100EFC22F0D610088
S315000138F0F10653144A7900C0454E660833FC0001AF
S31500013900 00C0454E4FEF001A33C000A002D24CDF73
S31500013910 7FFF4E734E714E714E7148E70F0C33C0E7
S315000139200 00A002D42A6F001C3A2F00204A3900C099
S315000139301C726636207C0000084E1030500048800C
S31500013940 02400003E148026DFCFF02D6816D02D6FA
S31500013950207C0000084B1030500048800 2400003D4
S315000139600 26DFFFC02D6816D02D642471E2D02E290
S31500013970 4244182D02E0207900C04590302800020B
S31500013980 0800000E670A007920000 08040466008A2
S31500013990 0279DFFF00804046287C00804024101415
S315000139A00 2000003424112002 07C0000084B103047
S315000139B0500 04880B24066347003B0476C043C0046
S315000139C0 60023C071014E408020000 03424112 00A1
S315000139D0B24667187003B0476C047C0360021C078B
S315000139E07003C006E508021400F381143005C1FC1A
S315000139F003C206800007A0002B4000163B7900C0D9
S31500013A001ECA02D83F072F0D6100ED603F042F0D3E
S31500013A106100EE9A2F0D6100EFDE33C000A002D6E1
S31500013A204CDF30F0205F5C8F4ED04E714E714E717F
S31500013A3033C000A002D833C000A002DA4E754E7121
S31500013A404E714E7148E73F3E33C000A002DC4FEF96
S31500013A50FFD045D7227C0000094C204A20D920D925
S31500013A6020914EB9000052FE303900804008 08000E
S31500013A70000C670009380 25200FF605C3012E04812
S31500013A80024000FF72003200E589068100C00C3455
S31500013A9020413010024000 0341EF001E3212E0497E
S31500013AA0024100FF74003401D1C2108041EF0010C1
S31500013AB03012E048024000FF72003200D1C110BC52
S31500013AC000013012E048024000FF5240024000FF70
S31500013AD0E148025200FF81523012E048024000FFE5
S31500013AE00C40000E65964240103900C01C70024021
S31500013AF00001720FE36808B9000700C01C868179CE
S31500013B0000C01C860252FF002A7C00C013B647EF94
S31500013B1000022C7C000007BC500008844A2D02DFED
S31500013B20670A41ED006A2F48002C6C0841ED011437
S31500013B302F48002C4A2D02DF670649ED0114600467
S31500013B4049ED006A206F002C4A680060630008 3A5C
S31500013B5043ED020C702922D851C8FFFC3290206F28
S31500013B60002C2028005C90AC005C2B4002680C39CC
S31500013B700002 00C01C7064062F0D61000E0E0C2D94
S31500013B8001402DE65047E1860041E2D02E01B4748
S31500013B9002B60C2D000A02DD65047E0460041E2DAA
S31500013BA002E21B4702B7025200FF607A3012E04878
S31500013BB0024000FF7A003A003012E048024000FF5E
S31500013BC07C003C003012E048024000FF7E003E00CF
S31500013BD02007D080D087E5882F34086A2F340866FD
S31500013BE02F34086241ED026E2006D080D086E5882A
S31500013BF0D1C02F2800082F2800042F1043ED020CF6
S31500013C002005D080D085E588D3C04EB90001962E17
S31500013C103012E048024000FF5240024000FFE148F6
S31500013C20025200FF81523012E048024000FF0C4070
S31500013C300 00066500FF7808AF000200024AAD0218CF
S31500013C406C000204302F0002720AE26802400000191
S31500013C507C003C00302F0002E268024000017E0039
S31500013C603E00486D020C2006ED889086E7880680A6
S31500013C7000E000E23212024100FF41EF0014240786
S31500013C80E78A9487D482D1C214280009488202 8126
S31500013C900000FFFF82C23401C4FC00A8D08220408C
S31500013CA04868006C4EB900019762302F0002720A13
S31500013CB0E268024000017A003A00302F0002E26811
S31500013CC0024000017E003E003012024000FF41EF3B
S31500013CD000102207E7899287D281D1C112280009F3
S31500013CE0488102800000FFFF80C17C003C00486DD6
S31500013CF0020C2005E788D085E588068000E00052A1
S31500013D002206D281D286E589D0812F004EB90001E3
S31500013D109762302F0002720AE268024000017C00BD
S31500013D203C00302F0002E268024000017E003E00A6
S31500013D30486D02182006ED889086E788068000E027
S31500013D4000E23212024100FF41EF00142407E78A24
S31500013D509487D482D1C214280005488202810000CA
S31500013D60FFFF82C23401C4FC00A8D08220404868 0B
S31500013D70003C4EB9000196A64AAD02246C64302F70
S31500013D800002720AE268024000017C003C00302F0A
S31500013D9000 2E268024000017E003E00486D0224F6
S31500013DA02006ED889086E788068000E000E2321260
S31500013DB0024100FF41EF00142407E78A9487D48269
S31500013DC0D1C214280006488202810000FFFF82C288
S31500013DD03401C4FC00A8D08220404868004860 0035
S31500013DE001FA302F0002720AE268024000017C00EB
S31500013DF03C00302F0002E268024000017E003E00D6
S31500013E00486D02242006ED889086E788068000E04A
S31500013E1000E23212024100FF41EF00142407E78A53
S31500013E209487D482D1C214280007488202810000F7
S31500013E30FFFF82C23401C4FC00A8D08220404868 3A
S31500013E4000054600001FE302F0002720AE26802404F
S31500013E5000017C003C00302F0002E26802400001B4
S31500013E607E003E00486D020C2006ED889086E788AC
S31500013E70068000E000E23212024100FF41EF001429
S31500013E802407E78A9487D482D1C21428000448 8281
S31500013E9002810000FFFF82C23401C4FC00A8D08267
S31500013EA0204048680030 4EB900019762302F000269

S31500013EB0720AE268024000017A003A00302F0002DD
S31500013EC0E268024000017E003E003012024000FF1F
S31500013ED041EF00102207E7899287D281D1C11228CA
S31500013EE0000448810280000FFFF80C17C003C0085
S31500013EF0486D020C2005E788D085E588068000E03C
S31500013F00000A2206D281D286E589D0812F004EB9D8
S31500013F1000019762302F0002720AE268024000136
S31500013F207C003C00302F0002E268024000017E0066
S31500013F303E00486D02182006ED889086E7880680C7
S31500013F4000E000E23212024100FF41EF00142407B3
S31500013F50E78A9487D482D1C2141048820281000074
S31500013F60FFFF82C23401C4FC00A8D0822F004EB9E3
S31500013F70000197624AAD02246C68302F0002720A72
S31500013F80E268024000017C003C00302F0002E2683A
S31500013F90024000017E003E00486D02242006ED88A5
S31500013FA09086E788068000E000E23212024100FFB7
S31500013FB041EF00142407E78A9487D482D1C21428DA
S31500013FC000024882028100000FFFF82C23401C4FC64
S31500013FD000A8D082204048680018 4EB9000196A674
S31500013FE06066302F0002720AE268024000017C001E
S31500013FF03C00302F0002E268024000017E003E00D4
S315000140000486D02242006ED889086E788068000E048
S315000140100 0E23212024100FF41EF00142407E78A51
S3150001402094 87D482D1C2142800014882028100000FB
S31500014030FFFF82C23401C4FC00A8D0822040486838
S315000140400 00C4EB900019762302F0002720AE26835
S31500014050024000017C003C00302F0002E268024071
S3150001406000017E003E00486D023C2006ED889086E8
S31500014070E788068000E000E23212024100FF41EFCC
S315000140800 00142407E78A9487D482D1C21428000A2F
S315000140904882028100000FFFF82C23401C4FC00A8ED
S31500014 0A0D0822040486800784EB900019762302FCF
S315000140B00002720AE268024000017C003C00302FD7
S315000140C00002E268024000017E003E00486D02489F
S315000140D02006ED889086E788068000E000E232122D
S315000140E0024100FF41EF00142407E78A9487D48236
S315000140F0D1C21428000B48820281000 0FFFF82C250
S31500014100 3401C4FC00A8D0822040486800844EB91E
S3150001411000019762302F0002720AE268024000 0134
S31500014 1207A003A00302F0002E268024000017E0068
S31500014 1303E003012024000FF41EF00102207E789DE
S3150001414092 87D281D1C11228000A48810280000 0DB
S31500014150FFFF80C17800380020790 0C045903028E3
S31500014160000208 00000F67067E052C0760047E0426
S3150001417 02C0741ED020C2006D080D087E588D1C0FE
S31500014 1802F082005E788D085E588068000E0009A9B
S3150001419022 04D281D284E589D0812F004EB9000153
S31500014 1A097624AB900C00E7867000192025200FF79
S31500014 1B06000017A302F0002720AE2680240000 1B3
S31500014 1C07E003E0048790000095870 44D0B900C00D
S31500014 1D001062207E7899287E789D0813212E049F1
S31500014 1E0024100FF74003401E58AD0822F004EB9E6
S31500014 1F0000218164A406F00011E302F0002720A93
S31500014200E268024000017A003A00302F0002E268BB
S3150001421002 4000017C003C003012E048024000FFF1
S31500014 2207E003E002005ED889085E788068000E047
S3150001423000E23212024100FF41EF00102406E78A34
S315000142409486D482D1C23412E04A024200FF76003B
S3150001425036 02D1C3141048820281000 0FFFF82C2D3
S31500014 26034 01C4FC00A8D0822207D281D287E58915
S31500014270D08128403012E048024000FF720032002F
S31500014280D28120013F3608002F2C00042F1443EF62
S31500014290001 64EB900019370487900000958486F1D
S31500014 2A000104EB9000218164A406D42302F000226
S31500014 2B0720AE268024000017E003E007044D0B9F5
S31500014 2C000C001062207E7899287E789D081321269
S31500014 2D0E049024100FF74003401E58AD0822F00D3
S31500014 2E0486F00104EB9000218164A406F28224C3A
S31500014 2F041EF000420D920912F0A3F3C00033F3CA7
S3150001430 0001F4EB900007174227C00027D84204C8E
S31500014310 20D920D920913012E048024000FF5240B6
S315000143200 24000FFE148025200FF81523012E0488C
S315000143300 24000FF0C40000E6500FE7A302F00029D
S31500014340720AE268024000015240024000 01E3683D
S315000143500 8AF00020002816F0002302F0002E268FE
S31500014360024000014A406600F8D4227C000008821F
S31500014370307C0048D1EF002C700420D951C8FFFCD5
S31500014380206F002C4268006030120 24000FF52404C
S3150001439002 4000FF0252FF0081524BED02E430124F
S3150001 43A0024000FF0C4000036500F7724FEF00303A
S315000143B033C000A002DE4CDF7CFC4E754E714E719F
S315000143C04E7148E7233E33C000A002E04FEFFFC421
S315000143D047EF0060227C0000095C41EF001020D904
S315000143E020D92091025300FF08D30002302F00622A
S315000143F0720AE268024000017C003C003013024070
S31500014400 00FF7E003E0049EF00303F39000007C43F
S3150001441020 06E788D086E588068000E0000A2207A4
S31500014420D281D287E589D08120402F2800082F2804
S3150001443000042F10224C4EB90001986A302F0062F9
S31500014440720AE268024000017C003C00301302401F
S315000144500 00FF7E003E002006E788D086E5880680BC
S31500014460 00E0009A2207D281D287E589D0812A40CD
S31500014470 207900C0459030280002080 0000F670A25
S315000144800 25300FF00530B006008025300FFC05364
S315000144900 0A003013E048024000FF72003200D28168
S31500014 4A00681000007BC20413F102F2D00082F2D4B
S31500014 4B000042F1543EF00164EB90001986A486FA4
S31500014 4C000082FCC4EB90002151E4BEF0028487943
S31500014 4D00000 9682F0C4EB9000216784A406F0099
S31500014 4E000942F0C486F00104EB90002163E204F63
S31500014 4F02F28000C43EF003C4EB90002351048 6FDF
S315000145000 0382F0D4EB90002161A2F0D2F0C486FC9
S3150001451000104EB9000215FA2F0D486F000C486FB6
S31500014520 00084EB90002157848790000 0970486FF5
S315000145300 00042F0D4EB9000215FA2F0D2F0C486FEE
S31500014540 00104EB9000215FA2F0D486F000C486F86
S31500014550 00084EB900021578487900000970486FC5
S315000145600 00042F0D4EB9000215FA2895296D000495
S31500014570 0004600E28BC00000000297C0000000039
S31500014580 00043F39000007C22F2C00042F1443EF0B
S31500014590 00264EB900019A082F0C486F003C4EB90F
S31500014 5A0002163E2C7C00027D844AB900C00E78BA
S31500014 5B06764302F0012720AE268024000017E0031
S31500014 5C03E00307C0044D1F90C C001062007E7888F
S31500014 5D09087E788D1C0486800 20486F003C4EB9F3
S31500014 5E0000218164A406F2E2F53001043EF001C8D
S31500014 5F041EF001420D92091486F00103F3C000381
S3150001460 03F3C001F4EB900007174224E41EF001C61
S315000146102 0D920D920913 02F0062720AE268024027
S31500014620 00017E003E00486F001C2007ED88908740
S31500014630E788068000E000E23213024100FF340100
S31500014640C4FC00A8D0822040486800244EB900016D
S31500014650976202530 0FF00530900302F0062720A6D
S31500014660E268024000017C003C003013024000FF7A
S315000146707E003E003F39000007CE2006E788D0863F
S31500014680E588068000E000522207D281D287E589BB
S31500014690D08120402F2800082F2800042F10224CFB
S315000146A04EB90001986A302F0062720AE268024030
S315000146B000017C003C003013024000FF7E003E00FA
S315000146C02006E788D086E588068000E0009A220762
S315000146D0D281D287E589D0812440207900C04590D6
S315000146E0302800020800000F670A025300FF00533A
S315000146F00B006008025300FF00530A003013E04824
S31500014700024000FF72003200D2810681000007BC20
S31500014710 20413F102F2A00082F2A00042F1243EFB1
S31500014720 00164EB90001986A486F00082F0C4EB961
S31500014730 0002151E224E204A20D920D920914879FF
S31500014740 000009682F0C4EB9000216784A406F0026
S31500014750 00942F0C486F00104EB90002163E204FF0
S3150001476 02F28000C43EF003C4EB900023510486F6C
S31500014770 00382F0D4EB90002161A2F0D2F0C486F57
S31500014780 00104EB9000215FA2F0D486F000C486F44
S31500014790 00084EB900021578487900000970486F83
S315000147A000042F0D4EB9000215FA2F0D2F0C486F7C
S315000147B000104EB9000215FA2F0D486F000C486F14
S315000147C000084EB900021578487900000970486F53
S315000147D000042F0D4EB9000215FA2895296D000423
S315000147E00004600E28BC00000000297C00000000C7
S315000147F00043F39000007CC2F2C00042F1443EF8F
S315000148000264EB900019A082F0C486F003C4EB99C

S315000148100002163E4AB900C00E786764302F0012B6
S31500014820720AE268024000017E003E00307C0044CC
S31500014830D1F900C001062007E7889087E788D1C033
S315000148404868002048 6F003C4EB9000218164A40DD
S315000148506F2E2F53001043EF001C41EF001420D997
S315000148602091486F00103F3C00033F3C001F4EB9AA
S31500014870000071742 24E41EF001C20D920D92091ED
S31500014880302F0062720AE268024000017E003E009B
S315000148904 86F001C2007ED889087E788068000E0B6
S315000148A000E23213024100FF3401C4FC00A8D082A9
S315000148B02040486800604EB900019762302F0062BF
S315000148C0720AE268024000017C003C00301302409B
S315000148D000FF7E003E00224E2006E788D086E5884E
S315000148E0068000E0000A2207D281D287E589D081BD
S315000148F0204020D920D92091302F0062720AE26827
S31500014900024000017C003C003013024000FF7E00A3
S315000149103E00224E2006E788D086E588068000E024
S31500014920009A2207D281D287E589D081204020D9F9
S3150001493020D92091302F0062720AE26802400001FC
S315000149407C003C003013024000FF7E003E00224EF8
S315000149502006E788D086E588068000E00052220717
S31500014960D281D287E589D081204020D920D92091D2
S315000149704FEF003C33C000A002E24CDF7CC4205F55
S31500014980588F4ED04E714E714E712F0733C000A015
S315000149900 2E4226F00087E003E29026C202902549F
S315000149A0E98822074EB9000253E03340020220296A
S315000149B00258E9884EB9000253E033400204202927
S315000149C0025CE9884EB9000253E0334002062029 11
S315000149D00264E9884EB9000253E03340020820 29F7
S315000149E00260E9884EB9000253E03340020A33C03F
S315000149F000A002E62E1F205F588F4ED04E714E71D9
S31500014A004E7148E7030C33C000A002E84FEFFFECFC
S31500014A102A6F00283E2F002C0C4700076C00012648
S31500014A20202D026848574EB900023A484879000DD
S31500014A300978486F0004486F00144EB9000217D276
S31500014A403C0748C641ED020C2006D080DC86E58899
S31500014A50D1C02F68000400043C0748C641ED020C92
S31500014A602006D080D086E588D1C02F6800080008CE
S31500014A700C470001670C0C47000267060C47000350
S31500014A8066164AAF00046C10486F00044EB9000167
S31500014A9095640A6F8000000C49EF00107020320700
S31500014AA048C1D2810681000007DA2041D0503F007B
S31500014AB0204F2F28000A2F280006224C4EB900014C
S31500014AC09370486F000C2F0C4EB90002150C30077D
S31500014AD00C400006626ED040303B00064EFB0002E1
S31500014AE0000E002400240024000E000E00342F14B2
S31500014AF043ED01BE300748C0E588D3C04EB9000278
S31500014B003510604041ED01BE300748C0E588D1C08F
S31500014B1020946030207900C0459030280002080 0BA
S31500014B20000F67047E0560027E04486D01BE41EDFB
S31500014B3001BE2007E588D1C02F08486D01D64EB9C0
S31500014B40000217D24FEF001433C000A002EA4CDF77
S31500014B5030C0205F5C8F4ED04E714E714E7148E76A
S31500014B60033A33C000A002EC267C00C01C7C4A1329
S31500014B706300028E4A3900C01C78660002844A79B5
S31500014B8000C01C846600027A227C00C01C7B0C11CA
S31500014B900026670002 6C4A11650000E00C11002531
S31500014BA0620000D80C130002620E7010D0B900C06A
S31500014BB01D44EA882E0060063E3900C01D460C11D0
S31500014BC0000362164240101148C0D080068000C022
S31500014BD01D2820403087600000A20C1100076218D2
S31500014BE0424010115940 48C0D080068000C01D3097
S31500014BF020403087600000840C11001F622A7CF877
S31500014C00424010 11DC40300648C0D080068000C00A
S31500014C101CF4204030870C11001F665E0C13000146
S31500014C20635812BC002660520C110020660833C777
S31500014C3000C01D3A60440C11002166 0833C700C04C
S31500014C401D3C60360C110022660833C700C01D3EAC
S31500014C5060280C110023660833C700C01D40601A86
S31500014C600C110024660833C700C01D42600C0C11EC
S31500014C700025660633C700C01D384A13630001824A
S31500014C800C11002866080C130001622A602E0C1113
S31500014C9000266672A52110C13000163047E1F60026D
S31500014CA07E2542401011B0476F144A136302531315
S31500014CB00C130001630612BC001C600242114A116A
S31500014CC06500013E0C11002562000136287C00C0FA
S31500014CD01C860254FFCFF0254FFFC247C00C01C8A83
S31500014CE00C110003621814BC00014240101102406D
S31500014CF00003E5480254FFF38154600000CA0C1119
S31500014D000007621A14BC000242401011594002 40C9
S31500014D1000003E5480254FFF38154600000AA0C1118
S31500014D20001F6236421242401011514002 40001FDC
S31500014D30720AE368025483FF81544240101151 40C4
S31500014D400240000348C0068000C01D2420404240A6
S31500014D50101033C000C01C88606C0C110020660660
S31500014D6014BC000660602C7C00C01C8B0C11002159
S31500014D70660E14BC00050254 83FF1CBC000160468C
S31500014D800C110022660E14BC0005025483FF1CBCE4
S31500014D90000260320C110023660E14BC0005025499
S31500014DA083FF1CBC0003601E0C110024660C14BC9E
S31500014DB00005025483FF4216600C0C11002566069D
S31500014DC0421200547C0042B900C01D440C1300027B
S31500014DD0630A33FC001000C01C84600833FC020027
S31500014DE000C01C84227C00C00EDC600C237C000108
S31500014DF05094001243E900D2B3FC00C0138265EC63
S31500014E0033C000A002EE4CDF5CC04E754E714E7190
S31500014E104E7133C000A002F04A3900C01C70661EF4
S31500014E204A3900C01C7C6616427900C01C8413FCFA
S31500014E30002800C01C7B13FC000500C01C7C33C08D
S31500014E4000A002F24E754E714E714E7133C000A034
S31500014E5002F4427900C01C8413FC002800C01C7BAC
S31500014E6013EF000500C01C7C33C000A002F6205FD2
S31500014E70548F4ED04E714E714E7133C000A002F860
S31500014E80027983FF0080402C7003C07900C01C901A
S31500014E9002400003E1480279FCFF00804046817927
S31500014EA00080404602 79C7FF008040400079280013
S31500014EB00080404002 79F3FF0080404633C000A0E5
S31500014EC002FA4E754E714E7148E7031C33C09E
S31500014ED000A002FC7E03CE7900C01C90267C0080D7
S31500014EE0403A300748C0D080068000C01CAA204045
S31500014EF030930C47000266582A7C00C00E89287C34
S31500014F0000C0459030133239 00C01D42E849904136
S31500014F102054B0506438521542401015205432289E
S31500014F200002E0490241000FB0416324083900 0143
S31500014F3000C00E8866084EB900008DF66012302852
S31500014F400002E0480240000F52001A80600242153A
S31500014F50287C00C01C9270003013320748C1E589D5
S31500014F60D1B418004A3900C0457767047C0A60024B
S31500014F70C0D7002D0067201E1A92E012A7C00C0C7
S31500014F80C8E52952015B08765464295424 73207D9
S31500014F9048C1E58920341800123C00FCD206E2A87B
S31500014FA0320748C1D281068100C01CA2204130804F
S31500014FB00748C0E58842B4080052470C47000450
S31500014FC06DCC13FC000400C04576423900C045771C
S31500014FD033C000A002FE4CDF38C04E754E714E71D3
S31500014FE04E7148E7010433C000A003004FEFFFF6FE
S31500014FF00C39000400C04576660000842A7C00C096
S31500015000004572303900C01CA2907900C01CA4486FBB
S3150001501000040280 0000FFFF4EB900023A484879B9
S31500015020000097C486F0008486F00084EB900026D
S31500015030 17E848574EB90002455E720032002A81D0
S3150001504066062ABC00008000203C400000002215B4
S3150001505 04EB9000253E02E0022074EB900025A82D1
S31500015060720FE2A833C000C01CB633C000C01CB426
S31500015070 33C000C01CB213FC000300C045764FEFDD
S315000150800000A33C000A003024CDF20804E754E712A
S3150001509 04E714E7133C000A003044A7900C01C84CE
S315000150A0637A227C00C01C864A3900C01C706706E0
S315000150B008D10007600408910007 33D10080402C15
S315000150C013F900C01C8900804042424 0103900C0DB
S315000150D001C8B02400003E1480279FCFF0080404638
S315000150E081790080404642 40103900C01C8A024046
S315000150F00007720BE3680279C7FF0080404081799F
S31500015100 0080404002 79F3FF008040462079 00C0CC
S3150001511013822 17C00015134000E600A207900C0FF
S31500015120138242A8001233C000A003064E754E71C9
S315000151304E714E7133C000A003085379 00C01C8420
S31500015140700030390080403AD1B900C01D44207941
S3150001515000C0138242A8000E33C000A0030A4E7598
S315000151604E714E714E7148E7033C33C000A0030CEB

S315000151704FEFFFF40C39002600C01C7B660000AE21
S315000151807C14267C00000980287C0000098445EFF8
S3150001519000083006480D080068000C01CF42040BC
S315000151A07E003E107000303900C01D389E802007F9
S315000151B048574EB900023A28300648C0E5880680AD
S315000151C0000007E82F00486F00042F0A4EB90002BD
S315000151D017D24879000009582F0A4EB9000218164D
S315000151E04A406C042A4B60022A4C2F0A2F0D486F45
S315000151F0000C4EB90002177E486F00044EB900023A
S3150001520045383E00100748803E007003C04648C03E
S315000152100068000C01D2420409F1052460C460018EF
S315000152206D00FF7013FC002700C01C7B4FEF000CC4
S315000152303C000A0030E4CDF3CC04E754E714E715B
S315000152404E7148E7013C33C000A0031023FC00C0A7
S315000152500E9600C0138261000A9A2A7C00804040A3
S315000152600255FFFC00550002287C0080404602548E
S31500015270EFFF0254F3FF00798000080403C027981
S31500015280FF800080403E0079000C0080403E0055C2
S3150001529002000055010002797FFF0080403C025563
S315000152A0FFEF0255FFF30055000413FC00BC00801C
S315000152B0404213FC00800080404302543FFF0054EB
S315000152C04000423900C01C70227C00000768207C27
S315000152D000C01CF4701420D951C8FFFC3F3C000AE1
S315000152E06100FB6A6100F878005501000255FBFF79
S315000152F04247287C00C01C84267C00804014247C04
S3150001530000C01D44605008130006670E13FC00EA36
S31500015310008040150BD3000652476100FD784A54C3
S31500015320632C0255FEFF005504003015080000EDF
S315000153306 6F853543039008040440240 0FFF720032
S3150001534032 00D3920255FBFF00550100600861004F
S31500015350F80E6100FE124A3900C01C7C63060C4738
S315000153600000F6DA242B900C01C8E33F900C01D4268
S31500015370 00C01CA233F900C01D3C00C01CA433F9B7
S31500015380 00C01D3E00C01CA633F900C01D4000C070
S31500015390 1CA84247300748C0E588068000C01C9219
S315000153A02040429052470C4700046DE83F3C000400
S315000153B06100FA9A33C000A003124CDF3C804E759F
S315000153C04E714E714E7148E7033E33C000A003147F
S315000153D0598F2EB9000009884239 00C00E8923FC75
S315000153E000C00E9600C01382287C00C013B623CCE1
S315000153F000C01C6223CC00C01C66423900C01C7E62
S31500015400423900C01C7D2A7C00C00E9660142B7C9C
S31500015410000014ECA000E2B7C00014E7A00124BEDA4
S3150001542000D2BBFC00C0138265E42C7C00C01CBE0C
S31500015430429642462A4C3B7900C01ECA02D81B7CC2
S31500015440001702E01B7C000202E23F062F0D6100FD
S31500015450E4CA424745ED006A47ED01141B4702DFE6
S315000154604A476704284A6002284B227C000008A2AA
S31500015470204C702920D951C8FFFC30912956005C77
S315000154804A4666144A47661043ED02CE207C0080E8
S3150001549040 2620D920D9309152470C4700026DBCD5
S315000154A0303C00FFC0460257FF00815752464BED84
S315000154B002E40C4600036D00FF7E588F33C000A046
S315000154C003164CDF7CC04E754E714E714E7148E726
S315000154D0213E33C000A0031802797FFF00804044BB
S315000154E02A7C008040240 8950006267C0080401412
S315000154F008D3000733FC000300C01ED033FC0001B3
S3150001550000C01ED4287C00C01ECE247C00C01ED83C
S31500015510 2C7C00C01ED26000014033FC000100C093
S315000155201ED66000118425434BC0001600000EE32
S315000155304A52670A33FC000300C01ED0600833FCE0
S3150001554000020 0C01ED0089500064A5267047E0379
S3150001555060 0242077003C007E908021500CF8115F2
S31500015560 7003C03900C01ED5E508021500F3811588
S31500015570 7003C03900C01ED7021500FC811508D57D
S315000155800006427900C01ECC425460780895000797
S31500015590 4256601E081300076718525608130006 84
S315000155A0670C13FC00EA0080401508D300060 8D3F7
S315000155B00007 3C161215E80902010003740 01401F0
S315000155C0D482068200027DB82042B0506C060815CE
S315000155D00000767C008150007671623F900804020F9
S315000155E000C0138633FC000100C0138C52546014B2
S315000155F042B900C01386427900C0138C42545279D5
S3150001560000C01ECC3014B07900C01ED06C0C0C79D1
S31500015610000600C01ECC6D00FF7453524A526D162F
S315000156204A5267044247 60063E3900C01ED0301414
S31500015630B0476C00FEFC527900C01ED63014B0791A
S315000156400 00C01ED06C0C0C79000300C01ED66F0082
S31500015650FED6527900C01ED43014B07900C01ED0D7
S315000156606C0C0C79000300C01ED46F00FEAE7003F3
S31500015670C0156608021500FC08D500007030C0157B
S31500015680671C08950006021500CF021500F308D520
S31500015690 0003021500FC08D5000008D5000633FCFE
S315000156A0000100C0138C615A2A7C0080403C0055E1
S315000156B0800002 79FDFF00804040 0279FEFF0080F4
S315000156C04040303C1FFFC07900C01ECA0255E000B1
S315000156D081557E28DE7900C01ECA33C70080402668
S315000156E033C70080402A33C70080402802557FFF18
S315000156F033C000A0031A4CDF7C844E754E714E7187
S315000157004E7148E7210433C000A0031C4FEFFFF49C
S315000157104A7900C0138C67000138427900C0138CA6
S315000157202A7C00C00E924A3900C01C706720487955
S3150001573000000958487900C01C6C4EB900021816C1
S315000157404A406F0A2AB900C01C6C600000A24AB91F
S31500015750 00C0138667000092203900C01386486F87
S31500015760 00084EB900023A48123900804024E8097F
S3150001577002010003740 01401E78A068200027D9883
S31500015780204220280004486F00044EB900023A481E
S31500015790487900000098C486F0008486F00084EB927
S315000157A00000217D2486F0008486F00042F0D4EB94A
S315000157B00000217E84879000009902F0D4EB9000242
S315000157C018164A406C082ABC42200000602048791D
S315000157D0000009942F0D4EB9000218164A406F0EAB
S315000157E02ABC428C000060062ABC425CC0003E3C9A
S315000157F020002F0D4879000009A0486F00104EB90E
S3150001580000000217E848790000099C486F000C486FB0
S31500015810000C4EB90002177E4879000009 98486FBE
S315000158200008486F00084EB9000217E848574EB9FC
S315000158300002455E9E40303C0FFFC047323C0FFFE1
S31500015840C27900C01ECAB0416706 33C700C01ECA6E
S315000158504FEF000C33C000A0031E4CDF20844E75B1
S315000158604E714E714E7148E7201C33C000A00320D3
S31500015870287C00C0138A267C00CC138C4A3900C0DC
S3150001588 01C706736487900000958487900C01C6CBD
S315000158904EB9000218164A406F20487900C00E9290
S315000158A0487900C01C6C4EB9000218164A40670AB6
S315000158B036BC00014254600000C62A7C00804024A8
S315000158C0081500076 73A425436BC000123F90080E7
S315000158D0402000C013861015E8080200000372007C
S315000158E01200E7890681000 27D9820012F00487980
S315000158F000E004D24EB9000194DC08950007607EF1
S315000159005254301412 15E809020100037 4001401FF
S31500015910D482068200027DB82042B0506F6042B93F
S31500015920 00C0138642 5436BC000108950006101 5C6
S3150001593002000003520002000003021500FC81155B
S31500015940 7003C0156608021500FC08D50000021593
S31500015950 00CF7003121502010003424214015342A3
S315000159603202C3FC02E4068100C013B62041C028FE
S31500015970 02E2E508021500F3811508D5000633C0D9
S31500015980 00A003224CDF38044E754E714E714E71E4
S315000159904E56FFF448E7000C33C000A003242D49FE
S315000159A0FFFC302E0008C1FC02E4068000C013B6DD
S315000159B02A4049ED01BE3F3C00022F0D6100F04433
S315000159C03F3C00012F0D6100F03A2F2C00042F2CD3
S315000159D0000843EEFFF84EB900022D964879000003
S315000159E009A4486EFFF8486EFFF44EB9000217D2BB
S315000159F043EEFFF4206EFFFC209133C000A0032686
S31500015A004CDF30004E5E205F548F4ED04E714E718A
S31500015A104E714E56FFF848E7001C33C000A003281C
S31500015A202D49FFFC302E0008C1FC02E4068000C0AF
S31500015A3013B62A4049ED01BE207900C045903028B1
S31500015A400002080000 0F67063F3C000560043F3C6A
S31500015A50000042F0D267C00014A024E933F3C0000B4
S31500015A602F0D4E933F3C00062F0D4E933F3C0001F8
S31500015A702F0D4E93486C0018486C0004486EFFF8D1
S31500015A804EB9000217E843EEFFF8206EFFFC2091A5
S31500015A9033C000A0032A4CDF38004E5E205F548FCE
S31500015AA04ED04E714E714E714E56FFF048E7031CB3
S31500015AB033C000A0032C2D49FFFC302E0008C1FC89
S31500015AC002E4068000C013B62A4049ED01BE3F3C00

S31500015AD000032F0D6100EF2C267C00C0459020535A
S31500015AE0302800020800000F67063F3C00056004ED
S31500015AF03F3C00042F0D6100EF0A205330280002BD
S31500015B000800000F67047C0560027C0420533028DE
S31500015B1000020800000F67047E0560027E0420076C
S31500015B20E588D08C2F002006E588D08C2F00486EA2
S31500015B30FFF44EB9000217D2486EFFF4486C000C10
S31500015B40486EFFF04EB9000217E82F2EFFF043EE24
S31500015B50FFF84EB9000229E04879000009A4486E11
S31500015B60FFF8486EFFF44EB9000217D243EEFFF478
S31500015B70206EFFFC209133C000A0032E4CDF38C0FD
S31500015B804E5E205F548F4ED04E714E714E714E5601
S31500015B90FFEC48E7000C33C000A003302D49FFFCA1
S31500015BA0302E0008C1FC02E4068000C013B628406E
S31500015BB04BEC01BE3F3C00022F0C6100EE463F3C20
S31500015BC000012F0C6100EE3C486D0008486D00088D
S31500015BD0486EFFF44EB9000217D2486D0004486DB5
S31500015BE00004486EFFF04EB9000217D2486EFFF46A
S31500015BF0486EFFF0486EFFEC4EB90002177E2F2E5D
S31500015C00FFEC43EEFFF84EB90002351043EEFFF804
S31500015C10206EFFFC209133C000A003324CDF300020
S31500015C204E5E205F548F4ED04E714E714E714E5660
S31500015C30FFF048E7000C33C000A003342D49FFFCF8
S31500015C40302E0008C1FC02E4068000C013B62A40CB
S31500015C5049ED01BE207900C04590302800020800B8
S31500015C60000F67063F3C000560043F3C00042F0D12
S31500015C706100ED903F3C00002F0D6100ED863F3C39
S31500015C8000062F0D6100ED7C486C00184EB900022C
S31500015C9017FE4A0067323F2E000843EEFFF461000B
S31500015CA0FEEE486EFFF4486C0018486EFFF04EB9E0
S31500015CB0000217A6486C0018486EFFF0486EFFF800
S31500015CC04EB9000217E860082D7C00000000FFF8BD
S31500015CD043EEFFF8206EFFFC209133C000A003368F
S31500015CE04CDF30004E5E205F548F4ED04E714E71A8
S31500015CF04E7133C000A00338207C00C01E983010BE
S31500015D007209E2680240003F0240003FD04002793A
S31500015D10FF8100804046817900804046301 0E0488E
S31500015D2002400001024000010279FFFE0080404668
S31500015D3081790080404622 7C0080404830 10E84846
S31500015D400240000F0240000F720CE36802510FFF80
S31500015D50815130100240000F0240000FE14802510C
S31500015D60F0FF8151207C00C01E9A3010E26802408B
S31500015D70000702400007E9480251FF8F81513010A8
S31500015D80720AE2680240000302400003E54802513C
S31500015D90FFF381513010E0480240000302400003 46
S31500015DA00251FFFC815130100240003F0240003F8A
S31500015DB00279FFC00080406081790080406033C075
S31500015DC000A0033A4E754E714E714E712F0633C0C7
S31500015DD000A0033C222F00087C0FCC41E889303C0F
S31500015DE000F0C041DC40E889303C0F00C041DC4096
S31500015DF0E889303CF000C041DC40300633C000A0E9
S31500015E00033E2C1F205F588F4ED04E714E714E713E
S31500015E1048E7030033C000A003403C2F000C303C90
S31500015E20F000C0467E003E00E98F303C0F00C046C0
S31500015E3072003200DE81E98F303C00F0C04672000C
S31500015E403200DE81E98F700FC04672003200DE81BA
S31500015E50200733C000A003424CDF00C0205F548FEF
S31500015E604ED04E714E714E712F0733C000A00344C0
S31500015E7042417E01302F0008C04767025241DE478A
S31500015E8066F20801000057C04400488033C000A0F4
S31500015E9003462E1F205F548F4ED04E714E714E71A8
S31500015EA02F0733C000A0034842417E01202F00087E
S31500015EB0C08767025241DE8766F20801000057C0BB
S31500015EC04400488033C000A0034A2E1F205F588F2C
S31500015ED04ED04E714E714E712F0733C000A0034C48
S31500015EE042417E01202F0008C08767025241DE87AA
S31500015EF066F2300133C000A0034E2E1F205F588F7B
S31500015F004ED04E714E714E7148E73F3E33C000A0F0
S31500015F1003504FEFFEB2342F017E227C00027EFE3B
S31500015F2041EF0004704F20D951C8FFFC42974DEF55
S31500015F300146283C00C02082448476FF600006A406
S31500015F407040D0427200320023C100C01EDA3F0207
S31500015F503F3C004C487900C020324EB900018542D1
S31500015F6050400C400008620006 74D040303B0006E9
S31500015F704EFB0002008000300044006C0058001205
S31500015F80001C001200802EBC0000355E6000064E2B
S31500015F904A3900C020226300063E48790002E94AD8
S31500015FA06000062C4A3900C020226300052A48797F
S31500015FB00002E95E600006184A3900C0202263002B
S31500015FC0061648790002E96E600006044A3900C0E7
S31500015FD0202263000602487900 02E97D600005F08F
S31500015FE04A3900C02022630005EE48790002E98F94
S31500015FF0600005DC487900C02032487900C0208263
S3150001600048780050 4EB9000011C648790002E99F50
S315000160104879 00C020824EB9000238AC2A404A8035
S3150001602067 0005B40C15003F660000964A3900C0AA
S31500016030202263 00008C267C0003084060762053F2
S315000160401028 0010B03900C0202262660C2D0068AD
S3150001605000001661648790002E9A34EB900022292B0
S3150001606058 8F2F0B610006C26048487 90002E9EF9C
S3150001607 04EB900022292588F0C39000300C020222B
S31500016080651820534240102B00103F0048790002 4D
S315000160900E9F24EB900022292 5C8F20532F28000CA0
S315000160A02F1048790002E9F74EB900022292 4FEF0C
S31500016 0B0000C588BB7FC000308B465826000051814
S315000160C043EF0004207C00C01EE2704F20D951C866
S315000160D0FFFC7E01267C000308406000037C205300
S315000160E02F102F0D4EB9000237804A406600036813
S315000160F0103900C020222053B02800106500035833
S3150001610042077A01600003280C07000967080C158D
S315000161100002D6606528D1E1D60041E0552050C07D4
S3150001612000068 66144A3900C02022630C2F0B6100F7
S31500016130 05F87E0A600003200C0700236642247CD2
S31500016140 00C02032424760 06101A4880DE400C1219
S3150001615000236708B5FC00C0208265EC3F3C0000C7
S315000161600486F014C2F0D700030072F40000A4EB9C1
S3150001617000 02397E2217B280677A7E0860000282A9
S315000161802053286800086 00449EC0010102C0C0117
S31500016190B0076708422F01444206601410 3900C057
S315000161A02022B01454C0440048801F4001441C0002
S315000161B04A066624704 02053B028001164047C40CE
S315000161C0600842461C28001148C6200C205390A89E
S315000161D00008E380B0866DB04A2F014466057E024B
S315000161E06000021E4A2C000266104A1567067E09E7
S315000161F060 00020E4207600002084 2074A15661A4D
S315000162004879 0002EA0B42A74EB9000238AC2A408F
S3150001621 04A8066067E036000023E102C000253008F
S3150001622 00C00007620001DA4880D040303B0006CE
S315000162304EFB0002016E00C8010001380082004CCD
S315000162400001 00010486F014A2F0D4EB9000189B6A2
S3150001625 02F400146202F014AB08D6700012C202FC7
S31500016260 0146206C0004B090650001942 06C000882
S315000162700B0906200018AB08366000186 60000180E9
S31500016280486F014A2F0D4EB9000188CA2F400146B9
S315000162900202F014AB08D670000F0202F0146206CA7
S315000162A00004B0906500015820 6C0008B0906300AE
S315000162B00 1506000014A486F014A2F0D43EF014E1C
S315000162C04EB90002383A202F014AB08D670000BA54
S315000162D02F2C0004486F014A4EB9000218164A4095
S315000162E06D00011C2F2C0008486F014A4EB90002AF
S315000162F018164A406F00010A600001043F3C000085
S315000163000486F014C2F0D4EB90002397E2F400146D0
S315000163100202F014AB08D6770202F0146206C0004A2
S315000163200B0906500 00DA206C0008B090630000D2DE
S31500016330600000CC3F3C000A486F014C2F0D4EB95E
S3150001634 0000239182F400146202F014AB08D6738C7
S315000163500202F0146206C0004B0906D0000A2206C35
S31500016360 0008B0906F0000 9A600000943F3C001056
S315000163700486F014C2F0D4EB90002397E2F40014660
S315000163800202F014AB08D66047E036074202F0146DA
S3150001639 0206C0004B0906566206C0008B0906360C4
S315000163A0605C1C150C06002267060C060027662099
S315000163B0421D200DD084068000C020822F40014658
S315000163C0528D4A1567061015B00666F4421560042B
S315000163D02F4D0146204F2F2801464EB90002458414
S315000163E02C001006488048C0206C0004B090650E51
S315000163F01006488048C0206C0008B09063027E07F2
S315000164000200C205390A80008E880E588068000C08B
S3150001641 01F22204020AF0146200C205390A80008DF
S315000164200E880068000C01EE2204010AF01440C0740

S31500016430000A67220C0700096700FCCE4A076616A8
S3150001644048790002EA0742A74EB9000238AC2A4051
S315000164504A806600FCB4588B0C070001660AB7FC3B
S31500016460000308B46500FC780C07000A57000168A0
S315000164704A07660000E020632EA80004205328681E
S3150001648000082A7C00C01F22247C00C01EE2600096
S31500016490009A4A126600008C4A2C000257000084AA
S315000164A0102C00020C000002671E0C00000367326C
S315000164B00C00000467120C00000567400C00000682
S315000164C065600C000008625A2015206C0004B0902B
S315000164D06508206C0008B0906348206C00042A907F
S315000164E060402015206C0004B0906D08206C0008F7
S315000164F0B0906F2E206C00042A9060262F2C000489
S315000165002F0D4EB9000218164A406D102F2C0008A7
S315000165102F0D4EB9000218164A406F06206C000472
S315000165202A9049EC0010588D528A70402053B028A9
S31500016530001164047E40600842471E28001148C7C6
S31500016540200C205390A80008E880B0876D00FF4416
S315000165506000008A4A3900C02022677A424010074B
S31500016560534048C0E588068000027ED620402F10A1
S3150001657048790002EA0E4EB900022292508F0C07AA
S31500016580000167441E2C00010C0700206C0C10074B
S315000165904880064000303F00600610C748803F00F3
S315000165A00C0700205DC04400488048C0E58806808D
S315000165B000027EF620402F1048790002EA194EB9F2
S315000165C0000222924FEF000A48790002EA2B4EB9E7
S315000165D000022292588F2EBC000166044EB90001BA
S315000165E0B0F24A976700F95A20174FEF014E33C0B0
S315000165F000A003524CDF7CFC205F548F4ED04E71BD
S315000166004E714E7133C000A00354424033C000A006
S3150001661003564E754E714E714E7148E7013E33C0B9
S3150001662000A003582C7C00C020254216423900C028
S31500016630020232A7C00C00E8A287C00C02028267CC4
S3150001664000C02022247C00C01F2A207900C045906A
S315000166500828000100036714487900027E5448792E
S315000166600002EA2E4EB900022292508F23FC00004E
S315000166700F0000C01EDA0C13000567060C13000695
S31500016680660A207900C045A82F1060144A136608CF
S3150001669048790002EA356008207900C045A42F1028
S315000166A04EB900022292588F42163F3CEA606100C1
S315000166B0F85820404E903E000C47FFFE66141ABC67
S315000166C0000118BC00012F124EB90001AC2E421474
S315000166D042150C47FFFB66141ABC000318BC0001E7
S315000166E02F124EB90001AC2E421460160C47FFFD65
S315000166F066161ABC00012F3900C01F264EB90001CB
S31500016700AAB242156000FF700C47FFFF6600FF68E2
S3150001671042136000FF5833C000A0035A4CDF7C804F
S315000167204E754E714E714E7148E73F3C33C000A025
S31500016730035C286F002C424248790002EA36267C27
S31500016740000222924E93588F247C00C020220C1204
S315000167500003651420544240102800103F00487978
S315000167600002EA394E935C8F20542F28000C2F101B
S3150001677048790002EA3E4E934FEF000C20542A68F6
S315000167800008600001621012B015650001564A1535
S3150001679062080C0000046300014A4A4266264879F1
S315000167A00002EA4E4E93588F0C120003650A48798F
S315000167B00002EA514E93588F48790002EA564E93E9
S315000167C0588F740148790002EA794E93588F0C125A
S315000167D000036510424010153F0048790002EA7C2B
S315000167E04E935C8F1A2D00017000102D0002E58872
S315000167F0068000027EB220402F100C0500206C0C92
S3150001680010054880064000303F00600610054880AC
S315000168103F000C0500205DC04400488048C0E58863
S31500016820068000027EF620402F1048790002EA8099
S315000168304E934FEF000E42472F2D000C4EB900022A
S3150001684045842600600000964A476F204879000279
S31500016850EA9748790002EA8D4E93508F0C12000395
S31500016860650A48790002EA994E93588F78273003D2
S3150001687090470C4000286F347C28206D000C3007AF
S31500016880D04648C0D1C01A100C0500306D0C0C055D
S3150001689000396F100C0500416C0A0C4600276C0C80
S315000168A03806600853460C46001D6ECE206D000C5E
S315000168B048707C0048790002EA9E4E93508F0C444E
S315000168C0002766060647002860120C0500206604AC
S315000168D07C01600242463004D046DE40BE436D0074
S315000168E0FF684BED001070402054B028001164047D
S315000168F07E40600842471E28001148C7200D2054DB
S315000169009 0A80008E880B0876D00FE7C33C000A027
S3150001691003 5E4CDF3CFC205F588F4ED04E714E71AA
S315000169204E7148E7030033C000A00360204F2F28B3
S31500016930000C4EB900022292588F2C3900C01EDA83
S315000169409CAF001060064EB90001B0F22F3900026B
S31500016950 62B24EB90000379A3E000C47FFFF660A45
S31500016960203900C01EDAB08662DC300733C000A0D1
S315000169700 03624CDF00C0205F508F4ED04E714E71C6
S315000169804E7148E7010433C000A003544FEFFFECEA
S3150001699004A3900C01EE267182F3900C01F22486F0E
S315000169A000004487800144EB9000011C660000124A5
S315000169B04A3900C01EE567460CB90F0C3F0000C0FE
S315000169C000FA640A48790002EB28600000C04879A1
S315000169D00CC01F2E3F3C00013F3C00224EB9000083
S315000169E071744A40670A48790002EB396000009EDB
S315000169F023F900C01F2E00C0456E600000D62A7C18
S31500016A000CC020224A3900C01EE26700008A4A39C6
S31500016A1000C01EE367702F3900C01F262F3900C042
S31500016A201F224EB9000237804A4066520CB90F0C3C
S31500016A303F0000C000FA640848790002EB4A603062
S31500016A404A3900C01EE467083E3900C01F2C6004A5
S31500016A5042471E1548573F3C00057023D0473F006B
S31500016A604EB900071744A40670E48790002EB5B2B
S31500016A704EB900022292588F6100008460544879 11
S31500016A800002EB6C600548790002EB854EB9000204
S31500016A9022292588F603C0C150003653661607E01B9
S31500016AA0602630075340 48C0E588068000C045ACE3
S31500016AB020402F103F0748790002EB9C4EB9000297
S31500016AC022924FEF000A524742401 0155340BE40F2
S31500016AD06FD042404FEF001433C000A003664CDF75
S31500016AE020804E754E714E714E7133C000A0036801
S31500016AF033C000A0036A4E754E714E714E7148E760
S31500016B00010433C000A0036C598F42474BD7702450
S31500016B10D0473F00224D4EB9000073184A956714BD
S31500016B207010D095320748C1E589068100C045AC91
S31500016B302041208052470C4700056DD2588F33C043
S31500016B4000A0036E4CDF20804E754E714E714E7162
S31500016B5033C000A0037033C000A003724E754E719E
S31500016B604E714E7133C000A00374518F3F3C000338
S31500016B7043EF00024EB90000735041D72F2800049D
S31500016B802F390002666848790002EBE54EB900022A
S31500016B9022924FEF000C3F3C000343EF00024EB937
S31500016BA00000735041D72F103F3C00634EB90000DF
S31500016BB00F2C4240508F33C000A003764E754E71A4
S31500016BC04E714E712F0D33C000A003782A6F000855
S31500016BD02F39000280BA48790002EC2B2F0D4EB9ED
S31500016BE0000222C82F3900025CA448790002EC3465
S31500016BF0486D00204EB9000222C84FEF001833C07D
S31500016C0000A0037A2A5F205F5C8F4ED04E714E71D1
S31500016C104E712F0633C000A0037C207900C0459039
S31500016C2030280002080000F6604720260027201 39
S31500016C307C0FDC4148C608390003 00C00012660417
S31500016C407200600422065381206F0008208120060D
S31500016C5033C000A0037E2C1F205F5C8F4ED04E7187
S31500016C604E714E7133C000A0038033C000A0038271
S31500016C70205F588F4ED04E714E714E7148E7033EDC
S31500016C8033C000A003844FEFFFD42A6F004C3E2F80
S31500016C90 00523F3C00004EB900007AEA2F4000182E
S31500016CA0207900C045903028000 20800000F6604D4
S31500016CB07C0260027C0147EF0028247C000222C886
S31500016CC02C7C00017332BE466C00016E4A47660099
S31500016CD0009A3F3C0004487900C013B64EB9000142
S31500016CE04A02025300FF08D300022F39000280BE78
S31500016CF048790002EC3D2F0D4E924FEF000C3F3CC0
S31500016D00 00002F3900C015842F13486D00084E96D8
S31500016D103F3C0004487900C0169A4EB900014A0268
S31500016D201B7C0041000F3F3C00002F3900C0186852
S31500016D302F13486D00204E961B7C004200273F3CD6
S31500016D40 0004487900C0197E4EB900014A023F3C51
S31500016D50 00002F3900C01B4C2F13486D00284E969A
S31500016D601B7C0043002F600005AE3F3C00054879BF
S31500016D70 00C013B64EB900014A023F3C00054879EE
S31500016D80 00C0169A4EB900014A02025300FF005391

S31500016D9005002F39000280C248790002EC442F0D0C
S31500016DA04E924FEF000C3F3C00002F3900C0158872
S31500016DB02F13486D00084E963F3C00002F3900C046
S31500016DC0186C2F13486D00204E963F3C00054879FC
S31500016DD000C0197E4EB900014A023F3C00002F391E
S31500016DE000C01B502F13486D00284E960C2D002015
S31500016DF0000E67061B6D000E000D1B7C0041000E88
S31500016E001B7C0042000F0C2D0020002667061B6D1F
S31500016E10002600251B7C004200261B7C0043002720
S31500016E200C2D0020002E67061B6D002E002D1B7CED
S31500016E300043002E6000011A207900C045903028D9
S31500016E4000020800000F66045547600253474A478F
S31500016E50665E3F3C000043EF00224EB900015AA88E
S31500016E60204F2F2800202F39000280C648790002C2
S31500016E70EC4C2F0D4E924FEF00103F3C000143EFBB
S31500016E8000224EB900015AA83F3C000243EF001E02
S31500016E904EB900015AA8204F2F28001C204F2F2839
S31500016EA0002448790002EC5A486D0020600002BCBB
S31500016EB00C470001662A2F39000280CA4879000270
S31500016EC0EC652F0D4E922F3900C00E9248790002C3
S31500016ED0EC68486D00204E924FEF001860000438B0
S31500016EE00C4700036C742F39000280CE48790002EA
S31500016EF0EC722F0D4E924FEF000C025300FF08D398
S31500016F0000003F3C00002F3C3F8000002F13486DDE
S31500016F1000084E96025300FF08D300023F3C0000D2
S31500016F202F3C3F8000002F13486D00204E960253E0
S31500016F3000FF3F3C00002F3C3F8000002F13486DAF
S31500016F4000284E961B7C0057000F1B7C005600271D
S31500016F501B7C0041002F600003BE3F3C000470FD16
S31500016F60D0473F0043EF00284EB900022E84303C43
S31500016F7000FFC06F00260253FF0081533013024009
S31500016F8000FF3200C2FC02E4068100C013B62841AC
S31500016F9008AF0002002A302F00240C4000036200D3
S31500016FA00376D040303B00064EFB0002000801C8C4
S31500016FB0026602D8025300FF287C00C00E84206FAF
S31500016FC000183013E048024000FF72003200E589E4
S31500016FD0D1C1082800020001670000363013024043
S31500016FE000FF52403F0048790002EC792F0D4E9286
S31500016FF03F3C00012F1343EF002C4EB900006958A6
S315000170003013E048024000FF72003200D28106814F
S31500017010000007BC20413F10204F2F28002C2F28AD
S31500017020002843EF00244EB9000197A6307C00AA40
S31500017030D1D43013E048024000FF3200C2FC002CDC
S31500017040D1C148680016486F00164EB90002161ADB
S31500017050486F0012486F001E486F00124EB90002B9
S3150001706015DC204F2F28000E2F28000A307C00AA9D
S31500017070D1D43013E048024000FF3200C2FC002C9C
S31500017080D1C148680023486D00064E924FEF001AA1
S31500017090025300FF08D30000206F00183013E048A8
S315000170A0024000FF72003200E589D1C108280002C2
S315000170B000001670002623013024000FF52403F00A8
S315000170C048790002EC81486D00204E924FEF000A8C
S315000170D03F3C00012F1343EF00224EB900006958CF
S315000170E03013E048024000FF72003200D28106816F
S315000170F0000007BC20413F10204F2F2800222F28D7
S315000171000001E43EF001E4EB9000197A6307C00AA6F
S31500017110D1D43013E048024000FF3200C2FC002CFB
S31500017120D1C148680016486F00104EB90002161A00
S31500017130486F000C486F0018486F000C4EB90002EA
S3150001714015DC204F2F2800082F280004307C00AAC8
S31500017150D1D43013E048024000FF3200C2FC002CBB
S31500017160D1C148680023486D00264E924FEF0010AA
S3150001717060000 1A43F3C00002F0C4EB900014A02F9
S315000171803F3C00012F0C4EB900014A023F3C000270
S315000171902F0C4EB900014A024240102C02B63F00A4
S315000171A03013024000FF52403F0048790002EC894B
S315000171B02F0D4E924FEF000C025300FF3F3C000093
S315000171C02F2C01BE2F13486D00084E96025300FF67
S315000171D008D300003F3C00002F2C01C22F13486D3D
S315000171E000204E96025300FF08D300013F3C0000E9
S315000171F02F2C01C62F13486D00284E961B7C00418B
S315000172000000F1B7C005700271B7C0052002F6000DB
S31500017210010630130240 00FF52403F004879000248
S31500017220EC942F0D4E92025300FF005306003013CB
S31500017230024000FF3F0043EF002C4EB90001599078
S315000172403013024000FF3F0043EF00284EB9000112
S315000172505A12204F2F2800263F3C00DF204F2F28AF
S31500017260003048790002EC9F486D00204E924FEFA6
S31500017270001C3F3C00012F2C01D62F13486D00073F
S31500017280600000923013024000FF52403F004879EF
S315000172900002ECB02F0D4E92025300FF0053060080
S315000172A03013024000FF3F0043EF002C4EB90001AE
S315000172B05B8E3F3C0001204F2F28002C2F13486D79
S315000172C000064E961B7C0066000F3013024000FF3D
S315000172D03F0043EF002C4EB900015C2E48790002B5
S315000172E080E2486F002E486F002E4EB9000217D279
S315000172F0204F2F28002648790002ECB9486D00205E
S315000173004E924FEF00163F3C00012F2C01D62F1352
S31500017310486D00264E964FEF002C33C000A0038621
S315000173204CDF7CC0205F4FEF000A4ED04E714E718C
S315000173304E7148E7273E33C000A00388518F246F62
S3150001734000303C2F003C7010D0B900C00E84322FA3
S315000173500034E049024100FF3401C4FC0016D0822A
S3150001736026402C7C000222920C4600036C0004206D
S3150001737049EF00042F0B486F003C486F00084EB9D7
S31500017380000217D2204F2F10224C4EB9000241E0C5
S315000173904879000280E6486F003C4EB90002181693
S315000173A04A406C047A2D60027A204879000280EA0C
S315000173B02F0C4EB9000218164A406C242A7C000292
S315000173C0ECC84879000280EE2F0C4EB90002153048
S315000173D02F0C4EB9000217FE4A006644600001B444
S315000173E04879000280F22F0C4EB9000218164A4065
S315000173F06C082A7C0002ECD060184879000280F6FD
S315000174002F0C4EB9000218164A406C1A2A7C00024B
S31500017410ECD84879000280EE2F0C4EB900021530E7
S315000174207E70600002E24879000280FA2F0C4EB9A4
S31500017430000218164A406C082A7C0002ECE0603211
S315000174404879000280FE2F0C4EB9000218164A40F8
S315000174506C082A7C0002ECE86018487900028102 77
S315000174602F0C4EB9000218164A406C1A2A7C0002EB
S31500017470ECF04879000281062F0C4EB90002153056
S315000174807E6E6000028248790002810A2F0C4EB995
S31500017490000218164A406C082A7C0002ECF8603299
S315000174A04879000281 0E2F0C4EB9000218164A4087
S315000174B06C082A7C0002ED00601848790002 8112EE
S315000174C02F0C4EB9000218164A406C1A2A7C00028B
S315000174D0ED084879000281162F0C4EB900021530CD
S315000174E07E756000022248790002811A2F0C4EB97E
S315000174F0000218164A406C082A7C0002ED1060322C
S315000175004879000281 1E2F0C4EB9000218164A4016
S315000175106C082A7C0002ED186018487900028122 65
S315000175202F0C4EB9000218164A406C1A2A7C00022A
S31500017530ED204879000281262F0C4EB90002153044
S315000175407E6D600001C24879000 2812A2F0C4EB976
S31500017550000218164A406C082A7C0002ED286032A7
S315000175604879000281 2E2F0C4EB9000218164A40A6
S315000175706C082A7C0002ED306018487900028132DD
S315000175802F0C4EB9000218164A406C0C2A7C0002D8
S31500017590ED387E20600001704879000281362F0C9B
S315000175A04EB9000218164A406C082A7C0002ED40CA
S315000175B06032487900028 13A2F0C4EB90002181642
S315000175C04A406C082A7C0002ED486018487900029E
S315000175D0813E2F0C4EB9000218164A406C1A2A7CBD
S315000175E00002ED504879000281422F0C4EB900028B
S315000175F015307E6B6000011048790002 81462F0C20
S315000176004EB9000218164A406C082A7C0002ED5851
S31500017610603248790002814A2F0C4EB900021816D1
S315000176204A406C082A7C0002ED6060184879000225
S31500017630814E2F0C4EB9000218164A406C1A2A7C4C
S3150001764000002ED684879000281522F0C4EB9000202
S3150001765015307E4D600000B04879000281562F0C2E
S315000176604EB9000218164A406C082A7C0002ED70D9
S3150001767060324879000281 5A2F0C4EB90002181661
S315000176804A406C082A7C0002ED786018487900 02AD
S31500017690815E2F0C4EB9000218164A406C182A7CDE
S315000176A00002ED804879000281622F0C4EB900027A
S315000176B015307E476050487900028 1662F0C4EB91D
S315000176C0000218164A406C082A7C0002ED886018F0
S315000176D04879000281 6A2F0C4EB9000218164A40F9
S315000176E06C162A7C0002ED9048790002816E2F0CFF

S315000176F04EB900021530600C2A7C0002ED9828BCB8
S315000177004479F99A7E54200A66402F143F052F0DBD
S31500017710 4E96100748803F0048790002EDA04E962C
S315000177204FEF00100C460C001660C486B00044879C7
S3150001773000 02EDA36076 0C460002660000A2486BCB
S31500017740000448790002EDA660622F143F052F0D53
S315000177502F0A4EB9000222C84FEF000E1547000648
S31500017760 0C460001660C486B000448790002EDAD39
S31500017770 60100C460002661 0486B0004487900024E
S31500017780EDB0486A0007604C422A00076050200AA3
S315000177906620487900 02EDB74E96588F0C460004D4
S315000177A0663C486B000448790002EDBF4E96508F47
S315000177B0602C48790002EDC22F0A4EB9000222C898
S315000177C0508F0C4600046616486B00044879000287
S315000177D0EDCA2F0A4EB9000222C84FEF000C508F96
S315000177E033C000A0038A4CDF7CE4205F4FEF000E1C
S315000177F04ED04E714E714E7148E7073E33C000A020
S3150001780003 8C4FEFFFF445D724B9000282804A3931
S3150001781000 0C01EE2670ECCB90000000100C01F2265
S3150001782062 0003DE2A7C000222924A3900C01EE36E
S315000178306700008C08AFC0020002424760640C47F3
S3150001784000 0364160252C0FF00520C00303C00FF98
S31500017850C0470252FF008152601802520 0FF0052D7
S315000178600D00303CFFFDD047024000FF0252FF00F1
S31500017870 81523F3C00012F1243EF000A4EB900002E
S31500017880 6958204F2F280008204F2F28000830075D
S315000178905240 3F0048790002EF5B4E954FEF000ED4
S315000178A05247207900C045901028000402000 03F8D
S315000178B042411200BE4164060C47000665802 67CE3
S315000178C000C020DA4A3900C01EE5670616B900C0B5
S315000178D01F314A3900C01EE6670000B80C130001CB
S315000178E0660000944240103900C020D83F00487914
S315000178F00002EF774E955C8F4A3900C020DC676E37
S3150001790004879000 2EF934E9548790002EFA54E950E
S315000179105 08F287C00C020EC0814000067084879C5
S31500017920 0002EFB46016C82C0000000167084879D0
S3150001793000 02EFC4600648790002EFC84E95487907
S3150001794000 02EFCD4E95508F081400016708487963
S3150001795000 02EFDC6038082C00010001670848 7955
S3150001796000 02EFEC602848790002EFF060204879C8
S3150001797000 02EFF560184A13660848790002F0071D
S3150001798060 0C0C13000 2660A48790002F0214E953C
S31500017990588F287C00C020E60C130001674C4A3939
S315000179A000C01EE466304A3900C01EE766284A391F
S315000179B000C01EEA66204A3900C01EEB66184A3925
S315000179C000C01EEC66104A3900C01EE866084A3936
S315000179D000C01EE96714 0C140012660E48790002F5
S315000179E0F0404E95588F600002184A3900C01EE4D7
S315000179F0670A13F900C01F2D00C020D87EFF267C20
S31500017A0000 0C020EA2C7C00C020D44A3900C01EE701
S31500017A10671818BC000C42531CBC000C33FC000355
S31500017A2000 0C020D223C700C020E24A3900C01EE8A8
S31500017A3067123F3900C01F3C3F3C00003F3C00003D
S31500017A406100004 0C4A3900C01EE967123F3900C0C3
S31500017A501F403F3C00013F3C0000610003F24A39F0
S31500017A6000 0C01EEA671818BC000E42531CBC000E6B
S31500017A7033FC000300C020D223C700C020E24A39EC
S31500017A8000 0C01EEB671C4A3900C020DC660A13FCE5
S31500017A900 0000100C020DD600A48790002F05F4E95C2
S31500017AA0588F4A3900C01EEC671E18BC000F42539E
S31500017AB01CBC000F33FC000300C020D223C700C04A
S31500017AC020E2423900C020DC4A3900C01EED6706BB
S31500017AD018BC001142534A3900C01EEE671818BC83
S31500017AE0000842531CBC000833FC000300C020D22E
S31500017AF023C700C020E24A3900C01EEF6700010219
S31500017B0048790002F07A4E95588F08AF00020002BC
S31500017B1042 47287C00E002DA600000C80C470003F7
S31500017B20641 6025200FF00520C00303C00FFC047B1
S31500017B30 0252FF00815260180252 00FF00520D00EE
S31500017B40303CFFFDD047024000FF0252FF00815248
S31500017B503F3C00012F1243EF000A4EB90000 69585D
S31500017B60204F2F280008204F2F28000830075240A9
S31500017B703F0048790002F0B04E957A003A077C0042
S31500017B803C073012E048024000FF3200C2FC00A868
S31500017B90D28C2006D080D086E588D28020412F283D
S31500017BA000 0043012E048024000FF3200C2FC00A887
S31500017BB0D28C2005D080D085E588D28020412F1037
S31500017BC048790002F0CA4E95E58E068600E0050664
S31500017BD020462F1048790002F0D84E954FEF00222B
S31500017BE05247207900C045901028000402000 03F4A
S31500017BF042411200BE4164080C4700066500FF1EA3
S31500017C0042404FEF000C33C000A0038E4CDF7CE0F6
S31500017C104E754E714E714E7148E7033E33C000A05A
S31500017C2003902A7C00C020D2287C00C020E2267C5A
S31500017C3000C020D47EFF247C00C020DC2C7C00C048
S31500017C4020DD4A16675A0C130012651813FC000E44
S31500017C5000C020E6427900C020EA16BC000E3ABCFC
S31500017C60000328870C55000352C0440048803C009D
S31500017C7053554A466716421613FC001000C020E60B
S31500017C80427900C020EA288742126014 0C94000051
S31500017C900000E660C421616BC0012288714BC0001A1
S31500017CA00C13000F620001822014B087661C0C556C
S31500017CB0000352C0440048803E0053554A476700BE
S31500017CC0016816BC0012600001600C39000300C097
S31500017CD020D9660001542C7C000222920C13000E5E
S31500017CE0661A720EB081660A48790002F0DE6000FB
S31500017CF000F248790002F0EE600000E80C13000C77
S31500017D0066143F3900C020E448790002F1004E961E
S31500017D105C8F600000D20C13000F660642126000F1
S31500017D2000 0C60C130008664A48790002F1234E96F4
S31500017D30588F421216BC00122887424760127000 03
S31500017D403007E588068000E00506204042 9052474C
S31500017D50207900C045901028000402000 03F4241EE
S31500017D601200BE41640000BC0C470006640000B46A
S31500017D7060CC0C130004650000AA0C130007620016
S31500017D8000A22A7C00C020EC72001213B081665E4C
S31500017D907205B081660808AD00000001600C72042E
S31500017DA0B081660C08ED000000010895000 0602C0A
S31500017DB00C130007660E7207B081660808AD000154
S31500017DC0000160140C13000666120C940000 0006F4
S31500017DD0660A08ED00010001089500014879000 2D4
S31500017DE0F13F4E96588F16BC00122887603448 79A9
S31500017DF00002F15A4E96588F16BC0012288770055C
S31500017E00BE8067067004BE80660408D500000C9427
S31500017E10000000767080C940000000 6660408D5F8
S31500017E200001423900C020D933C000A003924CDFC3
S31500017E307CC04E754E714E714E7133C000A00394D5
S31500017E4033C000A003964E754E714E714E712F0DC3
S31500017E5033C000A003982A7C00C020E6207C00C025
S31500017E6020EA227C00C020D4302F000A4A4067084D
S31500017E70CC4000016722604E0C6F0001000C660C7D
S31500017E801ABC0004425012BC0004602A1ABC000548
S31500017E90425012BC0005601E0C6F0001000C660CFE
S31500017EA01ABC0006425012BC0006600A1ABC000742
S31500017EB0425012BC000733FC000300C020D270FF01
S31500017EC023C000C020E233C000A0039A2A5F205FCE
S31500017ED05C8F4ED04E714E714E7133C000A0039C23
S31500017EE033C000A0039E4E754E714E714E7133C064
S31500017EF000A003A0518F3F3C000443EF00024EB99E
S31500017F0000 00735041D72F2800042F390002666CF8
S31500017F1048790002F1914EB9000222924FEF000C0E
S31500017F203F3C000443EF00024EB90000735041D7B5
S31500017F302F103F3C00634EB900000F2C4240508F7A
S31500017F4033C000A003A24E754E714E714E7133C0FF
S31500017F5000A003A413FC001000C020E613FC0011CE
S31500017F6000C020E713FC000800C020E833FC000233
S31500017F7000C020EA33C000A003A64E754E714E71B3
S31500017F804E7133C000A003A813FC001200C020E606
S31500017F90427900C020EA423900C020D9227C00C0C3
S31500017FA020DA207900C0459030280002E6480240D8
S31500017FB0000312800C0000026608423900C020DC72
S31500017FC0600E0C0000001660813FC000100C020DDF4
S31500017FD070FF23C000C020E2423900C020D813FC44
S31500017FE0001200C020D633FC030000C020EC33C0D1
S31500017FF000A003AA4E754E714E714E7148E72F3E91
S3150001800033C000A003AC518F0C39000100C020DA47
S31500018010660001EA2A7C00C020DB287C00C020F82B
S315000180202 47C00C020D92C7C00C045900C12000392
S31500018030660001380C39000300C020D7640001201 6
S3150001804000C39000100C020DC66000114267C00C04A

S3150001805020FA2E3C07FFFFFF201390B900C020FE37
S31500018060CE8023D300C020FE0C870000384630862
S3150001807038BC0003600000F24A54670453544212AC
S315000180804A54660000E64297201372001215E589EC
S3150001809006810OE005062041909002800 7FFFFFF60
S315000180A02F40000420560828000700C36606E288D0
S315000180B02F40000408150000670 67E0C2C0760049B
S315000180C07E0D2C07485742401015E2403200C3FC92
S315000180D000A8068100E002DA2006D080D087E58874
S315000180E0D28020012F004EB90C0194DC0815000052
S315000180F067067C0C280660047C0D2806081500001E
S3150001810067067E0C2A0760047E0D2A074240101579
S31500018110E2403200C3FC00A8068100E002DA200535
S31500018120D080D087E588D28022414240101 5E240B6
S3150001813032 00C3FC00A8068100E000E22004D080E2
S31500018140D086E588D280204120D920917000101573
S31500018150E588068000E005062040209360 0A23F9A1
S3150001816000C020DE00C020E242124A12660000 8EE4
S31500018170267C00C020E60C130012654E0C39000166
S31500018180 00C020DC66764A546638703F2056C02807
S31500018190 0004672E42401015524012280004020 1C5
S315000181A0003F4242140148C081C248401A80720011
S315000181B01200E589068100E005062041 23D000C0B2
S315000181C020FE13D500C020D6603213D300C020D6BE
S315000181D02A7C00C020EA4A55671E535516B900C0CD
S315000181E020E713F900C020E800C020E713F900C01A
S315000181F020E900C020E8600416BC0012508F33C08D
S31500018200 00A003AE4CDF7CF44E754E714E714E717B
S31500018210 48E7213E33C000A003B042072A7C008014
S31500018220400E0C39000100C020DA660001F8287CF6
S31500018230 00C020F0267C00C020DE247C00C020D9AE
S3150001824 04A1266700255FEFF0255FDFF2C7C00C0E6
S31500018250 20D60C160012645C0C160010660A38BC97
S31500018260 010014BC0004600E0C160011660E38BC29
S31500018270000A14BC00051CBC0012603842401016EE
S31500018280 4241123900C020D8EB49D04148C026806E
S315000182902F00610002644A40670608EB00040003F0
S315000182A038BC000914BC000113D600C020D71CBC81
S315000182B000127E012C7C000282960C12000166726D
S315000182C0301508000008660A4A0766060C54003C89
S315000182D063580255FEFF303CFFFFD0540240003F79
S315000182E038800C40003E670001FE0C40003D661AD6
S315000182F014BC000242937200123900C020D74240DA
S3150001830 0103618003880600001DE2013123900C0D3
S31500018310 20F1E2A802400001024000017209E3686F
S3150001832 00255FDFF8155600001BE00550100600048
S3150001833 001B60C120002660000A0301508000008 04
S3150001834 06700008E0255FEFF2013D08026803C156F
S3150001835 00240000172003200839330 3CFFFFD0548B
S3150001836 00240003F388066C00017E2013123C00FC6B
S3150001837 07400143900C020D7D2362800E2A82E0096
S3150001838 02F13610001744A40673A4240103900C018
S3150001839 020D8BE40662E103C00FB7200123900C088
S315000183A020D7D0361800721FE1A94681C39323D383
S315000183B000C020FA14BC000313FC000100C020DC3D
S315000183C0600 0012423D300C0210270FF2680604E85
S315000183D0005501006000011 00C120003660C0255E5
S315000183E0FEFF0255FDFF600000FE0C12000466143C
S315000183F00055010000550200535 40C54010063005E
S31500018400 00E6601A0C12000566000 0DC0255FEFF4C
S31500018410 0255FDFF53540C54000A630000CA421270
S31500018420 600000C44A3900C020DA660000BA424042
S31500018430 103900C000FEC07900C020F6660000A811
S3150001844 0287C00C020F2301502400001121448813 8
S31500018450B041672630150240000118806 61C487934
S3150001846000E001724EB9000194B4227C00E0017271
S31500018470207C00E0036A20D92091287C00C020F3EB
S31500018480 3015E2480240000112144881B0416728C4
S31500018490 3015E24802400001188066 1C487900E068
S315000184A0017E4EB9000194B4227C00E0017E207C5D
S315000184B000E0037620D92091287C00C020F43015F5
S315000184C0E448024000011214 4881B0416718301592
S315000184D0E4480240000118806 60C487900E0021A5F
S315000184E04EB9000194B433C000A003B24CDF7C84C2
S315000184F04E754E714E714E712F0733C000A003B4F5
S315000185002E2F0008202F00087210E2A8B18720073D
S31500018510E088B1872007E888B1872007E488B1871A
S315000185202007E288B1870287000000 01300733C0C7
S3150001853000A003B62E1F205F588F4ED04E714E718C
S315000185404E7148E7071C33C000A003B8267C00C063
S3150001855 01EDA2A6F001C2A137000302F00229A801F
S315000185600284D4247600000AE2F39000262B24EB973
S3150001857 00000379A3C000C40FFFE67320C40FFFAC0
S3150001858067300C40FFFC672E0C40FFF9672C0C404E
S31500018590000D672A0C40000A67240C400008672674
S315000185A00C40007E672A0C40FFFF672A604670FE7A
S315000185B0606C70FA606870FC606470F960601AC67D
S315000185C042154240605 84A47674A538D53476044B3
S315000185D02A4C4247603E4A856D0E0C9300000040CE
S315000185E06D062013B0856C0470FD60324EB9000132
S315000185F0B0F260200C46000466084A47660470FF24
S31500018600601C0C46001066084A47660470F8600E46
S31500018610 52471AC6BE6F00206500FF4E70FB33C07D
S3150001862000A003BA4CDF38E0205F508F4ED04E7168
S315000186304E714E7133C000A003BC33C000A003BE0F
S315000186404E754E714E714E712F0733C000A003C097
S315000186502E3900C01EDA7000302F00089E80600699
S315000186604EB90001B0F2203900C01EDAB0876EF0B3
S31500018670 33C000A003C22E1F205F548F4ED04E710F
S315000186804E714E7133C000A003C4227C00C01EDAB5
S315000186904A9167145391671 04A7900C0455066089C
S315000186A033FC000100C0455033C000A003C64E751F
S315000186B04E714E714E7133C000A003C833C000A085
S315000186C003CA4E754E714E714E7148E7203E33C056
S315000186D000A003CC518F4A3900C01EE2660001D6C4
S315000186E02A7C00C00580267C00022292247C00C0E0
S315000186F001062C7C00000F2C4A3900C01EE4675C81
S315000187002015B0B90003094C660A48790002F23017
S31500018710 6000019E48790002F23D4E93205548685B
S31500018720 0062F102079000780202F104EB9000077
S3150001873 07FFA44802F004EB900007FC62F002F120A
S3150001874 048790002F2844E934FEF00202F3900073B
S3150001875 080243F3C00634E966000015A4A3900C0AE
S315000187601EE367482F7900C00D74000448790002A2
S31500018770F2AB4E932F3900080000204F2F28000C32
S3150001878 048790007C0002F3900078020487900 0783
S3150001879 080002F3900C005842F152F124879000259
S315000187A0F2E74E934FEF00286000010A4879000274
S315000187B0F3114E9320552F28000E2052302800 0623
S315000187C0024000FF3F0030280006E048024000FF5B
S315000187D03F0042A72F3900C0455A3F3C0003487964
S315000187E00002F3724E9320552F2800163F3C004499
S315000187F04E9648790002F3904E93205520280016 94
S31500018800 3228001448C1243C000151802F40001E2B
S31500018810 20024EB900025A82D0AF001E2F003F3C03
S31500018820 00444E9648790002F3924E934FEF002290
S3150001883 03F3C00004EB90000774A48C0E5880680F3
S3150001884 000C00A2C20402A502F0D4EB900008990F5
S3150001885 04A4067122F2D00083F3C00444E96487946
S3150001886 00002F39460064879000 2F3964E93588FFE
S3150001887 0287900C00A28200C673020542F280008C8
S3150001888 03F3C00444E9620542028000890AD000835
S3150001889 0223C000151804EB9000253E02F00487975
S315000188A00002F3A24E93508F600A48790002F3A8A2
S315000188B04E93588F4240508F33C000A003CE4CDFF9
S315000188C07C044E754E714E714E7148E7001C33C0E3
S315000188D000A003D04FEFFFEC266F00242A6F00287B
S315000188E0227C000282E841D7700220D951C8FFFCE0
S315000188F030913F3C000A2F0D2F0B4EB90002397EF5
S3150001890 03F40000E2015B08B6338528028403F3C13
S31500018910000A2F0D2F0C4EB90002397E3F40001080
S3150001892 02015B08C631C528028403F3C000A2F0D55
S3150001893 02F0C4EB90002397E3F4000122015B08C33
S3150001894 066022A8B103900E000084A00670E0C0007
S3150001895 000167160C000002672460341F6F000FC8
S3150001896 00061F6F00110005600C1F6F000F000548
S3150001897 01F6F001100063F6F0012000860123F6F63
S3150001898 0000E00081F6F001100051F6F001300067F
S3150001899 048574EB90001AFBC202F000A4FEF001413
S315000189A033C000A003D24CDF3800205F508F4ED079

S315000189B04E714E714E7148E7031C33C000A003D4BB
S315000189C0266F00182A6F001C3F3C000A2F0D2F0B43
S315000189D04EB90002397E2E002015B08B630000844B
S315000189E07018BE80647C203C00000E1022074EB930
S315000189F000025A822C002015528028403F3C000A72
S31500018A002F0D2F0C4EB90002397E2E002015B08C89
S31500018A106350703CBE80644A2007E9889087E588E8
S31500018A20DC802015528026402055OC10003A66281D
S31500018A305288284B3F3C000A2F0D2F0C4EB90002E0
S31500018A40397E2E002015B08C630A703CBE8064040A
S31500018A50DC8760102A8B600620554A1067067CFF6A
S31500018A6060022A8B200633C000A003D64CDF38C033
S31500018A70205F508F4ED04E714E714E7148E7013CCA
S31500018A8033C000A003D87E012A7C00C02030287C98
S31500018A9000C0202A267C000222924A3900C01EE22A
S31500018AA0674E203900C01F220C800001000064348B
S31500018AB04A4067140C402580671C0C404B00671622
S31500018AC00C4096006710601C08AD0000000128BC30
S31500018AD000004B00601808ED0000000128B900C035
S31500018AE01F22600A48790002F4A44E93588F424728
S31500018AF04A3900C01EE3670C13F900C01F2900C0E4
S31500018B00202E42474A3900C01EE4670C13F900C003
S31500018B101F2D00C0202F42474A3900C01EE66716A6
S31500018B20303900C01F3402400001D04008AD0001B9
S31500018B300001815542472470C000262B24A3900C0D5
S31500018B401EE56716303900C01F3002400001E148BA
S31500018B500895000081554247601A4A47661660O625
S31500018B604EB9001B0F22F124EB90000379A0C40EF
S31500018B70FFFF67EC4A3900C01EE8674848790002E2
S31500018B80F4B84E93588F60200C47FFFF6714C81501
S31500018B900000660E2F39000262B63F074EB900008B
S31500018BA036764EB90001B0F22F124EB90000379A4F
S31500018BB03E000C47000366D048790002F43B4E9391
S31500018BC0588F42474A3900C01EE7671E2F0C3F3CAB
S31500018BD000023F3C002C4EB9000071744A40670AFE
S31500018BE048790002F4BE4E93588F4A47676C082DA8
S31500018BF00001000167084879000 2F50E6006487910
S31500018C000002F50F08150000670848790002F50A09
S31500018C10600648790002F50B7000103900C0202E5D
S31500018C20E588068000C0459820402F104240103943
S31500018C3000C0202F3F002F14082D0000000167O8F7
S31500018C4048790002F500600648790002F505487981
S31500018C500002F4CF4E934FEF001A424033C000A0FA
S31500018C6003DA4CDF3C804E754E714E714E7148E70A
S31500018C70030033C000A003DC227C00C000FE3C2FB1
S31500018C800000C602A1011B007630E424112004240E7
S31500018C90100792409C416014B00764124241120OD1
S31500018CA006410040424010079240 9C411E114A462F
S31500018CB06ED233C000A003DE4CDF00C0205F548FAC
S31500018CC04ED04E714E714E7133C000A003E008398B
S31500018CD0000100C0203167224A3900C02022661AED
S31500018CE048790002F5124EB9000222924879000233
S31500018CF0F51B4EB900022292508F33C000A003E249
S31500018D004E754E714E714E7133C000A003E4598FFA
S31500018D103F3C002C43EF00024EB900073184A97FE
S31500018D2067123 27C0010D3D7207C00C0202A20D9BC
S31500018D3020916010227C00027E44207C00C0202A03
S31500018D4020D92091588F33C000A003E64E754E718D
S31500018D504E714E7133C000A003E8518F3F3C0002B3
S31500018D6043EF00024EB900007350 41D72F2800048B
S31500018D702F39000266644879000 2F5364EB90002C1
S31500018D8022924FEF000C3F3C000243EF00024EB926
S31500018D900000735041D72F103F3C00634EB90000CD
S31500018DA00F2C4240508F33C000A003EA4E754E711E
S31500018DB04E714E7133C000A003EC33C000A003EE28
S31500018DC04E754E714E714E7133C000A003F0518F36
S31500018DD03F3C000043EF00024EB90000735041D7FB
S31500018DE02F2800042F390002665C48790002F557E6
S31500018DF04EB9000222924FEF000C3F3C000043EFB8
S31500018E0000024EB90000735041D72F103F3C00635A
S31500018E104EB900000F2C4240508F33C000A003F220
S31500018E204E754E714E714E7133C000A003F433C0BE
S31500018E3000A003F64E754E714E714E7133C000A0FF
S31500018E4003F8518F3F3C000A43EF00024EB9000080
S31500018E50735041D72F2800042F39000266844879C0
S31500018E600002F5794EB9000222923F3C000A43EF17
S31500018E70000E4EB90000735041EF000C2F103F3C1D
S31500018E800634EB900000F2C3F3C000943EF000E72
S31500018E904EB90000735041EF000C2F2800042F3902
S31500018EA00002668048790002F5844EB900022292DA
S31500018EB04FEF00183F3C000943EF00024EB9000096
S31500018EC0735041D72F103F3C00634EB900000F2C61
S31500018ED04240508F33C000A003FA4E754E714E7159
S31500018EE04E7133C000A003FC33C000A003FE4E75D3
S31500018EF04E714E714E7148E7030033C000A0040065
S31500018F003E2F000C7C0FCC47E84F700FC047720A0A
S31500018F10C2C0DC41E84F700FC0477264C2C0DC4179
S31500018F20E84F700FC047323C03E8C2C0DC4130064F
S31500018F3033C000A004024CDF00C0205F548F4ED026
S31500018F404E714E714E7148E7010C33C000A0040406
S31500018F50598F3E2F00143F3C000A3F074BEF000498
S31500018F60287C00022E84224D4E943E153F3C000A79
S31500018F7020 4F3F280004224D4E943015E948DE402B
S31500018F803F3C000A204F3F280004224D4E943015E5
S31500018F90E148DE403F3C000A204F3F280004224DB5
S31500018FA04E943015720CE368DE403007588F33C09B
S31500018FB000A004064CDF3080205F548F4ED04E71E6
S31500018FC04E714E7148E7030033C000A004082C2FF0
S31500018FD0000C3F066100FF207E003E007010E0AEEF
S31500018FE03F066100FF12323C2710C2C070003001FB
S31500018FF0DE80200733C000A0040A4CDF00C0205FDA
S315000190000588F4ED04E714E714E714E56FFEA48E75B
S31500019010230433C000A0040C2D49FFFC2A7C00C0A8
S31500019020058O2E2E00082055202 8000E7202B081E0
S31500019030640C422EFFEE422EFFEF600000F03EA848
S315000190400016640 42E2800162055202800163228O2
S315000190500 01448C1243C000151802D40FFEA200242
S3150001906O4EB900025A82D0AEFFEABE806316205581
S31500019070 2E28001630280014 48C022024EB90002DC
S31500019080 5A82DE80487807082055202800164480 39
S31500019090204048707800 43EEFFF44EB900022ECC12
S315000190A0487800302F2EFFF843EEFFF44EB9000248
S315000190B02ECC3F3C00023F2EFFF643EEFFF04EB9A9
S315000190C000022E84487800022F2EFFF843EEFFF4AB
S315000190D04EB900022ECC307C02DAD1D5D1EEFFF8A2
S315000190E01E104AAEFFF4660A10074880E8401E00CB
S315000190F060040207000F307C00DAD1D510074880E2
S31500019100 48C0EB88D1C0302EFFF248C0D1C01C1038
S3150001911 04A6EFFF0660A10064880E8401C006004AB
S31500019120 0206000F1D46FFEE1D47FFEF43EEFFEE61
S31500019130206EFFFC10D9109133C000A0040E4CDF45
S31500019140 20C44E5E205F588F4ED04E714E714E71C7
S3150001915 04E56FFF633C000A00410 2D49FFFC3D6EAC
S315000191600 008FFF64A6EFFF6660A2D7C0000000035
S31500019170FFF860147000302EFFF6720DE3A806802A
S31500019180308000002D40FFF843EEFFF8206EFFFC13
S31500019190209133C000A004124E5E205F548F4ED042
S315000191A04E714E714E56FFF633C000A0041437
S315000191B02D49FFFC2D6E0008FFF64879000283BE9B
S315000191C0486EFFF64EB9000218164A406C06426E0A
S315000191D0FFFA6012203CCF800000D0AEFFF6720D80
S315000191E02A83D40FFFA43EEFFFA206EFFFC309104
S315000191F033C000A004164E5E205F588F4ED04E71CC
S3150001920004E714E714E56FFF248E7010C33C000A075
S315000192100 4182D49FFFC43EE000841EEFFF220D968
S31500019220209142474BEEFFF649EEFFF44A6EFFF2FC
S3150001923067123D55FFF83A9438AEFFF23D47FFF20B
S31500019240064700104A6EFFF467143D6EFFF6FFF8FD
S3150001925 03D6EFFF4FFF6426EFFF4064700100CAEBA
S31500019260000007FFFFF6631A600C202EFFF6E28866
S31500019270 2D40FFF652470CAE000007FFFFF662EAEB
S3150001928060220CAE000003FFFFF66418600C202E6E
S31500019290FFF6D0802D40FFF653470CAE000003FFCA
S315000192A0FFF665EA303C03FFC06EFFF8024003FF9C
S315000192B0026EFC00FFFA816EFFFA9E6E00100647F1
S315000192C0001F0647000 9703FC047720AE368026E35
S315000192D003FFFFFA816EFFFA43EEFFFA206EFFFCF1
S315000192E0309133C000A0041A4CDF30804E5E205FFF
S315000192F04FEF000A4ED04E714E714E714E56FFF42D
S3150001930002F0233C000A0041C2D49FFFC227C000261

S315000193107D9041EEFFF420D92091302E00080240C5
S3150001932003FF3D40FFFA08C0000A3D40FFFA302E18
S31500019330000A322E0008740AE4690241003FD04156
S315000193400640FFD83F00486EFFF4610007A043EED8
S31500019350FFF4206EFFFC20D9209133C000A0041E2B
S315000193600241F4E5E205F588F4ED04E714E714E7146
S315000193704E56FFF033C000A004202D49FFFC302ECD
S3150001938000104440064000203F00202E0008486E91
S31500019390FFF04EB900023A482F2EFFF043EEFFF4DC
S315000193A04EB900024258302E001044403F00202E94
S315000193B0000C486EFFF04EB900023A482F2EFFF01E
S315000193C043EEFFF84EB900024258486EFFF8486E68
S315000193D0FFF4486EFFF04EB90002177E43EEFFF030
S315000193E0206EFFFC209133C000A004224E5E205F58
S315000193F04FEF000A4ED04E714E714E714E56FFF42C
S3150001940033C000A004242D49FFFC3F2E000C486EFA
S31500019410000084B6EFFF44EB90002161A2F2EFFF807
S315000194202F2EFFF443EEFFF46100051443EEFFF423
S31500019430206EFFFC20D9209133C000A004264E5E89
S31500019440205F5C8F4ED04E714E714E714E56FFF0BD
S315000194504BE7001C33C000A004282D49FFFC47EE55
S31500019460FFF449EE00084BEE00102D4AFFF0204CA8
S31500019470224D244B2028000422290004D0812540B6
S31500019480000420102211D1812480246EFFF043EEC6
S31500019490FFF4206EFFFC20D9209133C000A0042ADE
S315000194A04CDF38004E5E205F4FEF00104ED04E71FC
S315000194B04E714E7133C000A0042C206F000442800F
S315000194C052A8000422100D380208133C000A0042EAC
S315000194D0205F588F4ED04E714E714E7133C000A031
S315000194E00430206F0004226F00082028000422297E
S315000194F00004D0812140000420102211D181208056
S3150001950033C000A00432205F508F4ED04E714E7191
S315000195104E714E56FFF448E7000C33C000A00434E8
S31500019520D49FFFC49EEFFF44BEE0008204D224C7D
S3150001953020280004448023400004201040802280 1B
S31500019540043EEFFF4206EFFFC20D9209133C000A02A
S31500019550004364CDF30004E5E205F508F4ED04E7188
S315000195604E714E7133C000A00438206F00042028CC
S31500019570000044480214000042010408020803 3C034
S31500019580000A0043A205F588F4ED04E714E714E7135
S315000195904E56FFF048E7001C33C000AC0043C2D499D
S315000195A0FFFC47EEFFF449EE00084BEE00102D4A92
S315000195B0FFF0204C224D244B20280004222900004D0
S315000195C09081254000042010221191812480246E6F
S315000195D0FFF043EEFFF4206EFFFC20D9209133C04B
S315000195E000A0043E4CDF38004E5E205F4FEF0010B6
S315000195F04ED04E714E714E7133C000A00440206FA3
S3150001960000004226F00082028000422290000490810A
S315000196102140000420102211918120803 3C000A036
S31500019620044205F508F4ED04E714E714E714E5690
S31500019630FFEC48E7001C33C000A004442D49FFFCA1
S3150001964047EEFFF049EE00084BEE00142D4AFFEC01
S31500019650204C224D244B202800082229000890810 5
S31500019660254000082028000422290004918125407 4
S315000196700000420102211918124802 46EFFEC43EE18
S31500019680FFF0206EFFFC20D920D9209133C000AC25
S3150001969004464CDF38004E5E205F4FEF00184EDC77
S315000196A04E714E714E7133C000A00448206F000404
S315000196B0226F0008202800082229000890812140F5
S315000196C00008202800042229000491812140000479
S315000196D02010221191812080 33C000A0044A205F0E
S315000196E0508F4ED04E714E714E714E56FFEC48E77B
S315000196F0001C33C000A0044C2D49FFFC47EEFFF0CF
S3150001970049EE00084BEE00142D4AFFEC204C224D89
S31500019710244B2028000822290008D0812540000872
S315000197202028000422290004D18125400004201 0AC
S3150001973002211D1812480246EFFEC43EEFFF0206ECE
S31500019740FFFC20D920D9209133C000A0044E4CDF64
S315000197503800 4E5E205F4FEF00184ED04E714E71AD
S315000197604E7133C000A00450206F0004226F000820
S315000197702028000822290008D081214000082028 3D
S3150001978000042229000 4D18121400004201022116 5
S31500019790D1812080 33C000A00452205F508F4ED06B
S315000197A04E714E714E714E56FFEC48E7000C33C0B8
S315000197B000A004542D49FFFC2D7C00000000FFF49D
S315000197C02D7C00000000FFF84BEEFFF449EE000887
S315000197D02D42FFF02D43FFEC203C00000433906E38
S315000197E00010204C2628000424106C044483408277
S315000197F066062603673E6012223CFFE00000C28235
S31500019800670 8E28AE293528060EE223C0010000073
S31500019810C2826608E383E392538060EE223C000F26
S31500019820FFFFC4814840E9808480081000076704 6F
S315000198300 8C2001F204D20C22083242EFFF0262EB1
S31500019840FFEC224D206EFFFC2091216900040004EB
S31500019850 33C000A004564CDF30004E5E205F4FEF50
S31500019860000A4ED04E714E714E714E56FFE848E7D2
S31500019870000C33C000A004582D49FFFC2D7C0000CC
S3150001988000 00FFF42D7C00000000FFF84BEEFFF412
S31500019890 49EE00082D42FFF02D43FFEC2D44FFE871
S315000198A0203C00000433906E0014204C2828000848
S315000198B0262800042410 6C04448340826 6C626038D
S315000198C0674260 14223CFFE00000C282670AE28A16
S315000198D0E293E294528060EC223C00100000C282C6
S315000198E0660AE384E393E392538060EC223C000F23
S315000198F0FFFFC4814840E9808480081000076704 9F
S31500019900 08C2001F204D20C22083242EFFF0262EE0
S31500019910FFEC282EFFE8224D206EFFFC20912169E5
S31500019920000040004 33C000A0045A4CDF30004E5E30
S31500019930205F4FEF000E4ED04E714E714E714E5656
S31500019940FFEC48E7000C33C000A0045C2D49FFFC86
S31500019950227C000283C241EEFFF420D920914BEE16
S31500019960FFF449EE00082D42FFF02D43FFEC204C99
S315000199702628000424102202028200 0FFFFF008223
S3150001998000 1000000281FFF000000881001F48411D
S31500019990E8890441 0433D26E00106E0E672E0C4125
S315000199A0FFC06C204282428360220C4100406F0A54
S315000199B0428244824283448360 12E383E3925341A9
S315000199C066F86008E28AE293524166F808100007D9
S315000199D06704448340822 04D20C22083242EFFF059
S315000199E0262EFFEC224D206EFFFC20D9209133C09C
S315000199F000A0045E4CDF30004E5E205F4FEF000A90
S31500019A004ED04E714E714E714E56FFE448E7000C32
S31500019A1033C000A004602D49FFFC227C000283CAEA
S31500019A2041EEFFF020D920D920914BEEFFF049EE0F
S31500019A3000082D42FFEC2D43FFE82D44FFE4204CA6
S31500019A40241026280004428422020282000FFFFF0E
S31500019A500082001000000281FFF000000881001F53
S31500019A604841E8890441 0433D26E00106E1067360E
S31500019A700C41FFA06C264282428342846 0280C413D
S31500019A80006 06F0E428244824283448342844484 4E
S31500019A906014E383E392534166F8600AE28AE29333
S31500019AA0E294524166F608100007 67C64484408333
S31500019AB04082204D20C220C32084242EFFEC262E76
S31500019AC0FFE8282EFFE4224D206EFFFC20D920D985
S31500019AD0209133C000A004624CDF30004E5E205F4F
S31500019AE04FEF000A4ED04E714E714E7133C000A039
S31500019AF00464518F2F4200042E83206F000C241022
S31500019B0026280004322F00106B0C6712E383E392C0
S31500019B10534166F86008E282E293524166F820C238
S31500019B2020832 42F00042617508F33C000A004661B
S31500019B30205F5C8F4ED04E714E714E712F0733C030
S31500019B40000A00468302F0008E0583E00300733C0FB
S31500019B50000A0046A2E1F205F548F4ED04E714E71A5
S31500019B604E712F0733C000A0046C202F0008E05867
S31500019B704840E0582E00200733C000A0046E2E1F77
S31500019B80205F588F4ED04E714E714E7148E7010CD1
S31500019B9033C000A004709BCD2E0D287C000004006C
S31500019BA06002DE9DBBD465FA48790002F5C64EB95E
S31500019BB000002229220074480 2F0020542F102F08E4
S31500019BC02F390002679C2F39000009BC4879000231
S31500019BD0F5FD4EB9000222924FEF001C2F3900020B
S31500019BE05AA63F3C00634EB900000F2C424033C0D9
S31500019BF000A004724CDF30804E754E714E714E716D
S31500019C0048E7000C33C000A004744FEFFFEA4AB9DD
S31500019C1000C00E78670000A40CB90F0C3F0000C00D
S31500019C20C0FA630000964BEF00122AB900C00E5CE1
S31500019C30287C000004004A95675423D500C00E8095
S31500019C40207900C00E802028 0010B0B90002679C60
S31500019C50663C205520280014B094663220280 01C4A
S31500019C60B0B900025AA66626202800182254B091DF

S31500019C70661C2F154EB9000050F03E302F3900C0EA
S31500019C800E784EB9000050F03217B240672C2054BE
S31500019C902F50000A2F4800062F7900025AA6000EFF
S31500019CA02F790002679C0002486F00023F3C0004C6
S31500019CB03F3C00394EB9000071744FEF001633C0B6
S31500019CC000A004764CDF30004E754E714E714E7118
S31500019CD02F0633C000A004787C060839000300C0B3
S31500019CE0001266047200600422065381206F000888
S31500019CF02081200633C000A0047A2C1F205F5C8FD0
S31500019D004ED04E714E714E712F0D33C000A0047CA2
S31500019D102A6F00082F39000009A848790002F620A9
S31500019D202F0D4EB9000222C82F3900025CA44879D2
S31500019D300002F629486D00204EB9000222C84FEFF5
S31500019D40001833C000A0047E2A5F205F5C8F4ED0CE
S31500019D504E714E714E7133C000A0048033C000A015
S31500019D600482205F588F4ED04E714E714E7148E776
S31500019D70000C33C000A00484287C000222C82A6F8C
S31500019D80000C202F00107205B08162000130D04016
S31500019D90303B00064EFB0002C00C00A2008000547E
S31500019DA0003000CE2F39000009A848790002F632AA
S31500019DB02F0D4E944FEF000C2F3900C0456E487998
S31500019DC00002F63B6000009448790002F6494879A2
S31500019DD00002F6402F0D4E944FEF000C2079000043
S31500019DE004002F1048790002F652606E2F390000E8
S31500019DF009B048790002F6582F0D4E944FEF000C2A
S31500019E00486D00202F3900025AA63F3C00634EB927
S31500019E1000000C14600000A62F39000009B448792F
S31500019E200002F6612F0D4E944FEF000C2F3900C200
S31500019E30679C48790002F66A60202F39000009B84C
S31500019E4048790002F66F2F0D4E944FEF000C2F3913
S31500019E50000009BC48790002F678486D00204E944E
S31500019E604FEF000C60562F3900C0202A0839000038
S31500019E7000C0203167084879002F68D60064879EE
S31500019E800002F69248790002F67F2F0D4E9470007B
S31500019E90103900C0202EE538068000C04598204074
S31500019EA02F104240103900C0202F3F004879000290
S31500019EB0F697486D00204E944FEF001E33C000A068
S31500019EC004864CDF3000205F4FEF000A4ED04E7102
S31500019ED04E714E7148E7073E33C000A004882C3C02
S31500019EE0010000002A3C00020000287C0002458493
S31500019EF0267C000222C82A6F00242C6F0028082D18
S31500019F00000500E76600016C4EB9000052FE202DE7
S31500019F100C0DC223C000151804EB900024FCC91ADCC
S31500019F20C0DC45ED00E006920001517F20124EB99A
S31500019F3000024FCC919208ED000600E708ED0005FE
S31500019F4000E7421548790002F6A8486D003C4878BA
S31500019F50003C4EB9000011C6082D000700D5671256
S31500019F6048790002F6D72F0D4E94487508004E9396
S31500019F70508F082D000600D66722202D00D4C086FA
S31500019F8067084879002F6E1600648790002F6E6BC
S31500019F902F0D4E94487508004E93508F202D00D4F6
S31500019FA0C0856722202D00D4C086670848790002 43
S31500019FB0F6EB600648790002F6EF2F0D4E944875D0
S31500019FC008004E93508F082D000000D56722202DE2
S31500019FD000D4C086670848790002F6F3600648791E
S31500019FE00002F6F72F0D4E94487508004E93508FD8
S31500019FF0082D000200D5671248790002F6FB2F0DE5
S3150001A0004E94487508004E93508F082D000400D5D4
S3150001A010671248790002F6FF2F0D4E944875080025
S3150001A0204E93508F082D000600D5671A4879000215
S3150001A030F70A48790002F7032FCD4E944875080078
S3150001A0404E934FEF000C082D000500D5671A48798D
S3150001A0500002F71548790002F70E2F0D4E94487548
S3150001A06008004E934FEF000C2F0D4E944235083CDD
S3150001A070600E082D000600E7670608AD000600E73A
S3150001A080082D000600E767122F0E2F0D610003D67B
S3150001A0902F0D610005F41E0060027E030C0700030C
S3150001A0A066182F0D610007DE1E000C070002660A06
S3150001A0B02F0E2F0D610003AE7E014A0767082F0D93
S3150001A0C0610005C61E000C07000367B4422D007827
S3150001A0D0082D000700D567264AAD00C0660442A7D1
S3150001A0E06006206D00C02F1048790002F71B486DED
S3150001A0F000784E94487508784E934FEF000C082D62
S3150001A100000600D66774082D000200D2664C202D89
S3150001A11000D4C0856726202D00D4C08667084879FB
S3150001A1200002F721600648790002F726486D00789B
S3150001A1304E94487508784E93508F603E302D00D06E
S3150001A14000024000FF52403F0048790002F72B486D5C
S3150001A15000784E94487508786 01A102D00E64880FC
S3150001A16052403F0048790002F731486D00784E941D
S3150001A17048750878 4E934FEF000A202D00D4C0850C
S3150001A1806740082D000200D2671648790002F736AB
S3150001A190486D00784E94487508784E93508F60222A
S3150001A1A0302D00D0024000FF52403F0048790002A6
S3150001A1B0F73A486D00784E94487508784E934FEFFC
S3150001A1C0000A082D000000D56724302D00D0E04894
S3150001A1D0024000FF52403F0048790002F73F486DB8
S3150001A1E000784E94487508784E934FEF000A082D73
S3150001A1F0000200D56726302D00D2720CE2680240BB
S3150001A200000FF52403F0048790002F744486D00783C
S3150001A2104E94487508784E934FEF000A082D0004B6
S3150001A22000D5673E4A2D00E5660442466014102DAE
S3150001A23000E44880122D00E5488148C081C14840AC
S3150001A2403C00102D00E4488090463F00487900020A
S3150001A250F749486D00784E94487508784E934FEF4C
S3150001A260000A082D000600D5674E206D00B80828A3
S3150001A27000004000167263 02D C0D2720CE26802400C
S3150001A280000F7C003C00701AD0B900C00580220680
S3150001A290D281D286E589D0812F0C600648790002F5
S3150001A2A0F75548790002F74E486D00784E94487587
S3150001A2B008784E934FEF000C082D000500D5673046
S3150001A2C0082D000300D2670A206D00C84868000403
S3150001A2D06008206D00CC48680004 48790002F757F1
S3150001A2E0486D00784E94487508784E934FEF000CF0
S3150001A2F0100733C000A0048A4CDF7CE0205F508F3A
S3150001A3004ED04E714E714E7133C000A0048C226F37
S3150001A31000044A3900C01EE7671E303CFFFFD079B2
S3150001A32000C01F38024003FF0269FC0000D28169A8
S3150001A33000D208E9000000DB4A3900C01EE26712BC
S3150001A340103900C01F255300134000E608E9000339
S3150001A35000DB4A3900C01EEE670E137900C01F5597
S3150001A36000E408E9000100DB4A3900C01EEA672261
S3150001A370303CFFFFD07900C01F4402400001720A41
S3150001A380E36808A9000200D2816900D208E9000445
S3150001A39000DB4A3900C01EE96720303CFFFFD07957
S3150001A3A000C01F40024000FFE148026900FF00D0E3
S3150001A3B0816900D008E9000200DB4A3900C01EE8C5
S3150001A3C06722303CFFFFD07900C01F3C0240000FDE
S3150001A3D0720CE36802690FFF00D2816900D208E9B5
S3150001A3E00005000DB4A3900C01EEB671E303CFFFF4B
S3150001A3F0D07900C01F48024000FF0269FF0000D06B
S3150001A400816900D008E9000600DB4A3900C01EEC6C
S3150001A4106710237900C01F4A00DC08E9000400D652
S3150001A4206010203CFFABA000DDB900C000FA234069
S3150001A43000DC4A3900C01EED6710237900C01F4EAB
S3150001A44000E008E9000400D66008237900C000FA9C
S3150001A45000E033C000A0048E205F588F4ED04E71AD
S3150001A4604E714E7148E7211C33C000A00490287C30
S3150001A47000C00E842A6F0018266F001C302D00D2F2
S3150001A480024003FF4A406332302D00D2024003FFEF
S3150001A49072003200E58920014AB40800631C70107D
S3150001A4A0322D00D2024103FF74003401E58A2202F3
S3150001A4B0D0B418002B4000C460087010D0942B4013
S3150001A4C000C4203C0000009AD0AD00C4322D00D05B
S3150001A4D0E049024100FF3401C4FC002CD082068011
S3150001A4E0000000162B4000C8203C0000009AD0ADA9
S3150001A4F000C4322D00D0E049024100FF3401C4FC02
S3150001A500002CD0822B400CC082D000100D7660A12
S3150001A510082D000100DB670000AC302D00D202409F
S3150001A52003FF72003200E189068100C00A2C102D5A
S3150001A53000E4488048C0E588D28020412850202D7B
S3150001A54000BCB08C67642B4C00BC67562F0C4EB90F
S3150001A550000089904A40674A7018D0AD00BC2B4074
S3150001A56000B347010D0AD00BC2B4000C0200B672A90
S3150001A5702F0B2F2D00BC4EB900005C504A8066049B
S3150001A58042076027E01100702000001EF0808ADD4
S3150001A590000700E7812D00E7601008AD000700E71E
S3150001A5A0600842AD00B442AD00C04AAD00BC6600D1
S3150001A5B000C242AD00B442AD00C008AD000700E7DD
S3150001A5C0600000B0303C03FFC06D00D26600009C05

S3150001A5D04AB900C00A2867662F0B2F3900C00E44FE
S3150001A5E04EB900005C504A80550442076002 7E0153
S3150001A5F0100702000001EF0808AD000700E7812DF2
S3150001A60000E7082D000700E7673449ED00BC28B9CB
S3150001A61000C00E447018D0942B4000B4302D00D0E9
S3150001A620E048024000FF72003200E589D2AD00B475
S3150001A6302B4100B87010D0942B4000C060342B7CA5
S3150001A64000C00C3400B42B7C00C00C2C00C0202DA3
S3150001A65000B4322D00D0E049024100FF74003401FC
S3150001A660E58AD0822B4000B8600842AD00B442AD05
S3150001A67000C033C000A004924CDF3884205F508FA5
S3150001A6804ED04E714E714E712FC233C000A004940C
S3150001A690226F00084AA900B4670001B6202900B458
S3150001A6A0322900D0E049024100FF74003401E58AF5
S3150001A6B0D08223 4000B872032040C2280001 6700FF
S3150001A6C001AA0829000200D2674A102900E648803B
S3150001A6D0206900C032280004E0490241001F2069B8
S3150001A6E000B83410024200030281 0000FFFF82C25B
S3150001A6F0B041640001763029 00D0024000FF206994
S3150001A70000C032280004E0490241001FB04165281B
S3150001A71060000158302900D0024000FF206900C0C6
S3150001A72032280004E0490241001FB0416200013CA9
S3150001A7304A2900E66E000134302900D2720CE26823
S3150001A7400240000F206900C032280004024100 0FB8
S3150001A750B0416400011 64AA900BC67220829000419
S3150001A76000D66724206900BC20280008B0A900DCB7
S3150001A770650000F8B0A900E0630E600000EE08294C
S3150001A78000 0100D7660000E40829000700D76738F2
S3150001A7900829000200D26718206900B808280002BB
S3150001A7A000016624082800030001661C600000BC45
S3150001A7B0206900B83028000208 00000D660A082842
S3150001A7C0000600026700 00A408290C0000D66726DB
S3150001A7D00829000200D267102069 00B80828000382
S3150001A7E0000166126000008420 6900B8302800026A
S3150001A7F00800000E67740829000100D6672408299D
S3150001A800000200D2670E206900B808280002000184
S3150001A81066106056206900B830280002080 0000D55
S3150001A82067480829000200D667300829000200D2CD
S3150001A830670E303CFFE0206900B8C050661C602AF4
S3150001A840206900B83028000208C0000F660C601A63
S3150001A850303C1780C06900D66610082900050 0D66D
S3150001A860670C0829000700E76604700360027001 9F
S3150001A87033C000A00496241F205F588F4ED04E711E
S3150001A8804E714E7148E7070033C000A00498226F4D
S3150001A89000107C0342474AA900C0670001544AA937
S3150001A8A000B86700014C302900D0E048024000FFA3
S3150001A8B00C40000E6400013A0829000600D7676CB7
S3150001A8C00829000600DB66640829000200D26648F2
S3150001A8D0302900D0024000FF5240024000FF0269C9
S3150001A8E0FF0000D0816900D0302900D0024000FF6E
S3150001A8F0206900C032280004E0490241001FB0412E
S3150001A9006512303C00FFC0470269FF0000D0816933
S3150001A91000D060187E016014102900E648800240CC
S3150001A92000FF0269FF0000D0816900D04A476652E4
S3150001A9300829000500D7674A0829000500DB664299
S3150001A940302900D2720CE2680240000F52400240E8
S3150001A950000FE36802690FFF00D2816900D2302936
S3150001A96000D2E2680240000F206900C032280004CC
S3150001A9700241000FB041650802690FFF00D2600273
S3150001A9807E014A47666A0829000300D767620829DB
S3150001A990000300DB665A0829000200D2674E2069CF
S3150001A9A000C030280004E0480240001F206900B8BA
S3150001A9B032100241000302800000FFFF80C13A000D
S3150001A9C0522900E6102900E64880B0456D06422965
S3150001A9D000E660027E01102900E64880024000FF81
S3150001A9E00269FF0000D0816900D06004422900E6B7
S3150001A9F04A4766260829000100D7671E0829000173
S3150001AA0000DB6616522900E40C29004000E46D06BD
S3150001AA10422900E460027E017C024A47662A08292F
S3150001AA20000400D7672208290C0400DB661A0829FA
S3150001AA30000200D2670808A9000200D2500808E9EE
S3150001AA40000200D27E017C024A47664808290002BC
S3150001AA5000D767400829000200DB6638302900D09C
S3150001AA60E048024000FF5240024000FFE14802690F
S3150001AA7000FF00D0816900D0302900D0E0480240B3
S3150001AA8000FF0C40000F6508026900FF00D060025C
S3150001AA907E017C024A4766024206100633C000A0C8
S3150001AAA0049A4CDF00E0205F588F4ED04E714E71F4
S3150001AAB04E7148E7073C33C000A0049C4FEFFF7876
S3150001AAC0246F00A81F7C0001000149EF0086025493
S3150001AAD0C1FF08D40001422F000208D40006025427
S3150001AAE0FE7F08EC0007000108D400077A0147EF52
S3150001AAF000004600000FA081400066610301472099A
S3150001AB00E2680240001F0C40000363063F3C03005D
S3150001AB1060043F3C00C0610003023E000C47FFFD9C
S3150001AB2067060C4700066606081400066 7080C4708
S3150001AB300015660000860C47000667060814000625
S3150001AB4067520814000767 0000C60814000657C0BC
S3150001AB5044004880DA403F05486F00064E924A405D
S3150001AB60660608D40007600408940007 1F450C0222
S3150001AB700100546001F400003424 63E3C00802A4B1A
S3150001AB80101D4880DC4053474A4762F41F46008443
S3150001AB900254C1FF0894000608140007660A3F3CE8
S3150001ABA00004610002C4602E3F3C00C03F3C0084AB
S3150001ABB0486F00056100030C601C0C470018 6616FF
S3150001ABC03014EE48024000035240024 00003EF48B1
S3150001ABD00254FE7F815430147209E2680240001F5C
S3150001ABE052400240001FE3680254C1FF8154301 4F1
S3150001ABF0EE48024000030C4000026212301472 0952
S3150001AC00E2680240001F0C40001E6300FEEA301499
S3150001AC100240007F4FEF008833C000A0049E4CDF46
S3150001AC203CE0205F588F4ED04E714E714E7148E711
S3150001AC300F3E33C000A004A04FEFFF7849EF008616
S3150001AC402C6F00B00254FF80005400150254C1FF5E
S3150001AC507A0145EF000247EF00046000012230143B
S3150001AC600240007F3F00610002003F3C028061001C
S3150001AC7001AA3E000C47000166 0000CC2A4A3C3C72
S3150001AC800837E4060222F39000262B24EB9000075
S3150001AC90379A38000C44FFFF660A4EB90001B0F23C
S3150001ACA0534760041AC453464A476F044A4662D65C
S3150001ACB04A476F70103C00FFD005122F0002B20008
S3150001ACC066025345424 63E3C00802A4B101D488091
S3150001ACD0DC4053474A4762F4102F0084B0066600F1
S3150001ACE0009E1005460012 2F0003B2006600009078
S3150001ACF0102F0002B00566 0000863F05486F00066A
S3150001AD004E964A4066180254FF8000540006303CB5
S3150001AD103E00C05467040254C1FF52456 0600054AE
S3150001AD20007F605A30147209E2680240001F524CE7
S3150001AD300240001FE3680254C1FF81540254FF80A0
S3150001AD4000540015603 80C47000467060C470018CC
S3150001AD50660C707FC0470254FF8081546020025404
S3150001AD60FF800054001530147209E2680240001F8A
S3150001AD7052400240001FE3680254C1FF815430145F
S3150001AD800240007F0C400004672A30140240007F15
S3150001AD900C400018671E30140240007F0C40007FF3
S3150001ADA06712 30147209E2680240001F0C40000A63
S3150001ADB06500FEAC30140240007F0C400004670CB5
S3150001ADC030140240007F0C400018660A3F3C000622
S3150001ADD061000096602430140240007F0C40007F21
S3150001ADE066183F3C000A3F3C001148790002F75EB5
S3150001ADF0610000D03F3C00C0612030140240007F5A
S3150001AE004FEF008833C000A004A24CDF7CF0205F26
S3150001AE10588F4ED04E714E714E7148E7030033C0C4
S3150001AE2000A004A43C2F000C60124A466704534656
S3150001AE3066047EFD601A4EB90001B0F22F39000298
S3150001AE4062B24EB90000379A3E000C47FFFF67DA3F
S3150001AE500733C000A004A64CDF00C0205F548F2A
S3150001AE604ED04E714E714E7148E7030033C000A0BB
S3150001AE7004A81C2F000D7E05600853474EB900013A
S3150001AE80B0F24A47631A2F39000262B210064880AF
S3150001AE903F004EB9000036763C000C0600FF67DA2B
S3150001AEA04A4763061006488060027 0FD33C000A061
S3150001AEB004AA4CDF00C0205F548F4ED04E714E71F4
S3150001AEC04E7148E7070433C000A004AC2A6F001492
S3150001AED03A2F00183E2F001A602C2F39000262B259
S3150001AEE0101548800240 00FF3F004EB9000036763B
S3150001AEF03C000C46FFFF660A4EB90001B0F253470B
S3150001AF006004528D53454A4763044A4562CC4A4719
S3150001AF1063043006600270FD33C000A004AE4CDF4E
S3150001AF2020E0205F508F4ED04E714E714E712F0230

S3150001AF3033C000A004B0323CF83BD26F0008740065
S3150001AF403401E58A0682000285162042201033C0AC
S3150001AF5000A004B2241F205F548F4ED04E714E7153
S3150001AF604E7133C000A004B4303CF83AD06F0004EF
S3150001AF707200320006810002880E20414240101004
S3150001AF8033C000A004B6205F548F4ED04E714E716F
S3150001AF904E7133C000A004B87200322F0004D28172
S3150001AFA00681000284FC2041301033C000A004BA9F
S3150001AFB0205F548F4ED04E714E714E7148E7010C91
S3150001AFC033C000A004BC598F2A6F00143F2D00081E
S3150001AFD04EB90001AF624A4066047E0060100C2D36
S3150001AFE00002000652C0440048803E0048C749EDB1
S3150001AFF0000A303CFFFFD06D00083F004EB900014A
S3150001B000AF2ED0872EB04240102D000553403F00C0
S3150001B0104EB90001AF9272003200D2977000102D26
S3150001B0200005D280538128812E81720720174EB9DF
S3150001B03000024FCC52001B400001721820144EB979
S3150001B04000025A8228807000102D0004D194723CAF
S3150001B05020144EB900025A8228807000102D000378
S3150001B060D19420144EB900025A8228807000102D06
S3150001B0700002D1940C15000167120C15000266142A
S3150001B0802F144EB90000156A4A40670804AD000046
S3150001B0900E10000A588F33C000A004BE4CDF30806A
S3150001B0A0205F588F4ED04E714E714E71207C000339
S3150001B0B012EC227C00C07742203C000000B0E488FC
S3150001B0C0600222D851C8FFFC4E7548E73F3E204F2B
S3150001B0D02E7900C0573E23C800C0573EBFFC00C0B2
S3150001B0E077426C32BFFC00C0573E6F2A4CDF7CFCB6
S3150001B0F04E75203900C01EDA23C000C01EDE48E7A7
S3150001B1003F3E204F2E7900C0573E23C800C0573E10
S3150001B1104CDF7CFC4E752E7900C0573E4EB90000BF
S3150001B12097024CDF7CFC4E75207C00031248227C82
S3150001B13000C04646203C000000A4E488600222D8F4
S3150001B14051C8FFFC4E7533FC002400C0573C606EAD
S3150001B15033FC001C00C0573C606433FC001D00C07A
S3150001B160573C605A33FC002000C0573C606833FCF2
S3150001B170001F00C0573C605E33FC002300C0573CF3
S3150001B180605433FC002200C0573C604A33FC002166
S3150001B19000C0573C604033FC001E00C0573C60367F
S3150001B1A033FC002400C0573C602C33FC002500C052
S3150001B1B0573C602233FC002600C0573C601833DF41
S3150001B1C000C0572E33DF00C0573033DF00C057327F
S3150001B1D033DF00C05734007C070033DF00C0573A25
S3150001B1E033DF00C0573633DF00C0573848F9FFFF59
S3150001B1F000C056EA33C000A004C04EB90000961044
S3150001B2002E7C00C0573E2F3C00C056EA203C00C0B1
S3150001B210573E048000C056EAE2403F003F3C001B17
S3150001B2204EB90000717433C000A004C24E722700EB
S3150001B23033C000A004C4007C07002E7C00C0573E2A
S3150001B240227C00E00580203C00000000E2402F093E
S3150001B2503F003F3C00034EB90000717433C000A0AB
S3150001B26004C64E72270048E7030033C000A004C895
S3150001B2701E390080400813FC00800080400813FC42
S3150001B280000010080400302F000C48C0E588068090
S3150001B29000002676820402F104EB900C077423C007B
S3150001B2A013FC00010080400013C70080400833C032
S3150001B2B000A004CA4CDF00C0205F548F4ED04E71EF
S3150001B2C04E714E7148E7011C33C000A004D44FEF04
S3150001B2D0FFF0286F00244BD7267C00C021063014CE
S3150001B2E04640C06F00286628426D000E2A8C41EF49
S3150001B2F000282B4800082B4C00043B7C0001000C65
S3150001B3002F0D4EB900C0464642471E008F136006F8
S3150001B31008D300027E0430074FEF001033C000A0AF
S3150001B32004D64CDF3880205F5C8F4ED04E714E7153
S3150001B3304E7148E7030033C000A004D87C0B0839DE
S3150001B340000300C0001266047E0060042E065387C7
S3150001B350206F000C20874879000288DC487900E0DC
S3150001B36004DE4EB9000218164A406F042006600238
S3150001B370700033C000A004DA4CDF00C0205F5C8F90
S3150001B3804ED04E714E714E712F0D33C000A004DCAC
S3150001B3902A6F000848790000087248790002F78090
S3150001B3A02F0D4EB9000222C82F3900025CA448793C
S3150001B3B00002F789486D00204EB9000222C84FEFFE
S3150001B3C0001833C000A004DE2A5F205F5C8F4ED0D8
S3150001B3D04E714E714E7133C000A004E033C000A01F
S3150001B3E004E2205F588F4ED04E714E714E7148E780
S3150001B3F0033E33C000A004E44FEFFFE42A6F003C94
S3150001B4002F79000288E00018026F00FF001808EF8C
S3150001B41000002001A3F3C0001204F2F28001A43EF7B
S3150001B42000164EB900006958 2F390CE004F62F398D
S3150001B43000E004F2204F2F28001C2F28001843EFAC
S3150001B44000184EB9000195903F39000007BC204F06
S3150001B4502F28000E2F28000A43EF001A4EB90001CB
S3150001B46093702 47C00C00E842052486800C048793D
S3150001B47000E004DE486F00144EB9000217D2486F8F
S3150001B48000010486F0010486F001C4EB9000217D219
S3150001B4902F3900E004EE2F3900E004EA2F3900E0ED
S3150001B4A004F62F3900E004F243EF00144EB900010F
S3150001B4B095903F39000007BC204F2F28000A2F28FE
S3150001B4C0000643EF00164EB90001937020524868FA
S3150001B4D000C048790CE004DE486F00104EB9000252
S3150001B4E017D2486F000C486F000C486F00184EB910
S3150001B4F0000217D2287C00E004FE2C3C00278D00B8
S3150001B500203900C000FAB094632E20062239C0C00B
S3150001B51000FA92944EB9000253E0486F00044EB906
S3150001B52000023A48486F0004486F0018486F00143B
S3150001B5304EB9000217D260062F6F0010000C487931
S3150001B5400000288DC486F00104EB9000218164A4006
S3150001B5506F7C4879000288DC487900E004E24EB944
S3150001B56000218164A406F66486F000C487900E0E1
S3150001B57004E2486F000C4EB9000217E84879000250
S3150001B58088E4486F00084B6F00084EB9000217D2D8
S3150001B59048574EB90002455E486F00084EB9000291
S3150001B5A03A48487900028 8E8486F000C4EB9000213
S3150001B5B018164A406F082F7C4AED4E0000082E14DB
S3150001B5C0486F00084EB90002455EDE80601E48796C
S3150001B5D000288DC487900E004E24EB90002181640
S3150001B5E04A406F062E06DE9460022E14267C000267
S3150C01B5F022C82C7C00C04594202F0040720AB081DD
S3150001B60620002BCD040303B00064EFB0002007ACD
S3150001B61000A800D800C20174001600480 22E025E7E
S3150001B6200294020E48790002F7922F0D4E93508F25
S3150001B630486D00202F3900C000FA3F3C006D4EB91D
S3150001B64000000C14204F2F2800142F0E48790002F9
S3150001B650F7A060000242487900 02F7AB2F0D4E9326
S3150001B660508F486D002020544870 68003F3C006DA3
S3150001B6704EB900000C14204F2F28000C2F0E4879CC
S3150001B6800002F7BA60000210487900 02F7C52F0DD3
S3150001B6904E93508F486D00202F143F3C006D4EB9DC
S3150001B6A000000C14204F2F2800102F0E487900029D
S3150001B6B0F7D5600001E248790002F7E02F0D4E93BD
S3150001B6C0508F486D00202F3900E004FA600001E632
S3150001B6D048790002F7EB2F0D4E93508F486D0020ED
S3150001B6E02F14600001D048790002F7F52F0D4E9313
S3150001B6F0508F302F0018E048024000FF72003200E0
S3150001B700D2810681000007BC20413F102F3900E09D
S3150001B71004EE2F3900E004EA43EF001A4EB90001A6
S3150001B72097A6307C00AAD1D2302F0018E0480240FB
S3150001B73000FF3200C2FC002CD1C148680016486FD8
S3150001B740000C4EB90002161A486F0008486F001423
S3150001B750486F00084EB9000215DC204F2F2800045F
S3150001B7602F10307C00AAD1D2302F0020E0480240B1
S3150001B77000FF3200C2FC002CD1C1486800236000E2
S3150001B78000B648790002F7FF2F0D4E93508F302FE8
S3150001B790018E048024000FF72003200D2810681A3
S3150001B7A0000007BC20413F102F3900E004F62F3975
S3150001B7B000E004F243EF001A4EB9000197A6307C6F
S3150001B7C000AAD1D2302F0018E048024000FF320013
S3150C01B7D0C2FC002CD1C148680016486F000C4EB956
S3150001B7E00002161A486F0008486F0014485F0008D7
S3150001B7F04EB9000215DC204F2F2800042F10307C93
S3150001B80000AAD1D2302F0020E048024000FF3200CA
S3150001B810C2FC002CD1C1486800236C1A4879000295
S3150001B820F8072F0D4E93508F2F390CE004DE2F0EAF
S3150001B83048790002F811486D0020605E48790002DF
S3150001B840F81E2F0D4E93508F486D00202F3900E0C2
S3150001B85005023F3C006D4EB900000C142F3900E083
S3150001B86004E62F0E48790002F82A602A4879000278
S3150001B870F8352F0D4E93508F486D00202F143F3C05
S3150001B880006D4EB900000C142F3900E004E22F0EB2

S3150001B89048790002F845486D00254E934FEF001098
S3150001B8A0601C48790002F8502F0D4E93508F486D59
S3150001B8B000202F073F3C00634EB900000C144FEFE8
S3150001B8C0001C33C000A004E64CDF7CC0205F4FEFB4
S3150001B8D0000A4ED04E714E714E7133C000A004E87D
S3150001B8E04241227C00C00E963001C1FC00D2D089B3
S3150001B8F02040217C0001BAF8009A3001C1FC00D237
S3150001B900D0892040217C0001B960009E524130015E
S3150001B910C1FC00D2D0892040217C0001BB16009ACF
S3150001B9203001C1FC00D2D0892040217C0001BA2C13
S3150001B930009E52410C4100066DAE08F9000400C09C
S3150001B9402A2313FC000700C02A2513FC000400C0AB
S3150001B9502A2433C000A004EA4E754E714E714E7111
S3150001B96033C000A004EC3039008040A6720CE268B6
S3150001B9700240000742411239000C02A24B04167162D
S3150001B98002410007700CE16902798FFF008040A631
S3150001B9908379008040A6227C008040460051100039
S3150001B9A00251F3FF00510400007938000080404045
S3150001B9B04240103900C02A250240001F720AE3687E
S3150001B9C0027983FF0080402C81790080402C13F995
S3150001B9D0008040420C0210808390003000C02A2324
S3150001B9E06738303900804 04A08000006672C207C01
S3150001B9F000C029D152100C10000F630410BC000FB7
S3150001BA00700FC010C23900F000804062813900805 9
S3150001BA1040620279FFBF0080404A0251EFFF33C006
S3150001BA2000A004EE4E754E714E714E7133C000A0EA
S3150001BA3004F03039008040A6720CE268024000072B
S3150001BA404241123900C02A24B041671602410007 5B
S3150001BA50700CE16902798FFF008040A6837900802E
S3150001BA6040A6227C008040460051100002 51F3FF9F
S3150001BA7000510800007938000080404042401039EA
S3150001BA8000C02A250240001F720AE368027983FF7B
S3150001BA900080402C81790080402C13F900804042BF
S3150001BAA000C0210808390003000C02A23673830394D
S3150001BAB00080404A08000006672C207C00C029D17E
S3150001BAC052100C10000F630410BC000F700FC01051
S3150001BAD0023900F000804062813900804062027 9BB
S3150001BAE0FFBF0080404A0251EFFF33C000A004F2BD
S3150001BAF04E754E714E714E7133C000A004F433F988
S3150001BB000080403A00C02A0C33C000A004F64E75EE
S3150001BB104E714E714E7148E7003C33C000A004F8E7
S3150001BB2033F90080403A00C02A0E2A7C00C02A1050
S3150001BB303039000C02A0C9C7900C02A0E3A804A405A
S3150001BB406C024255247C00C02A123012B0556402A0
S3150001BB503495287C00C02A160C540008641E267CE5
S3150001BB6000C02A143015D15352540C540008660CE7
S3150001BB703013E64833C000C02A184253083900047E
S3150001BB8000C02A23671061204A40670A425202799F
S3150001BB90FFBF0080404A33C000A004FA4CDF3C00DE
S3150001BBA04E754E714E714E7148E73F3C33C000A051
S3150001BBB004FC598F420642433E3900C02A102A7CB2
S3150001BBC000C02111287C00C0210E267C00C0210A5C
S3150001BBD0247C00C04462BE7900C04464 6508BE7915
S3150001BBE000C0446C630C1ABC0002425442937C01AF
S3150001BBF0606070003007D19352541012488032149D
S3150001BC00B240654E20131412488248C2D48206827D
S3150001BC10000288EC2042122800 01E2A82E00388397
S3150001BC204293BE7900C04466640A7C010C15000289
S3150001BC306620601ABE7900C0446A640A0C150001C8
S3150001BC4066101A86600C7C010C150002660 41ABC8B
S3150001BC500010C39001F0080406C66047A01600205
S3150001BC60420578001805 1A15488548C52004E78855
S3150001BC70D084E588068000028D1C2205D281D285FA
S3150001BC80E589D0812240204A20D920D920914A062F
S3150001BC906700017E303900C04468E848720032000E
S3150001BCA0D28106810002 8D7020411C2800013007D7
S3150001BCB0E84872003200D281068100028D7020416F
S3150001BCC09C2800014A066700014876012A7C00C0CB
S3150001BCD04463BC156F041C1560121006488012 15CA
S3150001BCE048814441B0416C041C1544062A7C00C0BD
S3150001BCF02110DD150C1500256F041ABC00251E1533
S3150001BD001EB900C029C21F7900C029C300011F79CD
S3150001BD1000C029C400021F7900C029C500034A07D3
S3150001BD206C52440742066040100748804 1D712060C
S3150001BD30488148C1D1C142411210B0416F1A41D761
S3150001BD401006488048C0D1C09E1041D71006488 0D1
S3150001BD5048C0D1C04210600E41D71006488048C085
S3150001BD60D1C09F10420752060C0600046C644A07B4
S3150001BD706F6060B4420660501007488041D71206D2
S3150001BD80488148C1D1C142411210444106410 01FB8
S3150001BD90B0416F2441D71006488048C0D1C0101069
S3150001BDA04400060000 1F9E0041D71006488048C087
S3150001BDB0D1C010BC001F600E41D71006488048C094
S3150001BDC0D1C0DF10420752060C0600046C044A0774
S3150001BDD06EA61E1713C70080406C13C700C029BE8C
S3150001BDE01E2F000113C70080406D13C700C029BF75
S3150001BDF01E2F000213C70080406E13C700C029C062
S3150001BE001E2F000313C70080406F13C700C029C14E
S3150001BE103003588F33C000A004FE4CDF3CFC4E7546
S3150001BE204E714E714E7133C000A0050042B900C07B
S3150001BE30210A427900C0210E423900C0211008F9B9
S3150001BE400000400C02A2313FC000700C02A2513FCA6
S3150001BE50000400C02A2433C000A005024E754E71AD
S3150001BE604E714E7133C000A0050408B9000400C02C
S3150001BE702A2333C000A005064E754E714E714E71D0
S3150001BE8048E72F3E33C000A005C84FEFFFD64279A1
S3150001BE9000C0211433FC000A00C02116247C00C016
S3150001BEA0447042524252227C00C02A0C41EF0010DB
S3150001BEB0700520D951C8FFFC309142453005024 03A
S3150001BEC00001E94808B9000400C02A23817900C0AD
S3150001BED02A22267C00C02112368513FC000700C0E9
S3150001BEE02A2508F900060080406202390 0CF008049
S3150001BEF040620279FC0000804078007900010080F0
S3150001BF0040783039008040780240 03FF5240720089
S3150001BF103200203C01312D004EB9000253E0720A75
S3150001BF20E2A8486F00084EB900023A484879000273
S3150001BF30892E487900C029DE486F000C4EB90002EF
S3150001BF4017D2486F0008486F0008486F00084EB9BD
S3150001BF50000217E848574EB900024 55E33C000801B
S3150001BF60407E33F90080407E0080407C287C00C002
S3150001BF70446E38853E052A7C008040642C7C008016
S3150001BF80406C700030071DBC00000800D080220004
S3150001BF900275F0FF180070003007D0800275FF00AF
S3150001BFA0080052470C47000465D8423900C02A24CC
S3150001BFB042470279F000008040A63039008040A651
S3150001BFC00800000F67F43039008040A602400FFFD9
S3150001BFD0D15352470C47001065D83013E8483680D4
S3150001BFE00255F0FF38BC0001267C00804063283CE6
S3150001BFF08000000006000 01EC702AC0F900C0211425
S3150001C00006400080024000FF0255FF0081550C5496
S3150001C0100056630301 5E0480240000F0C40000371
S3150001C020660634BC0004601C303C0F00C055301558
S3150001C030E0480240000F52400240000FE14802551D
S3150001C040F0FF81554A52660001601CB900028D1845
S3150001C05013FC000100C02A24424616BC00FF38BC6E
S3150001C060000160000 12C427900C02A1660064EB913
S3150001C070000020F9E0C79000800C02A16640A2039B6
S3150001C080000C029B0C08467E63E3900C02A18BE79CF
S3150001C090000291706424424010390 0C02A245340A2
S3150001C0A00C36001F000064124240103900C02A24D9
S3150001C0B05340523600006 00000D8BE790002917 8E4
S3150001C0C0632242401039 00C02A2453404A360000F8
S3150001C0D06312424010390 0C02A24534053360000EF
S3150001C0E0600000AE3F3C00106100067C3E00424019
S3150001C0F010133207E04974003401D482068200022B
S3150001C10091802042B050631A3207E049740034012D
S3150001C110D482068200029180204210280001 9113E8
S3150001C1206004 16BC00000C470C006304424660081C
S3150001C1300C470800630652464245605 40C4704000A
S3150001C14063360C46000463305213 7E013015E04815
S3150001C1500240000F0240000FE14872003207D2810F
S3150001C160027 5F0FF18008175180052470C4700044C
S3150001C17065DA38BC000260184A4763125245300539
S3150001C18053400C40000463064245 38EC0005424654
S3150001C19004A13630C0C5400016606 4A526700FEC836
S3150001C1A04A13660438BC00054A5266280C5400023C
S3150001C1B0662261000 2B6388008F9000600804062F6
S3150001C1C00C540006660434BC00020C5400036604D9
S3150001C1D034BC0001203900C029B0C08467043 4BCD6
S3150001C1E00003 4A526700FE120C52000166000102 6A

S3150001C1F07C014247287C00C029C2720032077000C8
S3150001C200300719B618000800D0802400D2810681B3
S3150001C21000C029B6204130B5280052470C4700041A
S3150001C22065D8423900C02A24427900C02A1660C620
S3150001C2304EB900020F9E0C790008000C02A16640A46
S3150001C240203900C029B0C08467E6303900C02A18F9
S3150001C250486F000C02800000FFFF4EB900023A4809
S3150001C2604879000289324B6F0010486F00104EB9B4
S3150001C270000217D2486F00084EB90002455E3E0023
S3150001C2800C470190631A600852143007E4489E4037
S3150001C2900C4701C262F2600E53143007E448DE40D7
S3150001C2A00C47015E65F2103900804062E808020021
S3150001C2B0000313C000C029C713D300C029C623F940
S3150001C2C000C000FA00C029C8303900C01CA290790C
S3150001C2D000C01CA833C000C029CC43EF0010207C4D
S3150001C2E000C02A0C700520D951C8FFFC30916C02AC
S3150001C2F0424608B90006008040620279FC000080CF
S3150001C30040780079006400804078300064FEF002ABB
S3150001C31033C000A0050A4CDF7CF44E754E714E7198
S3150001C3204E7148E71F3E33C000A0050C4FEFFFECEE
S3150001C330247C0080407C3C122C7C0080407E3A1696
S3150001C340267C0080407830130240003FF38004243C8
S3150001C350163900C02A2442472A7C0080406C7200AC
S3150001C3603207700030071FB518000810207C00C086
S3150001C37029C21BB00800180052470C47000465DEAD
S3150001C38008F900060080406202S3FC0000530001D8
S3150001C3903013024003FF524072003200203C01314B
S3150001C3A02D004EB9000253E0720AE2A8486F000858
S3150001C3B04EB900023A4848790002892E487900C0F0
S3150001C3C029DE486F000C4EB9000217D2486F0008EB
S3150001C3D0486F0008486F00084EB9000217E8485731
S3150001C3E04EB90002455E3E003C87348713FC0004CB
S3150001C3F000C02A244EB900020F9E3F3C0064610032
S3150001C400035A3E00287C00C021180C4708A062068A
S3150001C4100C4707606404525460024253434863C85DA
S3150001C420303C03FFC0440253FC00815313C300C0D8
S3150001C4302A2408B9000600804062424772003207BA
S3150001C440700030071BB71810080052470C4700044C
S3150001C45065EA30144FEF001433C000A0050E4CDF1F
S3150001C4607CF84E754E714E7148E73F3E33C0B2
S3150001C47000A005104FEFFFEC36390080407C3439BF
S3150001C480080407E303900804078024003FF3F4003
S3150001C49000122A7C00C02A24424010153F40001099
S3150001C4A07A0308F90006008040620279FC00080E8
S3150001C4B04078007900010080407830390080407B6A
S3150001C4C0024003FF5240720032002003C01312D0030
S3150001C4D04EB9000253E0720AE2A8486F00084EB94D
S3150001C4E000023A4848790002892E487900C029DEBF
S3150001C4F0486F000C4EB9000217D2486F0008486F0A
S3150001C5000008486F00084EB9000217E848574EB9AF
S3150001C51000002455E3E0033C70080407E33C700807F
S3150001C520407C1ABC0001287C00C02114267C008036
S3150001C530406C247C008040642C7C00C029B0283CDF
S3150001C5408000000006000018A424010155340480C037
S3150001C550D0800272FF00080042401015534048C0C7
S3150001C560068000028D18204042401015534017905 6
S3150001C57000001E3C0080600001424240100742461 6
S3150001C5801C15534648C6DC8632326800024100FF5C
S3150001C5908041024000FF4241121553414 8C1D281F8
S3150001C5A00272FF00180081721800427900C02A1633
S3150001C5B060064EB900020F9E0C79000800C02A16CB
S3150001C5C054062016C08467EA3C3900C02A18424036
S3150001C5D01015534048C0D0800680000291702040 5B
S3150001C5E0BC50641C42401015534 00C33001F000020
S3150001C5F0640E424010155340523300006000 00BCE7
S3150001C600424010155340 48C0D080068000029 17800
S3150001C6102040BC50631A4240101553404A33000073
S3150001C620630E4240101553405333000060000 08CE6
S3150001C6303F3C00106100012 43C000C4608006332B7
S3150001C64042401007464042461C15534648C6DC8602
S3150001C6503232680002410 0FFC041024000FF424100
S3150001C6601215534148C1D2810272FF00180081722E
S3150001C67018 00E20F6644424 1121553414 8C1D28166
S3150001C68030321800024000FF0C4000FF660A0C54CD
S3150001C690FFFE67245354601C303C00FF42411215D3
S3150001C6A0534148C1D281C0721800660E0C54000273
S3150001C6B0670652547A0460027A064A0763104A7979
S3150001C6C000C0447066082016C0846700FEAE52158D
S3150001C6D00C15000564160C45000366104A7900C066
S3150001C6E0447066082016C0846700FE5E4A7900C061
S3150001C6F0447067027A0733C30080407C33C20080EE
S3150001C700407E303C03FFC06F00120279FC000080BE
S3150001C71040788179008040781AAF001108B9000687
S3150001C7200080406242477000300772003207068 17E
S3150001C73000C029C2204110B3080052470C4700042B
S3150001C74065E430054FEF001433C000A005124CDF3D
S3150001C7507CFC4E754E714E714E7148E73F0433C0F5
S3150001C76000A00514558F342F0022424338037C0064
S3150001C77033C400C02A1660064EB900020F9E0C791A
S3150001C780000800C02A16640A0839000700C029B04B
S3150001C79067E642452A7C008040A660700255F0009B
S3150001C7A042476002524 70C47EA606408301508 00A8
S3150001C7B0000F67F00C47EA5F620A300390440C40B1
S3150001C7C0040063067C003A0260403E3C0FFF3015D0
S3150001C7D002400FFF907900C02112064008004 24135
S3150001C7E0123900C02A243E80700AE169D257CE412F
S3150001C7F0B64765044A4566023607B84762044A45A4
S3150001C800660238077000 3007DC805245BA42658CF3
S3150001C8104A4266047C0060107000300222002006 45
S3150001C82004EB9000253E02C003006548F33C000A0ED
S3150001C83005164CDF20FC205F548F4ED04E714E7191
S3150001C8404E7133C000A005184A7900C044706616BF
S3150001C850227C00C0211632115351 4A41660833FC2D
S3150001C860000300C0447033C000A0051A4E754E7116
S3150001C87004E714E7148E7073E33C000A0051C2A7C65
S3150001C880000C02A24424010155340024 0FFFC6600B6
S3150001C89000EE287C0080406C424010155340 48C091
S3150001C8A006800002 8D182C404240101553401 99011
S3150001C8B00000424526 7C00C02A16247C00028F70A7
S3150001C8C02C7C00C044684253 60064EB900020F9E9C
S3150001C8D00C53000865F43E3900C02A100C150001FE
S3150001C8E066223016E84872003200D28120013C32BD
S3150001C8F008003007E84872003200D28120019C729C
S3150001C90008006028 3016E84872003200D28106819C
S3150001C91C00028D7020413C103007E84872003200 59
S3150001C920D2810681000 28D7020419C50424010 1533
S3150001C930534042471E340000DE46303CFFE0C0470C
S3150001C94067164A466F047E1F600242074240101571
S3150001C950534019870000600A42401015534019 8759
S3150001C96000000C46FFFF670A4A4667060C460001AF
S3150001C97066027A0A52450C45000A6500FF4A33C031
S3150001C98000A0051E4CDF7CE04E754E714E714E7156
S3150001C99048E73F3E33C000A005204FEFFFD67601A2
S3150001C9A0227C00C02A0C41EF0010700520D951C825
S3150001C9B0FFFC309108B9000400C02A2313FC0007CC
S3150001C9C000C02A252C7C00C02A244216247C008023
S3150001C9D0406208D20006021200CF303C03FFC0437A
S3150001C9E00279FC00008040788179008040783039F6
S3150001C9F000804078024003FFD04372003200203CA1
S3150001CA0001312D004EB9000253E0720AE2A8486FC7
S3150001CA1000084EB900023A48487900028936487939
S3150001CA2000C029DE486F000C4EB9000217D2486FCC
S3150001CA3000008486F0008486F00084EB9000217E861
S3150001CA4048574EB90002455E3E003C0733C600809A
S3150001CA50407E33C60080407C70003007D080720073
S3150001CA6032074EB900025A827214E2A028003F042E
S3150001CA704EB90001C75A3A003E032A7C00C029C2BA
S3150001CA80287C0080406426 7C00C0211A303CFFFFD0
S3150001CA90D047720032002001323CFFFFD2477400BA
S3150001CAA03401068200804 06C204210B508001C87C4
S3150001CAB06100FDC23F044EB90001C75A36803C3CB5
S3150001CAC00FFF9045064008 00CC400C4605006 50A5C
S3150001CAD00C460B0062044A53660842437E05600019
S3150001CAE001140C4607C065080C46084063 0000AEF9
S3150001CAF00C4608006450303CFFFFD04772003200FC
S3150001CB0CD28130341800024000FF0C4000FF643629
S3150001CB10303CFFFFD04772003200D281303418001A
S3150001CB20024000FF5240024000FF323CFFFFD24765
S3150001CB3074003401D48222020274FF001800817449
S3150001CB4018006000000B00C4608006500 00A8303CE3

S3150001CB50FFFFD04772003200D28130341800024004
S3150001CB6000FF4A406300008E303CFFFFD047720051
S3150001CB703200D28130341800024000FF5340024097
S3150001CB8000FF323CFFFFD24774003401D4822202F7
S3150001CB900274FF001800817418006058 3A13303C83
S3150001CBA0FFFFD04772003200D281303418000240B4
S3150001CBB000FF024000FF323CFFFFD2477400340100
S3150001CBC0D482068200C029B620420250FF0081505D
S3150001CBD0303CFFFFD04772003200068100804O6C76
S3150001CBE02041303CFFFFD0477200320020011B90EC
S3150001CBF0080052470C4700056500FE92421642792D
S3150001CC0000C02A1660064EB900020F9E0C79000874
S3150001CC1000C02A1665F0303900C02A18486F000C8A
S3150001CC2002800000FFFF4EB900023A48487900022F
S3150001CC30893A486F0010486F00104EB9000217D2AA
S3150001CC40486F00084EB90002455E3E000C47019050
S3150001CC50631A6008521 53007E4489E400C4701C22A
S3150001CC6062F2600E53153007E448DE400C47015E60
S3150001CC7065F20892000610 12E808020000313C0CC
S3150001CC8000C029C713F90080406300C029C623F9F3
S3150001CC9000C000FA00C029C8303900C01CA2907932
S3150001CCA000C01CA833C000C029CC43EF0010207C73
S3150001CCB000C02A0C700520D951C8FFFC30910279B9
S3150001CCC0FC000080407800790064008040783003E1
S3150001CCD04FEF002A33C000A005224CDF7CFC4E75C5
S3150001CCE04E714E714E7133C000A0052433C000A0B1
S3150001CCF005264E754E714E714E7148E7073C33C09D
S3150001CD0000A005284FEFFFE647EF00122A4B2C390A
S3150001CD1000804074287C00C0211C4A866C087A0178
S3150001CD202E06448760044245 2E064A45670000A542
S3150001CD30224C204B20D92091204D20390002893EDA
S3150001CD4022072C022401C4C0D5A800044282D58240
S3150001CD50D59024014842484 0C4C0D5902401C4C09E
S3150001CD6048404841C0C14281D480D38148414842AC
S3150001CD7032024242D5A800042410D58120822406 1D
S3150001CD80224B204C20D92091204D20390002894286
S3150001CD9022072C022401C4C0D5A800044282D582F0
S3150001CDA0D59024014842484 0C4C0D5902401C4C04E
S3150001CDB048404841C0C14281D480D381484148425C
S3150001CDC032024242D5A800042410D58120822406CD
S3150001CDD0600000A2224C204B20D92091204D203901
S3150001CDE00002893E22072C022401C4C095A8000432
S3150001CDF04282D58295902401484248 40C4C095900C
S3150001CE002401C4C048404841C0C14281D480D38175
S3150001CE104841484232024242 95A800042410958 1B5
S3150001CE20208224062 24B204C20D92091204D2039E6
S3150001CE3000028942 22072C022401C4C095A80004DD
S3150001CE404282D582959024014842484 0C4C09590BB
S3150001CE502401C4C048404841C0C14281D480D38125
S3150001CE604841484232024242 95A80004241095 8165
S3150001CE70208224062E132A7C00C02124EEB900C0BC
S3150001CE80212A6508BEB900C0212663703F3C0022F5
S3150001CE904240103900804070524048 6F000A48C035
S3150001CEA04EB900023A28486F000A487900C00E922E
S3150001CEB0486F000E4EB9000217D24879000289 4622
S3150001CEC0486F000A486F000A4EB9000217E8204F62
S3150001CED02F28000243EF00144EB90002425848 6F52
S3150001CEE0000E4EB90002455E288042B900C02120DD
S3150001CEF02E141ABC0014423900C0212533C7008004
S3150001CF00407220077210E2A813C0008040714A39AE
S3150001CF1000C000FD660261224A15630853154239B5
S3150001CF2000C021254FEF001A33C000A0052A4CDFAF
S3150001CF303CE04E754E714E714E7133C000A0052C0A
S3150001CF404FEFFFEA3F3C00224240103900804070 1B
S3150001CF50524048 6F000E48C04EB900023A2848793F
S3150001CF6000028 94A487900C00E92486F00124EB9F4
S3150001CF700002 17D2486F000E486F000E486F000E70
S3150001CF804EB9000217D24879000289464 86F000A55
S3150001CF90486F000A4EB9000217E8204F2F280002F9
S3150001CFA043EF00184EB90002425848 6F00124EB9BD
S3150001CFB00002455E23C000C021263F3C00224240BC
S3150001CFC010390080407052404 86F000E48C04EB97B
S3150001CFD00023A2848790002894E487900C00E922B
S3150001CFE0486F00124EB9000217D2486FC00E486F03
S3150001CFF0000E486F000E4EB9000217D248790002A2
S3150001D0008946486FC00A486F000A4EB9000217E8C0
S3150001D010204F2F28000243EF00184EB90002425854
S3150001D020486F00124EB90002455E23C000C0212A96
S3150001D0304FEF001633C000A0052E4E754E714E718E
S3150001D0404E7148E7070433C000A005304FEFFFEEED
S3150001D05013FC00170080407 03F3C0022424010390B
S3150001D06000804070524048 6F000A48C04EB9000225
S3150001D0703A28486F000A487900C00E92486F000EA0
S3150001D0804EB9000217D248790002894 6486F000A54
S3150001D090486F000A4EB9000217E8204F2F280002F8
S3150001D0A043EF00144EB900024258486F000E4EB9C4
S3150001D0B00002455E23C000C0211C42B900C02120E8
S3150001D0C02C3900C0211C13FC001400C0212461006E
S3150001D0D0FE6A700023C0008040742A7C00804010E4
S3150001D0E02015E0882E007003C0957218E3A8DE8033
S3150001D0F02A0760102015E0882E007003C09572186B
S3150001D100E3A8DE800839000700804024661 0200766
S3150001D1109085028003FFFFFF7203B08165D633C697
S3150001D12000080407220067210E2A813C00080407190
S3150001D13008B9000700804 0244FEF001233C000A059
S3150001D14005324CDF20E04E754E714E714E7148E747
S3150001D1503F3E33C000A005344FEFFFE82A7C00C0F4
S3150001D16029B02ABC0002000033FC003B00C029A8FC
S3150001D170287C00C02E482C3C80000000267C00C084
S3150001D1802B34247C00C029B42C7C00020F9E263C43
S3150001D19000010000243C8011E080303C0FFFC07974
S3150001D1A000C02B22662A3F3900C045704EB90001E6
S3150001D1B08EF602800000FFFF80FC0FA0484002406F
S3150001D1C00FFF0279F00000C02B22817900C02B22CB
S3150001D1D0089500070C79003C00C029A8621E08EDDD
S3150001D1E00007000302390 00F00C02B3113FC0001B8
S3150001D1F000C02B3033FC038400C029A8879508EDB5
S3150001D2000006000242476004 4E9652470C470064EE
S3150001D210640C2015C08367062015C08667EA2015B1
S3150001D220C083670E08AD0004000108ED0006000189
S3150001D230600608AD00060001082D000100016758CF
S3150001D24042473A07CAFC004C227C00028BE8D3C550
S3150001D250207C00C04332D1C5701220D951C8FFFCD1
S3150001D26078003807 2004D080D084E788068000E063
S3150001D2700520224020 7C00C04332D1C5700520D94B
S3150001D28051C8FFFC52470C47000365B608AD0001C3
S3150001D290000100950000C000082D00060002671A73
S3150001D2A04EB90001EA040C800000038463 0608ED10
S3150001D2B00000000108AD00060002082D0000000173
S3150001D2C0676C4EB90001C9904A40660808ED00072F
S3150001D2D000002600833FC000100C04470227C00C0DB
S3150001D2E029B641D7700520D951C8FFFC43D7424022
S3150001D2F010123200C2FC004C068100C043322041AC
S3150001D300700520D951C8FFFC7E001E1243D72007A5
S3150001D310D080D087E788068000E005202040700590
S3150001D32020D951C8FFFC08AD0000000187950 82DE2
S3150001D3300007000267000 2D24EB90001BE804A40D2
S3150001D34067542 27C00C029B641D7700520D951C83F
S3150001D350FFFC43D74240101 2320 0C2FC004C06814A
S3150001D36000C043322041700520D951C8FFFC7E0020
S3150001D3701E1243D72007D080D087E788068000E0B9
S3150001D380052020407005 20D951C8FFFC879508ADBE
S3150001D390000700016 01E08ED000700010C120003E2
S3150001D3A06508423900C029B5600A1012520013C03F
S3150001D3B000C029B5029500007FFF6000024C0815E8
S3150001D3C00002670C61000912 6100098A08950002D2
S3150001D3D0082D00070003670001044EB90001BE26AF
S3150001D3E0423900C02B3226B900C029D623F900C024
S3150001D3F0456EC0C02B2442476000 00C80C4700144C
S3150001D4006200008E7000303900C029A82213EC8911
S3150001D41006810000000AB0816576610008BC6100E2
S3150001D420093461 0009E23880700DC02C00016604E0
S3150001D4304A54666008 2C00020001670826B900C03C
S3150001D44029D6600626B900C029DA4A5467060C5463
S3150001D45000001662E303900C02D1E720CE268024 0B2
S3150001D460000F72003200E5890681000289B6224169
S3150001D4702051 4E90815467060C54000166046100E8
S3150001D4800BE2082D00030003673402 95FFFFFF3707
S3150001D4908D95602A0C54000266240 82D00060003AF
S3150001D4A066164A1257C04400488013C000C029B509

S3150001D4B0009580004000600625B900C029D6524773
S3150001D4C04E96082D000700036700013C203C8001B1
S3150001D4D0D800C095660C01306000FF22082D0005C6
S3150001D4E0000267160C79003C00C029A8630661009A
S3150001D4F0014460068D9538BC0100082D0004000228
S3150001D500670000D608D500014EB90001EABE082D14
S3150001D51000020002674C3F3C00004EB90001ECA23C
S3150001D5204879A51EBD9161000C762F3900C02B24C8
S3150001D53061000C6C2F3900C02B2461000C063F00E2
S3150001D54061000CA08150000675 62F3900C02B286A
S3150001D55061000C4C2F3900C02B2861000BE63F00FF
S3150001D560603A3F3C00004EB90001ECA24879A51E85
S3150001D570BD9161000C2A082D00010002670648785A
S3150001D580FFFF600242A761000C16082D0001000290
S3150001D59067063F3CFFFF60043F3C000061000C4C06
S3150001D5A04EB90001ECEC60024E962015C08267F878
S3150001D5B00295FCFFFBFF60024E9630390080400861
S3150001D5C00800000E6710203C00200030C095670659
S3150001D5D02015C08667E28D95082D00030002672697
S3150001D5E0227C00028952207C00C03E0E700820D9A0
S3150001D5F051C8FFFC4EB90001EF9060024E9620150E
S3150001D600C08267F88D954E96203C8003C000C09578
S3150001D6106700FDAC0295FCFFC3FF6000FB7E4FEF88
S3150C01D620001833C000A005364CDF7CFC4E754E71E8
S3150001D6304E714E712F0D33C000A005386100069A58
S3150001D640610007122A7C00C029B008ED000500021E
S3150001D65023F900C029D200C02B3423F900C02B20A6
S3150001D66000C03C60303900C02B20720CE2680240D9
S3150001D670000F72003200E589068100028976224197
S3150001D68020514E9008AD0005000208ED000400018E
S3150001D69060064EB900020F9E082D000400016706C0
S3150001D6A00815000767EC303900C02E4833C000A0CA
S3150001D6B0053A2A5F4E754E714E7133C000A008
S3150001D6C0053C303C0FFFC07900E0051E0279F000F1
S3150001D6D000C02B22817900C02B2223F900C0456EA0
S3150001D6E000C02B2433C000A0053E4E754E714E710D
S3150001D6F04E7133C000A0054033C000A005424E75EF
S3150001D7004E714E714E7133C000A0054433C000A066
S3150001D71005464E754E714E714E7133C00CA00548D7
S3150001D720303900C02B2202400FFF33C000E0051E36
S3150001D73033C000A0054A4E754E714E714E7133C00D
S3150001D74000A0054C0279FF0000C03C6008F900000A
S3150001D75000C03C6161000 90C610006AC33C000A049
S3150001D760054E4E754E714E714E7133C000A0055077
S3150001D77023F900C02D1E00C03C600279FF0000C0E5
S3150001D7803C6008F9000100C03C6123F900C0456E08
S3150001D79000C03C64424033C000A005524E754E7134
S3150001D7A04E714E7133C000AC0554424033C000A0F3
S3150001D7B005564E754E714E714E7133C000A0055817
S3150001D7C0424033C000A0055A4E754E714E714E71DE
S3150001D7D02F0733C000A0055C0279FF0000C03C6042
S3150001D7E00079000300C03C6023F900C02B2C00C067
S3150001D7F03C6823F900C02B2800C03C6461000086422
S3150001D800610006043E0033C000A0055E2E1F4E7562
S3150001D8104E714E714E7148E7010C33C000A0056090
S3150001D820287C00C03C60227C00C02D1E204C20D9E3
S3150001D83020D920912F3900C03C64610009E82A40B3
S3150001D8404A806724487900C03C6C2F3900C03C6887
S3150001D8502F0D61000A203E007003D047024000FFF1
S3150001D8600254FF008154600E0254FF00005400036D
S3150001D87042B900C03C68424033C000A005624CDF9B
S3150001D88030804E754E714E714E7133C000A00564E5
S3150001D890610007D06100057033C0C0A005664E75B2
S3150001D8A04E714E714E7133C000A00568424033C0BF
S3150001D8B000A0056A4E754E714E714E7133C000A0BF
S3150001D8C0056C0279FF0000C03C6008F9000100C048
S3150001D8D03C6123F900C02B2800C03C646100078429
S3150001D8E0610005 2433C000A0056E4E754E714E7160
S3150001D8F04E712F0D33C000A005702F3900C02D22A7
S3150001D900610009222A4023DD00C03C6423D500C002
S3150001D9103C6823F900C02D1E00C03C600279FF005F
S3150001D92000C03C6000790003 00C03C60424033C047
S3150001D930C0A005722A5F4E754E714E714E7133C04D
S3150001D94000A005740279FF0000C03C600079000365
S3150001D950C0C03C5023F900C02B2800C03C6423F9B9
S3150001D96000C02B2C00C03C68610006F861000498D9
S3150001D97033C000A005764E754E714E714E712F0D56
S3150001D98033C000A005782F3900C02D22610008960A
S3150001D9902A4023D500C03C6423F900C02D1E00C0D7
S3150001D9A03C600279FF0000C03C6008F9000100C03C
S3150001D9B03C61424033C000A0057A2A5F4E754E7124
S3150001D9C04E714E7133C000A0057C0279FF0000C084
S3150001D9D03C6008F9000000C03C6161000686 6100F8
S3150001D9E0042633C0C0A0057E4E754E714E714E71F0
S3150001D9F048E7010C33C000A0058023F900C02D1EA5
S3150001DA0000C03C600279FF0000C03C6008F90002DA
S3150001DA1000C03C61083900000 0C02B20666008394F
S3150001DA200000100C02B2067047E1060024247303996
S3150001DA3000C02B22720CE2680240000FD047320070
S3150001DA40C2FC02E4068100C013B628412A7C00C04C
S3150001DA503C6442473F072F0C4EB900014A0241EC94
S3150001DA6001BE300748C0E588D1C02F10224D4EB9FE
S3150001DA700000191A65247548D0C4700066DD64240CF
S3150001DA8033C000A005824CDF30804E754E714E7159
S3150001DA904E7133C000A00584610005C861000368AA
S3150001DAA033C000A005864E754E714E714E7133C05E
S3150001DAB000A00588424033C000A0058A4E754E710C
S3150001DAC04E714E7133C000A0058C61000596610050
S3150001DAD0033633C000A0058E4E754E714E714E71E0
S3150001DAE033C000A00590424033C000A005924E7598
S3150001DAF04E714E714E7133C000A0059461000564EC
S3150001DB00610003 0433C000A005964E754E714E7137
S3150001DB104E7133C000A00598424033C000A0059A5B
S3150001DB204E754E714E714E7133C000A0059C02793F
S3150001DB30FF0000C03C6008F9000100C03C6123F908
S3150001DB4000C02B2400C03C646100051861 0002B8C6
S3150001DB5033C000A0059E4E754E714E714E7133C095
S3150001DB6000A005A04241203900C02B24B0B900C055
S3150001DB702D2267047208605 6303CF000C07900C05F
S3150001DB802D206630227C00E0051E303900C02D2094
S3150001DB9002400FFF328002400FFF0279F00000C001
S3150001DBA02B22817900C02B22303900C02B22024062
S3150001DBB00FFF328023F900C02D1E00C03C600279A0
S3150001DBC0FF0000C03C6008F9000100C03C61300163
S3150001DBD033C000A005A24E754E714E714E7133C011
S3150001DBE000A005A46100047C6100021C33C000A0F2
S3150001DBF005A64E754E714E714E7133C000A005A833
S3150001DC00700133C000A005AA4E754E714E714E715A
S3150001DC1033C000A005AC6100044A610001EA33C0CB
S3150001DC2000A005AE4E754E714E714E7133C000A0C7
S3150001DC3005B0700133C000A005B24E754E714E712C
S3150001DC404E7133C000A005B46100041861000 1B82B
S3150001DC5033C000A005B64E754E714E714E7133C07C
S3150001DC6000A005B8700133C000A005BA4E754E710B
S3150001DC704E714E7133C000A005BC610003E6610020
S3150001DC80018633C000A005BE4E754E714E714E71B0
S3150001DC9033C000A005C0700133C000A005C24E7597
S3150001DCA04E714E714E7133C000A005C4610003B4BC
S3150001DCB06100015433C000A005C64E754E714E7108
S3150001DCC04E7133C000A005C8700133C000A005CA5B
S3150001DCD04E754E714E714E7148E7010433C000A076
S3150001DCE005CC2A7C00C029B060064EB900020F9E01
S3150001DCF0081500066706081500045 6EE227C000278
S3150001DD008A16207C00C02D1A706B20D951C8FFFCE1
S3150001DD1030914247227C00028A163007C1FC01B2CB
S3150001DD2006800 0C02ECC2040706B20D951C8FFFC64
S3150001DD30309152470C4700086DDA33FC000200C0EF
S3150001DD402E4833C000A005CE4CDF20804E754E71A3
S3150001DD504E714E7133C000A005D060064EB9000267
S3150001DD600F9E0839000600C029B0670A083900036A
S3150001DD7000C029B066E6227C00028A16207C00C01B
S3150001DD803C5C706B20D951C8FFFC309133C000A0B8
S3150001DD9005D24E754E714E714E7148E7010C33C076
S3150001DDA000A005D42A7C00C029B02E3C200000002A
S3150001DDB08F95287C00C029AC28B900C02B34600699
S3150001DDC04EB900020F9E2015C087670A4A94630662
S3150001DDD00815000767EA4A94630A2015C0876E0496
S3150001DDE04247600E0815000767063E3C01006002C7
S3150001DDF07E02300733C000A005D64CDF30804E7559
S3150001DE004E714E714E7148E73F3E33C000A005D8B2

S3150001DE104FEFFFF6287C00C029B0247C00C02E48B5
S3150001DE2008140007660002184EB90001EF90610060
S3150001DE30FF6A0C400100670001FE4A40670C0C4076
S3150001DE400002670001F8600001F642477C01780193
S3150001DE5036073A03267C00C02E3A4DEF00086000D3
S3150001DE6001784EB900020F9E303900C02D14B0461C
S3150001DE70642430390080400808000000E6718082C19
S3150001DE800000000367104A465F0C0C4600286C061A
S3150001DE9008140007 67CC4A4366164A4567127003A1
S3150001DEA00837000408006708 0C4700036D02760175
S3150001DEB042562A7C00C02ECC426F00046000010845
S3150001DEC0300748C0E5882F3508046100C27641ED28
S3150001DED000C4340748C2D482D1C23210B240670AA4
S3150001DEE008ED0002012F600000B04A43670489ADC6
S3150001DEF001204A45664630 2D0004024000FF3C00E1
S3150001DF00302D0004720CE2680240000F3F4000060B
S3150001DF10082C0007000367047400600274012002E4
S3150001DF20ED88068000C045C4322F000648C1E58948
S3150001DF30D08120402E9023D500C02D1A082D000334
S3150001DF40000004670C08ED0000012F08EA000000013B
S3150001DF504A6F000466425245300748C0E5883207D9
S3150001DF6048C1E589068100C02D1E204120B508045F
S3150001DF7043ED00C4300748C0D080D3C0300748C045
S3150001DF80D080068000C02DDE204030913F7C00010C
S3150001DF9000044A43670289934A6F0004671252B923
S3150001DFA000C0065023F900C000FA00C0064C6010FC
S3150001DFB052B900C0066023F900C000FA00C0065C31
S3150001DFC052564BED01B20C5600086C0808140007B6
S3150001DFD06700FEEE5247E7ACBF456C080814000720
S3150001DFE06700FE8608140007664C70030837000 4B4
S3150001DFF0080067122F132F3900C02B2C610C02C4B1
S3150001E00023C000C02E3E4247700308370000C0800B7
S3150001E010671A303900C02B2202400FFF323900C087
S3150001E0202D2002410FFFB04167027E08BA46670EF6
S3150001E03008C7000260083E3C010060027E02081427
S3150001E04000006670408D4000434873 0074FEF000A3E
S3150001E05033C000A005DA4CDF7CFC4E754E714E7163
S3150001E0604E7148E7031C33C000A005DC23FCA51E46
S3150001E070BD9100C03C5C287C00C029B00814000694
S3150001E080670408D400034EB90001EABE3F3C000014
S3150001E0904EB90001ECA22F3900C03C5C61000100C1
S3150001E0A02A7C00C03C504247267C00C03D202C3CB7
S3150001E0B08000000060262F15610000E42F1D61001D
S3150001E0C00082320748C1D28137801800300748C024
S3150001E0D0D080C3F330800610001125247303900C039
S3150001E0E03C60024000FFBE4064062014C08667C63D
S3150001E0F04EB90001ECEC082C00070003660E08EC93
S3150001E1000002000360064EB900020F9E2014C0866D
S3150001E110661E4A7900C02A2A6316303900804008F3
S3150001E1200800000E670A203C00200030C09466D625
S3150001E13033C000A005DE4CDF38C04E754E714E71FE
S3150001E1404E7148E71F0033C000A005E02C2F0018D0
S3150001E150383C00FF42473A0742431606DE473F0373
S3150001E1604EB900015E688E40B744E08E52450C45BB
S3150001E17000046DE470003007D0800680000289F645
S3150001E18020403E108E44300733C000A005E24CDF2C
S3150001E19000F8205F588F4ED04E714E714E7148E790
S3150001E1A0030033C000A005E452B900C0066823F994
S3150001E1B000C000FA00C006642E2F000C4246424001
S3150001E1C010073F004EB90001ECA2E08F52460C4603
S3150001E1D000046DEA33C000A005E64CDF00C0205FF5
S3150001E1E0588F4ED04E714E714E712F0733C000A01D
S3150001E1F005E83E2F0006424010073F004EB90001D6
S3150001E200ECA2E04F424010073F004EB90001ECA2DC
S3150001E21033C000A005EA2E1F205F548F4ED04E71E9
S3150001E2204E714E7148E7000C33C000A005EC3C2F4B
S3150001E230000C720CE2680240000F72003200E589A0
S3150001E240068100C0296820412A50200D670C204F05
S3150001E2502F28000C4E952840600299CC200C33C023
S3150001E26000A005EE4CDF3000205F588F4ED04E7176
S3150001E2704E714E7148E7050033C000A005F0206FCE
S3150001E2800014226F000C42452009671C7E013205ED
S3150001E290202F0010C087670420D152455241DE87E6
S3150001E2A058890C4100206DE8300533C000A005F205
S3150001E2B04CDF00A0205F4FEF000C4ED04E714E7127
S3150001E2C04E7148E7030033C000A005F4222F001069
S3150001E2D07C007E01202F000CC087670A0801000020
S3150001E2E067028C87E289DE8766EA200633C000A0D2
S3150001E2F005F64CDF00C0205F508F4ED04E714E7137
S3150001E3004E7148E7050033C000A005F8206F000CE8
S3150001E310226F00144245200967 1C7E013205202F19
S3150001E3200010C0876704229852455241DE875889FA
S3150001E3300C4100206DE8300533C000A005FA4CDF22
S3150001E34000A0205F4FEF000C4ED04E714E714E7102
S3150001E35048E7C3FC33C000A005FC287C00804000D0
S3150001E36008AC0007007B2A7C00C029B0247C00C0D1
S3150001E3702A2A082D0004000367542 67C00C02A2897
S3150001E38013B052651CB052663C0815000167286F
S3150001E390081500006708044 0000C368060045D40E3
S3150001E3A036807000301306800 0C02A2C2040195098
S3150001E3B000A352536000017819 7C000000A336BC0B
S3150001E3C000F06000016A610008886000015E082DA6
S3150001E3D00005000167146100071A08ED0005000336
S3150001E3E008AD0C050001600001460 82D0005000387
S3150001E3F067200C5200F0671008AD0005000308ED18
S3150001E400000400036000012819 7C000000A36000DD
S3150001E410011E082D00040001671A082D00000003E3
S3150001E42067046 1000BBA610008E208AD000400014F
S3150001E4300600000FC267C00C02960082D0002000156
S3150001E440671A4253082D0002000367 0000E26100CB
S3150001E4500 0AA60295FFFBFFFB600000D4082D00020F
S3150001E4600003670E61000A9008AD00020003600018
S3150001E47000BE082D0000000036700 00B00839000047
S3150001E48000C029FF660E0839000300C029FF660493
S3150001E490424760084247 1E3900C029CF4240102C2E
S3150001E4A0007A0240000F4241123900C029ECD247DE
S3150001E4B0CB041671408AD0000000308ED0002000139
S3150001E4C008ED00020003606642461C3900C029CFF0
S3150001E4D0207C000291C01E30600048876044525380
S3150001E4E00C5302006D024253301348C0E588068082
S3150001E4F000C021382A4041EC00803007 48C0D08056
S3150001E500D1C03A9041EC0090300748C0D080D1C0CC
S3150001E5103B500002207C000291C410306000488 00C
S3150001E520DE400C4700086DB66004610007DE4A79DB
S3150001E53000C04554660833FC000100C0455433C091
S3150001E54000A005FE4CDF3FC34E734E714E714E71F6
S3150001E55048E7033E33C000A00600598F267C00C061
S3150001E56029B0247C00C029622C3C20000000201325
S3150001E570C0866700037 62A7C00C029AC4A956700ED
S3150001E580036A539560003645252 0C5202006D02F5
S3150001E59042524A3900C02D186315523900C02D194E
S3150001E5A00C39000700C02D196306423900C02D1928
S3150001E5B02C7C00C021383012 48C0E588D08E2A4014
S3150001E5C070F8D052024001FF48C0E588D08E28403D
S3150001E5D03015905433C000C02958302D0002906C7C
S3150001E5E000233C00C0295A30127200123900C02D
S3150001E5F029CF0681000291C82041121048819 0411D
S3150001E60024001FF48C0E588D08E2840301590545D
S3150001E61033C000C0295C302D0002906C000233C0EB
S3150001E62000C0295E227C00C02130207C00C021343C
S3150001E63042803 03900C0295C6C024440D191C0C08F
S3150001E640D19042803 03900C0295E6C024440D1919C
S3150001E650C0C0D190082B000000026750082B0003B0
S3150001E66000016708 3E3900C0295C60063E3900C0DA
S3150001E67029582A7C00C029657000 1015E988068092
S3150001E68000C03E327207C25248C1D281D0812040B9
S3150001E69030877007C02A00010C000007660E52156C
S3150001E6A00C15004065060293FFF7FEFF700FC02AA6
S3150001E6B0001667A203900C02134E88823C000C0F1
S3150001E6C02A1E2A7C00C02A1A203900C02130E88877
S3150001E6D03A804A40631A203900C02A1E7200321558
S3150001E6E04EB9000253E0D081E28833C000C02A1C33
S3150001E6F042B900C0213442B900C0213008390001B5
S3150001E70000C02A236728303900C02A1CD0403E00A9
S3150001E7102A7C00C029DE3B47000A3B47000C33ED4B
S3150001E720000A008040A833ED000C008040AA700763
S3150001E730C0523200C3FC01B2068100C02ECC2A4170
S3150001E740287C00C02D142C7C00C02D0E2013C08601
S3150001E75067000098 2015E2882A807007C03900C03A
S3150001E76029631B4001304A7900C029586F040BD536

S3150001E77000070C95A51E8D9166185239000C02D18CB
S3150001E780103900C02D185300661633D200C02D165D
S3150001E790600E4A3900C02D18630608ED0001012FED
S3150001E7A04A3900C02D18630001420C39000700C028
S3150001E7B02D196600013608930005700l2C804279F7
S3150001E7C000C02D1242544A3900C02D1852C04400CF
S3150001E7D048800240000lEF4808B9000700C02A231B
S3150001E7E0817900C02A22600001024A96674A0C9686
S3150001E7F000000001660A70003014E58842B508047D
S3150001E8004A7900C029586F0C221670003014E58829
S3150001E81083B508040C39000700C02D19660000CC29
S3150001E8202016D0802C804A80660000C033FC00018F
S3150001E83000C02D12600000B44A7900C02D12670095
S3150001E84000A80C79000100C02D12660E41ED00C42E
S3150001E85070003014D080D1C042504A7900C0295886
S3150001E8606F14303900C02D1241ED00C4720032140C
S3150001E870D281D1C18150081300016734081300000 9
S3150001E880652E2F2D00044EB90001E142322D00C43F
S3150001E890B240661C202D0004B0B900C02B286610BA
S3150001E8A0301248C0E588068000C03E1220405290D2
S3150001E8B00C39000700C02D196630E3F900C02D128E
S3150001E8C0662870012C8008130001671008130000E8
S3150001E8D06618D1B900C03E0E4254600E525430142F
S3150001E8E053400C400028650 28D93303900080400862
S3150001E8F00800000E6714082B000000003670C301295
S3150001E900B07900C029606600FC80588F33C000A032
S3150001E91006024CDF7CC04E754E714E714E712F0D45
S3150001E92033C000A006042A7C00C029A80C550005A6
S3150001E930640808F9000700C029B04A55632A5355EF
S3150001E9404A5563124A7900C04552661C33FC0001E0
S3150001E95000C04552601242A73F3C00003F3C001DEB
S3150001E9604EB90000717 44E4033C000A006062A5FFE
S3150001E9704E754E714E714E7133C000A0060833C0FC
S3150001E98000A0060A4E754E714E714E7133C000A03D
S3150001E990060C227C00C077F222BC00C07BF62C5117
S3150001E9A0213C0001D14E228890FC002C228833C0E4
S3150001E9B000A0060E4E754E714E714E7133C000A009
S3150001E9C0061033C000A006124E754E714E714E717F
S3150001E9D033C000A0061408B900020080407B02394A
S3150001E9E0003F008040A208F90007008040A208F914
S3150001E9F000020080407B33C000A006164E754E71A2
S3150001EA004E714E7148E7011C33C000A006182A7CDE
S3150001EA1000C029B5287C00C029B4267C00C0433239
S3150001EA201014B015671C227C00C029B642411200A1
S3150001EA303001C0FC004CD08B2040701220D951C847
S3150001EA40FFFC7E001E152007D080D087E788068050
S3150001EA5000E00520224042401015320 0C2FC004C65
S3150001EA60D28B2041700520D951C8FFFC42401015B8
S3150001EA703200C2FC004CD28B2241207C00C029B658
S3150001EA80701220D951C8FFFC1895700FC0140239B5
S3150001EA9000F000C02B31813900C02B31610003E841
S3150001EAA0203900C000FA90B900C029C833C000A0BF
S3150001EAB0061A4CDF38804E754E714E714E7133C059
S3150001EAC000A0061C6100053C427900C02A26427955
S3150001EAD000C02A2833FC00F000C02A2A08F90005E4
S3150001EAE000C029B133C000A0061E4E754E714E718D
S3150001EAF04E7148E7011833C000A00620267C00C0ED
S3150001EB002A00103900C029FC1213E80902010003 8A
S3150001EB10D0010200000F021300F0811333F900C087
S3150001EB2029FE0080404A287C00C029EE33EC00040F
S3150001EB300080407C33EC00060080407E303C03FFC1
S3150001EB40C06C00080279FC00008040788179008061
S3150001EB50407833EC000A008040A833EC000C0080BA
S3150001EB6040AA43EC000F1011EA0802000001424 1DD
S3150001EB7012000241000102 79FFFE008040A4837960
S3150001EB8000080 40A41011E808020000014241120071
S3150001EB9002410001E9490279FFEF008040A483792F
S3150001EBA0008040A41011E2080200000102000001E9
S3150001EBB0D00008B90001008C0407B81390080407B8C
S3150001EBC0103900C029FC1213E80902010003D00123
S3150001EBD013C00080407A227C008040A21013EC080A
S3150001EBE00200000302000003ED080211003F81113B
S3150001EBF0207900C04590302800020800000C670407
S3150001EC007E0360027E027003C007ED080211003F19
S3150001EC1081111013E80802000003020000 03E9084D
S3150001EC20021100CF811110130200000F0200000F24
S3150001EC30021100F0811108F900000080407B33C009
S3150001EC4000A006224CDF18804E754E714E714E7132
S3150001EC5033C000A00624023900 3F008040A208F913
S3150001EC6000007008040A20279FC000080407800790C
S3150001EC700064008040781 3FC00020080407A08B9E5
S3150001EC8000000080407B08B9000400C029B3427926
S3150001EC9000C02A2A33C000A006264E754E714E7159
S3150001ECA04E7133C000A00628227C00C02A260C51D2
S3150001ECB000EF641270003011068000C02A2C20403B
S3150001ECC010AF00055251227C00C029B0082900046A
S3150001ECD000036606 08E90005000133C000A0062A04
S3150001ECE0205F548F4ED04E714E714E7133C000A0CD
S3150001ECF0062C33F900C02A2600C02A2A33C000A0F8
S3150001ED00062E4E754E714E714E7133C000A00630FF
S3150001ED10227C00C029B0203C00018000C091661011
S3150001ED200279FC000080407800790064008040781 8
S3150001ED3008B900000080407B08B90001008040 7BD3
S3150001ED4013FC00020080407A33F9000291CC008066
S3150001ED50404A08E9000200010079400000804008AD
S3150001ED6033C000A006324E754E714E714E7148E7A2
S3150001ED70011833C0C0A00634267C00C029FE33D317
S3150001ED800080404A207C0080407B08900000287C5F
S3150001ED9000C029DE33EC00040080407C33EC000621
S3150001EDA00080407E303C03FFC06C00080279FC0005
S3150001EDB0008C407881790080407833EC000A008039
S3150001EDC040A833EC000C008040AA43EC000F101160
S3150001EDD0EA08020000014241120002410001 0279E3
S3150001EDE0FFFE008040A48379008040A41011E8084A
S3150001EDF0020000014241120002410001E949027983
S3150001EE00FFEF008040A48379008040A41011E2083E
S3150001EE1002000001020000 01D0000890001 8110EB
S3150001EE20082B00000001660C082B00030001660494
S3150001EE3042076006 1E3900C029CF103900C029ECEF
S3150001EE40D00713C00080407A103900C029CE0200D5
S3150001EE50000102000001E70808900003811 0700F0D
S3150001EE60C03900C029D1023900F000804062813 9E1
S3150001EE700080406233C000A006364CDF18804E7514
S3150001EE804E714E714E7133C000A006387003C03901
S3150001EE9000C029C7E908023900CF008040628139E4
S3150001EEA000080406213F900C029C6008040634241D8
S3150001EEB0300148C0D080068000C029B6224030010A
S3150001EEC048C0D08006800080406420403091227C7A
S3150001EED000C029BE207C0080406C11B110001000DA
S3150001EEE052410C4100046DC833C000A0063A4E756C
S3150001EEF04E714E714E7133C000A0063C61886100AF
S3150001EF00FE6E3039008040A40800000057C044005E
S3150001EF1048800240000102 79FFFE00C02A22817961
S3150001EF2000C02A2208B9000400 80407B0839000489
S3150001EF3000C02A2367084EB90001BE26600833FCCB
S3150001EF400000100C0212E423900C02965427900C066
S3150001EF50296242 3900C02D1833FCFFFF00C02D166F
S3150001EF60427900C02D1442B900C02D0E427900C06D
S3150001EF702D1208B9000700C02A2308F9000000C0B5
S3150001EF80029B333C C00A0063E4E754E714E714E71C7
S3150001EF902F0D33C000A00640610000942A7C00C0FA
S3150001EFA029B00095001000046015303900 80400831
S3150001EFB00800000E66046100FD524EB900020F9E64
S3150001EFC0082D0002000367060815000767DC33C039
S3150001EFD000A006422A5F4E754E714E714E7133C0C6
S3150001EFE000A0064408B9000700C02A2308B900009A
S3150001EFF000C029B333C000A006464E754E714E714E
S3150001F0004E7133C000A006480C39000200C020DA58
S3150001F010660E7000103900C02B3023C000C020DE00
S3150001F02033C000A0064A4E754E714E714E7133C003
S3150001F03000A0064C0C39000200C020DA661E103909
S3150001F04000C02B31E808020 0000F424112000241C4
S3150001F050 0003ED4948C123C100C020DE33C000A032
S3150001F060064E4E754E714E714E7148E70F3E33C0D6
S3150001F07000A006504FEFFF9A422F001E427900C0B2
S3150001F0802A162F7C000000000324247267C00022F
S3150001F090959C2A7C000295A04A4767700C4700019F
S3150001F0A06704284B6002284D303CFFFFD0477C00A7
S3150001F0B03C00207C00C029BE424010306800207C04
S3150001F0C000C029C242411230680090414 86F0012C7

S3150001F0D048C04EB900023A282F0C486F0016486FF7
S3150001F0E000164EB9000217D2486F000E41EF0036E6
S3150001F0F02006E588D1C02F0841EF003A700030079D
S3150001F100E588D1C02F084EB90002177E52470C4739
S3150001F11000056584600064EB90001B0F20C7900085D
S3150001F12000C02A1665F04BEF002E303900C02A18B0
S3150001F1302F0D02800000FFFF4EB900023A48203928
S3150001F14000C04572E888486F00104EB900023A487F
S3150001F150486F0010486F00324EB90002150C42404C
S3150001F160103900C02A2544405840486F000E48C057
S3150001F1704EB900023A28204F2F28000E2F3C3FACF3
S3150001F180CCCD43EF001C4EB900023218486F001473
S3150001F190486F00324EB9000215304247486F0042AF
S3150001F1A041EF003670003007E588D1C02F08486F5F
S3150001F1B000184EB9000217A64879000295A4486FB7
S3150001F1C00014486F00144EB9000217E8204F2F288B
S3150001F1D0000C2F3C4120000043EF001C4EB9002F9
S3150001F1E03218486F0014486F003241EF0026700054
S3150001F1F03007E588D1C02F084EB9000217D2524711
S3150001F2000C47000465962E3C80000000287C00C057
S3150001F21029B0247C000222924A3900C01EFC676094
S3150001F2208F9448790002FF3D4E92588F60064EB981
S3150001F2300001B0F22014C08766F4203900C01F8A8D
S3150001F2407203B0816234D040303B00064EFB0002AF
S3150001F25000080010002400 1E08AC00070003601A15
S3150001F26008EC0007000308AC00060003600C08EC7C
S3150001F270C0030003009400000C008EC0004000134
S3150001F2802C7C00C029DE082C00070003660000B0C4D
S3150001F2902A7C00C02B1C4A3900C01EE26716700F7B
S3150001F2A0C07900C01F24720CE368026D0FFF0004D1
S3150001F2B0816D00044A3900C01EE367302B7900C016
S3150001F2C01F2600083F3900C01F284EB900018EF6DF
S3150001F2D002400FFF026DF0000006816D0006302D21
S3150001F2E0000602400FFF33C000E0051E4A3900C088
S3150001F2F01EE46722303C0FFFC07900C01F2C026D4F
S3150001F300F0000006816D0006302D000602400FFF59
S3150001F31033C000E0051E4A3900C01EE567082B7997
S3150001F32000C01F2E000C4A3900C01F0567082B7943
S3150001F33000C01FAE00104A3900C01EE66716700FE6
S3150001F340C07900C01F34720CE368026D0FFF00061E
S3150001F350816D00064A3900C01EEC67081B7900C0A2
S3150001F3601F4D00164A3900C01EED67081B7900C003
S3150001F3701F5100174A3900C01EEE670E1B7900C0E7
S3150001F3801F5500144EB90001F0024A3900C01EEFA4
S3150001F390671A700FC03900C01F59E908022D000F06
S3150001F3A00015812D00154EB90001F02E4A3900C015
S3150001F3B01EFF67181 03C00FFD03900C01F990200DC
S3150001F3C0000F022D00F00015812D00152A7C00C0CA
S3150001F3D01EEB4A3900C01EEA6716303CFFFFD079A2
S3150001F3E000C01F4412154881 48C1E9893D801808AB
S3150001F3F04A3900C01EE767101015488048C0E988E1
S3150001F4002DB900C01F3608004A15667C4A3900C06E
S3150001F4101EE766084A3900C01EEA676C1215488164
S3150001F42048C1E98930361808524048 6F00120280F7
S3150001F4300000FFFF4EB900023A48486F00124879B2
S3150001F440000295A8486F00524EB9000217E84879A4
S3150001F450000295AC486F004E486F001C4EB9000281
S3150001F46017E8486F00142F0E4EB9000218164A40CD
S3150001F4705DC0440048800200000108B9000000C0D8
S3150001F48029CE813900C029CE4A3900C01EE867005D
S3150001F49000E41215488148C1E98930361808524 0FE
S3150001F4A0486F001202800000FFFF4EB900023A4881
S3150001F4B0486F00124879000295A8486F00524EB96C
S3150001F4C0000217E84A156708267C000295B0601805
S3150001F4D04879000295AC486F004E486F00564EB908
S3150001F4E0000217E847EF004E2F0B1015488048C061
S3150001F4F0E98848760800486F00144EB90002177E65
S3150001F500204F2F28000C43EF00144EB9000241E0B2
S3150001F5103F3C0014487900C01F3A486F0016486FF7
S3150001F52000164EB90002177E486F004C486F001254
S3150001F530486F00124EB9000217E8204F2F28000A23
S3150001F54043EF001A4EB900024258487900029 5B4B9
S3150001F550486F0018486F00184EB90002177E486FB1
S3150001F56000104EB90002455E1215488148C1E9896D
S3150001F5703D8018064A3900C01EE9670000E41215ED
S3150001F580488148C1E989303618085240486F00124F
S3150001F59002800000FFFF4EB900023A48486F001290
S3150001F5A04879000295A8486F00524EB9000217E843
S3150001F5B04A156708267C000295B060184879000252
S3150001F5C0295AC486F004E486F005A4EB9000217E8D5
S3150001F5D047EF00522F0B1015488048C0E98848763E
S3150001F5E00800486F00144EB90002177E204F2F28DD
S3150001F5F0000C43EF00144EB9000241E03F3C0014F9
S3150001F600487900C01F3E486F0016486F00164EB974
S3150001F6100002177E486F004C486F0012486F0012B7
S3150001F6204EB9000217E8204F2F28000A43EF001AAF
S3150001F6304EB90002425848790002 95B4486F001845
S3150001F640486F00184EB90002177E486F00104EB978
S3150001F6500002455E1215488148C1E9893D801804BA
S3150001F6604A3900C01F00671A4A15670C13F900C012
S3150001F6701F9D00C029FC600A13F900C01F9D00C030
S3150001F68029EC4A3900C01F0167284A15671A700319
S3150001F690C03900C01FA1E908023900CF00C02A0005
S3150001F6A0813900C02A00600A13F900C01FA100C0F9
S3150001F6B029CF4A3900C01F096700028E4A3900C0A6
S3150001F6C01F0B6700009C264E203900C01FBE5380C9
S3150001F6D07208B08162000C8AD040303B00064EFBC2
S3150001F6E0000200120012001200120012002A0036004029
S3150001F6F0004A0070203900C01FBE5380068000C03A
S3150001F70029BE204010B900C01FC9605413F900C0BA
S3150001F7101FC900C029D16048377900C01FC8000A37
S3150001F720603E377900C01FC8000C6034302B0004DE
S3150001F730D06B0006E2483C003006907900C01FC835
S3150001F74037400006303900C01FC8D0463740000494
S3150001F750600E700FC03900C01FC913C000C029D088
S3150001F7604A3900C01F0A6700012E267C00C01FC44B
S3150001F770203900C01FBE53807206B0816200011895
S3150001F780D040303B00064EFB0002000E000E000E7C
S3150001F79000E0050006E00BE301302400001024010
S3150001F7A00001E94808B9000400C02A23817900C094
S3150001F7B02A22082C0000000367000DC0839000437
S3150001F7C000C02A23670A4EB90001BE26600000C8A0
S3150001F7D04EB90001BE64600000BE30130240000154
S3150001F7E002400001E74808B9000300C02A238179D5
S3150001F7F000C02A22600000A03013024000010 2402E
S3150001F80000001D04008B9000100C02A23817900C057
S3150001F8102A22301302400002024000010 8B900000A
S3150001F82000C02A23817900C02A220839000100C0BC
S3150001F8301FC5670A08B9000500C029ED605808F917
S3150001F840000500C029ED604E301302400001024060
S3150001F850C001D04008B9000100C02A23817900C007
S3150001F8602A22301302400002024000010 8B90000BA
S3150001F87000C02A23817900C02A220839000100C06C
S3150001F8801FC5670A08B9000400C029ED600808F918
S3150001F890000400C029ED424670003006D080068083
S3150001F8A000C029B6224070003006D080068008054
S3150001F8B04064204030917000 3006068000C029BEA9
S3150001F8C0224070003006068000804 06C2040109176
S3150001F8D052460C45000465C033F900C029E8008091
S3150001F8E040A833F900C029EA008040AA103900C0B7
S3150001F8F029EDEA08020000014241120002410001 1D
S3150001F900279FFFE008040A48379008040A410396B
S3150001F91000C029EDE808020000014241120002413F
S3150001F9200001E9490279FFEF008040A48379008054
S3150001F93040A4700FC03900C029D1023900F00080FF
S3150001F94040628139008040624A3900C01F02675215
S3150001F950267C00C029FE4A15671A303900C01FA44B
S3150001F96002400001024000 1E54808AB0002000127
S3150001F9708153602E0839000100C01FA5670808EBF6
S3150001F980000300016006 08AB00030001303900C025
S3150001F9901FA40240000102 4000C108AB0000000163
S3150001F9A081534A3900C01F03671E103900C01FA9C1
S3150001F9BC020000001D000121 5488148C1E98908B644
S3150001F9C00001180F8136180F2A7C00C029B54A3963
S3150001F9D000C01EF767080094800200 0042154A39EC
S3150001F9E000C01EF8670A00948002000 01ABC0001DC
S3150001F9F04A3900C01EFF573E103C00FFD03900C0E7
S3150001FA001F991A80424112003001C0FC004C068049
S3150001FA1000028BE822404240101 53200C2FC004C25
S3150001FA20068100C043322041701220D951C8FFFC23

S3150001FA3008EC000600024A3900C01F0767168F94BA
S3150001FA4060064EB90001B0F22014C08766F428BCE6
S3150001FA50000080004A3900C01F0D671E082C0007F0
S3150001FA60000266168F9460064EB90001B0F22014AA
S3150001FA70C08766F40094000140004A3900C01EF1B7
S3150001FA8067168F9460064EB90001B0F22014C08744
S3150001FA9066F408EC000500024A3900C01EF267004F
S3150001FAA0008808EC0005000223FC00C042B200C039
S3150001FAB02B384A3900C01EFB663C4878002048793D
S3150001FAC000C042B24EB900001494602A3F3C000ABD
S3150001FAD04EB90001AE1A0C40FFFD671A8F944879A2
S3150001FAE00002FF4E4E92588F60064EB90001B0F2E9
S3150001FAF02014C08766F4082C0005000266CE4A79F8
S3150001FB0000C02E4867063F3C000260123F3C0001E0
S3150001FB10487900C03C5C610012463F3C00004879D0
S3150001FB2000C02D1A61001238103900C01EF348803A
S3150001FB30123900C01EF448818041677C8F946006AB
S3150001FB404EB90001B0F22014C08766F44A3900C0EC
S3150001FB501EF467047C0460027C002C3900C01F6625
S3150001FB60D0867207B0816250D040303B00064EFB12
S3150001FB70000200100018002000280030000300 03874
S3150001FB800004000940200100060 2E00940200120052
S3150001FB906026009402001400601E00940300140005
S3150001FBA0601608EC00030002600E009402000800D3
S3150001FBB06006009403000800 4A3900C01EF567007C
S3150001FBC001C23039008040080 8C0000E670001B408
S3150001FBD0082C00000003670001AA08140001670051
S3150001FBE001A24A3900C01EE56714227C000289522F
S3150001FBF0207C00C03E0E700820D951C8FFFC487910
S3150001FC000002FF564E92588F267C00C02D166000CA
S3150001FC10015820390 0C000FAB085670001462A0064
S3150001FC20C839000700C02A2367081F7C00560019FF
S3150001FC3060061F7C00200019083900 0600C02A232F
S3150001FC4067081F7C0043001A60061F7C0020001A0B
S3150001FC5008390000 00C02A2267081F7C0053001BD8
S3150001FC6060061F7C0020001B08390005 00C02A23FE
S3150001FC7067081F7C0042001C60061F7C0059001C9F
S3150001FC802A4E2F3900C03E0E4240103900C02D18B1
S3150001FC903F004A536E063F3CFFFF60067007C053A4
S3150001FCA03F003F3900C02A12302D0004906D000636
S3150001FCB0E2483F003039008040A4080000 01660C8C
S3150001FCC03039008040A40800000267063F3C002A44
S3150001FCD060043F3C00203F2D000A3039008040 4A35
S3150001FCE0080000 0667063F3C002A60043F3C0020EE
S3150001FCF04240103900C029D13F00486F002D4240D3
S3150001FD00103900C029BF3F0042401039 0CC029BE4A
S3150001FD103F0048790002FFB44E924FEF00200839A8
S3150001FD20000300C02A236606427900C02A12424611
S3150001FD3070003006E588068000C03E1220402F1074
S3150001FD4048790002FFDE4E92508F52460C4600085B
S3150001FD5065DE0279FFBF0080404A0279FFFD00801F
S3150001FD6040A44EB90001B0F22F39000262B24EB979
S3150001FD700000379A0C40FFFF66082014C087670011
S3150001FD80FE924A3900C01F0F67108F9460064EB964
S3150001FD900001B0F22014C08766F44A3900C01EF291
S3150001FDA06600018C42472A7C00C000FE100648808E
S3150001FDB042411215B04167041C1552474EB9000164
S3150001FDC0B0F20C470004 65E4082C00070003660C3A
S3150001FDD048790002FFE34E92588F602E082C0006E8
S3150001FDE0000367047C0160024246082C00030003FD
S3150001FDF067047E0160024247300652 40D0473F0009
S3150001FE0048790002FFF14E925C8F3039008040083C
S3150001FE100800000E675C203C00200030C094675249
S3150001FE20303C2080C06C0002670A4879000300025A
S3150001FE30600000BE082C00020002671C082C0001AD
S3150001FE4000002670A48790003001960000 0A4487996
S3150001FE5000030038600 0009A082C00010002670ABE
S3150001FE60487900030051600008848790003006C5E
S3150001FE70607E082C0007000267084879000300 87A6
S3150001FE80606E082C0000000167084879000300 9A9B
S3150001FE90605E303900804008080000 0E674C082C6F
S3150001FEA0000000036744081400016708487900034D
S3150001FEB000AD603C081400056718082C0007000314
S3150001FEC067084879000300C460264879000300E307
S3150001FED0601E082C00070003670848790003 01012A
S3150001FEE0600E487900030121600648790003 01404C
S3150001FEF04E924240103900C029B452403F00487921
S3150001FF00000301 4B4E924FEF000A082C0007000137
S3150001FF10670A48790003015C4E92588F082C000647
S3150001FF2000 01670A487900030 1764E92588F267CB4
S3150001FF3000 0C00E924A3900C01EF9670000C82F138F
S3150001FF404879000301944E924240103900C029ECD1
S3150001FF5055403F002F1343EF00224EB9000242588D
S3150001FF60204F2F28001C48790003 01AF4E924240D2
S3150001FF7010390CC029FC55403F002F1343EF002ADA
S3150001FF804EB9000242582 04F2F28002448790003 19
S3150001FF9001C94E922039008040744 86F002C4EB939
S3150001FFA000023A28487900029 5B8486F0030486F38
S3150001FFB000304EB9000217E8204F2F2800284879 53
S3150001FFC0000301E44E922F3900C0211C4879000339
S3150001FFD001F84E923F3C0202F3900C021202F39D5
S3150001FFE000C0211C43EF00424EB9000197A6204FE5
S3150001FFF02F28003C2F2800384879000302 0D4E9225
S315000200004FEF00344A3900C01F08670004C248791E
S31500020010000 3022B4E92204F2F280022 4879C0031C
S3150002002002654E924FEF000C0839000700C02A23E1
S31500020030670 81F7C005600196006 1F7C0020001905
S315000200400839000600C02A2367081F7C0043001AED
S3150002005060061F7C0020001A083900000 0C02A2210
S3150002006067081F7C0053001B60061F7C0020001BD4
S315000200700839000500C02A2367081F7C0042001CBD
S3150002008060061F7C0059001C7E010839000400C06E
S3150002009002A236706486F00196006487900 03029A08
S315000200A03F07303CFFFFD047720032 00068100C096
S315000200B029BE2041424010103F0041EF003A303C39
S315000200C0FFFFD047720032 00E589D1C12F0841EF08
S315000200D0003E70003007E588D1C02F08486F002423
S315000200E04EB9000217A6204F2F28001C41EF002A06
S315000200F070003007E588D1C02F103F07487900030A
S3150002010002754E924FEF001652470C47000 56500E6
S31500020110FF7A2A4E3039008040 4A08000000 66708F6
S315000201204879000302C6600648790003 02CA083904
S315000201300003 00C02A2367063F3C005960043F3C87
S315000201400004E42401C3900C029D13F0070001039DC
S31500020150000C029D1D080068 0000291A020403F1025
S3150002016003F3900C02A1248790003029F4E924FEF90
S3150002017000010083900 0300C02A236606427900C02F
S3150002018002A123039008040A4080000026708487924
S3150002019000030 2F8600648790003 02FC08390005EC
S315000201A000C029ED67063F3C004E60043F3C005903
S315000201B00839C00100C02A2367063F3C0059600443
S315000201C03F3C004E3F2D000A302D000A486F001EAC
S315000201D002800000FFFF4EB900023A48303900C0E3
S315000201E0295C486F001A48C04EB900023A2848797D
S315000201F0000295BC486F001E486F001E4EB90002F1
S3150002020017D2486F001E486F001A486F001A4EB97F
S31500020210000217E8204F2F2800123F3900C0295C40
S315000202204879000302CD4E923039008040A408007E
S31500020230000667084879000 3032A60064879000326
S315000202400032E082D0004000F67063F3C004E600493
S3150002025 03F3C0059083900 0100C02A2367063F3C8B
S31500020260005960043F3C004E3F2D000C302D000C1F
S31500020270486F003202800000FFFF4EB900023A4882
S31500020280303900C0295E486F002E48C04EB90002C0
S3150002029003A284879000295BC486F0032486F00320E
S315000202A04EB9000217D2486F0032486F002E486FCF
S315000202B0002E4EB9000217E8204F2F2800263F399C
S315000202C000C0295E4879000302FF4E92203900C021
S315000202D02A1E486F003C4EB900023A48204F2F288A
S315000202E0003C43EF00724EB90002351 0302D000477
S315000202F0906D0006E2483E00302D00085240486FDD
S315000203000003A02800000FFFF4EB900023A48486FE9
S315000203100003A4879000295A8486F007A4EB9000261
S3150002032017E83F07302D0006D06D0004E2483F0073
S3150002033048790003 03314E924240102D000E5B4075
S3150002034003F002F1343EF004A4EB9000242584 24083
S315000203500103900C029D03F00103900C029D0486F93
S315000203600004202800000 00FF4EB900023A48486F80
S3150002037000046486F0046486F00464EB9000217D243
S31500020380204F2F28003E4879000303444E9230390D

S315000203900008040A408000001670848790003036D45
S315000203A0600648790003037I3F3900C0295848792D
S315000203B00003C35B4E924FEF00443039008040A4A5
S315000203C00800005670848790003038650064879 35
S315000203D00003038A3F3900C0295A4879000303748F
S315000203E04E923F3900C02A1C3F3900C02A1A204FBC
S315000203F02F2800544879000303BD4E924240102D57
S31500020400000E5B403F002F1343EF00304EB900024F
S31500020410425830 2D000A486F002602800000FFFF76
S315000204204EB900023A483007486F002048C04EB91C
S31500020430000023A28486F0026486F0024486F0024BD
S315000204404EB9000217E8204F2F28001C486F0060A3
S31500020450487900 0295C0486F00324EB9000217E88B
S315000204601039 00C029D0486F0026028000000 0FF24
S315000204704EB900023A48486F002E486F002A486F6C
S31500020480002A4EB9000217D2486F0064486F002650
S3150002049 0486F00264EB9000217E8486F002A486FD7
S315000204A00022486F00224EB9000217D2204F2F2891
S315000204B0001A4879000303A54E924FEF00220279F3
S315000204C0FFBF0080404A0279FFFD008040A44A39FE
S315000204D000C01F04670003DE4A3900C01EF2660030
S315000204E0031E4A3900C01EF46600 03140C390003C9
S315000204F000C020226362203C0001800CC09467583D
S31500020500303900 80406A024000FF3F00303900 80E7
S31500020510406802 4000FF3F003039008040660240DA
S315000205200 0FF3F0030390080406402 4000FF3F0078
S31500020530424010390080406 33F00303900804064F9
S31500020540E0480240000F3F004879000303BB4E9289
S315000205504FEF00106000035E303900C01CA2907994
S31500020560 00C01CA8907900C029CC486F00120280F6
S315000205700000FFFF4EB900023A484879000295C4CE
S315000205800486F0016486F00164EB9000217D2204F6B
S3150002059 02F28000E48790 00303EB4E924879000398
S315000205A0042B4E92203900C000FA90B900C029C827
S315000205B02F003F3C00544EB900000F2C4240103928
S315000205C000C029C73F0048790003043C4E924240CE
S315000205D0103900C029C63F004879000304544E92E0
S315000205E0487900 03046F4E924FEF001C1C3C00FF3B
S315000205F042054 2472F7C0002959C005A2F7C00023E
S315000206 0095A0005E2F7C0002959C00622C7C000265
S31500020610 95A04A4757 05266F00626002264E4A4741
S315000206206 7062A6F005A60042A6F005E7000300760
S315000206300068000C029C22040424010104440 0640B5
S31500020640001F486F001248C04EB900023A282F0B0D
S3150002065 0486F0016486F00164EB9000217D2204F97
S3150002066 02F28000E70003007068000C029BE2040E9
S315000206704240101044400640001F486F001648C012
S315000206804EB900023A282F0D486F001A486F001A19
S315000206904EB9000217D2204F2F28001270003C07E1
S315000206A0068000C029C220404240101 03F00700060
S315000206B03007068000C029BE2040424010103F008D
S315000206C070003007D080068000C029B620403 01066
S315000206D0024000FF3F0070003007D080068000C055
S315000206E029B620403010E0480240000F3F00300794
S315000206F052403F004879000304A64E924FEF00167F
S31500020700424010067200 3207D281068100C029B625
S315000207102041321002 4100FFB0416316700 03007DB
S31500020720D080068000C029B620403010024000FF6B
S315000207303C00424010057200 3207D281068100C099
S31500020740 29B6204132100241 00FFB041641670 0002
S3150002075 03007D080068000C029B620403010024003
S31500020760 00FF3A0052470C4700046500FEA548798E
S31500020770000304C94E92588F2A7C00C044704A5521
S31500020780670 8082C00070002670848790 00304DF9F
S31500020790 6054082C000000016708487900 0304F140
S315000207A06044301553400C4000046242D040303B56
S315000207B000064EFB0002000A0012001A0022002A5E
S315000207C04879000303503601E4879000305086016 90
S315000207D0487900030 51C600E48790003052A600665
S315000207E04879000305394E92588F600000C83F15BC
S315000207F04879000305464E925C8F600000B8303996
S31500020800008040080800000E670000AA082C0000BD
S31500020810000367000 0A04A3900C01EF2670808EC10
S3150002082000010003600608EC000000024A3900C01D
S315000208301F0E670608EC00030001423900C0296555
S315000208406 0064EB90001B0F2303C0102C06C0002F3
S31500020850671 22F39000262B24EB90000379A0C4075
S31500020860FFFF67DE0294FFFFFEFD48790003055C89
S315000208704E92588F42464879000305974E92588FFA
S3150002088042477000 3006E988068000C03E32720098
S315000208903207D281D08120403F10487900 03059A61
S315000208A04E925C8F52470C47000865D652460C465C
S315000208B0004065C24A3900C01EFA670003D04240B2
S315000208C0103900C029B452403F004879000305 9F01
S315000208D04E924879000305B84E924FEF000A424500
S315000208E02F7C000295B000624A456716303CFFFF36
S315000208F0D0453200C2FC004C068100028BE826413C
S315000209006 006267C00C029B642474BEB0028302DF4
S315000209100 00852404 86F0006028 00000FFFF4EB9F1
S315000209200 00023A48486F00064879000295A8486FC7
S315000209300 00524EB9000217E8082D0004000F672680
S315000209404A476708487900030659603E083900019C
S315000209500 00C02A2367084879000 3065E602C48799E
S31500020960000306 636024 4A4767084879000306685D
S315000209706018083900 0100C02A2367084879000375
S31500020980066D6006487900030671082D0005000F02
S31500020990 67264A47670848790003063C603E0839DD
S315000209A000 0100C02A23670848790003064160 2C2B
S315000209B048790003064660244A476708487900 03D7
S315000209C0064B6018083900 0100C02A2367084879D7
S315000209D000030650600648790003065 4082D0001FC
S315000209E0000F67084879000306346006487900 0359
S315000209F006384A4767063F3C005860043F3C0052AF
S31500020A003F0548790003061E4E92302D00085240DB
S31500020A103F0048790003 06764E924A47670E302B0E
S31500020A20 0048E44802400 0013F00601A082B000318
S31500020A3000 4967047C026002424 6302B00480240AD
S31500020A40 0001D0463F0048790003067B4E924A4792
S31500020A506714102B004AE80802000 0037201E169DC
S31500020A6030013F006020082B000 0049660E082B6B
S31500020A70000300496 6063F3C0000600A7001122B23
S31500020A80 0019E3683F0048790003068 04E92382D2C
S31500020A9000 043F3CFFEC3004486F002E0280000049
S31500020AA0FFFF4EB900023A48204F2F28002E43EF8F
S31500020AB000 0404EB90002425 8486F003A486F0C742F
S31500020AC0486F00364EB9000217D2204F2F28002E4B
S31500020AD048790003068 84E923C2D00063F3CFFEC07
S31500020AE03006486F003602800000FFFF4EB9000252
S31500020AF03A48204F2F28003643EF00484EB90002ED
S31500020B004258486F0042486F007C486F003E4EB91B
S31500020B10000217D2204F2F2800364879000 3068F8D
S31500020B204E923F3CFFFE204F2F28008243EF00509B
S31500020B304EB900024258204F2F28004A4879000336
S31500020B40 06964E923F3CFFEC30049046486F0046B4
S31500020B5048C04EB900023A28204F2F28004643EFDC
S31500020B600584EB900024258486F0052486F008C36
S31500020B70486F004E4EB9000217D2204F2F2800466A
S31500020B804879000 3069E4E924FEF00463F3CFFEB2C
S31500020B903004D046486F000402800000FFFF4EB9C1
S31500020BA00 0023A48204F2F28000443EF000E4EB9A8
S31500020BB0000242584A4767062C6F00626046082BBD
S31500020BC000000018671E3F3CFFFE204F2F28004CF6
S31500020BD00A17008043EF00164EB9000 2425843EF4F
S31500020BE000106018 3F3CFFFE204F2F28004C43EFB9
S31500020BF000124EB90002425843EF000C2F51005624
S31500020C004DEF0056486F0008486F004E486F000CC3
S31500020C104EB9000217D22F0E486F0008486F00081F
S31500020C204EB90002177E204F2F104879000306A501
S31500020C304E922F15487900030 6AC4E924240102D73
S31500020C400000E3F002F3C3E8000 0043EF001E4EB9CF
S31500020C500002425 8204F2F2800184879000306B395
S31500020C604E924FEF00184A45660A48790003 06BAC3
S31500020C704E92588F4BED001052470C47000265000A
S31500020C80FC8E52450C4500046300FC5E4A3900C0E6
S31500020C901F0E67624A3900C01EF4665A082C000706
S31500020CA000003660E3F3C0001487900C03C5C6100CF
S31500020CB000AE42472A7C00C02ECC4A47660E082C5C
S31500020CC000070003670 63F3C000160043F3C00004A
S31500020CD02F0D6100008A52474BED01B20C47000806
S31500020CE06DD8082C000700003670C3F3C00004879CA

S31500020CF000C03C5C61684A3900C01EF66748487904
S31500020D00000306C94E924879000306F14E924879CD
S31500020D1000C02B1C610002044879000C02B30610020
S31500020D20019048790003 06FD4E924FEF000C3F3CBE
S31500020D300001487900C03C5C61243F3C00004879D0
S31500020D4000C02D1A611842404FEF006633C000A062
S31500020D5006524CDF7CF04E754E714E714E7148E76D
S31500020D60030C33C000A00654287C000222922A6F8C
S31500020D7000143E2F00180807000067244879000374
S31500020D8007004E94588F08070002670A4879000345
S31500020D9007564E94588F48790003076 24E94588F2F
S31500020DA048790003076A4E94588F080700016708BE
S31500020DB0082D0001012F66402F2D01243F2D012E03
S31500020DC03F2D00CA2F2D00103F2D00C82F2D000CDD
S31500020DD03F2D00C62F2D00083F2D00C42F2D0004E5
S31500020DE02F154240102D01303F0048790003076D50
S31500020DF04E944FEF002860104879000307B94879EE
S31500020E000000307AF4E94508F08070002670A48791D
S31500020E1000C02B306100009A080700001675A4A6D2C
S31500020E20012E67147C013E0660045247DC46302DD3
S31500020E30012EC04667F4600242470839000700C027
S31500020E4029B3671870003007E588068000029 2020F
S31500020E5020402F104879000307BB60167000300748
S31500020E60E5880690000291DA20402F1048790003B7
S31500020E7007BF4E94508F6022080700003671C08398B
S31500020E80000700C029B367084879000307C3600654
S31500020E904879000307CD4E94588F33C000A00656FA
S31500020EA04CDF30C0205F5C8F4ED04E714E714E715A
S31500020EB02F0D33C000A006582A6F0008102D00011E
S31500020EC00200000F424112005241300 13F004240EF
S31500020ED0102D00033F004240102D00023F00102D4E
S31500020EE00001E8080200000F424112003001 3F00F3
S31500020EF0424010153F004879000307D64EB900025A
S31500020F0022924FEF000E33C000A0065A2A5F205FDE
S31500020F10588F4ED04E714E714E712F0D33C000A0B8
S31500020F20065C2A6F00082F2D0010302D0006720C69
S31500020F30E2680240000F3F002F2D000C302D000604
S31500020F4002400FFF3F002F2D0008302D0004E268FB
S31500020F500240C00F3F004879000307EB4EB900023A
S31500020F6022924FEF001633C000A0065E2A5F205F72
S31500020F70588F4ED04E714E714E7133C000A006602E
S31500020F8048E73F3E204F2E7900C077F223C800C0C3
S31500020F9077F24CDF7CFC4E754E714E714E7133C04A
S31500020FA000A0056248E73F3E204F2E7900C077F246
S31500020FB023C800C077F24CDF7CFC4E754E714E7131
S31500020FC04E7148E7030433C000A0066442472A7CF8
S31500020FD000C029B008D5000623FC0003840000C027
S31500020FE01EDA203C1800000C095674E53474A4758
S31500020FF06C067E0A7C0560027C040815000467 1AEA
S315000210003006 08C000013F00487900C02D1A4EB9CB
S31500021010000 20D5E089500046020 13FC000C00C05F
S31500021020 3D8C300608C000033F00487900C03C5C96
S31500021030 4EB900020D5E089500034EB90001B0F2EA
S31500021040 2F39000262B24EB90000379A0C40FFFFF8
S31500021050660CCCB90000028000C01EDA6E8402958E
S31500021060A7FFFFFF424033C000A006664CDF20C048
S3150002107 04E754E714E714E7133C000A0066823FC48
S31500021080000 2109600C0297433C000A0066A4E758D
S31500021090 4E714E714E712F0233C000A0066C207C39
S315000210A000C02D26227C00C000FA20107200322FCA
S315000210B0000AD0812211B280620E20107400342FF1
S315000210C0000A9082B280640E082F000300086606AA
S315000210D023D000C000F623D100C04232203C00C01B
S315000210E0423233C000A0066E241F205F588F4ED0B6
S315000210F04E714E714E7148E7033E33C000A0067032
S3150002110028 7C00C04472303C0FF0C06F0020670C90
S31500021110702008370003080167000262227C000281
S31500021120 60E2204C703320D951C8FFFC30912A7CF2
S315000211300 00C0448608D5000708ED000500017CFFC3
S31500021140 23C600C0449C7020083700020801 6714B9
S315000211500 08ED0006000142B900C0448C42B900C045
S3150002116004494601C7000302F002223C000C0448CBF
S31500021170302F002252407200320023C100C0449434
S3150002118 07E00267C00C04489247C00C0448A2C7CD4
S3150002119000C04488302F0020720CE2680240000F23
S315000211A00C400008672 20C40000967620C400002EE
S315000211B0670000A20C400005570000E40C40000630
S315000211C06700012460000 16816BC003314BC0033BA
S315000211D01CBC000108ED000700010895 00022F0D56
S315000211E0224C4EB90000810E2E3900C0447E4A8739
S315000211F06300013C205430280002720AE268024071
S31500021200003F0C40003367000126600001 2016BC37
S31500021210003714BC00371CBC004E0895000208EDCE
S3150002122000 0700012F0D224C4EB90000810E2E3907
S31500021230000C0447E4A87630000F62054302800022C
S315000212 40720AE2680240003F0C400037670000E085
S3150002125 0600000DA16BC003914BC0039421623C5F7
S3150002126000C0449408D5000208AD000700012F0D06
S315000212 70224C4EB90000810E2E3900C0447E4A87A8
S315000212 80630000AC205430280002720AE268024071
S315000212 90003F0C4000396700009660000090 08D538
S31500021 2A0000416BC002B14BC002B421608D5000203
S315000212B023C600C0449408AD000700012F0D224C3E
S315000212C04EB90000810E2E3900C0447E4A87635E05
S315000212D0205430280002720AE2680240003F0C40A5
S315000212E0002B674A604608D5000416BC002F14BCC2
S315000212F0002F421608D5000223C600C0449408AD4A
S315000213000000700012F0D224C4EB90000810E2E3926
S31500021310000C0447E4A87631620543028000 2720AAF
S31500021320E2680240003F0C40002F67027E004A87B7
S315000213306314702008370002080167 0A205433E854
S31500021340000E00C03C6623C700C042322A7C00C0A1
S3150002135042327020083700030801676C7E01600C78
S31500021360 2F0C3F074EB90000848052473 02F0020D1
S31500021370E848024000FFBE4065E6604C2F0C302F65
S3150002138 00024E848024000FF3F004EB90000848076
S31500021390 0C00000467124A00670E0C000002670880
S315000213A0 0C00000567206020487900C044C44879D3
S315000213B0 00C0423248780020 4EB9000012D42A7C7E
S315000213C0 00C0423260029BCD200D33C000A00672DF
S315000213D04CDF7CC0205F588F4ED04E714E714E71DD
S315000213E033C000A00674227C000210F623C900C096
S315000213F0298823C900C0298C23C900C0297C23C996
S31500021400 00C0298023C900C0297033C000A0067617
S31500021410 4E754E714E714E7133C000A0067842A7CA
S31500021420 3F3C00003F3C000B4EB90000717470005 7
S315000214303 3C000A0067A205F588F4ED04E714E718F
S3150002144 04E7133C000A0067C23FC0002141800C0B3
S3150002145 0297833C000A0067E4E754E714E714E71CC
S3150002146 033C000A00680302F0004720BE2680240EF
S3150002147000013F00102F0008424112003 0013F00D8
S31500021480302F0008024000FF3F004EB900017E4E99
S315000214900700033C000A00682205F588F4ED04E7176
S315000214A04E714E7133C000A0068423FC0002146004
S315000214B000C029A433C000A006864E754E714E7137
S315000214C04E712E7C00E008202C7C0000000013FCEC
S315000214D00004008040021 3FC0000008040034EB965
S315000214E000008F222E7C00C07D762C7C00C0573EE9
S315000214F04E664EB900008F7060FE205F20172F00E7
S315000215002F08207C000002764EFB88FE205F201703
S3150002151 02F002F08207C000002CE4EFB88FE205FA3
S31500021520 20172F002F08207C000000B04EFB88FEFB
S31500021530205F20172F002F08207C000002944EFB0C
S3150002154088FE205F20172F002F08207C00000256FD
S3150002155 04EFB88FE206F0004226F0008209921515D
S31500021560000 4301008800 00F0C407FF06E04085013
S31500021570000 7205F504F4ED0206F0008226F000CEC
S3150002158048E73F3E2F2800042F102F2900042F1171
S31500021590610004F2201F221F4CDF7CFC206F000436
S315000215A020C020C1205F4FEF000C4ED0206F0008F4
S315000215B0226F000C48E73F3E2F2800042F102F29E8
S315000215C000042F113017670E0880000F0C407FF0C1
S315000215D06E040857000761 0004AC60B8206F00086B
S315000215E0226F000C48E73F3E2F2800042F102F29B8
S315000215F000042F1161000580609A206F0008226F97
S3150002160000C48E73F3E2F2800042F102F29000424
S3150002161 02F116100062E6000FF7C206F000848E74C
S315000216203F3E2F10610002E0201F221F4CDF7CFC90
S31500021630206F000420C020C1205F504F4ED0206F83
S315000216400000848E73F3E2F2800042F10610002964B

S31500021650201F4CDF7CFC206F00042080205F504F4F
S315000216604ED0206F00047000321002417FFF6702E5
S31500021670700120 5F584F4ED0206F0004226F000881
S315000216804 8E73F3E2F2800042F102F2900042F1170
S31500021690610006A64CDF7CFC691C6D0A6E107000A8
S315000216A0205F504F4ED070FF205F504F4ED07001DA
S315000216B0205F504F4ED07002205F504F4ED07000C8
S315000216C0222F00084AAF000C67080801001F6702B4
S315000216D070FF48E73F3E61000252201F221F4CDF87
S315000216E07CFC206F000420C020C1205F4FEF000C5D
S315000216F04ED0206F000848E73F3E2F2800042F10E7
S31500021700610002 7A4CDF7CFC206F00042081205F9E
S3150002171 04FEF000C4ED0206F000470000810000737
S31500021720670270 01205F584F4ED0206F0004700090
S31500021730 4AA80004661022100881001F0C817FF05F
S3150002174000006602 7001205F584F4ED0206F0004E1
S315000217504298429 02C5F584F4ED0206F0004226F6D
S3150002176000082011220008810 01F0C817F800000E2
S3150002177 06E040840001F2080205F504F4ED0206F1D
S315000217800008226F000C48E73F3E2F102F11610020
S3150002179 0080E201F4CDF7CFC206F00042080205F97
S315000217A04FEF000C4ED0206F0008226F000C48E766
S315000217B03F3E2F102011220067100881001F0C8067
S315000217C07F8000006E040840001F2F00610007D0D2
S315000217D060C0206F0008226F000C48E73F3E2F10C2
S315000217E02F11610008 4E60AA206F0008226F000CBC
S315000217F048E73F3E2F102F11610008C46094206F06
S3150002180000047000221002817FFFFFFF6702700151
S315000218102 05F584F4ED0206F0004226F000848E721
S31500021820 3F3E2F102F116100092C4CDF7CFC691CF6
S315000218306D0A6E107000205F504F4ED070FF205F11
S31500021840504F4ED07001205F504F4ED07002205F35
S31500021850504F4ED07000222F00084AAF000C670886
S31500021860080 1001F670270FF48E73F3E610000BCA7
S3150002187061000 072201F4CDF7CFC206F0004208078
S31500021880205F4FEF000C4ED0206F000848E73F3E26
S315000218902F10610006664CDF7CFC206F000420805E
S315000218A0205F4FEF000C4ED0206F000470000810 2E
S315000218B00007670270 01205F584F4ED0206F000468
S315000218C070002210088 1001F0C817F800000 6602D2
S315000218D07001205F584F4ED0206F00044290205F67
S315000218E0584F4ED061000546C0406700099E0C4025
S315000218F007FF67080640FC806000094CE38A660021
S3150002190000970600009726100091CC040670005B0D9
S31500021910 0C4000FF670A06400380428360000540D0
S31500021920E38A6600057C60000580205F95CAC08058
S31500021930660AC281660E2F002F004ED06C06538AAD
S315000219404 4814080243C0000043EC0806606044276
S31500021950002 0C1410C800000FFFF620C4840484154
S315000219603001424104420010C0806B085342E381B9
S31500021970E3906AF8C1422601600004E4610004AE05
S3150002198061024ED0C04066069080 42814E750C4080
S3150002199003FF640A42804281003C00114E750440F6
S315000219A0043E6D0E70FF72FFE288240A92829182D3
S315000219B04E75428144400C4000206D0CC68356C1D0
S315000219C02602428204400020 0C4000106D0E824323
S315000219D0360248434242484204400010 53406D0AD0
S315000219E0E28AE293E39151C8FFF8B4FC000067046F
S315000219F04483408270FFD081C540C7414E75610065
S31500021A00042C6180640CB4FC00006706538164 02F6
S31500021A1053804ED0610004160C40043364623800D1
S31500021A20044403FE6E14380A660642A742A74ED045
S31500021A3042A72F3CBFF000004ED072FF0C4400209C
S31500021A406F1E04440020E8A92803C8816732B983BF
S31500021A50B4FC0000672A42845281D681D584601A7A
S31500021A60E8A92802C881B982888342834A8467101A
S31500021A70B4FC0000670A5281D4816404E2925240A7
S31500021A80600003DC610003480C4007FF661EE38A20
S31500021A906600040E0C4107FF6600040EE38C660026
S31500021AA00400B7CA660003FA600003FE0C4107FF92
S31500021AB066CCE38C660003EA244B600003ECC24129
S31500021AC06700039CC040660C3001240426C5244BA3
S31500021AD06000038CB0416408C544C745C141C54B8B
S31500021AE0924044410C41003562000374 0C410020CF
S31500021AF06D082A044284044100200C4100106D0C3A
S31500021B003A0442444845484404410010 7EFFE2AF8D
S31500021B10E2BCE2BDCA87B985C887B985B7CA66126B
S31500021B20D685D58464000338E292E29352406000 7F
S31500021B30032E968595846406448340 82244BC48290
S31500021B40660CC54304400020C482670003720C82FF
S31500021B500000FFFF620C484248433403424 30440FC
S31500021B6000104A826B0002F85340E38BE3925BC893
S31500021B70FFFA600002EA610002563C0A3E0BBD47CC
S31500021B803447C040660C0C4107FF670003146 0002F
S31500021B90032E0C4007FF661EE38A66000304C24159
S31500021BA0670002FE0C4107FF660002FEE38C670037
S31500021BB002F8600002ECC241670003040C4107FF11
S31500021BC0660AE38C670002E2600002D6D041044056
S31500021BD003FE3640200222056 12C2A00200322043D
S31500021BE0612426002002220461 1C4282D685D58207
S31500021BF0D681D580300B4A826B000264E383E3927E
S31500021C0053406000025A3C004841CCC1484048411A
S31500021C103E01CEC0DE869D8644864846484 73C073E
S31500021C203E014841C2C04840C0C74247C141D2876F
S31500021C30D1864E7561000198C54BC141C544C74561
S31500021C40600461 00018A3C0A3E0BBD473447C0402E
S31500021C506618C24167C0024A0C4107FF6600024A43
S31500021C60E38C6700024460000 2380C4007FF6618E6
S31500021C70E38A6600022CC241670002440C4107FF58
S31500021C8066C0023860000 21AC241670002320C4145
S31500021C9007FF660AE38C6700021060000 2049240A6
S31500021CA0064103FF36412F052F047C01E49E48427C
S31500021CB08CC238063E064844 42468CC238062C027E
S31500021CC04246E28E8CC2CCC7E08EEE8E9886E38CBC
S31500021CD09D868886484220046 11A448340822800F1
S31500021CE06112E383E392640474FF76FF281F2A1FBE
S31500021CF06000FEE23202C2C4484248433E033C024E
S31500021D00CEC4CCC43E064246484648 47DE8142819E
S31500021D10DD8148443A033202CAC4C2C4DE85DD818B
S31500021D2048424843C6C4C4C436024242484 24843B3
S31500021D30D687D58648444E75610000940C4007FF4D
S31500021D40662AE38A6706700244C04ED00C4107FF3A
S31500021D50660 8E38C56F0B6CA67EC300A0A400008E9
S31500021D606002300B0240000844C04ED00C4107FF0F
S31500021D706606E38C66D060EAB6CA66E63C003E00BA
S31500021D809C416A043E014446E24E670A92409140F3
S31500021D90320AB34060CE3F072F083E0A4647344711
S31500021DA041FA00066000FD18201F221F20572E81CF
S31500021DB02F002F08610000763A1FC040670C9A4038
S31500021DC00C4500336C04300A609A90404ED0225F74
S31500021DD0205F201F261F9442E39095423442E198E9
S31500021DE0E7982400024007FF6714B142E28A08C25C
S31500021DF0001FE19BE79BB7420243F800B742221F4E
S31500021E002A1F9844E39199443644E199E7992801B7
S31500021E10024107FF6714B344E28C08C4001FE19D28
S31500021E20E79DBB440245F800BB444ED1225F205FCA
S31500021E30201F261F9442E39095423442E198E79888
S31500021E402400024007FF6714B142E28A08C2001F5B
S31500021E50E19BE79BB7420243F800B7424ED10683A5
S31500021E6000000400640A52826406E292E29352403F
S31500021E70C0406F460C4007FF6C2E0243F800B54384
S31500021E800242F800B5439241E392D440E09AE69AC0
S31500021E90300AE340E292E09BE69B2F032F024ED0EC
S31500021EA070FF2F002F004ED0200A223CFFE00000D8
S31500021EB0E340E29142A72F014ED04E7160024E716D
S31500021EC042A742A74ED0205F95CAC08065042F0063
S31500021ED04ED06C04538A4480243C0000008E484055
S31500021EE0C04067064840064200 10C0806B06534257
S31500021EF0E3806AFAC1426000034E61000328610270
S31500021F004ED0C04066049080 4E750C40007F640837
S31500021F109080003C00114E750440009E650870FFDB
S31500021F20E28890 8A4E754440E0BA72FFE0A9468183
S31500021F30C282B382200AB580908A74FFD2824E751D
S31500021F40610002E261BC6408B4FC000067025380CF
S31500021F504ED0610002D00C400096640002EA3600C0
S31500021F600443007E6E14340A66082F3C000000000B
S31500021F704ED02F3CBF8000004ED072FFE6A97601FC
S31500021F80D681C282670002C03382B4FC0000670039
S31500021F9002B6D4836404E3925240600002AA61004E
S31500021FA002460C4000FF661EE38A660002C40C412C

S31500021FB000FF660002C2E38B660002B6B7CA66007D
S31500021FC002B0600002B20C4100FF660CE38B6600B1
S31500021FD002A0244B600002A0C241670AC040660A02
S31500021FE030012403244B60000274B0416406C543E9
S31500021FF0C141C54B924044410C41001862000248 5F
S31500022000E2ABB7CA660ED4836400023CE292524047
S315000220106000023494836700027264044482244B93
S31500022020C4826B0002225340D4825BC8FFFC60006C
S315000220300216610001B2380A3A0BB9453445C0406E
S31500022040660C0C4100FF6700022860000 23E0C404D
S315000220500 0FF661EE38A66000218C24167000212 8A
S31500022060 0C4100FF66000210E38B6700020A600063
S3150002207002 00C241670002140C4100FF660AE38BAC
S31500022080670001F4600001EAD0410440007E380294
S31500022090 3A034842CAC24843C8C3C4C3DA849B450A
S3150002 20A04445 4845D4856B00019E5340D482600066
S315000220B0019661000132C54BC141C5436004610 0CE
S315000220C00126380A3A0BB9453445C0406618C24162
S315000220D06700019E0C4100FF6600019CE38B6700CE
S315000220E00196600 0018C0C4000FF6618E38A6600C8
S315000220F00180C241670001940C4100FF660001881D
S3150002210060000 16EC241670001820C4100FF660A4F
S31500022110E38B670001626000015890414440064 02B
S315000221200 07FC5432802E28C484388C334043A043C
S3150002213048424 24488C3340428034244E28C88C39A
S31500022140C8C5E08CEE8C94846B0000FC5340D482AC
S3150002215060000 0F46100 00900C4000FF662AE38AEA
S31500022160670 6700244C04ED00C4100FF6608E38B3E
S31500022170 66F0B6CA67EC300A0A4000086002300B05
S3150002218002 40000844C04ED00C4100FF6606E38BB5
S31500022190 66D060EAB6CA66E638003A0098416A0432
S315000221A03A014444E24C670A92409140320AB340F3
S315000221B060CE3F052F083A0A4645344541FA0006E5
S315000221C06000FE16201F20572E802F086100005641
S315000221D03A1FC040670C9A400C4500146C04300A42
S315000221E0609E90404ED0225F205F201FE380954282
S315000221F03442E1982400024000FF670A0242FE00D0
S31500022200E28A08C2001F221FE381974336 43E199FF
S315000222102601024100FF670A0243FE00E28B08C361
S31500022220001F4ED1225F205F201FE380954234427 9
S31500022230E19824 0024000FF670A0242FE00E28A99
S315000222400 08C2001F4ED1068200000 08C6404E2929A
S31500022250 5240C0406F300C4000FF6C1A0242FF0031
S31500022260E382D440E09A300AE340E2922F024ED053
S315000222707 0FF2F004ED0200A223CFF000000E340F0
S31500022280E2912F014ED04E7160024E7190802F0066
S31500022290 4ED02F0733C000A00688486F000C204F8F
S315000222A02F28000C2F39000262B6487900003676D4
S315000222B04EB9000224103E0033C000A0068A2E1F2B
S315000222C04E754E714E714E712F0733C000A0068CAB
S315000222D0206F00084210486F0010204F2F28001070
S315000222E0486F0010487900023A684EB9000224107D
S315000222F03E0033C000A0068E2E1F4E754E714E71E3
S315000223004E7148E7070C33C000A006903E2F001816
S315000223103A2F001A2A6F001C286F0020600E2F0C1D
S315000223203F054E95B045670 4700160124A475EC08C
S315000223304400 48803C0053474A4666E2424033C066
S3150002234000A006924CDF30E0205F4FEF000C4ED02B
S315000223504E714E714E7148E7071C33C000A00694B9
S315000223603A2F001C266F0022286F00262A6F002AA9
S3150002237 01C2B000348861E1348870C470030671A39
S315000223804A2B000566142F0D2F0C3F07204F3F28BE
S31500022390002A6100FF6E4A4066584A45670A2F0DB9
S315000223A03F054E94B045664A4A4667264A6F001E66
S315000223B067202F0D3F3C00304E940C4000306632B1
S315000223C00C6F0002001E660A2F0D3F064E94B046A1
S315000223D066200C470030661E4A2B000566182F0D34
S315000223E02F0C3F07204F3F28002A6100FF164A4064
S315000223F0670470FF6002424033C000A006964CDFBD
S315000224003 8E0205F4FEF00124ED04E714E714E7182
S315000224104 8E73F3E33C000A006984FEFFFCC2C6F33
S31500022420 0064246F00682A6F006C286F00704244B3
S315000224304 22F0028600005220C470025660C528DAB
S315000224401E1548870C47002566125 2442F0A3F077D
S315000224504E96B047670005006 00004F81F7C002016
S3150002246 0000C1F7C0020000D422F000E422F000F91
S315000224704 22F0010422F00113F7CFFFF00123F7CCB
S31500022480FFFF00140C47002D66081F7C0001001197
S31500022490603 60C47002B66081F7C0001000E602880
S315000224A00C47002066081F7C00010010601A0C47CA
S315000224B0002366081F7C0001000F600C0C470030E9
S315000224C0660E1F7C0030000C528D1E15488766B4BE
S315000224D00C47002A57C0440048803F40002C4A401F
S315000224E0670E528D1E15488 7602E207C000297D7FA
S315000224F00830000270006 7202F0D4EB900023C32F0
S315000225003F400012528D1E154887207C000297D745
S3150002251008300002700066EC42430C47002E663E0D
S31500022520528D1E1548870C47002A57C04400488022
S315000225303600670852 8D1E15488760222F0D4EB948
S31500022540000 23C323F400014600 6528D1E15488739
S31500022550207C000297D7083000027000 66EC4245E4
S3150002256 00C47006867CC0C47006C67060C47004C6A
S31500022570 66083A07528D1E154887426F0032426F2F
S3150002258000 30426F002A3F074879000295DA4EB9B9
S31500022590 0002559E26404A80670000B84A6F002C0A
S315000225A06718548C3F6CFFFE00124A6F00126C0AC9
S315000225B01F7C00010011446F00124A43671454 8CB9
S315000225C03F6CFFFE00144A6F00146C063F7CFFFF4F
S315000225D00014B7FC000295DB621230050C40006C59
S315000225E0672C548C342CFFFE48C26066B7FC00028E
S315000225F095DF621230050C40006C6712548C740031
S315000226 00342CFFFE604CB7FC000295E06208588C41
S31500022610242CFFFC603CB7FC000295E465340C6F89
S31500022620FFFF001466063F7C000600140C45004CB2
S315000226306610508C2F6CFFF800042F6CFFFC00080C
S31500022640601 0588C486CFFFC486F00084EB90002B7
S31500022650161A30070C400786200017C207C0000CC
S31500022660003 3720E5288B03B88FE53C9FFF86600EB
S3150002267 00166D281323B18054EFB100200A8008A80
S315000226800011C00A2006C00F5002E00D000D000D083
S315000226900 02E015200A200D000D04547586364655F
S315000226A06667696E6F707375784E486F00173F3CA8
S315000226B0000003F3C000A2F024EB900024E16264089
S315000226C0101B48803F4000324A2F000E66740C40B1
S315000226D0002B666E4A2F001067083F7C00200032EE
S315000226E06060426F0032605A486F00173F3C00003C
S315000226F03F3C00082F024EB900024F5C26403F7C49
S3150002270000010030603C486F00173F3C00003F3C30
S315000227100000A2F024EB900024F5C2640 60243F7C1D
S3150002272000001002A486F0017204F3F28002E3F3C29
S31500022730 00102F024EB900024F5C26403F7C000279
S3150002274000 0303F7C0001002E600000A0486F000CA4
S31500022750 3FC7486F000A2F0A2F0E4EB9000249F2B0
S31500022760 3CC04A466D0001ECD8463F7C0002002E32
S315000227706 07830050C40006C660E588C300448C0F8
S31500022780206CFFFC20806008588C206CFFFC308493
S315000227903F7C0003002E6052588C266CFFFC426F71
S315000227A0002E0C6FFFFF0014650C2F0B4EB90002B1
S315000227B045842C0060342E8B424660045246529762
S315000227C0BC6F00146C2420574A10671E60EE548CAE
S315000227D042471E2CFFFF1F47002747EF00273F7C7B
S315000227E0000100147C01426F002E0C6F0001002EC6
S315000227F0660000E80C6FFFFF001467061F7C0020CE
S3150002280000 0C4A826612426F003042401F40000F9F
S315000228104A6F0014660242132F0B4EB9000245841A
S3150002282 02C00362F001496464A436F124A2F000F89
S315000228306 70E0C6F00010030660653436002424386
S315000228403A2F00129A469A434A2F000F67CC9A6F44
S315000228500030D86F00301F47000F4A6F00326704FE
S3150002286053455 2444A456C0242453006D045D04350
S315000228 70D8402F0A2F0E486F00143F05204F3F28DD
S31500022880003E204F3F2800426100FACC4A406600D3
S31500022890 00C22F0A2F0E3F3C00303F036100FA644C
S315000228A04A406710600000AC2F0A3F074E96B047B9
S315000228B0660000A042471E1B66EE4A2F0011670003
S315000228C000 0962F0A2F0E102F001548803F003F0555
S315000228D06100FA304A40677E60784A6F002E66765B
S315000228E00C5FFFFF0014670A302F0014B0466C020B
S315000228FC3C003E2F00129E464A476C024247300673
S31500022900D047D8404A2F001166262F0A2F0E102FC5

S31500022910001448803F003F076100F9E84A4067100B
S315000229206030424S1A1B2F0A3F054E96B045662275
S31500022930 3A0651CEFFEE4A2F0011671A2F0A2F0EC2
S31500022940102F001548803F003F076100F9B64A4044
S31500022950670470FF600C528D42471E156600FADA54
S315000229603004 4FEF003433C000A0069A4CDF7CFCE3
S31500022970205F4FEF00104ED04E714E714E7133C034
S3150002298000A0069C322F00044A416E0630014440E4
S31500022990600230 0133C000A0069E205F548F4ED0E5
S315000229A04E714E714E714E56FFF833C000A006A00E
S315000229B02D49FFFC3F3C00002F2E000843EEFFF896
S315000229C0615843EEFFF8206EFFFC209133C000A051
S315000229D006A24E5E205F588F4ED04E714E714E71DA
S315000229E04E56FFF833C000A006A42D49FFFC3F3C1B
S315000229F000012F2E000843EEFFF8611E43EEFFF89A
S31500022A00206EFFFC209133C000A006A64E5E205F1A
S31500022A10588F4ED04E714E714E714E56FFDC48E7BE
S31500022A20031C33C000A006A82D49FFFC487900020A
S31500022A309612486E00084EB9000218164A405DC04A
S31500022A4044004880 3C003E2E000C4BEEFFF82F2E31
S31500022A500008224D4EB9000241E049EEFFF44879E2
S31500022A6000029626 2F0D4EB9000218164A406C0631
S31500022A7028956000010247EEFFF048790002962A87
S31500022A802F0D4EB9000218164A406F7230074440A5
S31500022A9052403E00487900 02962E2F0D4EB9000292
S31500022AA018164A406F1233FC002100C04548227CAA
S31500022AB0000296126000011C3F3CFFFF2F0D487971
S31500022AC00002962E486EFFEC4EB9000217A62F2E74
S31500022AD0FFEC224B4EB9000242582F13224D4EB93B
S31500022AE0000235103F3C00012F1543EEFFEC4EB9B4
S31500022AF0000242582AAEFFEC0A558000600C2F0DE8
S31500022B002F0D2F0B4EB9000217D24879000295EA13
S31500022B103F3C00042F1343EEFFE84EB9000240CAC1
S31500022B2048790002 95FE3F3C00052F1343EEFFEC69
S31500022B304EB9000241482F0B2F0D486EFFE44EB9E5
S31500022B400000217D2486EFFE8486EFFE4486EFFE0C7
S31500022B504EB9000217D2486EFFEC486EFFE0486E8F
S31500022B60FFDC4EB9000217E8486EFFDC2F0D2F0C72
S31500022B704EB90002177E4A6E000C67364A4667183F
S31500022B80300748C0E58806800002961E2F002F0CEB
S31500022B904EB9000214FA60382F0C300748C0E58897
S31500022BA00680000296162F002F0C4EB9000217A6B9
S31500022BB0601E300748CCE588068000 0296162F0080
S31500022BC02F0C4EB9000214FA4A4667040A548000D2
S31500022BD0224C206EFFFC209133C000A006AA4CDFD7
S31500022BE038C04E5E205F5C8F4ED04E714E714E7174
S31500022BF04E56FFDC48E7010C33C000A006AC2D4957
S31500022C00FFFC42474BEEFFF82F2E0008224D4EB92D
S31500022C100000241E048790002966 22F0D4EB9000289
S31500022C2018164A406F122F0D4879000296622F0D30
S31500022C304EB9000217E87E02487900029666 2F0D09
S31500022C404EB9000218164A406F4A48790002966A3F
S31500022C502F0D486EFFEC4EB90002177E487900022E
S31500022C60966A2F0D486EFFE84EB9000217D24879D0
S31500022C700002966E486EFFE8486EFFE44EB9000207
S31500022C80177E486EFFEC486EFFE42F0D4EB9000228
S31500022C9017E852472F1543EEFFEC4EB9000241E00A
S31500022CA049EEFFF04879000296 72486EFFEC4EB983
S31500022CB0000218164A406C062895600000822F0D05
S31500022CC02F0D486EFFF44EB9000217D24879000262
S31500022CD096323F3C00032F2EFFF443EEFFE84EB937
S31500022CE0000240CA4879000296423F3C00042F2E59
S31500022CF0FFF443EEFFEC4EB900024148486EFFF482
S31500022D002F0D486EFFE44EB9000217D2486EFFE857
S31500022D10486EFFE4486EFFE04EB9000217D2486ED5
S31500022D20FFEC486EFFE0486EFFDC4EB9000217E882
S31500022D30486EFFDC2F0D2F0C4EB90002177E0C4792
S31500022D4000016F040A548000300748C0E5880680F7
S31500022D500000296522F002F0C4EB9000214FA48793F
S31500022D600002967 6486E00084EB9000218164A40CE
S31500022D706C040A548000224C206EFFFC209133C062
S31500022D80000A006AE4CDF30804E5E205F588F4ED0DC
S31500022D904E714E714E714E56FFF02F0D33C000A08C
S31500022DA006B02D49FFFC4BEEFFF8486E000C4EB9FB
S31500022DB0000217FE4A006620486E00084EB900025D
S31500022DC017FE4A00664633FC002100C04548227CB5
S31500022DD0000296766000009 2486E000C486E00086B
S31500022DE0486EFFF04EB9000217E82F2EFFF043EEB1
S31500022DF0FFF44EB9000241E048790002967A486E25
S31500022E00FFF44EB9000218164A406D082ABC3FC9A3
S31500022E100FDB600A2F2EFFF4224D6100FDD44879A4
S31500022E200002967 6486E000C4EB9000218164A4009
S31500022E306C1C2D55FFF40A6E8000FFF448790002DF
S31500022E40967E486EFFF42F0D4EB90002177E487922
S31500022E50000296764 86E00084EB9000218164A40DD
S31500022E606C040A558000224D206EFFFC209133C06F
S31500022E70000A006B22A5F4E5E205F508F4ED04E7182
S31500022E804E714E714E56FFF848E7030033C000A05C
S31500022E90 06B42D49FFFC3E2E00083C2E000A41EEE8
S31500022EA0FFF8300748C081C6208043EEFFF8206E47
S31500022EB0FFFC209133C000A006B64CDF00C04E5E78
S31500022EC0205F588F4ED04E714E714E714E56FFF4A2
S31500022ED048E7030033C000A006B82D49FFFC2E2E9A
S31500022EE000082C2E000C41EEFFF420076A024480F3
S31500022EF022066A0244810C8100010000641280C12C
S31500022F00690E220042414841028 00000FFFF601E16
S31500022F102F011F3C00204281E388E391B2AF0002F9
S31500022F20650692AF00025280531766EC5C8F4A87A1
S31500022F306A02448120812207B3866A0244802140C4
S31500022F400000443EEFFF4206EFFFC20D9209133C02B
S31500022F50 00A006BA4CDF00C04E5E205F508F4ED0F6
S31500022F604E714E714E712F002F014A806A02448 0C3
S31500022F704A816A0244810C8100010000641280C108
S31500022F800690E2200424148410280 0000FFFF601E96
S31500022F902F011F3C00204281E388E391B2AF000279
S31500022FA0650692AF00025280531766EC5C8F221FB1
S31500022FB0B39F6A0244804E7548E7C0004A806A029F
S31500022FC044804A816A0244810C810001000064 1235
S31500022FD080C1690E220042414841028 00000FFFF83
S31500022FE0601E2F011F3C00204281E388E391B2AFAD
S31500022FF00002650692AF00025280531766EC5C8FA0
S3150002300004A9F6A0244812001221F4E754E56FFCE08
S315000230104 8E7000C33C000A006BC2D49FFFC49EE70
S3150002302000008487900029 6962F0C4EB9000218162F
S31500023030 4A406C1233FC002100C04548227C000243
S31500023040969 56000014E2F0C4EB9000217FE4A00FA
S31500023050661233FC002200C04548227C0002969A82
S3150002306060000130 4BEEFFF62ABC3F800000486E3E
S31500023070FFFA2F14224C4EB9000242164879 00027A
S31500023080969E2F0C4EB9000218164A406E0A2ABCAA
S315000230903F000000536EFFFA3F3C00012F0D2F0C3C
S315000230A0486EFFF24EB90002177E2F0D2F0C486EA6
S315000230B0FFEE4EB9000217A6486EFFF2486EFFEE0B
S315000230C0486EFFEA4EB9000217E82F2EFFEA224D9C
S315000230D04EB9000242582F0D2F0D486EFFF24EB91F
S315000230E0000217D24879000296823F3C00022F2E38
S315000230F0FFF243EEFFEA4EB9000240CA48790002E7
S31500023100968E3F3C00022F2EFFF243EEFFEE4EB9A3
S3150002311000024148302EFFFA486EFFE648C04EB91B
S315000231200 00023A284879000296A2486EFFE6486EE7
S31500023130FFE24EB9000217D2486EFFF22F0D486E1B
S31500023140FFDE4EB9000217D2486EFFEA486EFFDE76
S31500023150486EFFDA4EB9000217D2486EFFEE486E8D
S31500023160FFDA486EFFD64EB9000217E8486EFFD660
S315000231702F0D486EFFD24EB90002177E486EFFE24F
S31500023180486EFFD2486EFFCE4EB90002177E43EE5E
S31500023190FFCE206EFFFC209133C000A006BE4CDF9E
S315000231A030004E5E205F588F4ED04E714E714E717A
S315000231B04E56FFF433C000A006C02D49FFFC2F2E49
S315000231C0000843EEFFF86100FE444879 0002969A31
S315000231D0486EFFF84EB9000218164A406608227C6D
S315000231E000002969A6018487900 0296A6486EFFF881
S315000231F0486EFFF44EB9000217D243EEFFF4206E7A
S31500023200FFFC209133C000A006C24E5E205F588F9D
S3150002321 04ED04E714E714E714E56FFF048E7010484
S31500023220 33C000A006C42D49FFFC4BEE000C4247FA
S315000232304 86E00084EB9000217FE4A0066144879 25
S3150002324000000296962F0D4EB9000218164A406F32AA
S3150002325060384879000296964 86E00084EB9000218
S315000232601 8164A406C2E2F1543EEFFF84EB900028F

S315000232703FC4486EFFF82F0D4EB9000218164A4099
S31500023280671033FC002100C04548227C0002969656
S315000232906072 7E014A4767122D5E0008FFF00A6EC1
S315000232A08000FFF043EEFFF0600443EE00082F11AA
S315000232B043EEFFF46100FD56486EFFF42F0D486E93
S315000232C0FFF04EB9000217D22F2EFFF043EEFFF8A1
S315000232D04EB900023CCC4A4767262F3C400000000C
S315000232E02F1543EEFFF44EB900023ECA486EFFF4B4
S315000232F04EB9000217FE4A0067060A6E8000FFF802
S3150002330043EEFFF8206EFFFC209133C000A006C6F4
S315000233104CDF20804E5E205F508F4ED04E714E7134
S315000233204E7148E70F3E33C000A006C82C6F002836
S3150002333 02A2F0030200ED085244078FF60342A4A96
S315000233402A200D908526402F0D2F0B206F003C02
S315000233504E904A406F1A284D2A4B2E0560081C14BF
S31500023360 18D51AC6DE844A8762F42A4BBBCE62D2CD
S315000233700D5C5B5EF002C63C633C000A006CA4CDF24
S315000233807CF0205F4FEF00104ED04E714E714E71A1
S315000233904 8E70F3E33C000A006CC78FF266F002810
S315000233A02C2F0030600000D82007E28822064EB992
S315000233B000025A82D08B28402A4B2E0660081A1425
S315000233C018D51AC5DE844A8762F4200BD0862840B7
S315000233D02A6F002C6002D9C6B9EF002C64122F0B9B
S315000233E02F0C206F003C4E904A406C0460E89BC64E
S315000233F0BBCB630E2F0B2F0D206F003C4E904A4025
S3150002340 06EECB9CD641A2C4C244D2E0660081A16A1
S315000234101CD214C5DE844A8762F4D9C69BC660B83C
S31500023420BBCB67142C4D244B2E0660081A161CD2F1
S315000234301 4C5DE844A8762F4200D908B222F002C5D
S31500023440928CB0816F1E204F2F2800342F06204FFA
S315000234502F2800342F0C6100FF38200D90862F4054
S31500023460002C601ABBCB6714204F2F2800342F067E
S3150002347 0200D90862F002F0B6100FF16264C202F61
S31500023480002CB08B6314908B22064EB9000253E0D7
S315000234902E00700ABE806400FF1033C000A006CE64
S315000234A04CDF7CF0205F4FEF00104ED04E714E7114
S315000234B04E7148E7011C33C000A006D0286F0014E5
S315000234C02E2F001C266F00204AAF0018672A202FD5
S315000234D00018538022074EB900025A82D08C2A4025
S315000234E02F0B2F072F0D2F0C6100FEA62F0B2F0778
S315000234F02F0D2F0C6100FE2C33C000A006D24CDF2C
S31500023500 3880205F4FEF00104ED04E714E714E71D3
S315000235104E56FFEA48E7030433C000A006D42D49FD
S31500023520FFFC486E00084EB9000217FE4A00671CEF
S315000235304879000296AA486E00084EB9000218168B
S315000235404A406C1233FC002100C04548227C00022E
S31500023550 96AA600000AA486EFFF22F2E000843EEDC
S31500023560FFF44EB9000242164BEEFFF8487900020C
S315000235709 6B2486EFFF4486EFFEE4EB9000217D2BD
S315000235804879000296AE486EFFEE2F0D4EB9000244
S31500023590177E7E0260303F3CFFFF2F0D486EFFF420
S315000235A0486EFFEE4EB9000217E8486EFFEE2F0D89
S315000235B0486EFFEA4EB90002177E2F2EFFEA224D11
S315000235C04EB9000242583C0751CFFFCC082E0000EC
S315000235D0FFF3671248790002 96B62F0D4EB9000224
S315000235E01530526EFFF2302EFFF2E2403F002F15E9
S315000235F043EEFFEE4EB90002425843EEFFEE206E56
S31500023600FFFC209133C000A006D64CDF20C04E5EE0
S31500023610205F588F4ED04E714E714E714E56FFE45A
S31500023620 48E7013C33C000A006D82D49FFFC49EE0D
S315000236300 0C847EE000C2F0C4EB9000217FE4A0096
S31500023640 66162F0B4EB9000217FE4A00660A227C46
S315000236500 00296AA600000DA2F14224C4EB900022C
S315000236604 1E02F13224B4EB9000241E02F0B2F0CE3
S315000236704EB9000218164A405EC0440048803E0C19
S31500023680 67142F0C2F0B486EFFF44EB9000217E891
S315000236904BEEFFF460122F0B2F0C486EFFF84EB95B
S315000236A0000217E84BEEFFF845EEFFF024952F0ACD
S315000236B02F0A486EFFE84EB9000217D24879000277
S315000236C096BA486EFFE8486EFFE44EB90002177ECE
S315000236D02F2EFFE443EEFFEC6100FE364A476704F5
S315000236E02A4C60022A4B2495486EFFEC4879000268
S315000236F096BE486EFFE84EB9000217E8486EFFE82C
S315000237002F0A4EB9000218164A406F1033FC0022E7
S315000237100 00C04548227C000296BE6014486EFFEC4B
S315000237202F0A486EFFE84EB9000217D243EEFFE8B1
S3150002373 0206EFFFC209133C000A006DA4CDF3C80ED
S315000237404E5E205F508F4ED04E714E714E712F0BD2
S31500023750 33C000A006DC226F0008206F000C264949
S315000237604A1966FC538912D866FC200B33C000A0A6
S3150002377006DE265F205F508F4ED04E714E714E711F
S31500023780 33C000A006E0226F0004206F0008600428
S315000237905289528 81011B01066044A0066F24240FD
S315000237A01011424112109 04133C000A006E2205F80
S315000237B0508F4ED04E714E714E712F0B33C000A0FA
S315000237C006E4226F0008206F000C264912D866FC18
S315000237D0200B33C000A006E6265F205F508F4ED036
S315000237E04E714E714E7148E7061033C000A006E8CE
S315000237F0226F0010206F0014222F001826497AFF2C
S31500023800 6006D28512D867084A8162F660024219BA
S315000238104A8152C0440048803C00D2854A4666EE40
S31500023820200B33C000A006EA4CDF0860205F4FEF92
S315000238300000C4ED04E714E714E714E56FFF848E74F
S3150002384 0001C33C000A006EC2D49FFFC266E0008C2
S3150002385 0286E000C2A4B6002528D7000101506 80ED
S315000238600000297D720400810000366EC3F3CFFFF9A
S315000238702F0C2F0D43EEFFF84EB900023A96200C9C
S31500023880 67082014B08D6602288B43EEFFF8206E7F
S31500023890FFFC209133C000A006EE4CDF38004E5EDE
S315000238A0205F508F4ED04E714E714E7148E7013EE9
S315000238B033C000A006F02C7C00C04544266F001CD5
S315000238C0246F0020200B660226562F0A2F0B4EB9B4
S315000238D0000245ACD7C04A13660470006024284B28
S315000238E060182A4A1015B007660A421441EC000114
S315000238F02C88600C4A1D66EC528C1E1466E42C8CD5
S31500023900200B33C000A006F24CDF7C80205F508F74
S315000239104ED04E714E714E7148E7011C33C000A065
S31500023920 06F4266F0014286F00182A4B6002528D87
S315000239307000101506 80000297D720400810000379
S31500023940 66EC3F3CFFFF204F3F28001E2F0C2F0D39
S315000239504EB900024E6A2E00200C67082014B08D64
S31500023960 6602288B200733C000A006F64CDF38809B
S315000239700205F4FEF000A4ED04E714E714E7148E7EE
S3150002398 0011C33C000A006F8266F0014286F001829
S31500023990 2A4B6002528D7000101506 80000297D7DE
S315000239A02040081 0000366EC4878FFFF3F3CFFFF0B
S315000239B0204F3F2800222F0C2F0D4EB900023B74D8
S315000239C02E00200C67082014B08D6602288B200773
S315000239D033C000A006FA4CDF3880205F4FEF000AA2
S315000239E04ED04E714E714E714E560000487800010F
S315000239F02F002F2E0008207CFFFFDCC24EBB88FE64
S31500023A004E5E205F584F4ED04E560000487800005A
S31500023A102F002F2E0008207CFFFFDCA24EBB88FE63
S31500023A204E5E205F584F4ED04E5600004878000139
S31500023A302F002F2E0008207CFFFFDE184EBB88FECB
S31500023A404E5E205F584F4ED04E560000487800001A
S31500023A502F002F2E0008207CFFFFDDF84EBB88FECC
S31500023A604E5E205F584F4ED033C000A006FC226F38
S31500023A70 0006205110AF000552912051421 04240DB
S31500023A80102F000533C000A006FE205F5C8F4ED0CB
S31500023A904E714E714E714E56FFF448E7010C33C01B
S31500023AA000A007002D49FFFC286E000C3F2E0010D7
S31500023AB0486E00084BEEFFF82F0D4EB9000246D2B3
S31500023AC03E0066562F0D4EB9000217FE4A00674A9F
S31500023AD04879000296C22F0D4EB9000218164A40C6
S31500023AE06F027E014879000296C62F0D4EB900027A
S31500023AF018164A406C027EFF2F1543EEFFF44EB9AC
S31500023B0000000241E04879000296CA486EFFF44EB9B7
S31500023B10000218164A406C027E020C47FFFF660638
S31500023B202ABCFF7FFFFF0C47000166062ABC7F7F87
S31500023B30FFFF0C47000266062ABC000000004A4747
S31500023B40670833FC002200C04548200C670428AEF3
S31500023B500 0008224D206EFFFC209133C000A0070210
S31500023B604CDF30804E5E205F4FEF000A4ED04E7122
S31500023B704E714E7148E7033E33C000A00704518FD1
S31500023B80286F0028266F002C3E2F00322A4C424610
S31500023B9045EF00044DD70C15002D66047C01600626
S31500023BA00C15002B66124A4766062C8C4292606000
S31500023BB04A476F025347528D204F3F2800303F0736
S31500023BC02F0E2F0D2F0A4EB90002523A4A40670EA7

S31500023BD00C400001671E0C400002672860324292C8
S31500023BE02C8C4A47672A0C150030662441ED0001E9
S31500023BF02C88601C2012B0AF003462084A46671057
S31500023C004492600C24AF003433FC002200C04548C5
S31500023C10200B670226962012508F33C000A007069B
S31500023C204CDF7CC0205F4FEF00104ED04E714E71BC
S31500023C304E7148E7070033C000A00708226F001044
S31500023C40424642471E113A066006528942471E11F3
S31500023C50207C000297D708300003700066EC0C4700
S31500023C60002D66047A01601A0C47002B661A5289E7
S31500023C7042471E116012700AC0C672D0D247D041A6
S31500023C803C00528942471E11207C000297D7083019
S31500023C900002700066E04A45671A0C467FFF630E13
S31500023CA0303C8001D0464440064080016008300620
S31500023CB044406002300633C000A0070A4CDF00E031
S31500023CC0205F588F4ED04E714E714E56FFDCAC
S31500023CD048E7010C33C000A0070C2D49FFFC4BEE50
S31500023CE000084879000296E22F0D4EB90002181616
S31500023CF04A405DC0440048803E004879000296E68C
S31500023D002F0D4EB9000218164A406F1233FC0022DC
S31500023D1000C04548227C000296EA6000019048797C
S31500023D20000296EE2F0D4EB9000218164A406C0A92
S31500023D30227C000296E2600001742F15224D4EB9D4
S31500023D40000241E04879000296F22F0D4EB90002B8
S31500023D5018164A406C0A227C000296F66000014E52
S31500023D60486EFFF44879000296FA2F0D486EFFE47A
S31500023D704EB9000217D22F2EFFE443EEFFE84EB9EA
S31500023D80000242E82F2EFFE843EEFFEC4EB9000296
S31500023D9041E04879000296FE486EFFEC4EB90002F9
S31500023DA018164A406D104879000296F6486EFFF4DE
S31500023DB04EB9000214FA487900029702486EFFF4DF
S31500023DC0486EFFE84EB9000217D2486EFFE82F0D83
S31500023DD0486EFFEC4EB9000217A6486EFFEC486E1D
S31500023DE0FFEC486EFFE84EB9000217D2487900028E
S31500023DF096CE3F3C00022F2EFFE843EEFFE44EB97B
S31500023E00000240CA49EEFFF0486EFFE4486EFFEC3E
S31500023E102F0C4EB9000217D24879000296DA3F3CBF
S31500023E2000022F2EFFE843EEFFE44EB9000241489E
S31500023E302F0C486EFFE4486EFFE04EB9000217A64B
S31500023E40486EFFE02F0C486EFFDC4EB9000217E801
S31500023E504879000296FE486EFFDC2F0C4EB900022E
S31500023E60177E487900029706486EFFF4486EFFEC0B
S31500023E704EB90002177E486EFFEC4EB90002453875
S31500023E803F002F14224C4EB9000242584A47671887
S31500023E902F0C4879000296F6486EFFF84EB90002DA
S31500023EA017E84BEEFFF860022A4C224D206EFFFC0B
S31500023EB0209133C000A0070E4CDF30804E5E205F9B
S31500023EC0588F4ED04E714E714E714E56FFE833C02A
S31500023ED000A007102D49FFFC486E000C4EB90002E7
S31500023EE017FE4A00661233FC002100C04548227CB8
S31500023EF00002970A600000B42F2E000C43EEFFF07A
S31500023F004EB9000241E0486EFFF0486E0008486E66
S31500023F10FFF84EB9000217E8486EFFF84EB90002E4
S31500023F2017FE4A00660643EE0008607E2F2EFFF853
S31500023F3043EEFFEC4EB9000241E048790002970ECB
S31500023F40486EFFEC4EB9000218164A406D344879A5
S31500023F500002970A486EFFF84EB9000218164A404B
S31500023F606F1033FC002200C04548227C0002970EE7
S31500023F70603833FC002200C04548227C00029712BA
S31500023F806028486EFFF42F2EFFF843EEFFEC4EB981
S31500023F90000242E8486EFFEC486EFFFC486EFFE80A
S31500023FA04EB9000217D243EEFFE8206EFFFC2091C5
S31500023FB033C000A007124E5E205F508F4ED04E7166
S31500023FC04E714E714E56FFF433C000A007142D49B0
S31500023FD0FFFC4879000297CA486E00084EB90002B3
S31500023FE018164A406C202F2E00080A17008043EE4E
S31500023FF0FFF861422D6EFFF8FFF40A6E8000FFF4AF
S315000240000043EEFFF46016486E00082F2E000843EEBA
S31500024010FFF84EB9000242E843EE0008206EFFFCAC
S31500024020209133C000A007164E5E205F588F4ED0F7
S315000240304E714E714E714E56FFF42F0D33C000A0D5
S3150002404007182D49FFFC4BEE000848790002970A33
S315000240502F0D4EB9000218164A406C202F150A176A
S315000240600008043EEFFF86100FF5C2D6EFFF8FFF45F
S3150002407000A6E8000FFF443EEFFF460322F0D2F1517
S31500024080043EEFFF84EB9000242E848790002970A69
S315000240900486EFFF84EB9000218164A406F0E48796C
S315000240A0000297162F0D4EB9000214FA224D206E09
S315000240B0FFFC209133C000A0071A2A5F4E5E205FE4
S315000240C0588F4ED04E714E714E714E56FFF448E7E0
S315000240D0030C33C000A0071C2D49FFFC3E2E000C2A
S315000240E02A6E000E4A476C08227C0002970A603844
S315000240F0300748C0E588DBC049EEFFF82895601E08
S3150002410004 86E00082F0C486EFFF44EB9000217D213
S31500024110 2F0D486EFFF42F0C4EB90002177E598DF3
S3150002412 03C0751CFFFDC224C206EFFFC209133C0AE
S315000241300 00A0071E4CDF30C04E5E205F4FEF000A24
S31500024140 4ED04E714E714E714E56FFF448E7030C37
S31500024150 33C000A007202D49FFFC3E2E000C2A6E1C
S31500024160000E4A476C08227C0002970A60524A47B0
S31500024170 6608227C000297166046534730074 8C0FD
S31500024180E588DBC049EEFFF82F0D486E00082F0CBC
S315000241904EB90002177E601E486E00082F0C486E4C
S315000241A0FFF44EB9000217D22F0D486EFFF42F0C02
S315000241B04EB90002177E598D3C0751CFFFDC224CC7
S315000241C0206EFFFC209133C000A007224CDF30C0D6
S315000241D04E5E205F4FEF000A4ED04E714E714E7109
S315000241E04E56FFFC33C000A007242D49FFFC486E43
S315000241F000084EB900024326 43EE0008206EFFFC7B
S31500024200209133C000A007264E5E205F588F4ED005
S315000242104E714E714E714E56FFF833C000A00728FC
S315000242202D49FFFC486EFFF8486E00084EB90002A1
S31500024230435C206E000C30AEFFFA43EE0008206E9F
S31500024240FFFC209133C000A0072A4E5E205F508FEC
S315000242504ED04E714E714E714E56FFF433C000A0D1
S31500024260072C2D49FFFC4A6E000C6C083D7CFFFFB3
S31500024270FFF86004426EFFF83D6E000CFFFA486ECE
S31500024280FFF4486EFFF8486E00084EB9000243DCA0
S315000242904A6EFFF66734487900029 71A486E00089C
S315000242A04EB9000218164A406C1033FC002200C0B8
S315000242B04548227C0002971E601433FC002200C08F
S315000242C04548227C0002972260 0443EE0008206ED5
S315000242D0FFFC209133C000A0072E4E5E205F5C8F4C
S315000242E04ED04E714E714E714E56FFF833C000A03D
S315000242F007302D49FFFC2F2E000C486EFFF8486E42
S3150002430000084EB900024474 43EEFFF8206EFFFC2B
S31500024310209133C000A007324E5E205F508F4ED0F0
S315000243204E714E714E712F0D33C000A007342A6FA5
S3150002433000082F0D4EB9000218A84A80670A2F0DF1
S3150002434 02F0D4EB90002175A33C000A007362A5F56
S31500024350205F588F4ED04E714E714E7148E7010C58
S31500024360 33C000A007384FEFFFF42A6F001C286FF6
S315000243700002 02F0D4EB9000217FE4A80671C2F0D32
S31500024380486F00044EB900025610 7030C02F000A62
S31500024390 6608 2F0C06000A6704429460243E2F2E
S315000243A00008 48C752873F7CFFFF000848574EB9AE
S315000243B0000258609E80288748572F0D4EB900028A
S315000243C0541E4FEF000C33C000A0073A4CDF30807A
S315000243D0205F508F4ED04E714E714E7148E7011CD0
S315000243E033C000A0073C4FEFFFF42A6F0020266F70
S315000243F00024286F002842942F0D4EB9000217FEA2
S31500024400 4A8067542F0D486F00044EB900025610B9
S315000244107030C02F0C0A66400 82F0006000A663870
S31500024420 2E13302F000848C0DE800C870000 3E8025
S3150002443 06E220C87FFFFC1806D1A3F47000848575E
S315000244402F0D4EB90002541E2F0D4EB9000218BC94
S315000244504A8067047001 28804FEF000C33C000A029
S31500024460073E4CDF3880205F4FEF000C4ED04E7176
S315000244704E714E7148E7001C33C000A007404FEF53
S31500024480FFE42A6F002C286F0030266F00342F0DB0
S315000244904EB9000217FE4A80671C2F0D486F0014A2
S315000244A04EB900025610 7030C02F001A6608082F47
S315000244B000006001A67062895269560604A6F00185E
S315000244C06C0C28952F0B4EB9000218D8604E4BD7AC
S315000244D02ABC7FFFFFFF43EF001041EF000420D903
S315000244E020D9209142A7302F001C48C02F002F0D43
S315000244F04EB9000257882015C1AF00104695201507
S31500024500C1AF0004486F00102F0C4EB90002541EB2
S315000245104 86F00042F0B4EB90002541E4FEF001CC9
S31500024520 33C000A007424CDF3800205F4FEF000C7B

S315000245304ED04E714E714E714E56FFFC48780001B8
S315000245402F2E0008486EFFFC207CFFFFD33A4EBB9D
S315000245508 8FE202EFFFC4E5E205F584F4ED04E56F0
S31500024560FFFC487800002F2E0008486EFFFC207CD6
S31500024570FFFFD3144EBB88FE202EFFFC4E5E205F4B
S31500024580584F4ED033C000A00744226F0004204982
S315000245904A1966FC20099088538033C000A007465A
S315000245A0205F588F4ED04E714E714E7148E701040E
S315000245B033C000A00748226F000C206F0010720063
S315000245C060102A481015B00767064A1D66F660068F
S315000245D052811E1966EC200133C000A0074A4CDF47
S315000245E02080205F508F4ED04E714E714E7148E73B
S315000245F0070433C000A0074C2A6F00143C2F001892
S315000246003A2F001A0C4602606D064240600000AE68
S315000246100C4601306F26044601304A456610487939
S31500024620000297D22FCD4EB900021530600E48795E
S31500024630000297D22FCD4EB90002150C7E0FCE4600
S31500024640067364A45671A3007534048C0E5880680F0
S3150002465000002974E2FC02F0D4EB90002150C60185E
S31500024660300753404 8C0E5880680002974E2F0067
S31500024670 2F0D4EB9000215307E1F3006E840CE409F
S315000246804A4767364A45671A3007534048C0E588A5
S3150002469006800002978A2F002F0D4EB90002150CD4
S315000246A0601830075340 48C0E58806800002978AA2
S315000246B02F002F0D4EB900021530700133C000A035
S315000246C0074E4CDF20E0205F508F4ED04E714E7168
S315000246D04E7148E73F3E33C000A00750518F286F06
S315000246E00038266F003C3E2F00404246422F00070C
S315000246F038062A533F4400043F4400023A04360572
S315000247004202 45EF00C114822 8BC000000002C7C06
S31500024710000245EE4A47670000A20C15002B670807
S3150002472000C15002D660000940C15002D66063F7CC4
S315000247300001000 44A476F025347528D607C1F7C7A
S31500024740000100074A4666060C1500306702524 60B
S31500024750 0C4600096F0E0C437FEE6C045243605206
S3150002476074016 04E0C15003067424A4467123F3CA2
S315000247700003F042FCC4E964A40660274014244E2
S3150002478048790002974E2F0C4EB90002153010 15CB
S315000247904880064 0FFD048C0E58806800002 97267A
S315000247A02F002F0C4EB9000214FA60064A46670221
S315000247B052444A476F025347528D4A47670E0C15B9
S315000247C000306D080C1500396F00FF744A446712F9
S315000247D03F3C00003F042F0C4E964A40660274018D
S315000247E042444A4767C000A80C15002E660000A046
S315000247F04A476F025347528D600000821F7C0001B8
S31500024800000 74A4666060C1500306702524 60C46F9
S315000248100 0096F045346605C0C4380126F045343D5
S31500024820600414BC00014A46674A0C150030674210
S315000248304A4467123F3C00003F042F0C4E964A4002
S31500024840660274014244487900029 74E2F0C4EB913
S31500024850000215301015 48800640FFD048C0E58892
S3150002486006800002972 62F002F0C4EB9000214FA7A
S31500024870600252444A476F025347528D4A47670EB7
S315000248800 0C1500306DC80C1500396F00FF70D64408
S315000248904A2F0007670001404A6F000467040A5462
S315000248A080004A476700009E0C15006567080C15D4
S315000248B00045660000904A476F025347528D4A47A9
S315000248C067200C15002B67060C15002D66140C15B7
S315000248D0002D66063F7C000100024A476F025347DD
S315000248E0528D4A4767540C1500306D4E0C1500392F
S315000248F06F2E60460C450CCB6F104A6F000267069E
S31500024900 14BC00016012 7401600ECAFC000A101584
S31500024910488006 40FFD0DA404A476F025347528D1D
S315000249204A47670C0C1500306D060C1500396FC42A
S315000249304A6F0002670E4445600A28BC0000000068
S3150002494060000 0944A46660842453605340 31482DE
S3150002495030054 8C0320348C1D0810C8000007FEE8A
S315000249606F063A3C7FEE601A300548C0320348C1F2
S31500024970D0810C80FFFF80126C063A3C80126002E6
S31500024980DA434247BA476C047E0144453F073F0576
S315000249902F0C4E964A40660C4A47670614BC000125
S315000249A060027401268D4A02670E4A6F000465048D
S315000249B07001602470FF60204A12670628BC00005E
S315000249C000002F0C4EB9000217FE4A0066084A463E
S315000249D067047002600 24240508F33C000A0075243
S315000249E04CDF7CFC205F4FEF000A4ED04E714E71B9
S315000249F04E7148E73F3E33C000A007544FEFFFC455
S31500024A000286F006C266F0070342F0078426F003AD0
S31500024A10426F003842453F4500363F4500343C056B
S31500024A203F4600323F4600303F46002E3F46002AB0
S31500024A3095CA226F007A41EF000220D920D930911F
S31500024A404DEF000A3016B0466C043CBC00060C4220
S31500024A500045660474656008 0C4200476608746780
S31500024A603F7C0001002A30020C40006667100C40B1
S31500024A70006567240C4000676730600 00364486F76
S31500024A800026486F002C204F3F280012204F2F2867
S31500024A90007E3F3C00016036486F0026486F002CBE
S31500024AA0302F001252403F00601A4A6F000A660613
S31500024AB03F7C0001000A486F0026486F002C204FF9
S31500024AC03F280012204F2F28007E3F3C0000486FEF
S31500024AD000244EB90002500C4BEF00146002528DB6
S31500024AE04A1566FA6002538D200F068000000014F4
S31500024AF0BBC063080C2D0030FFFF67EA200D3E00A5
S31500024B0041EF00149E484A47660842433F43002845
S31500024B106006362F002853434BEF002C0C420067E9
S31500024B2066160C43FFFC6D06B66F000A6D0442550D
S31500024B3060123ABC0001600C0C42006657C0440089
S31500024B4048803A804A6F00256704782D6002782BE7
S31500024B504A2F000466124A6F0026660C4A2F000688
S31500024B60670478206002424 44A5567344A6F002837
S31500024B706E143F7C00010036302F002844403F402F
S31500024B8000343C07602C302F0028B0476D0A3A07E4
S31500024B90090473F400036601A3A003C079C45601237
S31500024BA04A4767087A013C07534660063F7C000184
S31500024BB000360C420067662E4A2F0005673C4A45BE
S31500024BC0670A3E05DE6F0036DE46600A4A4667041D
S31500024BD03E0660027E01302F000AB0476F1C9047E6
S31500024BE03F40003260143E2F0034DE46302F000A6A
S31500024BF0B0476F0690473F4000324A2F0005660EC7
S31500024C00302F0034D046D06F00324A406F04740110
S31500024C10600242424A5566644A436C0A3EBC002D13
S31500024C203E03444760063EBC002B3E0345EF00149C
S31500024C300 0748C081FC000A48400600003015 00 3
S31500024C4048C78FFC000A4A4766E6200F0680000026
S31500024C500013B5C06604153C0030152F0001538AB7
S31500024C604A6F002A67047E4560027E65148741EF1B
S31500024C7000C5048200A90C03F4800304A4467045E
S31500024C807E01600242473607D645D66F0036D642C7
S31500024C90D66F0034D646D66F0032D66F00304BEF51
S31500024CA00084A2F0007670E3015B0436F24904361
S31500024CB03F40002E601C3015B0436F163E009E43E7
S31500024CC00C2F0030000266063F47003860043F475B
S31500024CD0003A4BEF0014424760122F0B3F3C002074
S31500024CE04E940C40002066000 0F85247BE6F003A10
S31500024CF06DE84A44670C2F0B3F044E94B04466009D
S31500024D0000E0424760122F0B3F3C00304E940C40AD
S31500024D1000030660000CC5247BE6F00386DE842474D
S31500024D206012181D48842F0B3F044E94B04466004F
S31500024D3000B05247BE456DEA424760122F0B3F3C18
S31500024D4000304E940C4000306600009 65247BE6F0B
S31500024D50000366DE84A42670E2F0B3F3C002E4E94FA
S31500024D600C40002E667A424760102F0B3F3C003003
S31500024D704E940C4000306668 5247BE6F00346DEAAE
S31500024D8042476010 1A1D48852F0B3F054E94B045C9
S31500024D90664E5247BE466DEC424660102F0B3F3CB4
S31500024DA000304E940C4000306636 5246BC6F0032DC
S31500024DB06DEA2A4A424660101E1D48872F0B3F079E
S31500024DC04E94B047661A5246BC6F00306DEA4246B0
S31500024DD060142F0B3F3C00204E940C4000206704C9
S31500024DE070FF60165246BC6F002E6DE6302F003AF9
S31500024DF0D043D06F0038D06F002E4FEF003C33C47
S31500024E0000A007564CDF7CFC205F4FEF00124ED00D
S31500024E104E714E714E7148E71F0433C000A0075809
S31500024E202A2F001C362F0020382F00227C2B2E051D
S31500024E304A856C062E0544877C2D204F2F28002498
S31500024E403F043F032F074EB900024F5C2A401B0660
S31500024E5020C0D33C000A0075A4CDF20F8205F4FEF29
S31500024E600000C4ED04E714E714E7148E7073E33C06C
S31500024E7000A0075C518F286F002C266F00303C2F54
S31500024E8000362A4C42474DD70C15002D66047E018A

S31500024E9060060C15002B66144A4666082C8C7E00AA
S31500024EA0600000984A466F025346528D204F3F28B3
S31500024EB000343F062F0E2F0D45EF00102F0A2A3C15
S31500024EC07FFFFFFF4EB90002523A4A40670E0C407E
S31500024ED00001671E0C400002674A605E7E002C8C51
S31500024EE04A4667560C150030665041ED00012C8883
S31500024EF060484A4767240C9280000000622620120E
S31500024F00B08562062E00448760302E3C8000000188
S31500024F100680800000019E8060202012B085620417
S31500024F202E0060164A4767082E3C80000000600289
S31500024F302E0533FC002200C04548200B6702269648
S31500024F402007508F33C000A0075E4CDF7CE0205F55
S31500024F504FEF000C4ED04E714E714E7148E7070866
S31500024F6033C000A007602E2F00143C2F00183A2FE2
S31500024F70001A4A456708287C0003081E6006287C3A
S31500024F800003082F700ED0AF001C224042112007EA
S31500024F90320648C14EB900024FCC1334080030061F
S31500024FA048C0220020074EB9000253E02E004A876D
S31500024FB066DC200933C000A007624CDF10E0205FE8
S31500024FC04FEF000C4ED04E714E714E712F010C8177
S31500024FD000010000641280C1690E2200424148416C
S31500024FE002800000FFFF601E2F011F3C002042814D
S31500024FF0E388E391B2AF0002650692AF00025280E7
S31500025000531766EC5C8F2001221F4E7548E7073E58
S3150002501033C000A007644FEFFFE42A6F00403C2F25
S315000250200004A246F004C266F0050284D4DEF0010A9
S31500025030206F00462C902D680004000442534879E4
S31500025040000299702F0E4EB9000216784A406C087B
S3150002505036BC00010A56800042457E09267C0002C3
S31500025060992B6042300748C0E788D08B2F002F0E60
S31500025070486F00084EB9000215AC487900029970D3
S31500025080486F00044EB9000216784A406D18300780
S3150002509048C0E788D08B2F002F0E4EB900025382EC
S315000250A07001EF68DA4053474A476CB82F0E4EB983
S315000250B0000216624A00675C7E09604A300748C0F1
S315000250C0E788D08B2F002F0E486F00104EB90002D2
S315000250D015DC2F0B486F000C486F00084EB9000212
S315000250E015AC487900029970486F00044EB9000267
S315000250F016784A406C102CAF00082D6F000C000485
S315000251007001EF689A4053474A476CB030055240E7
S315000251103480600242524A6F00446718DC524A46A3
S315000251206C122CBC000000002D7C00000000000464
S31500025130424634860C4600116F3A7C1160362F0EB9
S315000251404EB9000253942F400018302F001A48C05F
S31500025150E7880680000298D82F002F0E4EB900026B
S3150002516055CE2F0B2F0E4EB90002151E7030D02FC2
S315000251700001B18C03E0651CEFFC642142F0E4EB972
S315000251800000253942F4000187205B0816642302FF8
S315000251900001A48C0E7880680000298D82F002F0E12
S315000251A04EB9000255CE2F0E4EB9000216624A00C3
S315000251B06610B9CD671470D0D02CFFFF080000002E
S315000251C0670870062F400018600670042F4000180A
S315000251D00CAF0000000500186F42200C3E00200DA7
S315000251E09E4053476014523570000C3500397000EA
S315000251F06F0C1BBC0030700053474A476CE84A47A5
S3150002520006C1AB9CD67061ABC0031600E4A6F0044AB
S3150002521 0670A1ABC0031422D00015252200D4FEF8F
S315000252200001C33C000A007664CDF7CE0205F4FEF16
S315000252300001 44ED04E714E714E7148E73F3E33C058
S31500025240000A00768518F2C6F00382A6F003C246F2C
S31500025250000403C2F00443A2F00467E0042041604CA
S3150002526000C15003066444A46670000E24A466F0261
S31500025270534652 8D4A46672A0C15007867060C1566
S31500025280 0058661E4A4567060C450010661442041D
S315000252907A104A46670000B64A466F025346528D56
S315000252A0600878014A4566027A084A4566027A0A21
S315000252B00C4500246E0000960C4500026D00008E1F
S315000252C0300548C04480068000029 99C264030057D
S315000252D048C072FF2E81220020174EB9000253E009
S315000252E02F400004605E101548803F004EB9000250
S315000252F055E03F002F0B4EB90002559E28404A80CA
S31500025300674A7801243C0002999B200C94404A4645
S315000253106F025346528DBEAF00046302760130051A
S315000253 2048C02207C1414EB900025A82C1412E012C
S315000253300300248C044805380BE806302760130024 8
S3150002534048C0DE804A1567044A46669A200A670202
S31500025350248D4A04660642964240600C2C874A0314
S315000253606604700160027002508F33C000A0076AA3
S315000253704CDF7CFC205F4FEF00104ED04E714E7119
S315000253804E71205F20172F002F08207CFFFFC26A74
S315000253904EFB88FE4E56FFFC487800012F2E000871
S315000253A0486EFFFC207CFFFFC3484EBB88FE202EC2
S315000253B0FFFC4E5E205F584F4ED04E56FFFC48789B
S315000253C000002F2E0008486EFFFC207CFFFFC32240
S315000253D04EBB88FE202EFFFC4E5E205F584F4ED0FD
S315000253E02F010C8100010000641280C1690E2200A7
S315000253F04241484102800000FFFF601E2F011F3C10
S31500025400000204281E388E391B2AF0002650692AFC3
S3150002541000025280531766EC5C8F221F4E7548E7D6
S31500025420200433C000A0076C598F2A6F00144A95D6
S31500025430670001322F0D4EB900025860916D0008C7
S31500025440 0C6DFF8200086C38302D000848C044807D
S3150002545 00680FFFFFF82721FB0816F0642956000D1
S3150002546 0010442A7302D000848C044802040486805
S31500025470FF822F0D4EB9000257883B7CFF8200083F
S31500025480 0C6D007F00086F0A08ED0006000A600036
S31500025490 00E820390002999E0C80000100006 41485
S315000254A00C40000167640C400002675E0C4000037A
S315000254B0670000AA0C2D008000 0367182EBC0000AE
S315000254C00008048572F0D4EB9000258304A806700B7
S315000254D0008C60740C6D007F00086D100C95FFFF48
S315000254E0FF80660808ED0006000A6070082D0000BD
S315000254F0000267682EBC000000 8048572F0D4EB987
S3150002550000000258304A806754603E0CB9000000120
S31500025510000 2999E57C04400488048C0122D000AD6
S31500025520EE0902010C0017400140 1B082672E4A2DB1
S31500025530000 0367282EBC00000100485 72F0D4EB904
S3150002554000000258304A806714487800014878000102
S31500025550 2F0D4EB90002578852 6D00080295FFFFC3
S31500025560FF006606426D0008600E0C6D007F0008A3
S31500025570 6F0608ED0006000A2F0D204F2F28001493
S315000255804EB9000256C4588F33C000A0076E4CDFD6
S31500025590 2004205F508F4ED04E714E714E7133C033
S315000255A000A00770226F0004322F00081011B0010C
S315000255B066042009 60064A1966F2700033C000A02C
S315000255C00772205F5C8F4ED04E714E714E71205F16
S315000255D020172F002F08207CFFFFBFD04EFB88FE2E
S315000255E033C000A00774322F00040C4100616D0C19
S315000255F00C41007A6E0670E0D0416002300133C081
S31500025600 00A00776205F548F4ED04E714E714E71B8
S31500025610 48E7010833C000A00778226F000C206F0C
S31500025620001049E9000A0810000756C044004880E5
S31500025630 48C002000001EF0808940 00781142010F8
S31500025640 7217E2A8024000FF33400008203C007FA8
S31500025650FFFFC090E18822800894000 6021400CF62
S3150002566000C6900FF0008662A4A91671E08110006A7
S31500025670 67047E0160027E027003C007E908022900
S31500025680C0CF000A8129000A602408E90006000A00
S31500025690601C4A690008660C4A916712337CFF82D5
S315000256A000008600A08D100070469007F000833C0B9
S315000256B0 00A0077A4CDF1080205F508F4ED04E71CB
S315000256C04E714E712F0733C000A0077C226F000C6B
S315000256D0082900 07000A67082E3C800000006002C5
S315000256E07E007030C029000A673C00877F80000078
S315000256F020110880001FE0888E80203C0003FFFFF7
S315000257000C08766060 0870007FFFF1029000AE8081F
S31500025710020000030C000001660608C70012604E74
S315000257200887001260480829000 6000A67080087F1
S315000257307F80000060384A9166060887001F602E47
S3150002574 00C69FF8200086608 2011E0888E80601EC0
S31500025750302900084 8C006800000007F7217E3A8BF
S315000257608E802011E0880280007FFFFF8E80206FEE
S31500025770 00 08208733C000A0077E2E1F205F508FAF
S315000257804ED04E714E714E7148E7030033C000A0F1
S31500025790 0780226F000C2C11028600000010CAF5C
S315000257A0000000 02000106D044291601C4AAF0014F4
S315000257B067082E3C8000000060027E002011122F36
S315000257C00013E2A880872280200633C000A0078249
S315000257D04CDF00C0205F4FEF000C4ED04E714E7171
S315000257E04E712F0733C000A00784226F00080811EC

S315000257F0000756C04400488048C02E000CAF000087
S315000258000020000C6D044291500E2011122F000F31
S31500025810E3A880AF00102280200733C000A00786CD
S315000258202E1F205F4FEF000C4ED04E714E714E71FF
S3150002583033C000A00788226F0004206F00082010E2
S31500025840D1912011E09055C04400488048C033C061
S3150002585000A0078A205F508F4ED04E714E714E7156
S3150002586048E7010433C000A0078C2A6F000C081514
S31500025870000766044A956604700060162F154EB935
S31500025880000259EC2E0042A72F072F0D6100FF548C
S31500025890200733C000A0078E4CDF2080205F588F80
S315000258A04ED04E714E714E7148E73F0033C000A094
S315000258B00790598F206F00282810206F002C2A107D
S315000258C0203C0000FFFFC084223C0000FFFFC2858F
S315000258D04EB900025A822E00203C0000FFFFC0840F
S315000258E022057410E4A94EB900025A822600200449
S315000258F07210E2A8223C0000FFFFC2854EB90002E8
S315000259005A82240020047210E2A822052E8070100A
S31500025910E0A92017C1414EB900025A82C1412C01A9
S3150002592020077210E2A8223C0000FFFFC283D0814A
S31500025930223C0000FFFFC282D0817210E2A8DC8006
S315000259402003E2A822027810E8A9D081DC80203C5C
S315000259500000FFFFC083E9A8DE80203C0000FFFFB5
S31500025960C082E9A8DE80206F00202086206F0024F6
S315000259702087588F33C000A007924CDF00FC205FBF
S315000259804FEF00104ED04E714E714E7148E7011C1A
S3150002599033C000A007942A6F0014286F0018266FE0
S315000259A0001C7E0042A7487800012F0C6100FE34DD
S315000259B02F00487800012F0D6100FE284A806606F6
S315000259C02015B09365062013919552945287702044
S315000259D0BE806DD033C000A007964CDF3880205FB2
S315000259E04FEF000C4ED04E714E714E7148E70300D8
S315000259F033C000A00798222F000C4A81660470006B
S31500025A00602A203CFFFF0000C081670A2E3C80000E
S31500025A1000007C00600E2E3C000080007C106004BA
S31500025A20E28F52862007C08167F6200633C000A0A7
S31500025A30079A4CDF00C0205F588F4ED04E714E71D0
S31500025A404E7133C000A0079C4AAF0004670A204F7C
S31500025A502F28000461966018 4AAF00086710204F8D
S31500025A602F280008618606800000C0206002700070
S31500025A7033C000A0079E205F508F4ED04E714E71EC
S31500025A804E7148E7C000C0C1C2D748414241D081E9
S31500025A90322F0002C2EF000448414241D081222F38
S31500025AA00004508F4E7514FD0CFEC000000000002D
S31500025AB0FFFF00000000FFFFFFFF000000000000E4
S31500025AC0FFFF0000000000010400C0025AAA0002C3
S31500025AD05AAE000299A60053040000025AB200020E
S31500025AE05AB6000299B200730000000000000000DE
S31500025AF00000000299B80470040000025ABA0002BB
S31500025B005ABE000299C10031010000025AC20002C7
S31500025B108042000299D10032010000025AC20002FC
S31500025B208042000299DE0033010000025AC20002DE
S31500025B308042000299EB0034010000025AC20002C0
S31500025B408042000299F80035010000025AC20002A2
S31500025B50804200029A050036010000025AC2000283
S31500025B60804200029A120037010000025AC2000265
S31500025B70804200029A1F007100000000000000002F
S31500025B80000000029A3700640000000000000000D6
S31500025B90000000029A4400440000000000000000D9
S31500025BA0000000029A4F0457020000027E380002EB
S31500025BB07E3800029A6D00029A87000009C600022A
S31500025BC05AC600029A8C000F00029AD000029AD797
S31500025BD000029ADF00029AE900029AF200029AF99A
S31500025BE000029B0200029B8000001152000000008E
S31500025BF000029B86010000029BA4000015A2000081
S31500025C0015DA000016280000169C0000003000007D
S31500025C100100036400000000000000000000000212
S31500025C2009BE0036300000000000000000000000289
S31500025C3009BF7037300000000000000000000000252
S31500025C409C0C0401020000027E3C00025C0A000277
S31500025C509C220402020000027E3C00025C0E00024C
S31500025C609C450443020000027E3800027E38000290
S31500025C709C640457020000027E3800027E3800024D
S31500025C809C7B047200000000000000000000000027D
S31500025C909C9200029CBE0000177400025C12000275
S31500025CA09CC3030800029E160000000D000C000DA6
S31500025CB0000C000000000000800000000000FFFF52
S31500025CC0FFFFF149F2CA7149F2CA00000000000062
S31500025CD000000000000A00FFFFFF000004D20501D9
S31500025CE0040000025CCA00025CD600029EB80502ED
S31500025CF0040000025CCA00025CD600029EC3057361
S31500025D00020000025CB200025CB600029ECC054CA8
S31500025D100000000000000000000000029EE90546A7
S31500025D200000000000000000000000029F08056954
S31500025D300000000000000000000000029F31056C18
S31500025D400000000000000000000000029F490563F9
S31500025D500000000000000000000000029F610548EC
S31500025D60040000025CBA00025CBE00029F7D05666A
S31500025D70050000025CC200025CC600029FC80574F0
S31500025D8000000000000000000000000002A008055309
S31500025D90020000025CCE00025CD20002A00D056584
S31500025DA000000000000000000000000002A0200543E1
S31500025DB0020000025CDA00025CDA0002A041056D14
S31500025DC000000000000000000000000002A056057559
S31500025DD000000000000000000000000002A0670002B0
S31500025DE0A082000021D400025CDE0002A08505101C
S31500025DF00002A268000029CA000000000002A26B8D
S31500025E00010000015180FFFFFFFE0000000241C0B9
S31500025E100000C1C000000301070000027E3C000230
S31500025E205E020002A2840302060000027E3C000219
S31500025E305E060002A29C0166020000027E3C00028F
S31500025E405E0A0002A2BC034F050000025E120002B7
S31500025E505E0E0002A2EA0002A30C00002A5C000207
S31500025E605E160002A30F0104456100000000123411
S31500025E700000000100000040FFFFFFFF00000008D5
S31500025E80084D020000027E40000284E00002A3EEFA
S31500025E9000158000000000000000000000002A406F5
S31500025EA000552000000000000000000000002A429C4
S31500025EB0087A020000027E4000027E400002A44BE5
S31500025EC000147000000000000000000000002A46A72
S31500025ED00824020000027E4000027E400002A47FE7
S31500025EE00850020000027E40000284E80002A497E5
S31500025EF00851020000027E40000266580002A4B861
S31500025F00083D020000027E40000284E40002A4D39F
S31500025F100870020000027E40000284F40002A4F12E
S31500025F20023E060000027E3C000284EC0002A51935
S31500025F30023C060000027E3C000284EC0002A52818
S31500025F40086C020000027E3C000284F80002A535BD
S31500025F5000241000000000000000000000002A53F10
S31500025F600201020000025E7000025E740002A55F7A
S31500025F700443020000025E6C00025E6C0002A56C25
S31500025F80036E020000025E7000025E740002A57DCE
S31500025F900034C000000000000000000000002A5887B
S31500025FA000361000000000000000000000002A59D41
S31500025FB00274080000027E3C00C000FA0002A5B48A
S31500025FC00254080000027E3C00C000FA0002A5CF7F
S31500025FD000254000000000000000000000002A5E8C4
S31500025FE00034E000000000000000000000002A5FAB7
S31500025FF000359000000000000000000000002A6186D
S315000260000036D000000000000000000000002A63D33
S3150002601000573000000000000000000000002A65CFF
S315000260200202020000027E3C00025E780002A684A2
S315000260300203020000027E3C00025E780002A6AC69
S3150002604000273000000000000000000000002A6F239
S3150002605000275000000000000000000000002A71AFE
S3150002606000278000000000000000000000002A73ACB
S3150002607000231000000000000000000000002A758E4
S3150002608000249000000000000000000000002A7779D
S3150002609004530400000280520002804E0002A788C8
S315000260A00567010000027E4000025E7C0002A7C175
S315000260B000566000000000000000000000002A85172
S315000260C000563000000000000000000000002A8872F
S315000260D00002A8BD00002C5E00025E800002A8C37A
S315000260E0001250000000000000000000000000000082
S315000260F00000000000000000000000000000000098
S315000261000000000000000000000000000000000087
S315000261100000000000000000000000000000000077
S315000261200000000000000000000000000000000067
S315000261300000000000000000000000000000000057
S315000261400000000000000000000000000000000047

S3150002615000000000000000000000000000000000037
S3150002616000000000000000000000000000000000027
S3150002617000000000000000000000000000000000017
S3150002618000000000000000000000000000000000007
S31500026190000000000000000000000000000000000F7
S315000261A0000000000000000000000000000000000E7
S315000261B0000000000000000000000000000000000D7
S315000261C0000000000000000000000000000000000C7
S315000261D0000000000000000000000000000000000B7
S315000261E0000000000000000000000000000000000A7
S315000261F000000000000000000000000000000000097
S3150002620000000000000000000000000000000000086
S3150002621000000000000000000000000000000000076
S3150002622000000000000000000000000000000000066
S3150002623000000000000000000000000000000000056
S3150002624000000000000000000000000000000000046
S3150002625000000000000000000000000000000000036
S3150002626000000000000000000000000000000000026
S3150002627000000000000000000000000000000000016
S3150002628000000000000000000000000000000000006
S31500026290000000000000000000000000000002ACA8A0
S315000262A00000355E000000000002ACAD0100027E77
S315000262B00018000000000000000000000000000A7440
S315000262C07970652073706163652066F72206E65F2
S315000262D0787420706167652C20435220666F7220A5
S315000262E06F6E65206C696E652C206374726C2D432B
S315000262F020746F2061626F7274000150000000000A
S3150002630000000000000000002ACC40002ACD900008C
S315000263103CB2000262FA0002ACDE030100000000099
S3150002632000000000240300000041A00000000000030F
S315000263300000003008240200000027E4000027E4077
S3150002634000002ACEA044402000027E3C00027E40E7
S3150002635000002AD02045302000027E3C00027E40AF
S3150002636000002AD2D045702000027E3800027E387C
S3150002637000002AD4F044302000027E3800027E385E
S3150002638000002AD6C046C000000000000000000007A
S3150002639000002AD970473000000000000000000038
S315000263A00002ADD2016400000000000000000000FF
S315000263B00002ADF904440200000027E3C0002632C96
S315000263C00002AE0A04420200000027E3C00027E4047
S315000263D00002AE44045505000002632400026328 4D
S315000263E00002AE6D04750000000000000000000000F
S315000263F00002AE9B04700200000027E3C0002632093
S3150002640000002AEA705740200000027E3C00027E4036
S3150002641000002AED8046202000027E3C00027E4008
S3150002642000002AF0B046302000027E3C00027E40C3
S3150002643000002AF30045402000027E3C00027E409D
S3150002644000002AF56046E020000027E3C0002633078
S3150002645000002AF730002AF9000003CE40002633416
S3150002646000002AF95011242980000C01F5C29401F2E
S315000264705C293E6BEC9938D1B7170000000000008A
S31500026480000D801000000000000000000000000002B
S31500026490000000000000000000000000000000000F4
S315000264A0000000000000000000000000000000000E4
S315000264B0000000000000000000000000000000000D4
S315000264C0000000000000000000000000000000000C4
S315000264D0000000000000000000000000000000000B4
S315000264E0000000000000000000000000000000000A4
S315000264F000000000000000000000000000000000094
S3150002650000000000000000000000000000000000083
S3150002651000000000000000000000000000000000073
S3150002652000000000000000000000000000000000063
S3150002653000000000000000000000000000000000053
S3150002654000000000000000000000000000000000043
S3150002655000000000000000000000000000000000033
S3150002656000000000000000000000000000000000023
S3150002657000000000000000000000000000000000013
S3150002658000000000000000000000000000000000003
S31500026590000000000000000000000000000000000F3
S315000265A0000000000000000000000000000000000E3
S315000265B0000000000000000000000000000000000D3
S315000265C0000000000000000000000000000000000C3
S315000265D0000000000000000000000000000000000B3
S315000265E0000000000000000000000000000000000A3
S315000265F000000000000000000000000000000000093
S3150002660000000000000000000000000000000000082
S3150002661000000000000000000000000000000000072
S3150002662000000000000000000000000000000000062
S3150002663000000000000000000000000000000000052
S3150002664000000000000000000000000000000000042
S31500026650000000000000000E0000000F0002B18AD8
S3150002666000002B1910002B1980002B1A10002B1ABE1
S3150002667000002B1B50002B1BE0002B1C90002B1D436
S3150002668000002B1E00002B1EB0002B1F80002B20171
S3150002669000002B2080002B20F0002B2160002B222D3
S315000266A00002B22B0002B2370002B23F0002B24829
S315000266B00002B24F0002B2560002B25D0002B2649C
S315000266C00002B26B0002B2720002B2790002B28418
S315000266D00002B2900002B29A0002B2A40002B2AC68
S315000266E00002B2B70002B2C10002B2CC0002B2D5B9
S315000266F00002B2E00002B2EB0002B2F60002B301FF
S3150002670000002B30C0002B3170002B31F0002B32A41
S3150002671000002B3340002B3400002B34A0002B3548B
S3150002672000002B35E0002B3660002B3720002B37CDB
S3150002673000002B3840002B38F0002B39B0002B3A42B
S3150002674000002B3AD000000000000000000000000DF
S3150002675000000000000000000000000000000000031
S315000267600004000500060007000000000000100000A
S3150002677000002000000030000000400000005000003
S3150002678000006000000070000000780000007A000C6
S315000267900007C00000080000FFFFFFFF38230102C8
S315000267A0000000000000000000000000000000000E1
S315000267B0000000000000000000000000000000000D1
S315000267C0000000000000000000000000000000000C1
S315000267D0000000000000000000000000000000000B1
S315000267E0000000000000000000000000000000000A1
S315000267F000000000000000000000000000000000091
S3150002680000000000000000000000000000000000080
S3150002681000000000000000000000000000000000070
S3150002682000000000000000000000000000000000060
S3150002683000000000000000000000000000000000050
S3150002684000000000000000000000000000000000040
S3150002685000000000000000000000000000000000030
S3150002686000000000000000000000000000000000020
S3150002687000000000000000000000000000000000010
S3150002688000000000000000000000000000000000000
S31500026890000000000000000000000000000000000F0
S315000268A0000000000000000000000000000000000E0
S315000268B0000000000000000000000000000000000D0
S315000268C0000000000000000000000000000000000C0
S315000268D0000000000000000000000000000000000B0
S315000268E0000000000000000000000000000000000A0
S315000268F000000000000000000000000000000000090
S315000269000000000000000000000000000000000007F
S31500026910000000000000000000000000000000000145B
S31500026920001400140014001400140014001500016BC
S3150002693000180019001900 1A001B001C001E001F77
S31500026940002100230026002800 2A002C002D4108E1
S315000269504A27000000000000000000000000000000BE
S315000269600000000000000000000000000000000001F
S31500026970000000000000000FFFFFA24FFFFFF8175
S31500026980427800004240000000000000451C400022
S3150002699 0C2C8000042C80000000005DC0000012C4D
S315000269A00000000000000030000000000000017C5
S315000269B000000004000000FF0000000000000038D
S315000269C00000000030000000700000000F0000001F87
S315000269D00000003F0000003F00000000000000FFF23
S315000269E0000004D2014D020000027E40000284E053
S315000269F00002B452015800000000000000000000002E
S315000026A000002B46A0472000000000000000000000E8
S315000026A100002B48D087A020000027E4000027E4027
S315000026A200002B4AF0147000000000000000000000B1
S315000026A300002B4CE0824020000027E4000027E401C
S315000026A400002B4E30250020000027E40000284E823
S315000026A500002B4FB0251020000027E4000026658A8
S315000026A600002B51C023D020000027E40000284E4E0
S315000026A700002B5370270020000027E40000284F472
S315000026A800002B555023E060000027E3C000284EC7E
S315000026A900002B57D023C060000027E3C000284EC48
S315000026AA00002B58C026C020000027E3C000284F8F1

```
S31500026AB00002B59904640000000000000000000000016
S31500026AC00002B5A3046300000000000000000000000FD
S31500026AD00002B5B20556020000027E4000027D7C2D
S31500026AE00002B5C90549020000027E4000027D7C13
S31500026AF00002B5D705520200000269A8000269AC7D
S31500026B000002B5E505440300002697C0002699CA7
S31500026B100002B5F3054103000026978000269989 4
S31500026B200002B60D055300000000000000000000040
S31500026B300002B62E0576020000269A0000269A4D0
S31500026B400002B65205430200027E3800027E3879
S31500026B500002B6600548000000000000000000000C8
S31500026B600002B674054E030000269780002699 8B5
S31500026B700002B68D054C0300002697800026998 8E
S31500026B800002B6C705730300002697800026998 1D
S31500026B900002B6FE0536020000269B8000269BCB0
S31500026BA00002B72F0537020000269B8000269C069
S31500026BB00002B7400538020000269B8000269C443
S31500026BC00002B7510539020000269B8000269C81D
S31500026BD00002B7620530020000269B8000269CC01
S31500026BE00002B7730531020000269B8000269D0DB
S31500026BF00002B7850566020000269B8000269D480
S31500026C000002B79705570200027E3800027E385E
S31500026C100002B7B4056102000269D8000269DC0D
S31500026C200002B7C8046F000000000000000000000068
S31500026C300002B808054F020000027E3C000269B05D
S31500026C400002B856054205000026988000269 8CF6
S31500026C500002B87F0562020000027E3C000269B4AF
S31500026C600002B89B05460500002698400026980 9D
S31500026C700002B8D00578050000269900002699406
S31500026C800002B8F4057500000000000000000000000D4
S31500026C900002B9050554000000000000000000000000D3
S31500026CA00002B93E0002B97E00009940000269E482
S31500026CB00002B981042C0000000000000000000000060
S31500026CC000000000000000000000000000000000BC
S31500026CD000000000000000000000000000000000AC
S31500026CE0000000000000000000000000000000009C
S31500026CF0000000000000000000000000000000008C
S31500026D00000000000000000000000000000000007B
S31500026D10000000000000000000000000000000006B
S31500026D20000000000000000000000000000000005B
S31500026D30000000000000000000000000000000004B
S31500026D40000000000000000000000000000000003B
S31500026D50000000000000000000000000000000002B
S31500026D60000000000000000000000000000000001B
S31500026D70000000000000000000000000000000000B
S31500026D8000000000000000000000000000000000FB
S31500026D9000000000000000000000000000004180 2A
S31500026DA000003F91EB863F80000038D1B7173FB510
S31500026DB004EE41B504EE3D80000044109A784398F3
S31500026DC08000000000004B1896802FA2E3FF469C2D
S31500026DD04000471C40004F492A6A3F000000BF801E
S31500026DE000000002BEBA0002BF020002BF03000298
S31500026DF0BF180002BF1B0002BF200002BF430002F1
S31500026E00BF7A0002BFBD0002C016014D0200000299
S31500026E107E40000284E00002C050015800000000DB
S31500026E200000000000000002C068055200000000D9
S31500026E300000000000000002C08B087A0200000277
S31500026E407E4000027E400002C0AD014700000000 05
S31500026E500000000000000002C0CC08240200000 26C
S31500026E607E4000027E400002C0E10850020000029D
S31500026E707E40000284E80002C0F902510200000 2CC
S31500026E807E400002665800 02C11A023D0200000 25C
S31500026E907E40000284E40002C135087002000002 4E
S31500026EA07E40000284F40002C153023E0600000244
S31500026EB07E3C000284EC0002C17B023C060000021A
S31500026EC07E3C000284EC0002C18A086C02000002C9
S31500026ED07E3C000284F80002C197027000000000A6
S31500026EE00000000000000002C1A1025600000000DE
S31500026EF00000000000000002C1A8015400000000CA
S31500026F000000000000000002C1AE025000000000B6
S31500026F100000000000000002C1B50264000000008B
S31500026F200000000000000002C1C0024400000000 90
S31500026F300000000000000002C1D10474000000003D
S31500026F400000000000000002C1DD0248000000004F
S31500026F500000000000000002C1EF027100000000 04
S31500026F600000000000000002C2090246000000000 4
S31500026F700000000000000002C20F047800000000BA
S31500026F800000000000000002C219047600000000A2
S31500026F900000000000000002C23E053500000000AD
S31500026FA00000000000000002C25A0002C27A00007D
S31500026FB0BB3A00026E0A0002C27D011A00040102F7
S31500026FC0000501020400010206050001020600 0195
S31500026FD003040002C2920002C2960002C29C000290
S31500026FE00C2A1000000000000000000000000000 36
S31500026FF00000000000000000000000000000000089
S3150002700000000000000000000000000000000000 78
S315000270100000000000000000000000000000000068
S315000270200000000000000000000000000000000058
S315000270300000000000000000000000000000000048
S315000270400000000000000000000000000000000038
S315000270500000000000000000000000000000000028
S315000270600000000000000000000000000000000018
S315000270700000000000000000000000000000000008
S3150002708000000000000000000000000000000000F8
S3150002709000000000000000000000000000000000E8
S315000270A000000000000000000000000000000000D8
S315000270B000000000000000000000000000000000C8
S315000270C00000000000000000000042C800000000AE
S315000270D0000047C35000C7C3500047C3500000001A
S315000270E005A00000001E014D020000027E400002C3
S315000270F084E00002C4A20158000000000000000063
S3150002710000000002C4BA045200000000000000 00A1
S3150002711000000002C4DD087A020000027E4000027E
S3150002712007E400002C4FF01470000000000000000 8C
S3150002713000000002C51E0824020000027E40000272
S3150002714007E400002C533025002000002 7E40000269
S31500027150084E80002C54B0251020000027E40000292
S31500027160066580002C56C023D020000027E40000223
S31500027170084E40002C5870270020000027E4000021B
S31500027180084F40002C5A5023E060000027E3C00020F
S31500027190084EC0002C5CD023C060000027E3C0002E1
S315000271A0084EC0002C5DC026C020000027E3C000296
S315000271B0084F80002C5E901540000000000000000046
S315000271C000000002C5F302740000000000000000 87
S315000271D000000002C5F902420000000000000000A3
S315000271E000000002C5FD024C0000000000000000 85
S315000271F000000002C60A024400000000000000006F
S3150002720000000002C61702640000000000000000 31
S3150002721000000002C62E02480000000000000000 26
S3150002722000000002C64C02630000000000000000DD
S3150002723000000002C66903790000000000000000 99
S3150002724000000002C68B03590000000000000000 87
S3150002725000000002C6E403530000000000000000 24
S3150002726000000002C71403750600000 27E3C0002FD
S31500027270084EC0002C73C0343020000027E3800028F
S315000272807E380002C763017100000000000000 00A2
S3150002729000000002C76D036D00000000000000 0040
S315000272A000000002C773047800000000000000001E
S315000272B000000002C7A3047200000000000000 00E4
S315000272C000000002C7DA047300000000000000009C
S315000272D000000002C80C0270020000027E4000029A
S315000272E084F40002C833026200000000000000 00BD
S315000272F000000002C85B026B0500000270CE0002AD
S31500027300070D20002C88D02610500000270CE000232
S31500027310070D20002C8BE02410500000270D6000209
S31500027320070DA0002C8FD0531020000027E3C00024E
S31500027330070DE0002C9470532020000027E3C0002EE
S315000273407E400002C9AB0533020000027E3C000209
S315000273507E400002C9DA0534020000027E3C0002C9
S315000273607E400002CA0F0535020000027E4000027E
S31500027370084F40002CA510536020000027E3C000275
S31500027380084F40002CA8E0537020000027E3C000227
S31500027390084F40002CAD50538020000027E3C0002CF
S315000273A084F40002CB1C0557020000027E3800025C
S315000273B07E380002CB680577020000027E4000029A
S315000273C070DE0002CB85056F020000027E400002DD
S315000273D070E20002CBA6057A020000027E380002A5
S315000273E07E380002CBEA055A020000027E3800020D
S315000273F07E380002CC0E04450000000000000000AA
S3150002740000000002CC3D05460000000000000000 1E
```

S315000274100000002CC7C0002CC900000CEA000024C
S3150002742070E60002CC940133000000000000000068
S31500027430000000000000000000000000000000044
S31500027440000000000000000000000000000000034
S31500027450000000000000000000000000000000024
S31500027460000000000000000000000000000000014
S31500027470000000000000000000000000000000004
S315000274800000000000000000000000000000000F4
S315000274900000000000000000000000000000000E4
S315000274A00000000000000000000000000000000D4
S315000274B00000000000000000000000000000000C4
S315000274C00000000000000000000000000000000B4
S315000274D00000000000000000000000000000000A4
S315000274E0000000000000000000000000000000094
S315000274F0000000000000000000000000000000084
S31500027500000000000000000000000000000000073
S315000275100000000000000000000000040E00D40F6
S3150002752000000000040F518000000000003FF00000D7
S31500027530000000000000000014D020000027E4033
S315000275400000284E00002D3AE0358000000000000EF
S31500027550000000000002D3C60552000000000000031
S31500027560000000000002D3E9087A020000027E4011
S315000275700027E400002D40B014700000000000001A
S31500027580000000000002D42A0824020000027E4005
S315000275900027E400002D43F0250020000027E40FA
S315000275A0000284E80002D4570251020000027E4023
S315000275B0000266580002D478023D020000027E40B4
S315000275C0000284E40002D4930270020000027E40AC
S315000275D0000284F40002D4B1023E060000027E3CA0
S315000275E0000284EC0002D4D9023C060000027E3C72
S315000275F0000284EC0002D4E8026C020000027E3C27
S315000276000000284F80002D4F5024C000000000000DB
S31500027610000000000002D4FF0244000000000000047
S31500027620000000000002D5080274080000027E3C39
S31500027630000C000FA0002D5170254080000027E3C80
S31500027640000C000FA0002D5320177000000000000F7
S31500027650000000000002D54B016300000000000009C
S31500027660000000000002D57C044500000000000076
S315000276700000000000002D5B00002D5EF0000EB0AC0
S315000276800002753800002D5F301140000000000000064
S315000276900000000000000000000000000000000E2
S315000276A00000000000000000000000000000000D2
S315000276B00000000000000000000000000000000C2
S315000276C00000000000000000000000000000000B2
S315000276D00000000000000000000000000000000A2
S315000276E0000000000000000000000000000000092
S315000276F0000000000000000000000000000000082
S31500027700000000000000000000000000000000071
S31500027710000000000000000000000000000000061
S31500027720000000000000000000000000000000051
S31500027730000000000000000000000000000000041
S31500027740000000000000000000000000000000031
S31500027750000000000000000000000000000000021
S31500027760000000000000000000000000000000011
S315000277700003F80000042700000497424004 0F57A
S31500027780180000000000040E00D40000000000006C
S31500027790000060AD78EC000000080000006082436
S315000277A0020000027E4000027E400002D6DA02504B
S315000277B0020000027E4000027D800002D6F20164D1
S315000277C0000000000000000000000002D70B024487
S315000277D0000000000000000000000002D71F027730
S315000277E0000000000000000000000002D74C045711
S315000277F0020000027E3800027E380002D77504437A
S31500027800020000027E3800027E380002D790044948
S3150002781005000002778E000277920002D7BB04565B
S3150002782005000002778E000277920002D7CF04315C
S3150002783005000002778E000277920002D7E4043236
S31500027840010000027E4000027796000 2D81004333F
S31500027850020000027E3C0002779A0002D837043406
S3150002786005000002778E000277920002D861043585
S31500027870010000027E40000277960002D88A043692
S31500027880020000027E3C0002779A0002D8AE04375C
S3150002789005000002778E000277920002D8DD0438D6
S315000278A0010000027E40000277960002D90B0453C3
S315000278B0000000000000000000000002D93404723B
S315000278C0000000000000000000000002D96500026E
S315000278D0D9A20000F5060002779E0002D9A801137C
S315000278E000010001000100010001000100010 00188
S315000278F000020002000100010001000100010 00176
S31500027900000100010002000200000000000000069
S3150002791000000000000000000001000100010 0015B
S31500027920000100010001000100000000000001000149
S31500027930000100010001000100010001000000000039
S31500027940000200020002000200000000000000027
S3150002795000010001000100000000000000000100001B
S31500027960000100010002000200020001000000 28DE
S31500027970020102000027E3C0002796C0002DAB8C3
S3150002798000002DAD50000FC1E000279700002DADA83
S31500027990010 1FFFFFFFF00000006000000030000D8
S315000279A00F0000000070000000300000017000009F
S315000279B00018000003E8000000030000000040000B5
S315000279C000002000000FFF014D020000027E4000028D
S315000279D084E00002DB10015800000000000000000F5
S315000279E000000002DB28056F00000000000000000016
S315000279F000000002DB4B087A020000027E40000211
S315000027A007E400002DB6D01470000000000000001E
S31500027A1000000002DB8C0824020000027E40000205
S31500027A207E400002DBA1085002000 0027E400002F6
S31500027A3084E80002DBB9085102000 0027E4000021F
S31500027A4066580002DBDA083D020000027E400002B0
S31500027A5084E40002DBF5027002000 0027E400002AE
S31500027A6084F40002DC13083E060000027E3C00029B
S31500027A7084EC0002DC3B083C060000027E3C00026D
S31500027A8084EC0002DC4A086C020000027E3C000222
S31500027A9084F80002DC5704640000000000000000C5
S31500027AA000000002DC6104560200000027E3C000275
S31500027AB0799A0002DC7004490200000027E3C000250
S31500027AC0799A0002DC7E045202000000269A80002D2
S31500027AD079AA0002DC8C047602000000269A0000288
S31500027AE069A40002DC9A0448000000000000000BD
S31500027AF000000002DCBA045400000000000000008E
S31500027B0000000002DCF70446020000027E3C00028E
S31500027B10799A0002DD00047200000000000000000F5
S31500027B2000000002DD6804670300000027992000289
S31500027B30799E0002DD8E0477000000000000000003E
S31500027B4000000002DDC304410200000027E3C000286
S31500027B5079A20002DE12044E020000027E3C0002FE
S31500027B6079A20002DE540478020000027E3C000282
S31500027B7079A60002DE970463020000027E3C000240
S31500027B8079C20002DED80443020000027E3C0002F3
S31500027B9079C20002DEF00462020000027E3C0002AC
S31500027BA069B40002DF06046E020000027E3C000297
S31500027BB079AE0002DF3B0473020000027E3C000243
S31500027BC079B60002DF660444020000027E3C00022F
S31500027BD079B20002DF85044C020000027E3C0002FC
S31500027BE079BA0002DFB4046D020000027E3C000294
S31500027BF079BE0002E02B04740000000000000000C1
S31500027C000000002E0640002E09B0000FC5E00024D
S31500027C1079C60002E09E0424000401020000000 6E
S31500027C200000000000000000000000000000000004C
S31500027C300000000000000000000000000000000003C
S31500027C400000000000000000000000000000000002C
S31500027C500000000000000000000000000000000001C
S31500027C600000000000000000000000000000000000C
S31500027C7000000000000000000000000000000000FC
S31500027C8000000000000000000000000000000000EC
S31500027C9000000000000000000000000000000000DC
S31500027CA000000000000000000000000000000000CC
S31500027CB000000000000000000000000000000000BC
S31500027CC000000000000000000000000000000000AC
S31500027CD000000000000000000000000000000000009C
S31500027CE000000000000000000000000000000000008C
S31500027CF000000000000000000000000000000000007C
S31500027D0000000000003F80000038D1B717358F2A6384
S31500027D10418000003F547AE10002E73800011FDA91
S31500027D2000011EC40001216800012198000120AA59
S31500027D3000011F4E000121800001246400000000A2
S31500027D400000000000049742400000000007D007D09C
S31500027D5007D007D004A1050D042C04BC04A1050D0F
S31500027D6003C8044A0432049403C8044A043204943D

S31500027D7003C8044A0432049403C805AA0000000397
S31500027D800000000F00000000000000000000000DC
S31500027D90000000000000000000000000000000409B
S31500027DA000000000000000100000000000000004B7
S31500027DB0000000000000000001012C004B001800101A
S31500027DC000000898000007080002E7DF000089894
S31500027DD0000007080002E7EF00000E74000008002A
S31500027DE00002E7F7000006680000019A0002E807B1
S31500027DF000000898000007080002E81900000320A6
S31500027E0000000006400002E82400000FA000000CE459
S31500027E100002E841000002660000004400002E85F3A
S31500027E20000000000000000000002E87300000000ED
S31500027E300000000000002E889000004D20000000F1
S31500027E400000000100004B00000800000002E8AC40
S31500027E500002E8B3544D582D3520736F667477616E
S31500027E60726520436F70797269676874203139397
S31500027E70352D313939392C323030302051756164423
S31500027E806C6F67696320436F6E74726F6C73204305
S31500027E906F72706F726174696F6E2E0D0A416C6C2F
S31500027EA0207269676874732072657365727665649
S31500027EB02E000002E8BA0002E8C20002E8C9000287
S31500027EC0E8D10002E8D80002E8DC0002E8E200029B
S31500027ED0E8E70002E8F00002E8F60002E8FE000227
S31500027EE0E90D0002E9140002E91C0002E920000281
S31500027EF0E9270002E92D0002E9360002E940000006
S31500027F00000000000000000000000000000000069
S31500027F10000000000000000000000000000000059
S31500027F20000000000000000000000000000000049
S31500027F30000000000000000000000000000000039
S31500027F40000000000000000000000000000000029
S31500027F50000000000000000000000000000000019
S31500027F60000000000000000000000000000000009
S31500027F7000000000000000000000000000000000F9
S31500027F8000000000000000000000000000000000E9
S31500027F9000000000000000000000000000000000D9
S31500027FA000000000000000000000000000000000C9
S31500027FB000000000000000000000000000000000B9
S31500027FC000000000000000000000000000000000A9
S31500027FD0000000000000000000000000000000099
S31500027FE0000000000000000000000000000000089
S31500027FF0000000000000000000000000000000079
S3150002800000000000000000000000000000000068
S3150002801000000000000000000000000000000058
S3150002802000000000000000000000000000000048
S3150002803000000000000000000000000000000038
S315000280400000500000009000004D200000007FFFF3F
S31500028050FFFF040C000000401010000002803E00024E
S3150002806080420002EAA8040201000002803E0002E9
S3150002807080420002EAB3056C020000027E3C000266
S3150002808080804A0002EAD00453040000028052000231
S31500028090804E0002EADF0002EB150001698200024F
S315000280A080560002EB1C01040002EBD600016B6451
S315000280B0000000000002EBD901000002EBF0000212
S315000280C0EC010002EC070002EC0D0002EC170002C4
S315000280D0EC2600016C1200016BC400016C64000105
S315000280E06C7C42C80000000000002D2FE9BF5368D7
S315000280F0D4A52EDBE42E30896E9D322BCA4433D6AC
S31500028100BCD5358636054E6E6B283727C38738D1E0
S31500028110B4683A8310C1497424033C23D4F13DCC9F
S31500028120CA2E3F7FFCB9447A0000411FFDF442C7C4
S31500028130FD714479FCCD461C3E0047C34D8049740F
S3150002814020E03A83126F4B18948C4CBEB9AF4E6E38
S31500028150681B358637BD5015011151BA4155536812
S31500028160D1AA3089705F5511830A56B5E3CD2B8C9F
S31500028170BCCC000C000F00000002000004D208245C
S3150002818002000027E4000027E400002EDCE036342
S31500028190000000000C000000000000002EDE603738C
S315000281A0020000027E3C0002817200002EDFA0370B8
S315000281B0020000027E3C0002817600002EE10036499
S315000281C000000000000000000000000002EE41036112
S315000281D00000000000000000000000002EE50034113
S315000281E0020000027E3C00027E400002EE7C034258
S315000281F0020000027E3C00027E400002EEA1036500
S31500028200000000000000000000000000002EEC6035756
S3150002821000000000000000000000000002EED7045338
S3150002822000000000000000000000000002EEE303521E
S3150002823000000000000000000000000C0002EEF9034307
S315000282400020000002817A0002817A0002EF110374B1
S3150002825000000000000000000000000002EF25036994
S3150002826000000000000000000000000002EF3A0002D9
S31500028270EF4D000177F80002817E0002EF50030FF6
S31500028280000000000002F18400017EEE0000000002
S31500028290002F187010020202020090909090909A5
S315000282A009090D0909090401020000027E3C0002C7
S315000282B07E3C0002F19C0470000000000000000F9
S315000282C000000002F1EE043800000000000000089
S315000282D000000002F2030002F210000186CA000248
S315000282E082A60002F21301030200000000000051
S315000282F0000000000000000000002000096000000DE
S315000283000000700000008030102000027E3C000292
S31500028310082FA0002F3BC0370020000027E3C0002F5
S315000283208 2F60002F3E1016E0200000282FE000202
S315000283308 3020002F3FE0165020000027E3C000297
S3150002834 07E400002F417016D020000027E3C00022C
S31500028350 7E400002F42D0157020000027E38000220
S315000283607E380002F4450174C000000000000009F
S315000283700000002F46F0002F48B00018A7C000206
S31500028380830600002F49001070002F52A00018D54CB
S31500028390000000000002F52D01000002F542000176
S315000283A08DC80000000000002F54901000002F562D6
S315000283B000018E3C000000000002F56501003080DD
S315000283C002B900000000000C0000000000000000EA
S315000283D000000000000002F58E00019B8C0000E8
S315000283E00000002F5920100C0019CD00019D08E8
S315000283F000019D5600019D6E000000000000000075
S3150002840000000000000000000000000000000064
S3150002841000000000000000000000000000000054
S3150002842000000000000000000000000000000044
S3150002843000000000000000000000000000000034
S3150002844000000000000000000000000000000024
S3150002845000000000000000000000000000000014
S3150002846000000000000000000000000000000004
S315000284700000000000000000000000000000000F4
S315000284800000000000000000000000000000000E4
S315000284900000000000000000000000000000000D4
S315000284A00000000000000000000000000000000C4
S315000284B00000000000000000000000000000000B4
S315000284C00000000000000000000000000000000A4
S315000284D0000000000000000000000000000000094
S315000284E00000001800000002000000010FFFF00005C
S315000284F0000001900000001800000040000001F6C
S315000285000003B005A0078009700B500D400F3011131
S3150002851001300 14E016D0000000000000016D0000F7
S31500028520 02DA00000448000005B500000722000038
S315000285300088F000009FD00000B6A00000CD700003E
S3150002854 00E4400000FB20000111F0000128C000042
S31500028550 13F9000015670000 16D4000018410000 48
S315000285 6019AE00001B1C00001C8900001DF600004D
S31500028570 1F63000020D10000223E000023AB000052
S3150002858025180000268600002 7F3000029600000 57
S315000285902ACD00002C3B00002DA800002F1500005C
S315000285A0308200003 1F00000335D000034CA000062
S315000285B03637000037A5000039120000 3A7F000066
S315000285C03BEC00003D5A00003EC700004034000 06C
S315000285D041A10000430F0000447C000045E9000071
S315000285E04756000048C400004A3100004B9E000076
S315000285F04D0B00004E7900004FE600005153 00007B
S31500028600 52C00000542E0000559B000057080000 7F
S3150002861058750000 59E300005B5000005CBD000085
S31500028620 5E2A00005F98000061050000627200008 9
S3150002863063DF0000654D000066BA0000682700008F
S31500028640 69940000 6B0200006C6F00005DDC000094
S31500028650 6F49000070B700007224000073910000 99
S3150002866074FE0000766C000077D900007946 00009F
S315000286707AB300007C2100007D8E00007EFB0000A4
S31500028680806800008 1D60000834300008 4B00000A9
S31500028690861D0000878B000088F800008A650000AE
S315000286A08BD200008D4000008EAD0000901A0000B3
S315000286B09187000092F500009462000095CF0000B9
S315000286C0973C000098AA00009A1700009B840000BD

S315000286D09CF100009E5E00009FCB0000A1380000C6
S315000286E0A2A50000A4130000A5800000A6ED0000CC
S315000286F0A85A0000A9C80000AB350000ACA20000D1
S31500028700AE0F0000AF7D0000B0EA0000B2570000D5
S31500028710B3C40000B5320000B69F0000B80C0000DA
S31500028720B9790000BAE70000BC540000BDC10000E0
S31500028730BF2E0000C09C0000C2090000C3760000E4
S31500028740C4E30000C6510000C7BE0000C92B0000EA
S31500028750CA980000CC060000CD730000CEE00000EF
S31500028760D04D0000D1BA0000D3270000D4940000F7
S31500028770D6010000D76F0000D8DC0000DA490000FD
S31500028780DBB60000DD240000DE910000DFFE000003
S31500028790E16B0000E2D90000E4460000E5B3000008
S315000287A0E7200000E88E0000E9FB0000EB6800000D
S315000287B0ECD50000EE430000EFB00000F11D000012
S315000287C0F28A0000F3F80000F5650000F6D2000018
S315000287D0F83F0000F9AD0000FB1A0000FC8700001C
S315000287E0FDF40000FF620001000CF0001023C00011F
S315000287F003A9000105170001068400010 7F1000123
S31500028800095E00010ACC00010C3900010DA6000028
S3150002881001000000010000000100000001000000 4C
S315000288200100000001000000010000000100000003C
S315000288300100000001000000010000000100000002C
S315000288400100000001000000010000000100000001C
S315000288500100000001000000010000000100000000C
S31500028860010000000100000001000000010000000FC
S3150002887001000000010000000100000000000000ED
S31500028880010000000100000001000000010000000DC
S31500028890010000000100000001000000010000000CC
S315000288A0000000000100000001000000010000000BD
S315000288B0010000000100000001000000010000000AC
S315000288C00100000001000000010000 4E0001B33269
S315000288D00001B3880001B3D60001B3EE0000000028
S315000288E0000000004A1E34004AED4E000000000005F
S315000288F00001000100020002000200020003000360
S31500028900000300030003000300030003000400 0445
S3150002891000040004000400040004000400040042F
S31500028920000400040004000400040005448 05E
S3150002893000003FB4FDF4448000003FB4FDF40000A3
S31500028940023500002A2A4B9896803F99999A3F4C05
S315000289500CCCD0000000000000000000000000000076
S31500028960000000000000000000000000000000000FF
S31500028970000000000000001D73E0001D7A400015C
S31500028980D7D00001D88A0001D8BC0001D93E000127
S31500028990D9C40001DA920001DAC40001DAF6000154
S315000289A0DB280001DBDE0001DC100001DC420001F5
S315000289B0DC740001DCA60001D76A0001D7BA000107
S315000289C0D8160001D8A60001D8F20001D97E00010E
S315000289D0D9F00001DAAE0001DAE00001DB12000193
S315000289E0DB5E0001DBFA0001DC2C0001DC5E00012B
S315000289F0DC900001DCC20C00120021003F0047009F
S31500028A0059006A0074008B009500A600B800C000E9
S31500028A10DE00ED00F30000000000000000000000090
S31500028A2000000000000000000000000000000003E
S31500028A3000000000000000000000000000000002E
S31500028A4000000000000000000000000000000001E
S31500028A5000000000000000000000000000000000E
S31500028A600000000000000000000000000000000FE
S31500028A700000000000000000000000000000000EE
S31500028A800000000000000000000000000000000DE
S31500028A900000000000000000000000000000000CE
S31500028AA00000000000000000000000000000000BE
S31500028AB00000000000000000000000000000000AE
S31500028AC000000000000000000000000000000009E
S31500028AD000000000000000000000000000000008E
S31500028AE000000000000000000000000000000007E
S31500028AF000000000000000000000000000000006E
S31500028B0000000000000000000000000000000005D
S31500028B1000000000000000000000000000000004D
S31500028B2000000000000000000000000000000003D
S31500028B3000000000000000000000000000000002D
S31500028B4000000000000000000000000000000001D
S31500028B5000000000000000000000000000000000D
S31500028B600000000000000000000000000000000FD
S31500028B700000000000000000000000000000000ED
S31500028B80000000000000C00000000000000000000DD
S31500028B900000000000000000000000000000000CD
S31500028BA00000000000000000000000000000000BD
S31500028BB00000000000000000000000000000000AD
S31500028BC000000000000000000000000000000009D
S31500028BD000000000000000000000000000000008D
S31500028BE000000000000000000181017401720146CC
S31500028BF00D0604060D060406B900000000000000 7A
S31500028C000002080900000C0000001800000 0B40BD
S31500028C1046E5D7891523038600AB012C012C0230C9
S31500028C2046E5D7890C100C0A00014C0022000230EA
S31500028C300007A40001810174017201460D060406B3
S31500028C400D060406B90000000000000000002080933
S31500028C50000000C00000018000000B40471D9E007E
S31500028C600F5C028F007C01900190023 0471D9E002E
S31500028C70108A108400014000220002300007A4007E
S31500028C800181017401720146 0D0604060D060406F1
S31500028C90B90000000C0000000002080900000 0C040
S31500028CA00000000C00C000B4047AF11DB06E20126C0
S31500028CB00037019001900230 47AF11DB24BA24B489
S31500028CC0000140002200023 00007A4000181017465
S31500028CD001720146 0D0604060D060406B9000000DF
S31500028CE0000000000002080900000 0C0000000C0E9
S31500028CF00000 0B40476CAEF70A3301B300520190F5
S31500028D00019002304 76CAEF718D418CF000140002C
S31500028D10220002300007A4001510101008010 09668
S31500028D2001A90258035205DC010400C801DB0258FE
S31500028D30030704B00110012C02580258025803E836
S31500028D4008010 09601A90258035205DC010400C875
S31500028D5001DB02580307 04B00110012C0258025825
S31500028D60025803E80110012C02580258025803E87F
S31500028D7000000000000050008000A000B000C000EAF
S31500028D80000E000F00100011001100120012001355
S31500028D9000130014001400140015001500150016 27
S31500028DA00016001600170017001700170018001803
S31500028DB000180018001900190019001900190019E5
S31500028DC0001A001A001A001A001A001A001B001BC9
S31500028DD0001B001B001B001B001B001C001C001CB0
S31500028DE0001C001C001C001C001C001D001D001D98
S31500028DF0001D001D001D001D001D001D001E001E81
S31500028E00001E001E001E001E001E001E001E001E6A
S31500028E10001E001F001F001F001F001F001F001F53
S31500028E20001F001F001F001F001F001F0020002040
S31500028E3000200020002000200020002000200020 2A
S31500028E40002000200020002000210021002100 2116
S31500028E5000210021002100210021002100210021 02
S31500028E60002100210021002100210022002200 22EF
S31500028E70002200220022002200220022002200 22DA
S31500028E80002200220022002200220022002200 22CA
S31500028E90002300230023002300230023002300 23B2
S31500028EA0002300230023002300230023002300 23A2
S31500028EB000230023002300230023002300240024 90
S31500028EC0002400240024002400240024002400 247A
S31500028ED0002400240024002400240024002400 246A
S31500028EE0002400240024002400240024002400 245A
S31500028EF000250025002500250025002500250025 42
S31500028F0000250025002500250025002500250025 31
S31500028F1000250025002500250025002500250025 21
S31500028F200025002500250025002500260026002 60E
S31500028F3000260026002600260026002600260026F9
S31500028F4000260026002600260026002600260026E9
S31500028F5000260026002600260026002600260026D9
S31500028F6000260026002600260026002600260027C8
S31500028F70000000000000003000500060007000 8008C4
S31500028F8000090000A000A000A000B000B000B000C85
S31500028F90000C000C000D000D000D000D000D000E62
S31500028FA0000E000E000E000E000E000F000F000F46
S31500028FB0000F000F000F000F001000100010001 02D
S31500028FC00010001000100010001000110011001116
S31500028FD00011001100110011001100110011001101
S31500028FE0001100120012001200120012001200 12EA
S31500028FF0001200120012001200120012001200 13D8
S31500029000001300130013001300130013001300 13C0
S31500029010001300130013001300130013001300 13B0
S3150002902000130013001400140014001400140014 9A

S315000290300014001400140014001400140014001488
S315000290400014001400140014001400140014001478
S315000290500014001500150015001500150015001561
S315000290600015001500150015001500150015001550
S315000290700015001500150015001500150015001540
S31500029080001500150015001500150015001600162E
S315000290900016001600160016001600160016001618
S315000290A00016001600160016001600160016001608
S315000290B000160016001600160016001600160016F8
S315000290C000160016001600160016001600160016E8
S315000290D000160016001700170017001700170017D2
S315000290E000170017001700170017001700170017C0
S315000290F000170017001700170017001700170017B0
S31500029100001700170017001700170017001700179F
S31500029110001700170017001700170017001700178F
S31500029120001700170017001700170017001700177F
S315000291300018001800180018001800180018001867
S315000291400018001800180018001800180018001857
S315000291500018001800180018001800180018001847
S315000291600018001800180018001800180018001837
S31500029170012C01540154015401F401CC01CC01CC5F
S3150002918000010001000100010001000100010001CF
S3150002919000010001000100010001000100010001BF
S315000291A00000010E021D032C043A05490658076603
S315000291B00875F873F982FA91FB9FFCAEFDBDFECBF2
S315000291C00001030701020408010204080007000265
S315000291D00F85C0002F8600002F8660002F86C000211
S315000291E00F8770002F8820002F88B0002F898000273
S315000291F00F8A30002F8AD0002F8B80002F8C60002B1
S315000292000F8C70002F8CD0002F8DA0002F8E500021B
S31500029210F8F50002F9020002F91B0002F925000224
S315000292200F9300002F93E0002F94D000000000008C
S315000292300000F000000000000001000000000000007
S315000292400000800000000000000030000000090000002
S31500029250007700000000000000010000000000000007F
S3150002926000002000000000000000700000000000000ED
S3150002927000003000000000000000300000000000000E0
S3150002928000008000000000000000000000000010000CD
S3150002929003FF00000000300000000200000004C7AF45
S315000292A0C80047AFC80000004000044304000002A3
S315000292B0922A0002922E0002F9530473040000025D
S315000292C05AB200025AB60002F957047002000002AE
S315000292D05AAA00025AAE0002F95D047204000002A4
S315000292E05AB200025AB60002F9620452040000029F
S315000292F09252000292560002F967046305000002C8
S31500029300929E000292A20002F96B04300500000024E
S31500029310929E000292A20002F98404310500000224
S31500029320929E000292A20002F9B4046C02000002AC
S31500029330928A0002928E0002F9E50458000000000AB
S31500029340000000000000000002FA02045304000002BA
S31500029350923200029236002FA280448040000000201
S315000293609230A0002923E0002FA3A045404000002C3
S31500029370924200029 24E0002FA4C04490400000294
S315000293809 25A0002925E0002FA620444040000024B
S315000293909262000292660002FA8A046100000000EC
S315000293A0000000000000000002FA950478000000A8
S315000293B0000000000000000002FAA2046A04000000293
S315000293C0926A0002926E0002FAAB0469000000083
S315000293D0000000000000000002FAFB047A000000010
S315000293E00000000000000000002FB31046400000DF
S315000293F000000000000000002FB520441000000D1
S3150002940000000000000000002FB5D04420000000B4
S31500029410000000000000000002FB640450000000008F
S31500029420000000000000000002FB6B045700000071
S31500029430000000000000000002FB7E044F0000000056
S3150002944000000000000000002FB9A045A020000021B
S31500029450927200029276002FBBD045902000002DB
S315000294609262000292660002FBC8045502000002E4
S315000294709282000292860002FBD6046E020000026D
S315000294807E400002929A0002FBF504620300000028B
S31500029490927A0002927E0002FC040446030000255
S315000294A07E3C000292920002FC48044C020000023A
S315000294B07E3C000292960002FC89044D02000002E4
S315000294C07E3C00027E400002FCF704660000000BB
S315000294D000000000000000002FD38046D04000002D6
S315000294E05AB200025AB60002FD820456000000007B
S315000294F0000000000000000002FD970476000000054
S31500029500000000000000000002FDAF0479000000028
S31500029510000000000000000002FDBC044E0200000232
S315000295207E400002924A0002FDCF0467020000025A
S315000295307E3C000292460002FE110447020000022F
S315000295407E3C000292A60002FE4704740000000060
S31500029550000000000000000002FE86046B00000000E
S31500029560000000000000000002FE8F0438000000028
S31500029570000000000000000002FECE046F00000000A2
S3150002958000000000000000000002FF140002FF3200018A
S31500029590F06A000292AA0002FF34042E3FA00000E5
S315000295A04000000041A000004B98968040800000D9
S315000295B0000000003F0000004F80000042C800008B
S315000295C0498000039102DE00003080C00020FC28A
S315000295D0000000000000308120100646 96F757858E4
S315000295E0706E6373666545674700C1DAF2AD426421
S315000295F0D53AC21EC165412270BBBF325DEEC3249D
S3150002960036 0243D09278C3BEEE784316F3E5C1BE66
S31500029610974300000000000000003FC90FDB4049ED
S315000296200FDB3FC90FDB322BCC773F0000003F80B8
S3150002963000000C15B0533C1A40BFEC107E9FB3F569F
S3150002964063D7422443E642AC5090426E5052417070
S31500029650624F000000003F060A923FC90FDB3F86B9
S315000296600A923F8000003E8930A43FDDB3D7BF8017
S3150002967000000322BCC77000000007F7FFFFF4049BD
S315000296800FDB3FE61F47BEEB2F673CB5576D41AC7C
S31500029690 9775C10BF8D000000000FF7FFFFF3F3532
S315000296A004F33F3172183EDE5BD9000000003ED85B
S315000296B0E33D3F15539D3F3504F33F8000007F7F16
S315000296C0FFFF7F7FFFFFFF7FFFFF0080000043FC5D
S315000296D015F841600C8D3D0876B3447C15F842E0DE
S315000296E011C900000000042B000007F7FFFFFC2AE3A
S315000296F00000233877AA3F8000003FB8AA3B3F000C
S3150002970000003F3172183F8CCCCD000000007F7FF5
S31500029710FFFFFF7FFFFF3F80000000000000FF7F8A
S31500029720FFFF7F7FFFFF000000003F800000400038
S315000297300000040400000408000040A0000040C001
S31500029740000040E000004100000041100000 4120FE
S3150002975000042C80000447A0000461C400047C38D
S3150002976050000497424004B1896804CBEBC204E6EA5
S315000297706B28501502F951BA43B75368D4A555114F
S3150002978084E756B5E62158635FA95A0E1BCA749D33
S31500029790C5AE7F8000007F8000007F8000007F8052
S315000297A000007F8000007F8000007F8000007F80B5
S315000297B000007F8000007F8000007F8000007F80A5
S315000297C000007F8000007F8000007F8000007F8095
S315000297D000007F8000000020202020202020202062
S315000297E0282828282820202020202020202020202049
S315000297F020202020202020204810101010101010B9
S3150002980010101010101010108484848484848484843C
S31500029810841010101010101081818181818101014 4
S3150002982001010101010101010101010101010101 20
S315000298300101101010101010828282828282020202AE
S3150002984002020202020202020202020202020202F0
S315000298500202101010102000000000000000000009C
S3150002986000000000000000000000000000000000F0
S3150002987000000000000000000000000000000000E0
S3150002988000000000000000000000000000000000D0
S3150002989000000000000000000000000000000000C0
S315000298A000000000000000000000000000000000B0
S315000298B000000000000000000000000000000000A0
S315000298C00000000000000000000000000000000090
S315000298D00000000000000004E000000000000000032
S315000298E03FF00000000000000400000000000000001
S315000298F0400800000000000004010000000000000C8
S315000299004014000000000000040180000000000000A3
S31500029910401C00000000000004020000000000000083
S315000299204022000000000000040240000000000000069
S31500029930405900000000000040C38800000000000FB
S31500029940 4197D7840000000004341C37940000000DC
S3150002995004693B8B5C00000007FF000000000000008A
S315000299607FF000000000000007FF0000000000000011
S3150002997000000000000000005A595857565554532B
S3150002998005251504F4E4D4C4B4A494847464544327

S315000299904241393837363534333231300004E0000E1
S315000299A00000000000000053657269616C20706F6CE4
S315000299B06C005365726E6F004E6F205365726E6F48
S315000299C0007365742073657269616C20706F6C6CCC
S315000299D0006C766C20312070617373776400 6C764C
S315000299E06C203220706173737764006C766C20335E
S315000299F020706173737764006C766C20342070611A
S31500029A0073737764006C766C203520706173737779C
S31500029A1064006C766C2036207061737377640 06C18
S31500029A20766C20352074656D702063616C696220E6
S31500029A30706173737764007175696574206C6F6702
S31500029A4020696E0064756D70207365726E6F0064B6
S31500029A50756D70207365726E6F20776974686F75A5
S31500029A6074206C6F6767696E6720696E0073746F26
S31500029A707265207365726961 6C20706F6C6C20510F
S31500029A806464726573730061 74746E006C6F676FE1
S31500029A906E000D0A4D617820696E206172636869F5
S31500029AA07665000343332316664736100 0D25730DB9
S31500029AB00A4C6F676F6E20746F20256C7820617474
S31500029AC020000D0A000D0A25386C78202578004EF4
S31500029AD04D6F6E646179005475657364617900 57E0
S31500029AE065646E657364617900546875727364 6146
S31500029AF07900467269646179005361747572646 1B2
S31500029B00790053756E64617900253032643A2530E6
S31500029B1032643A253032640025303264 3A253032D6
S31500029B2064002C002532642F2532642F2534640018
S31500029B302532642F2532642F25346400 2534642FA0
S31500029B402532642F253264002000 2532642F253207
S31500029B50640025 32642F25326400252D332E33739B
S31500029B6020257300445354000025303464253032D6
S31500029B7064253032642E253032642530326400 4E3C
S31500029B80626F78636C00626F7820636C6F736564D2
S31500029B902065766 56E7473000D0A25732025376C71
S31500029BA06420004E4576656E7420446961676E6F67
S31500029BB07374696300252D31362E31367300252DD7
S31500029BC031362E313673 0054696D65200044617456
S31500029BD065200 0252D31302E31307325366C640018
S31500029BE064756D70206469 73706C617920 2656743
S31500029BF06973746572730064756D7020636F6C753A
S31500029C006D6E20686561646 96E67730064756D7058
S31500029C102073637 26F6C6C2072656769737465 7208
S31500029C207300737065636966792063 6F6C756D6E18
S31500029C30206E756D62657220666F72202D64206FCC
S31500029C4072202D730073706563696669 2072655789
S31500029C5069737465722 06E756D62657220666F72C5
S31500029C60202D7300636C65617220746865207363CE
S31500029C70726F6C6C20746162 6C6500577269 7465F0
S31500029C80207468652073 63726F6C6C207461626CF9
S31500029C906500726 5706561746 56469737465DC2
S31500029CA07020746865207265676973746572 206FC7
S31500029CB06E2074686520646973706C6179006459EA
S31500029CC0737000 64756D7020646973706C617920BD
S31500029CD072656769737465727300 0D0A25326420B2
S31500029CE0253364207C253136737C2000207C252D8B
S31500029CF031362E3136737C00207C252D31362E31BD
S31500029D0035737C000D0A25326420253364207C25B7
S31500029D103136737C20000D0A25326420253364 20F7
S31500029D207C253136737C2000207C252D31362E3160
S31500029D3036737C00207C252D31362E3136737C001D
S31500029D400D0A53706563696669656420726567 59A1
S31500029D507374657220646F6573206E6F7420657804
S31500029D606973742069 6E20737065636966696564 D8
S31500029D70 20636F6C756D6E000D0A537065636966 BC
S31500029D806965642072656769737465722 06F75749C
S31500029D90 206F6620626F756E647320666F72207321
S31500029DA0706563696669656420636F6C756D6E00C4
S31500029DB00D0A53706563696669656420636F6C7525
S31500029DC06D6E2069732 0656D707479000D0A53708B
S31500029DD06563696669656420636F6C756D6E20697B
S31500029DE073206F7574206F6620626F756E647300E0
S31500029DF00D0A5363726F6C6C20746162 6C65206627
S31500029E00756C6C000D0A4D617820696E206172 6373
S31500029E106869766500 4E526 56769737465727 30088
S31500029E20252D31362E3136730043 6F707972696 78C
S31500029E306874203139393900252D31362E31367381
S31500029E4000051756 1646C6F676963 20544D582D35F6
S31500029E50000D0A25326420253364 2000207C252D3E
S31500029E60 31362E3136737C00207C252D31362E314B
S31500029E70 36737C00252D31362E31367300526576C7
S31500029E806572736 500466F727761726400252D31C3
S31500029E90362E31367300496E697469616C697A6966
S31500029EA06E6700252D31362E31367300506C656192
S31500029EB07365207761697400537461727420 6164FA
S31500029EC0647200456E642061646472004C656E675C
S31500029ED0746820746F206469 73706C617920696E8E
S31500029EE020646563696D616C00646973706C617985
S31500029EF020617320363 42D626974206C6F6E672080
S31500029F00646F75626C6573 00646973706C61792045
S31500029F1061732033322D626974206 66C6F617469 D5
S31500029F206E6720706F696E74206E756D62657273EE
S31500029F3000646973706C61792061732031362062 26
S31500029F40697420776F72647300646973706C6179E7
S31500029F5020617320 3332206269 74206C6F6E6773DE
S31500029F6000646973706C617920617320382062 69BC
S31500029F707420636861726163746572730066 696CEA
S31500029F806C206D656D6F727920776974682068 65DB
S31500029F90782076616C75652C20616464 202D6920B9
S31500029FA06F72202D6C20666F72203136206F72 2000
S31500029FB03333220626974732C206465666175 6C7431
S31500029FC0203820626974730066 696C6C206D656D59
S31500029FD06F727920776974682066 6C6F6174207677
S31500029FE0616C75652C20616464202D4C20666F724D
S31500029FF020382062 7974652C20646566617 56C74FC
S3150002A000203420627974657300746573740065 6128
S3150002A010736520666 1736 82073 6563746F720082
S3150002A0207072696E7420666C6F6174732 0696E2033
S3150002A0306578706F6E656E7469616C20666F726D9D
S3150002A04000636F6C6420737461727420746865 2097
S3150002A0506D657465720 07072696E74207365 6374DF
S3150002A0606F72206D61700064697 3706C6179206132
S3150002A070732031362062 69742075666C6F61747361
S3150002A0802000646D0064756D70206D656D6F727968
S3150002A090000D0A53323053656374 4 547970 65205664
S3150002A0A0205341646472202053656374 53697A6550
S3150002A0B0204461746120202020 55736564202053 5A
S3150002A0C0656374 4 53657123205365637454696D65C2
S3150002A0D020202020536563744461 7465202020 20206B
S3150002A0E02020252544 3204E756D44617973 000D0A47
S3150002A0F02532642000 50726F6772616D 20004461E0
S3150002A10074612020202020004172636869766 50010
S3150002A11043616C436F6E737400384B546F755461B0
S3150002A12062004E6F742055736564 0020256 32025F6
S3150002A13030366C78202538 6C640020202020 2020C0
S3150002A140253 76C642025396C782000 2020202020B9
S3150002A1502025376C642025396C64200020202020BD
S3150002A160202025376C642025396C642000204F702E
S3150002A170656E2025376C640020446F6E6520253796
S3150002A1806C6400 204F70656E2025376C64002025B4
S3150002A190396C64200020 25396C640020253 7640060
S3150002A1A00D0A2530366C782000254C6500254C6753
S3150002A1B0000D0A2530366C7820002565002567 00DB
S3150002A1C00D0A2530366C78200025650025670 00DBE
S3150002A1D00A2530366C7820002530386C7820000D40
S3150002A1E00A2530366C78200025303 47820000D0A96
S3150002A1F02530366C782000253032 7820000D0A454D
S3150002A200726173696E6720646174612073637439
S3150002A2106F72202564000D0A526573746172746947
S3150002A2206E672068617264776172 65000D0A526515
S3150002A2307374617274696E67206C6F67000D0A49E8
S3150002A2406E697469616C697A696E672072616D0004
S3150002A2500D0A526573746F72696E6720696E746552
S3150002A2607272757074730 04E6472 0064656D616E0D
S3150002A27064207265737 6574730 00D0A257320253791
S3150002A2806C6420 00546 5 6D6520696E 2048483A4D19
S3150002A2904D3A535320666F726D617400 4461746562
S3150002A2A02D666F726D6174207370656 3 6 2764206218
S3150002A2B079202D66206F7074696F6E00666F726DFD
S3150002A2C0617420 3D4D4D2F44442F595959592020
S3150002A2D0313D44442F4D4D2F5959595920323D593C
S3150002A2E05959592F4D4D2F4444006F666673657454

S3150002A2F02066726F6D20656E746572656420646196
S3150002A300746520696E20686F7572730064740074D8
S3150002A310696D652F64617465000D0A4D696E696D1C
S3150002A320756D2074696D65206265747765656E204A
S3150002A33072657665727365207469D6520636861FE
S3150002A3406E6765732069732032342068F75727385
S3150002A3500D0A000D0A5761726E696E67202D207212
S3150002A36065766572736520746D65206368616ED2
S3150002A370676573206475706C6963617465206461D6
S3150002A380797320616E64207265647563652061 6F7
S3150002A39061696C61626C6520666C617368206D65CB
S3150002A3A06D6F72792E204F4B20746F2050726F633F
S3150002A3B06565643F20592F4E000D0A4F7065726124
S3150002A3C074696F6E2061626F72746564000D0A496A
S3150002A3D06E76616C69642054696D65204368616EAE
S3150002A3E067650D0A000D0A0020000D0A004E6E7503
S3150002A3F06D626572206F66206C6F676963616C209F
S3150002A4006D657465720074726E73666572206 43E
S3150002A41061746120627920586D6F64656D206E7281
S3150002A4206F6D206D657465720052656365697665 48
S3150002A430206461746120696E746F206D6574657243
S3150002A44020627920586D6F64656D006E756D626568
S3150002A45072206F6620736C6F7473202D207573657E
S3150002A460642077697468202D2400676C6F62616CC2
S3150002A47020746F20616C6C206D6574657273007454
S3150002A48072616E73706F6E64657220736C6F742086
S3150002A4906E756D62657200737065636966792054C4
S3150002A4A04F5520706572696F6420666F72206C6FFB
S3150002A4B067206C6973747300737065636966792 0CB
S3150002A4C077686963682 06C6F67207175616E74695D
S3150002A4D07479003D312073696E676C65207068611E
S3150002A4E073652C203D3220706F6C79706861736 5DC
S3150002A4F000737065636966792070686173652 0EA2
S3150002A500756D62657220696E20706F6C7970686114
S3150002A5107365206D6574657200 4C6F6720737461 94
S3150002A5207274206461746500 4C6F6720656E6420E6
S3150002A53064617465004C6F6720696E6465780041DA
S3150002A5406C6C206576656E7473202D20696E636 63
S3150002A55075646520616C6C2067726F7570730065 37
S3150002A56076656E74206E756D62657200636561E8
S3150002A5707220706C6320657665E7473006E756DFD
S3150002A580206576656E747300 64756D702 0657665F8
S3150002A5906E74206C6F672067726F7570006 4756DDC
S3150002A5A07020617263686976652065 76656E7420CF
S3150002A5B06C6F67006C6F6720737461727420746 9C4
S3150002A5C06D6520666F72206 46973706C6179006CC8
S3150002A5D06F6720656E642074696D6520666F7220F0
S3150002A5E06469 73706C617900 64756D702065766557
S3150002A5F06E7420746F74616C7300737570707 2651B
S3150002A6007373206865782064617461 20696E206CBA
S3150002A6106F672064756D7000696E636C7564652082
S3150002A620686578206D65737361676520646174611E
S3150002A63020696E206C6F672064756D70006C69739B
S3150002A64074206C6F6767696E67206F7074696F6ECE
S3150002A65073206F662065766656E74730064756D701F
S3150002A66020706F696E746572732061 6E6420736503
S3150002A67063746F7273206F6E206576656E74206CDC
S3150002A6806F6773006469 73706C6179 2065766 56EB5
S3150002A69074206F66207370656369666965642063FA
S3150002A6A06F756E7420696E206C6F67 0064697370D3
S3150002A6B06C6179206576656E742077697468696E57
S3150002A6C020726 16E6765206F6620636F756E7473A4
S3150002A6D020776 8656E20757365642077697468 20D3
S3150002A6E06F7074696F6E20706F73 6974696F6E2014
S3150002A6F03200646973706C6179206F6E6C792074B4
S3150002A70072616E736665722073697A6520616E6422
S3150002A71020706F696E7465727300 656 42062657F
S3150002A720666F72652066697273742066696 696EED
S3150002A73069736865642064617900 6578636C756421
S3150002A74065206 56E6420657665 6E7420696E206C80
S3150002A7506F672064756D70007 36B69702031 2065B8
S3150002A76076656E74206166746572206669727374AA
S3150002A770206D617463680 0696E746 56C2062797419
S3150002A78065206F72 6465722 07 3656C656374 20730D
S3150002A79065726E6F202D206D757374206265206759
S3150002A7A07265617465722074686 16E206F722065CD
S3150002A7B07175616C20746F20303430303030303037
S3150002A7C000696E636C756465206461746 51206772EA
S3150002A7D06F7570732062792 06C6574746572202DB2
S3150002A7E0674454655350707320 2D20446174612C64
S3150002A7F054616D7065722C6576656E742C53746146
S3150002A80072747 5702C504C432C70756C73652C7376
S3150002A81065726 9616C202D20616E79206E756D629C
S3150002A8206572206F662067726F7570206C6574742E
S3150002A83065727320737472756E6720746F676574C0
S3150002A840686572 20696E20616E79206F7264657226
S3150002A85000737461727420 6F6E2066697273742 05D
S3150002A8606576656E7420636E7472206D617463 68BA
S3150002A870656420666F72207370656369666965 64D4
S3150002A88020657 6656E74006D617463682 06F6E2054
S3150002A89031362062697420736 86F727420636F7533
S3150002A8A06E7465722069 6E7374656164206F6620CA
S3150002A8B06C6F6E6720636F756E7465720065766580
S3150002A8C06E74006469676E6F7374 69632065767 6 7E
S3150002A8D0655E7473000D0A4523204576656E7420F5
S3150002A8E0202020202020202020202020202020202060
S3150002A8F020506572 6D4C766C20204C6F67446169FE
S3150002A9006C7920204D73744461696C792020 20415F
S3150002A91072 63686 97665204D61784576656E7473F3
S3150002A9202047726F757073000D0A25326420252D3B
S3150002A93032307320253964202020202020202038
S3150002A940256320202020202020202020202563 2020206F
S3150002A9502020202020202020256320253 96420000D0A8E
S3150002A96025730045232065 76656E74206E616D65DC
S3150002A97020202020202020202020636F756E7420202046
S3150002A980202020206C61737420 6576656E74002524
S3150002A99032357300 0D0A2573002532752025 2D31B7
S3150002A9A032730020253130 6C7520002 0000D0A53C9
S3150002A9B074617274206F6E6C79206F6E2073 70658D
S3150002A9C063696 66965642 06576656E74000D0A536F
S3150002A9D074617274206F6E20616E79206D6174638A
S3150002A9E068696E672065 76656E74000D0A44756D3A
S3150002A9F070206F6E6C79206576656E747320776948
S3150002AA0074686 96E2072616E6765206F662065766 6E
S3150002AA10656E74206E756D62657273000D0A4475FB
S3150002AA206D7020616C6C206576656E74732073742C
S3150002AA3061727469 6E6720776974682073706563E2
S3150002AA40696669656420657665 6E74000D0A536BE6
S3150002AA5069702066697273742065766 56E74000D7E
S3150002AA600A53746F70206265666F72652063757231
S3150002AA7072656E7420646179000D0A44756D7020EA
S3150002AA8025730061726368697665 006461696C7931
S3150002AA902065766 56E74206C6F67000D0A537461 CB
S3150002AAA07274696E672065766 56E74206E756D6266
S3150002AAB06572202020202020202020202020253130648D
S3150002AAC0000D0A456E64696E67206576656E7420B0
S3150002AAD06E756D6265722020202020202020202020A5
S3150002AAE020202025313064000D0A4576656E74206398
S3150002AAF06F756E7420726 16E6765206C6F77657212
S3150002AB00206C696D69742020253130 6C64000D0A51
S3150002AB104576656E7420636F756E742072616E671A
S3150002AB2065207570706572206C696D6974202025C8
S3150002AB3031306C75000D0A446174652F54696D6578
S3150002AB40206C6F776572206C696D69742020202 0F5
S3150002AB50000D0A446174652F54696D6520757070 25
S3150002AB606572206C696D697420202020000D0A44EC
S3150002AB7061746120 6F6E6C7920666F72207365 72E4
S3150002AB8069616C206E756D6265722025303 86C784D
S3150002AB90000D0A4461746120666F7220616C6C203C
S3150002ABA07365726 9616C206E756D62657273000DF4
S3150002ABB00A000D0A4669727374206D6573736167C4
S3150002ABC065206164647220202020202020202020201D
S3150002ABD0202020202025386C78000D0A4C617374E1
S3150002ABE0206D657373616765206164647220 20203D
S3150002ABF0202020202020202020202020202025386CE4
S3150002AC0078000D0A5866657220 73697A652028698C
S3150002AC106E2062797465732920202020202020204E
S3150002AC20202020202025386C64000D0A4E756D62A6
S3150002AC306572206F66206576656E747320696E2074
S3150002AC4078666572202020202020202020202025386C5E

S3150002AC5064000D0A25326420252D313273202531F8
S3150002AC60306C64202530386C782000202530386C12
S3150002AC7078202532642025366420000D0A0025300E
S3150002AC80386C78200044005400650053005000707 0
S3150002AC900073004E0D0A6C6F67676564206F7574EA
S3150002ACA020617420000D0A00657869740065786970
S3150002ACB07420616E642072657365742073657269AF
S3150002ACC0616C004E73696D756C7461746520706F8A
S3150002ACD07765722066616C0068616C74006861F0
S3150002ACE06C74206D65746572004E7472616E737059
S3150002ACF06F6E6465722073 6C6F74206E756D62651B
S3150002AD007200777965206F722064656C7461206DBC
S3150002AD1065617375726 56D656E74732028777965E2
S3150002AD203D302C2064656C74613D312900637420CA
S3150002AD306F72207368756E74206D65746572202853
S3150002AD4063743D302C207368756E743D312900772B
S3150002AD507269746520686477722063 6F6E666967CC
S3150002AD6020746F2061726368697665006765742076
S3150002AD7064656661756C74206864777220636F6EB1
S3150002AD8066696720746F2072616D20666F72206536
S3150002AD9064697469 6E6700726573746F72652068A0
S3150002ADA064777220636F6E666967206C61737420C4
S3150002ADB073617665642074 6F20666C6173682074B3
S3150002ADC06F2072616D20666F722065646974696EA8
S3150002ADD0670073657420686477722063 6F6E6669B4
S3150002ADE06720746F206C617374207361766564 20CA
S3150002ADF0746F20666C6173680064755D7020686498
S3150002AE0077722063 6F6E66696700 70756C73652072
S3150002AE10696E70757420646 5626F756E636520 7401
S3150002AE20696D6520303D312F363420313D322F3663
S3150002AE303420323D342F363420333D382F363420F9
S3150002AE4073656300 70756C736520696E7075742026
S3150002AE50636F756E742065646765732 02D42313D9C
S3150002AE60626F7468202D42303D6F6E6500706C759E
S3150002AE707320 5520706F7765722073757 0706C79C8
S3150002AE802074726970 20706F696E7420666F72200A
S3150002AE90706F776572206661696C0064756D7020EB
S3150002AEA0706C7573205500536574 2070756C7365EC
S3150002AEB04F757420 303D7374642C20313D207075BB
S3150002AEC06C736520 7365726961 6C2C20323D6D630B
S3150002AED020736572696 16C00456E61626C652074EF
S3150002AEE06573742062757474 6F6E2061732067 6176
S3150002AEF0746520746F206C6F67696E206C65766569
S3150002AF006C73203520616E642036 00456E61626C7A
S3150002AF10657320627269646765206D6F6465206679
S3150002AF205F7220504C43207472616E736D697400A7
S3150002AF30446973706C617973206 36F7079726967 67A3
S3150002AF406874206D6573736167652075706F6E2016
S3150002AF5072657365740045 6E61626C6573206E6F0F
S3150002AF60726D616C6C79206F70656E20746 16D70A4
S3150002AF7065720053657420 6E756D626572206F6628
S3150002AF802070756C73652063 6F756E746572 7300DD
S3150002AF90686477720073657420 6D657465727 32CCC
S3150002AFA0207068617365732070 6572206D657465C3
S3150002AFB072000D0A4D617820696E2061726368 69BC
S3150002AFC07665000D0A4D7573742062652069 6E20E0
S3150002AFD06564697420726 16D20746F20777269747A
S3150002AFE065000D0A706C757320 75203D2025313081
S3150002AFF02E32662061766572616765000D0A706C95
S3150002B00075732075203D202531302E326620696EFB
S3150002B0107374616E74616E656F7573000D0A6C6F81
S3150002B02063617469 6F6E206F6620686172647761 0E
S3150002B030726520636F6E666967 20696E666F202D82
S3150002B040202573004465666175 6C740045646974F5
S3150002B0502052616D00466C6173 68000D0A44454CCE
S3150002B0605441205348554E54204D696E2B5520 505D
S3150002B070756C736545646765204465626F756E63BA
S3150002B08065205069632054657374442023 70756C81
S3150002B0907365000D0A252D352E357320252D352E87
S3150002B0A035732025352E326620252D392E3973200B
S3150002B0B02534752F363473202533642025 2D352EFD
S3150002B0C0357320253664005965730 04E6F00596545
S3150002B0D073004E6F00426F7468004E656761746953
S3150002B0E076650059657300 4E6F000D0A504C432079
S3150002B0F06272696467653A2000456E61626C6564D6
S3150002B1000044697361626C6564002020504F5220CE
S3150002B110436F70797269676874 3A2000456E61629E
S3150002B1206C656400446973616 26C656400202054 36
S3150002B130616D7065723A20004E6F726D204F7065B8
S3150002B1406E004E6F726D20436C6F73656400256CE2
S3150002B1506620000A000A000A00496E766572736963
S3150002B1606F6E206572726F72212121 0A00496E7616
S3150002B17065727369 6F6E2070726F626C656D2032D4
S3150002B1800A00256C6620000A004E54616D706572 2D5
S3150002B19000436C6F736564005374617274757073E7
S3150002B1A000506F77657220446E7300506F7765 7238
S3150002B1B02055707300576174636864 6F67004E6F41
S3150002B1C0204261747465727900426164507772 44F8
S3150002B1D06F776E005370757269 6F75735273740070
S3150002B1E054696D6563686E67546F0054696D656373
S3150002B1F0686E6746726F6D00446D64726 57365743E
S3150002B20000507 56C7365310050756C7365320050 71
S3150002B210756C736533004C696E6520437963 6C65A2
S3150002B220 7300476F6F6420506B7400 48756E7443E9
S3150002B23068616E6E656C004261642050 6B740058E2
S3150002B2406D697420506B74004C6F676F7574004C97
S3150002B2506F67696E31004C6F67696E32004C6F67BB
S3150002B260696E33004C6F67696E34004C6F67696EA6
S3150002B27035004C6F67696E3600437261736845 76B6
S3150002B280656E740053746F7265436F6E666967000C
S3150002B290506C6 3467265657A650054696D654572E0
S3150002B2A0726F72005068572726F720053746F72D9
S3150002B2B065436 16C696200436F6C6453746172 74B6
S3150002B2C00053746F7265536572 6E6F0053746F72BA
S3150002B2D06550504D004E6577506173737764310047
S3150002B2E04E6577506173737764 32004E65775061AD
S3150002B2F073737764 33004E65775061737377643482
S3150002B300004E6577506173737764 35004E657750EA
S3150002B31061737377643600 53796E63525443 0053F4
S3150002B320746F72654D756C74730053746F726553E6
S3150002B33074747900 53746F7265536372 6F6C6C0028
S3150002B34053746F7265506F6C6C0053746F726548FC
S3150002B350647772 00496E74657276616C7300446537
S3150002B3606D616E647300 4461696C7941636375 6DE6
S3150002B370730053746172744461746 100456E64446F
S3150002B38061746 1004E6578745365637 46F7200531D
S3150002B39074617274536563746F72005374617274 6C
S3150002B3A04461790044617461 586 6657200536F6640
S3150002B3B07456657273696F6E00536572696 16C20AB
S3150002B3C023005265 6C6561736520436F64650052A4
S3150002B3D0656C65617365205469 6D6500536F6674AB
S3150002B3E077617265205665727369 6F6E00415349C3
S3150002B3F04320566572 73696F6E00465331303034 9E
S3150002B4004600506F77657220466 1696C002532648A
S3150002B410253032782530347825386C7800253034 5A
S3150002B420782530347825303478253034 7800252D47
S3150002B43031362E31367300496E697469616C697AE8
S3150002B440696E67002530386C78 20202020202065
S3150002B45020006E756D626572206F66206C6F67697B
S3150002B460636 16C206D6574657200747261 6E7366D9
S3150002B470657220646174612062792058 6D6F64651B
S3150002B4806D2066726F6D206D657465720052656 31C
S3150002B4906569766520646174612069 6E746F206DDA
S3150002B4A065746572206279205 86D6F64656D006EF1
S3150002B4B0756D626572206F6620736C6F7473202DD2
S3150002B4C0207573656420776974682 02D2400676C83
S3150002B4D06F62616C20746F20616C6C206D6574659F
S3150002B4E07273007472616E73706F6E6465722 0732C
S3150002B4F06C6F74206E756D626572007370656369 38
S3150002B500667920544F552070726 96F6420666FA4
S3150002B510722 06C6F67206C69737473007370656355
S3150002B520696679207768696368206C6F672071 7530
S3150002B530616E74697479003D312073696E676C655A
S3150002B540207068617 3652C203D3220706F6C7970B3
S3150002B550686173650073706563696679207068 61F6
S3150002B56073652 06E756D6265722 0596E20706F6CF0
S3150002B5707970686173652 06D65746572004C6F67DA
S3150002B58020737461727420646174650 04C6F672065
S3150002B590656E6420646174 65004C6F720696E6431
S3150002B5A065780064756D7020636F6E7374616E7476

S3150002B5B0730064756D702063757272656E742063B4
S3150002B5C06F6E7374616E747300566F6C7461676527
S3150002B5D020506861736500437572726565E742050FF
S3150002B5E06861736500437572726565E742072616E6E
S3150002B5F067650044656C617920696E2075736563C1
S3150002B6002066726F6D204920746F20560041646A6D
S3150002B6107573742063757272656E7420696E207517
S3150002B6206E697473206F6620302E30312500726584
S3150002B6302D53796E6368726F6E697A652072616DD9
S3150002B64020746F20726F6D20636F6E7374616E74F7
S3150002B6507300766F6C7461676520726166E67650050
S3150002B660636C65617220746865206366F6E737461C2
S3150002B6706E747300686F6C6420612072616E676518
S3150002B68020666F72203420686F7572730061646A77
S3150002B6907573742076666F6C74616765206D6561736E
S3150002B6A075726564206C696E6520746F206E6575AF
S3150002B6B07472616C20696E20756E697473206F6690
S3150002B6C020302E3031250061646A757374420766FDE
S3150002B6D06C74616765206D65617375726564206C53
S3150002B6E0696E6520746F206C696E6520696E2075BF
S3150002B6F06E697473206F6620302E30312500616 4C6
S3150002B7006A7573742063757272656E7420736875D8
S3150002B7106E7420616D706C696669657220696E204F
S3150002B720756E697473206F6620302E303125006184
S3150002B730646A7573742041444320626974203600 3A
S3150002B74061646A7573742041444320626974 2037C8
S3150002B75000616 46A757374204144432062697420EF
S3150002B760380061646A7573742041444320626974C7
S3150002B77020390061646A75737420414443206269 0A
S3150002B78074203130006164 6A757374204144432029
S3150002B7906269742031310061646A7573742041 44B0
S3150002B7A04320766F6C746167652072656666 57265A3
S3150002B7B06E6365005772697465204361 6C20436F3E
S3150002B7C06E7374616E747300737065636966 69651E
S3150002B7D06420444143 20636F646520746F2050489F
S3150002B7E04F55542070696E20666F72203630207372
S3150002B7F065636F6E64732C20616E79206B657920A8
S3150002B800746F2073746F700064756D70204441 43C9
S3150002B810206F66667365742063 6F72726563 7469FE
S3150002B8206F6E20616E6420726573756C74616E74DE
S3150002B830206F6666735574206F66206375727 26523
S3150002B8406E7420616D70732C666F72206561636825
S3150002B850206761696E00726564 6F206F6666736544
S3150002B86074206D6561737572656D656E747320 61A2
S3150002B8706E6420636F72726563 74696F6E73007330
S3150002B880657420616463 20636 16C69627261 7469C4
S3150002B8906F6E20767320767265 66007365742044 37
S3150002B8A04143206375727265 6E74206F66667365B6
S3150002B8B07420636F7272656374696F6E206F6E2097
S3150002B8C0382062697420636F6E766572746572 00E1
S3150002B8D0736574206672657175656E637920647529
S3150002B8E072696E672063616C696272617465206D4C
S3150002B8F06F6465007874616C206572726F7220697C
S3150002B9006E20487A00646973706C617920666C6F88
S3150002B910617469 6E6720706F696E7420636F6E73EF
S3150002B92074616E747320776974682075 6E697473B6
S3150002B930206F6E202D320616E64202D6400646981
S3150002B94073706C617920746162 6C65206F66206326
S3150002B950616C69627261 74696F6E20636F6E737473
S3150002B960616E74732061 73206D616E7469737361A5
S3150002B97020616E64206578706F6E656E74006D630B
S3150002B980063616C69627261 7465206D65746572CB
S3150002B990043414C000D0A2052202044414 32020FE
S3150002B9A02069536C6F706520694F66667365 7420F3
S3150002B9B020694572726F7220686561 64726F6F6D7D
S3150002B9C02020202020206D617849202020 20206D69CA
S3150002B9D06E49000D0A25326420253464 20 25382E4E
S3150002B9E033662025372E31662025372E31662020F4
S3150002B9F025372E31662025382E336620 25382E33FC
S3150002BA0066 6000D0A4F666673657420697465726115
S3150002BA1074696F6E7320706 56E64696E6720256443
S3150002BA20000D0A4F666673657420636F756E7465E2
S3150002BA3072202564000D0A414443206F66667365D1
S3150002BA4074203D2025382E3366000D0A4261747437
S3150002BA5065727920414443 20636F6465203D202549
S3150002BA60382E3366000D0A52656 6206572656E73697355 
S3150002BA70746F722041444320636F6465203D202524
S3150002BA80382E3366000D0A436F756E7473207065 27
S3150002BA907220766F6C74203D2025382E3366000D99
S3150002BAA00A5265662064696F6465204144 432063D7
S3150002BAB06F6465203D2025382E3366000D0A4750F7
S3150002BAC041206F6666736574203D2025382E3366E5
S3150002BAD0000D0A4C6F772074726970204920 3D2050
S3150002BAE025382E3366000D0A486967682074726924
S3150002BAF07C2049203D2025382E3366000D0A5672E5
S3150002BB006566206F6E20475041203D2025382E3332
S3150002BB1066000D0A47504131203D2025382E3366F6
S3150002BB20000D0A47504132203D2025382E3366004B
S3150002BB300D0A47504133203D2025382E3366000D2D
S3150002BB400A205220764F66667365742076644F66C5
S3150002BB5066736574207645727 26F72206865 6164D9
S3150002BB60726F6F6D20202020206D61785620202074
S3150002BB7020206D696E56000D0A2532642025372E67
S3150002BB8031662025372E31662025372E316620254F
S3150002BB90382E31662025382E33662025382E336618
S3150002BBA0000D0A25737620205220416D70732E2EC9
S3150002BBB02E2E2E2E2057617474732E2E2E2E2E208C
S3150002BBC04477617474732E2E2E2E20566F6C747306
S3150002BBD02E2E2E2E2E2E2044766F6C74732E2E2E2E23
S3150002BBE0000D0A25732532642025316420 2532642E
S3150002BBF020256325357520253364 20256325357573
S3150002BC0020253364202563253575202533642025B8
S3150002BC10632535752025336420256325357 5202552
S3150002BC203364000D0A43757272656E74204E6F742A
S3150002BC302055706461746564202D20796F75206DBE
S3150002BC40757374207370656369667920 2D497B6903
S3150002BC5070686173657D20616E64202D527B697206
S3150002BC60616E67657D206F7074696F6E0D0A000DD7
S3150002BC700A566F6C74616765204E6F7420557064 46
S3150002BC8061746564202D20796F75206D757374203B
S3150002BC907370656369667920 2D567B706861736 9
S3150002BCA0657D20616E64202D767B7672616E676596
S3150002BCB07D206F7074696F6E0D0A000D0A417574EE
S3150002BCC06F2D72616E676520655E61626C656400D8
S3150002BCD00D0A52616E67652068656C6420746F2078
S3150002BCE02532752028692920253275202876290 0D3
S3150002BCF00D0A486F6C64696E672066726571 7565B8
S3150002BD006E637920746F2025382E34662028487A8F
S3150002BD1029000D0A486F6C64696E6720666F67348
S3150002BD2065747300 0D0A4672657175656E637920D6
S3150002BD302D2025382E336620487A206F6E207068B5
S3150002BD4061736520256420 2C206761696E2025642C49
S3150002BD50206176657261676696E672 0256C6420636F
S3150002BD6079636C6573000D0A54696D657220787487
S3150002BD70616C2061646A757374202D2020 20202551
S3150002BD80332E336620487A000D0A4144432061640B
S3150002BD906A7573742062697473203131207468 7213
S3150002BDA0752036202D2025347520253475202534 1E
S3150002BDB075202534752025347520253475000D0A25
S3150002BDC05672656620616 46A757374202D20253467
S3150002BDD064000D0A4F66667365742061646A757342
S3150002BDE0742025730064796E616D6963 00737461F2
S3150002BDF0746963000D0A41444320776 73205672 65C6
S3150002BE00662061646A75737420636F6465202538E1
S3150002BE102E3266000D0A49207368756E74206164BD
S3150002BE20 6A757374202D20253464000D0A2056701D
S3150002BE302076 52204E2D3E5641646A204C2D3E56A7
S3150002BE4041646A000D0A253364253364 20253132A4
S3150002BE502E346520562F6C7362202531322E3465BE
S3150002BE6020562F6C7362000D0A253364253364 2035
S3150002BE7025376420253764000D0A257320522020B9
S3150002BE8041646A492044656C6179000D0A2573256F
S3150002BE9032642025 31322E346520412F6C736220A4
S3150002BEA02535642075536563000D0A2573253264B2
S3150002BEB02025356420253564004E0D0A2573526906
S3150002BEC0207652 202020416D70732020205566 4C
S3150002BED06C7473202020202057617474732020 20F4
S3150002BEE0566172732020202020202020202020202E
S3150002BEF020206B574872202020202020206B5641524842
S3150002BF007200000D0A2573202020202020434F4E68

S3150002BF105320554E495453000D0A000D0A2573004D
S3150002BF200D0A25735269207652205077724616354
S3150002BF30C742056497068617365205641527068617З
S3150002BF407365000D0A25732020202020202044616994
S3150002BF506C79416363756D2020202020202020044C7
S3150002BF60656C7461204C6F672020202020202020E1
S3150002BF702070682041636375 6D000D0A25732020C9
S3150002BF8057415454202020202020564152202020206 0
S3150002BF9020564166202054484 42D564120202020 18
S3150002BFA020205641202054484 42D252520507772C2
S3150002BFB04661637420564970686173 65000D0A25EF
S3150002BFC07320202020202496E6974616C20564168D6
S3150002BFD0722020202020202020204132687220496EC3
S3150002BFE063722020202020202020205632687220 49A9
S3150002BFF06E637220202020202020 46696E616C200C
S3150002C00056416872202020202020202044656C7461ED
S3150002C0102056416872000D0A2573515420202020B3
S3150002C0202020202044616 96C79416363756D2020206C
S3150002C0302020202020 44656C7461204C6F672020EC
S3150002C040202020202020202020706820416363756D0027
S3150002C0506E756D626572206F66206C6F67696361CB
S3150002C0606C206D65746572007472616E73666572BA
S3150002C070206461746120627920586D6F64656D2059
S3150002C08066726F6D206D65746572005265636569CF
S3150002C090766520646174612069 6E746F2C6D6574C3
S3150002C0A0657220627920586D6F64656D006E756DDC
S3150002C0B0626572206F6620736C6F7473202D207513
S3150002C0C07365642077697468202D2400676C6F623B
S3150002C0D0616C20746F20616C6C206D65746572737F
S3150002C0E0007472616E73706F6E64657220736C6F2A
S3150002C0F074206E756D626572007370656369667928
S3150002C10020544F5520706572696F6420666F7220E5
S3150002C1106C6F67206C69737473007370656369660C
S3150002C120792077686963682 06C6F6720717561 6E24
S3150002C13074697479003D312073696E676C6520708D
S3150002C14068617365 2C203D3220706F6C797068616E
S3150002C150736500737065636966792070686173 65DB
S3150002C160206E756D6265722069 6E20706F6C7970D3
S3150002C17068617365206D65746572004C6F67207324
S3150002C1807461727420646174650 04C6F6720656E19
S3150002C1906420646174650 04C6F672069 6E6465781B
S3150002C1A0005068617365730056 6F6C747300546F48
S3150002C1B074616C73006675 6C6C2070686173 6500DF
S3150002C1C0616C6C206D657465726564 20646174616E
S3150002C1D00064696167 6E6F7374696373003720 6404
S3150002C1E0696769742 06B77682F6B7661726800 7471
S3150002C1F06F74616C2048617 26D6F6E69632044 6969
S3150002C20073746F7274696F6E007175 69657400 6616
S3150002C2107265717565 6E6379007072696E742070ED
S3150002C22068206163 63756D756C61746F72206C69E9
S3150002C2306D697473206F6E206D64202D74007072A8
S3150002C240696E7420564120746573742064617461 4A
S3150002C250206F6E206D64202D740064756D6D7920DB
S3150002C2606F7074696F6E20666F72206F6C642063E4
S3150002C270616C69627261746F72006D64006D6574DF
S3150002C2806572207265616C2074696D652064 6174E3
S3150002C29061006B5748006B5641524800 6B56414845
S3150002C2A0006B413248000D0A2573000D0A25730002
S3150002C2B000D0A4672657175656E6379202D202536E5
S3150002C2C02E336620487A206F6E20706861736 5206F
S3150002C2D025642C20676169 6E2025642C20617665B1
S3150002C2E0726167696E6720256C642063 79636C6589
S3150002C2F073000D0A2573002532642025326420005E
S3150002C3002000200020202020202020202020200085
S3150002C310200025362E33662050452000 25362E3143
S3150002C320560D0A002573002000202020202020 20F0
S3150002C33020202020200020253130 2E33665620002072
S3150002C3400025362E316644656720002025732000BD
S3150002C3502025732000253264202532642025372EBD
S3150002C36033662025372E3266202538 2E3266002087
S3150002C3702531302E336620002025732000560041D9
S3150002C38000570C554152000D0A2573002032200044
S3150002C3902038200020582000 2531362E374C6620C2
S3150002C3A02531362E374C66202531362E374C6620FF
S3150002C3B0002531322E31662000 2573006B574872F4
S3150002C3C0000D0A2573002531362E374C662025319D
S3150002C3D0362E374C66202531362E374C6620002500
S3150002C3E031362E374C66202531362E374C662000E4
S3150002C3F000D0A2573002531362E374C66202531 3637
S3150002C4002E374C66202531362E374C6620002531D4
S3150002C410362E374C66202531362E374C66200 00DD7
S3150002C4200A25730025326420253264 2025372E33EF
S3150002C43066202537 2E32662025382E3266002000E9
S3150002C44020002000200020002 5342E3166252520DC
S3150002C45025372E33662025372E3266000D0A202018
S3150002C460202020202020202020202020202020 20C4
S3150002C470202020202020202020202020202020 20B4
S3150002C4802020202020202020746F74616C2020202020
S3150002C490202020200020002020202020202020 20D4
S3150002C4A020006E756D626572206F66206C6F67691B
S3150002C4B063616C206D65746572007472616E736679
S3150002C4C06572206461746120627920586D6F6465BB
S3150002C4D06D2066726F6D206D6574657200526563BC
S3150002C4E06569766520646174612069 6E746F206D7A
S3150002C4F06574657220627920586D6F64656D006E91
S3150002C500756D626572206F6620736C6F7473202D71
S3150002C51020757365642077697468202D2400676C22
S3150002C5206F62616C20746F20616C6C206D6574653E
S3150002C530727300 7472616E73706F6E646572 2073CB
S3150002C5406C6F74206E756D626572007370656369D7
S3150002C55066792 0544F5520706572696F6420666F44
S3150002C56072206C6F67206C697374730073706563F5
S3150002C57069667920776869636820 6C6F67207175D0
S3150002C580616E74697479003D31207369 6E676C65FA
S3150002C59020706861736 52C203D3220706F6C797053
S3150002C5A068617365007370656369667920706861 96
S3150002C5B07365206E756D62657220696E20706F6C90
S3150002C5C079706861736 5206D65746572004C6F677A
S3150002C5D020737461727420646174650 04C6F672005
S3150002C5E0656E6420646174650 04C6F6720696E64D1
S3150002C5F065780054 6F74616C00546F75 0042696C03
S3150002C6006C696E67206C69737400546F75206C6F69
S3150002C61067206461797300446 1696C7920746F756F
S3150002C620206C6F6720726561 64696E6773006 46966
S3150002C63073706C617920746F75206C6F672064610A
S3150002C640696C792064656D616E647300646973 70E8
S3150002C6506C617920746 96D6573206F662064616907
S3150002C6606C7920706561 6B7300646973706C6179B3
S3150002C67020646 1696C7920746F75206C6F67206322
S3150002C6806F6E73756D7074696F6E00646973706C2A
S3150002C690617920746865206461792074797065 73A4
S3150002C6A020666F72206120726 16E6765206F662058
S3150002C6B064617465732C206F72207263762 0386B06
S3150002C6C020636F6E666967206669 6C6520627920F1
S3150002C6D0786D6F64656D20772F202D52206F7074F0
S3150002C6E0696F6E00646973706C617920746865 2085
S3150002C6F064617920747970652074616 26C65206F5B
S3150002C70066207570207 46F20313620646179 20743A
S3150002C7107970650064697 3706C617920746865204C
S3150002C72064617 96C69676874207361766 96E677390
S3150002C730207469 6D6520746162 6C6500646973704A
S3150002C7406C617920746F752070726F66696C6520F2
S3150002C750666F722073706563696669656420 6461D9
S3150002C7607465004 36C65617220446D64007175697D
S3150002C7706574006C6973742 06C6F672F746F752F04
S3150002C78064656D616E6420636F6E66696 77572615A
S3150002C790746 96F6E206F66207061726 16D65746573
S3150002C7A072730070726 96E74207068206163 6375BB
S3150002C7B06D756C61746F72206C696D697473206F2C
S3150002C7C06E206D6474202D742C2073 697A65732033
S3150002C7D06F6E206D6474202D6D007072696E742008
S3150002C7E07274632 06C6F672077686 56E2075736557
S3150002C7F06420776974682 02D442C202D48206F729E
S3150002C800202D63206F7074696F6E730064756D708E
S3150002C8102073656374 6F727320616E642070747224
S3150002C820732 06F6E202D4C2077697468206 46174C2
S3150002C830657300737065636966792070686173 65F4
S3150002C840206E756D626572206 96E20706F6C7970EC
S3150002C85068617365206D657465720073706563 69DE
S3150002C86066792 06F72206469 73706C61792070 61D9

S3150002C87072616D657465727320666F722062696C8F
S3150002C8806C696E67206469737061790075736593
S3150002C89020776974682D6220746F207370656337
S3150002C8A0696679207261746520666F72204B5748FB
S3150002C8B02062696C6C206469737061790075 73AF
S3150002C8C06520776974682D6220746F2064657014
S3150002C8D06F736974206D6F6E657920746F20 74684A
S3150002C8E06973206163636F756E7420617320 6F666E
S3150002C8F020737065632764206461746500757365CF
S3150002C900207769746820 2D6220616E64202D422092
S3150002C910746F2073706563696679206163636F75EE
S3150002C9206E742062616C616E636520617320 6F664E
S3150002C93020656E64696E67206461746520696E2085
S3150002C9406D6474202D4200737065636966792 06E8A
S3150002C950756D626572206F662070657269 6F6473A9
S3150002C96020706572206461792066 6F7220696E7428
S3150002C97065727661 6C20646174612061 6E64206503
S3150002C9806E61626C6520726563 6F7264696E6720A0
S3150002C9906F662070 6F6C7970686173652069 6E745A
S3150002C9A0657276616C2064617461007365 6C65639F
S3150002C9B07420746F7520283129206F72206E6F20C3
S3150002C9C0746F7520283029206 6F7220746869 7327
S3150002C9D020717561 6E746974790072656 36F726431
S3150002C9E02064656D616E6420283129206F72206E85
S3150002C9F06F2064656D616E642028302920 666F722F
S3150002CA002074686973207175616E74697479007235
S3150002CA1065636F72642061636375 6D756C6174B5
S3150002CA206F727320283129206F72206E6F20616326
S3150002CA3063756D756C61746F72732028302920 6678
S3150002CA406F7220746869732071756 16E7469747986
S3150002CA5000736574206E756D626572206F66207054
S3150002CA606861736573207065722 06D6574657220E6
S3150002CA70666F7220696E74657276616C206C6F6780
S3150002CA807320616E642064656D616E6473006C6F01
S3150002CA9067202831292 06F7220646F6E2774206CFC
S3150002CAA06F67202830292073696E676C652070686D
S3150002CAB061736520696E74657276616C2064617457
S3150002CAC06120666F722074686973207061726 16D8D
S3150002CAD065746572007265636F72642028312920 5D
S3150002CAE06F7220646F6E277420726563 6F726420A2
S3150002CAF0283029207369 6E676C6520706861 7365DA
S3150002CB002064656D616E647320666F722074686955
S3150002CB107320706172616D65746572007265636F10
S3150002CB2072642028312920 6F7220646F6E27742068
S3150002CB307265636F7264202830292073696E676C90
S3150002CB4065520706861736520616363756D756C61DC
S3150002CB50746F727320666F722074686973207061D5
S3150002CB6072616D657465720073746F726520636FAE
S3150002CB706E666967757261746 96F6E20746F20667E
S3150002CB806C61736800737065636966792064656DAC
S3150002CB90616E642077696E646F7720696E206D69B5
S3150002CBA06E757465730073706563696679206E7558
S3150002CBB06D626572206F6620696E74657276616C4D
S3150002CBC0206C6F6720706572696F647320746F20C2
S3150002CBD06F7665726C617020666F722064656D6136
S3150002CBE06E642077696E646F770073657420636F75
S3150002CBF06E666967206261636B20746F206C617375
S3150002CC007420666C6173682076616C756500636C6E
S3150002CC1065617220656469742072616D2D662099
S3150002CC20636F6E666967206261636B20746F20644E
S3150002CC30656661756C742076616C756500646973EE
S3150002CC40706C61792074696D6520696E2045786320
S3150002CC50656C20666F726D6174202D204A756C6951
S3150002CC60616E446174652E4672616374696F6E20EB
S3150002CC7066726F6D20312F312F3930007265666909
S3150002CC806C6C20746865202D4C207461626C6500A2
S3150002CC906D647400746F752F64656D616E642061D6
S3150002CCA06E64206D6474206C6F6720646174610029
S3150002CCB00D0A4D75737420666972737420736574F8
S3150002CCC02073657269616C206E756D626572000D06
S3150002CCD00A4E6F206461746120617661696C6162DB
S3150002CCE06C65000D0A6C6F636174696F6E206606
S3150002CCF020636F6E666967207461626C65202D2001
S3150002CD006461696C7920666C61736820666F722053
S3150002CD1064617920696E646578202320256C64201D
S3150002CD20776974682064617465206F6620000D0A55
S3150002CD304E6F20636F6E666967207461626C652050
S3150002CD40666F72207468697320646179202D20757C
S3150002CD5073696E6720257300446566 61756C74009D
S3150002CD60456469742052616D00466C617368000DFA
S3150002CD700A6C6F636174696F6E206F6620636F6EF3
S3150002CD80666967207461626C65202D2025730044F4
S3150002CD90656661756C74004564697420526 16D0044
S3150002CDA0466C617368000D0A53657269616C2023D3
S3150002CDB0203D202530386C78000D0A4E756D62656F
S3150002CDC072206F66207068617365733D2025644A
S3150002CDD0000D0A4E756D626572206F6620746F755E
S3150002CDE020706572696F6473203D202564000D0A08
S3150002CDF044656D616E642077696E646F77203D20AD
S3150002CE0025640 00D0A4F7665726C6170203D2025FF
S3150002CE1064000D0A0D0A25734C6F672F4461792051
S3150002CE20544F5520444D442041434320504D20F9
S3150002CE304C6F673120446D6431204163633120 4277
S3150002CE4050000D0A25734C6F6753697A652041437A
S3150002CE504353697A6520444D4453697A6520546F79
S3150002CE607453697A65000D0A2573253764202020DC
S3150002CE702563202020202563202020202563202533 6476
S3150002CE8020202020202563202020202025632020200A
S3150002CE9025632025326400 0D0A257325376C64202C
S3150002CEA025376C642025376C642025376C64000DA9
S3150002CEB00A25732533316C64204461746120 5375ED
S3150002CEC062746F74616C000D0A25732533316C64CC
S3150002CED0204576656E74204F7665726865616400DA
S3150002CEE00D0A25732533316C642044617461204F29
S3150002CEF07665726865616400 0D0A2573253331 6CA7
S3150002CF006420546F74616C000D0A25732533316CED
S3150002CF1064205573616 26C65206 6C61736800 0DEE
S3150002CF200A25732533316C64204D6178696D756D00
S3150002CF302064617973207374 6F72616765000D0AEC
S3150002CF404D7573742062652061206661637 46F7229
S3150002CF50206F662031343430000D0A4C6F67206D25
S3150002CF60757374206265207365742074 6F20626520
S3150002CF7020612066616374 6F72206F662064656D3E
S3150002CF80616E642077696E646F77000D0A4C6F6775
S3150002CF90206D7573742062652073657420746F202A
S3150002CFA052652061206661637 46F72206F66206419
S3150002CFB0656D616E642077696E646F7720616E6459
S3150002CFC02073696E676C652070686173 65206C6F8B
S3150002CFD067206D7573742062652065 6E61626C658B
S3150002CFE064000D0A496E76616C696420636F6E6631
S3150002CFF069672074616 26C65000D0A496E76616C20
S3150002D0006964206 36F6E66696720746 1626C65008D
S3150002D0100D0A436F6E666967207461626C652077DC
S3150002D02072697474656E000D0A4D617820696E200E
S3150002D03061726368697665000D0A25730044617939
S3150002D04020547970657320 53756E6461792020AF
S3150002D050202 04D6F6E646179202020205475657 3FF
S3150002D06064617920202057656 46E657364617920 56
S3150002D07054687572736461792020467269646179B5
S3150002D08020202020536174757264617900 0D0A00B4
S3150002D09020 00252D392E3973000D0A596F75206D22
S3150002D0A075737420636F6C642073746172742074 78
S3150002D0B06865207 56E697420626566 6F7265206C9C
S3150002D0C06F6164696E6720746865 20386B206669D3
S3150002D0D06C652E0D0A000D0A4C6F6164207 0726F2A
S3150002D0E06772616D20776974686F757420636F6CFF
S3150002D0F06473746172 74696E672028592F4E293FD2
S3150002D100000D0A4F7065726174696F6E2061626FFD
S3150002D11072746564000D0A544F552070726F666909
S3150002D1206C6520666F72206461792074797065205F
S3150002D130257320000D0A0020252D392E3973000D86
S3150002D1400A25326420252D382E38732000202530FA
S3150002D1503278000D0A00200020000D0A25730025F2
S3150002D1602D382E387300556E697473000D0A257337
S3150002D17000202D2D3A2D2D202D2D2F2D2D2F2D2D0D
S3150002D1802D2D0020787878782E7878780020002067
S3150002D1902D2D3A2D2D202D2D2F2D2D2F2D2D2D2DB3
S3150002D1A00020787878782E787878000D0A25730032
S3150002D1B0202D2D2F2D2D2F2D2D2D2D0020787878F9
S3150002D1C07878782E787878002000202D2D2F2D2D36

S3150002D1D02F2D2D2D2D0020787878787878782E787856
S3150002D1E078000D0A2573002025366C7825632563A1
S3150002D1F025632025326420000D0A257300252D386B
S3150002D2002E387300556E697473000D0A2573002556
S3150002D2102D382E3873005254430020002025366CD8
S3150002D22078202532642000253130 6C7500202020BC
S3150002D230787878787878787878000D0A25732531302E3B
S3150002D2403130732531302E3130732531302E313065
S3150002D250732531302E3130732538 2E3873205449D8
S3150002D2604D45204F46205045414B004461696C793B
S3150002D27000496E74657276616C730052616D41632A
S3150002D28063756D00546F74616C0044656D616E6404
S3150002D290000D0A25730025343 02E34307300200029
S3150002D2A020000D0A2573202344617973202020 2053
S3150002D2B0202020537461727420002020202020202018
S3150002D2C0456E64200020436F6E73756D7074696FCE
S3150002D2D06E20202044656D616E642054494D4520C0
S3150002D2E04F46205045414B000D0A2573002025 3537
S3150002D2F06420002000200020200025363 12E363101
S3150002D300730020002000200020002078787878782EF4
S3150002D310787878782030303A30302030312F30312F43
S3150002D32031393930000D0A257320202020202020 4370
S3150002D3304F4E5320434F4E534441544554494D4555
S3150002D340202020202020205045414B205045414B44414E
S3150002D350544554494D45000D0A2573202020202 0AE
S3150002D36020434F4E53202020434F4E5344415445B1
S3150002D370202020202020205045414B2054494D45206F06
S3150002D38066205045414B000D0A257300202531 3297
S3150002D3902E364C660020002531302E3130730020A7
S3150002D3A0002000202531322E364C660020006E7594
S3150002D3B06D626572206F66206C6F676963616C20AF
S3150002D3C06D657465720074726166E736657220644F
S3150002D3D06174612062792058 6D6F64656D20667292
S3150002D3E06F6D206D65746572200526563656976 6559
S3150002D3F0206461746120696E746F206D6574657254
S3150002D4002062792058 6D6F64656D006E756D626578
S3150002D41072206F6620736C6F7473202075 73658E
S3150002D42064207769746820 2D2400676C6F62616CD2
S3150002D430 20746F20616C6C206D657465727 3007464
S3150002D44072616E73706F6E64657220736C6F742096
S3150002D4506E756D6265720073706563696679 2054D4
S3150002D4604F5520706572696F6420666F72206C6F0B
S3150002D470067206C69737473007370656369 667920DB
S3150002D4807768696368206C6F67207175616E74696D
S3150002D4907479003D312073696E676C652070686 12E
S3150002D4A073652C203D3220706F6C7970686173 65EC
S3150002D4B00073706563696679207068617365206EB2
S3150002D4C0756D62657220696E20706F6C7970686125
S3150002D4D0736520 6D657465720 04C6F6720737461A5
S3150002D4E072742064617465004C6F672065 6E6420F7
S3150002D4F0646174650 04C6F6720696E7465 7 6 0046E6
S3150002D50075 6C6C206C6F67004461 696C792052659A
S3150002D5106164696E6773006C6F672073746172 74FD
S3150002D520207469 6D65206F66 72206469 73706C6120
S3150002D53079006C6F6720656E642074696D652066 7C
S3150002D5406F7220646973706C6179006469 73706CCC
S3150002D5506179207261 7720636F6E73756D7074697D
S3150002D5606F6E2064617461206F6E206D6477 7202D6A
S3150002D5706C5B5D20636F6D6D616E640064697370 DC
S3150002D5806C617920636F6E73756D7074696F6E204E
S3150002D59064617461207065722064617920 66726FBD
S3150002D5A06D20696E74657276616C206C6F 677300AC
S3150002D5B0646973706C617920 74696D6520696E2087
S3150002D5C0457863656C20666F726D6174202D204A02
S3150002D5D0756C69616E446174652E467261637469 25
S3150002D5E06F6E2066726F6D20312F312F3930006DCC
S3150002D5F0647700646 56D616E64206C6F672064 6198
S3150002D6007461000D0A53657420736572 69616C203A
S3150002D6106E756D6265720000D0A2573000D0A25731B
S3150002D62000202D2D2F2D2D2F2D2D2D2D00207878FC
S3150002D63078787878782E787878000200 0200078781C
S3150002D640787878782E78787800202D2D2F2D2D2F2A
S3150002D6502D2D2D2D0020787878787878782E78787888
S3150002D660000D0A25735959595944617465 2E546936
S3150002D67060D65202020496E74657276616C204466 66
S3150002D6807461000D0A2573002000787878782E7868
S3150002D6907878000D0A2573202D446174652E54692D
S3150002D6A06D652D2D202020202041636375 6D000D0AC6
S3150002D6B025735959595944617465 2E54696D65200B
S3150002D6C0202020416363756D000D0A257300202515
S3150002D6D031322E364C66200020007472616E7370F1
S3150002D6E06F6E64657220736C6F74206E756D626501
S3150002D6F072007370656369667920706172616D6527
S3150002D700746572206E756D62657200646973706C01
S3150002D71061792 06D756C7469706C69657273 0064E9
S3150002D72069 73706C617920646566 61756C74206DCD
S3150002D730756C7469706C69657273 20776974686F49
S3150002D74075742063 6C656172696E67 0064697370D3
S3150002D7506C6179206D756C7469706C69657273 2081
S3150002D7606C6173742077726974 74656E207769745C
S3150002D77068202D570073746F7265206D756C74691D
S3150002D780706C6965727320746F20666C61736800D1
S3150002D7903 6C656172206D756C7469706C69657233
S3150002D7A07320776974686F75742073746F72696E0B
S3150002D7B06720696E20666C6173 68006D756C7469AA
S3150002D7C0706C69657220666F7220616D7073006D90
S3150002D7D0756C7469706C69657220666F7220766FFB
S3150002D7E06C7473006D756C7469706C69657220 6611
S3150002D7F06F72207265616C2074696D65207061724A
S3150002D800616D20737065632 7642062792 02D500054
S3150002D810756E69747320666F72207265616C20740E
S3150002D820696D6520706172616D20737065632 7642E
S3150002D83020627920 2D50006E756D62657220 6F66CA
S3150002D8402064656369 6D616C20706F696E74732004
S3150002D850666F722064656D616E642066696 56C64CC
S3150002D860006D756C7469706C6965722066 7220E2
S3150002D87064656D616E6420706172616D2073706 59E
S3150002D8806327642062792 02D5000756E69747320B7
S3150002D890666F722064656D616E6420706172616D7F
S3150002D8A020737065632764206279202D50006E759F
S3150002D8B06D626572206F662064656369 6D616C20B6
S3150002D8C0706F696E747320666F7220636F6E737504
S3150002D8D06D7074696F6E20666965 6C64006D756C37
S3150002D8E07469706C69657220666F7220636F6E73FD
S3150002D8F0756D7074696F6E20706172616D207370E0
S3150002D90065632764206279202D5000756E697473F1
S3150002D91020666F7220636F6E73756D7074696F6EB9
S3150002D92020706172616D2073706563276420627 96D
S3150002D930202D5000737 96E632064617461 20696ED4
S3150002D9402072616D206261636B20746F20666C6168
S3150002D95073682064617461 2C2065726173 65206549
S3150002D9606469747300647 56D70206F72206D6F64E4
S3150002D9706966792072656 16C2074696D6520756EC1
S3150002D9806974732028 6F7468657277697365206 19C
S3150002D99063756D756C61746F7220756E697473ED
S3150002D9A029006D6D756C74007365742 06F72207634
S3150002D9B0696577206D756C7469706C6965727300 40
S3150002D9C00D0A4D617820696E2061726368697 66519
S3150002D9D000000D0A4E6F2077726974657320 6F662098
S3150002D9E06D756C7469706C6965727320696E2061FD
S3150002D9F0726368697 665000D0A6C6F636174696F9C
S3150002DA006E206F66206D756C7469706C6965722024
S3150002DA107461626C65202D2025730044656661750C
S3150002DA206C7400456469742052616D00466C6173C2
S3150002DA3068000D0A20502020202020722D4D756C742E
S3150002DA4020722D556E697473000D0A253264202 5E5
S3150002DA50392E33652025 2D382E3873000D0A2050B5
S3150002DA6020645F4450202020 20642D4D756C742064
S3150002DA70642D556E69747320 20632D4450202020 36
S3150002DA8020632D4D756C7420632D556E6974730079
S3150002DA900D0A25326420253464202539 2E3365206B
S3150002DAA0252D382E3873202534642025392E3365EA
S3150002DAB020252D382E3873006C696E65206C696DD1
S3150002DAC06974000D0A4C696E65206C696D69742073
S3150002DAD03D202564006D6F72650073657420746 85D
S3150002DAE065206C696D6974206F66206C696E65735A
S3150002DAF0206469737 06C61796564207065722070 48
S3150002DB0061676 52C20303D6E6F206C696D6974000B
S3150002DB106E756D626572206F66206C6F67696361 F0
S3150002DB206C206D6574657200747261 6E73666572DF

S3150002DB30206461746120627920586D6F64656D207E
S3150002DB4066726F6D206D65746572005265636569F4
S3150002DB507665206461746120696E746F206D6574E8
S3150002DB6065722062792058 6D6F64656D006E756D01
S3150002DB70626572206F6620736C6F7473202D207538
S3150002DB807365642077697468202D2400676C6F6260
S3150002DB90616C20746F20616C6C206D6574657273A4
S3150002DBA0007472616E73706F6E64657220736C6F4F
S3150002DBB074206E756D626572007370656369667 94D
S3150002DBC020544F5520706572696F6420666F72200B
S3150002DBD06C6F67206C697374730073706563696632
S3150002DBE079207768696368206C6F67207175616E4A
S3150002DBF074697479003D312073696E676C652070B3
S3150002DC006861736 52C203D3220706F6C7970686193
S3150002DC107365007370656369667920706861736500
S3150002DC20206E756D62657220696E20706F6C7970F8
S3150002DC3068617365206D65746572004C6F67207349
S3150002DC40746172742064617465004C6F6720656E3E
S3150002DC50642064617465004C6F6720696E64657840
S3150002DC600064756D702074657374206461746100 5C
S3150002DC70566F6C7461676520506861736500437501
S3150002DC807272656E742050686173650043757272B4
S3150002DC90656E742072616E676500766F6C7461677B
S3150002DCA0652072616E6765202D2075736564206933
S3150002DCB06E206D74202D465B5D00686F6C6420617A
S3150002DCC02070686173652066 6F722034206D696EFC
S3150002DCD0757465732C206F7220772F202D41206575
S3150002DCE078657263697365207472616 36B20616E15
S3150002DCF06420686F6C640072756E20746573740 0BC
S3150002DD0073657420617665726167696E67206F66F6
S3150002DD1020667265717565 6E6379206D65617375CE
S3150002DD2072656D656E7420303D36342C313D313668
S3150002DD302C323D342C333D302C20757365202D76E4
S3150002DD405B5D20616E64202D565B5D20746F2073CF
S3150002DD506574206761696E2072616E676520616E07
S3150002DD6064207068617365007265706561746564CC
S3150002DD706C792064756D7020726561646 96E677373
S3150002DD802065766572792073656 36F6E64006761DC
S3150002DD90746520746865206D65746572206F6E20E7
S3150002DDA0666F7220737065636966696564206E7555
S3150002DDB06D626572206F66207375627365636F6E3E
S3150002DDC064730067656E65726174652061207261B5
S3150002DDD06D70207761766520 6F6E205048206F75D2
S3150002DDE0742C207265636F726420612068697374 93
S3150002DDF06F6772616D20772F2D412C202D6477205D
S3150002DE00746F2064756D70206869737467 6F677261 D0
S3150002DE106D00414443207365 6C65637420302C3178
S3150002DE202C322C352C362C37202D3E20492C564EA2
S3150002DE302C56442C475041492C56424154542C509E
S3150002DE404C432046696C746572 20746F204D4F20D6
S3150002DE5070696E00504C432066696C74657220735B
S3150002DE60656C65637420666F7220757365 20772F03
S3150002DE70202D4120636F6D6D616E6420302D343D1F
S3150002DE8066696C7465722C353D44534D206F766518
S3150002DE907272616E6765004155582073656C6563E1
S3150002DEA074203C2C312C322C33202D3E2076726594
S3150002DEB0662C2047504169312C2047504169322C4B
S3150002DEC020475041693320696620414443207365E7
S3150002DED06C6563743D3D35007374617274 20636FC3
S3150002DEE0646520666F72202D64772064756D7000FC
S3150002DEF0656E6420636F646520666F72202D647799
S3150002DF002064756D700073657420444143206375 07
S3150002DF107272656E74206F666673657420636F72C3
S3150002DF2072656374696F6E206F6E20382062697441
S3150002DF3020636F6E766572746572006E756D6265CA
S3150002DF4072206F662061766572616765732066 6FFF
S3150002DF5072202D412061732065787 06F6E656E7434
S3150002DF60206F662032005341 20636C6F636B20730F
S3150002DF70656C65637420666F72202D412077697423
S3150002DF8068202D6E0044656C61792062657477 6540
S3150002DF90656E2074776F20636F6E7665727369 6F34
S3150002DFA06E7320666F72202D41202D4E20616E64A5
S3150002DFB0202D48004C4544207365 6C6563742030FF
S3150002DFC02C312C322C332C34202D3E204F46462C1D
S3150002DFD0204F4E2C205854414C2C206B48722C203A
S3150002DFE06B56617268202D20757365207769746897
S3150002DFF0202D70206F72202D4D20746F2073656C5A
S3150002E000656374207068617365206F72206D657434
S3150002E0106572206E756D6265722C20646973706C10
S3150002E020617920776974682 02D6400617578206DA6
S3150002E0306F646520287573652077 2F202D4129206E
S3150002E0407B302E2E32202D3E666F6C6C6F7765729A
S3150002E0507C706F73207065616B7C6E656720706 57E
S3150002E060616B7D0052756E2073656C6620746573F4
S3150002E07074202D2D20757365207769746 8202D64B0
S3150002E08020746F2064756D702073656C6620746 5EC
S3150002E0907374207265737 56C7473006D74007465A5
S3150002E0A07374206D6574657200 0D0A202020536119
S3150002E0B06D706C6573202B5065616B202D50656108
S3150002E0C06B20205074 6F5020202041766 72D4443E8
S3150002E0D02020202020202020524D532020437265EC
S3150002E0E0737446616374002020202041766 72D44B4
S3150002E0F0433220202020202020524D5332000D0A88
S3150002E1002531306C752025356C752025356C7520CA
S3150002E1102535 6C752025382E3166202531302E3373
S3150002E12066202531302E3566002025382E316620B0
S3150002E1302531302E3366000D0A49204F6666202DA2
S3150002E140205761697420317374206368617 2000D0F
S3150002E1500A49204F6E202D202063686172206 86F65
S3150002E1606C646F666600 0D0A49204F6E2C2D2020D2
S3150002E17057616974203 26E6420636861 72000D0A09
S3150002E18049204F6666202D20576169742 06E657797
S3150002E19020636D64000D0A25632025326420256400
S3150002E1A0202564202531302E3666202534642000 51
S3150002E1B02534642025346420253 62E3166202534 04
S3150002E1C07520253475202534752025372E34662092
S3150002E1D025362E316620253475202534752025 34C2
S3150002E1E0752025372E34660D0A002025313 42E3748
S3150002E1F04C6620253134 2E374C66002025313 42ECC
S3150002E200374C6620 00202531302E33662 00020252B
S3150002E2107320005600410057005641 52000D0A2055
S3150002E2202531322E3366202531322E3366560020B2
S3150002E2302531322E3366202531322E3366560020A2
S3150002E2402531322E3366202531322E336656000DA5
S3150002E2500A252D3335732532307300 0D0A70686135
S3150002E26073652068656C6420746F202532752028DA
S3150002E270692920253275202876292025382E3466EC
S3150002E28020 28487A2920666F72202564206D696EDF
S3150002E29075746573000D0A63757272656E74206D0E
S3150002E2A0656173757265 6D656E747320726570 6CE7
S3150002E2B06163656420627920617578206D6561739A
S3150002E2C07572656D656E7473000D0A637572726 59B
S3150002E2D06E74206D656173757265 6D656E747320FB
S3150002E2E07265706C6163656420627920 6772656 618
S3150002E2F020617420414443000D0A617578206F66DF
S3150002E30066736574206D656173757265 6D656E748D
S3150002E3107320646973616 26C65642C2061757820 70
S3150002E32072656164696E673A000D0A6164632073FF
S3150002E330656C656374203D202564000D0A6175785D
S3150002E34020736 56C656374203D202564000D0A61A7
S3150002E3507578206761696E203D202564000D0AA3
S3150002E36061757820697068617365203D20256400B7
S3150002E3700D0A617578207664761696E203D20256415
S3150002E380000D0A61757820767068617365203D20FC
S3150002E3902564000D0A617578206F66667365742 0C0
S3150002E3A03D202564000D0A67617465203D202536EF
S3150002E3B064000D0A686F6C646F6666203D20253620
S3150002E3C064000D0A74657374206D6F646520646958
S3150002E3D07361626C6564000D0A46726571756 56EDD
S3150002E3E06379202D2025362E336620487A206F6EDB
S3150002E3F0207068617365202564 2C206761696E2030
S3150002E40025642C20617665726167696E6720256CCA
S3150002E41064206379636C6573000D0A4C454420746D
S3150002E420656D706F726172696C79206F66662E0017
S3150002E4300 0D0A4C454420 74656D706F72617269 6C89
S3150002E44079206F75747075 7469 6E6720636C6F637B
S3150002E4506B2063727973 74616C2E000D0A4C45440D
S3150002E46020 74656D706F726172696C792074656D66
S3150002E470706F726172696C79206F6E2E000D0A4C94
S3150002E480454420707 56C73696E67202573 20737519

S3150002E4906D6D696E672070686173657320256420EF
S3150002E4A0746F202564000D0A252D31352E31357302
S3150002E4B025732020202020202020206920202020B3
S3150002E4C020202020202076202020202020202020766C4C
S3150002E4D020202020202020207664202020202020209A
S3150002E4E02076646C20202020202020204144432020D6
S3150002E4F0202020746F74616C004D656173757265BE
S3150002E5006D656E74000D0A252D31352E3135732554
S3150002E5107325396420253964202539642025396418
S3150002E5202025396420253964202539640053616D1C
S3150002E530706C652074696D6573000D0A252D313581
S3150002E5402E313573257325392E31662025392E3124
S3150002E550662025392E31662025392E316620253949
S3150002E5602E31662025392E31660053746174696333
S3150002E570206F6666736574000D0A252D31352E31BE
S3150002E5803573257325392E31662025392E316620BD
S3150002E59025392E31662025392E31662025392E3130
S3150002E5A0660044796E616D6963206F666673657491
S3150002E5B0000D0A252D31352E313573257325396423
S3150002E5C00044414320636F7272656374696F6E0023
S3150002E5D00D0A252D31352E313573257325392E3603
S3150002E5E0662025392E36662025392E3666202539AF
S3150002E5F02E36662025392E36660043616C20436F1F
S3150002E6006E7374616E7473000D0A252D31322E31CC
S3150002E6103273256420202573253964202539640048
S3150002E6204761696E000D0A252D31352E3135732568
S3150002E6307325396420253964202020202020202020BB
S3150002E6402020202025396400506F73207065616B00AD
S3150002E6500D0A252D31352E31357325732539642062
S3150002E660253964202020202020202020202020253922
S3150002E67064004E6567207065616B000D0A252D31B9
S3150002E680352E3135732573253964202539642020CA
S3150002E690202020202020202020202025396400506B20B5
S3150002E6A0746F20506B000D0A252D31352E313573CE
S3150002E6B0257325392E32662025392E3266202020F2
S3150002E6C0202020202020202025392E326600524D7F
S3150002E6D053000D0A252D31352E3135732573253913
S3150002E6E02E34662025392E34662020202020202034
S3150002E6F0202020202025392E3266004372657374204D
S3150002E700466163746F72000D0A4F6E6C79206269FE
S3150002E7106C6C696E6720706172616D657465727387
S3150002E7202063616E20626520726F75746564207461
S3150002E7306F204C454420004E5065616B00252D31FB
S3150002E740362E31367300252D31362E31367300259D
S3150002E7502D31362E31367300252D31362E31367354
S3150002E76000252D382E38732000416C6C48727300D8
S3150002E77025382E387300204D232532640025732058
S3150002E78000416C6C2D4872730050642000204D23AA
S3150002E7902532640020252D382E38730050415353FC
S3150002E7A04544002000202A2A2A2063616C63756C86
S3150002E7B06174696E67202A2A2A004E4F54455354C3
S3150002E7C000202A2A2A20206869676820202A2A2A05
S3150002E7D0002A2A2A20206C6F7720202A2A2A004320
S3150002E7E06F756E747320706572207666C74004F4D
S3150002E7F06666736574730042617474657279207615
S3150002E8006F6C746167650054656D706572617475CD
S3150002E81072652044696F646500475041204F666601
S3150002E820736574004C6F77205472697020506F695B
S3150002E8306E7420666F72204D65746572206167631F
S3150002E8400048696768205472697020506F696E7457
S3150002E85020666F72204D657465722061676300558C
S3150002E8606E726567756C6174656420566F6C74614F
S3150002E870676500566F6C746167652072616E6765C5
S3150002E880206F7665726C61700043757272656E7484
S3150002E8902072616E6765206F7665726C6170004EDC
S3150002E8A06E6F006576656E006F6464000D0A4349FB
S3150002E8B0503A000D0A43495023002D2D2D2D2D2DA2
S3150002E8C03E00537472696E6700446563696D616CDC
S3150002E8D0005369676E65640048657800466C6F612F
S3150002E8E07400446174650048483A4D4D3A535300EA
S3150002E8F048483A4D4D00436F6D6D616E6400556E2A
S3150002E9006B6E6F776E204F7074696F6E0053796EFF
S3150002E91074617800446563696D616C0048657800CE
S3150002E920537472696E670052616E6765004368656B
S3150002E930636B73756D006C657474657220202D00AF
S3150002E940706F736974696F6E20000D0A4368617295
S3150002E9506163746572206F76657272756E000D0A58
S3150002E9604672616D696E67206572726F72000D0A7A
S3150002E970506172697479206572726F72000D0A4372
S3150002E9806861726163746572206572726F72000DDE
S3150002E9900A4C696E6520746F6F206C6F6E6700207B
S3150002E9A00D0A000D0A2D2D2D2D2D2D2D2D2D2D2D42
S3150002E9B02D2D2D2D2D2D2D2D2D2D2D2D2D2D2D2D7F
S3150002E9C02D2D2D2D2D2D2D2D2D2D2D2D2D2D2D2D6F
S3150002E9D02D2D2D2D2D2D2D2D2D2D2D2D2D2D2D2D5F
S3150002E9E02D2D2D2D2D2D2D2D2D2D2D0D0A000DDF
S3150002E9F00A002534642000252D31352E3135733A2F
S3150002EA0020252D34307300200D0A00200D000D0A3A
S3150002EA102573204572726F7200206F6E206F7074BC
S3150002EA20696F6E20257325630D0A000D0A000D0A13
S3150002EA3025730D0A00000D0A002534642000252DD9
S3150002EA4032302E3230733A20252D343073000D0ABF
S3150002EA50005065726D0020547970652020202020B8
S3150002EA604F7074205061726D2020202020446573FF
S3150002EA706372697074696F6E000D0A002534640052
S3150002EA80202573256320202020252D3873000D0A25A5
S3150002EA9032322E323273002000202020202000202520
S3150002EAA02D34302E343073006E65772070617373A7
S3150002EAB077640070617373776420636F7079206680
S3150002EAC06F7220636F6E6669726D6174696F6E0034
S3150002EAD070617373776F7264206C6576656C007310
S3150002EAE06574207365726E6F202D206D75737420A8
S3150002EAF062652067726561746572207468616E2052
S3150002EB006F7220657175616C20746F2030343030FD
S3150002EB103030303030007061737377640064756D70E5
S3150002EB2020706173737764000D0A536574207469EB
S3150002EB306D65206669727374000D0A4D61782069ED
S3150002EB406E2061726368697665000D0A53657420EA
S3150002EB5074696D65206669727374000D0A4D617879
S3150002EB6020696E2061726368697665000D0A5061DC
S3150002EB707373776F72647320646F206E6F74206D87
S3150002EB8061746368000D0A456E7465722070617364
S3150002EB9073776F7264207477696365000D0A257551
S3150002EBA020253130730072656164657231007465C7
S3150002EBB063683200537570657233005574496C4947
S3150002EBC0745934006C4576656C62416C007135753A
S3150002EBD0326130643800706400706F7765725F640A
S3150002EBE06F776E73000D0A25732025376C6420003B
S3150002EBF0506861736520446961676E6F73746963F7
S3150002EC0000566F6C74730044656C74610056415211
S3150002EC10205068617365004C696E652046726571A5
S3150002EC2075656E6379004D756C7400252D31362E2F
S3150002EC3031367300252D31362E31367300252D38A7
S3150002EC402E387300252D382E38732000252D3130AD
S3150002EC502E31307325362E31660025382E31662543
S3150002EC60382E3166002573002531332E336620484F
S3150002EC707A00252D382E3873006B574825326420CA
S3150002EC80006B5248253264200050682532642052B7
S3150002EC90253264005068202564202020202000258B
S3150002ECA0362E316625632025352E336620504600E2
S3150002ECB050682532642020200025342E3166252511
S3150002ECC0442020202020004E256325352E33660061
S3150002ECD0256325352E326600256325352E316600DD
S3150002ECE0256325352E336600256325352E326600CB
S3150002ECF0256325352E316600256325352E336600BC
S3150002ED00256325352E326600256325352E316600AC
S3150002ED10256325352E336600256325352E3266009A
S3150002ED20256325352E316600256325352E3366008B
S3150002ED30256325352E326600256325352E3166007C
S3150002ED40256325352E336600256325352E3266006A
S3150002ED50256325352E316600256325352E3366005B
S3150002ED60256325352E326600256325352E3166004C
S3150002ED70256325352E336600256325352E3266003A
S3150002ED80256325352E316600256325352E3366002B
S3150002ED90256325352E326600256325352E3166001C
S3150002EDA0256300257300252D382E38730025730040
S3150002EDB0252D382E3873002D7878782E7870002518
S3150002EDC073002D7878782E7870002573004E747251
S3150002EDD0616E73706F6E64657220736C6F74206EF1
S3150002EDE0756D6265720064756D702070756C736501

S3150002EDF020636F756E746572730053657420504993
S3150002EE004320536572696I6C206E756D626572008E
S3150002EE105365742070756C73654F757420303D733D
S3150002EE2074642C20313D2070756C73652073657295
S3150002EE3069616C2C20323D6D632073657269616C69
S3150002EE400044756D7020504943205374617465000 7
S3150002EE50436865636B206D6178696D756D207661B7
S3150002EE606C7565206F6E20504943207375622D4183
S3150002EE706363756D756C61746F727300436F6E7444
S3150002EE80726F6C2052656C61792041202D2D2031E4
S3150002EE9020747572E73206F6E2072656C61797361
S3150002EEA000436F6E74726F6C2052656C61792042FA
S3150002EEB0202D2D2031207475726E73206F6E207294
S3150002EEC0656C617973005265717565737420504977A
S3150002EED043206563686F0057616B6520757020502B
S3150002EEE04943005075742050494320696E20736C63
S3150002EEF0656570206D6F6465005265736574205098
S3150002EF00494320636F6D6D756E69636174696F6ED7
S3150002EF1000457261736520504943205265676973E3
S3150002EF20746572730044756D7020646961676E6FF3
S3150002EF3073746963206461746100526563616C6312
S3150002EF40756C61746520637572726F780070740007
S3150002EF5070756C736520746573740000D0A50756C58
S3150002EF6073652025346420202020202020530386C2B
S3150002EF70782530386C78000D0A2020205365726996
S3150002EF80616C204E756D626572202020203D20202521
S3150002EF903264000D0A202020504943 20636F756EAB
S3150002EFA074696E67000D0A20202052656C61792013
S3150002EFB041203D002053544154555320554E4B4E4B
S3150002EFC04F574E00204F4E00204F4646000D0A2056
S3150002EFD0202052656C61792042203D002053544125
S3150002EFE054555320554E4B4E4F574E00204F4E0010
S3150002EFF0204F4646000D0A20202050494320736CBC
S3150002F000656570696E67000D0A2020205374616E73
S3150002F0106461726420507 56C736520436F756E74FB
S3150002F020000D0A2020204D696E6920436C6F7365BE
S3150002F0307420492F4F20657870616E73696F6E0078
S3150002F0400D0A20204E6F7420696E2050756C736510
S3150002F05020436F756E74696E67204D6F646500504C
S3150002F060494320636869702069732061 6C72656127
S3150002F07064792061776 16B652E000D0A20202020BD
S3150002F08020202020202020466C6173682020202020202A
S3150002F09020202020202020202052616D2020202020A8
S3150002F0A020202020202020202020205049432000FC
S3150002F0B000D0A50756C7365202532642025303 86C34
S3150002F0C0782530386C7820202000253038 6C782559
S3150002F0D030386C782020200025303 86C78000D0AF4
S3150002F0E02050494320656 3686F206F6B20000D0A2C
S3150002F0F020504943206261642 06D6573736167650033
S3150002F1000D0A204D6178696D756D207375622D61EA
S3150002F11063637 56D756C61746F72203D20202534B2
S3150002F1206420000D0A2050494320616363756D75A2
S3150002F1306C61746F727320636C656172656400 0D35
S3150002F1400A2052656C617920747269676765722 05C
S3150002F150636F6E6669726D6564000D0A202A2A2A3B
S3150002F16020524 54C4159204552524F52202D2D20B6
S3150002F17053544154555320554E4B4E4F574E202A09
S3150002F1802A2A004E707500706F7765722075707 34B
S3150002F190000D0A25732025376C64000 73657420E0
S3150002F1A06E756D626572206F662065787465726E23
S3150002F1B0616C206D657465727320696E207363617C
S3150002F1C06E20696E2072616D206F6E6C79202873D5
S3150002F1D063616E202D5731323334207 46F2077727B
S3150002F1E069746520746F20666C617368290064 69AE
S3150002F1F073706C617920706F696E74657220696EC6
S3150002F200666F0064756D7020386B20696E666F00DC
S3150002F210736D00736574206D65746572732C20704E
S3150002F220686173657320706572206D6574657200 1E
S3150002F2300 0D0A44656661756C7420386B000D0A38D8
S3150002F2406B41646472 2046696C654C656E20537529
S3150002F2506D4F66386B2020386B43686B53756D2093
S3150002F260436F6E666967494420546F754E616D65DA
S3150002F27020202052656C656173652D54696D652F4456
S3150002F28061746500 0D0A2530366C78202530376C9E
S3150002F29064202530386C78202530386C782025306B
S3150002F2A0386C7820252D382E3873000D0A636F6E60
S3150002F2B0666967207 46F7574616 222064617974612E
S3150002F2C062207374617274 38206368656 36B70744C
S3150002F2D07220207374417263206E787441726320C7
S3150002F2E0656E6441726300 0D0A25366C78202536F8
S3150002F2F06C78202536 6C782025366C782025386C7B
S3150002F30078202536 6C782025366C782025366C7860
S3150002F310000D0A504820696E744D747 2732073632F
S3150002F320616E4D7472732077696E646F77206F76A3
S3150002F33065726C6170206E756D544F55732020 2076
S3150002F340544F557374617274202020202020544F55F7
S3150002F350656E64204F6C6465737444617465204EF7
S3150002F36065776573744461746520 4E756D44617981
S3150002F37073000D0A2532642025376C642025386C0B
S3150002F380642025376420253764202537 6C642000E5
S3150002F3902000200020002D2D2F2D2D2F2D2D2D2D3F
S3150002F3A020002025376C64002D2D2F2D2D2F2D2D7D
S3150002F3B02D2D2020202020202020300 04E62617564F1
S3150002F3C0726174652 02D20302028617574 6F2920A2
S3150002F3D0393630302C31393230302C333834303003
S3150002F3E000706172697479203D6E6F6E652C20F3
S3150002F3F0313D6576656E2C20323D6F6464006E7514
S3150002F4006D626572206F66206269747320283720E8
S3150002F4106F72203820 29002D6530206E6F206563BB
S3150002F420686F2C202D653120 6563686F002D6D3065
S3150002F430206E6F206D6F64656D2C202D6D31206DF1
S3150002F4406F64656D00777269746520636F6D6D75A3
S3150002F4506E69636174696F6E20706172616D657445
S3150002F460657273207 46F2061726368697665 0074D1
S3150002F470657374206D6F64656D202D20756E7469 D9
S3150002F4806C205E632074797065640073747479000D
S3150002F490746572 6D696E616C207061 72616D6574FE
S3150002F4A0657273000D0A696E76616C69642062 6129
S3150002F4B07564207261746500 0D0A000D0A000D0A5A
S3150002F4C04D617820696E20617263686976650000D08
S3150002F4D00A257320256C6420626175642025 6420E8
S3150002F4E06269747320257320706172697479 2025AC
S3150002F4F073206563686F2025732 06D6F64656D00E8
S3150002F500686F6C640068756E7400006E6F00006E42
S3150002F5106F000D0A617465300 0D0A000D0A6174717F
S3150002F5203065307330 3D310D0A00737500737461B6
S3150002F5307274757073000D0A25732025376C64206A
S3150002F540004E74616D70657200 74616D7065722033
S3150002F55065766656E7473000D0A25732025376C6413
S3150002F56020007463007469 6D65206368616E676567
S3150002F57064206576656E7473000D0A25732025373F
S3150002F5806C6420002025732025376C6420007 66584
S3150002F59072006475 6D702061736963207665727 39B
S3150002F5A0696F6E20616E6420736F66747761 72652F
S3150002F5B020766572736 96F6E20616E64206368657A
S3150002F5C0636B73756D000D0A617369632020202020D9
S3150002F5D0736F667477617265 206368656 36B7301
S3150002F5E0756D206368656 36B73756D2020636 16C4E
S3150002F5F063737 56D2072656C6561 7365000D0A250E
S3150002F6002D372E37732025303 86C782020253038 58
S3150002F6106C782025303 86C782025303 86C782000BC
S3150002F620252D31362E31367300252D31362E3136C3
S3150002F6307300252D31362E313673002538 6C78004D
S3150002F640252D31362E313673004368656 36B73752B
S3150002F6506D00253038 6C7800252D31362E31367303
S3150002F66000252D31362E31367300253038 6C7800256B
S3150002F6702D31362E313673 00252D372E3773002560
S3150002F6803473202535 6C6420626175640048 6F6CA2
S3150002F690640048756E74002531642062202573204B
S3150002F6A07061726974790 04E202020202020202020206B
S3150002F6B0202020202020202020202020202020202042
S3150002F6C0202020202020202020202020202020202032
S3150002F6D020202020202000202020207365726E6F20BB
S3150002F6E0004D74722000204D232000504820007 0E7
S3150002F6F0232000515420005123200054232000 6C63
S3150002F7002320 00252D382E387300544F5500252D01
S3150002F710382E3873 00556E69747300253 86C78205C
S3150002F7200020203120002020532000253264532 05F
S3150002F73000253364200020412000253264 20002564
S3150002F74032642000253264200025326420 00252DF3

S3150002F750382E3873002000252D382E3873001818DD
S3150002F7601818181818181808080808080808080018A9
S3150002F770181818181818180808080808080808080099
S3150002F780252D31362E31367300252D31362E313662
S3150002F79073004D6F6E746820746F20446174650047
S3150002F7A025342E347325372E32660050726F6A6501
S3150002F7B06374656420426C6C0025342E347325AB
S3150002F7C0372E3266004C617374204D6F6E7468205A
S3150002F7D042696C6C0025342E347325372E3266004E
S3150002F7E05374617274204461746500456E642044EA
S3150002F7F06174652000737461727420687768065AA
S3150002F8006E64206B77680042696C6C205261746585
S3150002F81000252D342E34732531322E3566004C6187
S3150002F8207374205570646174650025342E34732513
S3150002F830372E3266004163636F756E742042616CC7
S3150002F840616E63650025342E347325372E326600C9
S3150002F8504375746F666620446174650052637600 70
S3150002F860586D69743000586D69743100476F6F6462
S3150002F870207265706C7900476F742073746174 75B9
S3150002F88073004E6F207265706C790050617269 74F4
S3150002F89079206572726F720041646472206572 72B9
S3150002F8A06F7200526567206572726F72005265 67E9
S3150002F8B038206572726F720048616D6D696E67 20DD
S3150002F8C06572726F72000042726561 6B00526376F6
S3150002F8D064206D6573736167650047 6F7420737486
S3150002F8E06174757300636861 6E6E656C2074696D10
S3150002F8F0656F75740050617269747920657272 6FF2
S3150002F900720052637664206D657373616765 2C209D
S3150002F91077726F6E6720616464720052656720 6554
S3150002F92072726F72005265673820657272 6F72006A
S3150002F93048616D6D696E67206572726F72 00476C01
S3150002F9406F62616C20636F6D6D616E6400427265F9
S3150002F950616B00436D64005365726E6F00506F6C8D
S3150002F9606C005265673800526567004365 6E7465C0
S3150002F970722063656E7465722066726571 120696EA7
S3150002F98020487A00706C63206D6F64656D204E436B
S3150002F9904F206C6F772066726571202D2064657624
S3150002F9A0696174696F6E2066726F6D20637472 4648
S3150002F9B072657100706C63206D6F64656D204E43D5
S3150002F9C04F2068696768206672657120 2D2064651C
S3150002F9D076696174696F6E2066726F6D20637472E8
S3150002F9E046726571004C6F63616C206F7363696C5C
S3150002F9F06C61746F72206469766964652063 6F64F2
S3150002FA006500656E746572206368616E6E656C2052
S3150002FA1072656769737465727320666F72 20586DBA
S3150002FA206974206D6F64650052534D20736F66745E
S3150002FA3077617265207479706500 72736D206861F2
S3150002FA40726477617265207479706500 786D697485
S3150002FA502072656C6179 20332062697420 6D61734E
S3150002FA606B00526563656976652 06D75782D207326
S3150002FA70656C656374206 36F6D6D756E6963617421
S3150002FA80696F6E2070686173 6500786D69742064B1
S3150002FA90656C617900616371756972652063686 17D
S3150002FAA06E0065786563 20706C63006A616D20285C
S3150002FAB0786D6974202D6A7B302C312C322C337D83
S3150002FAC0202D3E20302C312C726567382C726567EA
S3150002FAD0382F7365726E6F297C28726376202D69C2
S3150002FAE06A7B322C337D202D3E20726567382C725C
S3150002FAF065673 82F7365726E6F2900747572 6E2092
S3150002FB006F6E20726563656976 65722C2075736502
S3150002FB1020772F202D727B636F64657D20746F20A2
S3150002FB2061636375 6D2073746174697374 69637359
S3150002FB300064756D702073746174697374 6963739C
S3150002FB402066726F6D2078202D69727B636F646503
S3150002FB507D0064756D70207061726D7300636861FB
S3150002FB606E20410063686 16E20420044756D70200C
S3150002FB7042617564 20504C4C2044617461004475A6
S3150002FB806D70204946 20616E64204C4F2063686187
S3150002FB906E6E656C2064617461004F7665722061D9
S3150002FBA06761696E202D20646F6E27742063 6C6511
S3150002FBB0617220452F462062756666657200536C613A
S3150002FBC07665204D6F64650072656365697665 20AA
S3150002FBD064656C61590068556E7420666F722063A5
S3150002FBE06F7272656374207265636569766520 64F7
S3150002FBF0656C6179004368616E6E656C206E756D29
S3150002FC0062657200626175642072617465207365 53
S3150002FC106C656374204C696E65467265712A28327A
S3150002FC205E284E2D32292920287573652 02D5820ED
S3150002FC30666F7220786D69742C206E6F6E65206611
S3150002FC406F7220726376290 06C6F6732286269745C
S3150002FC5020746 96D652F64656D6F642066696C74C6
S3150002FC606572207 4696D6529202875736520 2D5883
S3150002FC7020666F7220786D69742C206E6F6E652017
S3150002FC80666F722072637629004C696D6974 20284A
S3150002FC90526376204E3D302E2E3220666F72207CC5
S3150002FCA06E6F2064656D6F642066696C7465727C24
S3150002FCB066696C7465727C636C6970706564 2066D3
S3150002FCC0696C7465722 9282D584C3120746F206333
S3150002FCD06C697020786D6974206F75747075742CF8
S3150002FCE0202D584C3020666F7220616E616C6F67F2
S3150002FCF020786D697429004D6F64756C6174696F43
S3150002FD006E20284E3D30206F72203120666F7220A1
S3150002FD1046534B2F50534B292875736520 2D582077
S3150002FD20666F7220786D69742C206E6F6E65206620
S3150002FD306F72207263762900 64756D7020666 96C35
S3150002FD4074657220736574 20706F696E7473202DEA
S3150002FD50206F7220772F202D6920636170747475 726F
S3150002FD6065206469666 6492028 6F72207265 6D6F28
S3150002FD706420772F202D38206F7074292064 6174D7
S3150002FD8061006269746D617020666F7220 6520631E
S3150002FD906F6D6D616E6400746573742066 696C7450
S3150002FDA06572207068617365206465 6C6179 0061B3
S3150002FDB06C69676E2066696C746572 00 64756D7035
S3150002FDC0207265636569766520737461746 5007374
S3150002FDD070656369667920737461676520 6E756DF7
S3150002FDE06265722028312D342066696C746572 2C26
S3150002FDF020353D425044534D2C20363D4941524 D0B
S3150002FE002C20373D5141524D2C20383D4E434F292F
S3150002FE10007573652077 2F2D4E7B7374616765 7D40
S3150002FE2020666F722061676320283 02C312C322CB9
S3150002FE30333D6E6F6E652C736F66742C68617264 E7
S3150002FE402C626F7468290075736520772F2D4E7B9F
S3150002FE5073746167657D20666F722066696C74656E
S3150002FE607220617474656E2C425044534D20676152
S3150002FE70696E2C6941524D616763206F7220714130
S3150002FE80524D616763005465737420504C430054AD
S3150002FE90776565 6B2046696C746572202D2D206628
S3150002FEA0696E652061646A7573742061 6E64 20638D
S3150002FEB06865636B20696620726561 6C69676E6D41
S3150002FEC0656E74206E65636573736172790044753D
S3150002FED06D702072637664206461746120 6F6E2097
S3150002FEE0616C6C2065696768742073 7562626974F7
S3150002FEF073206F7220757365 20772F202D696 38FF
S3150002FF0020746F2063617074 7572652 06D6F64206463
S3150002FF106174610054757 26E206F66662074726138
S3150002FF206E736D697420616E6420726563656976AD
S3150002FF3065007800706C6320636D6473000D0A526D
S3150002FF406573746172 74696E6720706C63000D0A62
S3150002FF5042726561 6B000D0A6631206632206641 87
S3150002FF60474320445 34D2069414743 20644E434F43
S3150002FF70207369674066 34204620472 07472 69659B
S3150002FF807320676F6F643020676F6F643120676F0D
S3150002FF906F643220676F6F643320676F6F6434203B
S3150002FFA0676F6F643520676F6F643620676F6F64A3
S3150002FFB0370D0A000D253264202532642025347 35C
S3150002FFC0202533642563253464256 32534642 0257E
S3150002FFD03675253264202531642536 6C6400253653
S3150002FFE06C64000D0A6D617374657220 6D6F6465D1
S3150002FFF0000D0A736C617665206D6F6465202532 8B
S31500030000064000D0A5472616E736D697474696E6768
S315000300102063 6F6D6D616E64000D0A5472616E73B9
S315000300206D69747469 6E67207265673 82F736572BC
S315000300306E6F2064617461000D0A5472616E736D94
S315000300406974746 96E67207265673820646174 61C8
S31500030050000D0A5472616E736D697474696E67205C
S31500030060746F6E6520646174612031000D0A5472E9
S3150003007061 6E736D697474696E6720746F6E652043
S3150003008064617461203 20000D0A416C69676E696EA4
S315000300906720 66696C7465727 3000D0A547765652B
S315000300A06B696E672066696C7465727300 0D0A521C

S315000300B06563656976696E67207374617469737 4C1
S315000300C0696373000D0A57616974696E6720666F09
S315000300D07220656467652066726F6D206D61737447
S315000300E06572000D0A57616974696E6720666F72DF
S315000300F020656467652066726F6D20736C61766533
S3150003010000D0A526563656976696E67207061 63DF
S31500030110 6B6574732066726F6D206D617374657 29F
S31500030120000D0A526563656976696E6720706163BF
S315000301306B6574732066726F6D20736C61766500F0
S3150003014 00D0A504C432069646C6500202D206F6EA8
S315000301502063686 16E6E656C20256400204641 4904
S315000301604C206F6E2066696C7465722061 6C6967DA
S315000301706E6D656E7400204641494C206F6E206299
S3150003018061756420636C6F636B20616C69676E6D68
S31500030190656E74000D0A4C696E6520467265717 54D
S315000301A0656E6379203D2025372E3366487A000D28
S315000301B00A5243562042617564205261746520 3D9C
S315000301C02025372E3366487A000D0A584D495420A8
S315000301D04261756420526174652 03D2025372E33B4
S315000301E066487A000D0A426175642050 4C4C2050D3
S315000301F068617365202566000D0A426175642050A7
S3150003020 04C4C2046435720253130 6C64000D0A427E
S3150003021061756420504C4C20496E7465677261 7435
S315000302206F72202531352E334C66000D0A537461E7
S3150003023 06765202020202053696 76E616C2020208B
S315000302402073657474696E6720 4147437265672 03E
S315000302504E20536F66742048617264205361747 52F
S3150003026 07261746564000D0A504C43 5231202531 86
S3150003027 0302E3165000D0A46696C742531642025DC
S3150003028031302E316520 25382E31666442202536DD
S315000302906420253164202534730020 20204E000D70
S315000302A00A425044534D2025313064202531 3064B1
S315000302B02025366420352020202025632020202079
S315000302C0202025397300594553004E4F000D0A4926
S315000302D0526D6F6420253130642025392E31662511
S315000302E02520253664203620202020256320202043
S315000302F020256320253973 00594553004E4F000DC1
S3150003030 00A51526D6F642025313064202539 2E3110
S315000303106625252025366420372020202025632 0C6
S315000303202020202025632025397300594553004E4F5D
S3150003033 0000D0A4E434F2020202025323164202536F6
S3150003034064203800 0D0A4E61744672092531392E30
S3150003035032662025 34642F382039000D0A64696615
S3150003036066492025313064202533397300594553B6
S315000303700 04E4F000D0A646966666512025313064CC
S3150003038020253339730059455300 4E4F000D0A6833
S3150003039079705149202531302E306620253130645D
S315000303A020253664000D0A4E434F2F4920253130 50
S315000303B02E3266202531302E3266000D0A52616ECA
S315000303C06765202531642020436F6172736546207B
S315000303D025336420204669 6E65462025336420252F
S315000303E0336420253364202533 64000D0A53696E74
S315000303F06365206C617374 20616C69676E6D656EED
S3150003040074202D2074656D706572617475726520 34
S315000304106469666665726 56E6365203D2025352EC3
S315000304203266206465677265657300202D20656CEE
S315000304306170736564207469 6D6520000D0A4669F1
S3150003044 06C7465722043 6F6172736520512 03D2081
S315000304502535640020202D20636F6D6D6F6E206639
S315000304607265717565 6E6379203D20253564000DCF
S3150003047 00A5374616765204672657 152616E6765DA
S3150003048 02046696E65467265712041747 4526567CC
S315000304902055 6E69747920644 2417474656E2064D4
S315000304A0424761696E000D0A2535642025396420AB
S315000304B025386420253664202535642020 25362EEC
S315000304C031662025362E3166000D0A416C69676E4A
S315000304D06D656E742053746174757 33A2020002021
S315000304E0416C69676E696E672046696C74657273E1
S315000304F000205477656 56B696E672046696C746581
S315000305007273005041535300 20537461676573201F
S3150003051 0556E6D6174636861626C650020 54696D24
S3150003052 0652045787069726564 00204F7574206F85
S315000305306620526 16E676573002046 6F7263656459
S315000305402045786974 0020416C69676E204578 6997
S31500030550742043 6F64653A20202564000D0A202029
S315000305602020202020302020202020202031202020 2061
S31500030570202032202020202020203320202020202 04D
S3150003058 0342020202020202035202020202020362023
S315000305902020202020 37000D0A0020253664000D78
S315000305A00A4F6E206368616E6E656C206E756D62B0
S315000305B065722 03D202564000D0A0D0A432058521A
S315000305C0204D4F4420494147432051414743206C26
S315000305D06F2D646976204C494D2046494C542020A2
S315000305E0312D4E434F4849202030 2D4E434F4C4F1B
S315000305F0202020202020202020204C4F202020202097
S3150003060020444556202020434 54E5445522063 74CA
S315000306107246726571 2062617564 2F487A000D0A0D
S3150003062025317820256320202533 7320253473 2034
S3150003063025347300 50534B0046534B004E6F6E6583
S31500030640005 36F6674004E6F6E65004861726400F6
S31500030650482B5300486172 64004E6F6E6500536FFA
S31500030660667400 4E6F6E6500486172640048 2B53D2
S315000306700048617264002025366400202533640037
S31500030680202031 2F253164002025382E31660020A5
S3150003069025382E316600202531302E3166002025 7F
S315000306A0382E316600202538 2E3166002025372E58
S315000306B0316600202537 2E32660020616374 75612A
S315000306C06C2076616C756573000D0A2043 20736593
S315000306D0726E6F2E2E2E20706F6C6C20726567 38CB
S315000306E02E2E2E2E202052 206269746D61 702E2EBE
S315000306F000202054 204920532048206E000D0A0074
S3150003070000D0A0D0A20442065 646765636F646520DE
S315000307106 36D642D706F6C6C2070617250207265 0E
S31500030720 67312E2E2E20706172312072656732 4C
S31500030730 2E2E2E2E207061723220726567332E2E76
S31500030740 2E2E20706172332045727220207263 76DA
S3150003075 0646D61702000202054204920532048 20D6
S3150003076 06E002053746174 7573000D0A002532 7888
S3150003077 0202530386C78202530386C7820253034A5
S315000307807820 2530386C782025303478202530 3889
S31500030790 6C782025303478202530386C78202530 45
S315000307A03478202530337820 2530386C78200025 9E
S315000307B02D38302E3830 7320002000202573 00207A
S315000307C0257300205265706C79696E670020536546
S315000307D06E64696E67002025327820253178 2025DE
S315000307E0317820253178000D0A25327895
S315000307F0202530386C78202534752025303 86C78E0
S31500030800202532782025 30386C78004E776174 6362
S31500030810680077617463682073 63616E004E30 31DC
S3150003082032333435363738394142434445460030 4E
S31500030830313233343536373839616263646566007D
S31500030840000025BB600025BE400025C9200025DDE1E
S315000308500000025DF000025E56000260D00002629C58
S31500030860000026 30A0002645400026CA400026FAA29
S31500030870000027416000276780 00278CE00027980B0
S315000308800000 27C06000280960 00280A80002826EA7
S3150003089000002828400 0282D6000283760002838 8E5
S315000308A000002839A000283AC000283D60002958A73
S315000308B00000295C800027D1C00027D1C00027D1CFF
S315000308C000027D1C00027D1C00027D1C00027D1CB3
S315000308D000027D1C00027D1C00027D1C00027D1CA3
S315000308E000027D1C00027D1C00027D1C00027D1C93
S315000308F000027D1C00027D2C00027D2C00027D2C53
S3150003090000027D2C00027D2C00027D2C00027D2C32
S3150003091000027D2C00027D2C00027D2C00027D2C22
S3150003092000027D2C00027D2C00027D2C00027D2C12
S3150003093000027D2C00025BFA000280D2000283E8EB
S30D000309400002B8CC0003096CD8
S3090003094C000309840E
S31500030964000311520 13C708EFFFFFFFF00000000DD
S3150003097400000000000000000000000000000000 6A
S31500030984000000000000004465 6661756C7420000075
S315000309940 0010F01000113679400414C4C2D48726A
S315000309A4730000000000002000000000000000000A7
S315000309B40000000000000000000000000000000002A
S315000309C40000000000000000000000000000000001A
S315000309D400000000000000000000000000000000 0A
S315000309E4000000000000000000000000000000000FA
S315000309F4000000000000000000000000000000000EA
S31500030A04000000000000000000000000000000000D9

S31500030A1400000000000000000000000000000000C9
S31500030A2400000000000000000000000000000000B9
S31500030A3400000000000000000000000000000000A9
S31500030A440000000000000000000000000000000099
S31500030A540000000000000000000000000000000089
S31500030A640000000000000000000000000000000079
S31500030A740000414C4C444159530000000000005F
S31500030A840000000000000000000000000000000059
S31500030A940000000000000000000000000000000049
S31500030AA40000000000000000000000000000000039
S31500030AB40000000000000000000000000000000029
S31500030AC40000000000000000000000000000000019
S31500030AD40000000000000000000000000000000009
S31500030AE400000000000000000000000000000000F9
S31500030AF400000000000000000000000000000000E9
S31500030B0400000000000000000000000000000000D8
S31500030B1400000000000000000000000000000000C8
S31500030B2400000000000000000000000000000000B8
S31500030B3400000000000000000000000000000000A8
S31500030B440000000000000000000000000000000098
S31500030B540000000000000000000000000000000088
S31500030B640000000000000000000000000000000078
S31500030B740000000000000000000000000000000068
S31500030B840000000000000000000000000000000058
S31500030B940000000000000000000000000000000048
S31500030BA40000000000000000000000000000000038
S31500030BB40000000000000000000000000000000028
S31500030BC40000000000000000000000000000000018
S31500030BD40000000000000000000000000000000008
S31500030BE400000000000000000000000000000000F8
S31500030BF400000000000000000000000000000000E8
S31500030C0400000000000000000000000000000000D7
S31500030C1400000000000000000000000000000000C7
S31500030C2400000000000000000000000000000000B7
S31500030C3400000000000000000000000000000000A7
S31500030C440000000000000000000000000000000097
S31500030C540000000000000000000000000000010086
S31500030C6403010F010C1F00160003001600030016F0
S31500030C74000300160003001900030016000300160 0
S31500030C8400030016000300160003001900030C14F2
S31500030C9400030014000100000001000000010C002D
S31500030CA4469AA3A149EA600049EA600049EA60005A
S31500030CB4496A600049EA600049EA600049EA60005B
S31500030CC449EA6000496A60004A6A60004B03D60039
S31500030CD44A8E62004A8E620049EA600049EA60006D
S31500030CE449EA600049EA6000496A600049EA60002B
S31500030CF449EA600049EA600049EA6000496A60001B
S31500030D044A6A60004B03D6004A8E62004A8E62002A
S31500030D144AD2F00088288828885088508850A050E2
S31500030D24A00AA014A028900AA00A903C0800080070
S31500030D34080008000800080008000800A0289828EE
S31500030D4498289828A028A828B028B828E029A828ED
S31500030D54A03CA064E029E029E003E051E051E0511E
S31500030D64E051E051E851F051E050E015E029E02963
S31500030D74A029A015A00AA00AA00AA00AA00AA004F2
S31500030D84A028A004A3E8A00A0000000000000000B5
S31500030D940000000002020808080808080802020204
S31500030DA420202010101010104040404042424208B8
S31500030DB44208080842424242404040404242420442F8
S31500030DC440404042010101010104040405040000FA
S31500030DD40000000049EA600049EA600049EA60004D
S31500030DE449EA6000496A600049EA600049EA60002A
S31500030DF449EA600049EA6000496A60004A6A600099
S31500030E044B03D6004A8E62004A8E62004AD2F00031
S31500030E1400000000000000000000000000000000C5
S31500030E243F800000410000000000000000000000B5
S31500030E340000000000003F800000570000000000 8F
S31500030E440000000000000000000000003F800000D6
S31500030E545641524C670000000000000000000000E9
S31500030E6400003F80000056564C00000000000000BE
S31500030E7400000000000000003F8000005600000050
S31500030E840000000000000000000000000000003F8096
S31500030E94000064656C5600000000000000000000BA
S31500030EA4000000003F8000005641000000000000DF
S31500030EB4000000000000000000003A83126F6B5725
S31500030EC4000000000000000025382E3366000000F1
S31500030ED43A83126F6B574800000000000025313037
S31500030EE42E334C6600003A83126F446B5641524CC0
S31500030EF467000025382E3366000000003A83126F1C
S31500030F04446B564152484C67002531302E334C66A8
S31500030F1400003A83126F446B5641524C6400002519
S31500030F24382E3366000000003A83126F446B564131
S31500030F3452484C64002531302E334C6600003A8304
S31500030F44126F442D6B56410000000025382E33667C
S31500030F54000000003A83126F442D6B56414800008B
S31500030F64002531302E334C6600003A83126F442D2C
S31500030F746B41320000000025382E33660000000062
S31500030F843A83126F442D6B413248000000253130F9
S31500030F942E334C6600003A83126F522D6B570000B2
S31500030FA400000025382E3366000000003A83126FD2
S31500030FB4522D6B5748000000002531302E334C6602
S31500030FC400003A83126F526B5641524C6700002558
S31500030FD4382E3366000000003A83126F526B564173
S31500030FE452484C67002531302E334C6600003A8351
S31500030FF4126F526B5641524C640000025382E3366E9
S31500031004000000003A83126F526B564152484C64F7
S31500031014002531302E334C6600003A83126F522D6D
S315000310246B56410000000025382E3366000000008D
S315000310343A83126F522D6B564148000000253130 16
S315000310442E334C6600003A83126F522D6B413200E5
S3150003105400000025382E3366000000003A83126F21
S31500031064522D6B4132480000002531302E334C6635
S3150003107400003A83126F6B5632000000000000250D
S31500031084382E3366000000003A83126F6B563248DB
S3150003109400000000002531302E334C6600003A83ED
S315000310A4126F64656C6B563200000025382E336666
S315000310B4000000003A83126F64656C6B5632480075
S315000310C4002531302E334C6600003F800000435028
S315000310D44831000000000025382E306600000000 69
S315000310E43F800000436F756E747331000025313001
S315000310F42E304C6600003F80000043504832000007
S3150003110400000025382E3066000000003F800000F2
S31500031114436F756E74733200002531302E304C667E
S3150003112400003991A2B4487A000C0000000000025AB
S31500031134382E336600000000358637BD4D43796388
S315000311446C657300002531302E334C660000FFFFB7
S30700031154FFFF92
S3150003115800000001000000030002675C0002675CF0
S315000311680004000500060007000C010000007FF8E0
S3150003117804010002E79C0002E7A30002E7A50002B8
S31500031188E7BA0002E7C10002E7D10000085252009D
S3150003119800000002E8A00002E8A30002E8A8000293
S315000311A87E4C00027E500002EBA60002EBAE000264
S315000311B8EBB40002EBBB0002EBC40002EBCD00006C
S315000311C8000100000001000000010000000100000A
S315000311D800010000000100000001000000010000FA
S315000311E800010000000100000002000000010000E9
S315000311F800010000000100000001000000010000DA
S3150003120800010000000100000011000000010000B9
S3150003121800010000000100000001000000010000B9
S3150003122800010000000100000002000000010000A8
S3130003123800010000000100000001000000019B
S3150003124848E71B0833C000A004D0226F00184201E8
S31500031258287C00804008181418BC00804246263CA7
S315000312680020AAAA6058206900083E10204330BC13
S3150003127800AA33FC00550020555430BC00A0206951
S3150003128800043C87601E2051082800050001 6710F6
S3150003129810280C01BF0008000007671672016012D4
S315000312A85269000E205110280001BF0008000007EC
S315000312B866D4524654A90008549154A900044A0115
S315000312C86606BC69000C659E1884100133C000A02D
S315000312D804D24CDF10D8205F588F4ED04E714E7112
S307000312E84E713C
S315000312EC48E7011433C000A004CC226F0010207C05
S315000312FC0020AAAA267C00205554721442474BE9B7
S3150003130C001030BC00AA36BC005530BC008030BC83
S3150003131C00AA36BC005532BC0030082D0003000170
S3150003132C67F8207C00804014267C00C021066040B0
S3150003133C08100007672408100006671808D0000673
S3150003134C5341660608D30001602E13FC00EA0080A5

S31500003135C40156002524708D00007082D000500010E
S31500003136C670E082D00070001660E16BC0001600807
S31500003137C082D0007000167B8300733C000A004CE60
S31500003138C4CDF2880205F588F4ED04E714E714E71B4
S70500000000FA

ROM-Boot S-Record File

S0030000FC
S315008002002E7C00E00FE8287C0080400042B8000089
S31500800210297A016200187E00302C001A0800000F2F
S315008002206700011E0C2C000D001C67167007C08726
S31500800230528 02E0041FA01421970780000196000 40
S315008002400100197C0042001D42422C7C00E000081F
S315008002502A4E42466028302C001A0800000F67F6A6
S315008002601E2C001C1A8718074A46660A0C0400537F
S31500800270660C7C0160080C04000D670A528DBBFC7D
S315008002800 0E0005865D00C04000D660000BE45ED08
S31500800290FFFF2A4E1C16528D267C00E0005B7E00F6
S315008002A04A42660A0C06003066A6740160A20C06F5
S315008002B00033667C4205424660421013E908168088
S315008002C00C15003963047637600276301015 90037A
S315008002D0D1134A46671AB7FC00E000606510BBCAB6
S315008002E0640C207900E0005C119378005287DA1B59
S315008002F04A4657C0440048803C00528DBBCA63BA08
S3150080030000C0500FF664420075A807200123900E00F
S31500800310005BB0816634082C000600146700FF324B
S31500800320 08EC00060014197C00EA00156000FF2224
S315008003300C0600376600FF1A4EB900E00000600A1E
S315008003405087080700156700FED0267C0000040051
S3150080035 00C93000600006400FEB49BCD2E0D600257
S31500800360DE9DBBD363FA4A876600FEA22079000031
S3150080037004044E90014F00104F4F46463F3F35359F
S70500000000FA

RAM-Boot S-Record File

S0030000FC
S30B00E00000600001364E75BA
S31500E0009048E703001E390080400813FC008000801A
S31500E000A0400813FC000100804000302F000C48C0DF
S31500E000B0E588068000E0088020402F104EB900E079
S31500E000C007463C0013FC00010080400013C7008097
S31500E000D040084CDF00C0205F548F4ED048E7011C3B
S31500E000E04FEFFFF0286F00244BD7267C00E009F69F
S31500E000F030144640C06F00286628426D000E2A8CF8
S31500E0010041EF00282B4800082B4C00043B7C000103
S31500E00110000C2F0D4EB900E007E442471E008F1396
S31500E00120600608D300027E0430074FEF00104CDF74
S31500E001303880205F5C8F4ED048E7001C13FC00023D
S31500E00140008040013FC000A00804004287C00E0A8
S31500E0015009FE4214614A610000D8267C00E009FCF1
S31500E0016042532A7C00804014602C0815000767265D
S31500E0017052140C14003F6F02421408150006670C77
S31500E0018008D5000613FC00EA008040154EB900E0F1
S31500E0019006F408D500074A5367D04CDF38004E75A1
S31500E001A0007900080080401A223C00E0000044414B
S31500E001B0203C00E00962D04133C000804050203C42
S31500E001C000E009F1D04133C000804052203C00E01D
S31500E001D009F2D04133C000804054203C00E009F5EC
S31500E001E0D04133C0008040564E7560064EB900E0FF
S31500E001F0071C30390080405C0800000C66EE13EF07
S31500E00200000500804058302F0004205F5C8F4ED000
S31500E0021030390080405C0800000D670470FF600A1A
S31500E002201239008040 5A42401001205F588F4ED06C
S31500E00230227C00E009F822BC00E00C0C2051213CB5
S31500E0024000E0024E228890FC002C22884E7548E79A
S31500E00250073E2E3C3800A10142B9000000002A7C8E
S31500E0026000E009F642153F3C000A3F3C001448799D
S31500E0027000E008B4287C00E0069C4E944245267CCB
S31500E0028000E009382C7C00E00934203CF000000056
S31500E00290C087721CE2A82C002F130C0600096F0C15
S31500E002A010064880064000573F00600A1006488066
S31500E002B0064000303F006100FF32E98F52450C45B1
S31500E002C000086DC62F166100FF480C40FFFF66F47C
S31500E002D03F3C000A3F3C001A487900E008C84E94CB
S31500E002E0247C00E0071C60024E922F166100FF227C
S31500E002F03E000C0700FF67F00C07005967060C0785
S31500E003000007966047C0A60027C0342154247604E2F
S31500E003103F3C000A3F3C0012487900E008E24E9478
S31500E003202F1330070280000FFFF80FC000A064022
S31500E0033000303F006100FEB42F133007028000005A
S31500E00340FFFF80FC000A4840064000303F006100A5
S31500E00350FE9A3F074EB900E000904E925247BE46E5
S31500E0036062044A1567AA4A1566283F3C000A3F3CE4
S31500E0037000011487900E008F44E94487900E003DA89
S31500E00380610000B60C40000456C0440048801A8064
S31500E0039060103F3C000A3F3C0016487900E0091E29
S31500E003A04E943F3C000A4A1567063F3C0010600445
S31500E003B03F3C00094A156708487900E0090E6006E7
S31500E003C0487900E009054E9433FC000100E009FCA1
S31500E003D04E9260FC4CDF7CE04E7548E7230C2A6FBA
S31500E003E00018203900E00880323CFFFFD26F001C85
S31500E003F074003401EF8AE28AD482D08228404246F1
S31500E004001E1D4887E14F4240101D8E403F072F0CCE
S31500E00410548C4EB900E000DC4A40660852460C4671
S31500E0042000406DDC0C4600405DC0440048804CDF77
S31500E0043030C4205F5C8F4ED048E70F3E4FEFFF7829
S31500E004402C7C00E009342F166100FDC60C40FFFF4E
S31500E0045066F449EF00860254FF80005400150254 0A
S31500E00460C1FF7A0145EF000247EF0004600001207A
S31500E0047030140240007F3F00610001DC3F3C028017
S31500E00480610019A3E000C470001660000CA2A4A54
S31500E004903C3C00837E40601C2F166100FD743800F2
S31500E004A00C44FFFF660A4EB900E0071C53476004A0
S31500E004B01AC453464A476F044A4662DC4A476F7499
S31500E004C0103C00FFD005122F0002B2006602534531
S31500E004D042463E3C00802A4B101D4880DC40534794
S31500E004E04A4762F4102F0084B006660000A21005A9
S31500E004F04600122F0003B20066000094102F00029F
S31500E00500B0056600008A3F05486F0006206F00B61A
S31500E005104E904A4066180254FF8000540006303C74
S31500E005203E00C05467040254C1FF52456060005467
S31500E00530007F605A30147209E2680240001F5240A0
S31500E00540024000 1FE3680254C1FF81540254FF8059
S31500E0055000540015603 80C47000467060C47001885
S31500E00560660C707FC0470254FF80815460200254BD
S31500E00570FF8000540015301472 09E2680240001F43
S31500E0058052400240001FE3680254C1FF8154301418
S31500E005900240007F0C400004672A30140240007FCE
S31500E005A00C400018671E30140240007F0C40007FAC
S31500E005B0671230147209E2680240001F0C40000A1C
S31500E005C06500FEAE30140240007F0C400004670C6C
S31500E005D030140240007F0C40001866083F3C0006DD
S31500E005E06174602430140240007F0C40007F66187E
S31500E005F03F3C000A3F3C0011487900E009406100B9
S31500E0060009C3F3C00C0611430140240007F4FEF75
S31500E00610008 84CDF7CF0205F588F4ED048E703001F
S31500E006203C2F000C60124A466704534666047EFD82
S31500E0063060184EB900E0071C2F3900E0093461006C
S31500E00640FBD03E000C47FFFF67DC30074CDF00C005
S31500E00650205F548F4ED048E703001C2F000D7E0329
S31500E006606008 53474EB900E0071C4A4763182F3924
S31500E0067000E009341006488 03F006100FB6E3C0054
S31500E006800C0600FF67DC4A476306100648806002F6
S31500E0069070FD4CDF00C0205F548F4ED048E7070462
S31500E006A02A6F00143A2F00183E2F001A602A2F39BD
S31500E006B000E0093410154880024000FF3F00610069
S31500E006C0FB2A3C000C46FFFF660A4EB900E0071C19
S31500E006D053476004528D53454A4763044A4562CE08
S31500E006E04A47630430066002 70FD4CDF20E0205F7D
S31500E006F0508F4ED048E73F3E204F2E7900E009F874
S31500E0070023C800E009F8BFFC00E00C0C6C26BFFC37
S31500E0071000E00A0C6F1E4CDF7CFC4E7548E73F3E5E
S31500E00720204F2E7900E009F823C800E009F84CDFF5
S31500E007307CFC4E752E7900E009F84EB900E00230F7
S31500E007404CDF7CFC4E7548E70114226F0010207CDC
S31500E00750020AAAA267C0020555472144 2474BE991
S31500E00760001030BC00AA36BC005530BC008030BC5E
S31500E0077000AA36BC005532BC0030082D000300014B
S31500E00780 67F8207C00804014267C00E009F6604093
S31500E0079008100007672408100006671808D000064E
S31500E007A05341660608D30001602E13FC00EA008080
S31500E007B04015600 2524708D00007082D00050001E9
S31500E007C0670E082D00070001660E16BC00016008E2
S31500E007D0082D0007000167B830074CDF2880205F4E
S31500E007E0588F4ED048E71B08226F00184201287C3C
S31500E007F000080400818141 8BC00804246263C0020C1
S31500E00800AAAA6058206900083E10204330BC00AA1E
S31500E0081033FC005500205 55430BC00A0206900048C
S31500E00820308760 1E205108280005000167101 02857
S31500E008300001BF0008000007671672016012 5269E6
S31500E00840000E205110280001BF000800000766D402
S31500E00850524654A90008549154A900044A01660678
S31500E00860BC69000C659E188410014CDF10D8205F2F
S31500E00870588F4ED014980B2300040005000600079D
S31500E0088000000000000001000000020000000300007C
S31500E0089000004000000005000000060000000700005C
S31500E008A0000078000007A0000007C0000008000065
S31500E008B0FFFFFFFF0D0A52616D20426F6F742076D5
S31500E008C0657273696F6E20000D0A0D0A436C6561EF
S31500E008D07220616C6C206C6F67733F2028592F4E35
S31500E008E029000D0A45726173696E6720736563744A
S31500E008F06F7220000D0A0D0A586D6F64656D2062F7
S31500E00900696E0D0A000D0A646F6E650D0A000D58DA
S31500E009106D6F64656D206572726F720D0A000D531E
S31500E0092065637 46F7220457261736520 6572726FDC
S31500E00930720D0A0000000000000000000000000048
S31500E009401818181818181818080808080808080 8C1
S31500E009500018181818181818180808080808080 8B9
S30700E009600800A7
S30D00E00A02000400050006000 7F0
S70500000000FA

```
Modem Hex File
Microchip PIC16C63
Configuration: 0x3FFA

282D 3FFF 3FFF 3FFF 2D6E 0825 0782 280A   -...n%..
280F 2814 3099 0084 3081 0080 0008 3099   ........
0084 3040 0080 0008 3099 0084 301F 0080   .@......
0008 0825 0782 281E 2823 2828 3092 0084   .%..#(..
3051 0080 0008 3092 0084 3028 0080 0008   Q....(..
3092 0084 3014 0080 0008 1120 2200 2220   ..... .
2274 2213 3002 00AE 3002 00B2 2260 223E   t.....`>
224F 22C6 300F 00A4 0822 0423 3A0F 0524   O..."#.$
00A1 30A0 00A7 0905 04B1 0521 0782 2843   .....!.C
2857 287A 287A 289D 289D 289D 289D 28C0   Wzz.....
28C0 28C0 28C0 28C0 28C0 28C0 28C0 1820   .......
286A 1406 0806 39F0 3801 0086 3001 00A2   j.......
0822 0423 3A0F 0524 00A1 1420 301C 00A6   "#.$. ..
2843 2843 18A0 2869 1407 0807 39F0 3801   CC.i....
0087 3001 00A3 0822 0423 3A0F 0524 00A1   ..."#.$.
226A 2843 1820 288D 1486 0806 39F0 3802   jC .....
0086 3002 00A2 0822 0423 3A0F 0524 00A1   ..."#.$.
1420 301C 00A6 2843 2843 18A0 288C 1487   ..CC...
0807 39F0 3802 0087 3002 00A3 0822 0423   ......"#
3A0F 0524 00A1 226A 2843 1820 28B0 1506   .$.jC ..
0806 39F0 3804 0086 3004 00A2 0822 0423   ......"#
3A0F 0524 00A1 1420 301C 00A6 2843 2843   .$. ..CC
18A0 28AF 1507 0807 39F0 3804 0087 3004   ........
00A3 0822 0423 3A0F 0524 00A1 226A 2843   ."#.$.jC
1C20 2843 2843 18A0 28C2 3008 00A3 0822   CC....."
0423 3A0F 0524 00A1 226A 2843 3FFF 3FFF   #.$.jC..
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3FFF 3FFF 3FFF 3FFF 3FFF 3FFF 3FFF 3FFF   ........
3081 0084 3008 0080 3085 0084 303F 0080   ......?.
3086 0084 3010 0080 3087 0084 0800 39C0   ........
3880 0080 0008 3020 0084 0180 0A84 1F84   ... ....
2A15 30A0 0084 0180 0A84 1B84 2A1B 0008   ........
0185 0186 0187 0008 3087 0084 1700 1798   ........
308C 0084 1600 3098 0084 1680 1986 0008   ........
1587 0807 39F0 3808 0087 226A 0008 308C   .....j..
0084 1200 3098 0084 1280 0008 2005 3098   ........
0084 1500 3098 0084 1200 1798 2237 3098   ......7.
0084 1300 3019 0084 0840 0080 0008 2005   ....@...
3098 0084 1500 3098 0084 1200 1798 308C   ........
```

```
0084 1680 1318 1618 081A 30A0 00A7 0008   ........
30C0 008B 3031 0090 307E 0092 308C 0084   ..1.~...
1400 0008 14A0 2019 0191 108C 308C 0084   ........
1480 301C 00A6 0008 1206 3086 0084 1200   ........
2306 3086 0084 1600 2306 2306 2306 2306   ........
0008 0008 0806 00A9 3008 0086 3040 0084   ......@.
3040 00A8 3091 00AD 3002 008A 2318 018A   @.......
2A9B 3461 3474 3465 3430 3471 3431 3473   .ate0q1s
3430 343D 340B 0832 3E30 0080 0A84 30A5   0=.20...
00AD 3002 008A 2318 018A 2AAB 340D 340A   ........
3420 340C 340B 2224 2306 3040 0084 3040    ..$.@.@
00A8 30B8 00AD 3002 008A 2318 018A 2AC1   ........
3461 3474 3426 3477 340D 340A 3420 340C   at&w.. .
340B 2224 2306 0829 0086 0008 3008 0086   .$.)....
3040 0084 3040 00A8 30D3 00AD 3002 008A   @.@.....
2318 018A 2B01 3420 340A 3451 3475 3461   ... .Qua
3464 346C 346F 3467 3469 3463 3420 3443   dlogic C
346F 346E 3474 3472 346F 346C 3473 3420   ontrols
3443 346F 3472 3470 346F 3472 3461 3474   Corporat
3469 346F 346E 3420 3428 3463 3429 3432   ion (c)2
3430 3430 3430 3420 340A 340D 3420 340C   000 .. .
340B 2224 2306 0186 0187 0008 300C 00AB   .$......
3067 00AA 3032 00A9 0BA9 2B0C 0BAA 2B0C   g.2.....
0BAB 2B0C 0008 3098 0084 1A80 2B13 0008   ........
2323 3A0B 1903 0008 3A0B 0080 0A84 0FAD   #.......
2B18 0A8A 2B18 082D 0082 3040 0084 3040   ...-.@.@
00A8 3030 00AD 3003 008A 2318 018A 2B48   .0.....H
340A 3450 3461 3472 3461 346D 3465 3474   .Paramet
3465 3472 3420 3474 346F 346F 3420 3448   er too H
3469 3467 3468 340A 340D 3420 340C 340B   igh.. ..
2224 2D6D 3040 0084 3040 00A8 3055 00AD   $m@.@.U.
3003 008A 2318 018A 2B6C 340A 3450 3461   ....l.Pa
3472 3461 346D 3465 3474 3465 3472 3420   rameter
3474 346F 346F 3420 344C 346F 3477 340A   too Low.
340D 3420 340C 340B 2224 2D6D 0A84 303A   . ..$m.:
0200 1803 2B8C 3030 0200 1C03 2B8C 00B0   ...0....
0A84 303A 0200 1803 2B8E 3030 0200 1C03   .:...0..
2B8E 00AC 0830 1003 0DB0 0DB0 0DB0 07B0   ..0.....
07B0 082C 07B0 2B8E 30FF 00B0 0008 30A0   .,......
0084 0627 1903 2D6D 01A9 306D 0600 0A84   .'.m.m..
04A9 306F 0600 0A84 04A9 3064 0600 0A84   .o...d..
04A9 3065 0600 0A84 04A9 306D 0600 0A84   .e...m..
04A9 3020 0600 0A84 04A9 302D 0600 0A84   . ...-..
04A9 1903 2BB4 2D6D 3066 0200 1D03 2BC6   ...mf...
236E 3003 0230 1803 2B25 3000 0230 1C03   n.0.%.0.
2B4A 00A5 223E 224F 2D6D 2D6D 3065 0200   J.>Omme.
1D03 2BE9 308C 0084 1A00 2D6D 3040 0084   .....m@.
3040 00A8 30D9 00AD 3003 008A 2318 018A   @.......
2BE6 340A 3450 3449 3443 3420 346F 346B   ..PIC ok
342E 340A 34CD 3420 340C 340B 2224 2D6D   ... ..$m
2D6D 3072 0200 1D03 2BEF 2800 2D6D 3073   mr....ms
0200 1D03 2C3D 236E 3007 0230 1803 2B25   ..=n.0.%
3000 0230 1C03 2B4A 1E85 2C38 3040 0084   .0.J.8@.
3040 00A8 3009 00AD 3004 008A 2318 018A   @.......
2C36 340A 344D 346F 3464 3465 346D 3420   6.Modem
3443 3461 3472 3472 3469 3465 3472 3420   Carrier
3464 3465 3474 3465 3463 3474 342E 3420   detect.
3420 3443 3461 346E 3427 3474 3420 3473    Can't s
3465 3474 3420 3472 3469 346E 3467 3473   et rings
3420 340A 340D 3420 340C 340B 2224 2D6D    .. ..$m
0830 00B2 2282 2D6D 2D6D 3061 0200 1D03   0..mma..
2D6D 236E 0830 3AFF 1903 2C5B 3010 0230   mn0..[.0
1803 2B25 3000 0230 1C03 2B4A 1DB0 2C7F   .%.0.J.
0930 0522 1D03 2CA1 0830 00A4 0822 0423   0"..0."#
3A0F 0524 00A1 308C 0084 1A00 2D6D 3040   .$....m@
0084 3040 00A8 306A 00AD 3004 008A 2318   .@.j....
018A 2C7D 340A 3441 3463 3474 3469 3476   .}.Activ
3465 3420 3444 3465 3476 3469 3463 3465   e Device
3473 3420 343D 3420 340B 2CC4 2D5E 3040   s = ..^@
0084 3040 00A8 308A 00AD 3004 008A 2318   .@......
018A 2CA0 3443 3461 346E 3427 3474 3420   ..Can't
3464 3469 3473 3461 3452 346C 3465 3420   disable
3452 3453 3434 3438 3435 342E 3420 340B   RS485. .
2D5E 3040 0084 3040 00A8 30AC 00AD 3004   ^@.@....
008A 2318 018A 2CC3 3443 3461 346E 3427   ....Can'
3474 3420 3464 3469 3473 3461 3462 346C   t disabl
3465 3420 344D 3461 3473 3474 3465 3472   e Master
342E 3420 340B 2D5E 1DA4 2CD9 30CD 00AD   . .^....
3004 008A 2318 018A 2CD8 3452 3453 3434   .....RS4
```

```
3438 3435 343D 346F 346E 3420 3420 340B   85=on  .
2CEB 30E0 00AD 3004 008A 2318 018A 2CEB   ........
3452 3453 3434 3438 3435 343D 346F 3466   RS485=of
3466 3420 340B 1D24 2D00 30F4 00AD 3004   f .$....
008A 2318 018A 2CFF 344D 346F 3464 3465   ....Mode
346D 343D 346F 346E 3420 3420 340B 2D12   m=on  ..
3007 00AD 3005 008A 2318 018A 2D12 344D   .......M
346F 3464 3465 346D 343D 346F 3466 3466   odem=off
3420 340B 1CA4 2D27 301B 00AD 3005 008A    ..'....
2318 018A 2D26 3452 3453 3432 3433 3432   ..&RS232
343D 346F 346E 3420 3420 340B 2D39 302E   =on  .9.
00AD 3005 008A 2318 018A 2D39 3452 3453   .....9RS
3432 3433 3432 343D 346F 3466 3466 3420   232=off
340B 1C24 2D4D 3042 00AD 3005 008A 2318   .$MB....
018A 2D4C 3441 3453 3449 3443 343D 346F   .LASIC=o
346E 3420 3420 340B 2D5E 3054 00AD 3005   n  .^T..
008A 2318 018A 2D5E 3441 3453 3449 3443   ...^ASIC
343D 346F 3466 3466 3420 340B 3065 00AD   =off .e.
3005 008A 2318 018A 2D6A 340A 340D 3420   ....j..
340C 340B 2224 2D6D 2D6D 0008 1E8C 2DC8   ..$mm...
00B3 0E03 00B4 080A 00B6 018A 1383 0804   ........
00B5 1D18 2D8C 3040 0084 3040 00A8 0BAE   ...@.@..
2DBA 3002 00AE 3003 08A5 1903 00A5 03A5   ........
223E 224F 081A 2DBA 081A 00AC 1FAC 2D9C   >O......
0BAF 2DBA 3002 00AF 0AA5 0825 3C02 1C03   .....%..
01A5 223E 224F 2DBA 082C 3A0D 1D03 2DAA   .>O.,...
3002 00AE 3002 00AF 0827 0084 082C 0080   ....'.,.
238F 2DBD 082C 3A08 1D03 2DB3 0827 3AA0   ..,...'.
1D03 03A7 2DBF 0827 0084 082C 0080 0FA7   ...'.,..
2DBF 081A 081A 1218 1618 30A0 00A7 0836   .......6
008A 0835 0084 0E34 0083 0EB3 0E33 0009   .5.4..3.
1E0C 2DEB 120C 00B3 0E03 00B4 080A 00B6   ........
018A 1383 0804 00B5 0828 0084 0800 3A0C   ....(...
1903 2DE7 3A0C 0099 0AA8 226A 0836 008A   .....j6.
0835 0084 0E34 0083 0EB3 0E33 0009 2237   5.4..3.7
3040 00A8 2DDE 1E8B 2DF3 1D0B 2DF3 110B   @.......
1405 1005 0009 1C0C 2E25 00B3 0E03 00B4   ....%...
080A 00B6 018A 1383 0804 00B5 0BA6 2E1B   ........
301C 00A6 0831 0522 1D03 2E17 2237 1020   ..1"..7
01A2 30F0 0586 10A0 01A3 30F0 0587 0822   ......."
0423 3A0F 0524 00A1 2200 01B1 2E1B 0922   #.$...."
05B1 301C 00A6 100C 0836 008A 0835 0084   ....6.5.
0E34 0083 0EB3 0E33 0009 1C8C 2E50 00B3   4..3..P.
0E03 00B4 080A 00B6 018A 1383 0804 00B5   ........
0831 0523 1D03 2E44 108C 308C 0084 1080   1#.D....
10A0 01A3 30F0 0587 0822 0423 3A0F 0524   ...."#.$
00A1 0923 05B1 2E47 0923 05B1 226A 0836   .#.G#.j6
008A 0835 0084 0E34 0083 0EB3 0E33 0009   .5.4..3.
0009
```

Transponder Hex File
Microchip PIC16C505
Configuration: 0xFD4

```
4A3 CC4 002 C09 006 C00 007 C05    ........
024 050 2A4 204 E1F 743 A09 064    $`...C.d
070 071 068 069 A1E 1E2 880 840    pqhi...@
820 810 808 804 802 801 CC4 002     .......
C09 006 C00 007 666 A24 766 A26    ....f$f&
666 A28 666 A39 666 A39 666 A39    f(f9f9f9
666 A39 666 A39 666 A39 666 A39    f9f9f9f9
A40 306 371 370 2A8 526 426 A1E    @.qp.&&.
208 F0A 743 A4A 210 E02 F00 743    ..CJ...C
A4A A4F 070 071 068 069 A1E 311    JOpqhi..
E38 02A 211 E07 F07 10A 027 06A    8*....'j
610 5AA 6F1 58A 771 54A 20A 026    ....qJ.&
070 071 068 069 A1E
```

```
Pulse Hex File
Microchip PIC16LC505
Configuration: 0xFD8

5A3 B00 1E2 801 802 804 808 810   ........
820 840 880 2EF A0B 800 064 213    @....d.
030 004 CCF 002 006 567 206 467   0....g.g
033 1B0 C0E 006 610 2A8 C0C 006   3.......
630 2A9 C08 006 650 2AA C8F 002   0...P...
670 2AB 207 031 212 E06 631 D01   p..1..1.
1E2 A39 A6C AA0 AA3 A39 AAD AB0   .91..9..
AA3 6B2 A66 2B4 C14 094 603 A45   ..f....E
692 A62 216 5A3 022 452 074 C08   .b.."Rt.
035 07E 07F 492 447 472 C0F 026   5~ .Gr.&
C07 007 4B2 747 5B2 CCF 002 C00   ...G....
006 C03 007 6D2 B84 000 000 000   ........
000 A0E C07 02F 90B A0E C0E 02F   .../.../
90B 000 000 A3B 532 672 A9F 311   ...;2r..
37F 37E 0F5 7F5 A9F 31E 31F EF0    ~......
F00 743 A9D 21E 19F 02F 3AF 1AF   .C.../..
20F 32F 32F 1AF 30F 1AF 60F A9D   .//.....
592 552 21F E0F 1E2 B00 B1B B36   .R.....6
B51 B6C B6E B70 B72 B74 B76 B78   Qlnprtvx
B7A B7C B7E B80 B82 572 A0E A0E   z|~..r..
432 074 A0E C14 094 703 AAB 572   2t.....r
216 5A3 022 2B4 A0E 532 074 A0E   .."..2t.
432 217 024 20E 140 743 547 643   2.$.@CGC
447 064 403 32E 703 AC7 217 198   Gd......
643 AC5 2B7 5EE A0E 572 A0E A0E   C....r..
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
C30 037 C33 038 024 C80 02E C07   0738$...
150 D00 030 191 192 193 02F 3AF   P.0.../.
1AF 20F 32F 32F 1AF 30F 1AF 70F   ..//....
570 064 A0E C34 037 C37 038 024   pd.4778$
C80 02E C07 154 D00 034 195 196   ...T.4..
197 02F 3AF 1AF 20F 32F 32F 1AF   ./...//.
30F 1AF 70F 574 064 A0E C38 037   ...td.87
C3B 038 024 C80 02E C07 158 D00   ;8$...X.
038 199 19A 19B 02F 3AF 1AF 20F   8.../...
32F 32F 1AF 30F 1AF 70F 578 064   //....xd
A0E C3C 037 C3F 038 024 C80 02E   .<7?8$..
C07 15C D00 03C 19D 19E 19F 02F   .\.<.../
3AF 1AF 20F 32F 32F 1AF 30F 1AF   ...//...
70F 57C 064 A0E 5A3 B2A 5A3 B37   .|d..*.7
5A3 B44 5A3 B51 5A3 B5E 5A3 B8D   .D.Q.^..
5A3 B99 5A3 BA5 5A3 BB1 5A3 BCA   ........
5A3 BD6 5A3 BE2 CCF 002 C00 006   ........
C03 007 003 FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
A06 A1C A32 A48 A5E A74 208 09B   ..2H^t..
208 703 03B C30 024 208 1F3 443   ..;0$..C
603 2B2 643 2B1 643 2B0 068 064   ..C.C.hd
C01 036 4A3 A0E 209 09B 209 703   .6......
03B C34 024 209 1F7 443 603 2B6   ;4$..C..
643 2B5 643 2B4 069 064 C02 036   C.C.id.6
4A3 A0E 20A 09B 20A 703 03B C38   ......;8
024 20A 1FB 443 603 2BA 643 2B9   $..C..C.
643 2B8 06A 064 C03 036 4A3 A0E   C.jd.6..
20B 09B 20B 703 03B C3C 024 20B   ....;<$.
1FF 443 603 2BE 643 2BD 643 2BC   .C..C.C.
06B 064 C00 036 4A3 A0E 20C 09B   kd.6....
20C 703 03B C50 024 20C 1F3 443   ..;P$..C
603 2B2 643 2B1 643 2B0 06C 064   ..C.C.ld
C01 036 4A3 A0E 20D 09B 20D 703   .6......
03B C54 024 20D 1F7 443 603 2B6   ;T$..C..
643 2B5 643 2B4 06D 064 C02 036   C.C.md.6
4A3 A0E FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
FFF FFF FFF FFF FFF FFF FFF FFF   ........
CCF 002 C00 006 C03 C07 572 203   ......r.
E18 643 B20 C05 024 060 2A4 204   .C .$`..
E1F 743 B0D 064 CCF 002 C00 006   .C.d....
C03 007 C0F 026 C30 027 4A3 A0E   ...&0'..
CFF 02F 207 E03 F03 743 003 2EF   ./...C..
B22 B0B C1E 037 C1F 038 C00 03E   "..7.8.>
C04 03F C01 02E 487 4A3 A0E C1E   .?......
037 C1F 038 C00 03E C15 03F C01   7.8.>.?.
02E 587 4A3 A0E C1E 037 C1F 038   .....7.8
C00 03E C16 03F C01 02E 4A7 4A3   .>.?....
A0E C1E 037 C1F 038 C00 03E C07   ..7.8.>.
03F C01 02E 5A7 4A3 A0E C30 024   ?.....0$
070 071 072 073 068 074 075 076   pqrshtuv
077 069 078 079 07A 07B 06A 07C   wixyz{j|
07D 07E 07F 06B C50 024 070 071   }~ kP$pq
072 073 06C 074 075 076 077 06D   rsltuvwm
064 C1E 037 C1F 038 C00 03E C08   d.7.8.>.
03F C01 02E 4A3 A0E C1E 037 C1F   ?.....7.
038 C00 03E C19 03F C01 02E 4A3   8.>.?...
A0E C1E 037 C1F 038 C00 03E C1A   ..7.8.>.
03F C01 02E 4A3 A0E C1E 037 C1F   ?.....7.
038 C00 03E C0B 03F C01 02E 4A3   8.>.?...
A0E C1E 037 C1F 038 21B 03F C00   ..7.8.?.
03E 19F 02F 3AF 1AF 20F 32F 32F   >./...//
1AF 30F 1AF 70F 51E 07B 4A3 C10   .....{..
02E A0E C1E 037 C1F 038 C00 03E   ...7.8.>
C0D 03F C01 02E 4A3 A0E C1E 037   .?.....7
C1F 038 C00 03E C0E 03F C01 02E   .8.>.?..
4A3 A0E 5D2 C1E 037 C1F 038 C00   ....7.8.
03E C1F 03F C01 02E 4A3 A0E FFF   >.?.....
FFF FFF FFF FFF FFF FFF FFF FFF   ........
FFF FFF FFF FFF FFF FFF FFF FFF   ........
```

```
Minicloset Hex File
Microchip PIC16C505
Configuration: 0xFD4

4A3 CC7 002 C09 006 C02 007 C37    .......7
026 027 C05 024 060 2A4 204 E1F    &'.$'...
743 A0C 064 06E 06F 068 069 A3A    C.dnohi:
1E2 880 840 820 810 808 804 802    ..@ ....
801 1E2 800 800 800 804 804 804    ........
810 810 810 814 814 814 820 820    ......
820 824 824 824 830 830 830 834     $$$0004
834 834 CC7 002 C09 006 C02 007    44......
2AC 20C F18 643 06C 206 ECB 02A    ...Cl..*
20C 921 10A 666 A4B 766 A4D 026    .!.fKfM&
706 A55 CCB 166 06C 666 A55 666    .U.flfUf
A66 666 A66 666 A66 666 A66 666    ffffffff
A66 666 A66 666 A66 A6B 306 36F    fffffk.o
36E 2A8 A7A 208 F10 743 A74 C01    n.z..Ct.
18E 743 A74 A79 06E 06F 068 069    .Ctynohi
A7A A7A A3A
```

What is claimed is:

1. A system for monitoring energy usage on a power line, comprising:

(a) an electronic microprocessor-controlled digital electricity metering device coupled to a power line and including a non-volatile, non-battery-powered data-storage device, wherein said metering device is operable to perform interval metering, store data acquired by said interval metering in said data-storage device, receive a data request, and transmit data in response to said request over said power line; and (b) a data collector coupled to said metering device via said power line, said data collector operable to:

(i) receive data from and transmit data to said metering device over said power line, (ii) store data received from said metering device over said power line, and (iii) receive data from and transmit data to a remotely located computer.

2. A system as in claim 1, wherein said data collector is a transponder.

3. A system as in claim 1, wherein said metering device is coupled to an output device operable to control loads on said power line.

4. A system as in claim 1, wherein said metering device is operable to meter reactive electric energy.

5. A system as in claim 1, wherein said data collector receives data from and transmits data to said remotely located computer via a power line.

6. A system as in claim 1, wherein said data collector receives data from and transmits data to said remotely located computer via a telephone line.

7. A system as in claim 1, wherein said data collector is coupled to and operable to store data in a non-volatile memory storage device.

8. A system as in claim 1, wherein said metering device comprises a microprocessor that is remotely programmable.

9. A system as in claim 8, wherein the microprocessor can be remotely programmed to change what data are stored by the metering device and in what time intervals.

10. A system as in claim 8, wherein the microprocessor can be remotely programmed to change time-of-use profiles.

11. A system as in claim 8, wherein the microprocessor can be remotely programmed to change whether the metering device operates on a pre-paid or on a credit basis.

12. A system as in claim 8, wherein the metering device is operable to retrieve local data.

13. A system as in claim 12, wherein said metering device is coupled to a local display device.

14. A system as in claim 13, wherein the microprocessor can be remotely programmed to change what data are displayed on said display device.

15. A system as in claim 8, wherein said microprocessor can be locally reprogrammed via a local data input device.

16. A system as in claim 1, wherein said non-volatile non-battery-powered data storage device is a flash memory device.

17. A system as in claim 1, wherein said metering device is coupled to and operable to receive data from other metering devices.

18. A system as in claim 1, wherein said metering device is operable to adjust the frequency on which it transmits data over said power line.

19. A system as in claim 18, wherein said frequency is adjusted in response to instructions received from a remote computer.

20. A system for monitoring energy usage, comprising:

(a) one or more power lines; and (b) an electronic microprocessor-controlled digital electricity metering device coupled to said one or more power lines and comprising at least one non-volatile, non-battery-powered data-storage device, wherein said metering device is operable to perform interval metering and metering of multiple billing.

21. A system as in claim 20, wherein said metering device is operable to receive a data request and transmit data in response to said request over said one or more power lines.

22. A system as in claim 21, further comprising a data collector coupled to said metering device via said power line, said data collector operable to:

(i) receive data from and transmit data to said metering device over said power line, (ii) store data received from said metering device over said power line, and (iii) receive data from and transmit data to a remotely located computer.

23. A method of monitoring energy usage, comprising the steps of:

(a) measuring energy usage using a microprocessor-controlled digital electricity metering device;

(b) storing data representing measured energy usage at regular intervals of time in a non-volatile, non-battery-operated data storage device;

(c) receiving a request for said stored data over a power line from a transponder; and (d) in response to said request, transmitting said stored data over said power line to said transponder.

24. A method as in claim 23, wherein said microprocessor can be remotely programmed.

25. A method as in claim 24, wherein said microprocessor can be remotely programmed and is operable to take a programmed action when a measured parameter reaches or exceeds a downloaded value.

26. A method as in claim 23, wherein said non-volatile non-battery-powered data storage device is a flash memory device.

27. An application specific integrated circuit (ASIC) for monitoring energy usage, comprising:

(a) a meter component, operable to perform interval metering and transmit data acquired at each interval to a data storage device;

(b) a digital control logic component;

(c) a real-time clock component; and (d) a power line communication component.

28. An ASIC as in claim 27, further comprising a random access memory (RAM) component.

29. An ASIC as in claim 27, further comprising a first-in first-out (FIFO) buffer.

30. An ASIC as in claim 27, further comprising a watchdog timer.

31. An ASIC as in claim 27, further comprising a serial UART.

32. An ASIC as in claim 27, wherein said meter component comprises circuitry for sampling.

33. A device for monitoring energy usage, comprising:

(a) an application specific integrated circuit (ASIC) chip coupled to and controllable by a microprocessor;

(b) a microprocessor coupled to said ASIC chip and operable to control the operation of said ASIC chip; and (c) a flash memory device coupled to said ASIC chip and to said microprocessor, wherein said flash memory device is operable to receive energy usage data from said ASIC chip and controllable by said microprocessor, and to store interval metering data.

34. A device as in claim 33, wherein said flash memory device is operable to store data in a first set of one or more data registers and a second set of one or more data registers, and wherein said microprocessor is operable to direct received meter data into said first set or said second set according to an external signal.

35. A device as in claim 34, wherein said external signal is from an automatic transfer switch.

36. A system as in claim 1, wherein said metering device comprises a paper printing device.

37. A device for monitoring energy usage by a plurality of end users, comprising:

(a) a main processor;

(b) a remote processor in communication with said main processor, and directed by said main processor regarding which current channels to read;

(c) an analog multiplexer controllable by said remote processor;

(d) a current sensing circuit coupled to said analog multiplexer;

(e) an application specific integrated circuit (ASIC) chip coupled to and controllable by said remote processor; and (f) a flash memory device coupled to said ASIC chip and to said remote processor, wherein said flash memory device is operable to receive energy usage data from said ASIC chip and controllable by said remote processor, and to store interval metering data.

38. A system as in claim 1, wherein said interval metering comprises periodically storing data into a non-volatile, non-battery-powered memory.

39. A system as in claim 38, wherein said metering device is further operable to aggregate stored data upon request by said microprocessor.

40. A system as in claim 38, wherein said metering device is further operable to report accumulated energy usage.

41. A system as in claim 40, wherein said energy usage is real, reactive, or apparent.

42. A system as in claim 39, wherein said aggregated data is aggregated according to intervals of said interval metering.

43. A system as in claim 1, wherein data acquired by said interval metering is stored such that data acquired during each interval is stored in a separate register.

44. A system as in claim 20, wherein said metering device is further operable to store data acquired at each metered interval in a separate register.

45. A method as in claim 23, wherein data acquired at each of said regular intervals is stored in a separate register.

46. A circuit as in claim 27, wherein said data storage device comprises a plurality of discrete registers, each register operable to receive data corresponding to one interval.

47. A device as in claim 33, wherein said interval metering data is stored in a plurality of discrete data registers, each register operable to store data acquired at one interval.

48. A device as in claim 37, wherein said interval metering data is stored in a plurality of discrete registers, each register operable to store data for one interval.

49. A system as in claim 1, wherein data acquired by said interval metering is stored such that data acquired for each interval is separately recoverable for some time after the next interval.

50. A system as in claim 20, wherein said metering device is further operable to store data acquired at each metered interval such that data acquired for that interval is separately recoverable for some time after the next interval.

51. A method as in claim 23, wherein data acquired for each of said regular intervals is separately recoverable for some time after the next interval.

52. A circuit as in claim 27, wherein said data storage device is operable to store data acquired at each metered interval such that data acquired for that interval is separately recoverable for some time after the next interval.

53. A device as in claim 33, wherein said interval metering data is stored such that data acquired for one interval is separately recoverable for some time after the next interval.

54. A device as in claim 37, wherein said interval metering data is stored such that data acquired for one interval is separately recoverable for some time after the next interval.

55. A system as in claim 43, further comprising means for altering which register stores data for which interval.

* * * * *